US012180233B2

(12) United States Patent
Stoessel et al.

(10) Patent No.: US 12,180,233 B2
(45) Date of Patent: Dec. 31, 2024

(54) METAL COMPLEXES

(71) Applicant: UDC IRELAND LIMITED, Ballycoolin (IE)

(72) Inventors: Philipp Stoessel, Frankfurt am Main (DE); Armin Auch, Darmstadt (DE)

(73) Assignee: UDC IRELAND LIMITED, Ballycoolin (IE)

( * ) Notice: Subject to any disclaimer, the term of this patent is extended or adjusted under 35 U.S.C. 154(b) by 938 days.

(21) Appl. No.: 16/969,584

(22) PCT Filed: Feb. 11, 2019

(86) PCT No.: PCT/EP2019/053231

§ 371 (c)(1), (2) Date: Aug. 13, 2020

(87) PCT Pub. No.: WO2019/158453

PCT Pub. Date: Aug. 22, 2019

(65) Prior Publication Data

US 2022/0289778 A1 Sep. 15, 2022

(30) Foreign Application Priority Data

Feb. 13, 2018 (EP) .................................... 18156388

(51) Int. Cl.
*C07F 15/00* (2006.01)

(52) U.S. Cl.
CPC ................................ *C07F 15/0033* (2013.01)

(58) Field of Classification Search
CPC .................................................. C07F 15/0033
See application file for complete search history.

(56) References Cited

U.S. PATENT DOCUMENTS

| | | | | |
|---|---|---|---|---|
| 7,332,232 | B2 | 2/2008 | Ma et al. | |
| 2018/0026208 | A1 | 1/2018 | Tsai et al. | |
| 2018/0026209 | A1 | 1/2018 | Stoessel et al. | |
| 2018/0226591 | A1 | 8/2018 | Stoessel et al. | |
| 2018/0254416 | A1 | 9/2018 | Stoessel et al. | |
| 2019/0161510 | A1* | 5/2019 | Stoessel ................. | C09K 11/06 |
| 2020/0083463 | A1 | 3/2020 | Stoessel et al. | |
| 2022/0289778 | A1 | 9/2022 | Stoessel | |

FOREIGN PATENT DOCUMENTS

| | | | |
|---|---|---|---|
| JP | 2013-168552 | A | 8/2013 |
| TW | 201718613 | A | 6/2017 |
| TW | 201722980 | A | 7/2017 |
| WO | WO-2016124304 | A1 | 8/2016 |
| WO | WO-2017032439 | A1 | 3/2017 |
| WO | WO-2018019688 | A1 | 2/2018 |
| WO | WO-2018178001 | A1 | 10/2018 |

OTHER PUBLICATIONS

International Search Report for PCT/EP2019/053231 mailed Apr. 15, 2019.

Written Opinion of the International Searching Authority for PCT/EP2019/053231 mailed Apr. 15, 2019.

* cited by examiner

*Primary Examiner* — William D Young
(74) *Attorney, Agent, or Firm* — Riverside Law LLP

(57) ABSTRACT

The present invention relates to iridium complexes suitable for use in organic electroluminescent devices, especially as emitters.

15 Claims, No Drawings

METAL COMPLEXES

CROSS-REFERENCE TO RELATED APPLICATIONS

This application is a national stage application (under 35 U.S.C. § 371) of PCT/EP2019/053231, filed Feb. 11, 2019, which claims benefit of European Application No. 18156388.3, filed Feb. 13, 2018, both of which are incorporated herein by reference in their entirety.

The present invention relates to iridium complexes suitable for use in organic electroluminescent devices, especially as emitters.

According to the prior art, triplet emitters used in phosphorescent organic electroluminescent devices (OLEDs) are, in particular, bis- and tris-ortho-metallated iridium complexes having aromatic ligands, where the ligands bind to the metal via a negatively charged carbon atom and an uncharged nitrogen atom or via a negatively charged carbon atom and an uncharged carbene carbon atom. Examples of such complexes are tris(phenylpyridyl)iridium(III) and derivatives thereof, and a multitude of related complexes, for example with 1- or 3-phenylisoquinoline ligands, with 2-phenylquinoline ligands or with phenylcarbene ligands, where these complexes may also have acetylacetonate as auxiliary ligand. Complexes of this kind are also known with polypodal ligands, as described, for example, in U.S. Pat. No. 7,332,232 and WO 2016/124304. Even though these complexes having polypodal ligands show advantages over the complexes which otherwise have the same ligand structure without polypodal bridging of the individual ligands therein, there is also still need for improvement, for example with regard to efficiency, lifetime, sublimability and solubility.

The problem addressed by the present invention is therefore that of providing novel and especially improved metal complexes suitable as emitters for use in OLEDs.

It has been found that, surprisingly, this problem is solved by metal complexes with a hexadentate tripodal ligand having the structure described below, which are of very good suitability for use in an organic electroluminescent device. The present invention therefore provides these metal complexes and organic electroluminescent devices comprising these complexes.

The invention thus provides a compound of the formula (1)

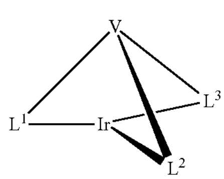

formula (1)

where the symbols used are as follows:

$L^1$, $L^2$, $L^3$ are the same or different at each instance and are each a bidentate monoanionic sub-ligand that coordinates to the iridium via one carbon atom and one nitrogen atom, via two carbon atoms, via two nitrogen atoms, via two oxygen atoms or via one oxygen atom and one nitrogen atom;

V is a group of the formula (2)

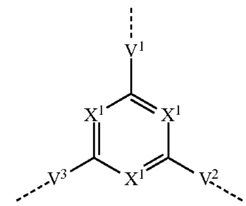

formula (2)

where the dotted bonds each represent the position of linkage of the sub-ligands $L^1$, $L^2$ and $L^3$;

$V^1$ is a group of the following formula (3):

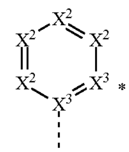

formula (3)

where the dotted bond represents the bond to $L^1$ and * represents the bond to the central cycle in formula (2);

$V^2$ is selected from the group consisting of $—CR_2—CR_2—$, $—CR_2—SiR_2—$, $CR_2—O—$ and $—CR_2—NR—$, where this group is bonded to $L^2$ and to the central cycle in formula (2);

$V^3$ is the same or different and is $V^1$ or $V^2$, where this group is bonded to $L^3$ and to the central cycle in formula (2);

$X^1$ is the same or different at each instance and is CR or N;

$X^2$ is the same or different at each instance and is CR or N, or two adjacent $X^2$ groups together are NR, O or S, thus forming a five-membered ring; or two adjacent $X^2$ groups together are CR or N when one of the $X^3$ groups in the cycle is N, thus forming a five-membered ring; with the proviso that not more than two adjacent $X^2$ groups in each ring are N;

$X^3$ is C at each instance in the same cycle or one $X^3$ group is N and the other $X^3$ group in the same cycle is C, where the $X^3$ groups may be selected independently when V contains more than one group of the formula (3); with the proviso that two adjacent $X^2$ groups together are CR or N when one of the $X^3$ groups in the cycle is N;

R is the same or different at each instance and is H, D, F, Cl, Br, I, $N(R^1)_2$, $OR^1$, $SR^1$, CN, $NO_2$, COOH, $C(=O)N(R^1)_2$, $Si(R^1)_3$, $Ge(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^1$ radicals and where one or more nonadjacent $CH_2$ groups may be replaced by $Si(R^1)_2$, C=O, $NR^1$, O, S or $CONR^1$, or an aromatic or heteroaromatic ring system which has 5 to 40 aromatic ring atoms and may be substituted in each case by one or more $R^1$ radicals; at the same time, two R radicals together may also form a ring system;

$R^1$ is the same or different at each instance and is H, D, F, Cl, Br, I, $N(R^2)_2$, $OR^2$, $SR^2$, CN, $NO_2$, $Si(R^2)_3$, $Ge(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^2$ radicals and where one or more nonadjacent $CH_2$ groups may be replaced by $Si(R^2)_2$, C=O, $NR^2$, O, S or $CONR^2$, or an aromatic or heteroaromatic ring system which has 5 to 40 aromatic ring atoms and may be substituted in each case by one or more $R^2$ radicals; at the same time, two or more $R^1$ radicals together may form a ring system;

$R^2$ is the same or different at each instance and is H, D, F or an aliphatic, aromatic and/or heteroaromatic organic radical, especially a hydrocarbyl radical, having 1 to 20 carbon atoms, in which one or more hydrogen atoms may also be replaced by F;

at the same time, the three bidentate ligands $L^1$, $L^2$ and $L^3$, apart from by the bridge V, may also be closed by a further bridge to form a cryptate.

The ligand is thus a hexadentate tripodal ligand having the three bidentate sub-ligands $L^1$, $L^2$ and $L^3$. "Bidentate" means that the particular sub-ligand in the complex coordinates or binds to the iridium via two coordination sites. "Tripodal" means that the ligand has three sub-ligands bonded to the bridge V or the bridge of the formula (2). Since the ligand has three bidentate sub-ligands, the overall result is a hexadentate ligand, i.e. a ligand which coordinates or binds to the iridium via six coordination sites. The expression "bidentate sub-ligand" in the context of this application means that $L^1$, $L^2$ or $L^3$ would in each case be a bidentate ligand if the bridge V or the bridge of the formula (2) were not present. However, as a result of the formal abstraction of a hydrogen atom from this bidentate ligand and the attachment to the bridge V or the bridge of the formula (2), it is no longer a separate ligand but a portion of the hexadentate ligand which thus arises, and so the term "sub-ligand" is used therefor.

The ligand in the compound of the invention, when $V^2$=$-CR_2-CR_2-$, thus has one of the following structures (LIG-1) and (LIG-2):

(LIG-1)

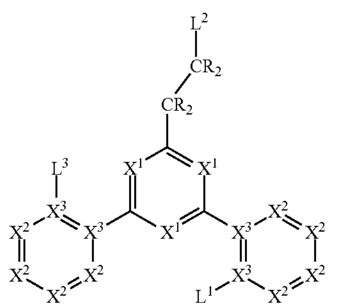

(LIG-2)

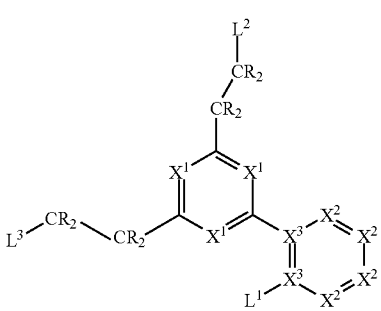

The same is true when $V^2$=$-CR_2-SiR_2-$, $-CR_2-O-$ or $-CR_2-NR-$, where, in this case, the silicon or the oxygen or nitrogen binds either to the central cycle or to the bidentate sub-ligand.

The bond of the ligand to the iridium may either be a coordinate bond or a covalent bond, or the covalent fraction of the bond may vary according to the ligand. When it is said in the present application that the ligand or the sub-ligand coordinates or binds to the iridium, this refers in the context of the present application to any kind of bond from the ligand or sub-ligand to the iridium, irrespective of the covalent component of the bond.

When two R or $R^1$ radicals together form a ring system, it may be mono- or polycyclic, and aliphatic, heteroaliphatic, aromatic or heteroaromatic. In this case, these radicals which together form a ring system may be adjacent, meaning that these radicals are bonded to the same carbon atom or to carbon atoms directly bonded to one another, or they may be further removed from one another. For example, it is also possible for an R radical bonded to the $X^2$ group to form a ring with an R radical bonded to the $X^1$ group.

The wording that two or more radicals together may form a ring, in the context of the present description, shall be understood to mean, inter alia, that the two radicals are joined to one another by a chemical bond with formal elimination of two hydrogen atoms. This is illustrated by the following scheme:

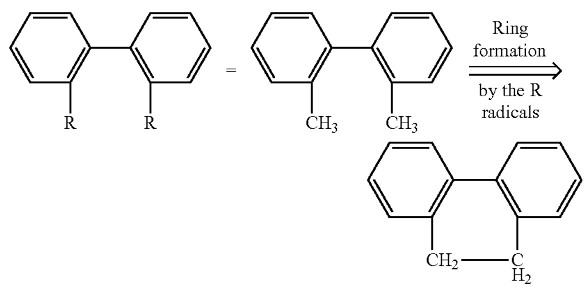

In addition, however, the abovementioned wording shall also be understood to mean that, if one of the two radicals is hydrogen, the second radical binds to the position to which the hydrogen atom was bonded, forming a ring. This shall be illustrated by the following scheme:

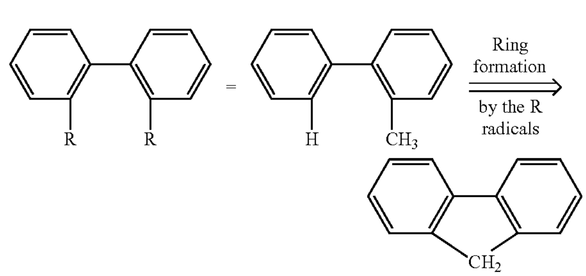

As described above, this kind of ring formation is possible in radicals bonded to carbon atoms directly adjacent to one another, or in radicals bonded to further-removed carbon atoms. Preference is given to this kind of ring formation in radicals bonded to carbon atoms directly bonded to one another.

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. The heteroaryl group in this case preferably contains not more than three heteroatoms. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc.

An aromatic ring system in the context of this invention contains 6 to 40 carbon atoms in the ring system. A heteroaromatic ring system in the context of this invention contains 1 to 40 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for a plurality of aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. shall thus also be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl, terphenyl, quaterphenyl or bipyridine, shall likewise be regarded as an aromatic or heteroaromatic ring system.

A cyclic alkyl, alkoxy or thioalkoxy group in the context of this invention is understood to mean a monocyclic, bicyclic or polycyclic group.

In the context of the present invention, a $C_1$- to $C_{20}$-alkyl group in which individual hydrogen atoms or $CH_2$ groups may also be replaced by the abovementioned groups is understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. An $OR^1$ group is understood to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system which has 5-40 aromatic ring atoms and may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Stated hereinafter are preferred embodiments of the bridgehead V, i.e. the structure of the formula (2).

In a preferred embodiment of the invention, all $X^1$ groups in the group of the formula (2) are CR, and so the central trivalent cycle of the formula (2) is a benzene. More preferably, all $X^1$ groups are CH or CD, especially CH. In a further preferred embodiment of the invention, all $X^1$ groups are a nitrogen atom, and so the central trivalent cycle of the formula (2) is a triazine.

Preferred embodiments of the group of the formula (1) are the structures of the following formula (4) or (5):

formula (4)

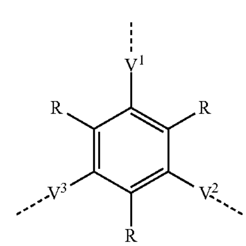

-continued formula (5)

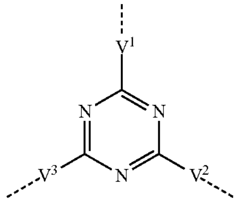

where the symbols used have the definitions given above.

Preferred R radicals on the trivalent central benzene ring of the formula (4) are as follows:

R is the same or different at each instance and is H, D, F, CN, $OR^1$, a straight-chain alkyl group having 1 to 10 carbon atoms, preferably having 1 to 4 carbon atoms, or an alkenyl group having 2 to 10 carbon atoms or a branched or cyclic alkyl group having 3 to 10 carbon atoms, preferably having 3 to 6 carbon atoms, each of which may be substituted by one or more $R^1$ radicals but is preferably unsubstituted, or an aromatic or heteroaromatic ring system which has 5 to 24 aromatic ring atoms, preferably 6 to 12 aromatic ring atoms, and may be substituted in each case by one or more $R^1$ radicals; at the same time, the R radical may also form a ring system with an R radical on $X^2$;

$R^1$ is the same or different at each instance and is H, D, F, CN, $OR^2$, a straight-chain alkyl group having 1 to 10 carbon atoms, preferably having 1 to 4 carbon atoms, or an alkenyl group having 2 to 10 carbon atoms or a branched or cyclic alkyl group having 3 to 10 carbon atoms, preferably having 3 to 6 carbon atoms, each of which may be substituted by one or more $R^2$ radicals but is preferably unsubstituted, or an aromatic or heteroaromatic ring system which has 5 to 24 aromatic ring atoms, preferably 6 to 12 aromatic ring atoms, and may be substituted in each case by one or more $R^2$ radicals; at the same time, two or more adjacent $R^1$ radicals together may form a ring system;

$R^2$ is the same or different at each instance and is H, D, F or an aliphatic, aromatic and/or heteroaromatic organic radical having 1 to 20 carbon atoms, in which one or more hydrogen atoms may also be replaced by F, preferably an aliphatic or aromatic hydrocarbyl radical having 1 to 12 carbon atoms.

More preferably, this R radical=H or D, especially=H.

More preferably, the group of the formula (4) is a structure of the following formula (4'):

formula (4')

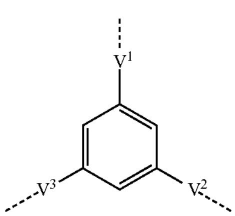

where the symbols used have the definitions given above.

There follows a description of preferred bivalent arylene or heteroarylene units $V^1$ and the groups of the formula (3) as occur in the group of the formulae (2), (4) and (5). When $V^3$ is a group of the formula (3), the preferences which follow are applicable to this group as well. As apparent from the structures of the formulae (2), (4) and (5), these structures contain one or two ortho-bonded bivalent arylene or heteroarylene units according to whether $V^3$ is a group of the formula (3) or is a group selected from $—CR_2—CR_2—$, $—CR_2—SiR_2—$, $—CR_2—O—$ and $—CR_2—NR—$.

In a preferred embodiment of the invention, the symbol $X^3$ in the group of the formula (3) is C, and so the group of the formula (3) is represented by the following formula (3a):

formula (3a)

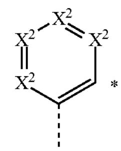

where the symbols have the definitions listed above.

The group of the formula (3) may represent a heteroaromatic five-membered ring or an aromatic or heteroaromatic six-membered ring. In a preferred embodiment of the invention, the group of the formula (3) contains not more than two heteroatoms in the aryl or heteroaryl group, more preferably not more than one heteroatom. This does not mean that any substituents bonded to this group cannot also contain heteroatoms. In addition, this definition does not mean that formation of rings by substituents cannot give rise to fused aromatic or heteroaromatic structures, for example naphthalene, benzimidazole, etc. Examples of suitable groups of the formula (3) are benzene, pyridine, pyrimidine, pyrazine, pyridazine, pyrrole, furan, thiophene, pyrazole, imidazole, oxazole and thiazole.

When both $X^3$ groups in a cycle are carbon atoms, preferred embodiments of the group of the formula (3) are the structures of the following formulae (6) to (22):

formula (6)

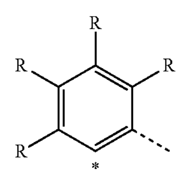

formula (7)

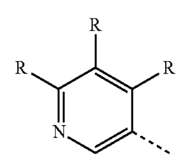

formula (8)

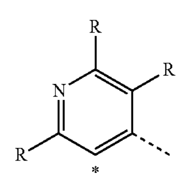

formula (9)

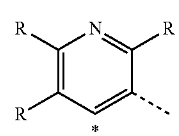

-continued formula (10)

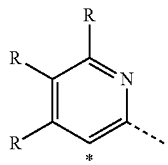

formula (11)

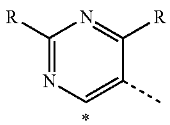

formula (12)

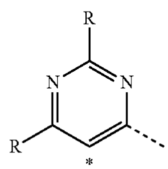

formula (13)

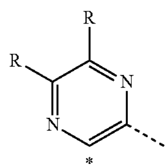

formula (14)

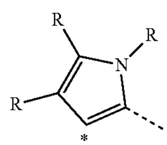

formula (15)

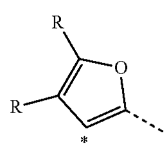

formula (16)

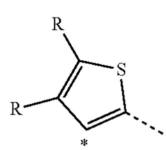

formula (17)

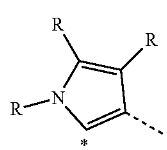

formula (18)

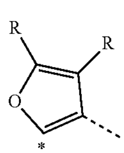

-continued formula (19)

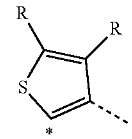

formula (20)

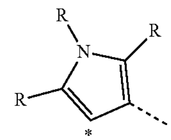

formula (21)

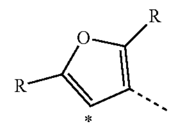

formula (22)

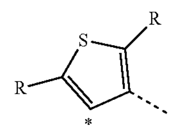

where the symbols used have the definitions given above.

When one $X^3$ group in a cycle is a carbon atom and the other $X^3$ group in the same cycle is a nitrogen atom, preferred embodiments of the group of the formula (3) are the structures of the following formulae (23) to (30):

formula (23)

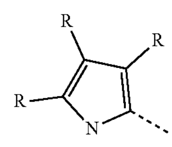

formula (24)

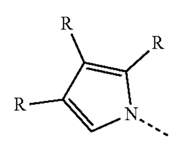

formula (25)

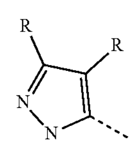

formula (26)

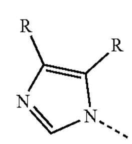

-continued formula (27)

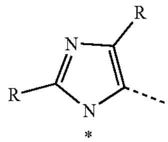

formula (28)

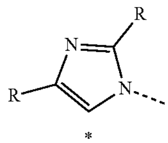

formula (29)

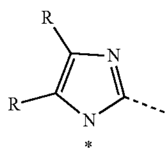

formula (30)

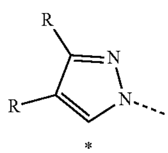

where the symbols used have the definitions given above.

Particular preference is given to the optionally substituted six-membered aromatic rings and six-membered heteroaromatic rings of the formulae (6) to (10) depicted above and the five-membered heteroaromatic rings of the formulae (23) and (29). Very particular preference is given to ortho-phenylene, i.e. a group of the abovementioned formula (6), and the groups of the formulae (23) and (29).

At the same time, as also described above in the description of the substituent, it is also possible for adjacent substituents together to form a ring system, such that it is possible for fused structures to form, including fused aryl and heteroaryl groups, for example naphthalene, quinoline, benzimidazole, carbazole, dibenzofuran, dibenzothiophene, phenanthrene or triphenylene.

When two groups of the formula (3) are present, i.e. when $V^3$ is likewise a group of the formula (3), these may be the same or different. In a preferred embodiment of the invention, when two groups of the formula (3) are present, both groups are the same and also have the same substitution.

Preferably, the $V^2$ group and optionally $V^3$ is selected from the —$CR_2$—$CR_2$— and —$CR_2$—O— groups. When $V^2$ or $V^3$ is a —$CR_2$—O— group, the oxygen atom may either be bonded to the central cycle of the group of the formula (2), or it may be bonded to the sub-ligands $L^2$ or $L^3$. In a particularly preferred embodiment, $V^2$ is —$CR_2$—$CR_2$—. When $V^3$ is also —$CR_2$—$CR_2$—, these groups may be the same or different. They are preferably the same. Preferred R radicals on the —$CR_2$—$CR_2$— or —$CR_2$—O— group are selected from the group consisting of H, D, F and an alkyl group having 1 to 5 carbon atoms, where hydrogen atoms may also be replaced by D or F and where adjacent R together may form a ring system. Particularly preferred R radicals on these groups are selected from H, D, $CH_3$ and $CD_3$, or two R radicals bonded to the same carbon atom, together with the carbon atom to which they are bonded, form a cyclopentane or cyclohexane ring.

More preferably, the structures of the formula (4) and (5) are selected from the structures of the following formulae (4a) to (5b):

formula (4a)

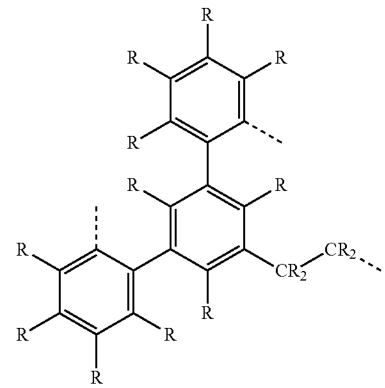

formula (4b)

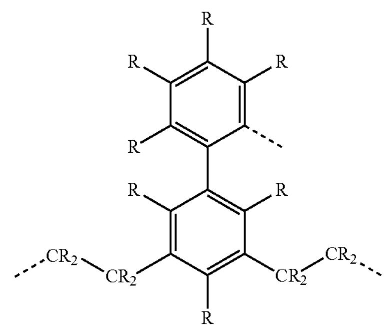

formula (5a)

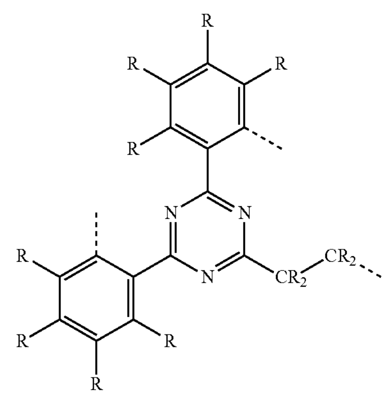

formula (5b)

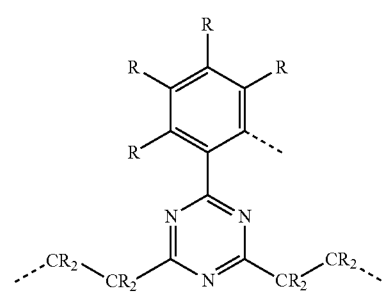

where the symbols used have the definitions given above. Particular preference is given here to the formulae (4b) and (5b), especially the formula (4b).

A preferred embodiment of the formulae (4a) and (4b) are the structures of the following formulae (4a') and (4b'):

formula (4a')

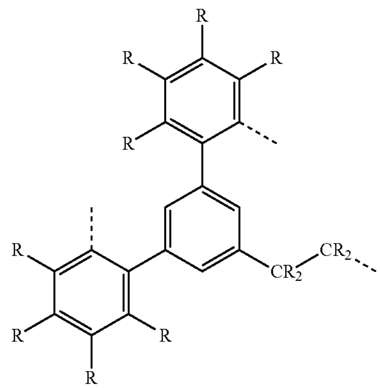

formula (4b')

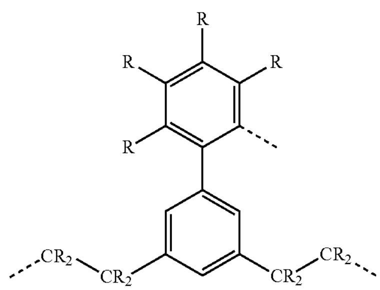

where the symbols used have the definitions given above.

More preferably, the R groups in the formulae (3) to (5) are the same or different at each instance and are H, D or an alkyl group having 1 to 4 carbon atoms. Most preferably, R═H or D, especially H. Particularly preferred embodiments of the formula (2) are therefore the structures of the following formulae (4c), (4d), (4e), (4f), (5c), (5d), (5e) and (5f):

formula (4c)

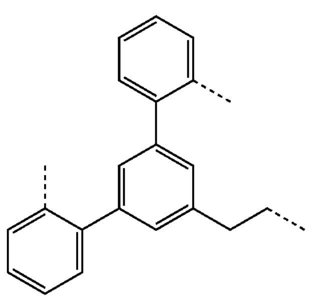

formula (4d)

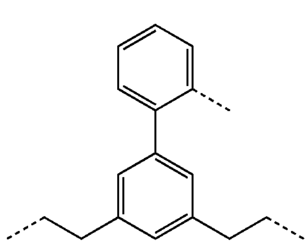

-continued formula (4e)

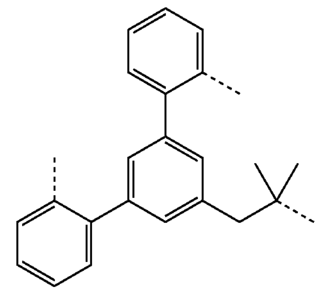

formula (4f)

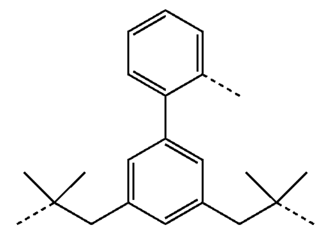

formula (5c)

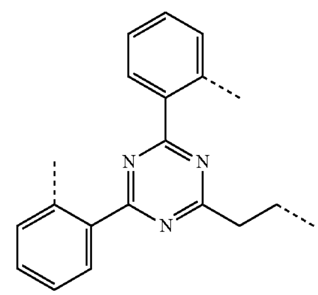

formula (5d)

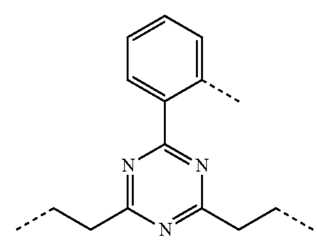

formula (5e)

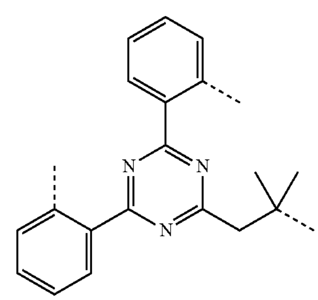

formula (5f)

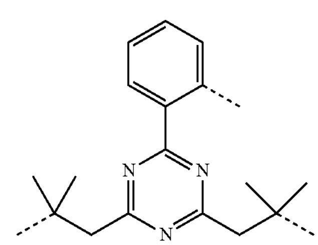

where the symbols used have the definitions given above.

There follows a description of the bidentate sub-ligands $L^1$, $L^2$ and $L^3$. As described above, $L^1$, $L^2$ and $L^3$ coordinate to the iridium via one carbon atom and one nitrogen atom, via two carbon atoms, via two nitrogen atoms, via two oxygen atoms, or via one nitrogen atom and one oxygen atom. In a preferred embodiment, at least one of the sub-ligands $L^1$, $L^2$ and $L^3$, more preferably at least two of the sub-ligands $L^1$, $L^2$ and $L^3$, coordinate(s) to the iridium via one carbon atom and one nitrogen atom or via two carbon atoms, especially via one carbon atom and one nitrogen atom. Most preferably, all three sub-ligands $L^1$, $L^2$ and $L^3$ each have one carbon atom and one nitrogen atom as coordinating atoms.

It is further preferable when the metallacycle which is formed from the iridium and the sub-ligand $L^1$, $L^2$ or $L^3$ is a five-membered ring. This is especially true when the coordinating atoms are carbon and nitrogen or two carbons or nitrogen and oxygen. If the two coordinating atoms are nitrogen or oxygen, the formation of a six-membered ring may also be preferred. The formation of a five-membered ring is shown in schematic form below:

five-membered ring where N is a coordinating nitrogen atom and C is a coordinating carbon atom, and the carbon atoms shown are atoms of the sub-ligand $L^1$, $L^2$ or $L^3$.

In a preferred embodiment of the invention, at least one of the sub-ligands $L^1$, $L^2$ and $L^3$, more preferably at least two sub-ligands $L^1$, $L^2$ and $L^3$ and most preferably all three sub-ligands $L^1$, $L^2$ and $L^3$ are the same or different at each instance and are a structure of one of the following formulae (L-1) and (L-2):

formula (L-1)

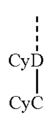

formula (L-2)

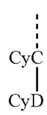

where the dotted bond represents the bond of the sub-ligand to V or to the bridge of the formula (2) and the other symbols used are as follows:

- CyC is the same or different at each instance and is a substituted or unsubstituted aryl or heteroaryl group which has 5 to 14 aromatic ring atoms and coordinates in each case to the metal via a carbon atom and which is bonded to CyD via a covalent bond;
- CyD is the same or different at each instance and is a substituted or unsubstituted heteroaryl group which has 5 to 14 aromatic ring atoms and coordinates to the metal via a nitrogen atom or via a carbene carbon atom and which is bonded to CyC via a covalent bond;

at the same time, two or more of the optional substituents together may form a ring system; the optional radicals are preferably selected from the abovementioned R radicals.

CyD preferably coordinates via an uncharged nitrogen atom or via a carbene carbon atom. In addition, CyC coordinates via an anionic carbon atom.

When two or more of the substituents, especially two or more R radicals, together form a ring system, it is possible for a ring system to be formed from substituents bonded to directly adjacent carbon atoms. In addition, it is also possible that the substituents on CyC and CyD together form a ring, as a result of which CyC and CyD may also together form a single fused aryl or heteroaryl group as bidentate sub-ligand.

It is possible here for all sub-ligands $L^1$, $L^2$ and $L^3$ to have a structure of the formula (L-1), so as to form a pseudo-facial complex, or for all sub-ligands $L^1$, $L^2$ and $L^3$ to have a structure of the formula (L-2), so as to form a pseudo-facial complex, or for one or two of the sub-ligands $L^1$, $L^2$ and $L^3$ to have a structure of the formula (L-1) and the other sub-ligands to have a structure (L-2), so as to form a pseudo-meridional complex.

In a preferred embodiment of the present invention, CyC is an aryl or heteroaryl group having 6 to 13 aromatic ring atoms, more preferably having 6 to 10 aromatic ring atoms, most preferably having 6 aromatic ring atoms, which coordinates to the metal via a carbon atom, which may be substituted by one or more R radicals and which is bonded to CyD via a covalent bond.

Preferred embodiments of the CyC group are the structures of the following formulae (CyC-1) to (CyC-20) where the CyC group binds in each case at the position signified by # to CyD and coordinates at the position signified by * to the iridium, (Cyc-1)

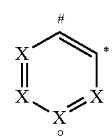

(CyC-2)

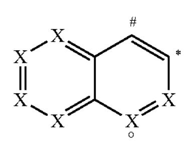

(CyC-3)

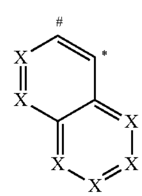

(CyC-4)

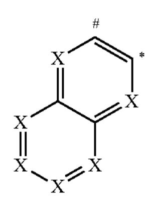

(CyC-5)

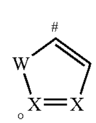

-continued
(CyC-6)
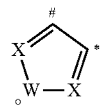
(CyC-7)
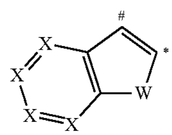
(CyC-8)
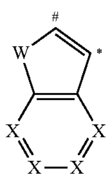
(CyC-9)
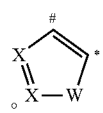
(Cyc-10)
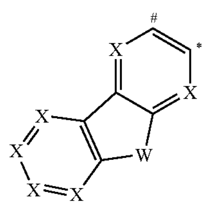
(CyC-11)
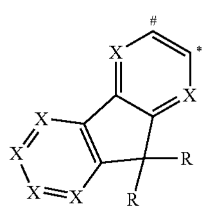
(CyC-12)
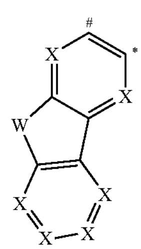
(CyC-13)
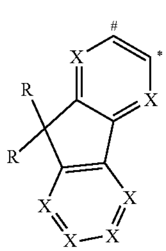
-continued
(CyC-14)
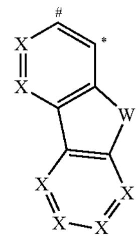
(CyC-15)
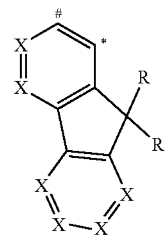
(CyC-16)
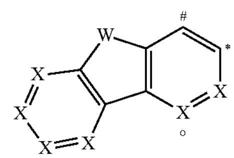
(CyC-17)
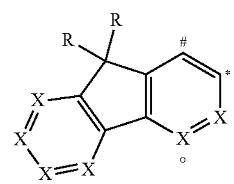
(CyC-18)
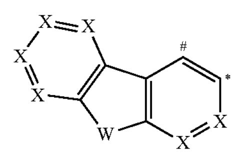
(CyC-19)
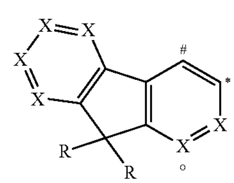
(CyC-20)
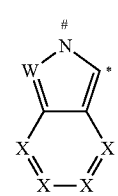
where R has the definitions given above and the other symbols used are as follows:
X is the same or different at each instance and is CR or N, with the proviso that not more than two symbols X per cycle are N;
W is the same or different at each instance and is NR, O or S;

with the proviso that, when the bridge V or the bridge of the formula (2) is bonded to CyC, one symbol X is C and the bridge of the formula (2) is bonded to this carbon atom. When the CyC group is bonded to the bridge V or the bridge of the formula (2), the bond is preferably via the position marked by “o” in the formulae depicted above, and so the symbol X marked by “o” in that case is preferably C. The above-depicted structures which do not contain any symbol X marked by “o” are preferably not bonded directly to the bridge of the formula (2), since such a bond to the bridge is not advantageous for steric reasons.

Preferably, a total of not more than two symbols X in CyC are N, more preferably not more than one symbol X in CyC is N, and most preferably all symbols X are CR, with the proviso that, when the bridge V or the bridge of the formula (2) is bonded to CyC, one symbol X is C and the bridge V or the bridge of the formula (2) is bonded to this carbon atom.

Particularly preferred CyC groups are the groups of the following formulae (CyC-1a) to (CyC-20a):

(CyC-1a)

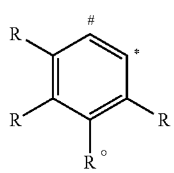

(CyC-1b)

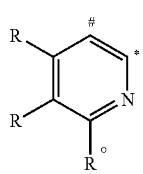

(CyC-1c)

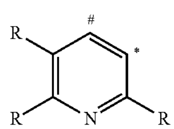

(CyC-1d)

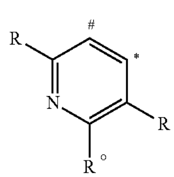

(CyC-1e)

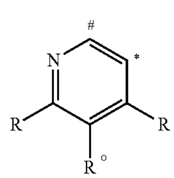

(CyC-1f)

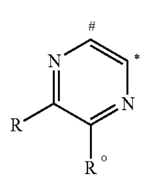

-continued (CyC-1g)

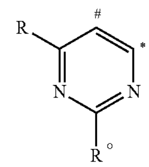

(CyC-1h)

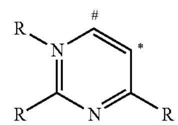

(CyC-2a)

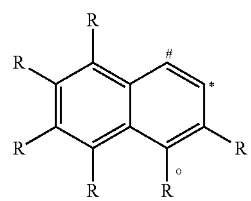

(CyC-2b)

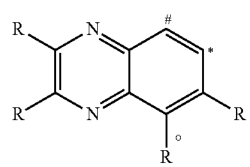

(CyC-3a)

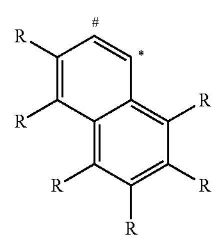

(CyC-3b)

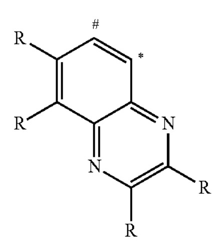

(CyC-4a)

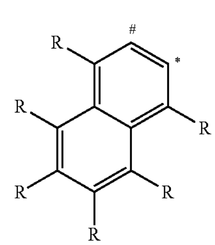

(CyC-4b)
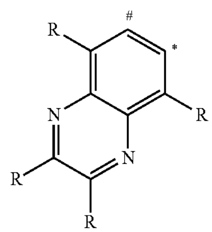
(CyC-5a)
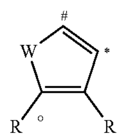
(CyC-6a)
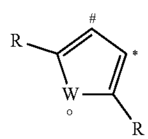
(CyC-7a)
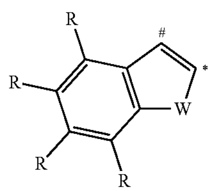
(CyC-8a)
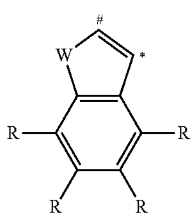
(CyC-9a)
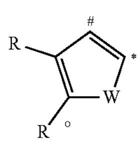
(CyC-10a)
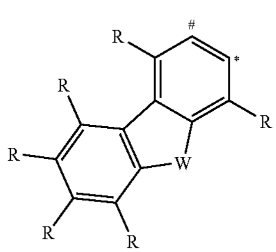
(CyC-11a)
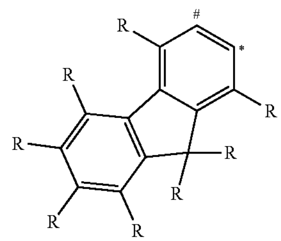
(CyC-12a)
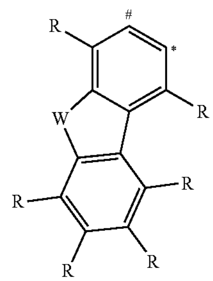
(CyC-13a)
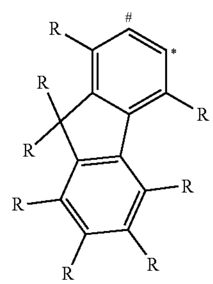
(CyC-14a)
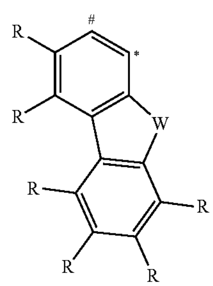
(CyC-15a)
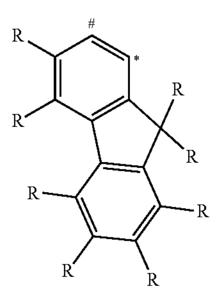
(CyC-16a)
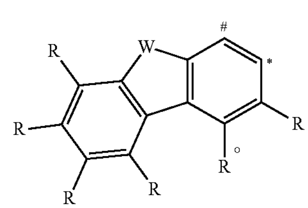

-continued (CyC-17a)

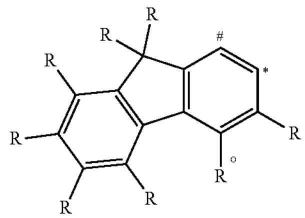

(Cyc-18a)

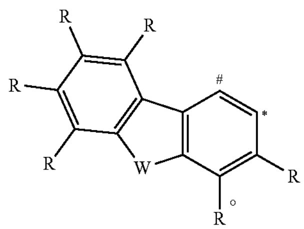

(CyC-19a)

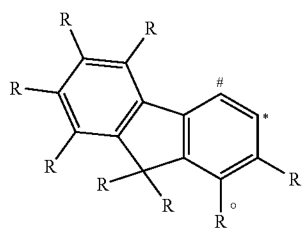

(CyC-20a)

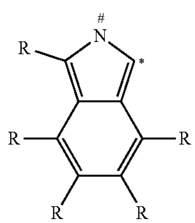

where the symbols used have the definitions given above and, when the bridge V or the bridge of the formula (2) is bonded to CyC, one R radical is not present and the bridge V or the bridge of the formula (2) is bonded to the corresponding carbon atom. When the CyC group is bonded to the bridge V or the bridge of the formula (2), the bond is preferably via the position marked by "o" in the formulae depicted above, and so the R radical in this position in that case is preferably absent. The above-depicted structures which do not contain any carbon atom marked by "o" are preferably not bonded directly to the bridge V or the bridge of the formula (2).

Preferred groups among the (CyC-1) to (CyC-20) groups are the (CyC-1), (CyC-3), (CyC-8), (CyC-10), (CyC-12), (CyC-13) and (CyC-16) groups, and particular preference is given to the (CyC-1a), (CyC-3a), (CyC-8a), (CyC-10a), (CyC-12a), (CyC-13a) and (CyC-16a) groups.

In a further preferred embodiment of the invention, CyD is a heteroaryl group having 5 to 13 aromatic ring atoms, more preferably having 6 to 10 aromatic ring atoms, which coordinates to the metal via an uncharged nitrogen atom or via a carbene carbon atom and which may be substituted by one or more R radicals and which is bonded via a covalent bond to CyC.

Preferred embodiments of the CyD group are the structures of the following formulae (CyD-1) to (CyD-12) where the CyD group binds in each case at the position signified by # to CyC and coordinates at the position signified by * to the iridium, (CyD-1)

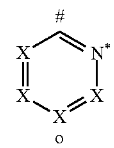

(CyD-2)

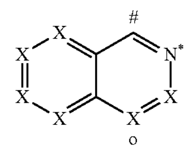

(CyD-3)

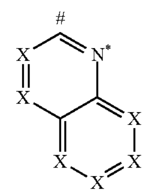

(CyD-4)

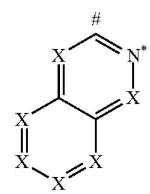

(CyD-5)

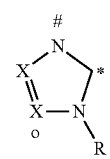

(CyD-6)

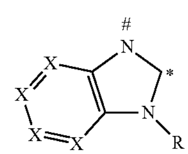

(CyD-7)

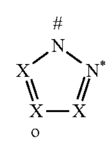

(CyD-8)

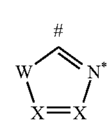

(CyD-9)

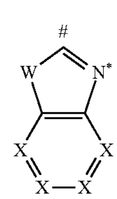

-continued (CyD-10)

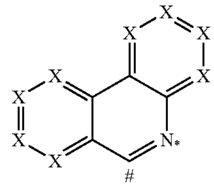

(CyD-11)

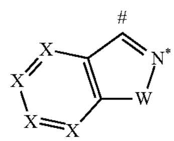

(CyD-12)

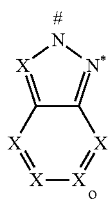

where X, W and R have the definitions given above, with the proviso that, when the bridge V or the bridge of the formula (2) is bonded to CyD, one symbol X is C and the bridge V or the bridge of the formula (2) is bonded to this carbon atom. When the CyD group is bonded to the bridge V or the bridge of the formula (2), the bond is preferably via the position marked by "o" in the formulae depicted above, and so the symbol X marked by "o" in that case is preferably C. The above-depicted structures which do not contain any symbol X marked by "o" are preferably not bonded directly to the bridge V or the bridge of the formula (2), since such a bond to the bridge is not advantageous for steric reasons.

In this case, the (CyD-1) to (CyD-4) and (CyD-7) to (CyD-12) groups coordinate to the metal via an uncharged nitrogen atom, and (CyD-5) and (CyD-6) groups via a carbene carbon atom.

Preferably, a total of not more than two symbols X in CyD are N, more preferably not more than one symbol X in CyD is N, and especially preferably all symbols X are CR, with the proviso that, when the bridge V or the bridge of the formula (2) is bonded to CyD, one symbol X is C and the bridge V or the bridge of the formula (2) is bonded to this carbon atom.

Particularly preferred CyD groups are the groups of the following formulae (CyD-1a) to (CyD-12b):

(CyD-1a)

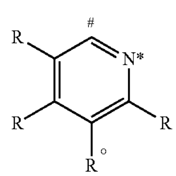

(CyD-2a)

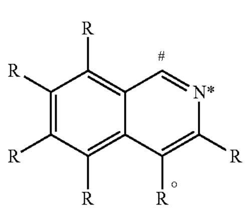

-continued (CyD-3a)

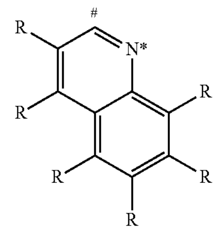

(CyD-3b)

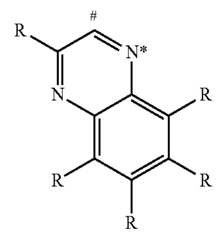

(CyD-4a)

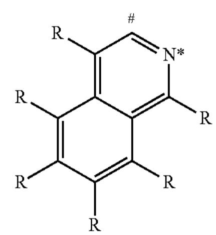

(CyD-5a)

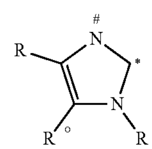

(CyD-6a)

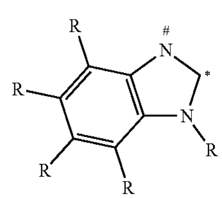

(CyD-7a)

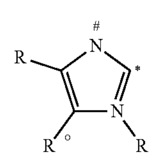

(CyD-8a)

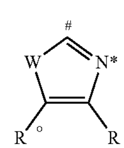

-continued (CyD-9a)

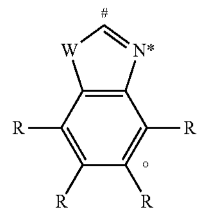

(CyD-10a)

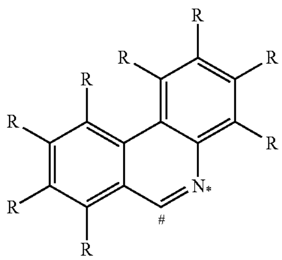

(CyD-11a)

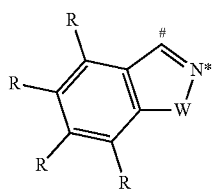

(CyD-12a)

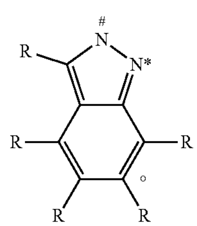

(CyD-12b)

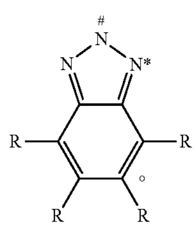

where the symbols used have the definitions given above and, when the bridge V or the bridge of the formula (2) is bonded to CyD, one R radical is not present and the bridge V or the bridge of the formula (2) is bonded to the corresponding carbon atom. When the CyD group is bonded to the bridge V or the bridge of the formula (2), the bond is preferably via the position marked by "o" in the formulae depicted above, and so the R radical in this position in that case is preferably absent. The above-depicted structures which do not contain any carbon atom marked by "o" are preferably not bonded directly to the bridge V or the bridge of the formula (2).

Preferred groups among the (CyD-1) to (CyD-12) groups are the (CyD-1), (CyD-2), (CyD-3), (CyD-4), (CyD-5) and (CyD-6) groups, especially (CyD-1), (CyD-2) and (CyD-3), and particular preference is given to the (CyD-1a), (CyD-2a), (CyD-3a), (CyD-4a), (CyD-5a) and (CyD-6a) groups, especially (CyD-1a), (CyD-2a) and (CyD-3a).

In a preferred embodiment of the invention, CyC is an aryl or heteroaryl group having 6 to 13 aromatic ring atoms, and at the same time CyD is a heteroaryl group having 5 to 13 aromatic ring atoms. More preferably, CyC is an aryl or heteroaryl group having 6 to 10 aromatic ring atoms, and at the same time CyD is a heteroaryl group having 5 to 10 aromatic ring atoms. Most preferably, CyC is an aryl or heteroaryl group having 6 aromatic ring atoms, and CyD is a heteroaryl group having 6 to 10 aromatic ring atoms. At the same time, CyC and CyD may be substituted by one or more R radicals.

The abovementioned preferred (CyC-1) to (CyC-20) and (CyD-1) to (CyD-12) groups may be combined with one another as desired, provided that at least one of the CyC or CyD groups has a suitable attachment site to the bridge V or a bridge of the formula (2), suitable attachment sites being signified by "o" in the formulae given above.

It is especially preferable when the CyC and CyD groups specified above as particularly preferred, i.e. the groups of the formulae (CyC-1a) to (CyC-20a) and the groups of the formulae (CyD1-a) to (CyD-14b), are combined with one another, provided that at least one of the preferred CyC or CyD groups has a suitable attachment site to the bridge V or the bridge of the formula (2), suitable attachment sites being signified by "o" in the formulae given above. Combinations in which neither CyC nor CyD has such a suitable attachment site for the bridge V or the bridge of the formula (2) are therefore not preferred.

It is very particularly preferable when one of the (CyC-1), (CyC-3), (CyC-8), (CyC-10), (CyC-12), (CyC-13) and (CyC-16) groups and especially the (CyC-1a), (CyC-3a), (CyC-8a), (CyC-10a), (CyC-12a), (CyC-13a) and (CyC-16a) groups is combined with one of the (CyD-1), (CyD-2) and (CyD-3) groups and especially with one of the (CyD-1a), (CyD-2a) and (CyD-3a) groups.

Preferred sub-ligands (L-1) are the structures of the formulae (L-1-1) and (L-1-2), and preferred sub-ligands (L-2) are the structures of the formulae (L-2-1) to (L-2-4):

(L-1-1)

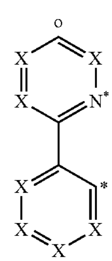

(L-1-2)

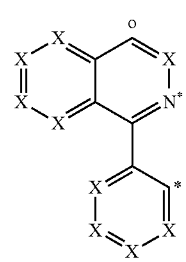

-continued
(L-2-1)
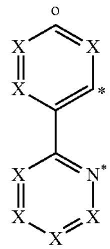
(L-2-2)
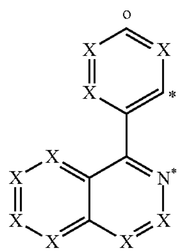
(L-2-3)
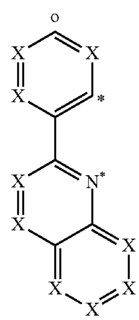
(L-2-4)
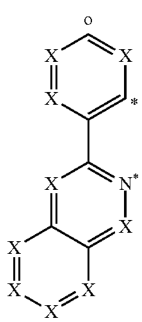
where the symbols used have the definitions given above and "o" represents the position of the bond to the bridge V or the bridge of the formula (2).
Particularly preferred sub-ligands (L-1) are the structures of the formulae (L-1-1a) and (L-1-2b), and particularly preferred sub-ligands (L-2) are the structures of the formulae (L-2-1a) to (L-2-4a)
(L-1-1a)
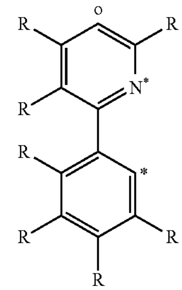
(L-1-2a)
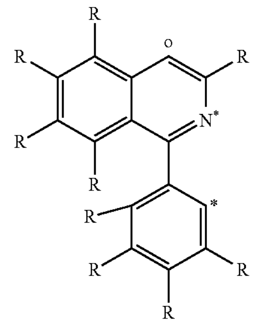
(L-2-1a)
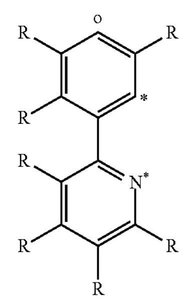
(L-2-2a)
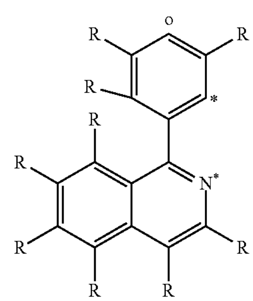
(L-2-3a)
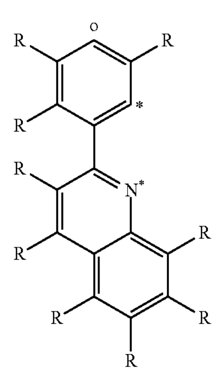

-continued (L-2-4a)

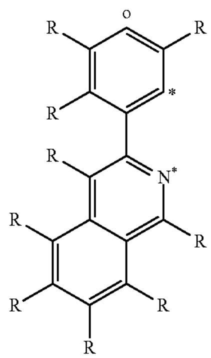

where the symbols used have the definitions given above and "o" represents the position of the bond to the bridge V or the bridge of the formula (2).

When two R radicals of which one is bonded to CyC and the other to CyD together form an aromatic ring system, this can result in bridged sub-ligands and, for example, also in sub-ligands which overall constitute a single larger heteroaryl group, for example benzo[h]quinoline, etc. The ring between the substituents on CyC and CyD is preferably formed by a group of one of the following formulae (31) to (40):

formula (31)

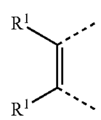

formula (32)

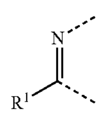

formula (33)

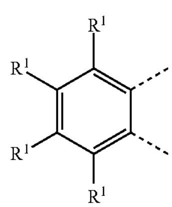

formula (34)

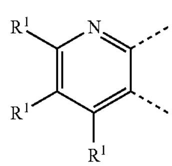

formula (35)

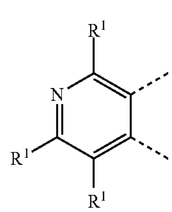

-continued formula (36)

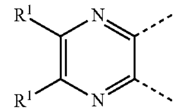

formula (37)

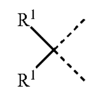

formula (38)

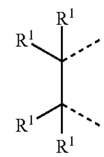

formula (39)

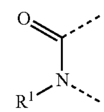

formula (40)

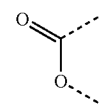

where $R^1$ has the definitions given above and the dotted bonds signify the bonds to CyC or CyD. At the same time, the unsymmetric groups among those mentioned above may be incorporated in each of the two possible options; for example, in the group of the formula (40), the oxygen atom may bind to the CyC group and the carbonyl group to the CyD group, or the oxygen atom may bind to the CyD group and the carbonyl group to the CyC group.

At the same time, the group of the formula (37) is preferred particularly when this results in ring formation to give a six-membered ring, as shown below, for example, by the formulae (L-21) and (L-22).

Preferred ligands which arise through ring formation between two R radicals in the different cycles are the structures of the formulae (L-3) to (L-30) shown below:

(L-3)

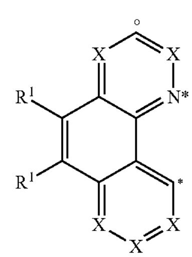

(L-4)

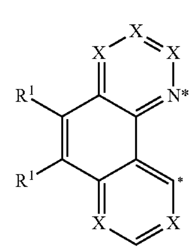

-continued
(L-5)
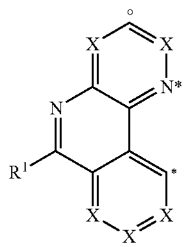
(L-6)
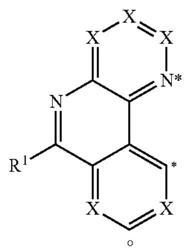
(L-7)
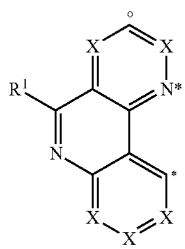
(L-8)
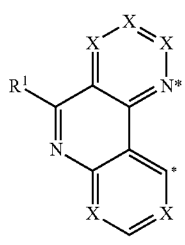
(L-9)
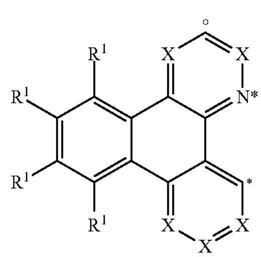
(L-10)
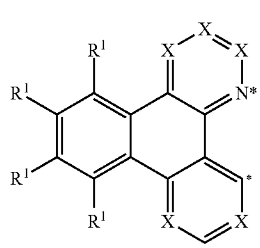
-continued
(L-11)
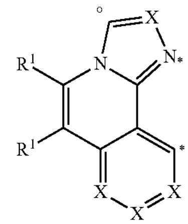
(L-12)
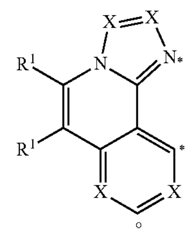
(L-13)
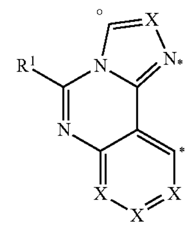
(L-14)
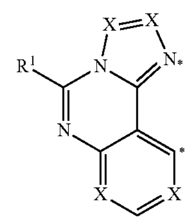
(L-15)
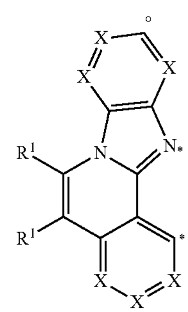
(L-16)
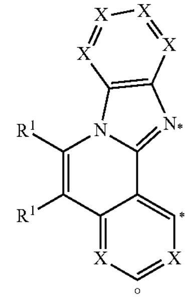

(L-17)
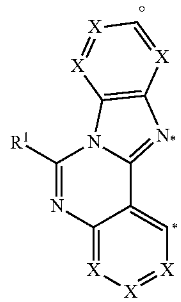
(L-18)
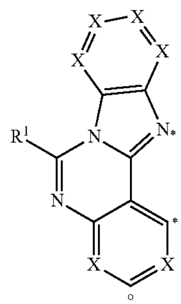
(L-19)
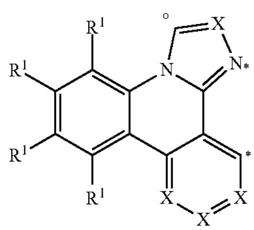
(L-20)
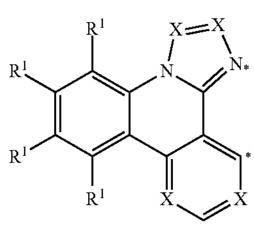
(L-21)
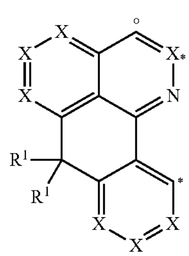
(L-22)
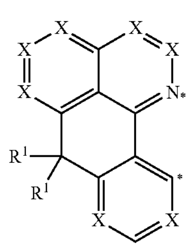
(L-23)
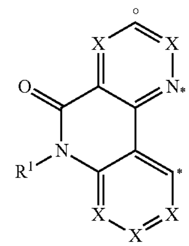
(L-24)
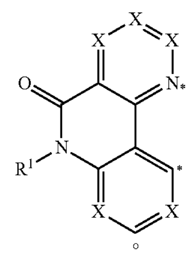
(L-25)
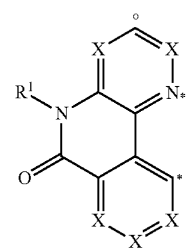
(L-26)
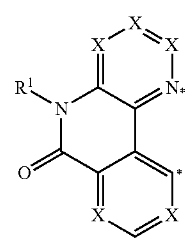
(L-27)
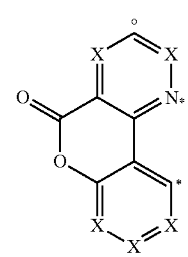
(L-28)
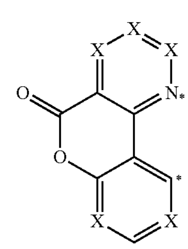

-continued (L-29)

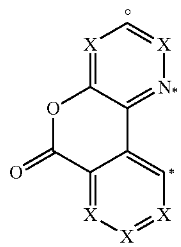

(L-30)

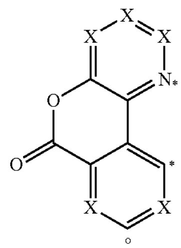

where the symbols used have the definitions given above and "o" indicates the position at which this sub-ligand is joined to the bridge V or the group of the formula (2).

In a preferred embodiment of the sub-ligands of the formulae (L-3) to (L-32), a total of one symbol X is N and the other symbols X are CR, or all symbols X are CR.

In a further embodiment of the invention, it is preferable if, in the groups (CyC-1) to (CyC-20) or (CyD-1) to (CyD-14) or in the sub-ligands (L-3) to (L-32), one of the atoms X is N when an R group bonded as a substituent adjacent to this nitrogen atom is not hydrogen or deuterium. This applies analogously to the preferred structures (CyC-1a) to (CyC-20a) or (CyD-1a) to (CyD-14b) in which a substituent bonded adjacent to a non-coordinating nitrogen atom is preferably an R group which is not hydrogen or deuterium. In this case, this substituent R is preferably a group selected from $CF_3$, $OCF_3$, alkyl groups having 1 to 10 carbon atoms, especially branched or cyclic alkyl groups having 3 to 10 carbon atoms, $OR^1$ where $R^1$ is an alkyl group having 1 to 10 carbon atoms, especially a branched or cyclic alkyl group having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

A further suitable bidentate sub-ligand is a structure of the following formula (L-31) or (L-32):

(L-31)

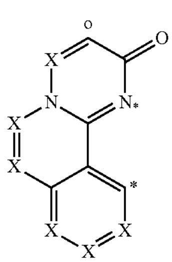

-continued (L-32)

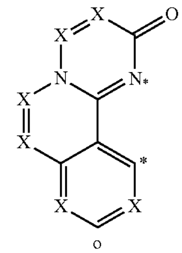

where R has the definitions given above, * represents the position of coordination to the metal, "o" represents the position of linkage of the sub-ligand to the bridge V or the bridge of the formula (2) and the other symbols used are as follows:

X is the same or different at each instance and is CR or N, with the proviso that not more than one X symbol per cycle is N.

When two R radicals bonded to adjacent carbon atoms in the sub-ligands (L-31) and (L-32) form an aromatic cycle with one another, this cycle together with the two adjacent carbon atoms is preferably a structure of the formula (41):

formula (41)

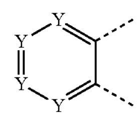

where the dotted bonds symbolize the linkage of this group within the sub-ligand and Y is the same or different at each instance and is $CR^1$ or N and preferably not more than one symbol Y is N.

In a preferred embodiment of the sub-ligand (L-31) or (L-32), not more than one group of the formula (41) is present. The sub-ligands are thus preferably sub-ligands of the following formulae (L-33) to (L-38):

(L-33)

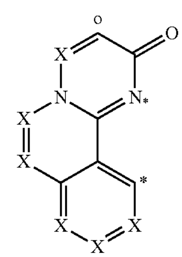

(L-34)

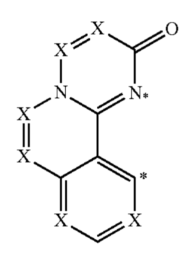

-continued (L-35)

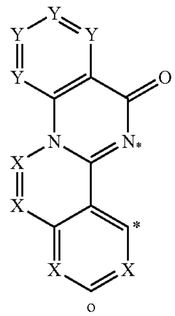

(L-36)

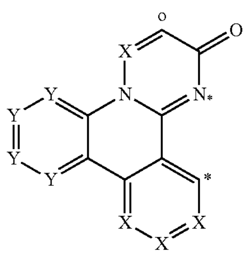

(L-37)

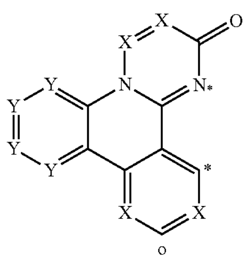

(L-38)

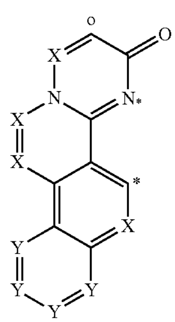

where X is the same or different at each instance and is CR or N, but the R radicals together do not form an aromatic or heteroaromatic ring system and the further symbols have the definitions given above.

In a preferred embodiment of the invention, in the sub-ligand of the formulae (L-31) to (L-38), a total of 0, 1 or 2 of the symbols X and, if present, Y are N. More preferably, a total of 0 or 1 of the symbols X and, if present, Y are N.

Preferred embodiments of the formulae (L-33) to (L-38) are the structures of the following formulae (L-33a) to (L-38f):

(L-33a)

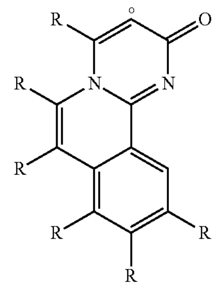

(L-33b)

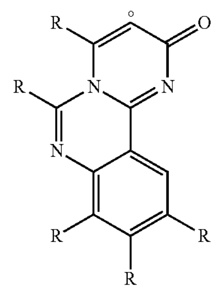

(L-33c)

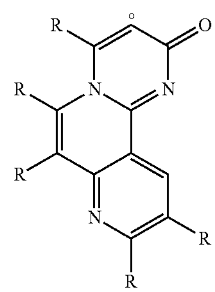

(L-33d)

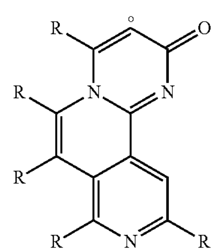

(L-34a)

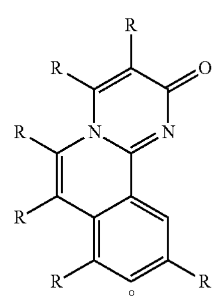

(L-34b)
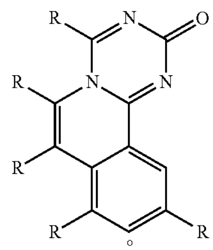
(L-34c)
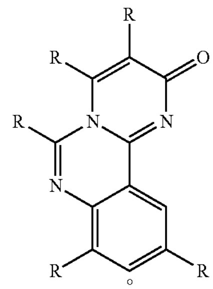
(L-34d)
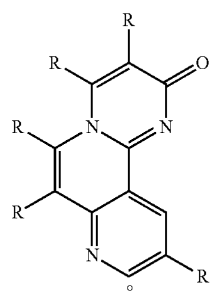
(L-35a)
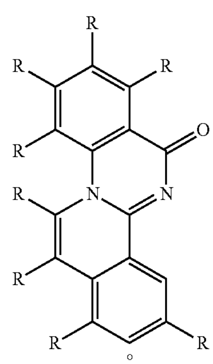
(L-35b)
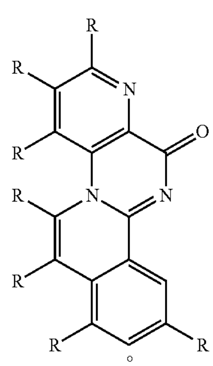
(L-35c)
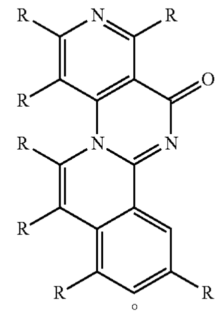
(L-35d)
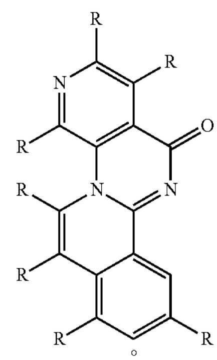
(L-35e)
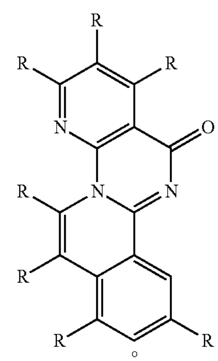
(L-35f)
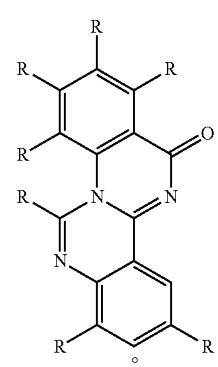

(L-35g)
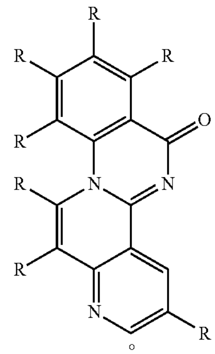
(L-36a)
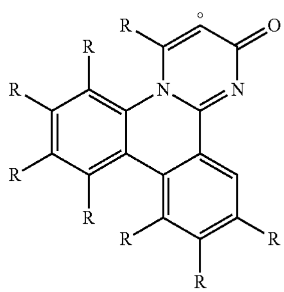
(L-36b)
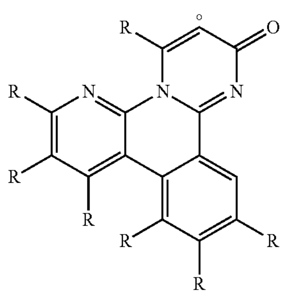
(L-36c)
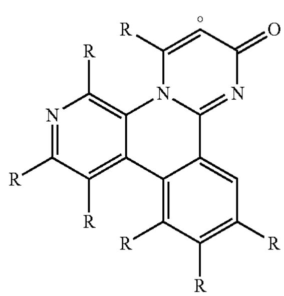
(L-36d)
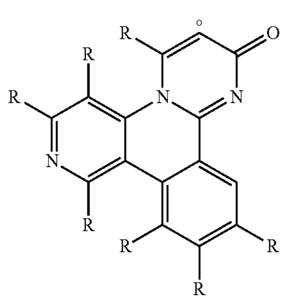
(L-36e)
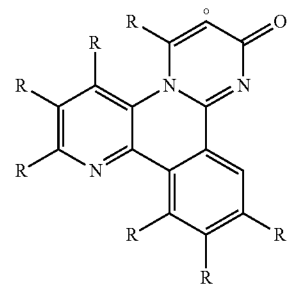
(L-36f)
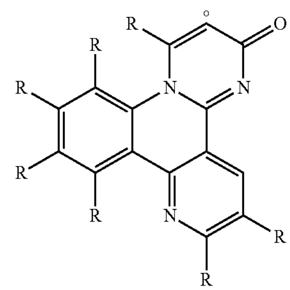
(L-36g)
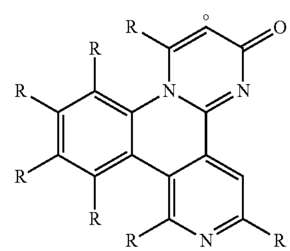
(L-37a)
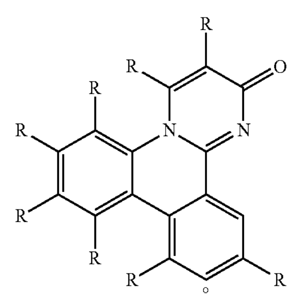
(L-37b)
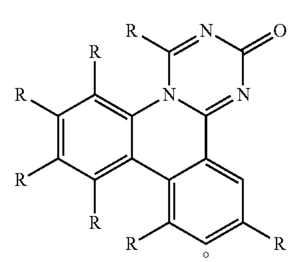

-continued
(L-37c)
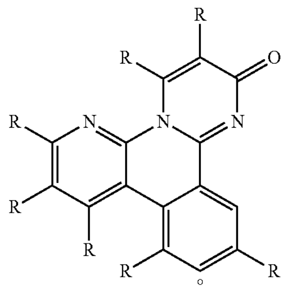
(L-37d)
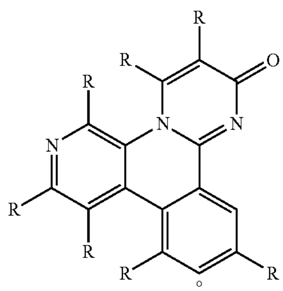
(L-37e)
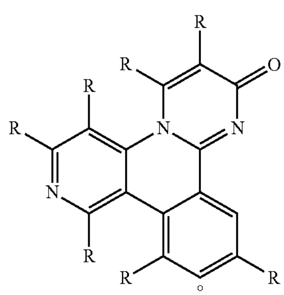
(L-37f)
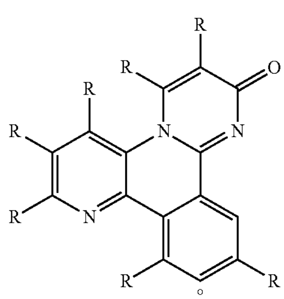
(L-37g)
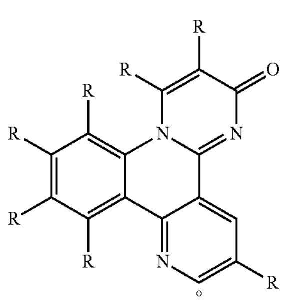
-continued
(L-38a)
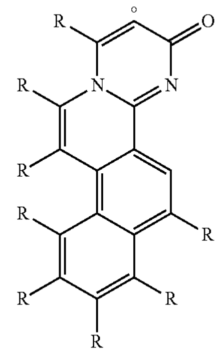
(L-38b)
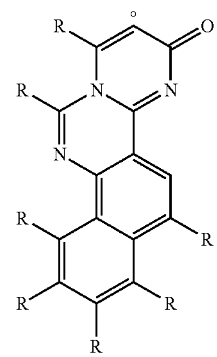
(L-38c)
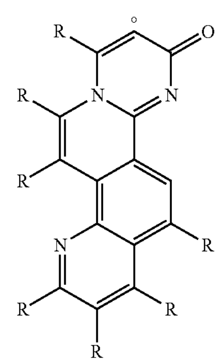
(L-38d)
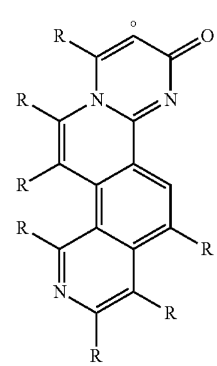

-continued (L-38e)

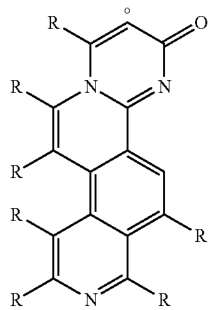

(L-38f)

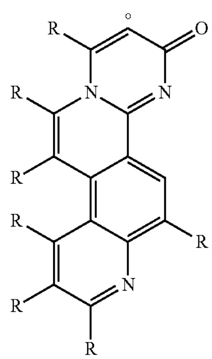

where the symbols used have the definitions given above and "o" represents the position of the linkage to the bridge V or to the bridge of the formula (2).

In a preferred embodiment of the invention, the X group in the ortho position to the coordination to the metal is CR. In this radical, R bonded in the ortho position to the coordination to the metal is preferably selected from the group consisting of H, D, F and methyl.

In a further embodiment of the invention, it is preferable, if one of the atoms X or, if present, Y is N, when a substituent bonded adjacent to this nitrogen atom is an R group which is not hydrogen or deuterium. In this case, this substituent R is preferably a group selected from $CF_3$, $OCF_3$, alkyl groups having 1 to 10 carbon atoms, especially branched or cyclic alkyl groups having 3 to 10 carbon atoms, $OR^1$ where $R^1$ is an alkyl group having 1 to 10 carbon atoms, especially a branched or cyclic alkyl group having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

When one or more of the sub-ligands $L^1$, $L^2$ or $L^3$ coordinate to the iridium via two nitrogen atoms, they are preferably the same or different and are a sub-ligand of one of the following formulae (L-39), (L-40) and (L-41):

(L-39)

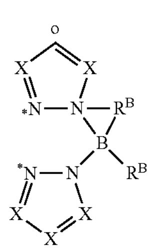

-continued (L-40)

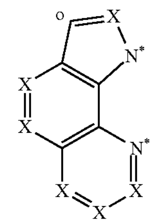

(L-41)

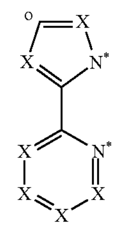

where X has the definitions given above, and where not more than one X group per ring is N, "o" indicates the position of the linkage to the bridge V or to the bridge of the formula (2) and $R^B$ is the same or different at each instance and is selected from the group consisting of F, $OR^1$, a straight-chain alkyl group having 1 to 10 carbon atoms or a branched or cyclic alkyl group having 3 to 10 carbon atoms, where the alkyl group may be substituted in each case by one or more $R^1$ radicals, or an aromatic or heteroaromatic ring system which has 5 to 24 aromatic ring atoms and may be substituted in each case by one or more $R^1$ radicals; at the same time, the two $R^B$ radicals together may also form a ring system. In this case, the sub-ligands coordinate to the iridium via the two nitrogen atoms marked by *.

When one or more of the sub-ligands $L^1$, $L^2$ or $L^3$ coordinate to the iridium via two oxygen atoms, they are preferably a sub-ligand of the following formula (L-42):

formula (L-42)

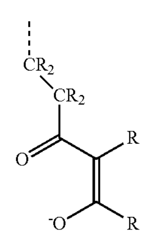

where R has the definitions given above, the sub-ligand coordinates to the iridium via the two oxygen atoms and the dotted bond indicates the linkage to the bridge V or the bridge of the formula (2). This sub-ligand is preferably bonded to a group of the formula (3) and not to a —$CR_2$—$CR_2$— group.

When one or more of the sub-ligands $L^1$, $L^2$ or $L^3$ coordinate to the iridium via one oxygen atom and one nitrogen atom, they are preferably a sub-ligand of the following formula (L-43):

formula (L-43)

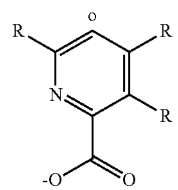

where R has the definitions given above and is preferably H, the sub-ligand coordinates to the iridium via one oxygen atom and the nitrogen atom, and "o" indicates the position of the linkage to the bridge V or the bridge of the formula (2).

There follows a description of preferred substituents as may be present on the above-described sub-ligands $L^1$, $L^2$ and $L^3$, but also on the bivalent arylene or heteroarylene group in the structures of the formulae (3) to (5).

In a preferred embodiment of the invention, the metal complex of the invention contains two R substituents or two $R^1$ substituents which are bonded to adjacent carbon atoms and together form an aliphatic ring according to one of the formulae described hereinafter. In this case, the two R substituents which form this aliphatic ring may be present on the bridge V or the bridge of the formula (2) and/or on one or more of the bidentate sub-ligands. The aliphatic ring which is formed by the ring formation by two R substituents together or by two $R^1$ substituents together is preferably described by one of the following formulae (42) to (48):

formula (42)

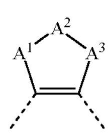

formula (43)

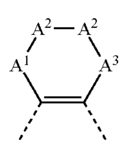

formula (44)

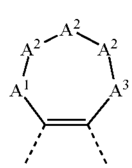

formula (45)

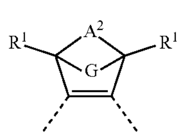

formula (46)

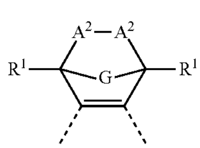

-continued formula (47)

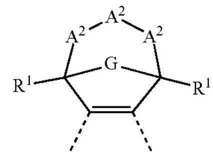

formula (48)

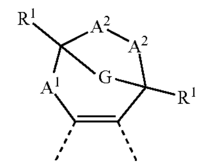

where $R^1$ and $R^2$ have the definitions given above, the dotted bonds signify the linkage of the two carbon atoms in the ligand and, in addition:

$A^1$, $A^3$ is the same or different at each instance and is $C(R^3)_2$, O, S, $NR^3$ or C(=O);

$A^2$ is $C(R^1)_2$, 0, S, $NR^3$ or C(=O); G is an alkylene group which has 1, 2 or 3 carbon atoms and may be substituted by one or more $R^2$ radicals, $—CR^2=CR^2—$ or an ortho-bonded arylene or heteroarylene group which has 5 to 14 aromatic ring atoms and may be substituted by one or more $R^2$ radicals;

$R^3$ is the same or different at each instance and is H, F, a straight-chain alkyl or alkoxy group having 1 to 10 carbon atoms, a branched or cyclic alkyl or alkoxy group having 3 to 10 carbon atoms, where the alkyl or alkoxy group may be substituted in each case by one or more $R^2$ radicals, where one or more nonadjacent $CH_2$ groups may be replaced by $R^2C=CR^2$, C≡C, $Si(R^2)_2$, C=O, $NR^2$, O, S or $CONR^2$, or an aromatic or heteroaromatic ring system which has 5 to 24 aromatic ring atoms and may be substituted in each case by one or more $R^2$ radicals, or an aryloxy or heteroaryloxy group which has 5 to 24 aromatic ring atoms and may be substituted by one or more $R^2$ radicals; at the same time, two $R^3$ radicals bonded to the same carbon atom together may form an aliphatic or aromatic ring system and thus form a spiro system; in addition, $R^3$ with an adjacent R or $R^1$ radical may form an aliphatic ring system;

with the proviso that no two heteroatoms in these groups are bonded directly to one another and no two C=O groups are bonded directly to one another.

In the above-depicted structures of the formulae (42) to (48) and the further embodiments of these structures specified as preferred, a double bond is depicted in a formal sense between the two carbon atoms. This is a simplification of the chemical structure when these two carbon atoms are incorporated into an aromatic or heteroaromatic system and hence the bond between these two carbon atoms is formally between the bonding level of a single bond and that of a double bond. The drawing of the formal double bond should thus not be interpreted so as to limit the structure; instead, it will be apparent to the person skilled in the art that this is an aromatic bond.

When adjacent radicals in the structures of the invention form an aliphatic ring system, it is preferable when the latter does not have any acidic benzylic protons. Benzylic protons are understood to mean protons which bind to a carbon atom bonded directly to the ligand. This can be achieved by virtue of the carbon atoms in the aliphatic ring system which bind directly to an aryl or heteroaryl group being fully substituted and not containing any bonded hydrogen atoms. Thus, the absence of acidic benzylic protons in the formulae (42) to (44) is achieved by virtue of $A^1$ and $A^3$, when they are $C(R^3)_2$, being defined such that $R^3$ is not hydrogen. This can additionally also be achieved by virtue of the carbon atoms in the aliphatic ring system which bind directly to an aryl or heteroaryl group being the bridgeheads in a bi- or polycyclic structure. The protons bonded to bridgehead carbon atoms, because of the spatial structure of the bi- or polycycle, are significantly less acidic than benzylic protons on carbon atoms which are not bonded within a bi- or polycyclic structure, and are regarded as non-acidic protons in the context of the present invention. Thus, the absence of acidic benzylic protons in formulae (45) to (48) is achieved by virtue of this being a bicyclic structure, as a result of which $R^1$, when it is H, is much less acidic than benzylic protons since the corresponding anion of the bicyclic structure is not mesomerically stabilized. Even when $R^1$ in formulae (45) to (48) is H, this is therefore a non-acidic proton in the context of the present application.

In a preferred embodiment of the invention, $R^3$ is not H.

In a preferred embodiment of the structure of the formulae (42) to (48), not more than one of the $A^1$, $A^2$ and $A^3$ groups is a heteroatom, especially 0 or $NR^3$, and the other groups are $C(R^3)_2$ or $C(R^1)_2$, or $A^1$ and $A^3$ are the same or different at each instance and are O or $NR^3$ and $A^2$ is $C(R^1)_2$. In a particularly preferred embodiment of the invention, $A^1$ and $A^3$ are the same or different at each instance and are $C(R^3)_2$, and $A^2$ is $C(R^1)_2$ and more preferably $C(R^3)_2$ or $CH_2$.

Preferred embodiments of the formula (42) are thus the structures of the formulae (42-A), (42-B), (42-C) and (42-D), and a particularly preferred embodiment of the formula (42-A) is the structures of the formulae (42-E) and (42-F):

formula (42-A)

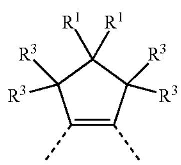

formula (42-B)

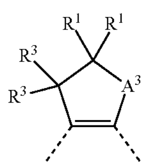

formula (42-C)

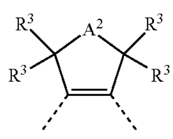

formula (42-D)

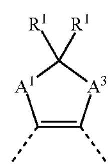

formula (42-E)

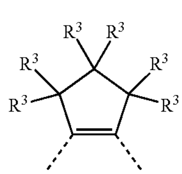

-continued formula (42-F)

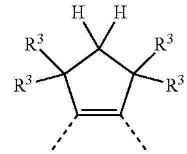

where $R^1$ and $R^3$ have the definitions given above and $A^1$, $A^2$ and $A^3$ are the same or different at each instance and are O or $NR^3$.

Preferred embodiments of the formula (43) are the structures of the following formulae (43-A) to (43-F):

formula (43-A)

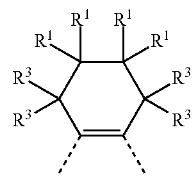

formula (43-B)

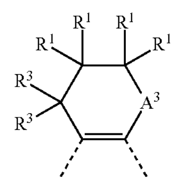

formula (43-C)

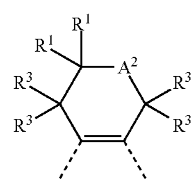

formula (43-D)

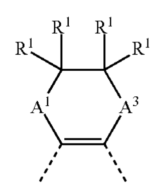

formula (43-E)

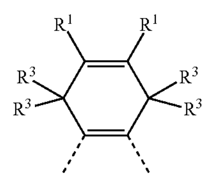

formula (43-F)

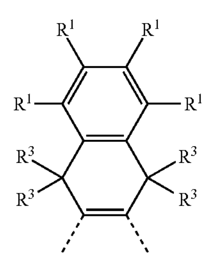

where $R^1$ and $R^3$ have the definitions given above and $A^1$, $A^2$ and $A^3$ are the same or different at each instance and are O or $NR^3$.

Preferred embodiments of the formula (46) are the structures of the following formulae (44-A) to (44-E):

formula (44-A)

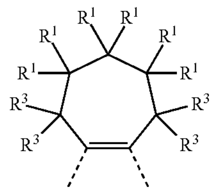

formula (44-B)

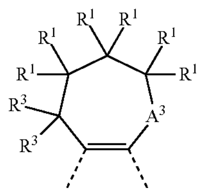

formula (44-C)

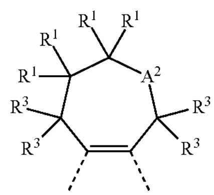

formula (44-D)

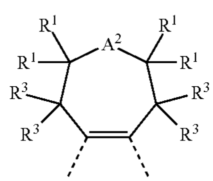

formula (44-E)

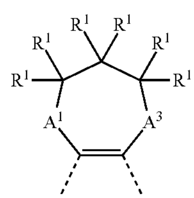

where $R^1$ and $R^3$ have the definitions given above and $A^1$, $A^2$ and $A^3$ are the same or different at each instance and are O or $NR^3$.

In a preferred embodiment of the structure of formula (45), the $R^1$ radicals bonded to the bridgehead are H, D, F or $CH_3$. Further preferably, $A^2$ is $C(R^1)_2$ or O, and more preferably $C(R^3)_2$. Preferred embodiments of the formula (45) are thus structures of the formulae (45-A) and (45-B), and a particularly preferred embodiment of the formula (45-A) is a structure of the formula (45-C):

formula (45-A)

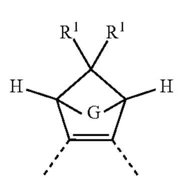

-continued formula (45-B)

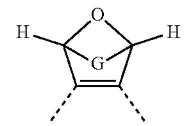

formula (45-C)

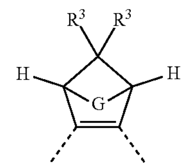

where the symbols used have the definitions given above.

In a preferred embodiment of the structures of the formulae (46), (47) and (48), the $R^1$ radicals bonded to the bridgehead are H, D, F or $CH_3$. Further preferably, $A^2$ is $C(R^1)_2$. Preferred embodiments of the formulae (46), (47) and (48) are thus the structures of the formulae (46-A), (47-A) and (48-A):

formula (46-A)

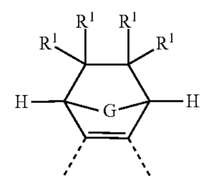

formula (47-A)

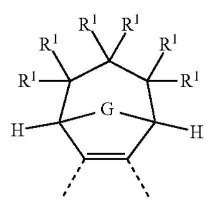

formula (48-A)

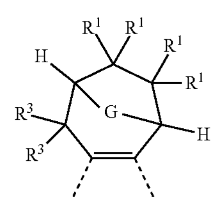

where the symbols used have the definitions given above.

Further preferably, the G group in the formulae (45), (45-A), (45-B), (45-C), (46), (46-A), (47), (47-A), (48) and (48-A) is a 1,2-ethylene group which may be substituted by one or more $R^2$ radicals, where $R^2$ is preferably the same or different at each instance and is H or an alkyl group having 1 to 4 carbon atoms, or an ortho-arylene group which has 6 to 10 carbon atoms and may be substituted by one or more $R^2$ radicals, but is preferably unsubstituted, especially an ortho-phenylene group which may be substituted by one or more $R^2$ radicals, but is preferably unsubstituted.

In a further preferred embodiment of the invention, $R^3$ in the groups of the formulae (42) to (48) and in the preferred embodiments is the same or different at each instance and is F, a straight-chain alkyl group having 1 to carbon atoms or a branched or cyclic alkyl group having 3 to 20 carbon atoms, where one or more nonadjacent $CH_2$ groups in each case may be replaced by $R^2C{=}CR^2$ and one or more hydrogen atoms may be replaced by D or F, or an aromatic or heteroaromatic ring system which has 5 to 14 aromatic ring atoms and may be substituted in each case by one or more $R^2$ radicals; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

In a particularly preferred embodiment of the invention, $R^3$ in the groups of the formulae (42) to (48) and in the preferred embodiments is the same or different at each instance and is F, a straight-chain alkyl group having 1 to 3 carbon atoms, especially methyl, or an aromatic or heteroaromatic ring system which has 5 to 12 aromatic ring atoms and may be substituted in each case by one or more $R^2$ radicals, but is preferably unsubstituted; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

Examples of particularly suitable groups of the formula (42) are the structures listed below:

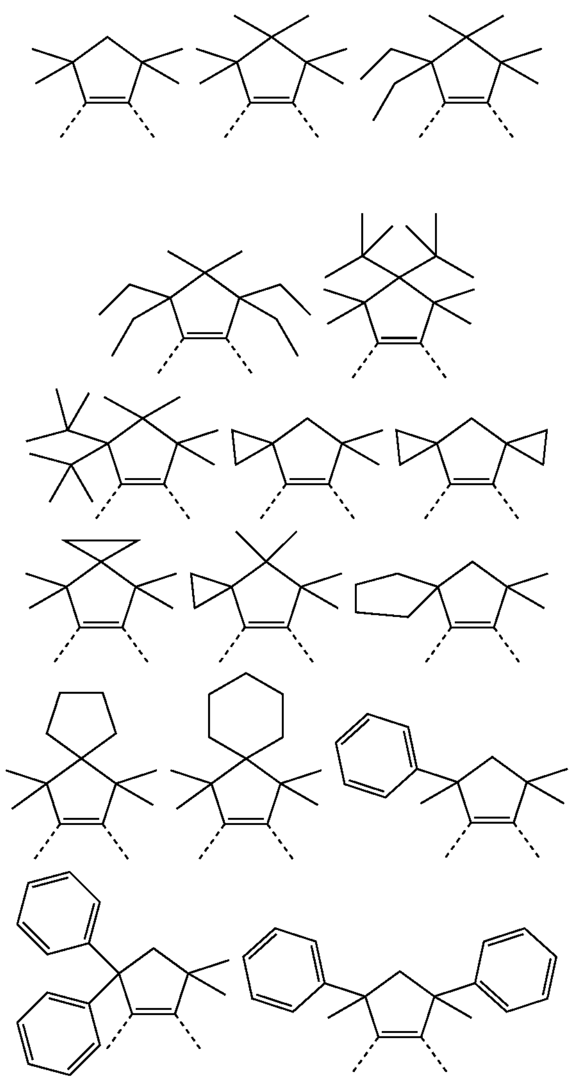

-continued

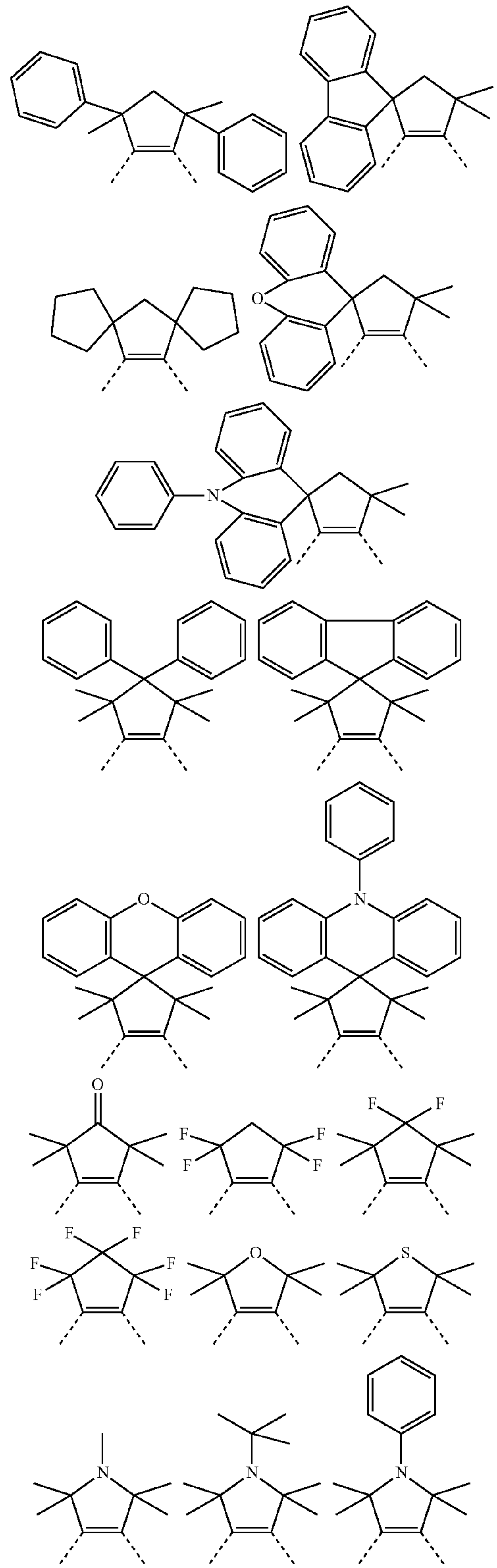

-continued
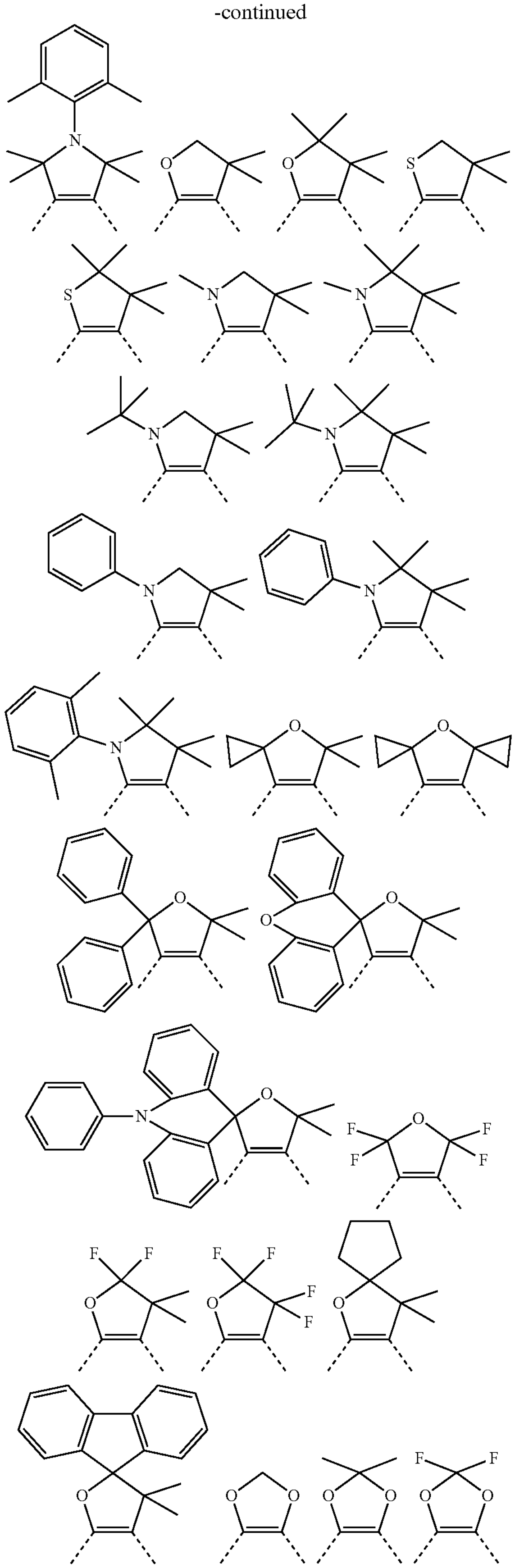
-continued
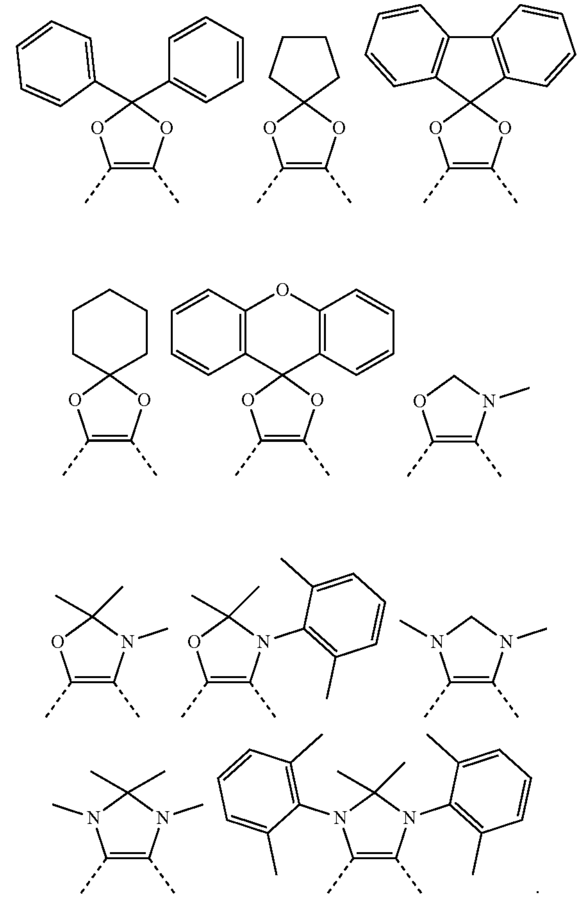
Examples of particularly suitable groups of the formula (43) are the structures listed below:
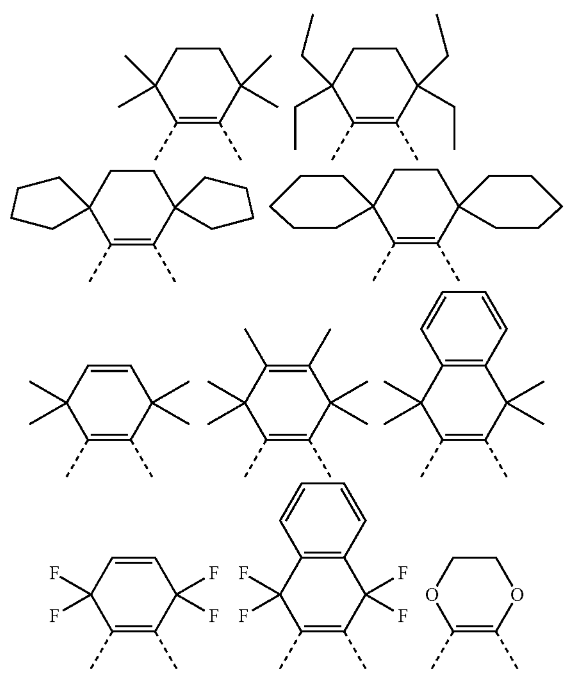

-continued

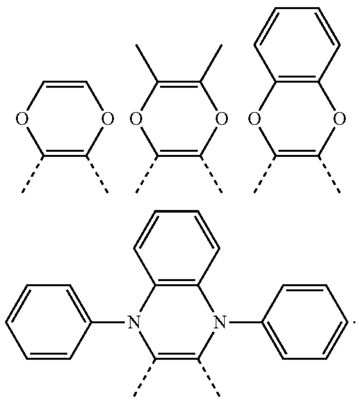

Examples of particularly suitable groups of the formulae (44), (46) and (47) are the structures listed below:

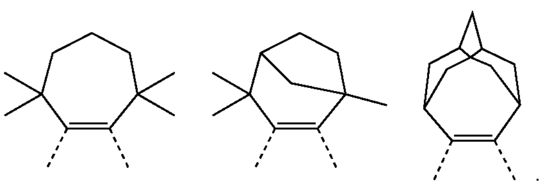

Examples of particularly suitable groups of the formula (45) are the structures listed below:

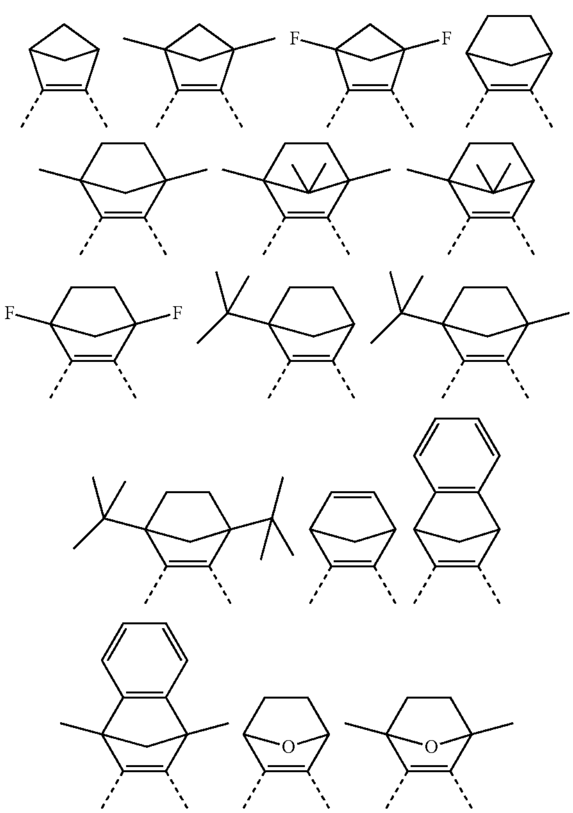

-continued

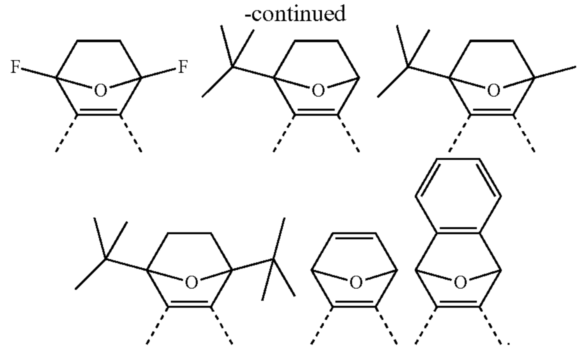

Examples of particularly suitable groups of the formula (46) are the structures listed below:

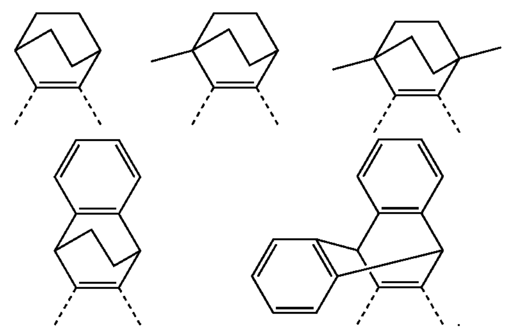

In a further preferred embodiment of the invention, at least one of the sub-ligands $L^1$, $L^2$ and $L^3$, preferably exactly one of the sub-ligands $L^1$, $L^2$ and $L^3$, has a substituent of one of the following formulae (49) and (50):

formula (49)

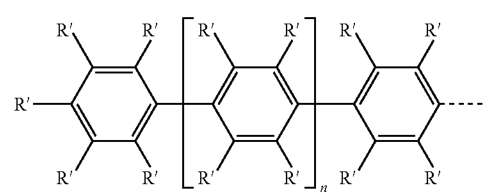

formula (50)

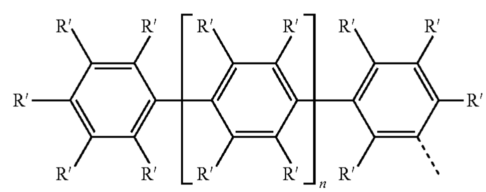

where the dotted bond indicates the linkage of the group and, in addition:

R' is the same or different at each instance and is H, D, F, CN, a straight chain alkyl group having 1 to 10 carbon atoms in which one or more hydrogen atoms may also be replaced by D or F, or a branched or cyclic alkyl group having 3 to 10 carbon atoms in which one or more hydrogen atoms may also be replaced by D or F, or an alkenyl group having 2 to 10 carbon atoms in which one or more hydrogen atoms may also be replaced by D or F; at the same time, two adjacent R' radicals or two R' radicals on adjacent phenyl groups together may also form a ring system; or two R' on adjacent phenyl groups together are a group selected from $NR^1$, O and S, such that the two phenyl rings together with the bridging group are a dibenzofuran or dibenzothiophene, and the further R' are as defined above;

n is 0, 1, 2, 3, 4 or 5.

In this case, the $R^1$ radical on the nitrogen is as defined above and is preferably an alkyl group having 1 to 10 carbon atoms or an aromatic or heteroaromatic ring system which has 6 to 24 aromatic ring atoms and may be substituted by one or more $R^2$ radicals, more preferably an aromatic or heteroaromatic ring system which has 6 to 18 aromatic ring atoms and may be substituted by one or more $R^2$ radicals, but is preferably unsubstituted.

In a preferred embodiment of the invention, n=0, 1 or 2, preferably 0 or 1 and most preferably 0.

In a further preferred embodiment of the invention, the two substituents R' bonded in the ortho positions to the carbon atom by which the group of the formula (49) or (50) is bonded to the sub-ligands $L^1$, $L^2$ and $L^3$ are the same or different and are H or D.

Preferred embodiments of the structure of the formula (49) are the structures of the formulae (49a) to (49h), and preferred embodiments of the structure of the formula (50) are the structures of the formulae (50a) to (50h):

formula (49a)

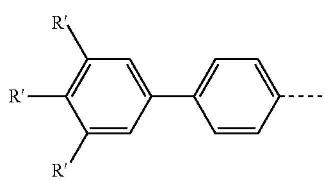

formula (49b)

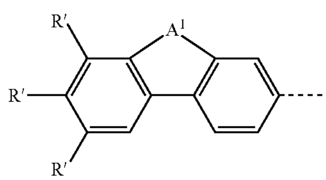

formula (49c)

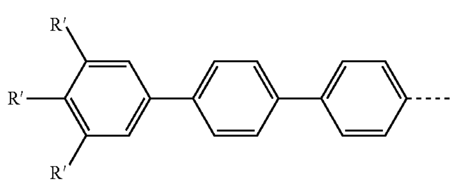

formula (49d)

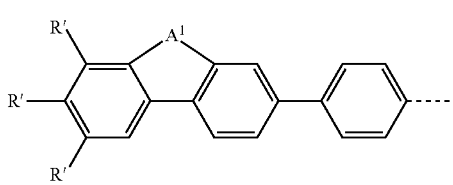

-continued formula (49e)

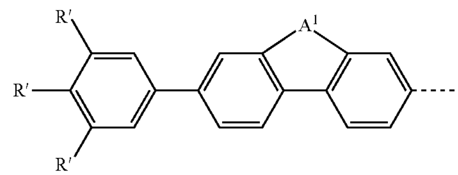

formula (49f)

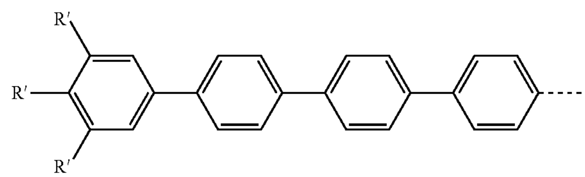

(formula 49g)

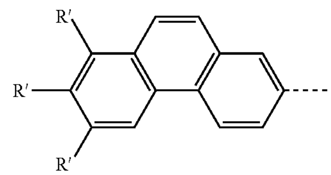

formula (49h)

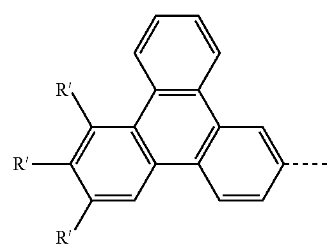

formula (50a)

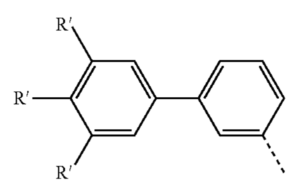

formula (50b)

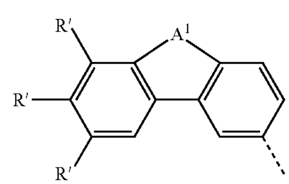

formula (50c)

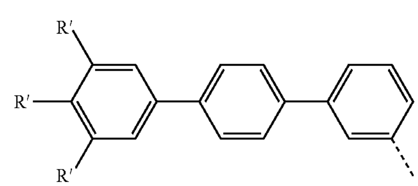

formula (50d)

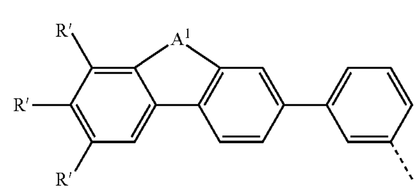

-continued formula (50e)

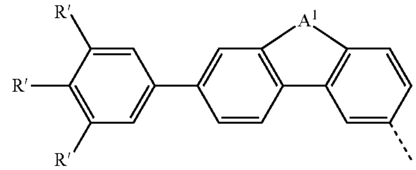

formula (50f)

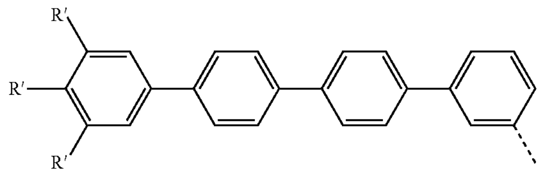

formula (50g)

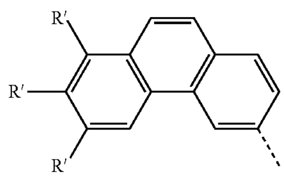

formula (50h)

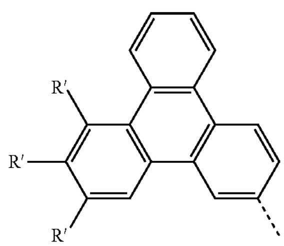

where $A^1$ is O, S, $C(R^1)_2$ or $NR^1$ and the further symbols used have the definitions given above. In this case, $R^1$, when $A^1$=$NR^1$, is preferably an aromatic or heteroaromatic ring system which has 6 to 18 aromatic ring atoms and may be substituted by one or more $R^2$ radicals, but is preferably unsubstituted. In addition, $R^1$, when $A^1$=$C(R^1)_2$, is preferably the same or different at each instance and is an alkyl group having 1 to 6 carbon atoms, preferably having 1 to 4 carbon atoms, more preferably methyl groups.

Preferred substituents R' on the groups of the formula (49) or (50) or the preferred embodiments are selected from the group consisting of H, D, CN and an alkyl group having 1 to 4 carbon atoms, more preferably H, D, methyl, cyclopentyl, 1-methylcyclopentyl, cyclohexyl or 1-methylcyclohexyl, especially H, D or methyl.

Preferably, none of the sub-ligands except for the group of the formula (49) or (50) has further aromatic or heteroaromatic substituents having more than 10 aromatic ring atoms.

In a preferred embodiment of the invention, the substituent of the formula (49) or (50) is bonded in the para position to the coordination to the iridium, more preferably to CyD. When $L^1$, $L^2$ and $L^3$ are not all the same, it is preferable when the substituent of the formula (49) or (50) is bonded to the sub-ligand which, on coordination to the iridium, leads to the furthest red-shifted emission. Which sub-ligand that is can be determined by quantum-chemical calculation on corresponding complexes that each contain three identical sub-ligands and have three identical units $V^1$, $V^2$ and $V^3$.

It is preferable here when the group of the formula (49) or (50) is bonded to the ligand $L^1$, i.e. to the ligand bridged via a group of the formula (3) to the central cycle of the bridgehead. This is especially true when the $V^3$ group is identical to the $V^2$ group, i.e. when the bridgehead has two —$CR_2$—$CR_2$— groups or the other alternatives for $V^2$, and when the three sub-ligands $L^1$, $L^2$ and $L^3$ have the same base structure. By virtue of the linkage of $L^1$ to the ortho-arylene group or ortho-heteroarylene group of the formula (3), this part of the complex has lower triplet energy than the sub-ligand $L^2$ and $L^3$, and so the emission of the complex comes predominantly from the $L^1$-Ir substructure. The substitution of the sub-ligand $L^1$ by a group of the formula (49) or (50) then leads to a distinct improvement in efficiency.

Very particular preference is given to compounds in which $V^2$ and $V^3$ are —$CR_2$—$CR_2$— and the sub-ligand $L^1$ has a structure of the formula (L-1-1) or (L-2-1), where the group of the formula (49) or (50) is bonded in para position to the iridium to the six-membered ring that binds to the iridium via a nitrogen atom. Preferably, the emission of the $V^2$-$L^2$ and $V^3$-$L^3$ units is blue-shifted relative to the emission of $V^1$-$L^1$.

When the compounds of the invention have R radicals that do not correspond to the above-described R radicals, these R radicals are the same or different at each instance and are preferably selected from the group consisting of H, D, F, Br, I, $N(R^1)_2$, CN, $Si(R^1)_3$, $B(OR^1)_2$, $C(=O)R^1$, a straight-chain alkyl group having 1 to 10 carbon atoms or an alkenyl group having 2 to 10 carbon atoms or a branched or cyclic alkyl group having 3 to 10 carbon atoms, where the alkyl or alkenyl group may be substituted in each case by one or more $R^1$ radicals, or an aromatic or heteroaromatic ring system which has 5 to 30 aromatic ring atoms and may be substituted in each case by one or more $R^1$ radicals; at the same time, two adjacent R radicals together or R together with $R^1$ may also form a mono- or polycyclic, aliphatic or aromatic ring system. More preferably, these R radicals are the same or different at each instance and are selected from the group consisting of H, D, F, $N(R^1)_2$, a straight-chain alkyl group having 1 to 6 carbon atoms or a branched or cyclic alkyl group having 3 to 10 carbon atoms, where one or more hydrogen atoms may be replaced by D or F, or an aromatic or heteroaromatic ring system which has 5 to 24 aromatic ring atoms and may be substituted in each case by one or more $R^1$ radicals; at the same time, two adjacent R radicals together or R together with $R^1$ may also form a mono- or polycyclic, aliphatic or aromatic ring system.

Preferred $R^1$ radicals bonded to R are the same or different at each instance and are H, D, F, $N(R^2)_2$, CN, a straight-chain alkyl group having 1 to 10 carbon atoms or an alkenyl group having 2 to 10 carbon atoms or a branched or cyclic alkyl group having 3 to 10 carbon atoms, where the alkyl group may be substituted in each case by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a mono- or polycyclic aliphatic ring system. Particularly preferred $R^1$ radicals bonded to R are the same or different at each instance and are H, F, CN, a straight-chain alkyl group having 1 to 5 carbon atoms or a branched or cyclic alkyl group having 3 to 5 carbon atoms, each of which may be substituted by one or more $R^2$ radicals, or an aromatic or heteroaromatic ring system which has 5 to 13 aromatic ring atoms and may be substituted in each case by one or more $R^2$ radicals; at the same time, two or more adjacent $R^1$ radicals together may form a mono- or polycyclic aliphatic ring system.

Preferred $R^2$ radicals are the same or different at each instance and are H, F or an aliphatic hydrocarbyl radical having 1 to 5 carbon atoms or an aromatic hydrocarbyl radical having 6 to 12 carbon atoms; at the same time, two or more $R^2$ substituents together may also form a mono- or polycyclic aliphatic ring system.

The abovementioned preferred embodiments can be combined with one another as desired. In a particularly preferred embodiment of the invention, the abovementioned preferred embodiments apply simultaneously.

Examples of suitable structures of the invention are the compounds depicted below.

1

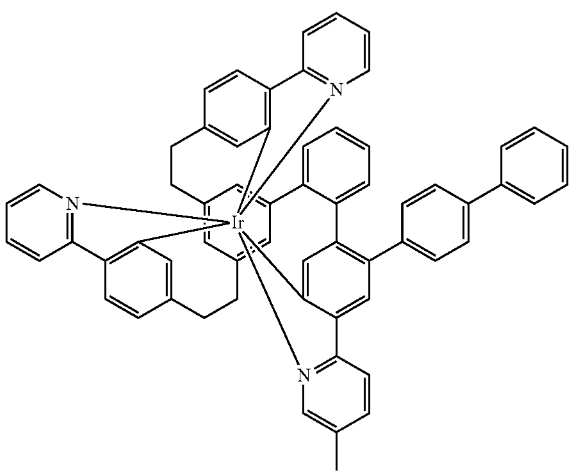

2

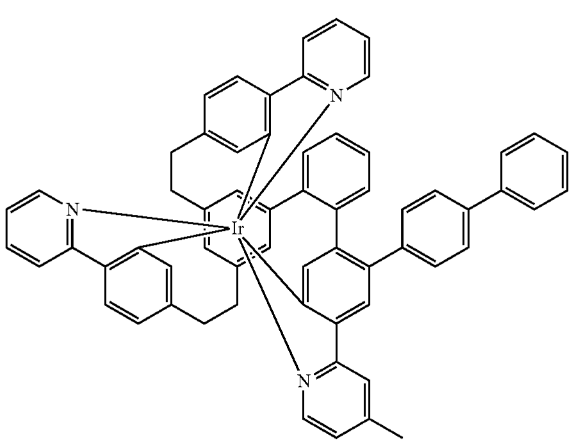

-continued

3

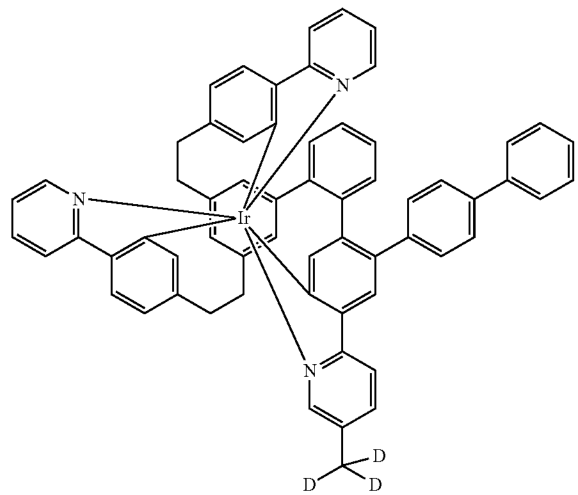

4

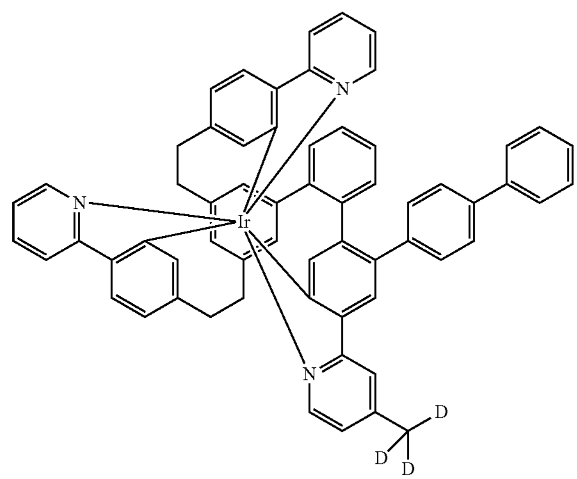

5

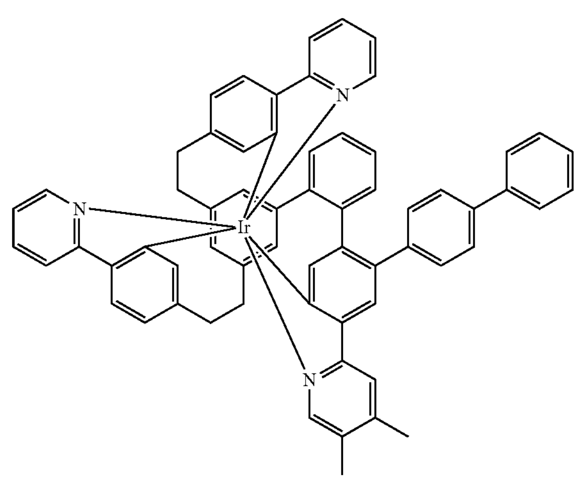

6
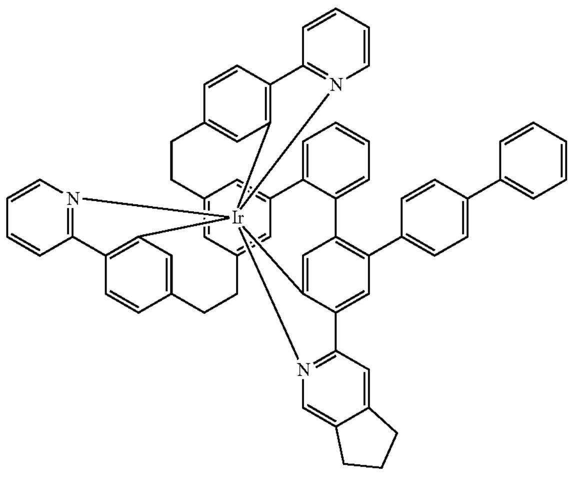
7
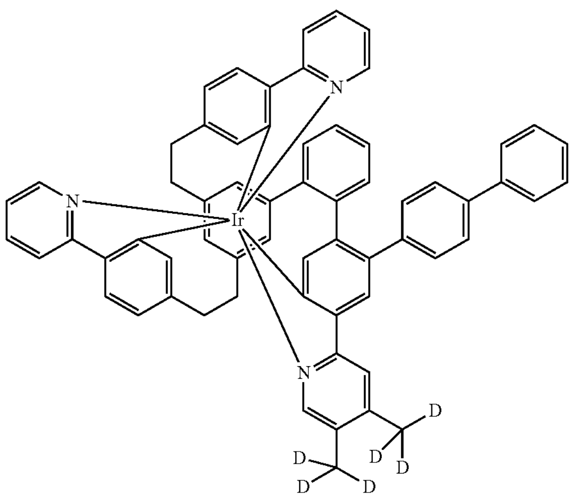
8
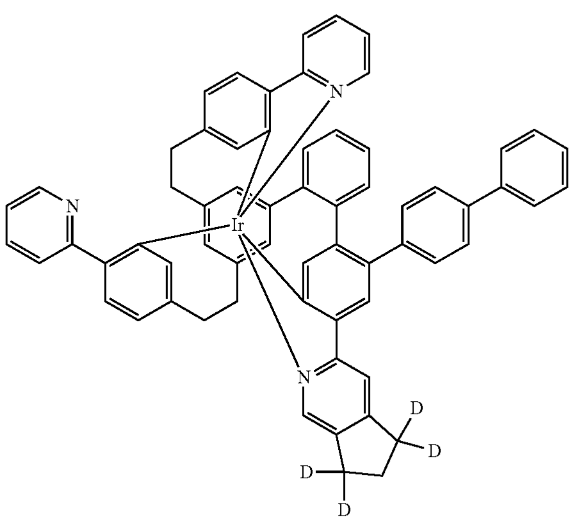
9
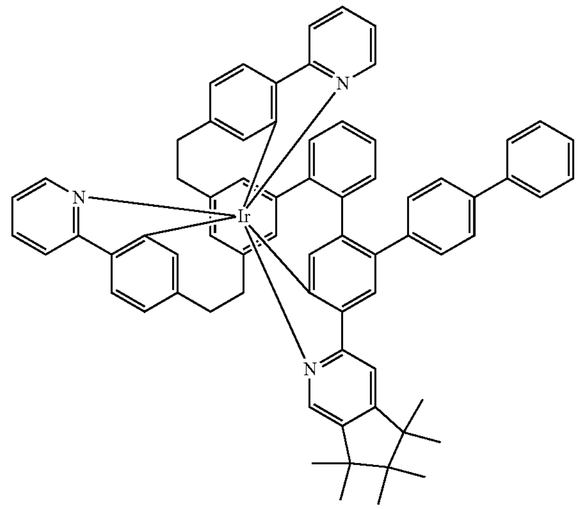
10
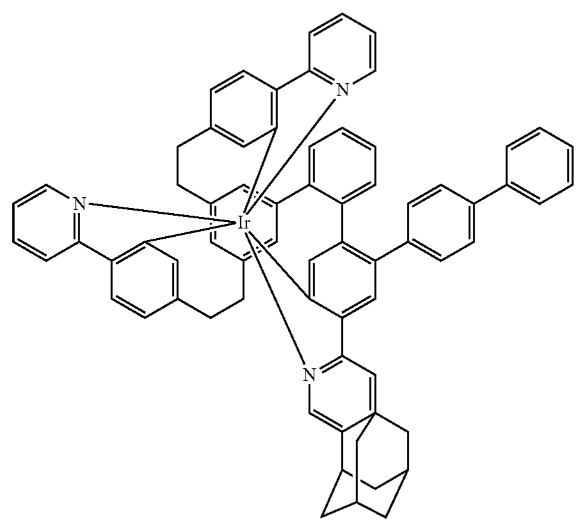
11
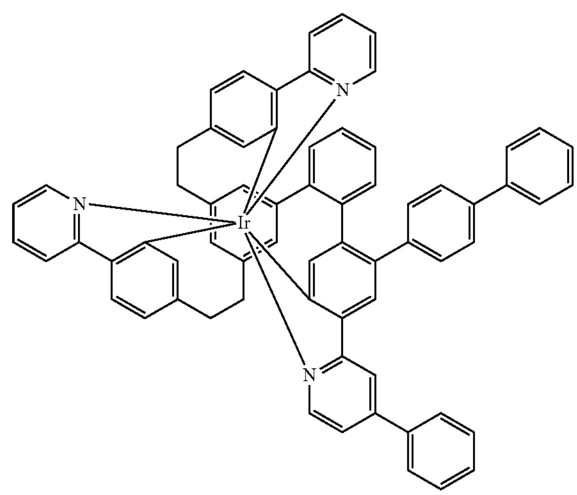

-continued
12
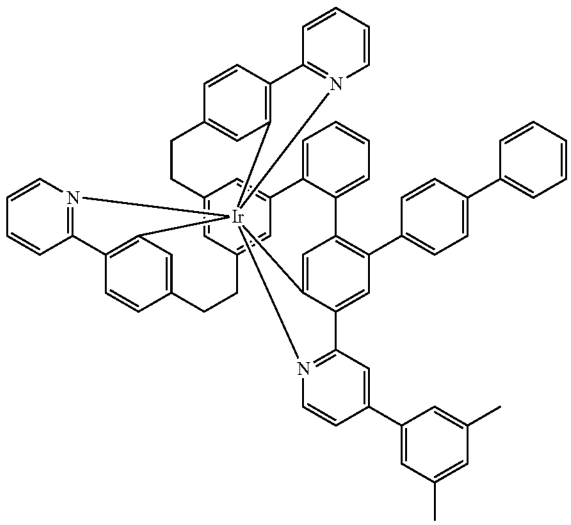
13
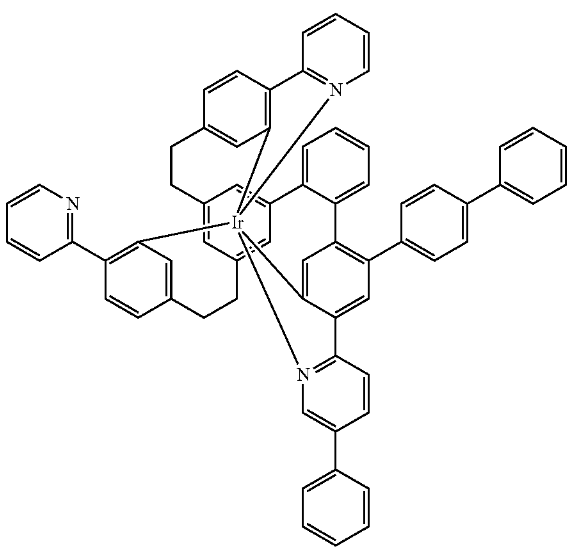
14
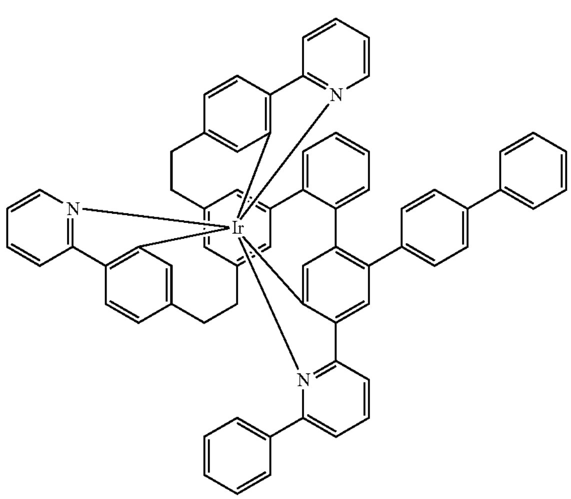
-continued
15
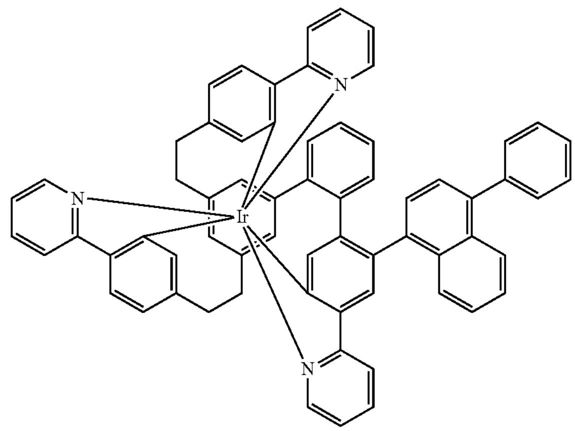
16
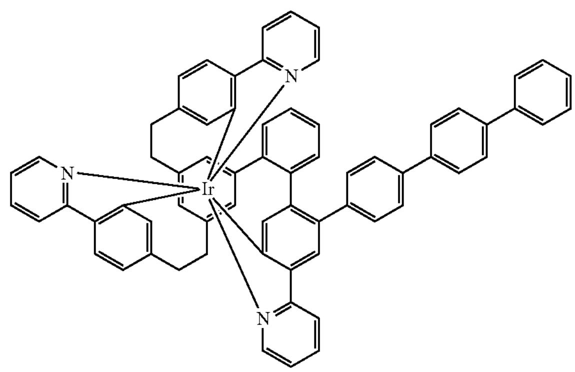
17
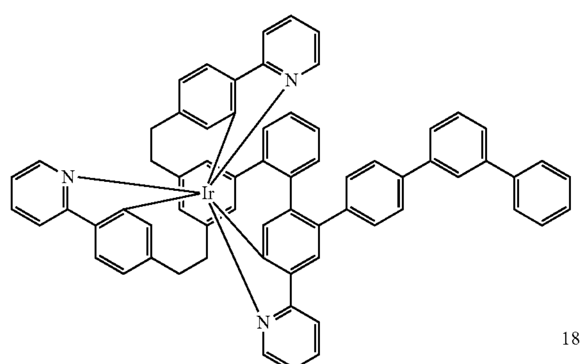
18
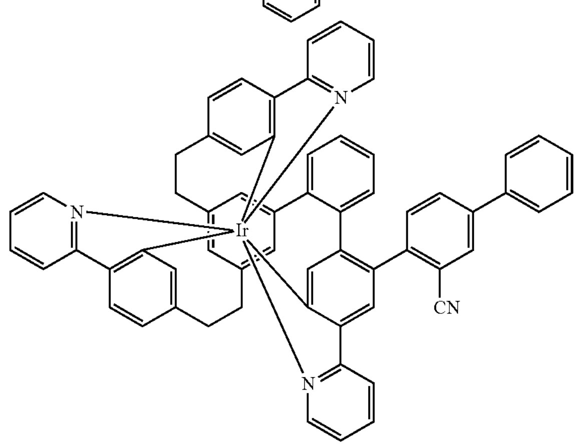

-continued
19
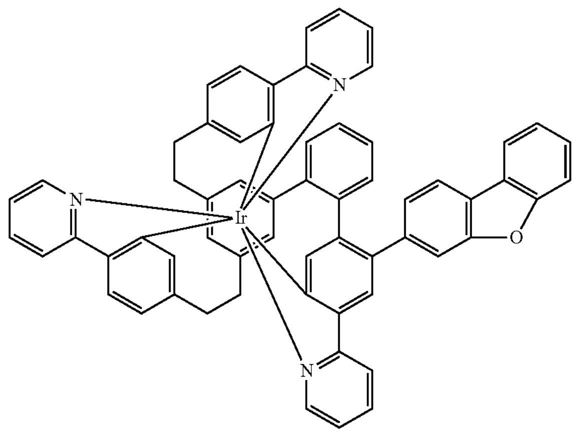
20
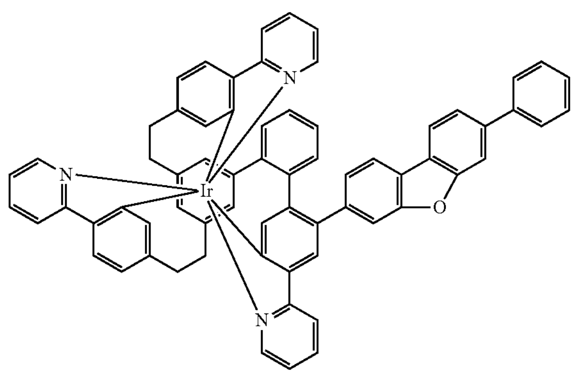
21
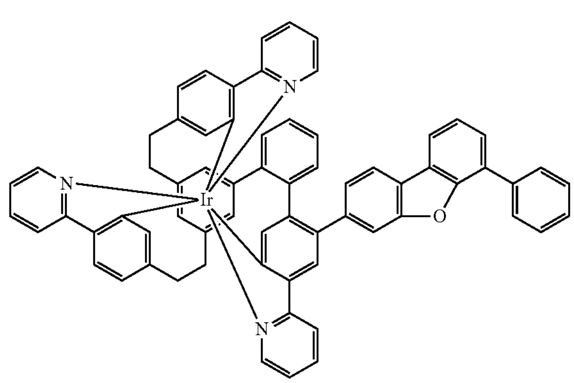
-continued
22
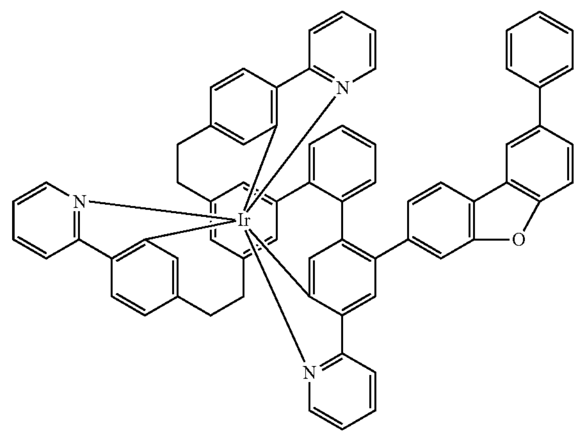
23
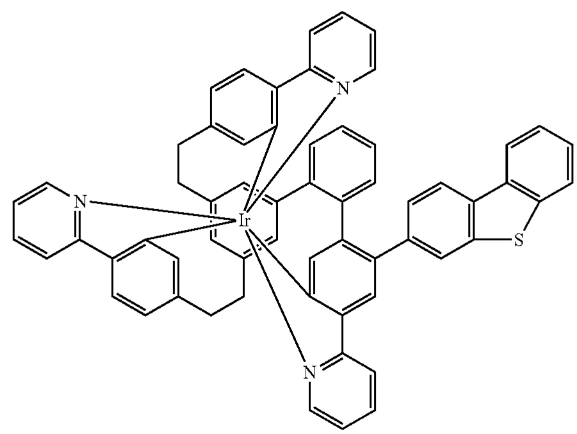
24
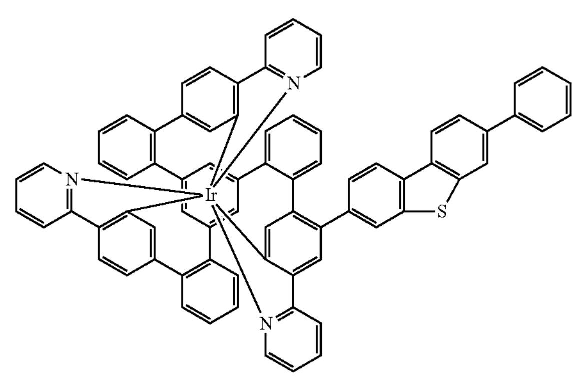

-continued
25
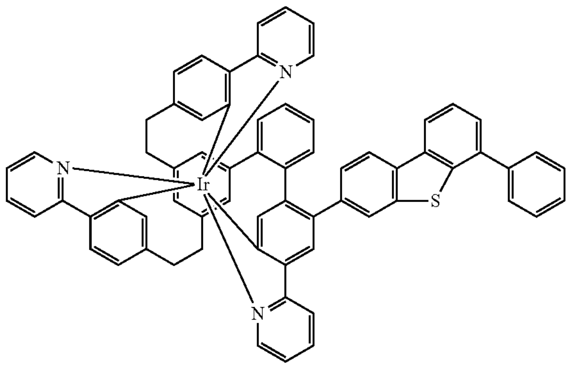
26
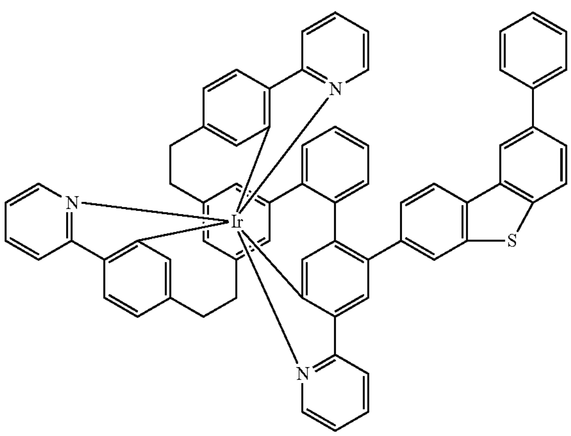
27
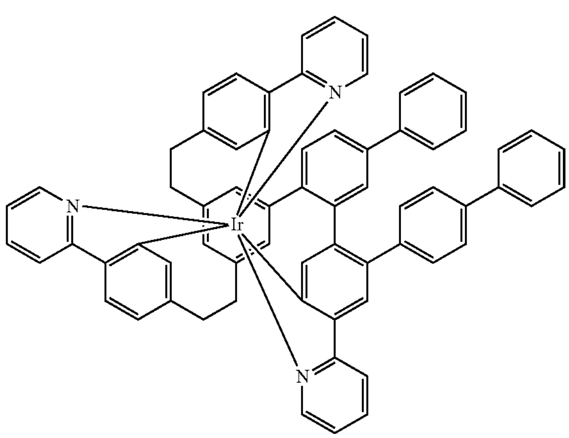
-continued
28
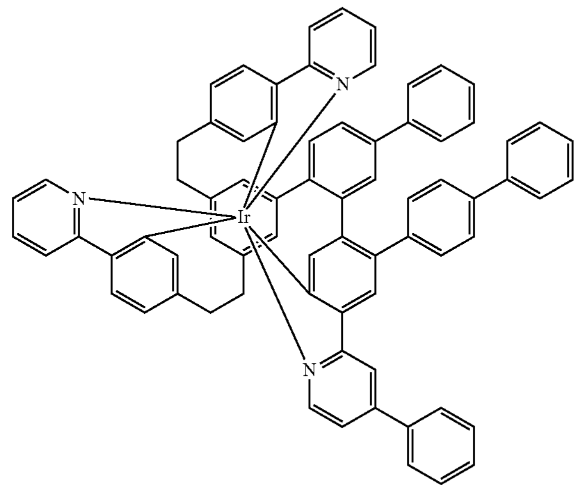
29
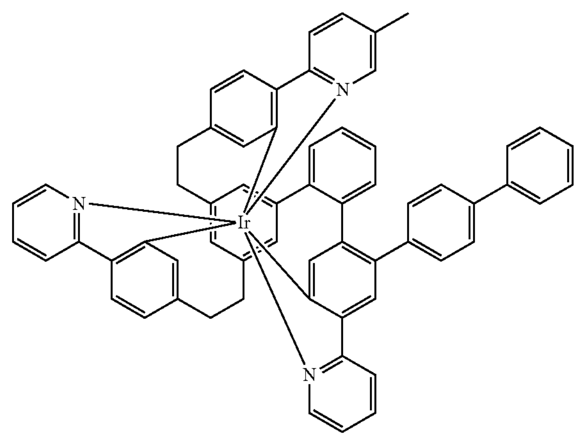
30
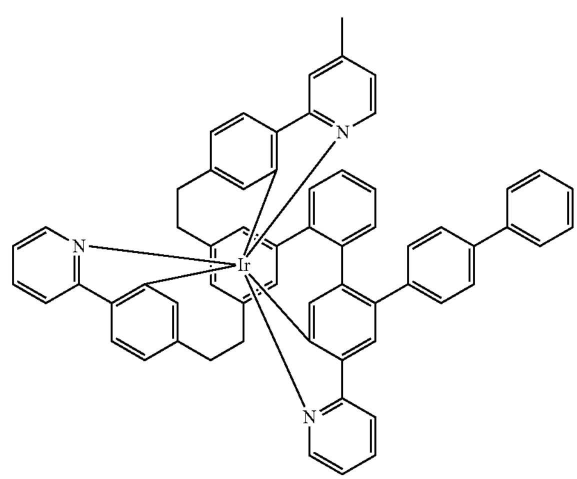

31
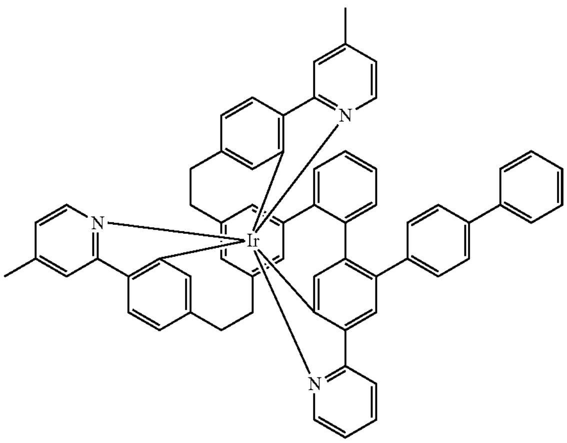
32
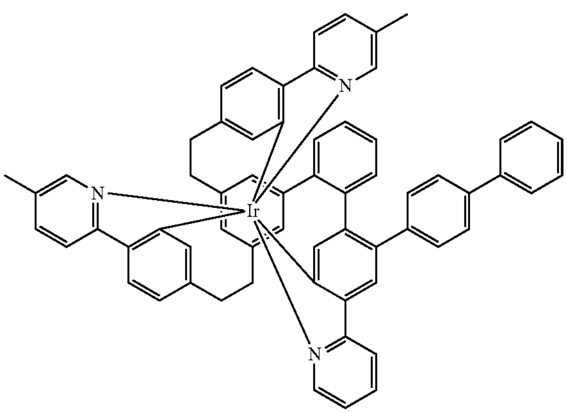
33
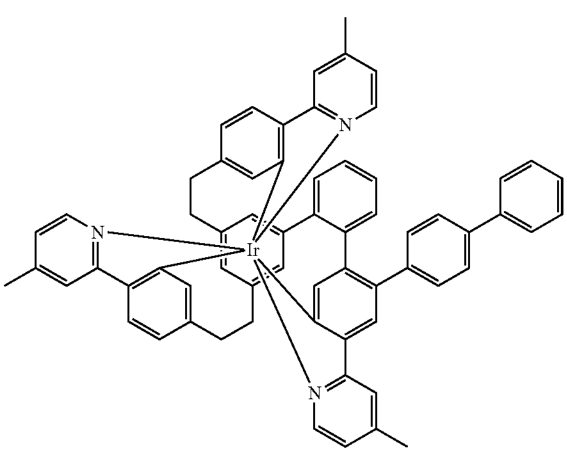
34
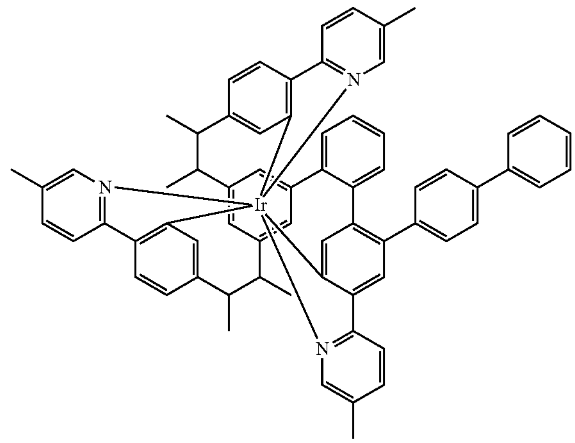
35
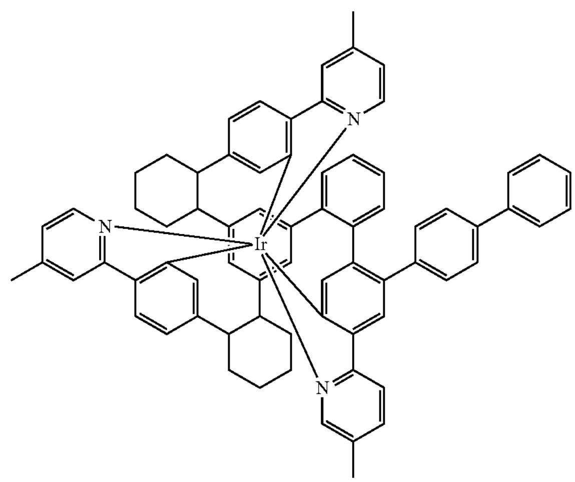
36
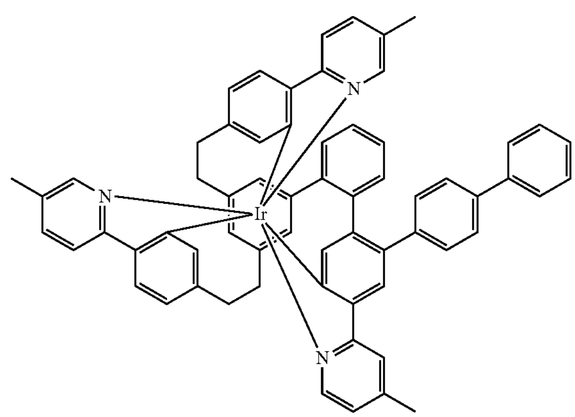

37
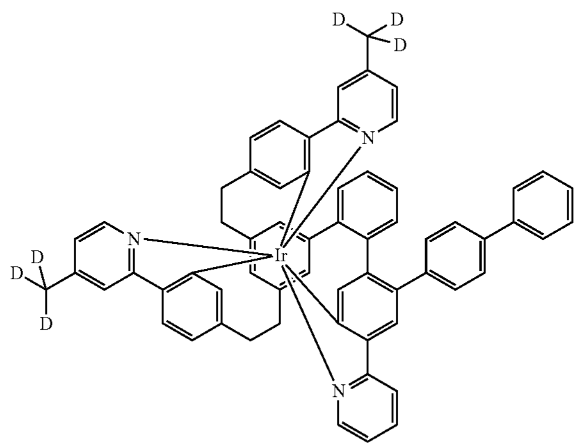
38
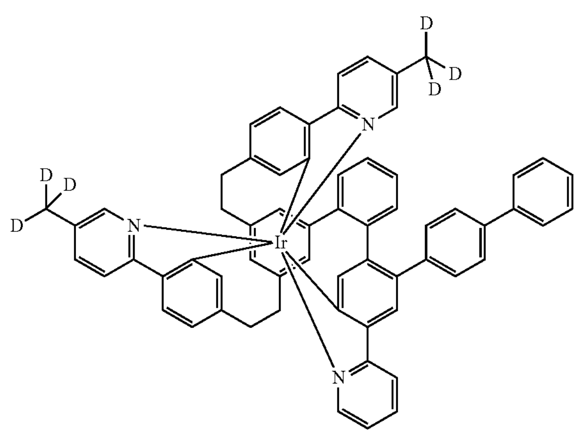
39
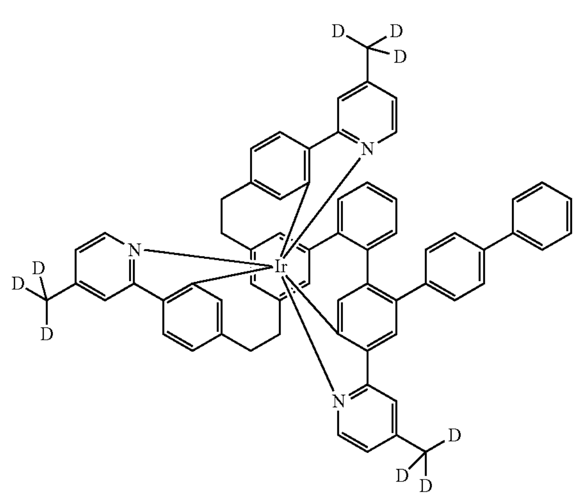
40
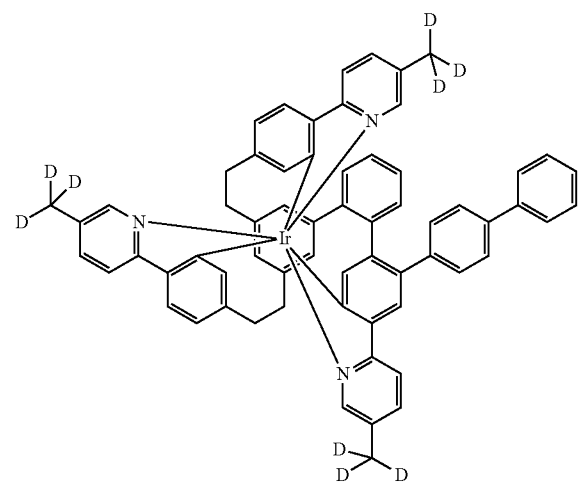
41
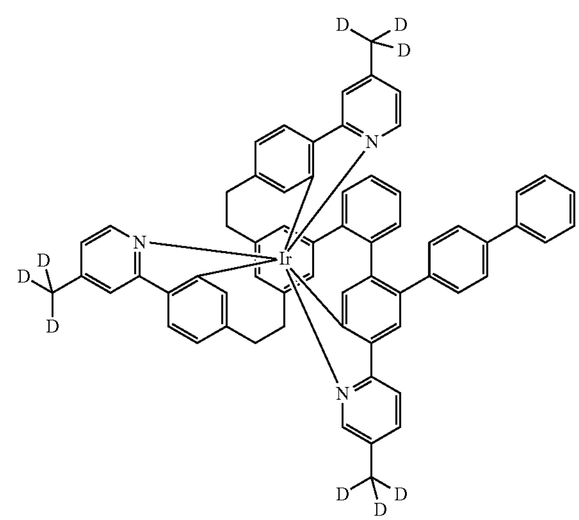
42
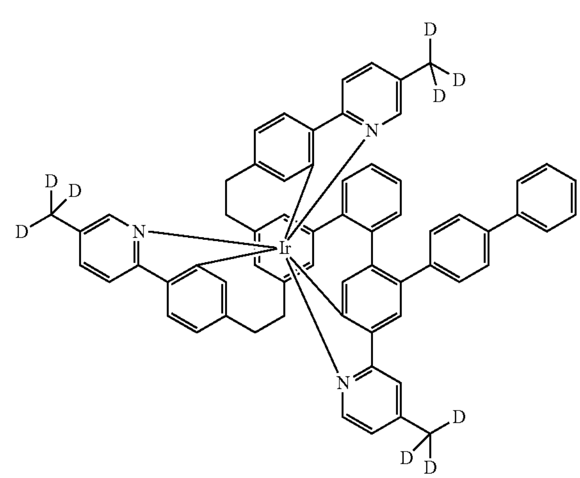

-continued
43
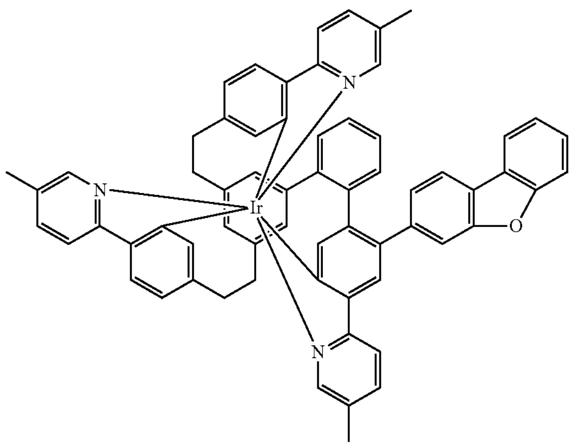
44
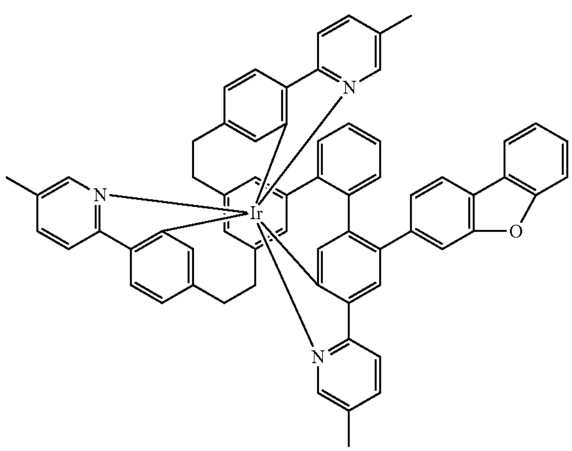
45
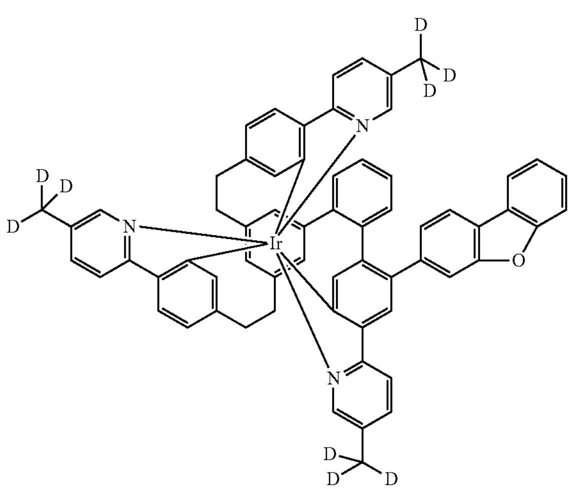
-continued
46
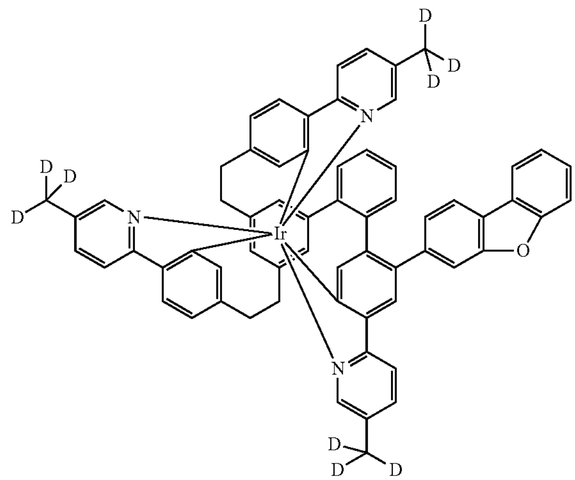
47
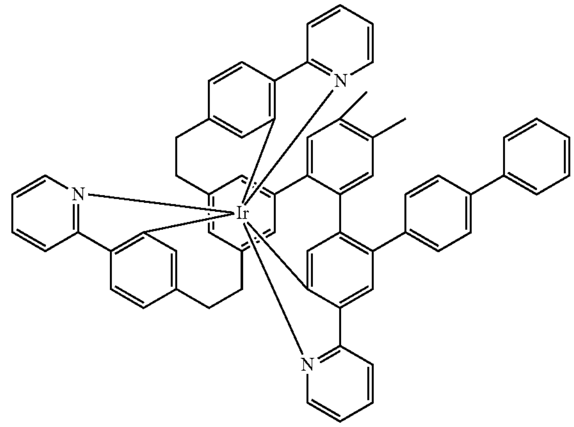
48
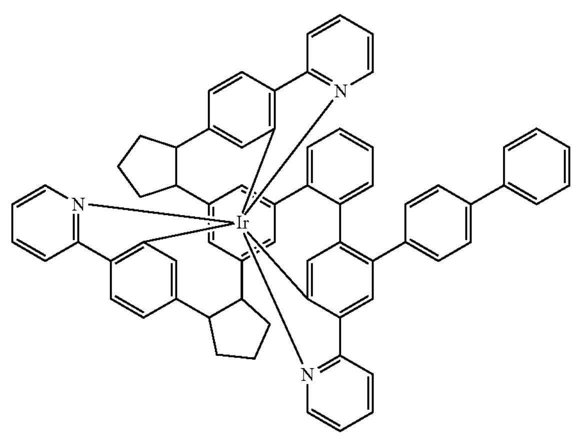

-continued
49
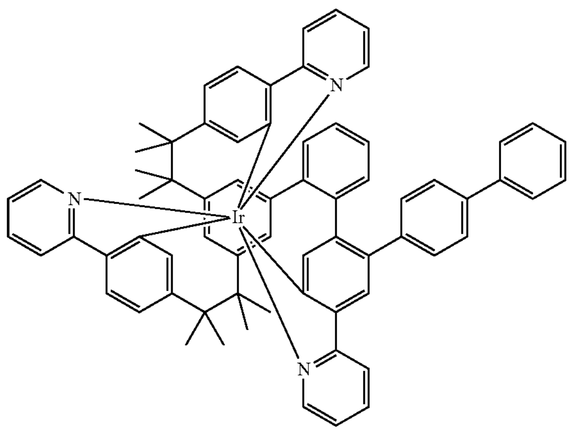
50
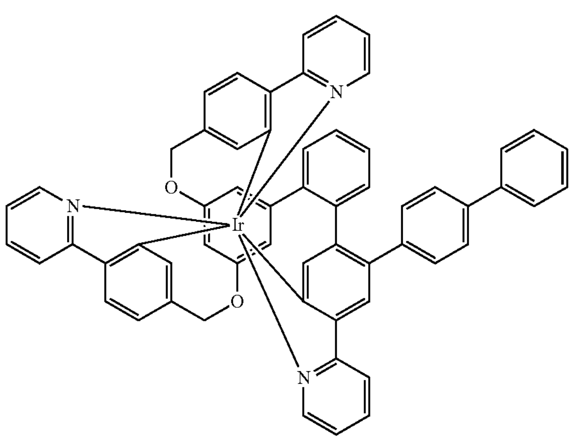
51
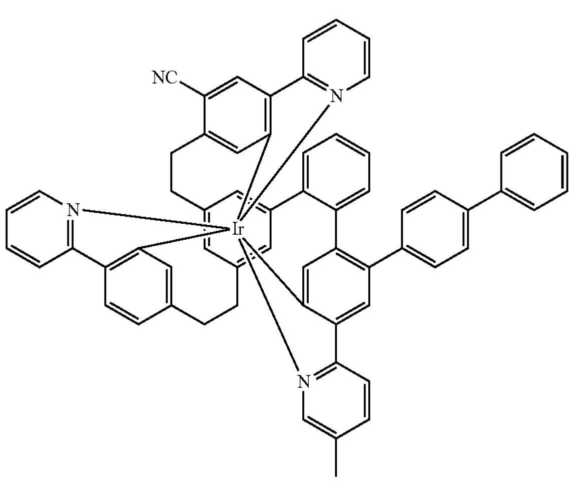
-continued
52
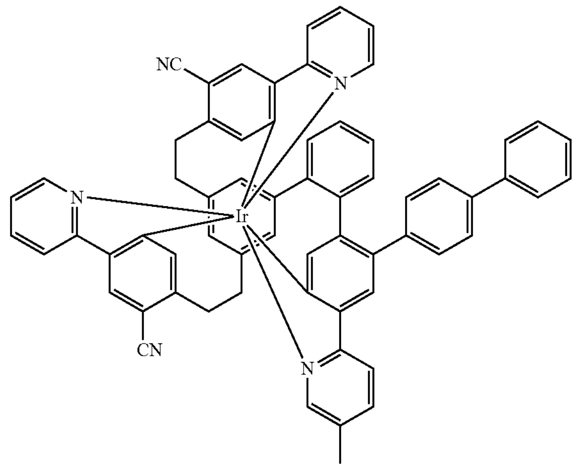
53
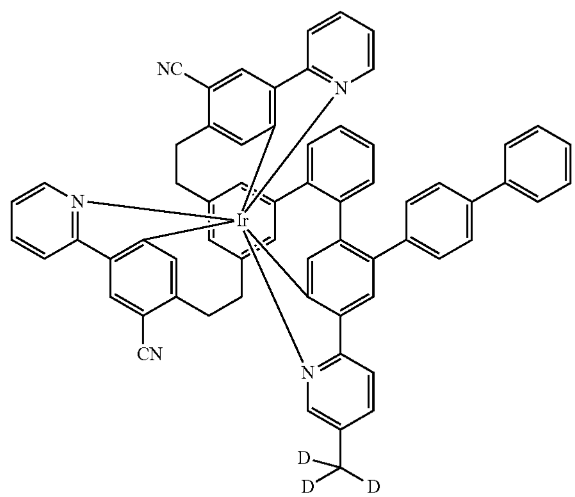
54
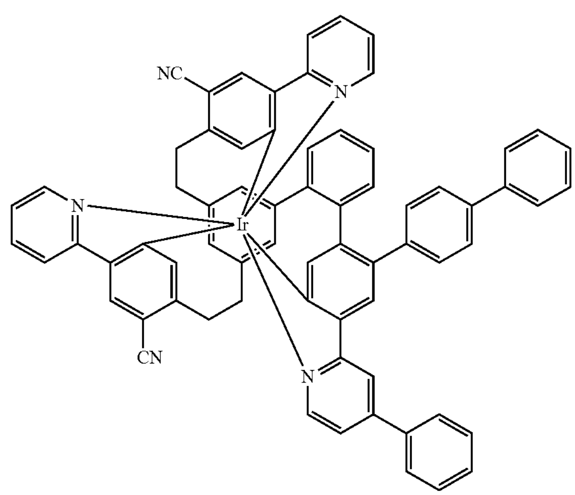

-continued
55
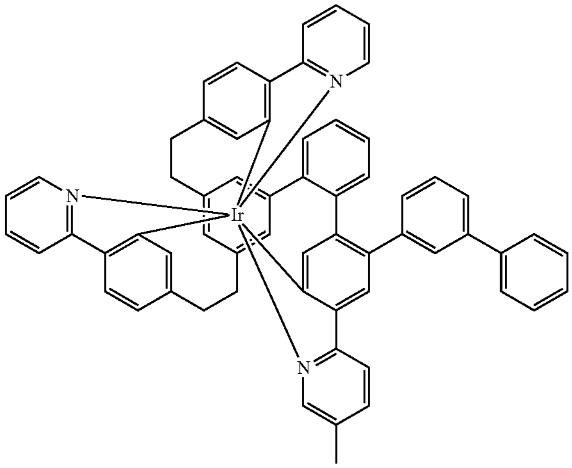
56
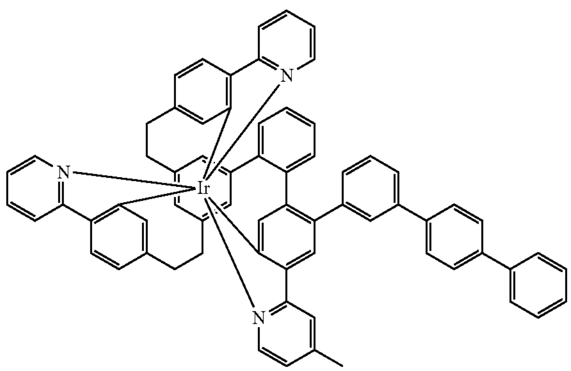
57
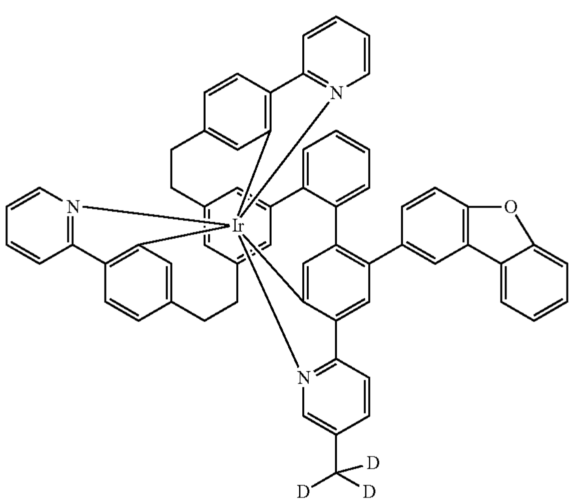
-continued
58
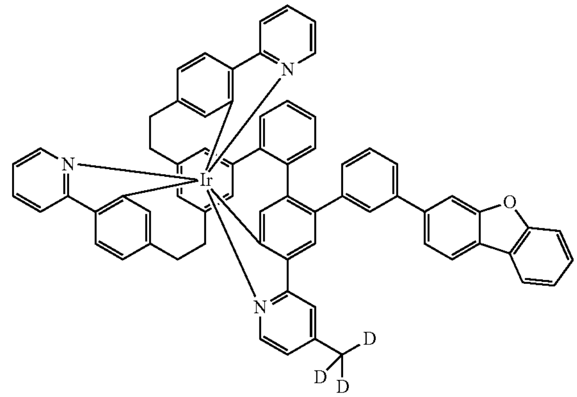
59
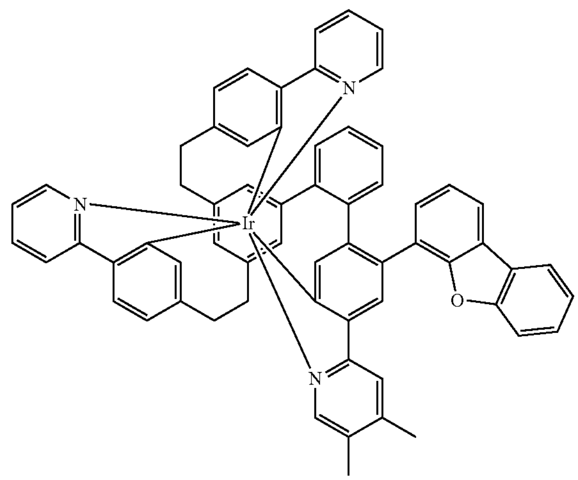
60
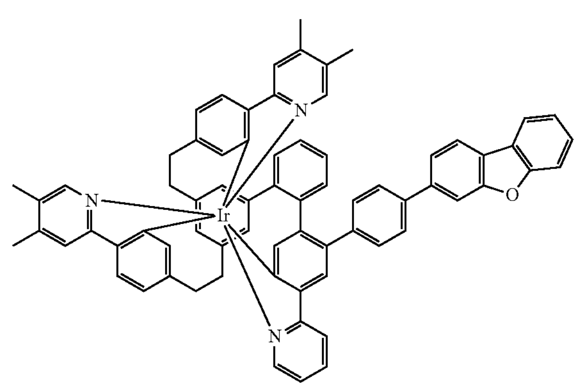

-continued
61
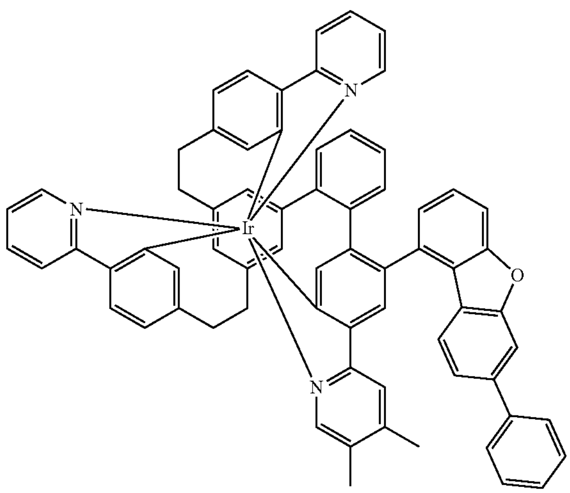
62
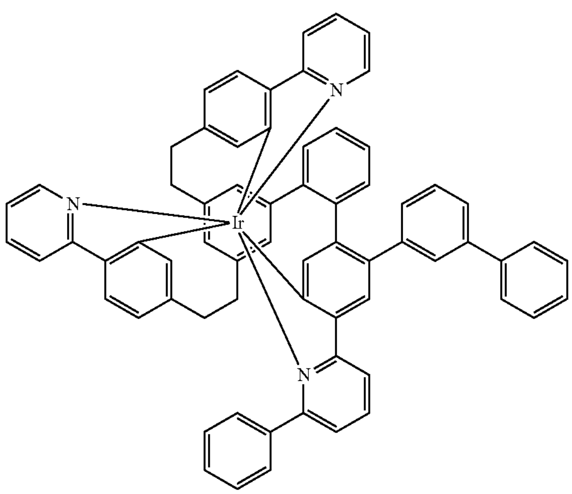
63
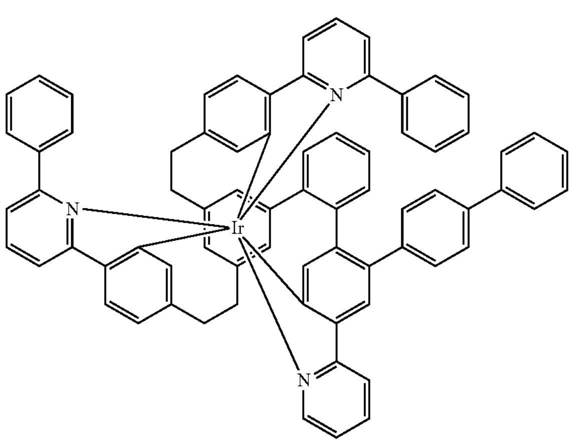
-continued
64
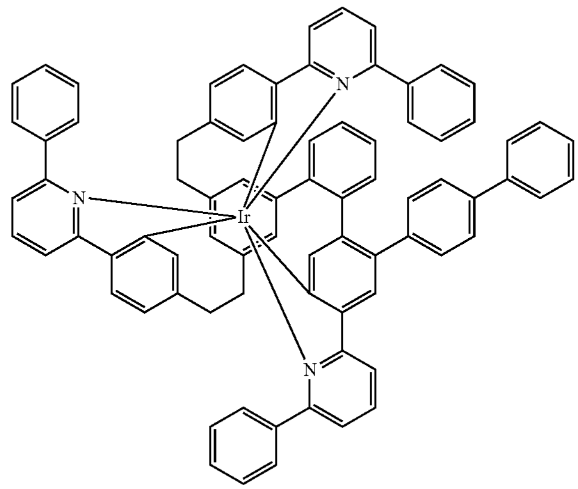
65
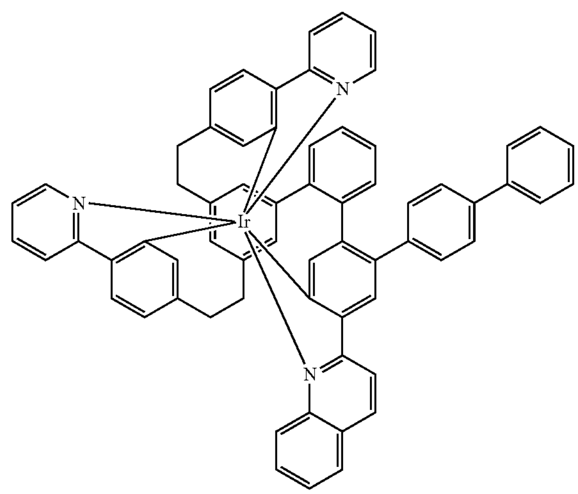
66
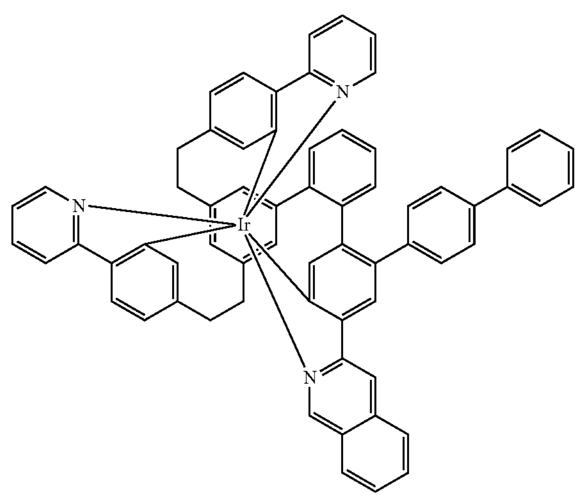

-continued
67
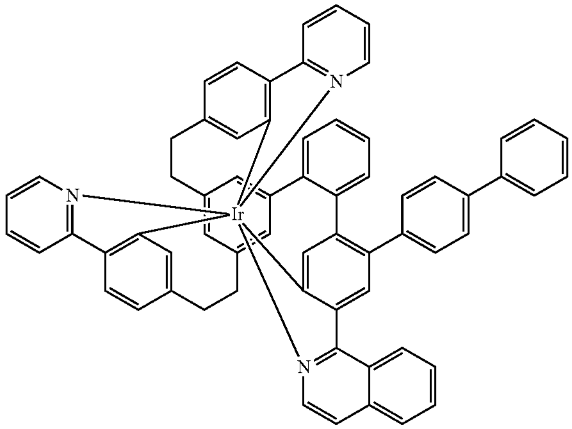
68
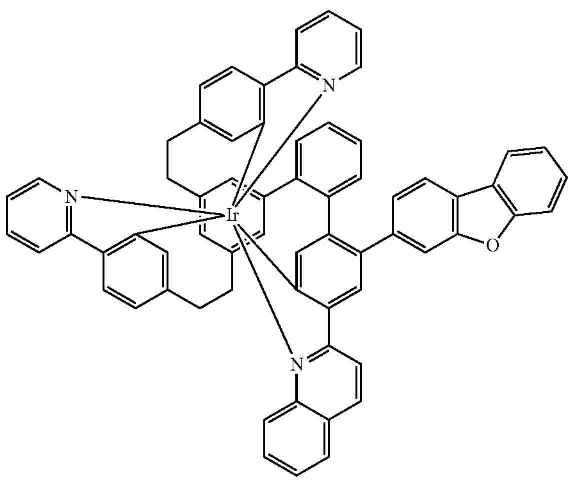
69
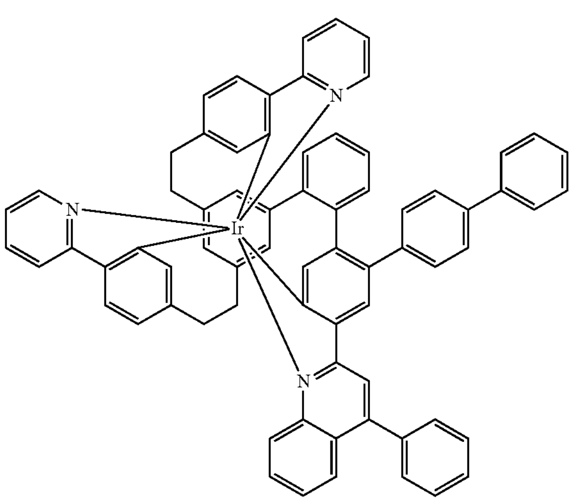
-continued
70
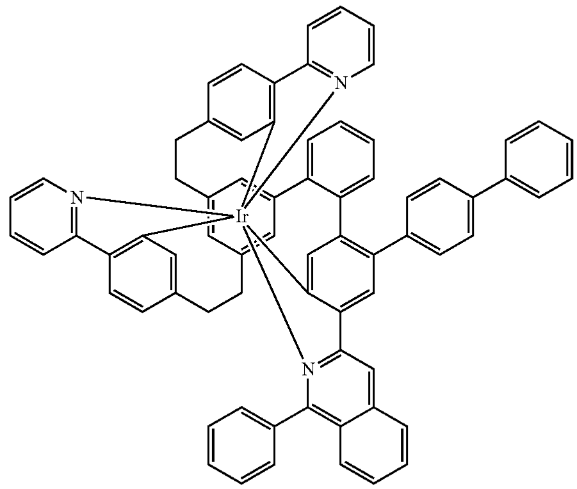
71
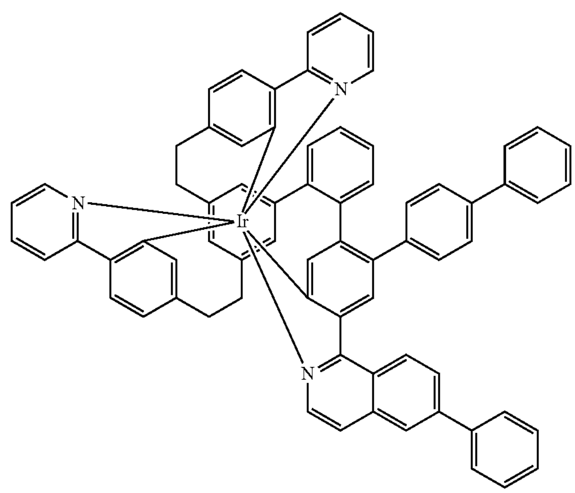
72
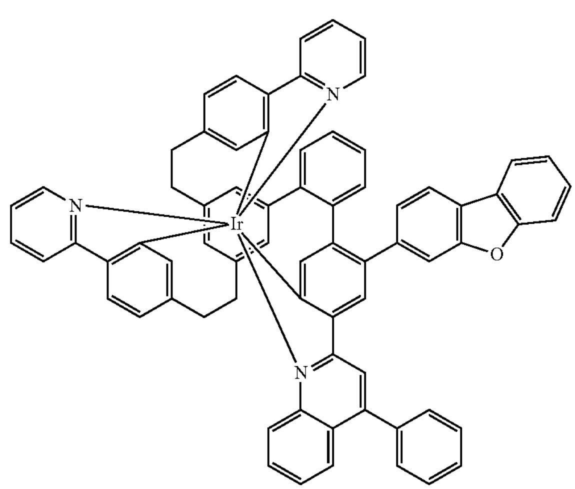

-continued
73
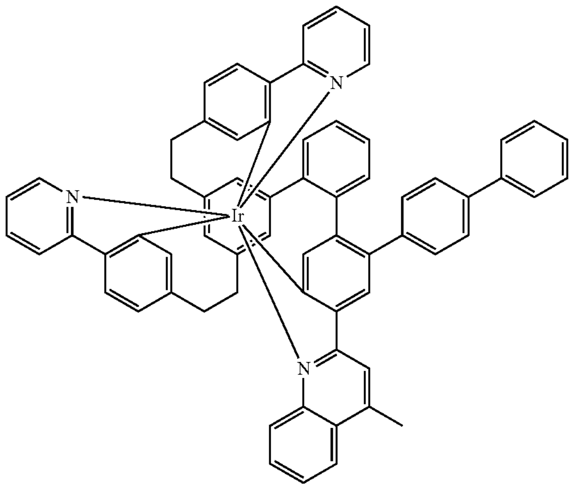
74
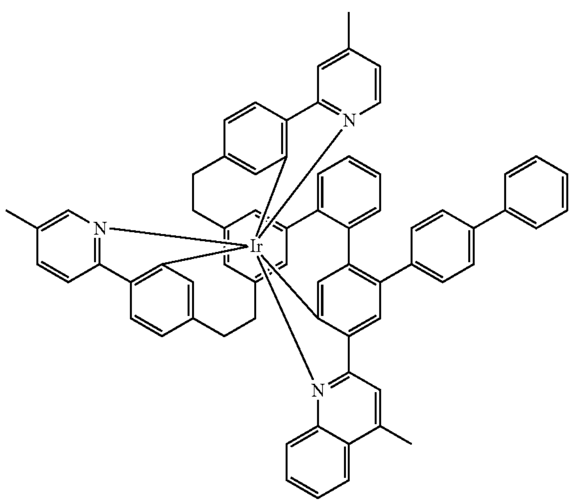
75
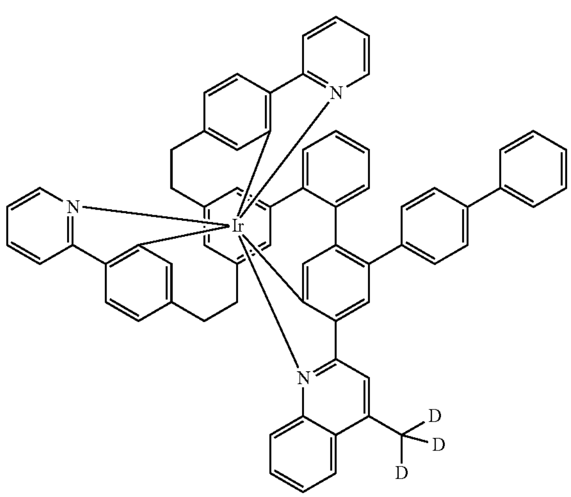
-continued
76
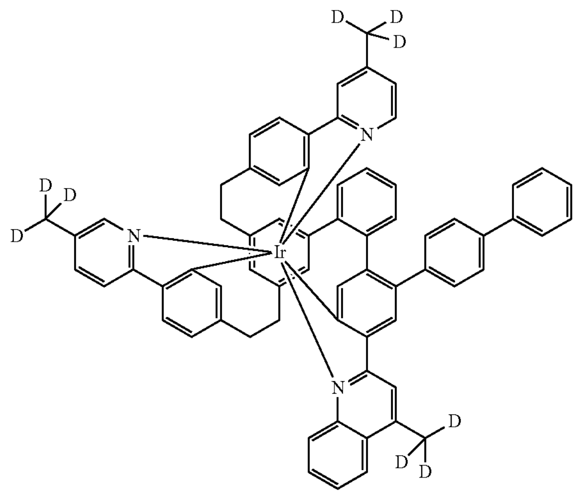
77
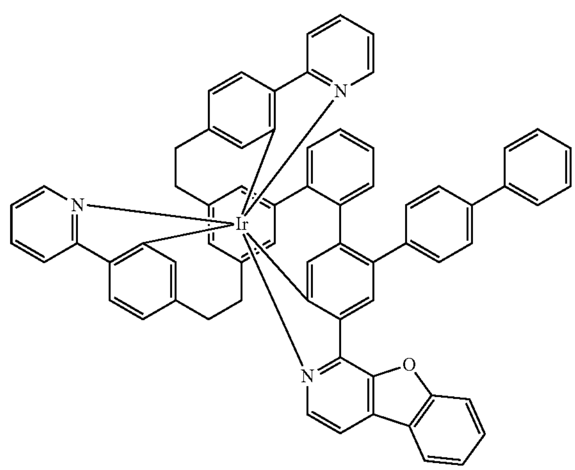
78
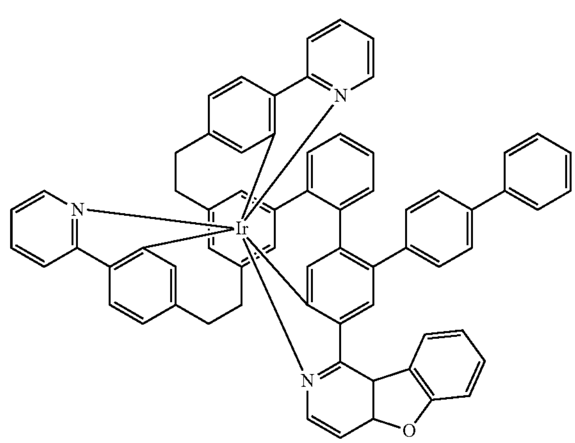

-continued
79
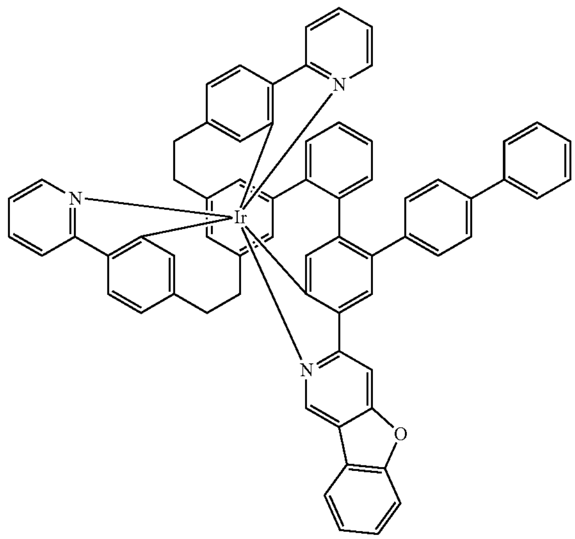
80
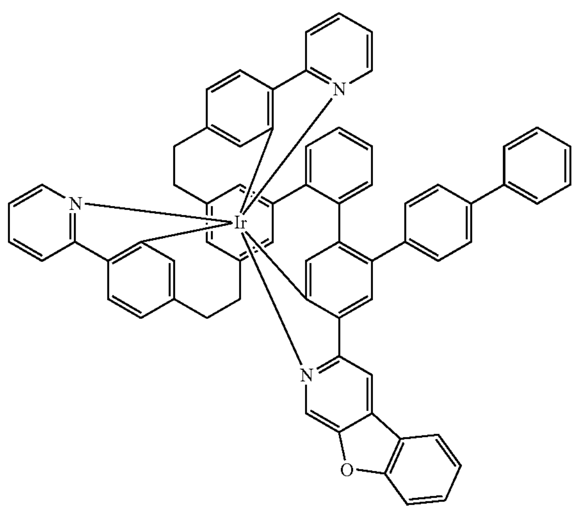
81
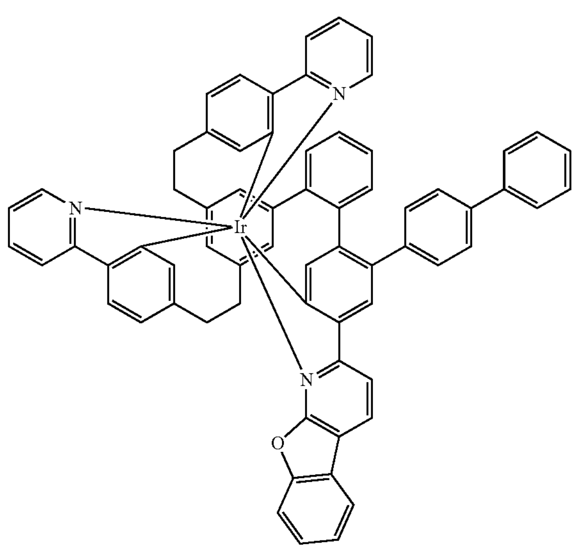
-continued
82
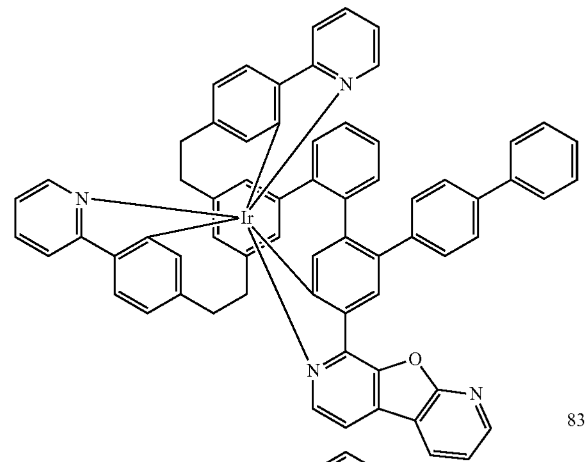
83
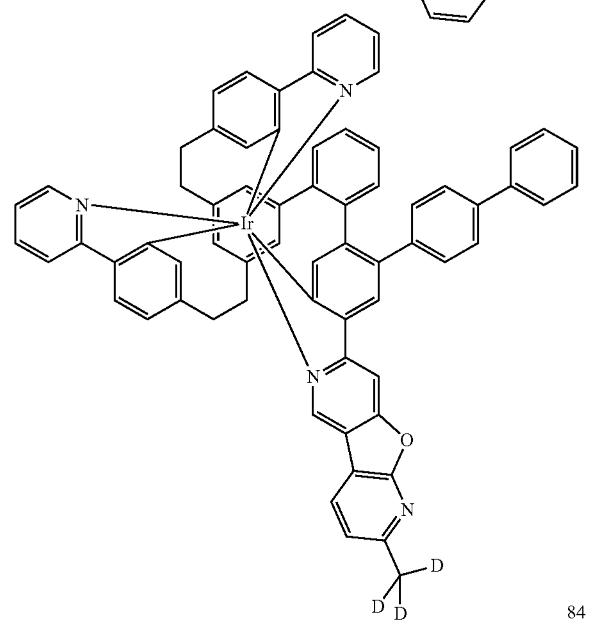
84
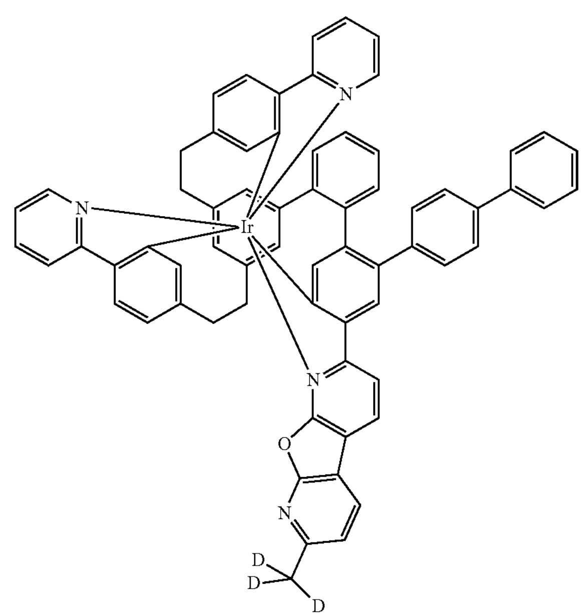

-continued
84
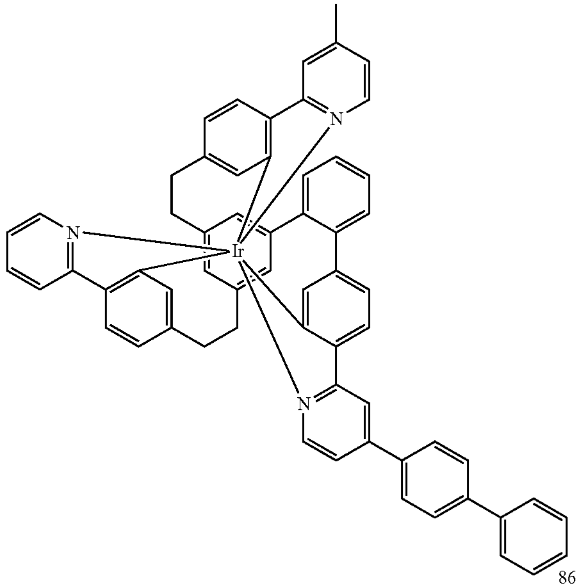
86
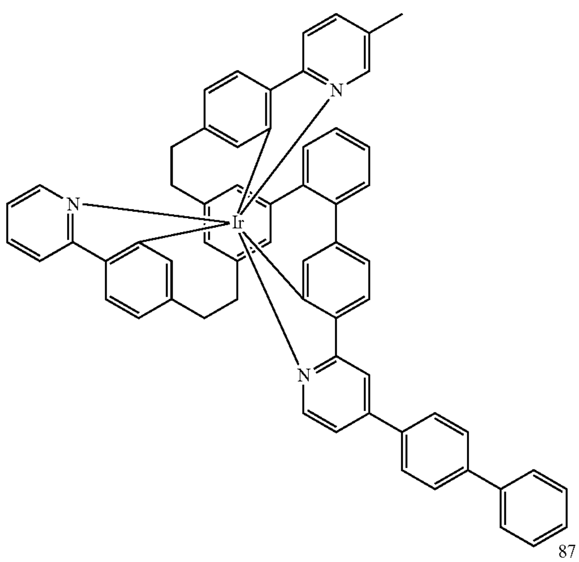
87
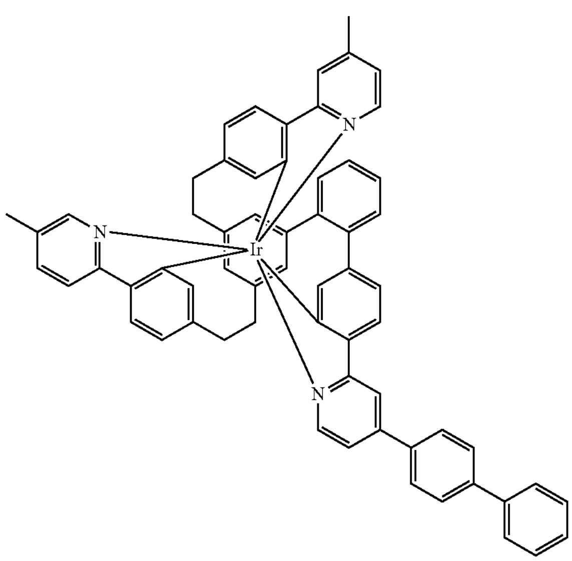
-continued
88
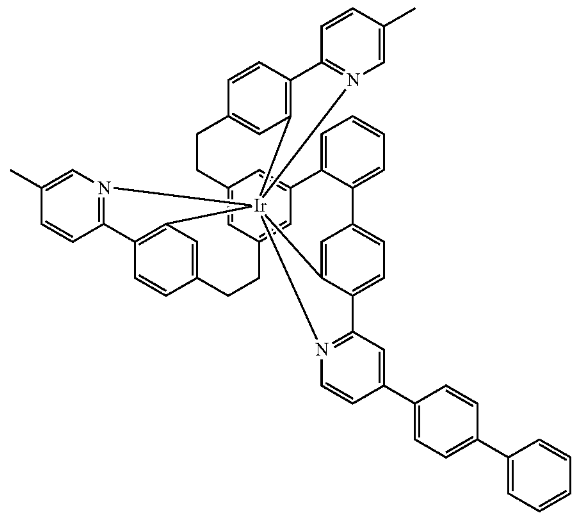
89
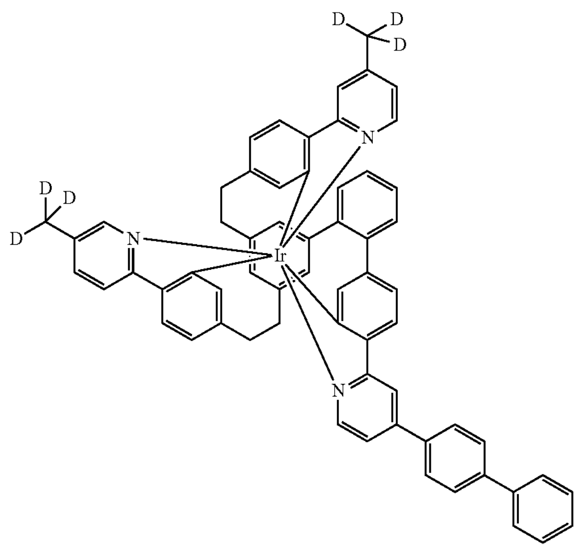
90
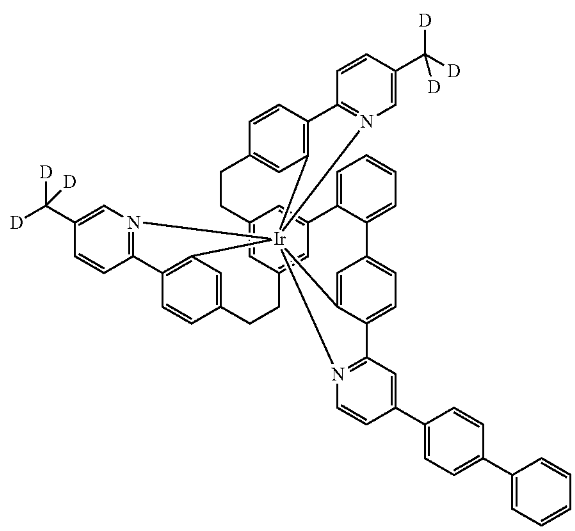

-continued
91
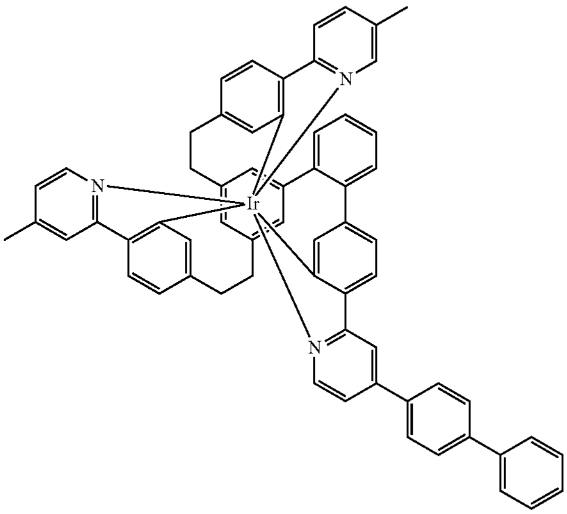
92
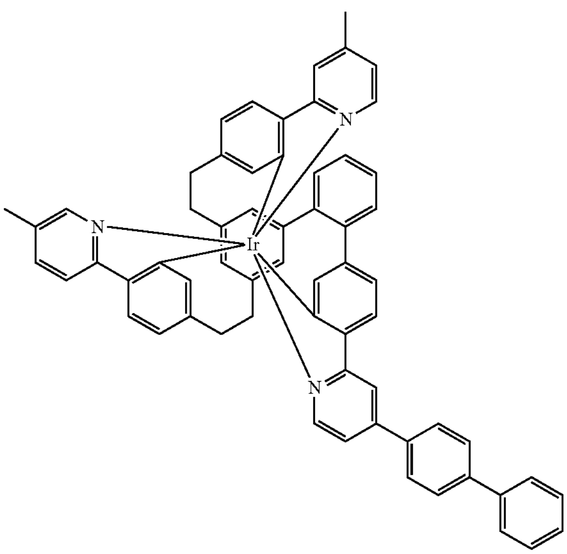
93
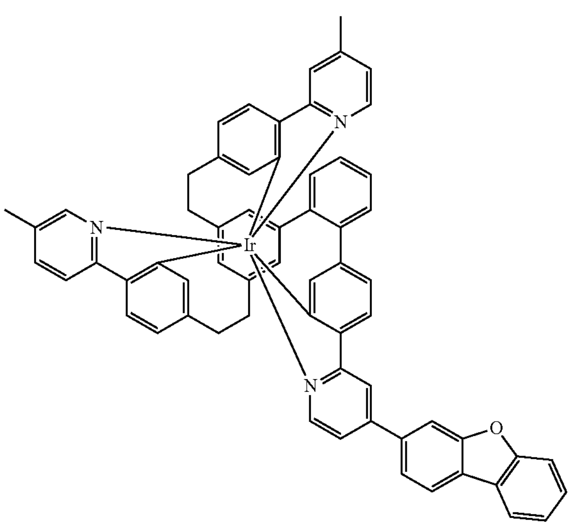
-continued
94
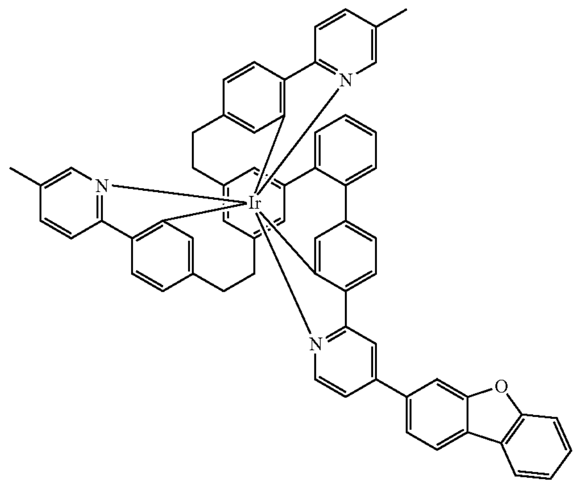
95
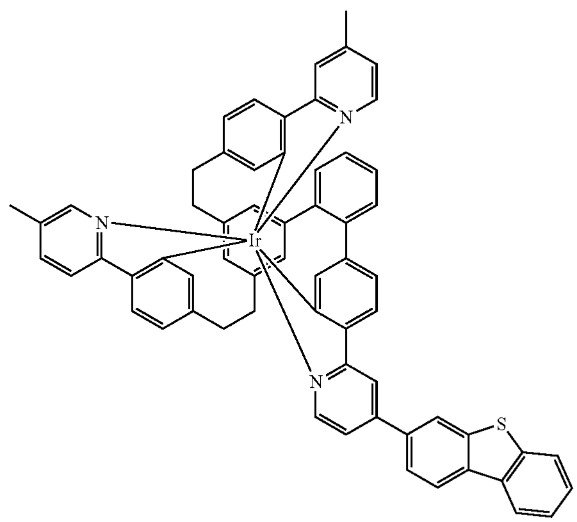
96
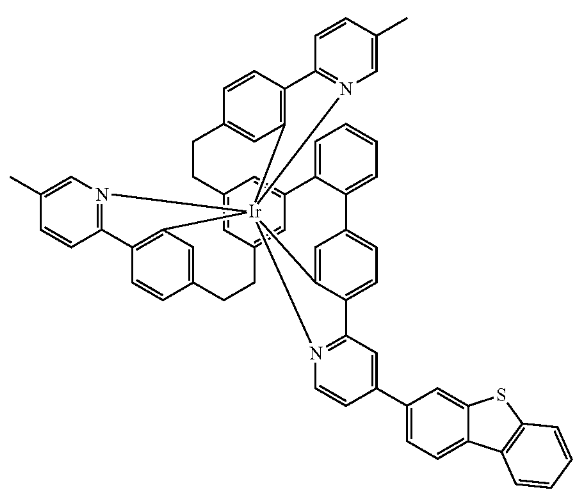

-continued
97
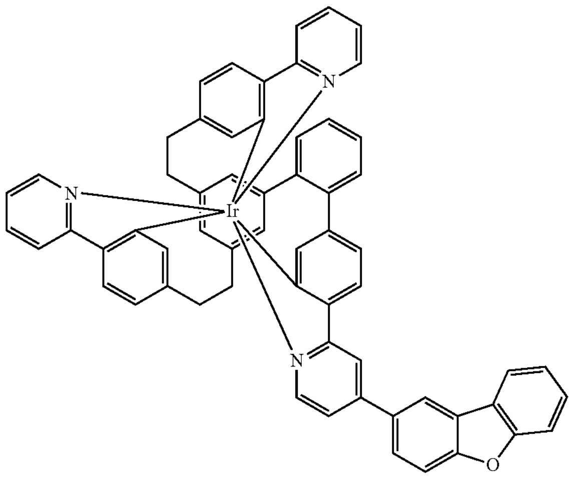
98
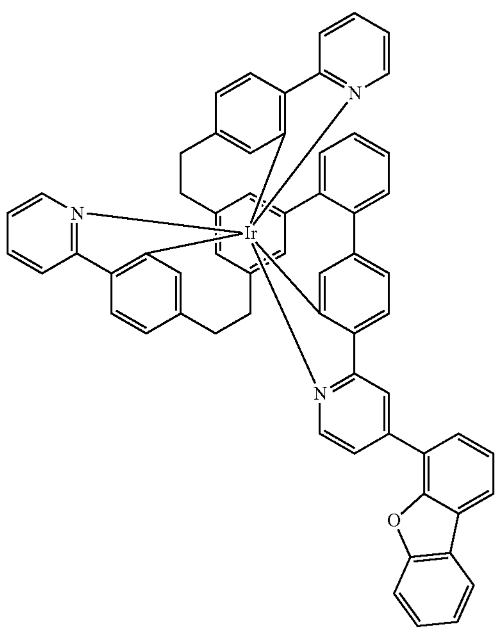
99
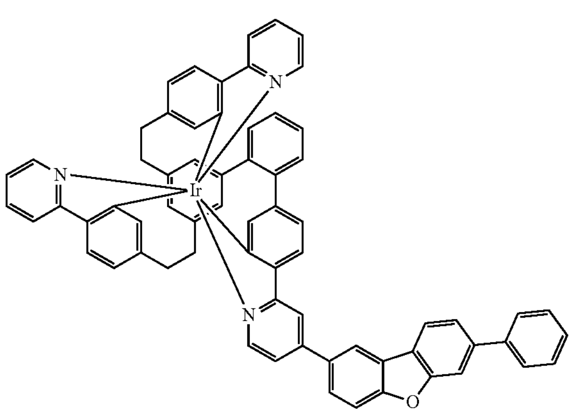
-continued
100
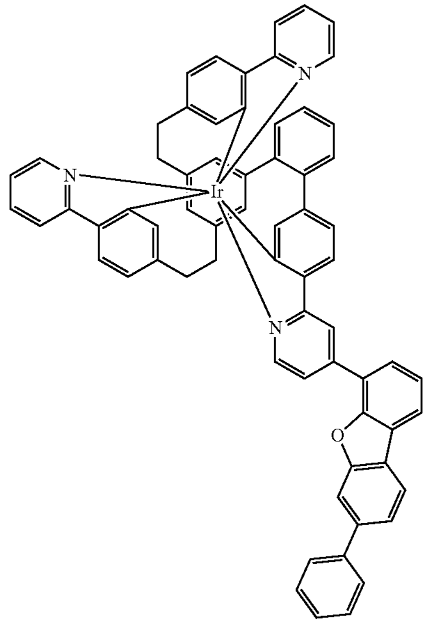
101
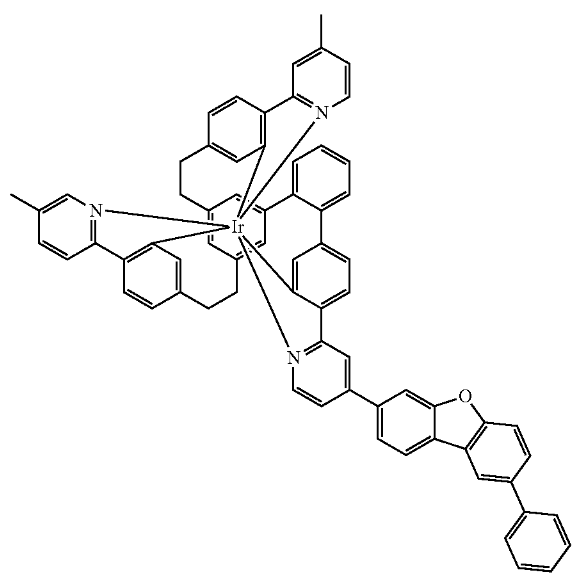
102
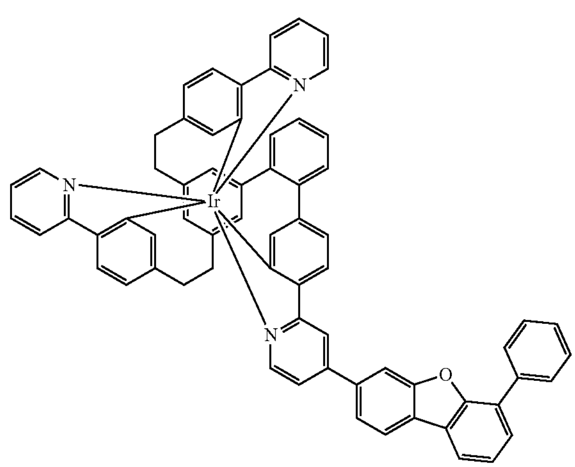

-continued
103
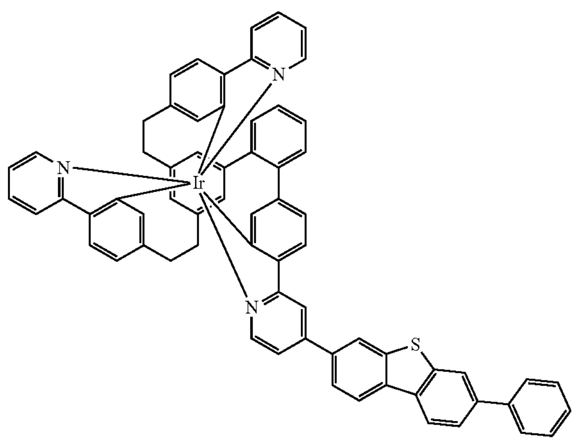
104
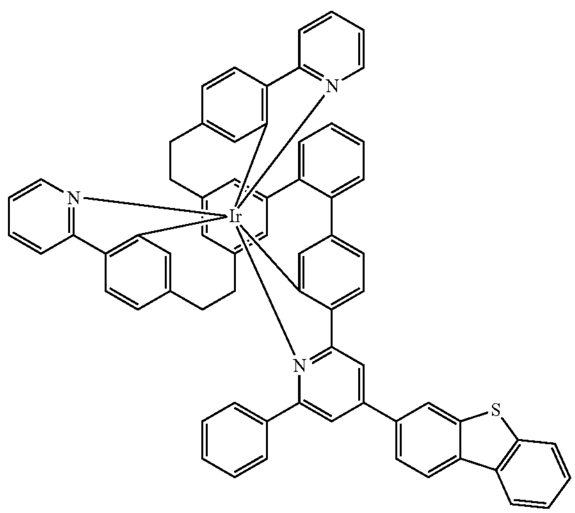
105
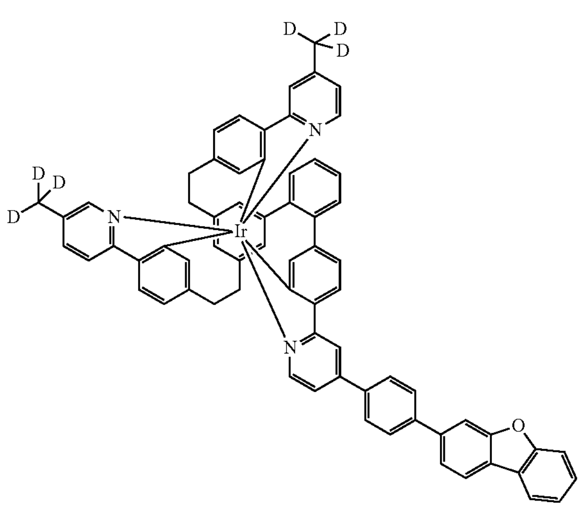
-continued
106
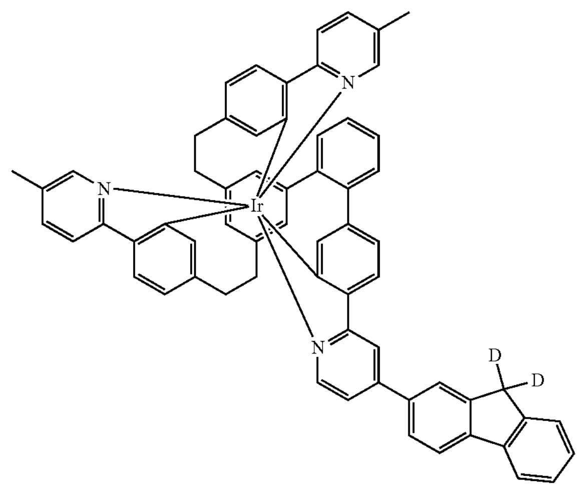
107
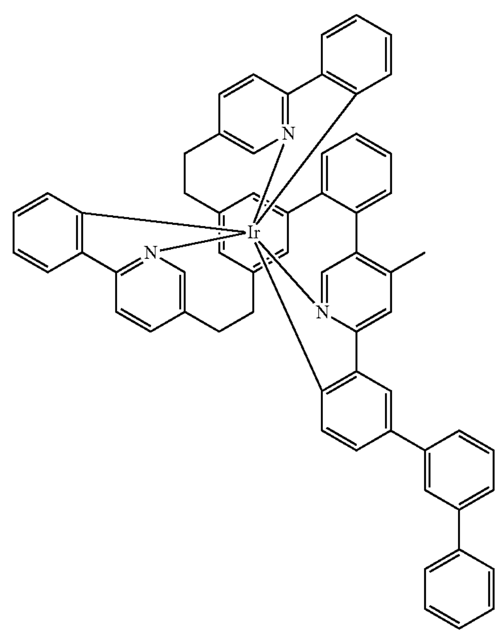

-continued
108
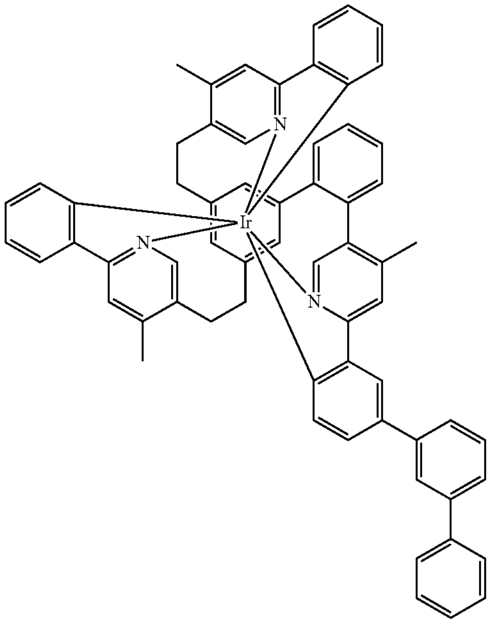
109
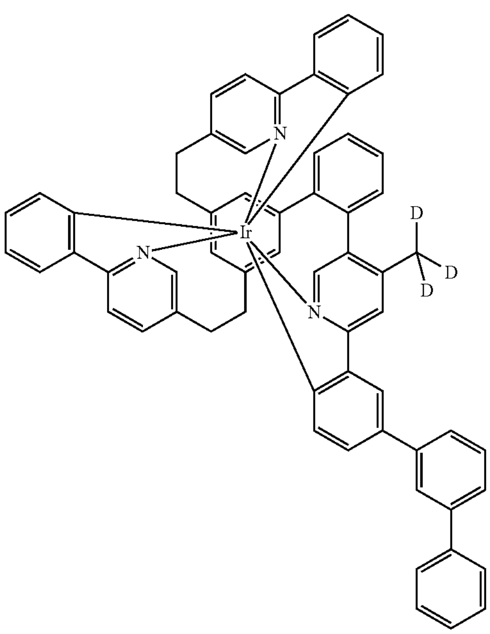
-continued
110
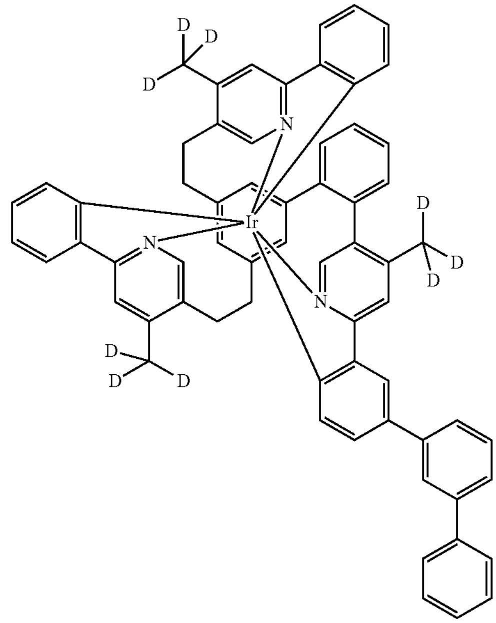
111
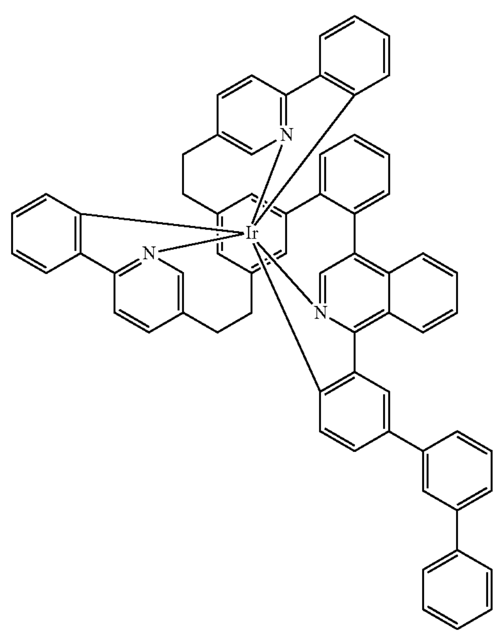

112
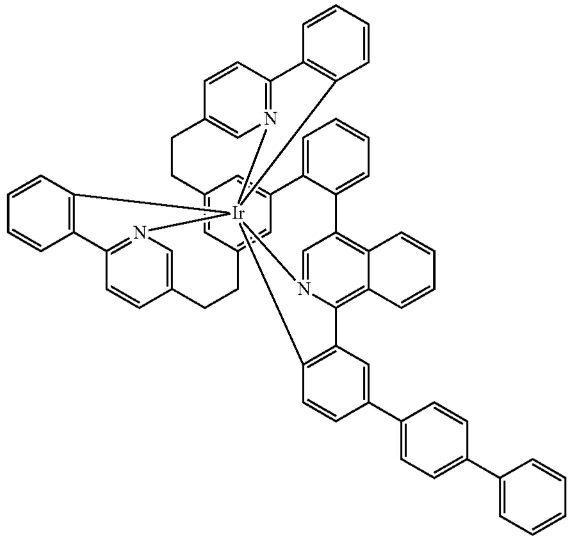
113
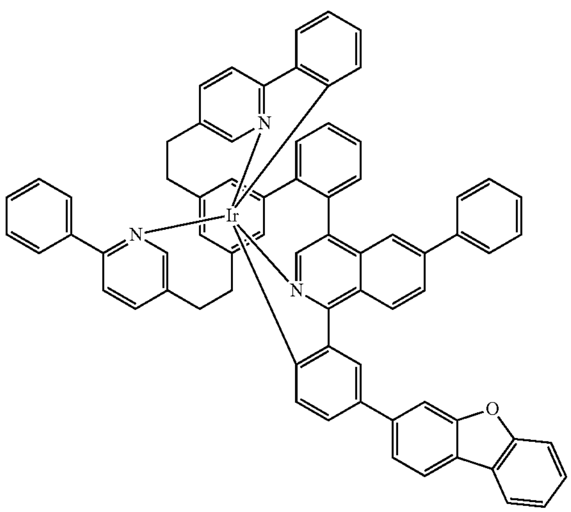
114
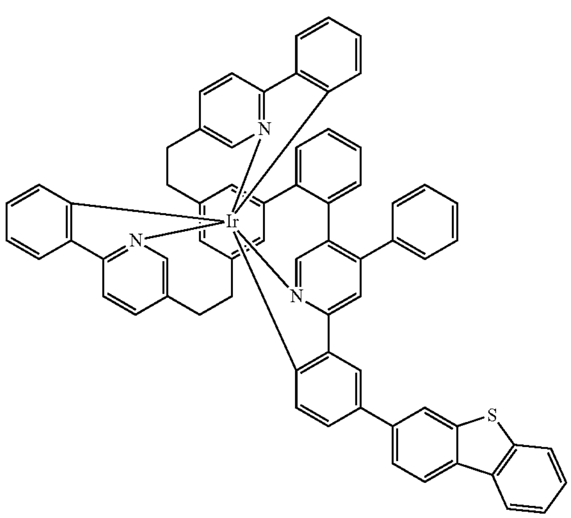
115
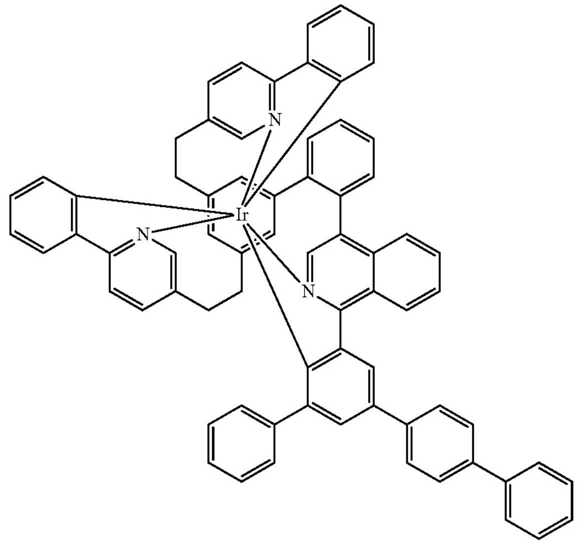
116
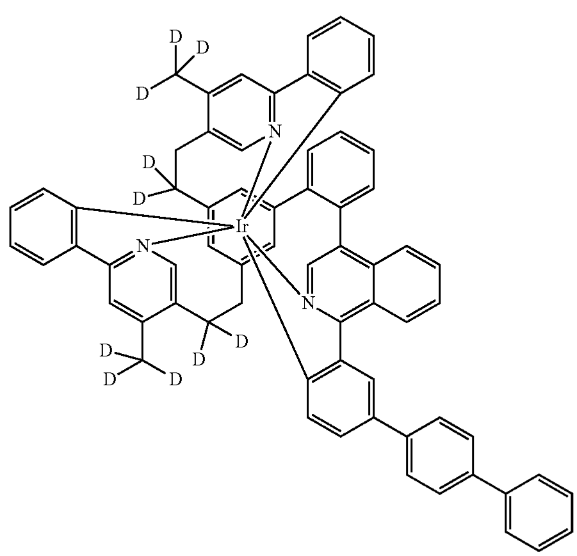

-continued
117
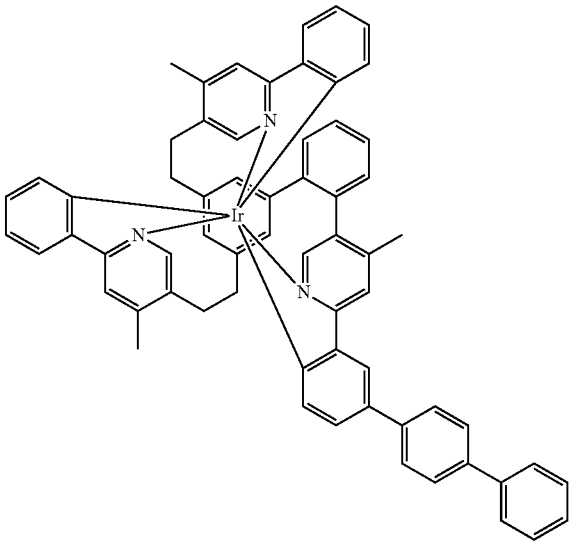
118
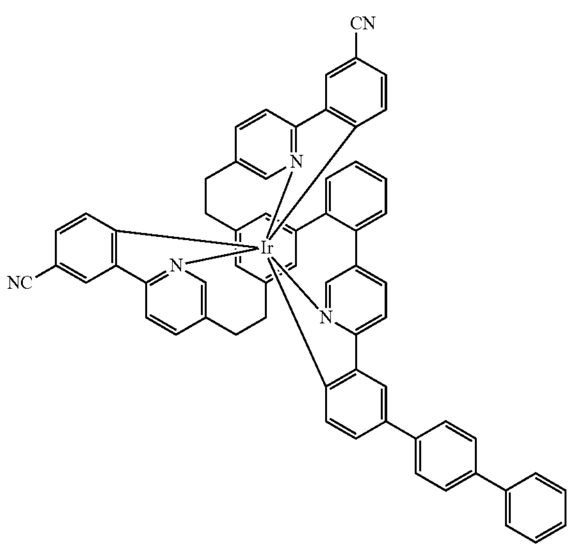
-continued
119
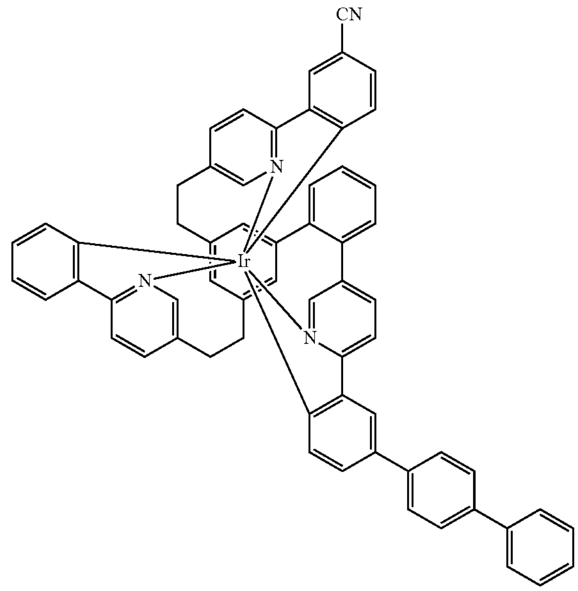
120
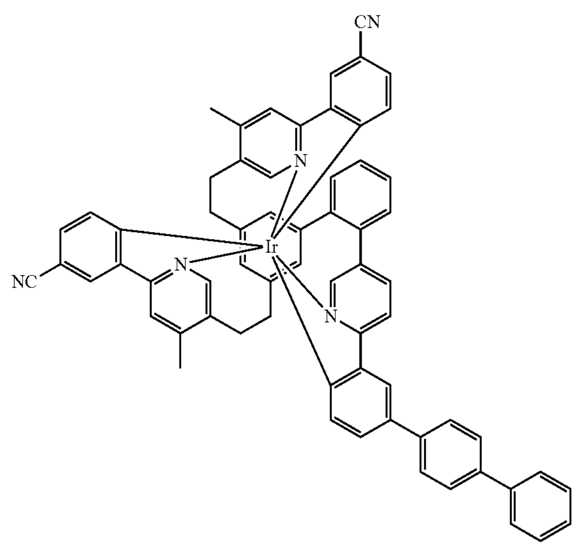

121
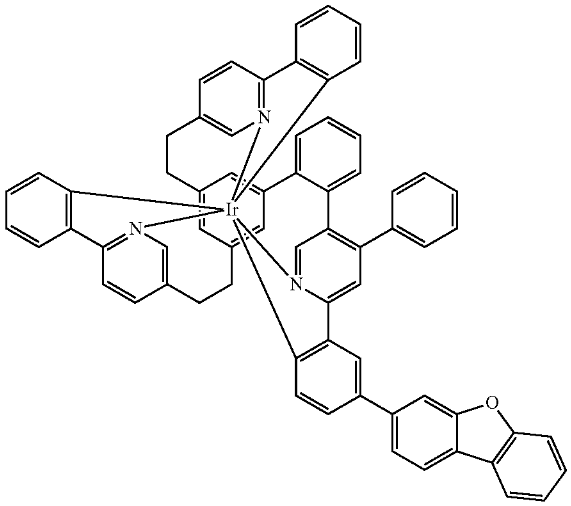
122
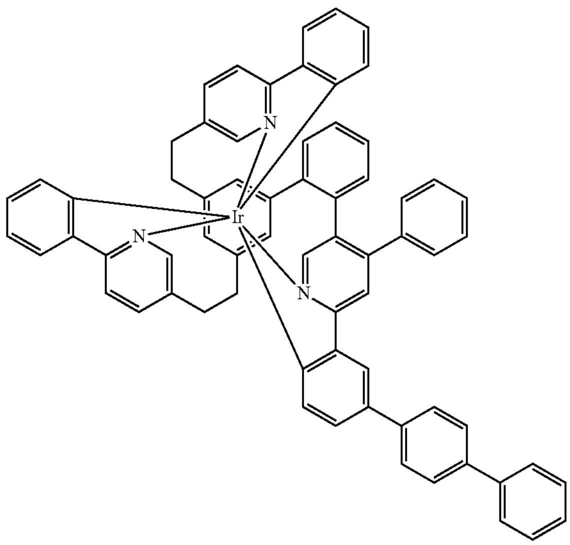
123
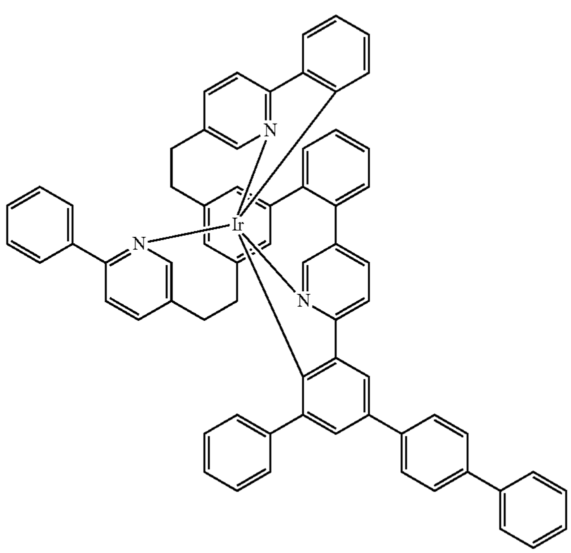
124
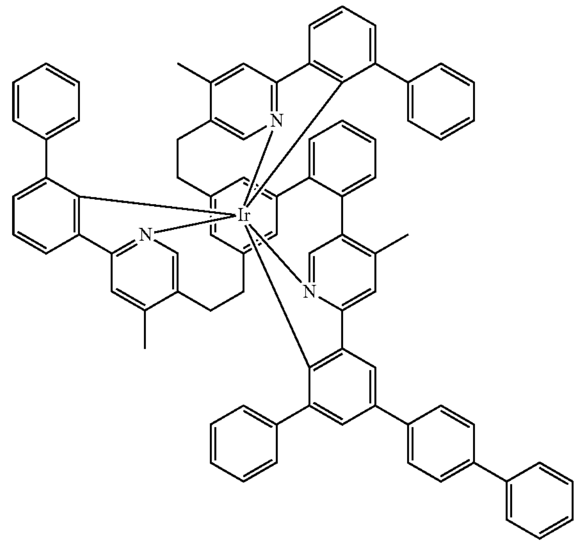
125
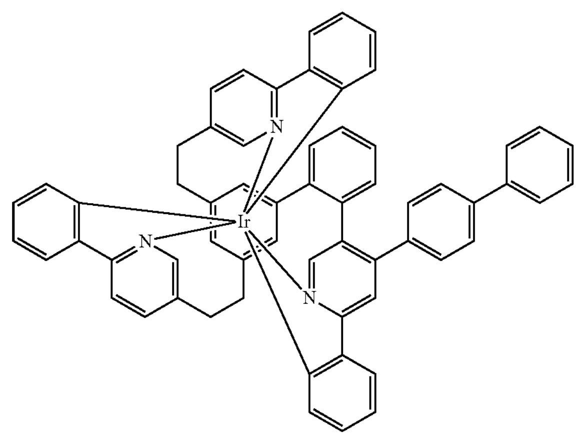
126
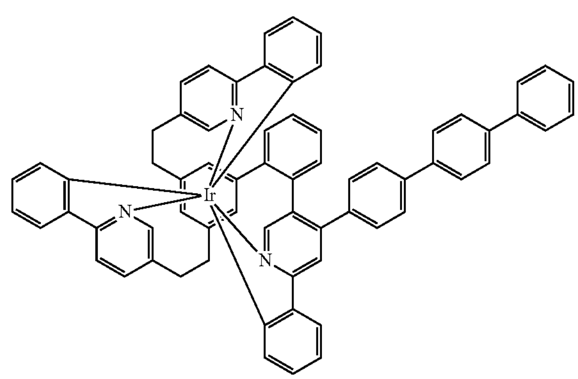

-continued
127
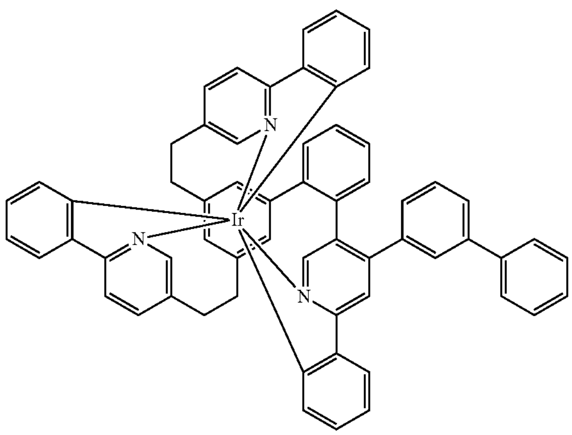
128
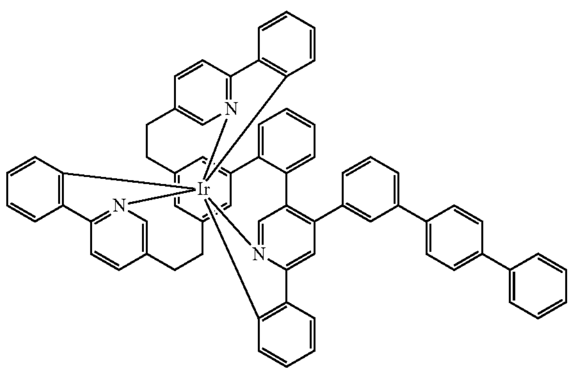
129
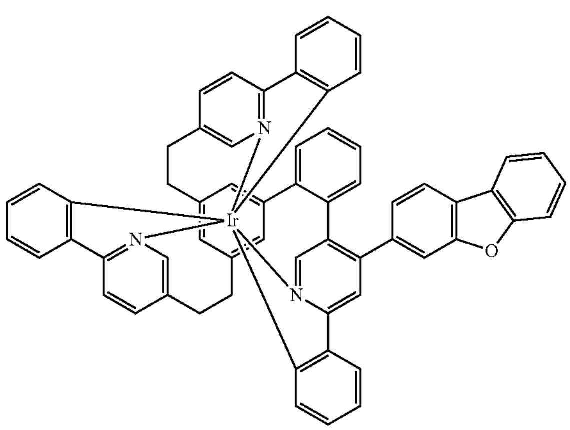
-continued
130
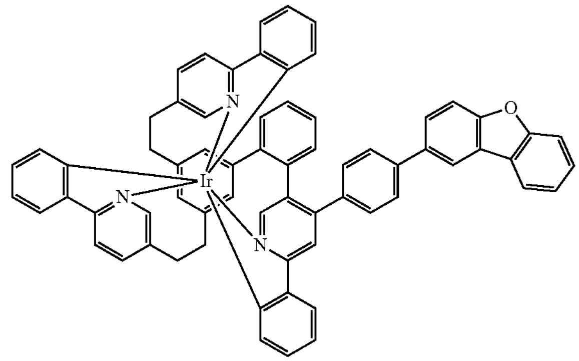
131
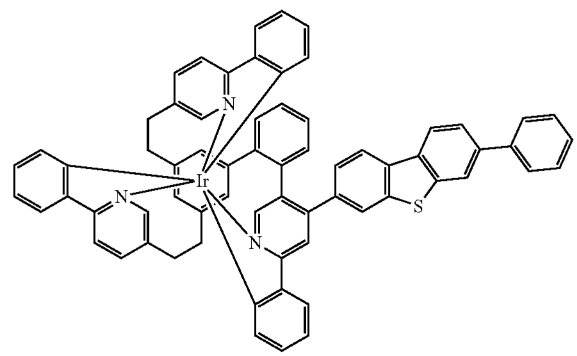
132
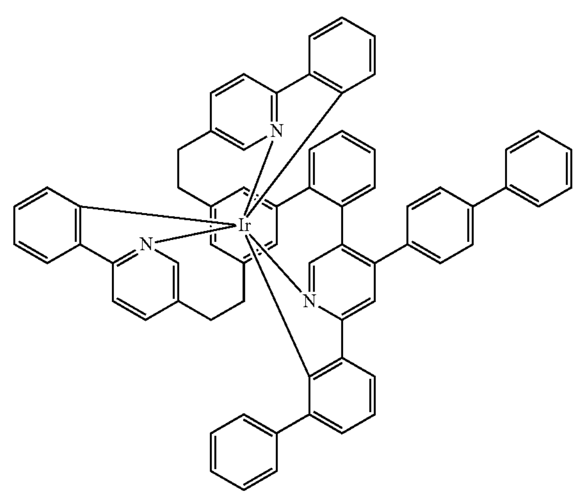

133
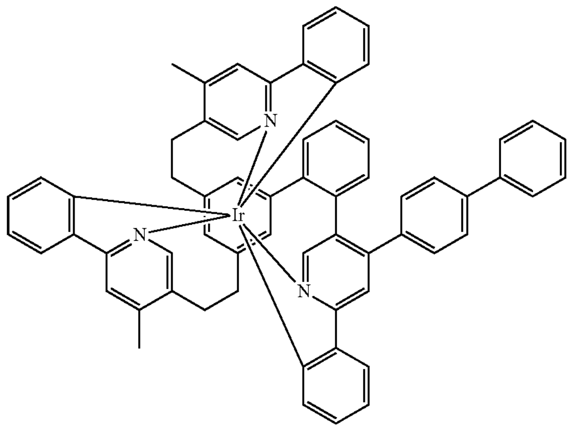
134
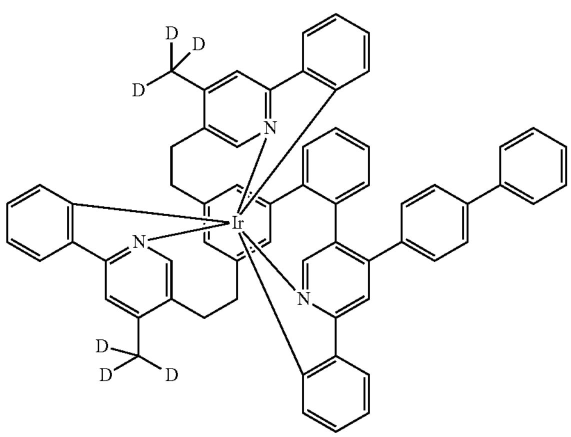
135
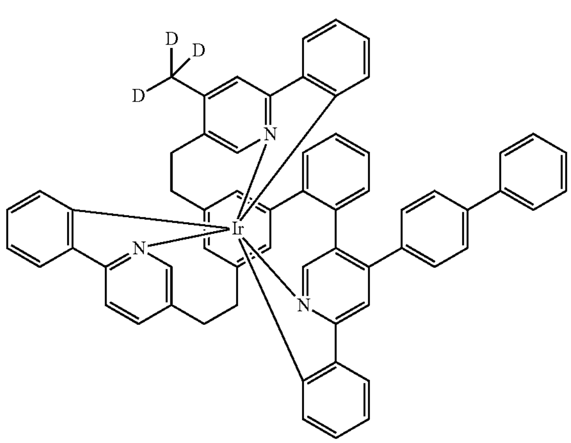
136
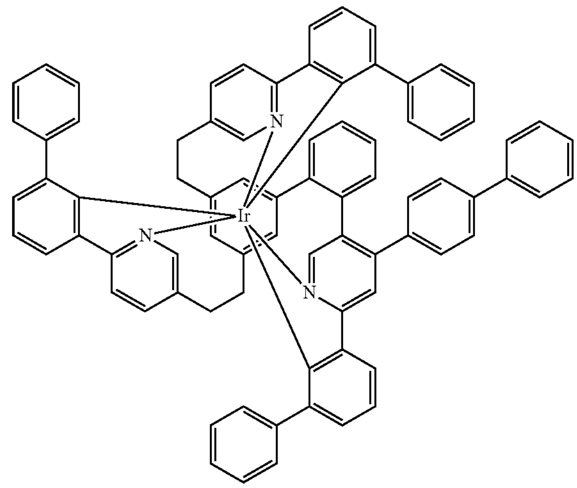
137
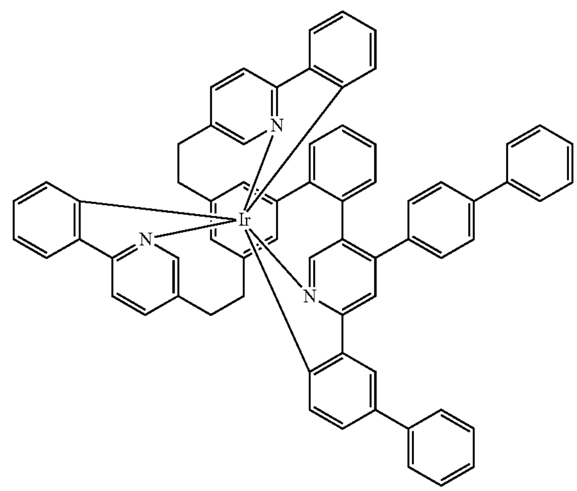
138
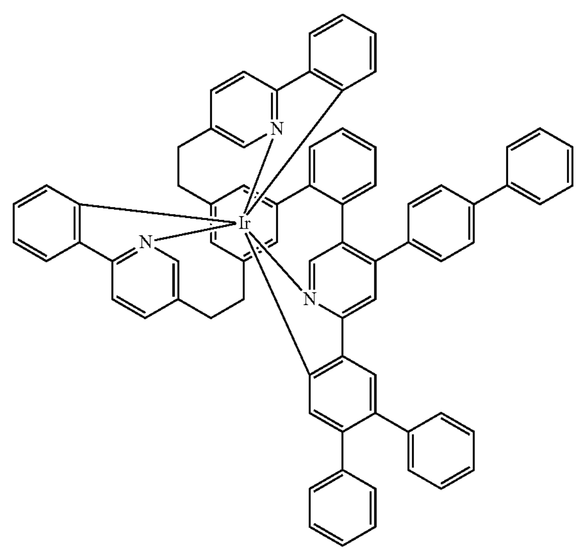

139
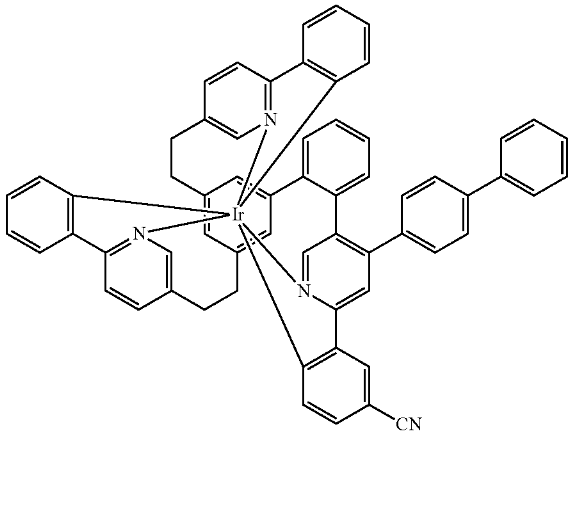
140
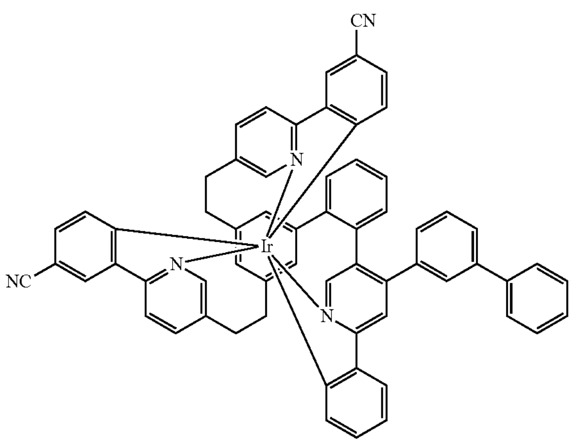
141
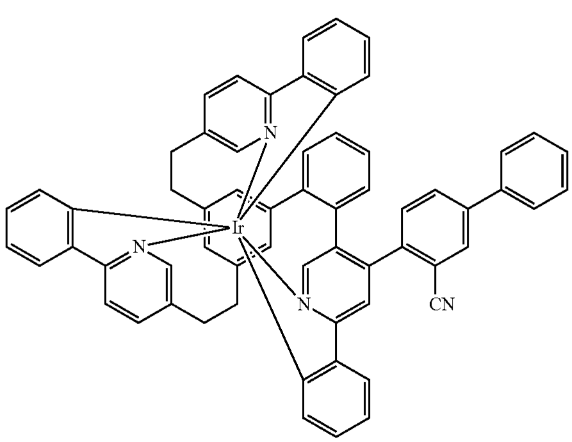
142
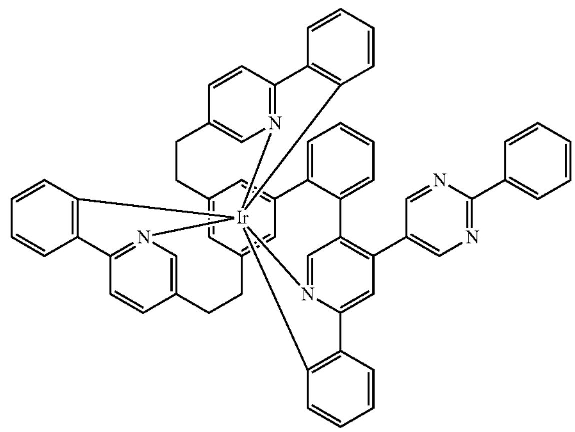
143
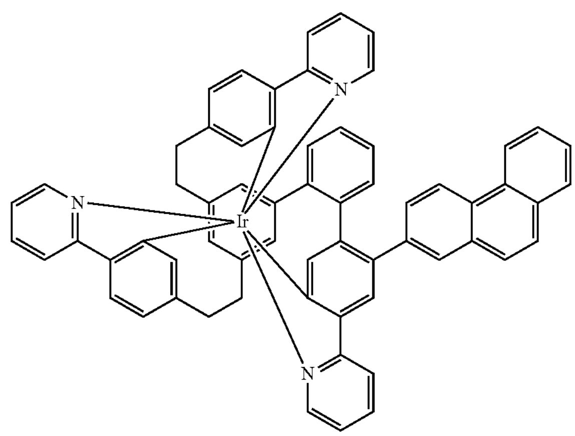
144
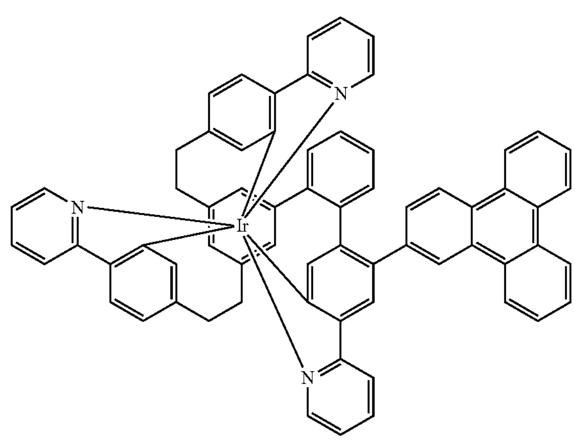

145
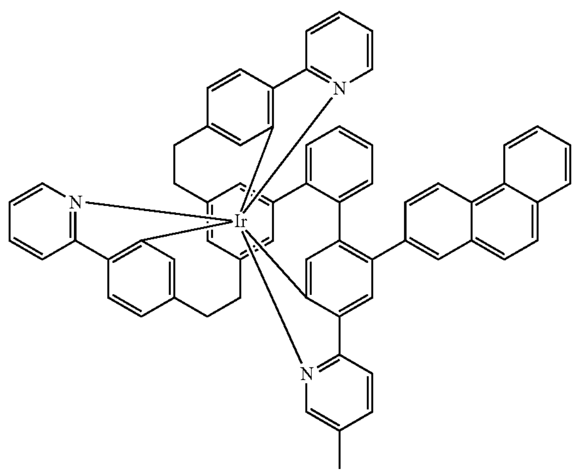
146
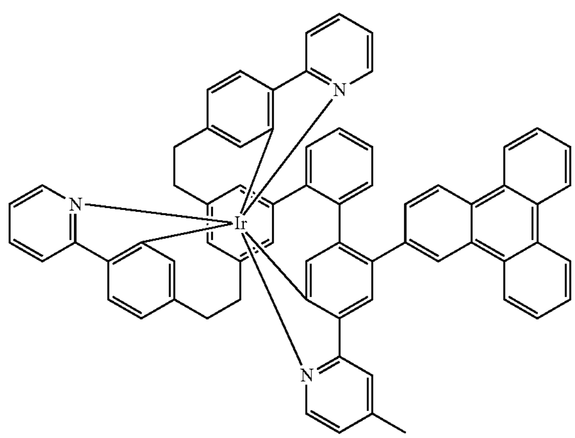
147
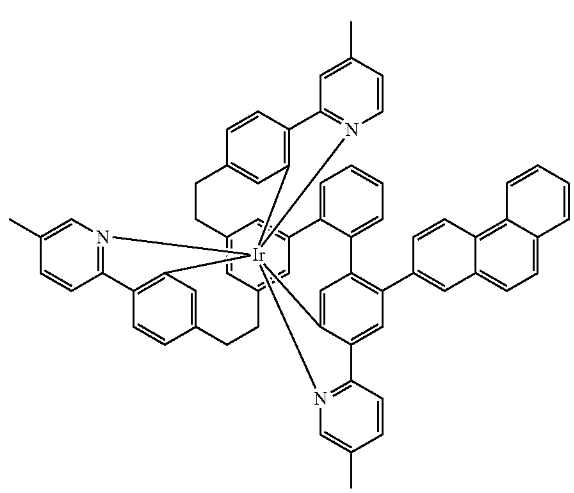
148
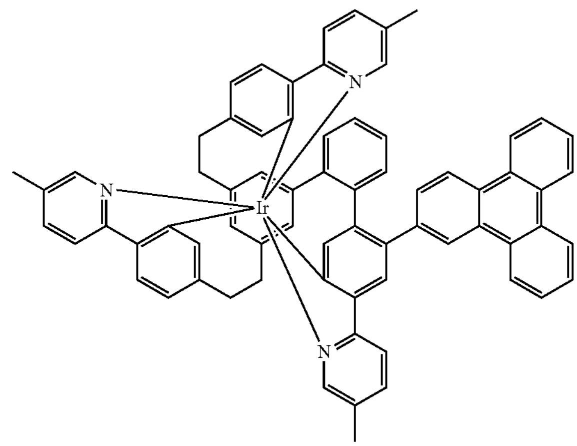
149
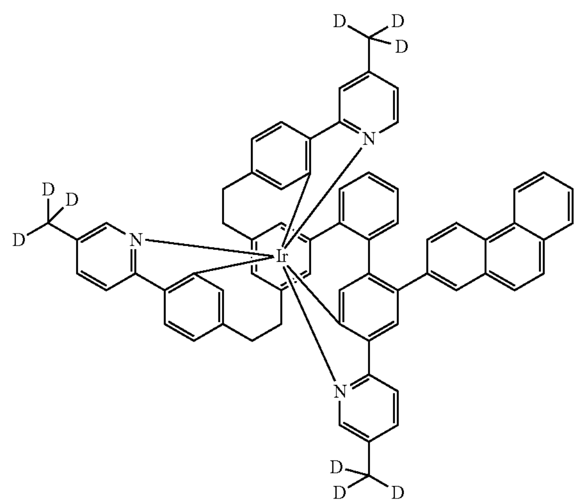
150
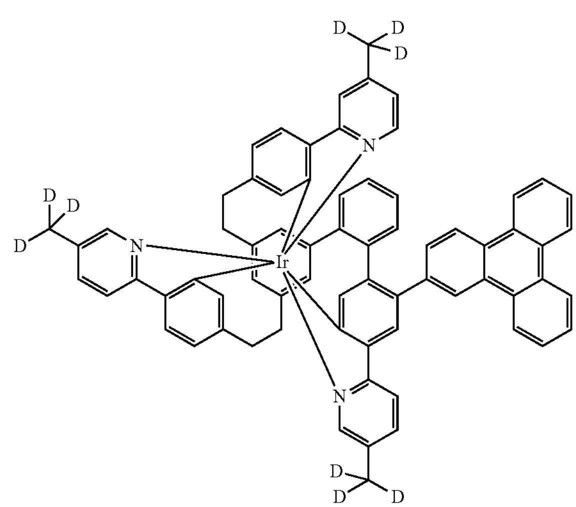

-continued
151
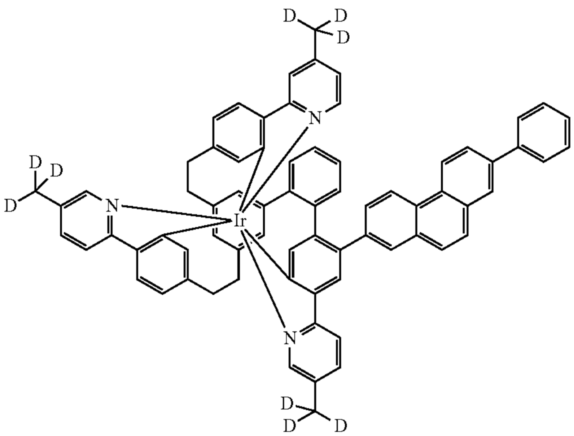
152
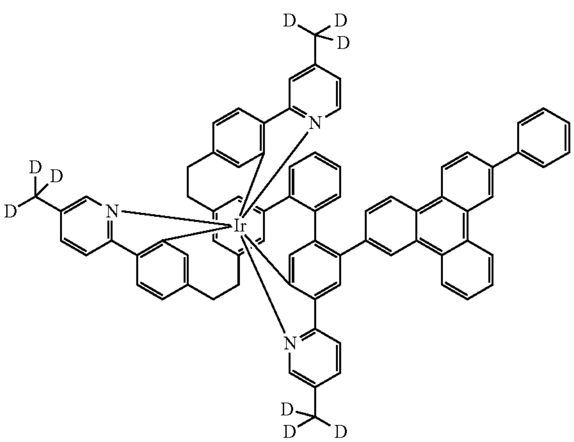
153
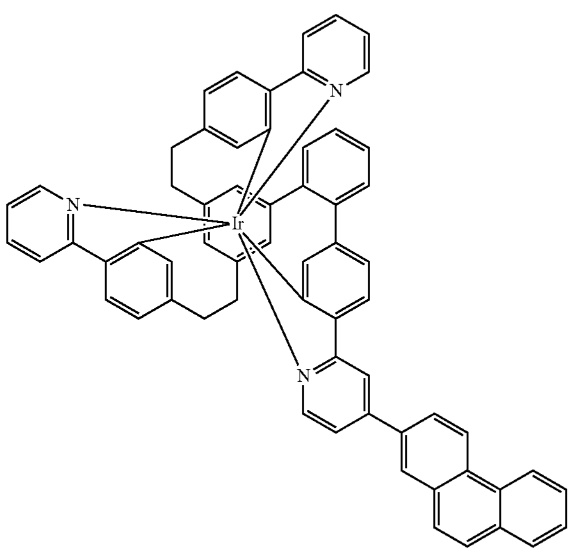
-continued
154
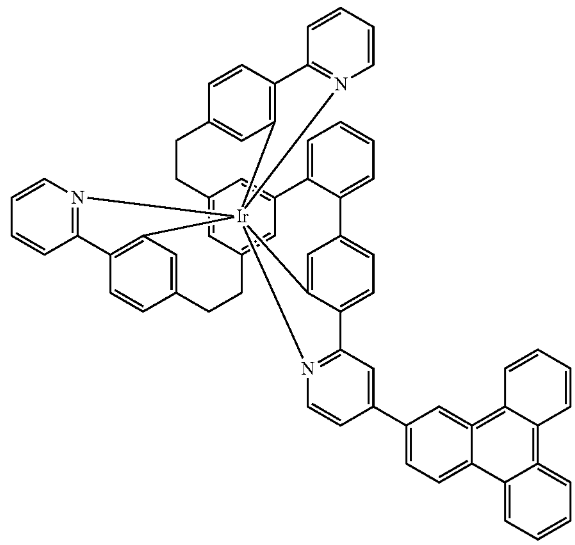
155
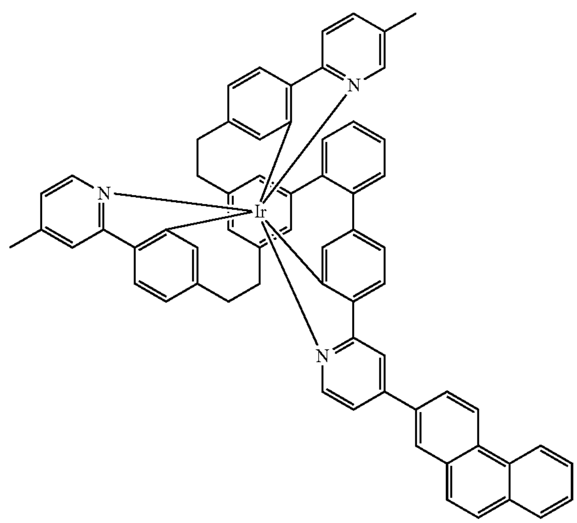
156
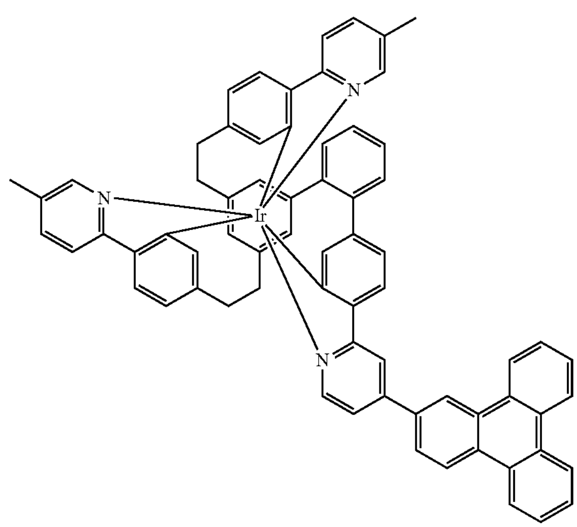

-continued
157
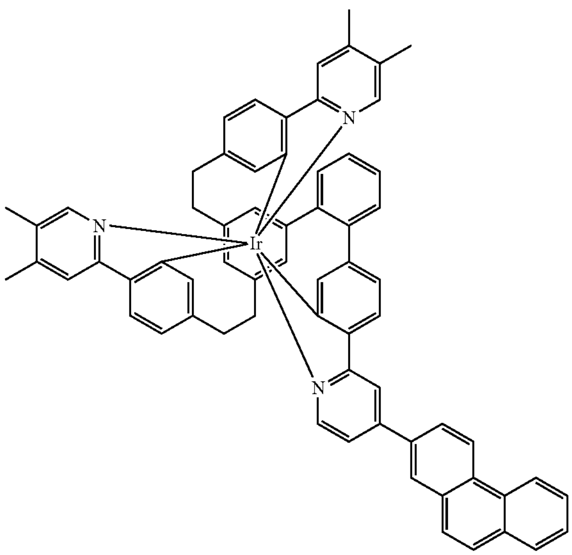
158
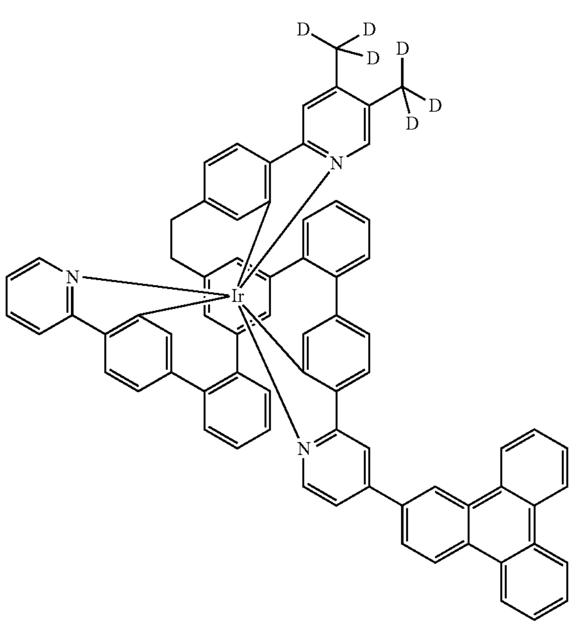
-continued
159
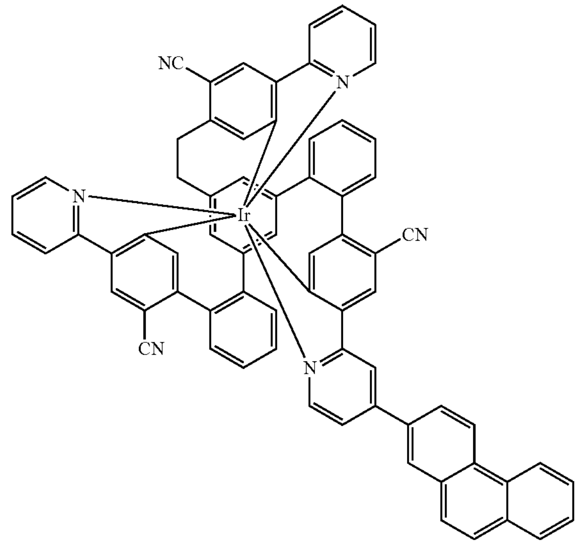
160
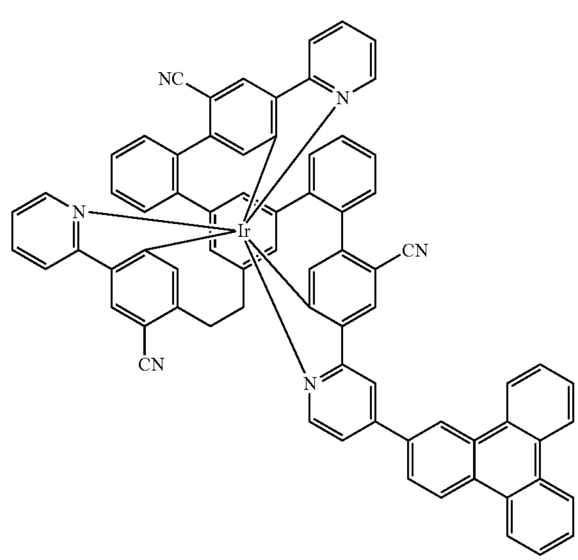

-continued
161
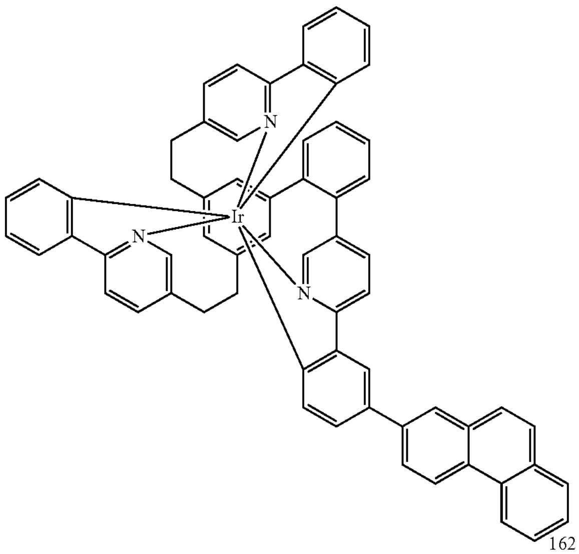
162
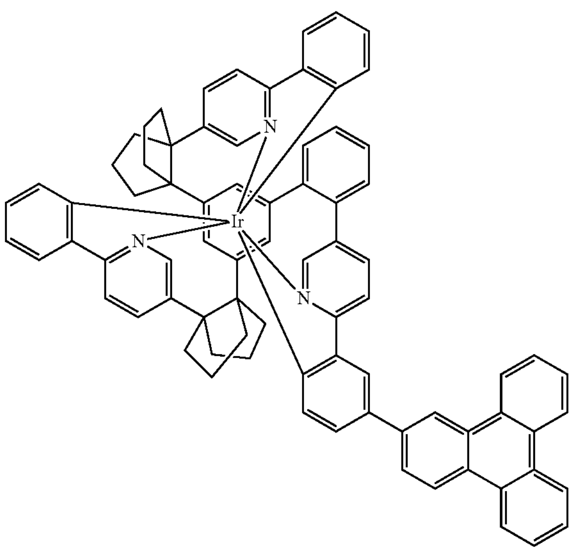
163
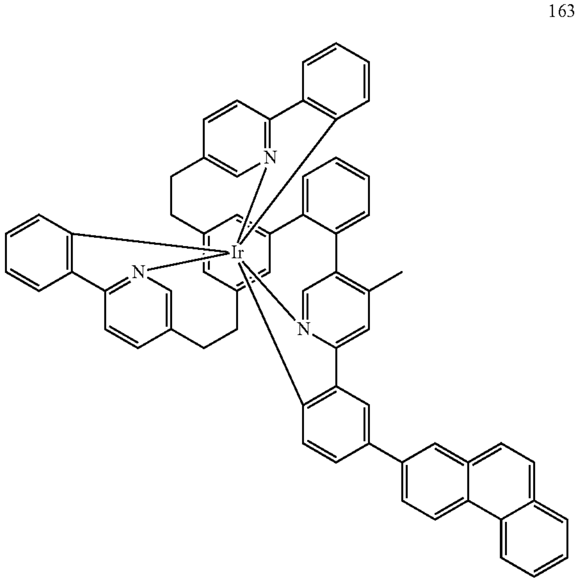
-continued
164
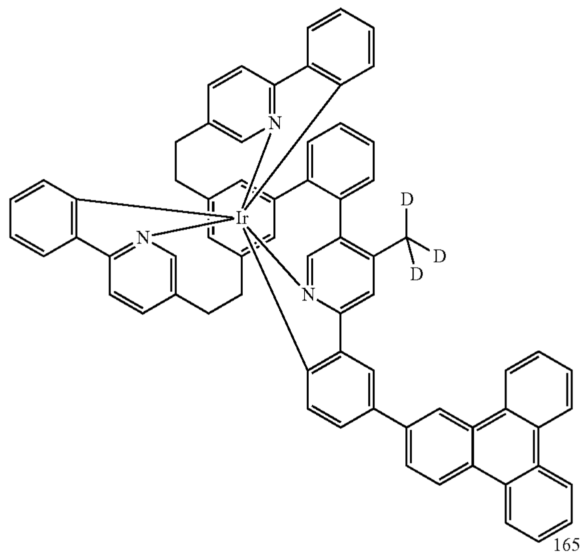
165
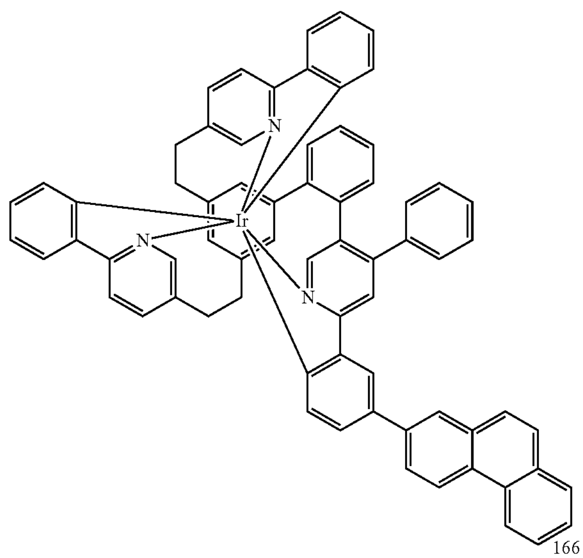
166
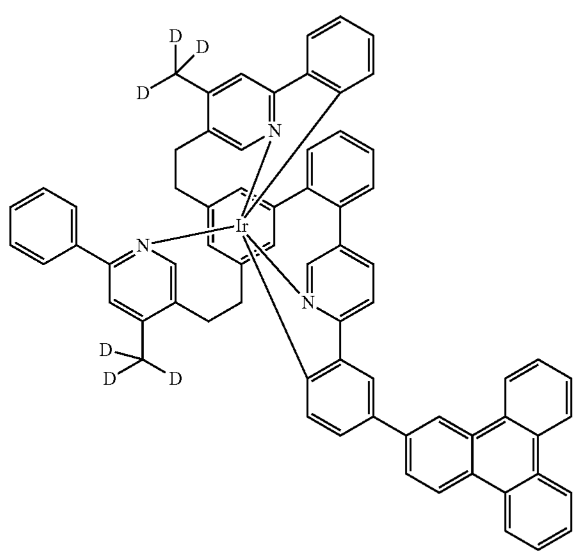

167
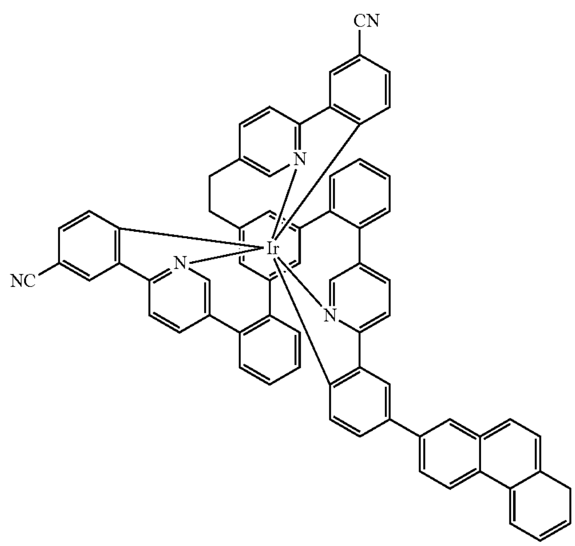
168
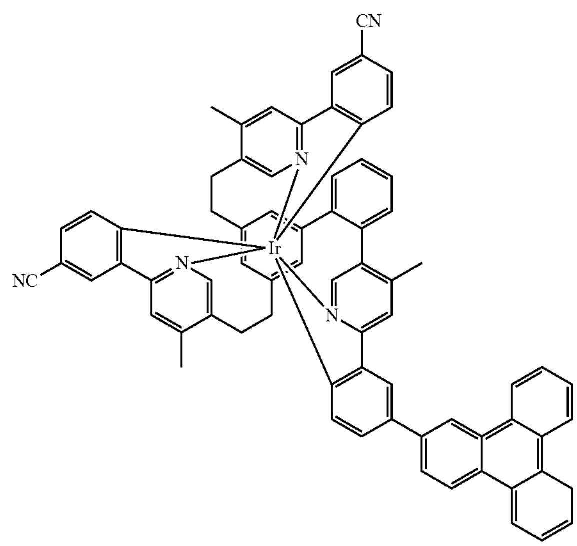
169
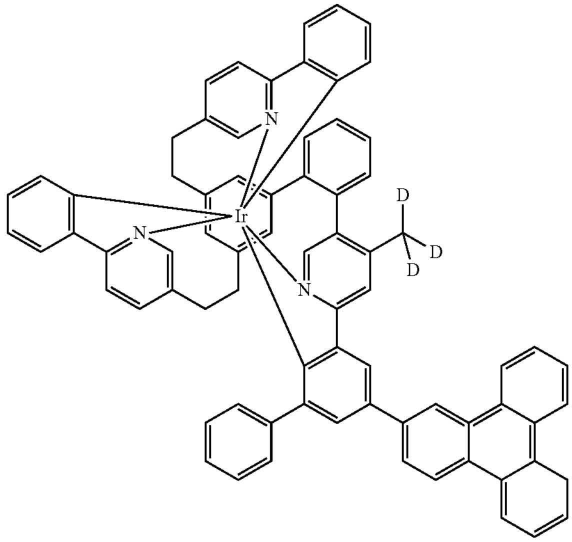
170
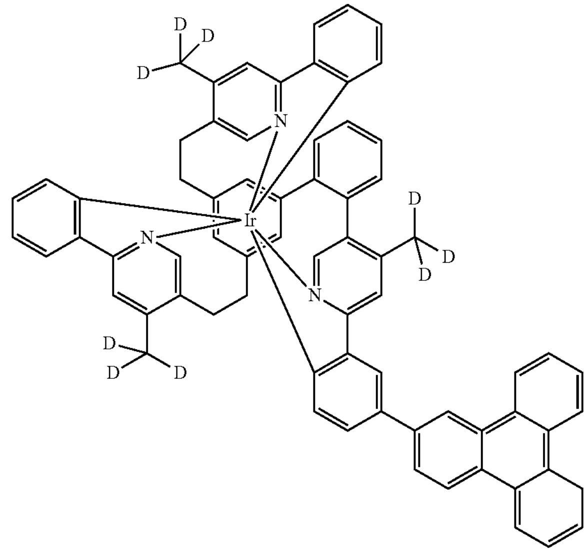
171
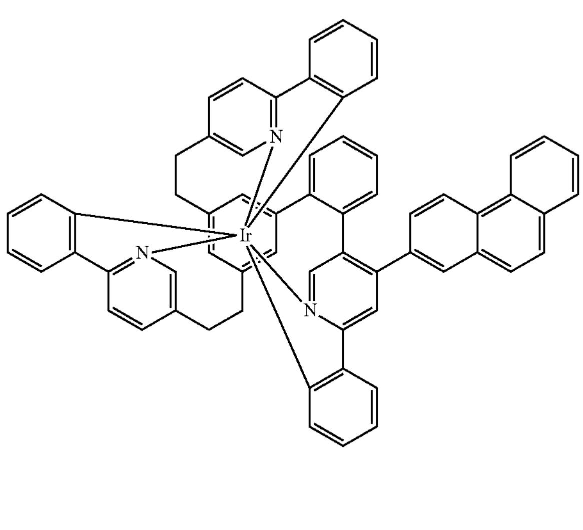
172
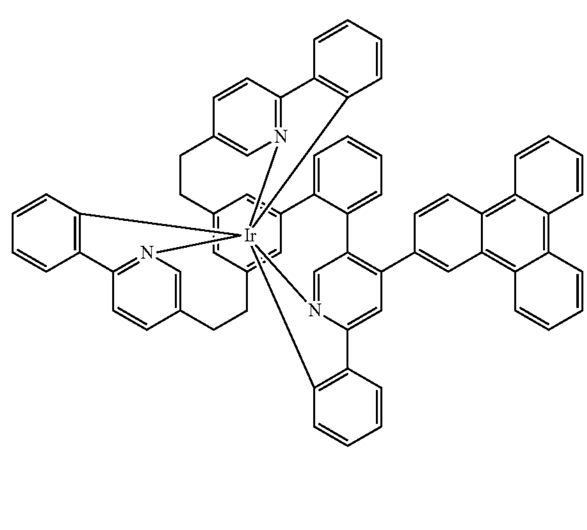

-continued
173
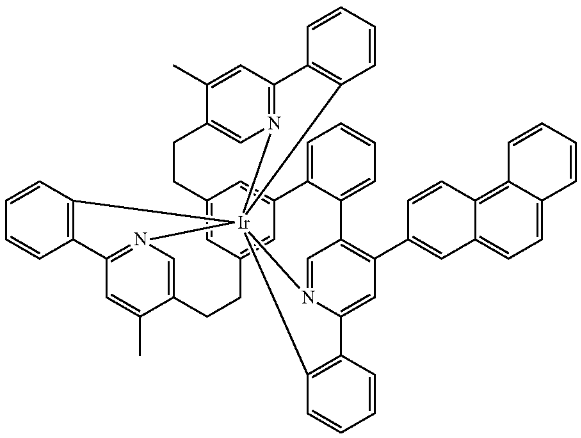
174
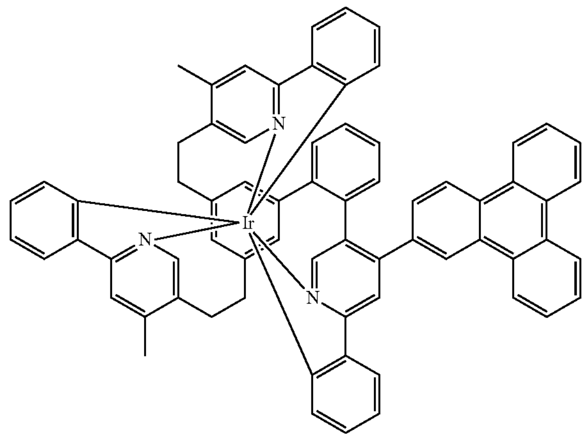
175
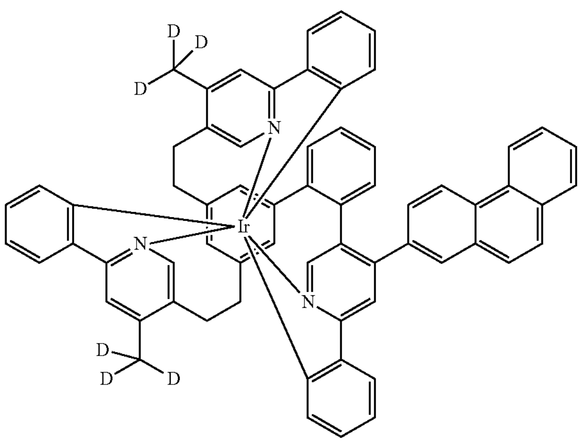
176
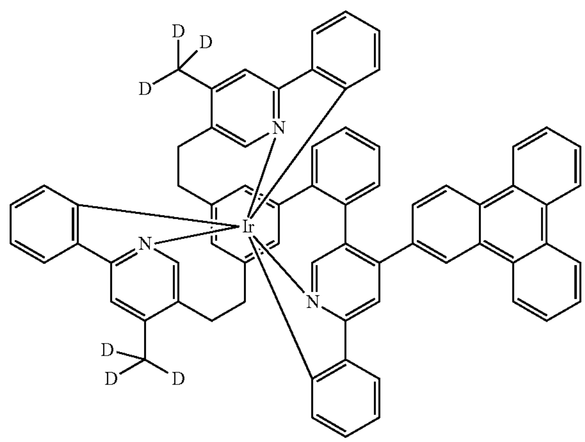
177
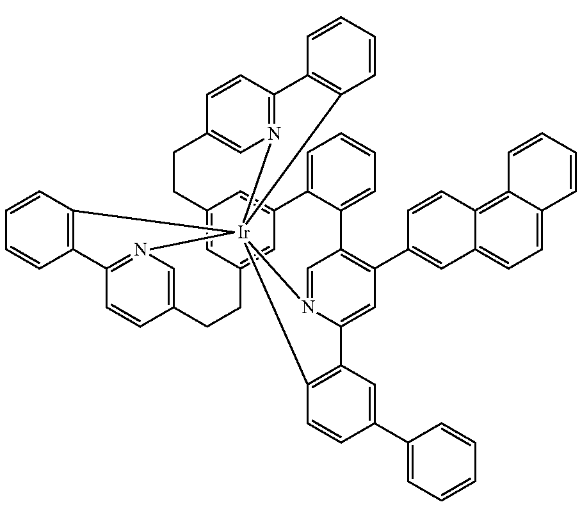
178
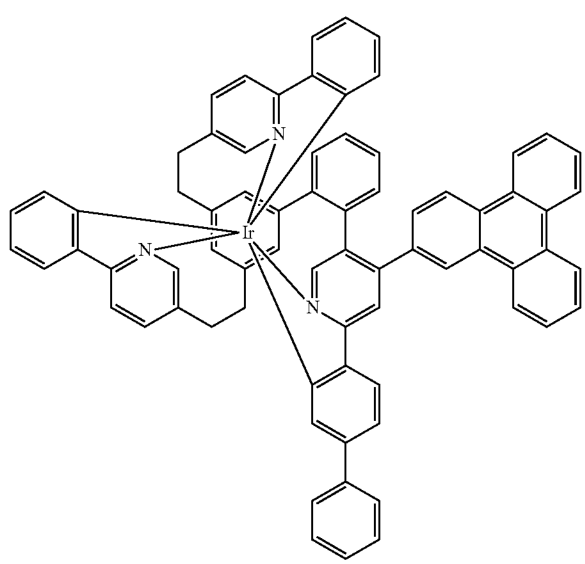

-continued
179
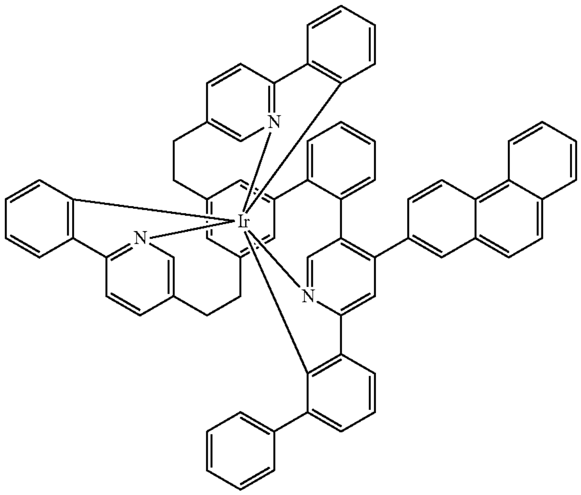
180
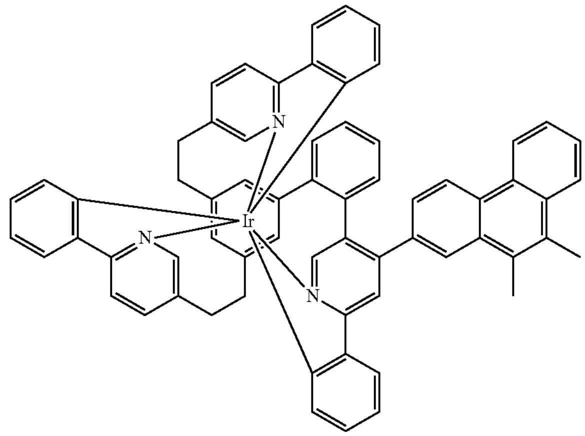
181
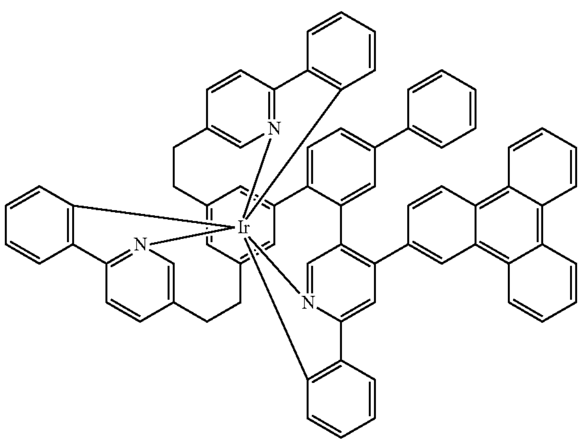
182
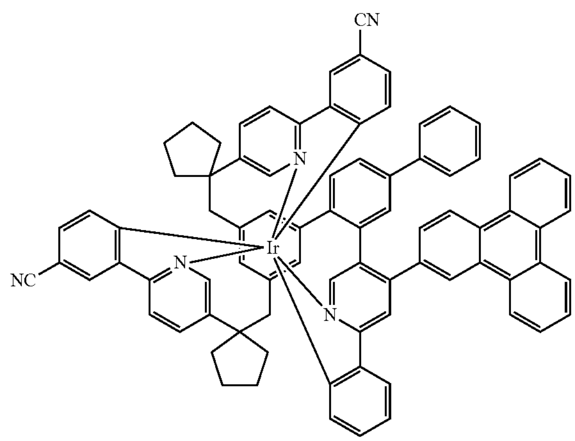
183
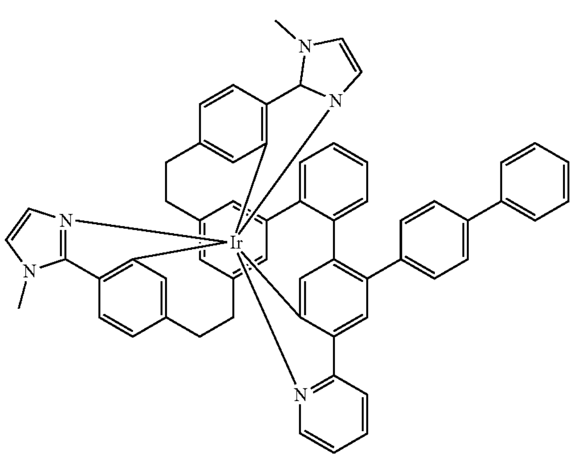
184
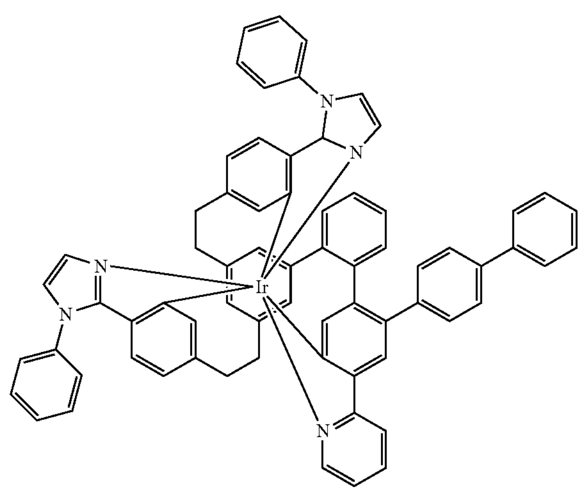

-continued
185
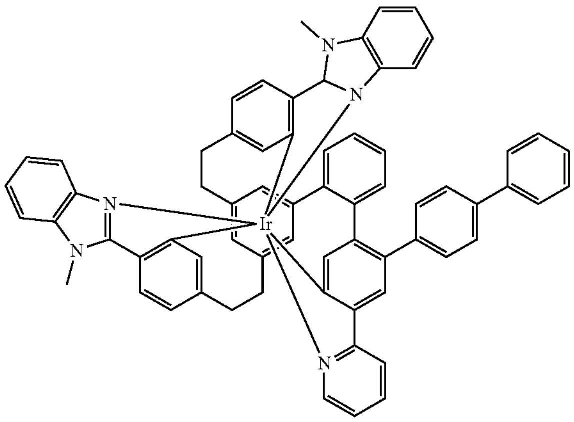
186
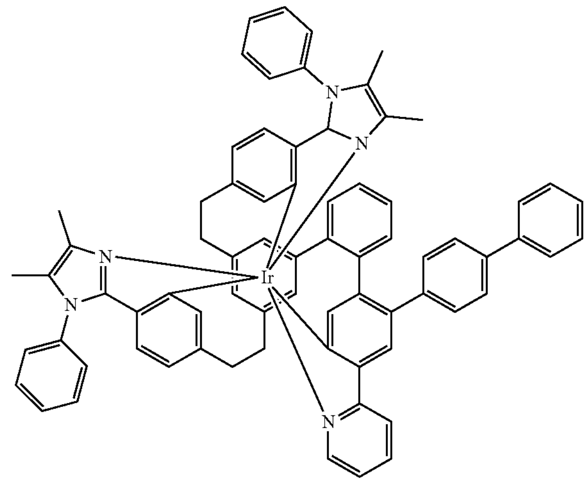
187
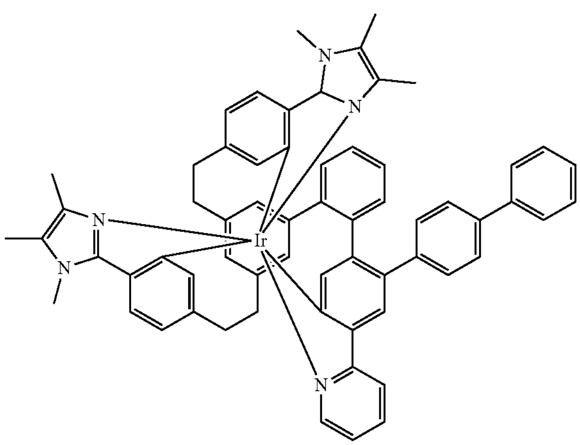
188
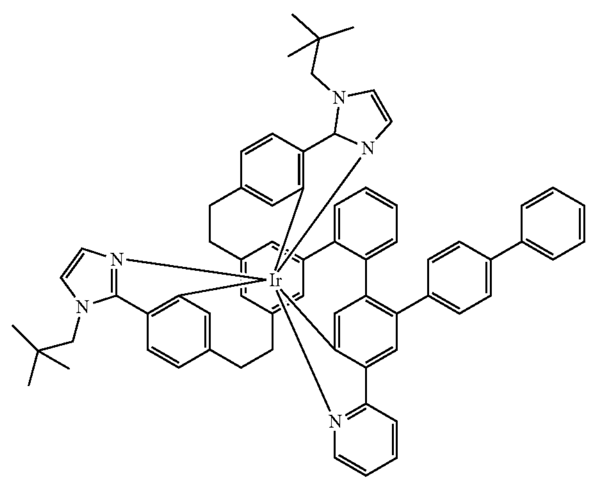
189
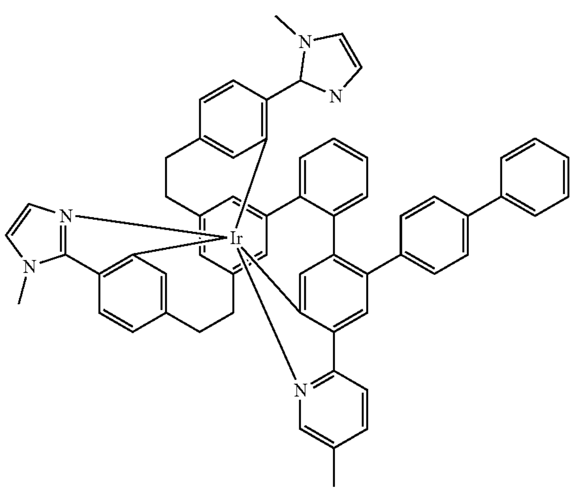
190
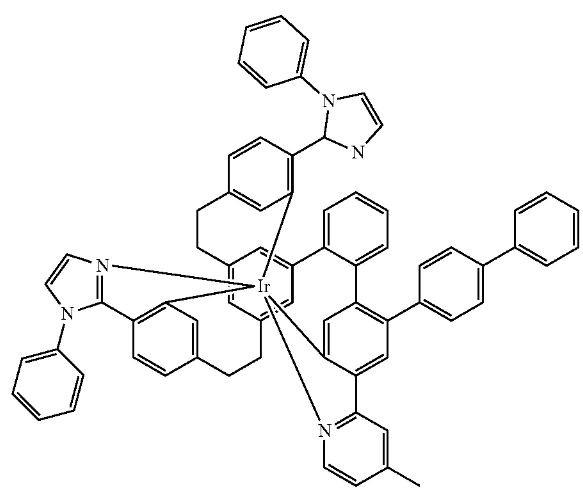

-continued
192
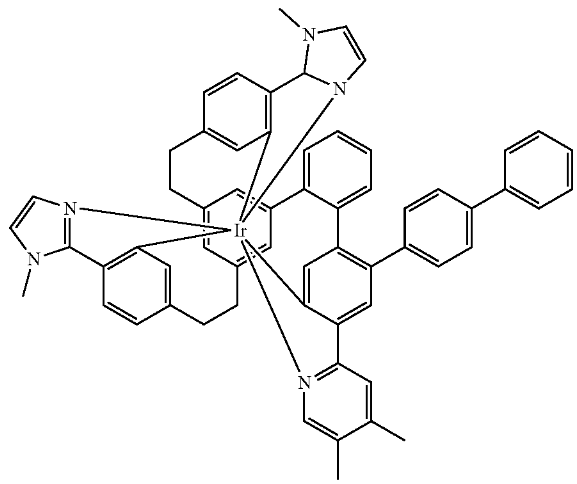
192
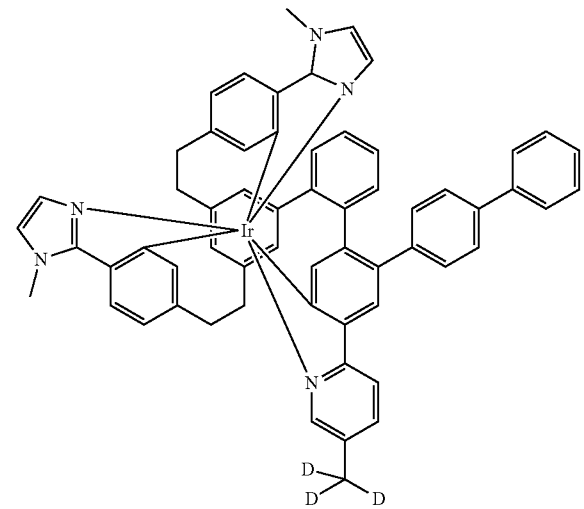
193
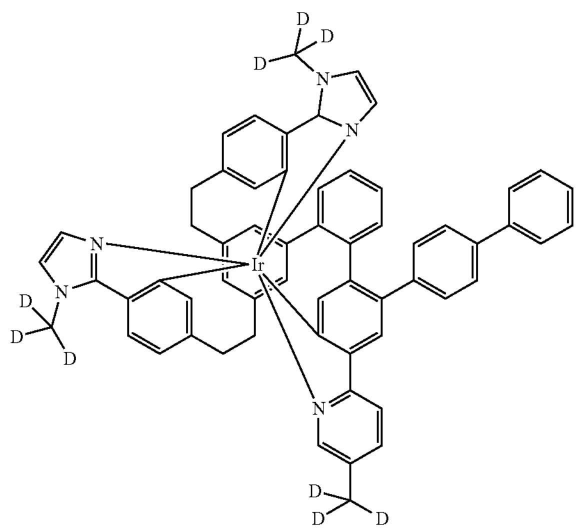
194
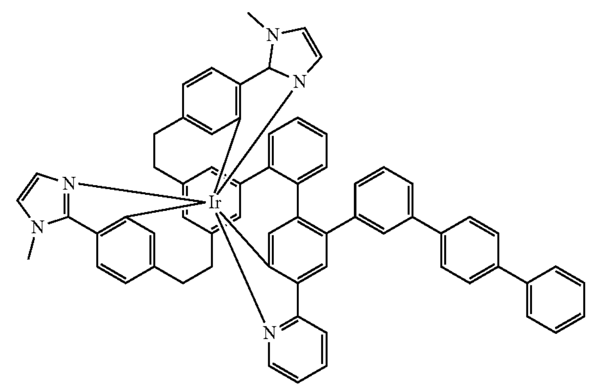
194
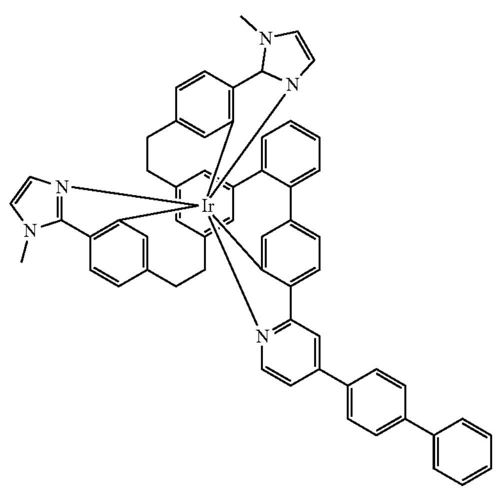
196
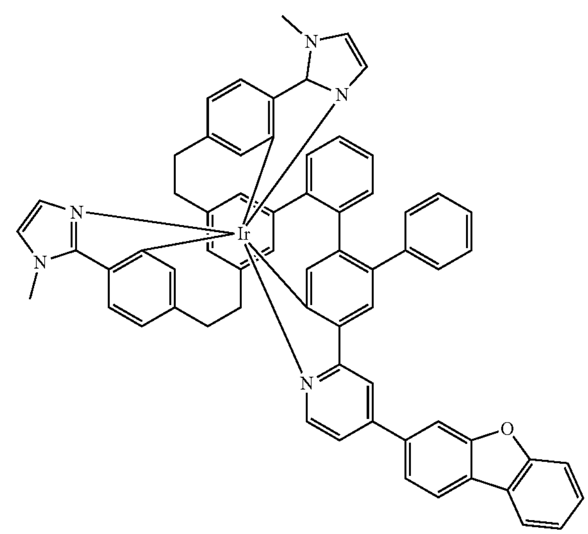

-continued
197
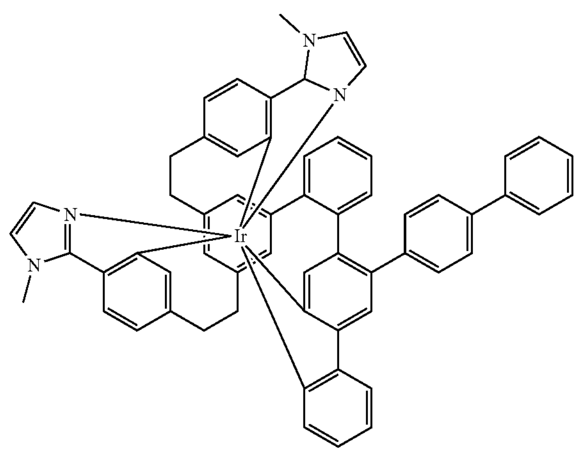
198
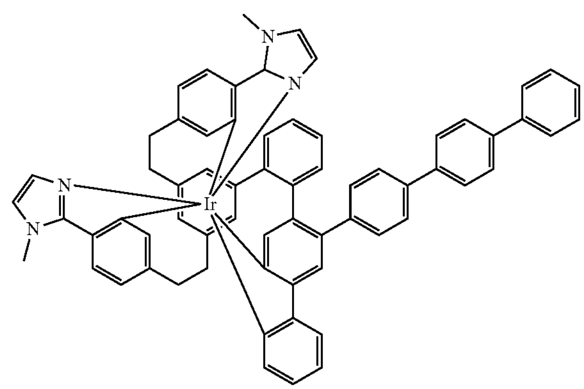
199
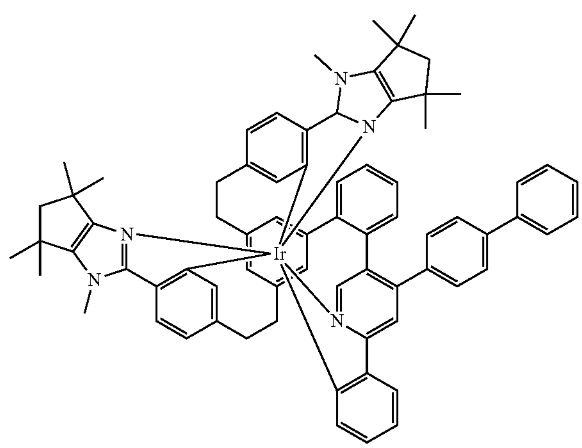
200
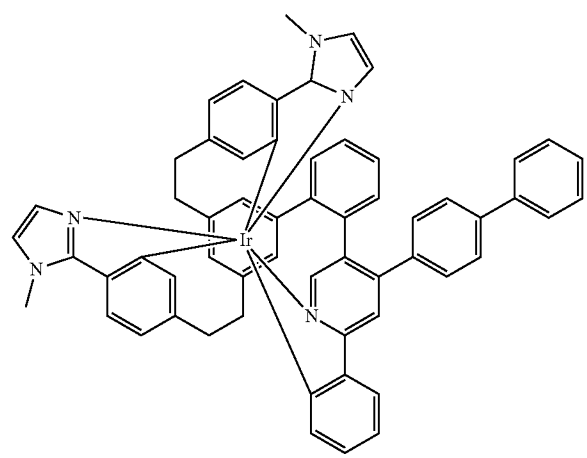
201
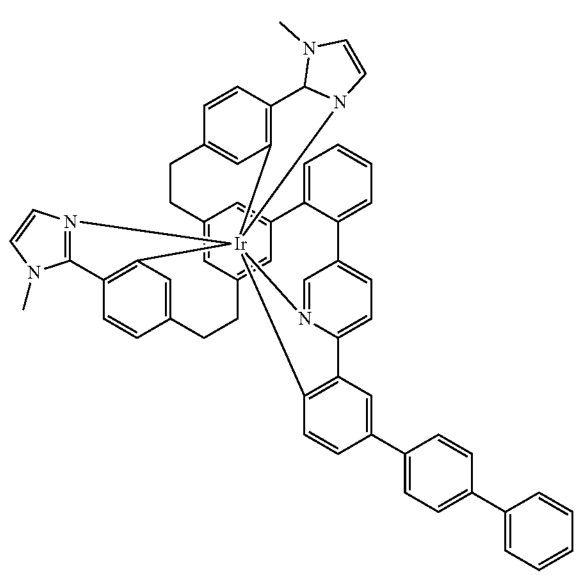
202
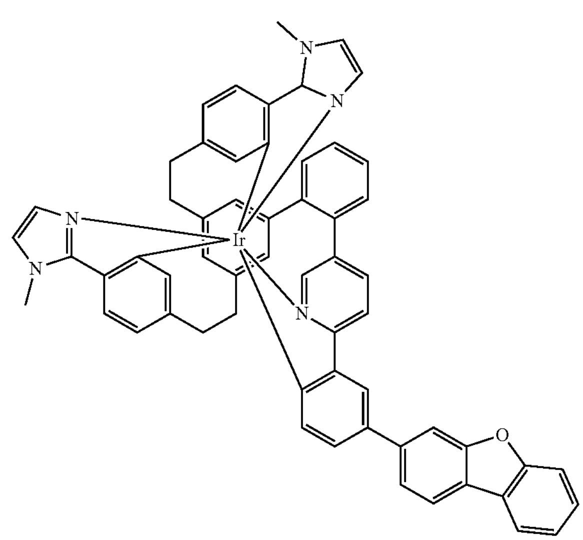

-continued
203
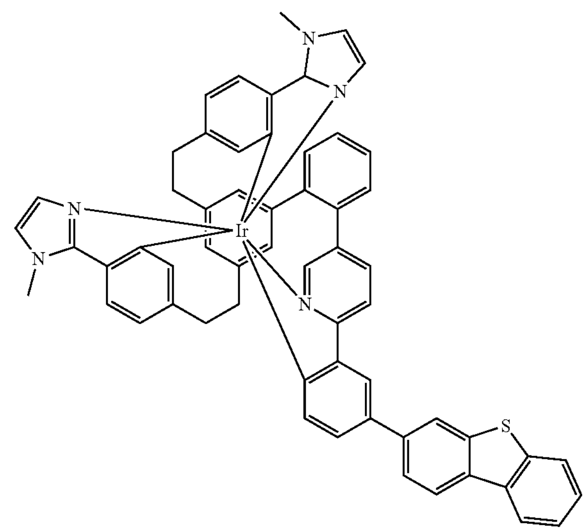
204
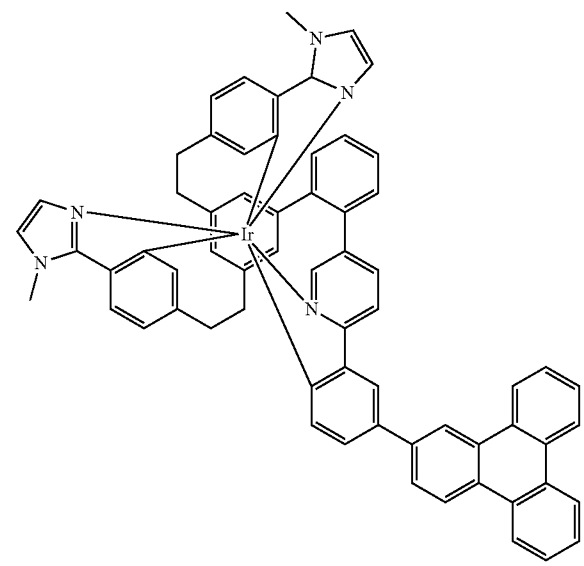
205
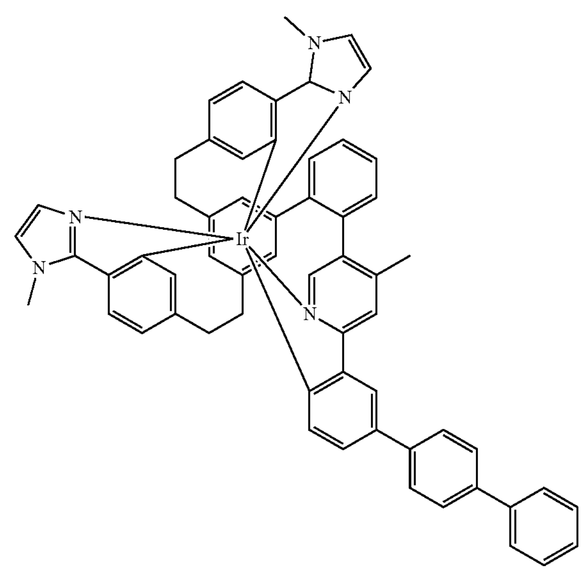
206
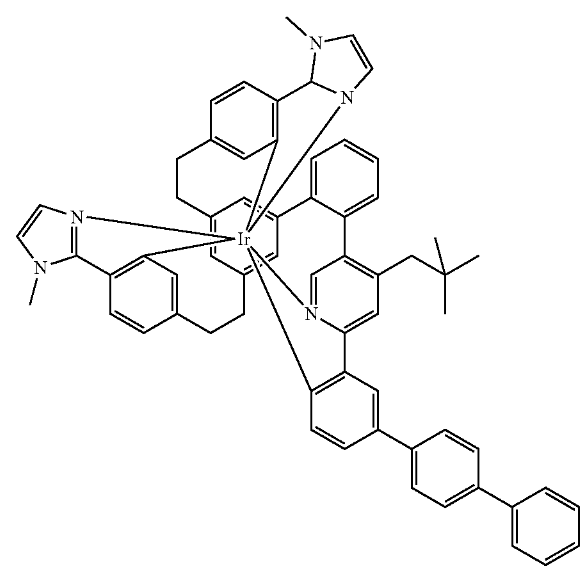
207
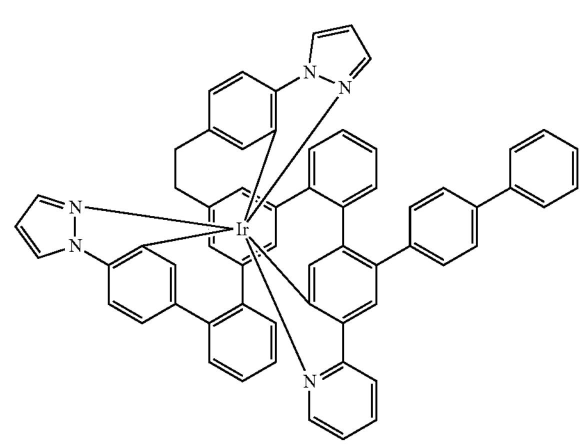
208
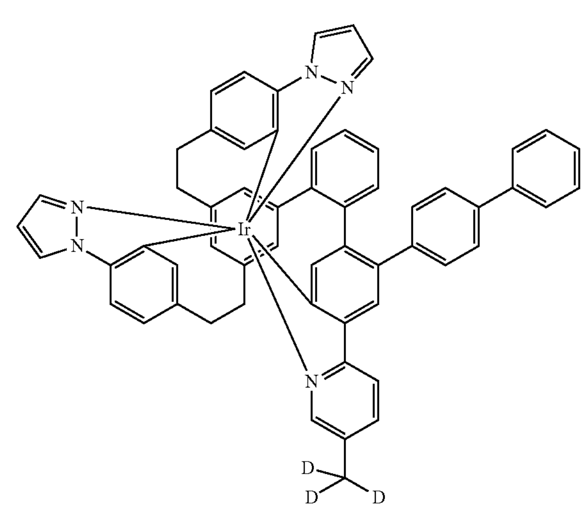

-continued
209
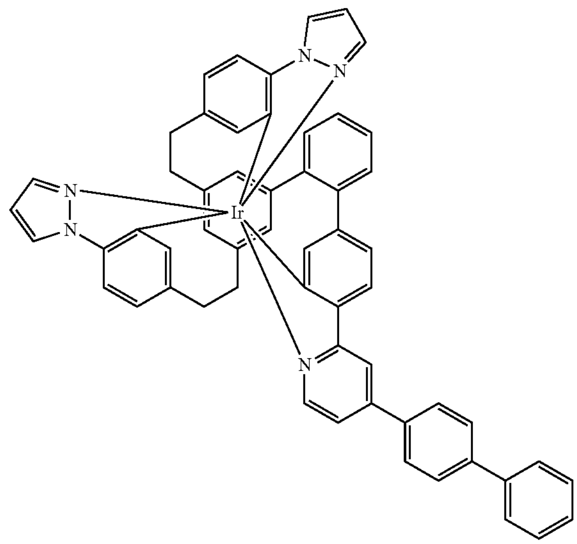
210
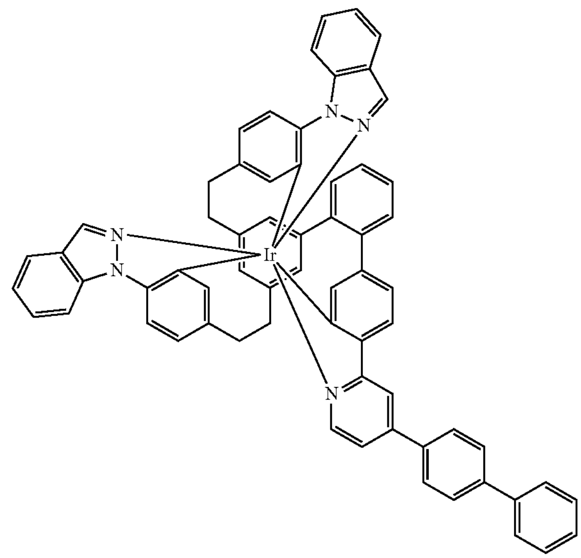
211
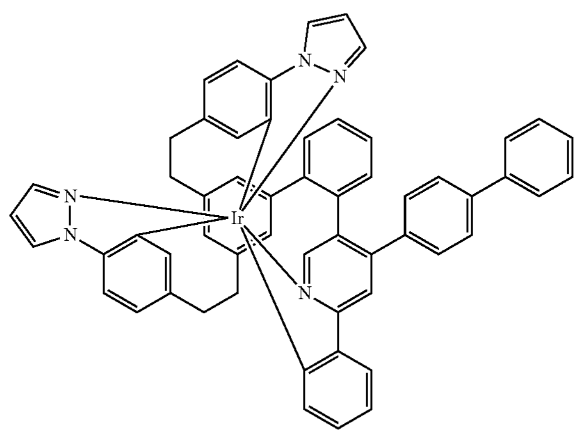
212
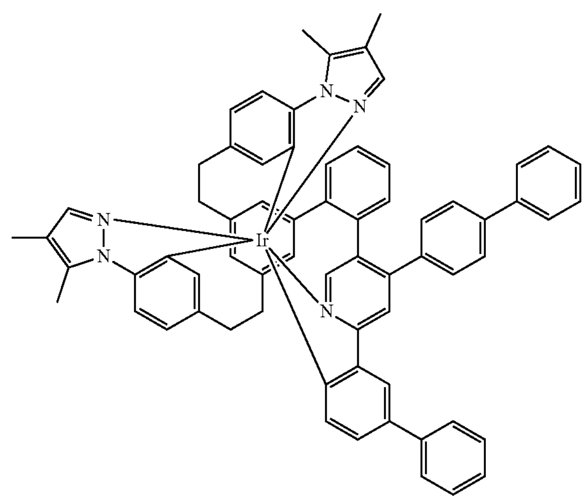
213
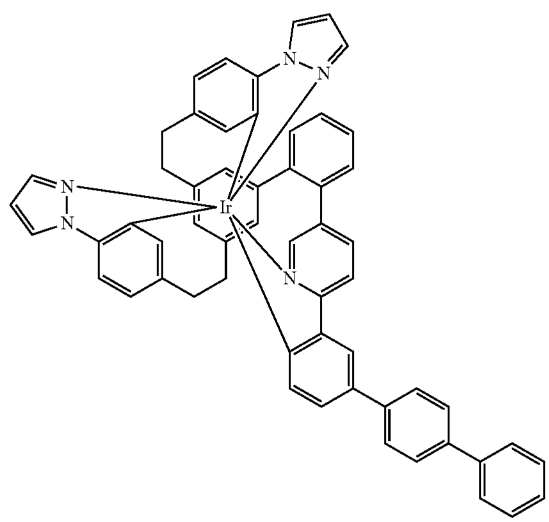
214
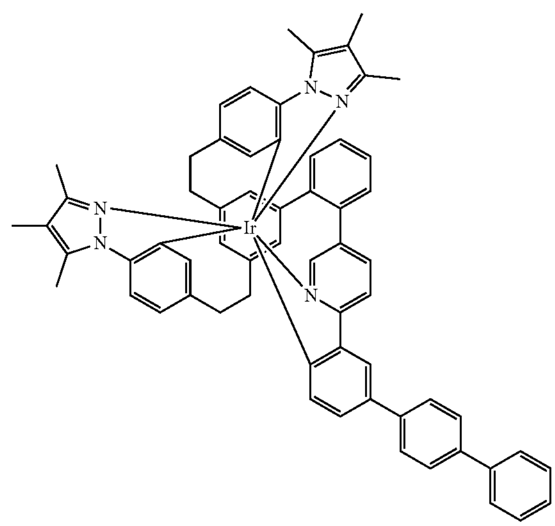

-continued
215
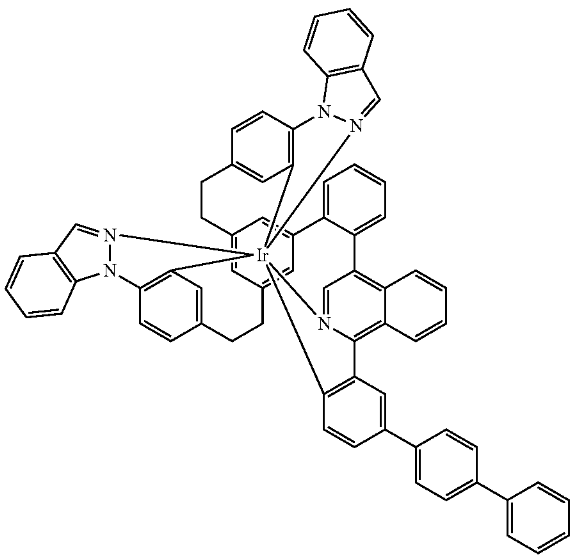
216
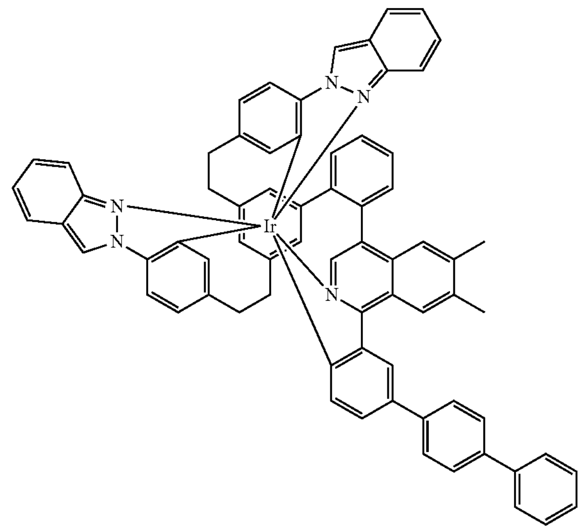
217
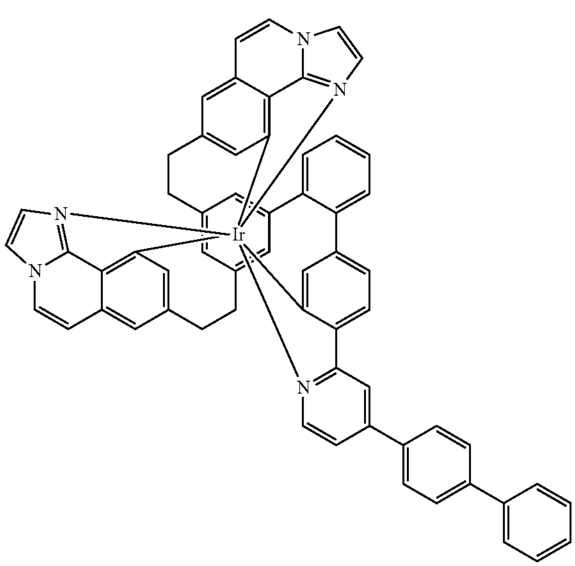
218
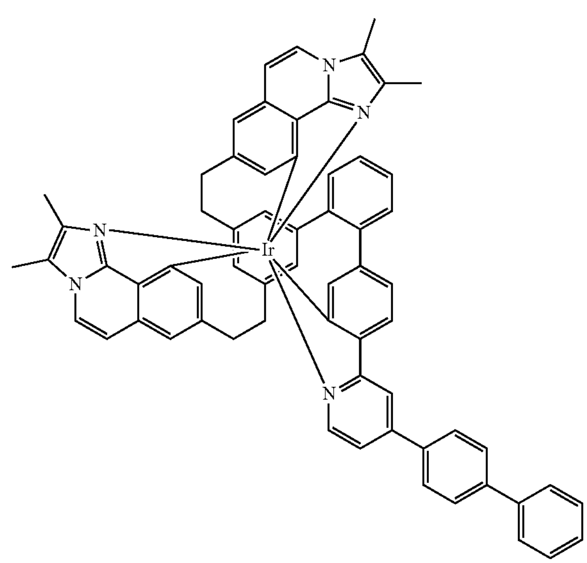

-continued
219
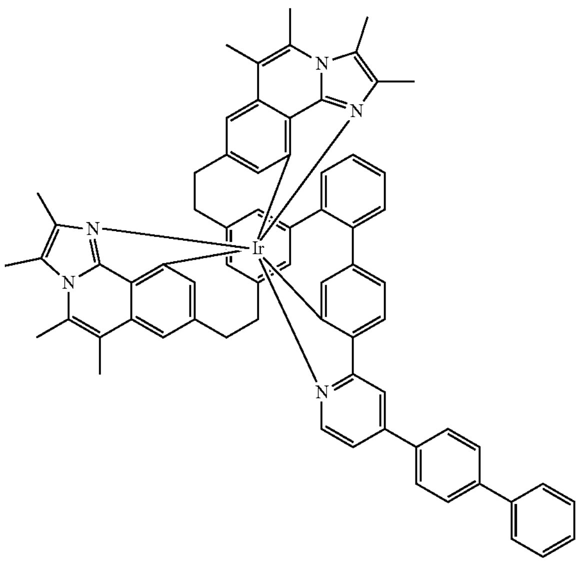
220
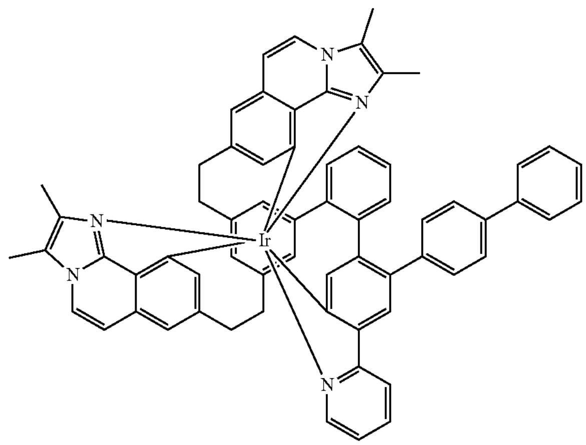
221
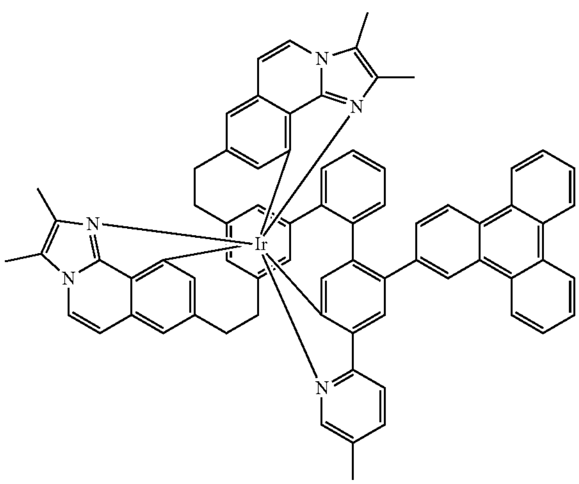
222
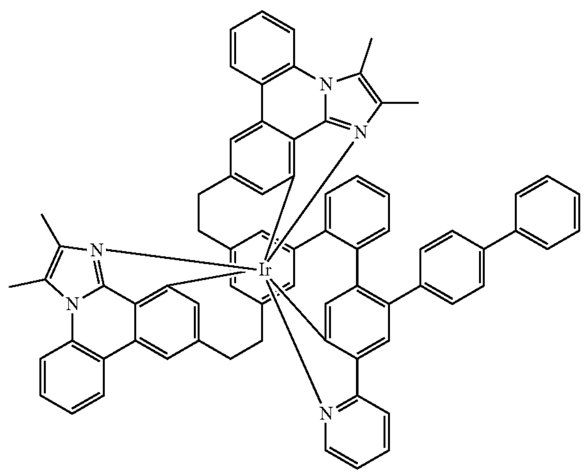
223
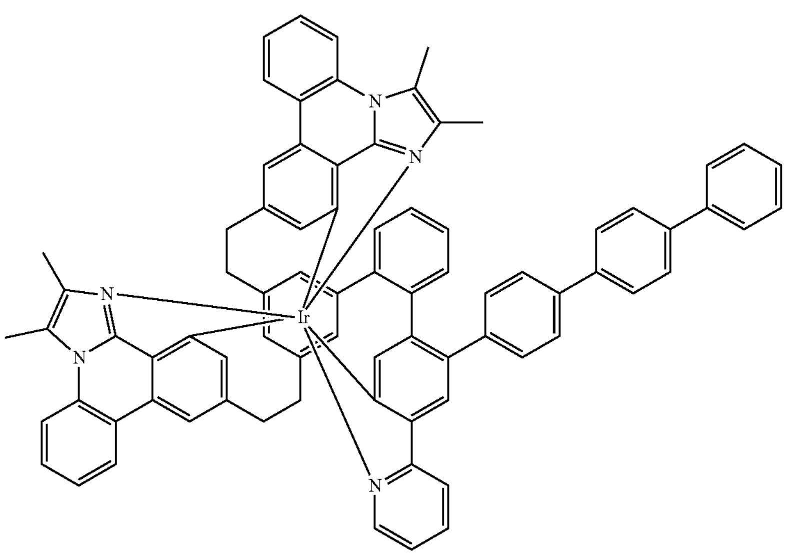

-continued
224
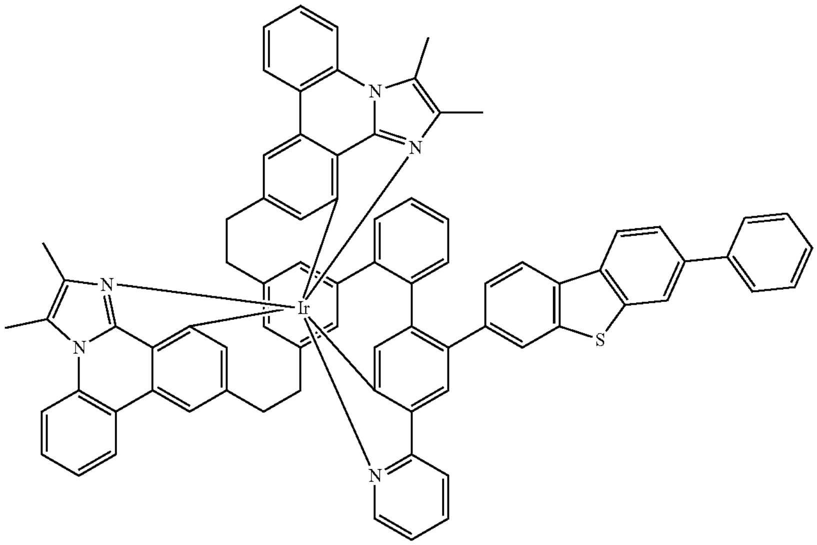
225
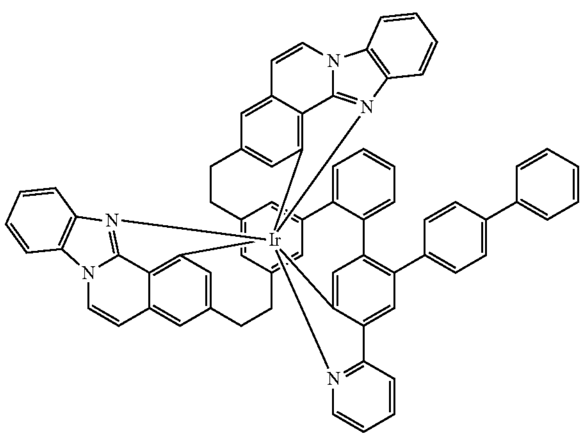
226
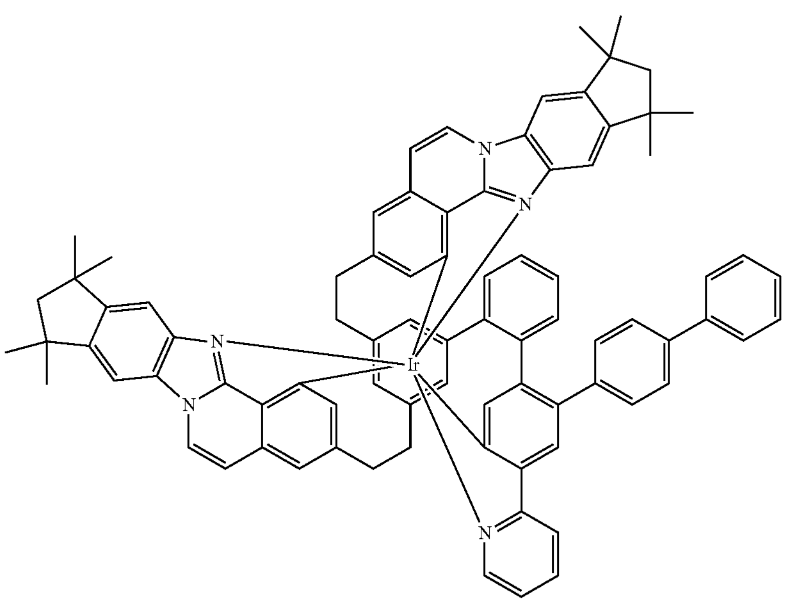

-continued
227
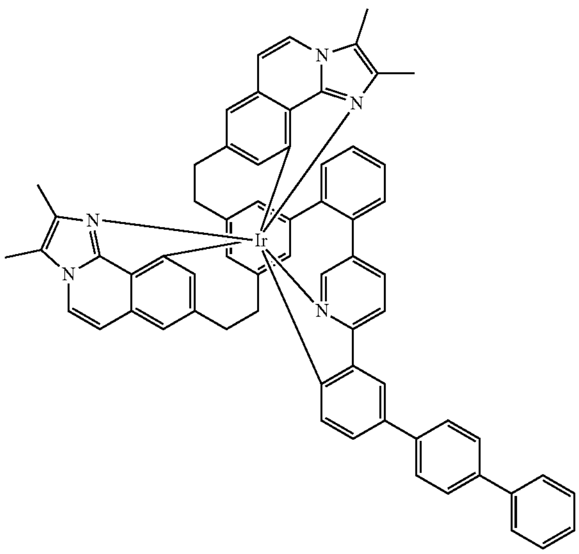
228
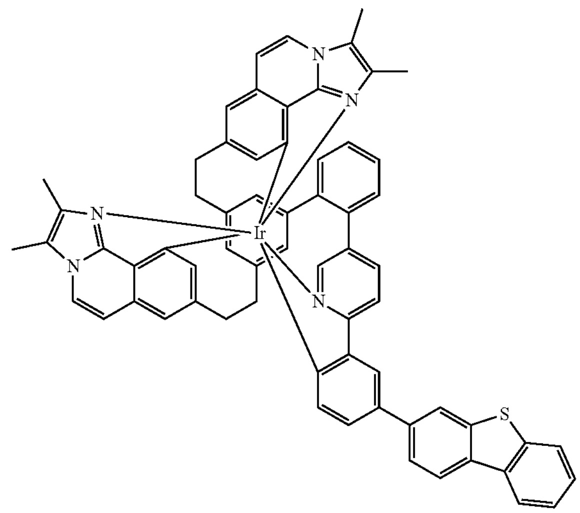
229
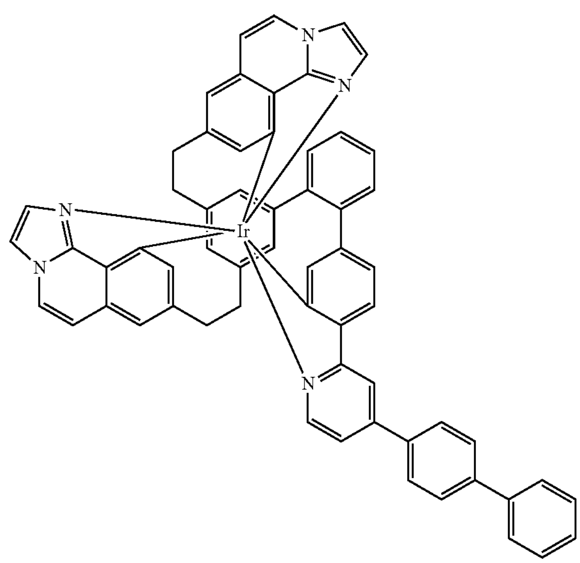
230
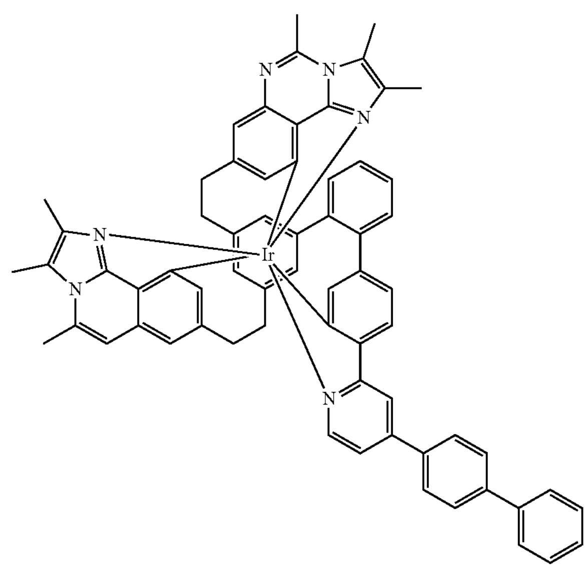

-continued
231
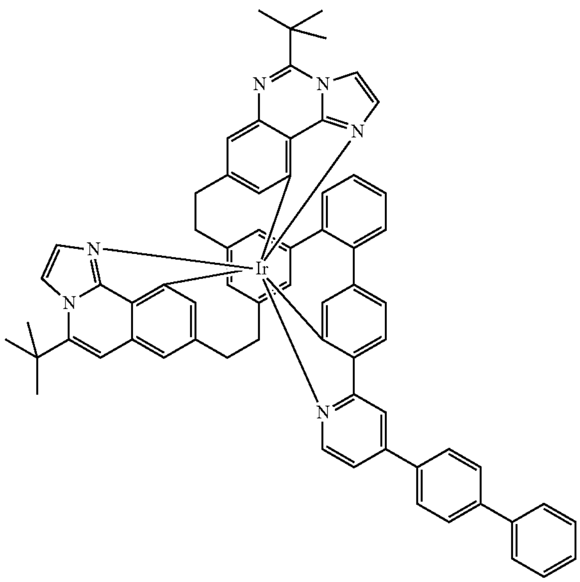
232
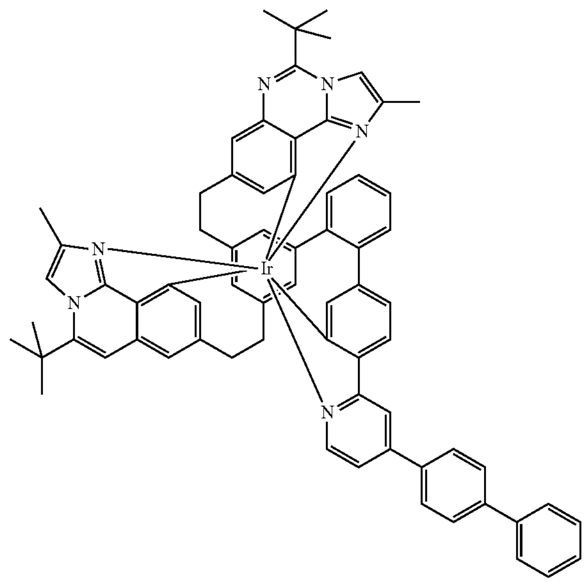
233
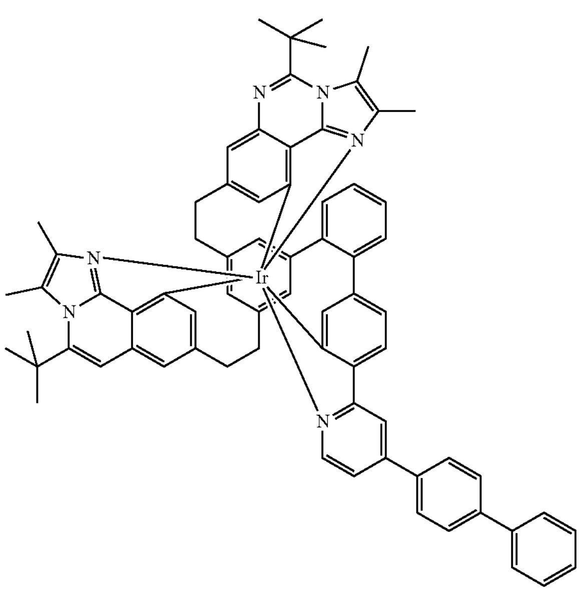
234
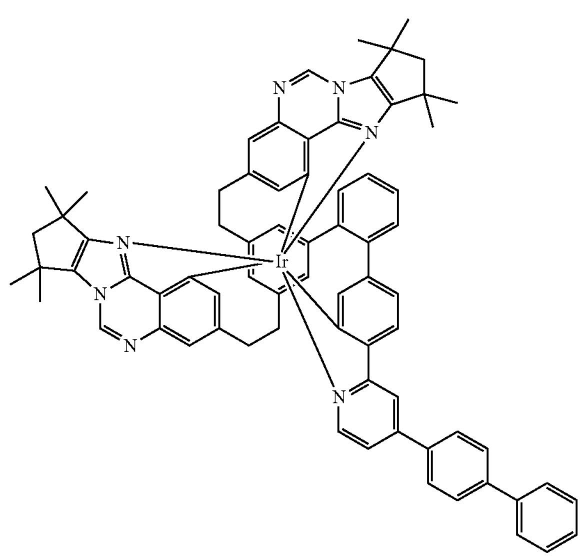

-continued
235
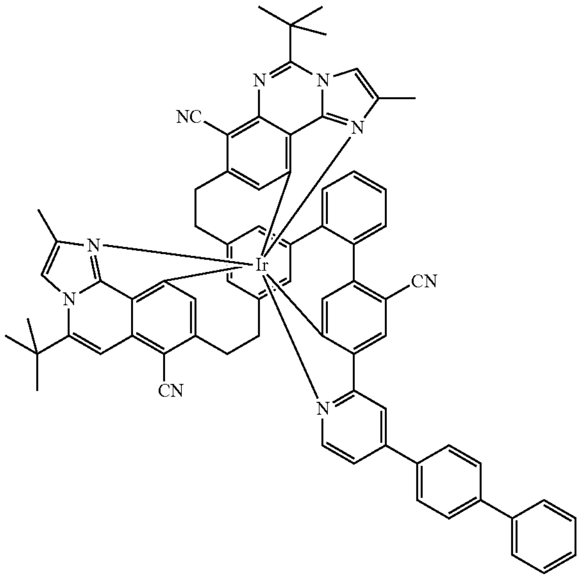
236
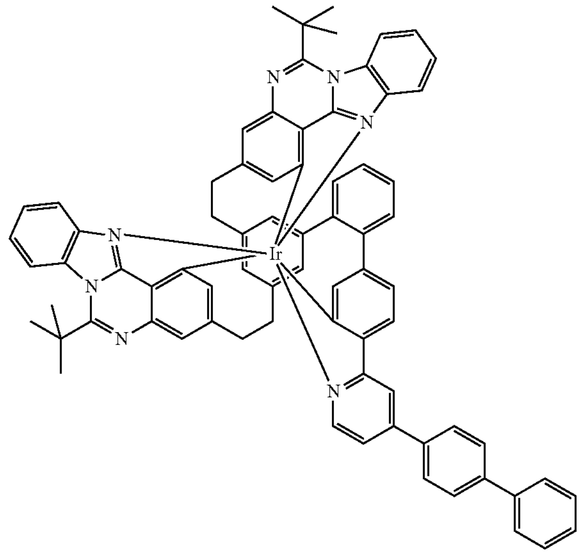
237
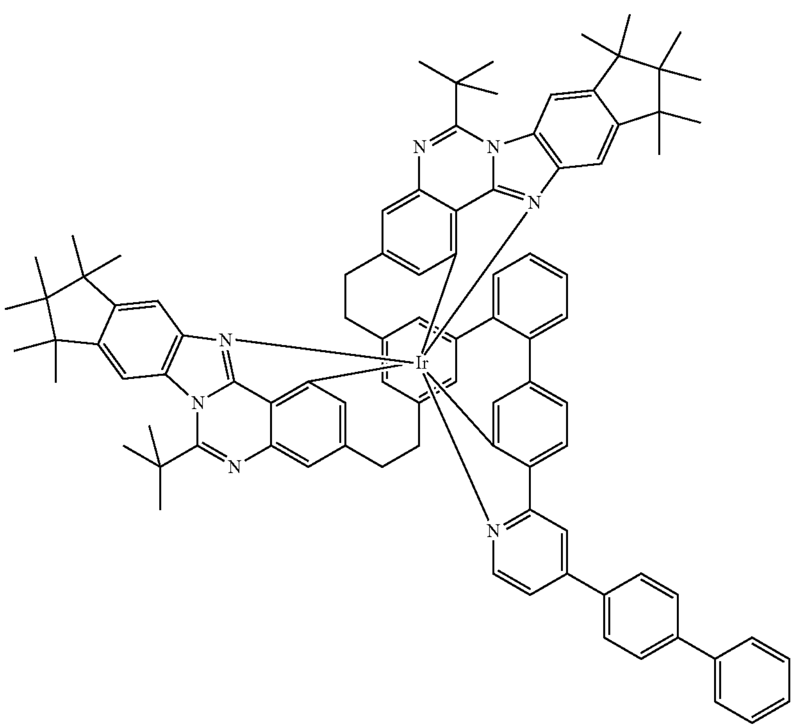

-continued
238
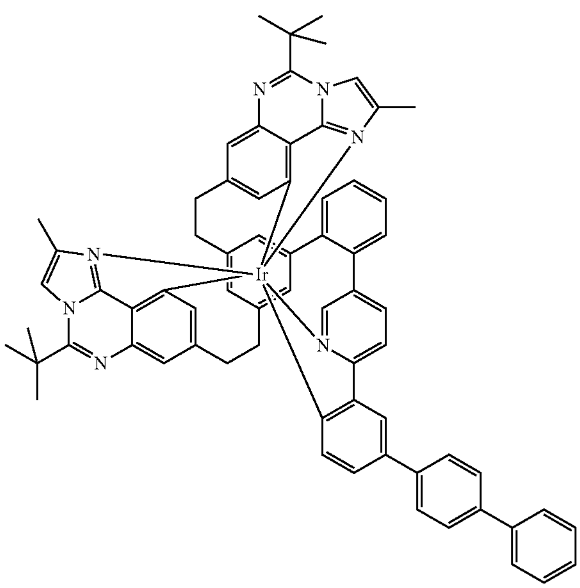
239
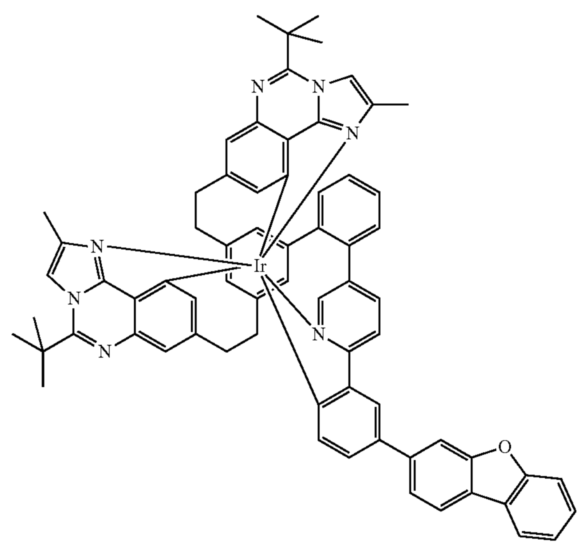
240
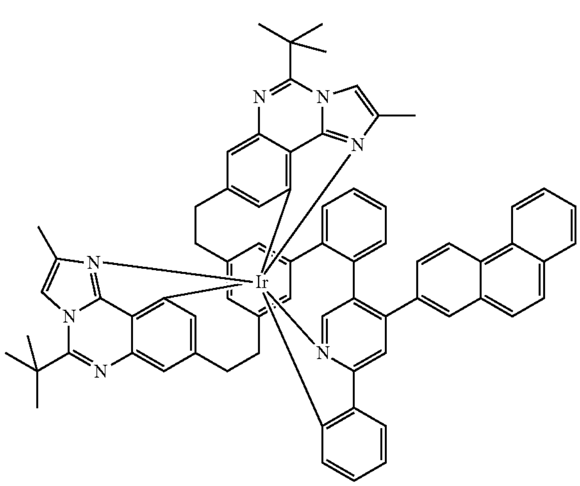
241
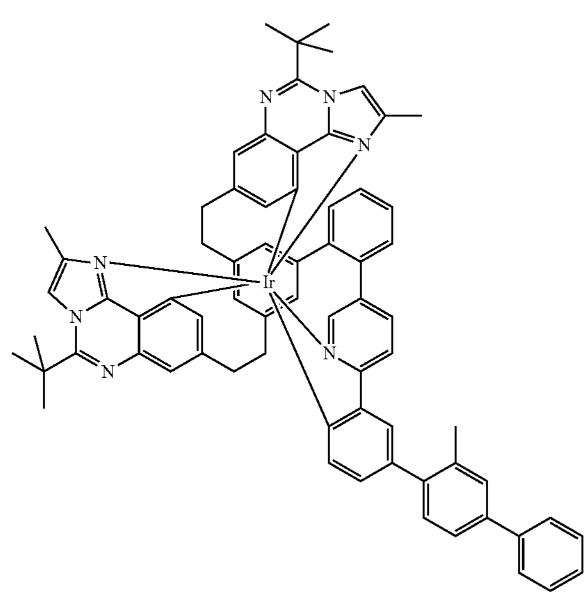

-continued
242
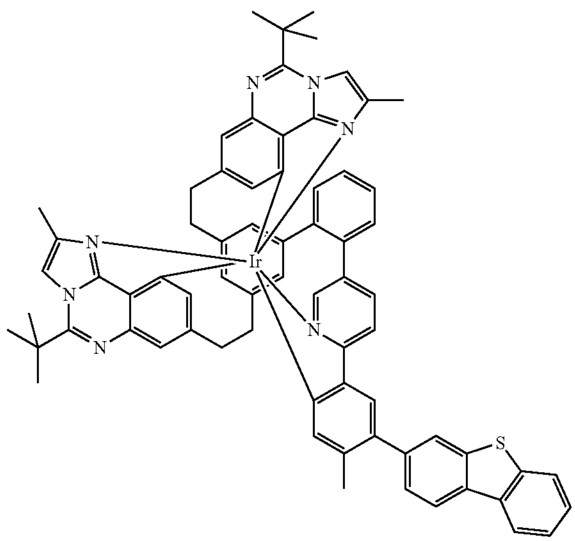
243
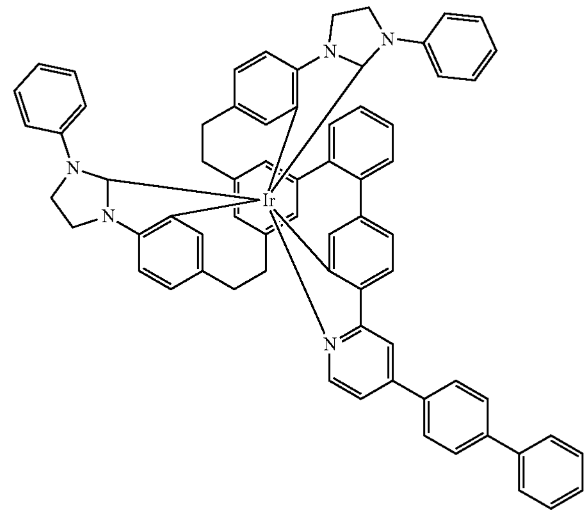
244
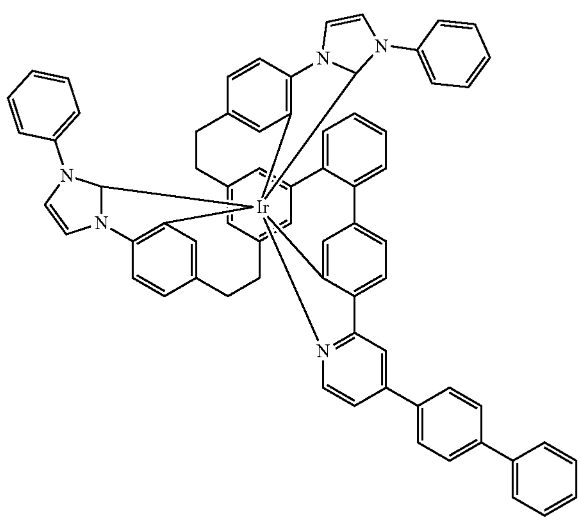
245
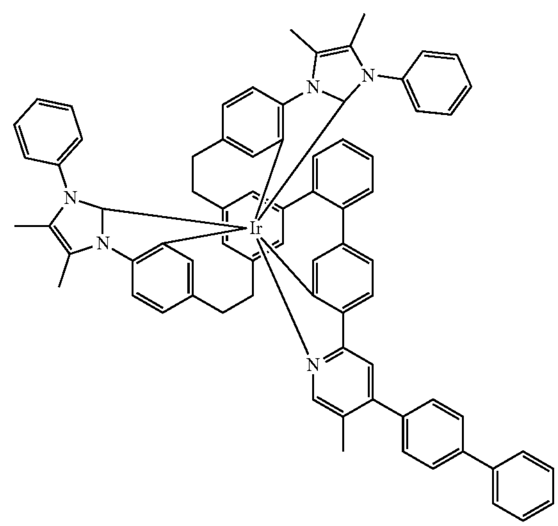
246
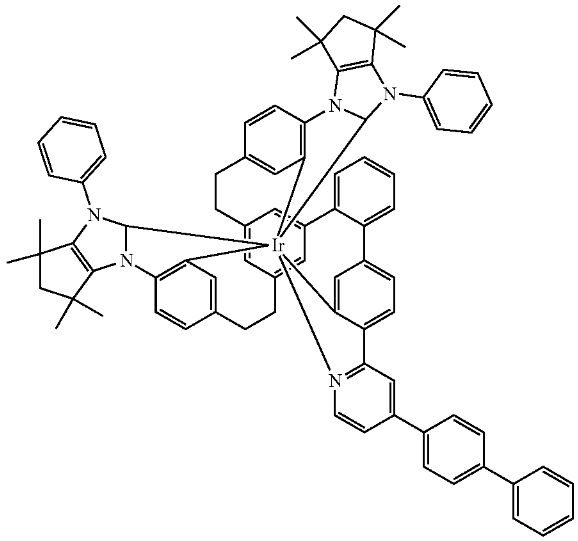
247
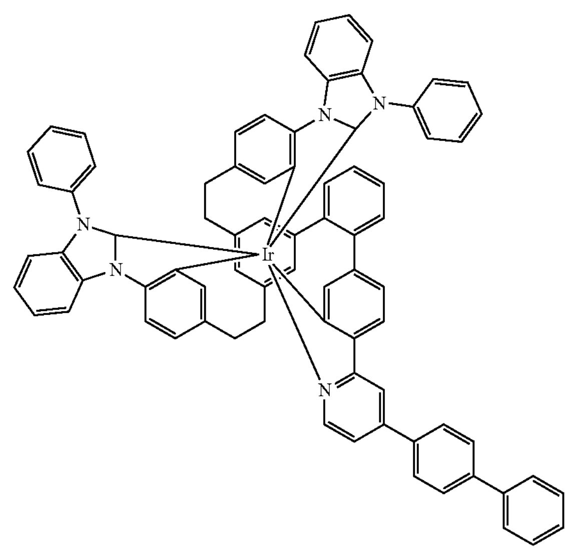

-continued
248
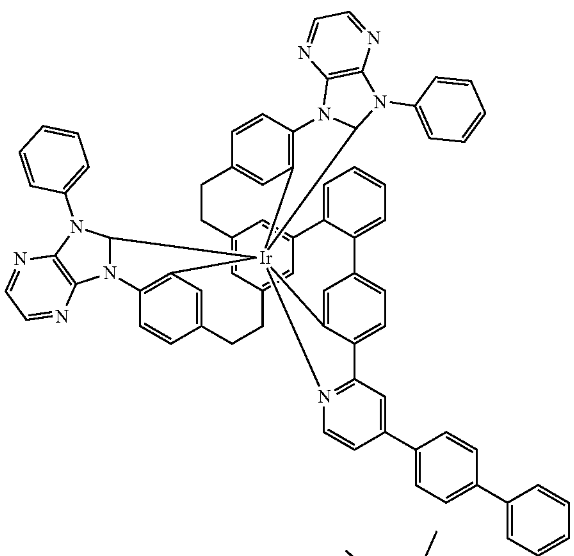
249
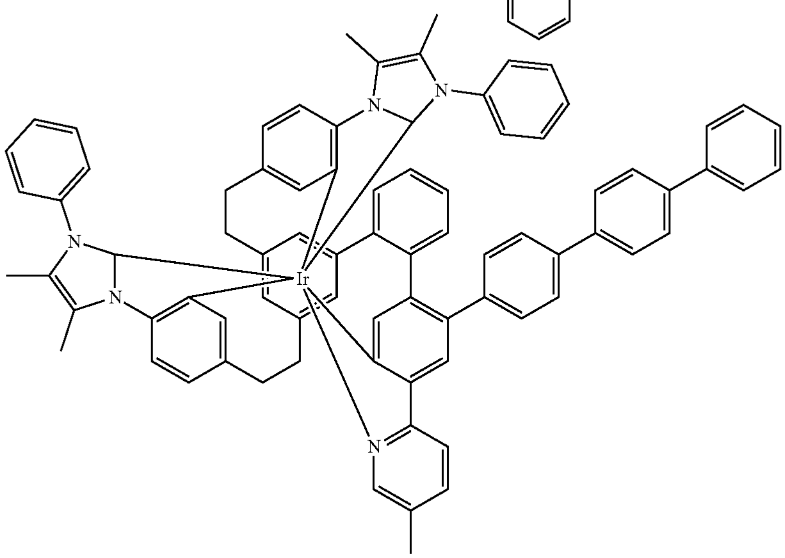
250
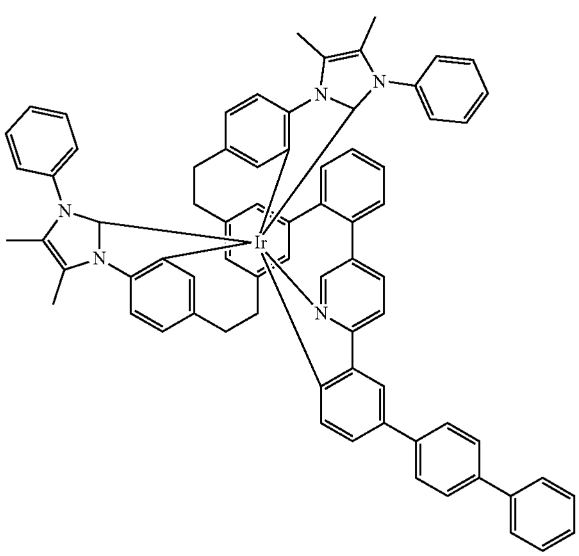
251
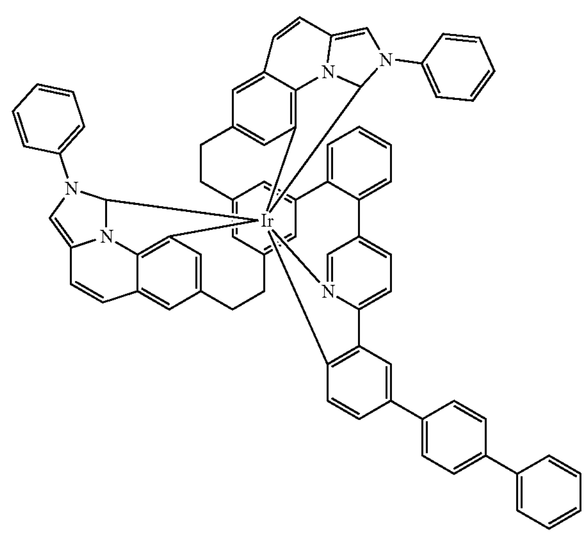

-continued
252
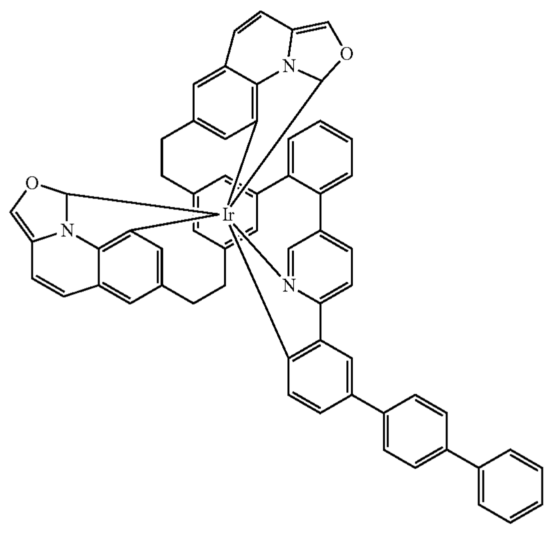
253
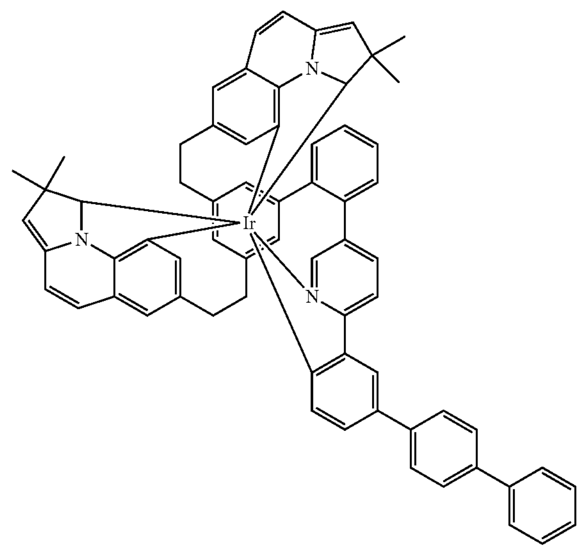
254
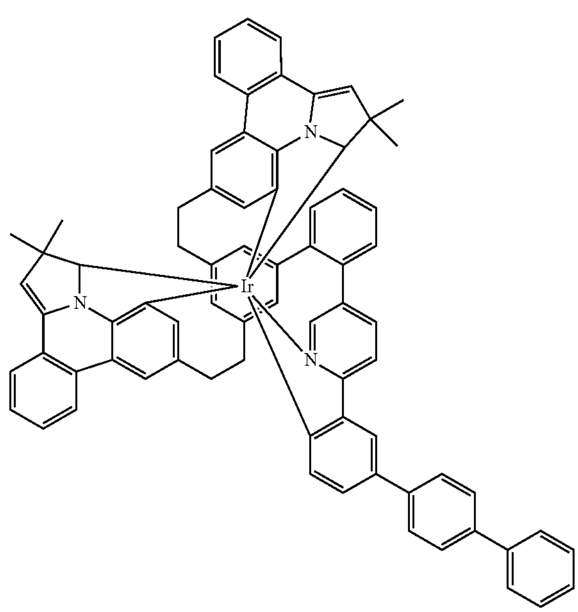
255
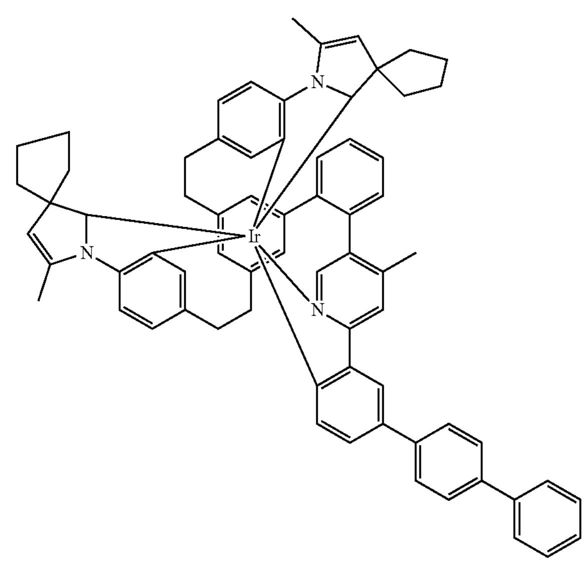

-continued
256
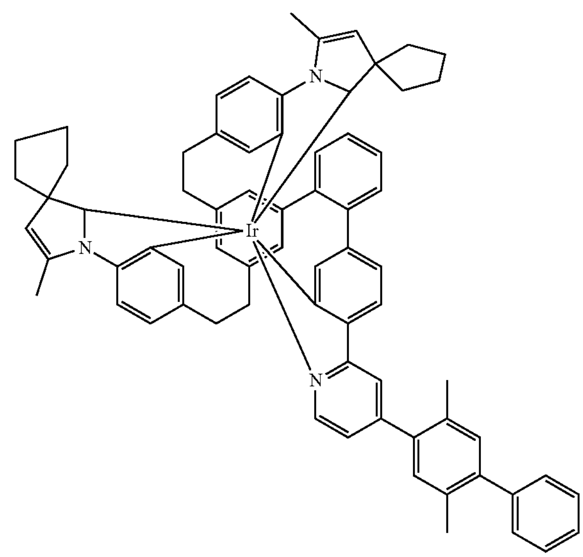
257
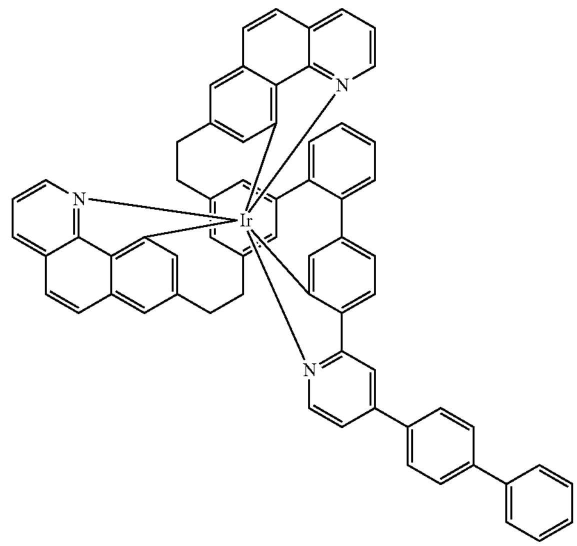
258
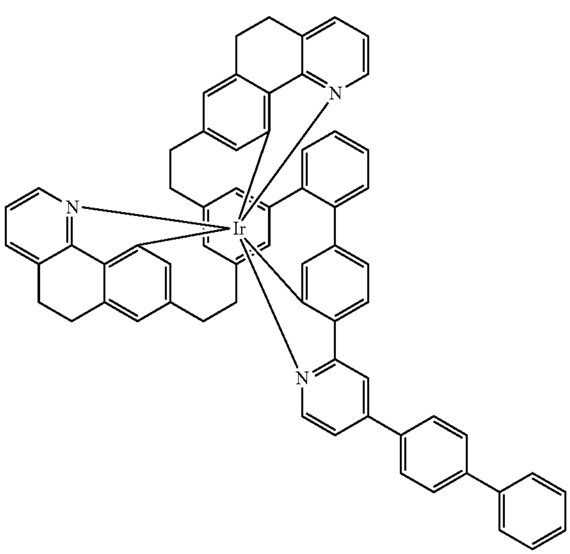
259
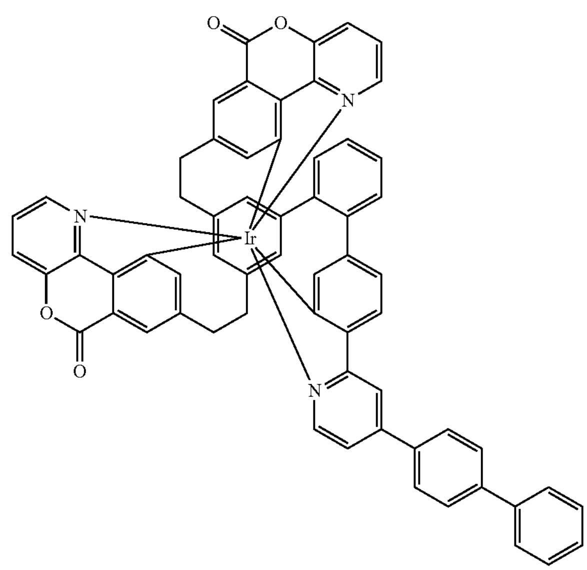

-continued
260
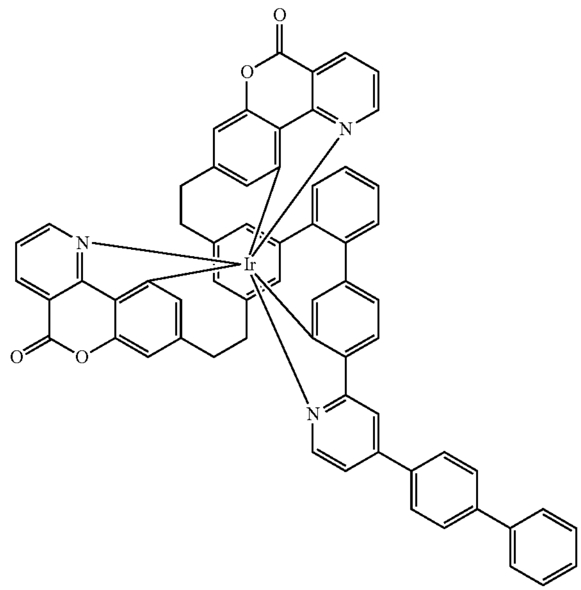
261
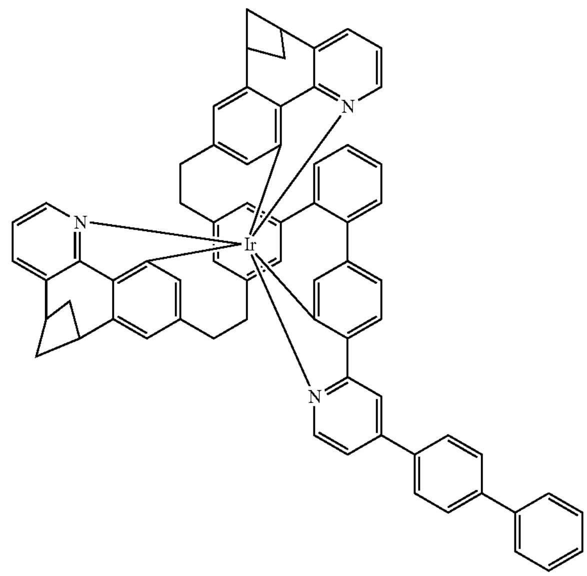
262
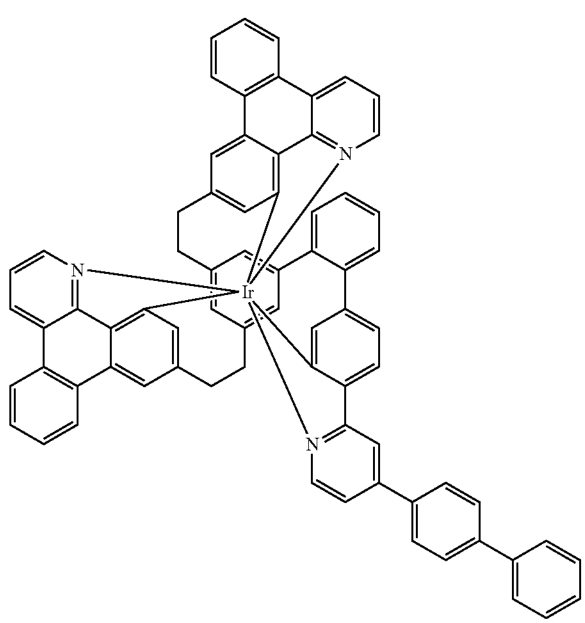
263
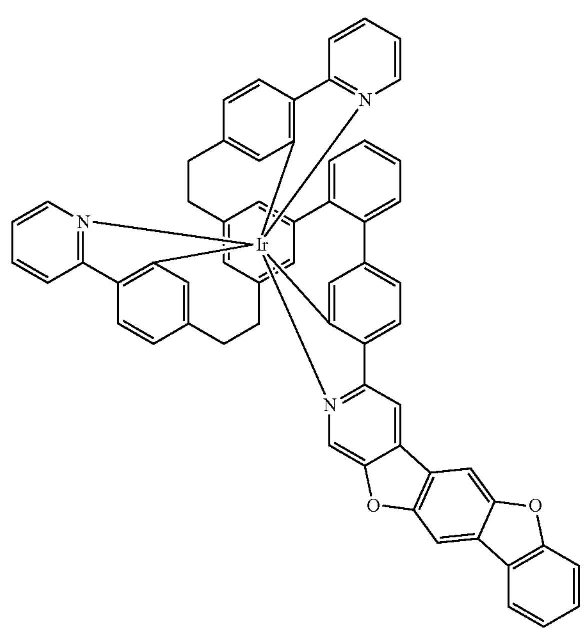

-continued
264
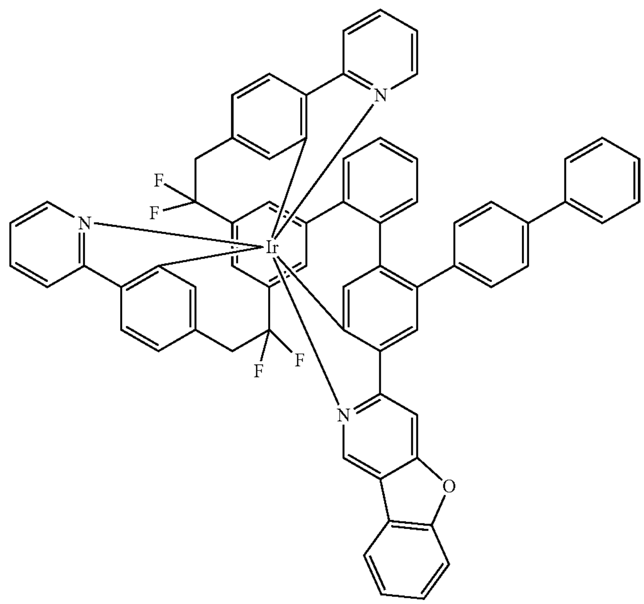
265
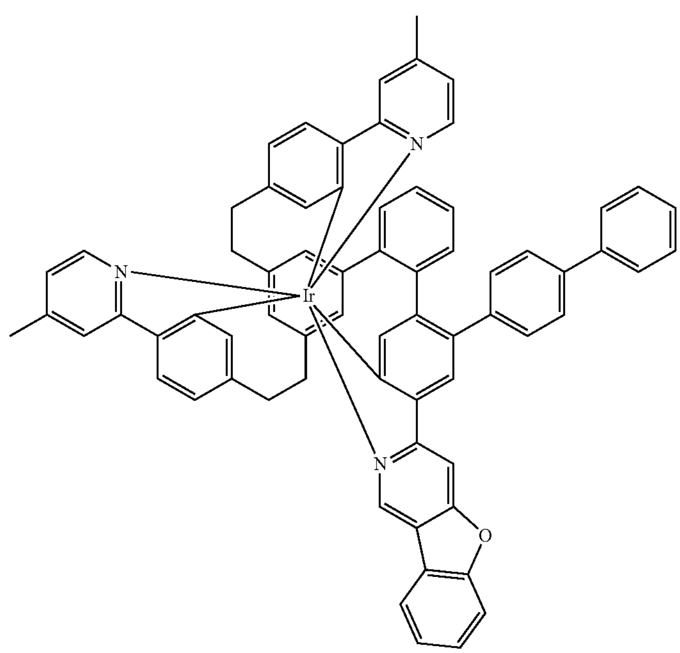

-continued
266
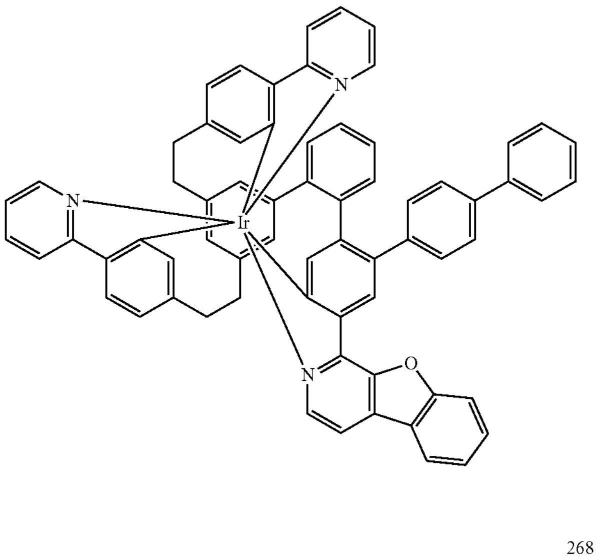
267
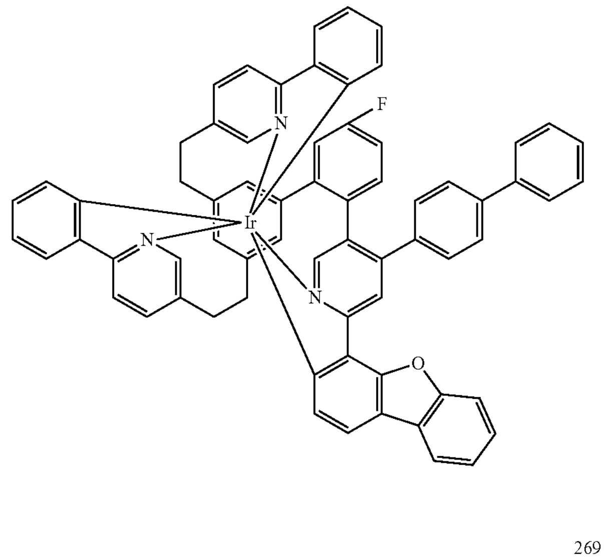
268
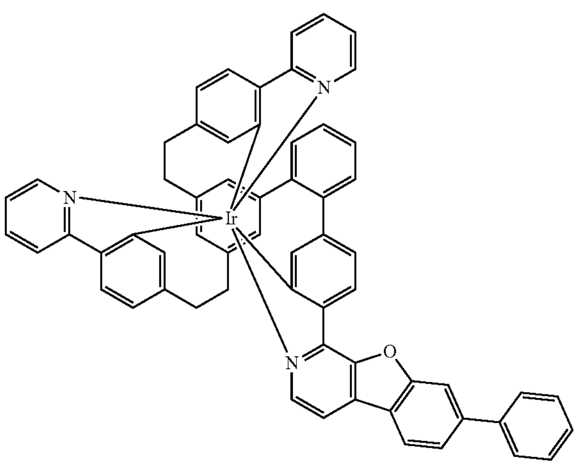
269
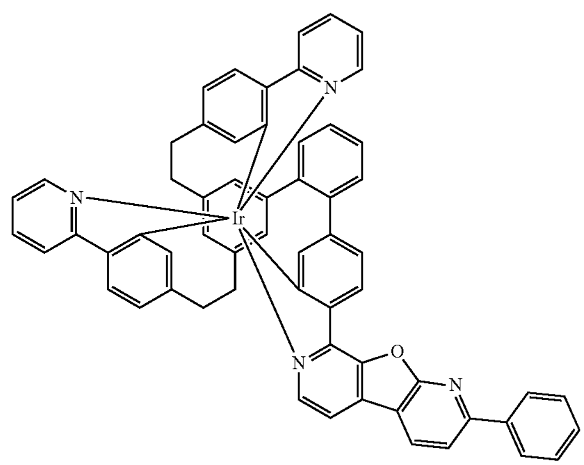
270
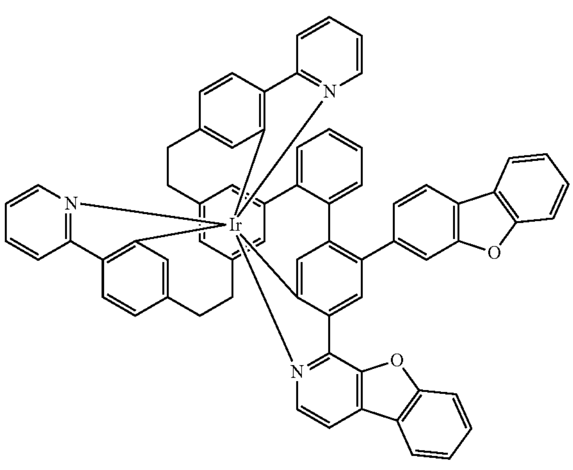
271
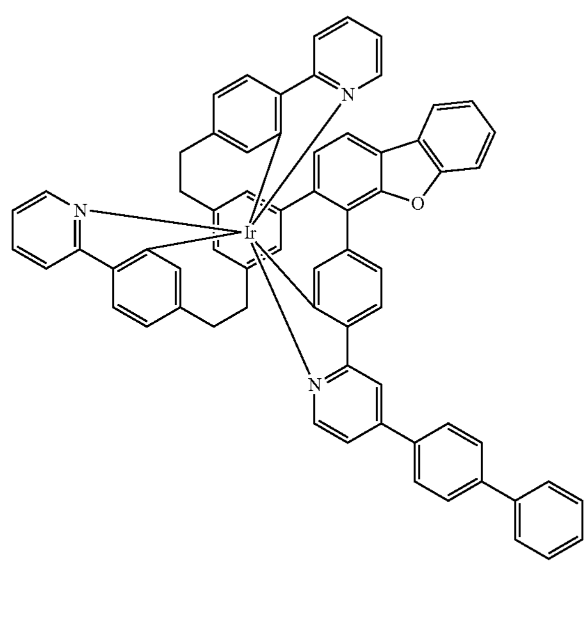

-continued
272
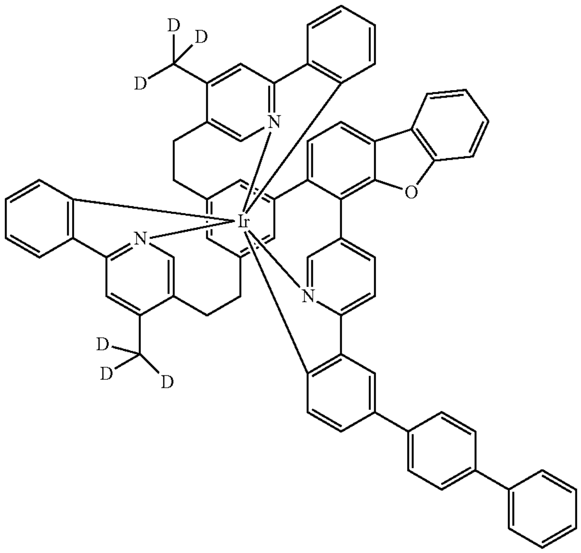
273
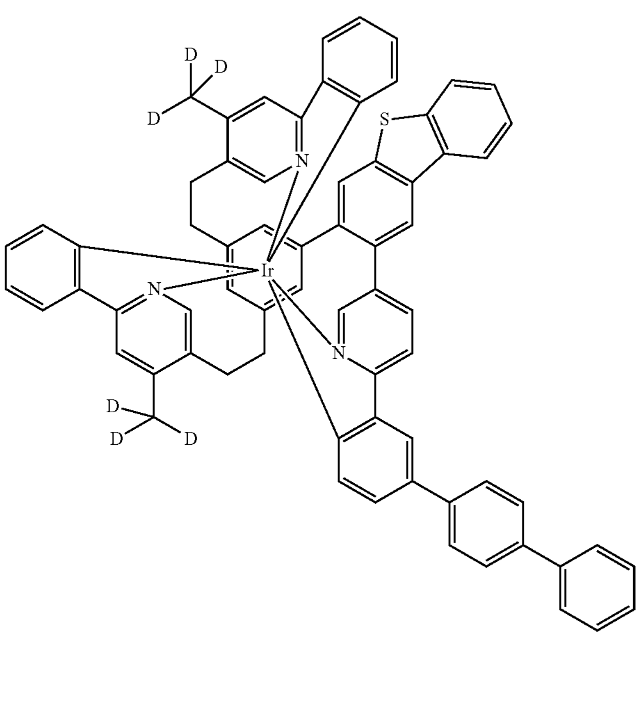

-continued
274
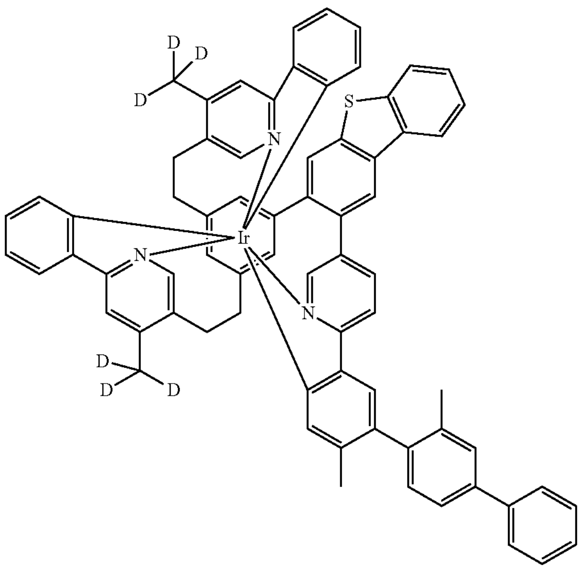
275
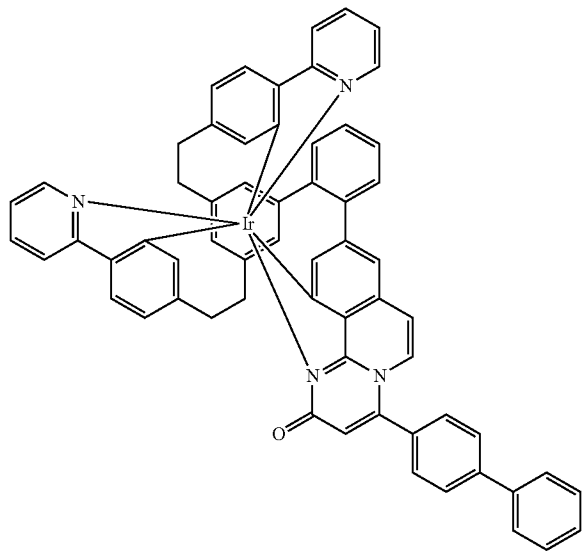
276
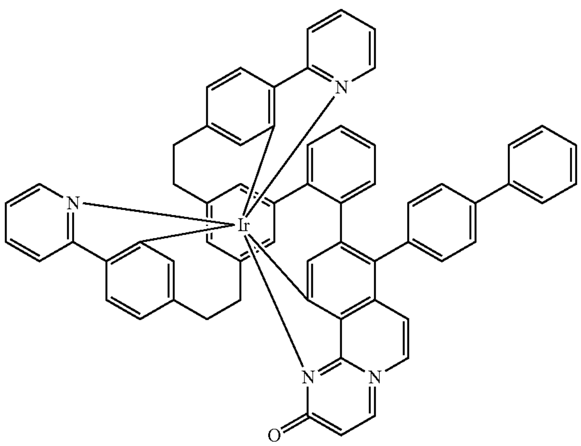
277
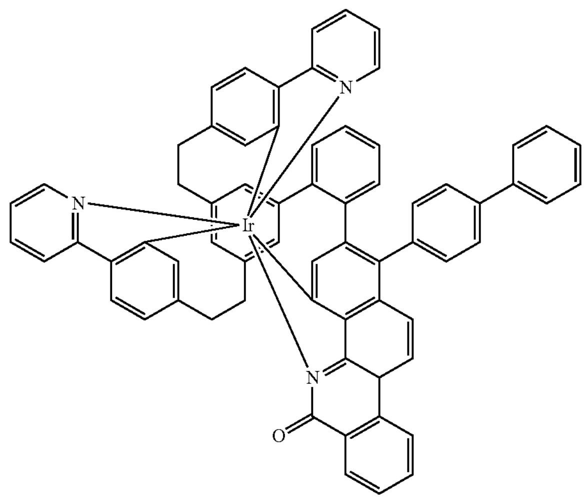
278
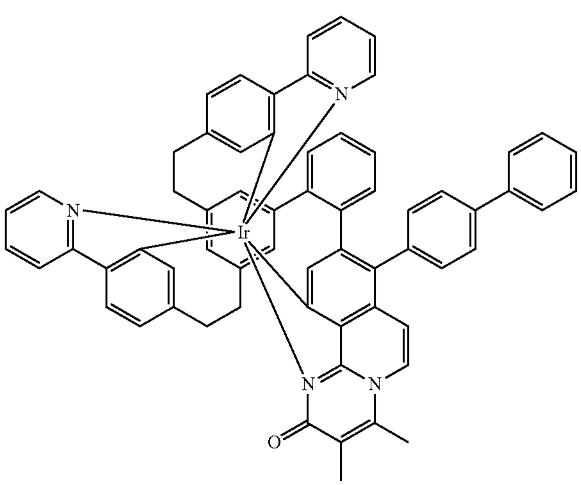
279
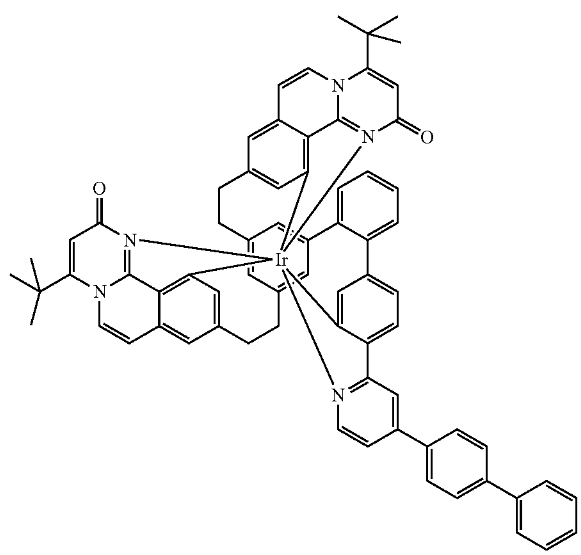

-continued
280
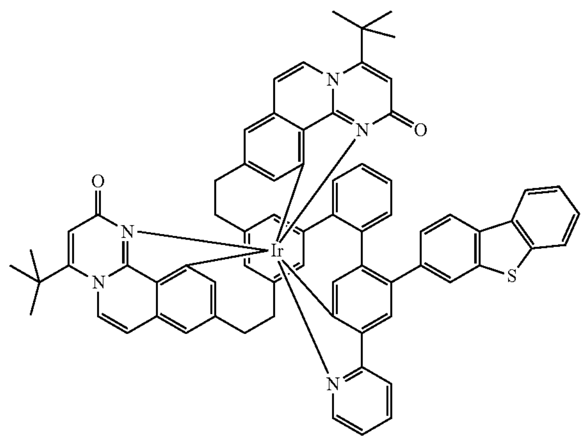
281
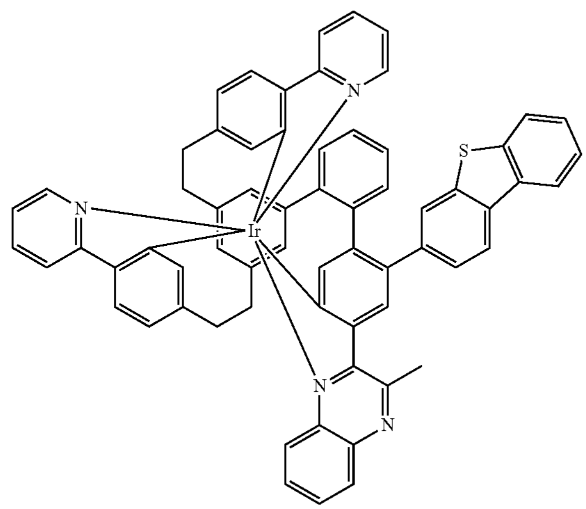
282
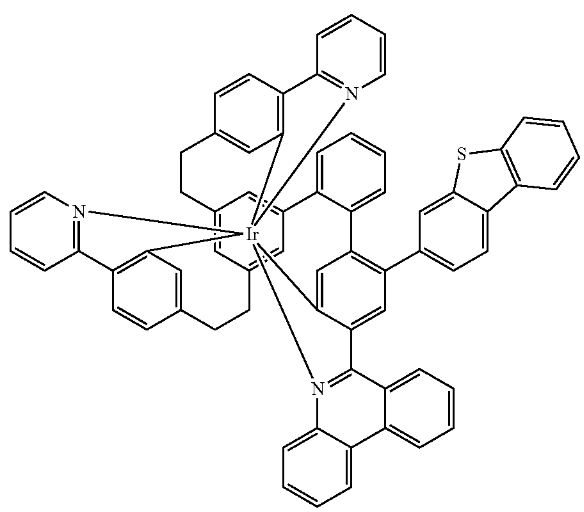
283
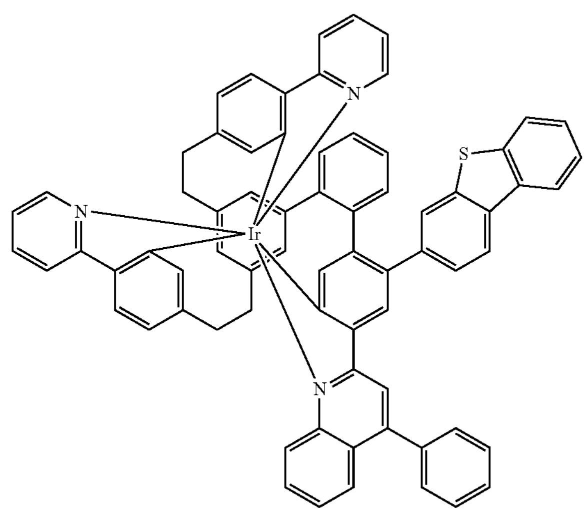
284
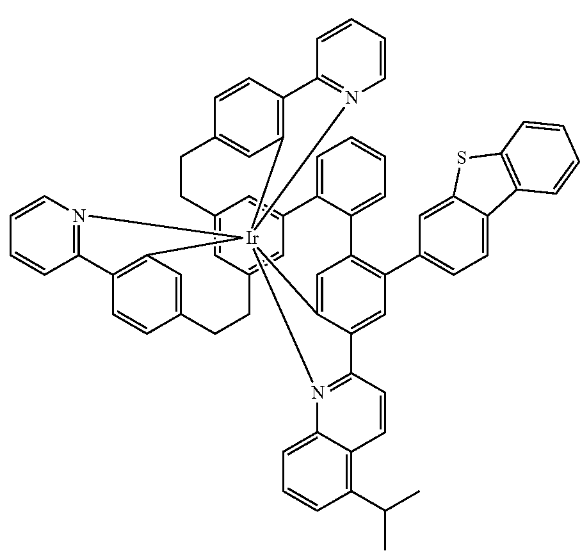
285
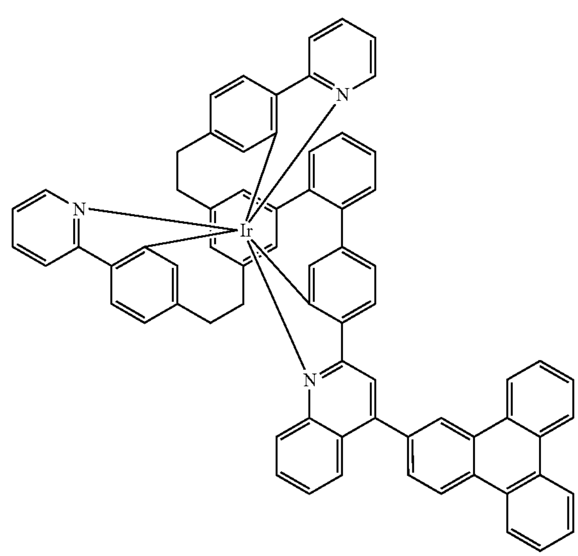

-continued
286
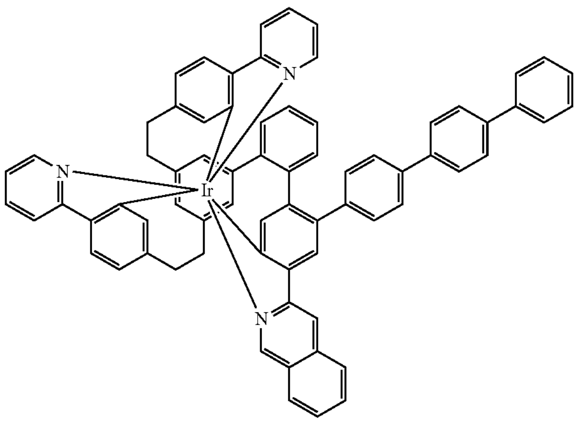
287
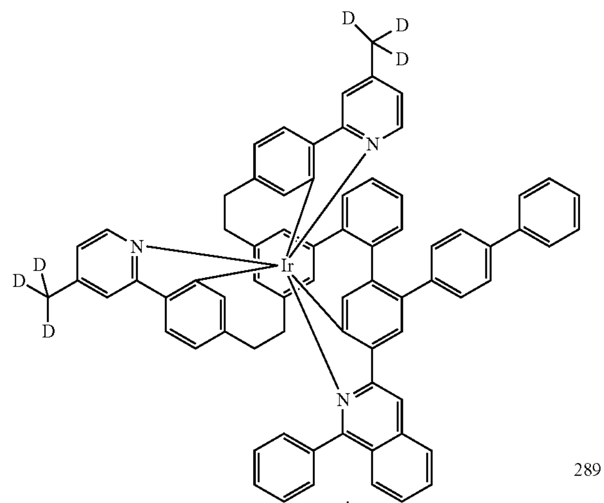
288
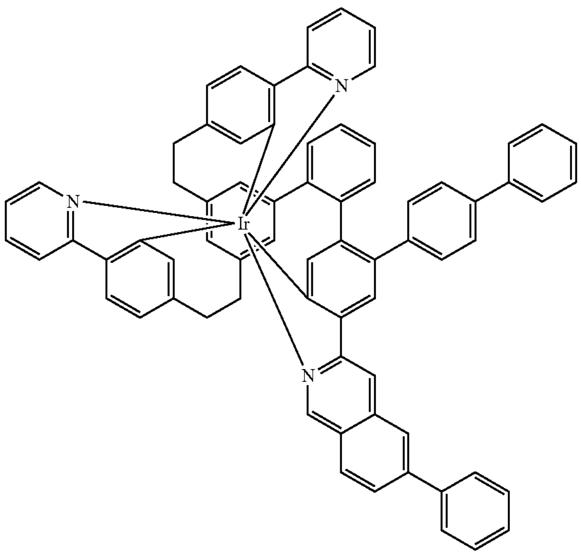
289
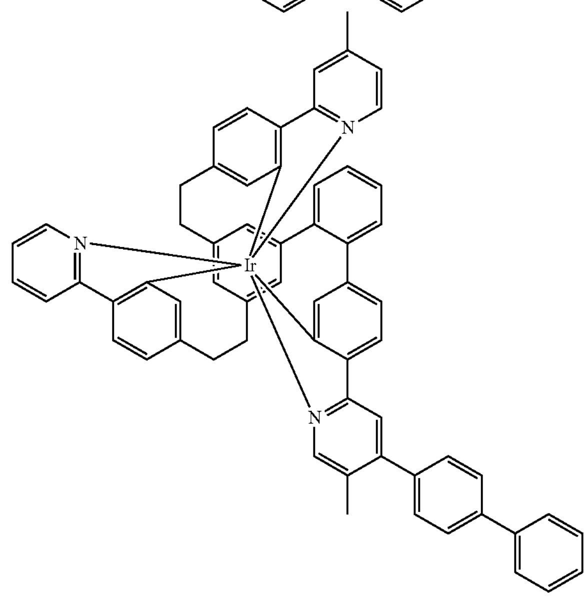
290
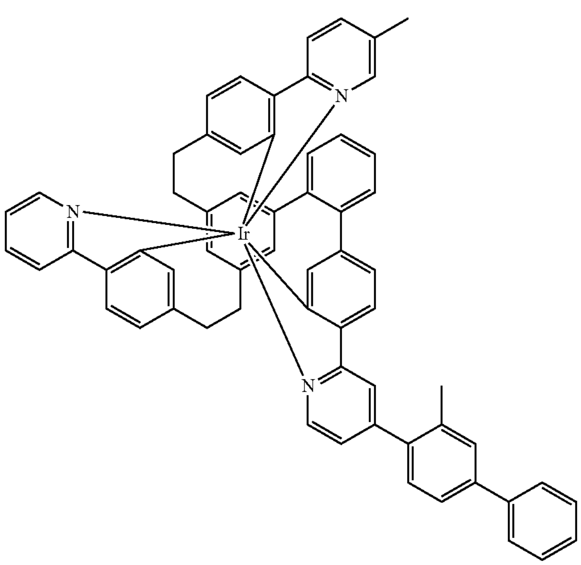
291
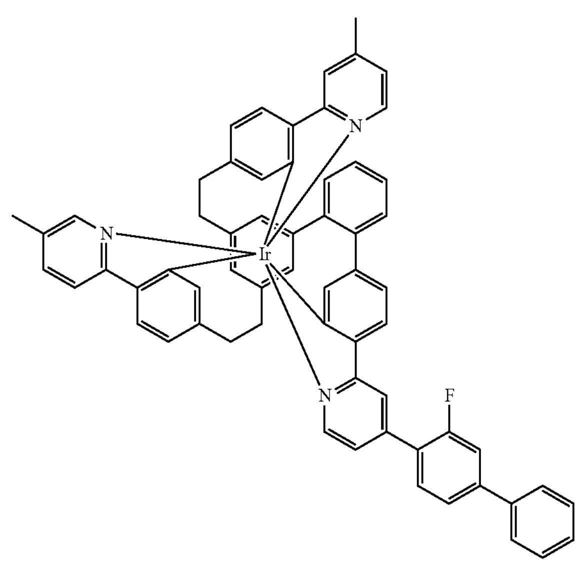

-continued
292
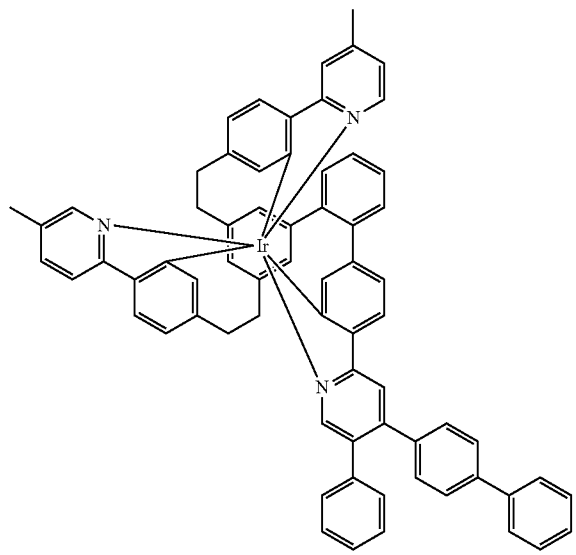
293
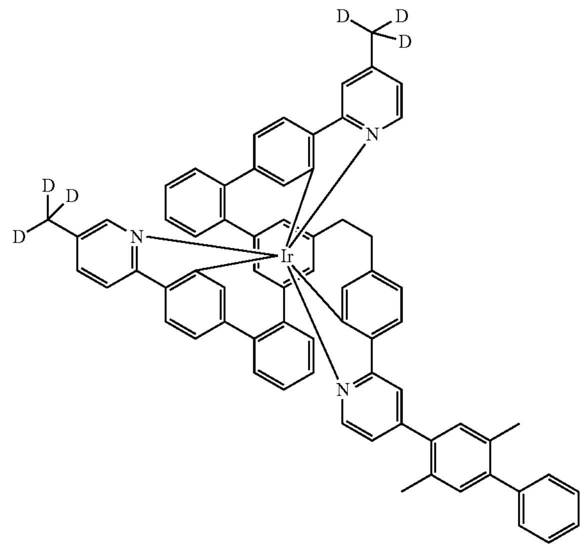
294
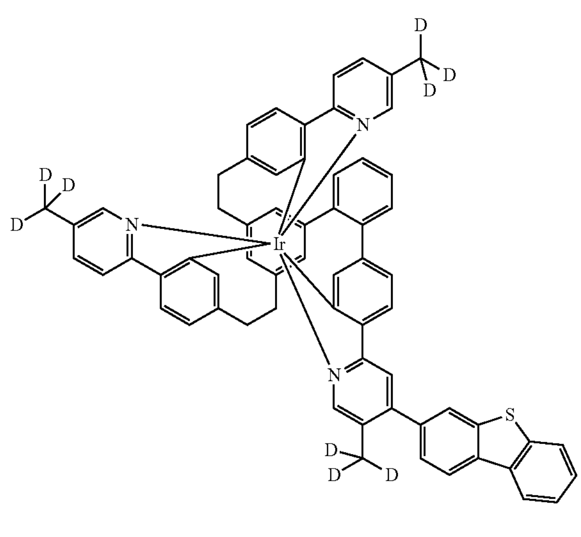
295
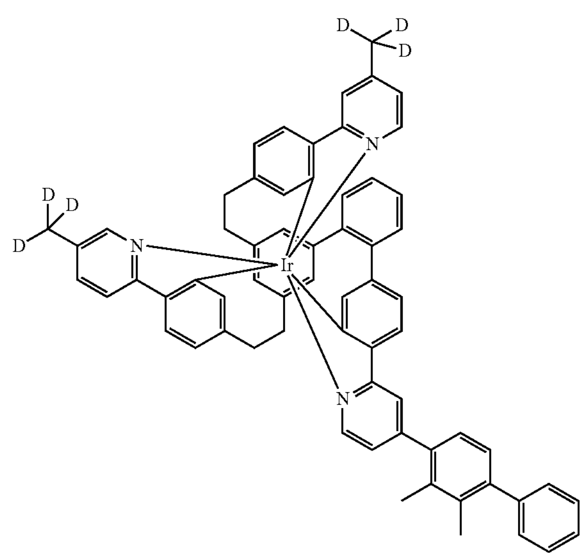

-continued
296
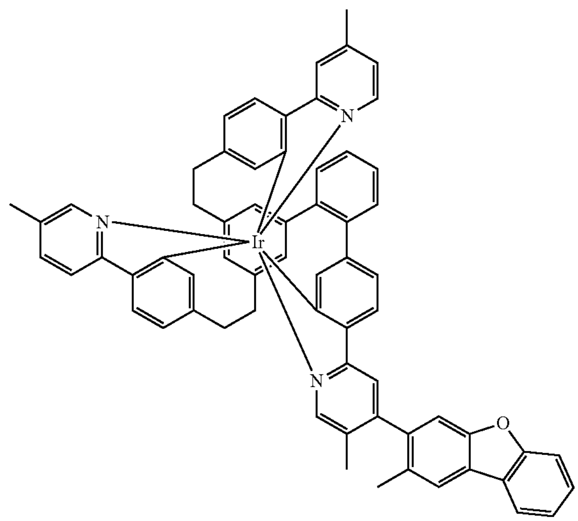
297
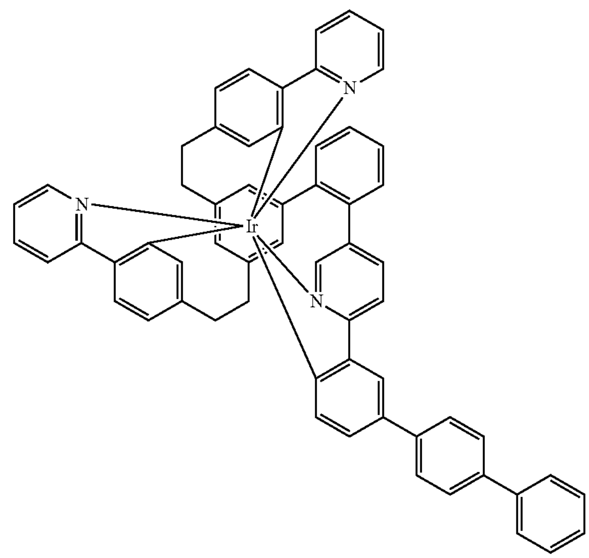
298
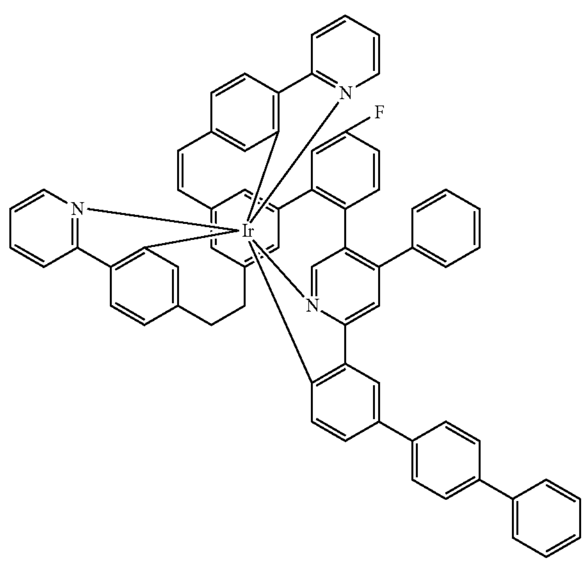
299
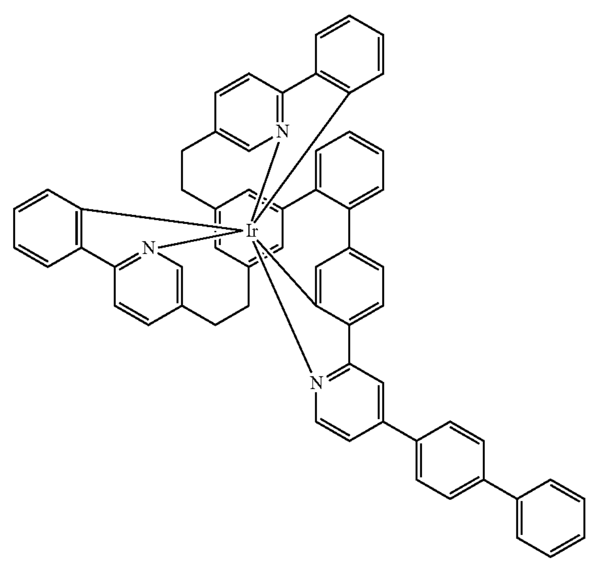
300
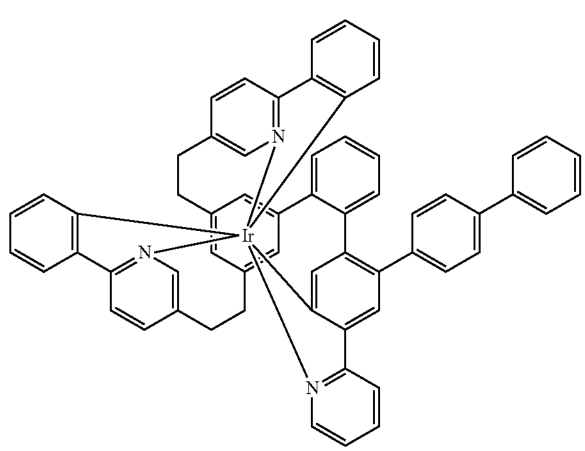
301
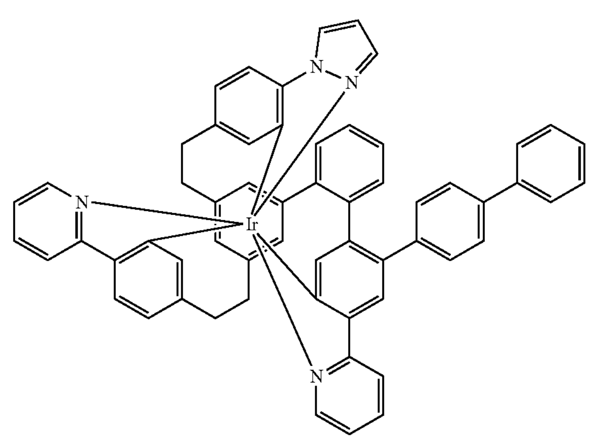

-continued
302
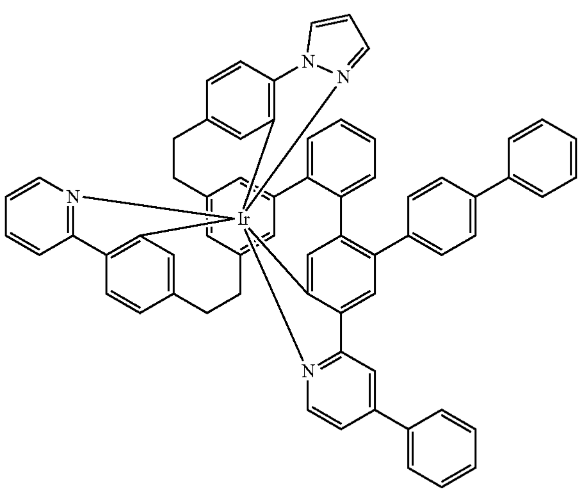
303
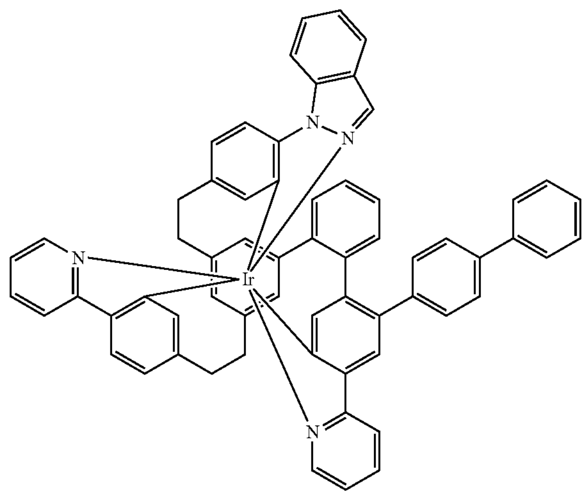
304
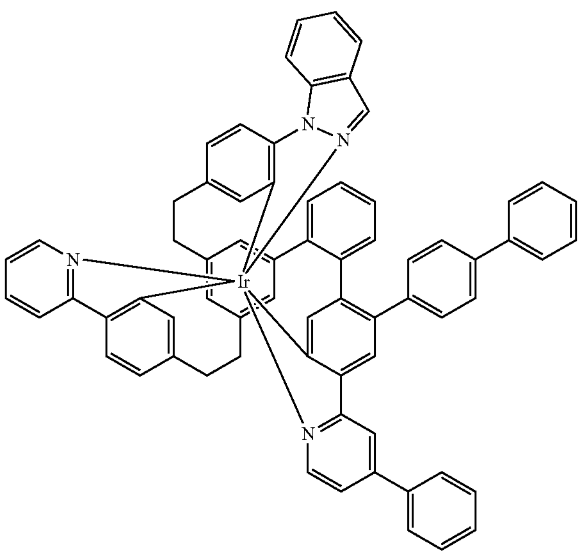
305
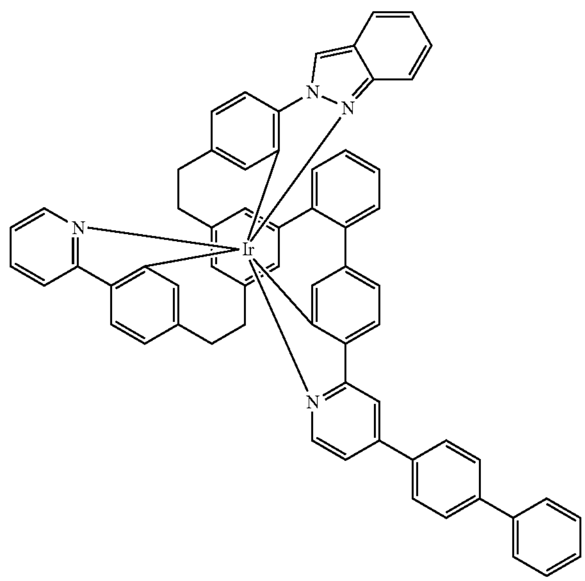
306
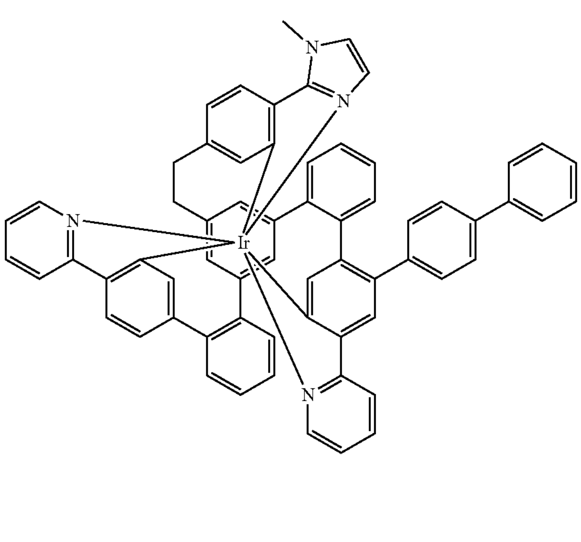
307
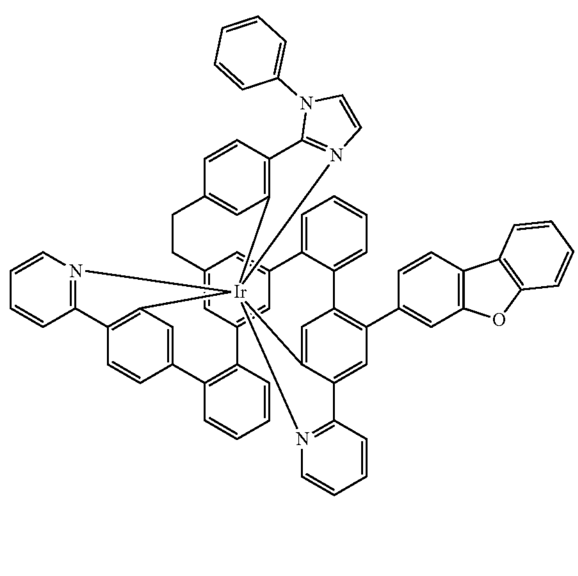

-continued
308
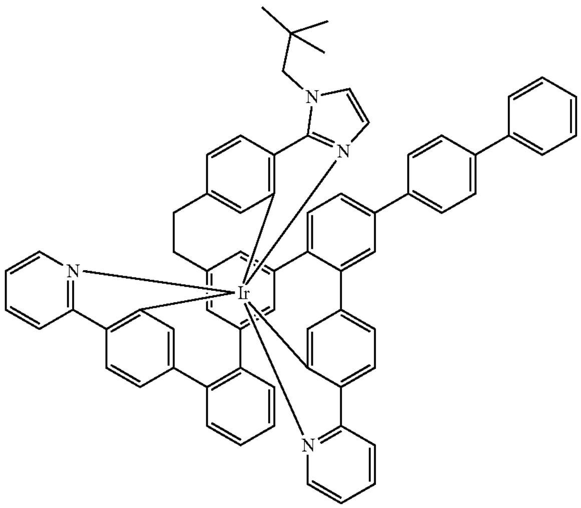
309
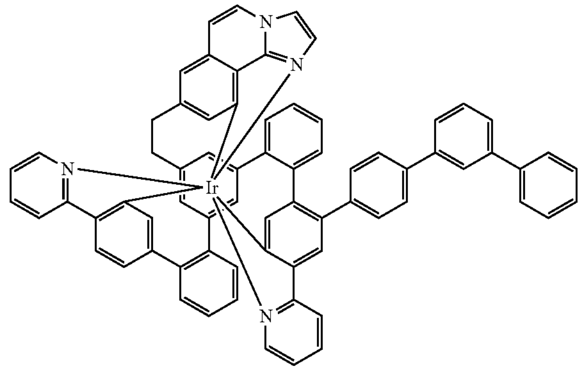
310
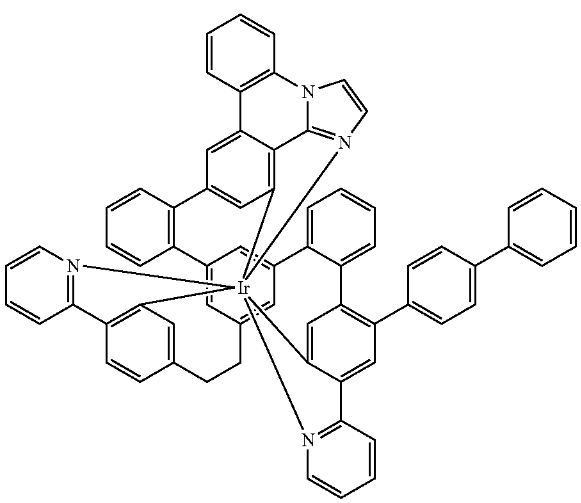
311
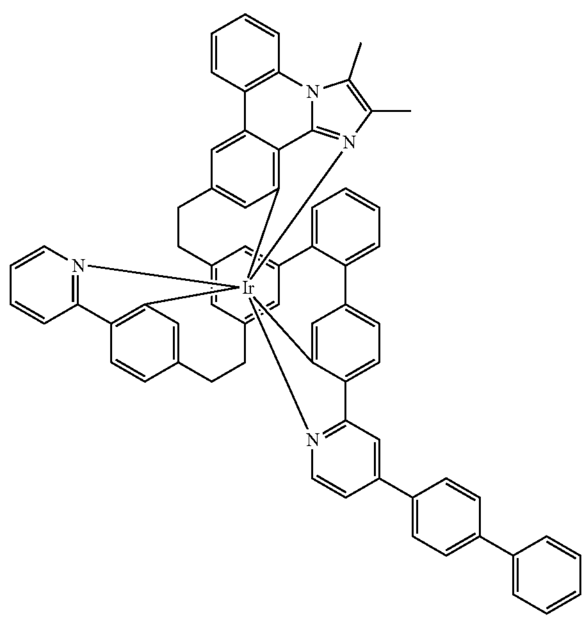

-continued
312
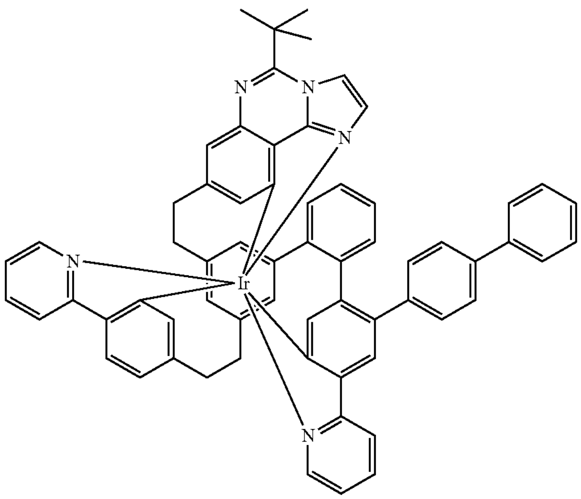
313
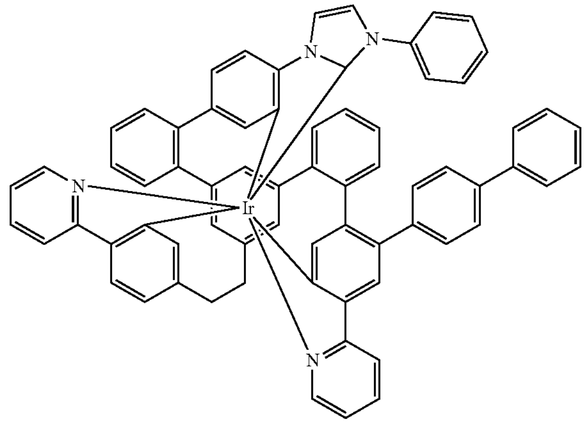
314
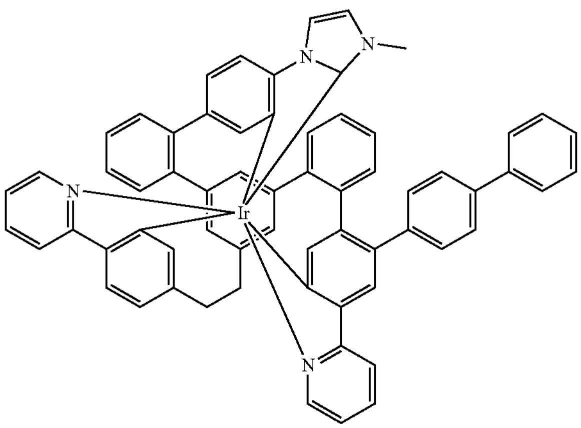
315
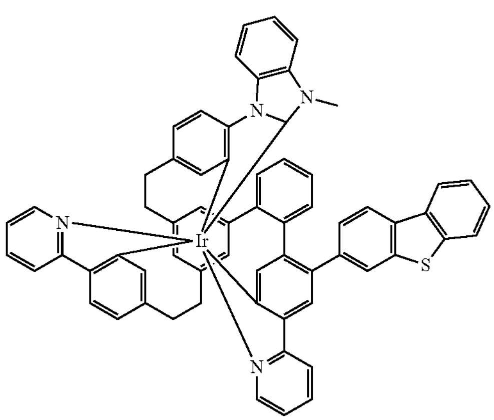
-continued
316
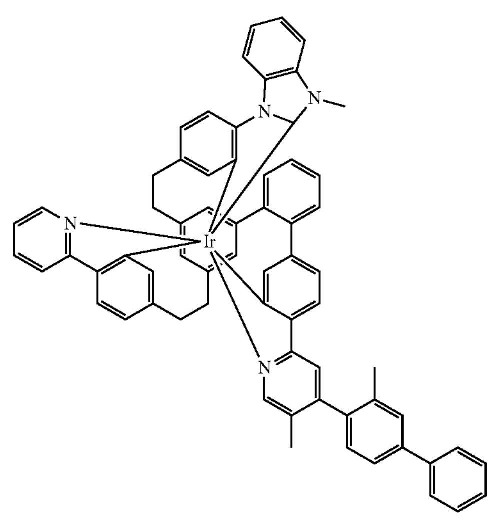

317
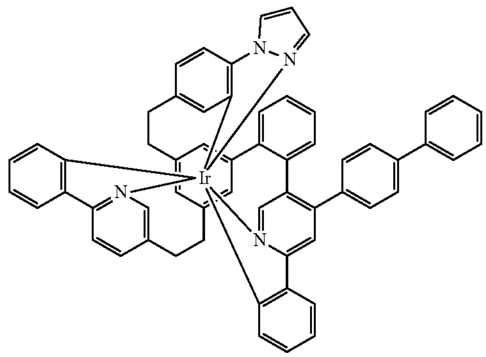
318
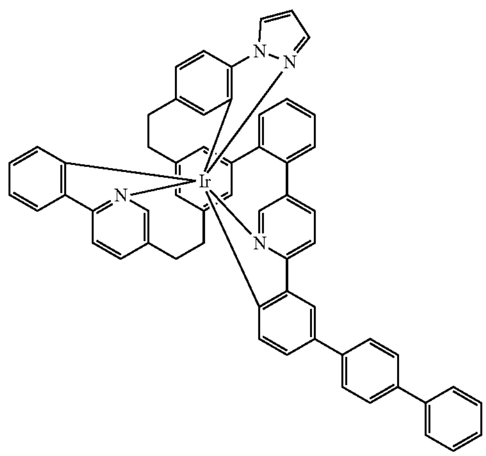
319
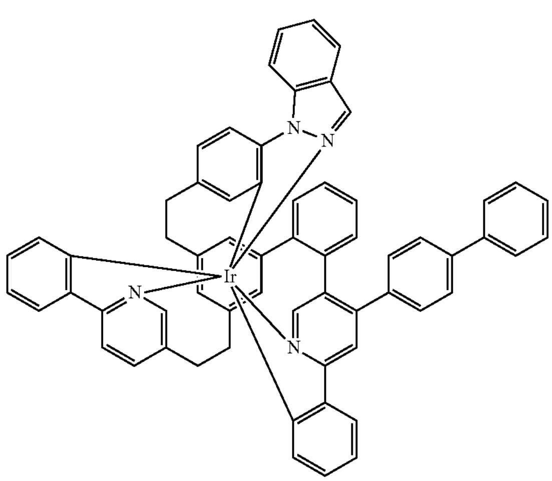
320
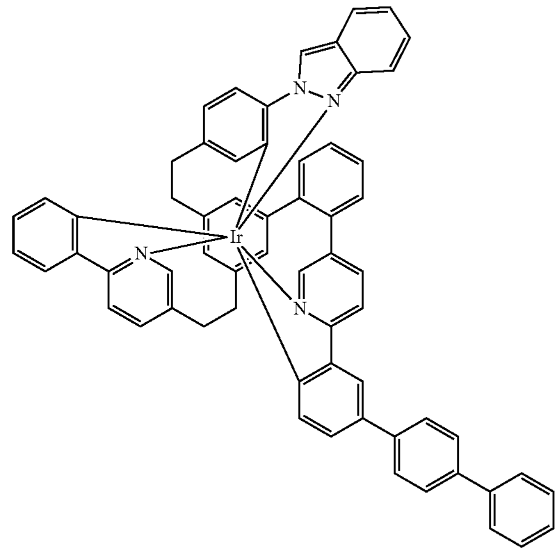
321
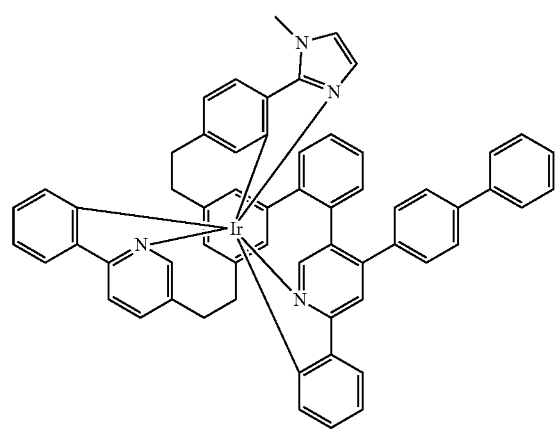
322
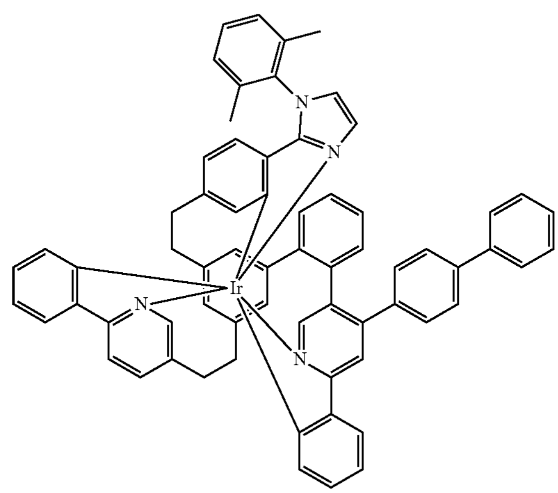

323
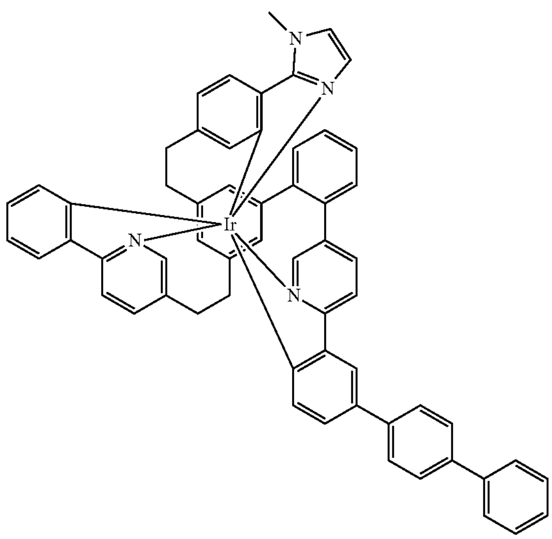
324
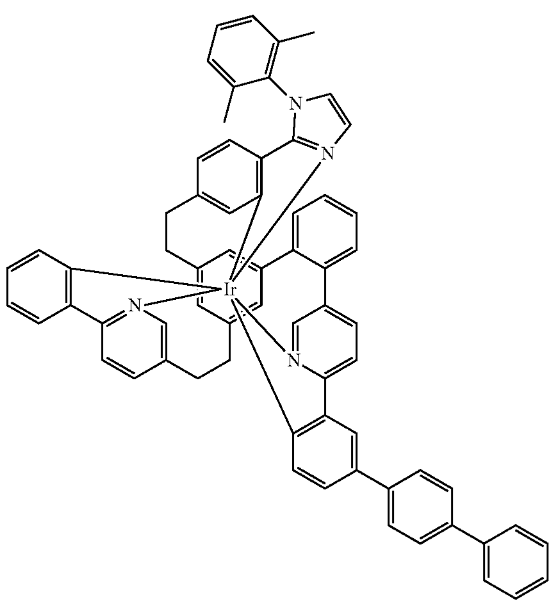
325
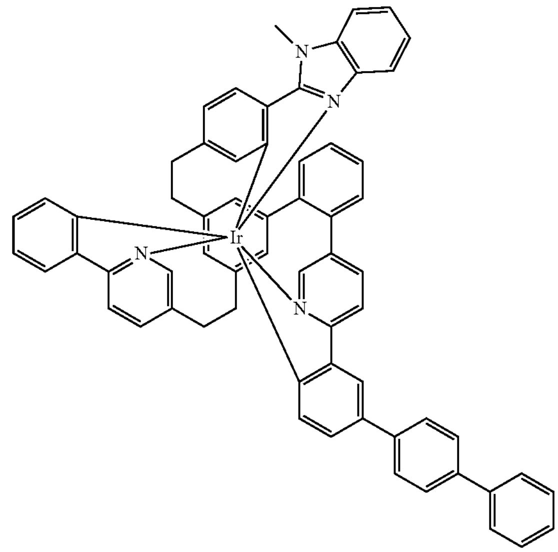
326
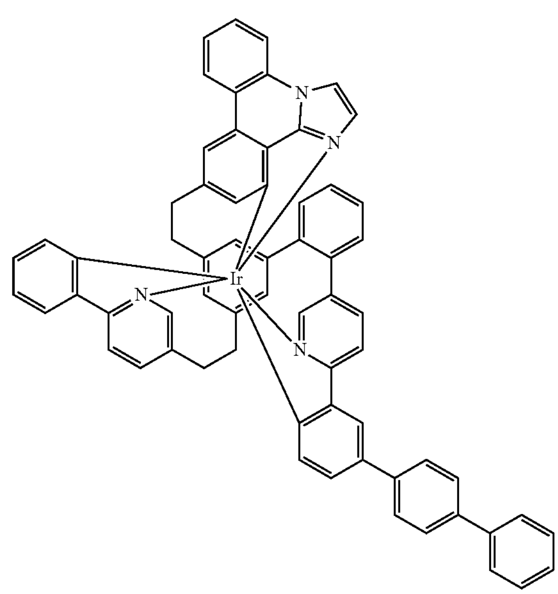

327
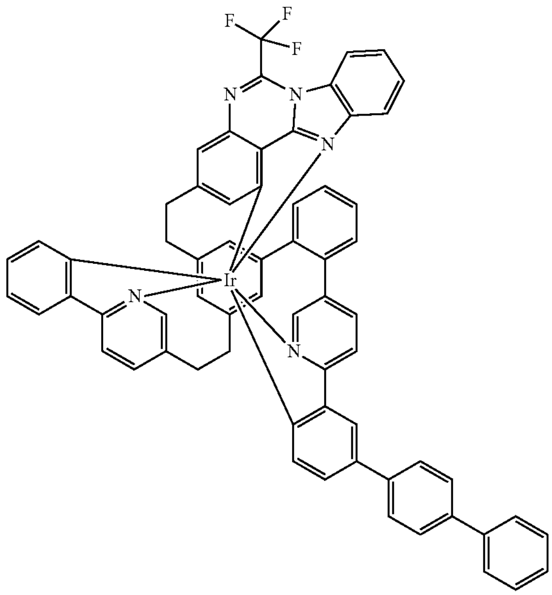
328
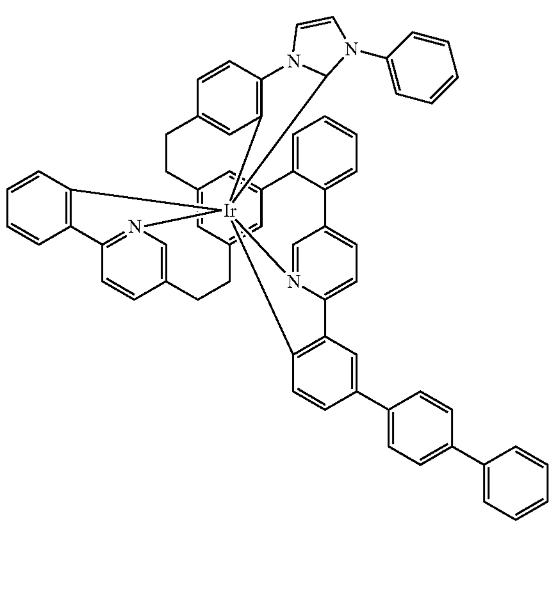
329
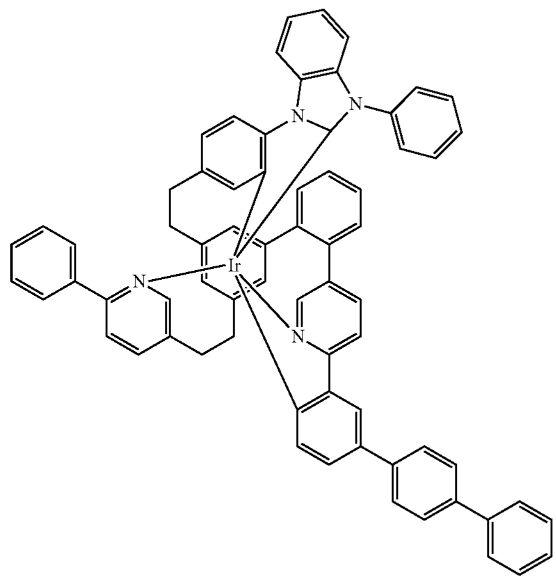
330
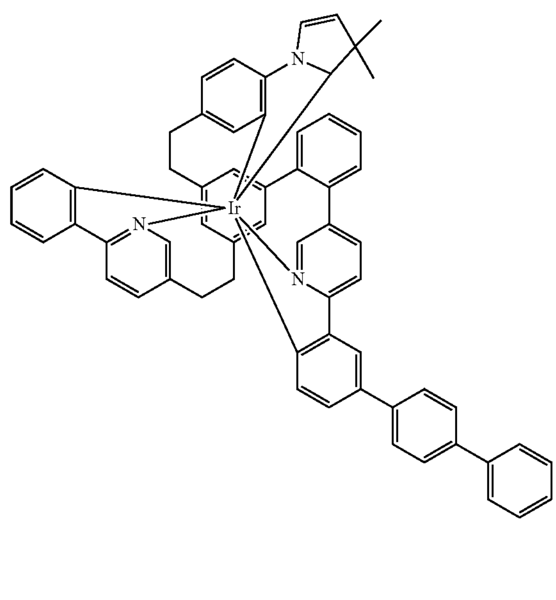

-continued
331
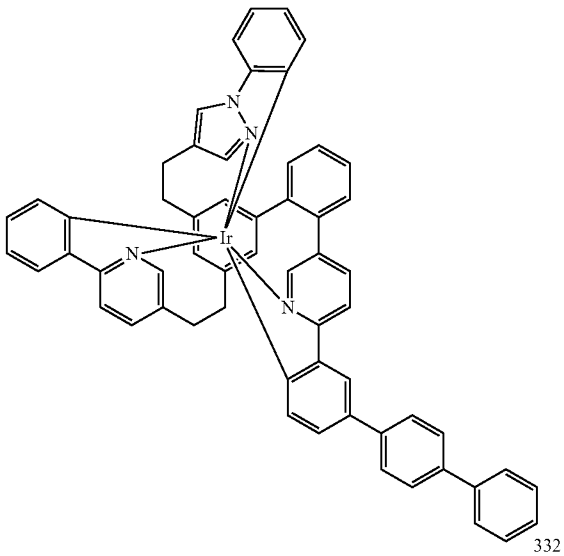
332
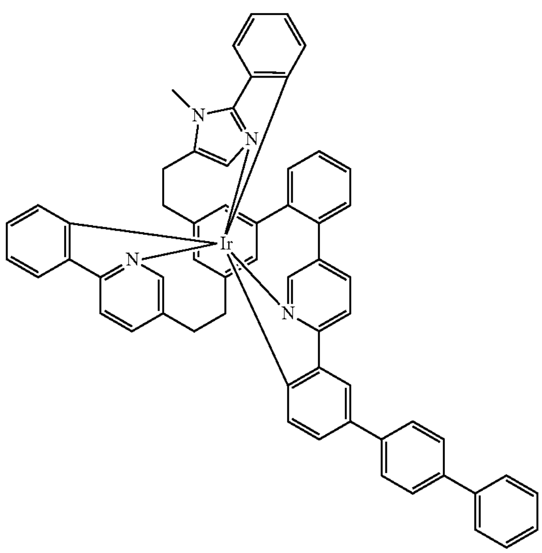
333
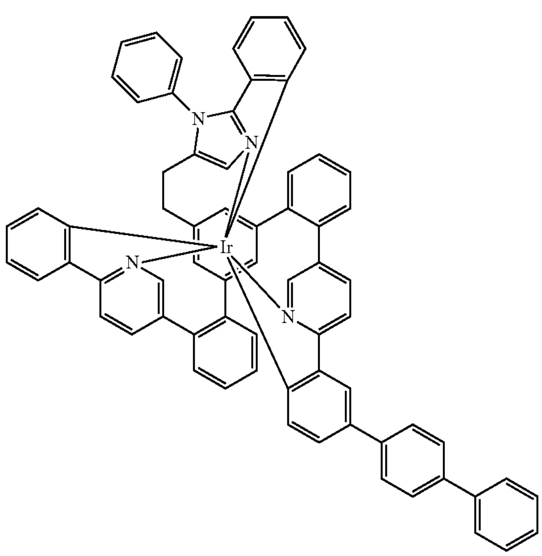
-continued
334
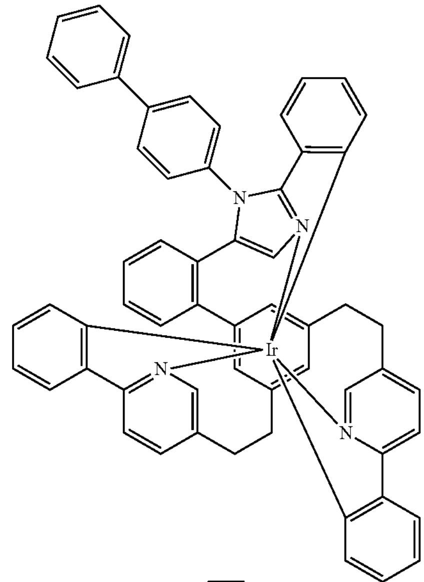
335
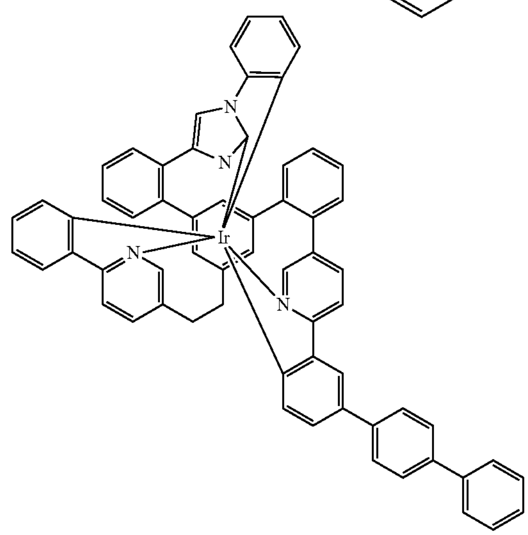
336
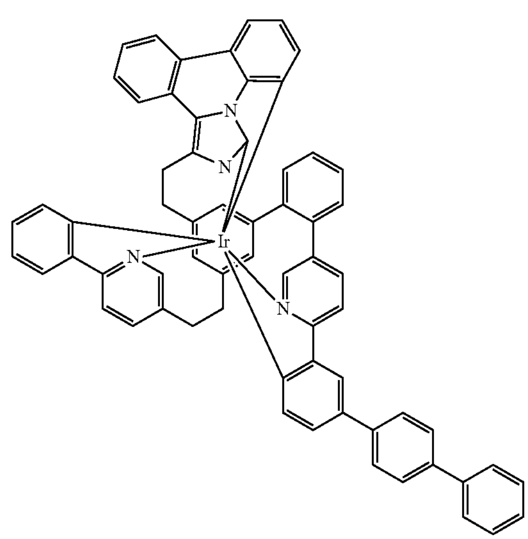

-continued
337
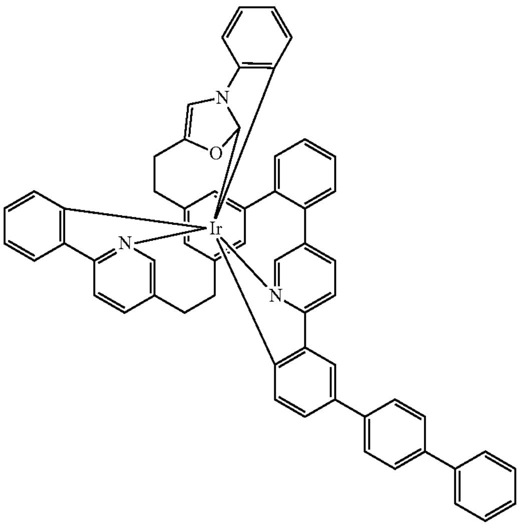
338
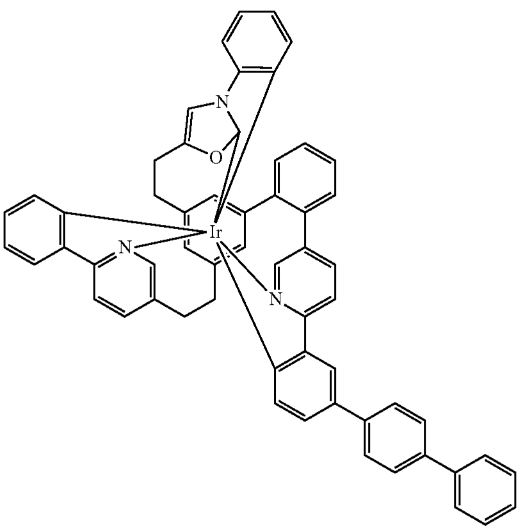
339
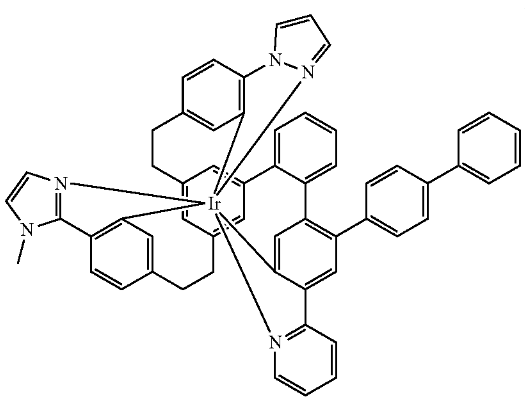
-continued
340
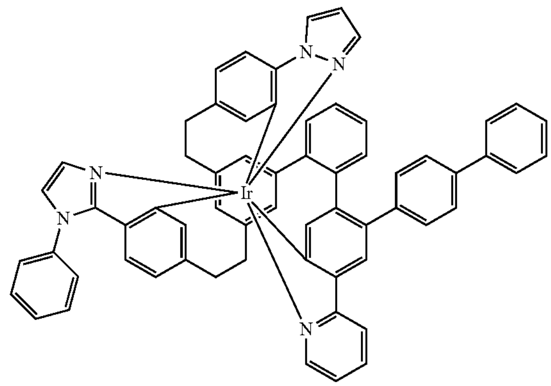
341
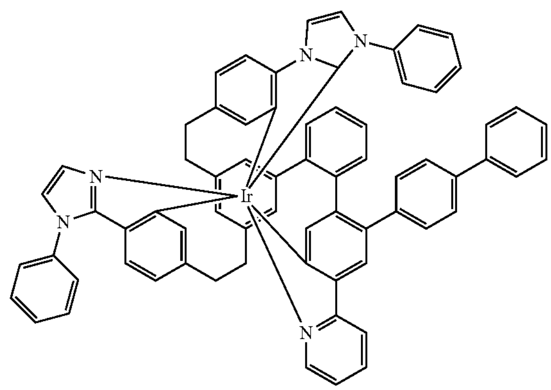
342
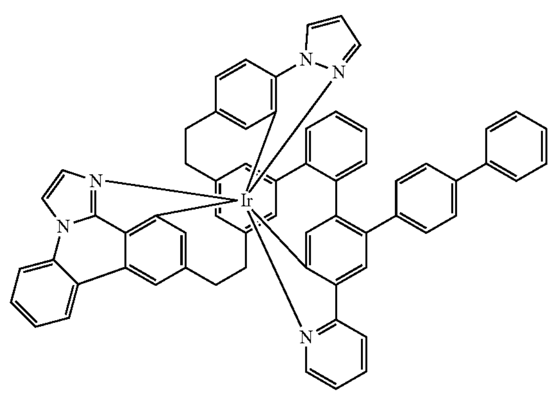
343
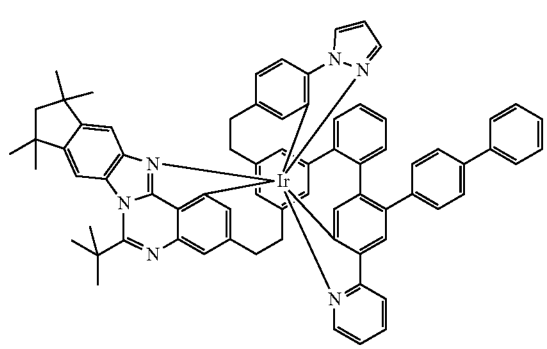

344
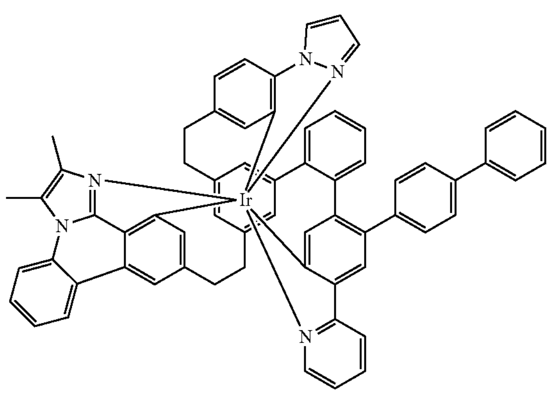
345
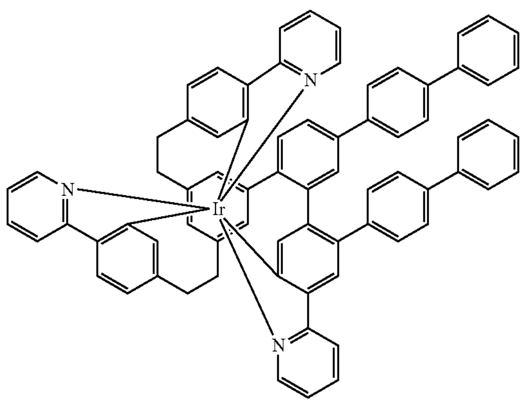
346
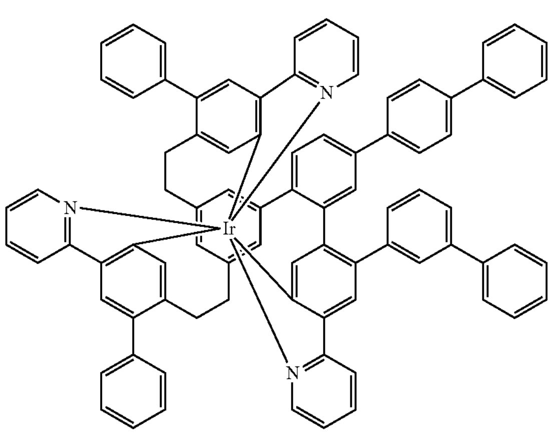
347
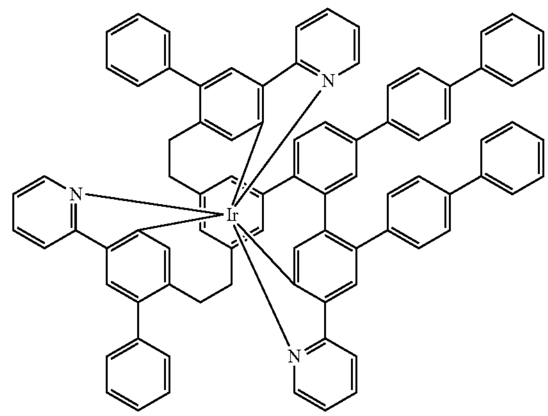
348
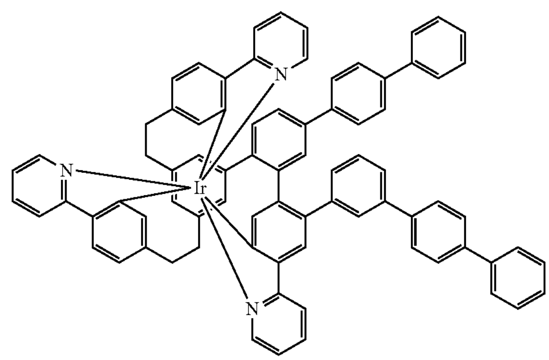
349
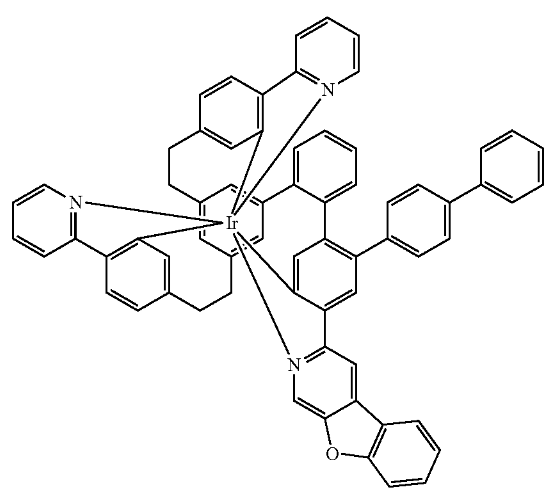

-continued
350
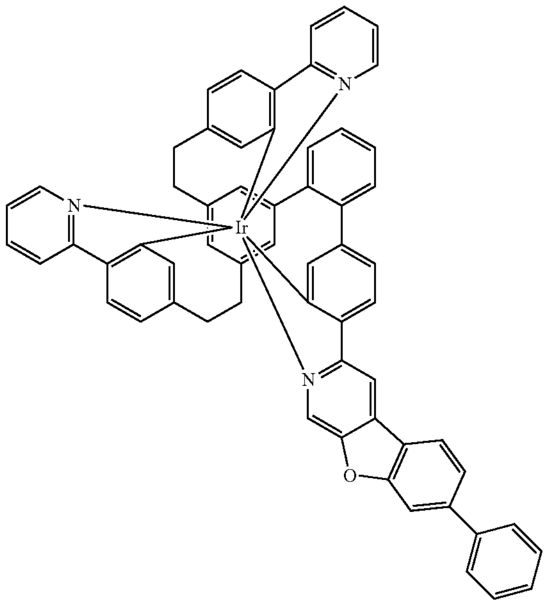
351
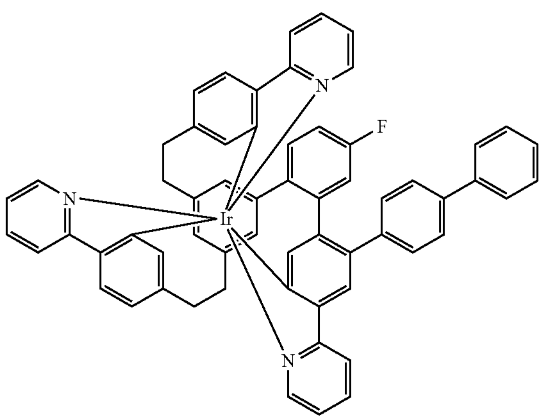
352
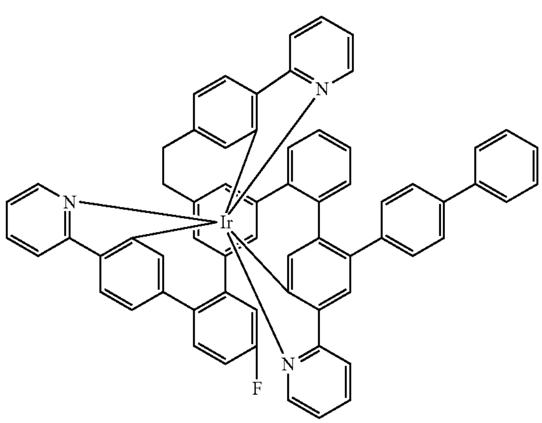
-continued
353
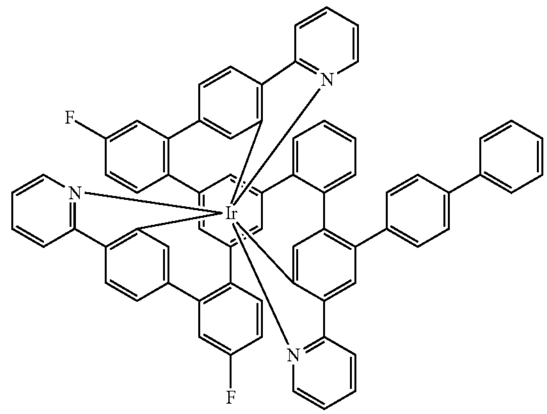
354
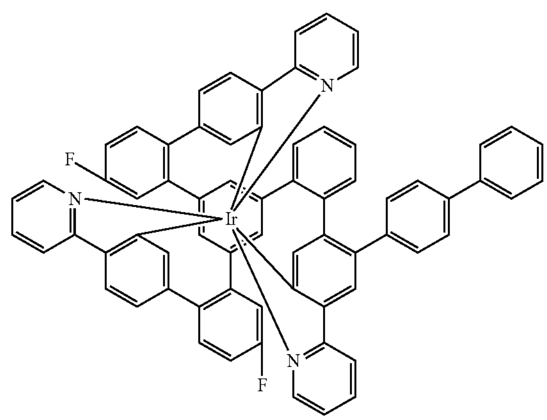
355
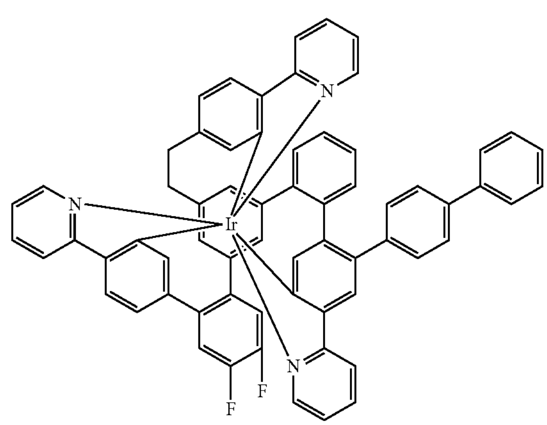

-continued
356
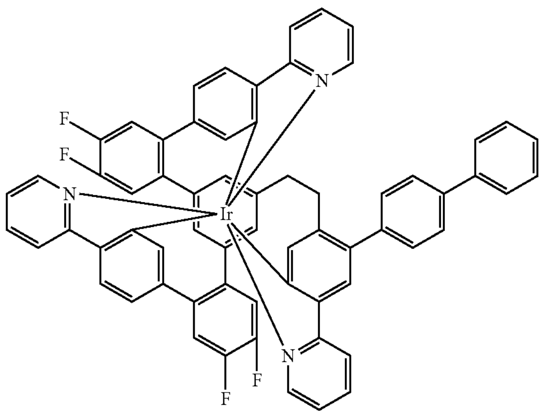
357
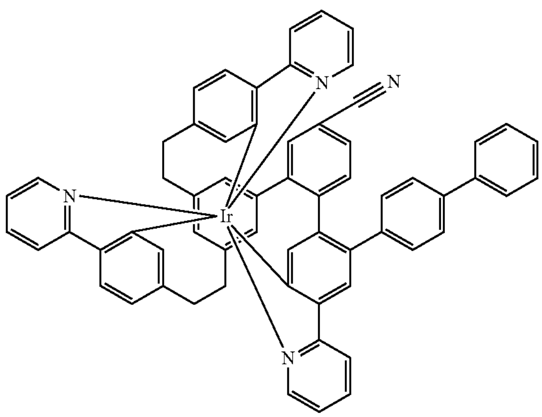
358
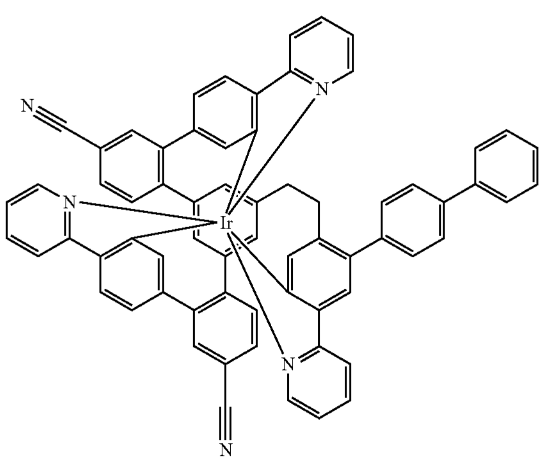
-continued
359
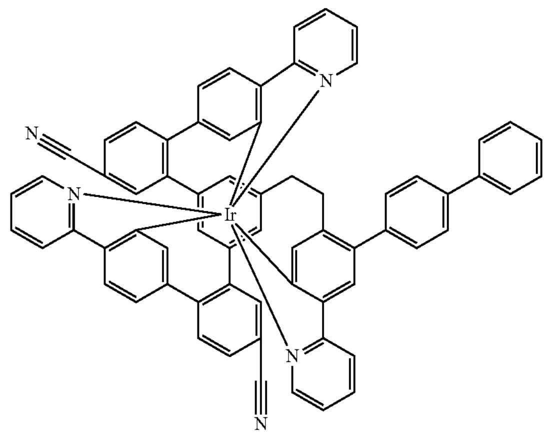
360
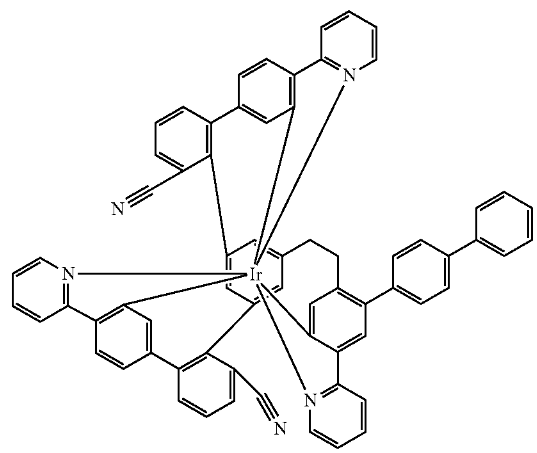
361
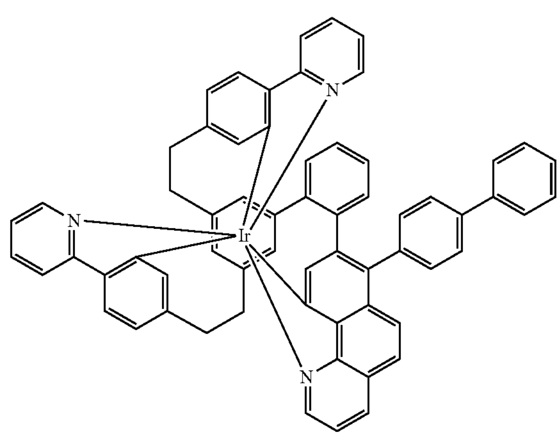

-continued
362
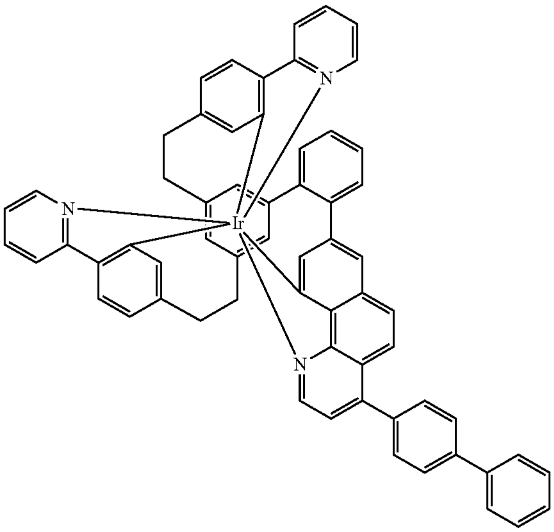
363
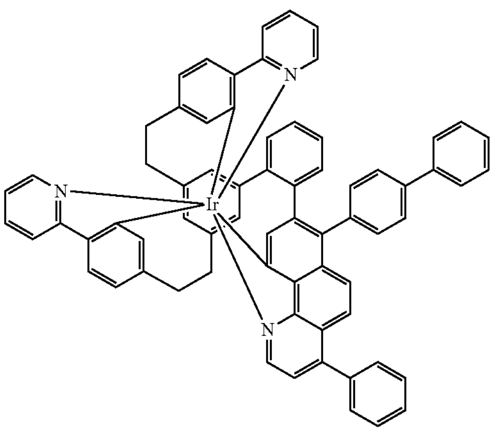
364
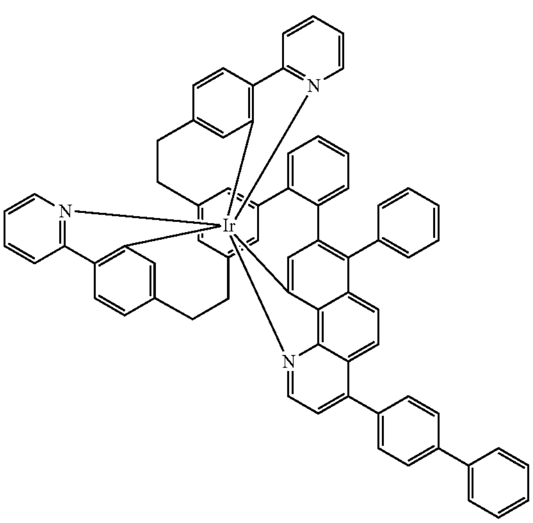
-continued
365
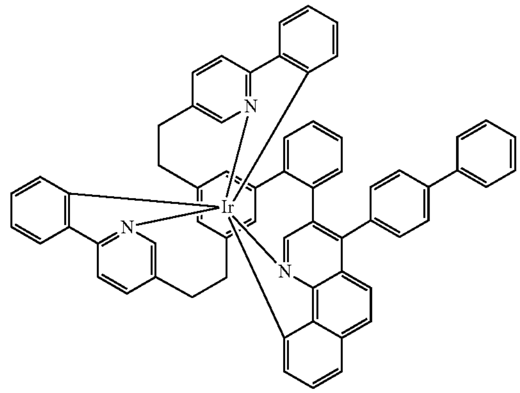
366
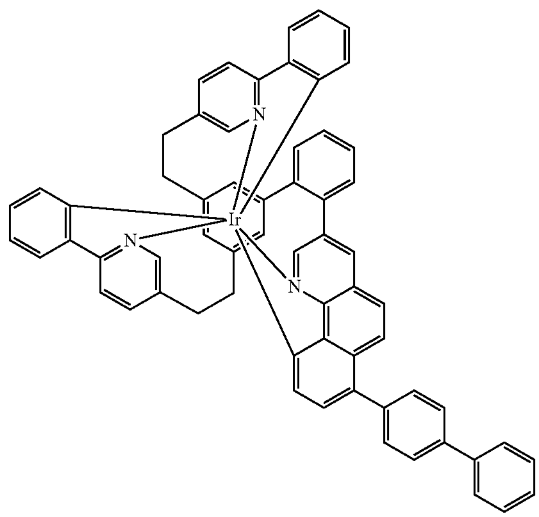
367
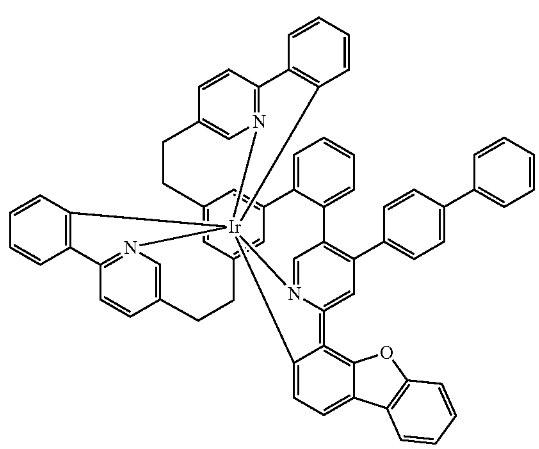

-continued
368
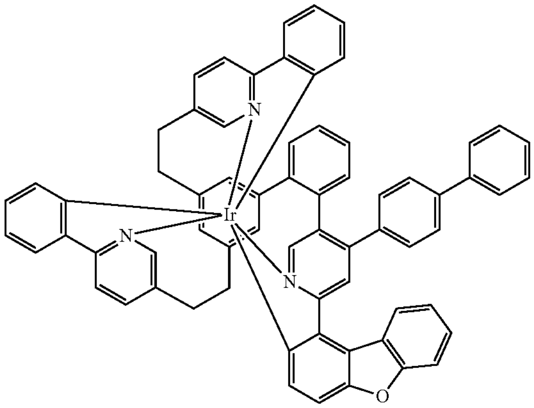
369
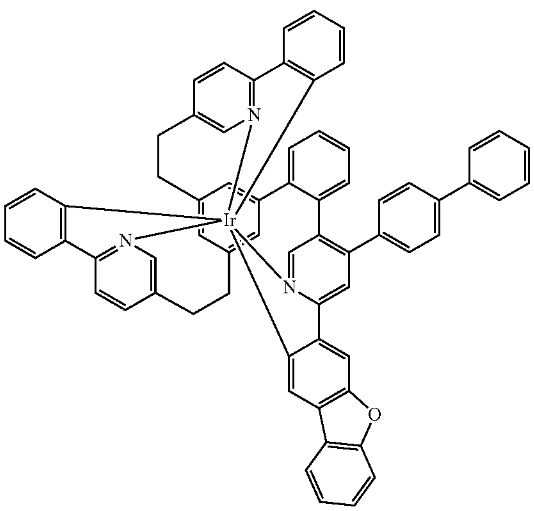
370
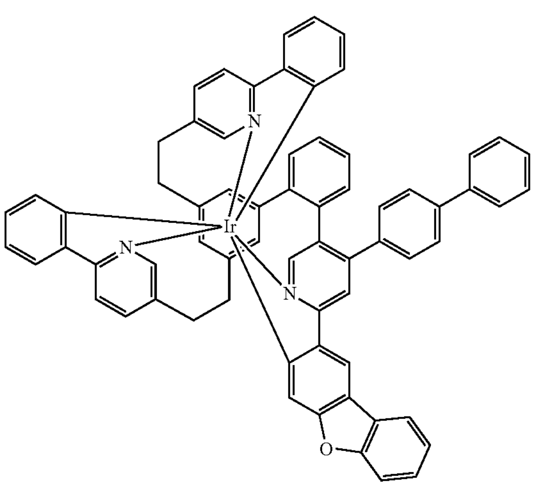
-continued
371
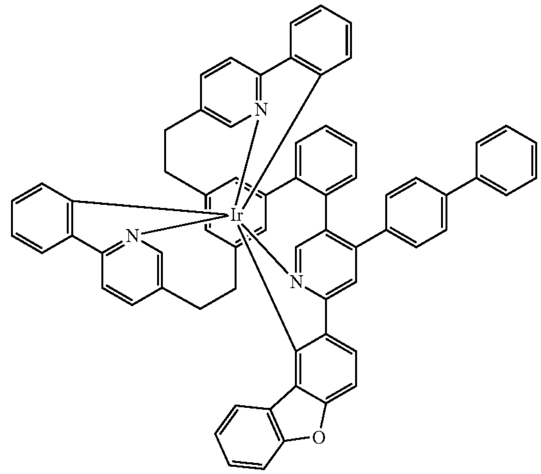
372
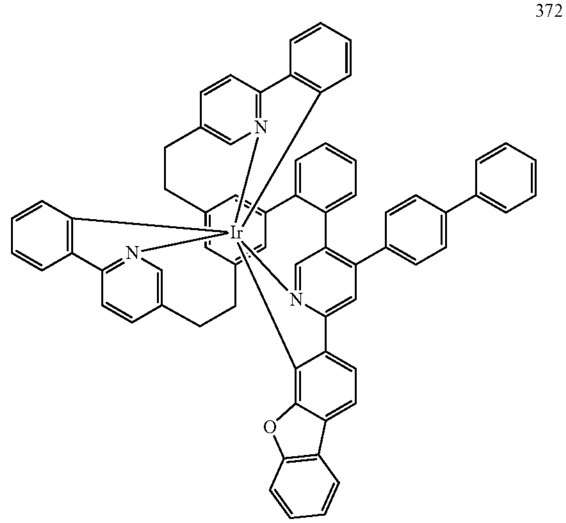
373
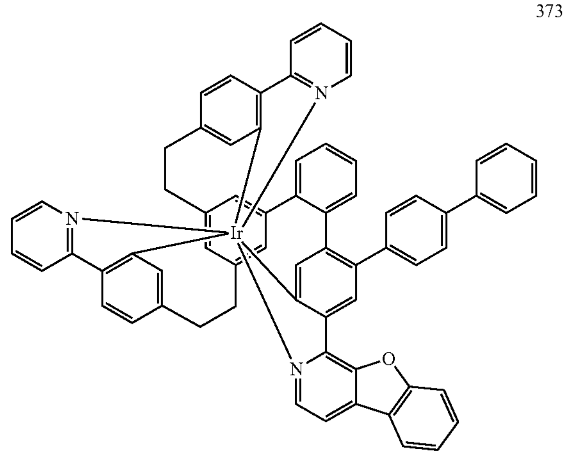

-continued
374
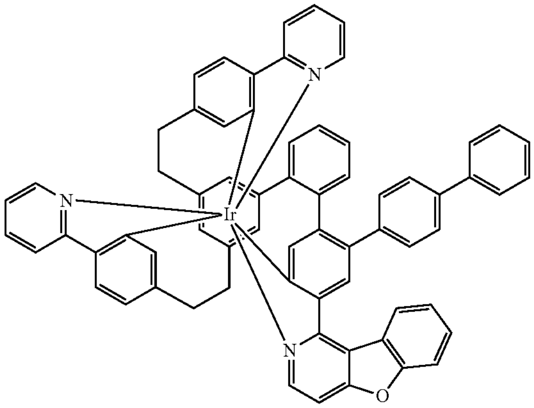
375
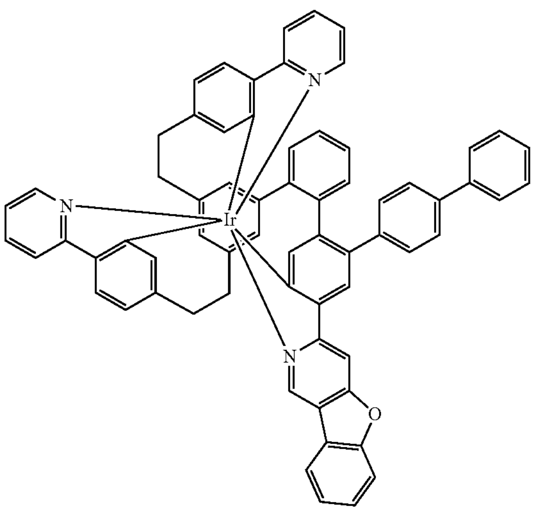
376
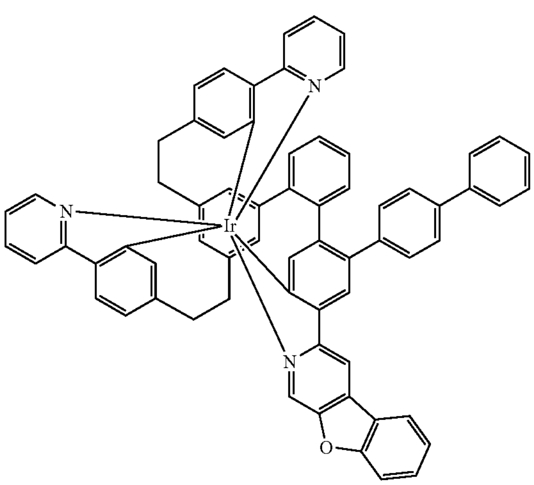
-continued
377
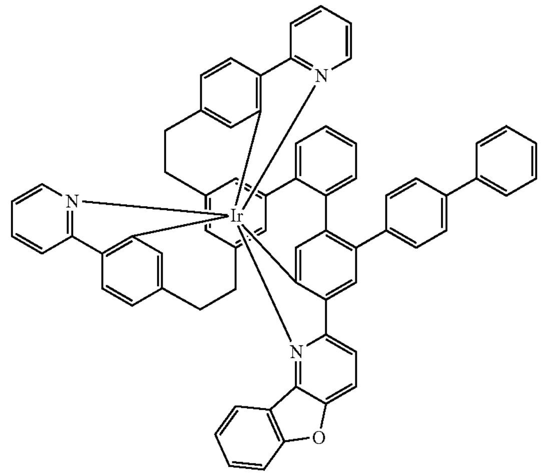
378
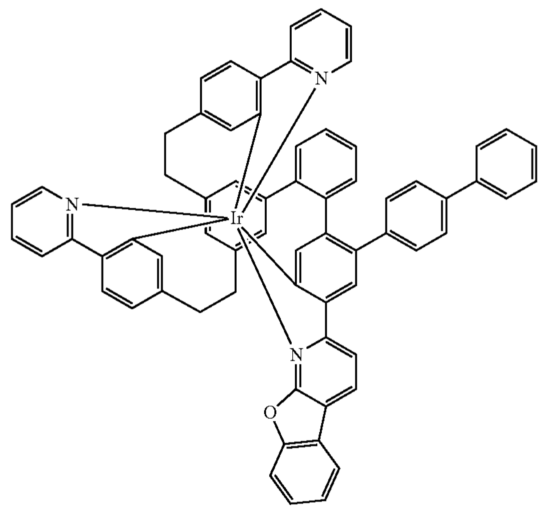
379
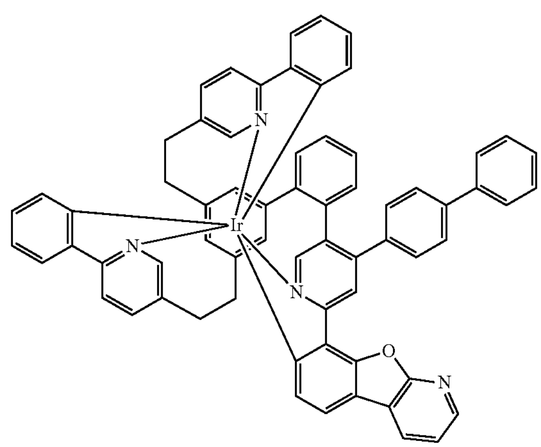

-continued
380
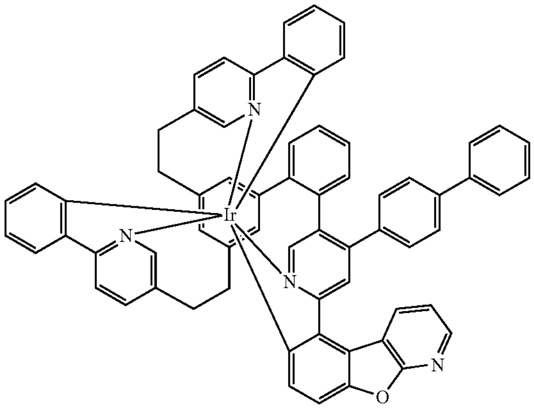
381
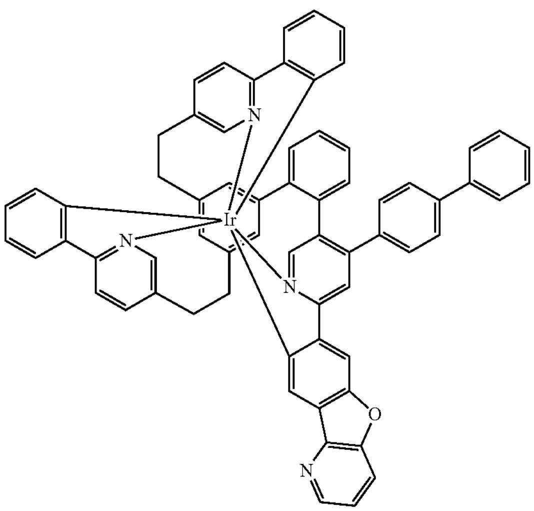
382
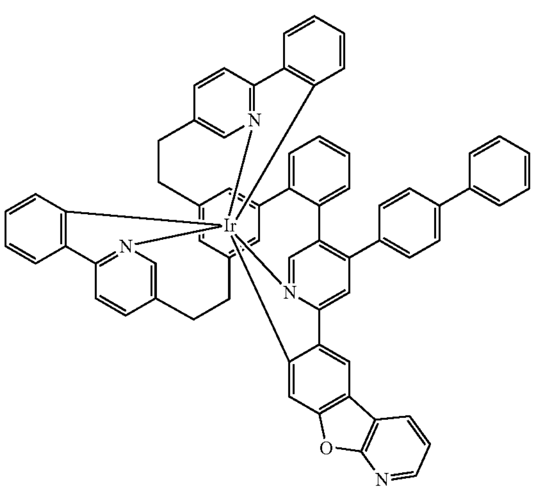
-continued
383
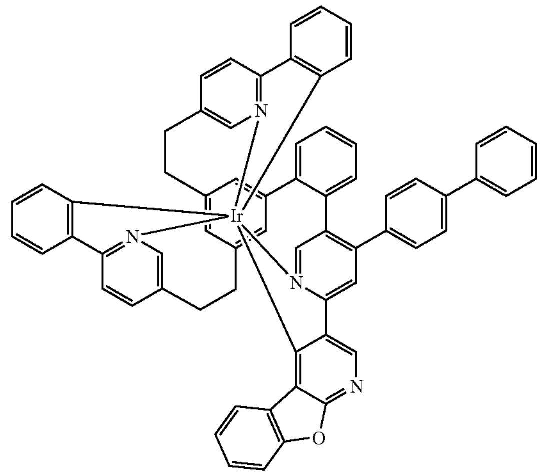
384
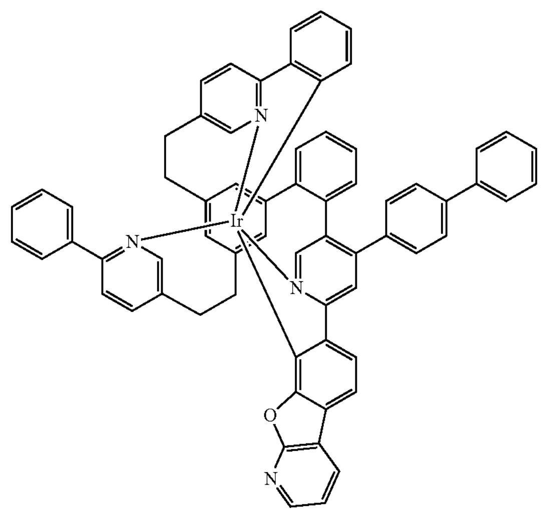
385
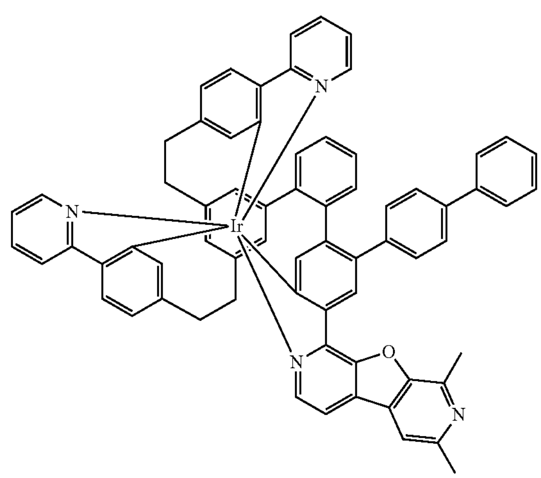

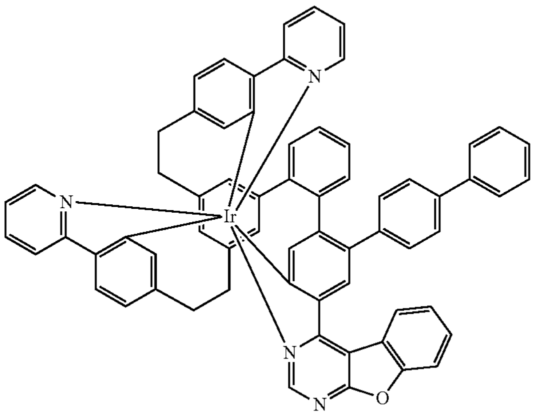
386
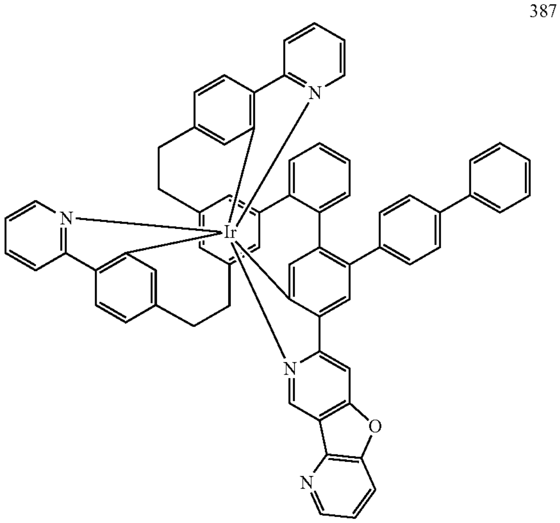
387
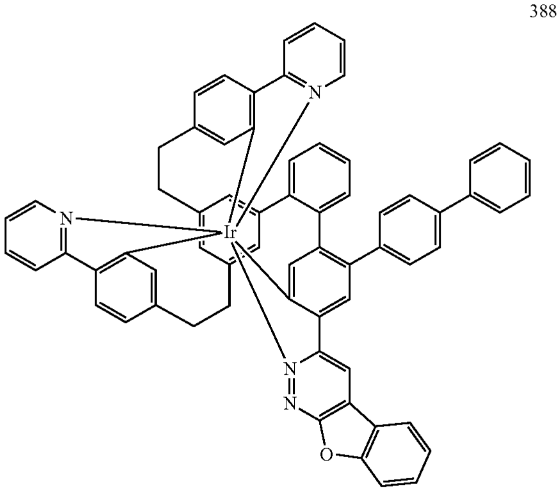
388
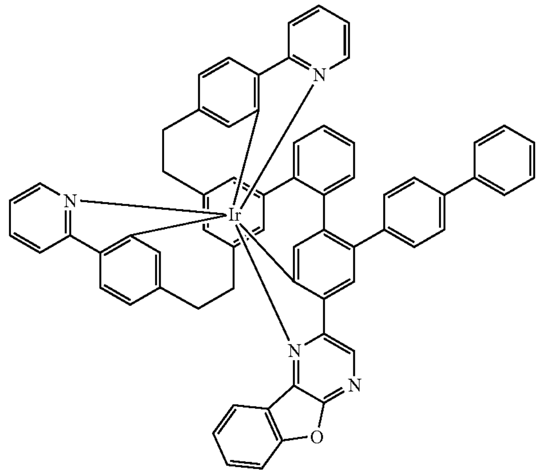
389
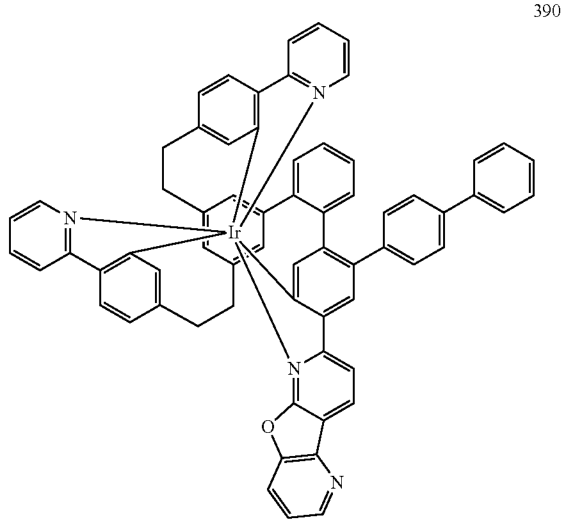
390
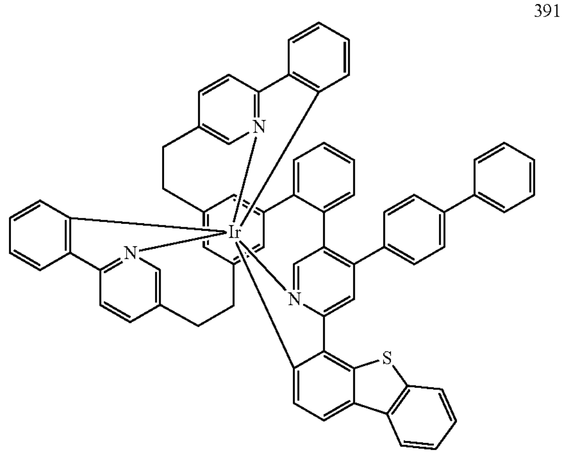
391

392
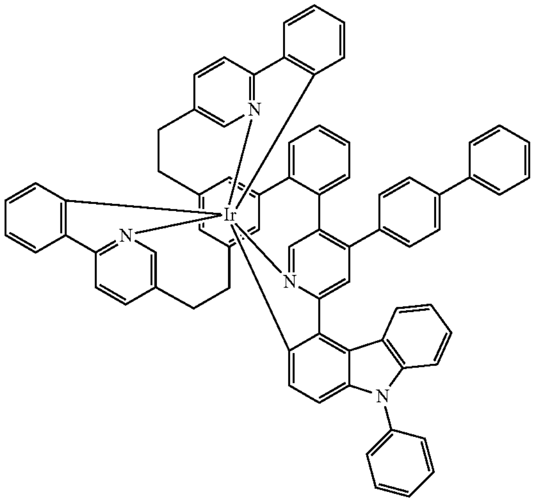
393
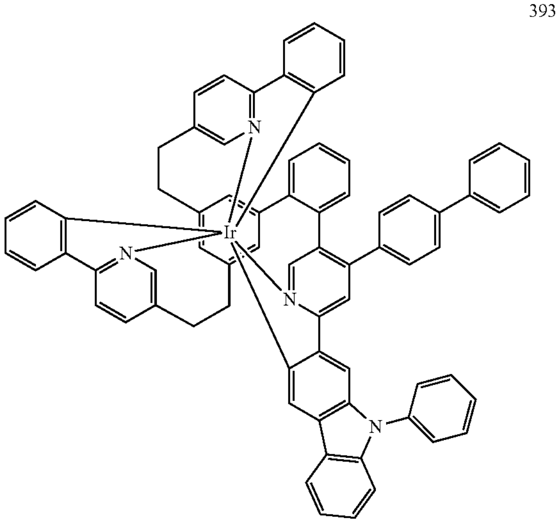
394
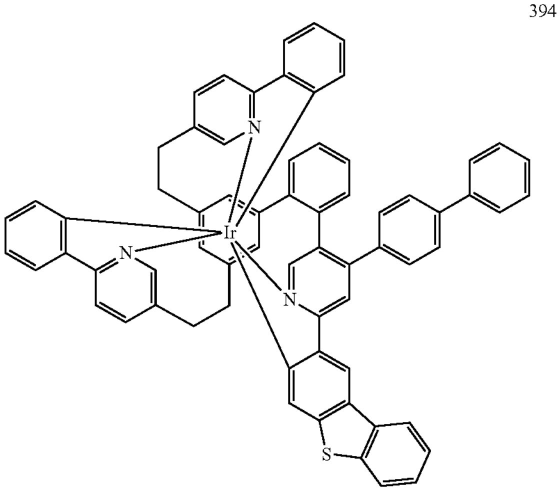
395
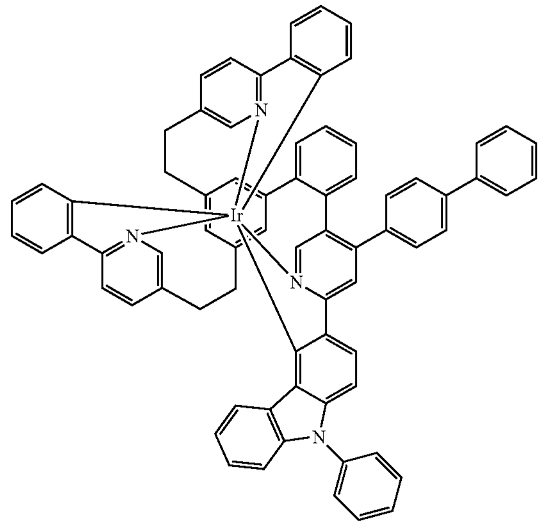
396
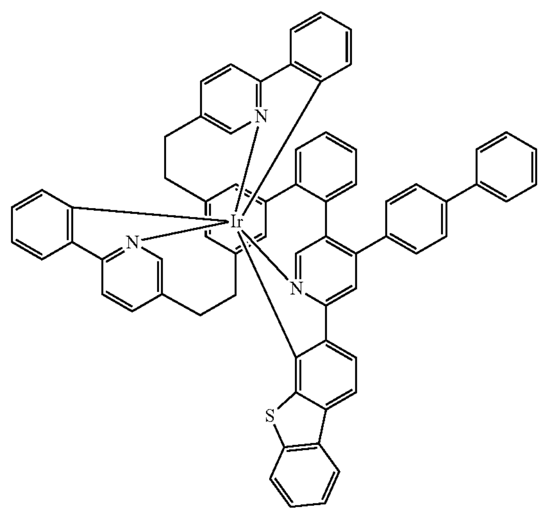
397
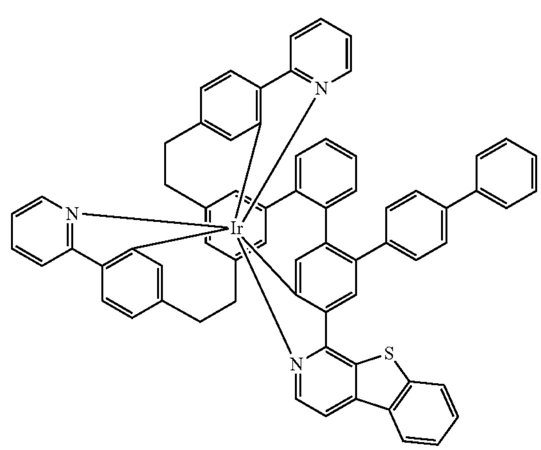

-continued
398
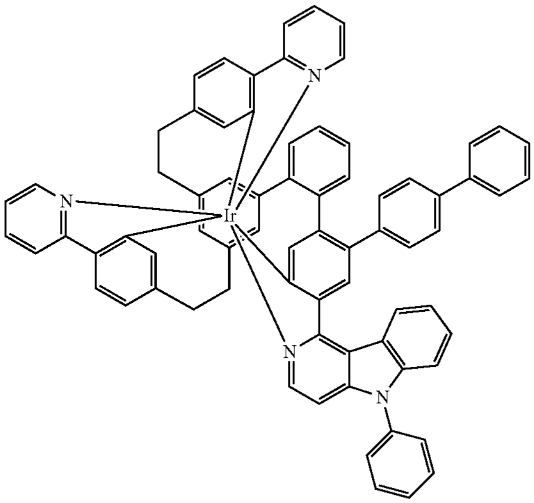
399
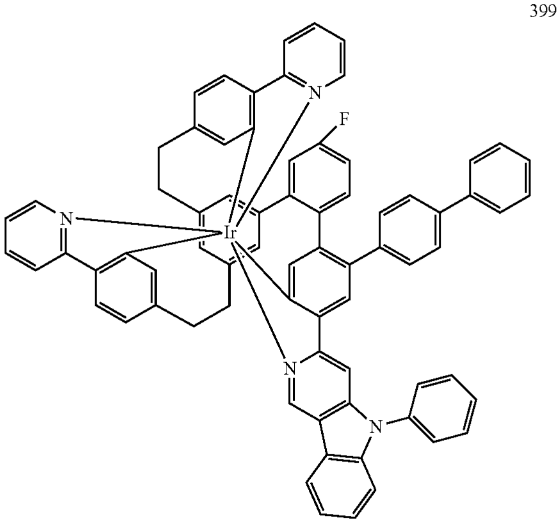
400
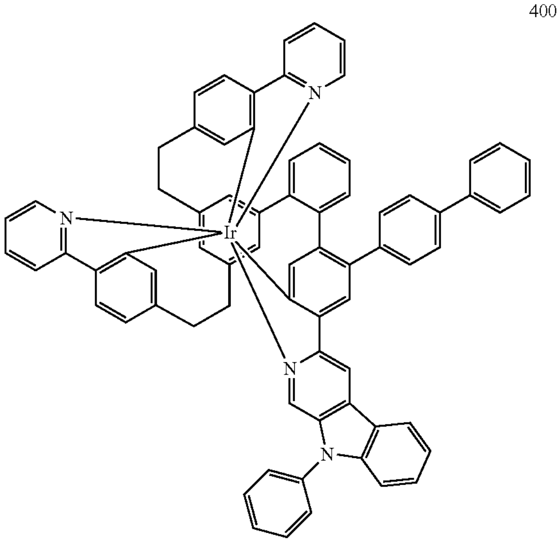
-continued
401
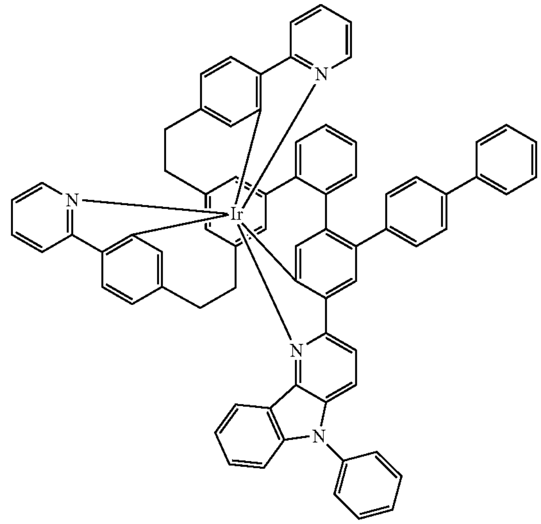
402
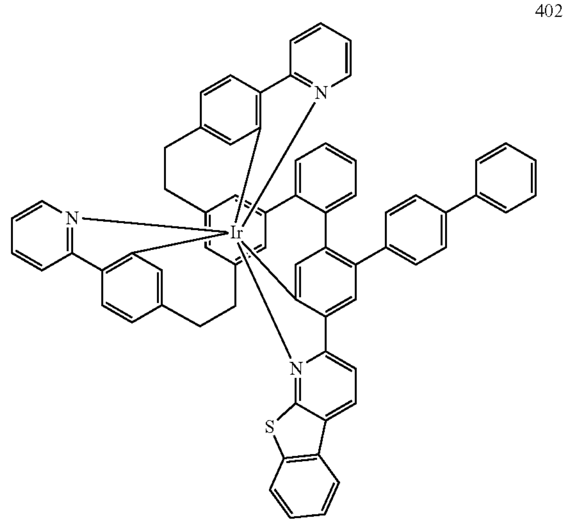
403
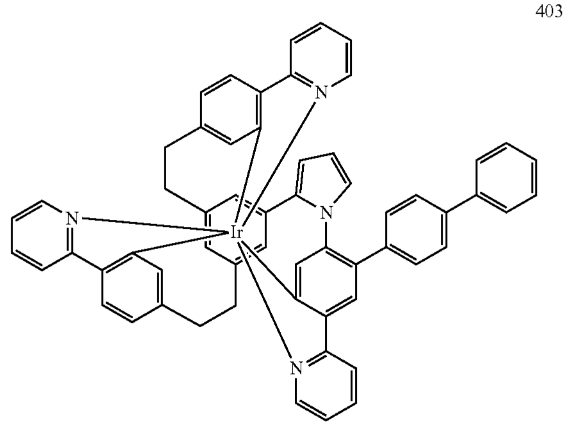

404
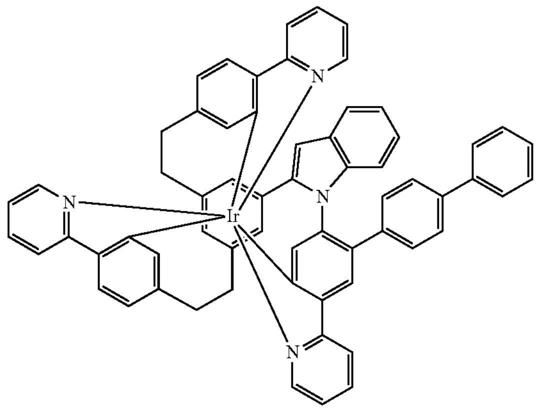
405
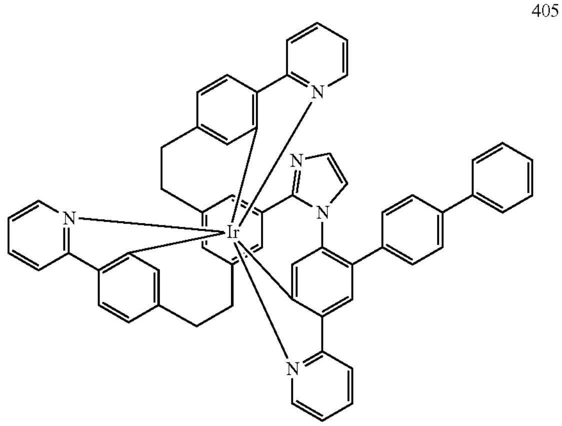
406
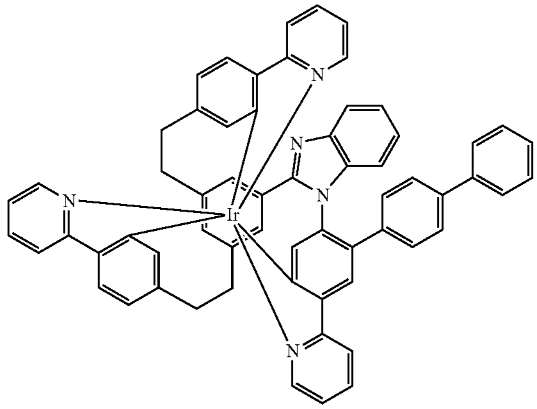
407
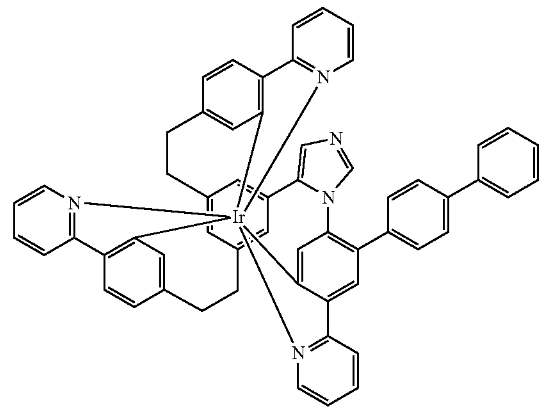
408
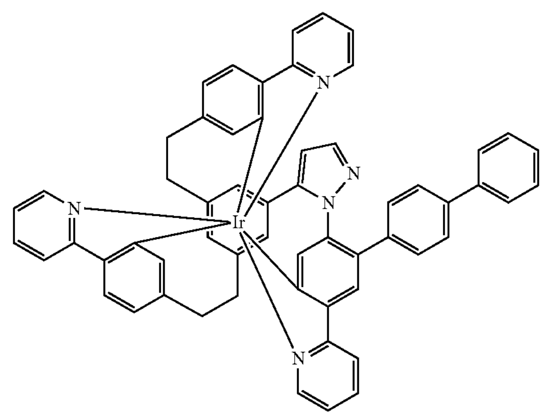
409
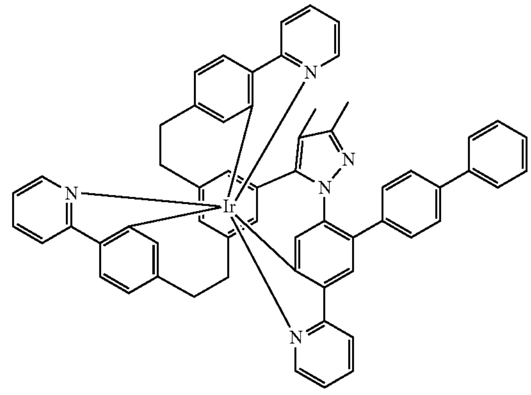

410
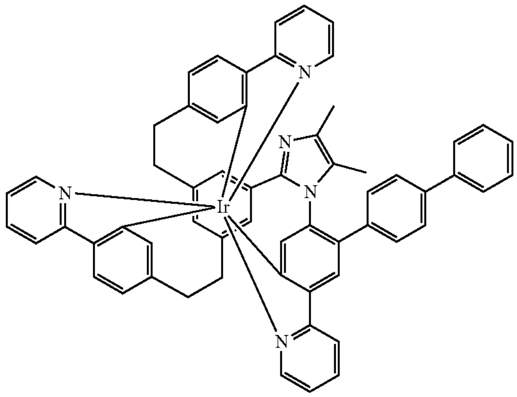
411
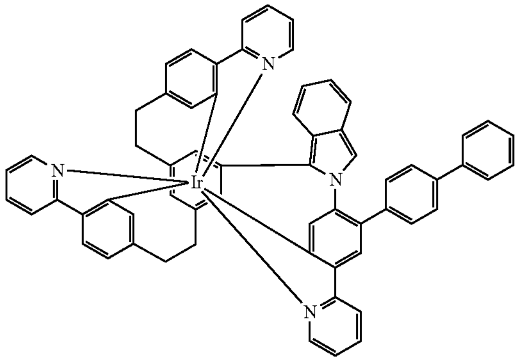
412
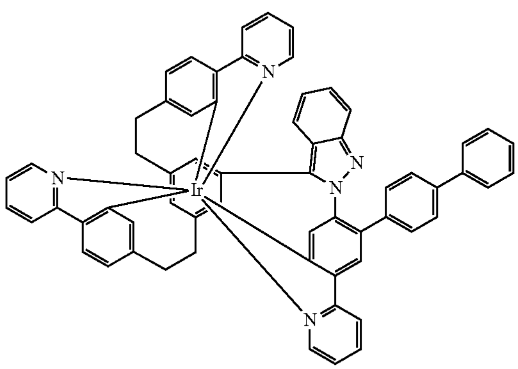
413
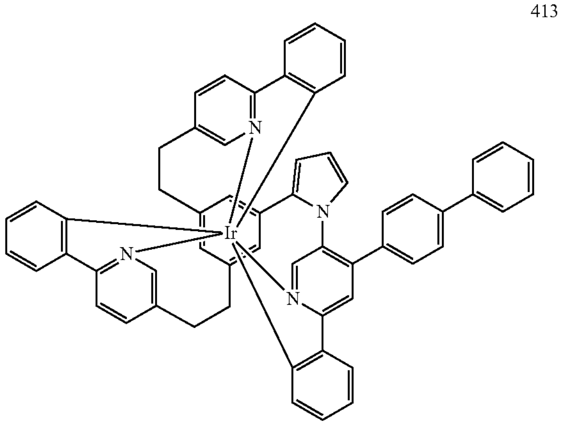
414
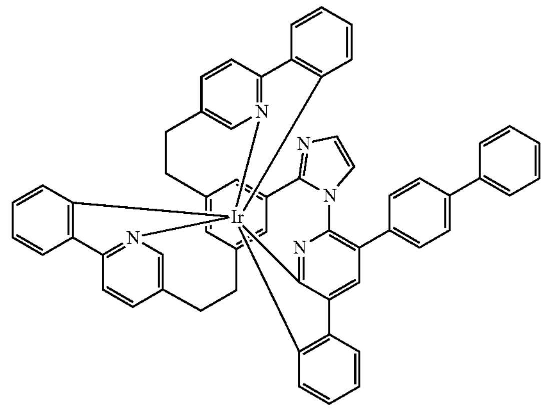
415
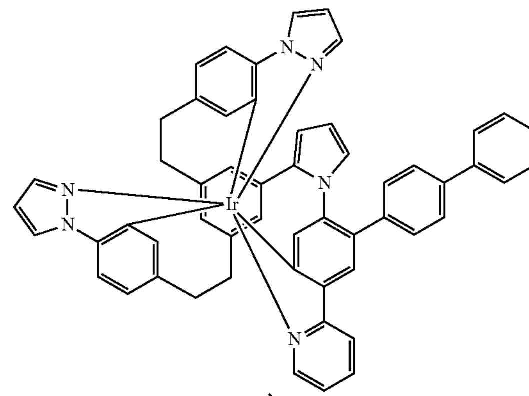
416
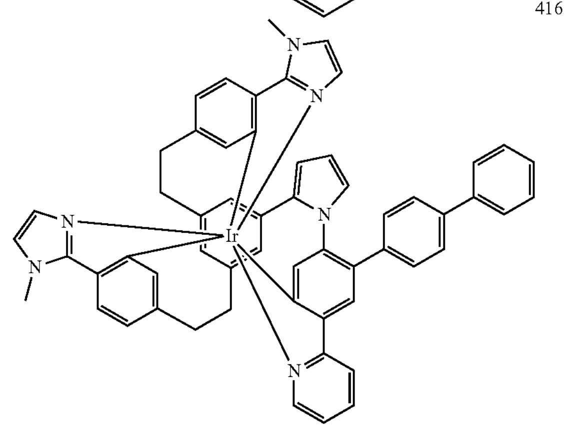
417
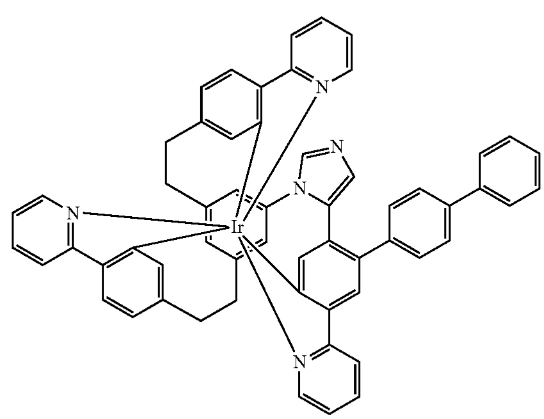

-continued
418
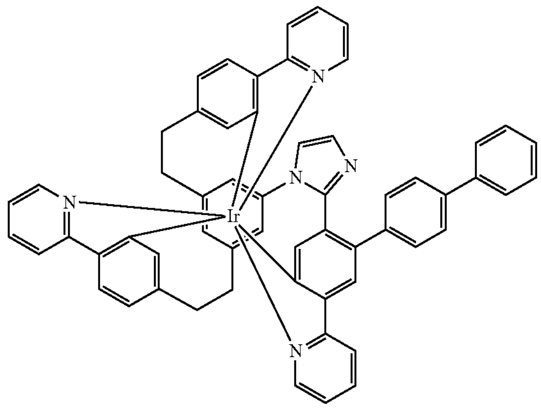
419
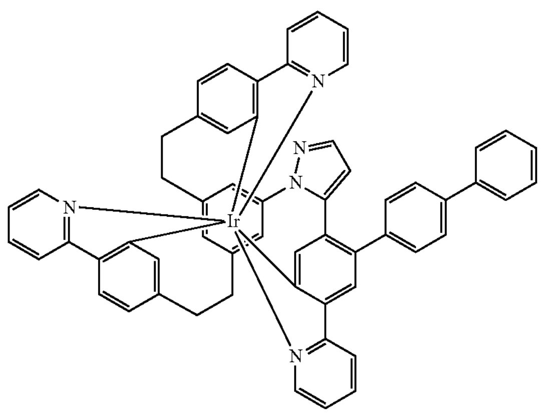
420
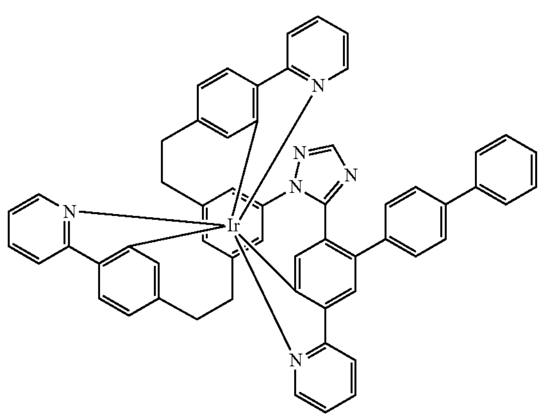
-continued
421
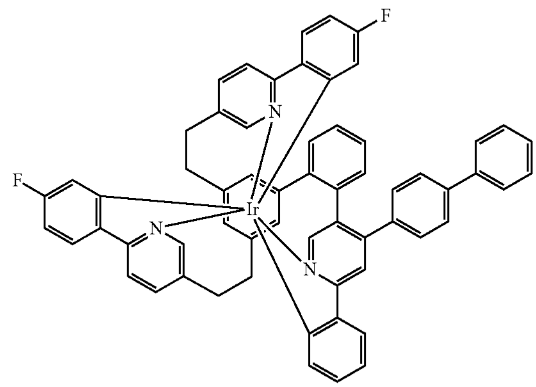
422
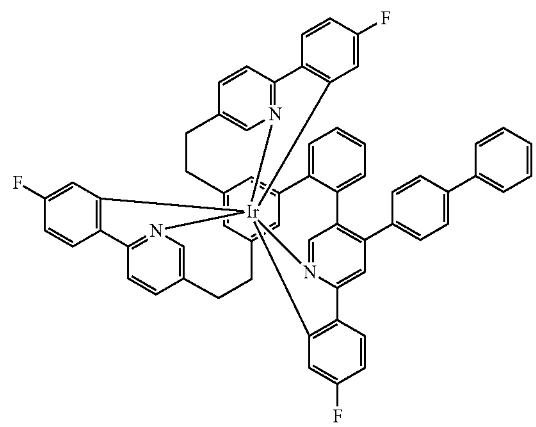
423
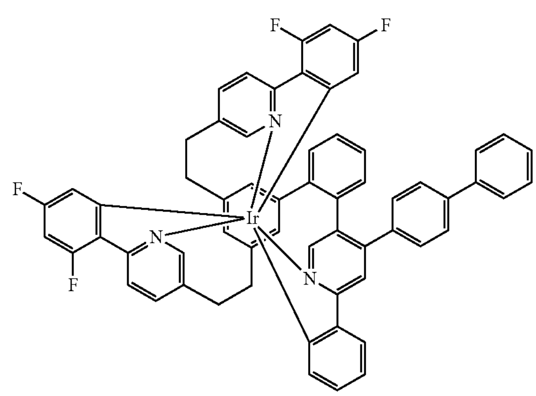

424
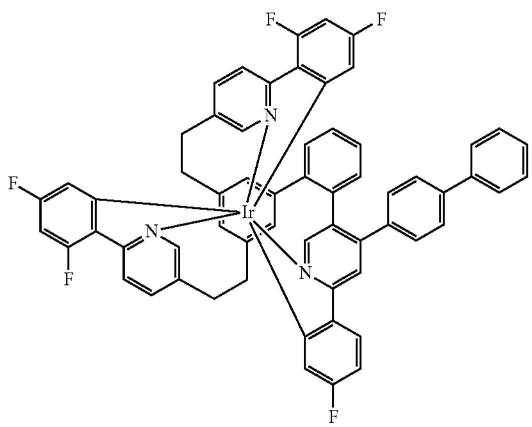
425
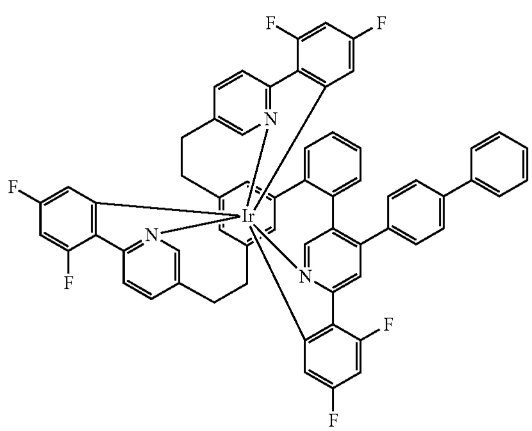
426
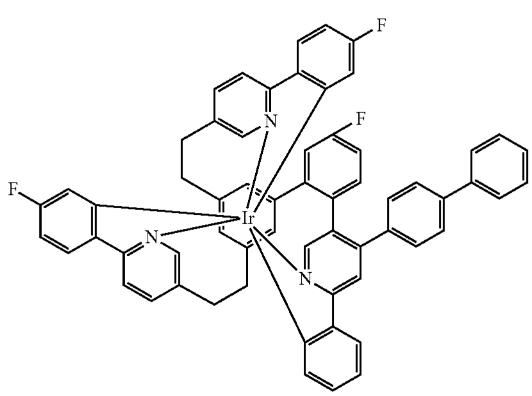
427
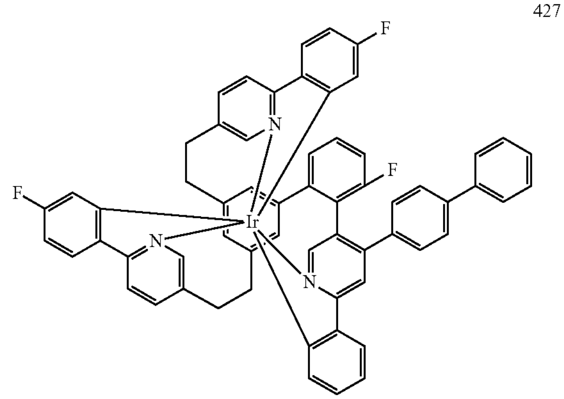
428
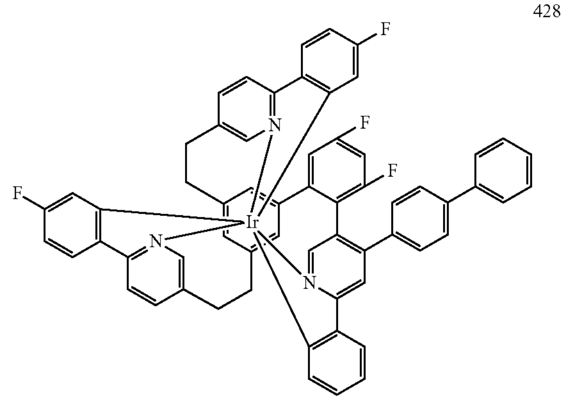
429
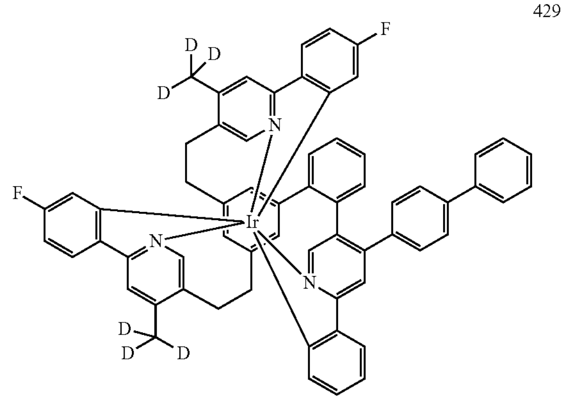
430
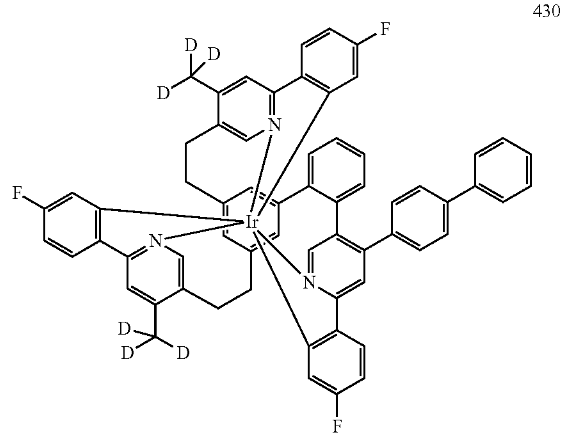

-continued
431
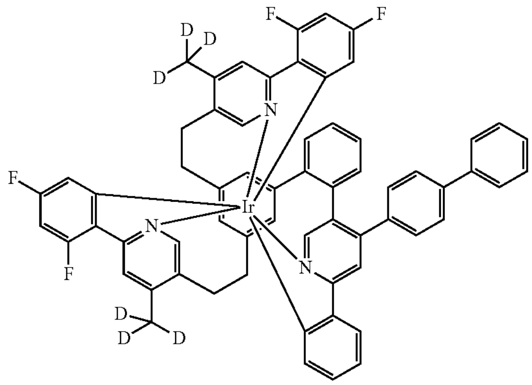
432
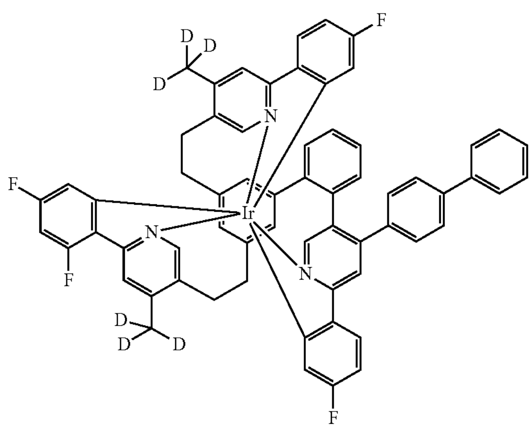
433
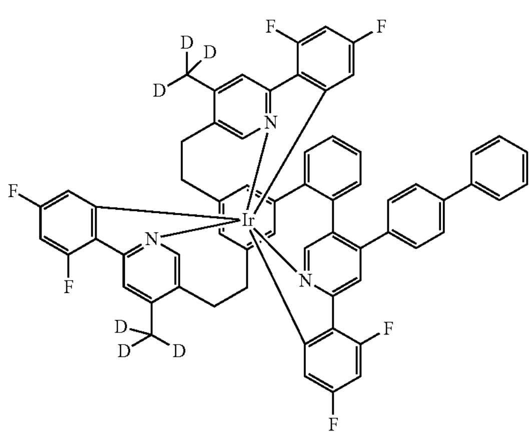
-continued
434
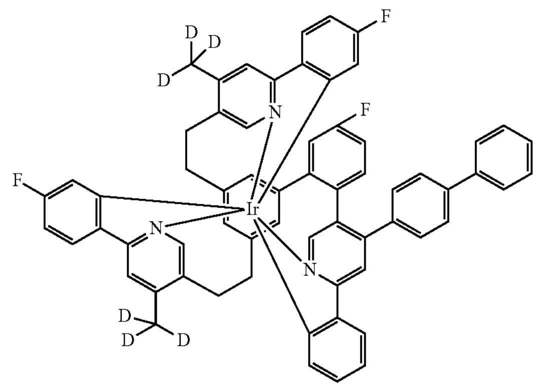
435
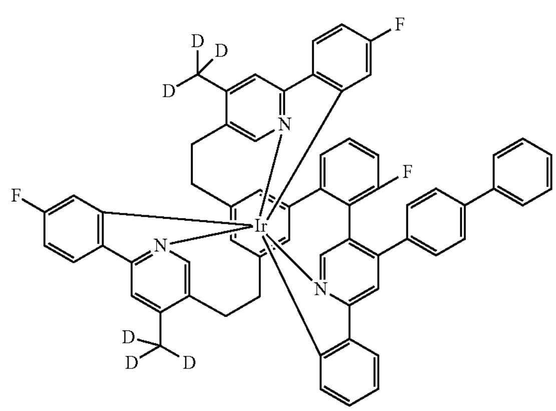
436
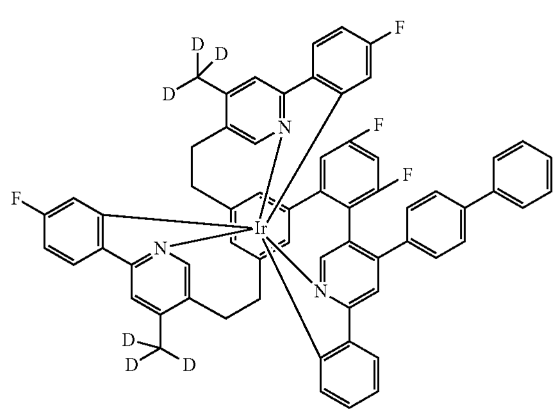

437
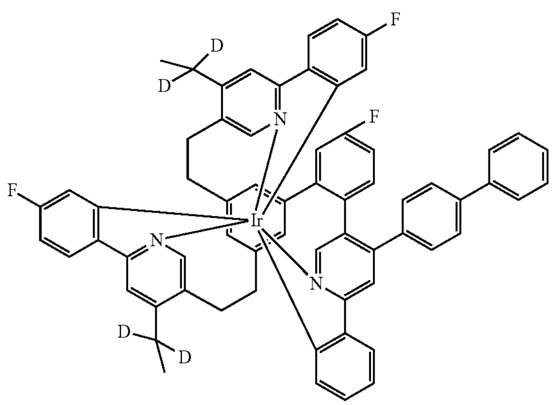
438
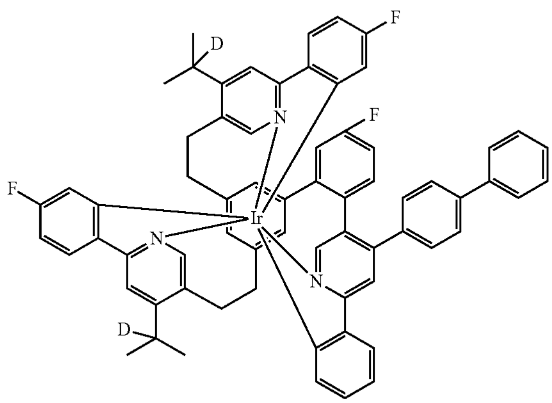
439
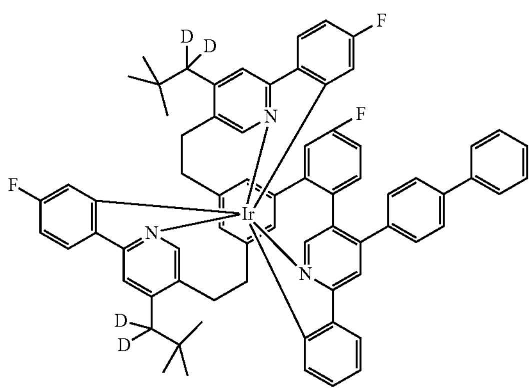
440
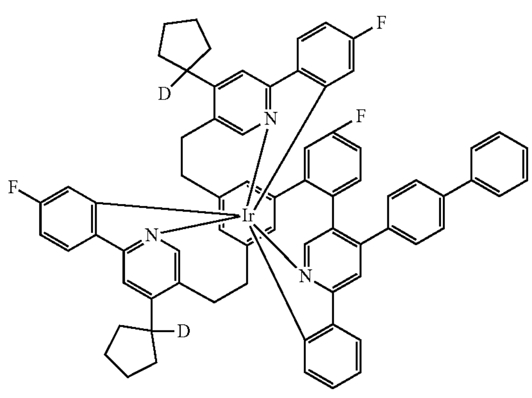
441
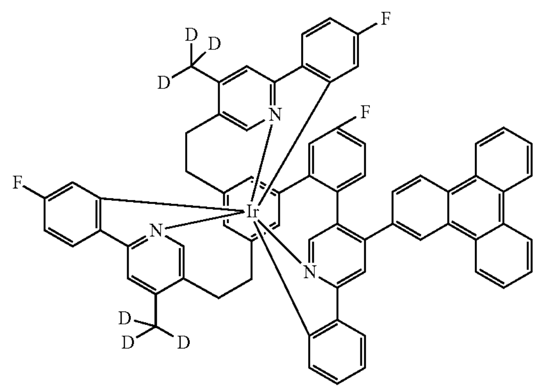
442
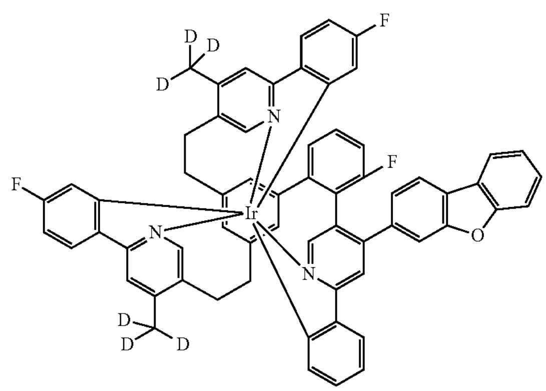
443
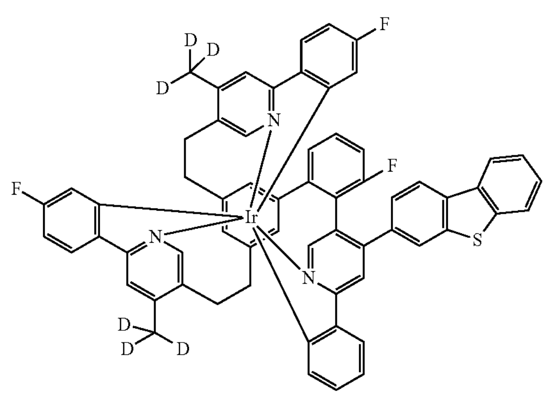
444
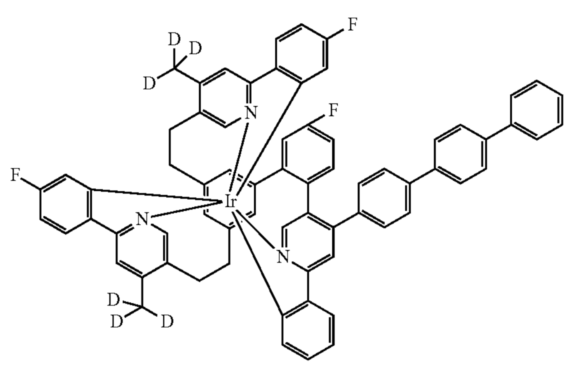

-continued
445
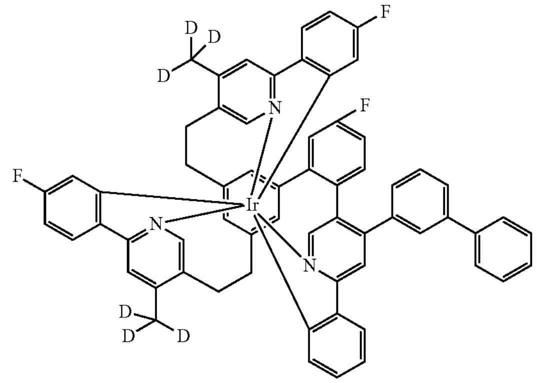
446
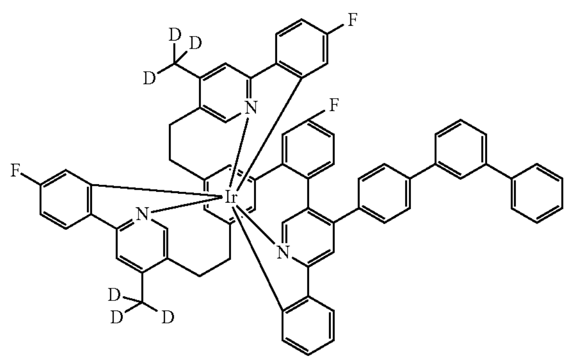
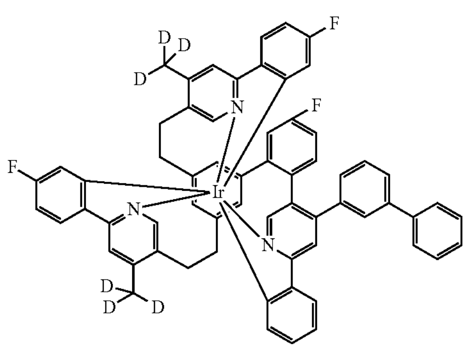
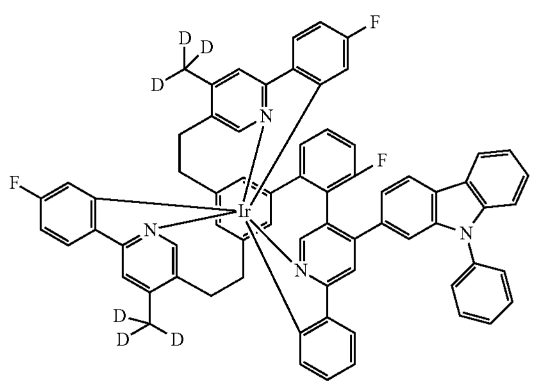
-continued
447
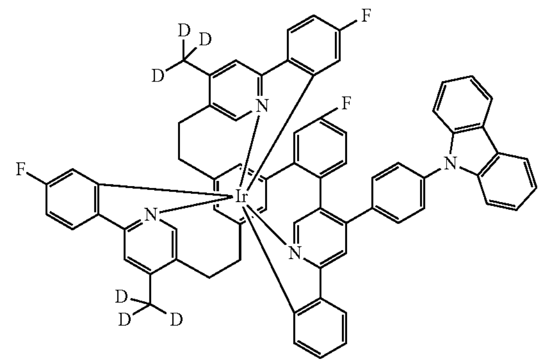
448
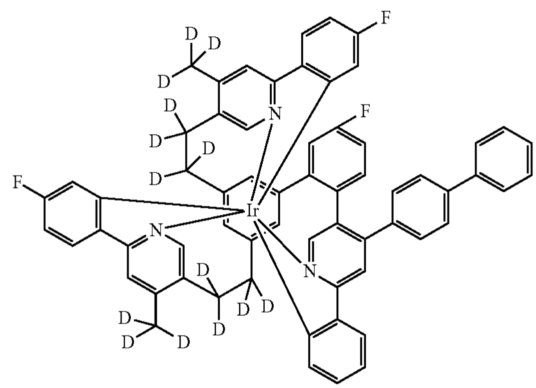
449
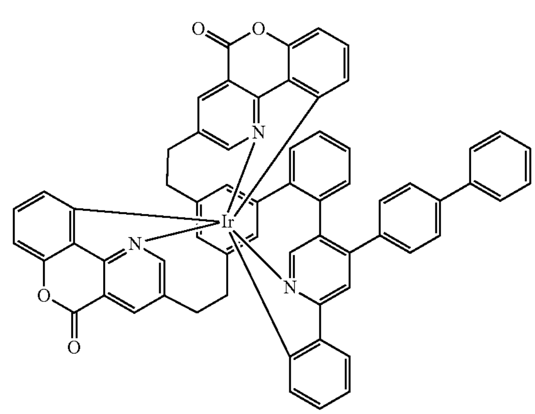
450
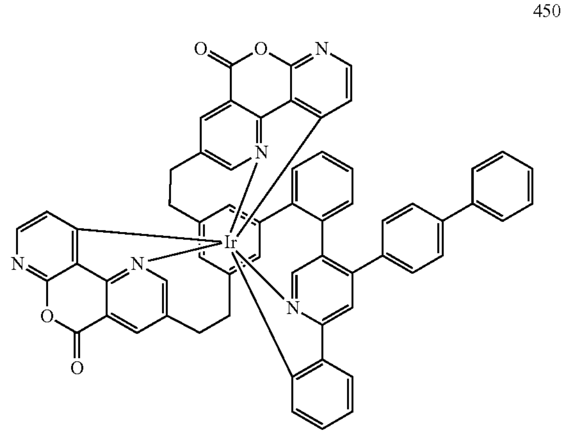

451
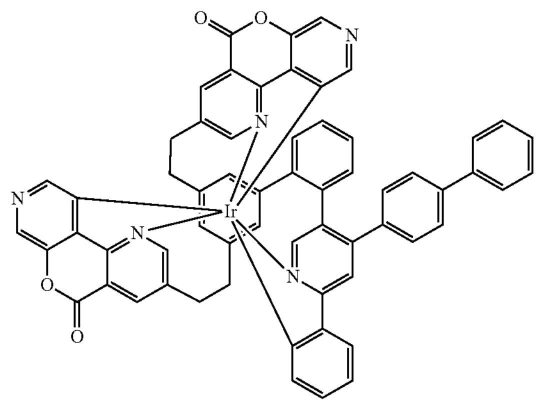
452
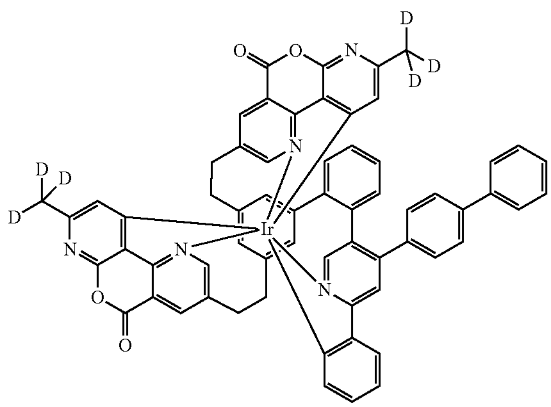
453
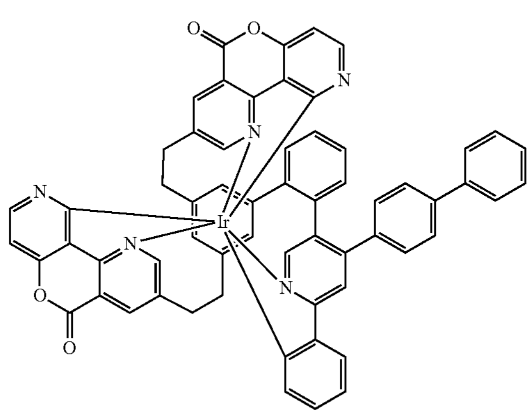
454
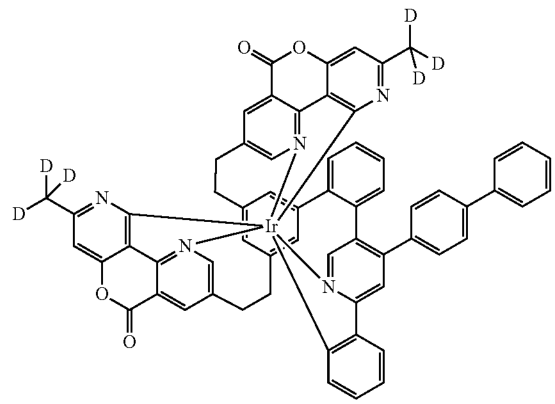
455
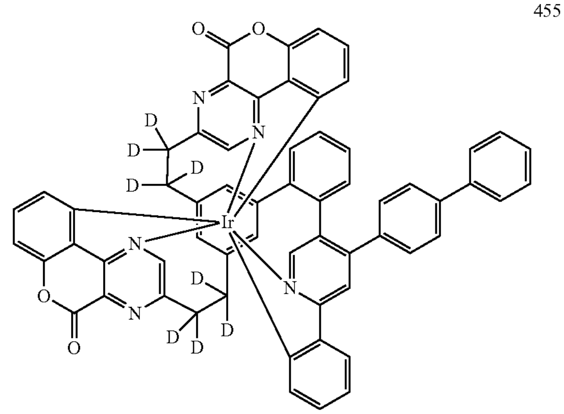
456
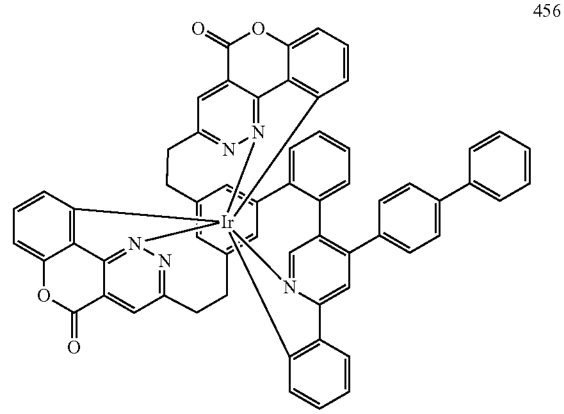
457
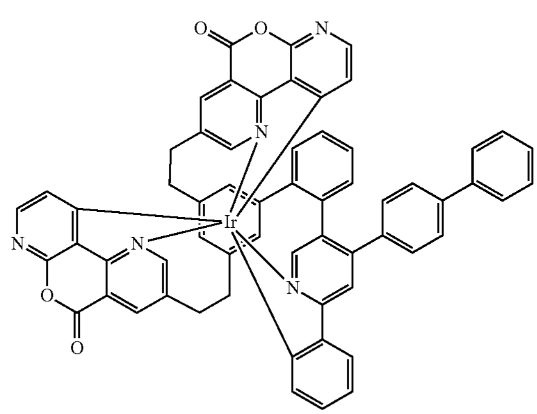

-continued
458
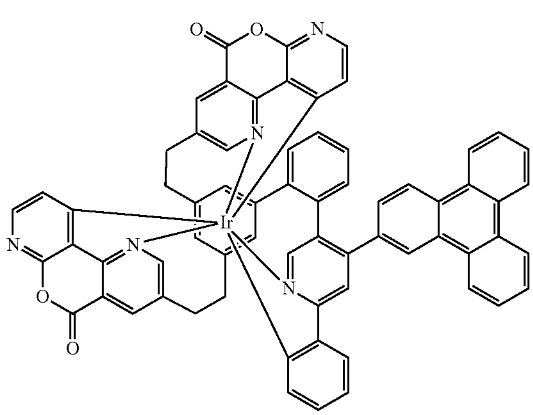
459
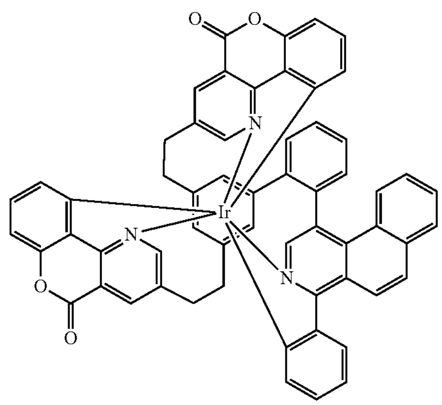
460
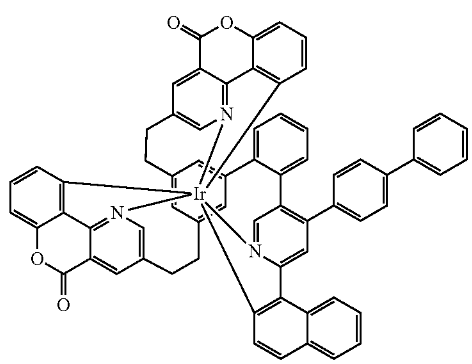
461
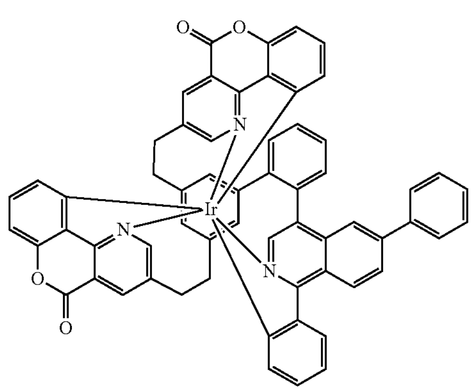
-continued
462
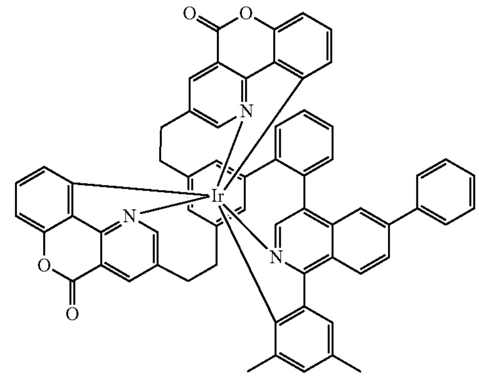
463
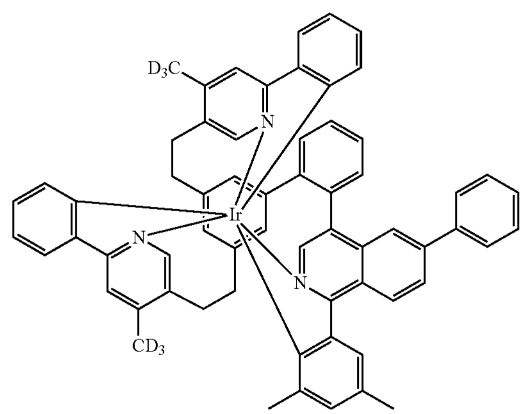
464
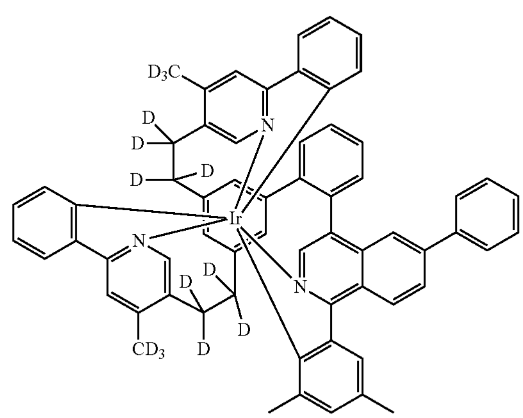

-continued
465
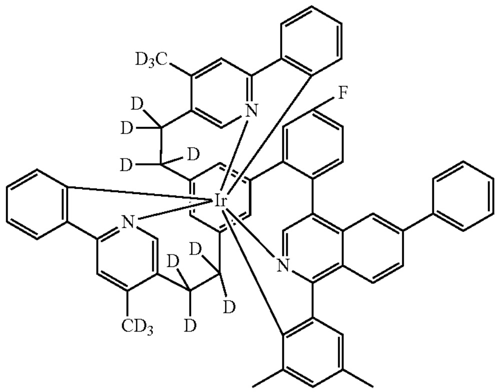
466
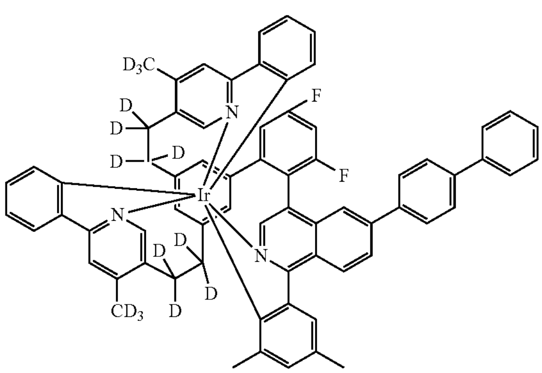
467
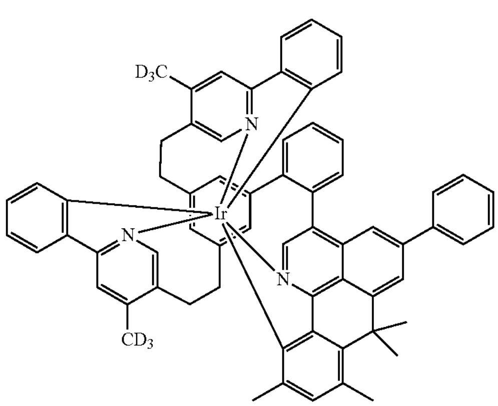
-continued
468
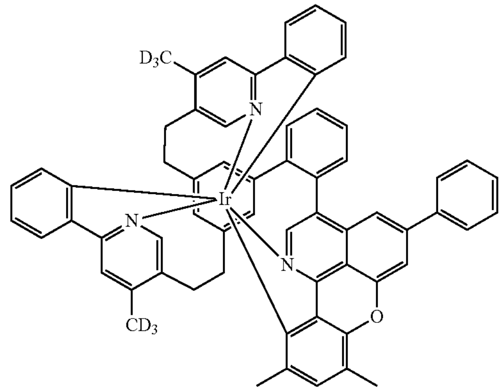
469
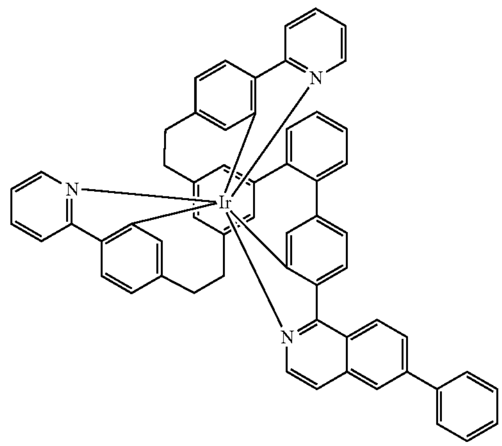
470
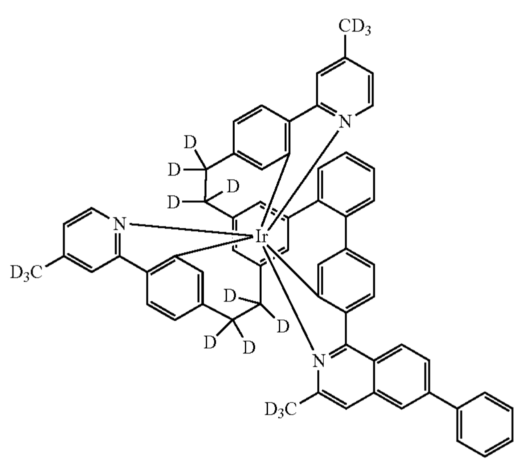

471
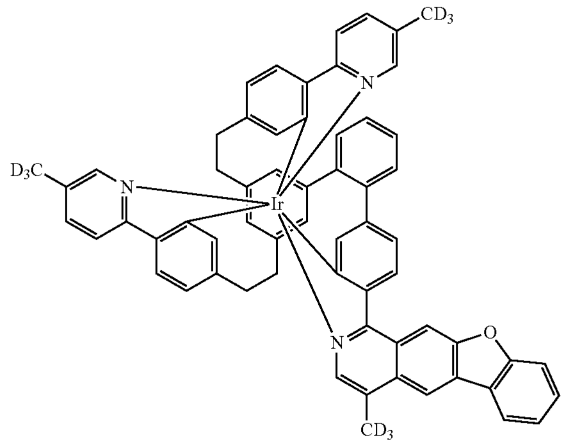
472
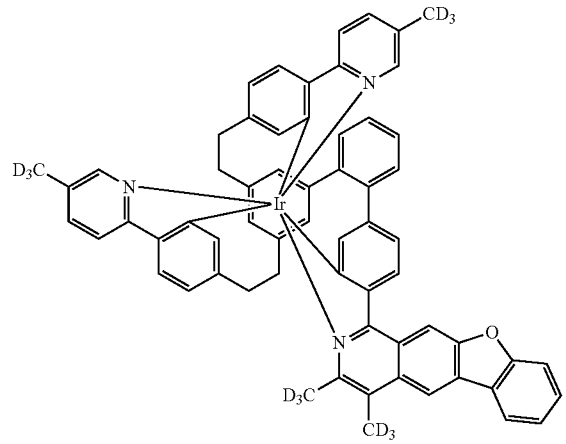
473
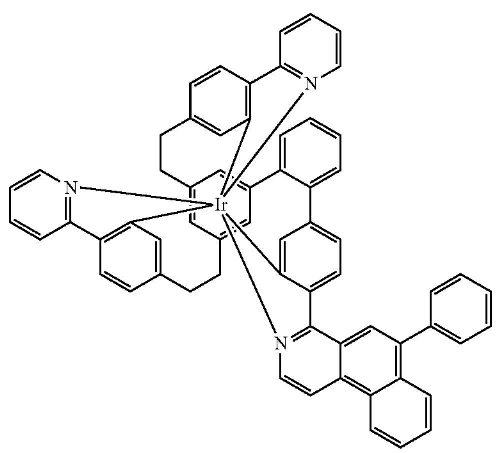
474
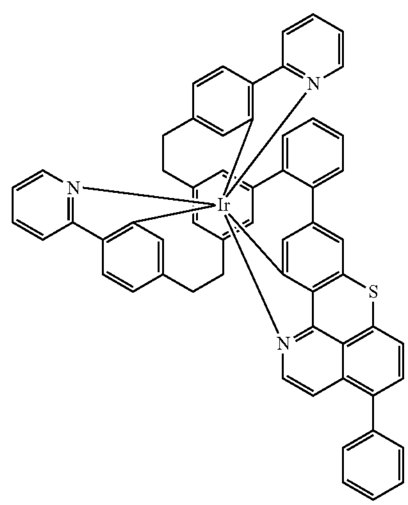
475
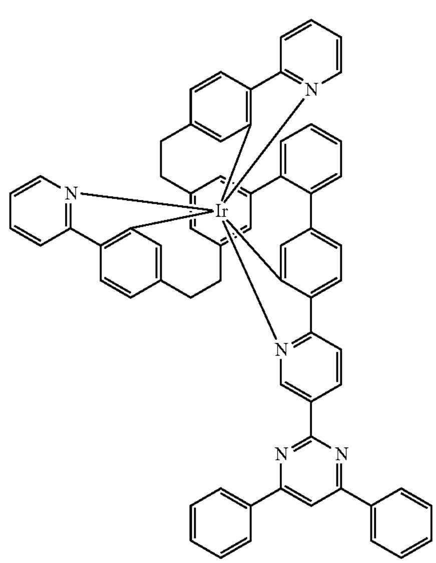
476
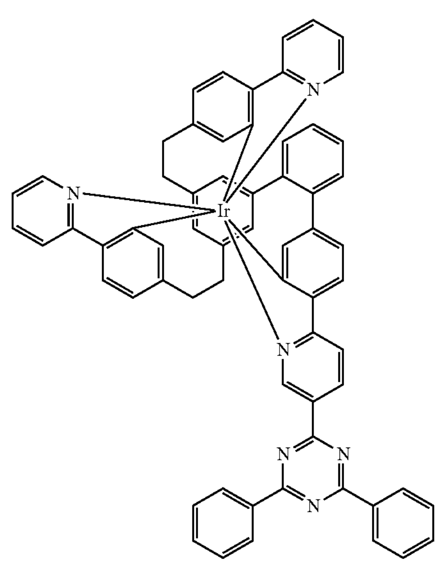

-continued
477
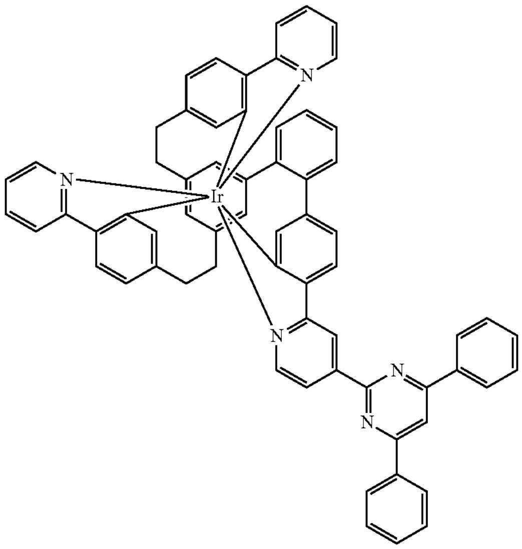
478
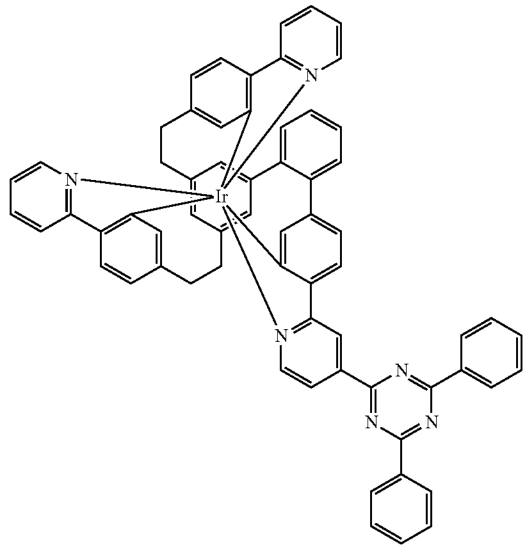
479
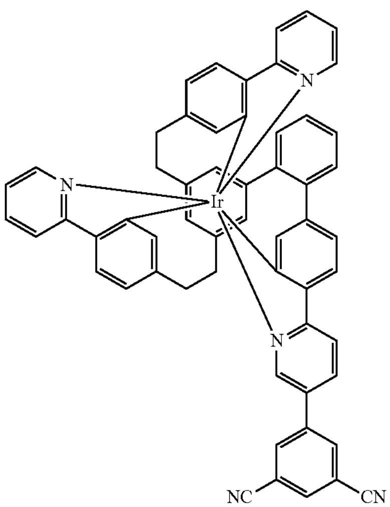
480
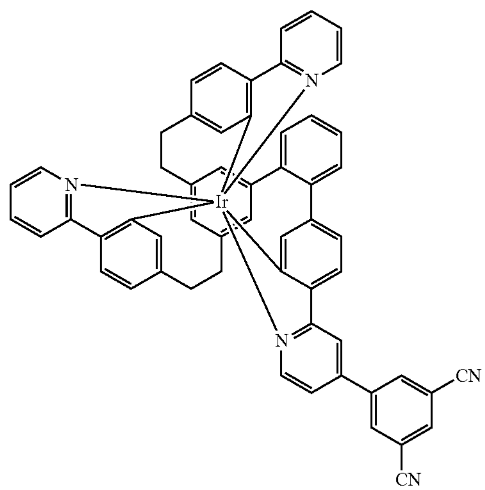
481
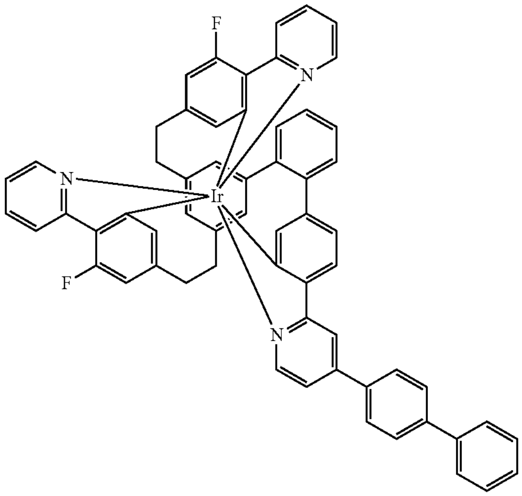
482
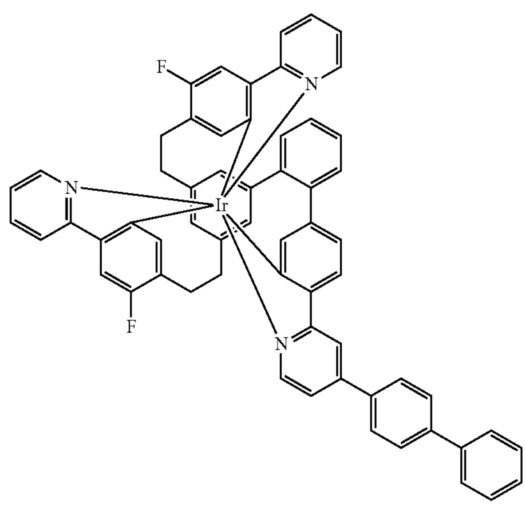

-continued
483
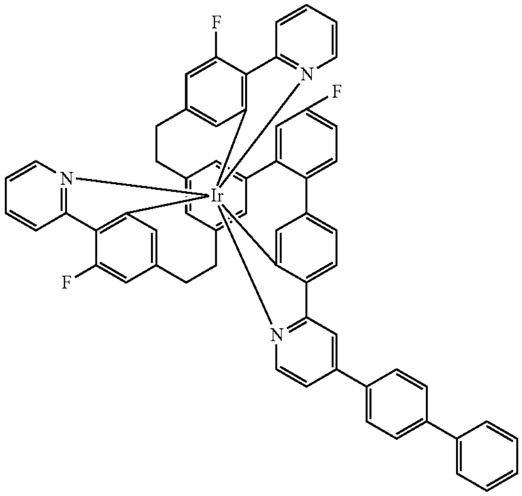
484
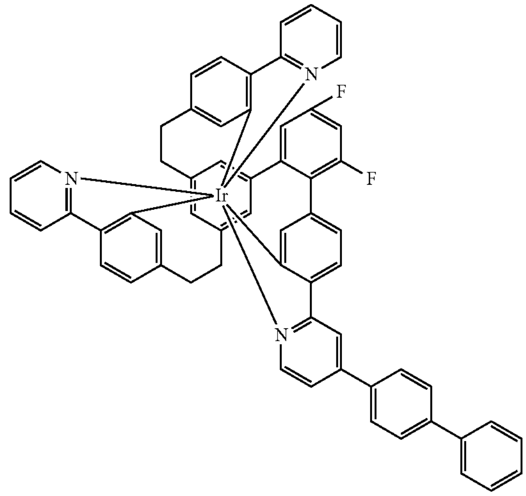
485
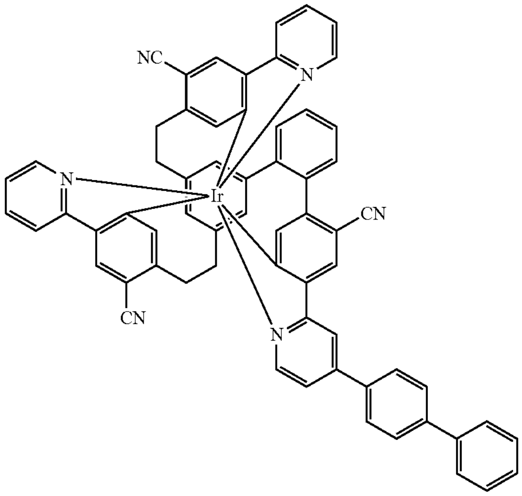
486
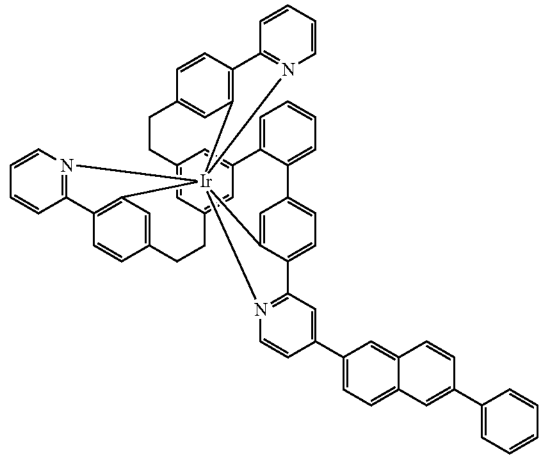
487
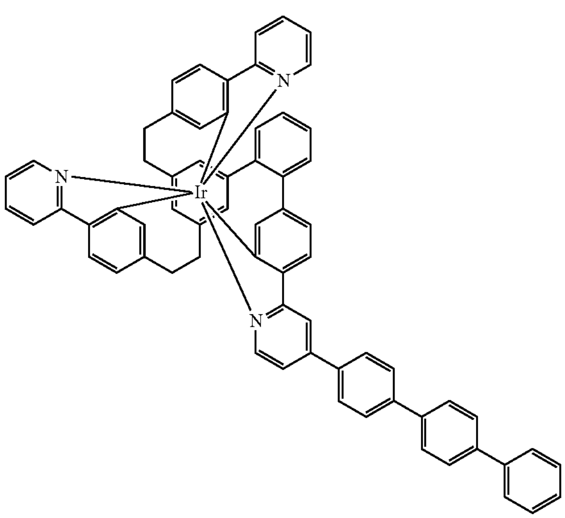
488
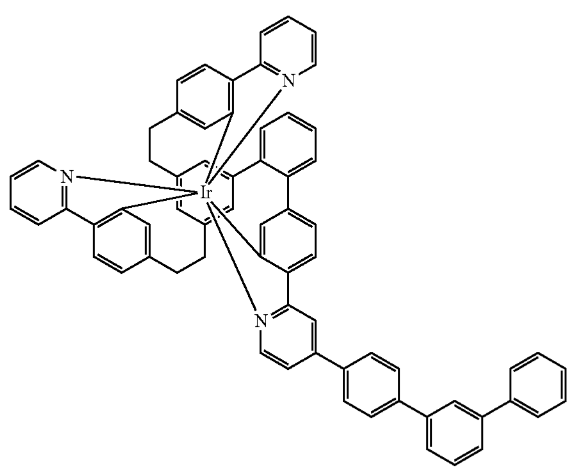

-continued
489
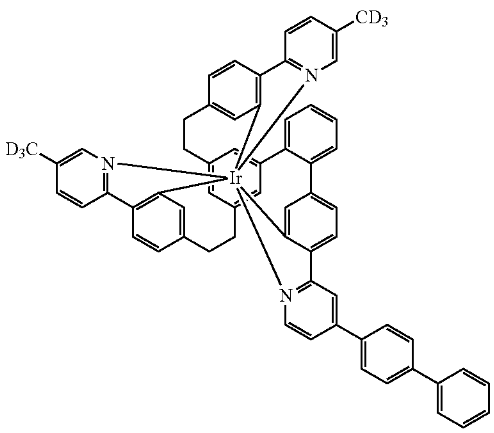
490
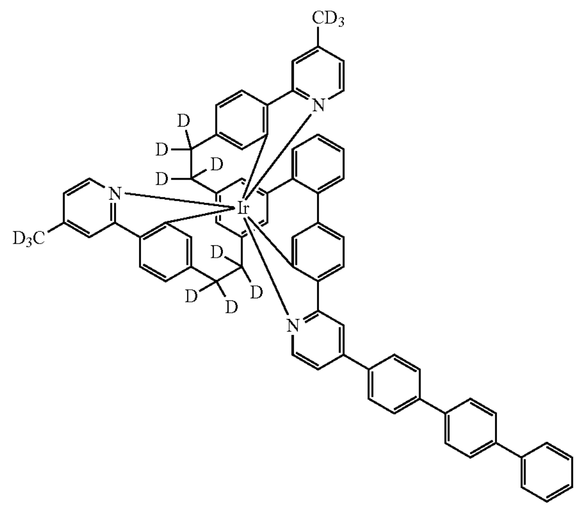
491
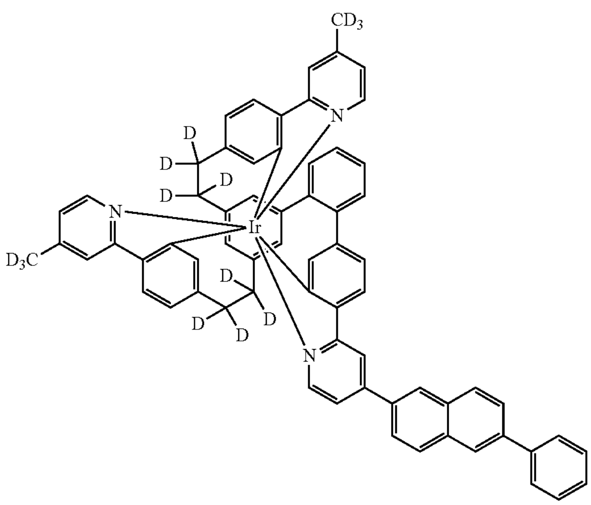
492
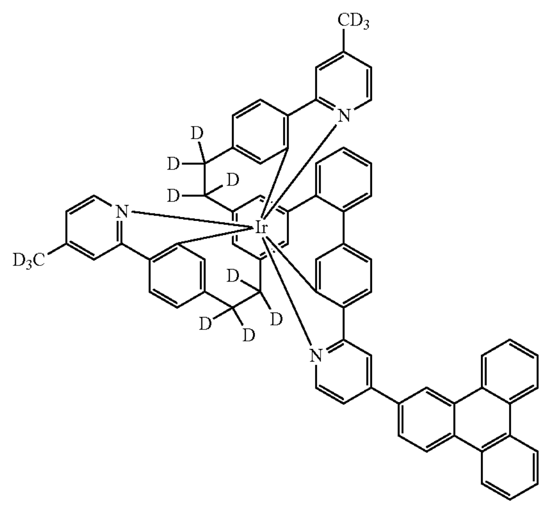
493
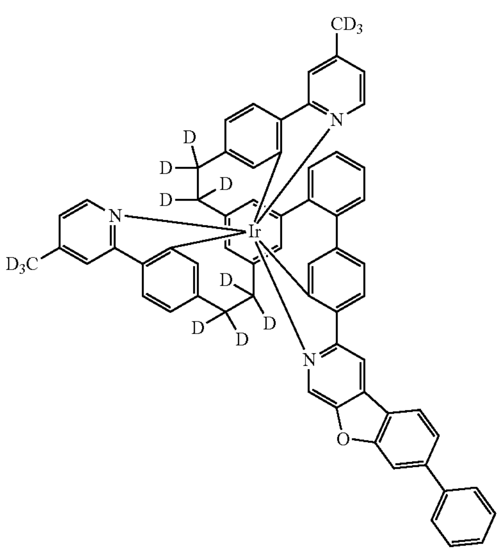
494
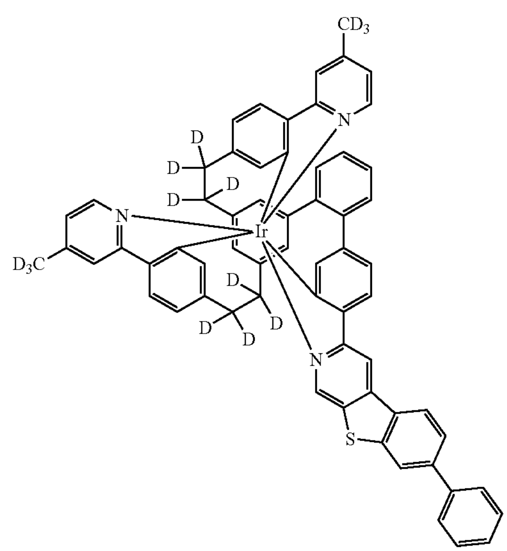

-continued
495
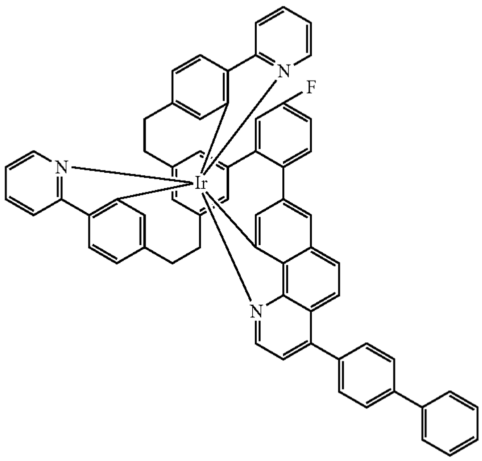
496
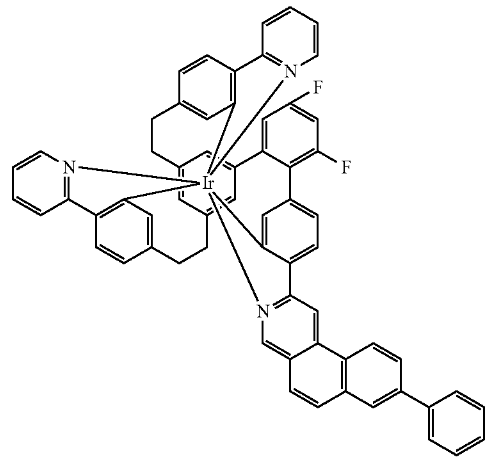
497
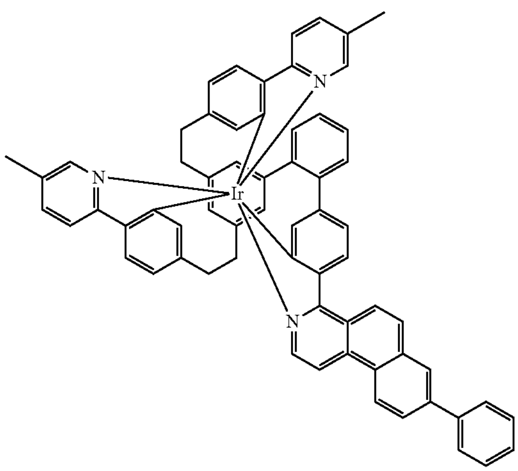
498
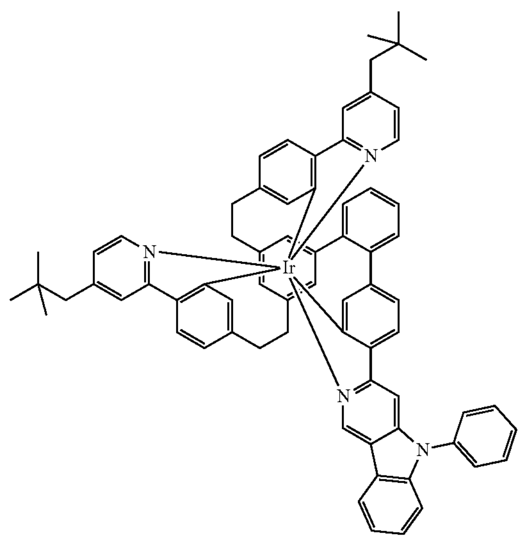
499
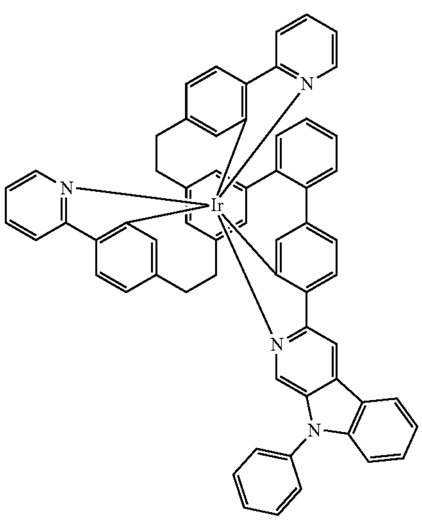
500
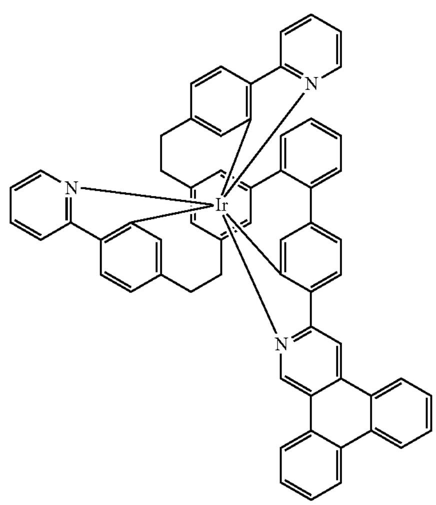

-continued
501
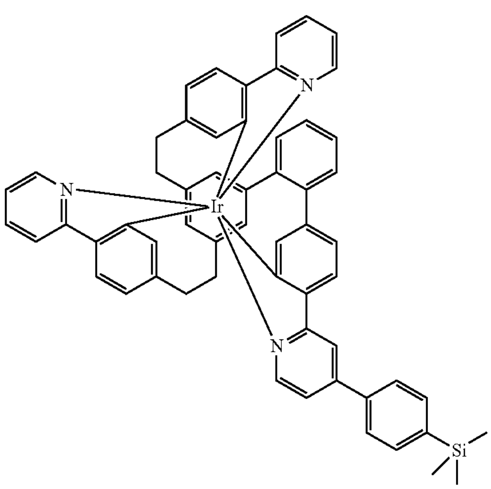
502
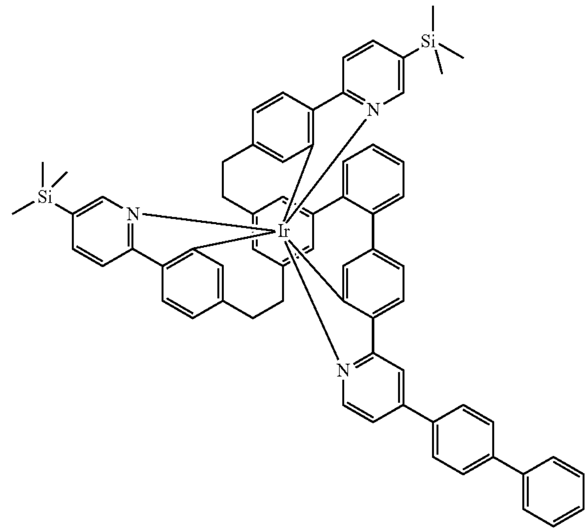
503
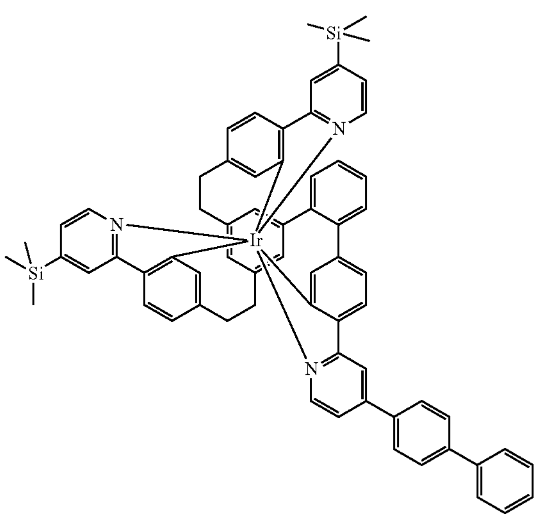
504
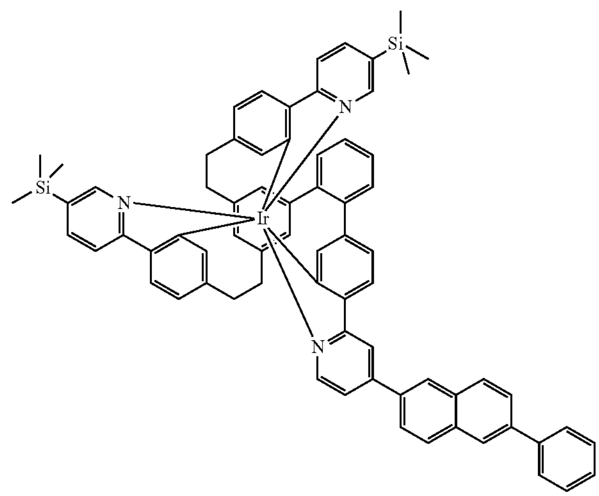
505
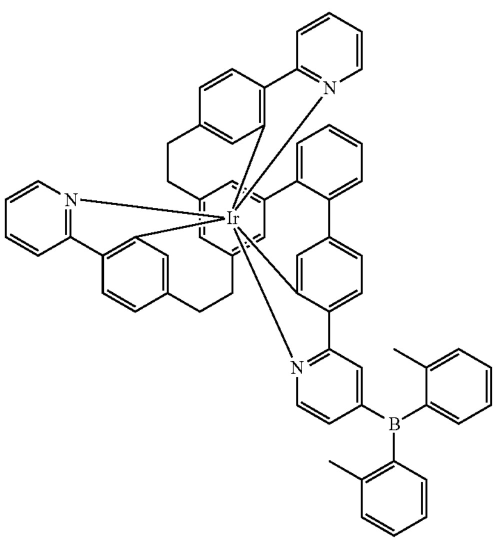
506
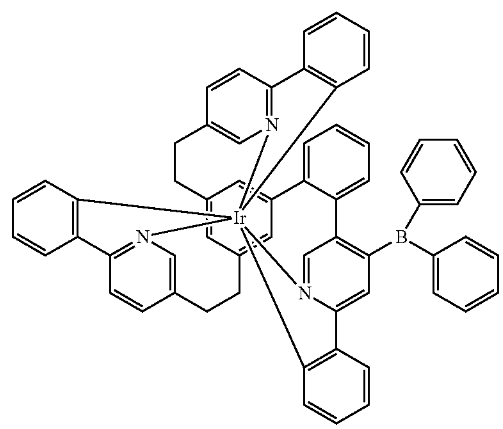

-continued
507
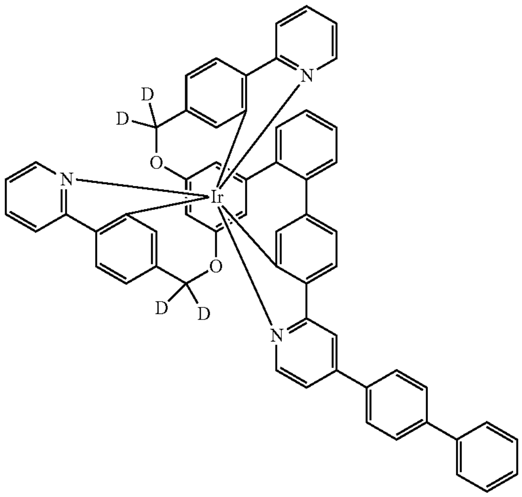
508
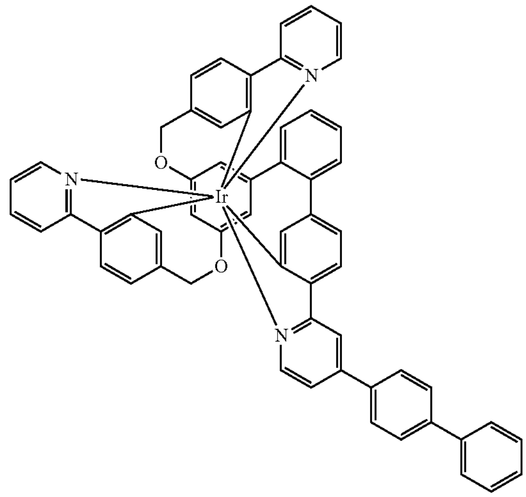
509
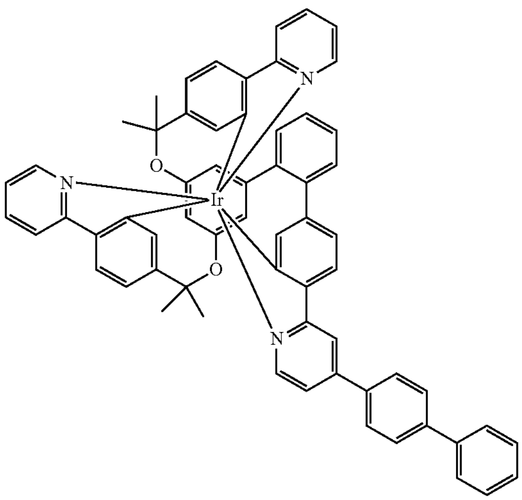
510
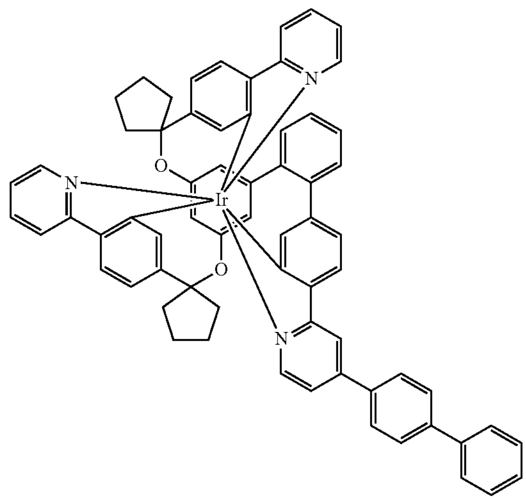
511
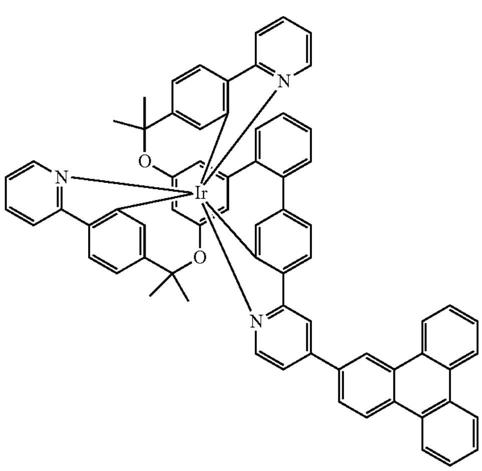
512
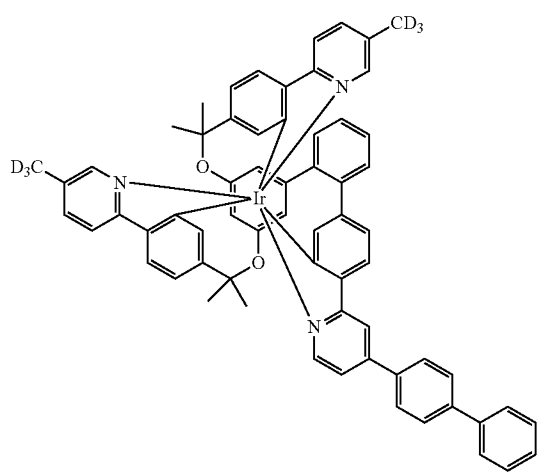

-continued
513
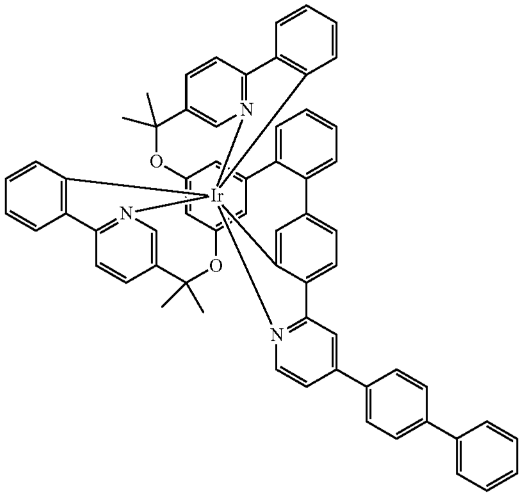
514
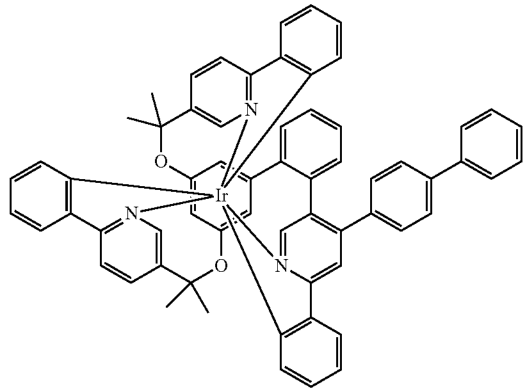
515
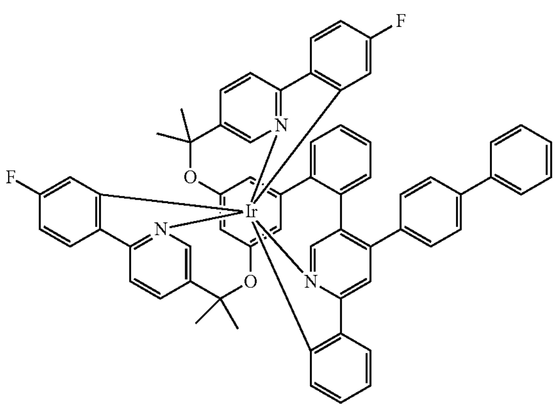
516
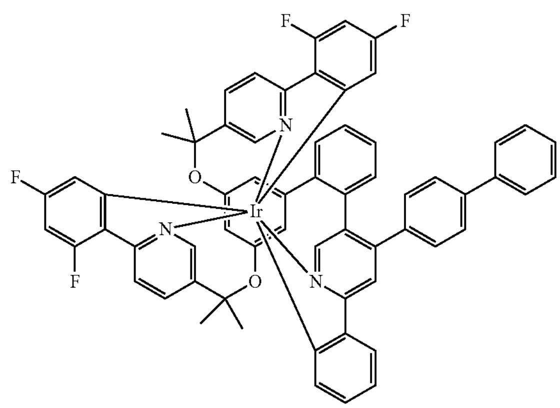
517
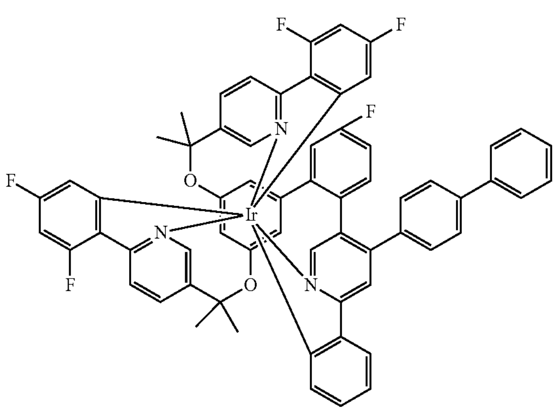
518
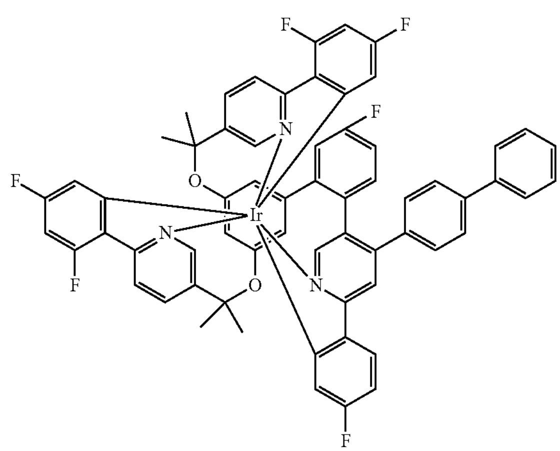

-continued
519
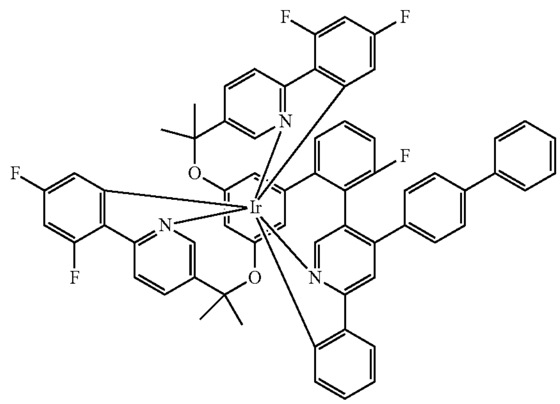
520
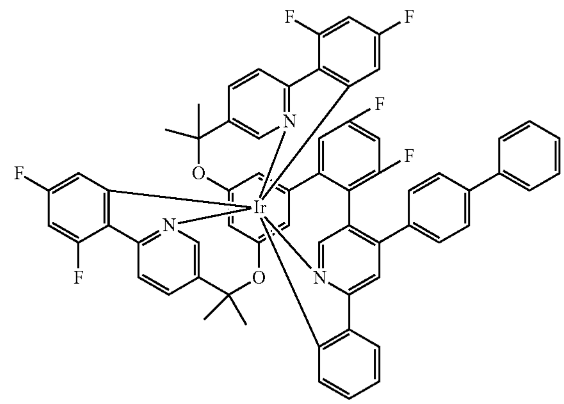
521
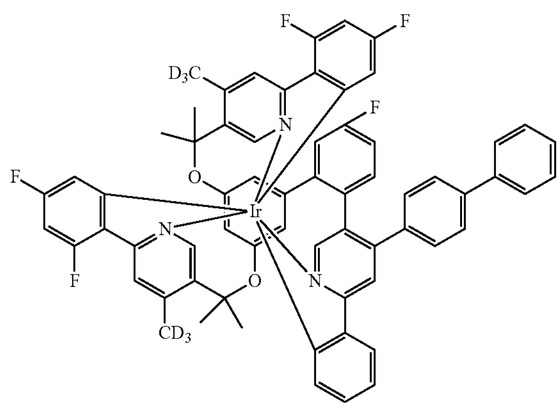
522
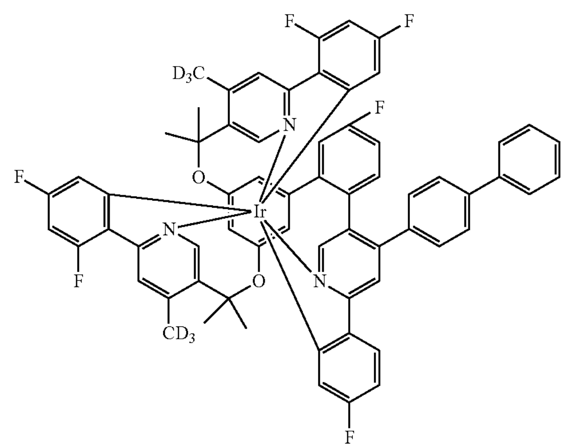
523
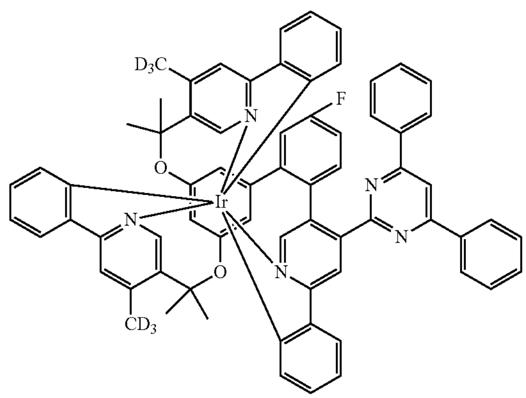
524
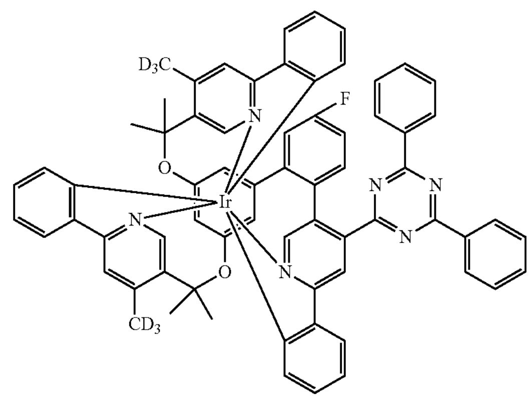

-continued
525
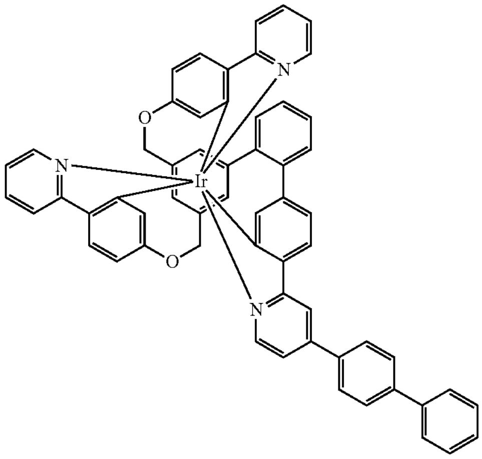
526
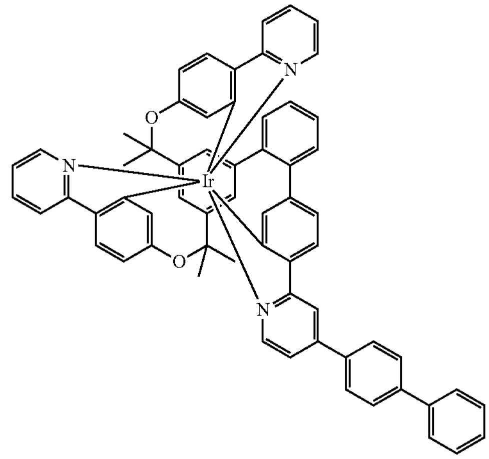
527
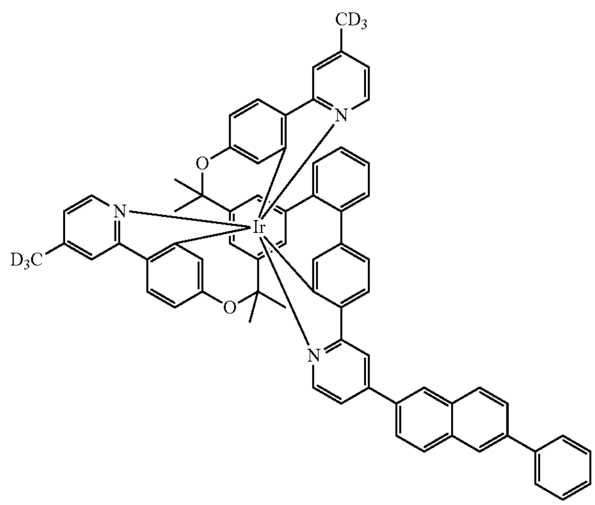
528
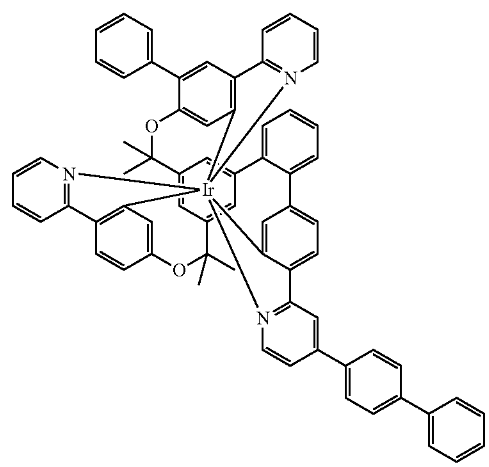
529
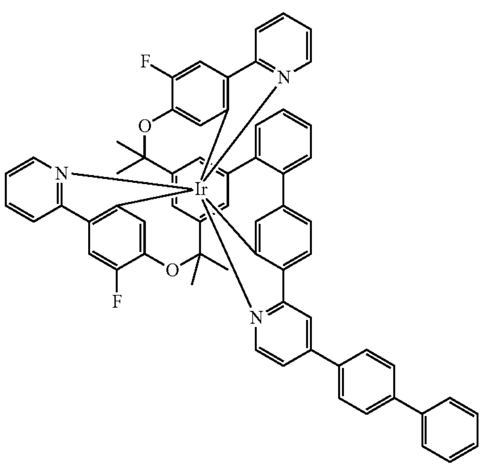
530
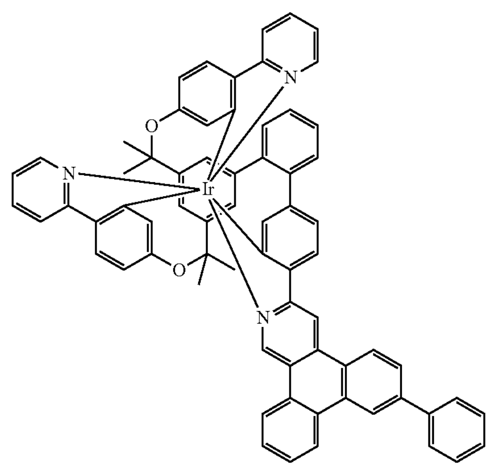

-continued
531
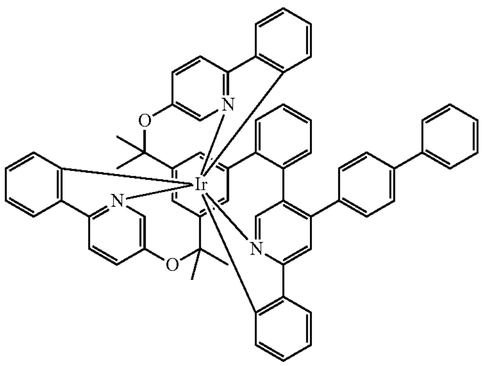
532
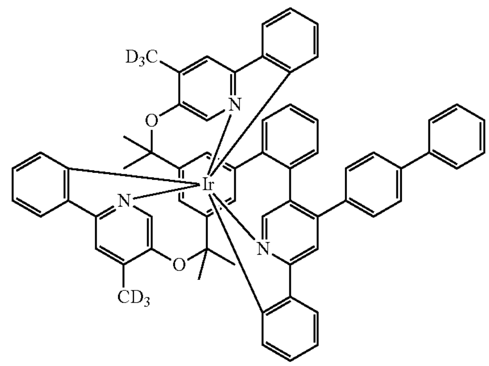
533
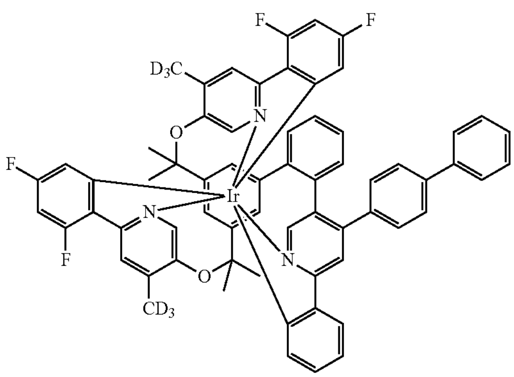
534
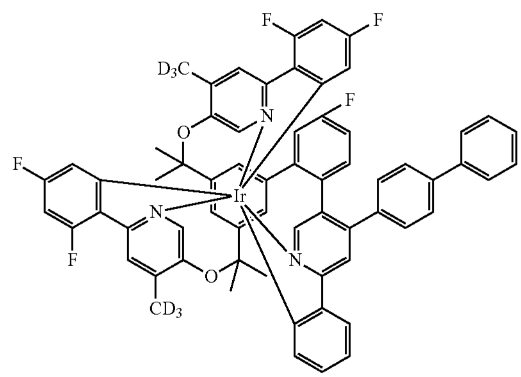
535
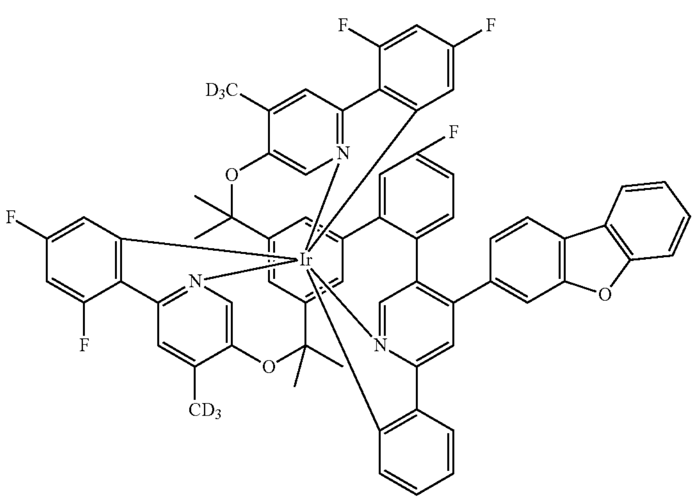

-continued
536
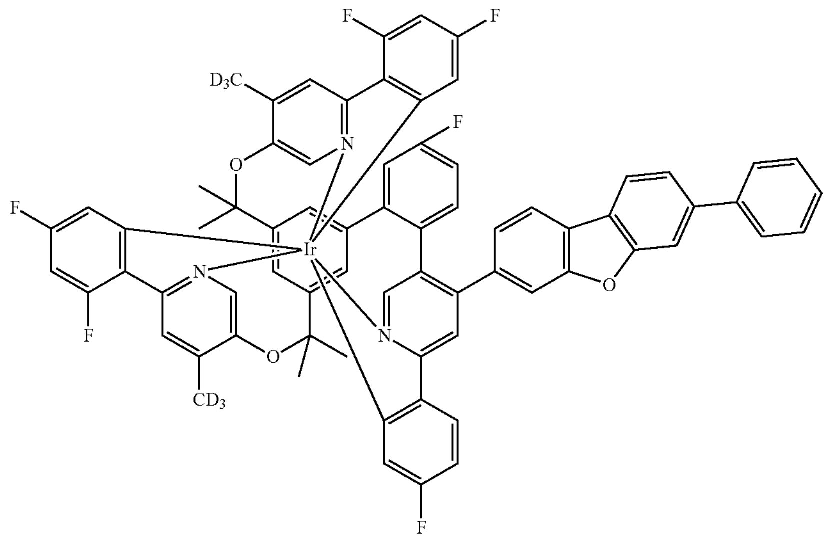
537
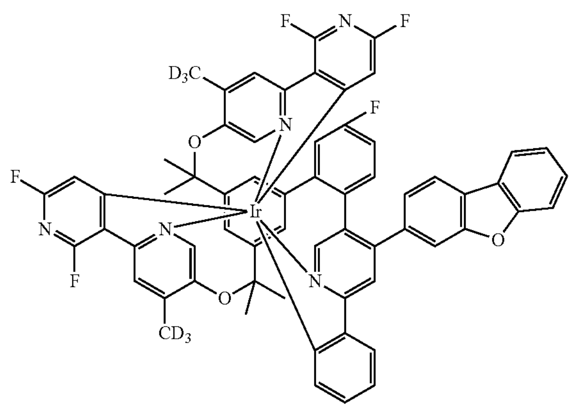
538
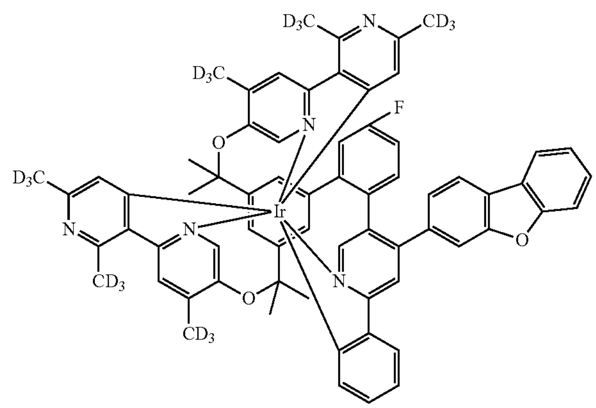
539
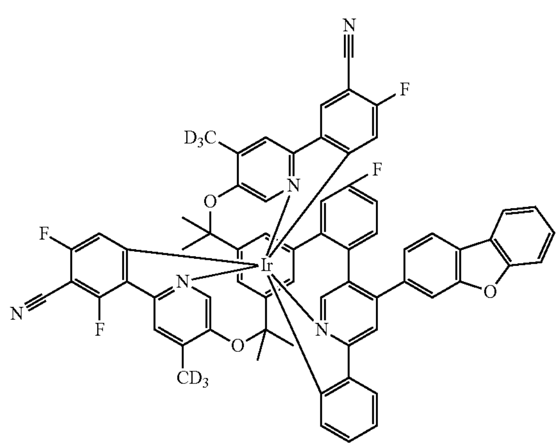
540
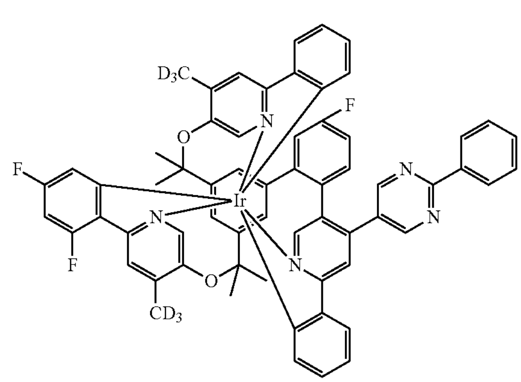

-continued
541
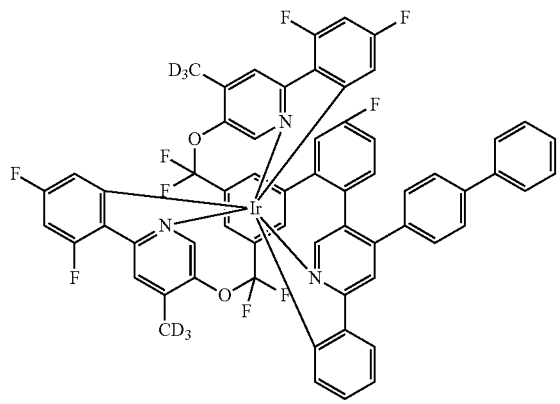
542
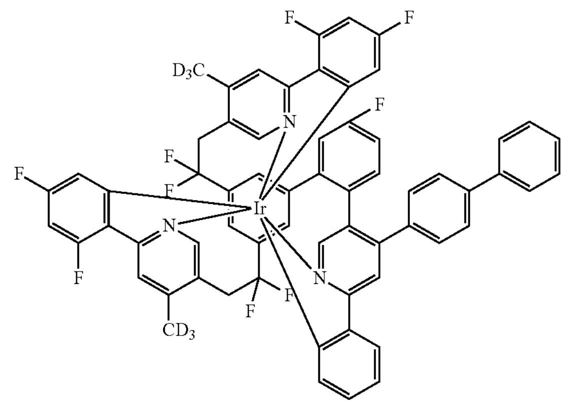
543
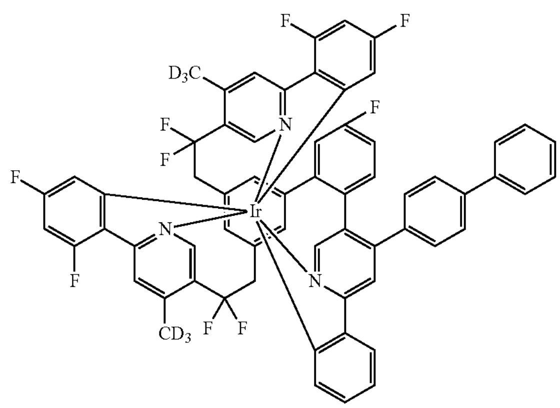
544
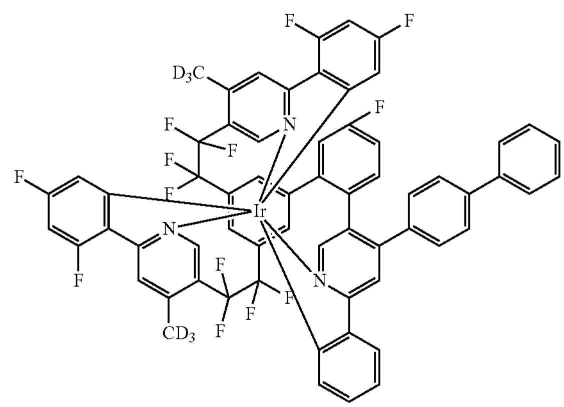
545
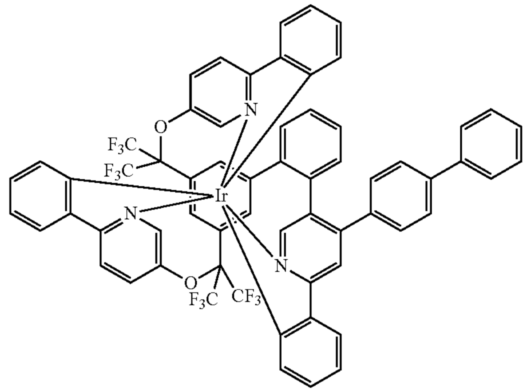
546
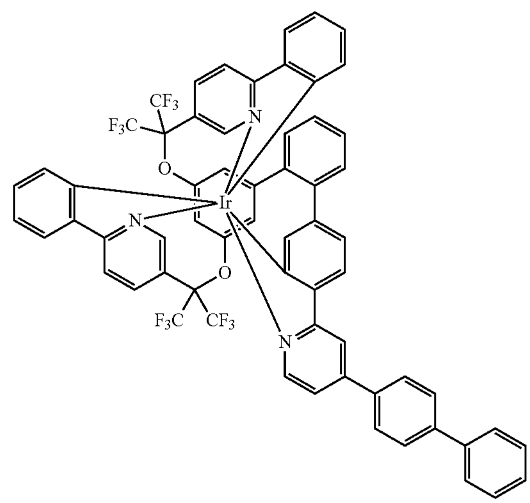

-continued
547
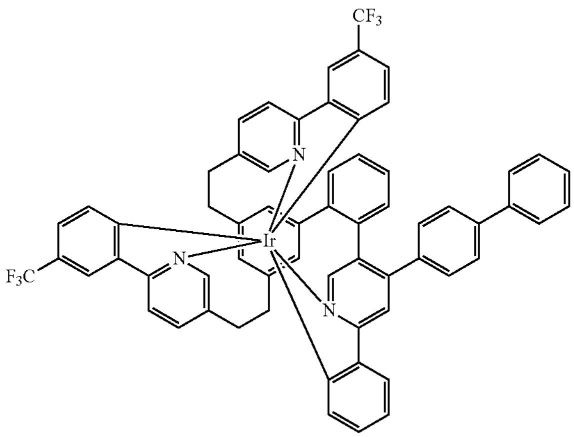
548
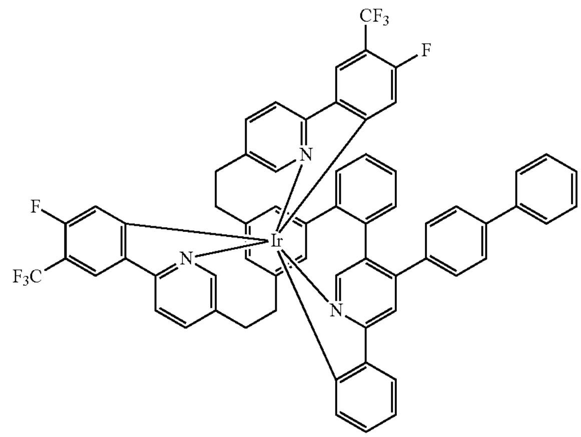
549
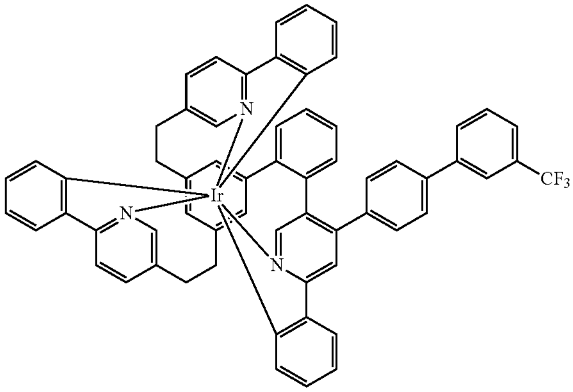
550
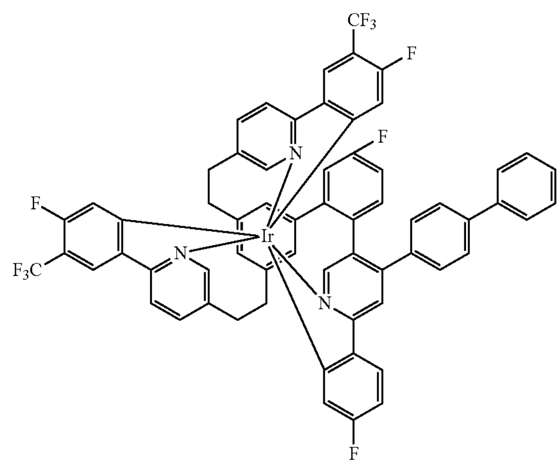
551
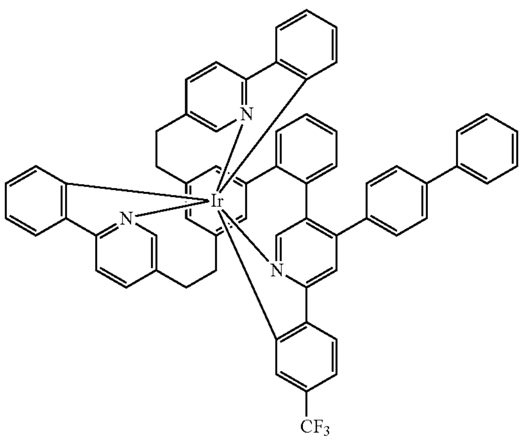
552
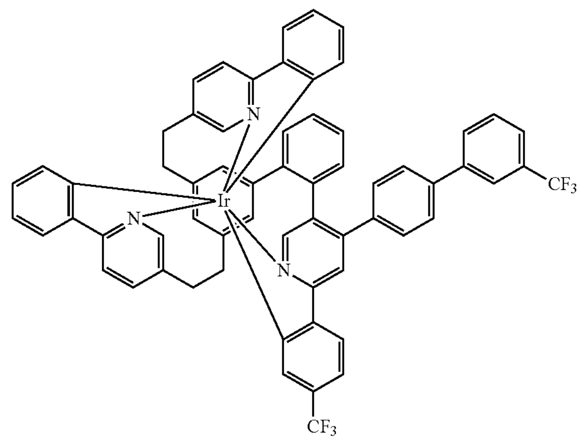

-continued
553
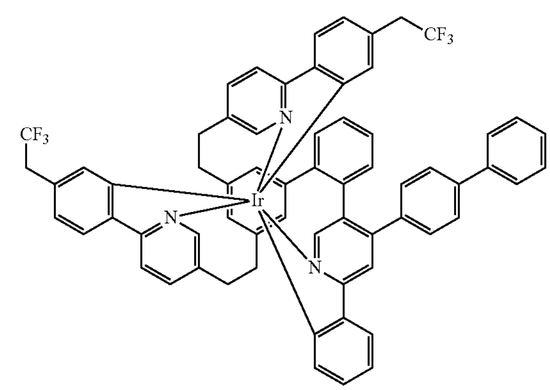
554
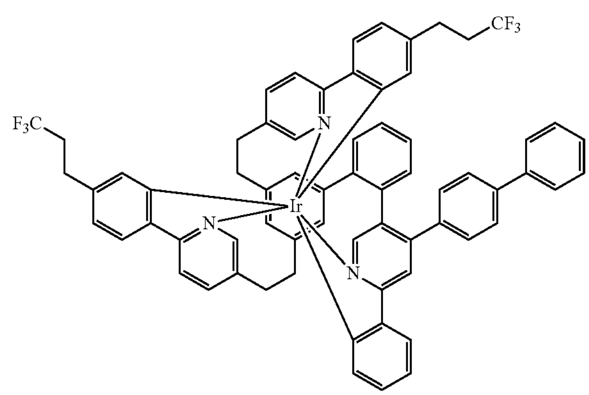
555
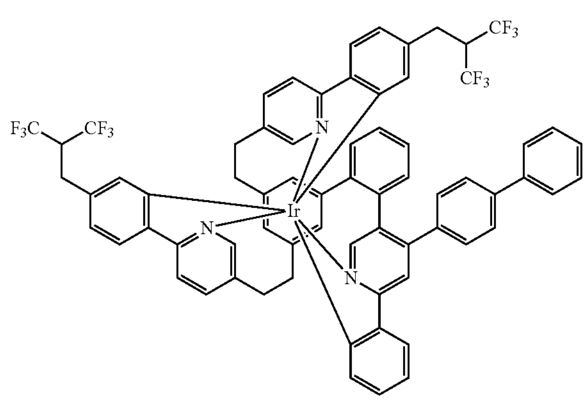
556
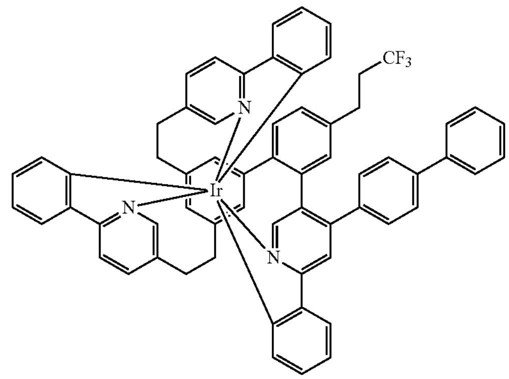
557
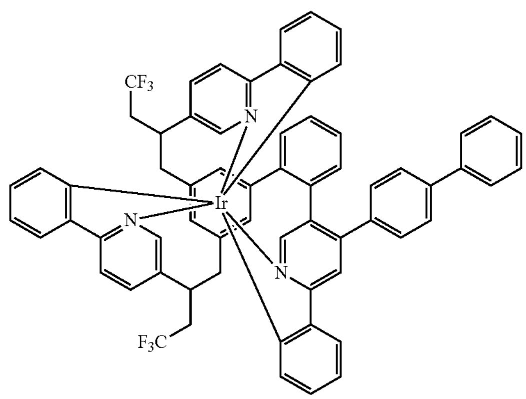
558
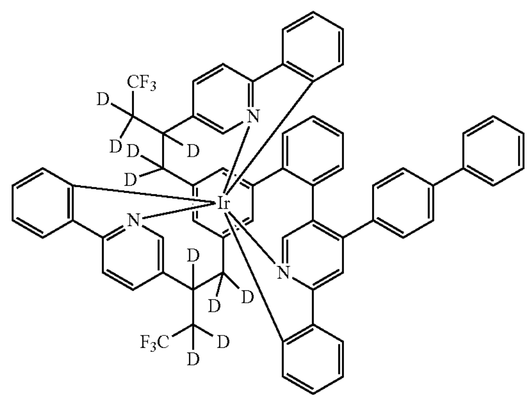
559
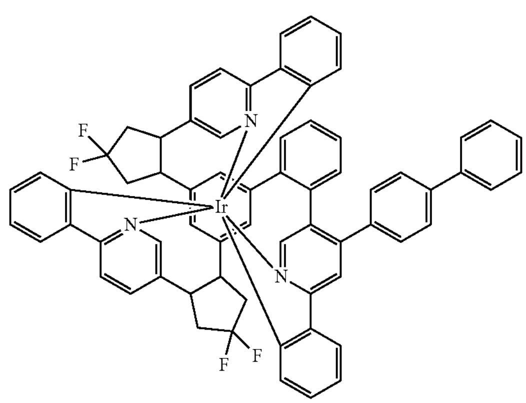
560
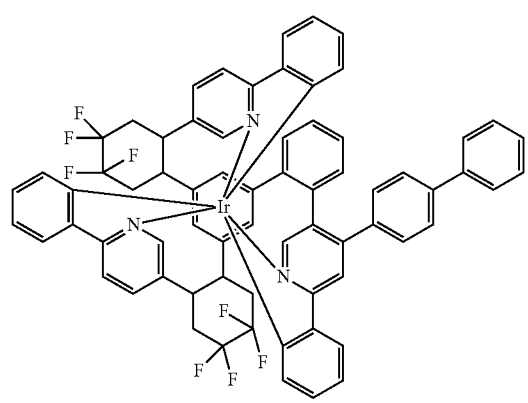

-continued
561
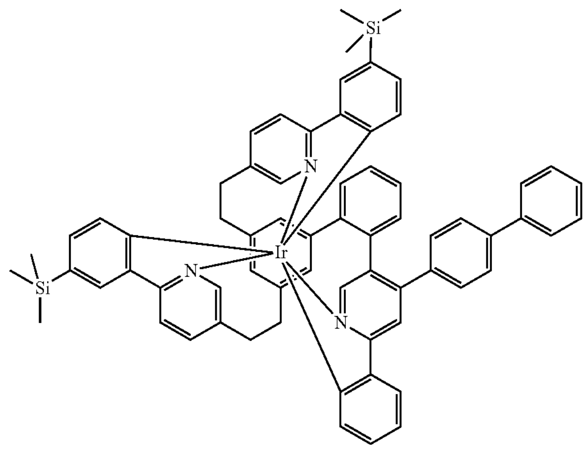
562
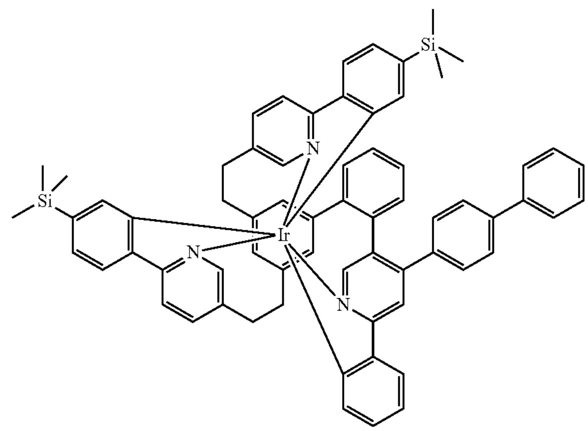
563
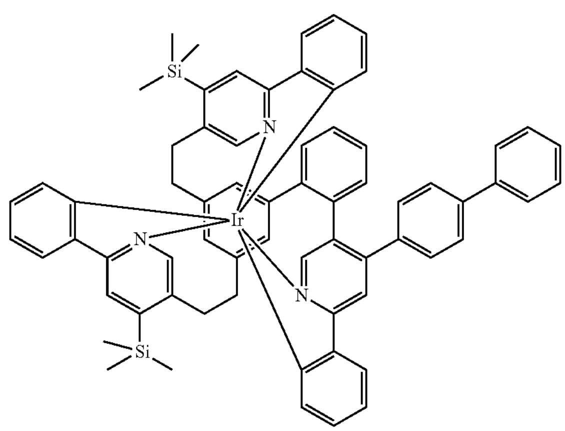
564
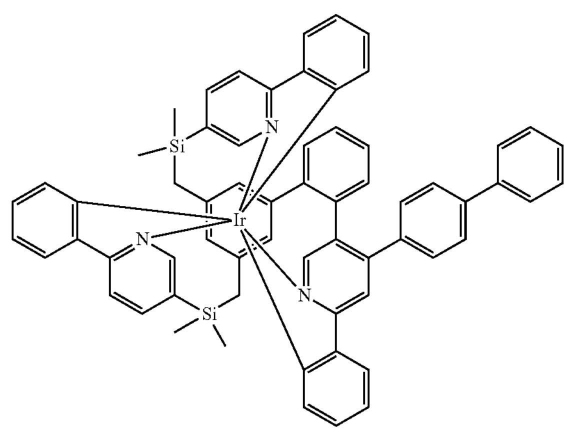
565
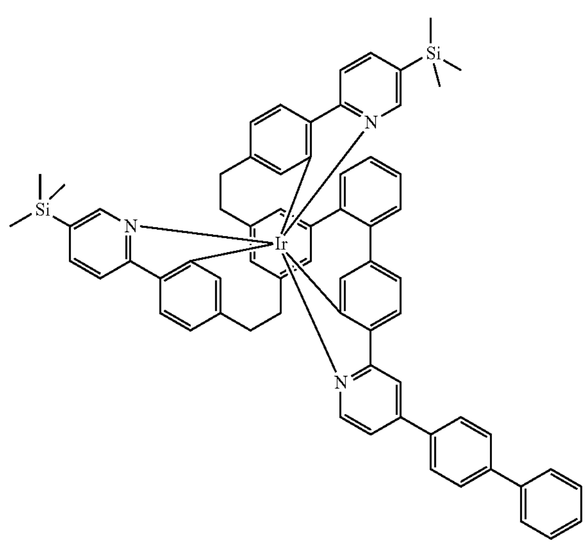
566
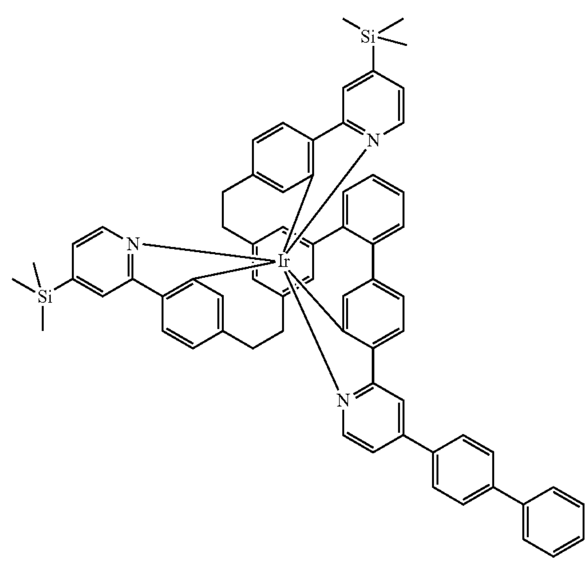

-continued
567
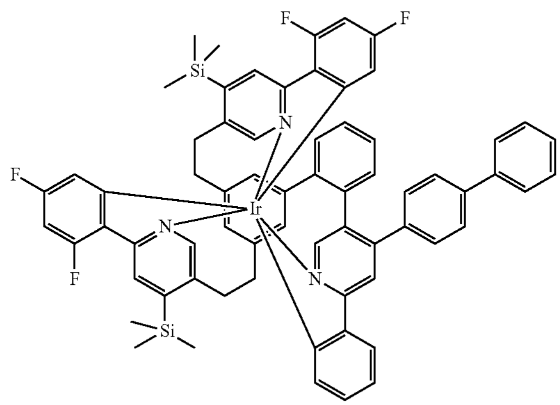
568
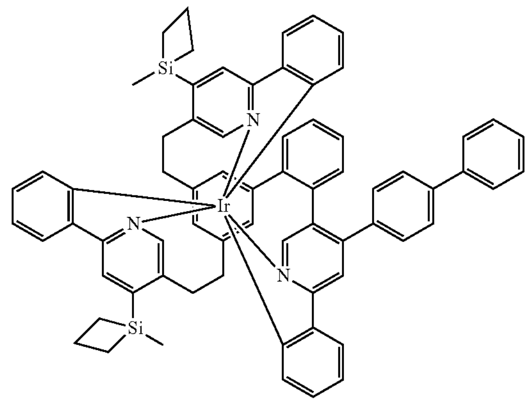
569
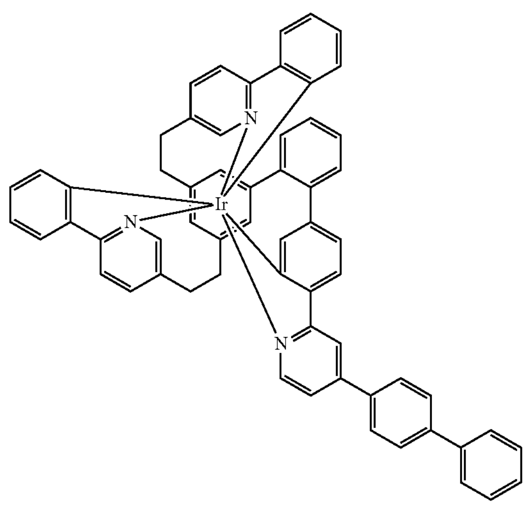
570
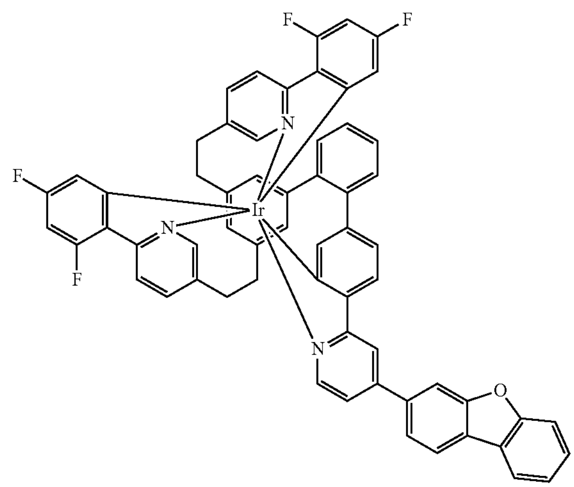
571
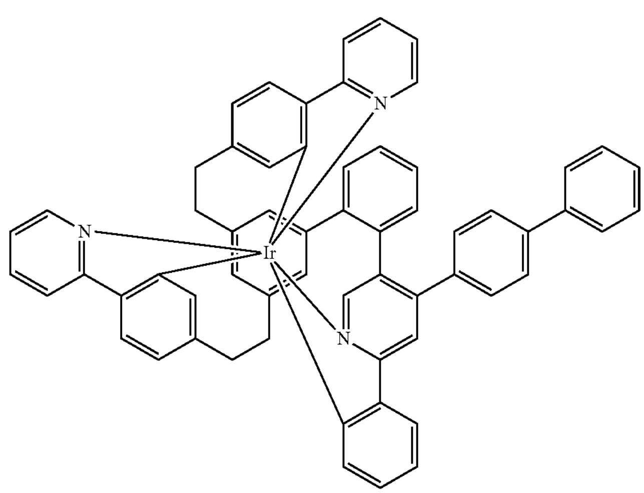

-continued
572
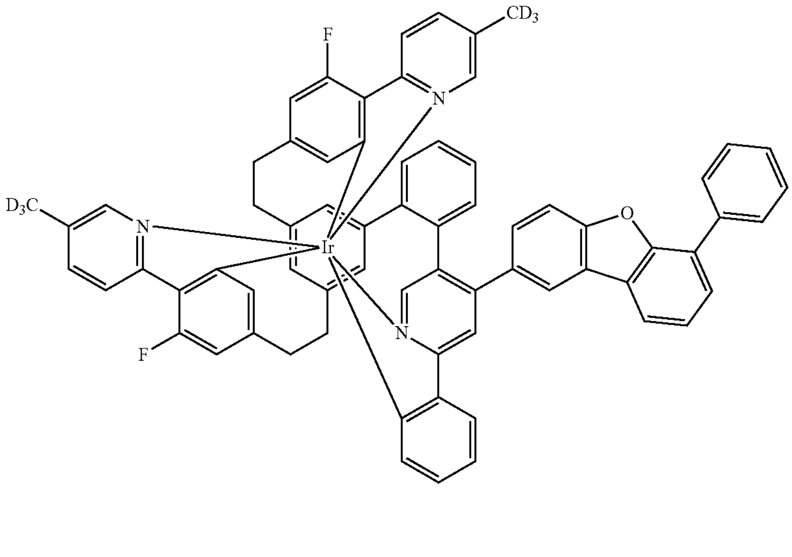
573
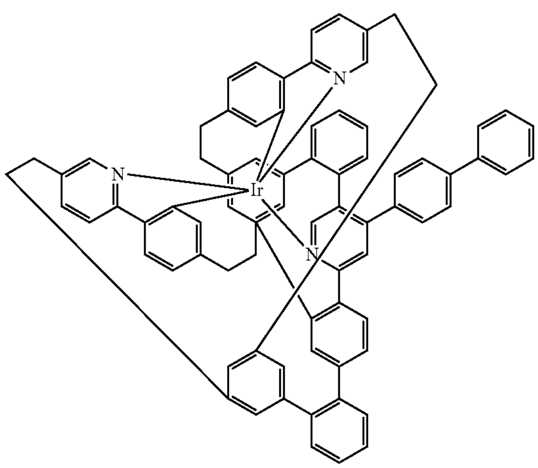
574
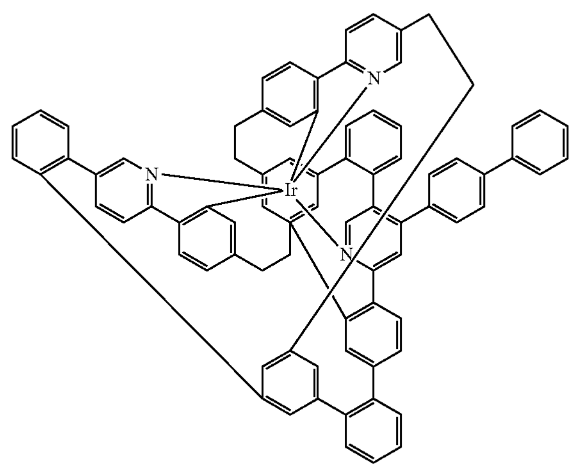
575
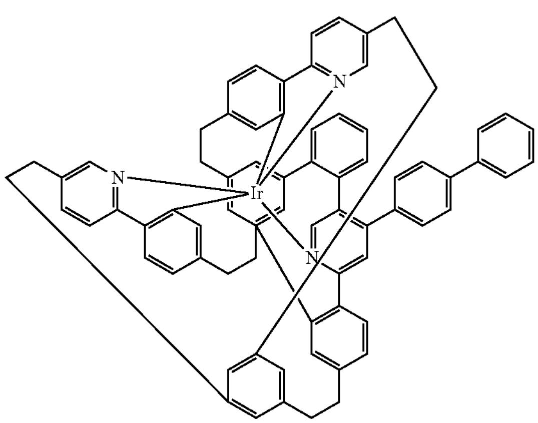
576
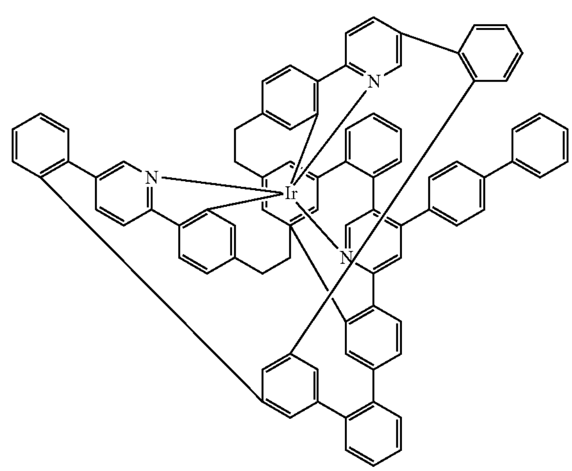

577
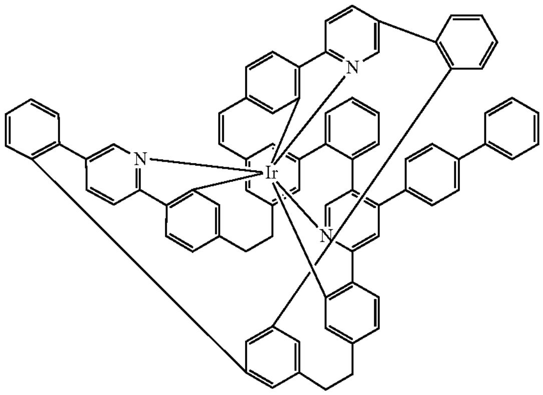
578
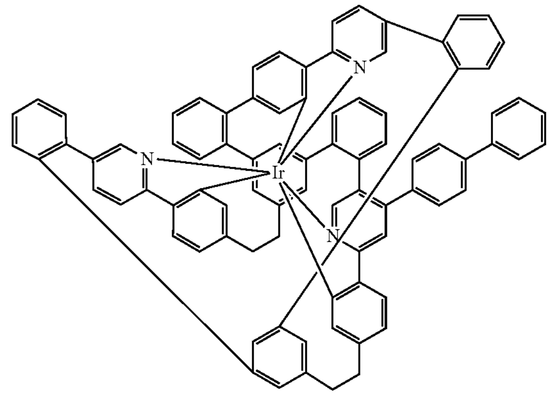
579
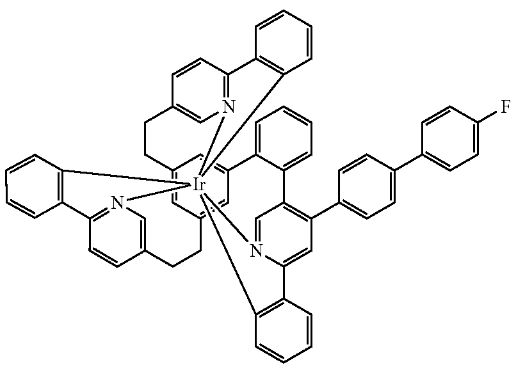
580
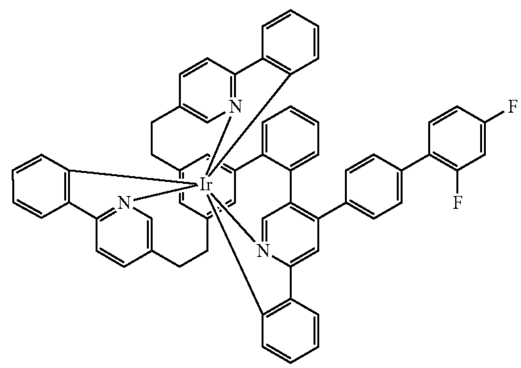
581
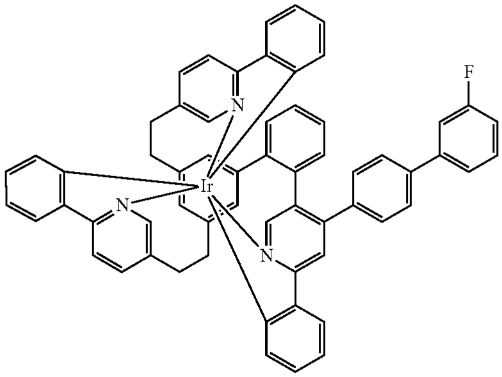
582
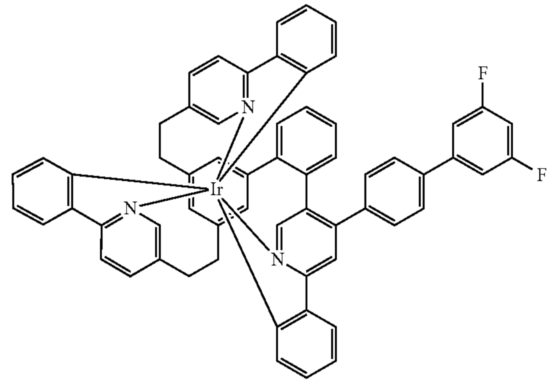
583
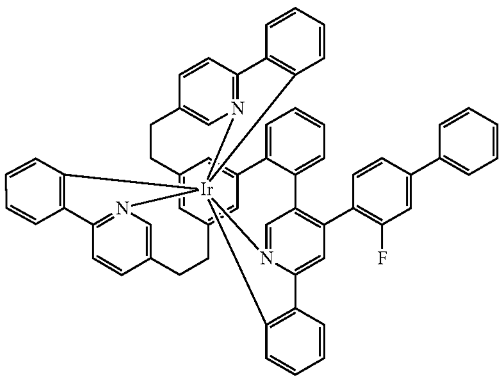
584
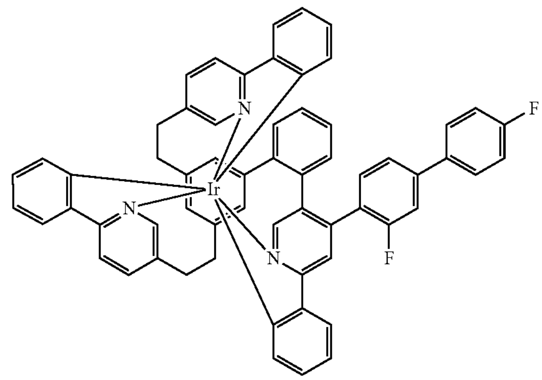

-continued
585
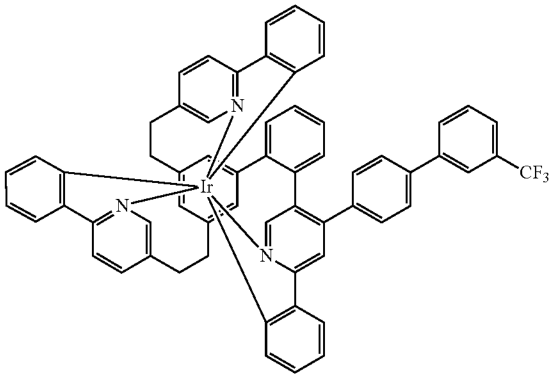
586
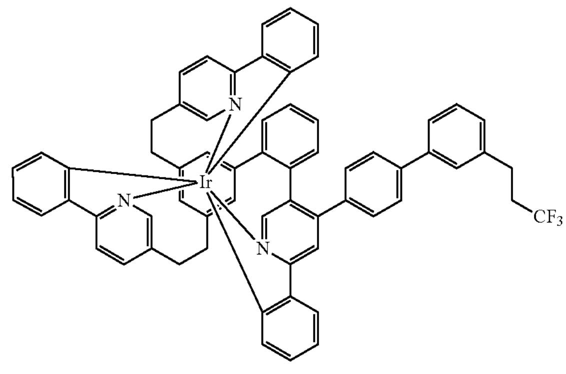
587
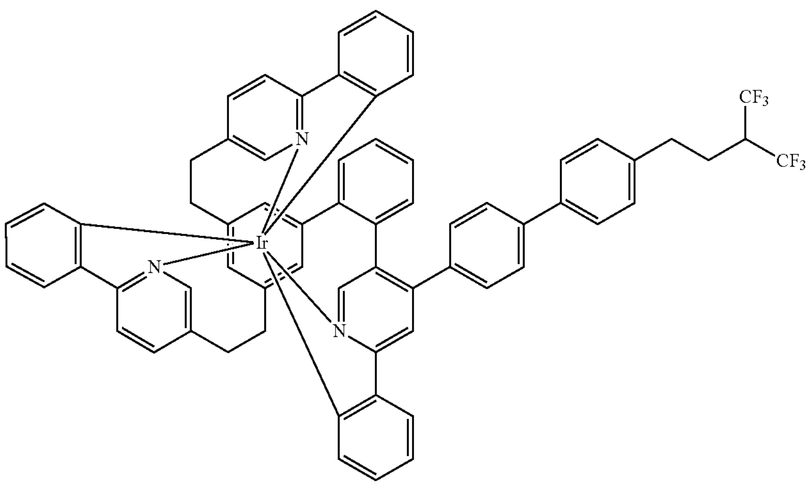
588
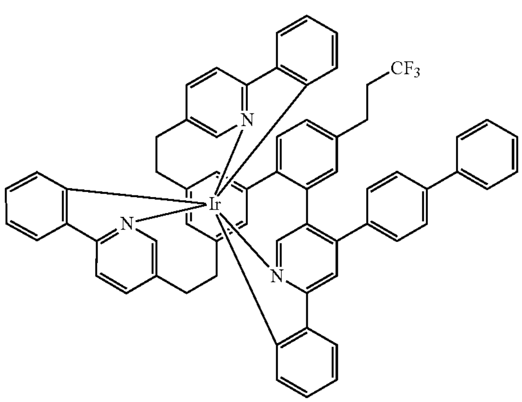
589
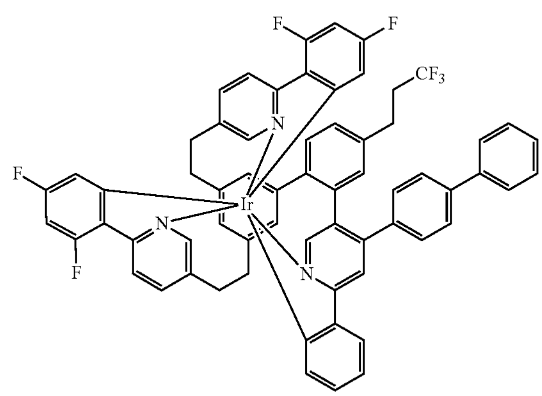
590
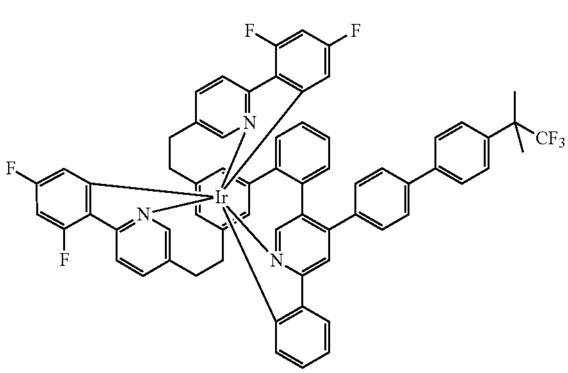
591
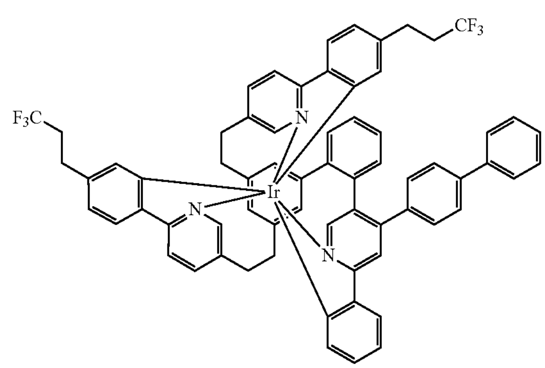

-continued
592
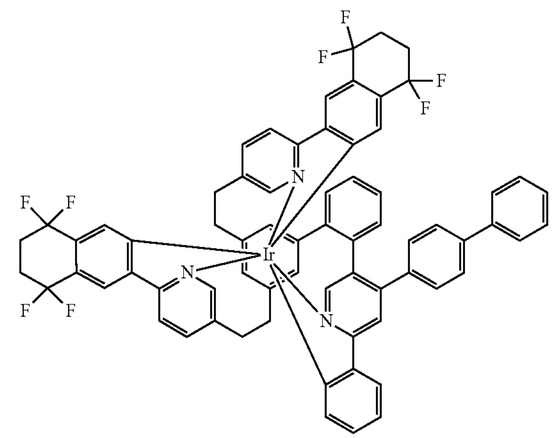
593
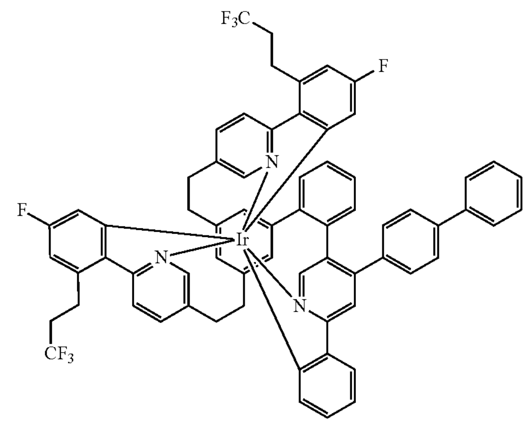
594
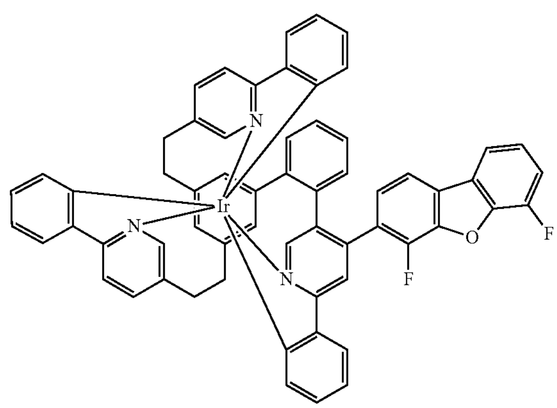
595
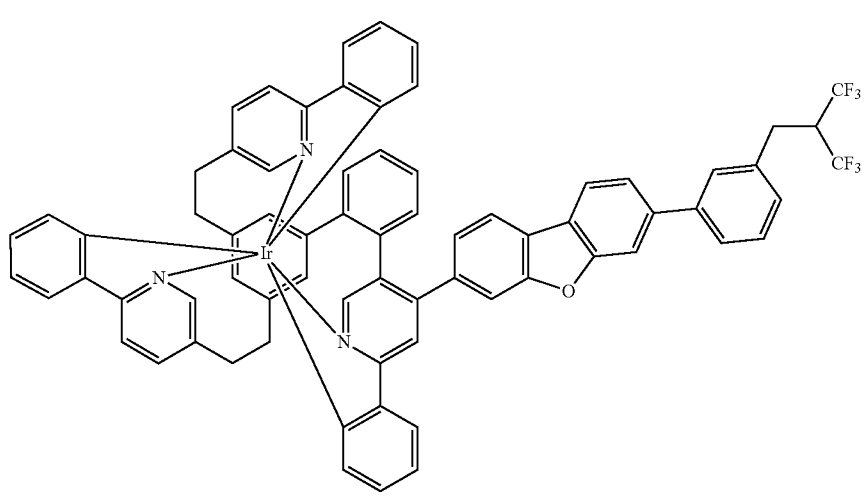

-continued
596
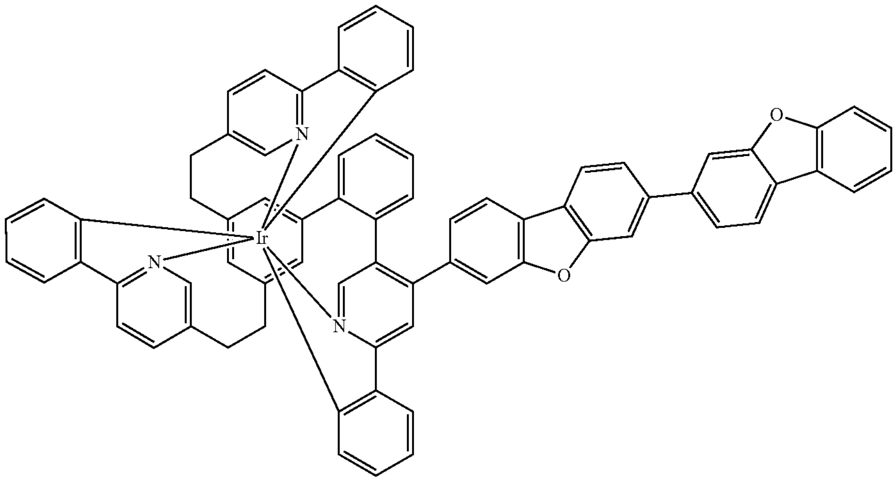
597
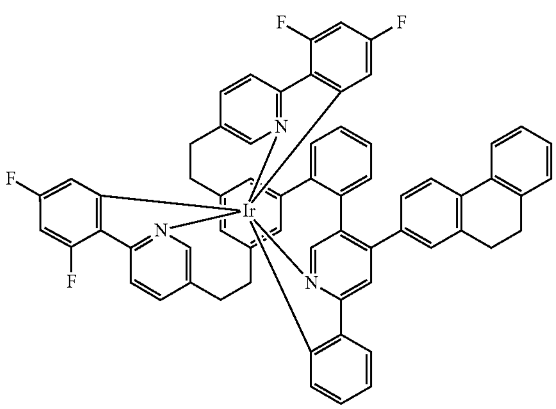
598
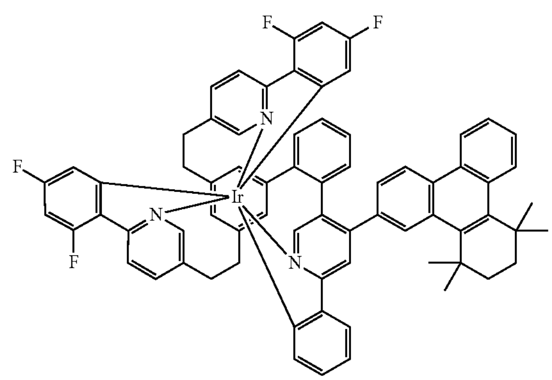
599
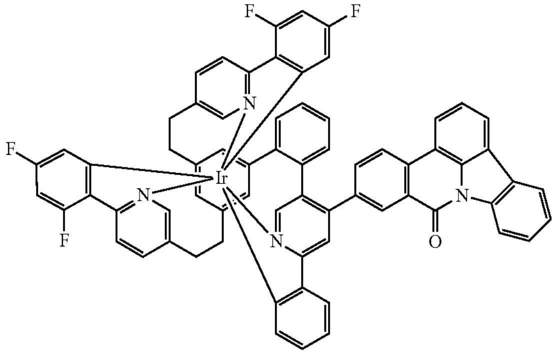

-continued
600
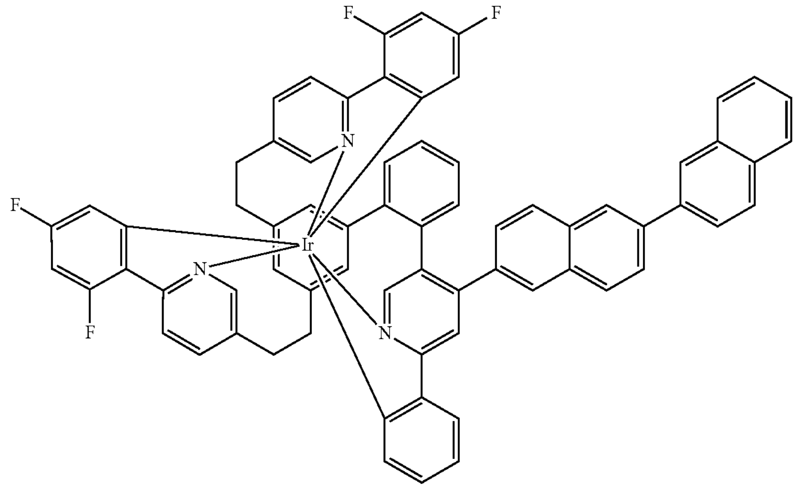
601
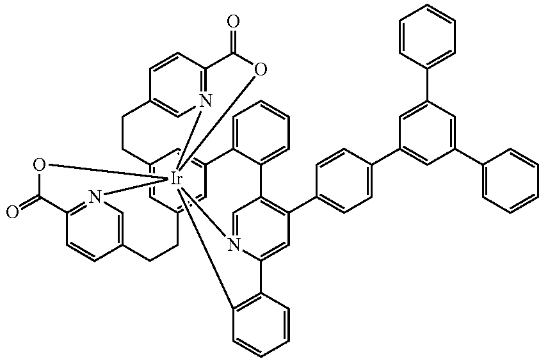
602
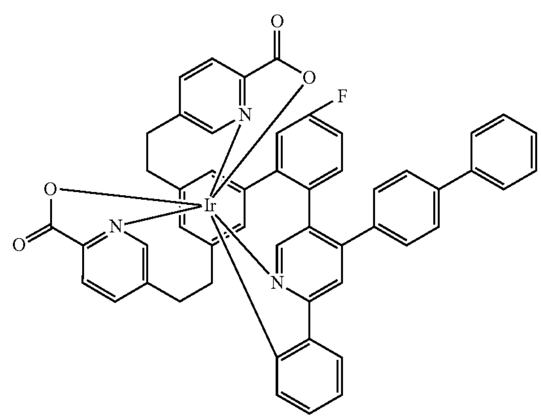
603
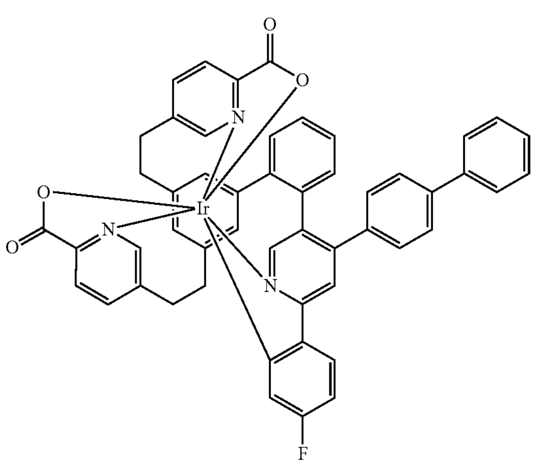
604
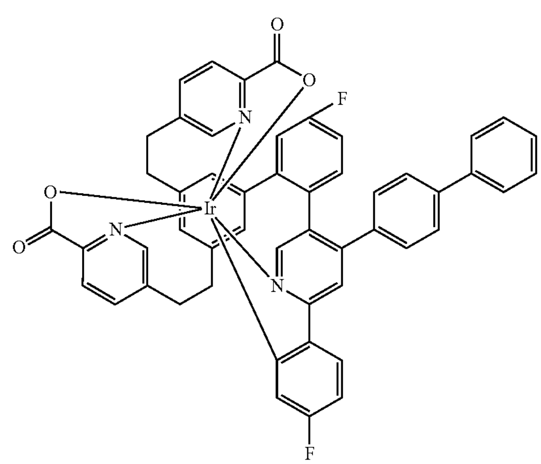

-continued
605
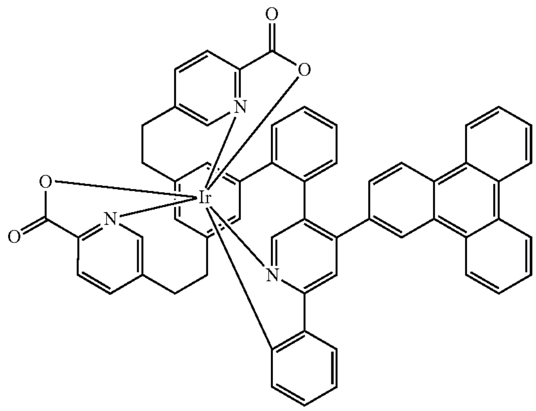
606
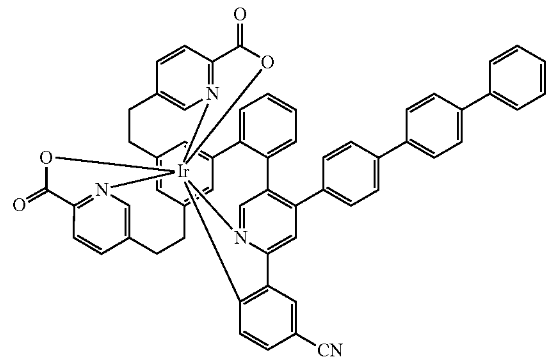
607
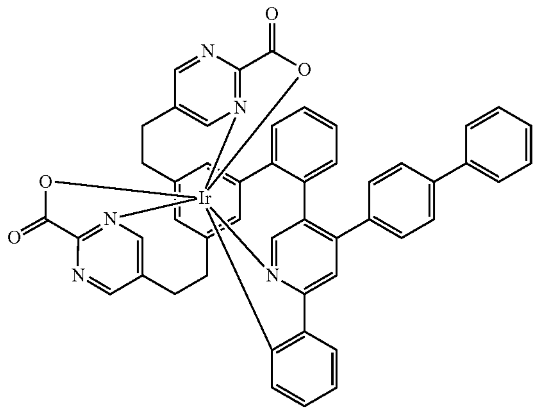
608
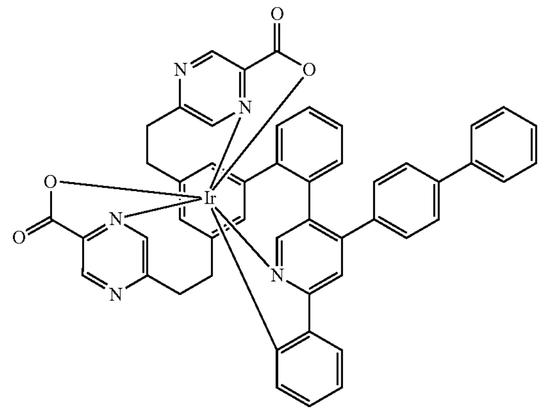
609
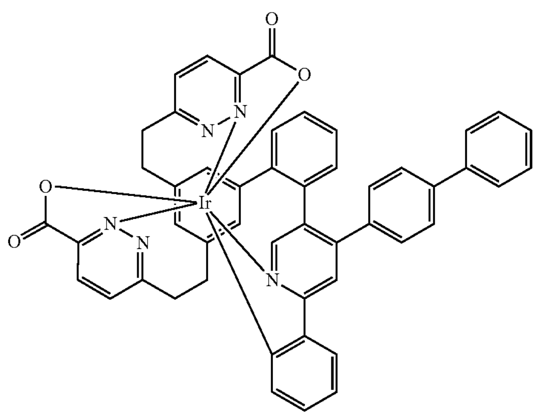
610
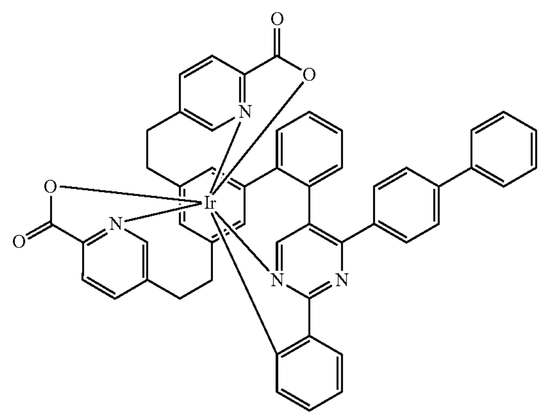
611
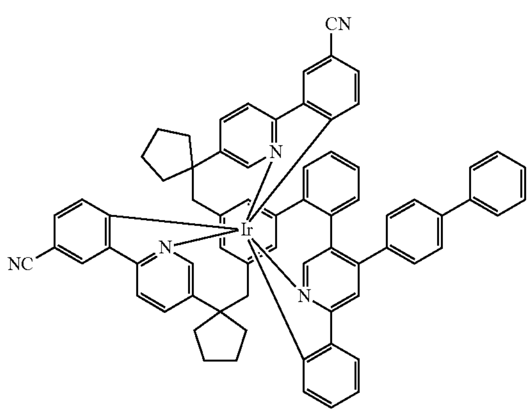
612
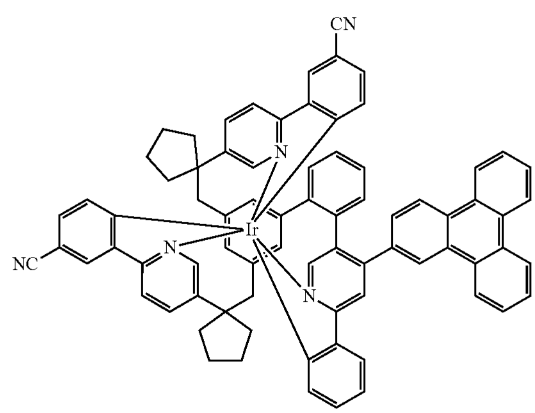

-continued
613
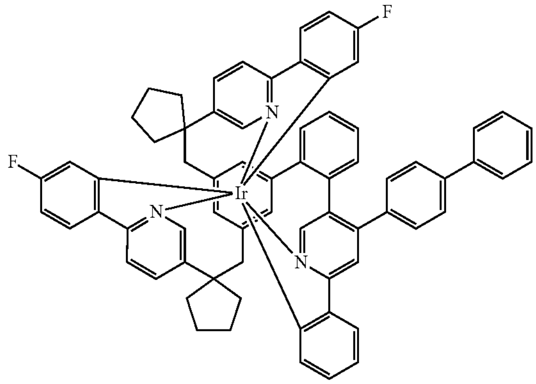
614
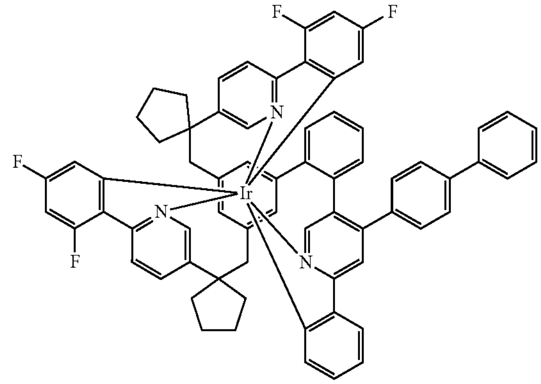
615
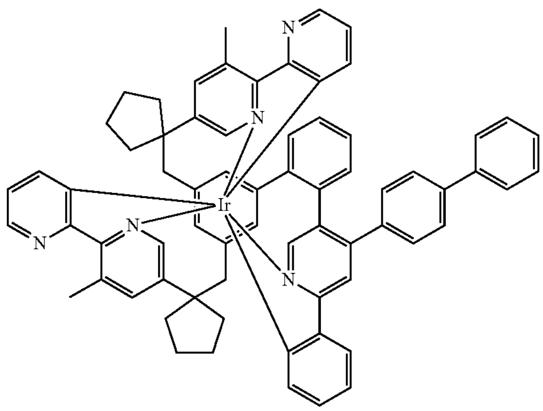
616
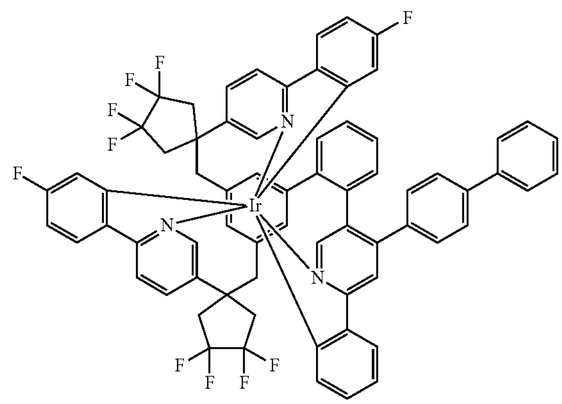
617
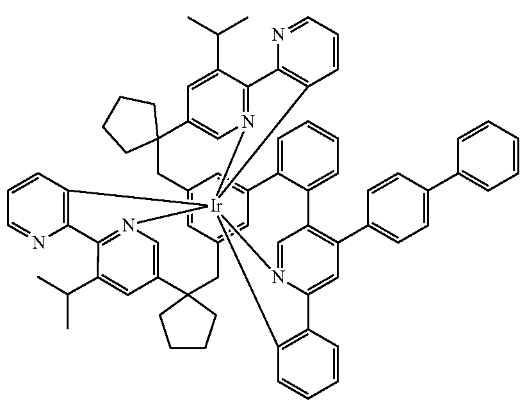
618
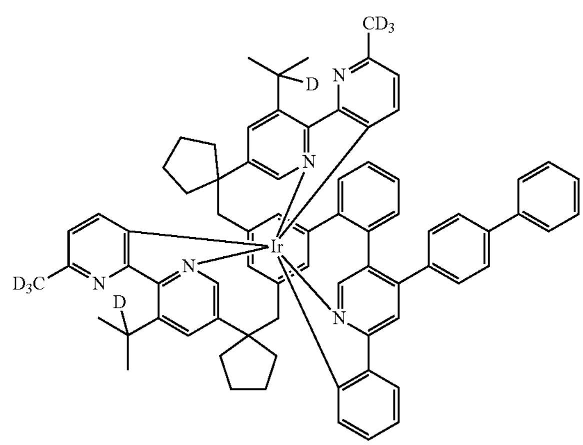

-continued
619
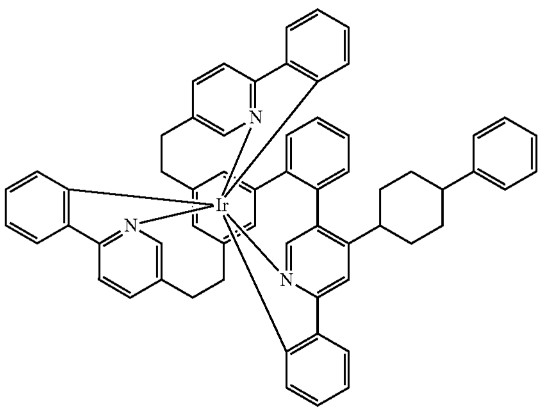
620
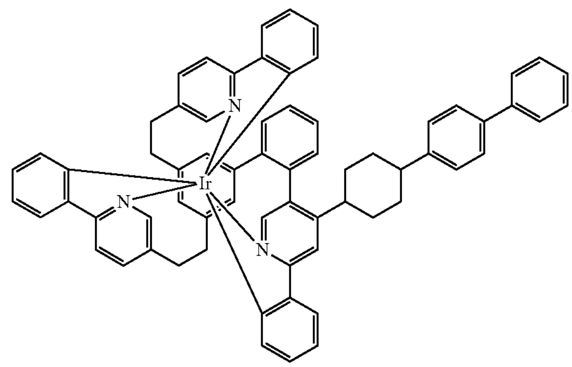
622
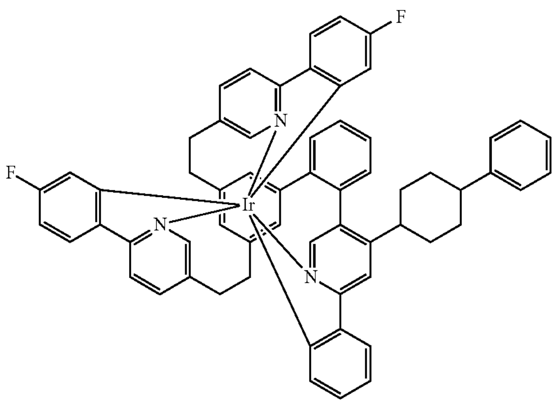
623
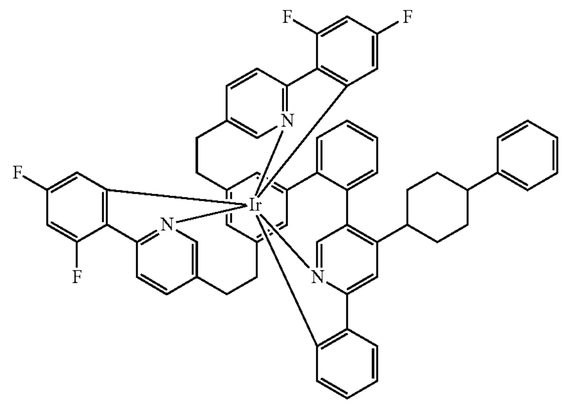
624
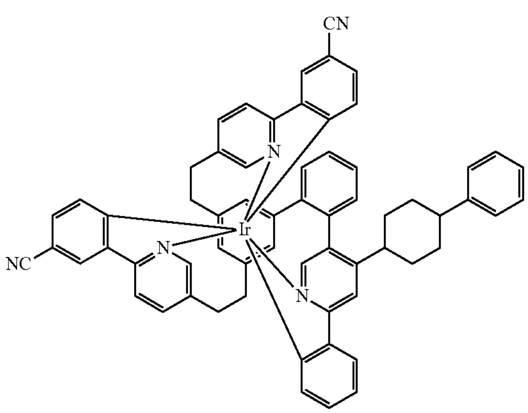
625
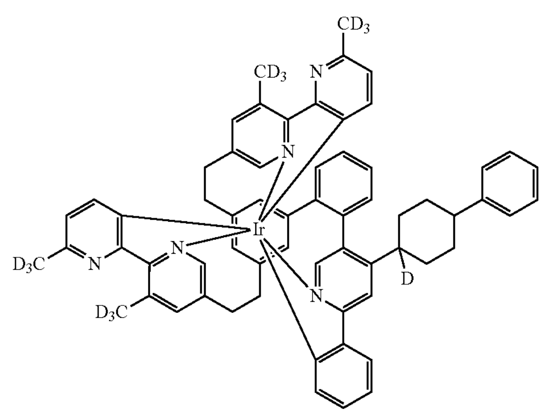
626
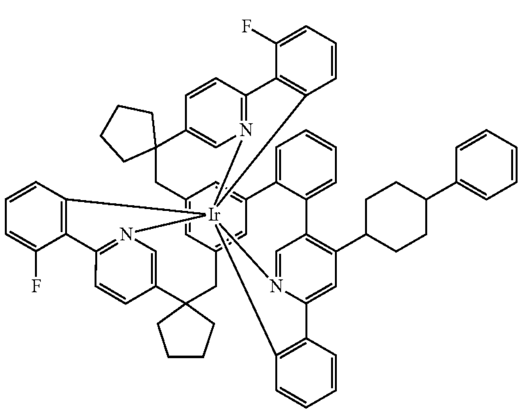
627
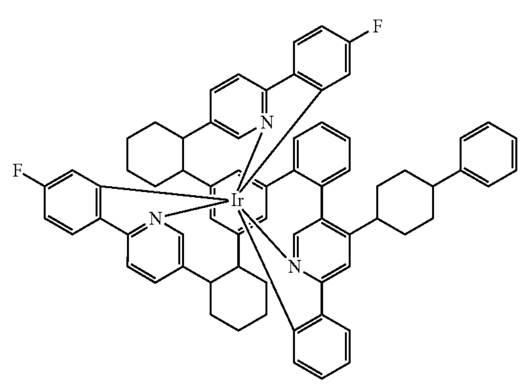

-continued
628
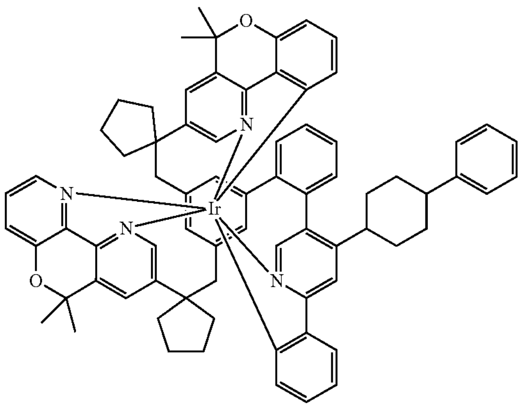
629
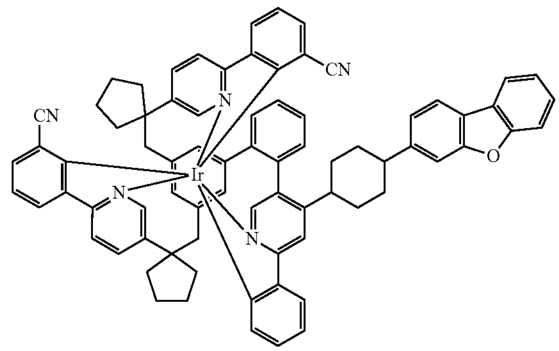
630
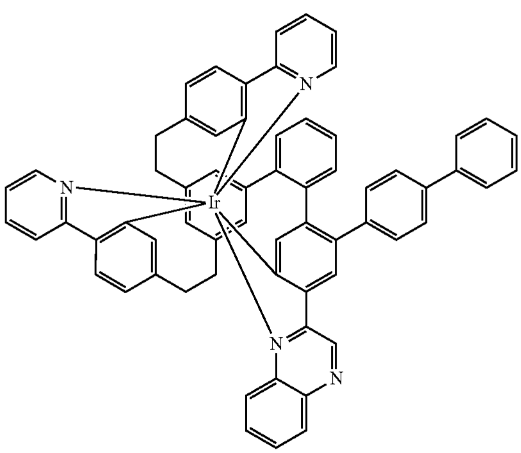
631
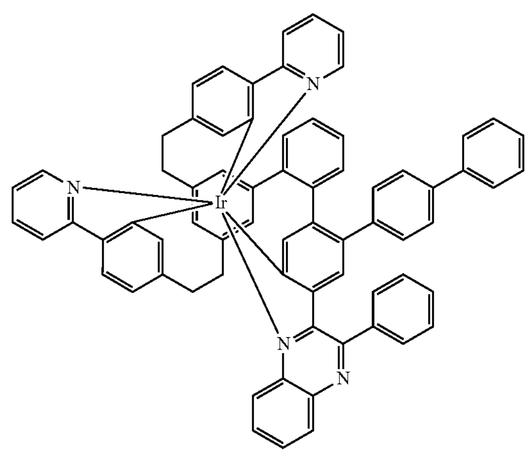
632
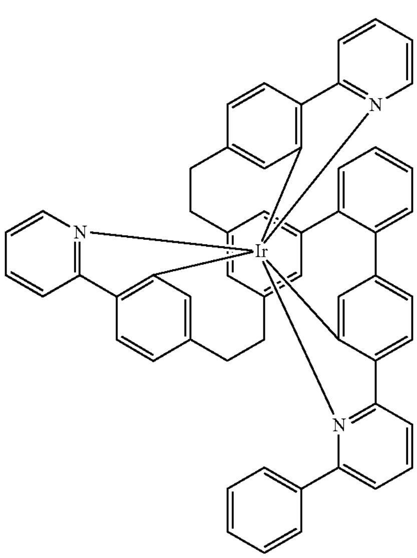
633
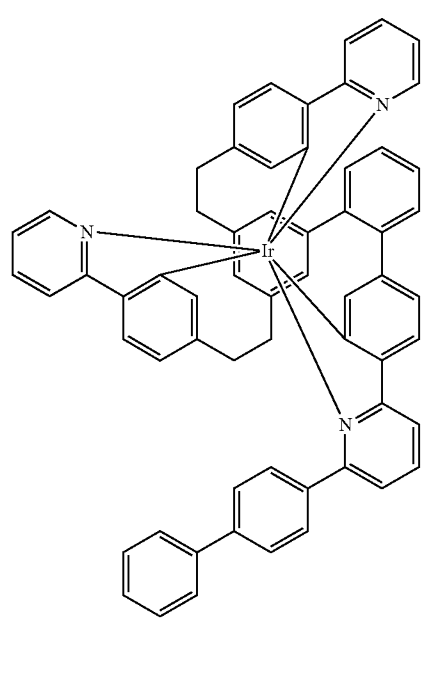

-continued
634
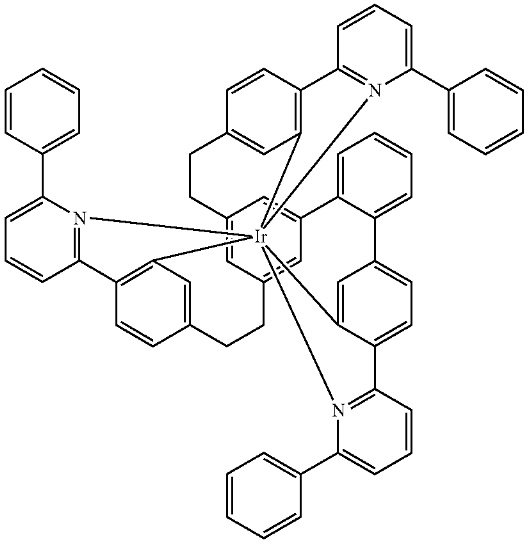
635
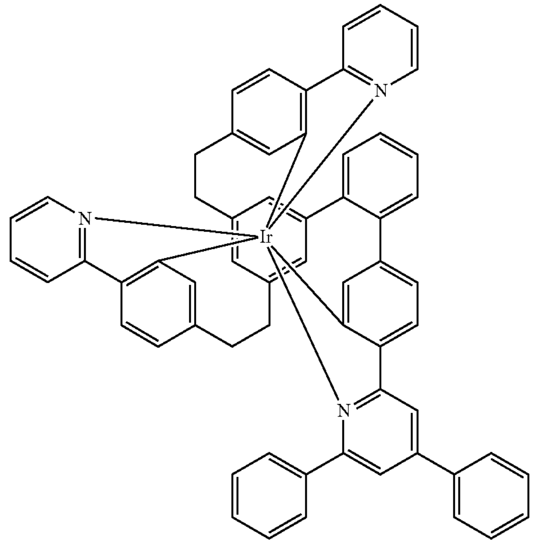
636
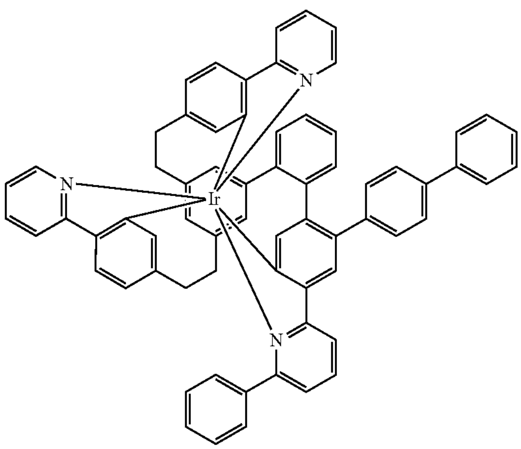
637
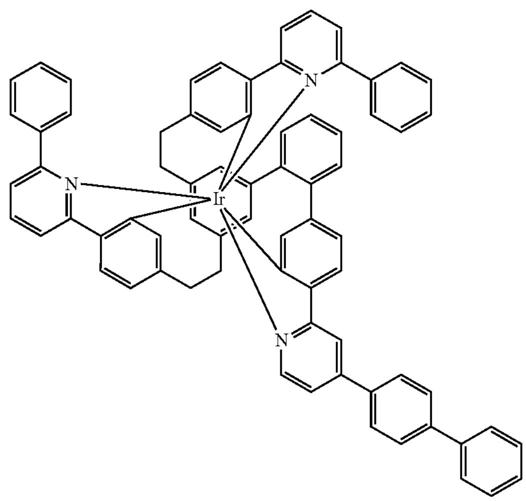
638
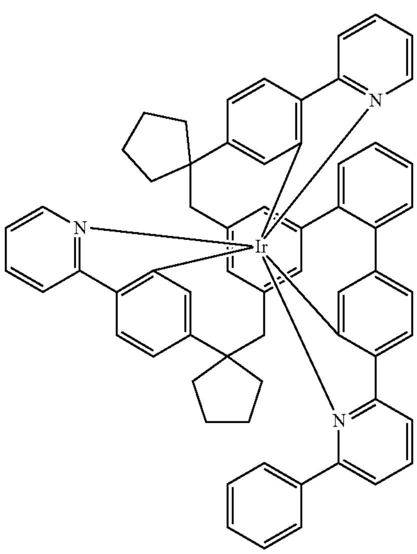
639
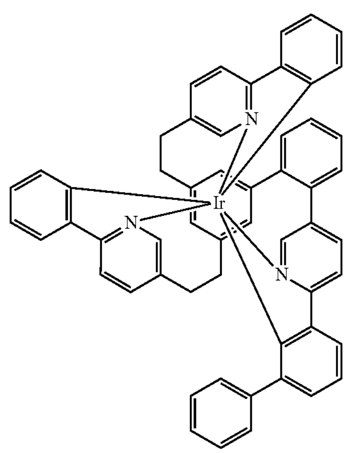

-continued
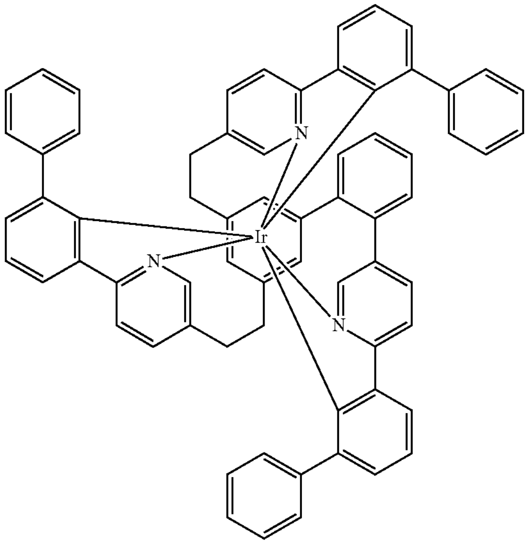
641
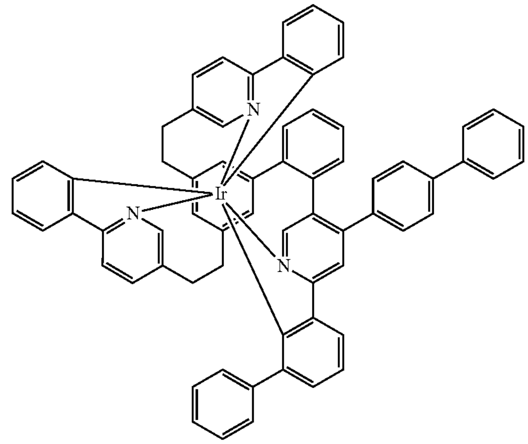
642
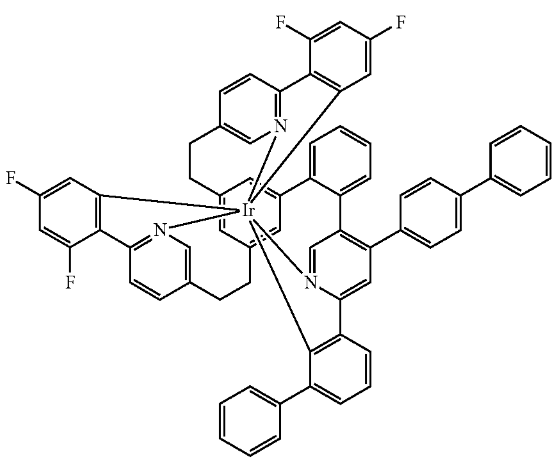
643
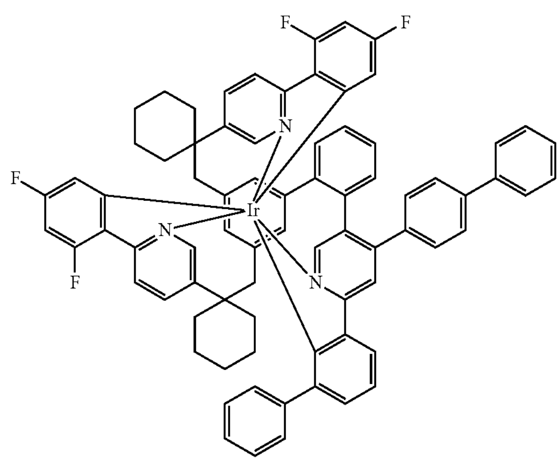
654
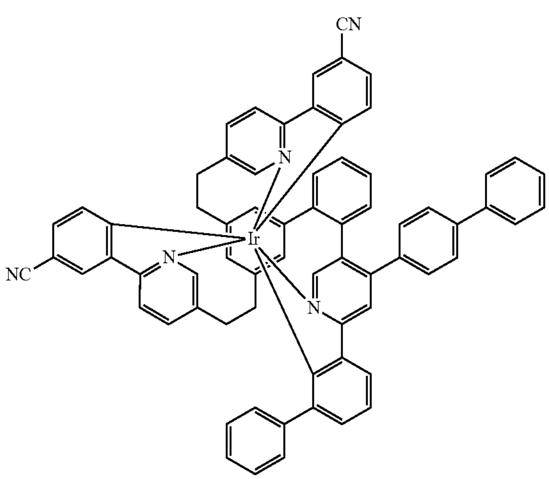
646
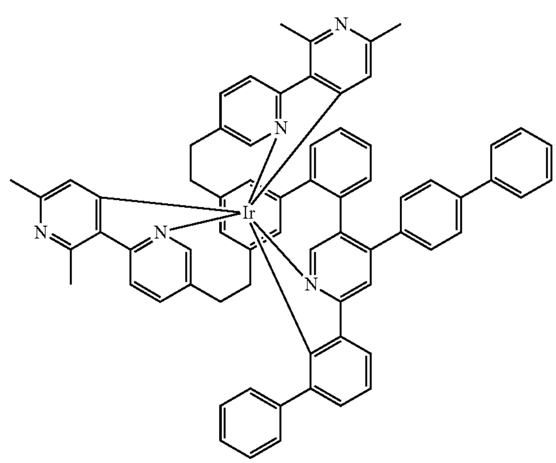

-continued
647
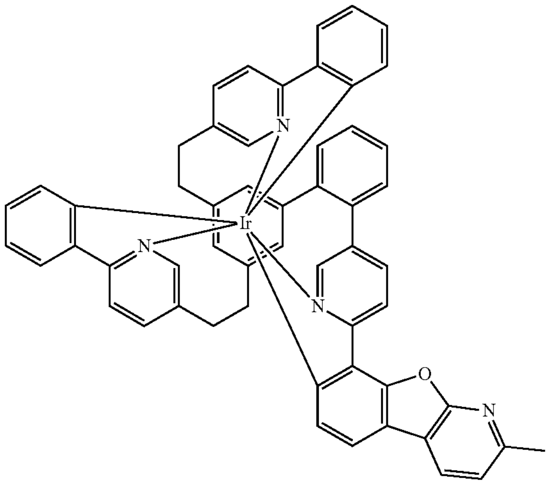
648
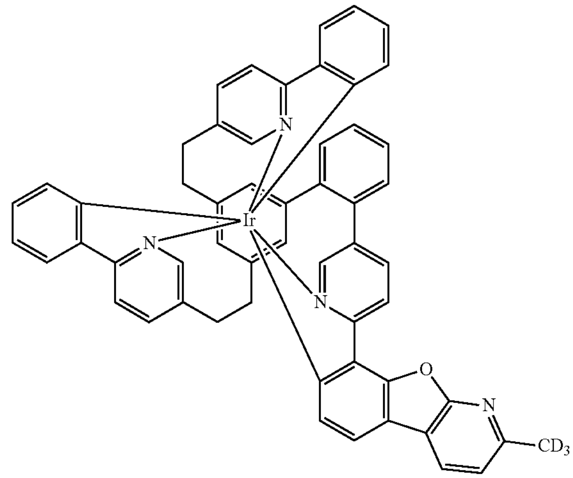
649
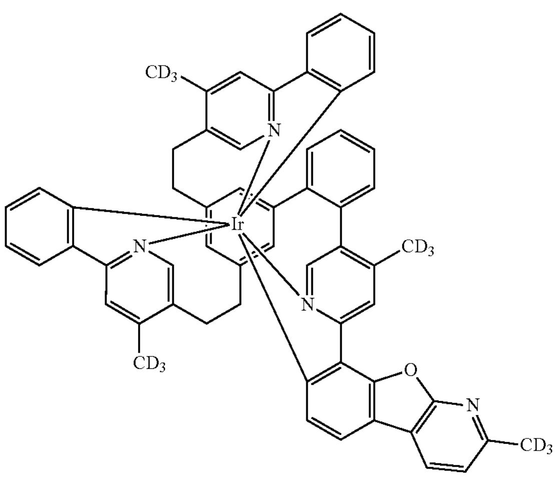
650
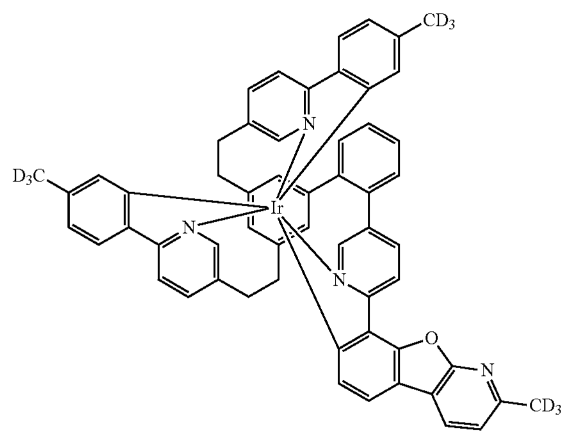
651
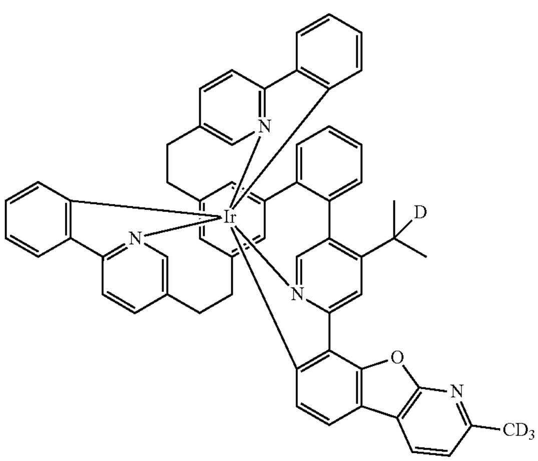
652
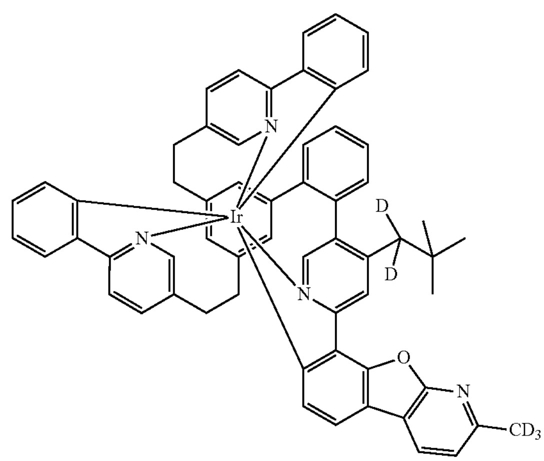

-continued
653
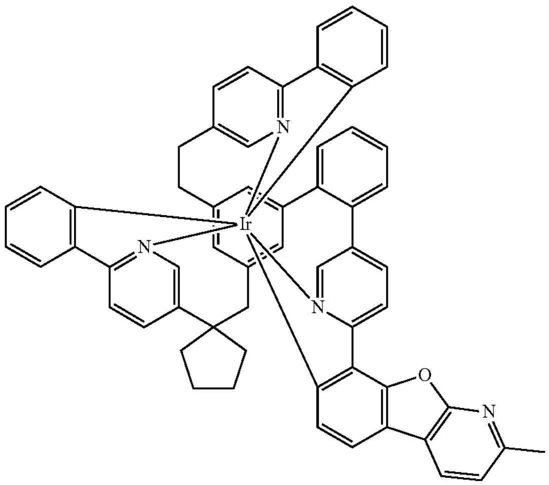
654
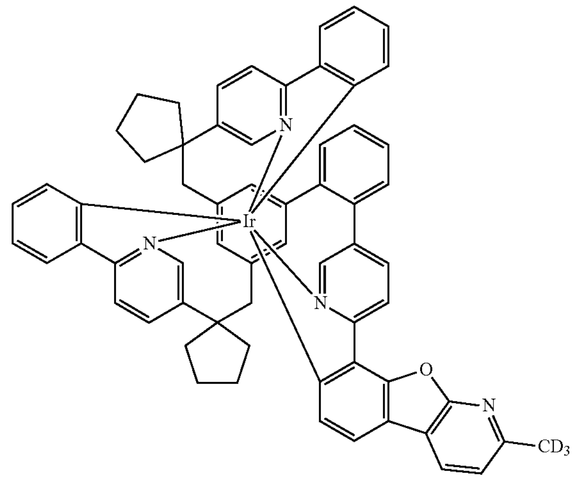
655
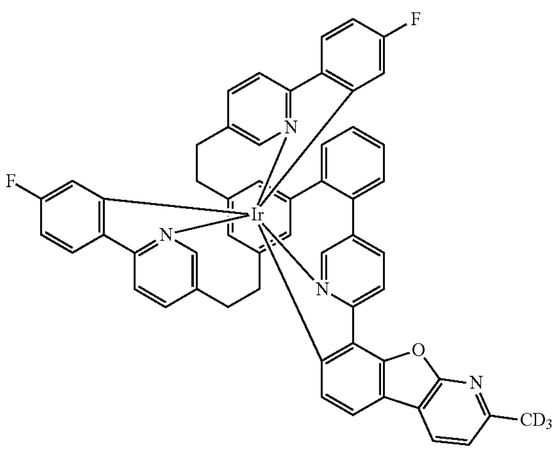
656
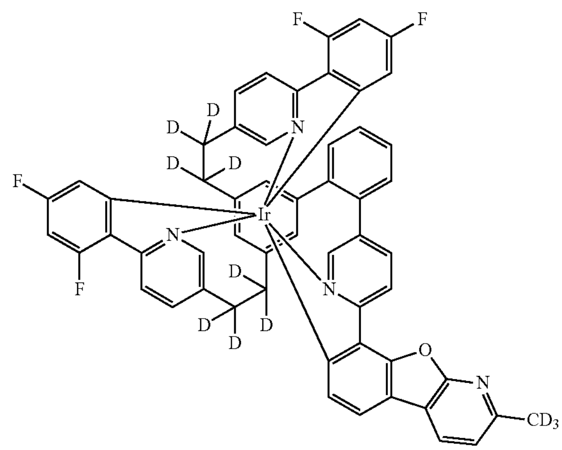
657
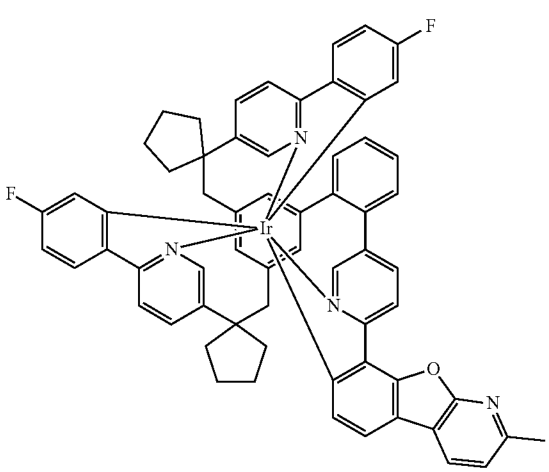
658
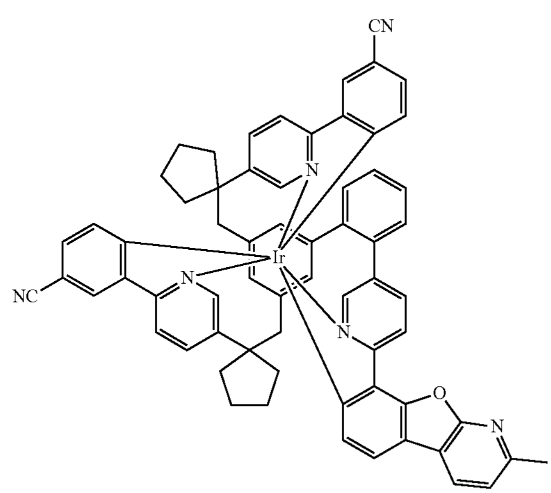

-continued
659
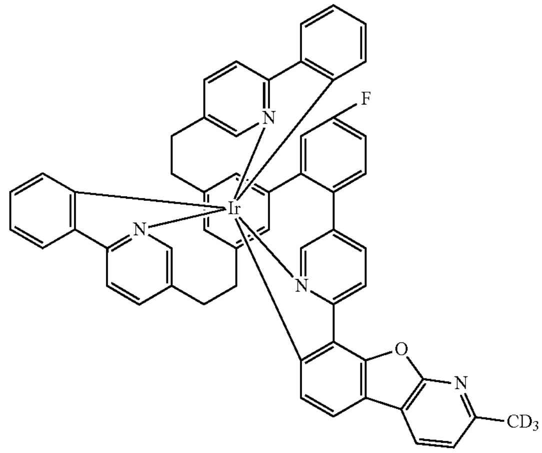
660
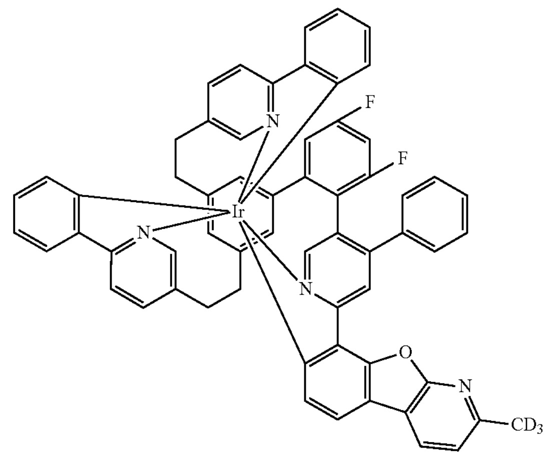
661
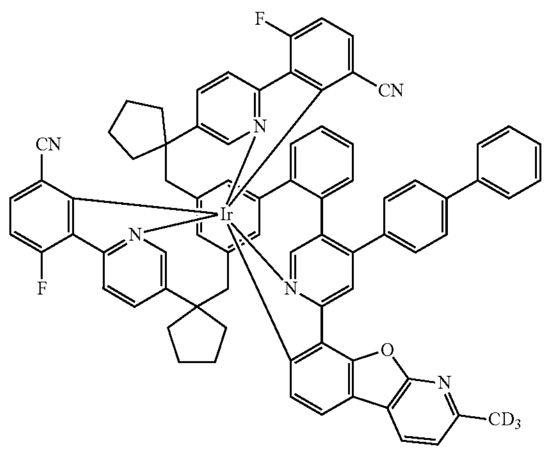
662
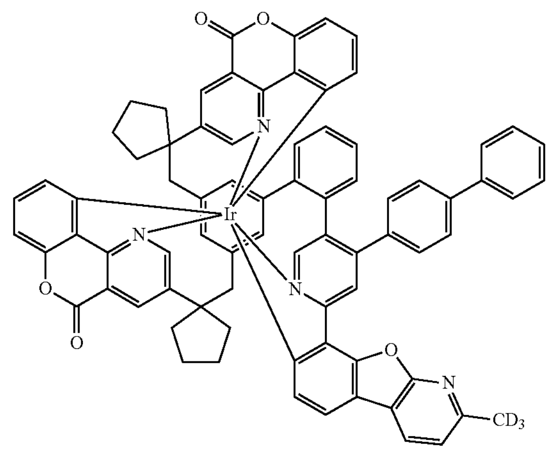
663
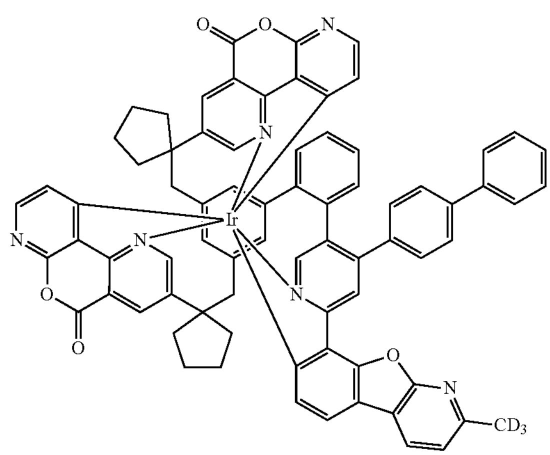
664
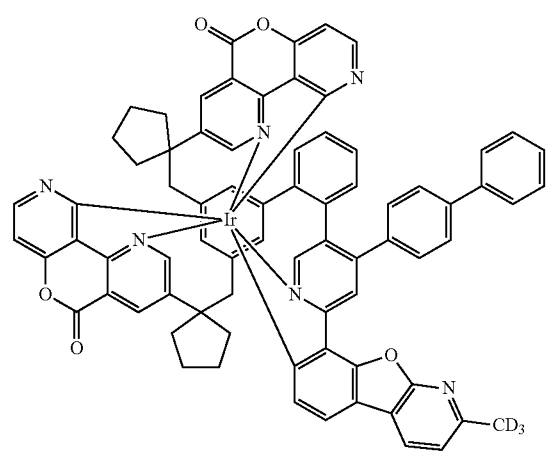

-continued
665
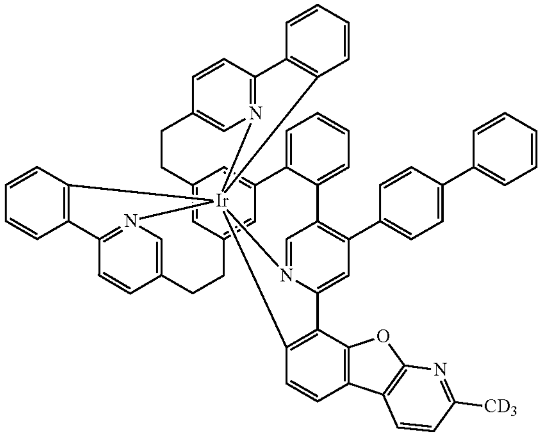
666
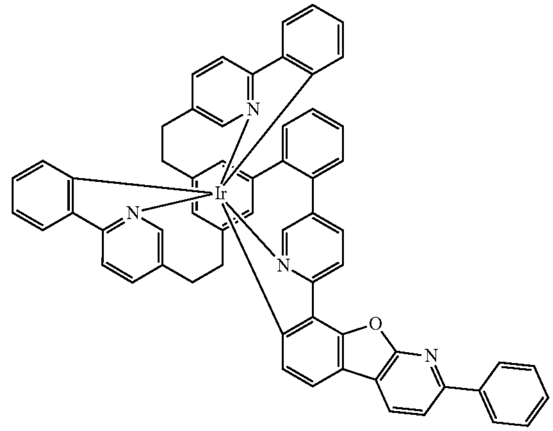
667
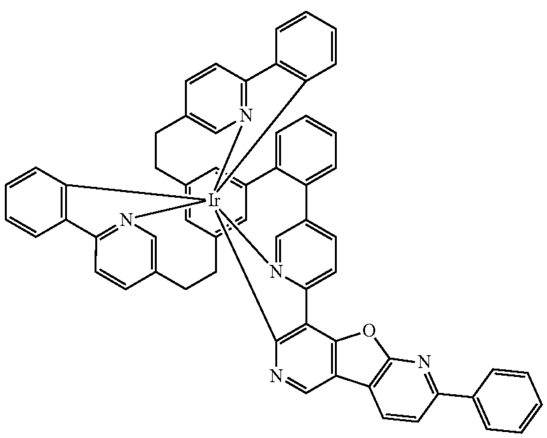
668
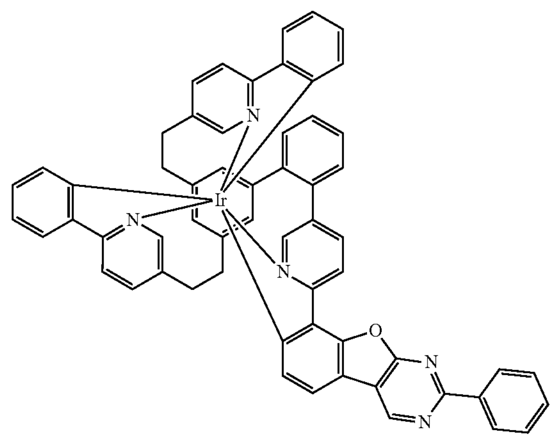
669
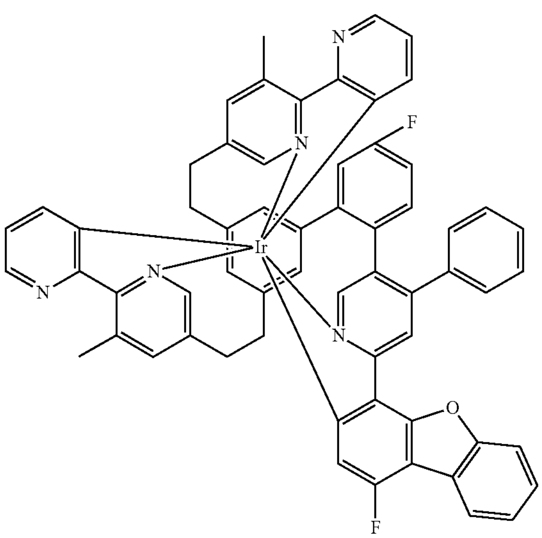
670
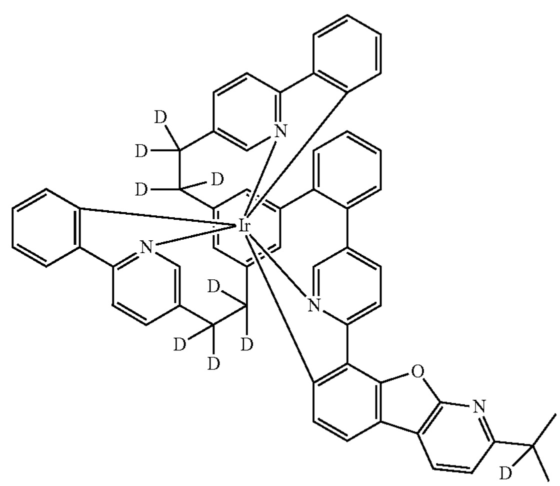

-continued
671
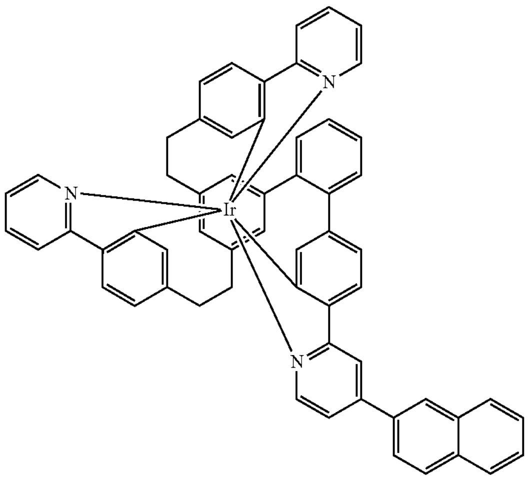
672
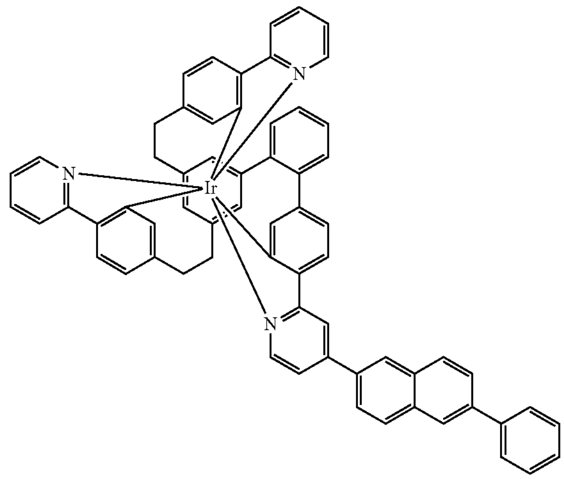
673
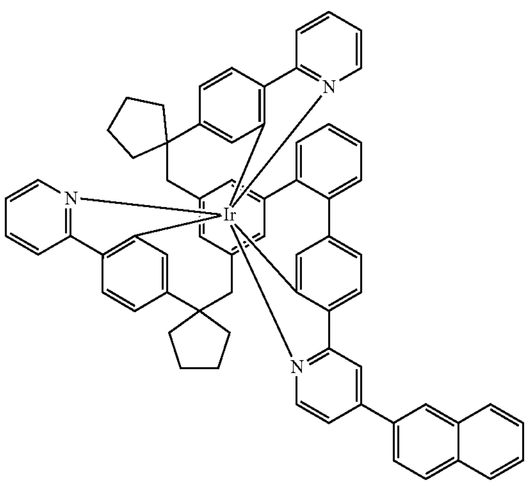
674
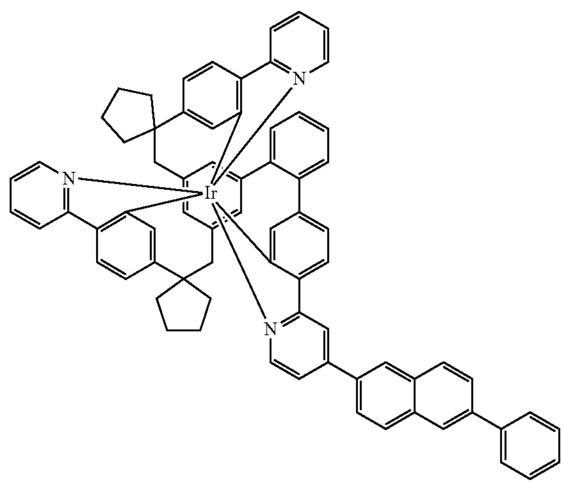
675
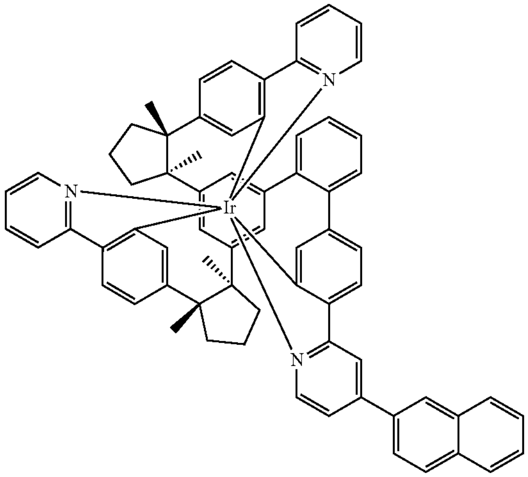
676
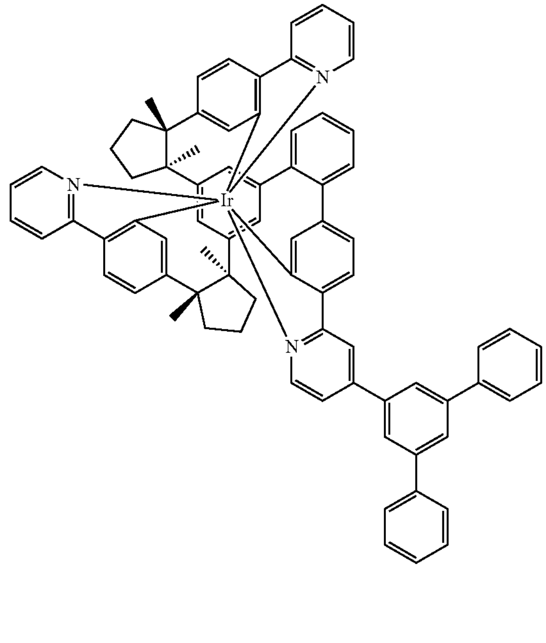

-continued
677
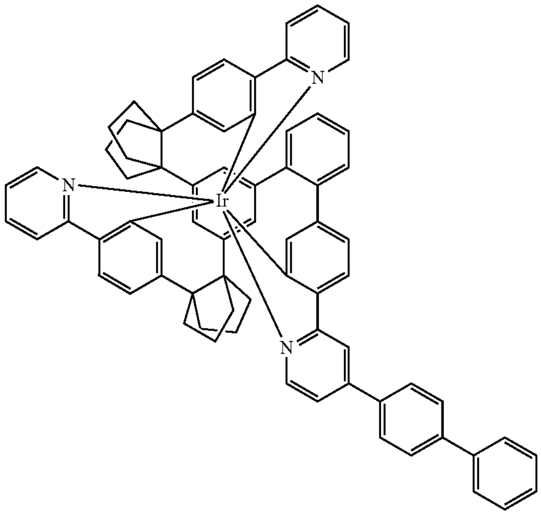
678
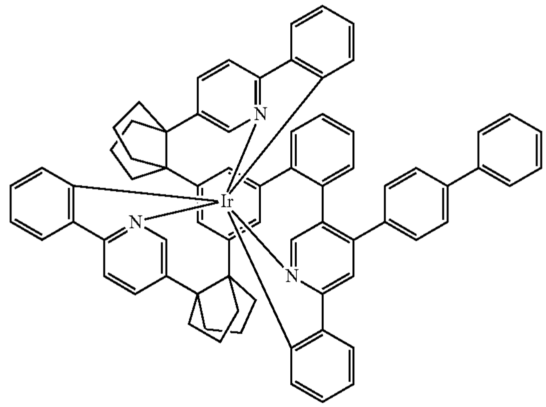
679
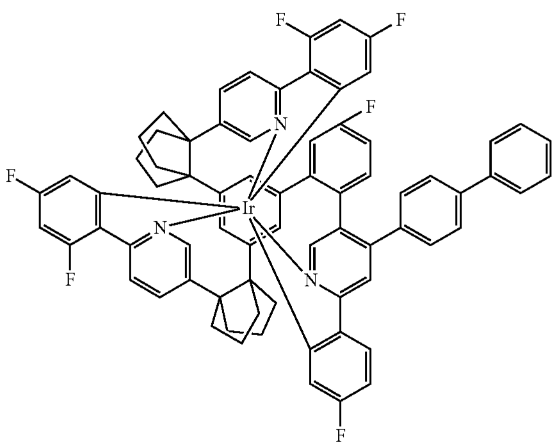
680
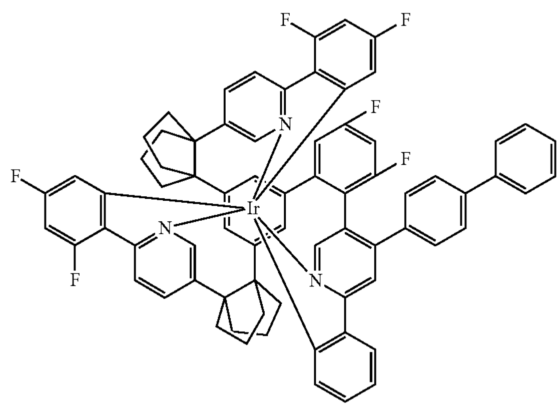
681
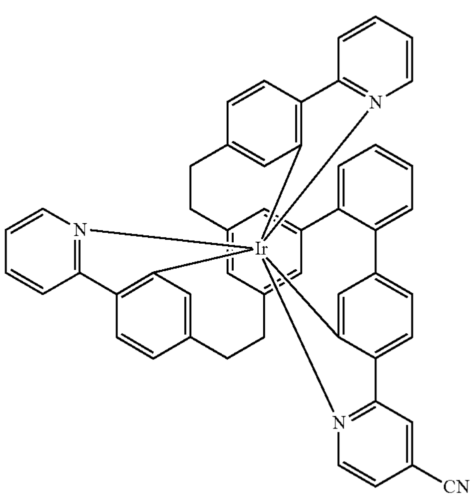
682
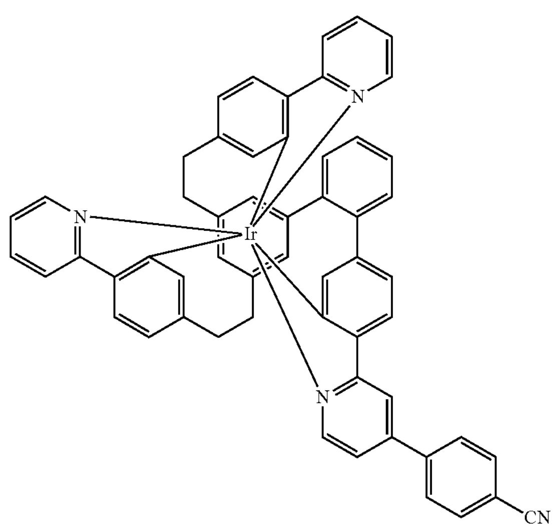

-continued
683
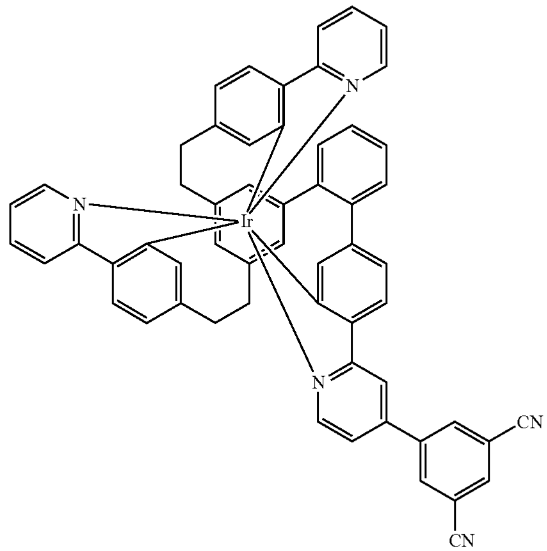
684
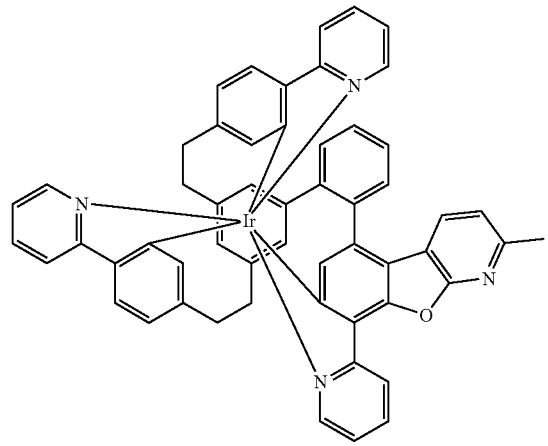
685
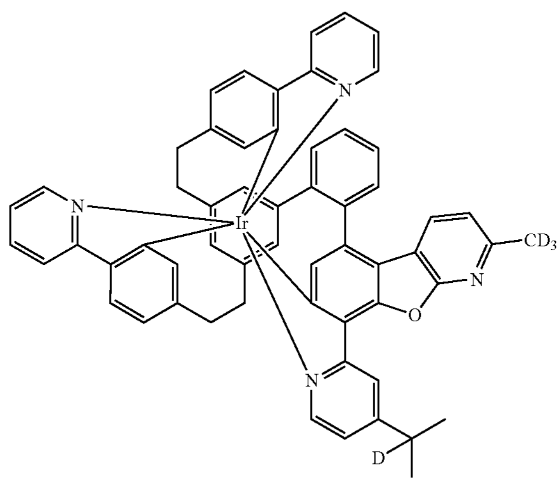
686
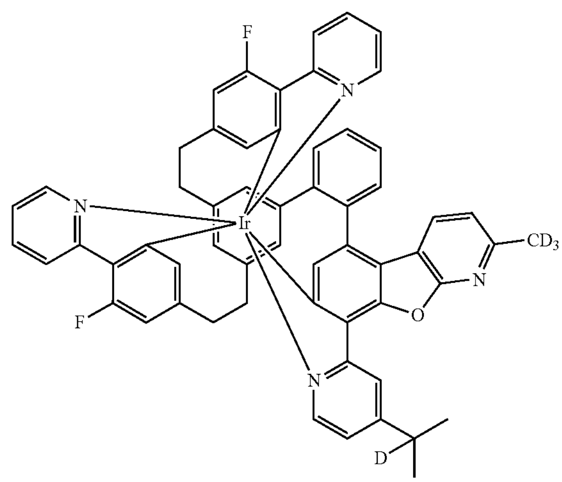
687
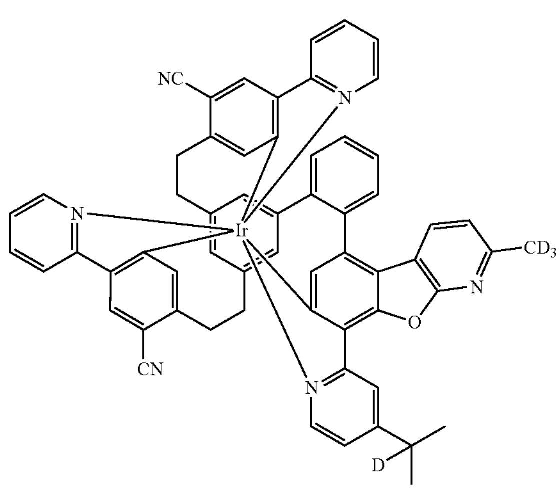
688
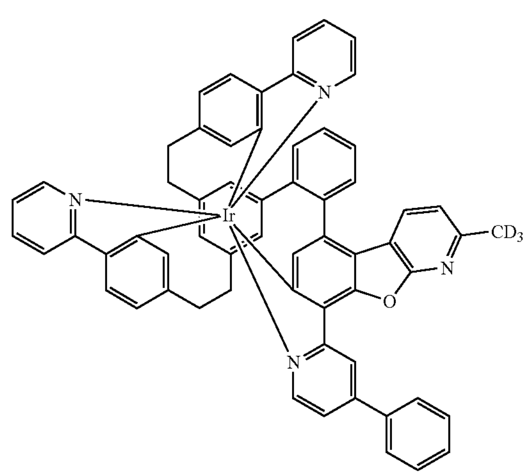

-continued
689
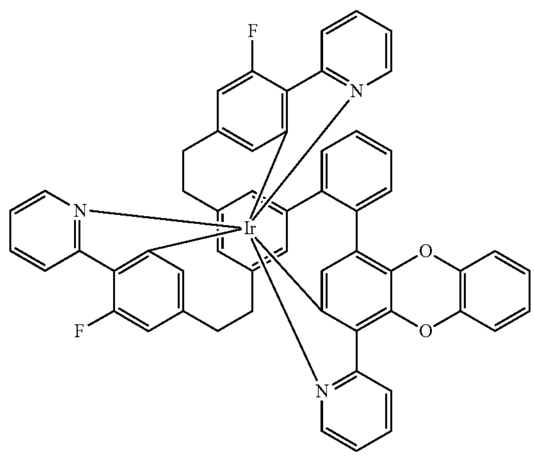
690
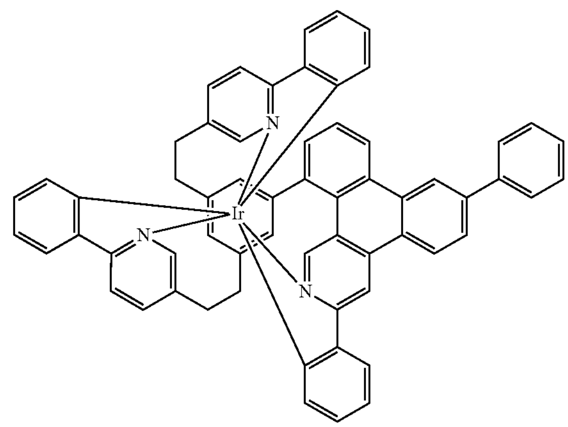
691
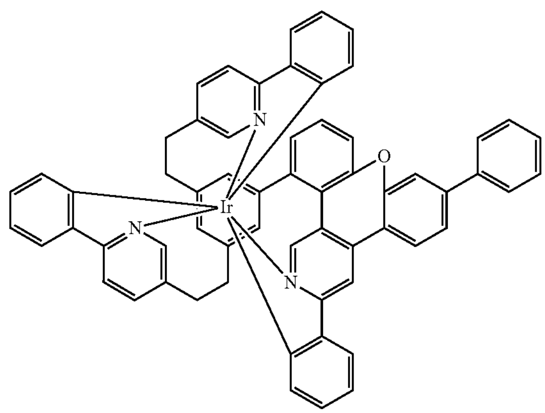
692
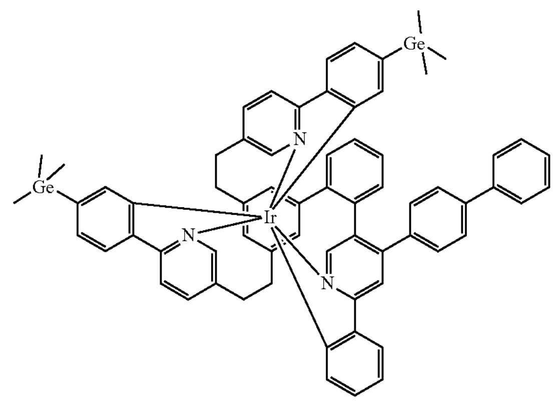
693
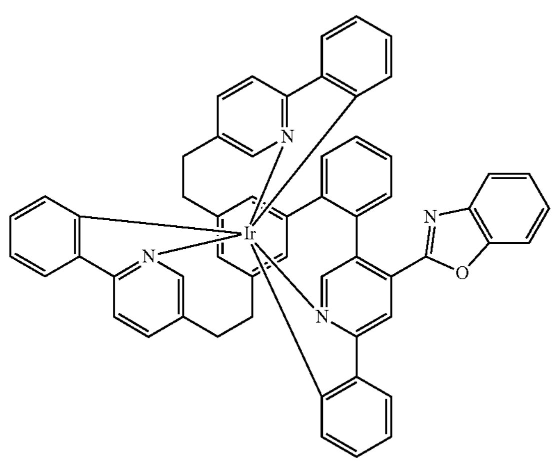
694
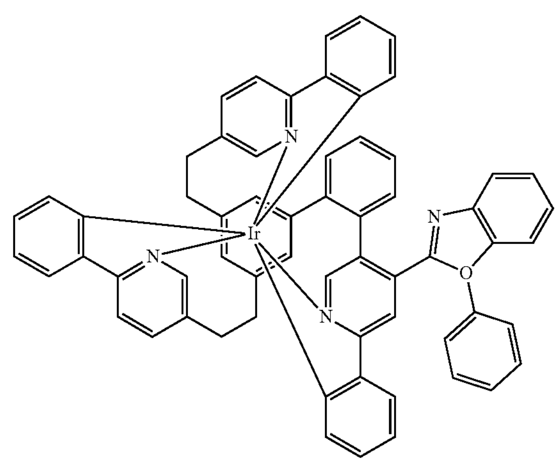

-continued

695

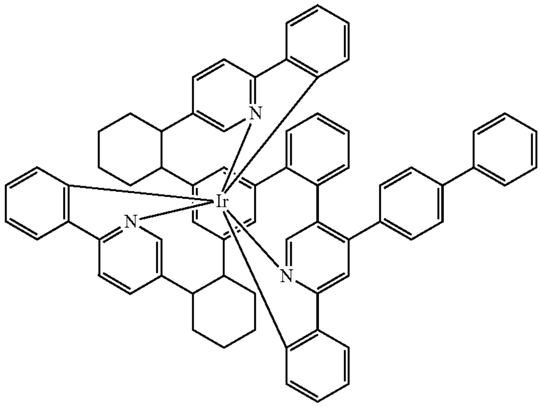

696

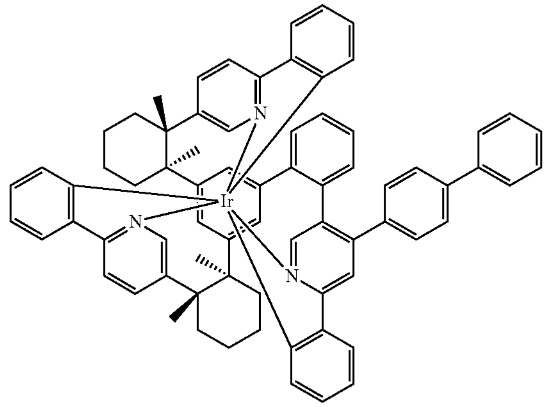

The iridium complexes of the invention are chiral structures. If the tripodal ligand of the complexes is additionally also chiral, the formation of diastereomers and multiple enantiomer pairs is possible. In that case, the complexes of the invention include both the mixtures of the different diastereomers or the corresponding racemates and the individual isolated diastereomers or enantiomers.

If ligands having two identical sub-ligands are used in the ortho-metallation, what is obtained is typically a racemic mixture of the $C_1$-symmetric complexes, i.e. of the 4 and A enantiomers. These may be separated by standard methods (chromatography on chiral materials/columns or optical resolution by crystallization).

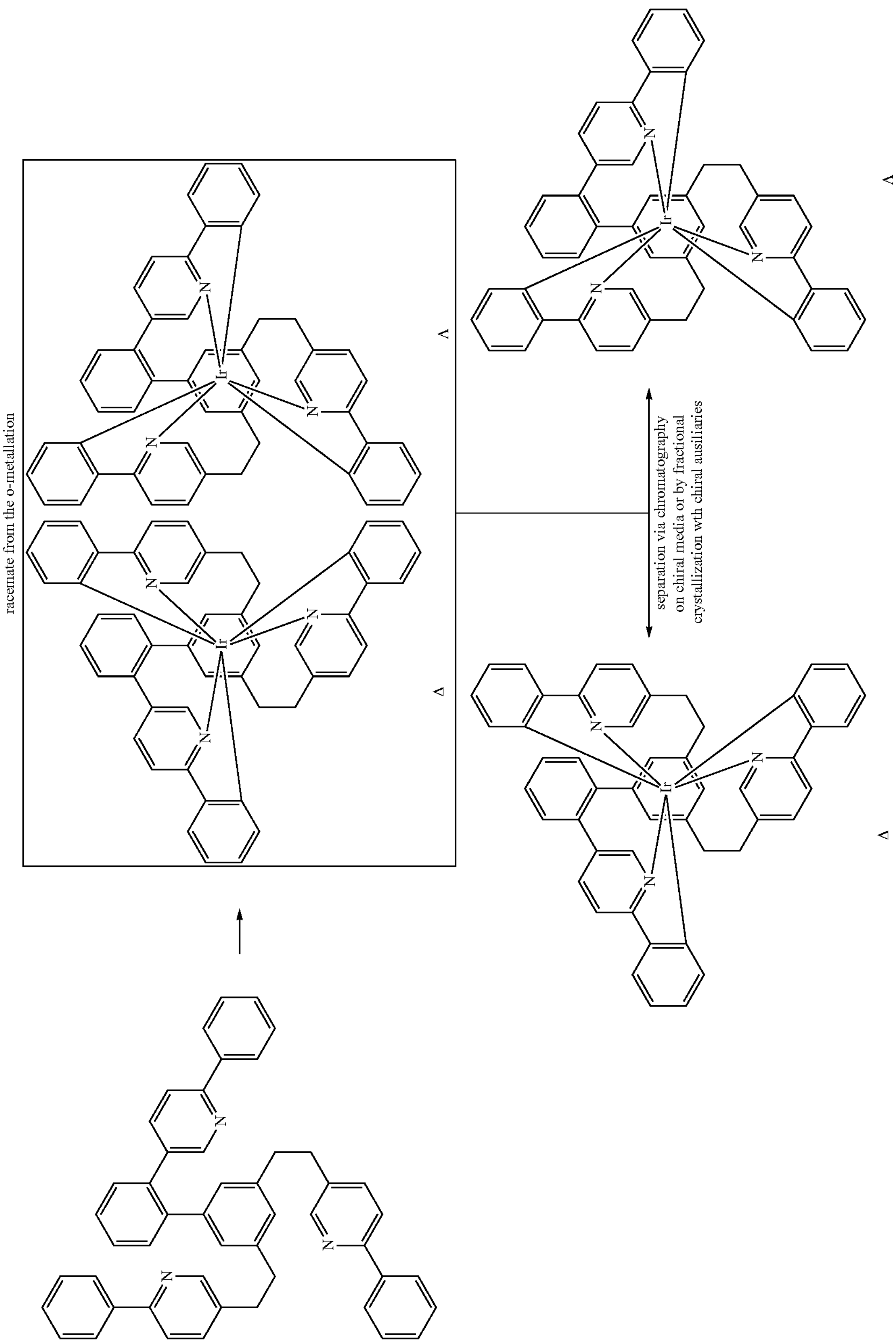
racemate from the o-metallation
Λ
Δ
separation via chromatography
on chiral media or by fractional
crystallization wth chiral ausiliaries
Λ
Δ

Optical resolution via fractional crystallization of diastereomeric salt pairs can be effected by customary methods. One option for this purpose is to oxidize the uncharged Ir(III) complexes (for example with peroxides or $H_2O_2$ or by electrochemical means), add the salt of an enantiomerically pure monoanionic base (chiral base) to the cationic Ir(IV) complexes thus produced, separate the diastereomeric salts thus produced by fractional crystallization, and then reduce them with the aid of a reducing agent (e.g. zinc, hydrazine hydrate, ascorbic acid, etc.) to give the enantiomerically pure uncharged complex, as shown schematically below:

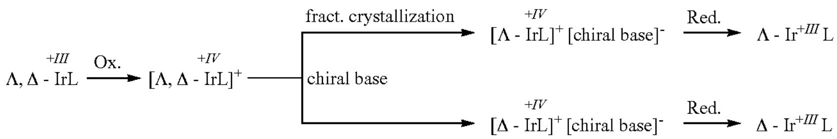

In addition, an enantiomerically pure or enantiomerically enriching synthesis is possible by complexation in a chiral medium (e.g. R- or S-1,1-binaphthol).

If ligands having three different sub-ligands are used in the complexation, what is typically obtained is a diastereomer mixture of the complexes which can be separated by standard methods (chromatography, crystallization, etc.).

Enantiomerically pure $C_1$-symmetric complexes can also be synthesized selectively, as shown in the scheme which follows. For this purpose, an enantiomerically pure $C_1$-symmetric ligand is prepared and complexed, the diastereomer mixture obtained is separated and then the chiral group is detached.

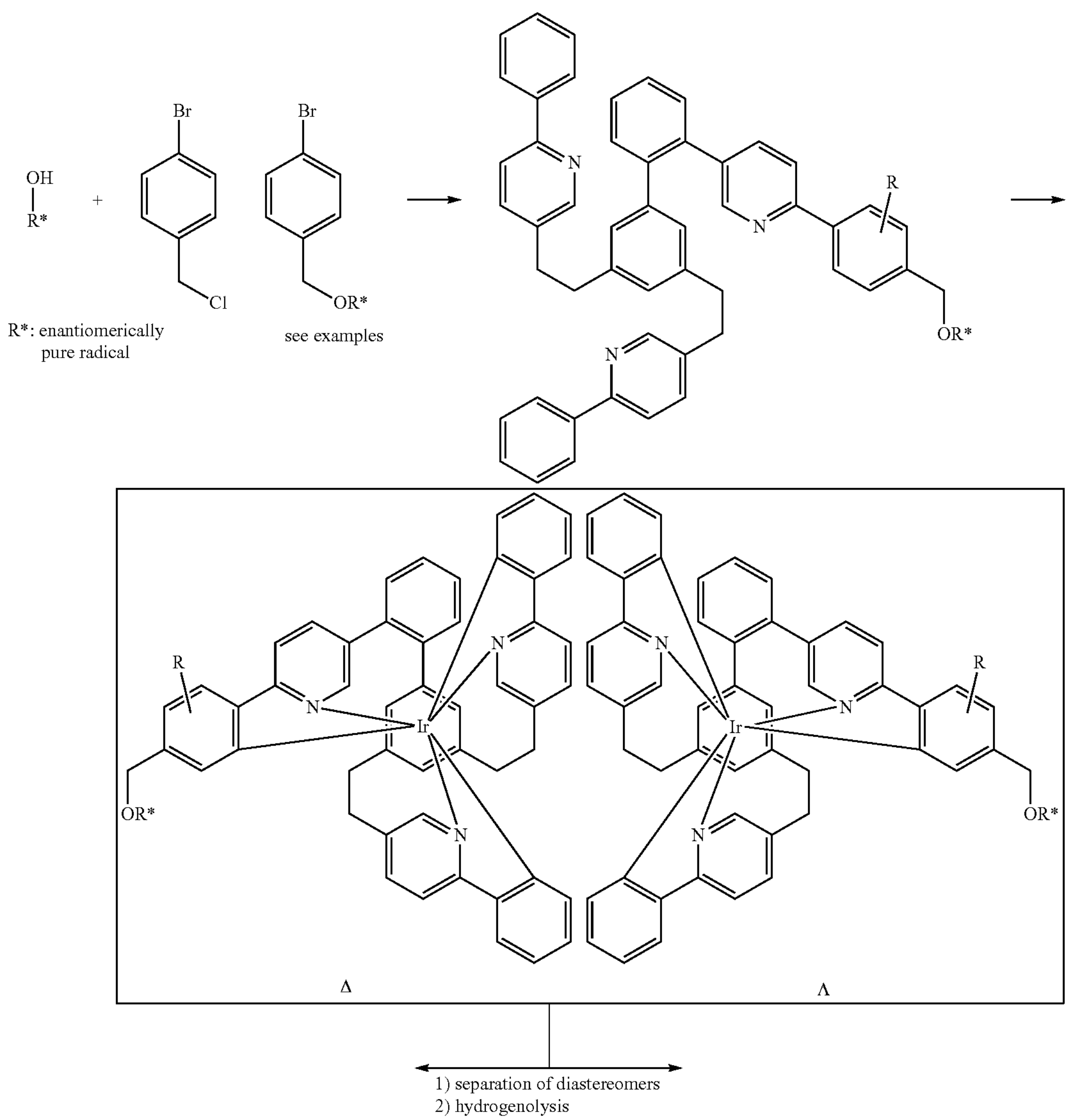

-continued

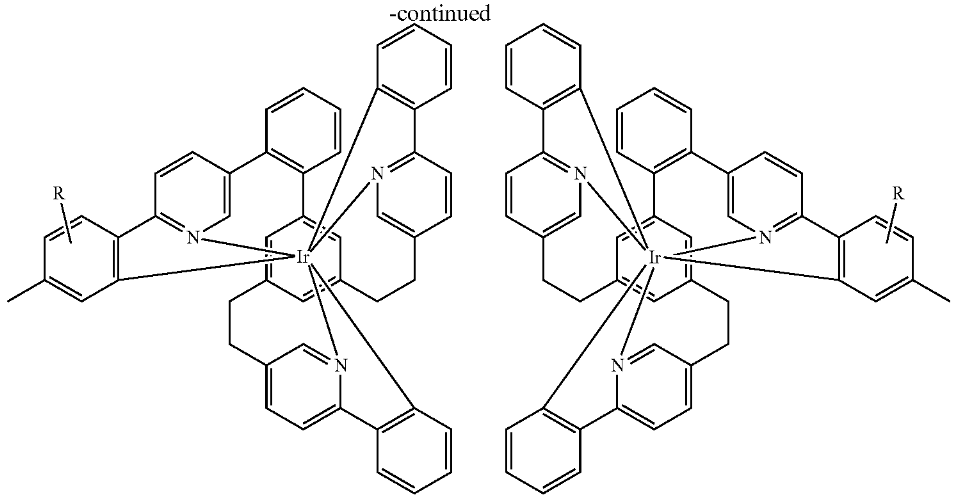

Δ Λ

The compounds of the invention are preparable in principle by various processes. In general, for this purpose, an iridium salt is reacted with the corresponding free ligand.

Therefore, the present invention further provides a process for preparing the compounds of the invention by reacting the appropriate free ligands with iridium alkoxides of the formula (51), with iridium ketoketonates of the formula (52), with iridium halides of the formula (53) or with iridium carboxylates of the formula (54)

$Ir(OR)_3$ formula(51)

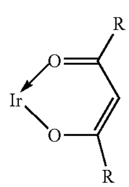

formula (52)

$IrHal_3$ formula (53)

$Ir(OOCR)_3$ formula (54)

where R has the definitions given above, Hal=F, Cl, Br or I and the iridium reactants may also take the form of the corresponding hydrates. R here is preferably an alkyl group having 1 to 4 carbon atoms.

It is likewise possible to use iridium compounds bearing both alkoxide and/or halide and/or hydroxyl and ketoketonate radicals. These compounds may also be charged. Corresponding iridium compounds of particular suitability as reactants are disclosed in WO 2004/085449. Particularly suitable are $[IrCl_2(acac)_2]^-$, for example $Na[IrCl_2(acac)_2]$, metal complexes with acetylacetonate derivatives as ligand, for example $Ir(acac)_3$ or tris(2,2,6,6-tetramethylheptane-3,5-dionato)iridium, and $IrCl_3 \cdot xH_2O$ where x is typically a number from 2 to 4.

The synthesis of the complexes is preferably conducted as described in WO 2002/060910 and in WO 2004/085449. In this case, the synthesis can, for example, also be activated by thermal or photochemical means and/or by microwave radiation. In addition, the synthesis can also be conducted in an autoclave at elevated pressure and/or elevated temperature.

The reactions can be conducted without addition of solvents or melting aids in a melt of the corresponding ligands to be o-metallated. It is optionally also possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulfoxides (DMSO) or sulfones (dimethyl sulfone, sulfolane, etc.). Suitable melting aids are compounds that are in solid form at room temperature but melt when the reaction mixture is heated and dissolve the reactants, so as to form a homogeneous melt. Particularly suitable are biphenyl, m-terphenyl, triphenyls, R- or S-binaphthol or else the corresponding racemate, 1,2-, 1,3- or 1,4-bisphenoxybenzene, triphenylphosphine oxide, 18-crown-6, phenol, 1-naphthol, hydroquinone, etc. Particular preference is given here to the use of hydroquinone.

It is possible by these processes, if necessary followed by purification, for example recrystallization or sublimation, to obtain the inventive compounds of formula (1) in high purity, preferably more than 99% (determined by means of $^1H$ NMR and/or HPLC).

The compounds of the invention may also be rendered soluble by suitable substitution, for example by comparatively long alkyl groups (about 4 to 20 carbon atoms), especially branched alkyl groups, or optionally substituted aryl groups, for example xylyl, mesityl or branched terphenyl or quaterphenyl groups. Another particular method that leads to a distinct improvement in the solubility of the metal complexes is the use of fused-on aliphatic groups, as shown, for example, by the formulae (44) to (50) disclosed above. Such compounds are then soluble in sufficient concentration at room temperature in standard organic solvents, for example toluene or xylene, to be able to process the complexes from solution. These soluble compounds are of particularly good suitability for processing from solution, for example by printing methods.

For the processing of the iridium complexes of the invention from a liquid phase, for example by spin-coating or by printing methods, formulations of the iridium complexes of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, a-terpineol, benzothiazole, butyl benzoate, cumene, cyclohexanol, cyclohexanone, cyclohexylbenzene, decalin, dodecylbenzene, ethyl benzoate, indane, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexamethylindane, 2-methylbiphenyl, 3-methylbiphenyl, 1-methylnaphthalene, 1-ethylnaphthalene, ethyl octanoate, diethyl sebacate, octyl octanoate, heptylbenzene, menthyl isovalerate, cyclohexyl hexanoate or mixtures of these solvents.

The present invention therefore further provides a formulation comprising at least one compound of the invention and at least one further compound. The further compound may, for example, be a solvent, especially one of the abovementioned solvents or a mixture of these solvents. The further compound may alternatively be a further organic or inorganic compound which is likewise used in the electronic device, for example a matrix material. This further compound may also be polymeric.

The compound of the invention can be used in the electronic device as active component, preferably as emitter in the emissive layer or as hole or electron transport material in a hole- or electron-transporting layer, or as oxygen sensitizers or as photoinitiator or photocatalyst. The present invention thus further provides for the use of a compound of the invention in an electronic device or as oxygen sensitizer or as photoinitiator or photocatalyst. Enantiomerically pure iridium complexes of the invention are suitable as photocatalysts for chiral photoinduced syntheses.

The present invention still further provides an electronic device comprising at least one compound of the invention.

An electronic device is understood to mean any device comprising anode, cathode and at least one layer, said layer comprising at least one organic or organometallic compound. The electronic device of the invention thus comprises anode, cathode and at least one layer containing at least one iridium complex of the invention. Preferred electronic devices are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), the latter being understood to mean both purely organic solar cells and dye-sensitized solar cells, organic optical detectors, organic photoreceptors, organic field-quench devices (O-FQDs), light-emitting electrochemical cells (LECs), oxygen sensors and organic laser diodes (O-lasers), comprising at least one compound of the invention in at least one layer. Compounds that emit in the infrared are suitable for use in organic infrared electroluminescent devices and infrared sensors. Particular preference is given to organic electroluminescent devices. Active components are generally the organic or inorganic materials introduced between the anode and cathode, for example charge injection, charge transport or charge blocker materials, but especially emission materials and matrix materials. The compounds of the invention exhibit particularly good properties as emission material in organic electroluminescent devices. A preferred embodiment of the invention is therefore organic electroluminescent devices. In addition, the compounds of the invention can be used for production of singlet oxygen or in photocatalysis.

The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. In this case, it is possible that one or more hole transport layers are p-doped, for example with metal oxides such as $MoO_3$ or $WO_3$, or with (per)fluorinated electron-deficient aromatics or with electron-deficient cyano-substituted heteroaromatics (for example according to JP 4747558, JP 2006-135145, US 2006/0289882, WO 2012/095143), or with quinoid systems (for example according to EP1336208) or with Lewis acids, or with boranes (for example according to US 2003/0006411, WO 2002/051850, WO 2015/049030) or with carboxylates of the elements of main group 3, 4 or 5 (WO 2015/018539), and/or that one or more electron transport layers are n-doped.

It is likewise possible for interlayers to be introduced between two emitting layers, which have, for example, an exciton-blocking function and/or control charge balance in the electroluminescent device and/or generate charges (charge generation layer, for example in layer systems having two or more emitting layers, for example in white-emitting OLED components). However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are three-layer systems where the three layers exhibit blue, green and orange or red emission (for the basic construction see, for example, WO 2005/011013), or systems having more than three emitting layers. The system may also be a hybrid system wherein one or more layers fluoresce and one or more other layers phosphoresce. A preferred embodiment is tandem OLEDs. White-emitting organic electroluminescent devices may be used for lighting applications or else with colour filters for full-colour displays.

In a preferred embodiment of the invention, the organic electroluminescent device comprises the iridium complex of the invention as emitting compound in one or more emitting layers.

When the iridium complex of the invention is used as emitting compound in an emitting layer, it is preferably used in combination with one or more matrix materials. The mixture of the iridium complex of the invention and the matrix material contains between 0.1% and 99% by volume, preferably between 1% and 90% by volume, more preferably between 3% and 40% by volume and especially between 5% and 15% by volume of the iridium complex of the invention, based on the overall mixture of emitter and matrix material. Correspondingly, the mixture contains between 99.9% and 1% by volume, preferably between 99% and 10% by volume, more preferably between 97% and 60% by volume and especially between 95% and 85% by volume of the matrix material, based on the overall mixture of emitter and matrix material.

The matrix material used may generally be any materials which are known for the purpose according to the prior art. The triplet level of the matrix material is preferably higher than the triplet level of the emitter.

Suitable matrix materials for the compounds of the invention are ketones, phosphine oxides, sulfoxides and sulfones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, biscarbazole derivatives, indolocarbazole derivatives, for example according to WO 2007/063754 or WO 2008/056746, indenocarbazole derivatives, for example according to WO 2010/136109 or WO 2011/000455, azacarbazoles, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, diazasilole derivatives, for example according to WO 2010/054729, diazaphosphole derivatives, for example according to WO 2010/054730, triazine derivatives, for example according to WO 2010/015306, WO 2007/063754 or WO 2008/056746, zinc complexes, for example according to EP 652273 or WO 2009/062578, dibenzofuran derivatives, for example according to WO 2009/148015 or WO 2015/169412, or bridged carbazole derivatives, for example according to US 2009/0136779, WO 2010/050778, WO 2011/042107 or WO 2011/088877. Suitable matrix materials for solution-processed OLEDs are also polymers, for example according to WO 2012/008550 or WO 2012/048778, oligomers or dendrimers, for example according to Journal of Luminescence 183 (2017), 150-158.

It may also be preferable to use a plurality of different matrix materials as a mixture, especially at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex of the invention. Preference is likewise given to the use of a mixture of a charge-transporting matrix material and an electrically inert matrix material (called a "wide bandgap host") having no significant involvement, if any, in the charge transport, as described, for example, in WO 2010/108579 or WO 2016/184540. Preference is likewise given to the use of two electron-transporting matrix materials, for example triazine derivatives and lactam derivatives, as described, for example, in WO 2014/094964.

Depicted below are examples of compounds that are suitable as matrix materials for the compounds of the invention.

Examples of triazines and pyrimidines which can be used as electron-transportina matrix materials are the following structures:

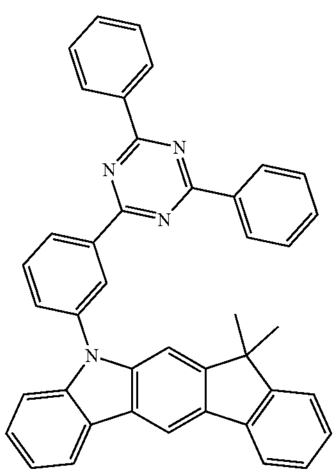

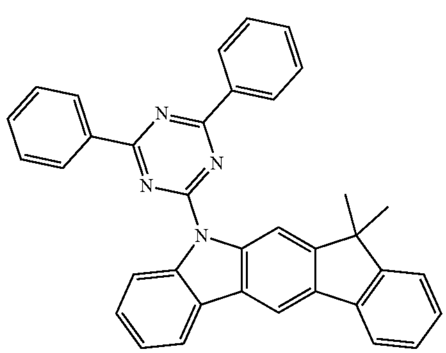

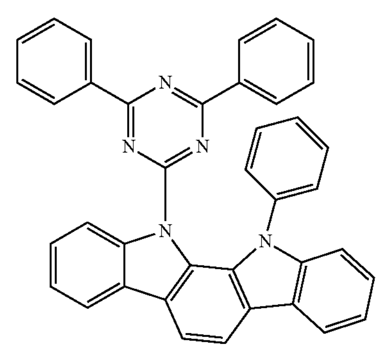

-continued
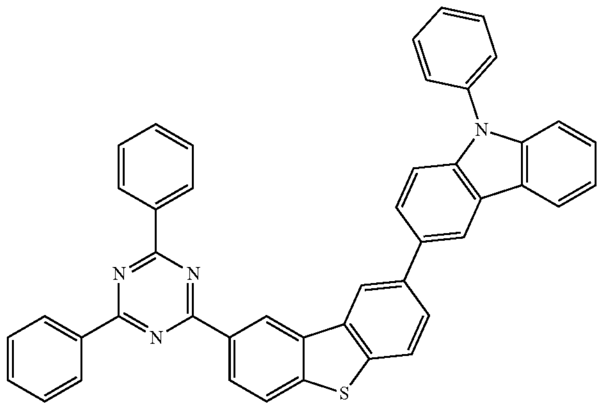
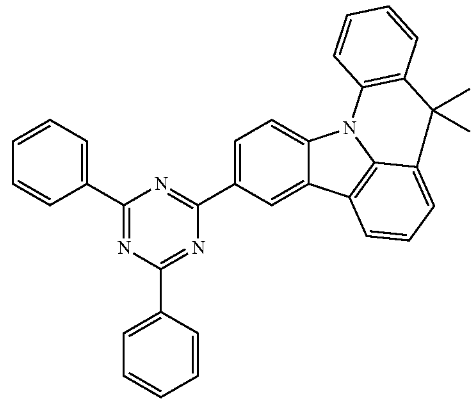
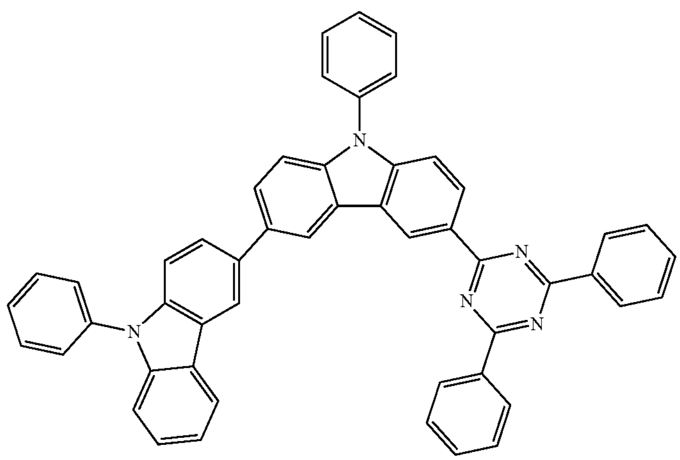
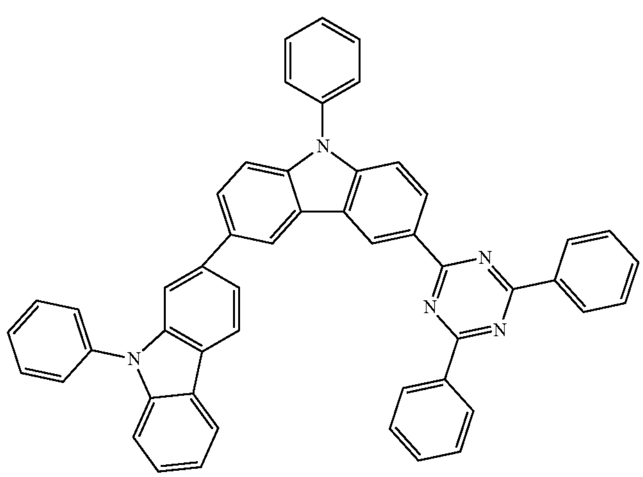
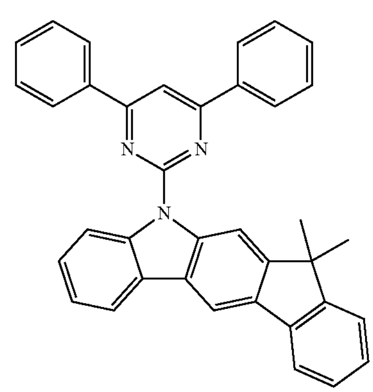

-continued
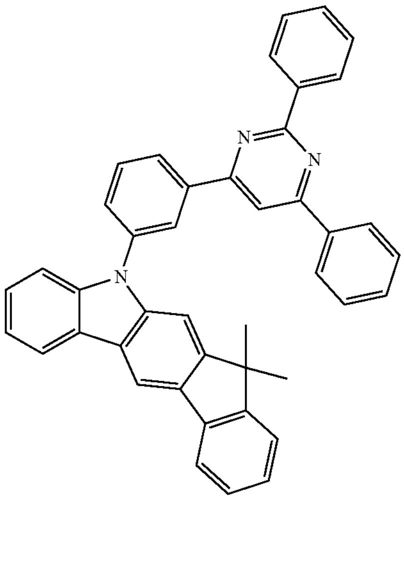
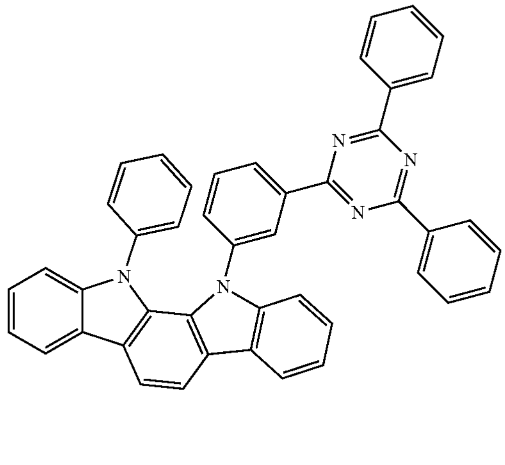
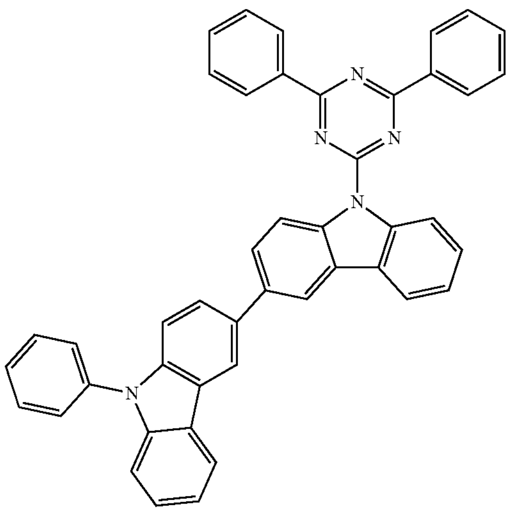
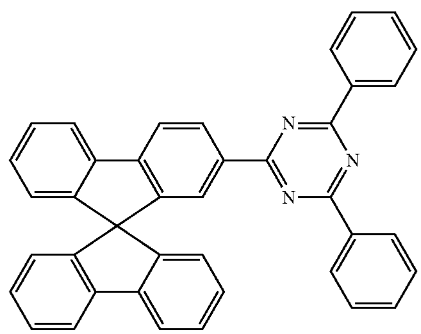
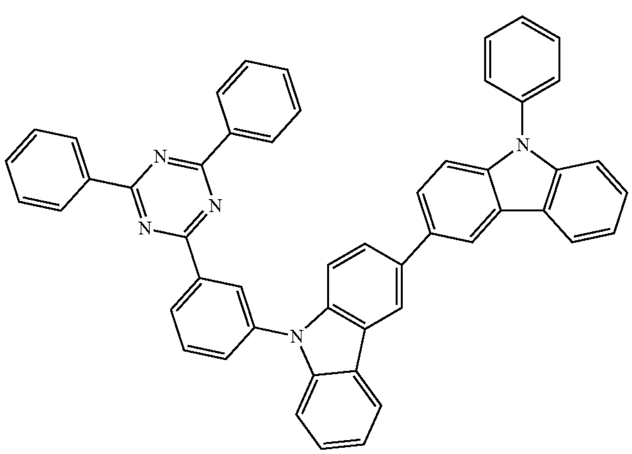
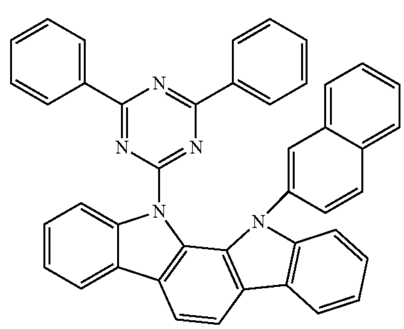

-continued
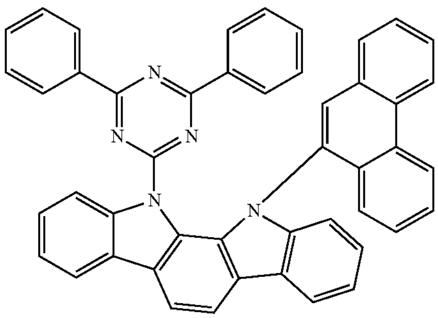
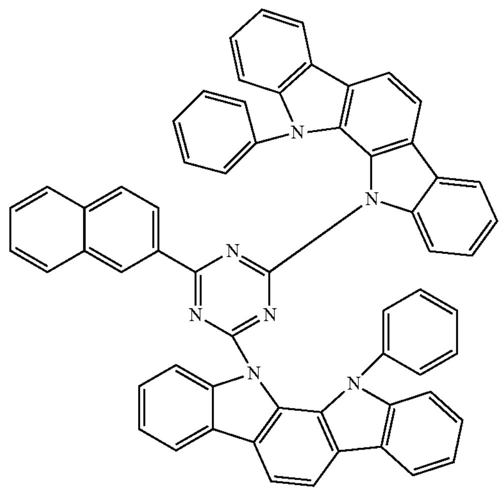
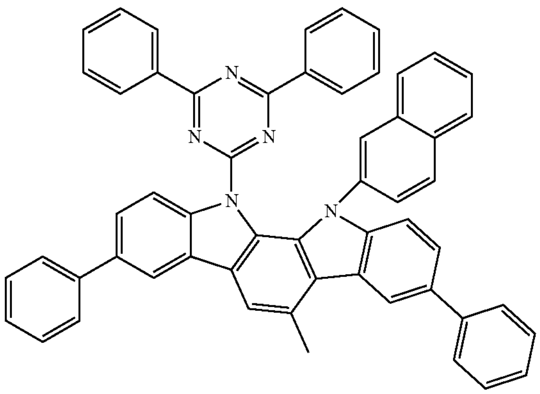
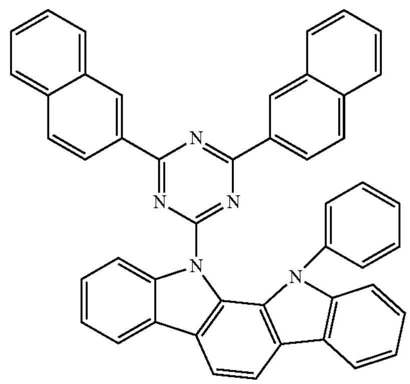
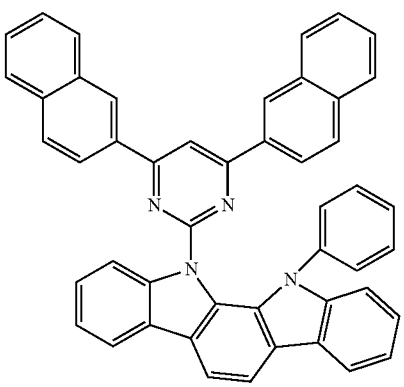
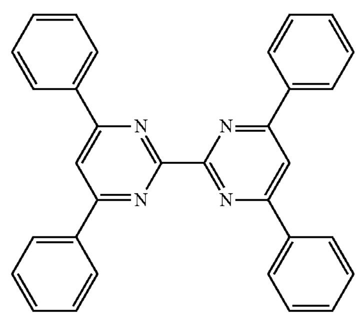
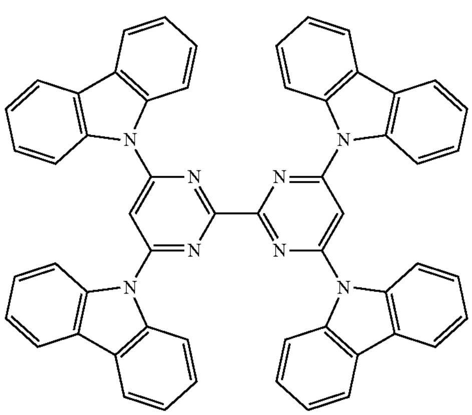
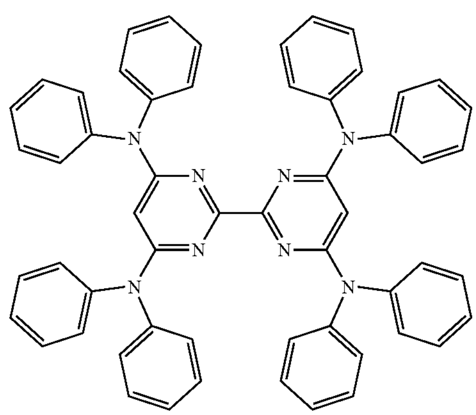

-continued
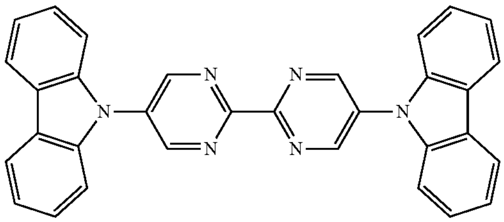
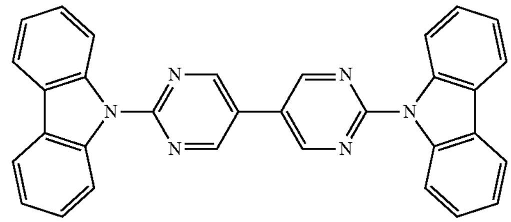
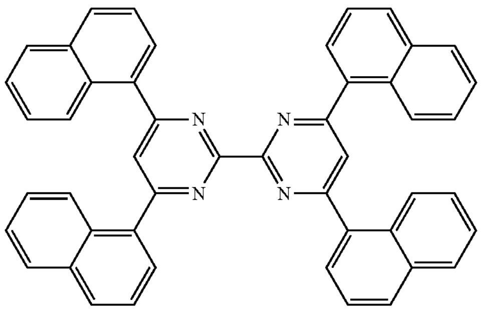
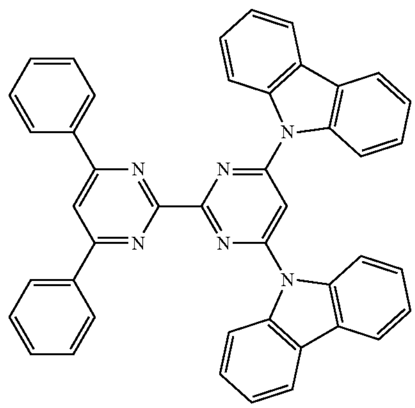
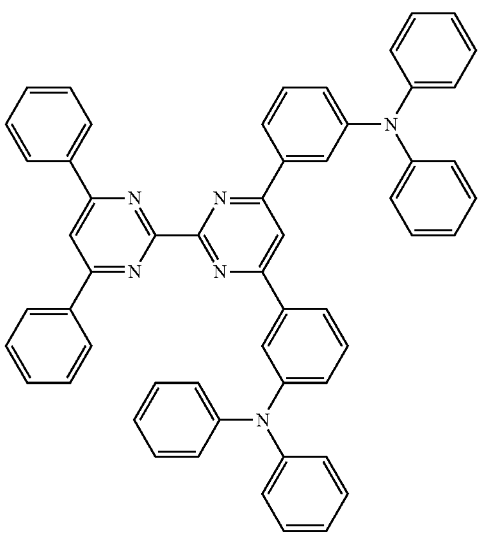
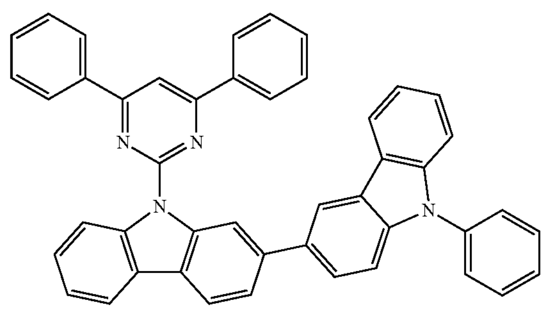
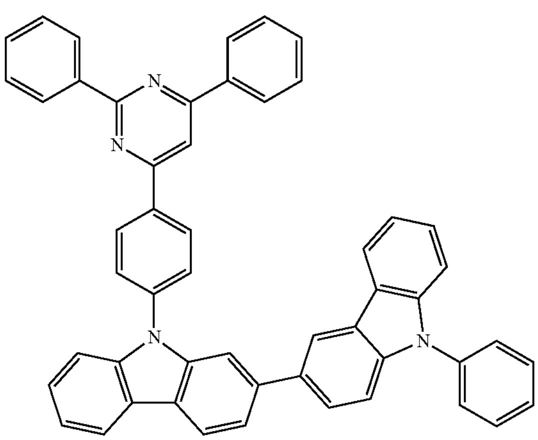
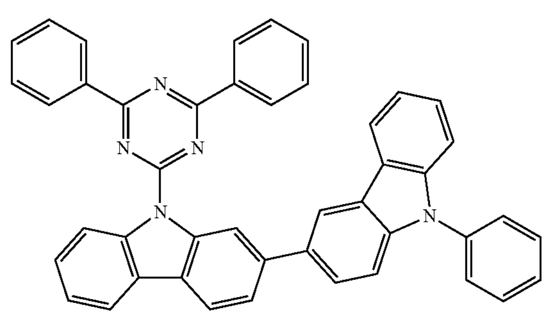

-continued
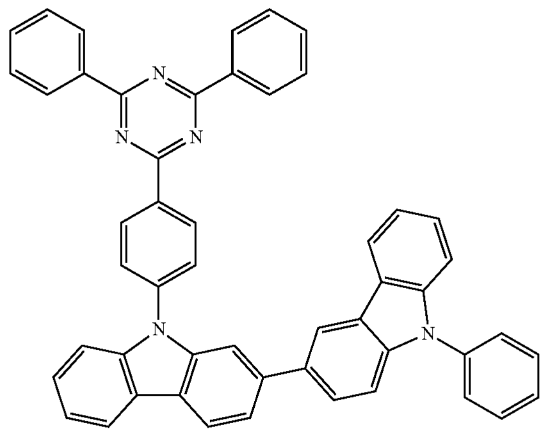
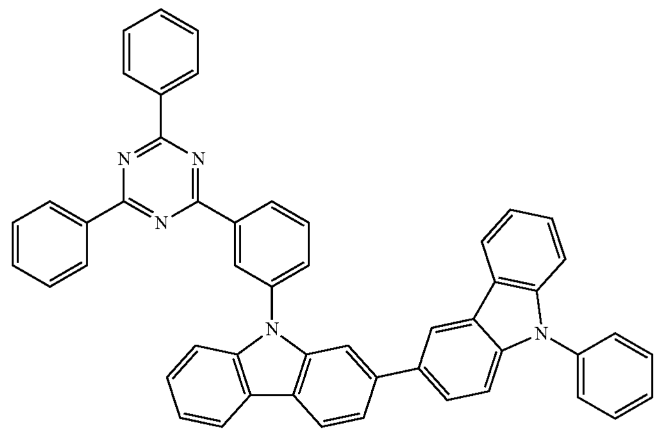
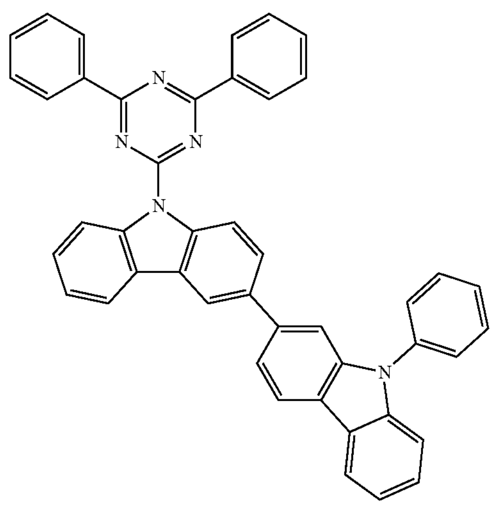
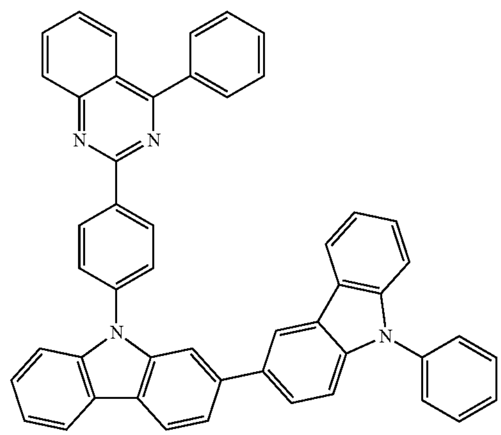
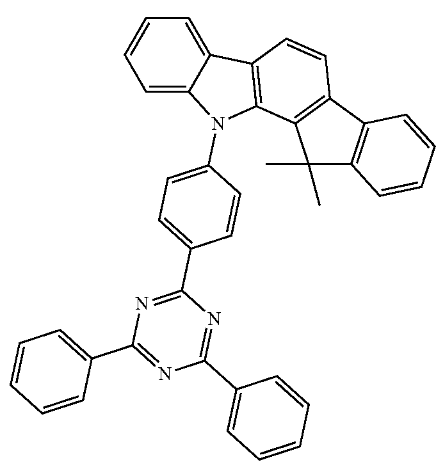
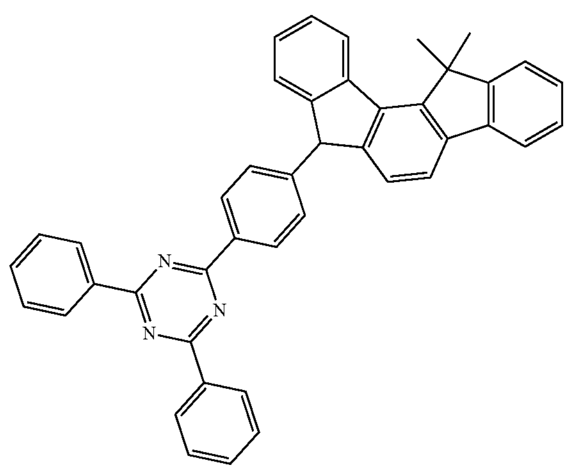

-continued
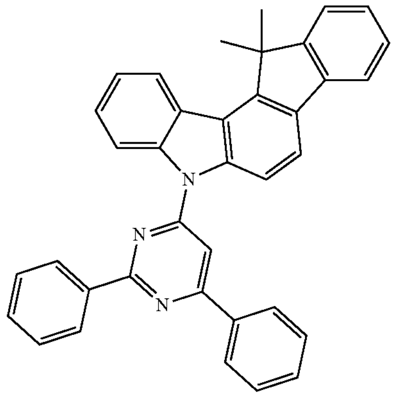
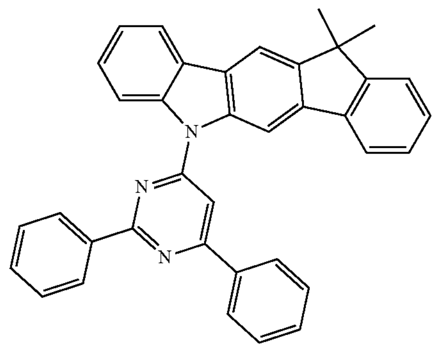
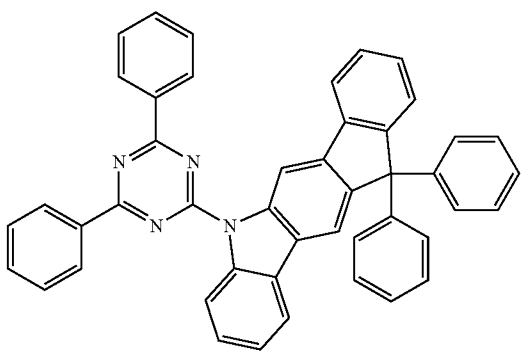
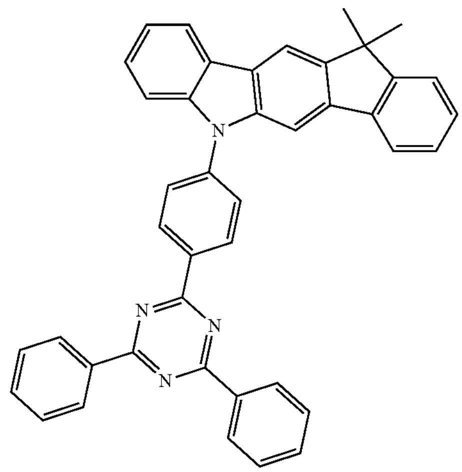
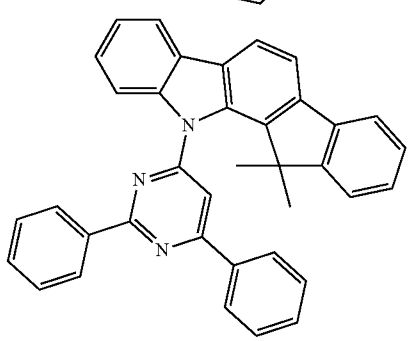
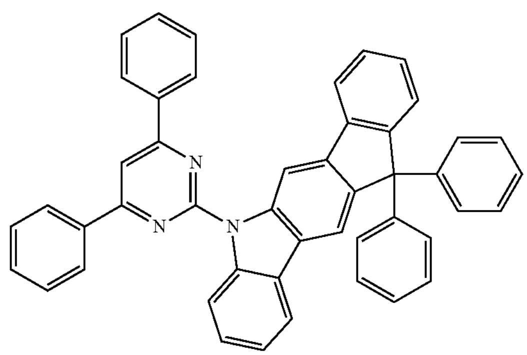
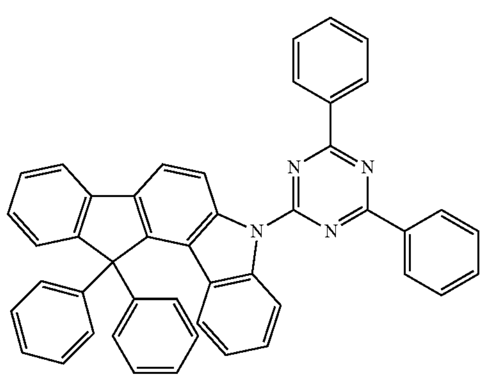
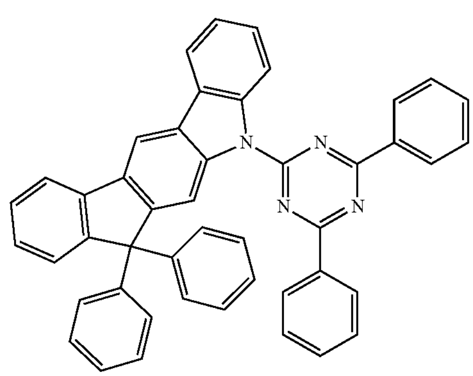

-continued
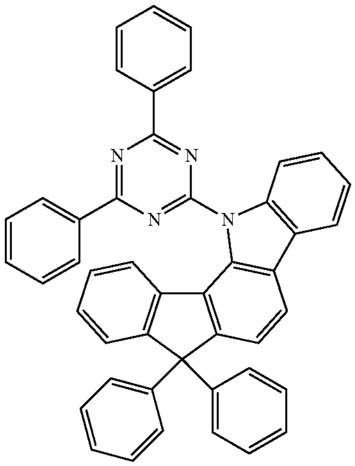
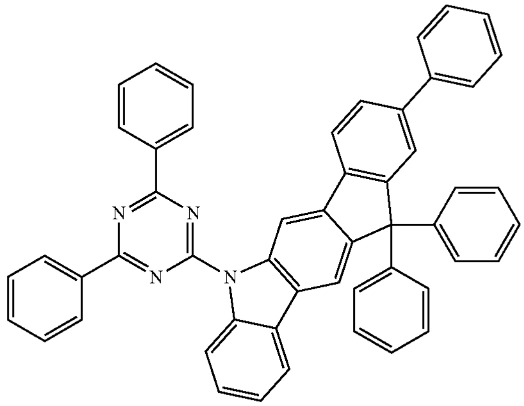
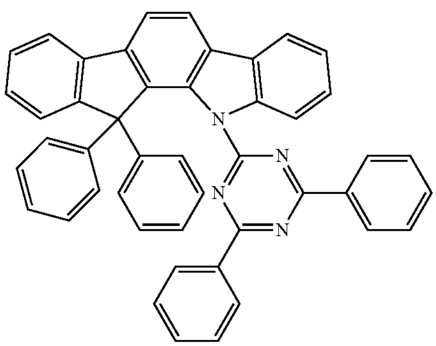
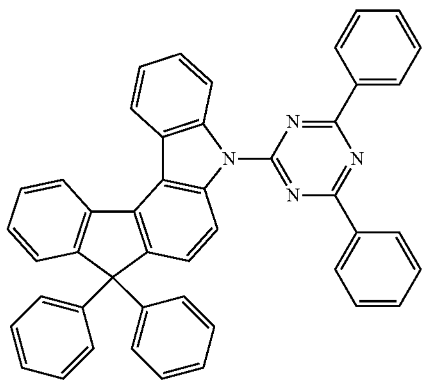
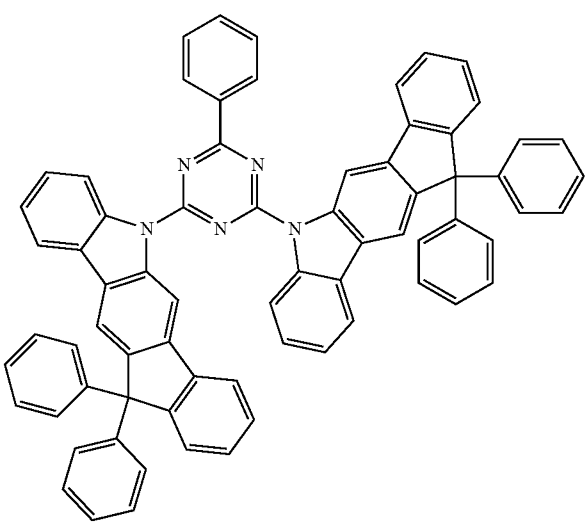

-continued
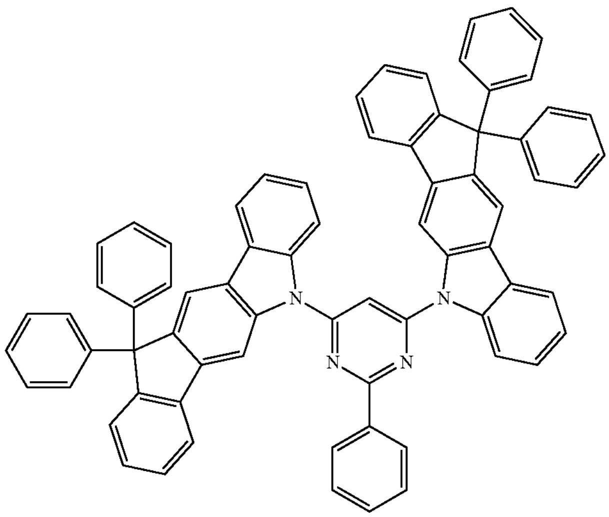
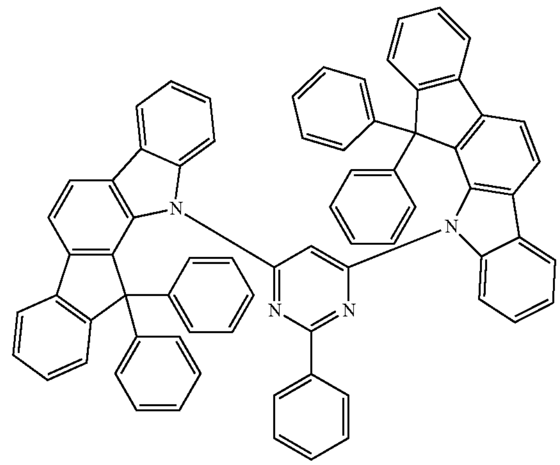
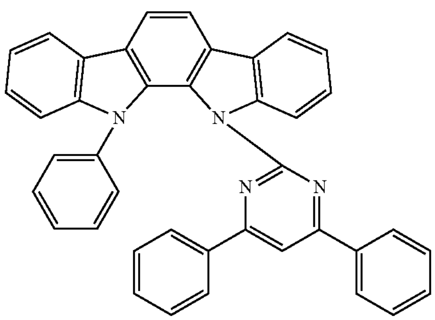
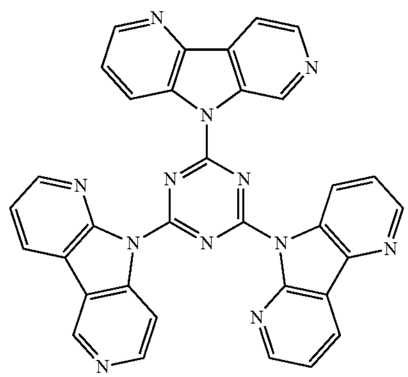
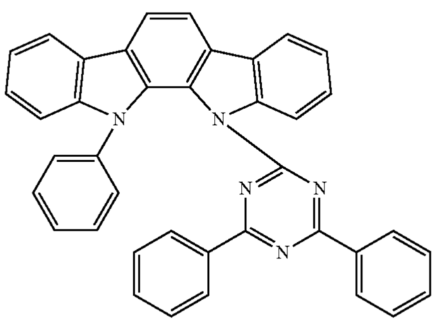
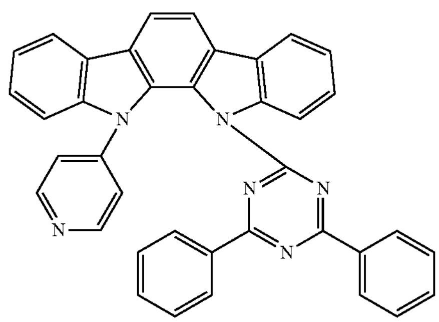
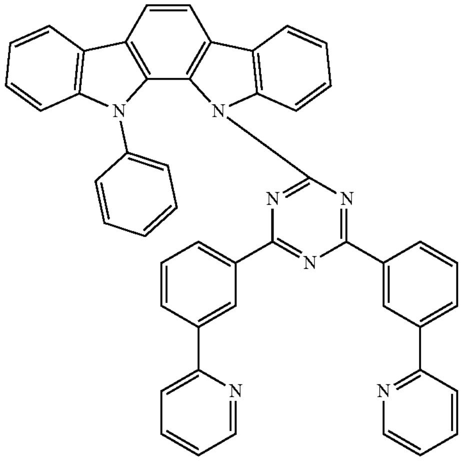
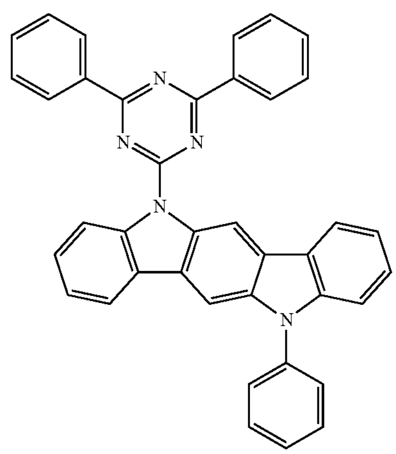

-continued
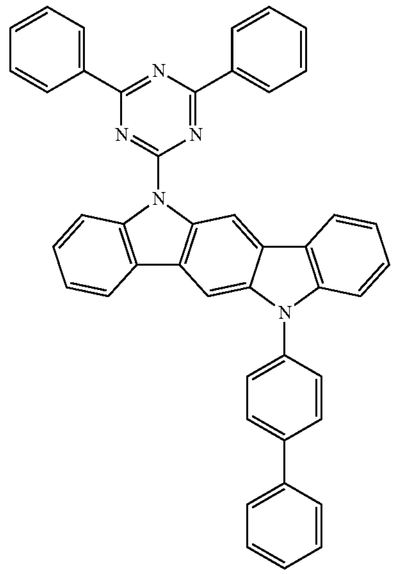
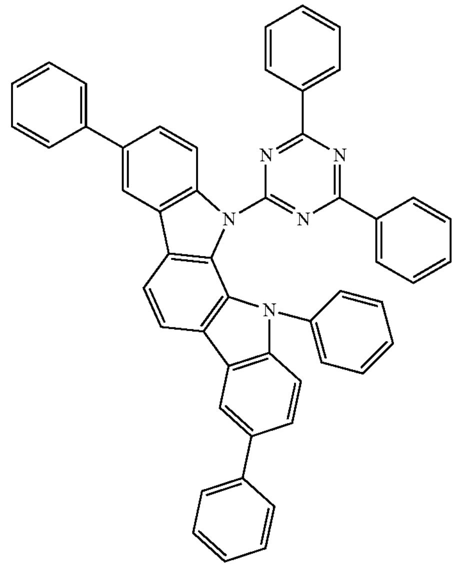
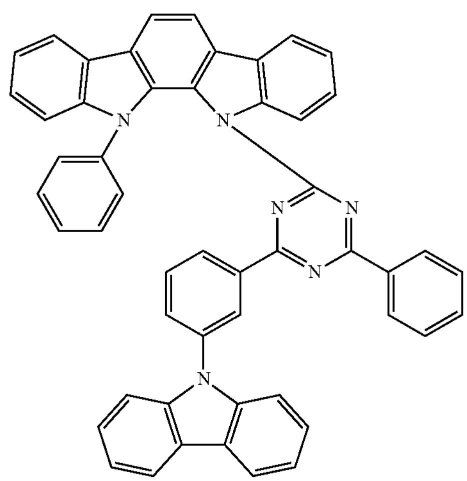
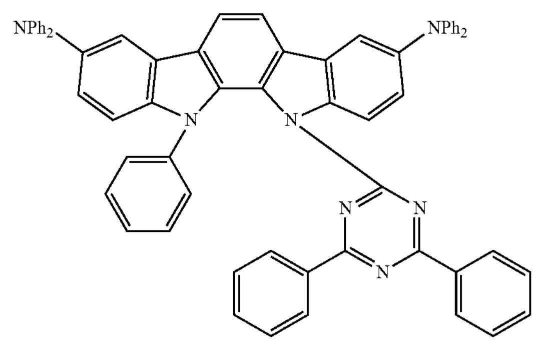
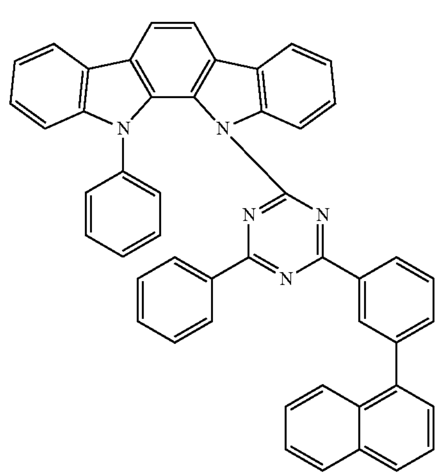
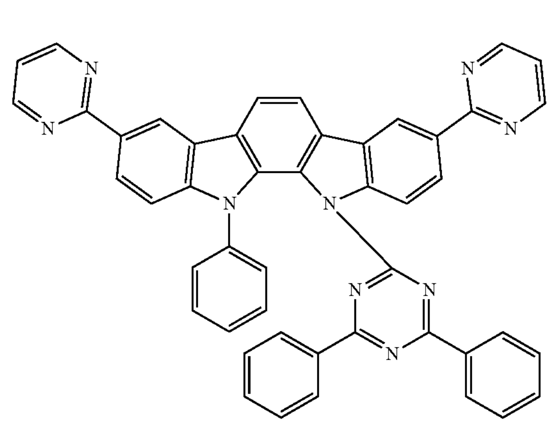

-continued
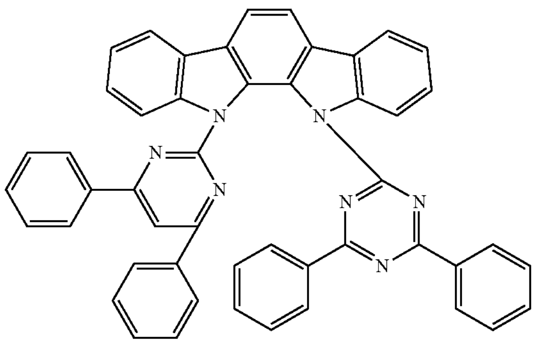
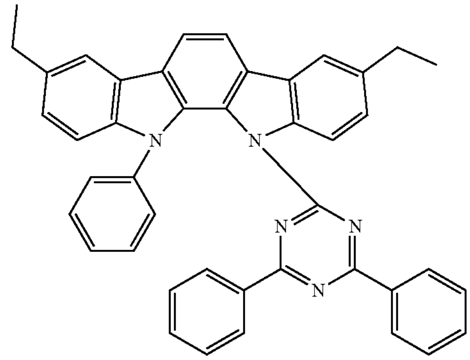
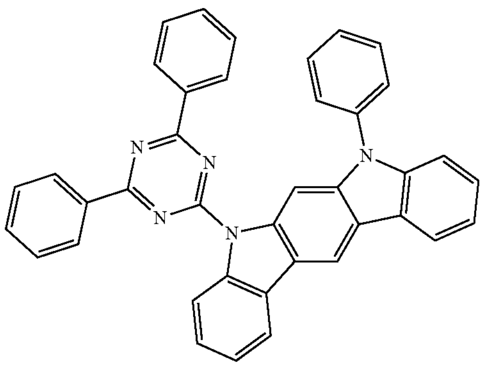
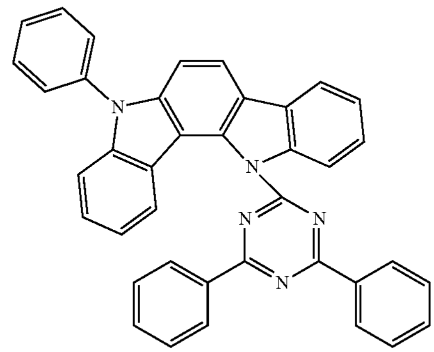
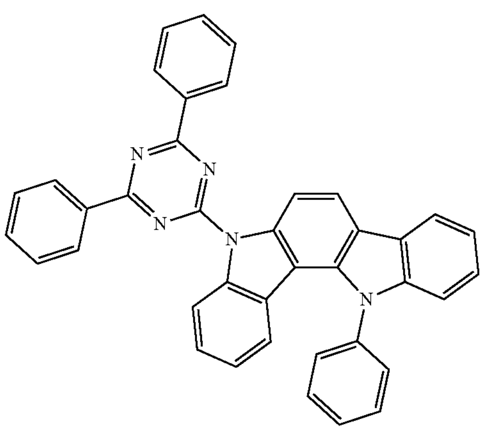
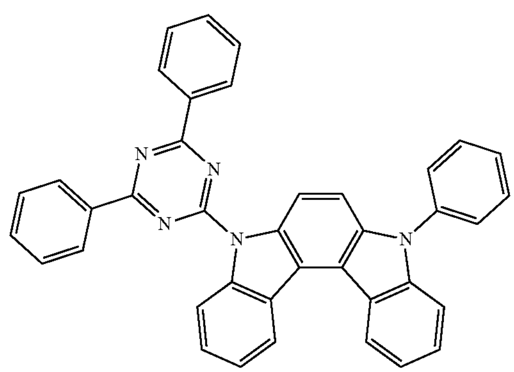
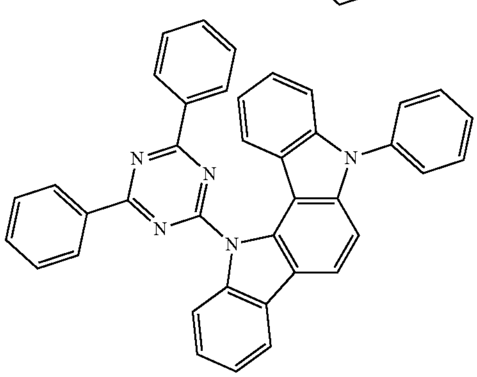
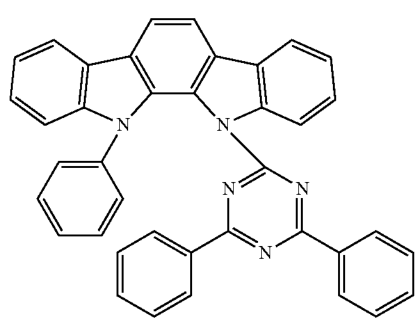

-continued
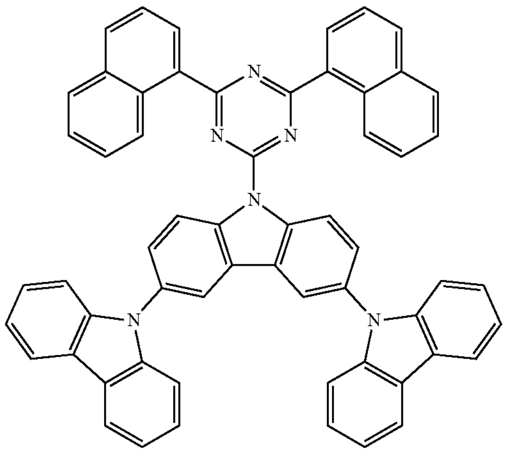
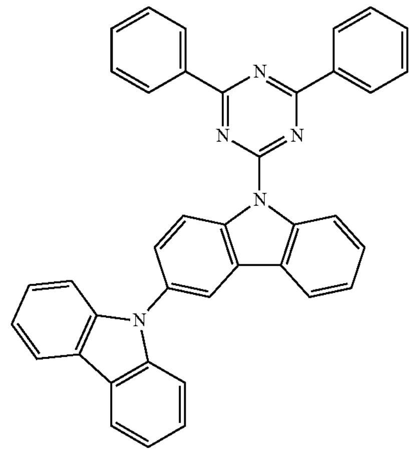
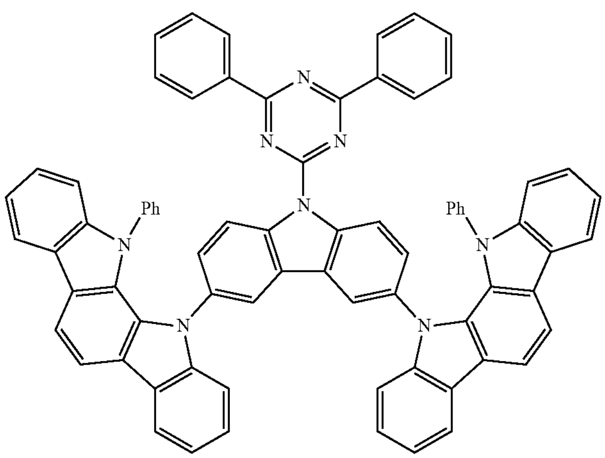
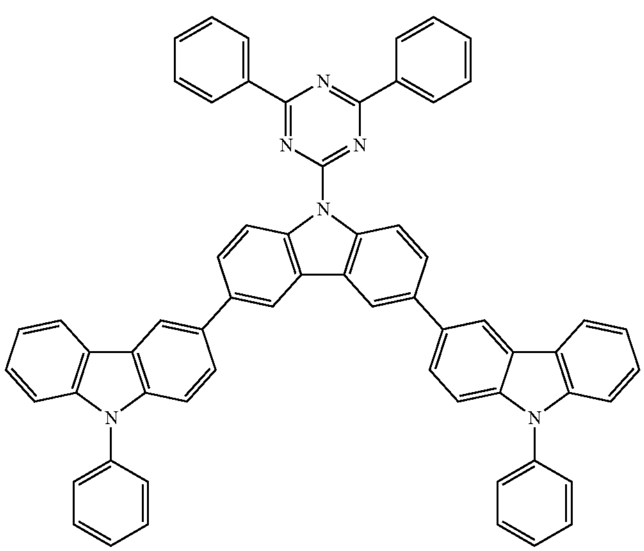

-continued
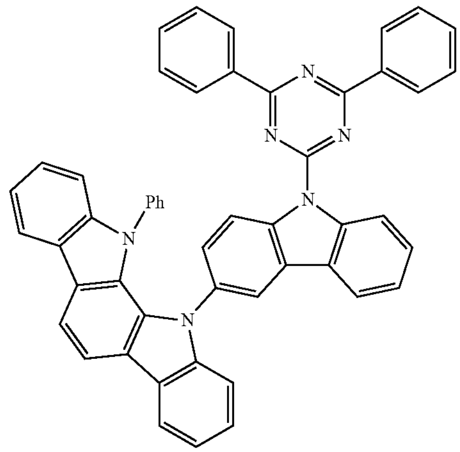
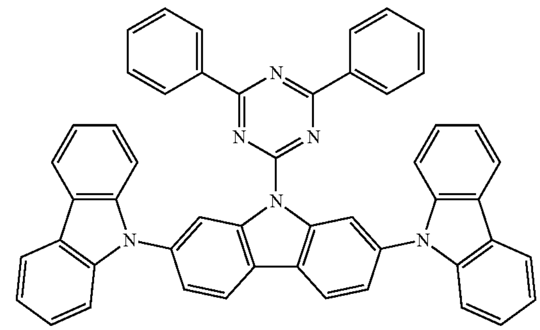
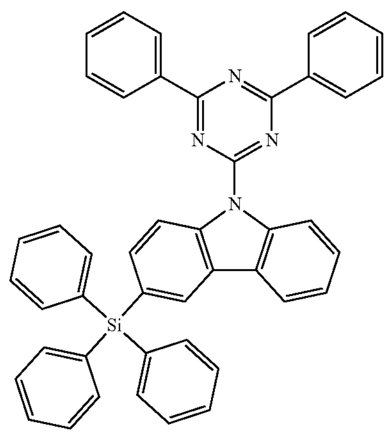
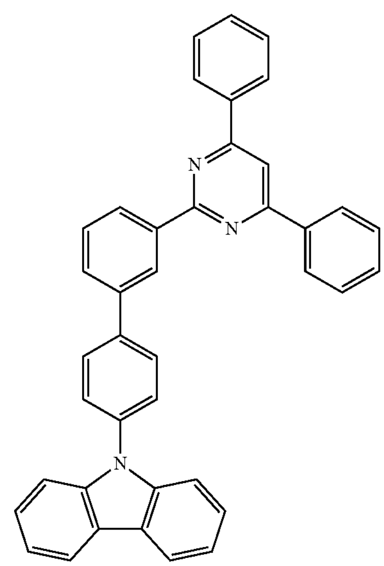
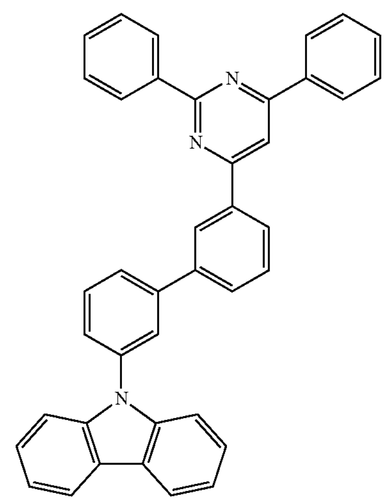
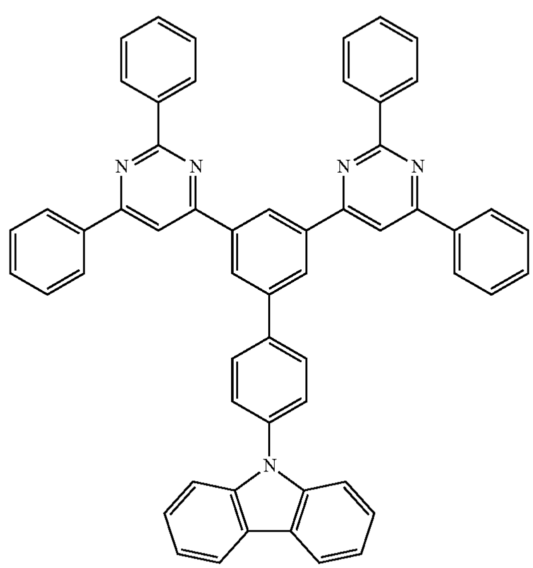
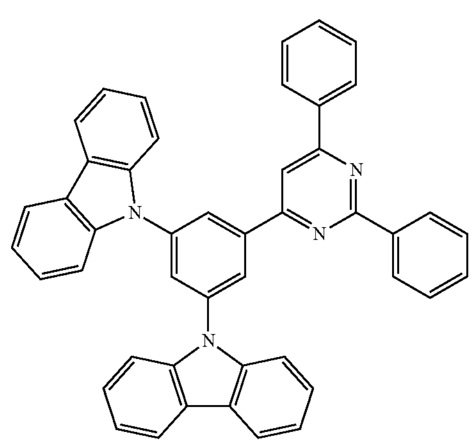

-continued
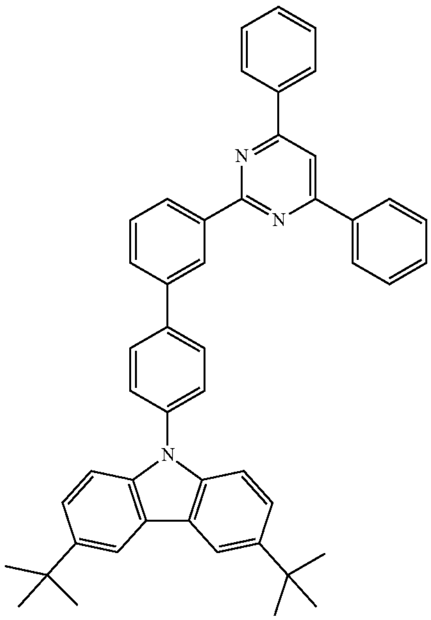
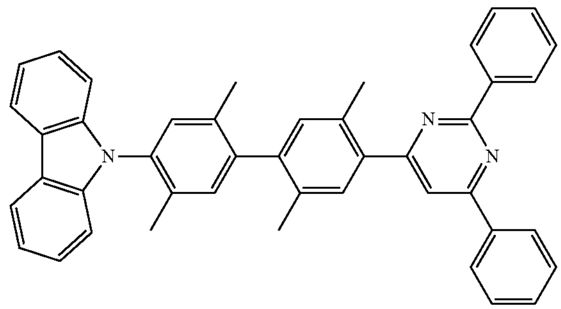
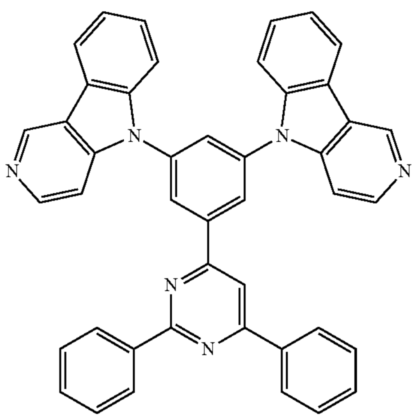
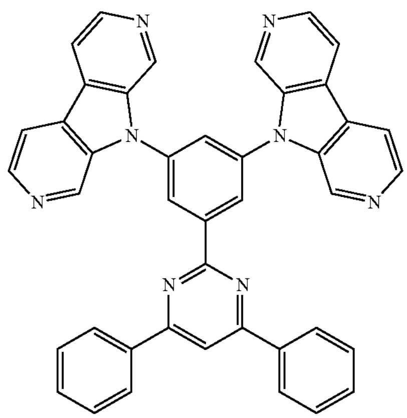
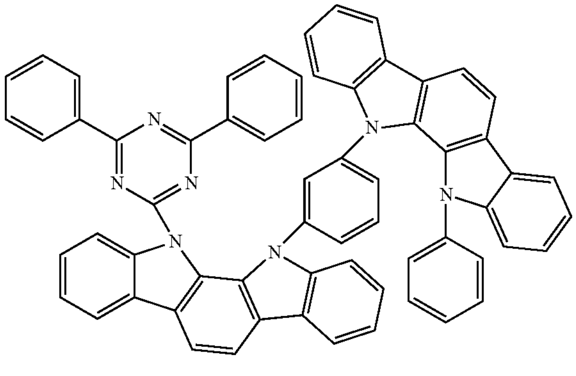
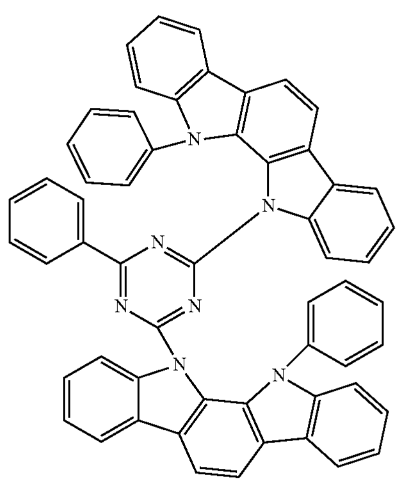

-continued
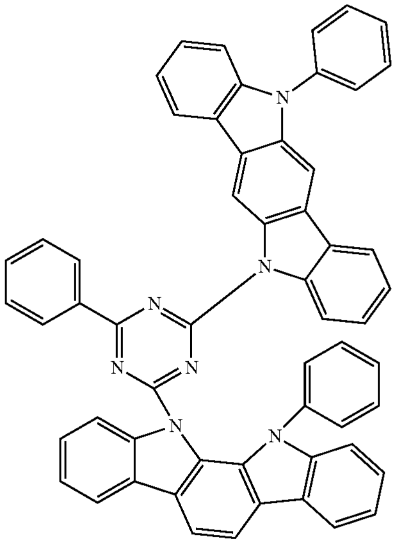
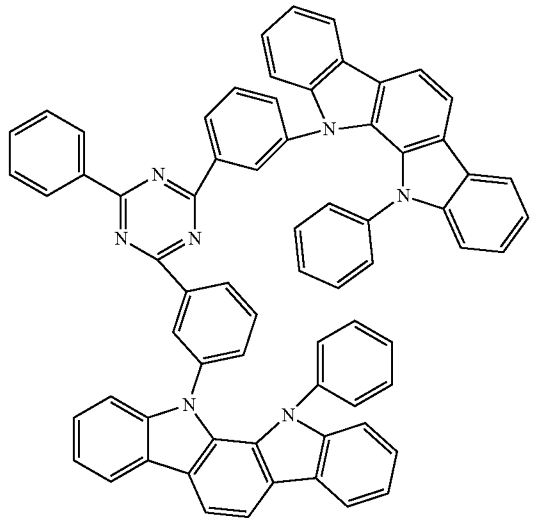
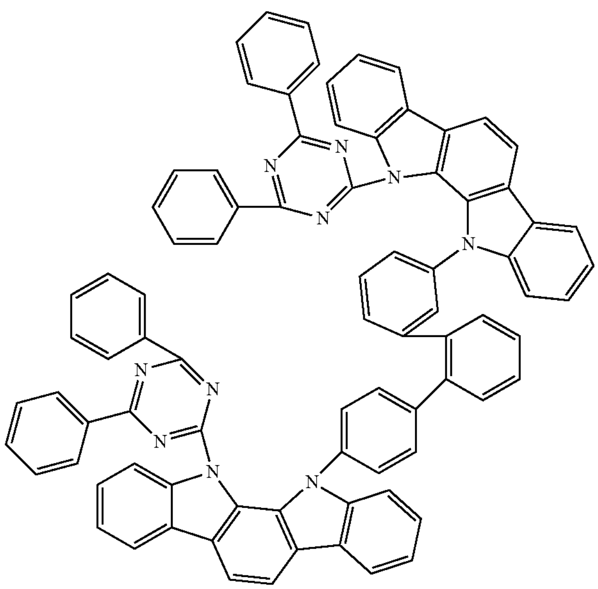
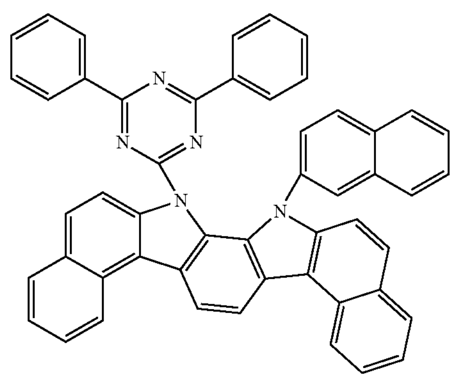
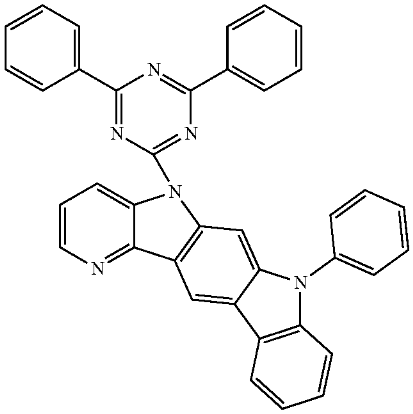
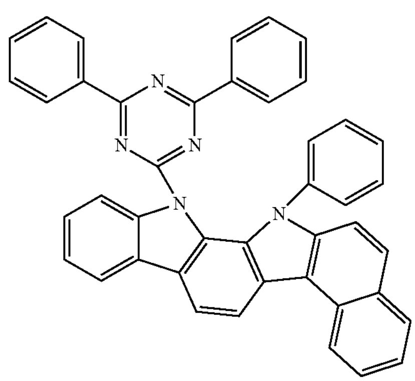

-continued
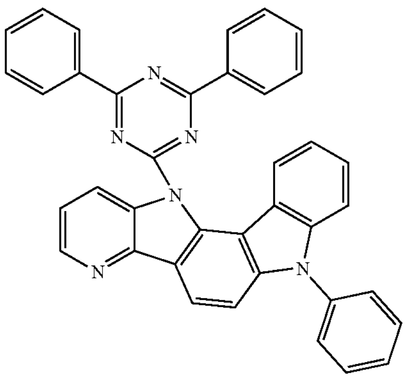
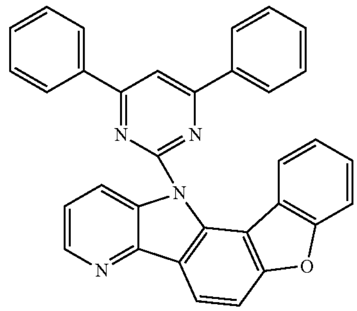
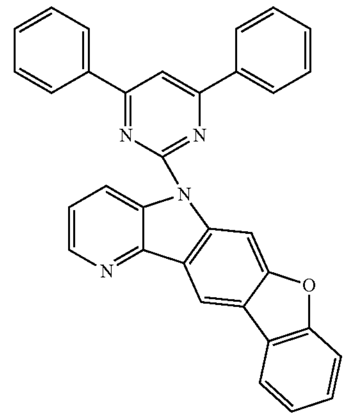
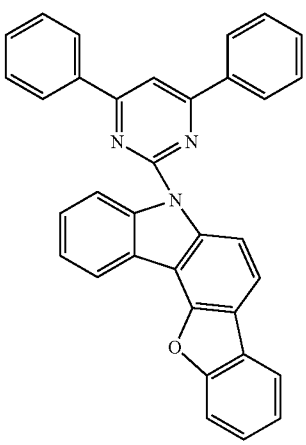
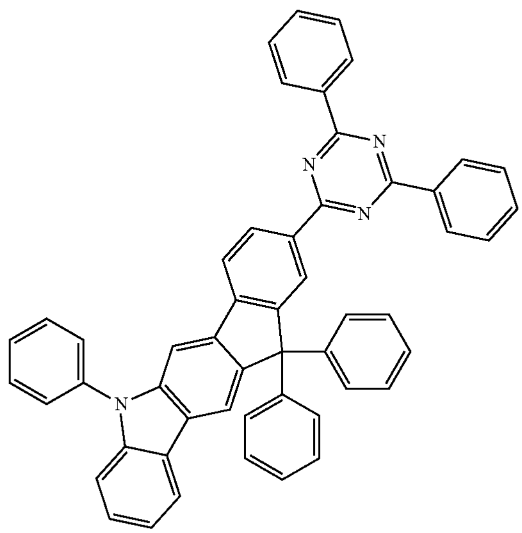
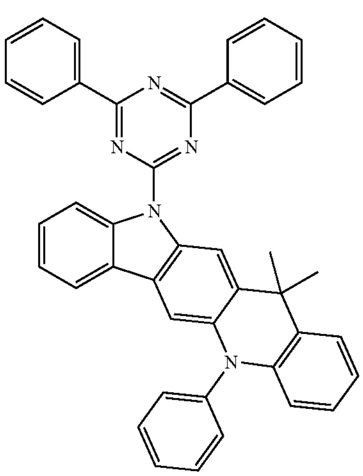
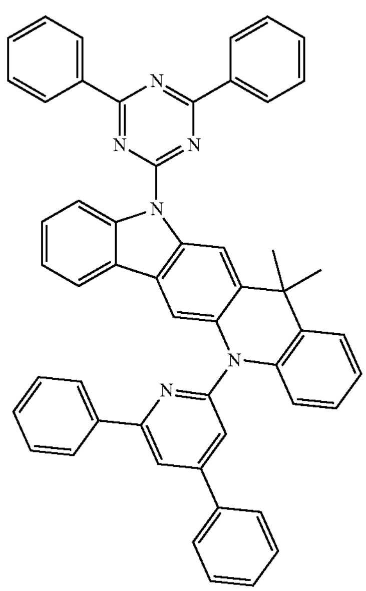
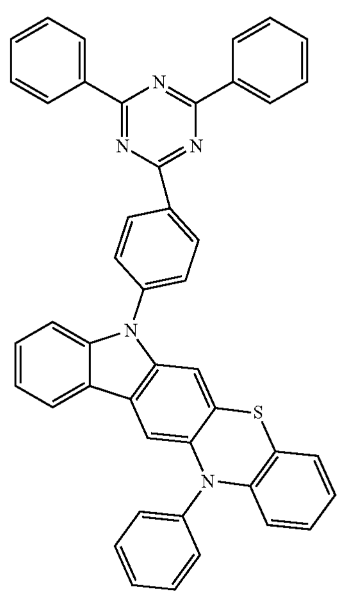

-continued
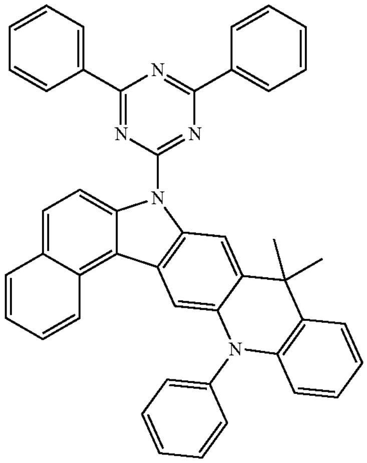
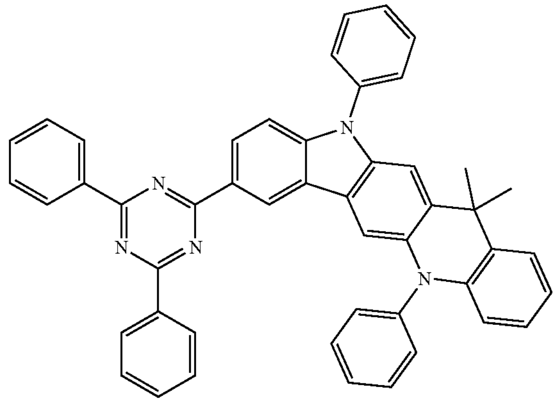
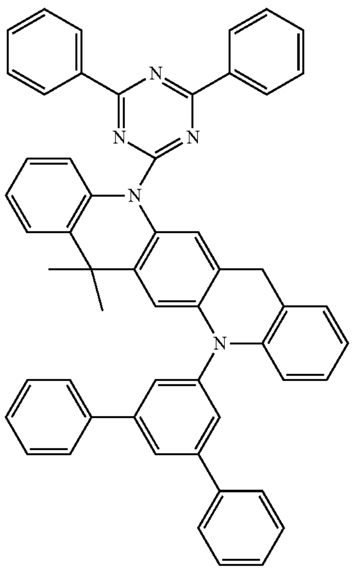
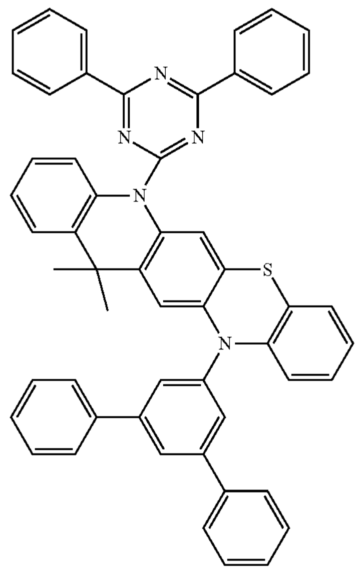
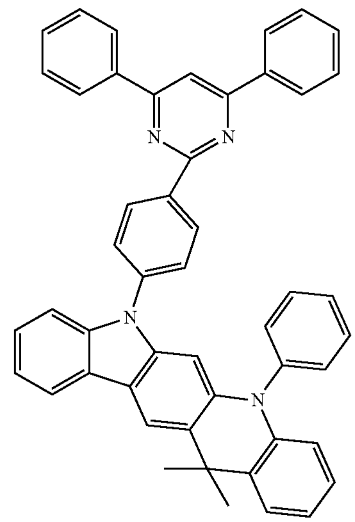
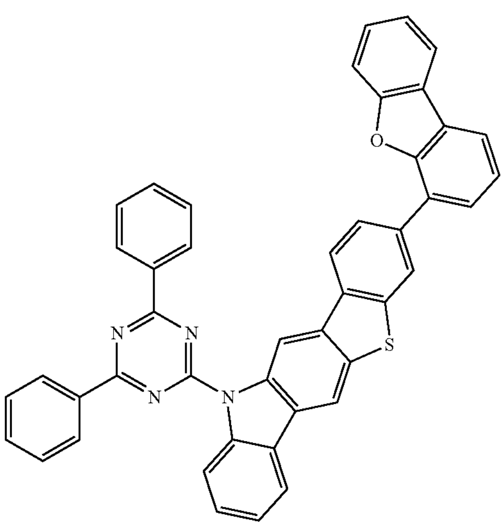
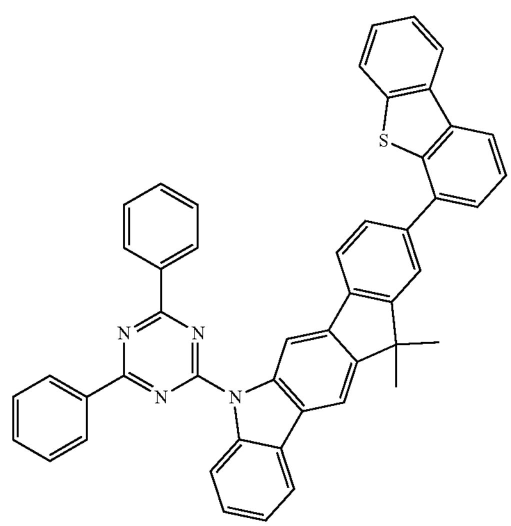

-continued
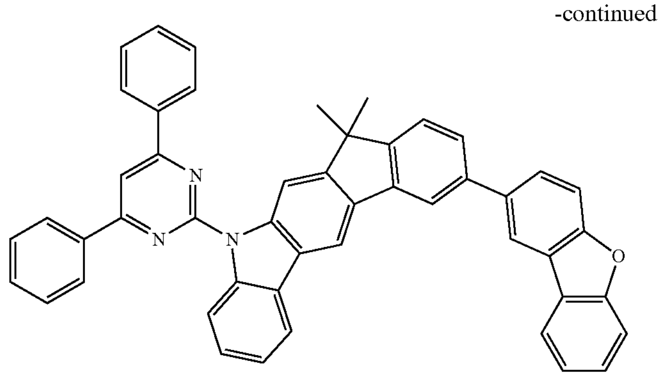
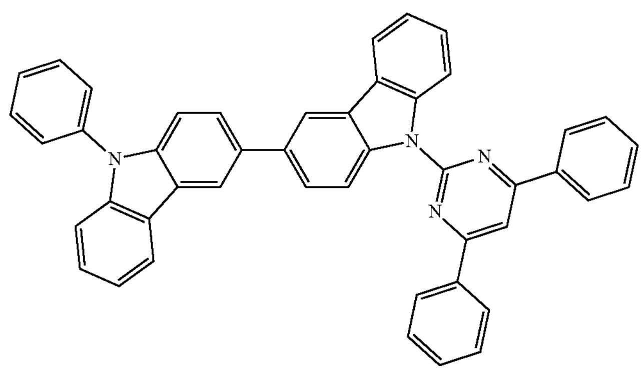
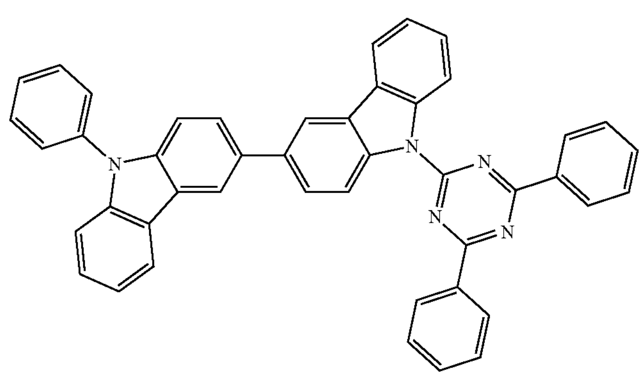
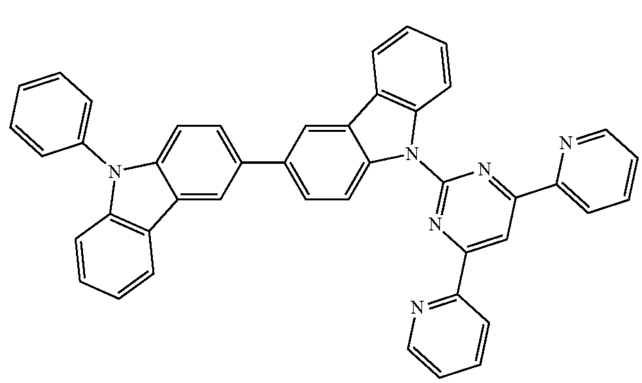
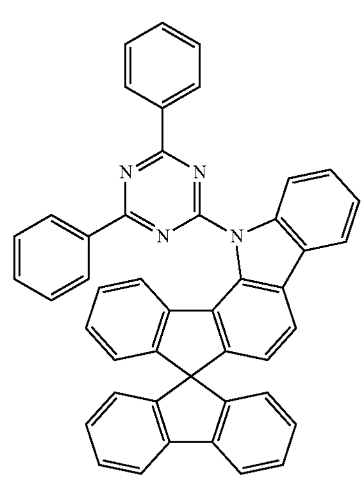

-continued
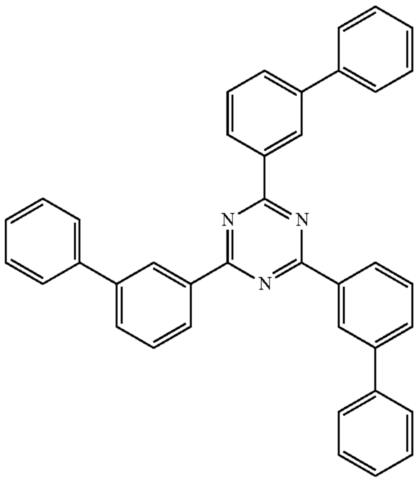
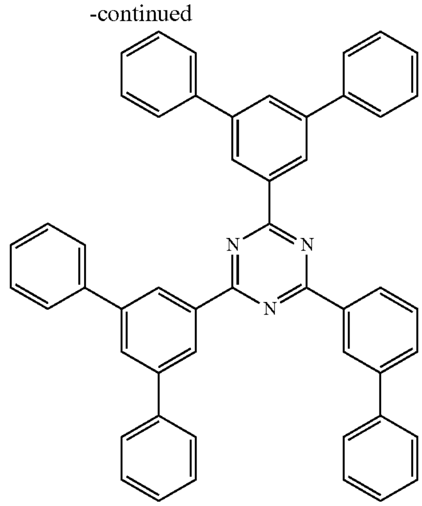
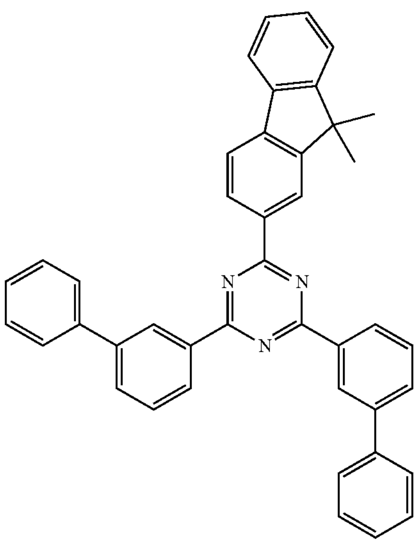
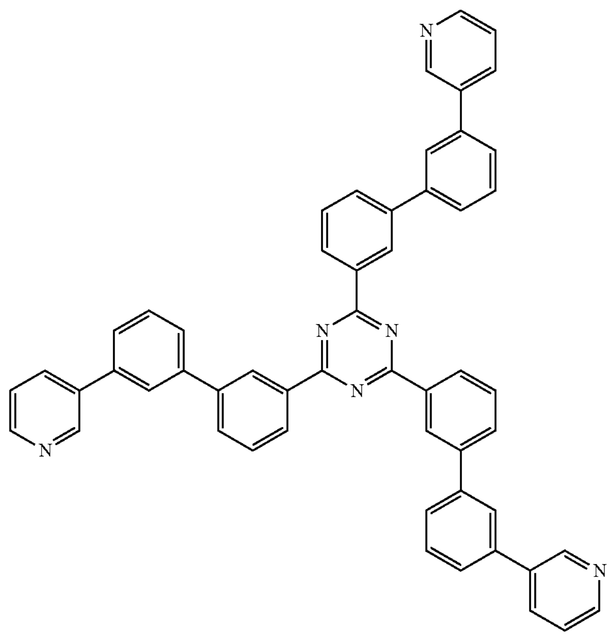
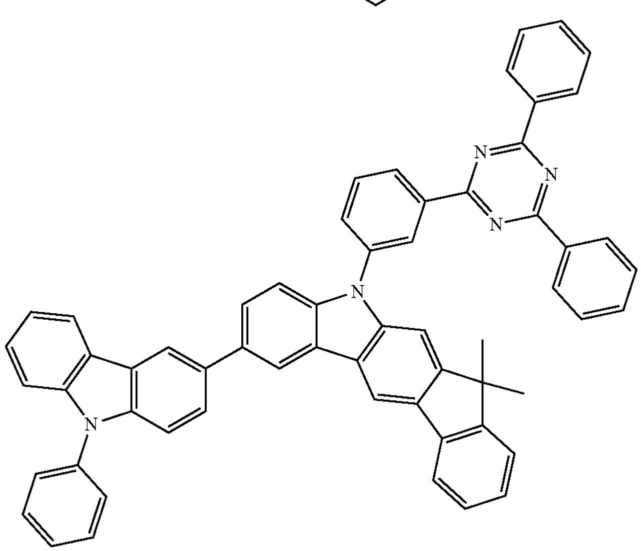

-continued
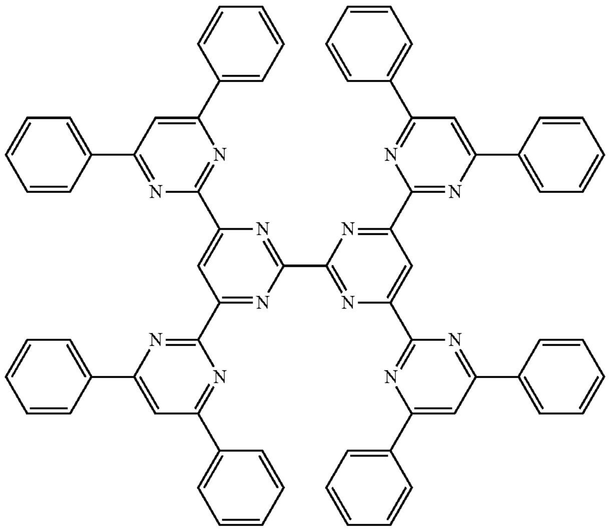
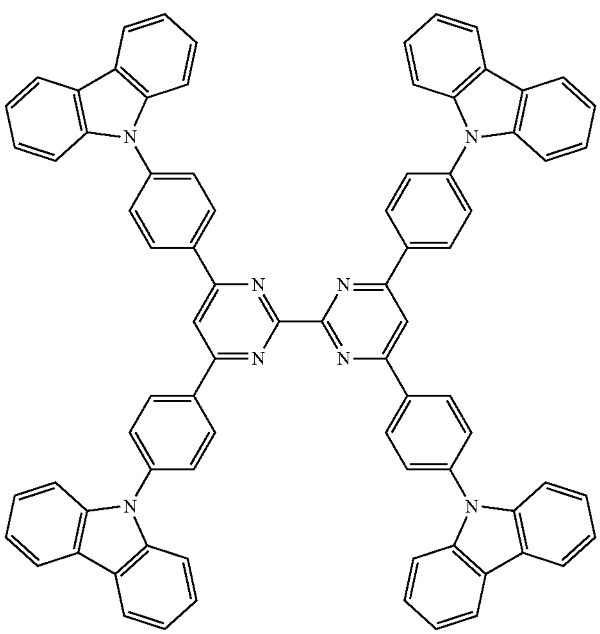
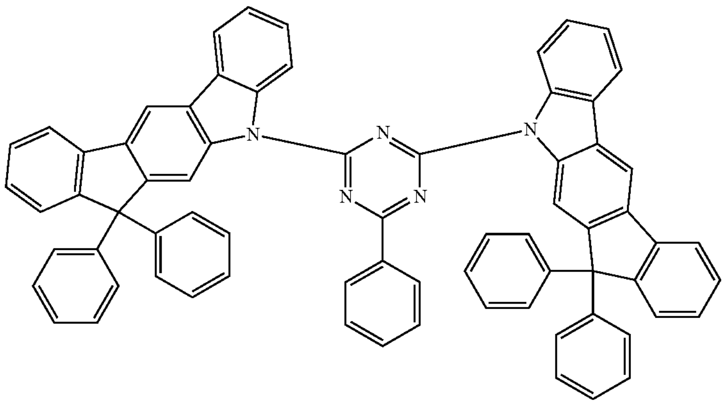

-continued
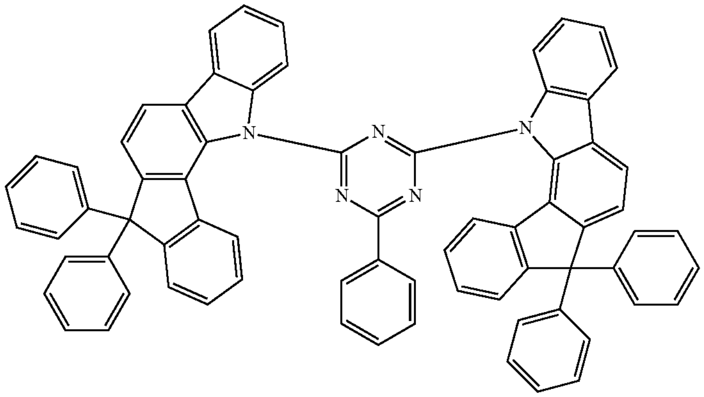
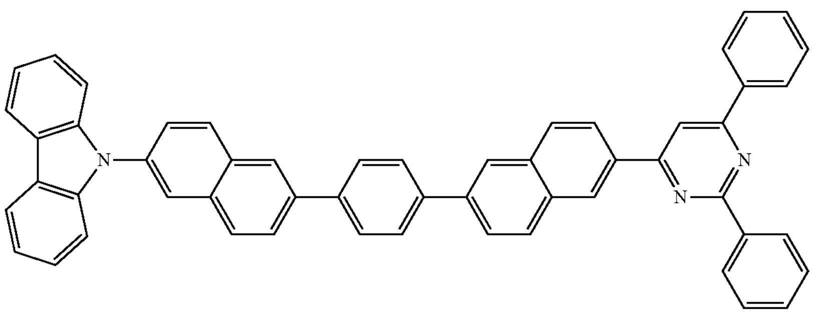
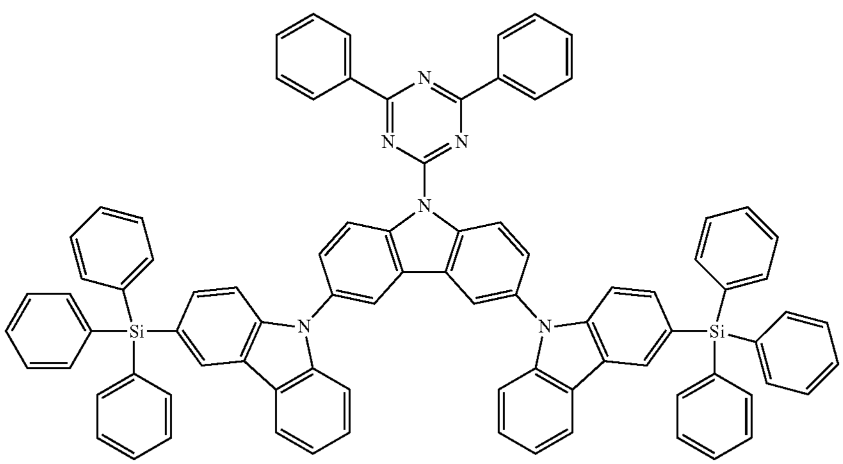
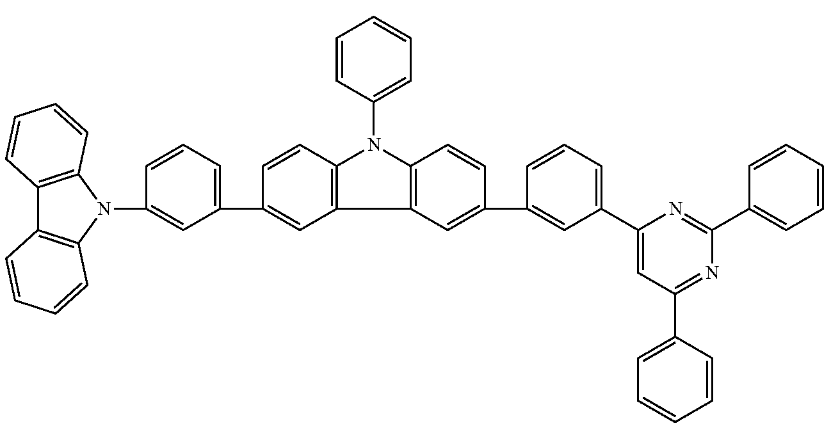

-continued
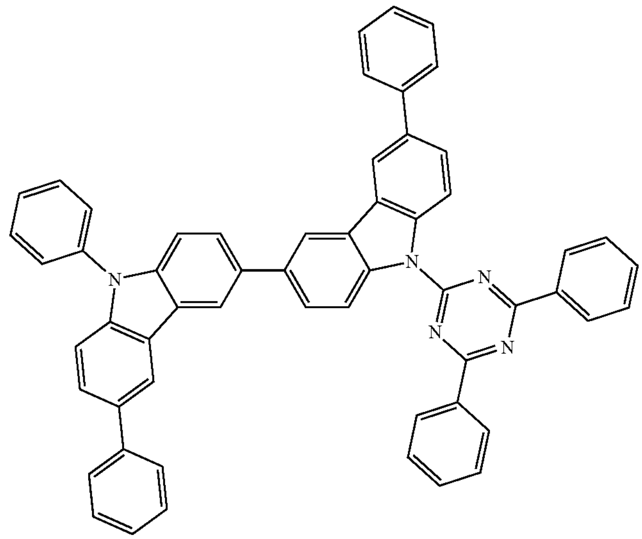
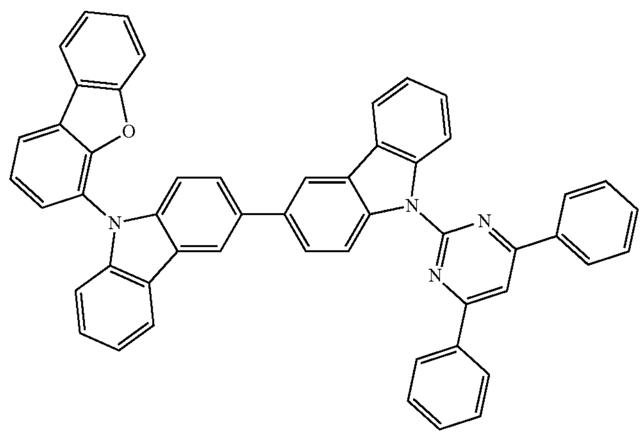
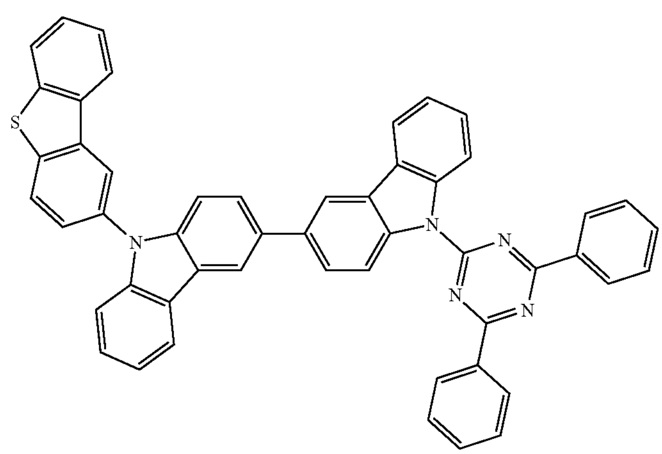

-continued
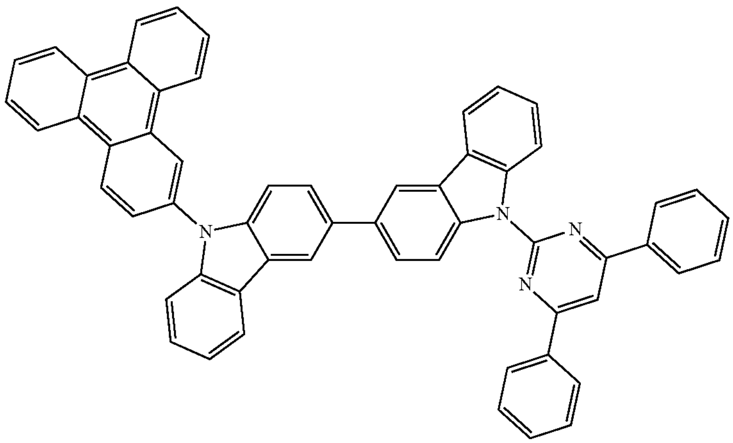
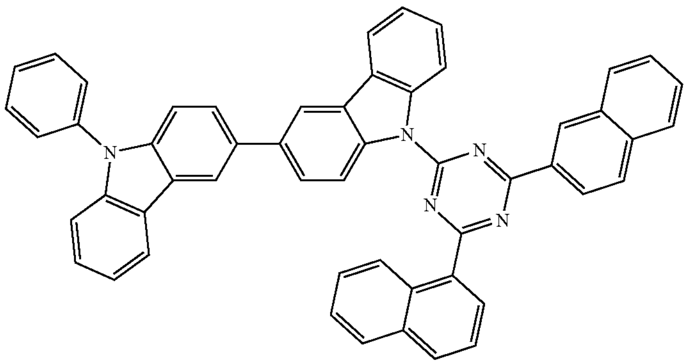
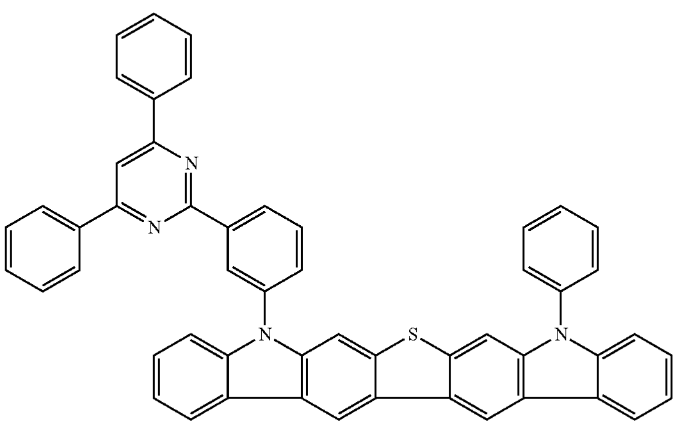
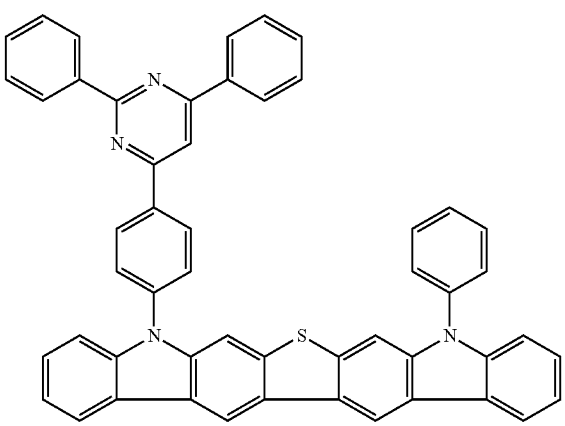

-continued
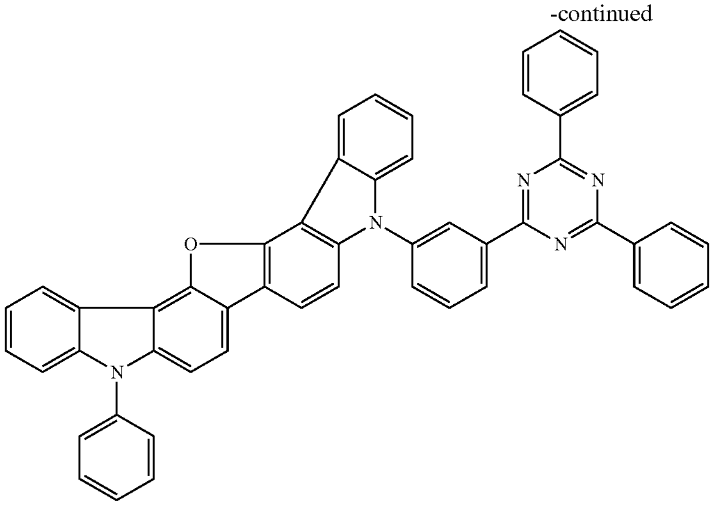
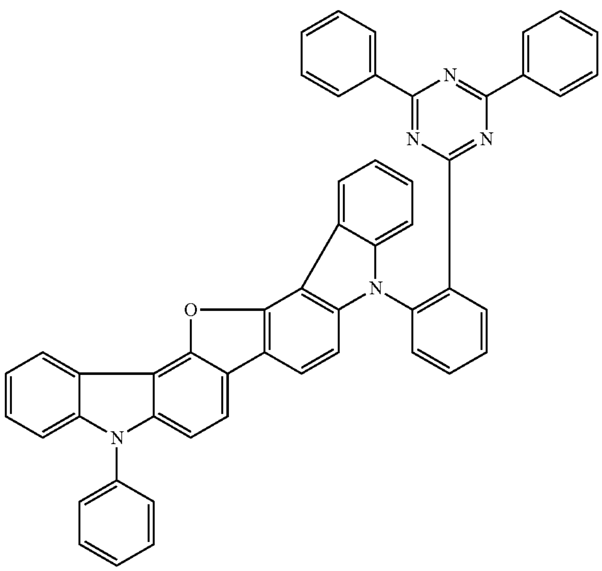
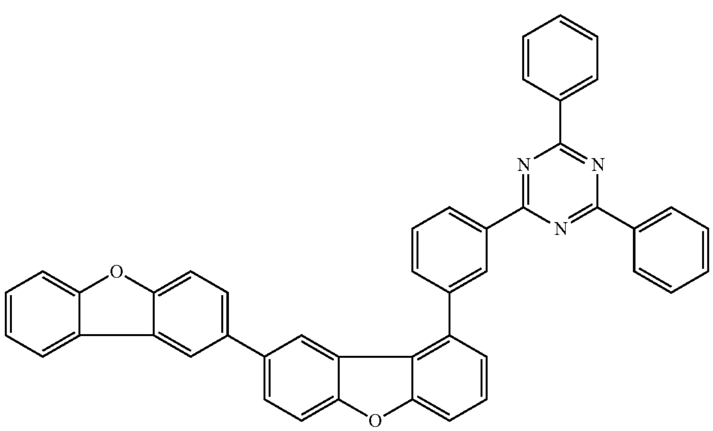

-continued
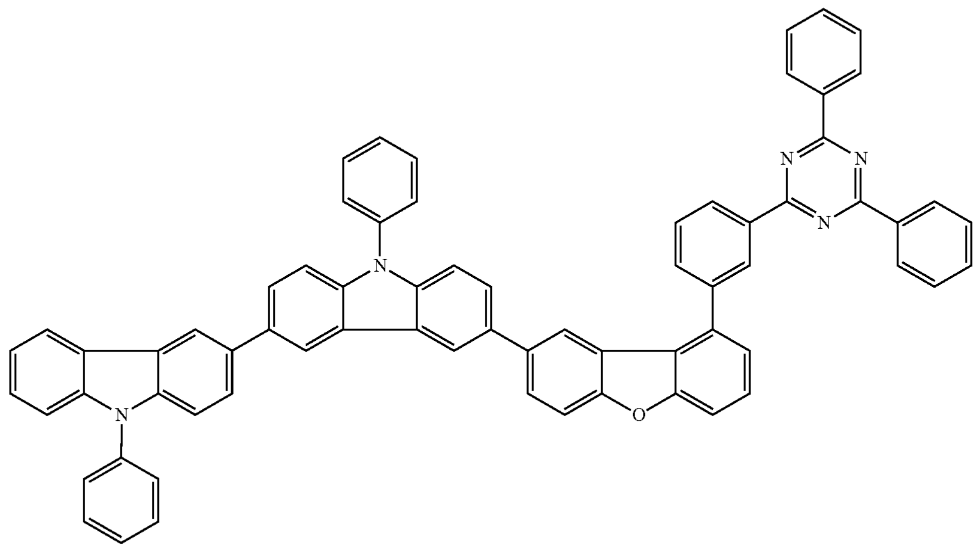
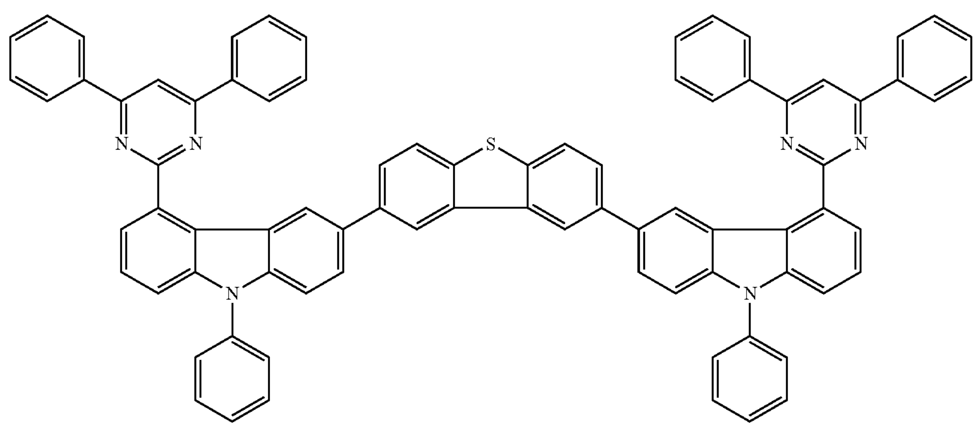
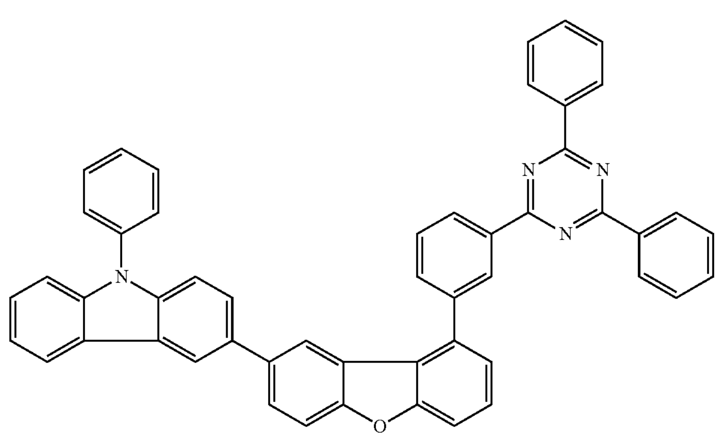

-continued
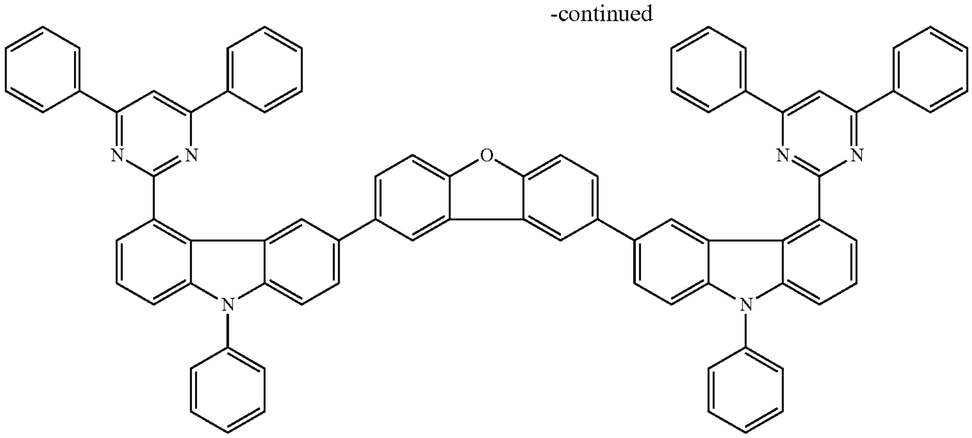
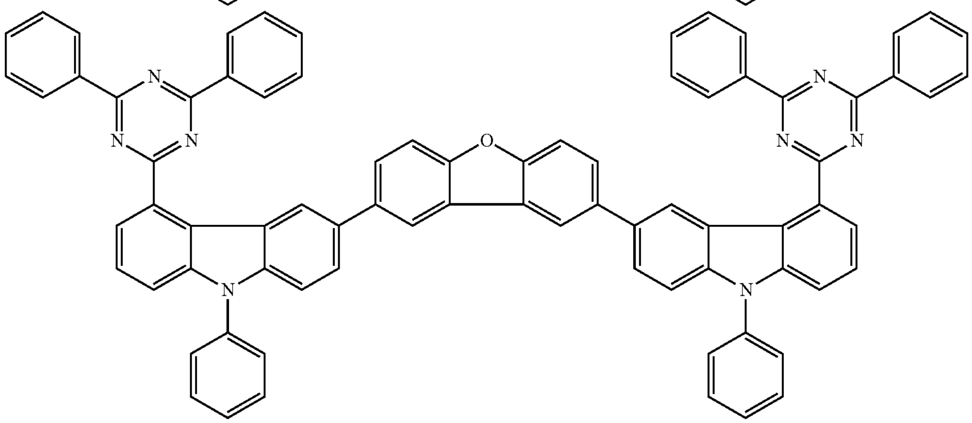
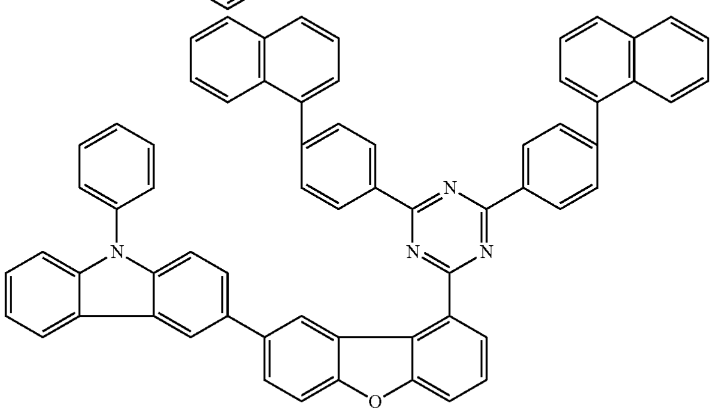
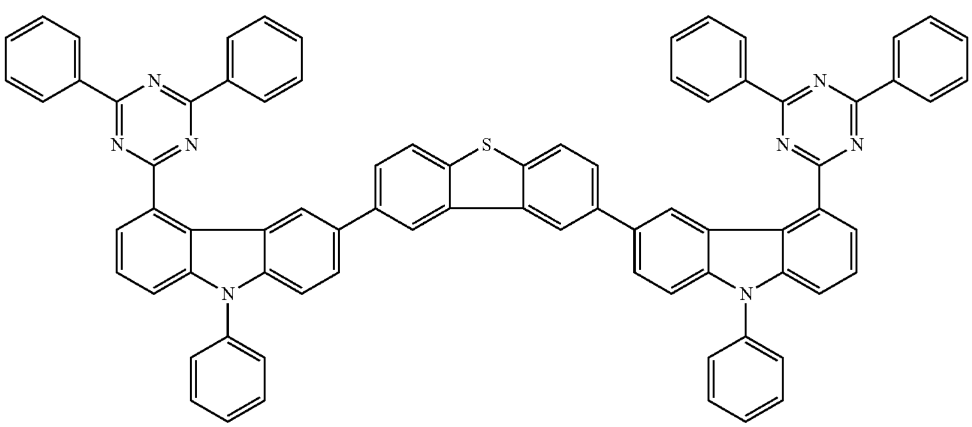

-continued
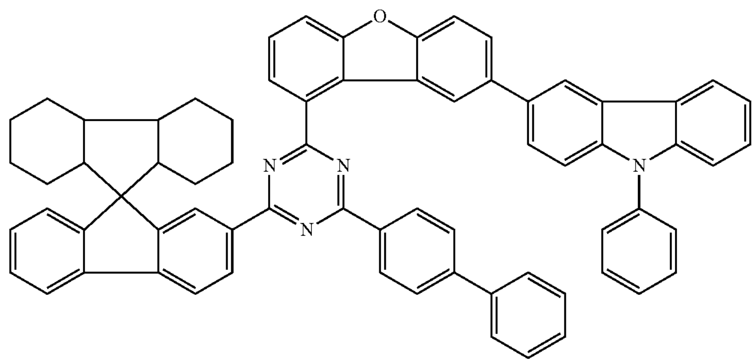
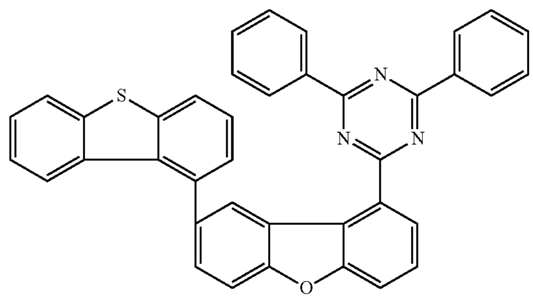
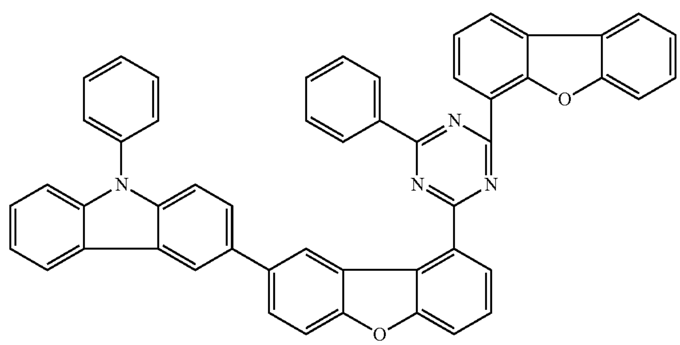
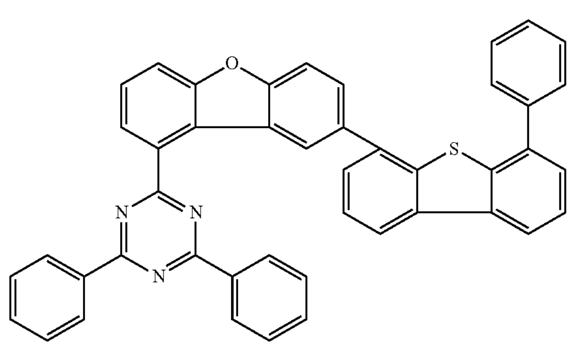

-continued
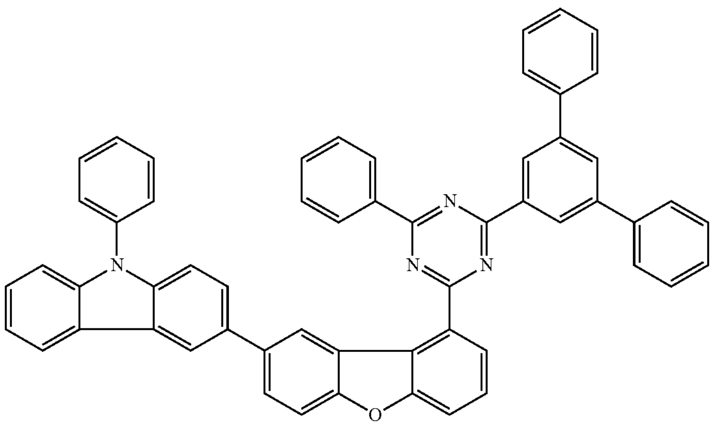
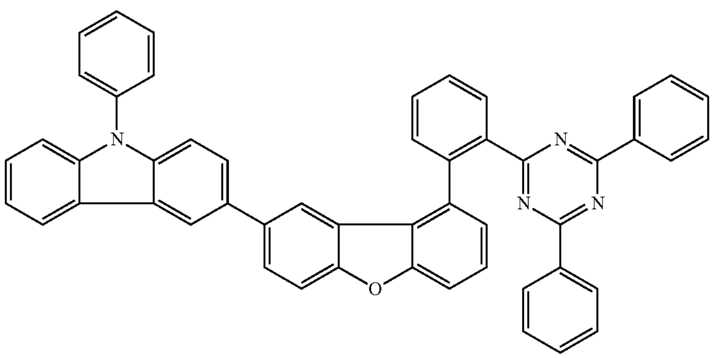
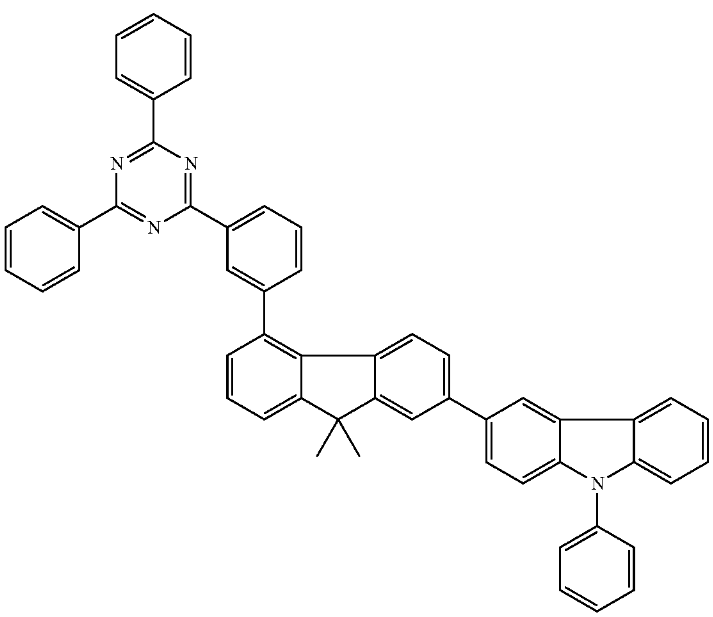

-continued
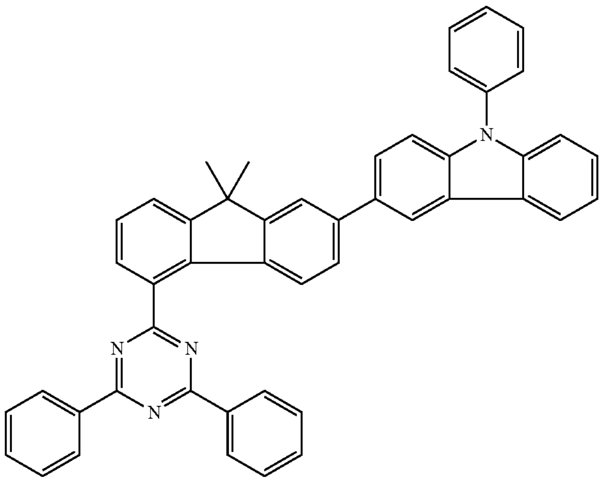
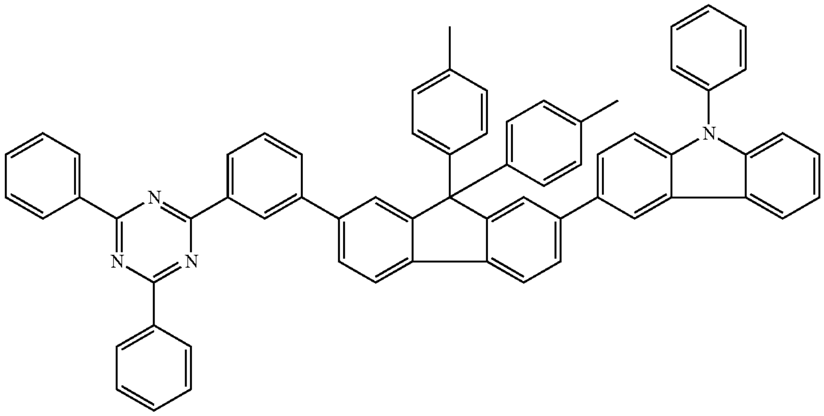
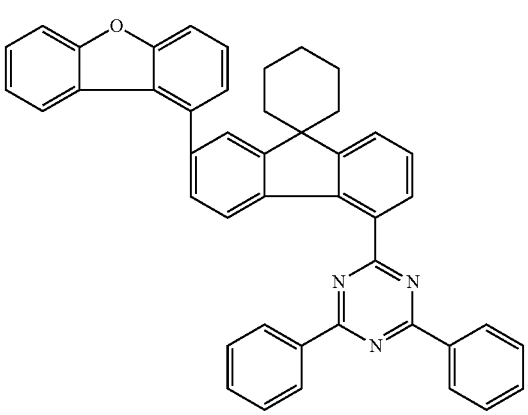
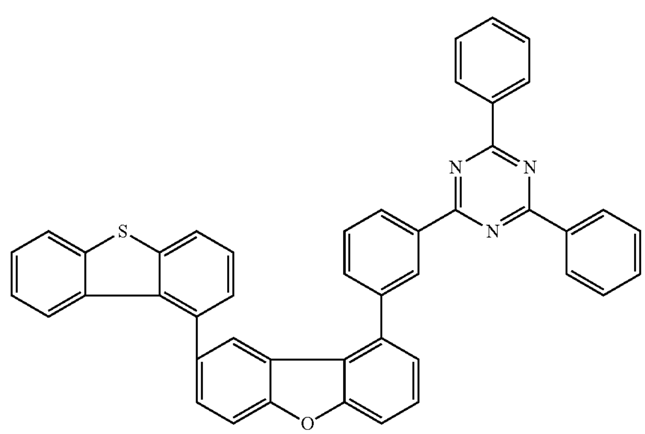

-continued
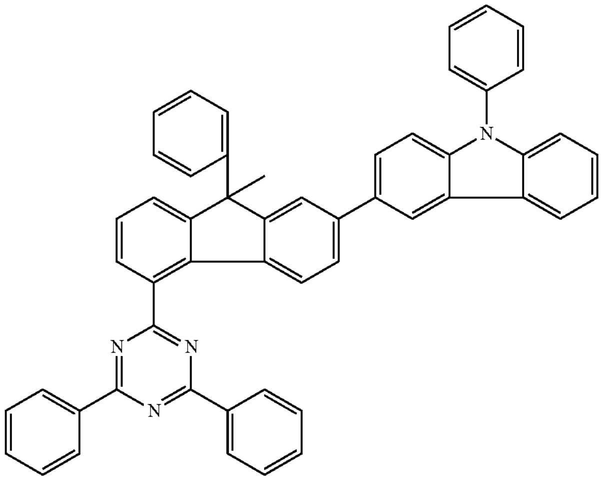
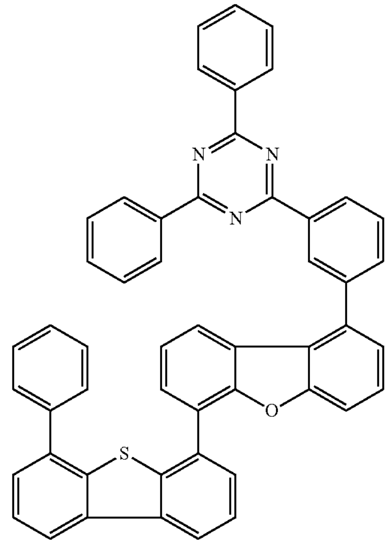
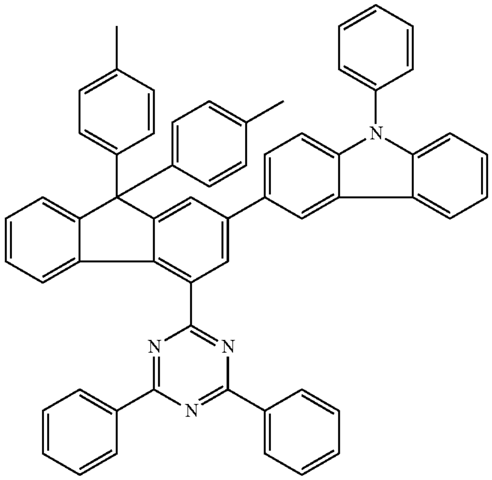
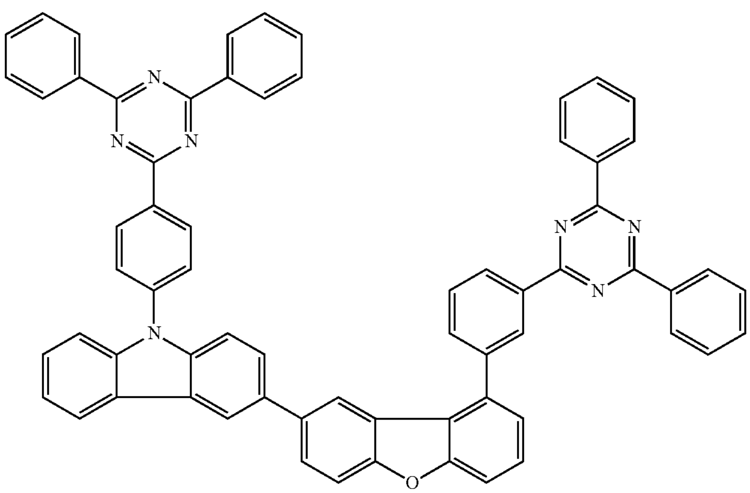

-continued
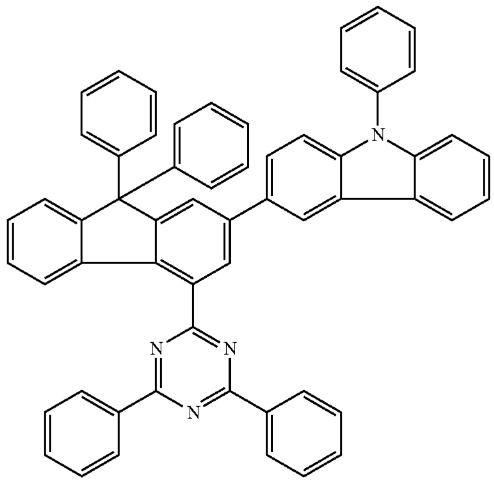
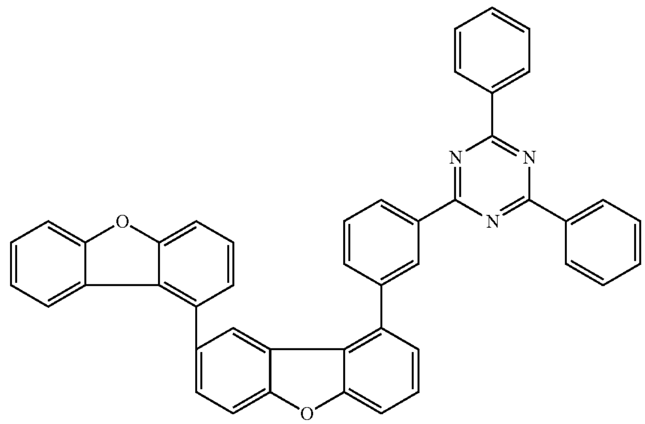
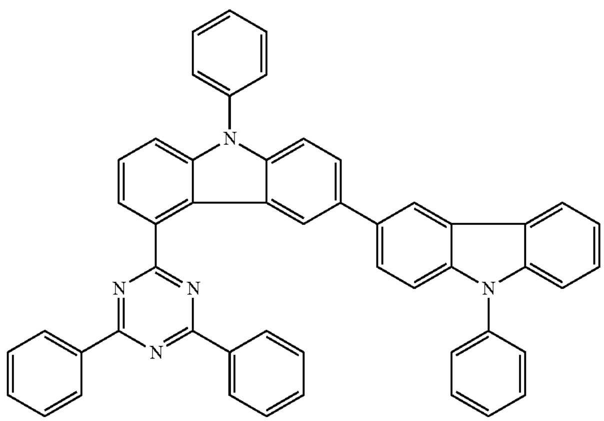
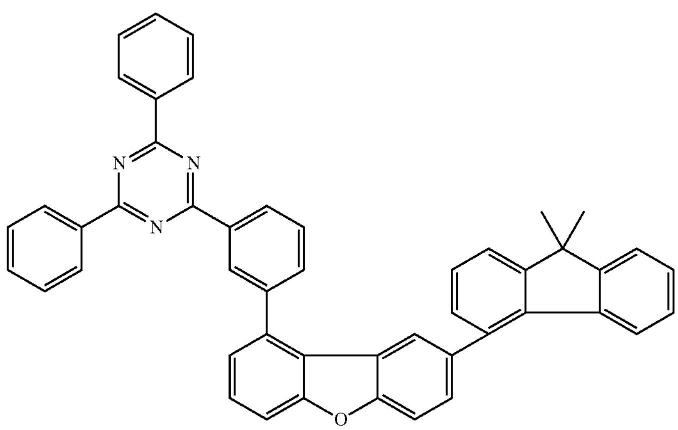
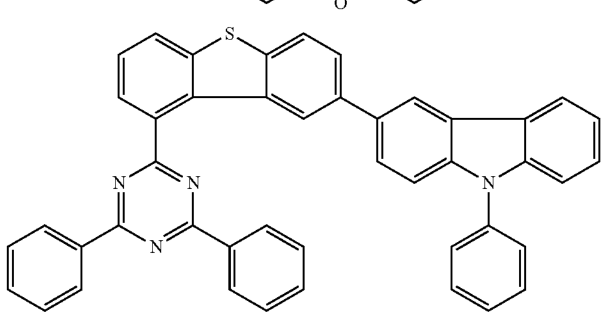

-continued
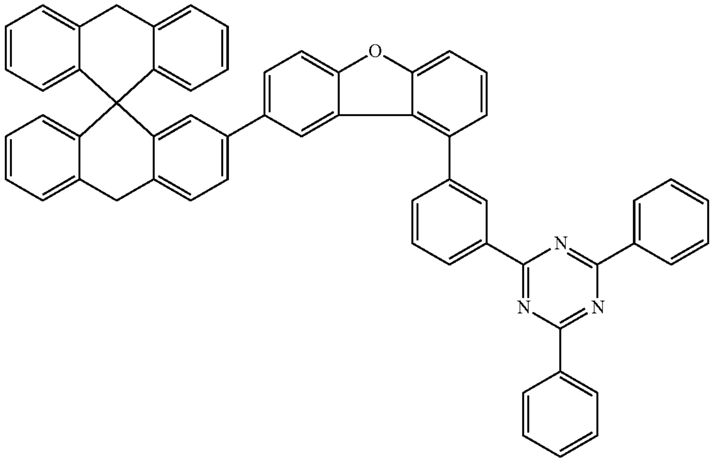
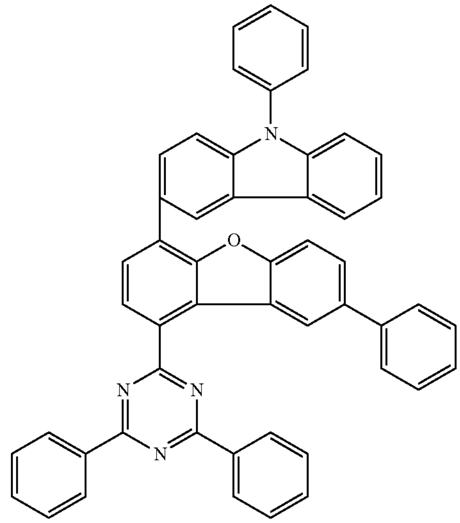
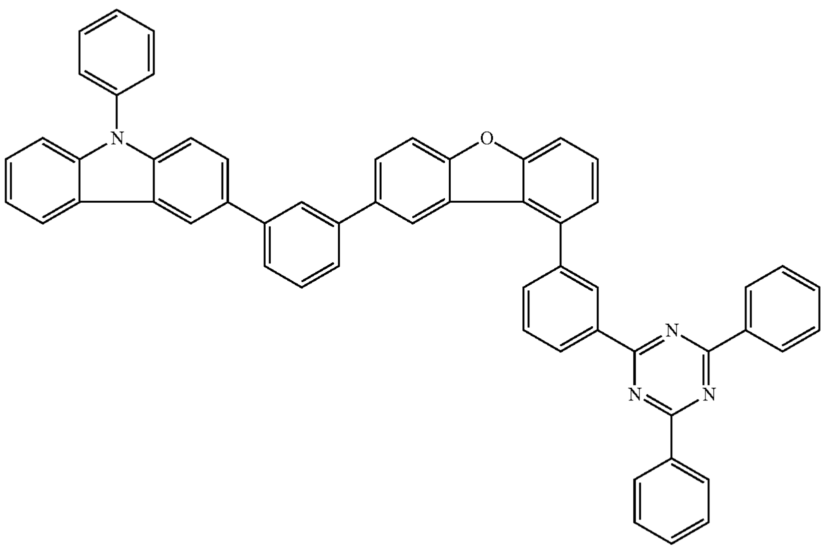
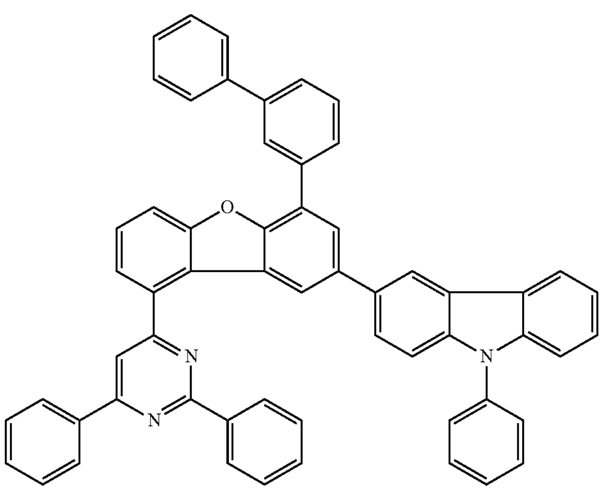

-continued
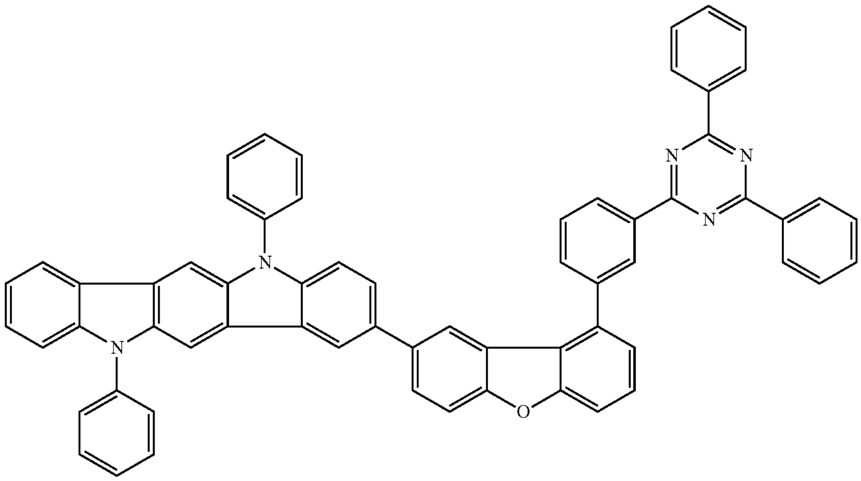
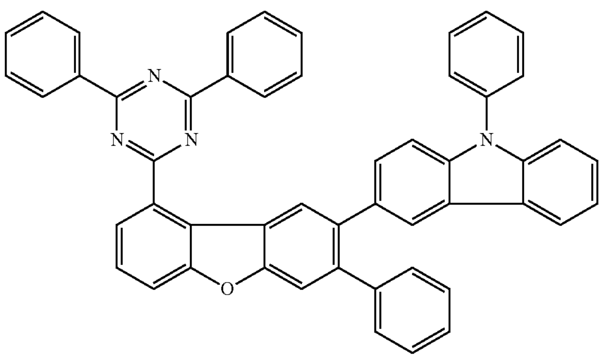
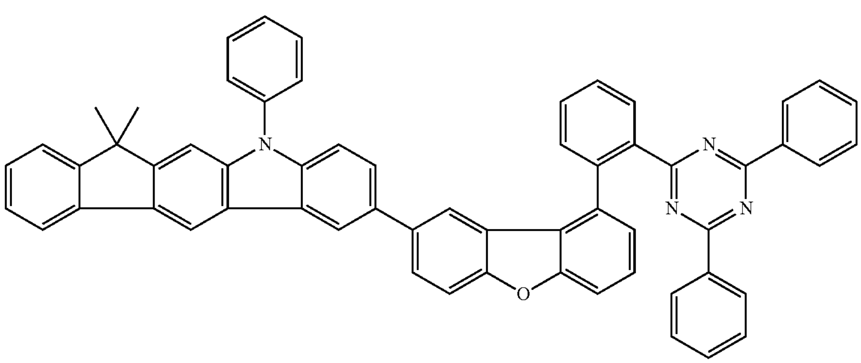
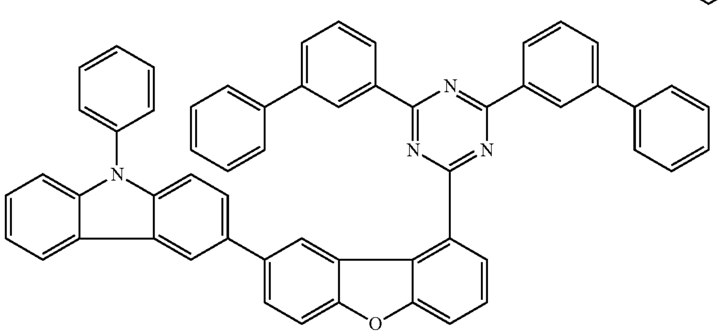

-continued
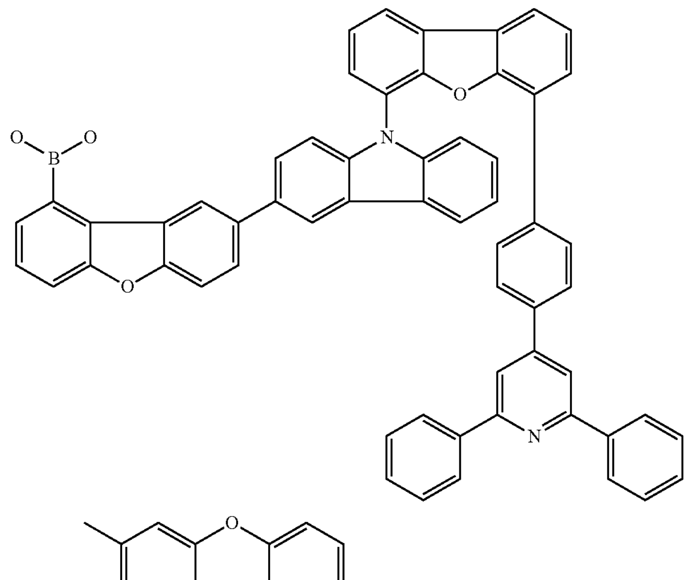
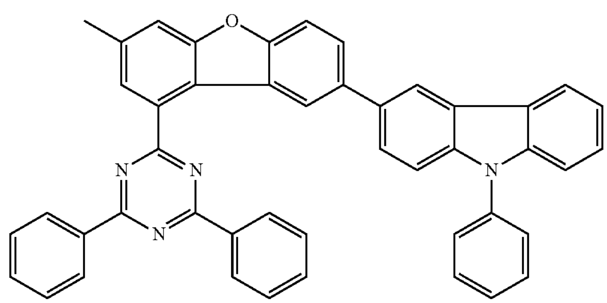
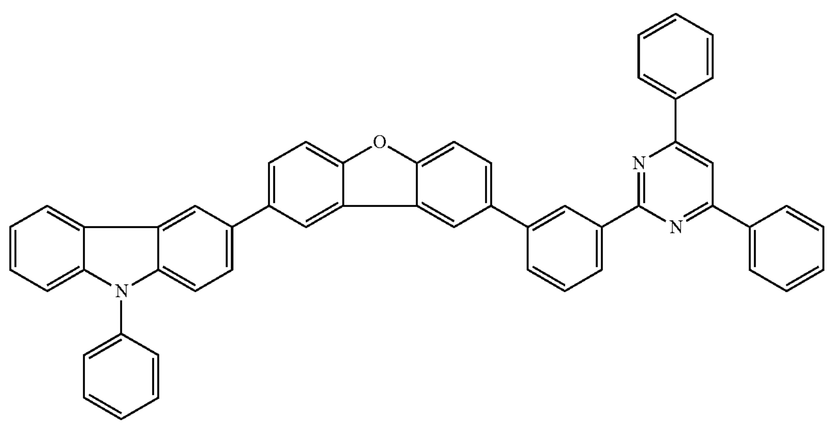
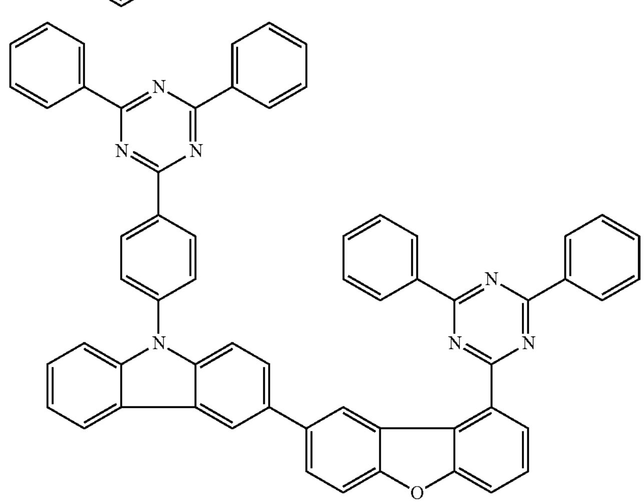

-continued
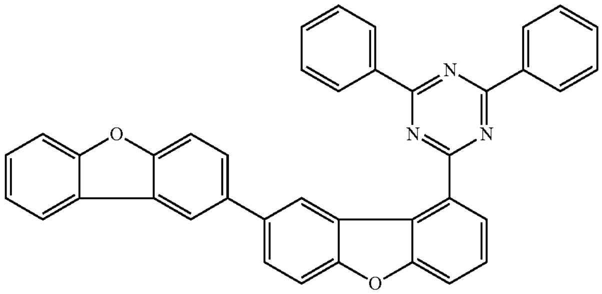
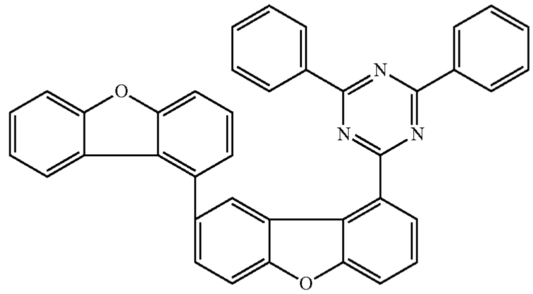
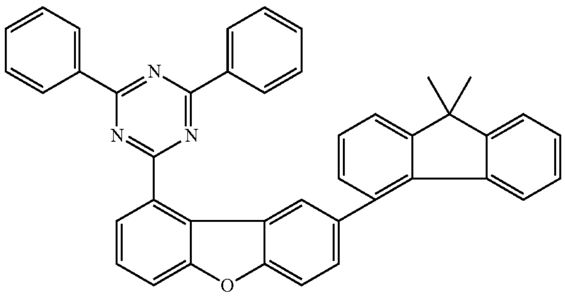
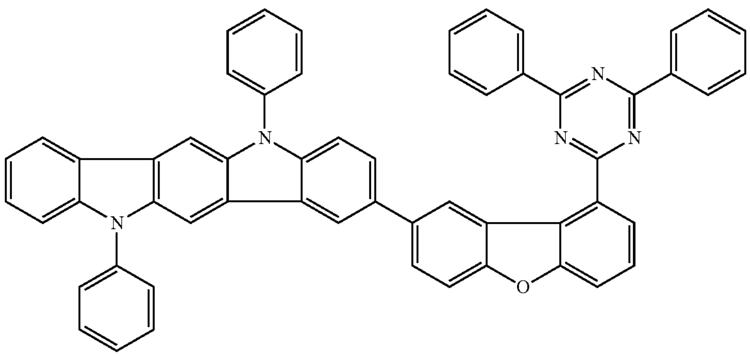
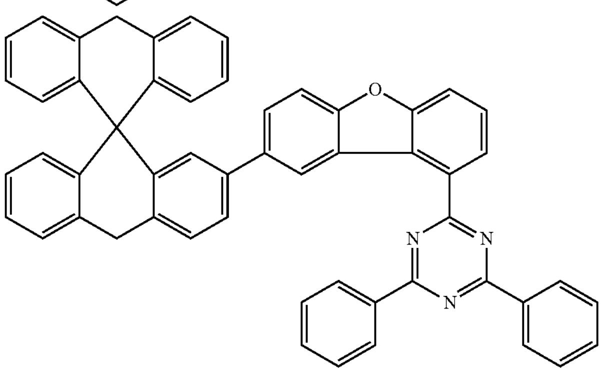
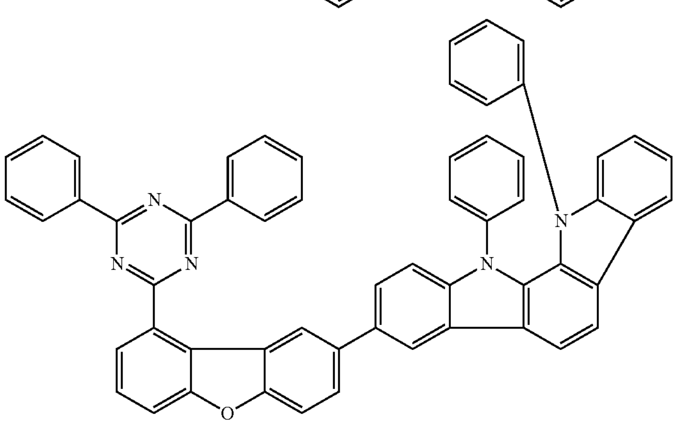

-continued
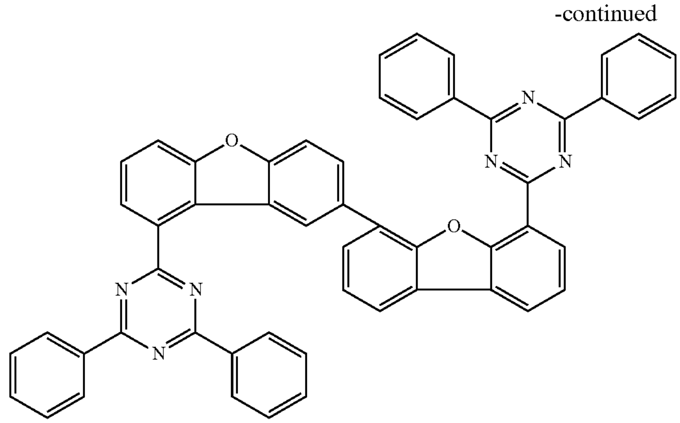
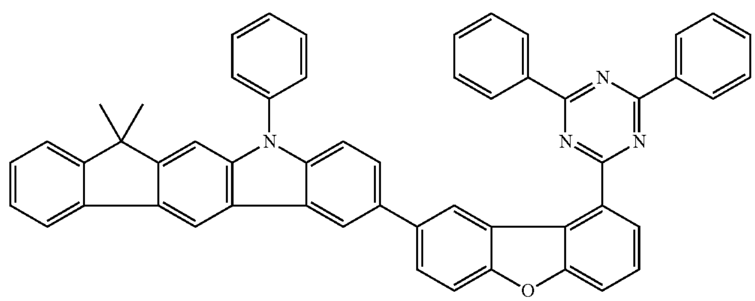
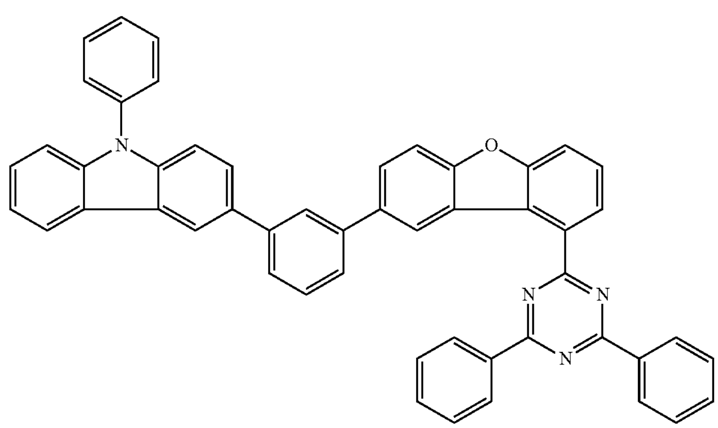
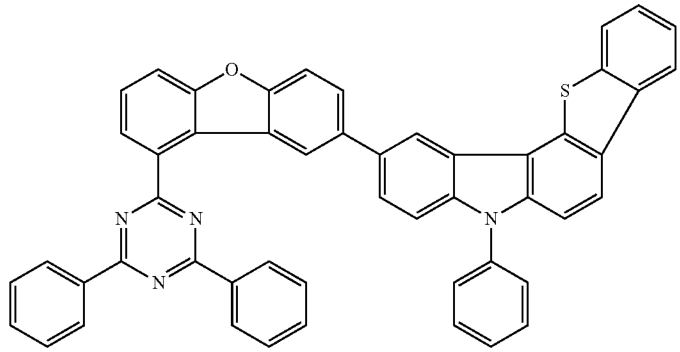

-continued
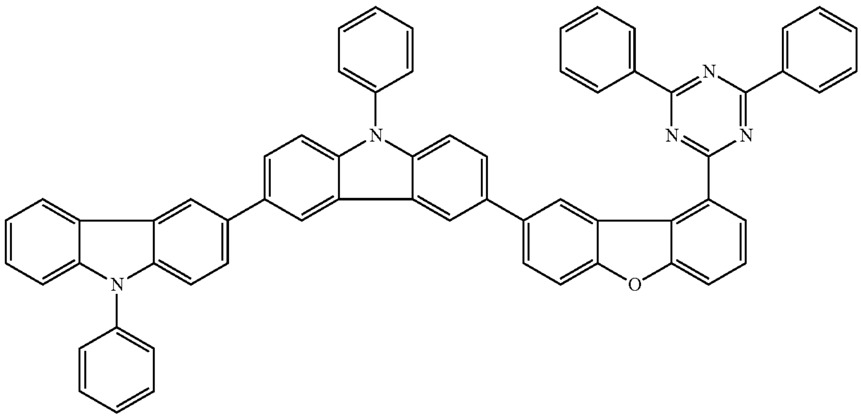
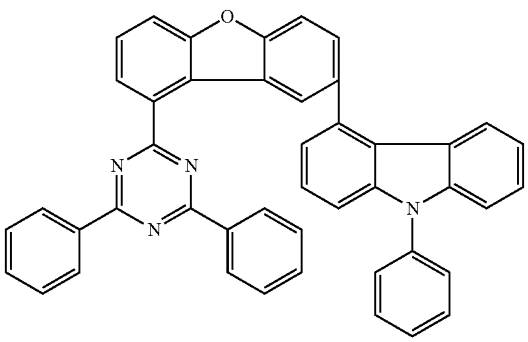
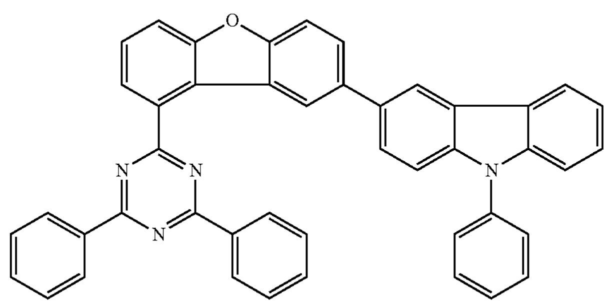
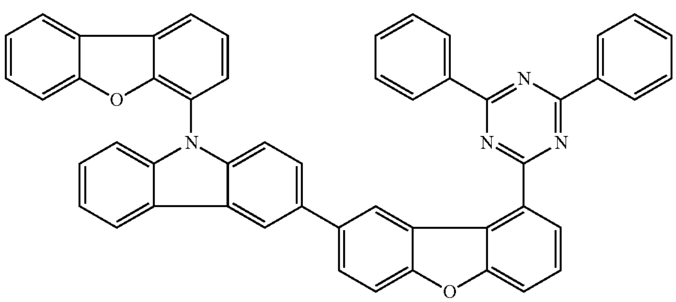
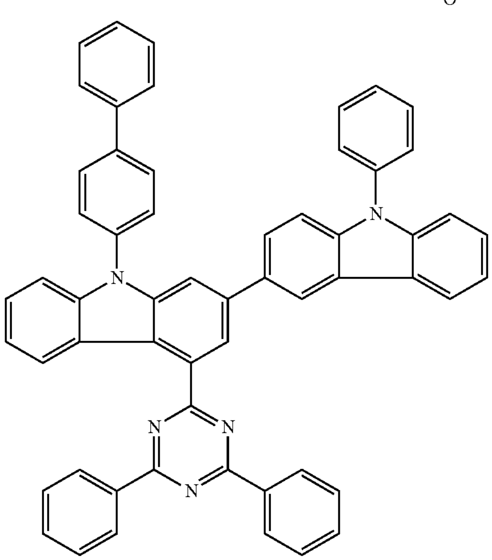
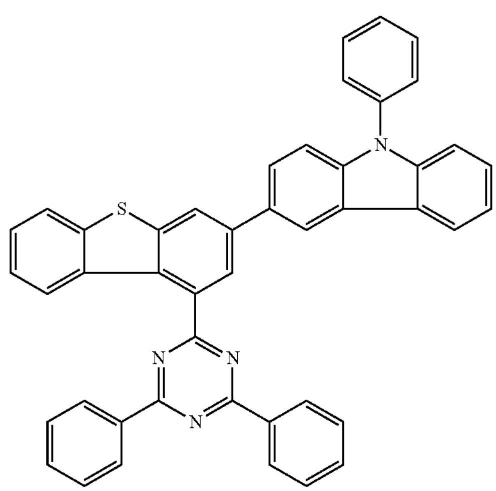

-continued
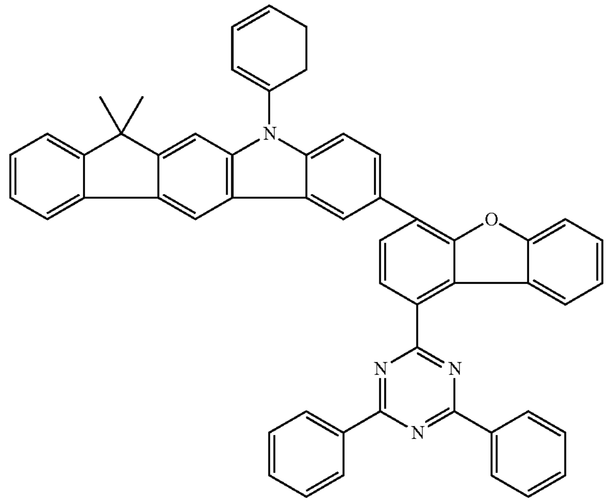
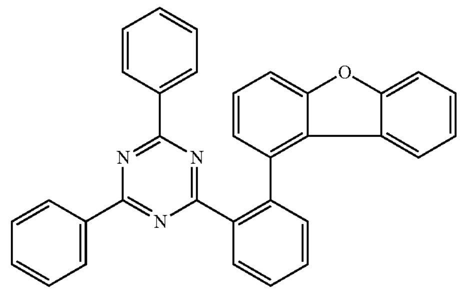
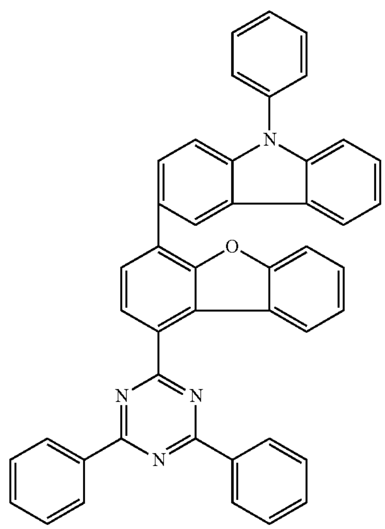
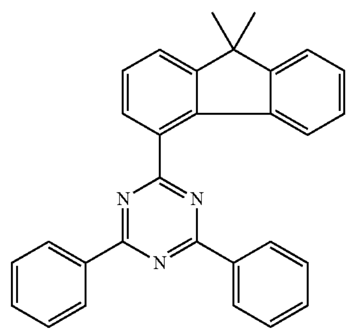
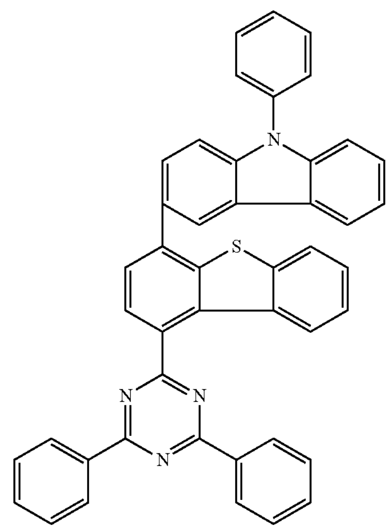
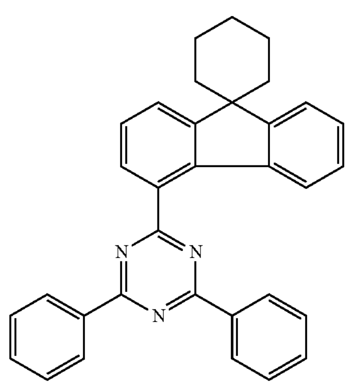
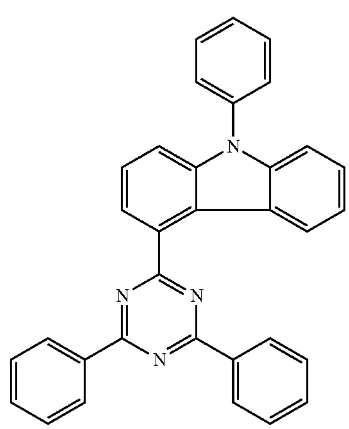

-continued
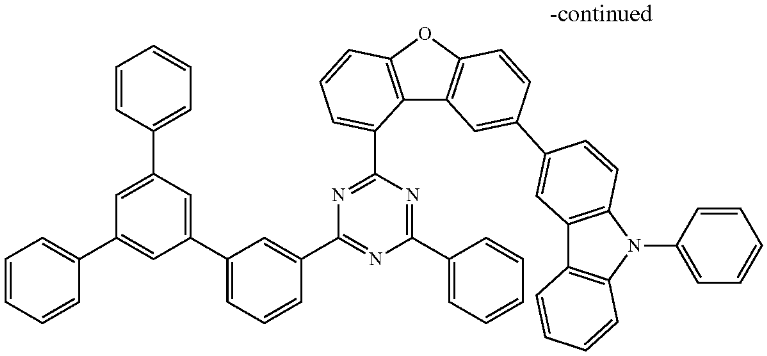
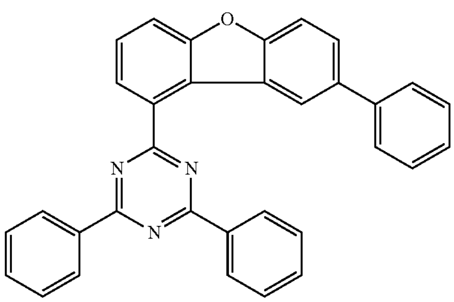
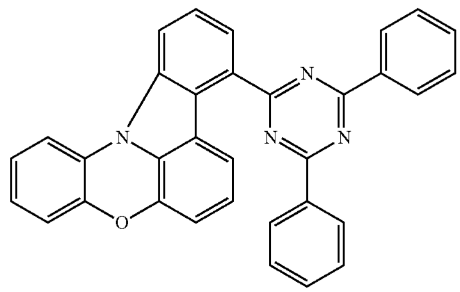
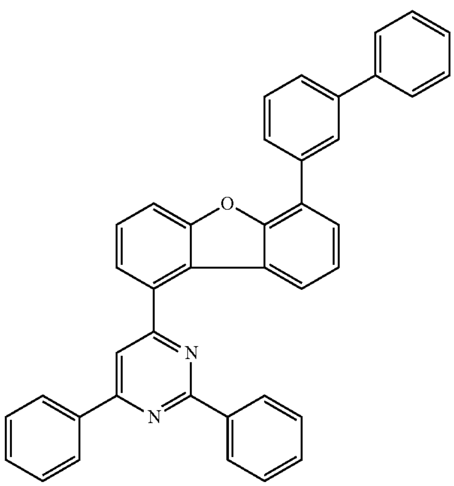
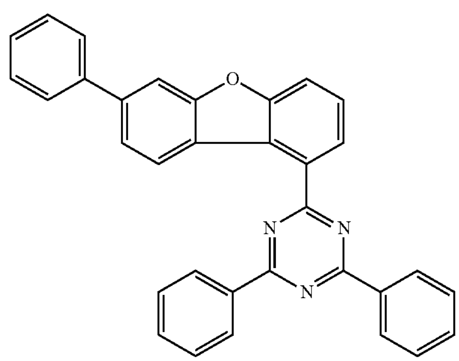
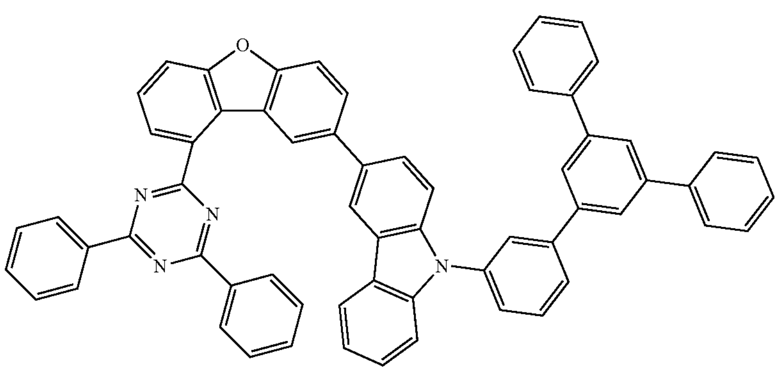
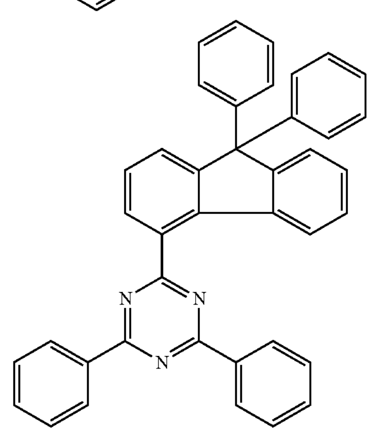

Examples of lactams which can be used as electron-transporting matrix materials are the following structures:
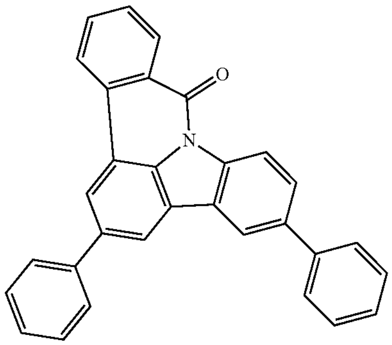
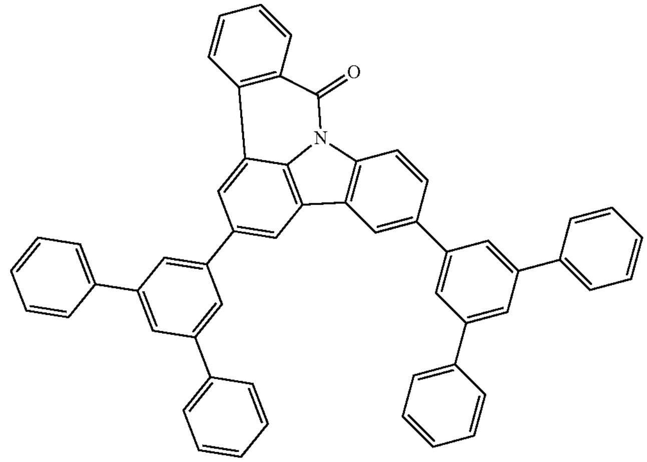
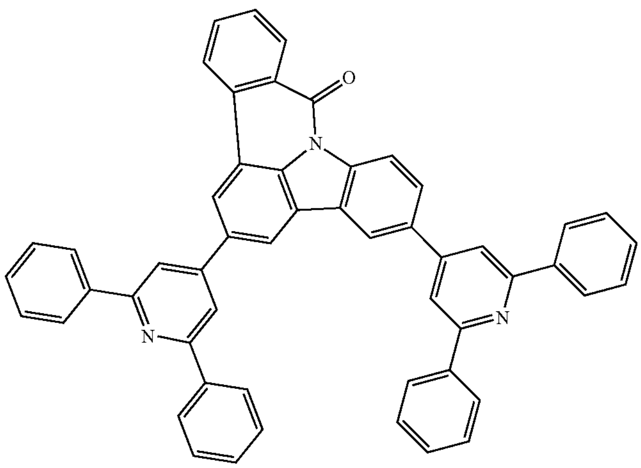
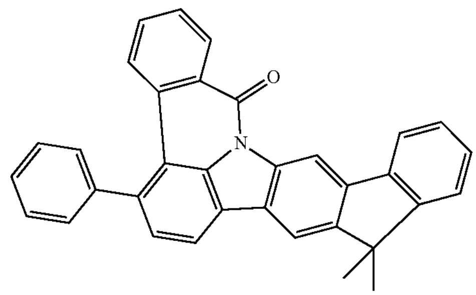
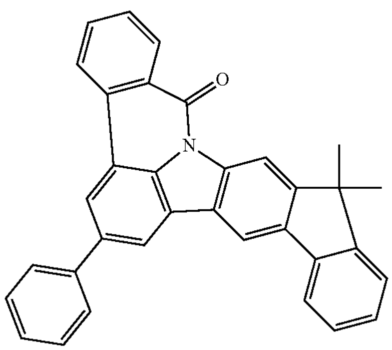
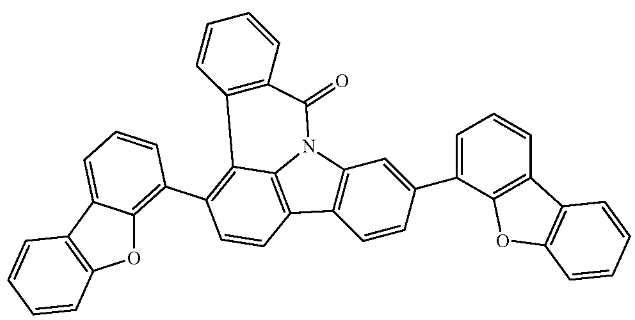
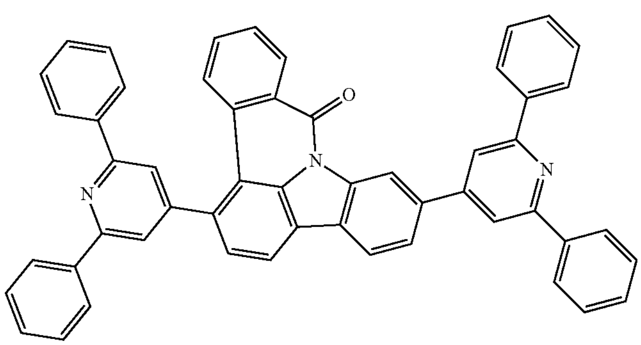

-continued
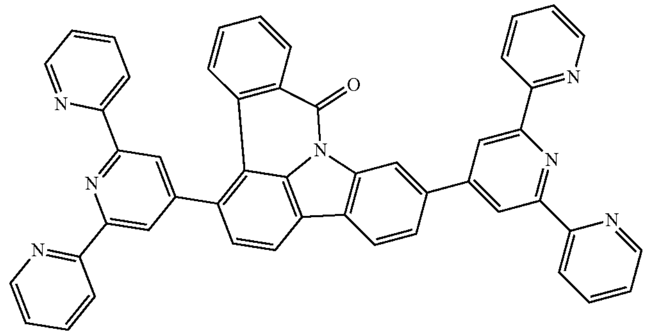
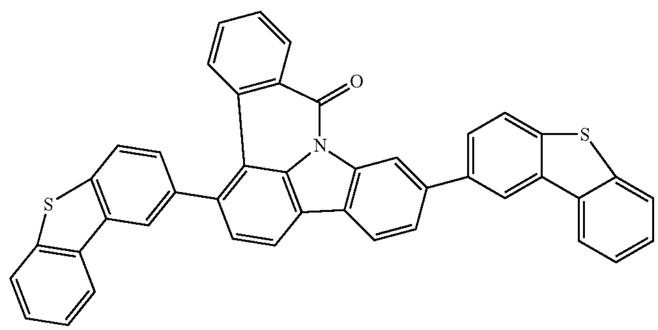
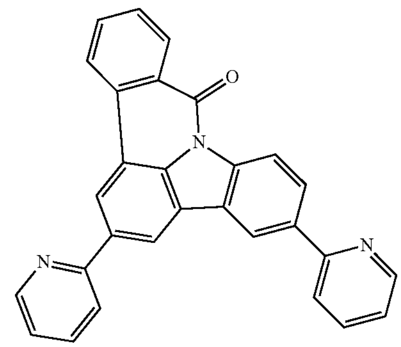
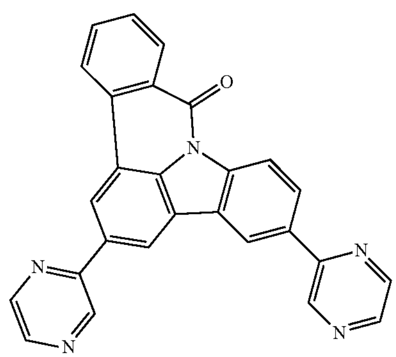
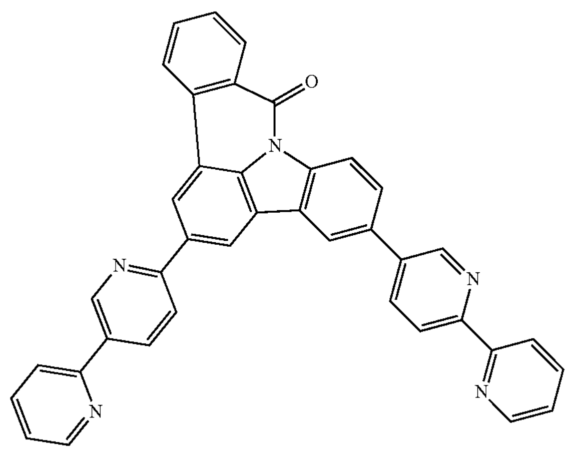
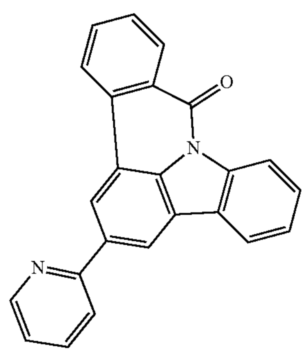
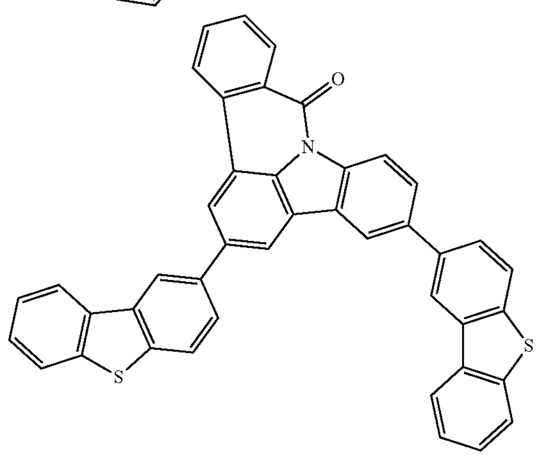

-continued
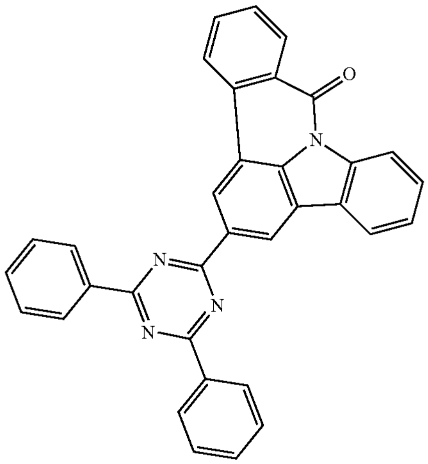
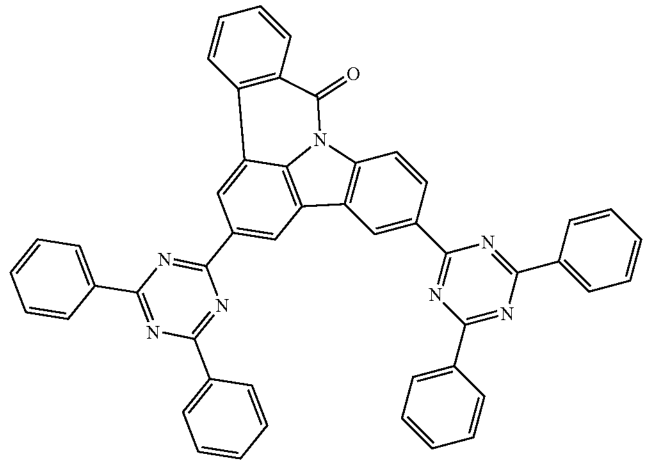
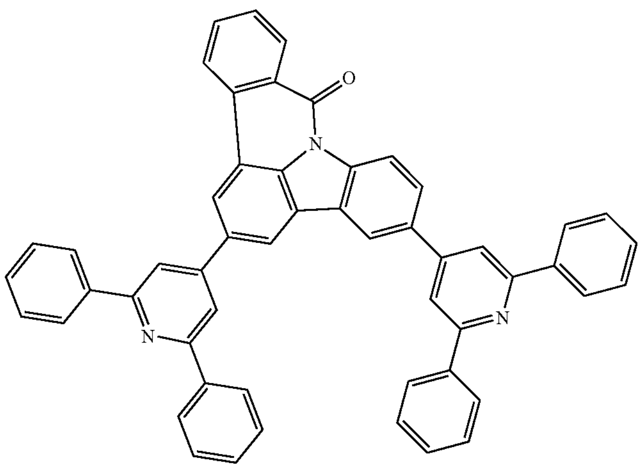
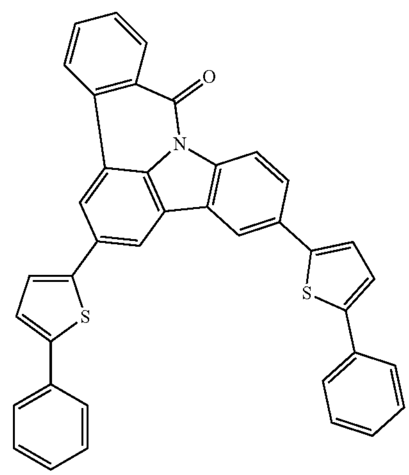
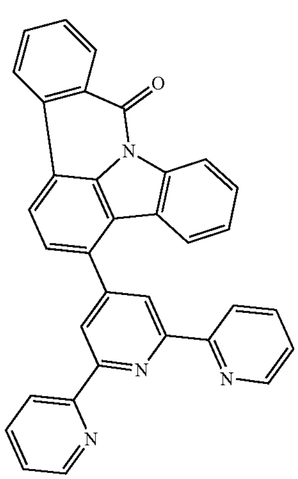
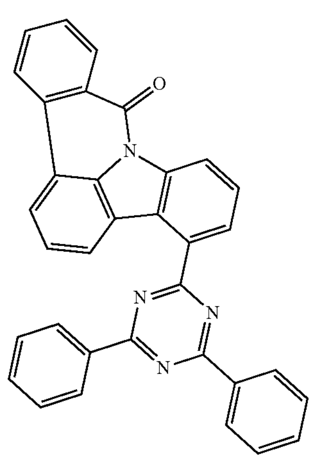
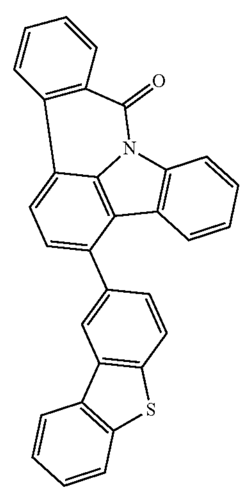
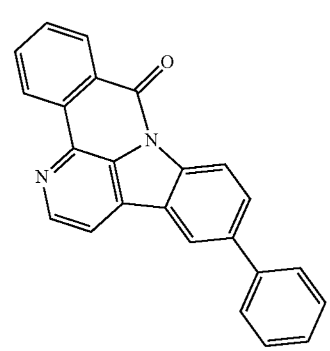

-continued
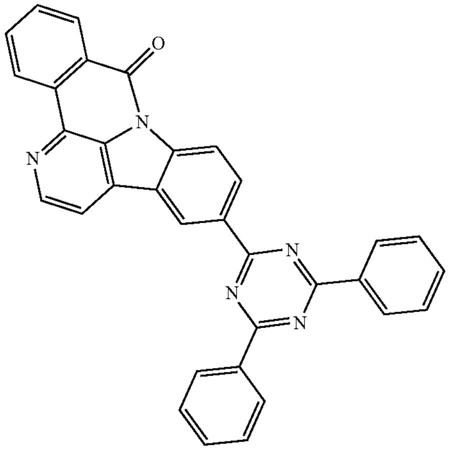
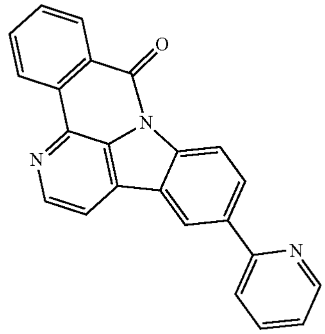
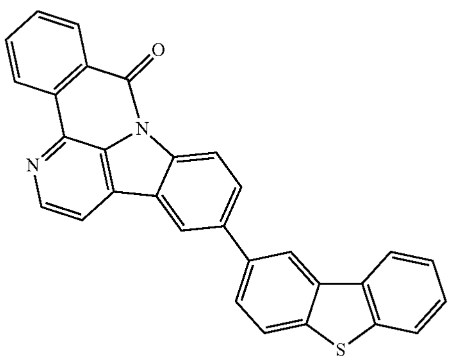
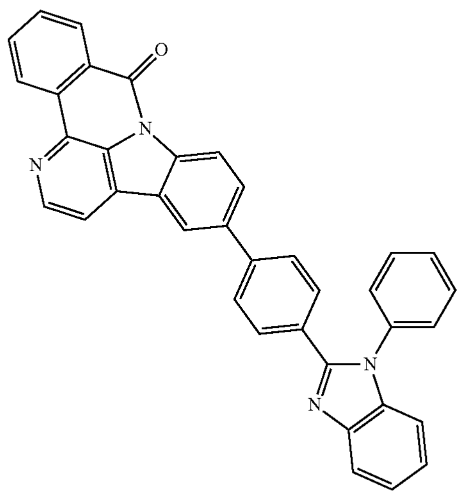
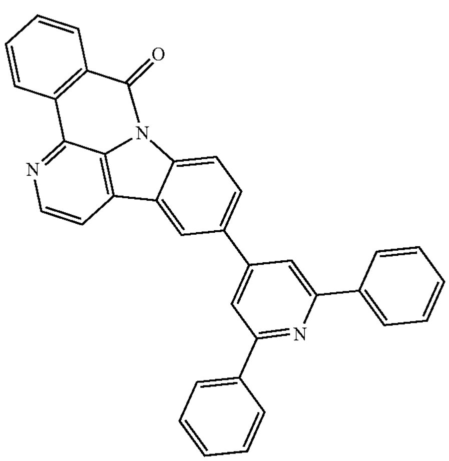
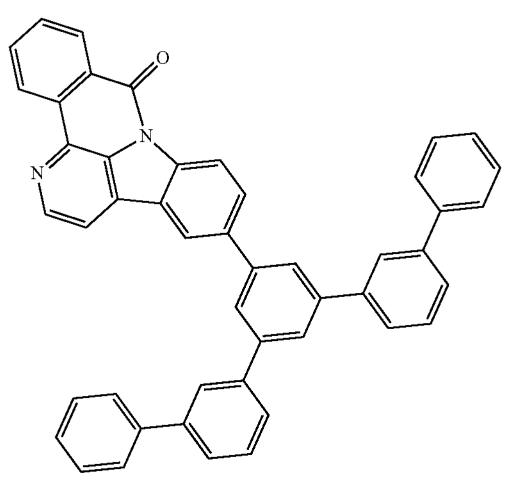

-continued
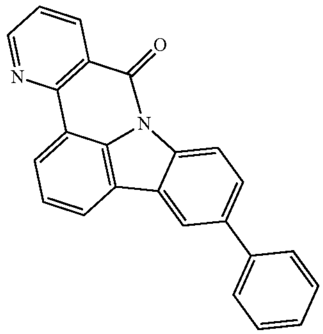
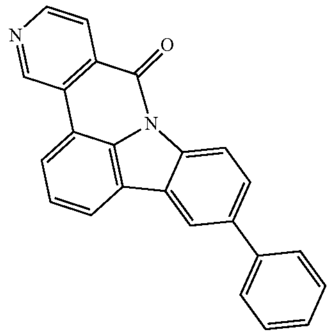
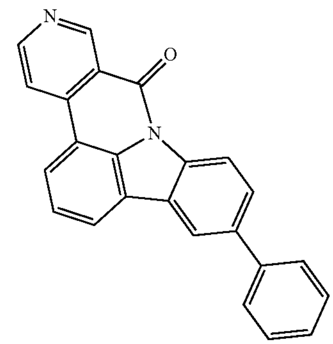
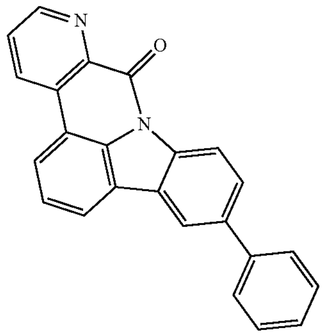
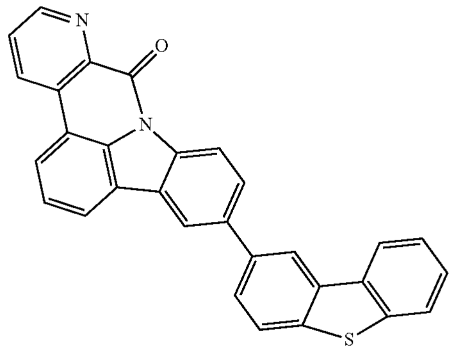
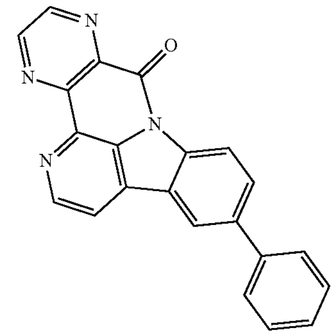
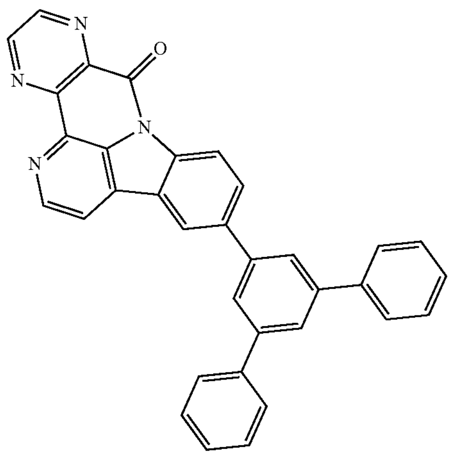
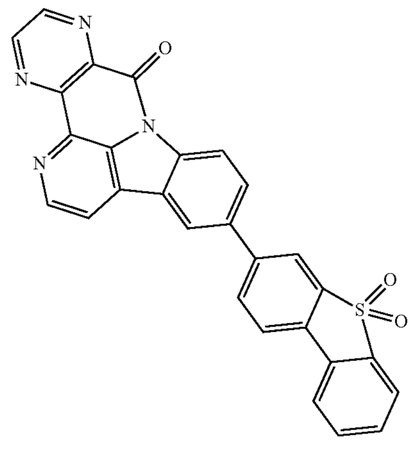
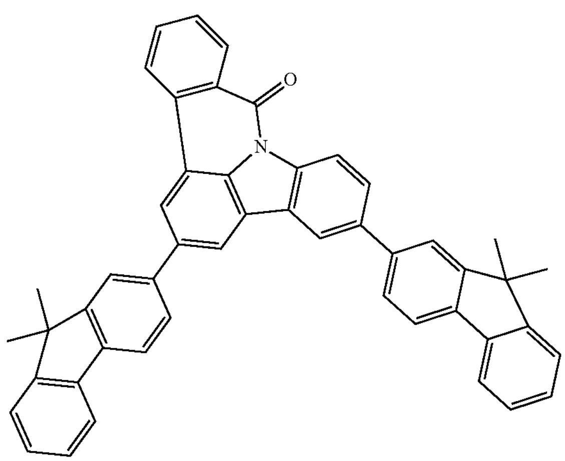
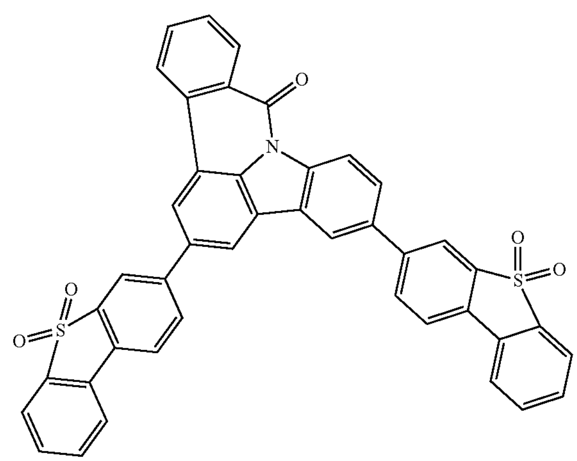

-continued
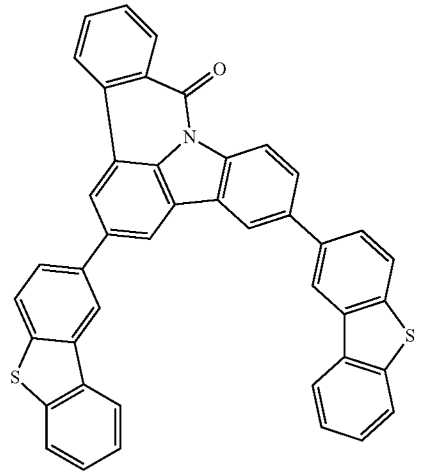
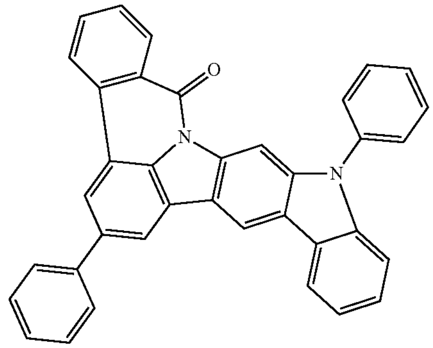
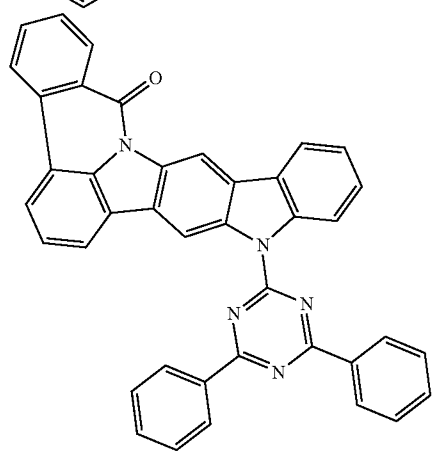
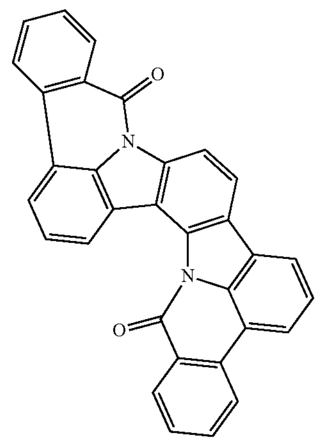
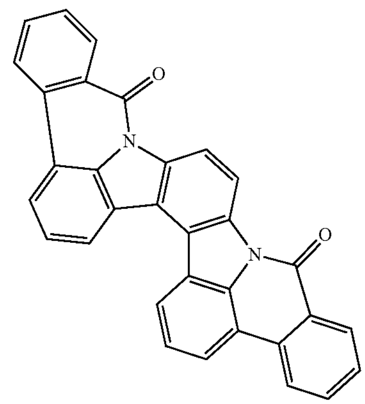
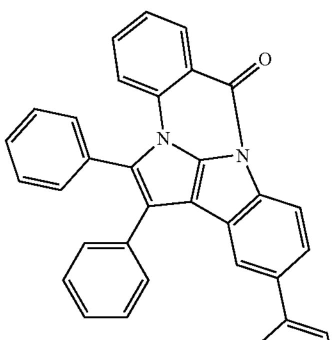
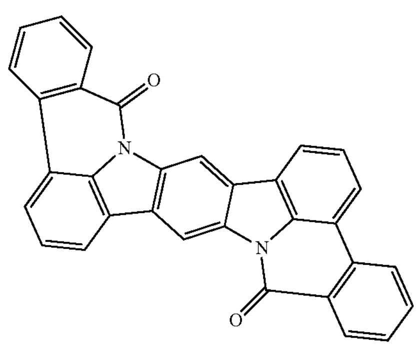
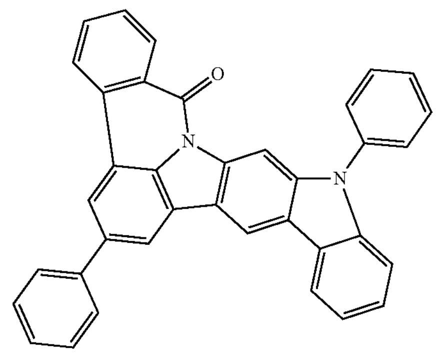
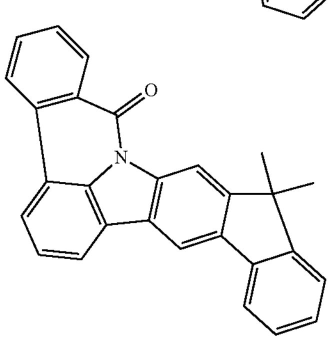
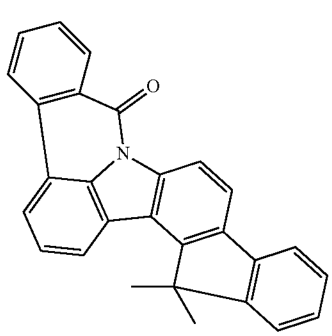
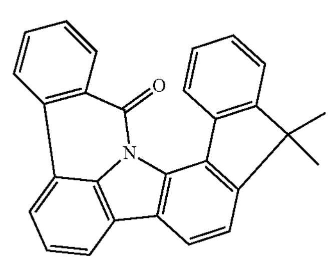

-continued
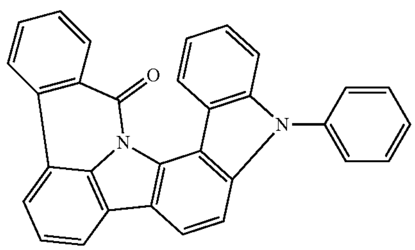
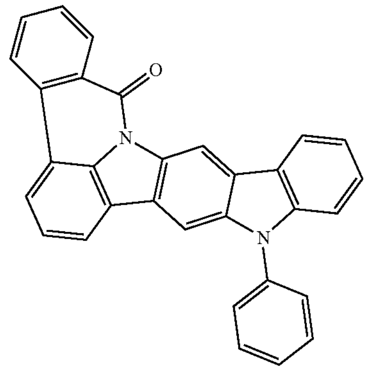
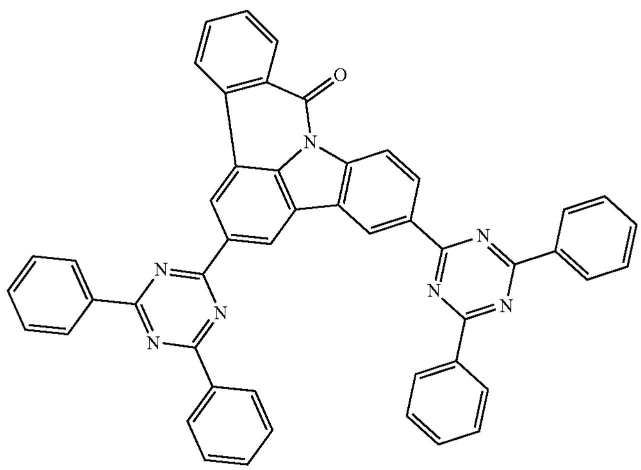
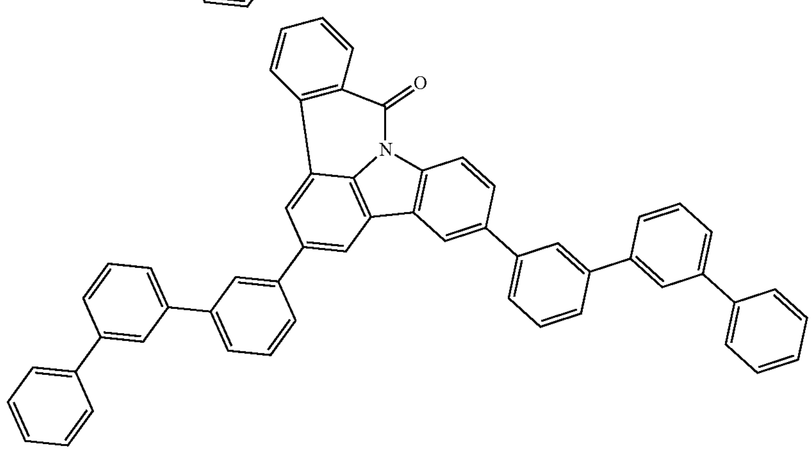
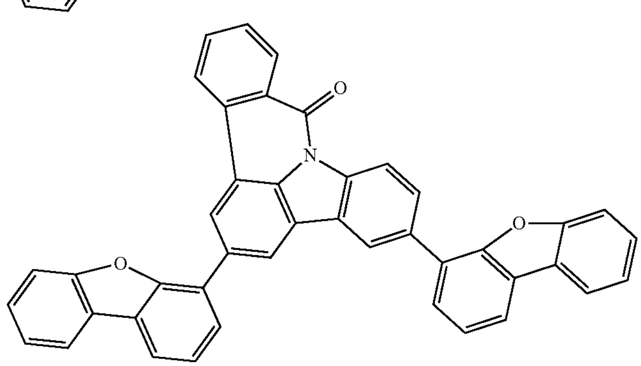

-continued
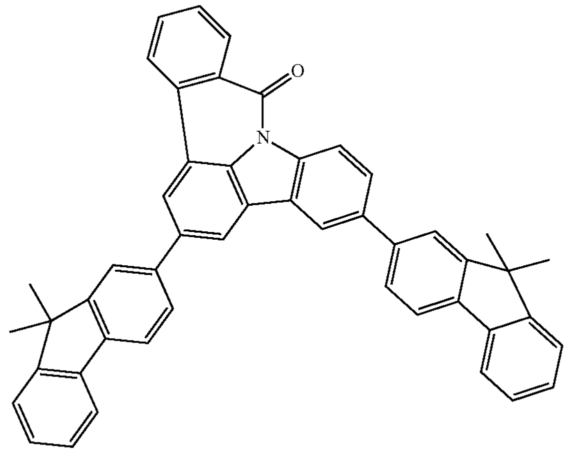
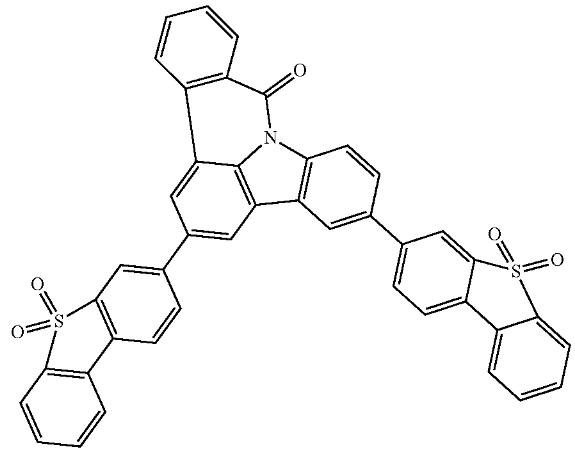
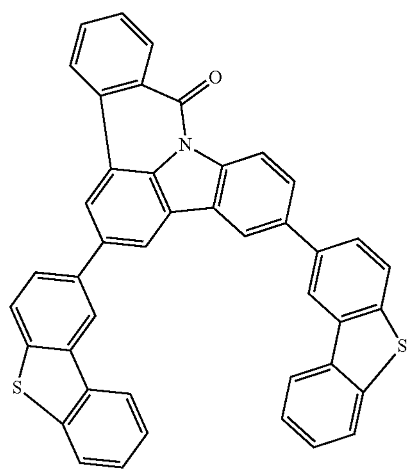
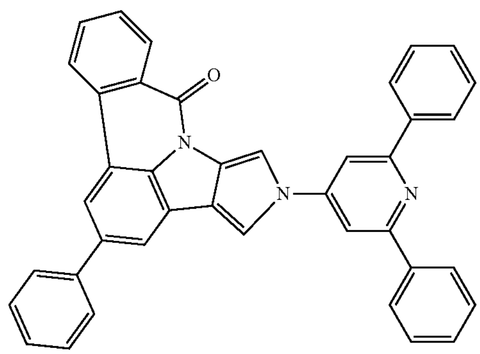
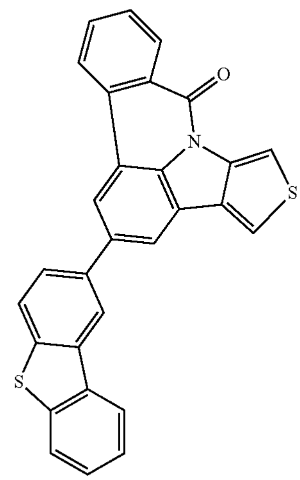
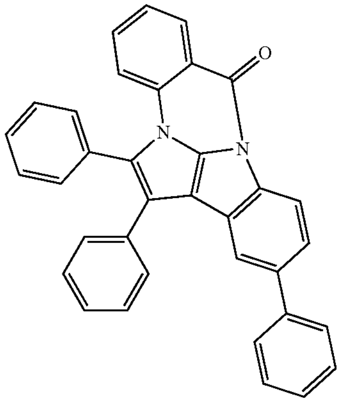
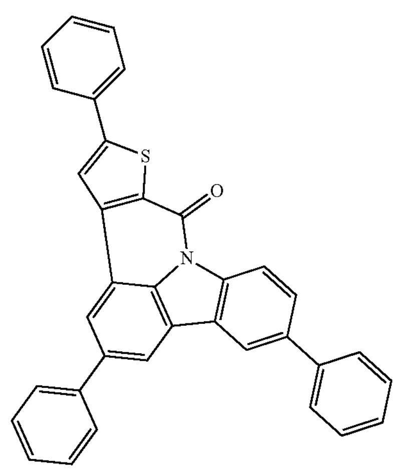
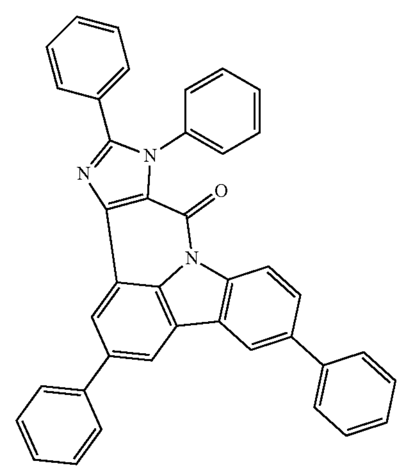

-continued
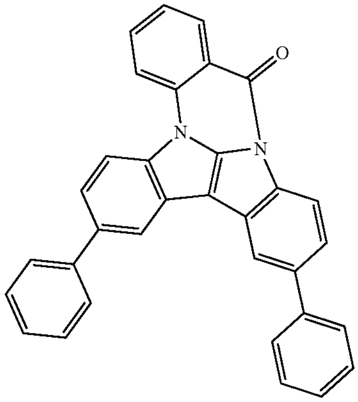
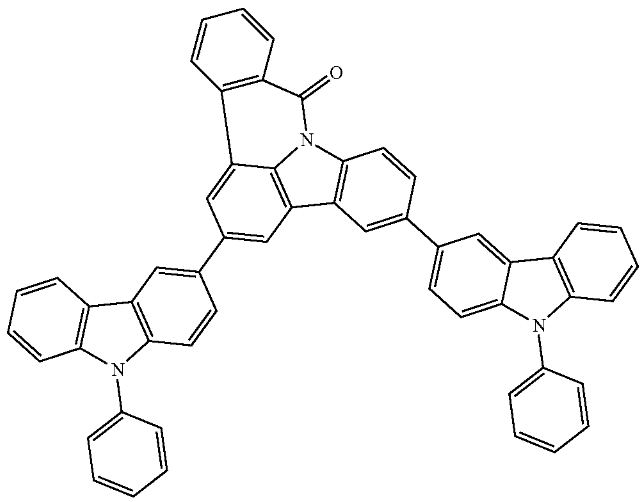
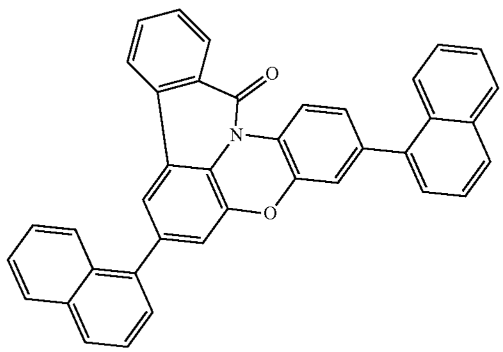
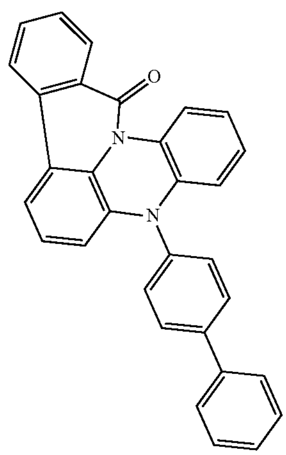
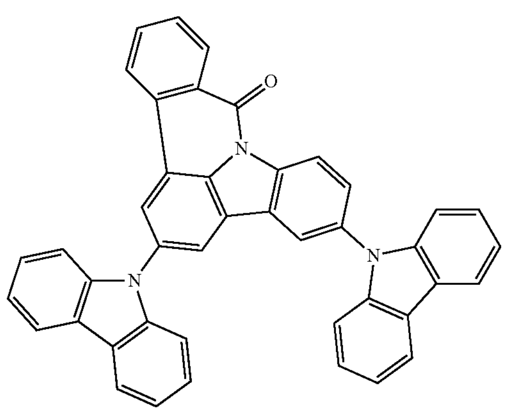
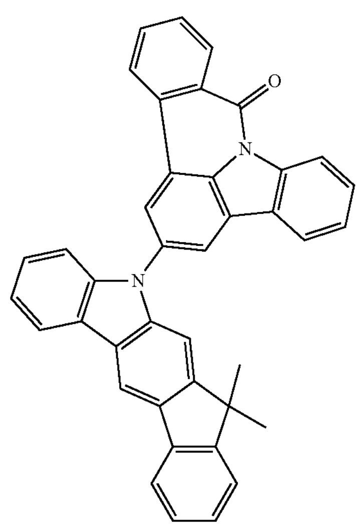

-continued
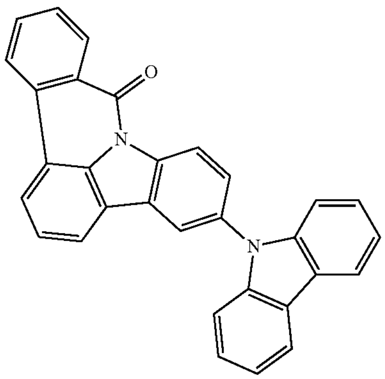
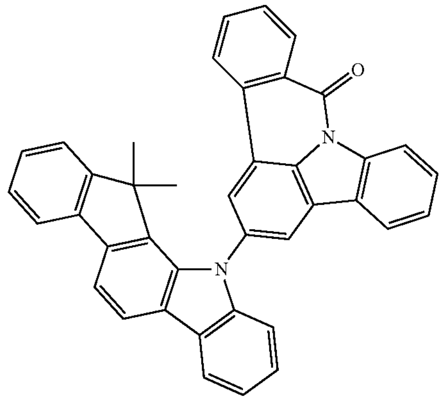
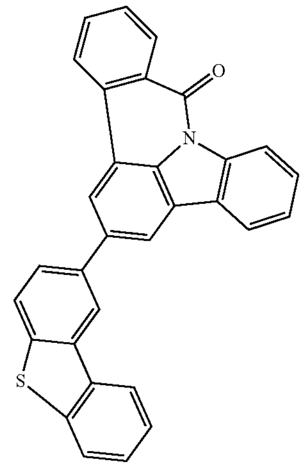
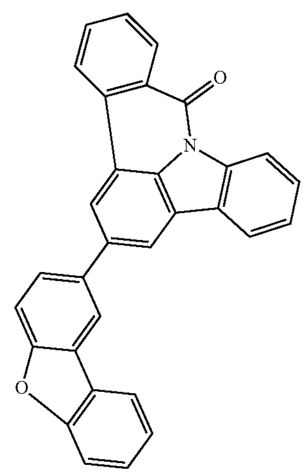
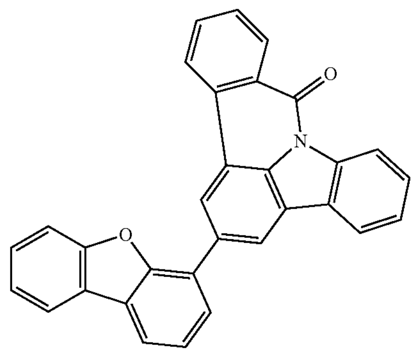
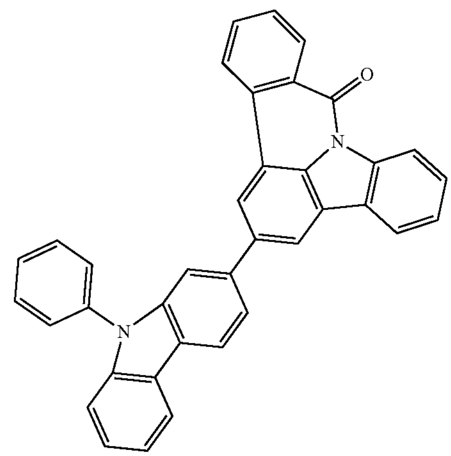
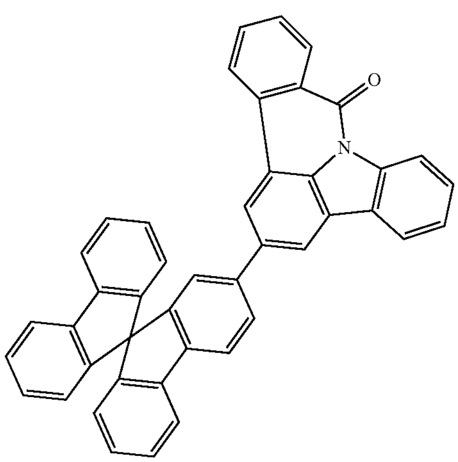
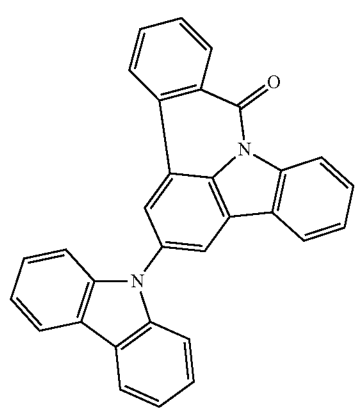

-continued
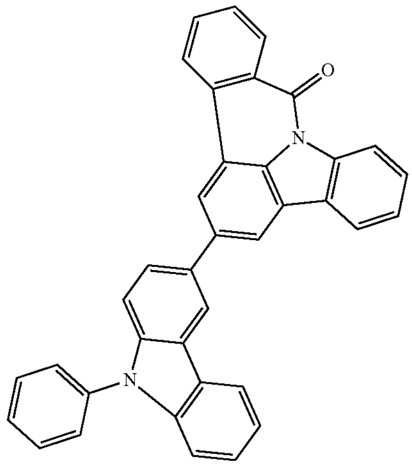
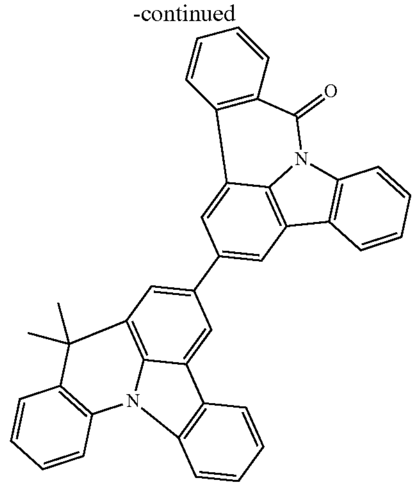
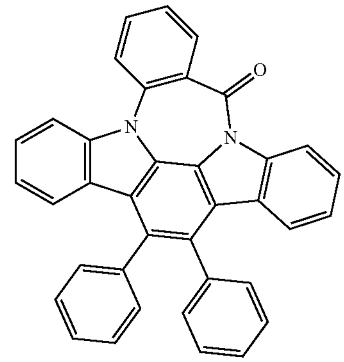
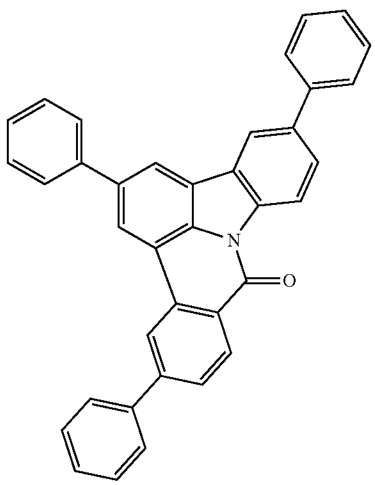
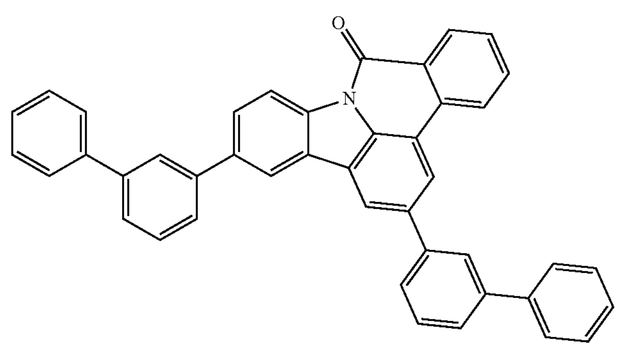
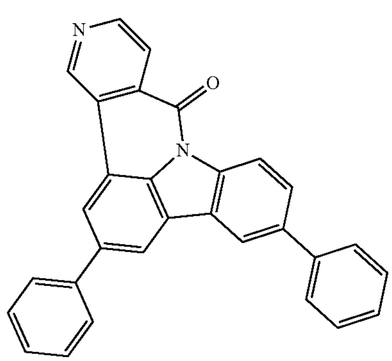
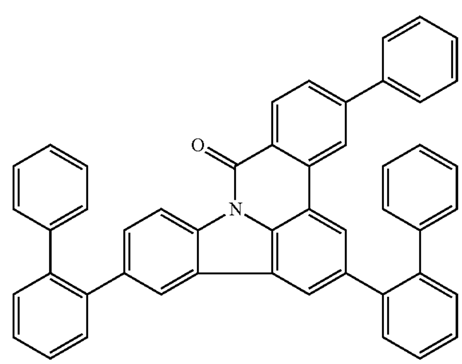
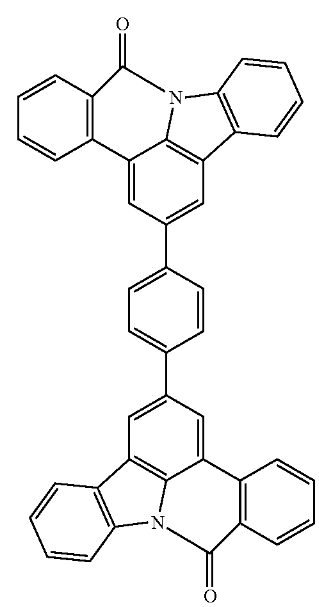

-continued
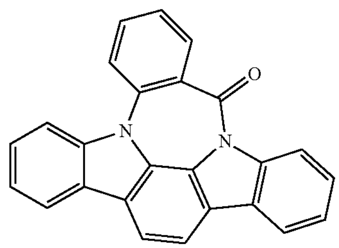
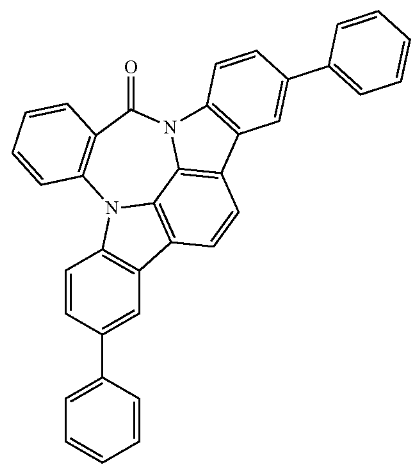
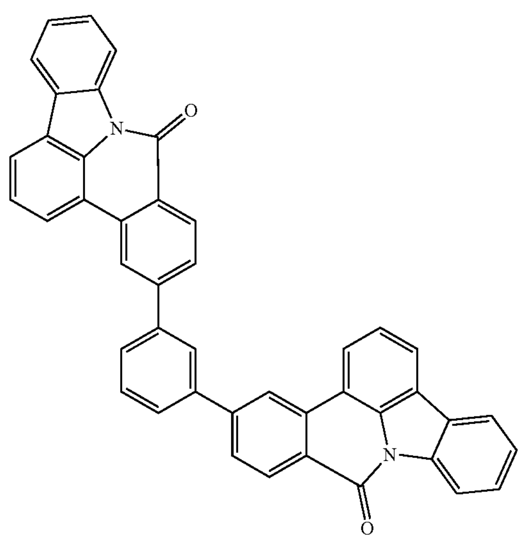
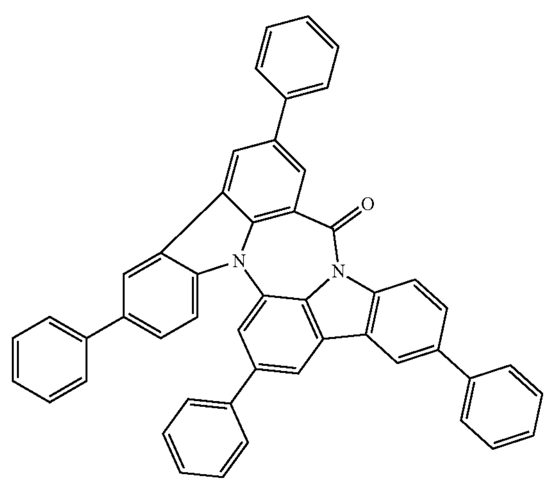
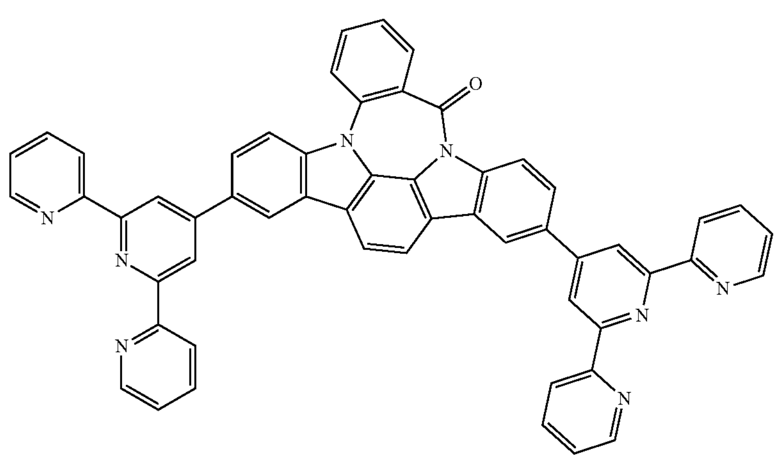

-continued
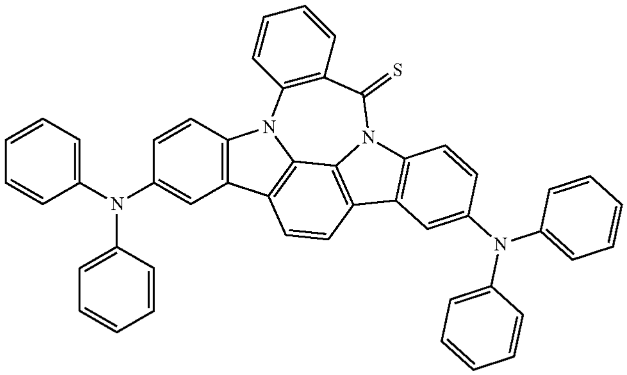
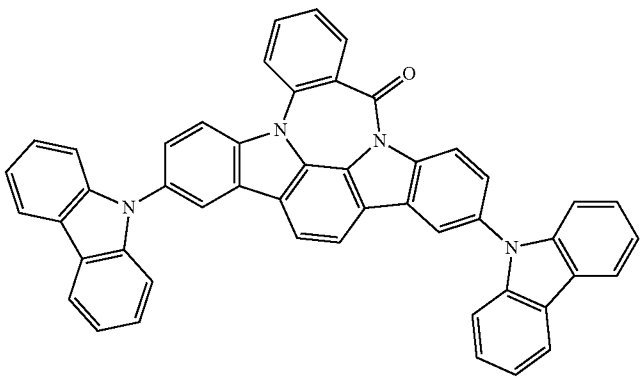
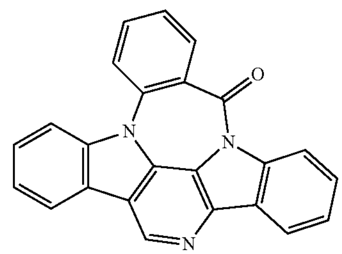
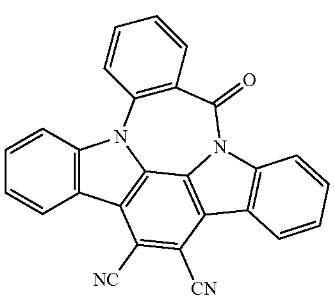
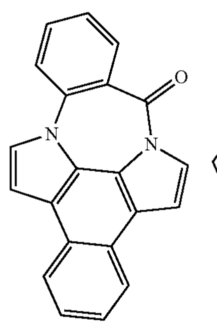
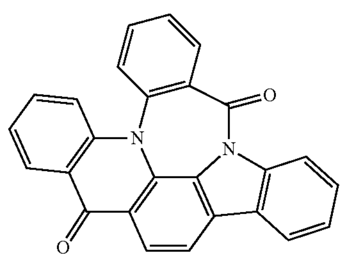
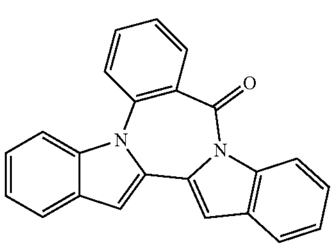
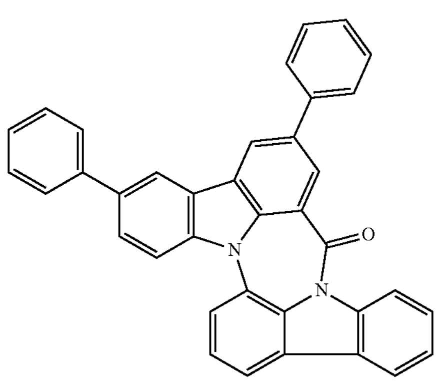

-continued
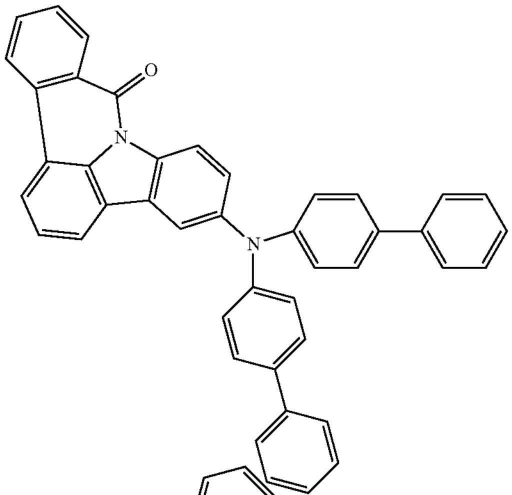
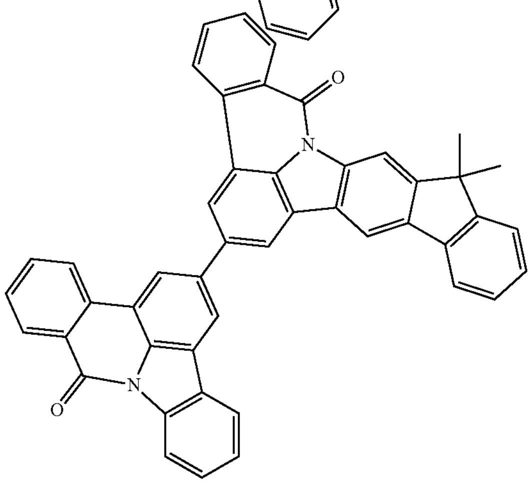
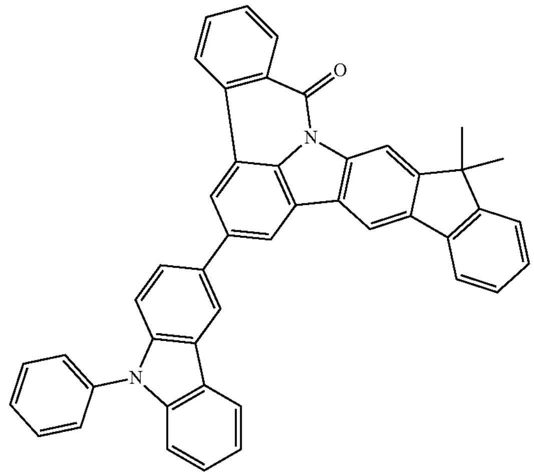
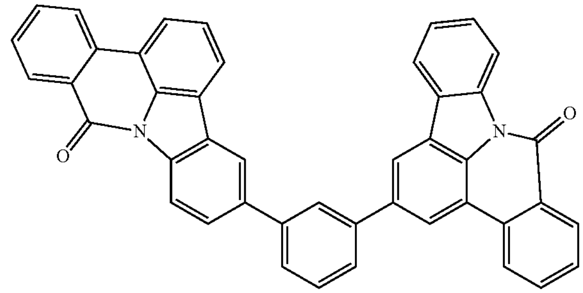
Examples of indolo- and indenocarbazole derivatives in the broadest sense which can be used as hole- or electron-transporting matrix materials according to the substitution pattern are the following structures:
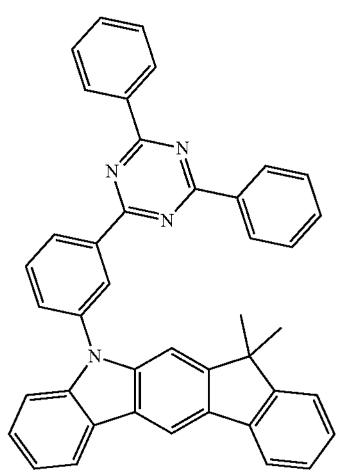
-continued
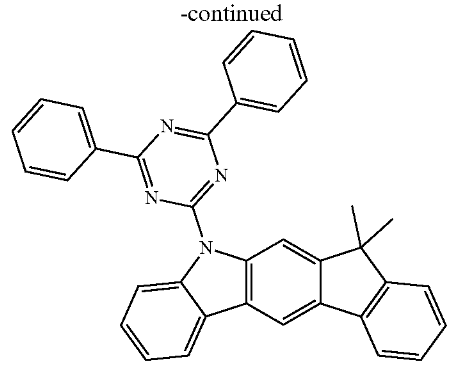
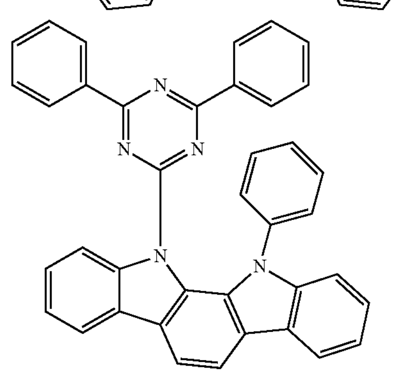

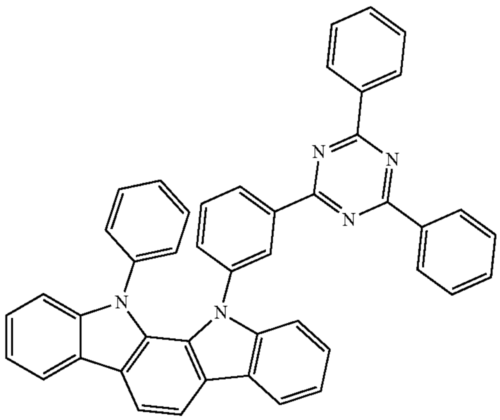
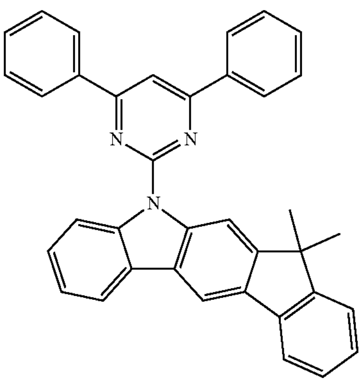
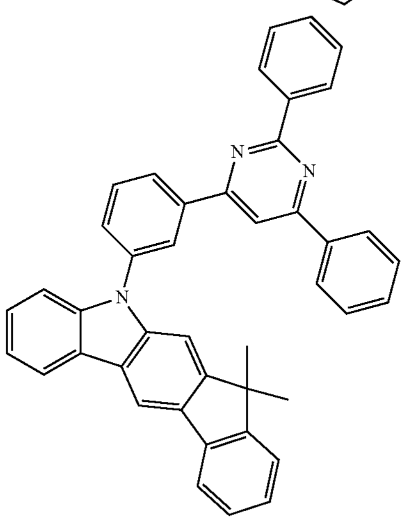
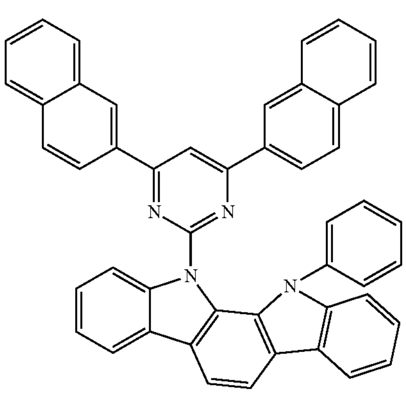
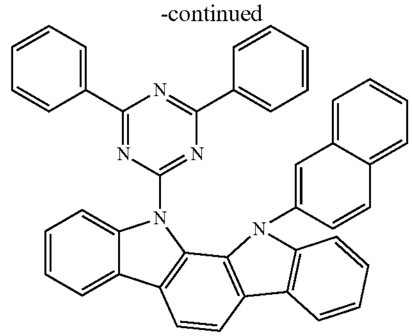
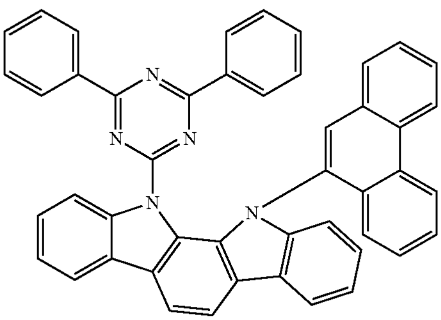
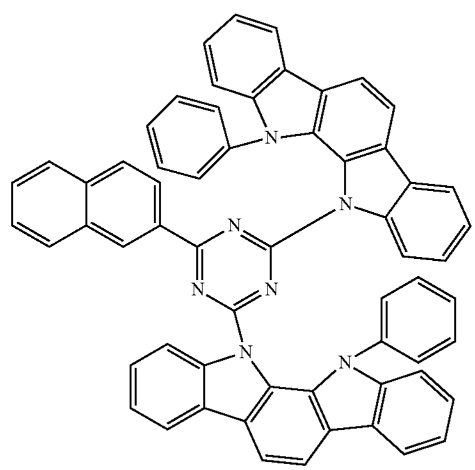
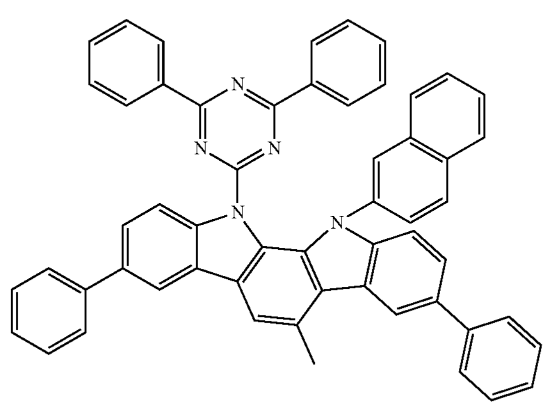

-continued
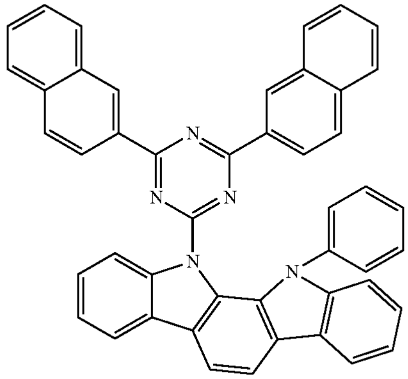
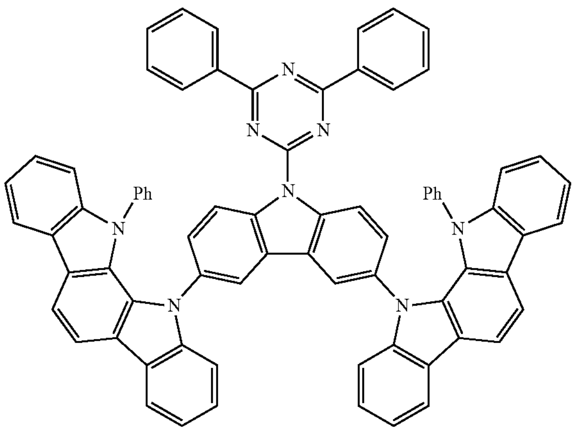
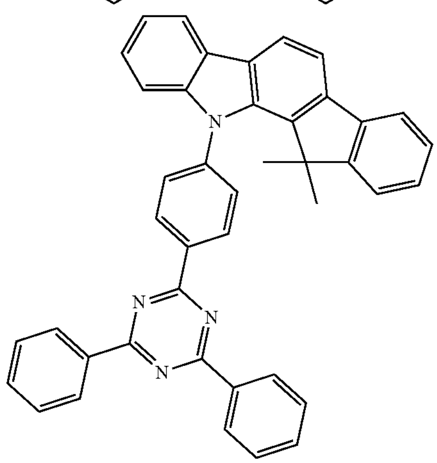
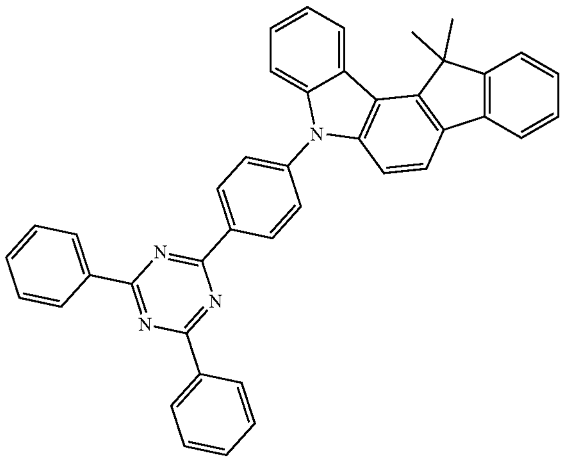
-continued
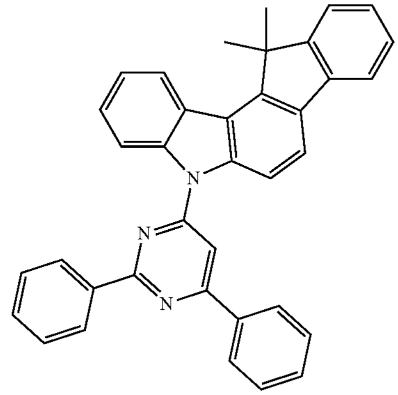
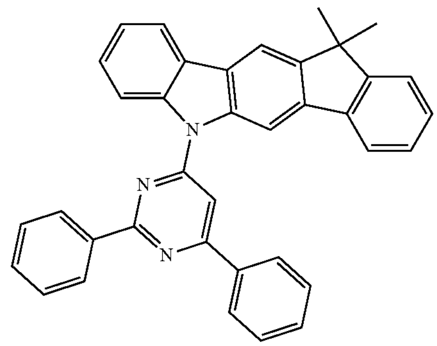
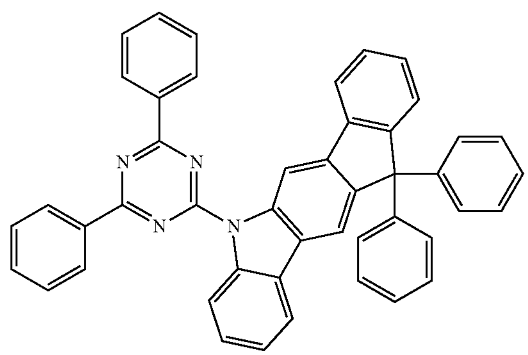
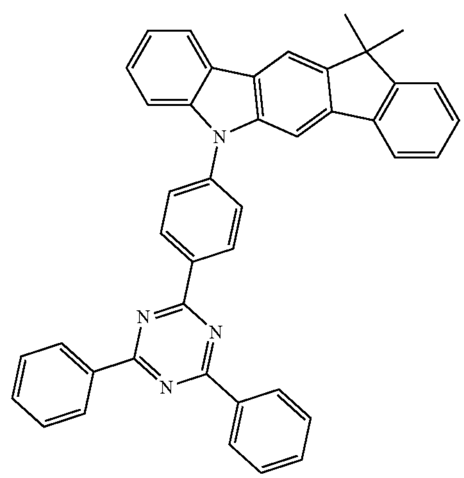

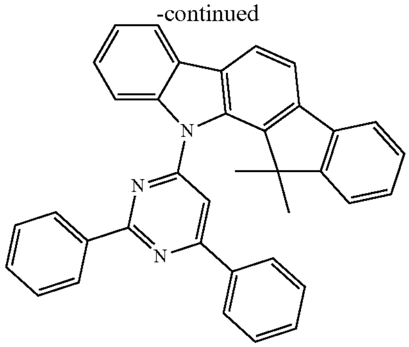
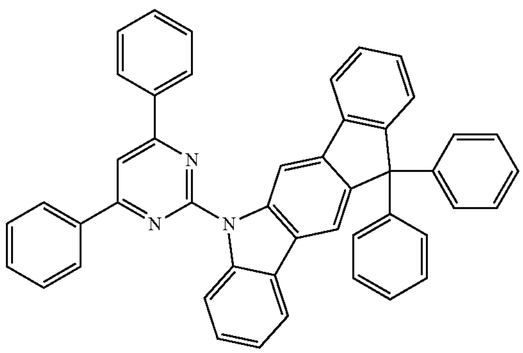
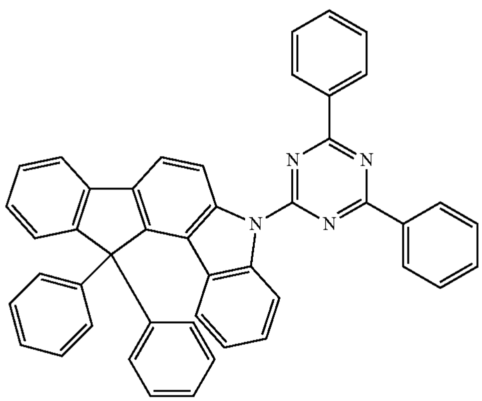
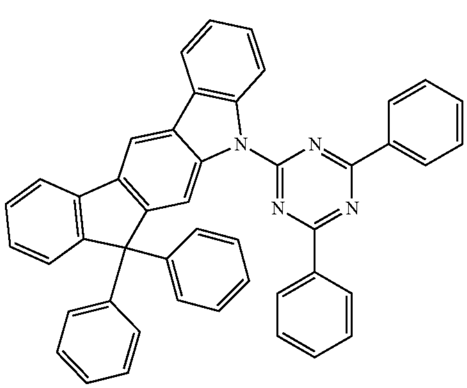
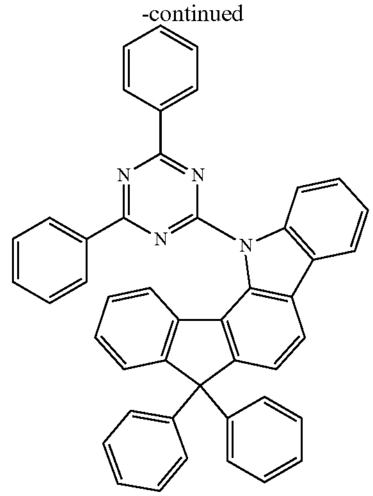
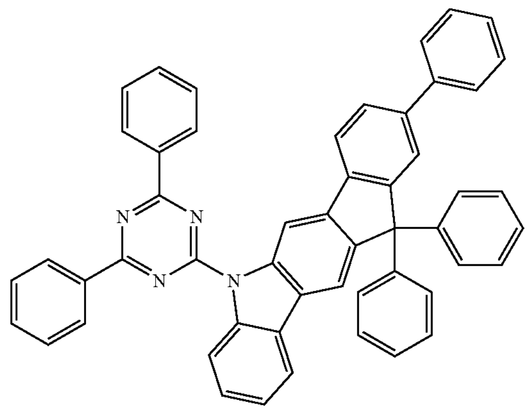
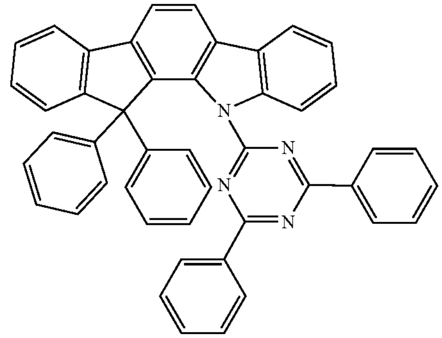

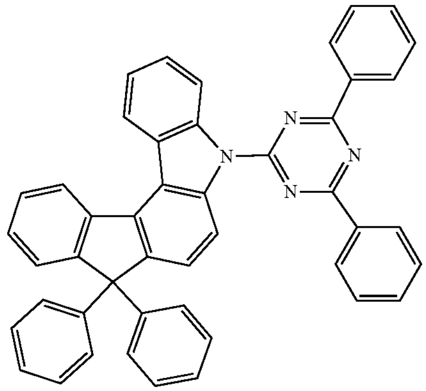
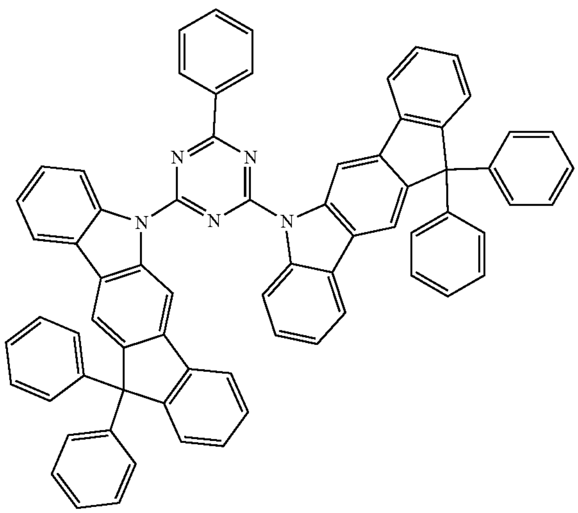
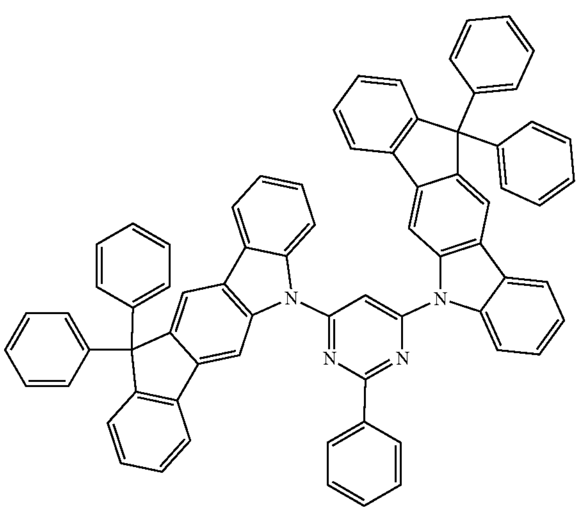
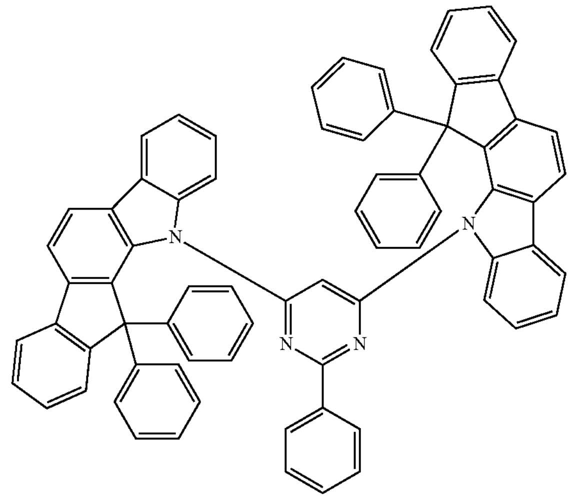
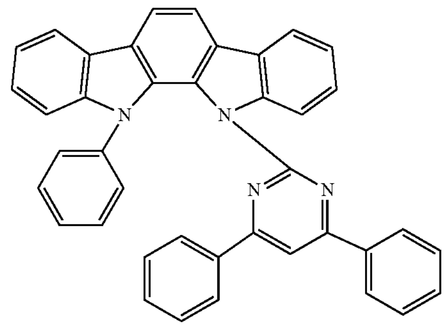
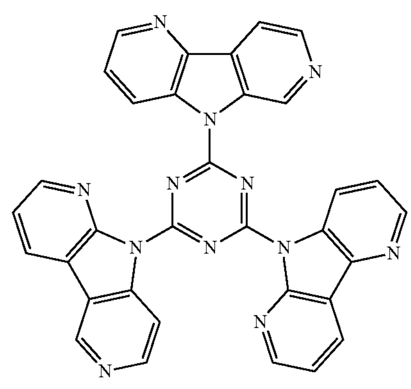
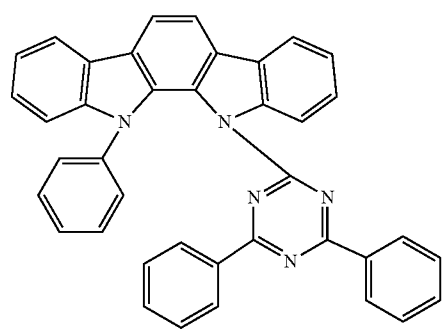

-continued
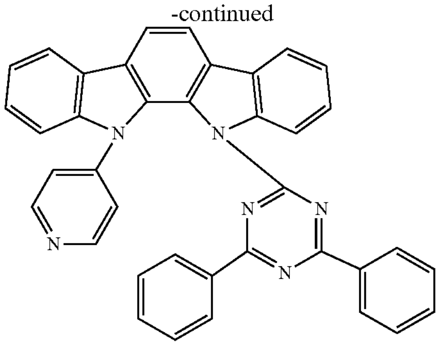
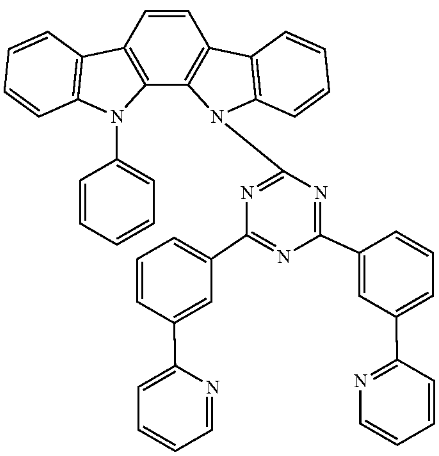
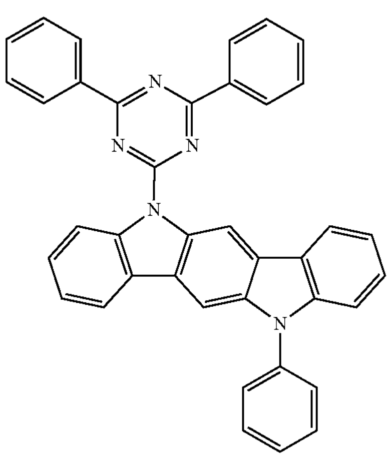
-continued
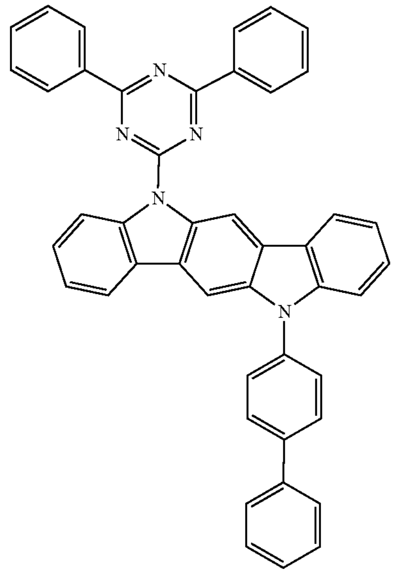
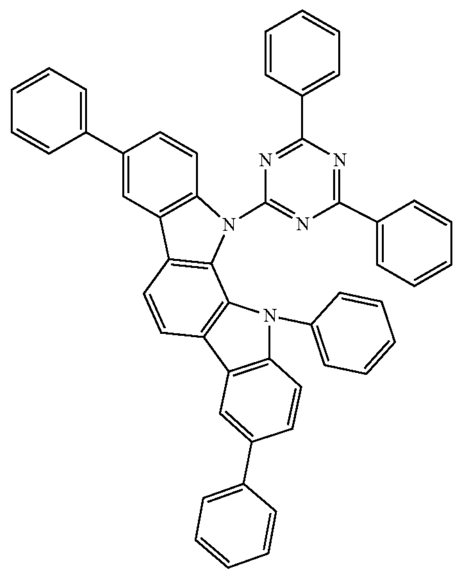
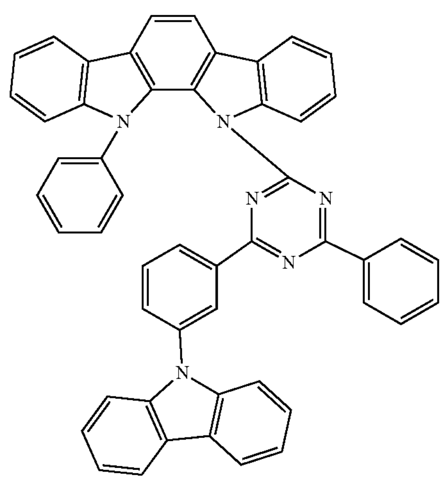

-continued
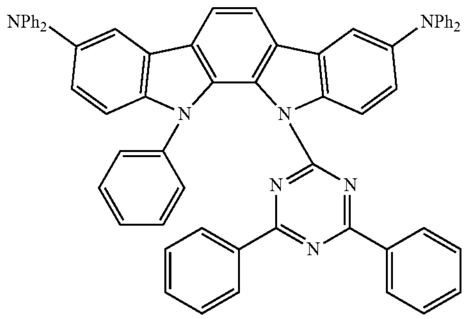
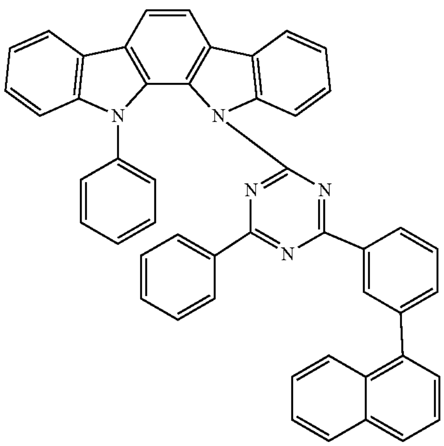
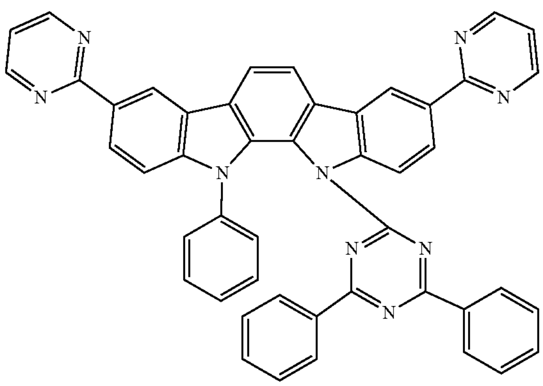
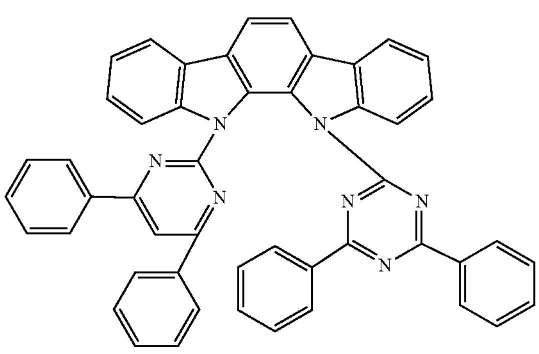
-continued
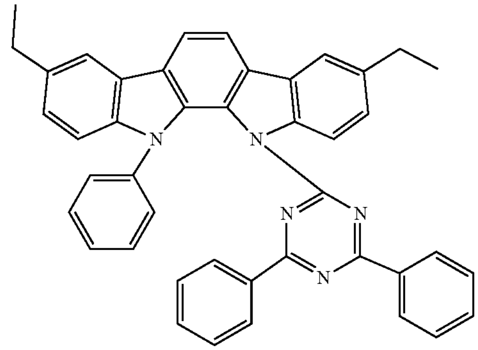
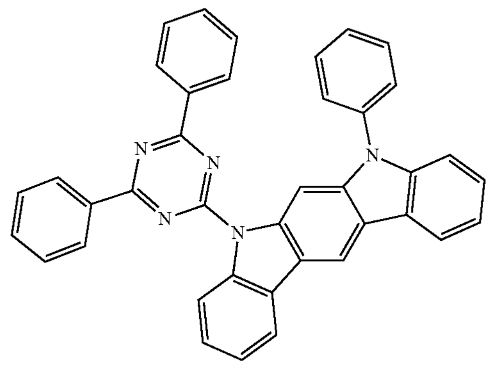
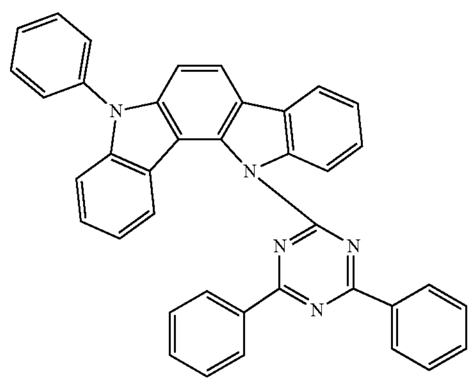
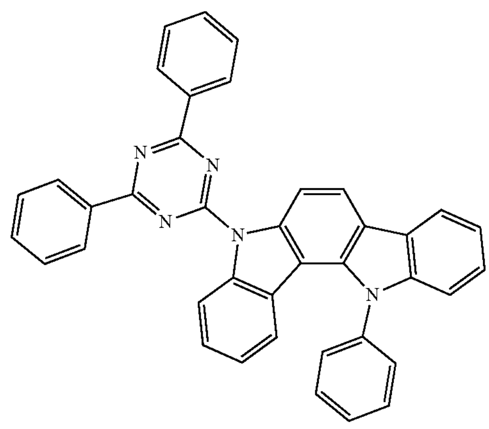

-continued
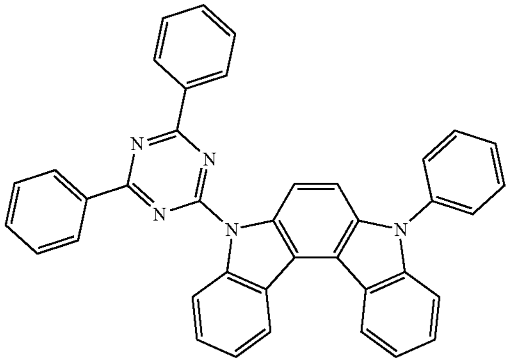
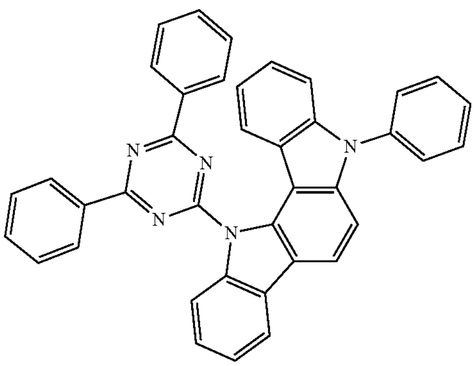
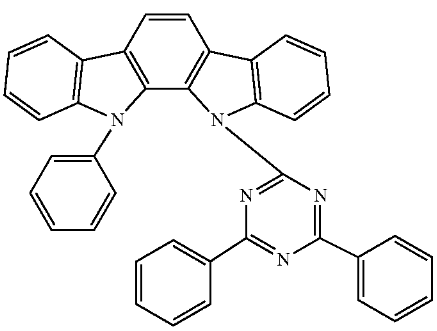
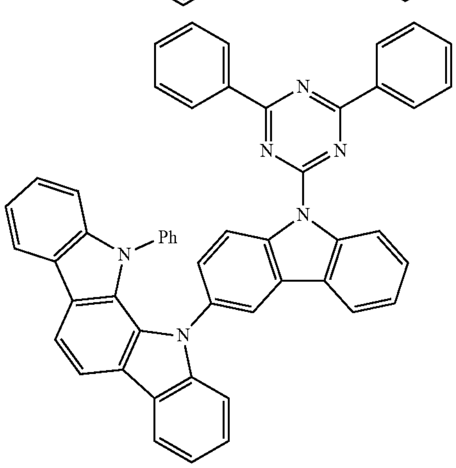
-continued
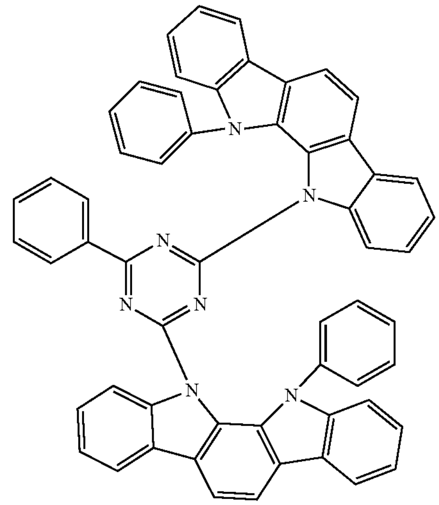
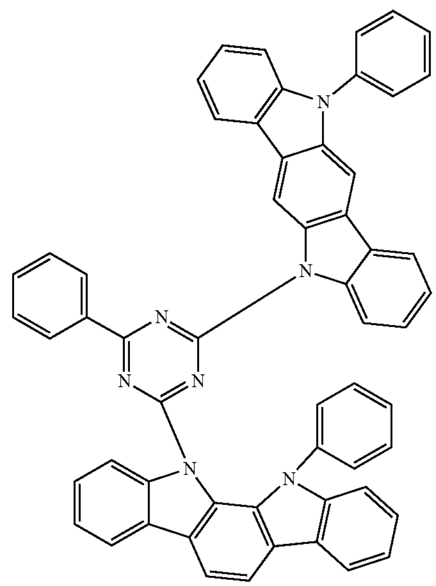
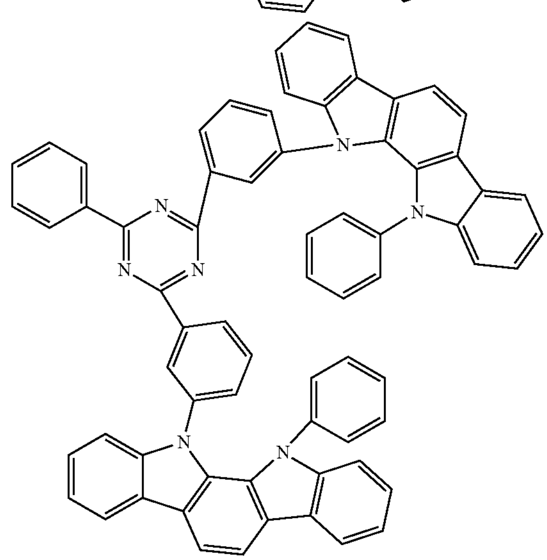

-continued
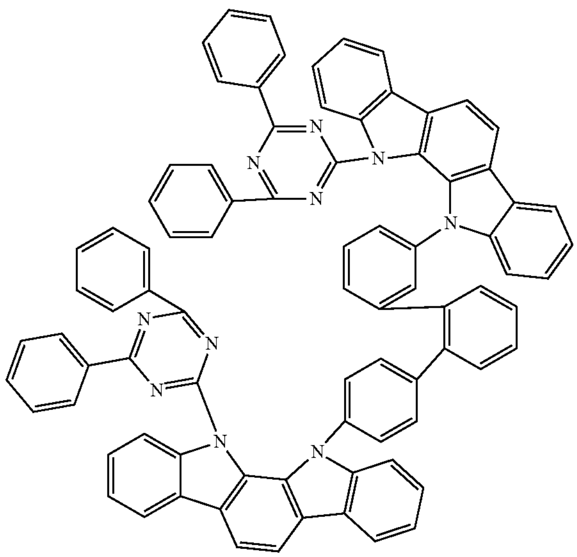
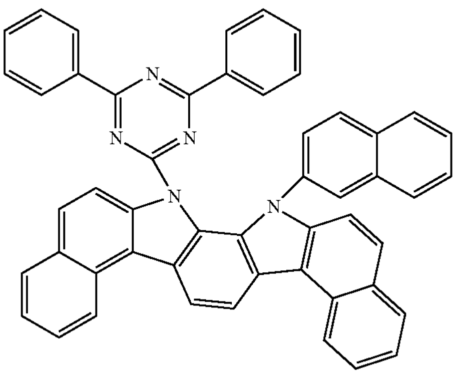
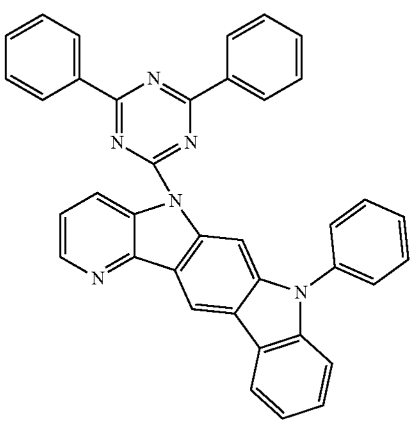
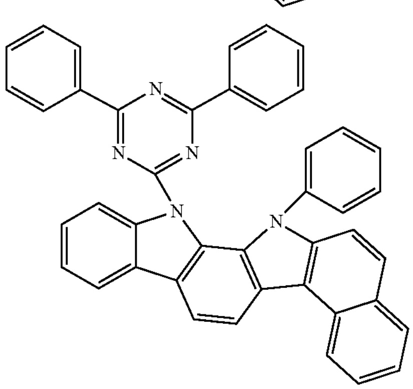
-continued
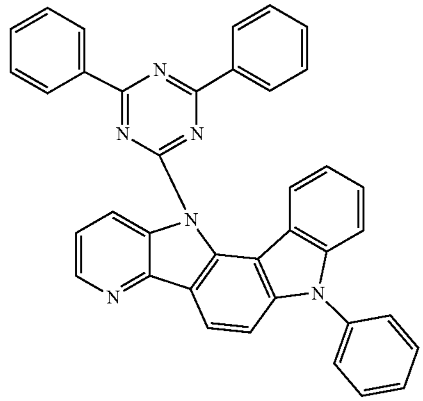
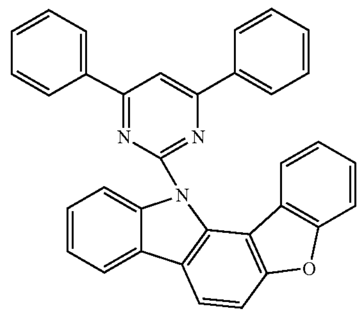
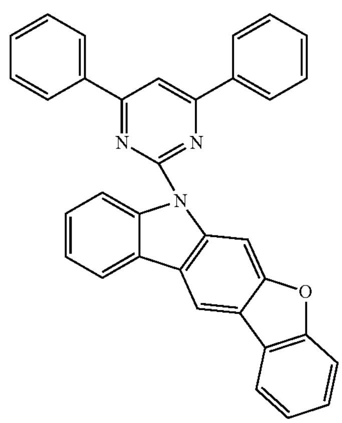
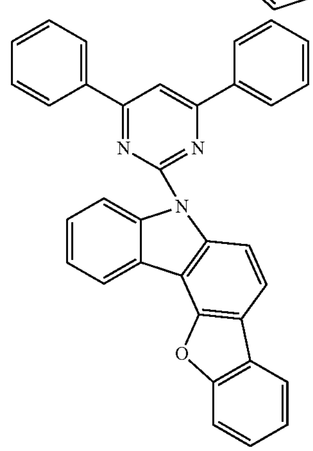

-continued
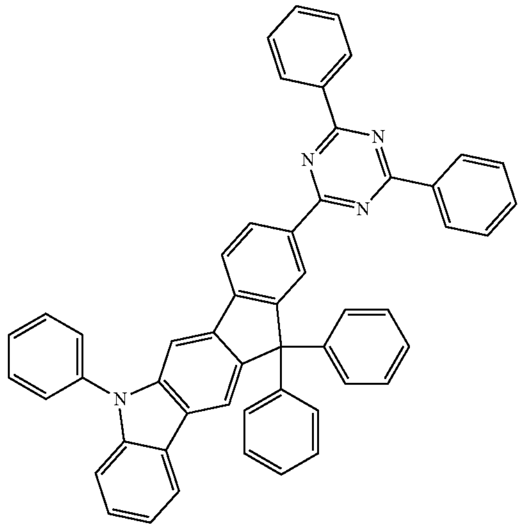
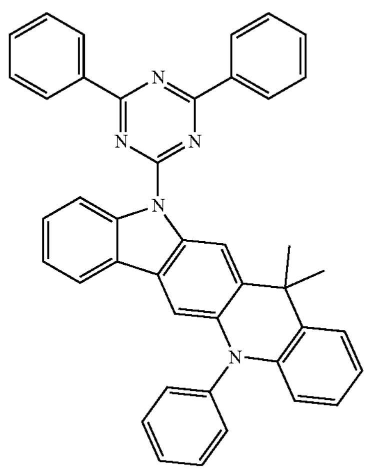
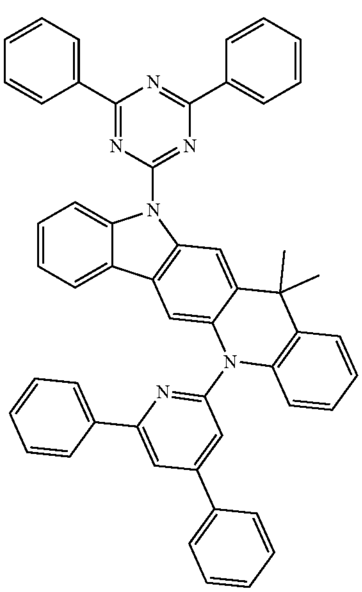
-continued
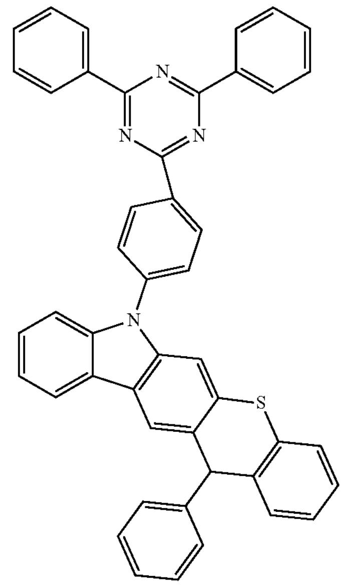
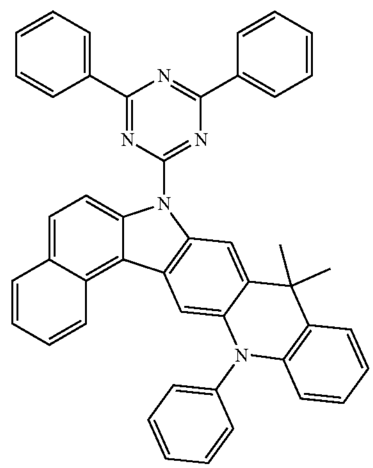
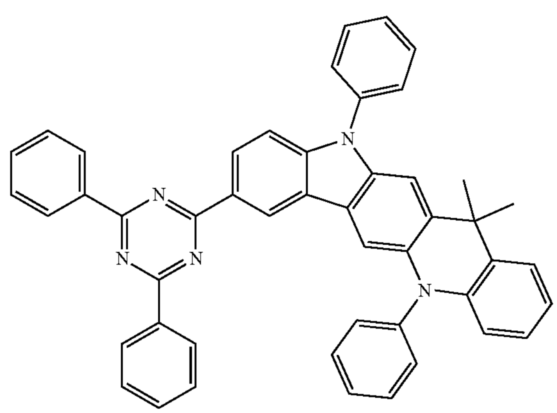

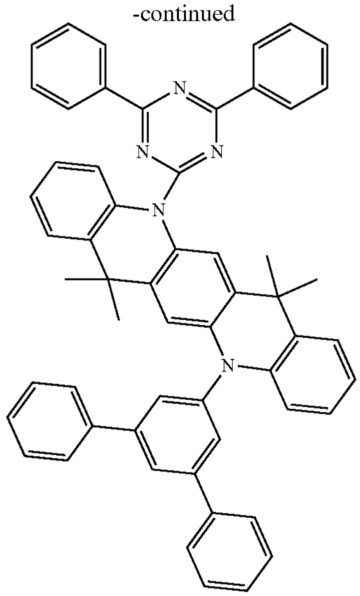
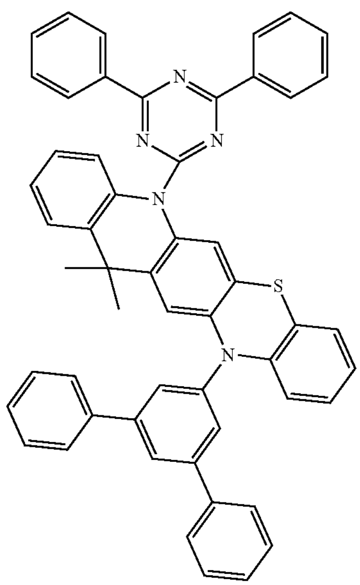
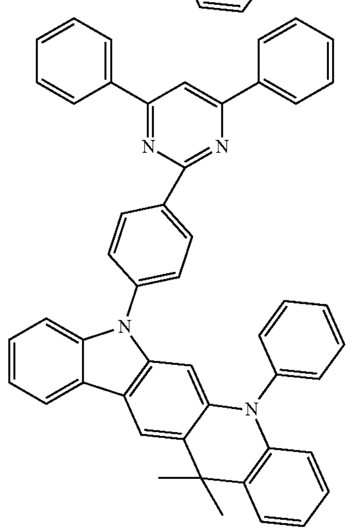
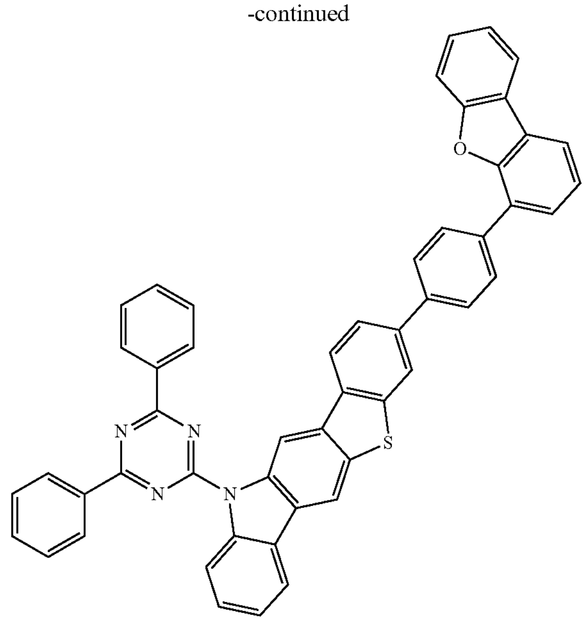
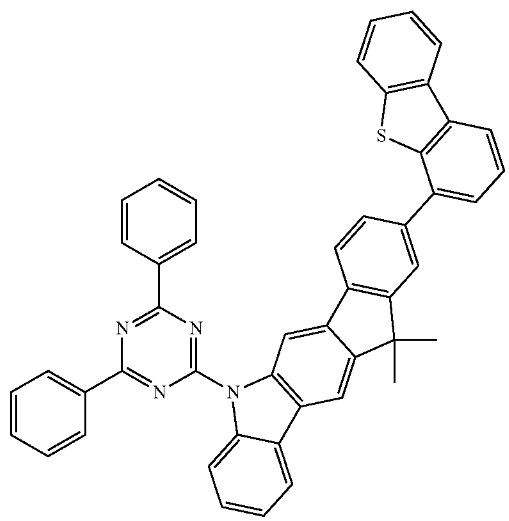
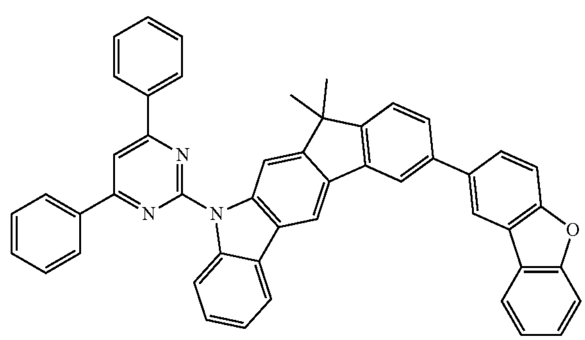

-continued
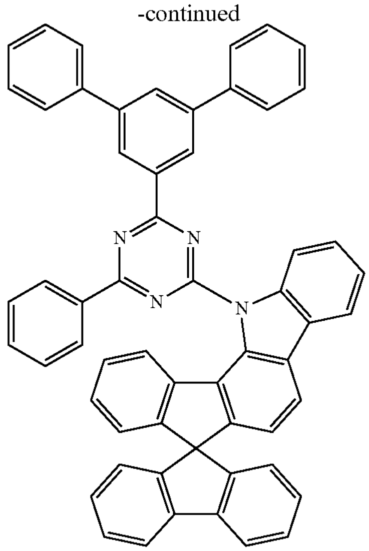
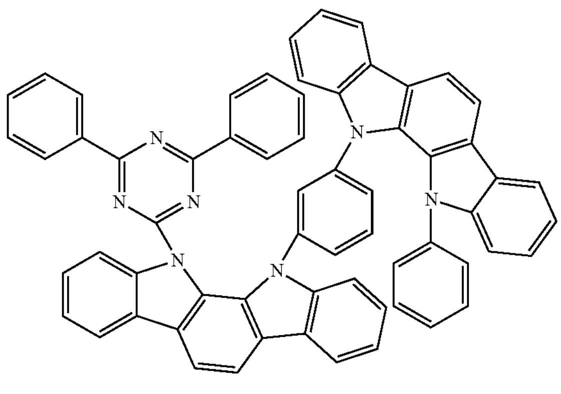
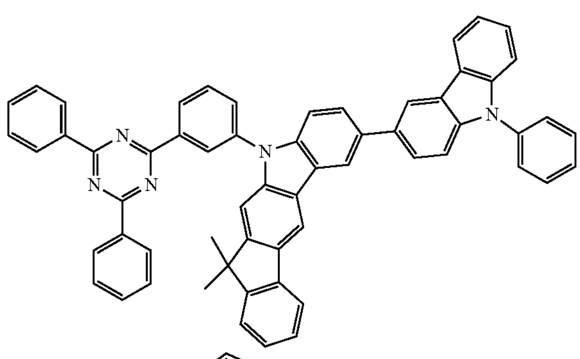
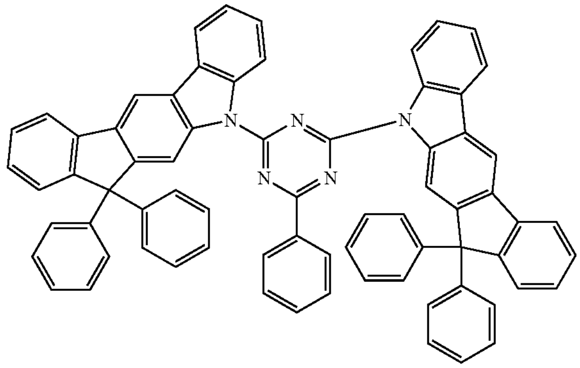
-continued
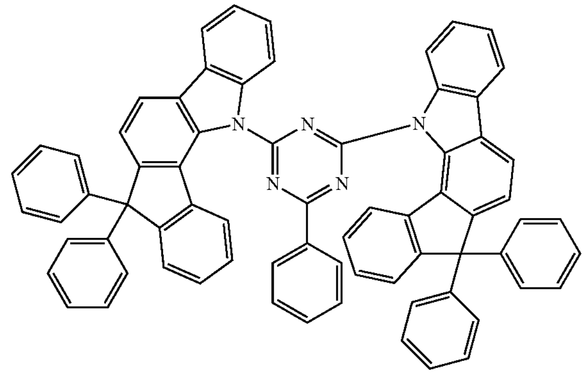
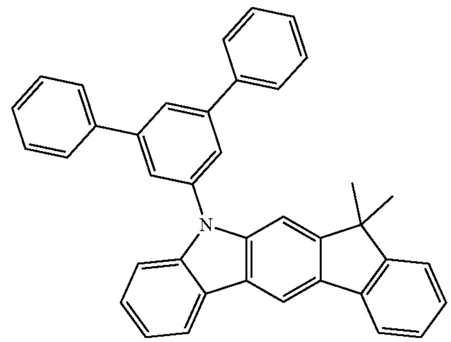
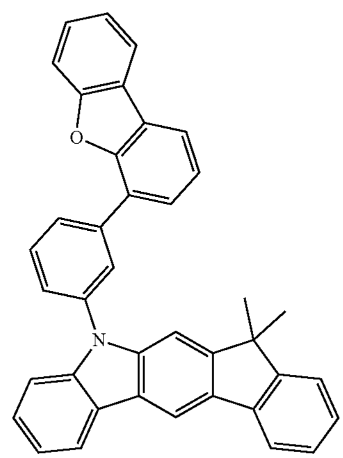
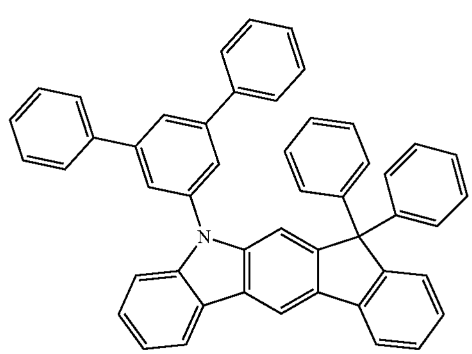

-continued
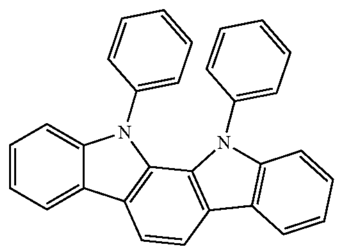
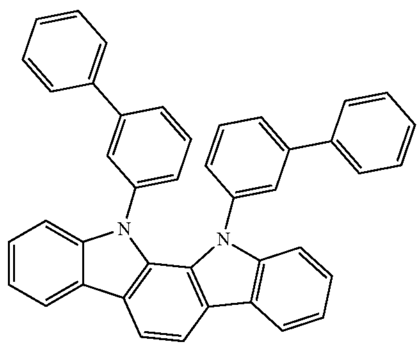
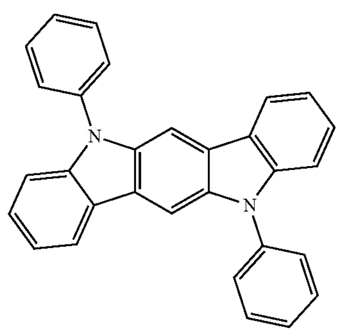
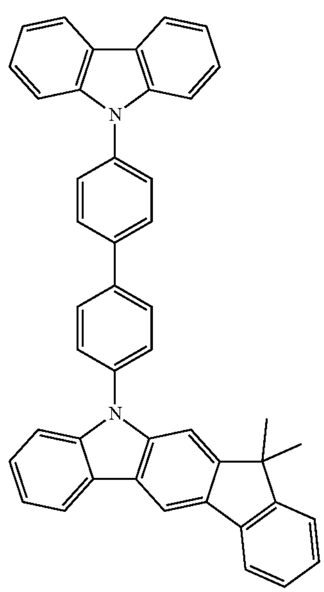
-continued
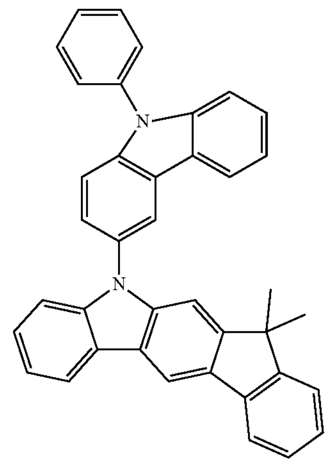
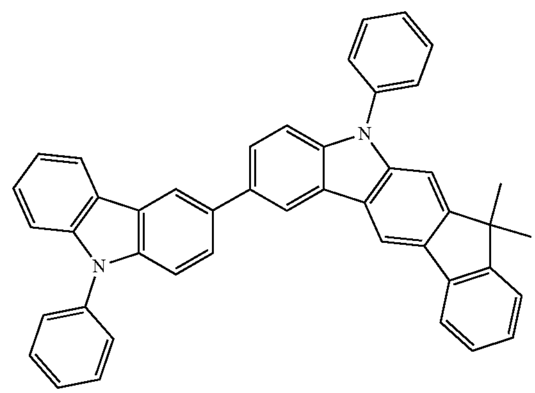
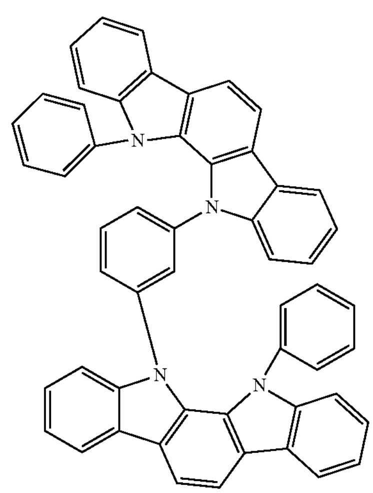

-continued
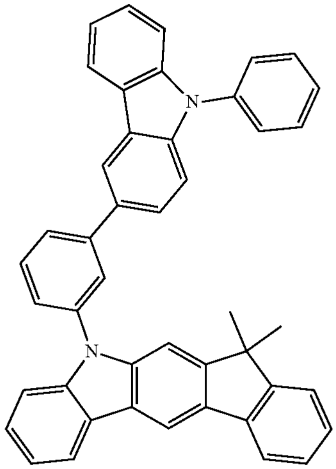
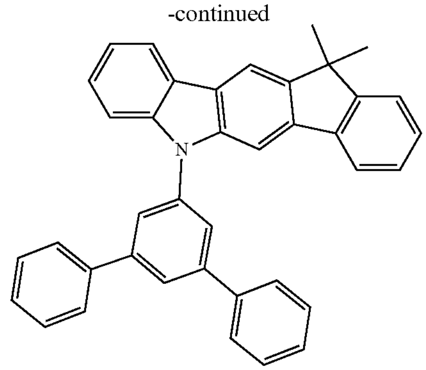
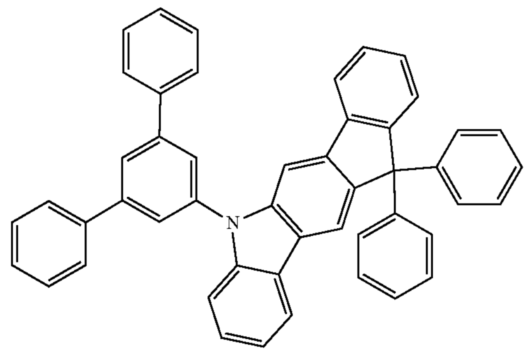
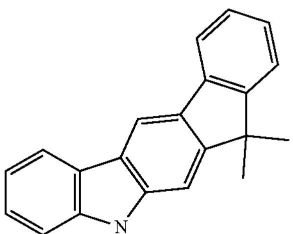
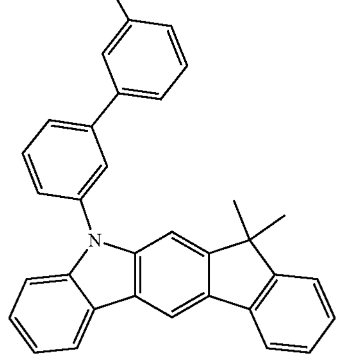
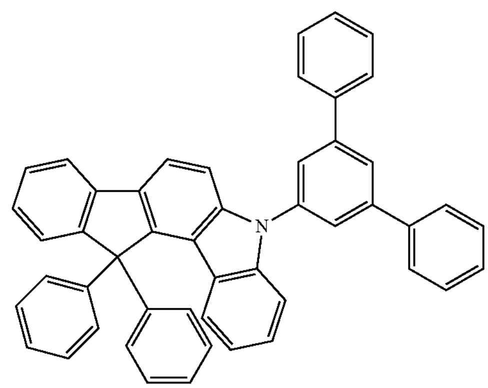
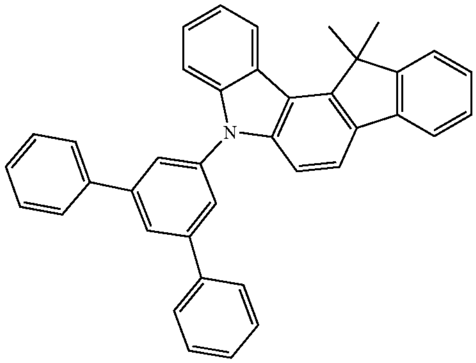
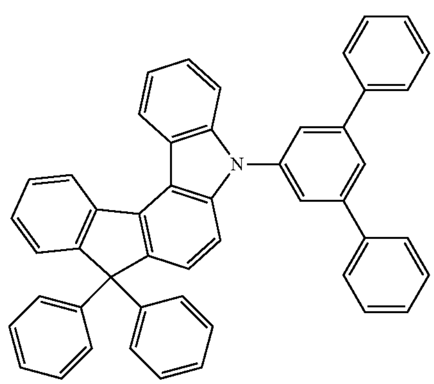

-continued
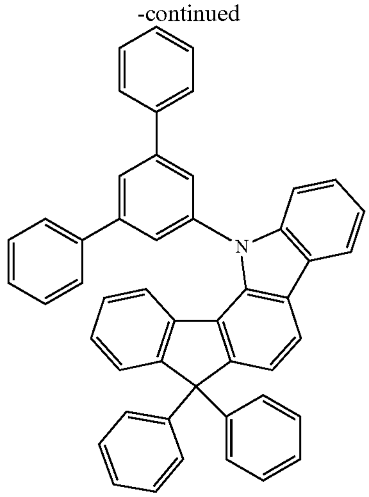
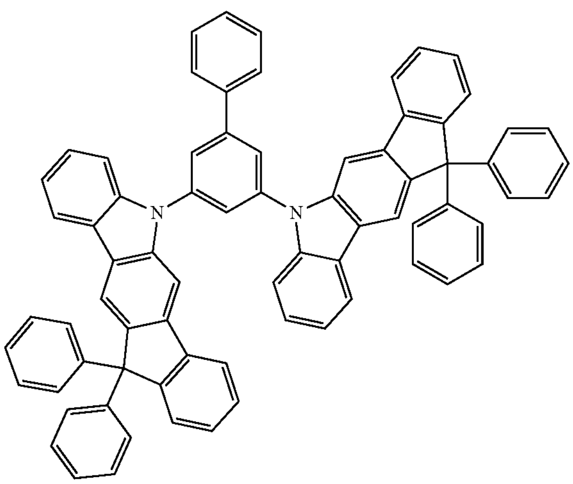
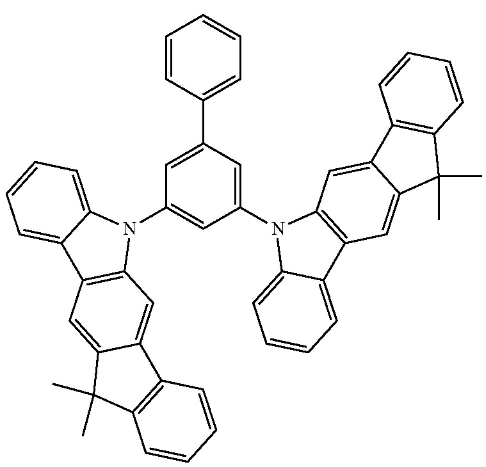
-continued
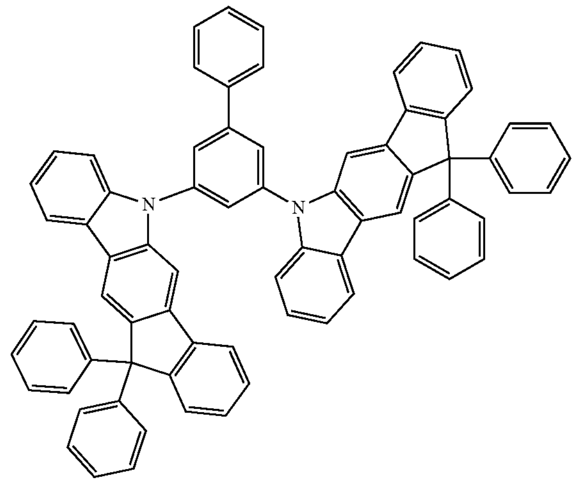
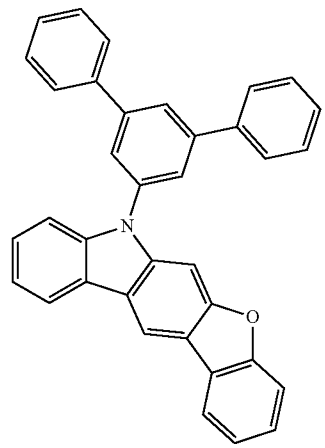
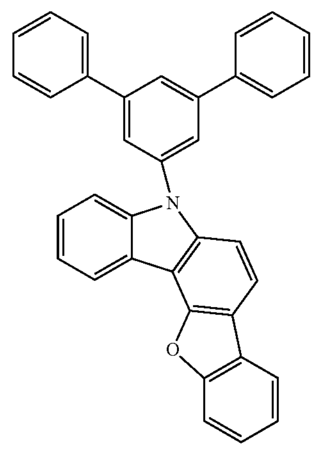
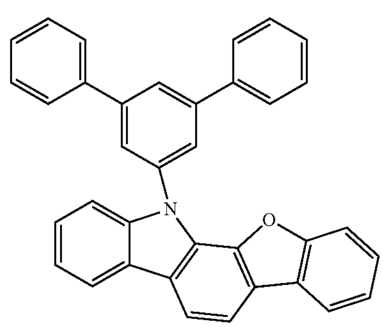

-continued
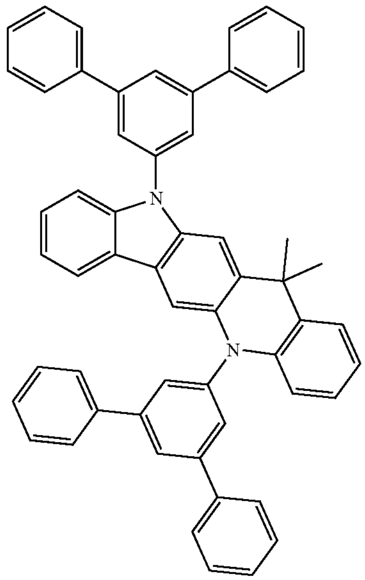
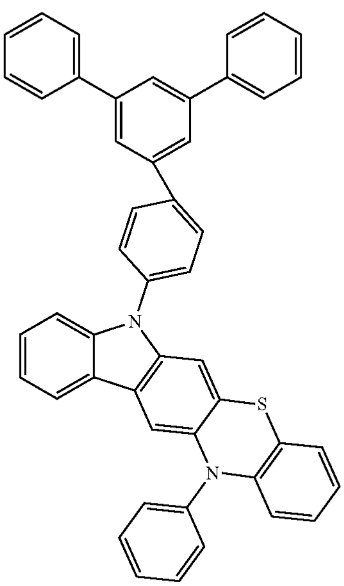
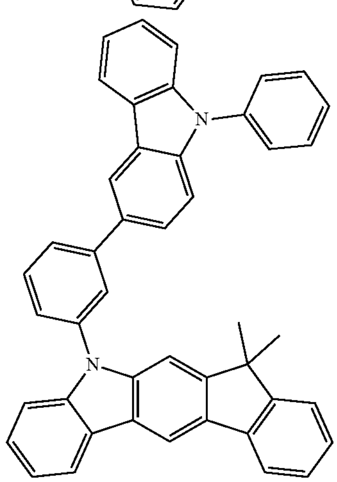
-continued
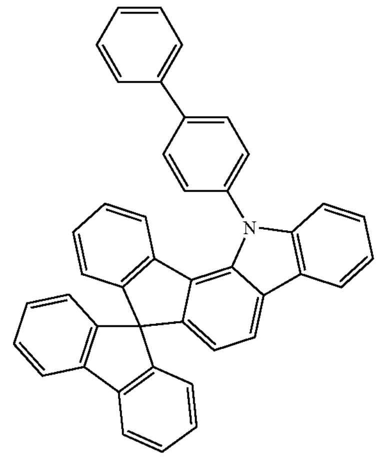
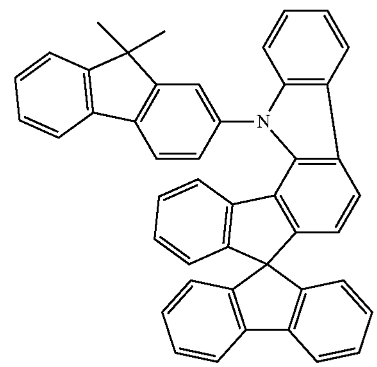
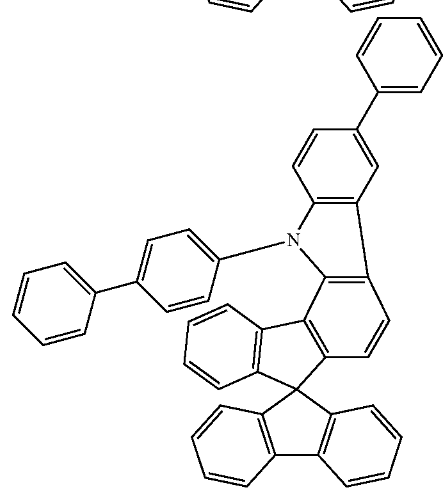
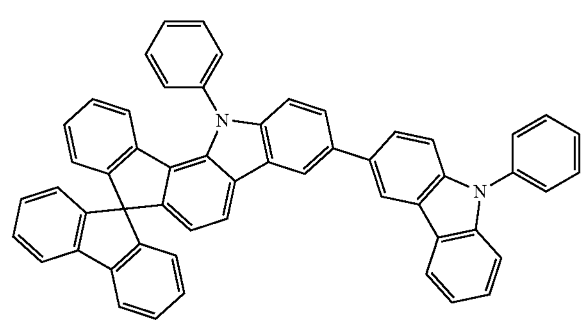

-continued
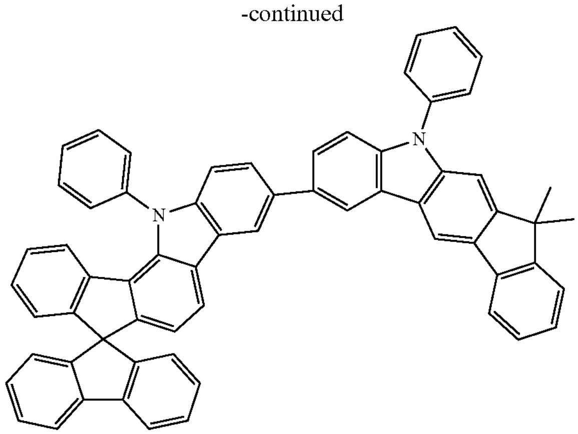
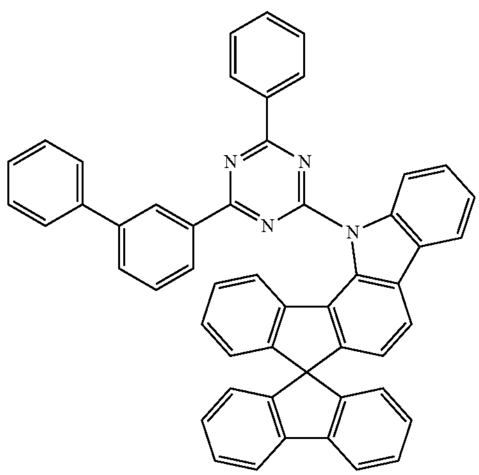
Examples of carbazole derivatives which can be used as hole- or electron-transporting matrix materials according to the substitution pattern are the following structures:
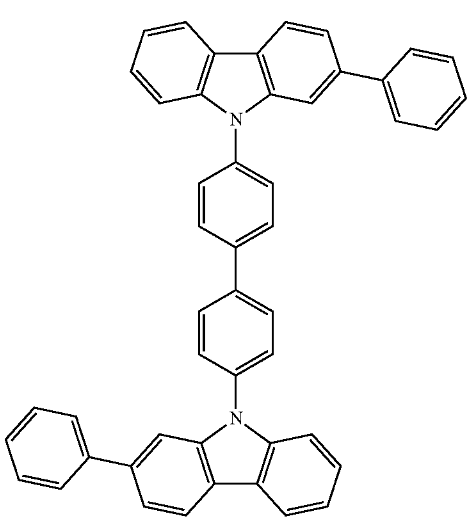
-continued
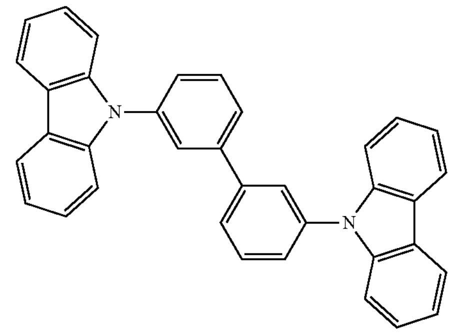
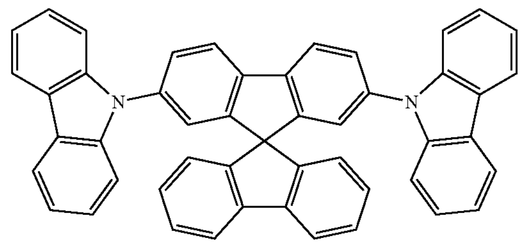
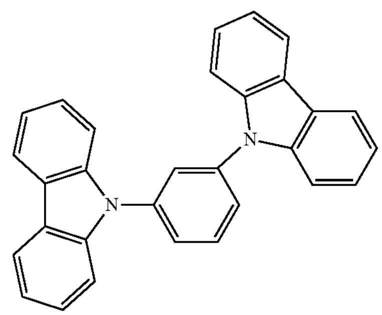
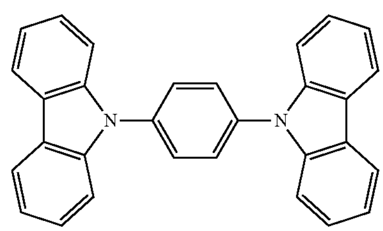
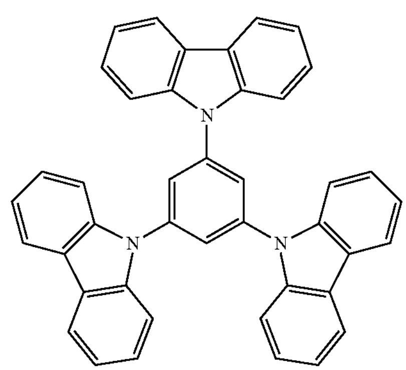
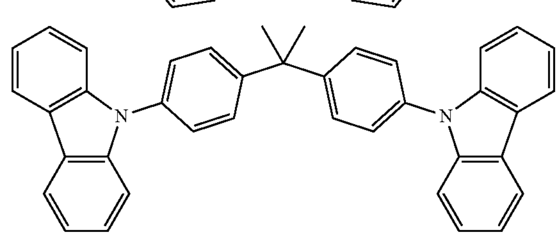

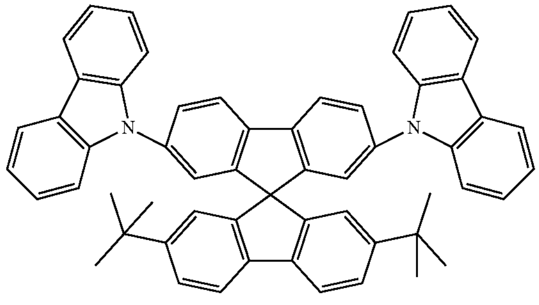
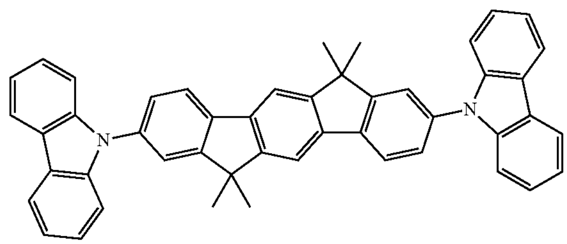
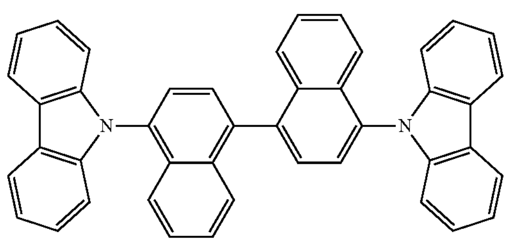
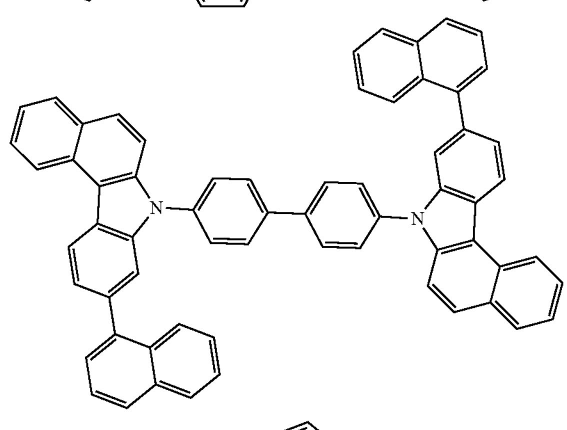
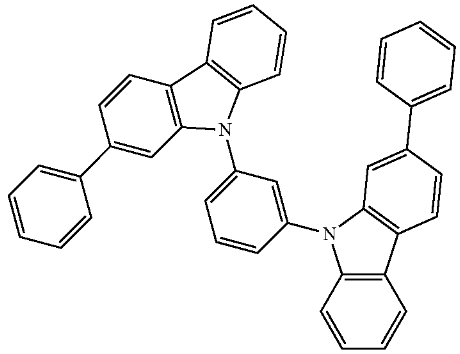
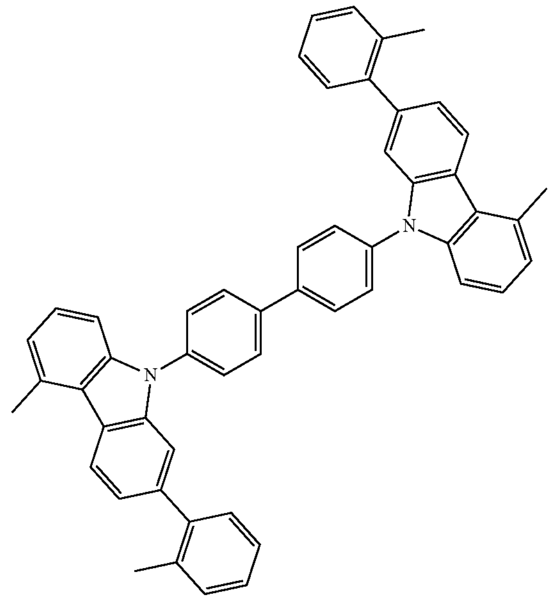
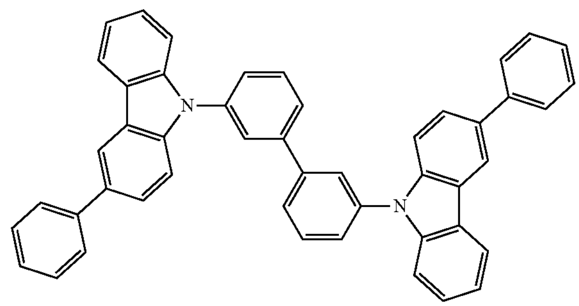
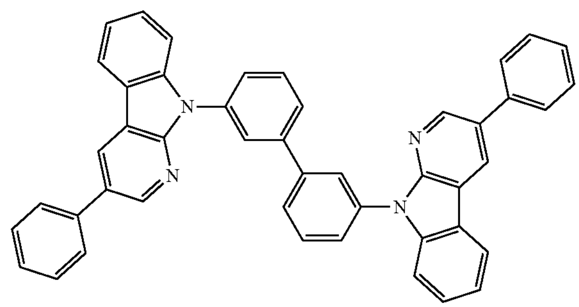
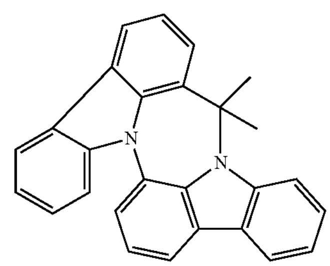
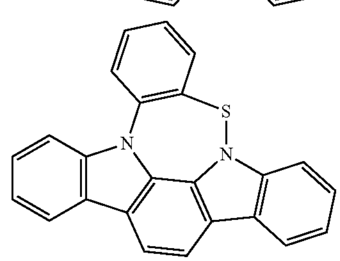

-continued
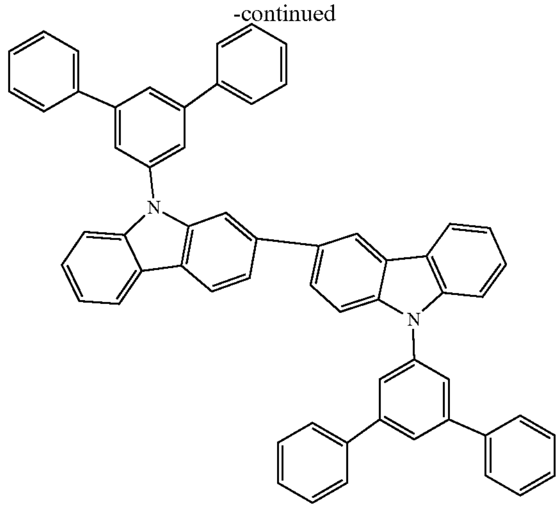
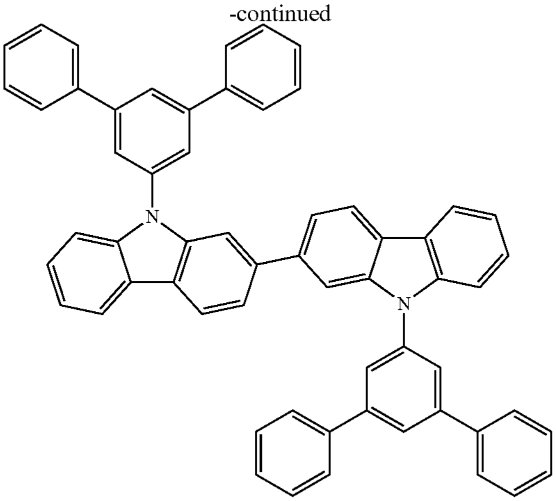
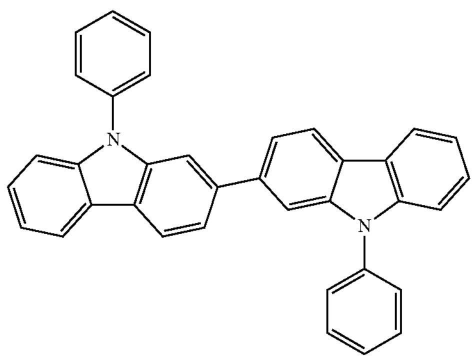
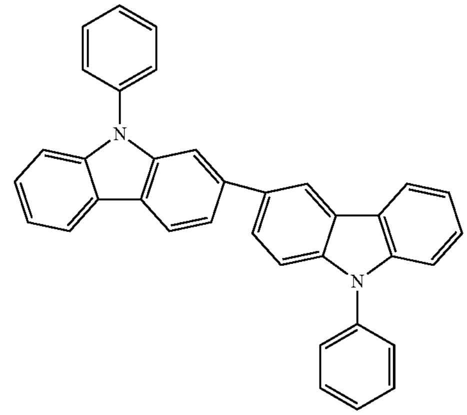
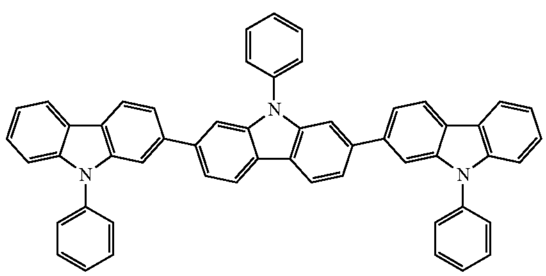
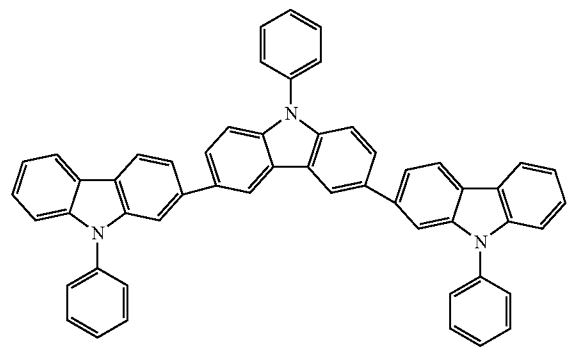 [SMILES: c1ccc(-n2c3ccc(-c4ccc5c6ccccc6n(-c6ccccc6)c5c4)cc3c3cc(-c4ccc5c6ccccc6n(-c6ccccc6)c5c4)ccc32)cc1]
Examples of bridged carbazole derivatives which can be used as hole-transporting matrix materials:
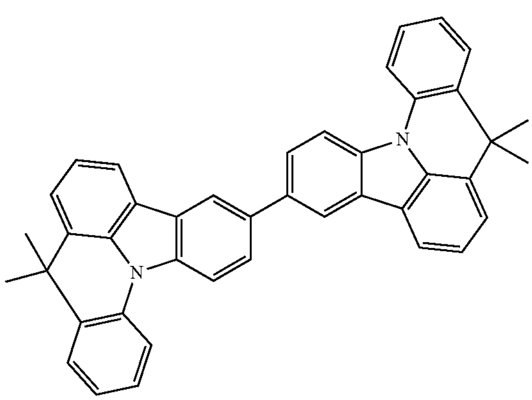
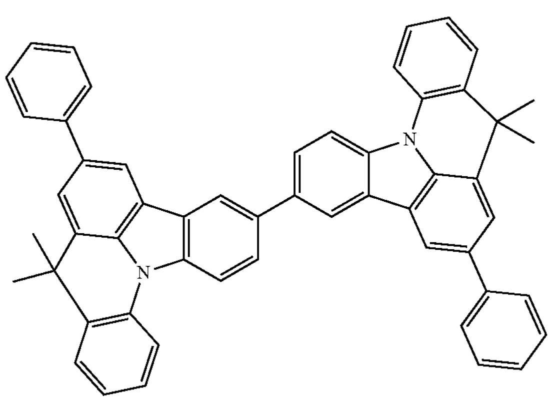

-continued
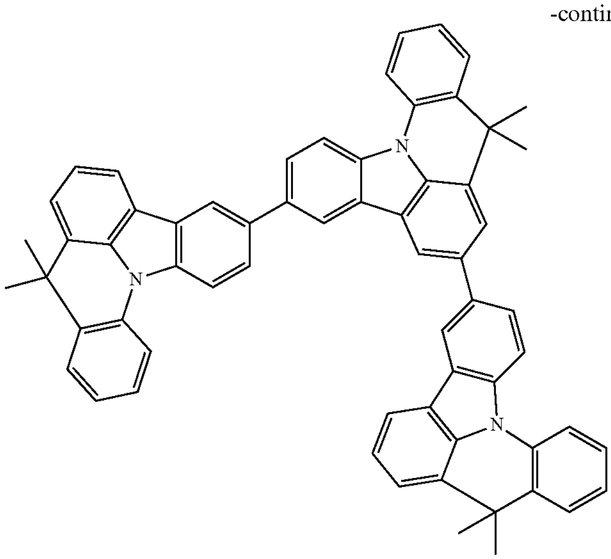
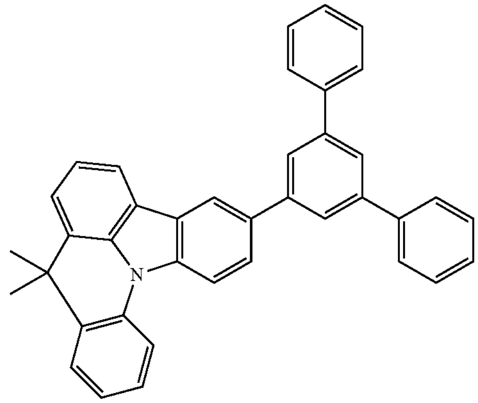
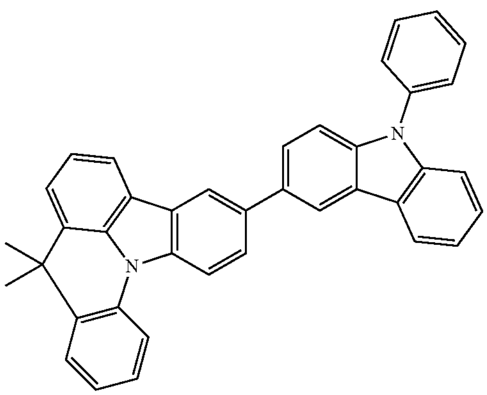
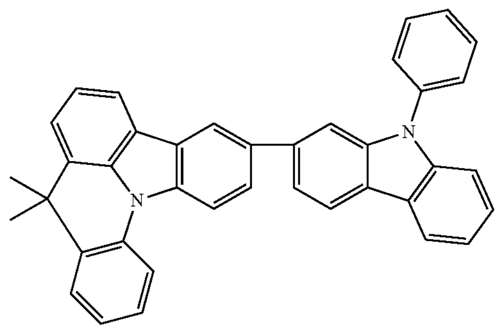
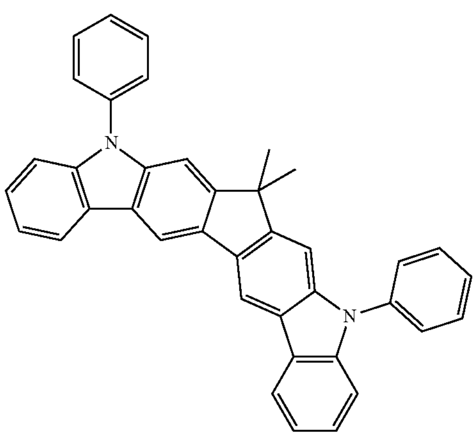
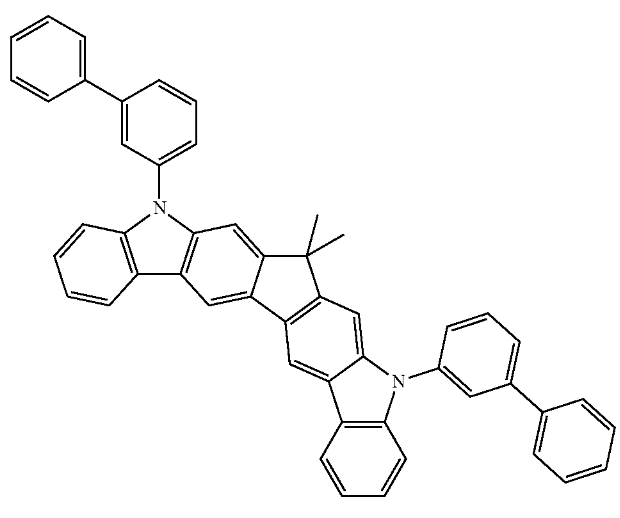

-continued
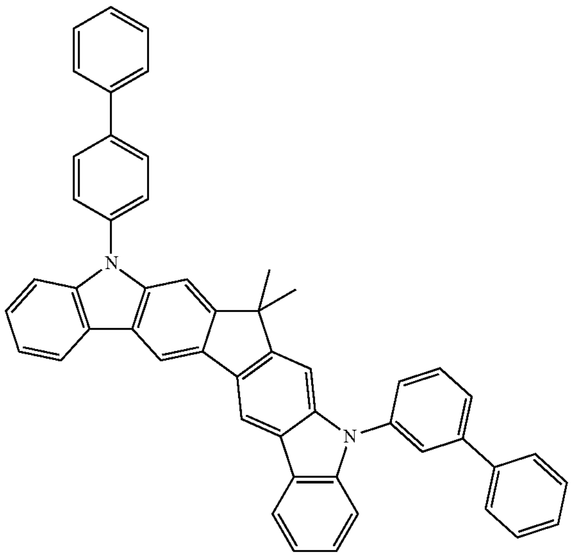
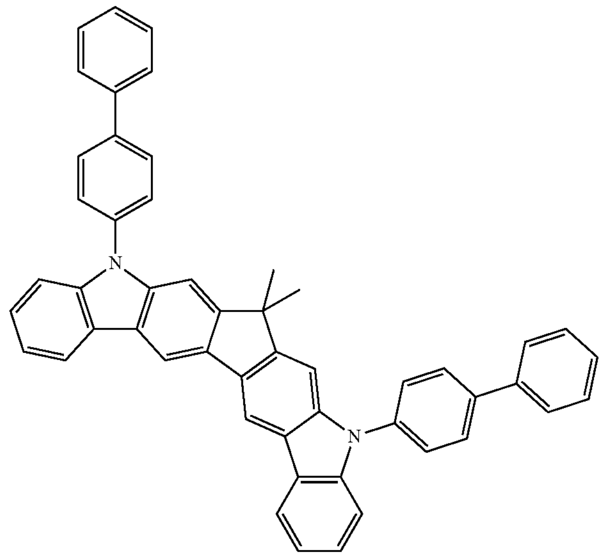
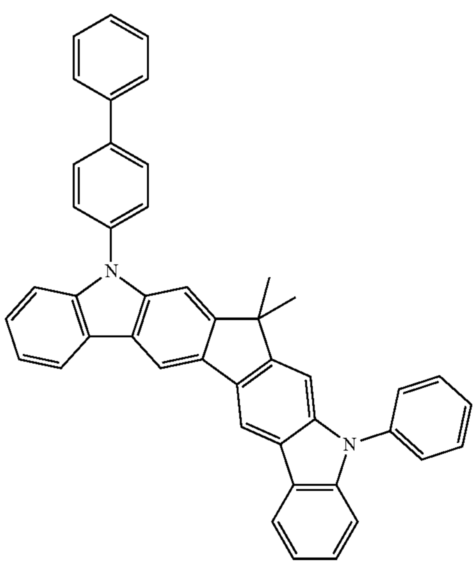
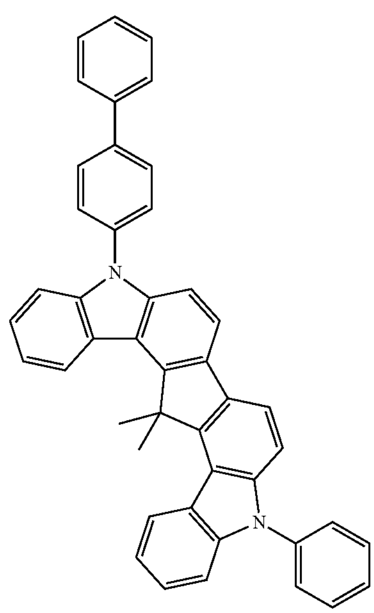

-continued
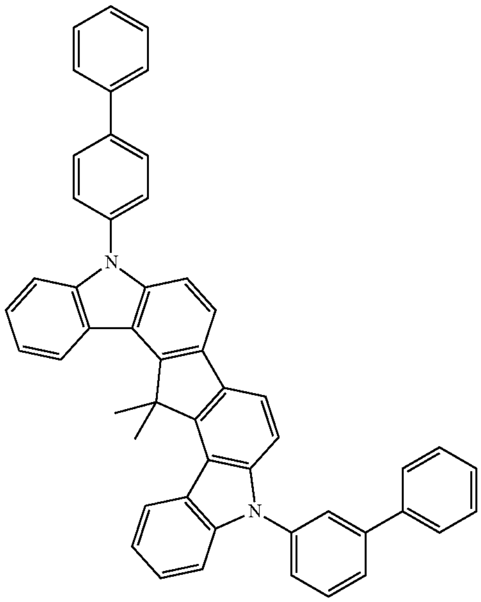
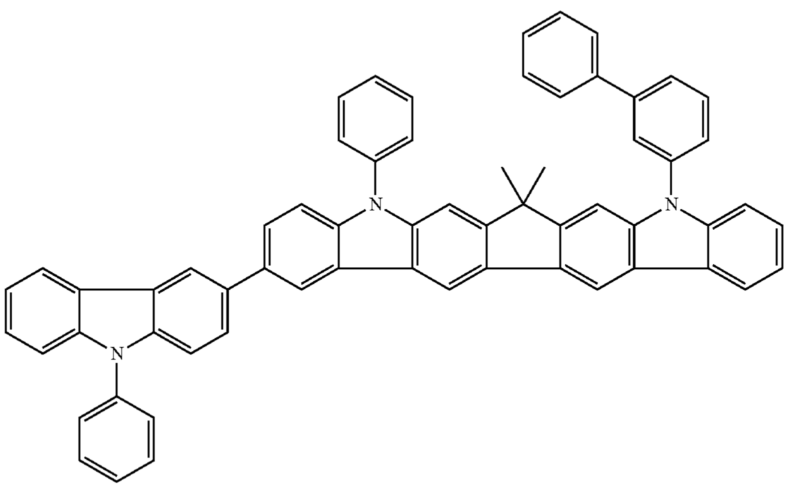
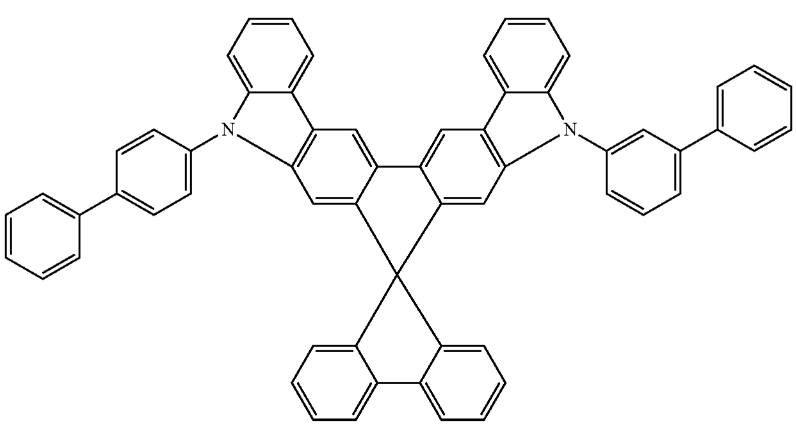

-continued
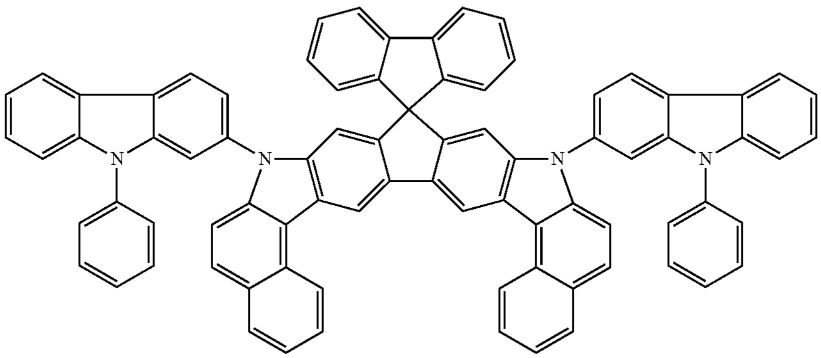
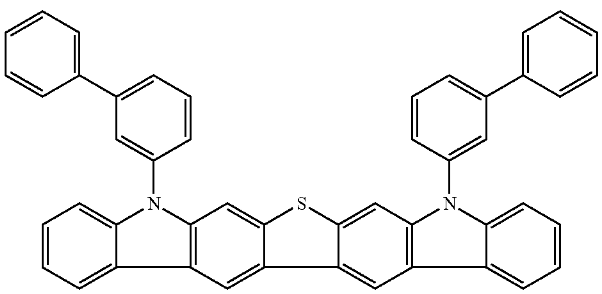
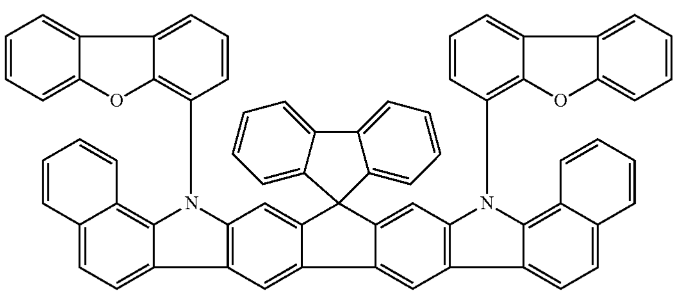
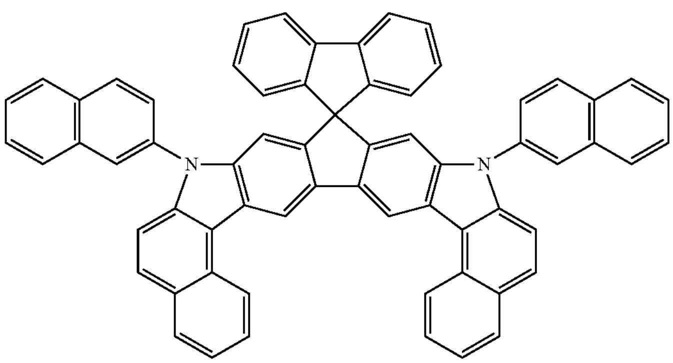
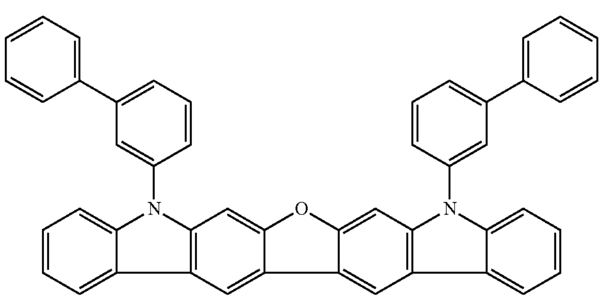

-continued
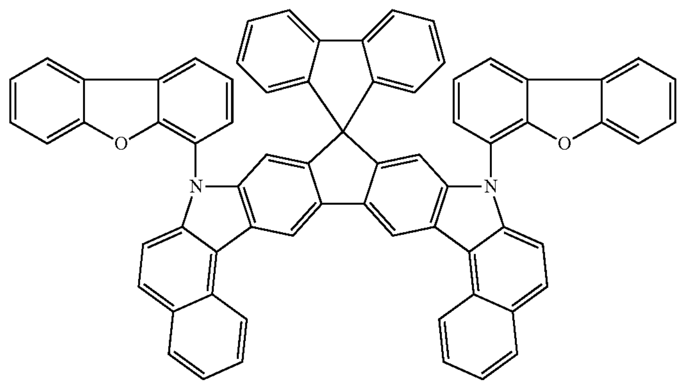
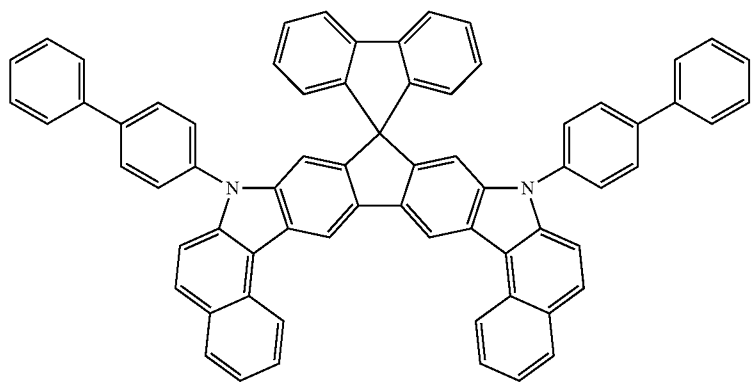
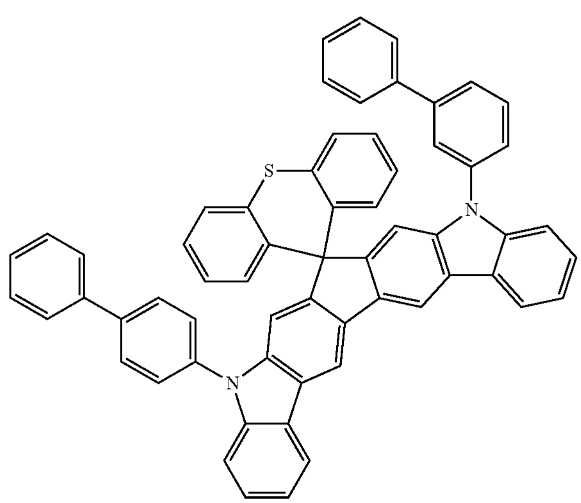
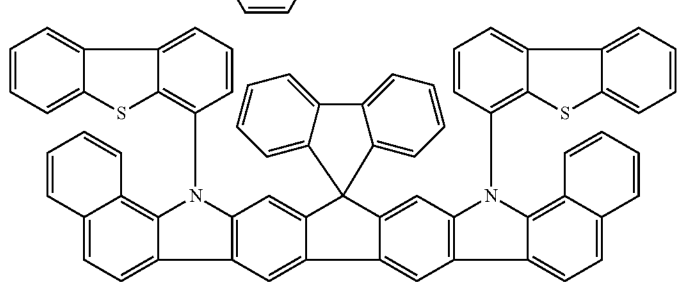

-continued
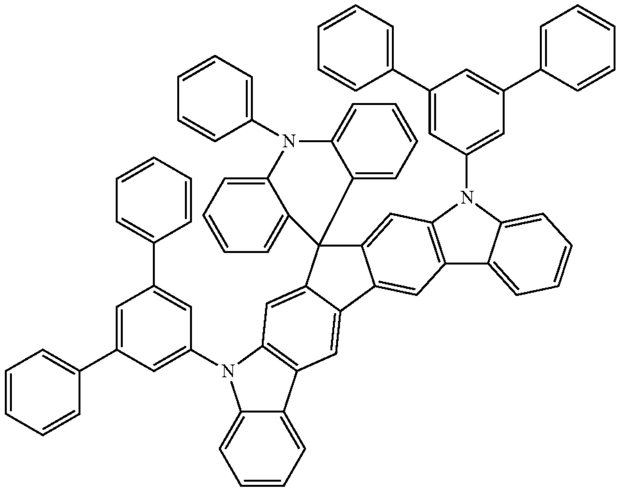
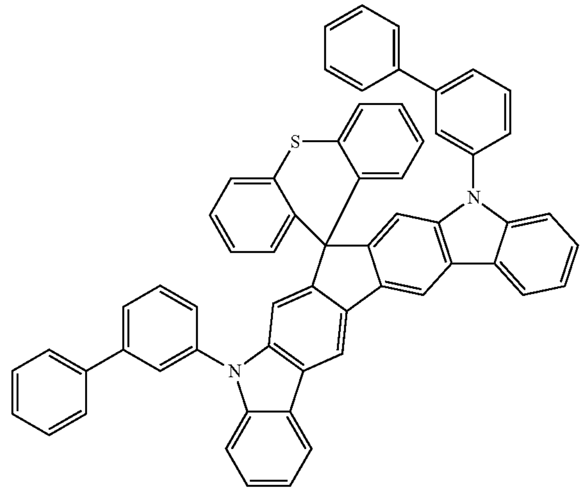
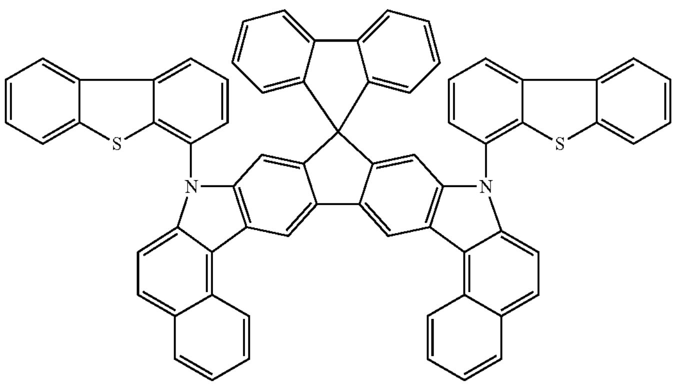
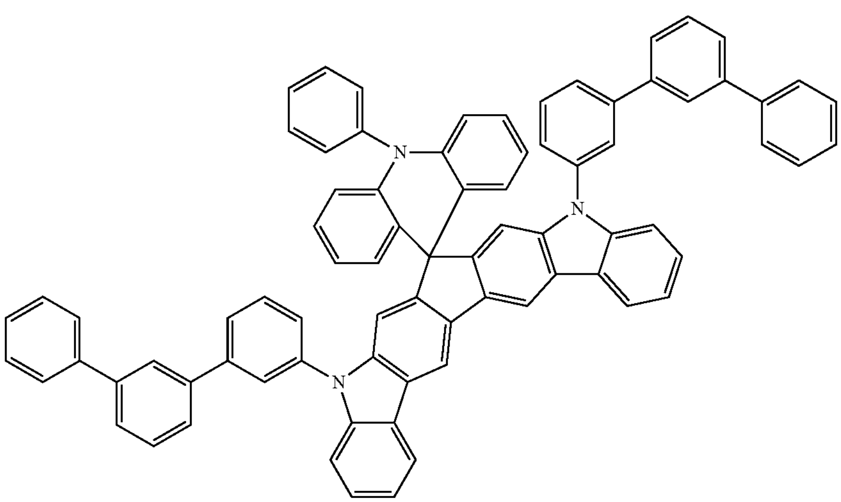

-continued
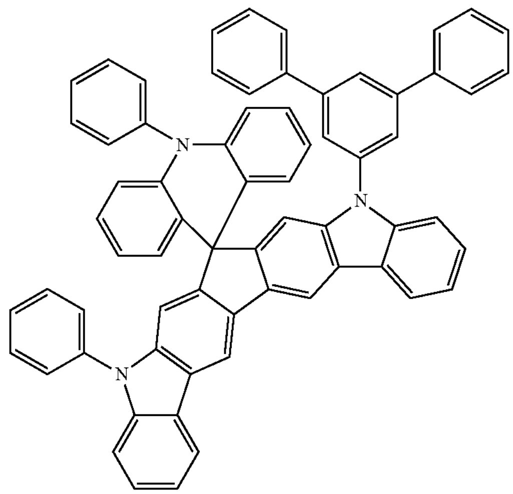
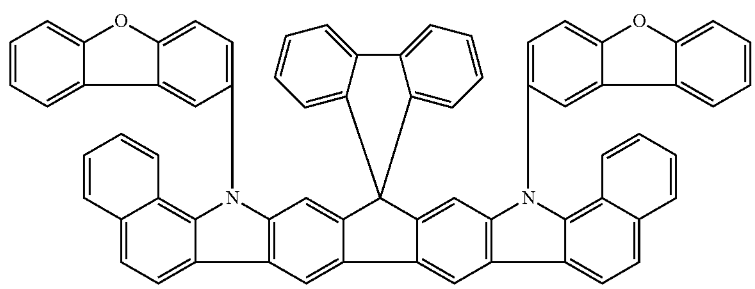
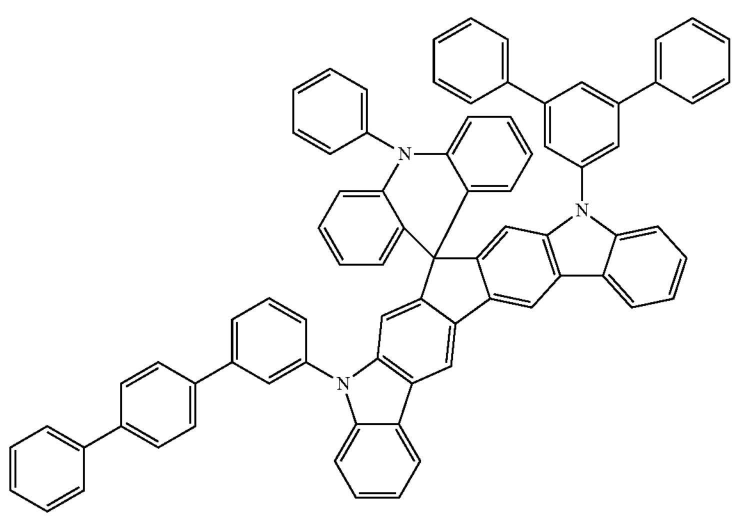

-continued
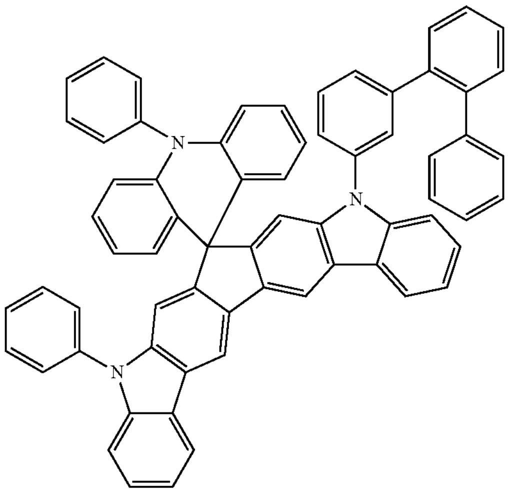
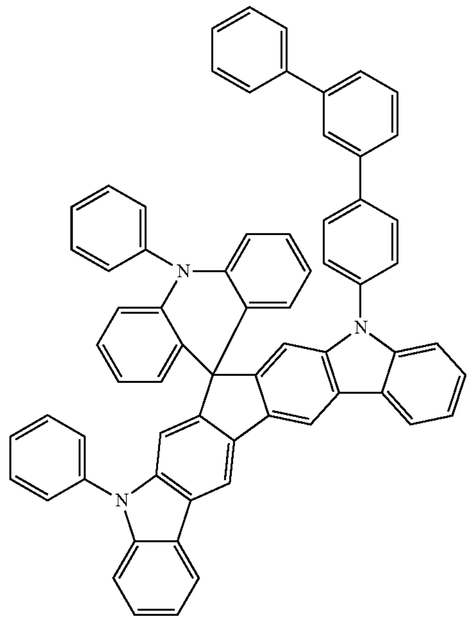
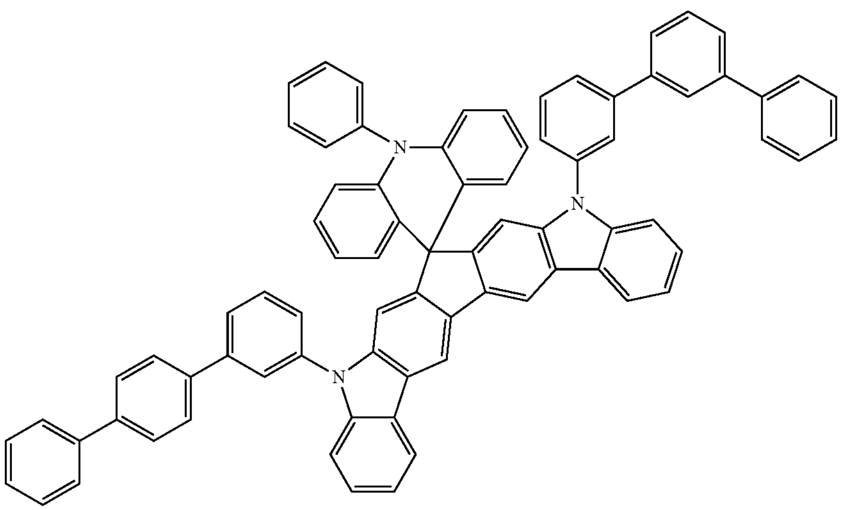
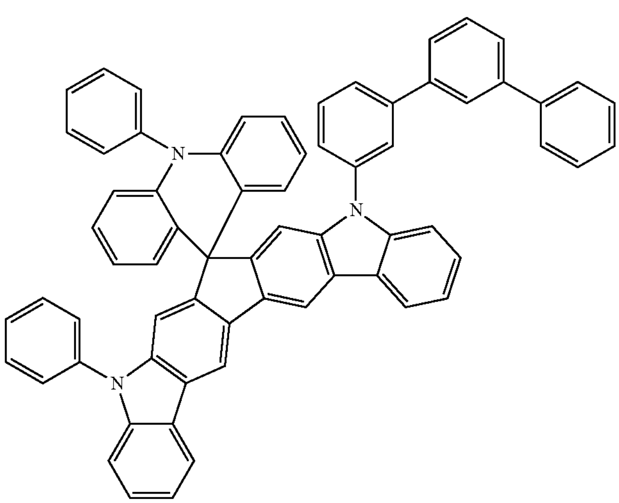
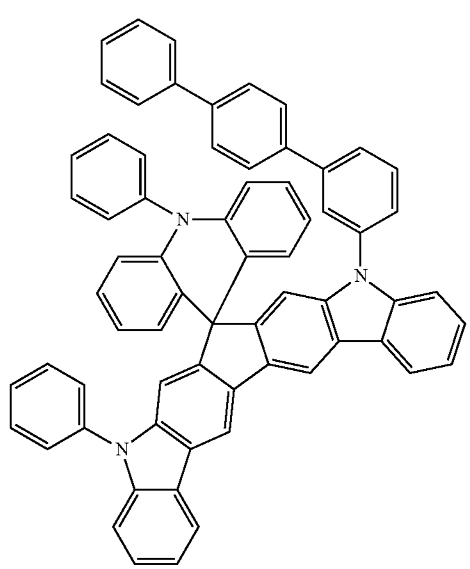

-continued
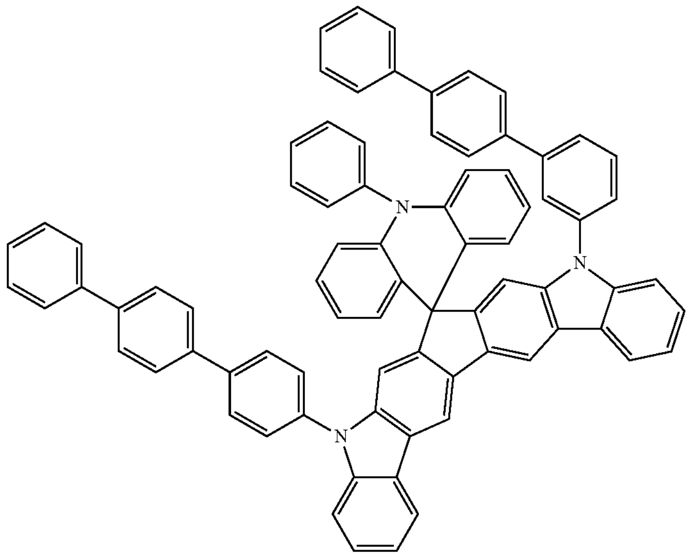
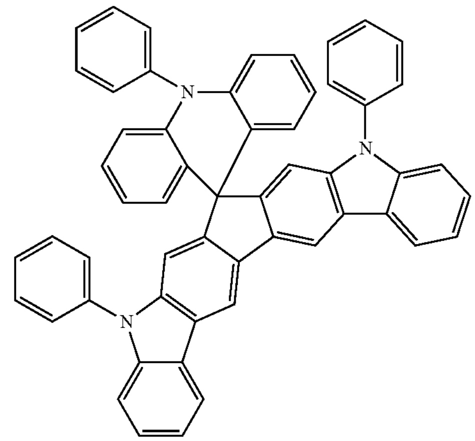
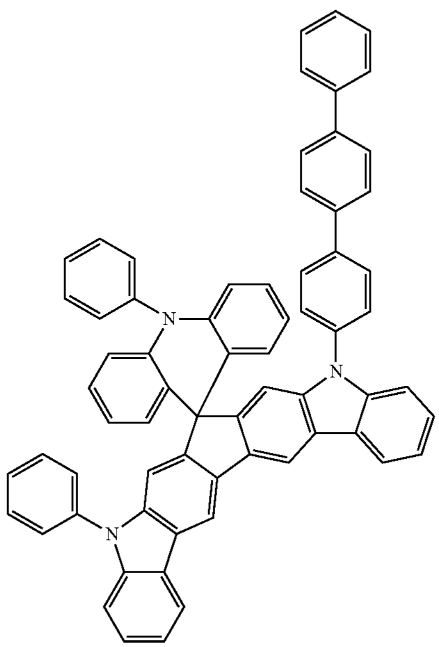
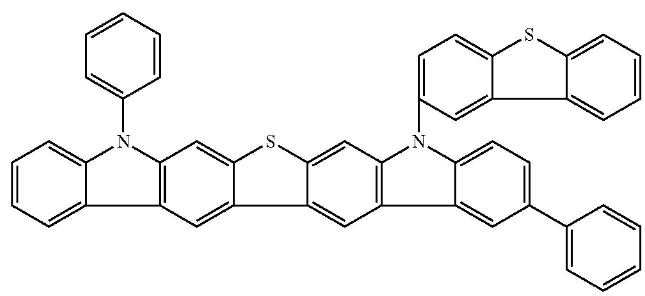
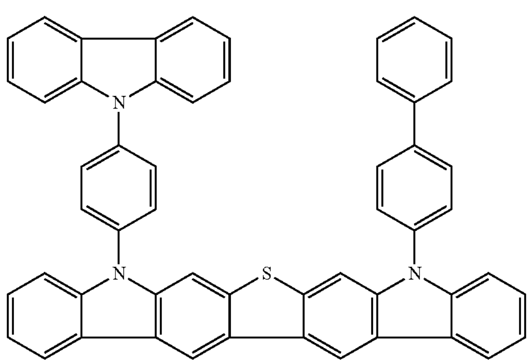
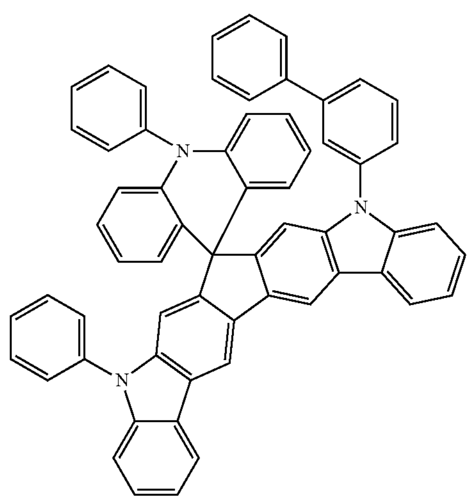

-continued
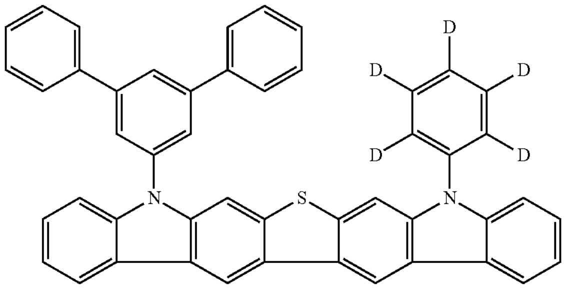
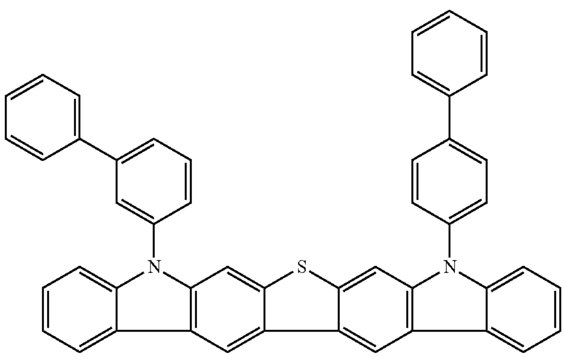
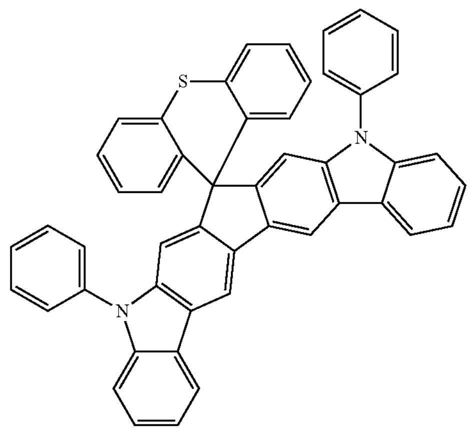
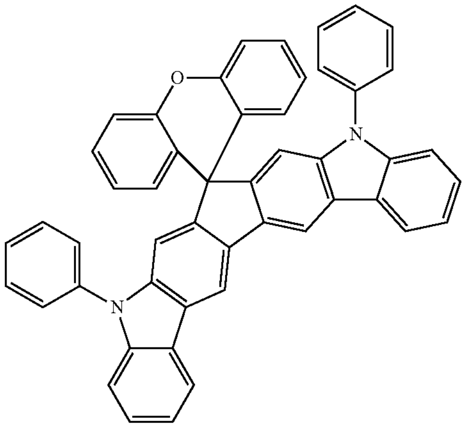
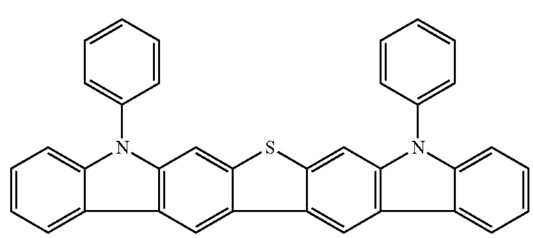

-continued
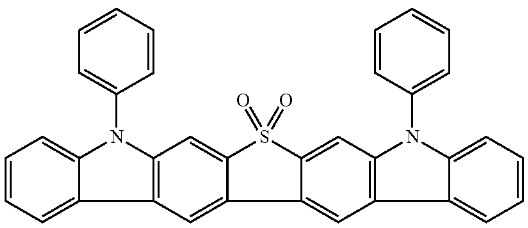
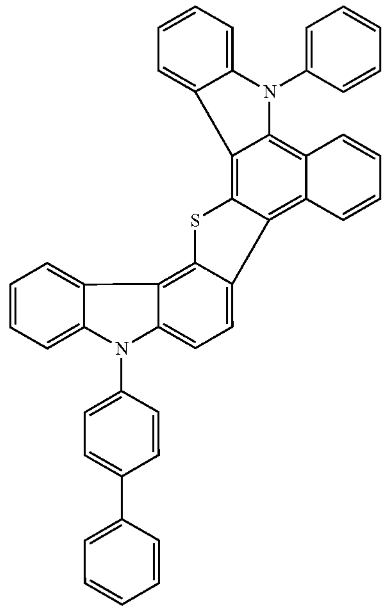
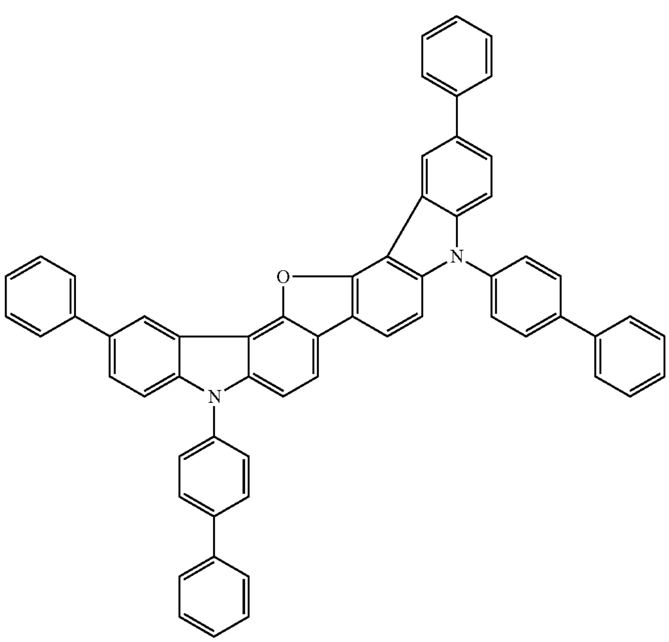

-continued
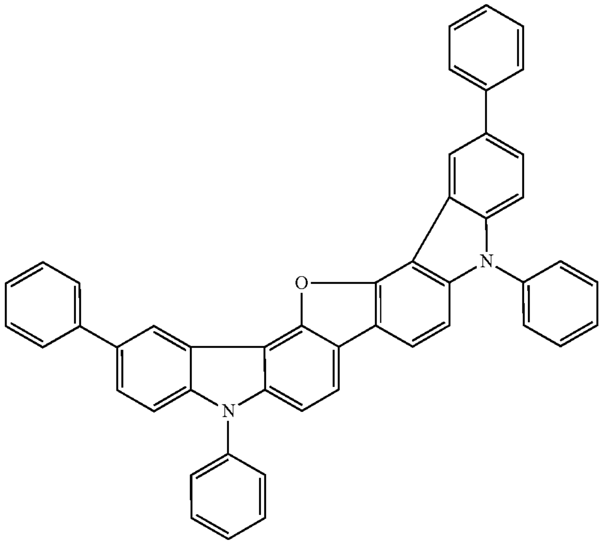
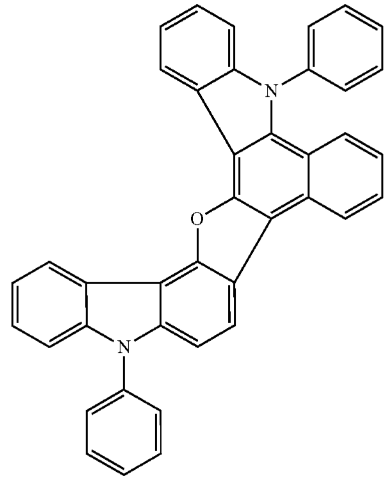
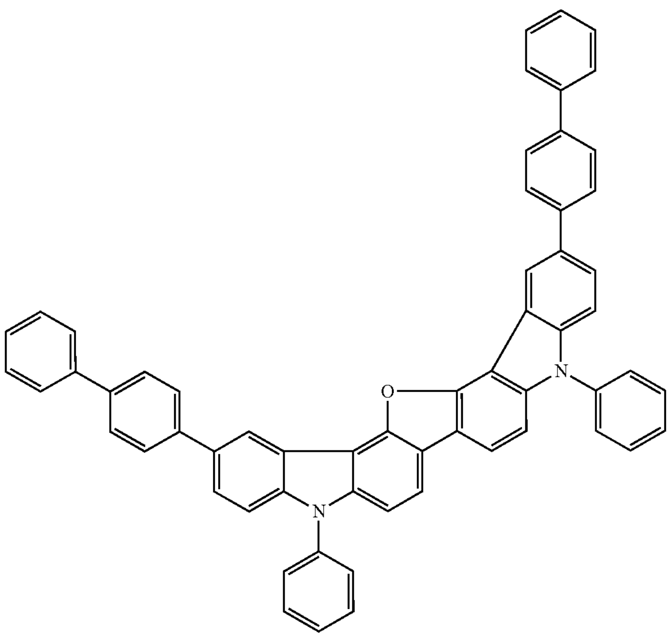
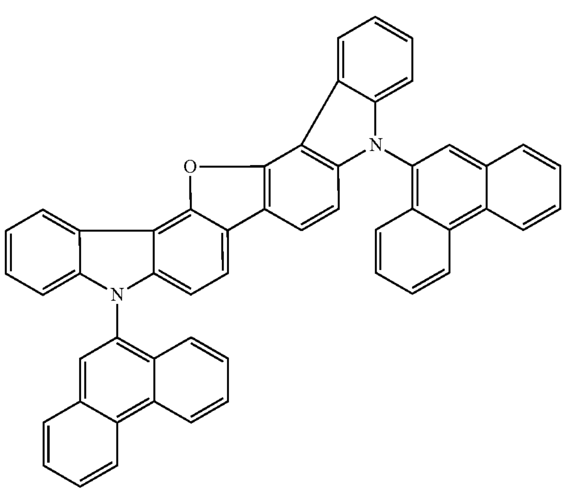
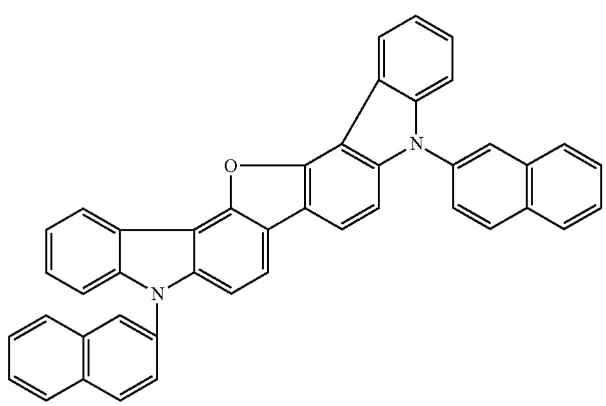

-continued
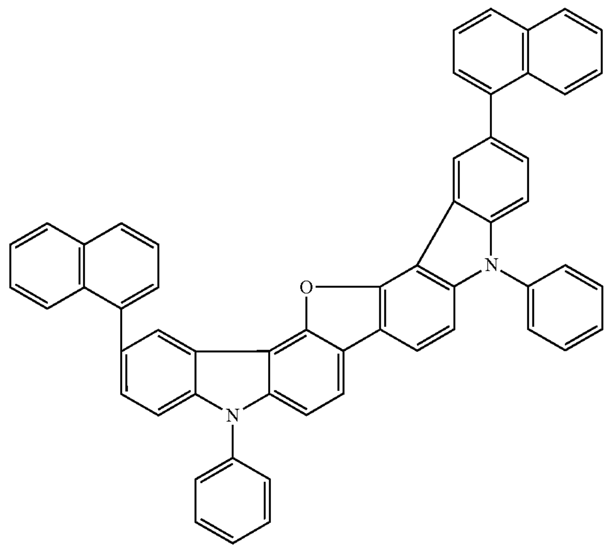
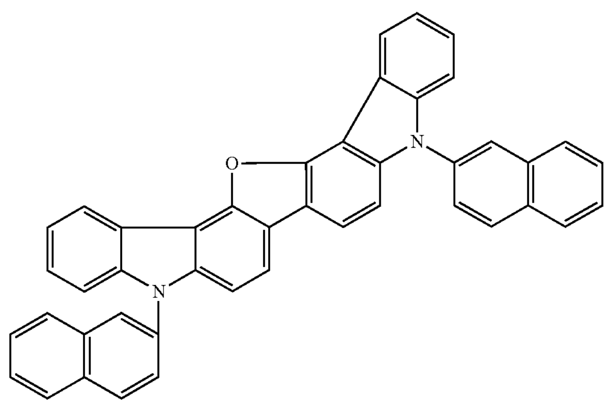
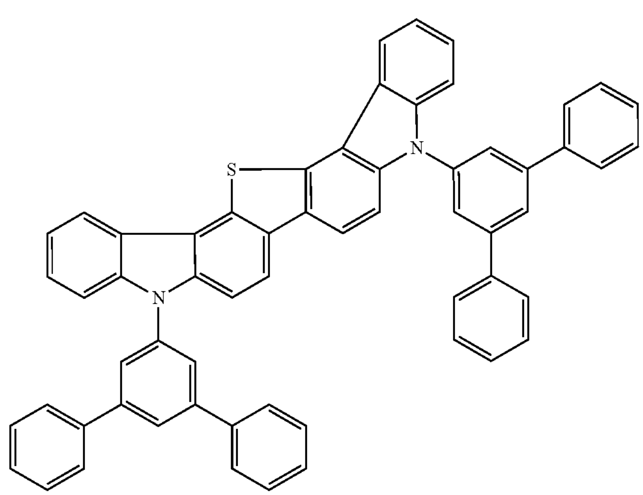

-continued
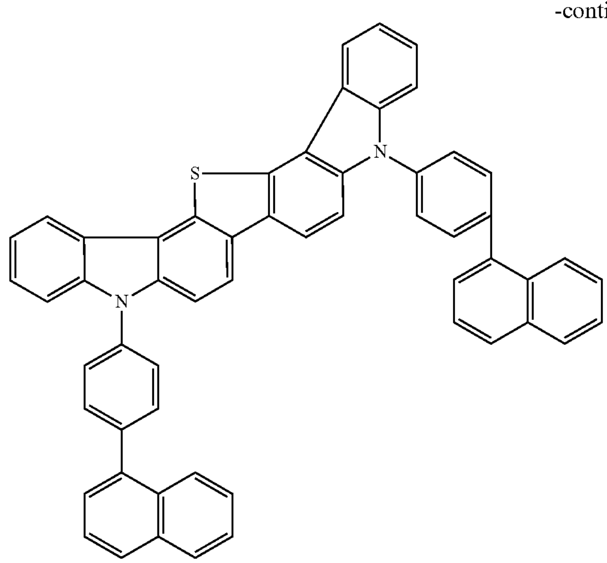
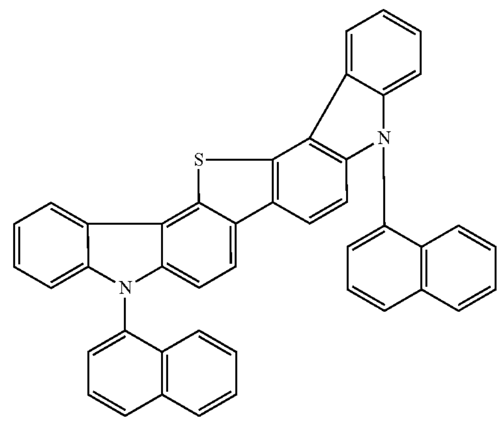
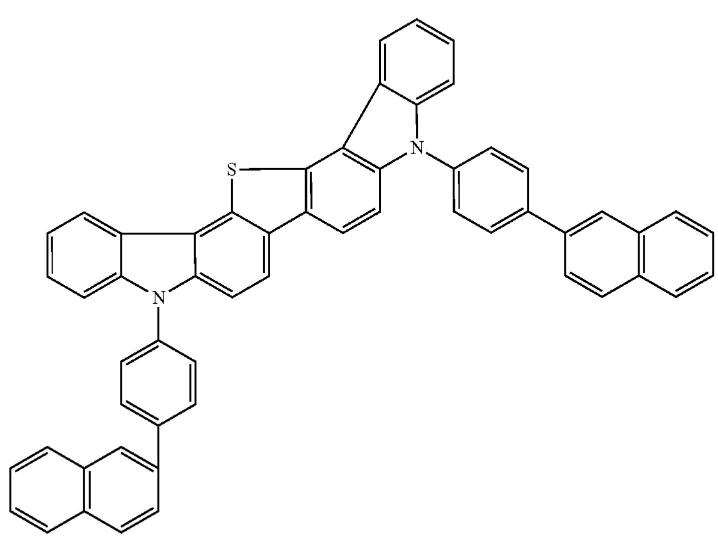
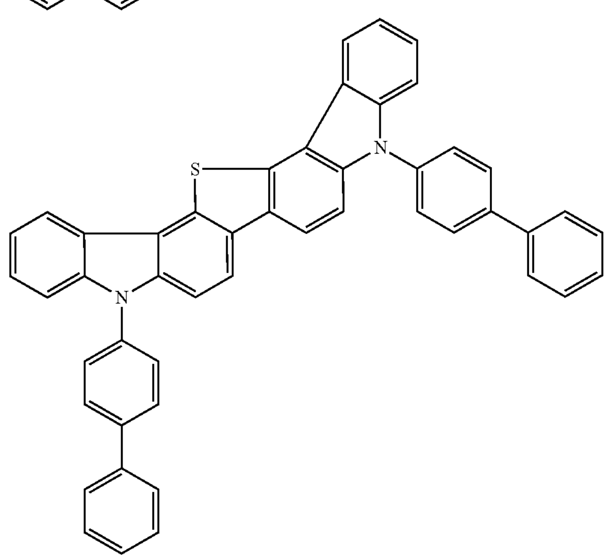

-continued
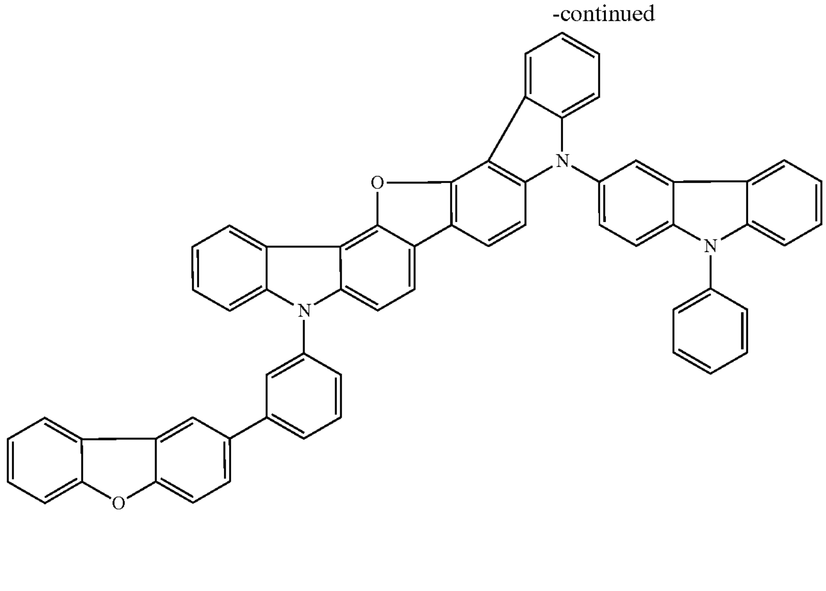
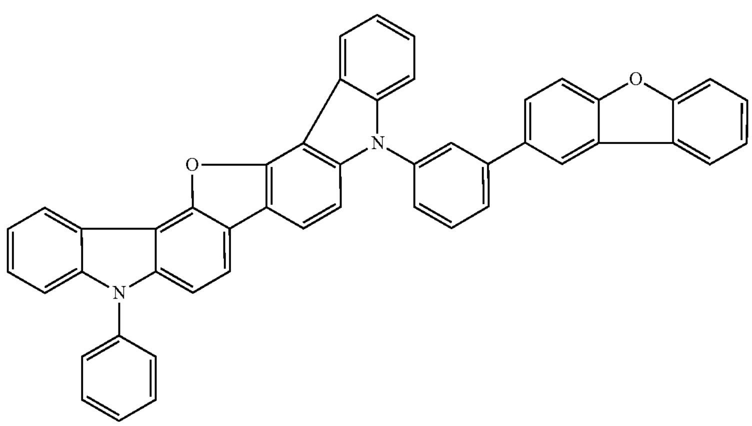
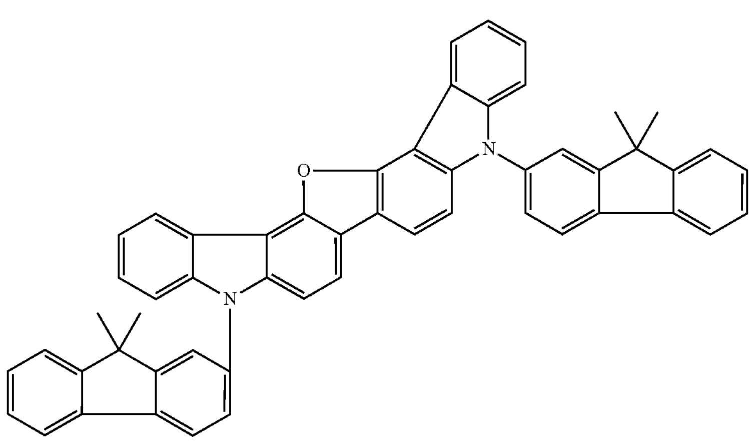

-continued
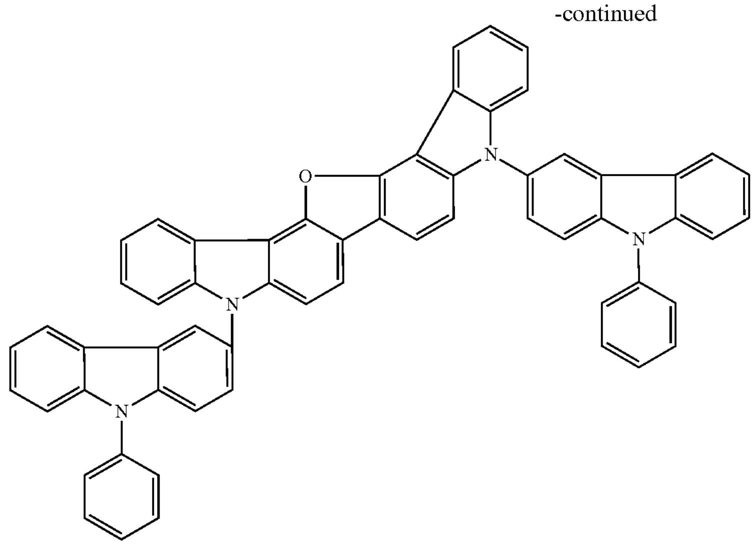
Examples of biscarbazole derivatives which can be used as hole-transporting matrix materials:
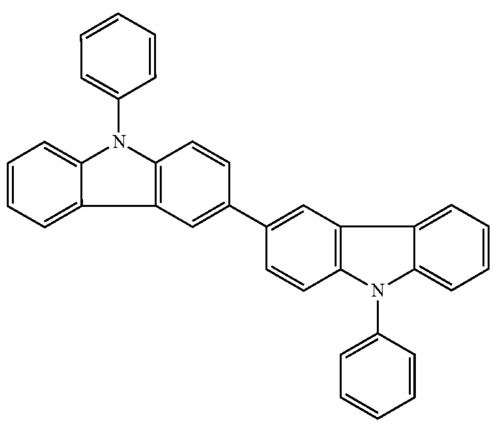
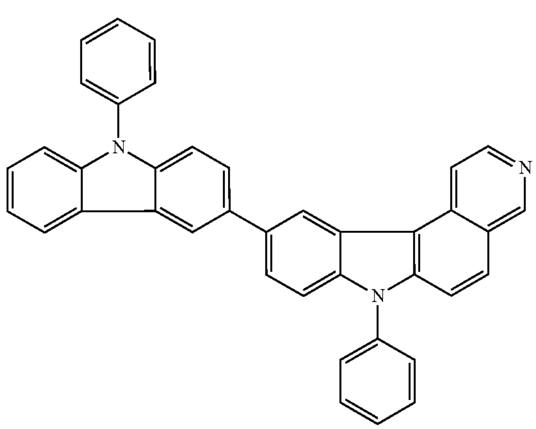
-continued
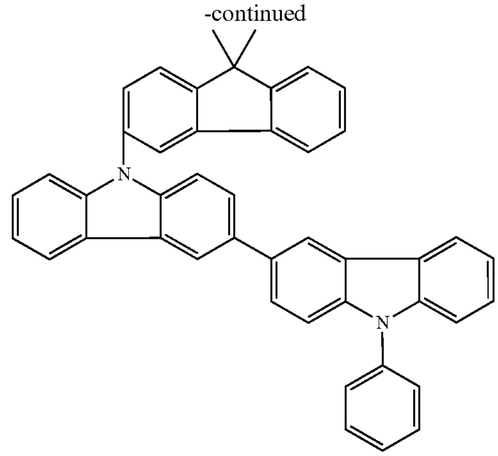
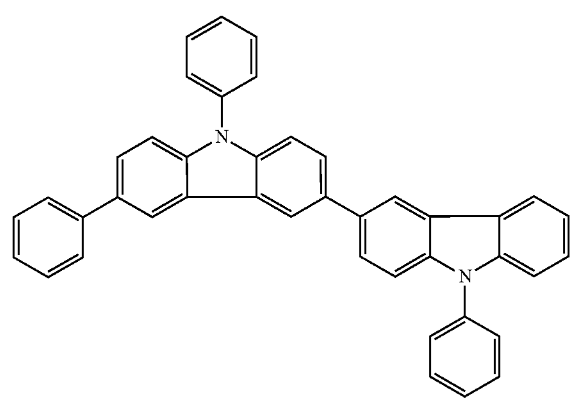

-continued
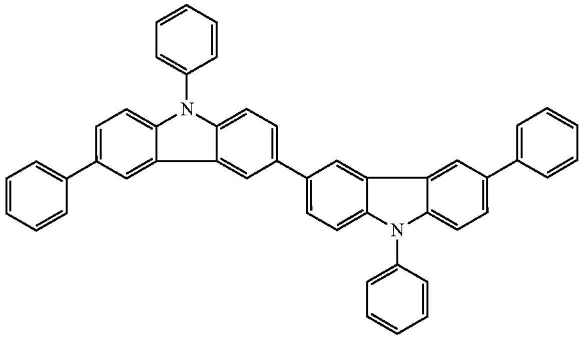
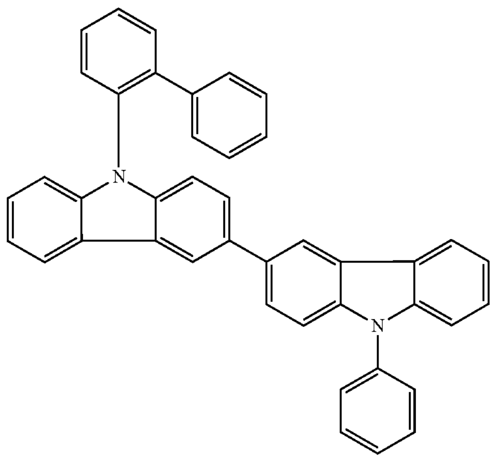
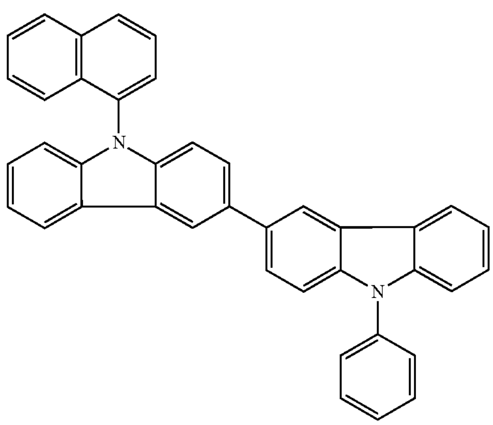
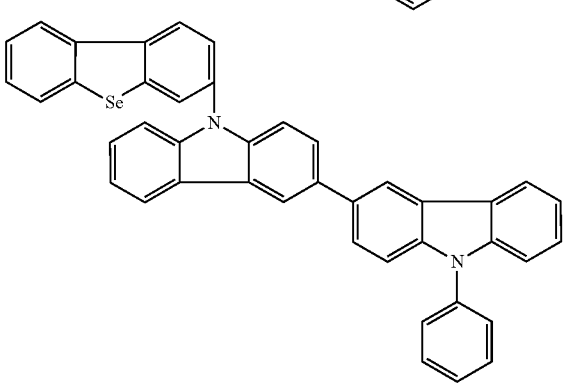
-continued
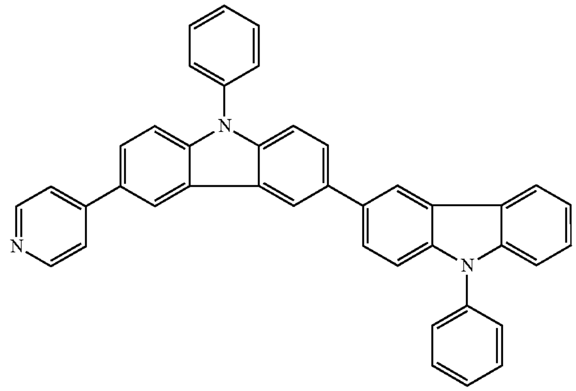
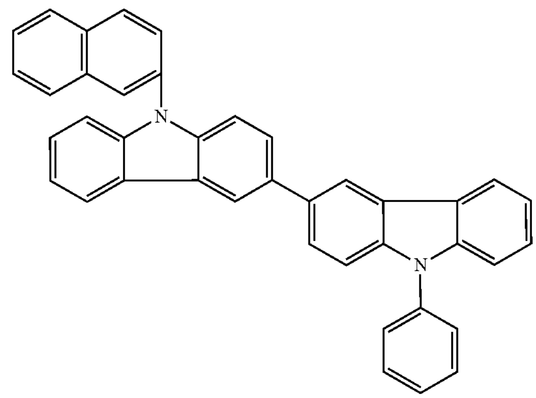
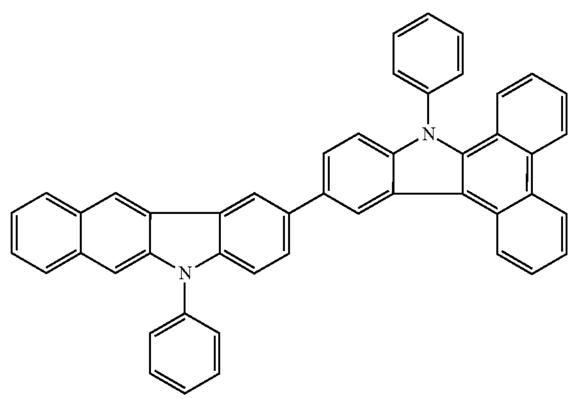
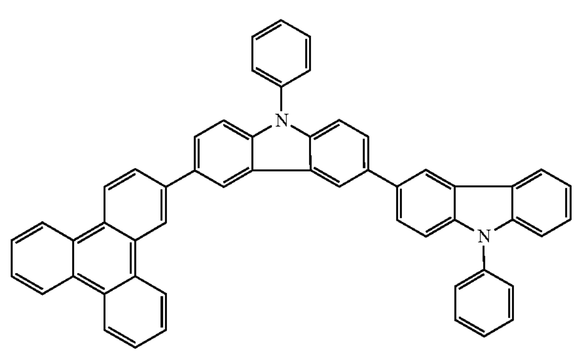

-continued
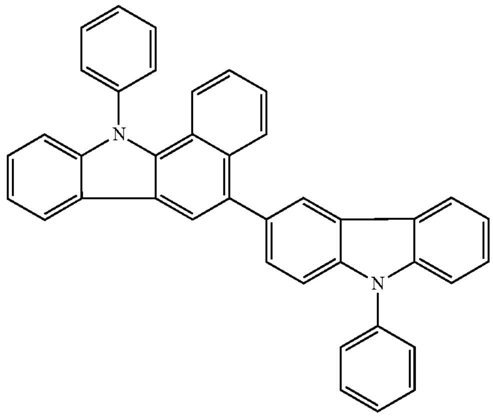
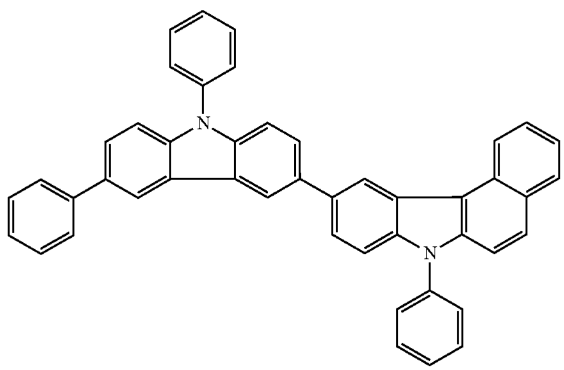
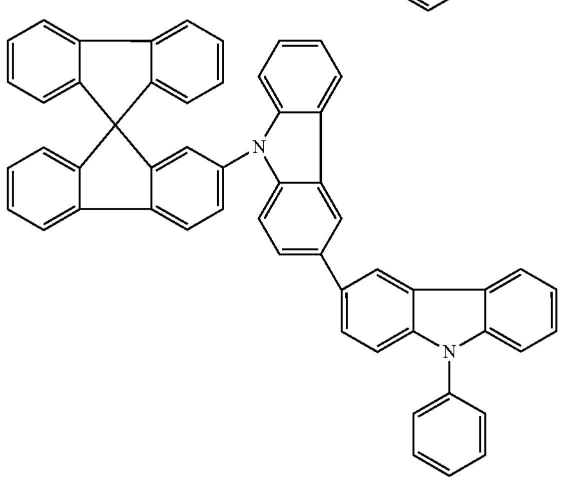
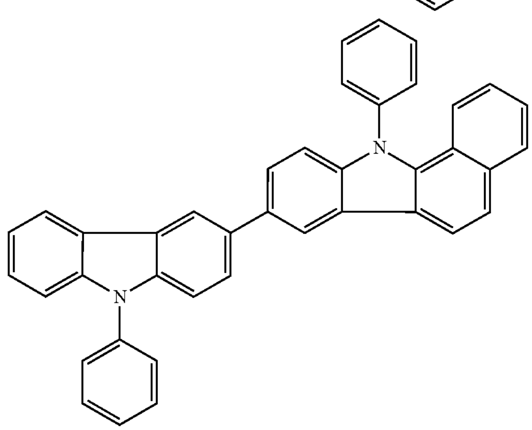
-continued
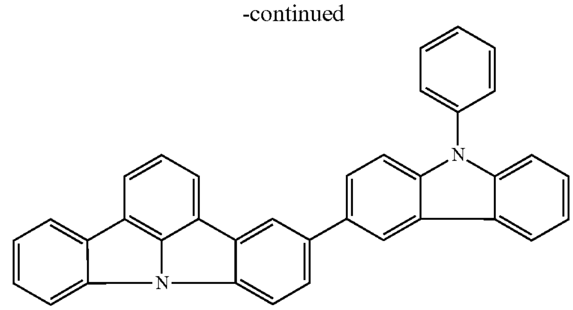
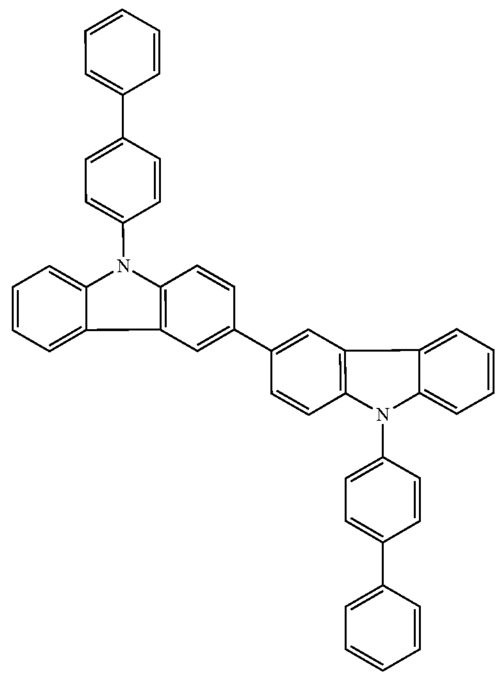
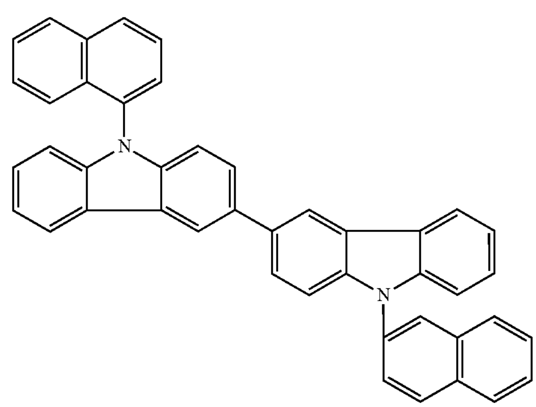

-continued
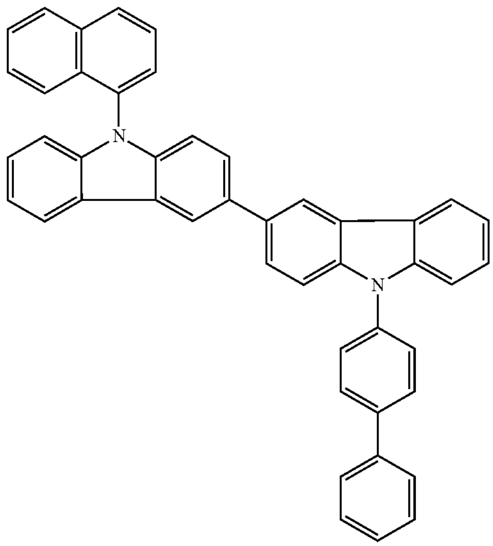
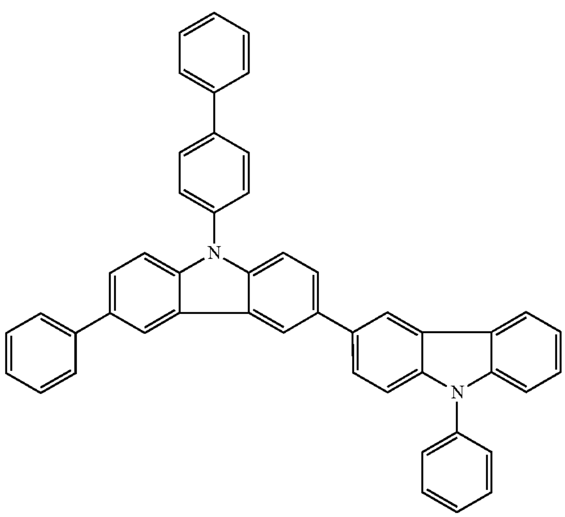
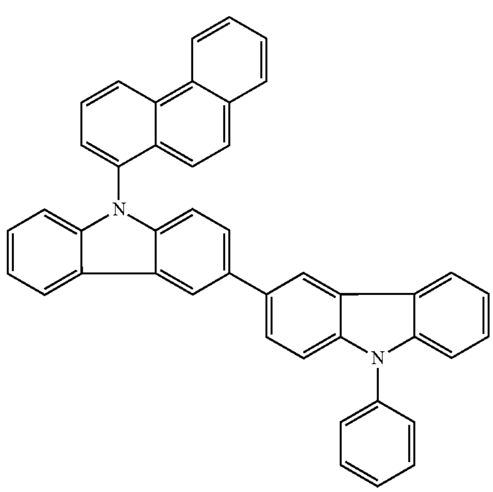
-continued
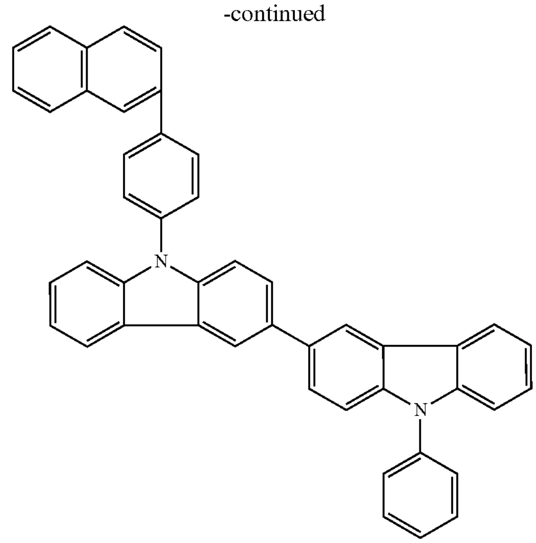
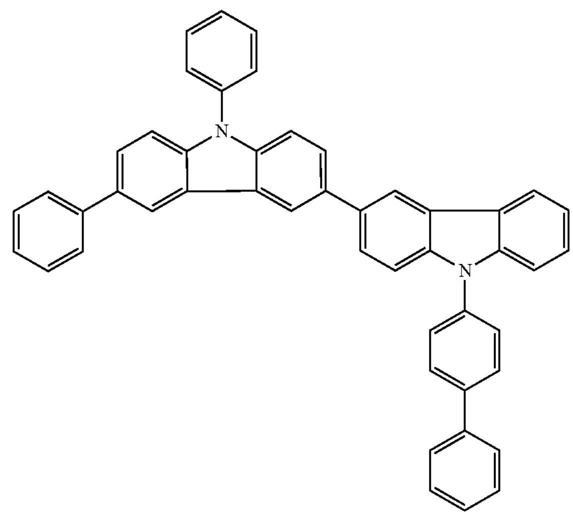
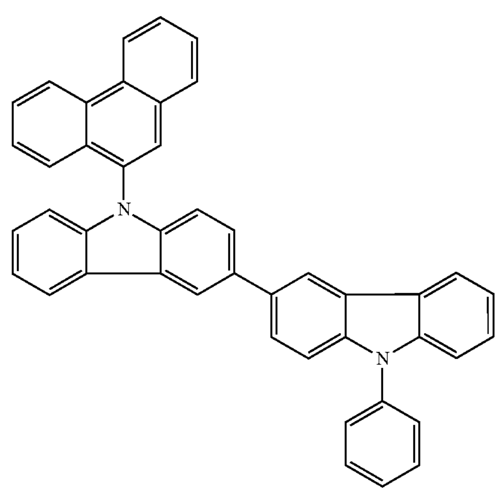

-continued
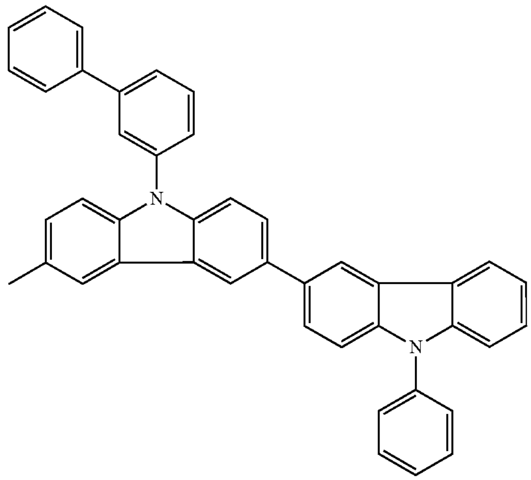
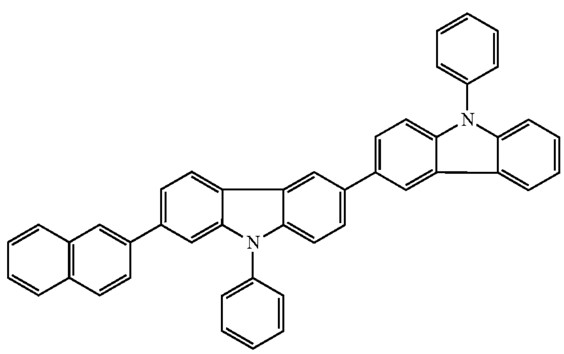
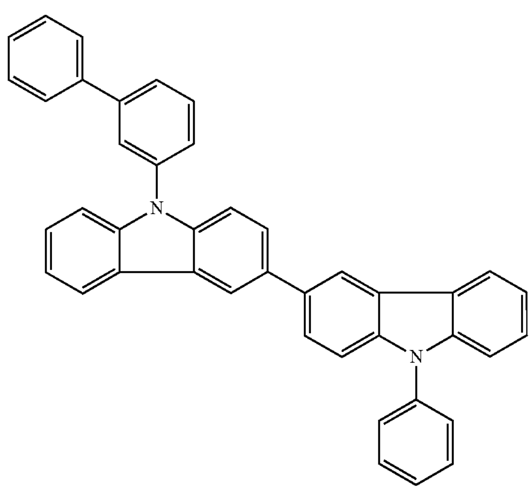
-continued
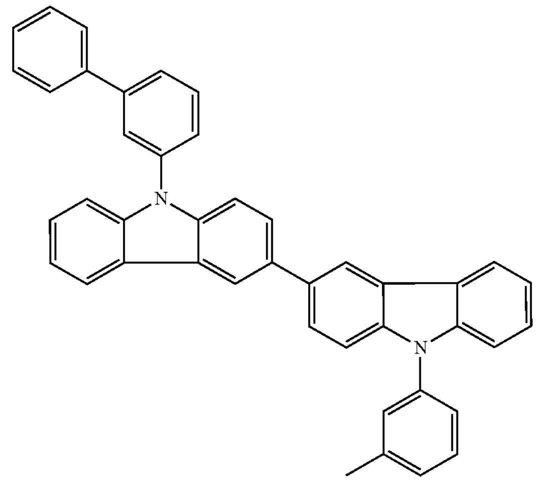
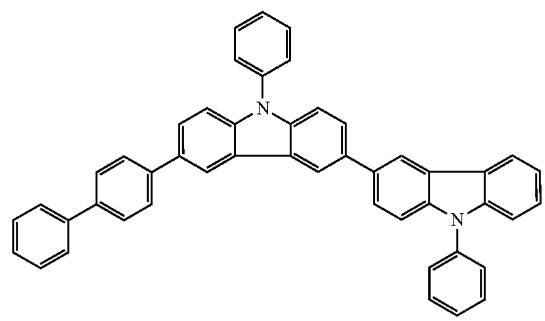
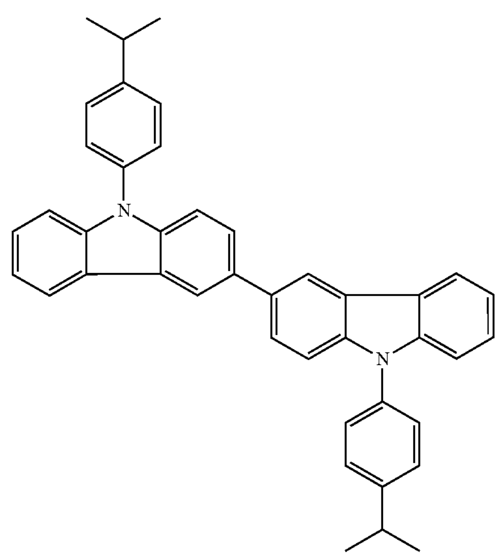

-continued
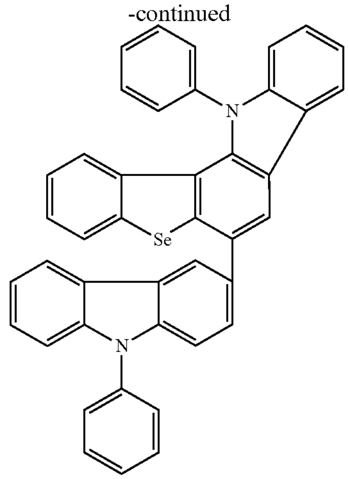
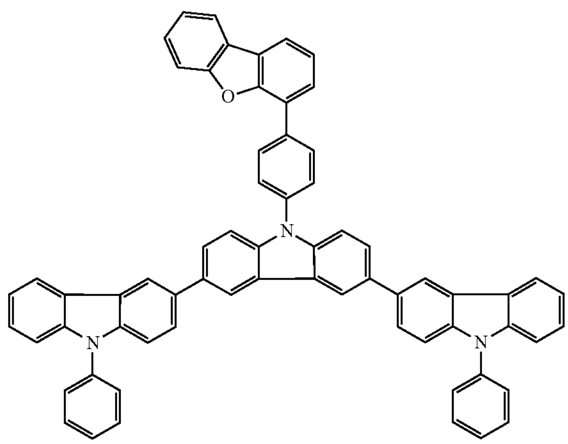
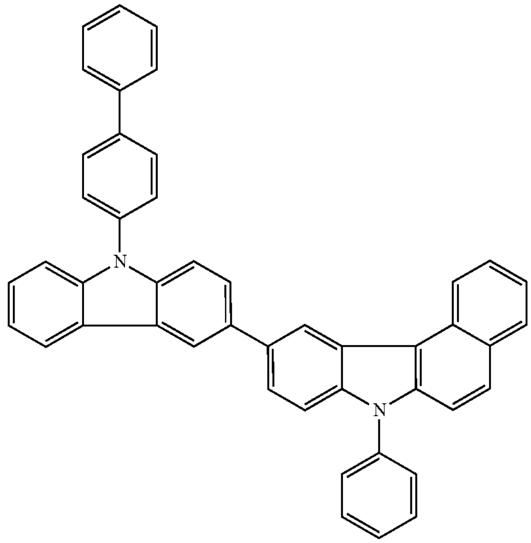
-continued
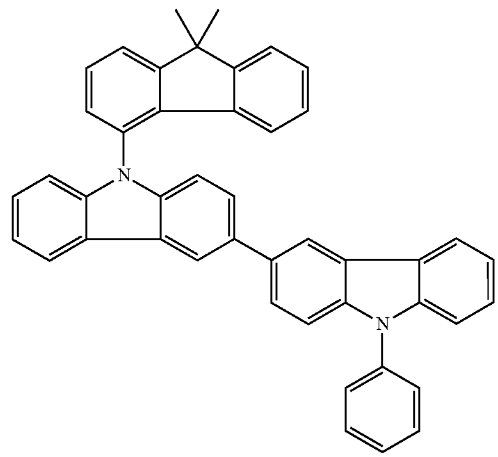
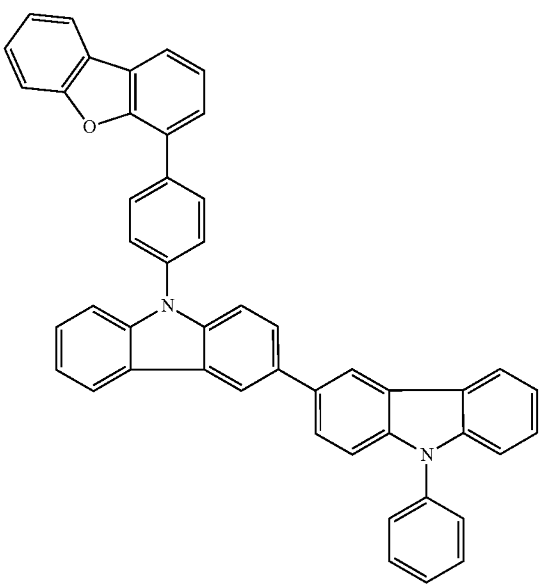
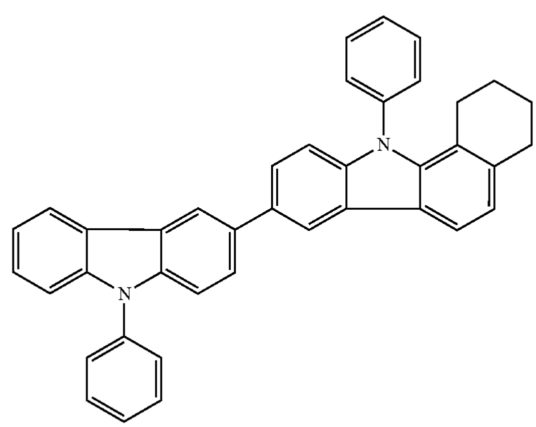

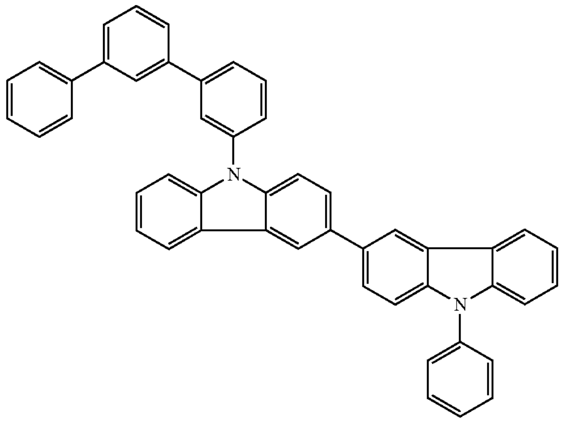
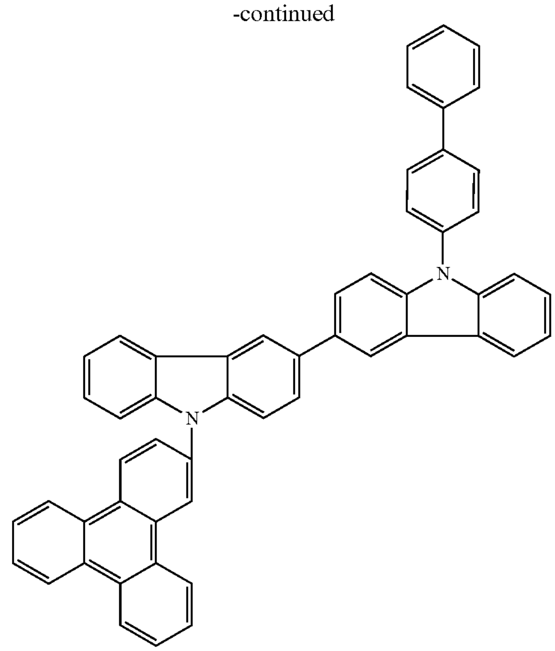
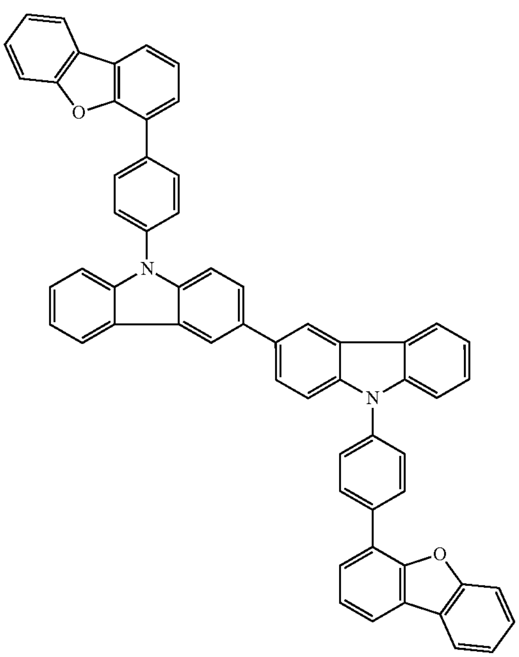
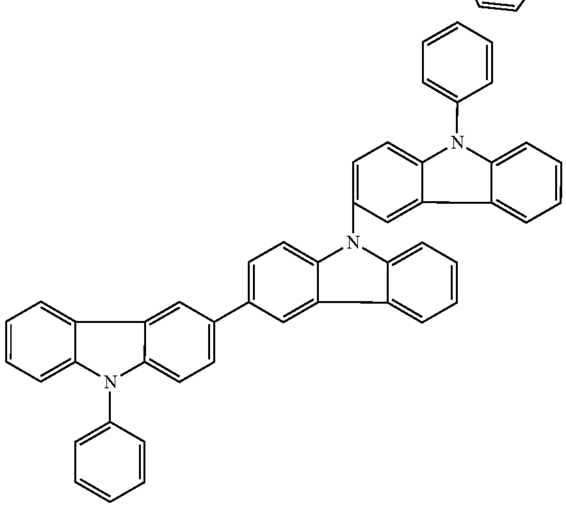
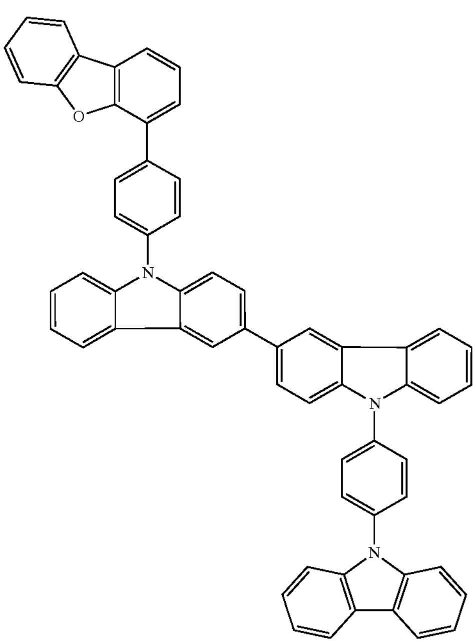
N
N
O
O

-continued
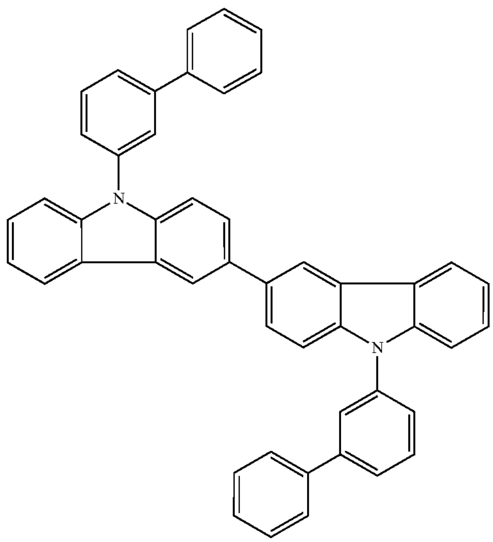
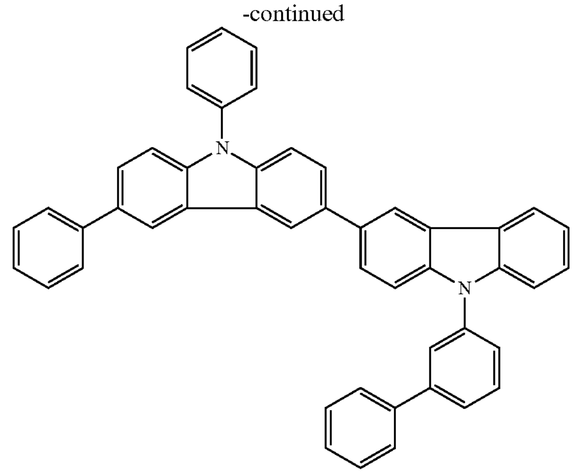
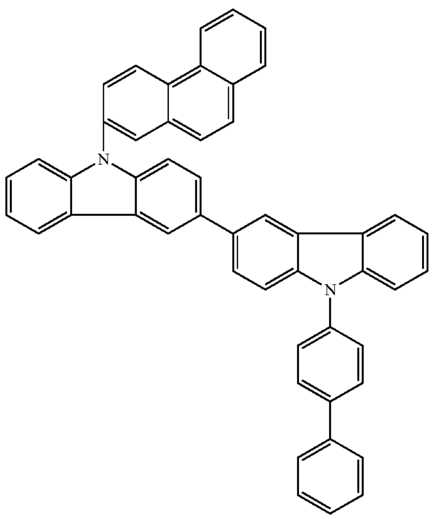
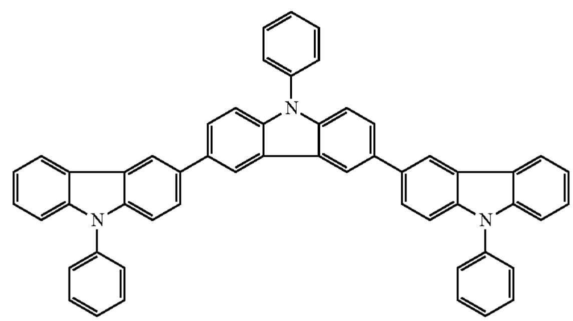
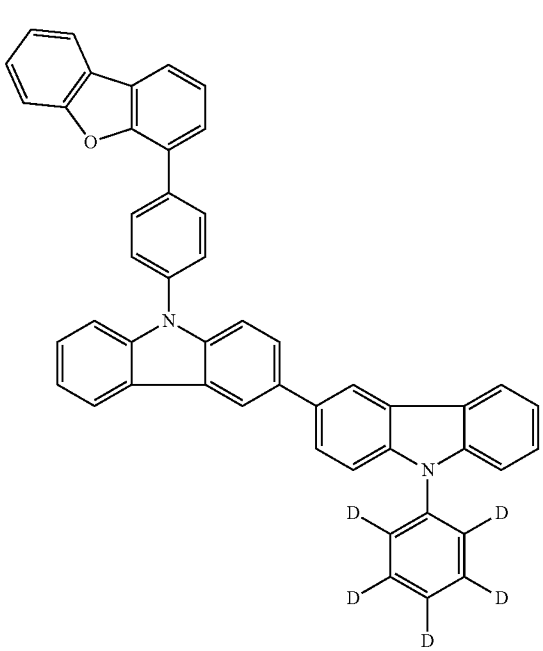
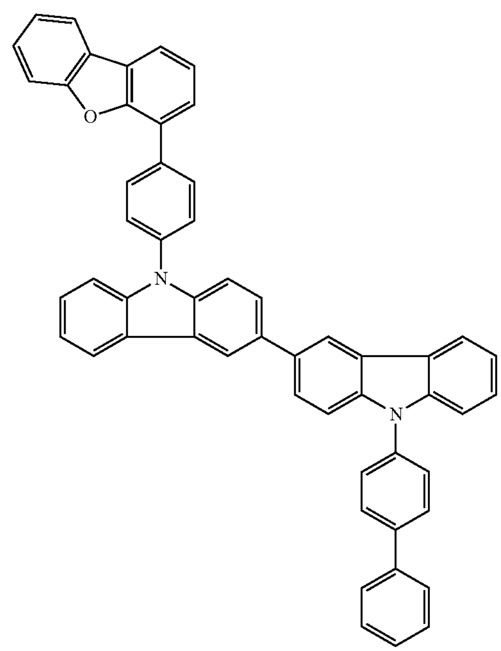

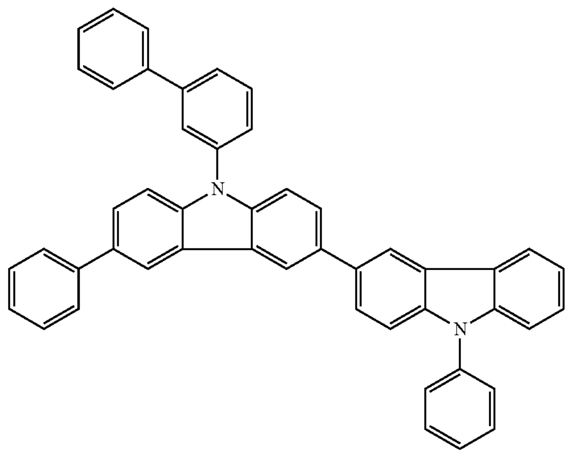
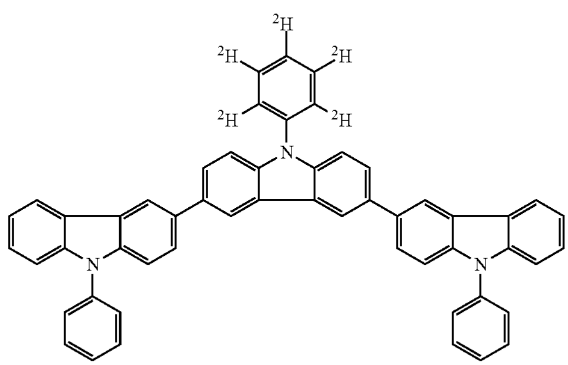
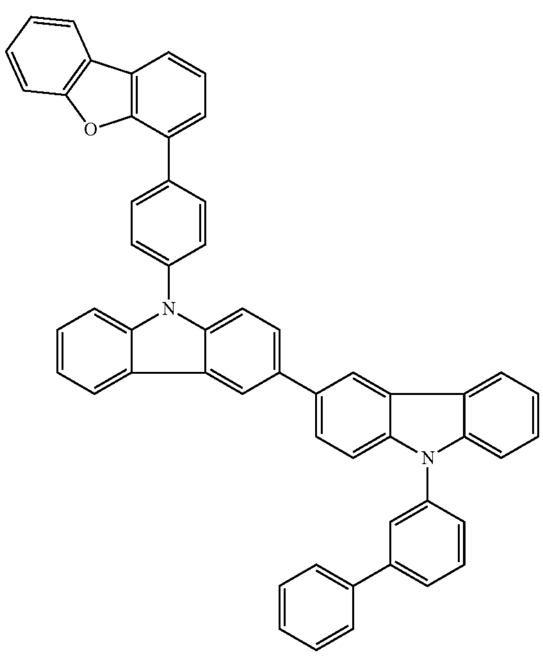
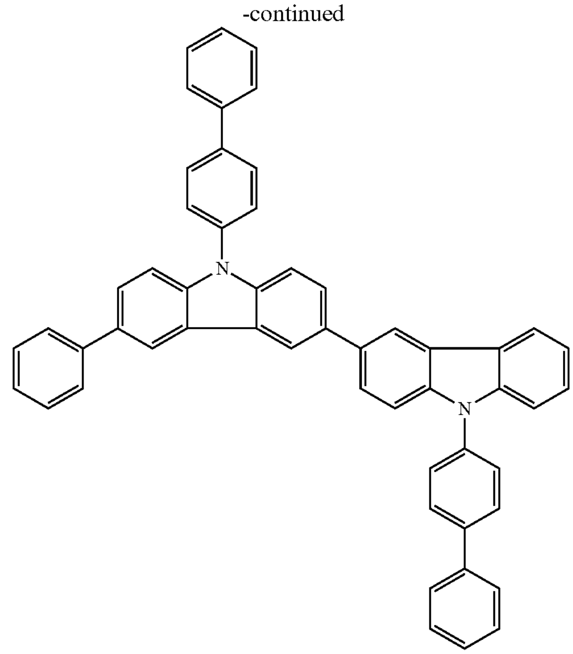
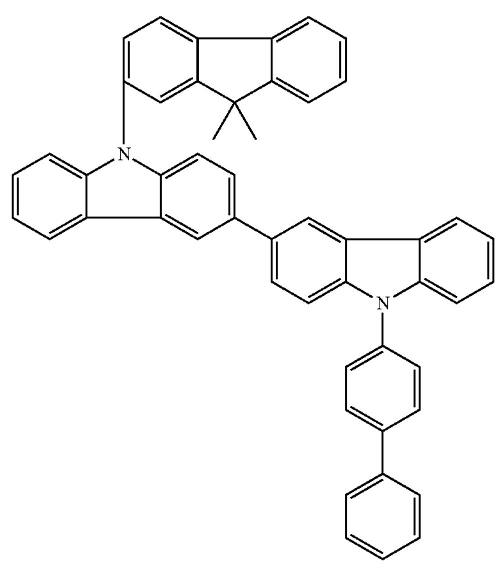
N
N

-continued
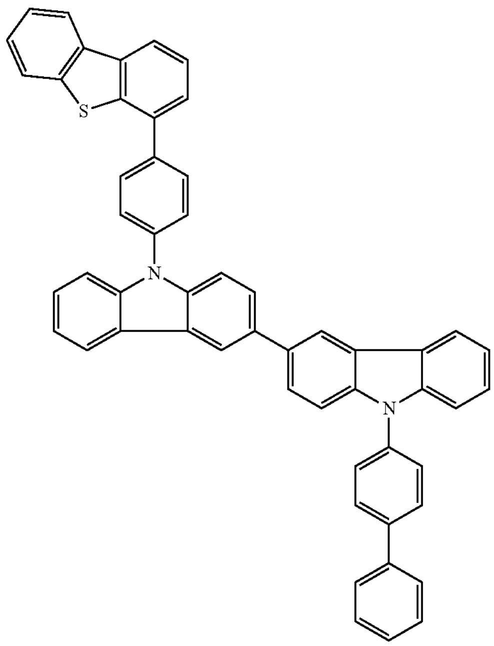
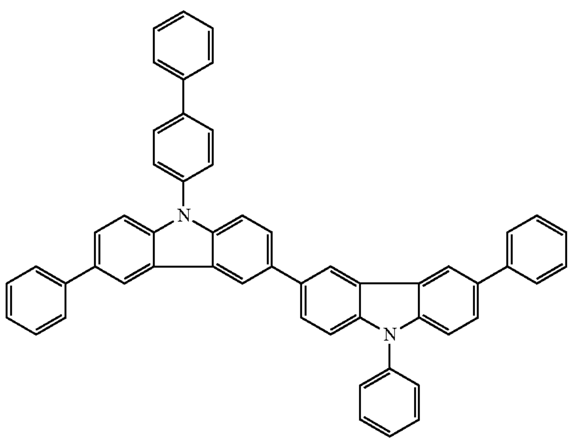
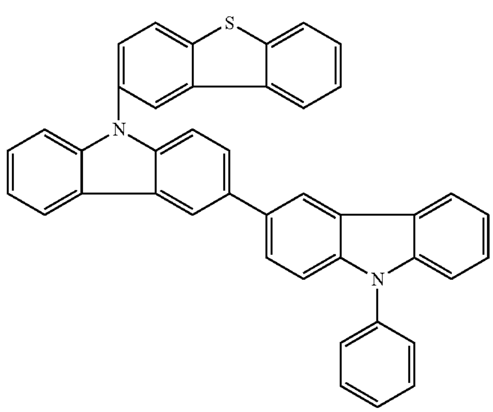
-continued
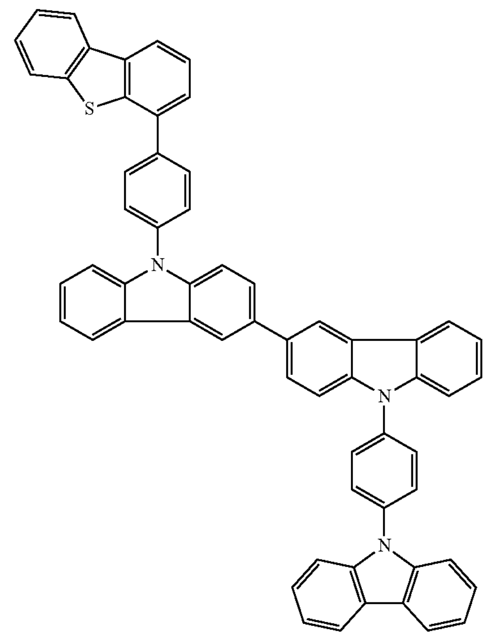
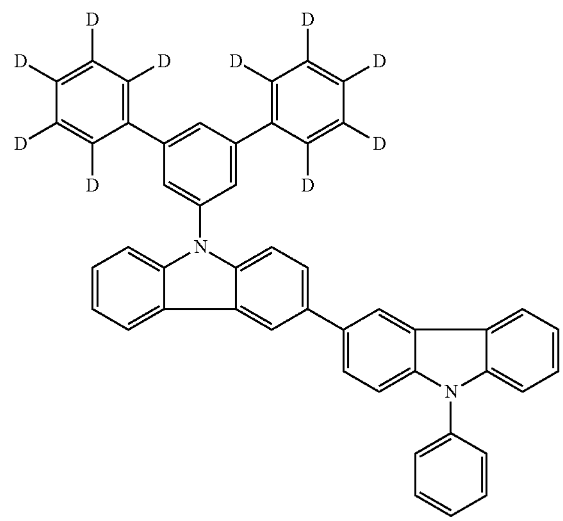
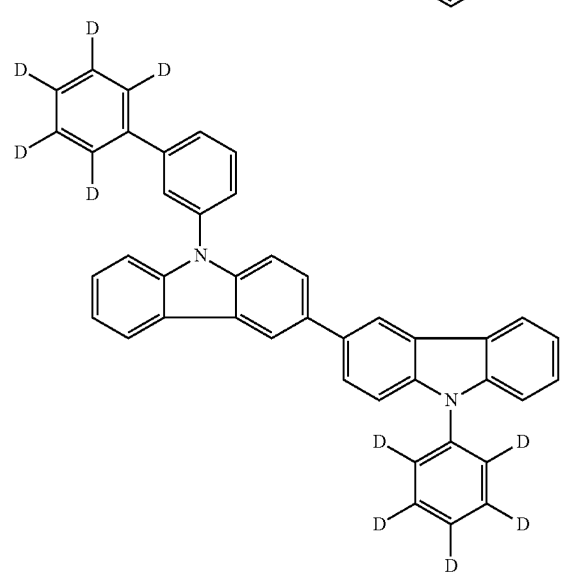

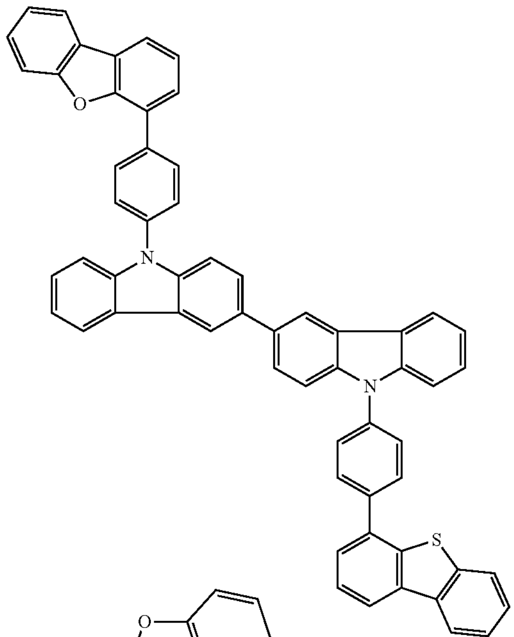
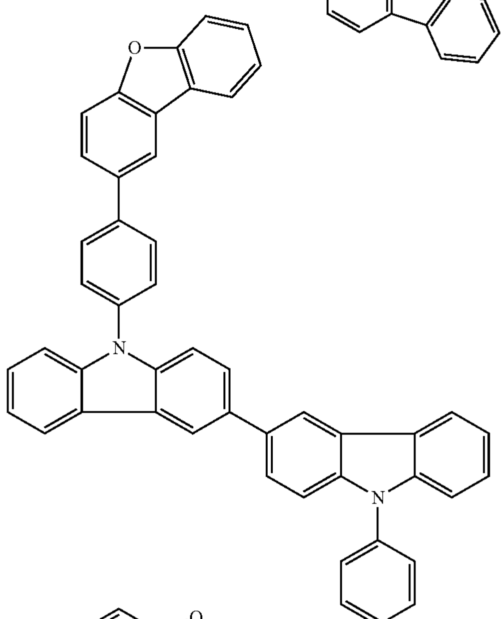
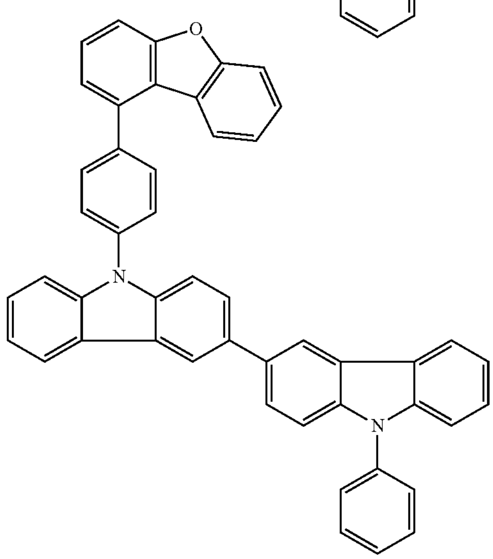
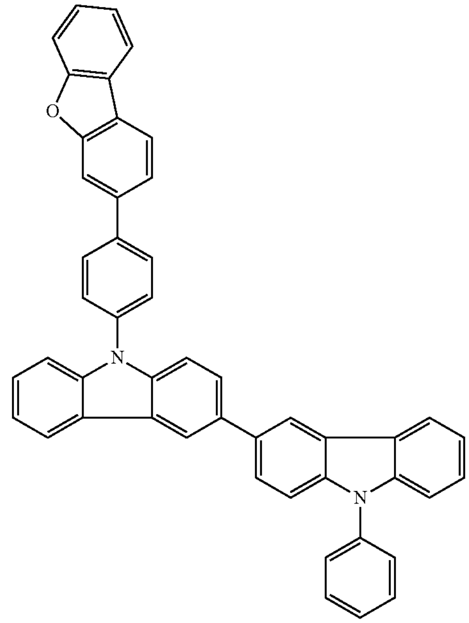
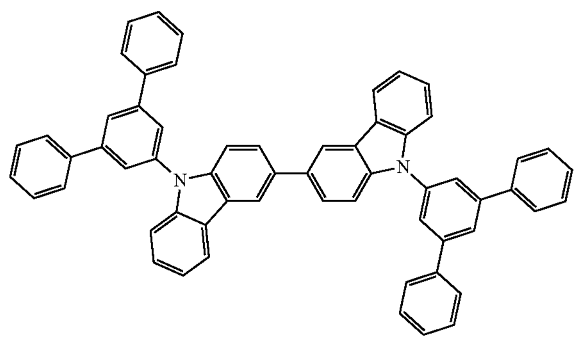
Examples of amines which can be used as hole-transporting matrix materials:
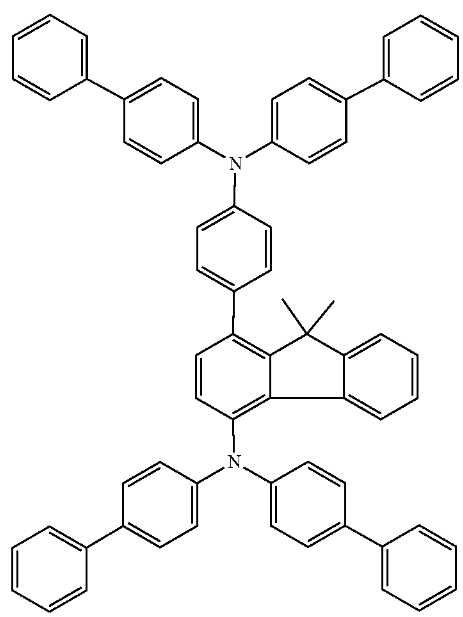

-continued
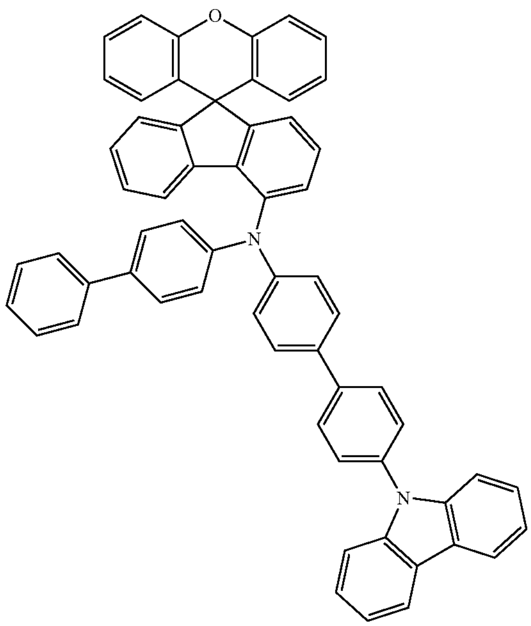
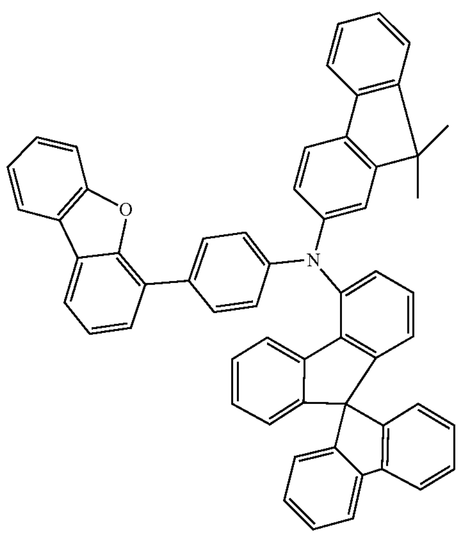
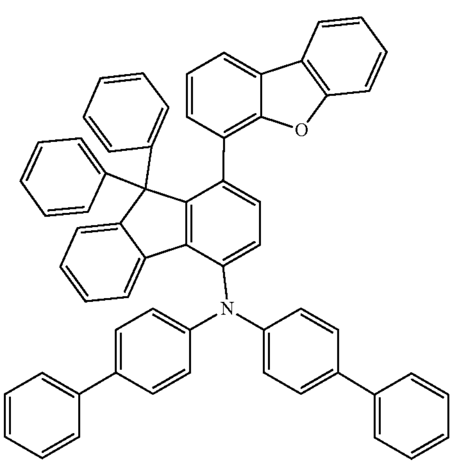
-continued
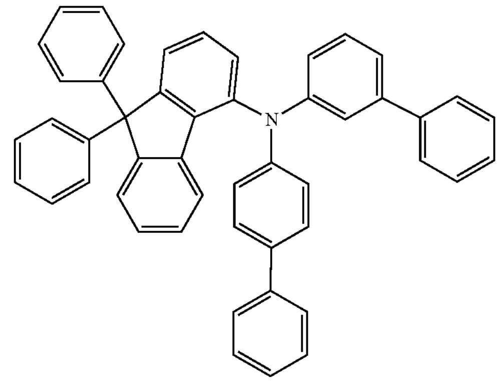
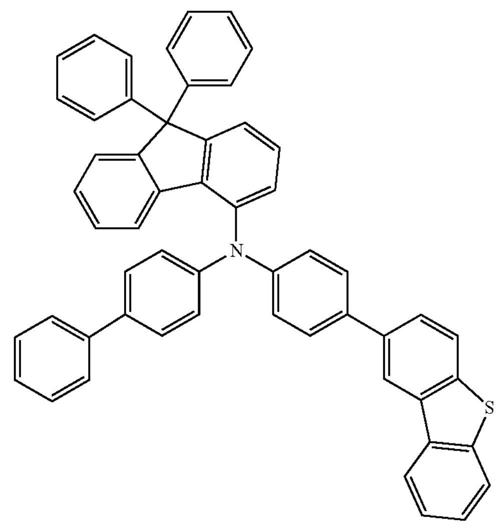
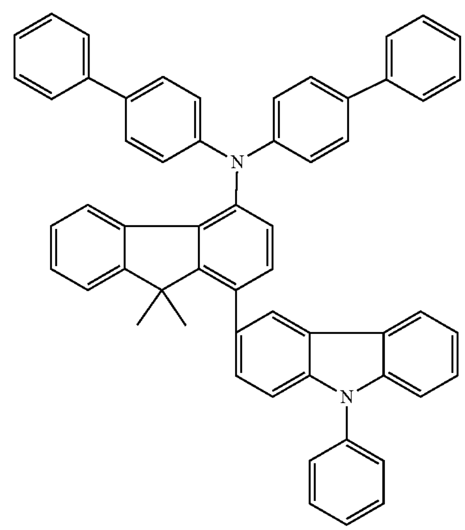
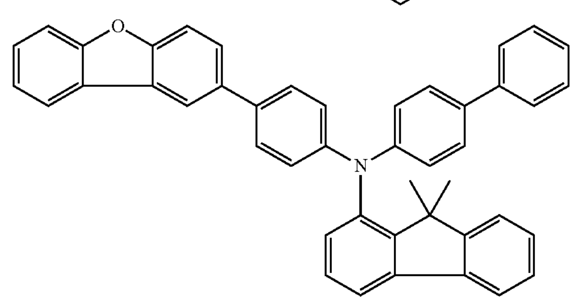

-continued
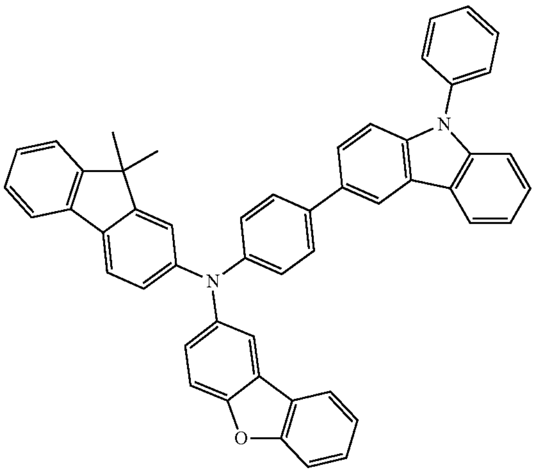
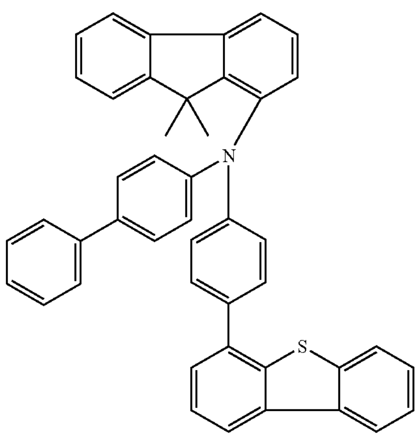
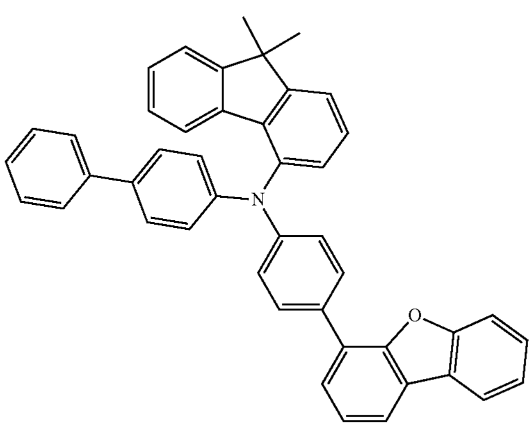
-continued
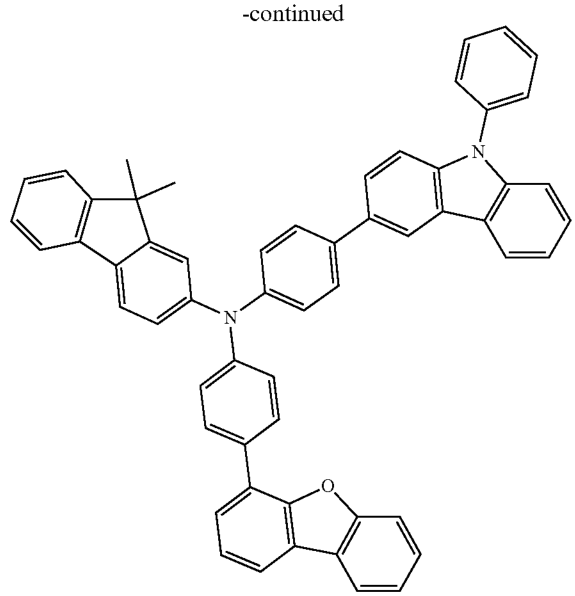
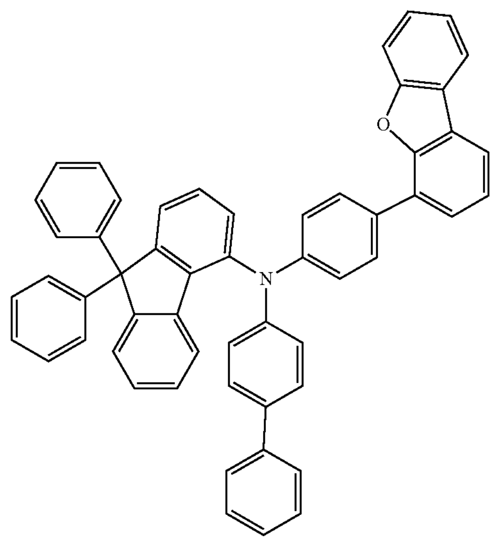
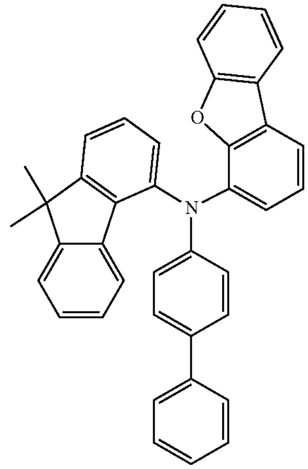

-continued
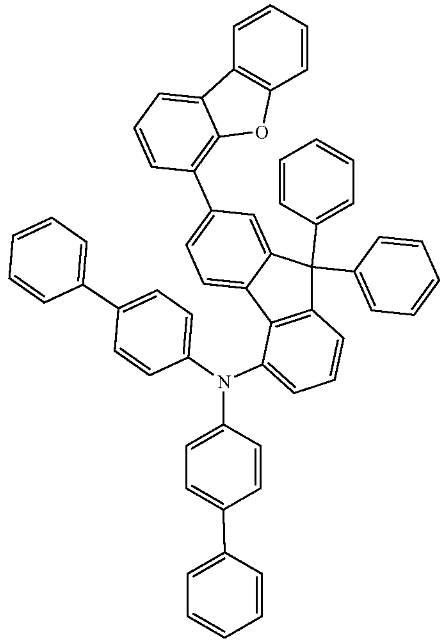
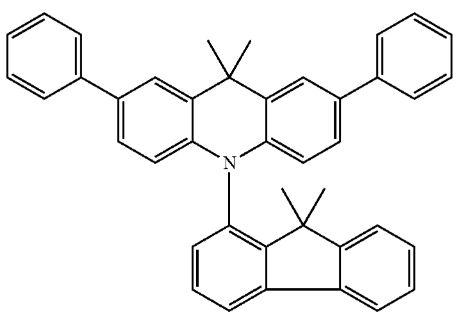
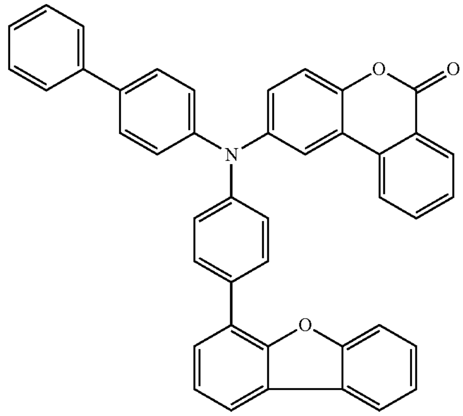
-continued
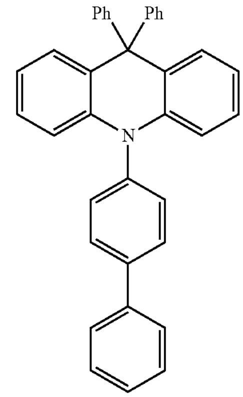
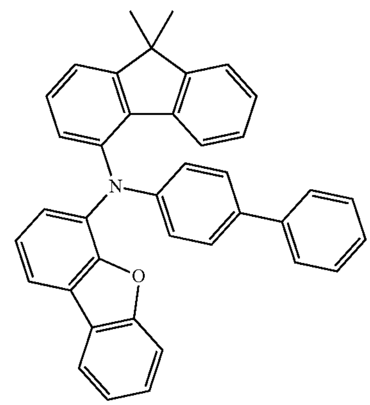
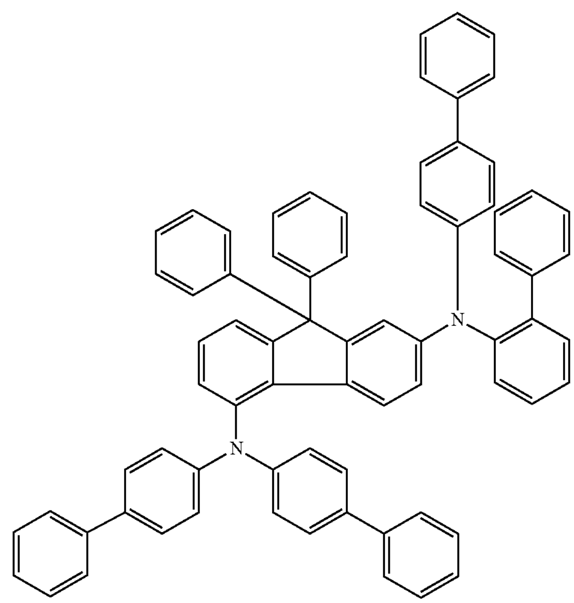

-continued
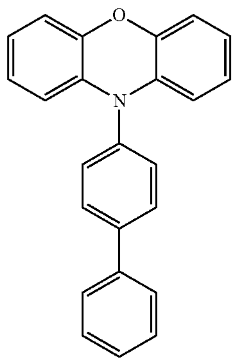
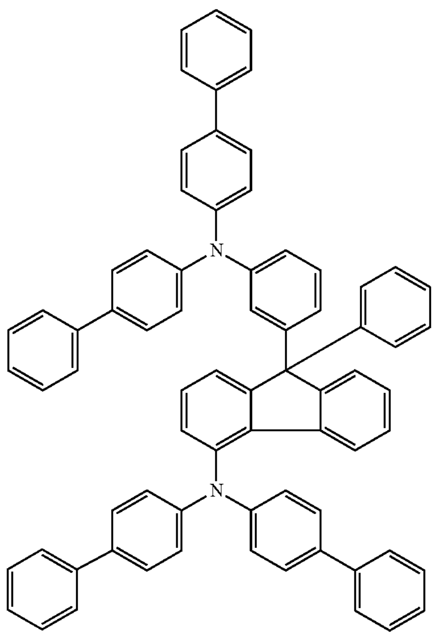
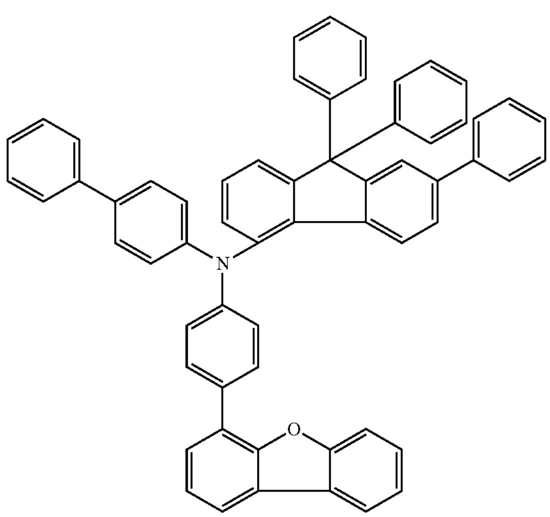
-continued
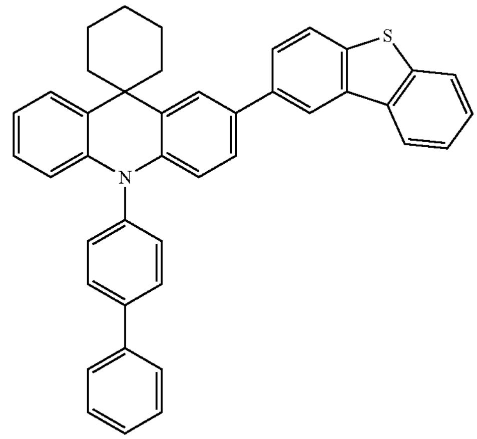
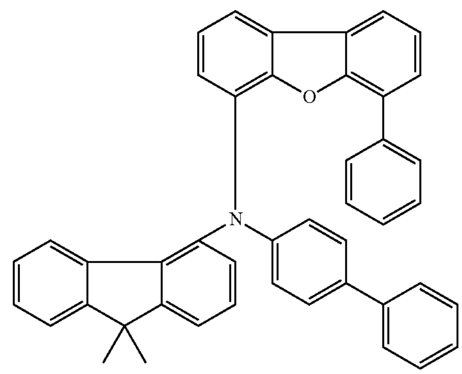
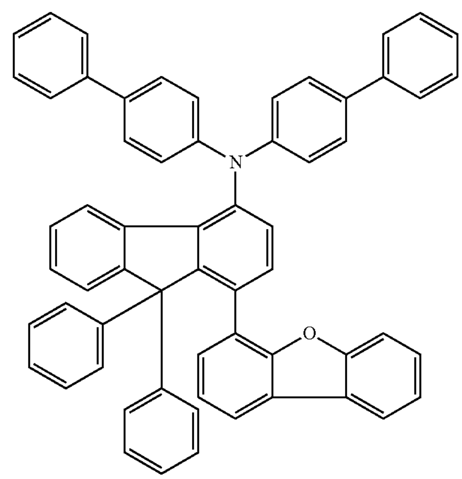
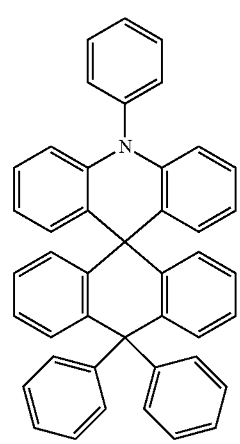

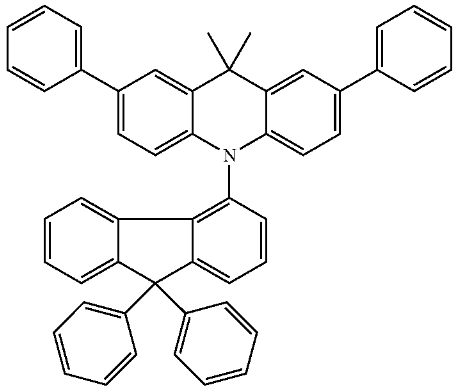
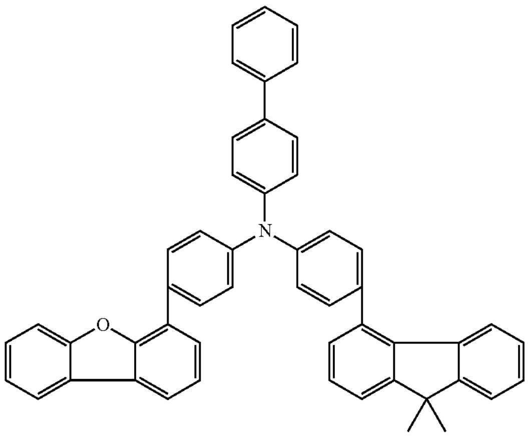
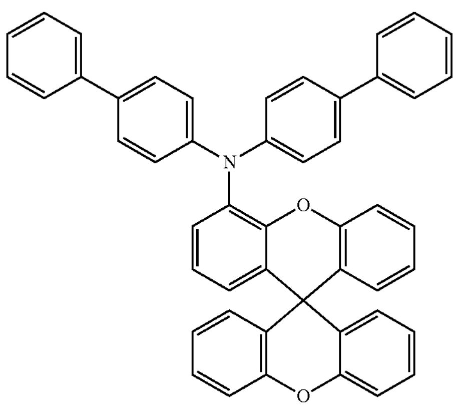
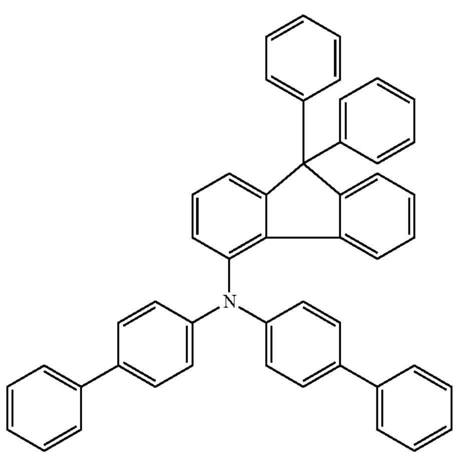
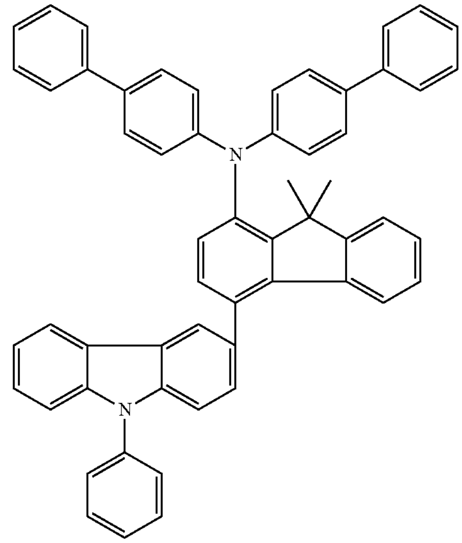
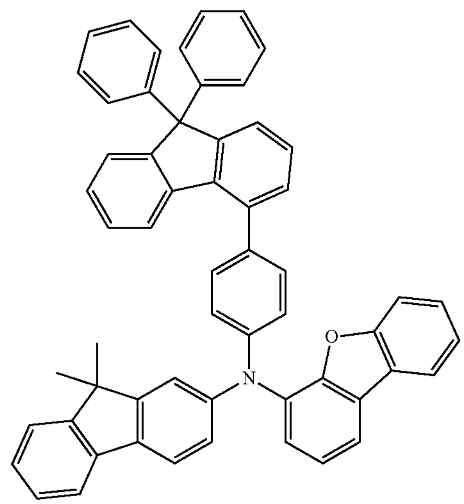
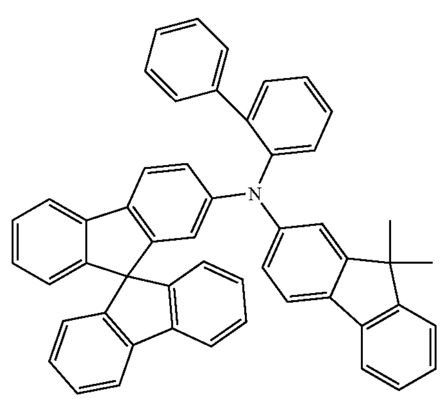

-continued
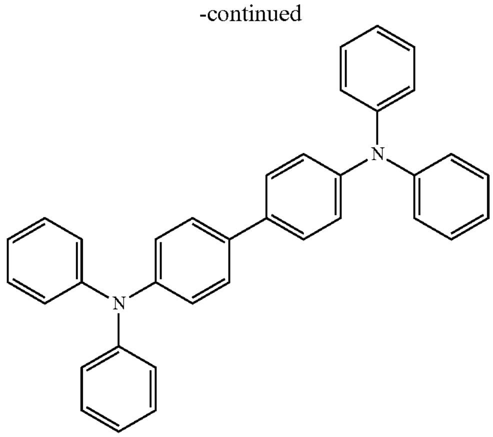
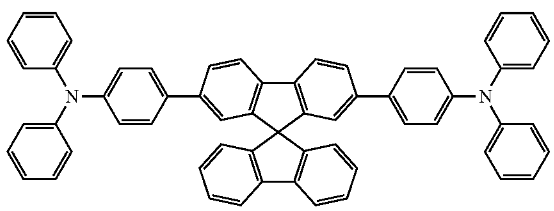
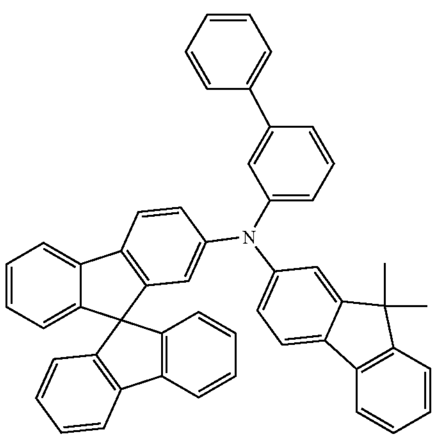
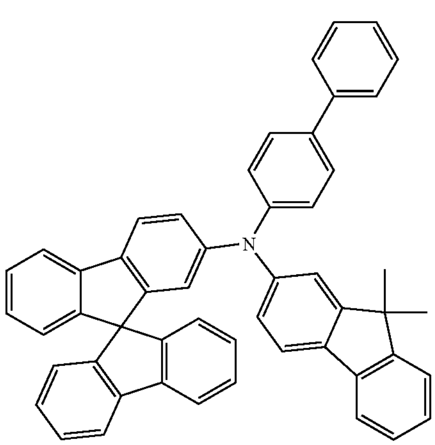
-continued
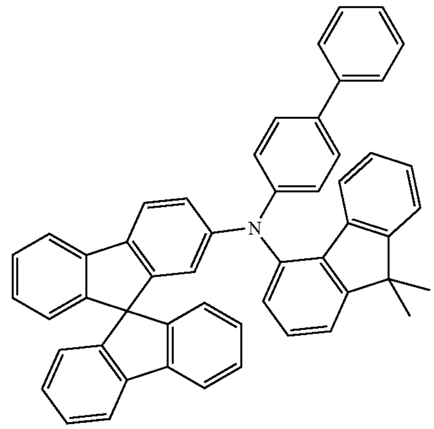
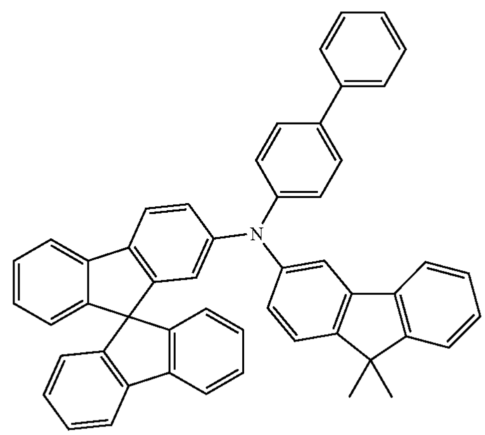
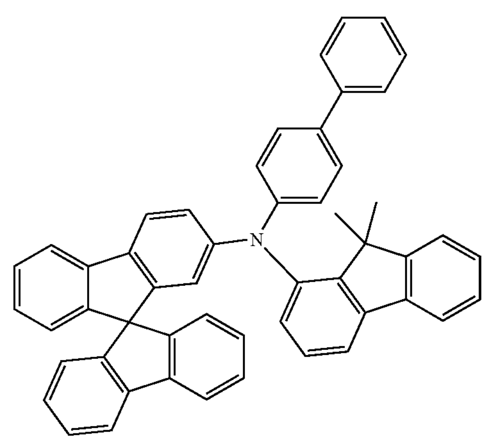

-continued
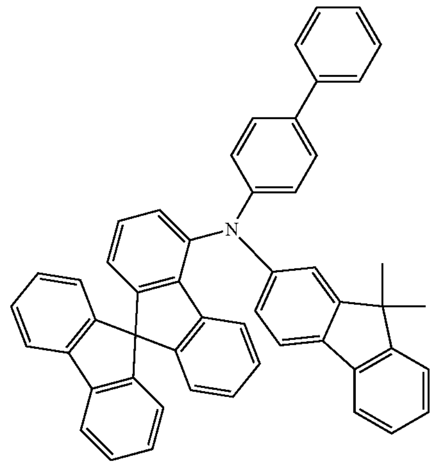
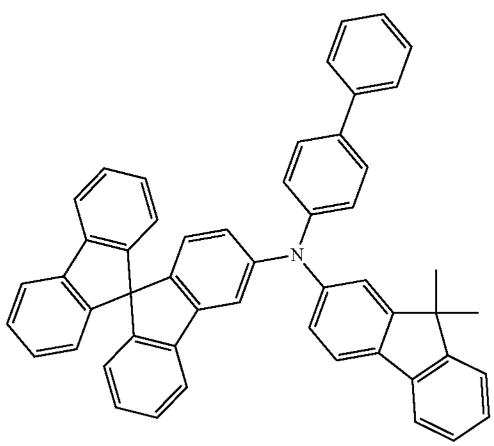
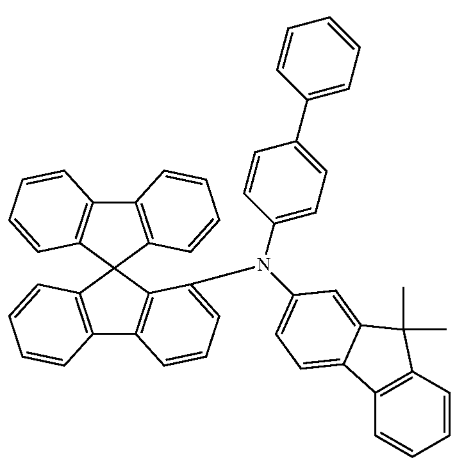
-continued
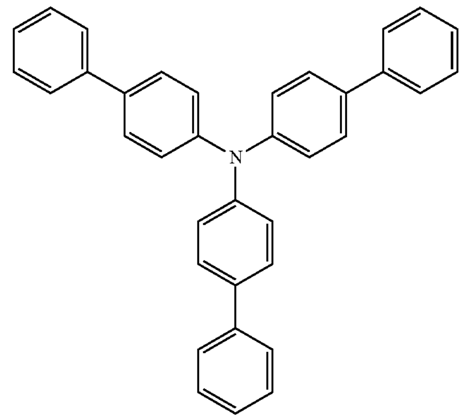
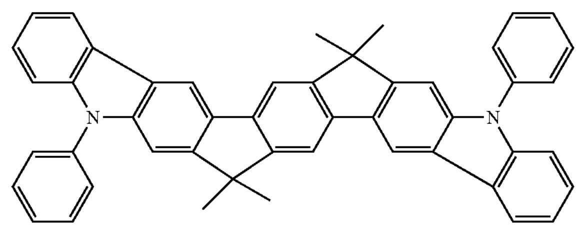
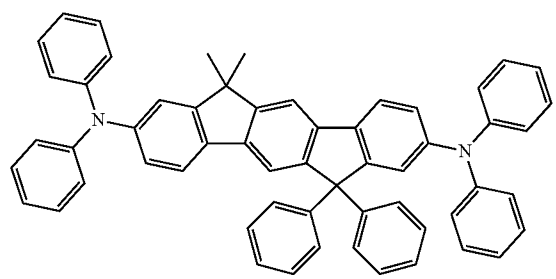
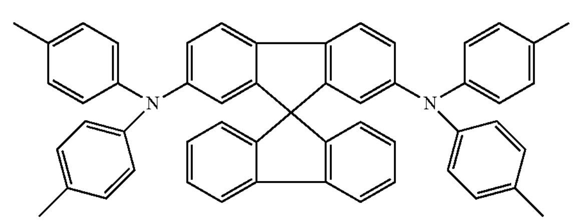
Examples of materials which can be used as wide band-gap matrix materials:

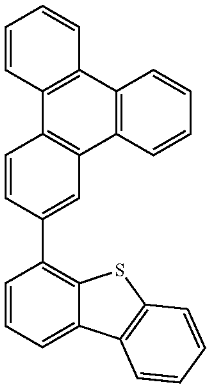
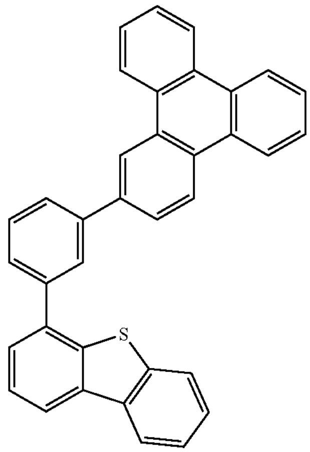
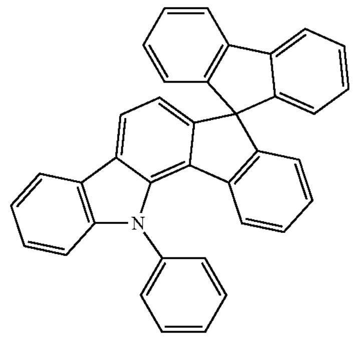
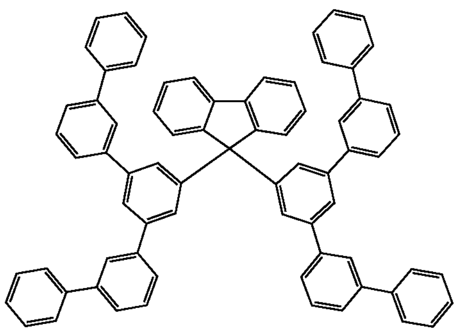
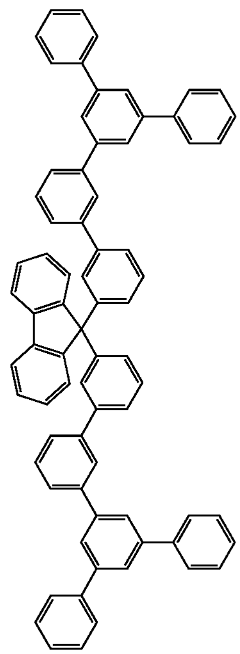
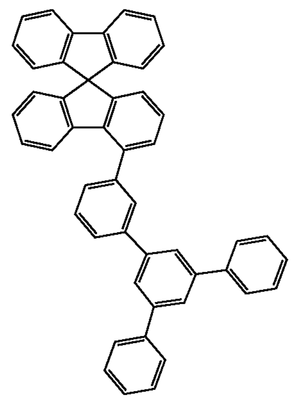
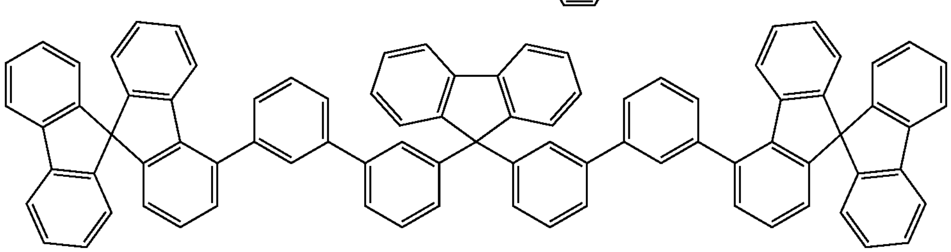
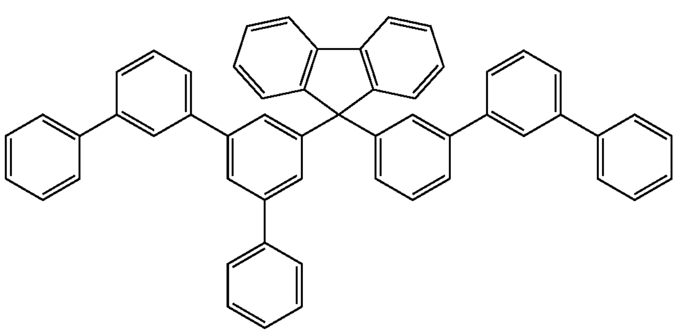
S
S
N -continued

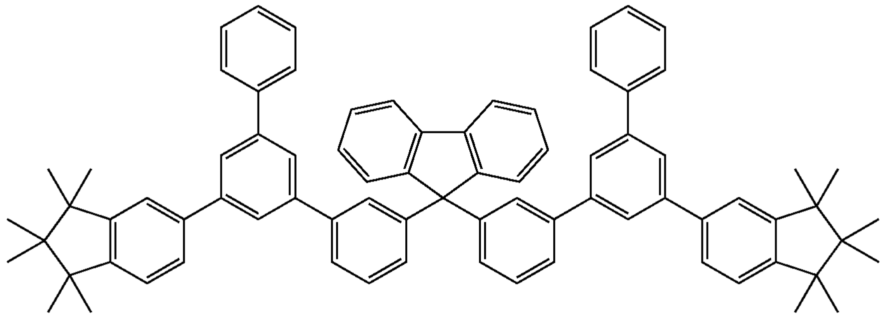

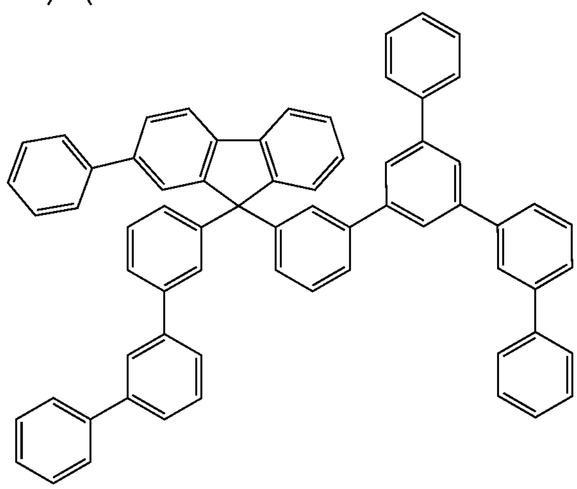

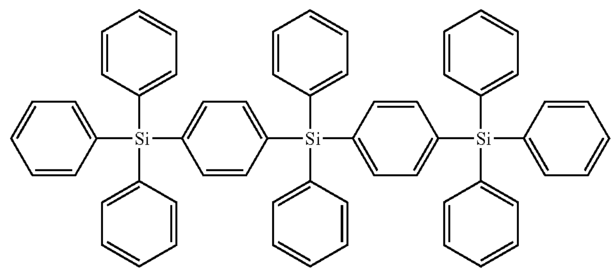

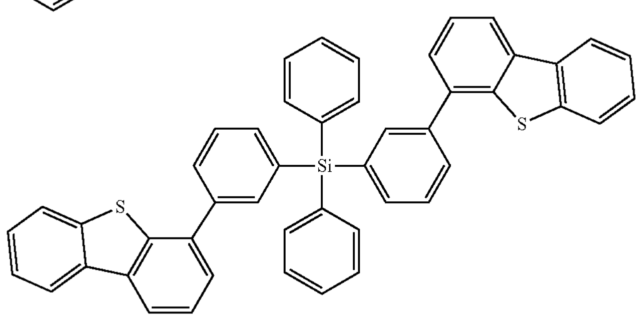

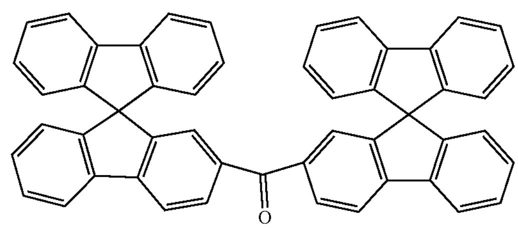

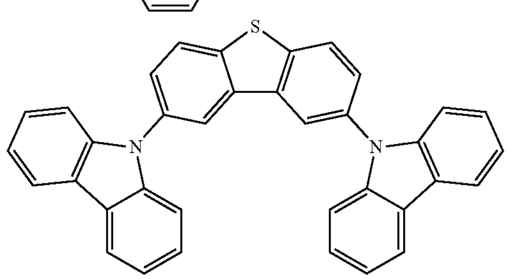

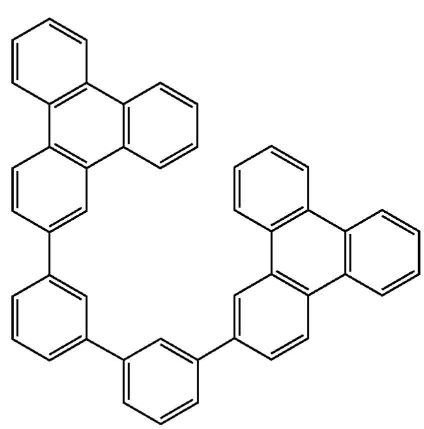

It is further preferable to use a mixture of two or more triplet emitters, especially two or three triplet emitters, together with one or more matrix materials. In this case, the triplet emitter having the shorter-wave emission spectrum serves as co-matrix for the triplet emitter having the longer-wave emission spectrum. For example, the metal complexes of the invention can be combined with a metal complex emitting at shorter wavelength, for example a blue-, green- or yellow-emitting metal complex, as co-matrix. For example, it is also possible to use the metal complexes of the invention as co-matrix for triplet emitters that emit at longer wavelength, for example for red-emitting triplet emitters. In this case, it may also be preferable when both the shorter-wave- and the longer-wave-emitting metal complex is a compound of the invention. A preferred embodiment in the case of use of a mixture of three triplet emitters is when two are used as co-host and one as emitting material. These triplet emitters preferably have the emission colours of green, yellow and red or blue, green and orange.

A preferred mixture in the emitting layer comprises an electron-transporting host material, what is called a "wide bandgap" host material which, owing to its electronic properties, is not involved to a significant degree, if at all, in the charge transport in the layer, a co-dopant which is a triplet emitter which emits at a shorter wavelength than the compound of the invention, and a compound of the invention.

A further preferred mixture in the emitting layer comprises an electron-transporting host material, what is called a "wide bandgap" host material which, owing to its electronic properties, is not involved to a significant degree, if at all, in the charge transport in the layer, a hole-transporting host material, a co-dopant which is a triplet emitter which emits at a shorter wavelength than the compound of the invention, and a compound of the invention.

The compounds of the invention can also be used in other functions in the electronic device, for example as hole transport material in a hole injection or transport layer, as charge generation material, as electron blocker material, as hole blocker material or as electron transport material, for example in an electron transport layer. It is likewise possible to use the compounds of the invention as matrix material for other phosphorescent metal complexes in an emitting layer.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O—SC) or the emission of light (OLED/PLED, O-LASER). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled. Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

Suitable charge transport materials as usable in the hole injection or hole transport layer or electron blocker layer or in the electron transport layer of the organic electroluminescent device of the invention are, for example, the compounds disclosed in Y. Shirota et al., Chem. Rev. 2007, 107(4), 953-1010, or other materials as used in these layers according to the prior art. Preferred hole transport materials which can be used in a hole transport, hole injection or electron blocker layer in the electroluminescent device of the invention are indenofluorenamine derivatives (for example according to WO 06/122630 or WO 06/100896), the amine derivatives disclosed in EP 1661888, hexaazatriphenylene derivatives (for example according to WO 01/049806), amine derivatives having fused aromatic systems (for example according to U.S. Pat. No. 5,061,569), the amine derivatives disclosed in WO 95/09147, monobenzoindenofluorenamines (for example according to WO 08/006449), dibenzoindenofluorenamines (for example according to WO 07/140847), spirobifluorenamines (for example according to WO 2012/034627, WO2014/056565), fluorenamines (for example according to EP 2875092, EP 2875699 and EP 2875004), spirodibenzopyranamines (e.g. EP 2780325) and dihydroacridine derivatives (for example according to WO 2012/150001).

The device is correspondingly (according to the application) structured, contact-connected and finally hermetically sealed, since the lifetime of such devices is severely shortened in the presence of water and/or air. Additionally preferred is an organic electroluminescent device, characterized in that one or more layers are coated by a sublimation process. In this case, the materials are applied by vapour deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example M. S. Arnold et al., *Appl. Phys. Lett.* 2008, 92, 053301).

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution.

The organic electroluminescent device can also be produced as a hybrid system by applying one or more layers from solution and applying one or more other layers by vapour deposition. For example, it is possible to apply an emitting layer comprising a metal complex of the invention and a matrix material from solution, and to apply a hole blocker layer and/or an electron transport layer thereto by vapour deposition under reduced pressure.

These methods are known in general terms to those skilled in the art and can be applied by those skilled in the art without difficulty to organic electroluminescent devices comprising compounds of formula (1) or the above-detailed preferred embodiments.

The electronic devices of the invention, especially organic electroluminescent devices, are notable for one or more of the following surprising advantages over the prior art:

1) The compounds have improved sublimability compared to comparable compounds in which all three $V^1$ to $V^3$ groups are a group of the formula (3) or in which all three $V^1$ to $V^3$ groups are a —$CR_2$—$CR_2$— group.
2) The compounds have improved solubility compared to comparable compounds in which all three $V^1$ to $V^3$ groups are a group of the formula (3) or in which all three $V^1$ to $V^3$ groups are a —$CR_2$—$CR_2$— group.
3) The compounds, when used in an OLED, have improved efficiency compared to comparable compounds in which all three $V^1$ to $V^3$ groups are a group of the formula (3) or in which all three $V^1$ to $V^3$ groups are a $CR_2$—$CR_2$— group.
4) The compounds, when used in an OLED, have improved lifetime compared to comparable compounds in which all three $V^1$ to $V^3$ groups are a group of the formula (3) or in which all three $V^1$ to $V^3$ groups are a —$CR_2$—$CR_2$— group.

These abovementioned advantages are not accompanied by a deterioration in the further electronic properties.

The invention is illustrated in more detail by the examples which follow, without any intention of restricting it thereby. The person skilled in the art will be able to use the details given, without exercising inventive skill, to produce further electronic devices of the invention and hence to execute the invention over the entire scope claimed.

EXAMPLES

The syntheses which follow, unless stated otherwise, are conducted under a protective gas atmosphere in dried solvents. The metal complexes are additionally handled with exclusion of light or under yellow light. The solvents and reagents can be purchased, for example, from Sigma-ALDRICH or ABCR. The respective figures in square brackets or the numbers quoted for individual compounds relate to the CAS numbers of the compounds known from the literature. In the case of compounds that can have multiple tautomeric, isomeric, diastereomeric and enantiomeric forms, one form is shown in a representative manner.

A: Synthesis of the Synthons S:

Example S1

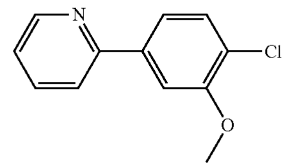

Variant A: Coupling of the 2-bromopyridines, S1

To a mixture of 26.9 g (100 mmol) of 2-(4-chloro-3-methoxyphenyl)-4,4,5,5-tetramethyl-1,3,2-dioxaborolane [627525-96-6], 19.0 g (120 mmol) of 2-bromopyridine, 21.2 g (200 mmol) of sodium carbonate, 200 ml of toluene, 50 ml of ethanol and 100 ml of water are added, with very good stirring, 1.2 g (1 mmol) of tetrakis(triphenylphosphino) palladium(0), and then the mixture is heated under reflux for 24 h. After cooling, the organic phase is removed and washed once with 300 ml of water and once with 300 ml of saturated sodium chloride solution, and dried over magnesium sulfate. The desiccant is filtered off, the filtrate is concentrated fully under reduced pressure and the residue is subjected to a Kugelrohr distillation (p about $10^{-2}$ mbar, T about 200° C.). Yield: 19.8 g (90 mmol), 90%; purity; about 95% by $^1H$ NMR.

Variant B: Coupling of the 2,5-dibromopyridines, S7

A mixture of 23.7 g (100 mmol) of 2,5-dibromopyridine [624-28-2], 23.4 g (100 mmol) of 2-(3-methoxyphenyl)-4,4,5,5-tetramethyl-1,3,2-dioxaborolane [325142-84-5], 27.6 g (200 mmol) of potassium carbonate, 50 g of glass beads (diameter 3 mm), 526 mg (2 mmol) of triphenylphosphine, 225 mg (1 mmol) of palladium(II) acetate, 200 ml of acetonitrile and 100 ml of methanol is heated under reflux with good stirring for 16 h. After cooling, the solvent is largely removed under reduced pressure, and the residue is taken up in 500 ml of ethyl acetate, washed three times with 200 ml each time of water and once with 300 ml of saturated sodium chloride solution and dried over magnesium sulfate. The desiccant is filtered off, the filtrate is concentrated to dryness and the solids are recrystallized from acetonitrile. Yield: 18.3 g (68 mmol), 68%; purity: about 95% by $^1H$ NMR.

In an analogous manner, it is possible to prepare the following compounds:

| Ex. | Reactants Variant | Product | Yield |
|---|---|---|---|
| S2 | 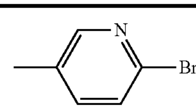 3510-66-5 627525-96-6 A | 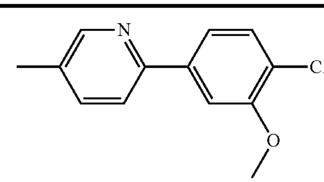 | 83% |

-continued
| Ex. | Reactants Variant | Product | Yield |
|---|---|---|---|
| S3 | 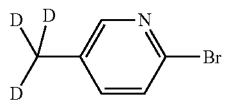 1185306-03-9 627525-96-6 A | 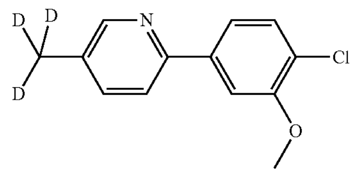 [SMILES: [2H]C([2H])([2H])c1ccc(-c2ccc(Cl)c(OC)c2)nc1] | 85% |
| S4 | 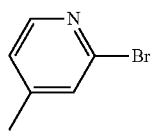 4926-28-7 627525-96-6 A | 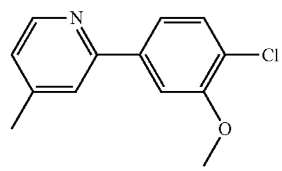 [SMILES: COc1cc(-c2cc(C)ccn2)ccc1Cl] | 88% |
| S5 | 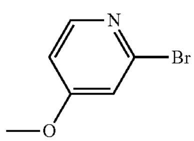 89488-29-9 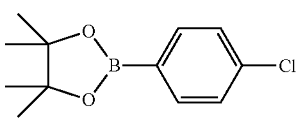 195062-61-4 A | 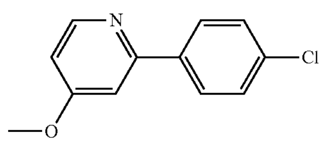 | 74% |
| S6 | 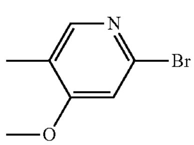 1227574-33-5 195062-61-4 A | 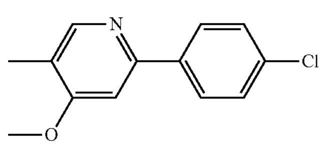 [SMILES: COc1cc(-c2ccc(Cl)cc2)ncc1C] | 70% |
| S7 | 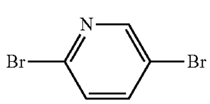 624-28-2 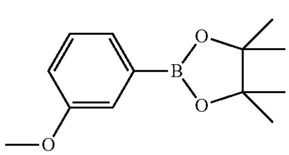 325142-84-5 B | 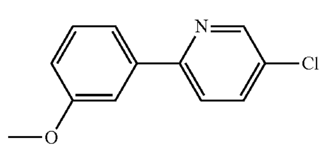 | 65% |
| S8 | 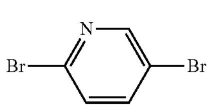 624-28-2 | 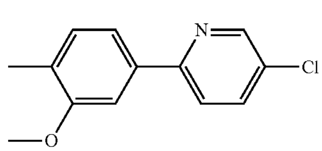 [SMILES: COc1cc(-c2ccc(Cl)cn2)ccc1C] | 69% |

-continued
| Ex. | Reactants Variant | Product | Yield |
|---|---|---|---|
| | 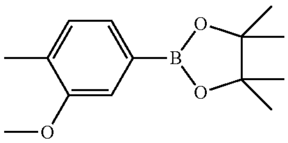 1417036-28-2 B | | |
| S9 | 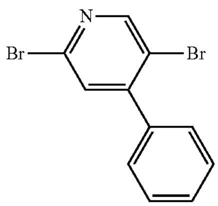 1381937-40-1 | 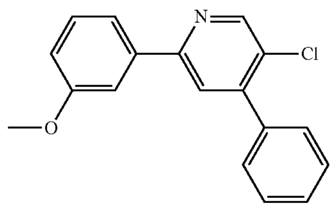 [SMILES: COc1cccc(-c2cc(-c3ccccc3)c(Cl)cn2)c1] | 67% |
| | 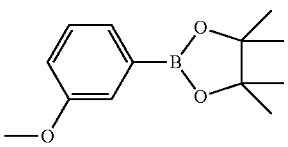 325142-84-5 B | | |
| S10 | 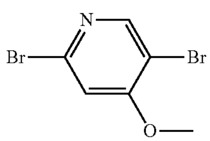 1211520-71-6 | 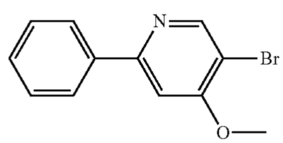 | 65% |
| | 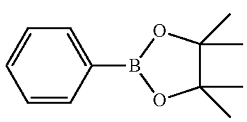 24388-23-6 B | | |
| S11 | 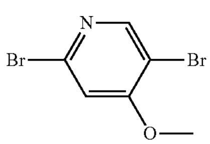 1211520-71-6 | 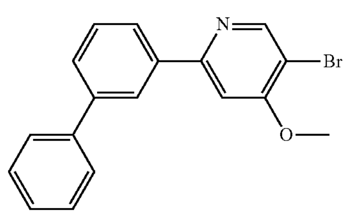 [SMILES: COc1cc(-c2cccc(-c3ccccc3)c2)ncc1Br] | 70% |
| | 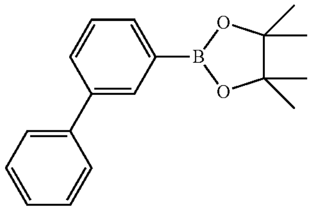 913844-88-3 B | | |

-continued
| Ex. | Reactants Variant | Product | Yield |
|---|---|---|---|
| S12 | 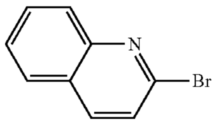 2005-43-8 627525-96-6 A | 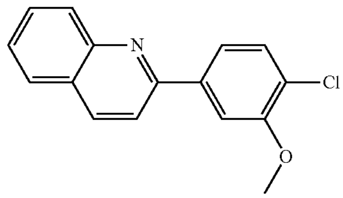 [SMILES: COc1cc(-c2ccc3ccccc3n2)ccc1Cl] | 73% |
| S13 | 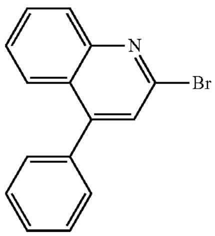 857206-12-3S 627525-96-6 A | 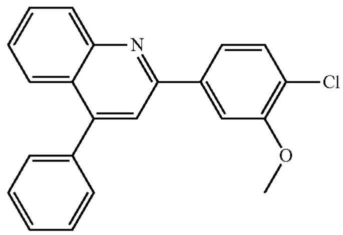 [SMILES: COc1cc(-c2cc(-c3ccccc3)c3ccccc3n2)ccc1Cl] | 77% |
| S14 | 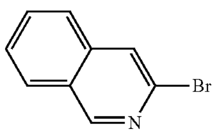 34784-02-6 627525-96-6 A | 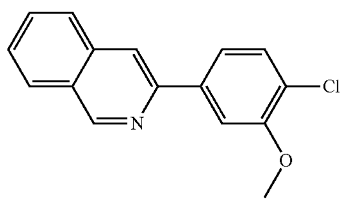 [SMILES: COc1cc(-c2cc3ccccc3cn2)ccc1Cl] | 77% |
| S15 | 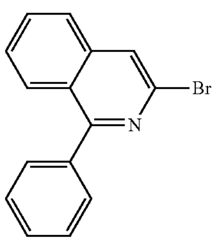 2073111-76-7 627525-96-6 A | 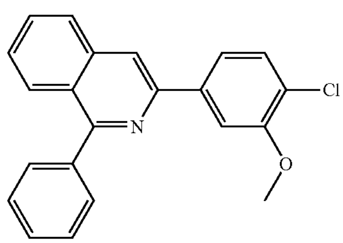 [SMILES: COc1cc(-c2cc3ccccc3c(-c3ccccc3)n2)ccc1Cl] | 77% |
| S16 | 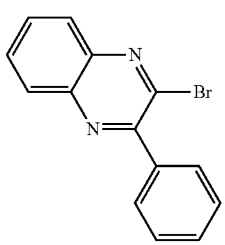 1195563-58-6 627525-96-6 A | 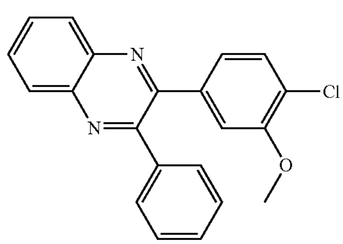 [SMILES: COc1cc(-c2nc3ccccc3nc2-c2ccccc2)ccc1Cl] | 73% |
| S17 | 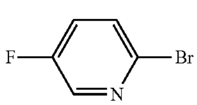 41404-58-4 | 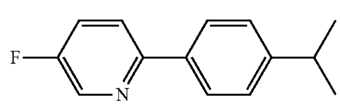 [SMILES: CC(C)c1ccc(-c2ccc(F)cn2)cc1] | 81% |

-continued

| Ex. | Reactants Variant | Product | Yield |
|---|---|---|---|
| | 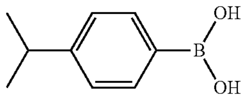 16152-51-5 B | | |

Example S50

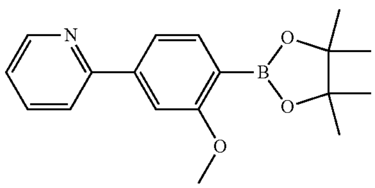 [SMILES: COc1cc(-c2ccccn2)ccc1B1OC(C)(C)C(C)(C)O1]

Variant A

To a mixture of 22.0 g (100 mmol) of S1, 26.7 g (105 mmol) of bis(pinacolato)diborane, 29.4 g (300 mmol) of potassium acetate (anhydrous), 50 g of glass beads (diameter 3 mm) and 300 ml of THF are added, with good stirring, 821 mg (2 mmol) of SPhos and then 225 mg (1 mmol) of palladium(II) acetate, and the mixture is heated under reflux for 16 h. After cooling, the salts and glass beads are removed by suction filtration through a Celite bed in the form of a THF slurry, which is washed through with a little THF, and the filtrate is concentrated to dryness. The residue is taken up in 100 ml of MeOH and stirred in the warm solvent, and the crystallized product is filtered off with suction, washed twice with 30 ml each time of methanol and dried under reduced pressure. Yield: 27.4 g (88 mmol), 88%; purity: about 95% by $^1$H NMR.

Variant B

Procedure analogous to variant A, except that SPhos is replaced by tricyclohexylphosphine.

In an analogous manner, it is possible to prepare the following compounds:

| Ex. | Reactant Variant | Product | Yield |
|---|---|---|---|
| S51 | S2 A | 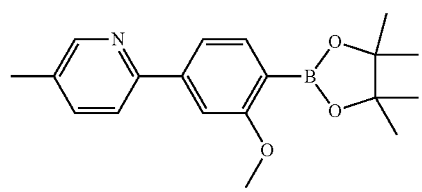 | 90% |
| S52 | S3 A | 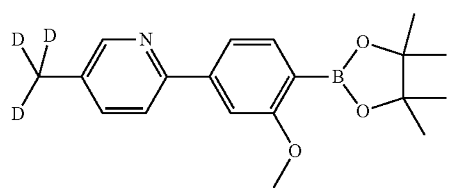 [SMILES: [2H]C([2H])([2H])c1ccc(-c2ccc(B3OC(C)(C)C(C)(C)O3)c(OC)c2)nc1] | 89% |
| S53 | S4 A | 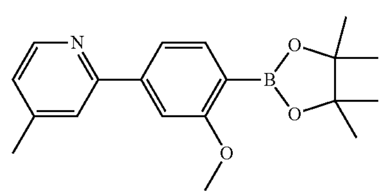 [SMILES: COc1cc(-c2cc(C)ccn2)ccc1B1OC(C)(C)C(C)(C)O1] | 87% |
| S54 | S5 A | 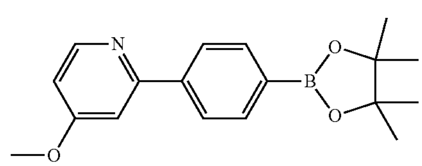 | 90% |

-continued
| Ex. | Reactant Variant | Product | Yield |
|---|---|---|---|
| S55 | S6 A | 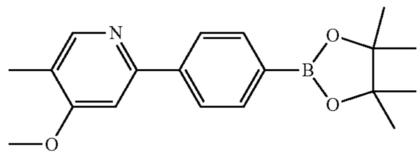 | 87% |
| S56 | S7 A | 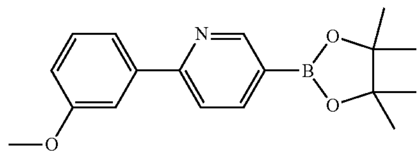 | 84% |
| S57 | S8 A | 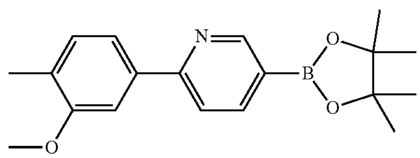 | 88% |
| S58 | S9 B | 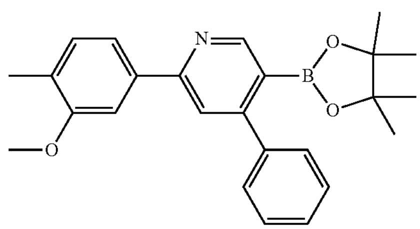 | 85% |
| S59 | S10 A | 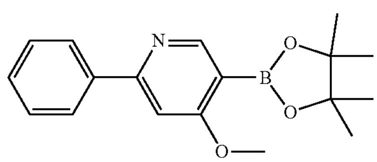 [SMILES: COc1cc(-c2ccccc2)ncc1B1OC(C)(C)C(C)(C)O1] | 87% |
| S60 | S11 A | 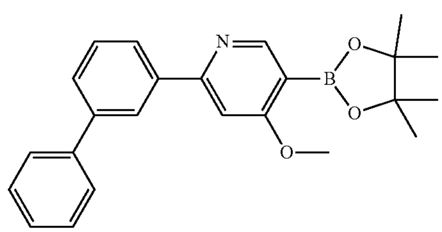 [SMILES: COc1cc(-c2cccc(-c3ccccc3)c2)ncc1B1OC(C)(C)C(C)(C)O1] | 90% |
| S61 | S12 A | 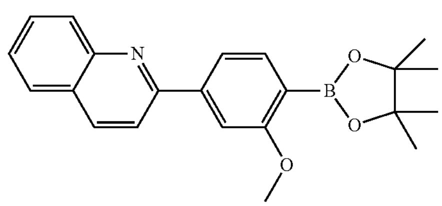 [SMILES: COc1cc(-c2ccc3ccccc3n2)ccc1B1OC(C)(C)C(C)(C)O1] | 94% |
| S62 | S13 A | 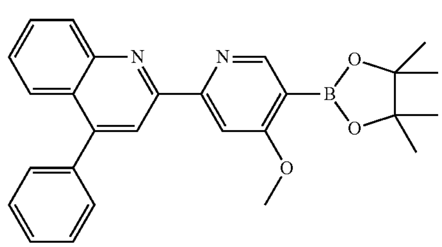 [SMILES: COc1cc(-c2cc(-c3ccccc3)c3ccccc3n2)ncc1B1OC(C)(C)C(C)(C)O1] | 91% |

-continued

| Ex. | Reactant Variant | Product | Yield |
|---|---|---|---|
| S63 | S14<br>A | 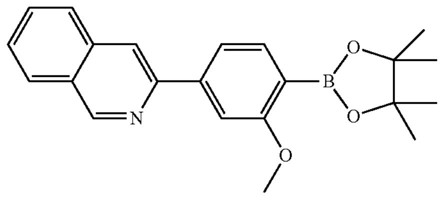 [SMILES: COc1cc(-c2cc3ccccc3cn2)ccc1B1OC(C)(C)C(C)(C)O1] | 90% |
| S64 | S15<br>A | 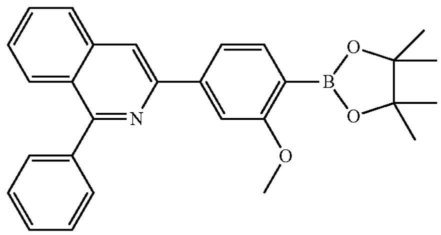 [SMILES: COc1cc(-c2cc3ccccc3c(-c3ccccc3)n2)ccc1B1OC(C)(C)C(C)(C)O1] | 90% |
| S65 | S16<br>A | 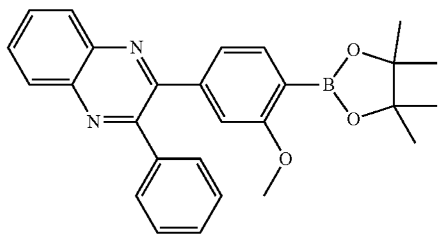 [SMILES: COc1cc(-c2nc3ccccc3nc2-c2ccccc2)ccc1B1OC(C)(C)C(C)(C)O1] | 90% |
| S66 | 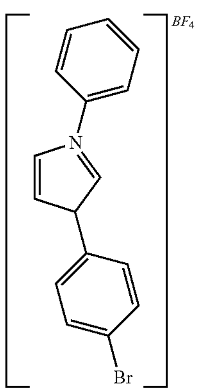<br>1434057-17-6<br>A | 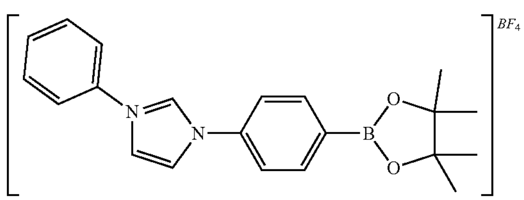<br>Stirring with acetonitrile | 55% |

Example S100

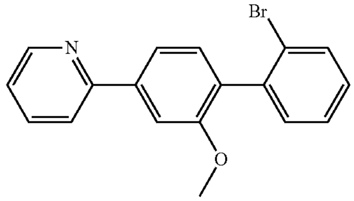

To a mixture of 31.1 g (100 mmol) of S50, 28.3 g (100 mmol) of 1-bromo-2-iodobenzene [583-55-1], 31.8 g (300 mmol) of sodium carbonate, 200 ml of toluene, 70 ml of ethanol and 200 ml of water are added, with very good stirring, 788 mg (3 mmol) of triphenylphosphine and then 225 mg (1 mmol) of palladium(II) acetate, and the mixture is heated under reflux for 48 h. After cooling, the organic phase is removed and washed once with 300 ml of water and once with 300 ml of saturated sodium chloride solution, and dried over magnesium sulfate. The desiccant is filtered off and the filtrate is concentrated fully under reduced pressure. The residue is flash-chromatographed (Torrent automatic column system from A. Semrau), Yield; 32.3 g (95 mmol), 95%; purity: about 97% by $^1$H NMR.

In an analogous manner, it is possible to prepare the following compounds:

| Ex. | Reactant | Product | Yield |
|---|---|---|---|
| S101 | S51 | 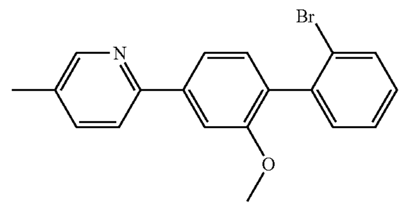 [SMILES: COc1cc(-c2ccc(C)cn2)ccc1-c1ccccc1Br] | 90% |
| S102 | S52 | 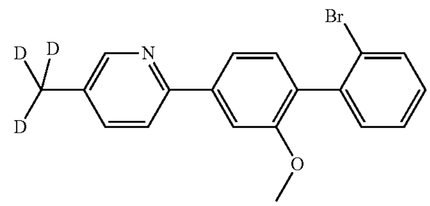 [SMILES: [2H]C([2H])([2H])c1ccc(-c2ccc(-c3ccccc3Br)c(OC)c2)nc1] | 87% |
| S103 | S53 | 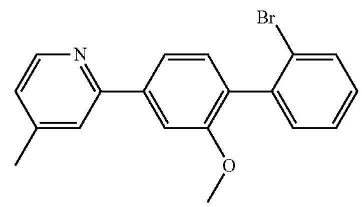 [SMILES: COc1cc(-c2cc(C)ccn2)ccc1-c1ccccc1Br] | 91% |
| S104 | S54 | 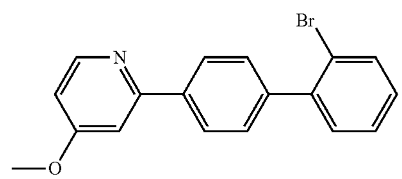 [SMILES: COc1ccnc(-c2ccc(-c3ccccc3Br)cc2)c1] | 86% |
| S105 | S55 | 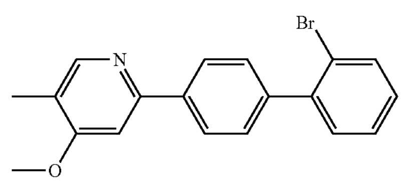 [SMILES: COc1cc(-c2ccc(-c3ccccc3Br)cc2)ncc1C] | 93% |
| S106 | S56 | 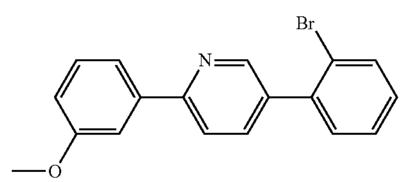 | 86% |
| S107 | S57 | 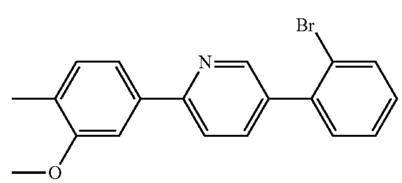 [SMILES: COc1cc(-c2ccc(-c3ccccc3Br)cn2)ccc1C] | 86% |
| S108 | S58 | 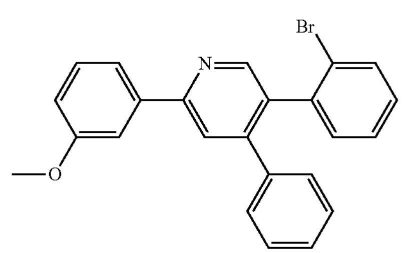 [SMILES: COc1cccc(-c2cc(-c3ccccc3)c(-c3ccccc3Br)cn2)c1] | 89% |

-continued
| Ex. | Reactant | Product | Yield |
|---|---|---|---|
| S109 | S59 | 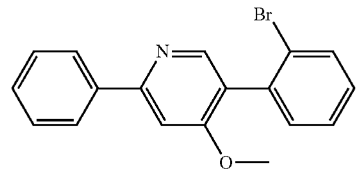 [SMILES: COc1cc(-c2ccccc2)ncc1-c1ccccc1Br] | 87% |
| S110 | S60 | 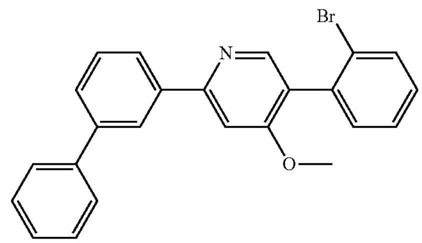 [SMILES: COc1cc(-c2cccc(-c3ccccc3)c2)ncc1-c1ccccc1Br] | 90% |
| S111 | S61 | 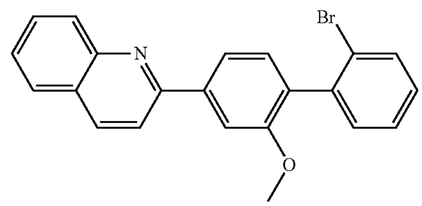 [SMILES: COc1cc(-c2ccc3ccccc3n2)ccc1-c1ccccc1Br] | 88% |
| S112 | S62 | 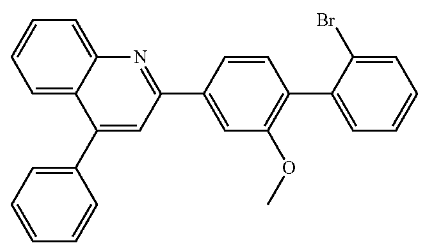 [SMILES: COc1cc(-c2cc(-c3ccccc3)c3ccccc3n2)ccc1-c1ccccc1Br] | 85% |
| S113 | S63 | 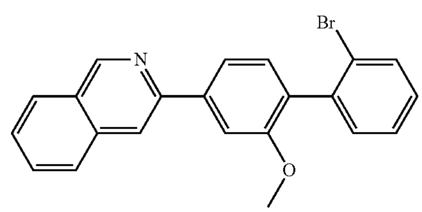 [SMILES: COc1cc(-c2cc3ccccc3cn2)ccc1-c1ccccc1Br] | 83% |
| S114 | S64 | 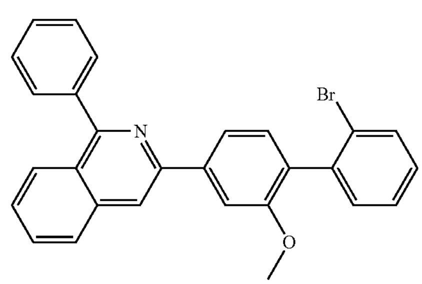 [SMILES: COc1cc(-c2cc3ccccc3c(-c3ccccc3)n2)ccc1-c1ccccc1Br] | 80% |

-continued
| Ex. | Reactant | Product | Yield |
|---|---|---|---|
| S115 | S65 | 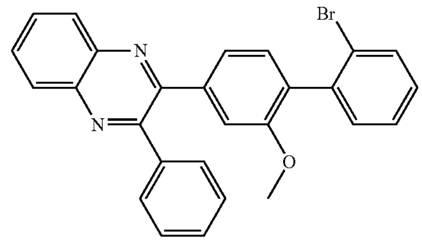 [SMILES: COc1cc(-c2nc3ccccc3nc2-c2ccccc2)ccc1-c1ccccc1Br] | 76% |
| S116 | 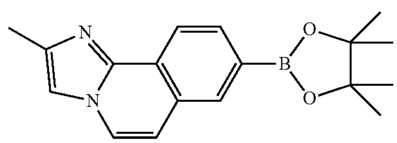 1989597-11-6 | 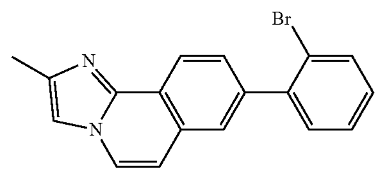 [SMILES: Cc1cn2ccc3cc(-c4ccccc4Br)ccc3c2n1] | 80% |
| S117 | 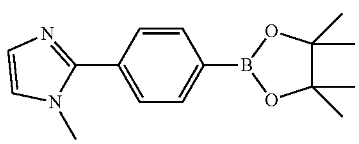 1394374-23-2 | 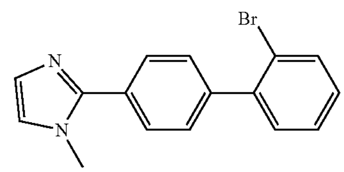 [SMILES: Cn1ccnc1-c1ccc(-c2ccccc2Br)cc1] | 89% |
| S118 | 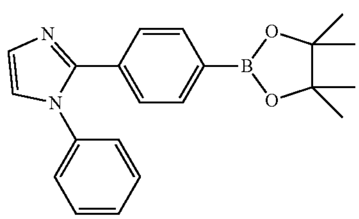 1621467-82-0 | 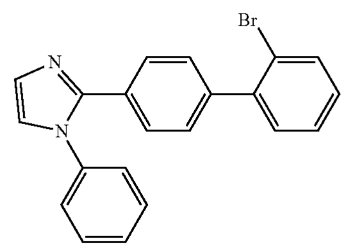 [SMILES: Brc1ccccc1-c1ccc(-c2nccn2-c2ccccc2)cc1] | 86% |
| S119 | 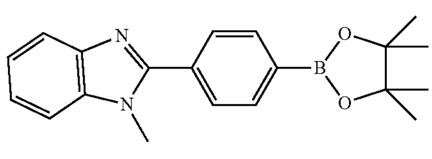 1466412-09-8 | 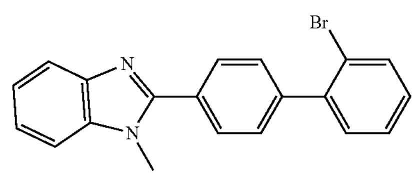 [SMILES: Cn1c(-c2ccc(-c3ccccc3Br)cc2)nc2ccccc21] | 85% |
| S120 | 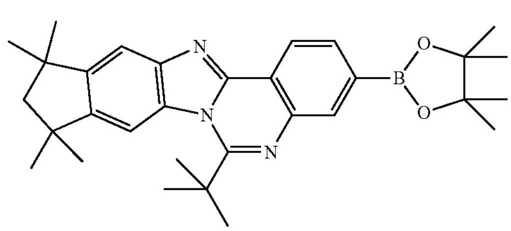 1989597-13-8 | 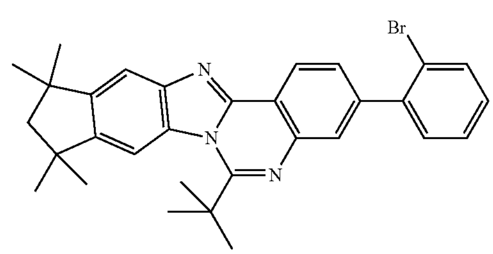 [SMILES: CC(C)(C)c1nc2cc(-c3ccccc3Br)ccc2c2nc3cc4c(cc3n12)C(C)(C)CC4(C)C] | 77% |
| S121 | 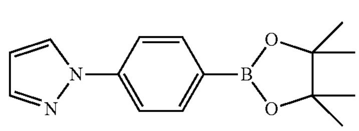 1312478-63-9 | 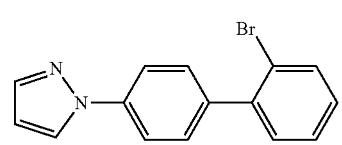 [SMILES: Brc1ccccc1-c1ccc(-n2cccn2)cc1] | 80% |

-continued

| Ex. | Reactant | Product | Yield |
|---|---|---|---|
| S122 | S66 | 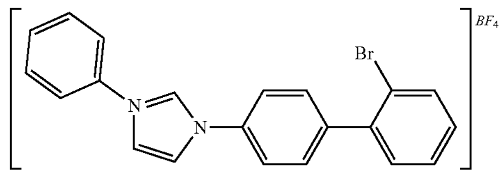 Extraction of the water phase with dichloromethane/recrystallization of the crude product from acetonitrile/MeOH | 67% |
| S123 | 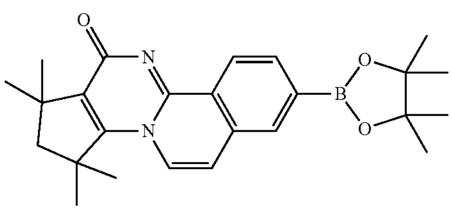 1989597-91-2 | 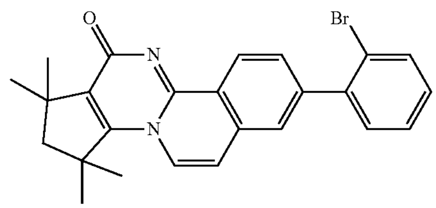 [SMILES: CC1(C)CC(C)(C)c2c1c(=O)nc1c3ccc(-c4ccccc4Br)cc3ccn21] | 85% |
| S124 | S554 | 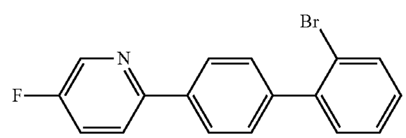 [SMILES: Fc1ccc(-c2ccc(-c3ccccc3Br)cc2)nc1] | 76% |

Example S150

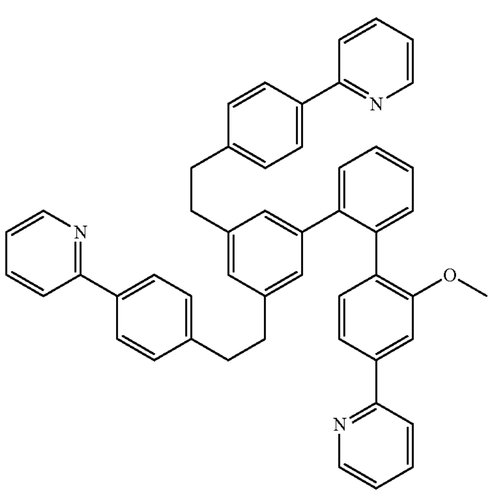 [SMILES: COc1cc(-c2ccccn2)ccc1-c1ccccc1-c1cc(CCc2ccc(-c3ccccn3)cc2)cc(CCc2ccc(-c3ccccn3)cc2)c1]

To a mixture of 56.7 g (100 mmol) of S358, 34.0 g (100 mmol) of S100, 63.7 g (300 mmol) of tripotassium phosphate, 300 ml of toluene, 150 ml of dioxane and 300 ml of water are added, with good stirring, 1.64 g (4 mmol) of SPhos and then 449 mg (2 mmol) of palladium(II) acetate, and the mixture is heated under reflux for 24 h. After cooling, the organic phase is removed and washed twice with 300 ml each time of water and once with 300 ml of saturated sodium chloride solution, and dried over magnesium sulfate. The desiccant is filtered off, the filtrate is concentrated to dryness under reduced pressure and the glassy crude product is recrystallized at boiling from acetonitrile (~150 ml) and then for a second time from acetonitrile/ethyl acetate. Yield; 51.8 g (74 mmol), 74%; purity: about 95% by $^1$H NMR.

In an analogous manner, it is possible to prepare the following compounds;

| Ex. | Reactants | Product | Yield |
|---|---|---|---|
| S151 | S358<br>S101 | 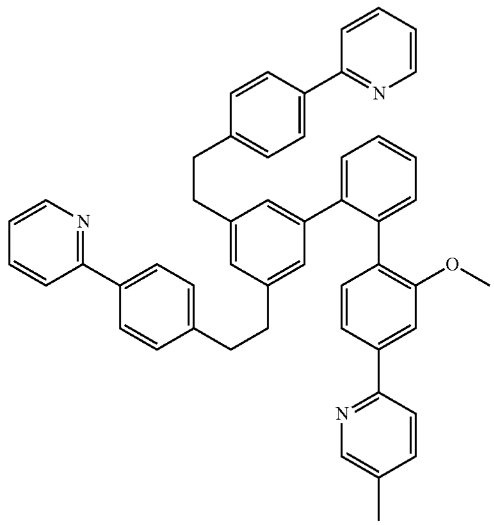 [SMILES: COc1cc(-c2ccc(C)cn2)ccc1-c1ccccc1-c1cc(CCc2ccc(-c3ccccn3)cc2)cc(CCc2ccc(-c3ccccn3)cc2)c1] | 71% |
| S152 | S358<br>S102 | 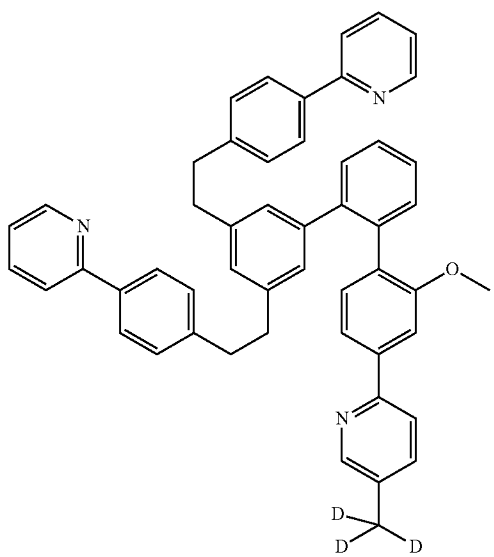 [SMILES: [2H]C([2H])([2H])c1ccc(-c2ccc(-c3ccccc3-c3cc(CCc4ccc(-c5ccccn5)cc4)cc(CCc4ccc(-c5ccccn5)cc4)c3)c(OC)c2)nc1] | 75% |
| S153 | S358<br>S103 | 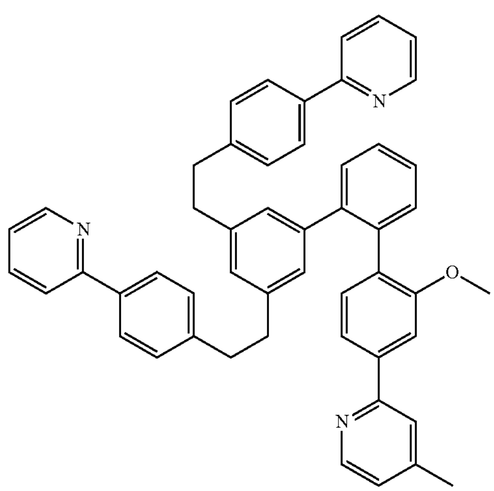 [SMILES: COc1cc(-c2cc(C)ccn2)ccc1-c1ccccc1-c1cc(CCc2ccc(-c3ccccn3)cc2)cc(CCc2ccc(-c3ccccn3)cc2)c1] | 70% |

-continued
| Ex. | Reactants | Product | Yield |
|---|---|---|---|
| S154 | S359<br>S101 | 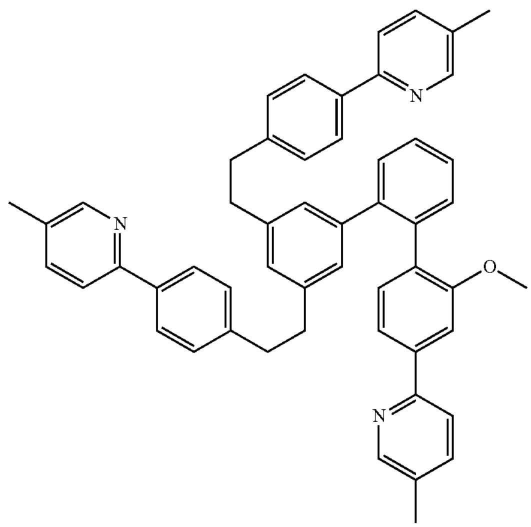 | 68% |
| S155 | S360<br>S103 | 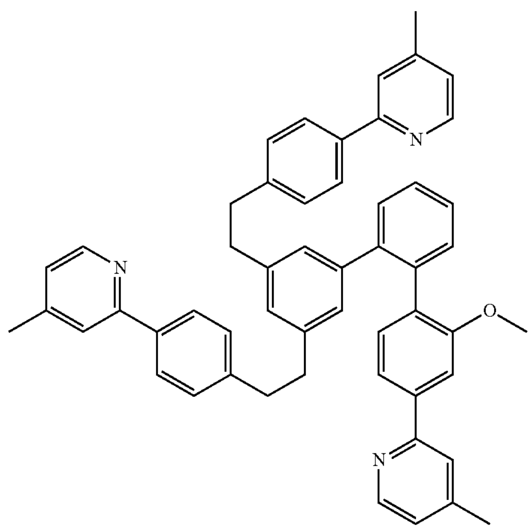 | 70% |
| S156 | S361<br>S100 | 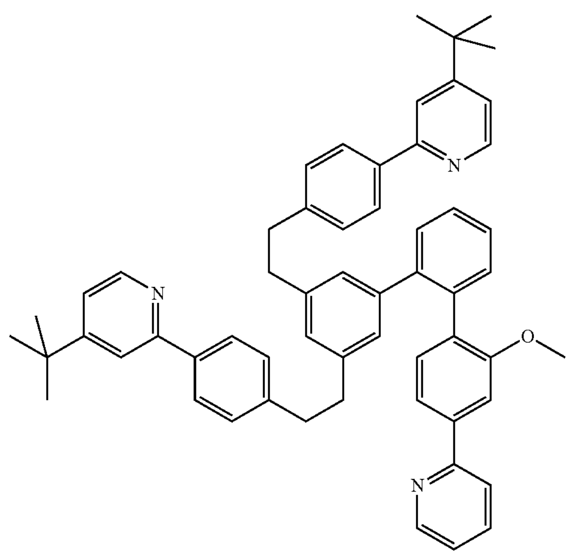 [SMILES: COc1cc(-c2ccccn2)ccc1-c1ccccc1-c1cc(CCc2ccc(-c3cc(C(C)(C)C)ccn3)cc2)cc(CCc2ccc(-c3cc(C(C)(C)C)ccn3)cc2)c1] | 73% |

-continued
| Ex. | Reactants | Product | Yield |
| --- | --- | --- | --- |
| S157 | S358<br>S104 | 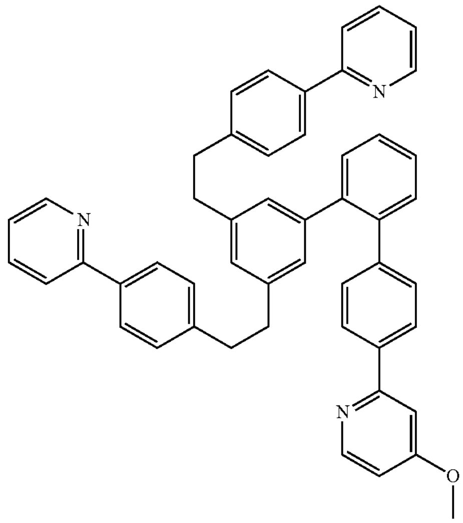 [SMILES: COc1ccnc(-c2ccc(-c3ccccc3-c3cc(CCc4ccc(-c5ccccn5)cc4)cc(CCc4ccc(-c5ccccn5)cc4)c3)cc2)c1] | 71% |
| S158 | S358<br>S105 | 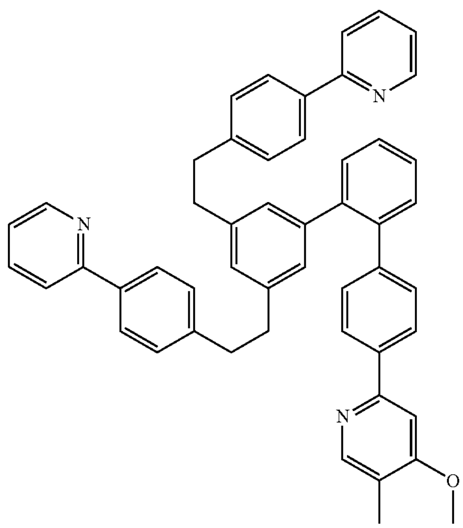 [SMILES: COc1cc(-c2ccc(-c3ccccc3-c3cc(CCc4ccc(-c5ccccn5)cc4)cc(CCc4ccc(-c5ccccn5)cc4)c3)cc2)ncc1C] | 71% |
| S159 | S359<br>S105 | 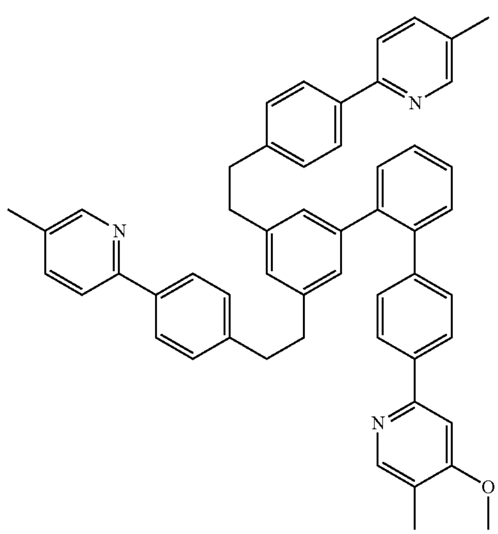 | 76% |

-continued
| Ex. | Reactants | Product | Yield |
|---|---|---|---|
| S160 | S362<br>S106 | 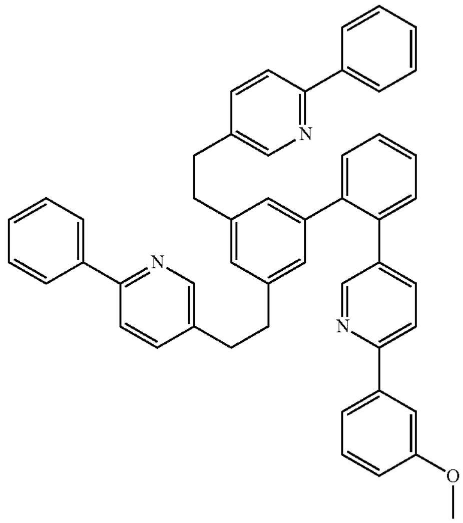 [SMILES: COc1cccc(-c2ccc(-c3ccccc3-c3cc(CCc4ccc(-c5ccccc5)nc4)cc(CCc4ccc(-c5ccccc5)nc4)c3)cn2)c1] | 70% |
| S161 | S362<br>S107 | 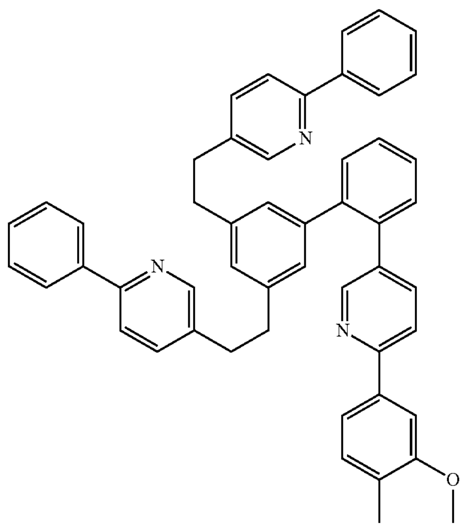 [SMILES: COc1cc(-c2ccc(-c3ccccc3-c3cc(CCc4ccc(-c5ccccc5)nc4)cc(CCc4ccc(-c5ccccc5)nc4)c3)cn2)ccc1C] | 69% |
| S162 | S362<br>S108 | 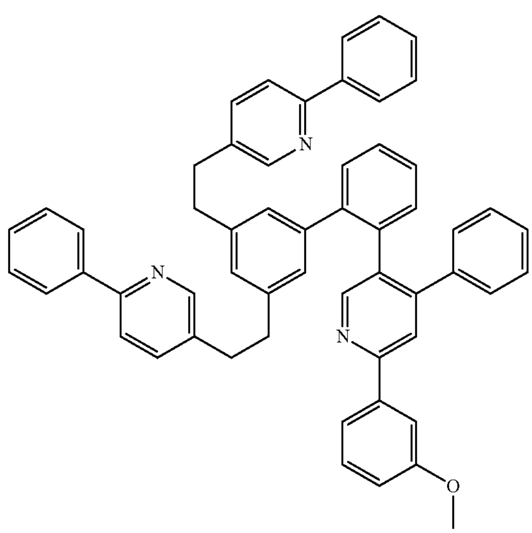 [SMILES: COc1cccc(-c2cc(-c3ccccc3)c(-c3ccccc3-c3cc(CCc4ccc(-c5ccccc5)nc4)cc(CCc4ccc(-c5ccccc5)nc4)c3)cn2)c1] | 74% |

-continued
| Ex. | Reactants | Product | Yield |
|---|---|---|---|
| S163 | S363<br>S106 | 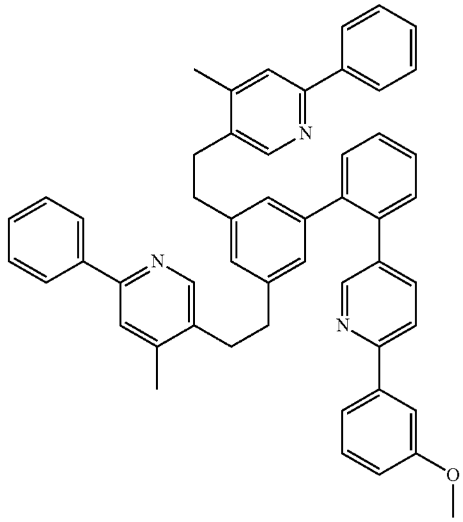 [SMILES: COc1cccc(-c2ccc(-c3ccccc3-c3cc(CCc4cnc(-c5ccccc5)cc4C)cc(CCc4cnc(-c5ccccc5)cc4C)c3)cn2)c1] | 69% |
| S164 | S364<br>S106 | 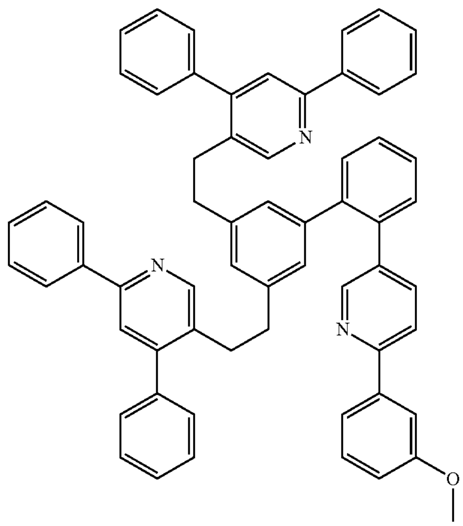 [SMILES: COc1cccc(-c2ccc(-c3ccccc3-c3cc(CCc4cnc(-c5ccccc5)cc4-c4ccccc4)cc(CCc4cnc(-c5ccccc5)cc4-c4ccccc4)c3)cn2)c1] | 70% |
| S165 | S362<br>S109 | 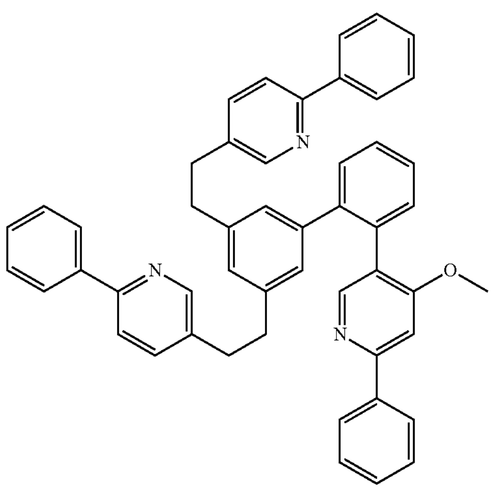 [SMILES: COc1cc(-c2ccccc2)ncc1-c1ccccc1-c1cc(CCc2ccc(-c3ccccc3)nc2)cc(CCc2ccc(-c3ccccc3)nc2)c1] | 75% |

-continued
| Ex. | Reactants | Product | Yield |
| --- | --- | --- | --- |
| S166 | S362<br>S110 | 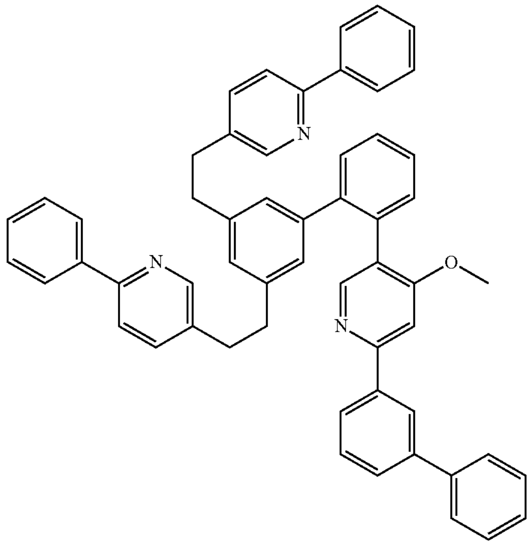 [SMILES: COc1cc(-c2cccc(-c3ccccc3)c2)ncc1-c1ccccc1-c1cc(CCc2ccc(-c3ccccc3)nc2)cc(CCc2ccc(-c3ccccc3)nc2)c1] | 72% |
| S167 | S363<br>S109 | 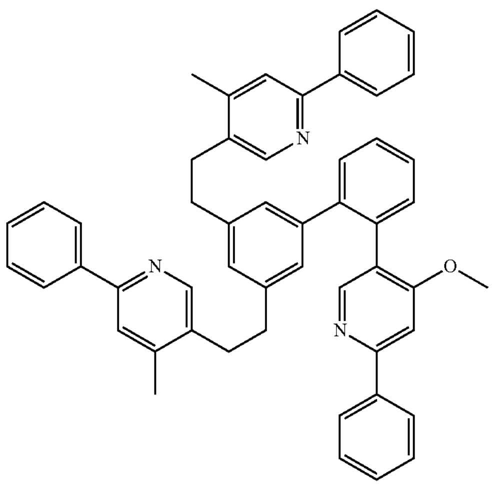 [SMILES: COc1cc(-c2ccccc2)ncc1-c1ccccc1-c1cc(CCc2cnc(-c3ccccc3)cc2C)cc(CCc2cnc(-c3ccccc3)cc2C)c1] | 71% |
| S168 | S358<br>S111 | 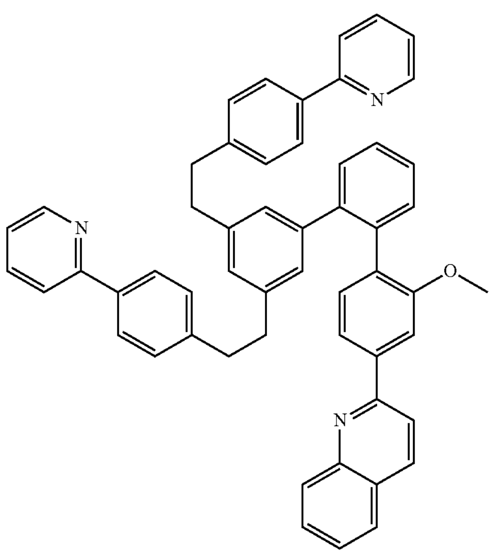 [SMILES: COc1cc(-c2ccc3ccccc3n2)ccc1-c1ccccc1-c1cc(CCc2ccc(-c3ccccn3)cc2)cc(CCc2ccc(-c3ccccn3)cc2)c1] | 70% |

-continued
| Ex. | Reactants | Product | Yield |
|---|---|---|---|
| S169 | S359<br>S112 | 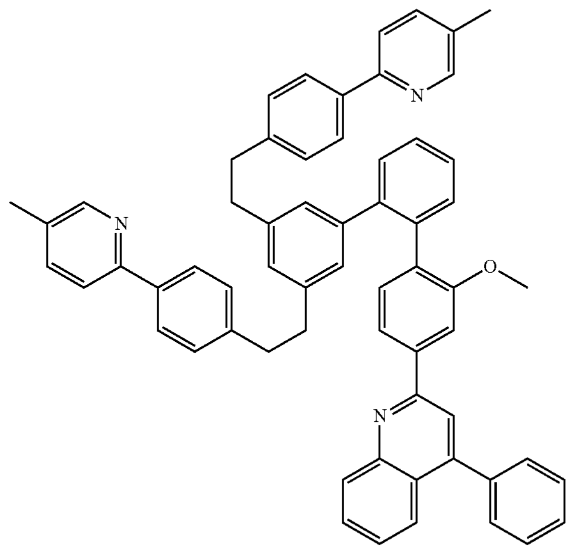 [SMILES: COc1cc(-c2cc(-c3ccccc3)c3ccccc3n2)ccc1-c1ccccc1-c1cc(CCc2ccc(-c3ccc(C)cn3)cc2)cc(CCc2ccc(-c3ccc(C)cn3)cc2)c1] | 73% |
| S170 | S360<br>S113 | 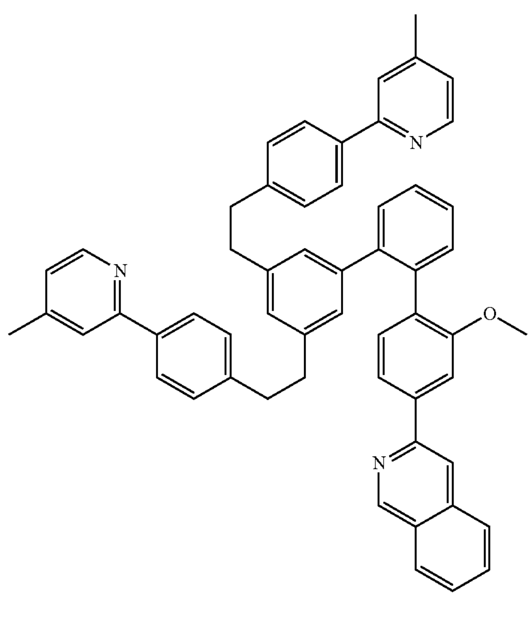 | 80% |

-continued
| Ex. | Reactants | Product | Yield |
|---|---|---|---|
| S171 | S358<br>S114 | 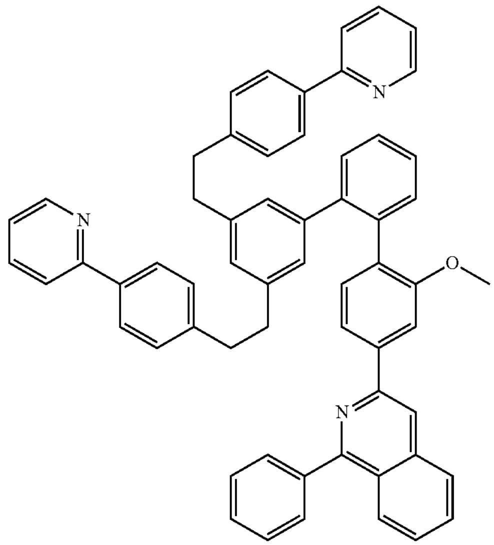 [SMILES: COc1cc(-c2cc3ccccc3c(-c3ccccc3)n2)ccc1-c1ccccc1-c1cc(CCc2ccc(-c3ccccn3)cc2)cc(CCc2ccc(-c3ccccn3)cc2)c1] | 78% |
| S172 | S358<br>S115 | 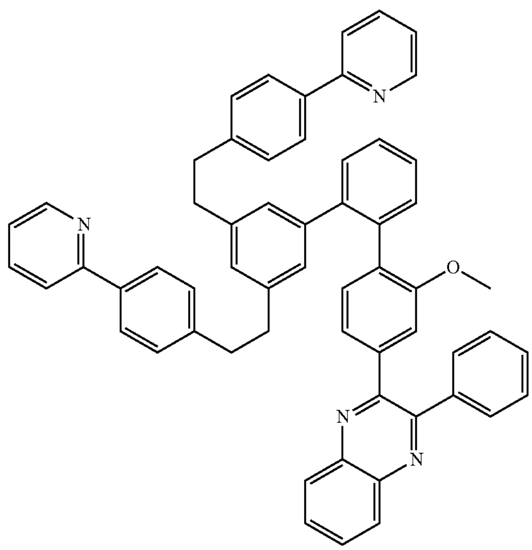 [SMILES: COc1cc(-c2nc3ccccc3nc2-c2ccccc2)ccc1-c1ccccc1-c1cc(CCc2ccc(-c3ccccn3)cc2)cc(CCc2ccc(-c3ccccn3)cc2)c1] | 65% |
| S173 | S350<br>S100 | 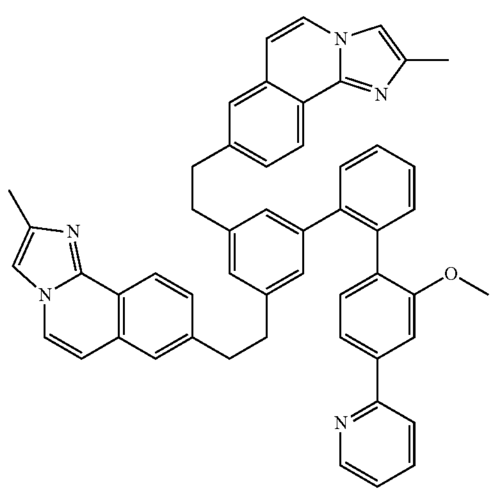 | 74% |

-continued
| Ex. | Reactants | Product | Yield |
|---|---|---|---|
| S174 | S350<br>S104 | 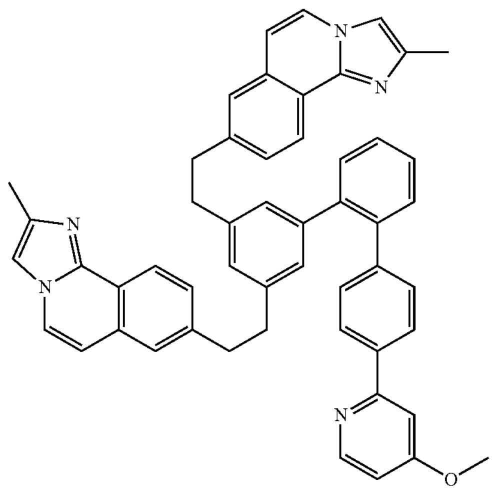 | 76% |
| S175 | S351<br>S100 | 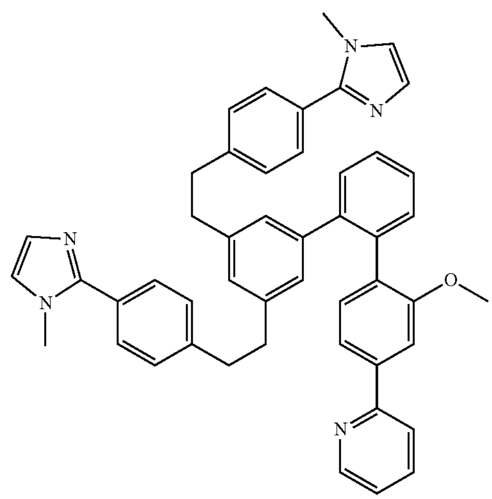 [SMILES: COc1cc(-c2ccccn2)ccc1-c1ccccc1-c1cc(CCc2ccc(-c3nccn3C)cc2)cc(CCc2ccc(-c3nccn3C)cc2)c1] | 73% |
| S176 | S351<br>S105 | 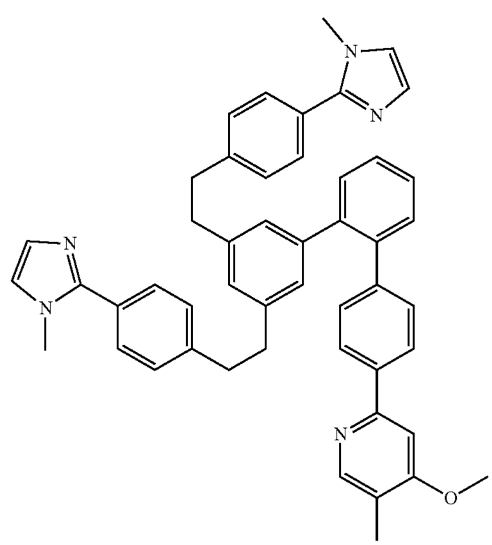 [SMILES: COc1cc(-c2ccc(-c3ccccc3-c3cc(CCc4ccc(-c5nccn5C)cc4)cc(CCc4ccc(-c5nccn5C)cc4)c3)cc2)ncc1C] | 69% |

-continued
| Ex. | Reactants | Product | Yield |
|---|---|---|---|
| S177 | S352<br>S105 | 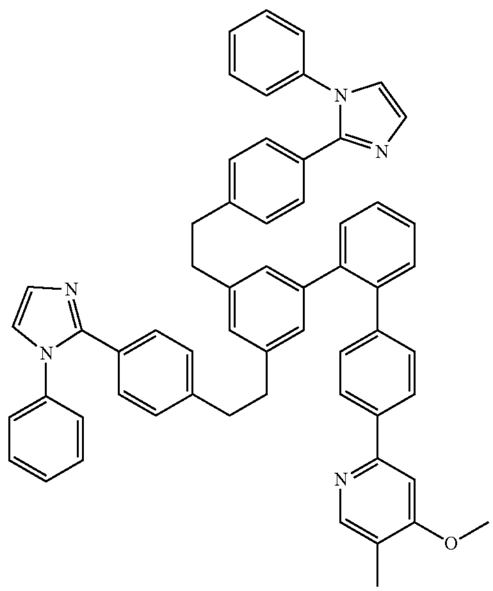 [SMILES: COc1cc(-c2ccc(-c3ccccc3-c3cc(CCc4ccc(-c5nccn5-c5ccccc5)cc4)cc(CCc4ccc(-c5nccn5-c5ccccc5)cc4)c3)cc2)ncc1C] | 74% |
| S178 | S353<br>S104 | 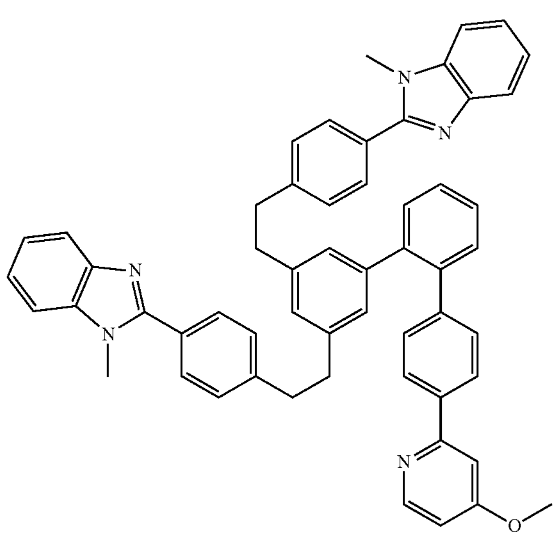 [SMILES: COc1ccnc(-c2ccc(-c3ccccc3-c3cc(CCc4ccc(-c5nc6ccccc6n5C)cc4)cc(CCc4ccc(-c5nc6ccccc6n5C)cc4)c3)cc2)c1] | 75% |

-continued
| Ex. | Reactants | Product | Yield |
|---|---|---|---|
| S179 | S354<br>S104 | 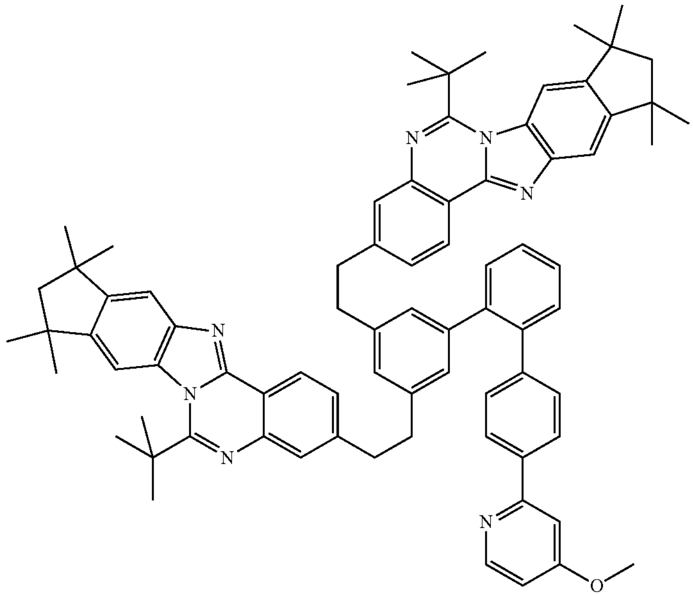 | 66% |
| S180 | S355<br>S101 | 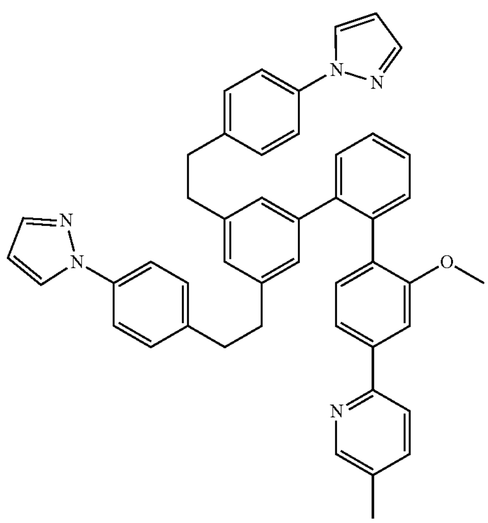 [SMILES: COc1cc(-c2ccc(C)cn2)ccc1-c1ccccc1-c1cc(CCc2ccc(-n3cccn3)cc2)cc(CCc2ccc(-n3cccn3)cc2)c1] | 77% |
| S181 | S355<br>S104 | 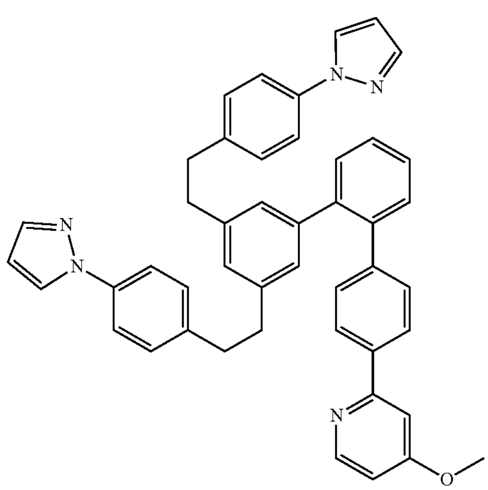 [SMILES: COc1ccnc(-c2ccc(-c3ccccc3-c3cc(CCc4ccc(-n5cccn5)cc4)cc(CCc4ccc(-n5cccn5)cc4)c3)cc2)c1] | 75% |

-continued
| Ex. | Reactants | Product | Yield |
|---|---|---|---|
| S182 | S355<br>S110 | 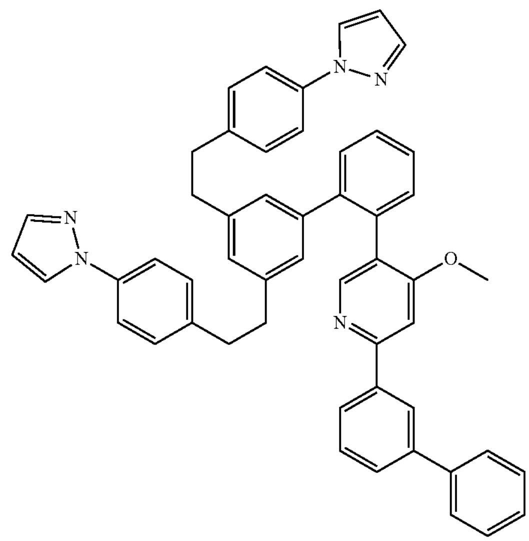 [SMILES: COc1cc(-c2cccc(-c3ccccc3)c2)ncc1-c1ccccc1-c1cc(CCc2ccc(-n3cccn3)cc2)cc(CCc2ccc(-n3cccn3)cc2)c1] | 75% |
| S183 | S356<br>S104 | 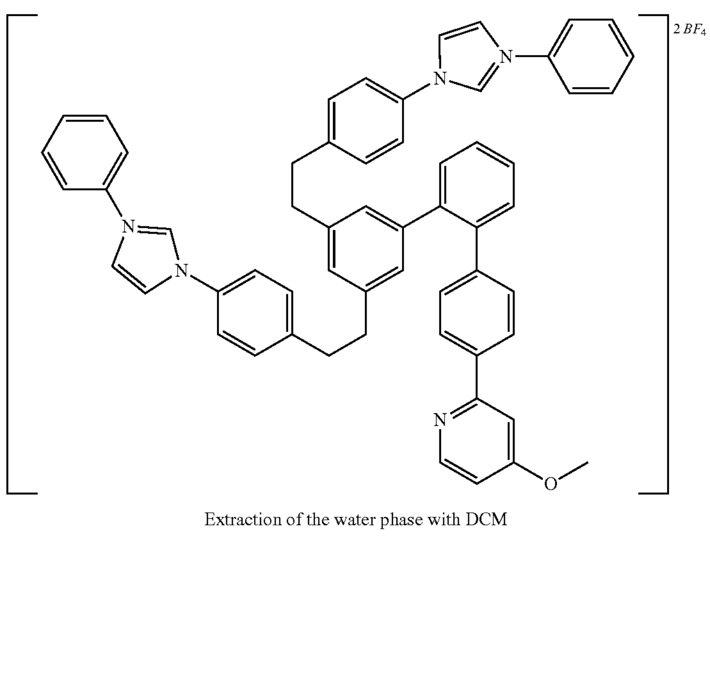 Extraction of the water phase with DCM | 51% |

-continued

| Ex. | Reactants | Product | Yield |
|---|---|---|---|
| S184 | S357<br>S104 | 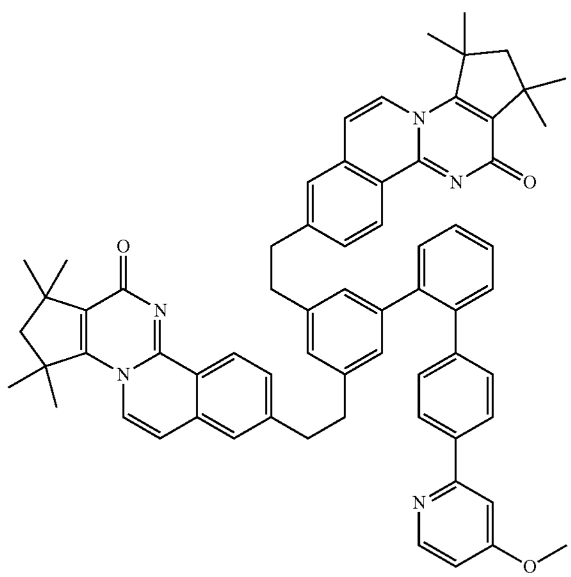 | 69% |

Example S200

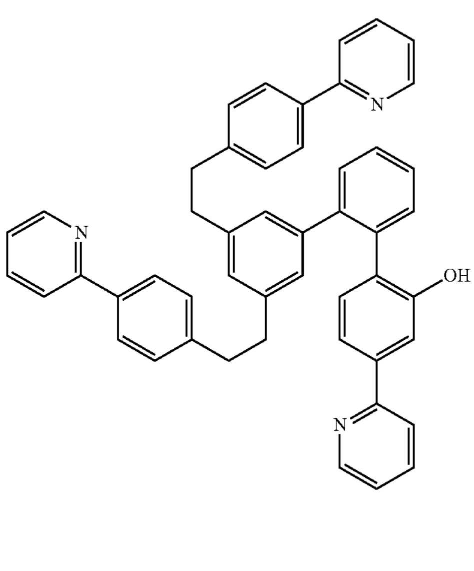 [SMILES: Oc1cc(-c2ccccn2)ccc1-c1ccccc1-c1cc(CCc2ccc(-c3ccccn3)cc2)cc(CCc2ccc(-c3ccccn3)cc2)c1]

A mixture of 70.0 g (100 mmol) of 5150 and 115.6 g (1 mol) of pyridinium hydrochloride is heated to 220° C. (heating mantle) on a water separator for 4 h, discharging the distillate from time to time. The reaction mixture is left to cool down, 500 ml of water are added dropwise starting from a temperature of –150° C. (caution: delayed boiling) and stirring is continued overnight. The beige solid is filtered off with suction and suspended in 700 ml of MeOH, the mixture is neutralized while stirring by adding triethylamine and stirred for a further 5 h, and triethylamine is again added if necessary until there is a neutral reaction. The solids are filtered off with suction, washed three times with 100 ml each time of Mead and dried under reduced pressure. Yield; 62.5 g (91 mmol), 91%; purity: about 95% by $^{1}$H NMR.

In an analogous manner, it is possible to prepare the following compounds:

| Ex. | Reactants | Product | Yield |
|---|---|---|---|
| S201 | S151 | 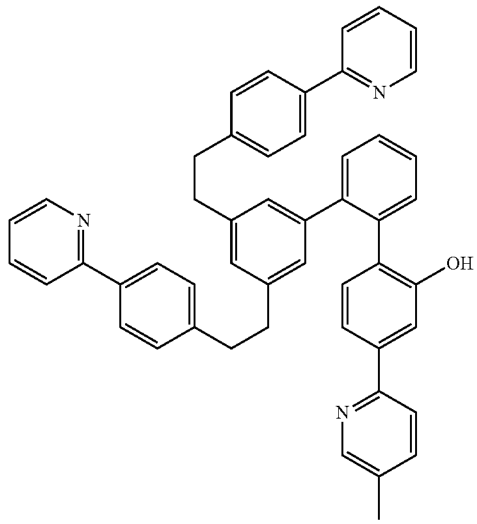 [SMILES: Cc1ccc(-c2ccc(-c3ccccc3-c3cc(CCc4ccc(-c5ccccn5)cc4)cc(CCc4ccc(-c5ccccn5)cc4)c3)c(O)c2)nc1] | 85% |
| S202 | S152 | 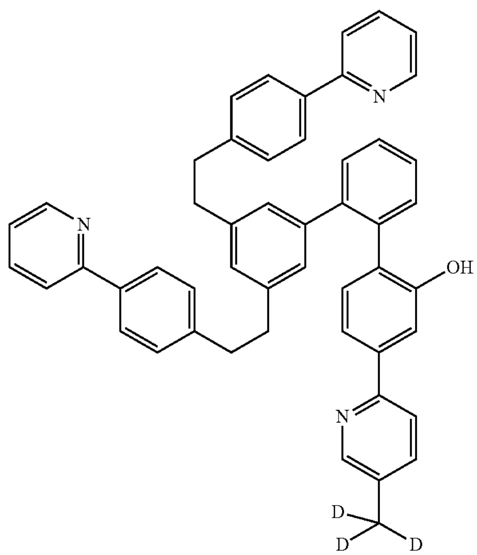 [SMILES: [2H]C([2H])([2H])c1ccc(-c2ccc(-c3ccccc3-c3cc(CCc4ccc(-c5ccccn5)cc4)cc(CCc4ccc(-c5ccccn5)cc4)c3)c(O)c2)nc1] | 90% |
| S203 | S153 | 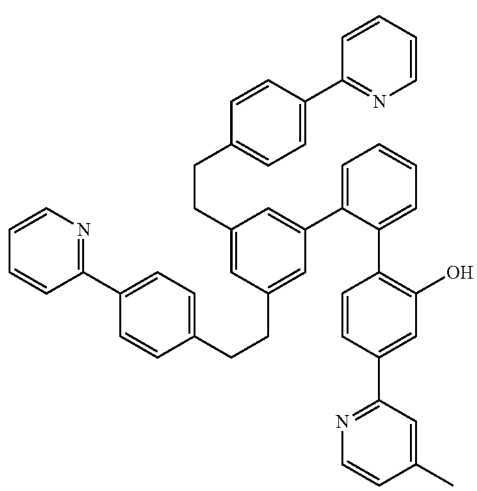 [SMILES: Cc1ccnc(-c2ccc(-c3ccccc3-c3cc(CCc4ccc(-c5ccccn5)cc4)cc(CCc4ccc(-c5ccccn5)cc4)c3)c(O)c2)c1] | 87% |

-continued
| Ex. | Reactants | Product | Yield |
|---|---|---|---|
| S204 | S154 | 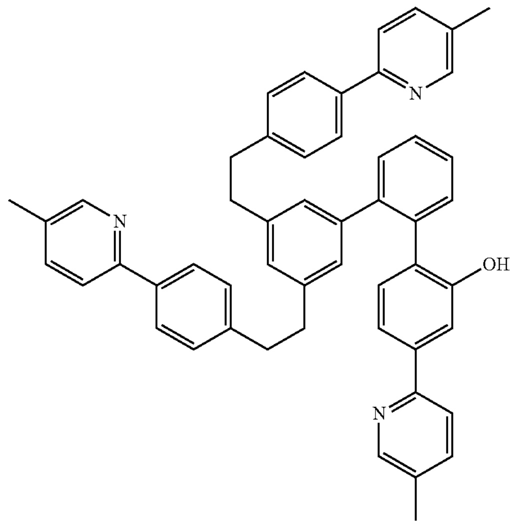 | 86% |
| S205 | S155 | 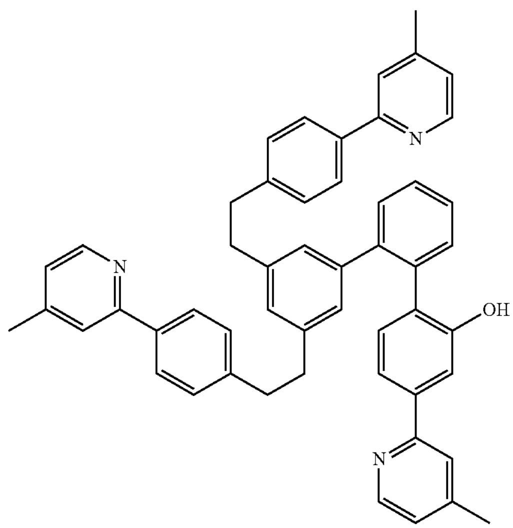 [SMILES: Cc1ccnc(-c2ccc(CCc3cc(CCc4ccc(-c5cc(C)ccn5)cc4)cc(-c4ccccc4-c4ccc(-c5cc(C)ccn5)cc4O)c3)cc2)c1] | 85% |
| S206 | S156 | 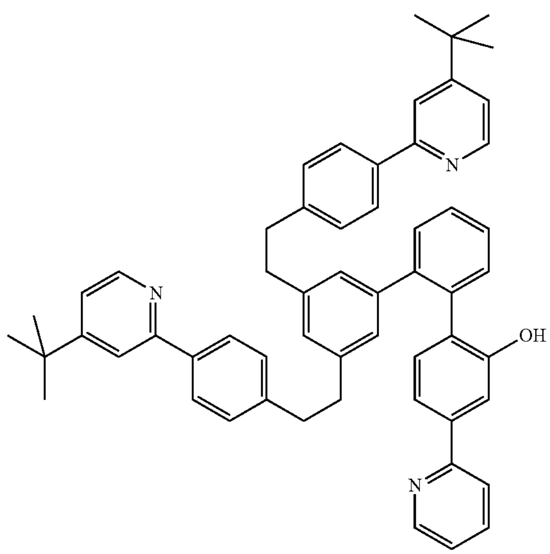 [SMILES: CC(C)(C)c1ccnc(-c2ccc(CCc3cc(CCc4ccc(-c5cc(C(C)(C)C)ccn5)cc4)cc(-c4ccccc4-c4ccc(-c5ccccn5)cc4O)c3)cc2)c1] | 90% |

-continued
| Ex. | Reactants | Product | Yield |
|---|---|---|---|
| S207 | S157 | 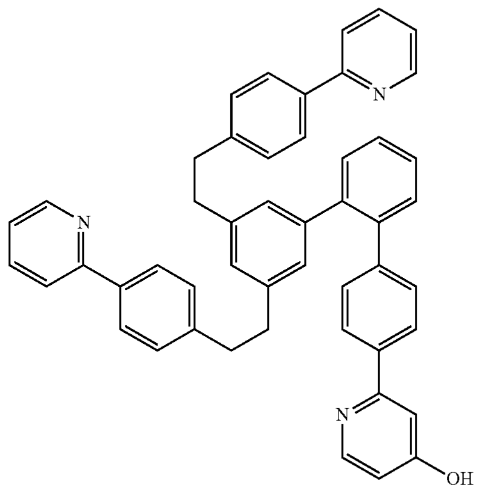 [SMILES: Oc1ccnc(-c2ccc(-c3ccccc3-c3cc(CCc4ccc(-c5ccccn5)cc4)cc(CCc4ccc(-c5ccccn5)cc4)c3)cc2)c1] | 89% |
| S208 | S158 | 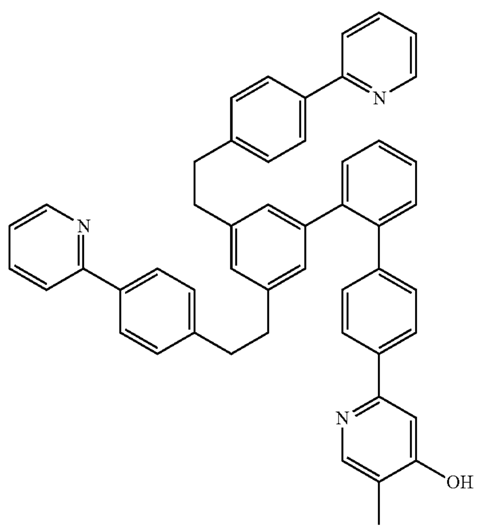 [SMILES: Cc1cnc(-c2ccc(-c3ccccc3-c3cc(CCc4ccc(-c5ccccn5)cc4)cc(CCc4ccc(-c5ccccn5)cc4)c3)cc2)cc1O] | 90% |
| S209 | S159 | 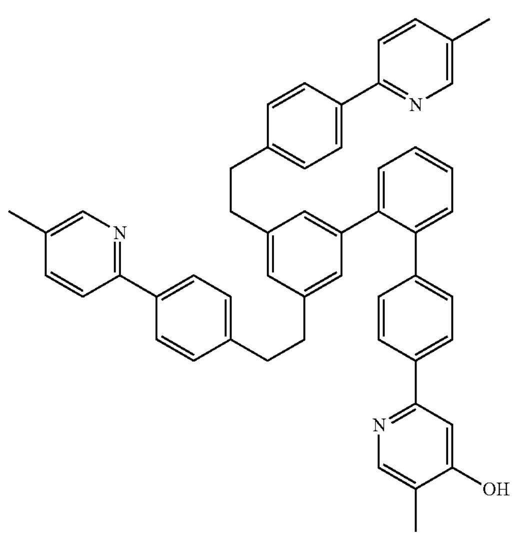 [SMILES: Cc1ccc(-c2ccc(CCc3cc(CCc4ccc(-c5ccc(C)cn5)cc4)cc(-c4ccccc4-c4ccc(-c5cc(O)c(C)cn5)cc4)c3)cc2)nc1] | 83% |

-continued
| Ex. | Reactants | Product | Yield |
|---|---|---|---|
| S210 | S160 | 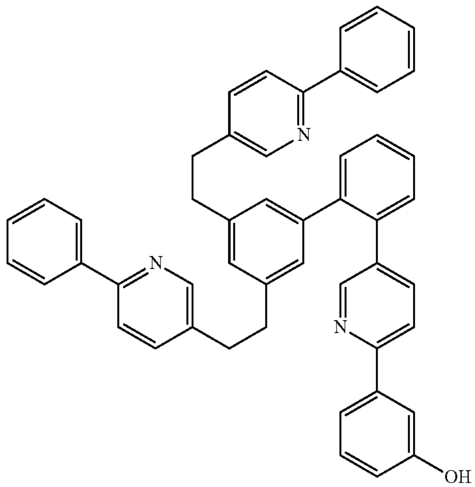 [SMILES: Oc1cccc(-c2ccc(-c3ccccc3-c3cc(CCc4ccc(-c5ccccc5)nc4)cc(CCc4ccc(-c5ccccc5)nc4)c3)cn2)c1] | 81% |
| S211 | S161 | 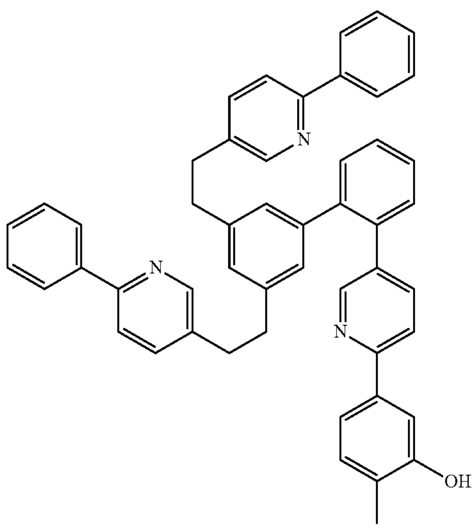 [SMILES: Cc1ccc(-c2ccc(-c3ccccc3-c3cc(CCc4ccc(-c5ccccc5)nc4)cc(CCc4ccc(-c5ccccc5)nc4)c3)cn2)cc1O] | 84% |
| S212 | S162 | 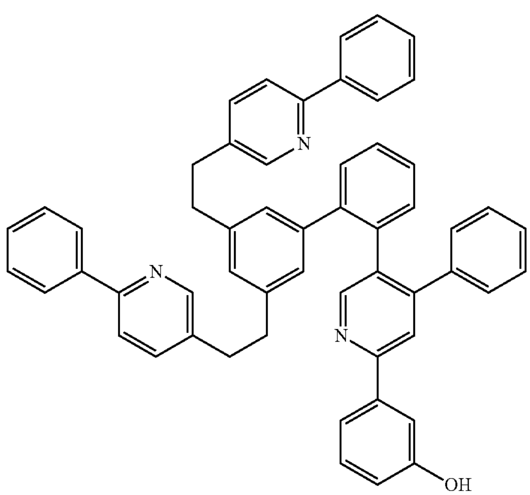 [SMILES: Oc1cccc(-c2cc(-c3ccccc3)c(-c3ccccc3-c3cc(CCc4ccc(-c5ccccc5)nc4)cc(CCc4ccc(-c5ccccc5)nc4)c3)cn2)c1] | 85% |

-continued
| Ex. | Reactants | Product | Yield |
|---|---|---|---|
| S213 | S163 | 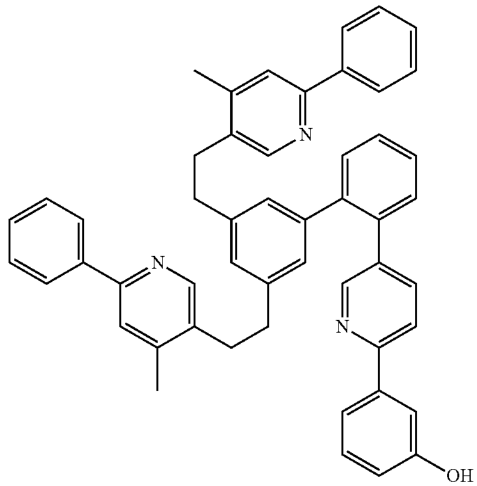 [SMILES: Cc1cc(-c2ccccc2)ncc1CCc1cc(CCc2cnc(-c3ccccc3)cc2C)cc(-c2ccccc2-c2ccc(-c3cccc(O)c3)nc2)c1] | 85% |
| S214 | S164 | 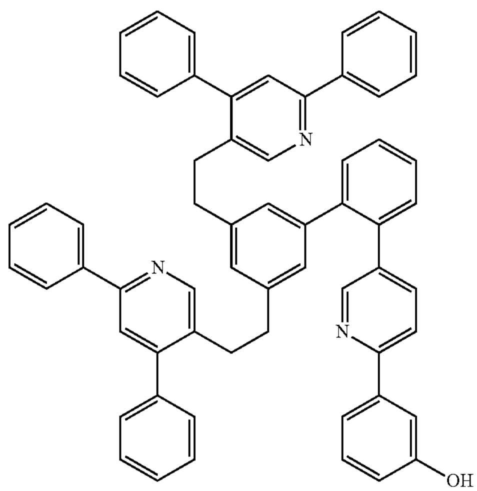 [SMILES: Oc1cccc(-c2ccc(-c3ccccc3-c3cc(CCc4cnc(-c5ccccc5)cc4-c4ccccc4)cc(CCc4cnc(-c5ccccc5)cc4-c4ccccc4)c3)cn2)c1] | 82% |
| S215 | S165 | 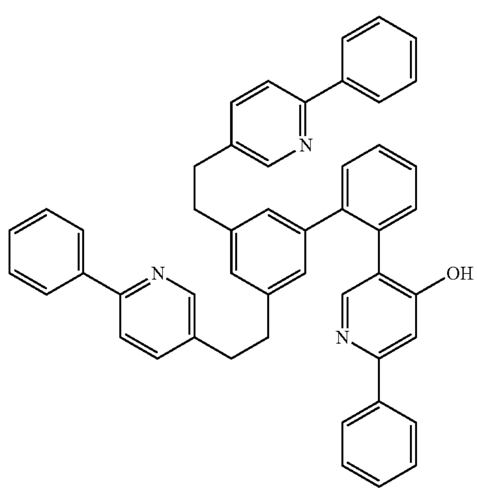 [SMILES: Oc1cc(-c2ccccc2)ncc1-c1ccccc1-c1cc(CCc2ccc(-c3ccccc3)nc2)cc(CCc2ccc(-c3ccccc3)nc2)c1] | 83% |

-continued
| Ex. | Reactants | Product | Yield |
|---|---|---|---|
| S216 | S166 | 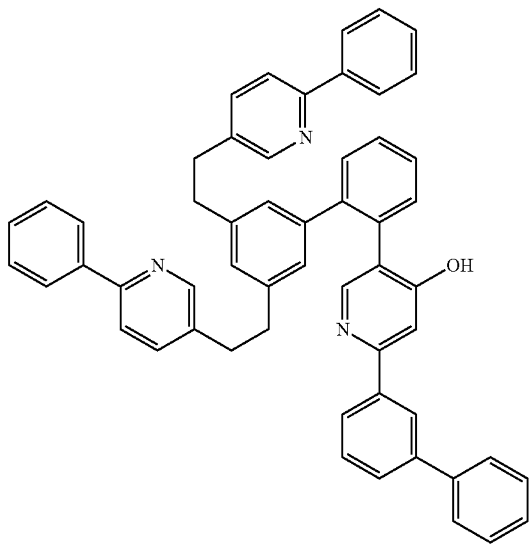 | 85% |
| S217 | S167 | 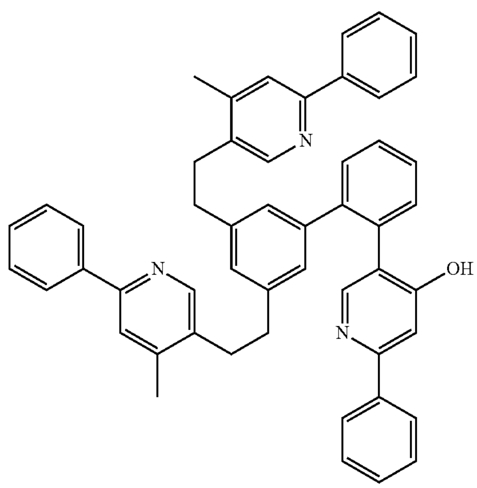 [SMILES: Cc1cc(-c2ccccc2)ncc1CCc1cc(CCc2cnc(-c3ccccc3)cc2C)cc(-c2ccccc2-c2cnc(-c3ccccc3)cc2O)c1] | 81% |
| S218 | S168 | 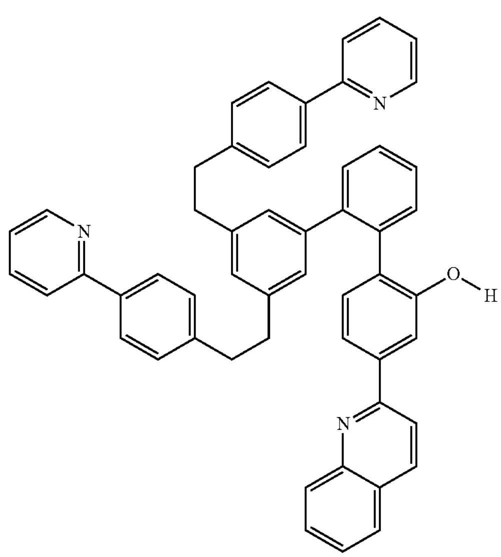 [SMILES: Oc1cc(-c2ccc3ccccc3n2)ccc1-c1ccccc1-c1cc(CCc2ccc(-c3ccccn3)cc2)cc(CCc2ccc(-c3ccccn3)cc2)c1] | 84% |

-continued
| Ex. | Reactants | Product | Yield |
|---|---|---|---|
| S219 | S169 | 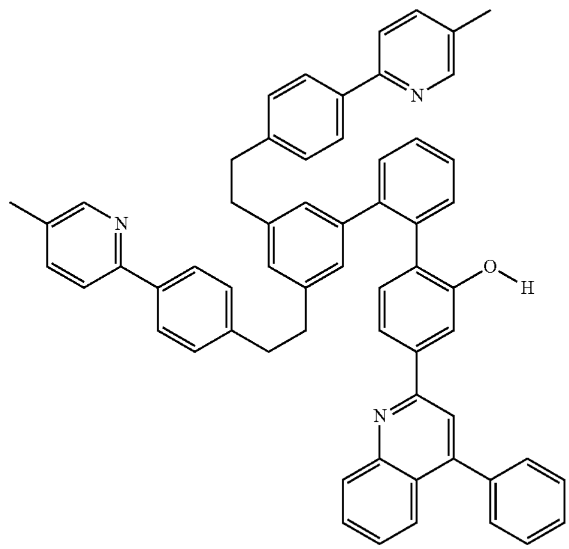 [SMILES: Cc1ccc(-c2ccc(CCc3cc(CCc4ccc(-c5ccc(C)cn5)cc4)cc(-c4ccccc4-c4ccc(-c5cc(-c6ccccc6)c6ccccc6n5)cc4O)c3)cc2)nc1] | 84% |
| S220 | S170 | 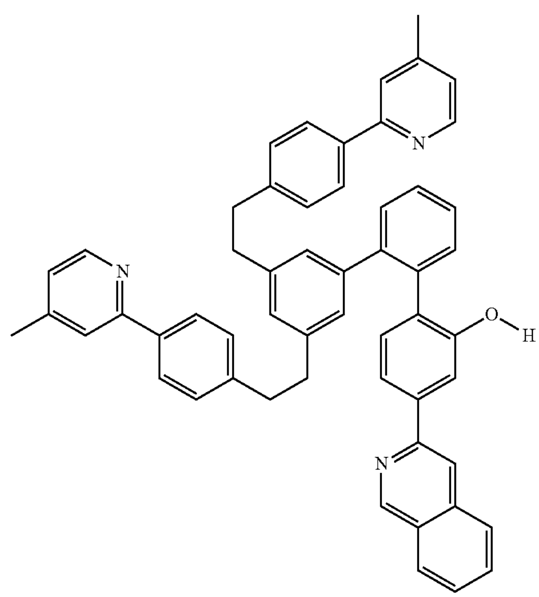 [SMILES: Cc1ccnc(-c2ccc(CCc3cc(CCc4ccc(-c5cc(C)ccn5)cc4)cc(-c4ccccc4-c4ccc(-c5cc6ccccc6cn5)cc4O)c3)cc2)c1] | 90% |

-continued
| Ex. | Reactants | Product | Yield |
|---|---|---|---|
| S221 | S171 | 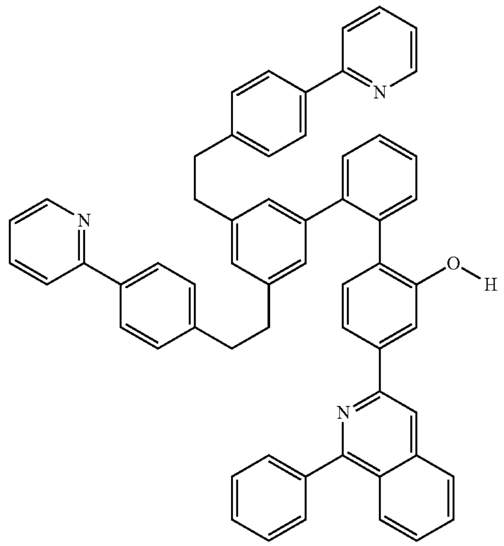 [SMILES: Oc1cc(-c2cc3ccccc3c(-c3ccccc3)n2)ccc1-c1ccccc1-c1cc(CCc2ccc(-c3ccccn3)cc2)cc(CCc2ccc(-c3ccccn3)cc2)c1] | 85% |
| S222 | S172 | 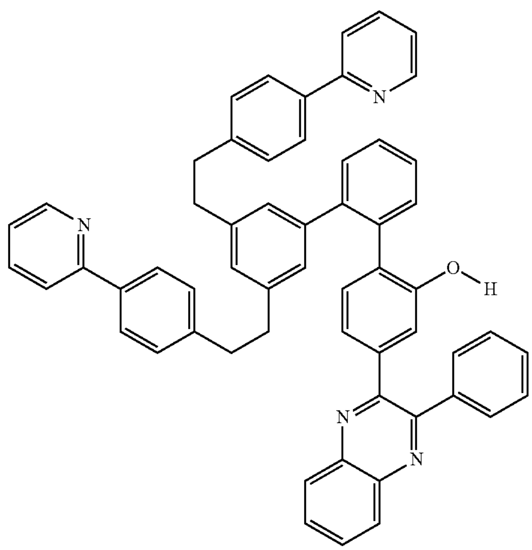 [SMILES: Oc1cc(-c2nc3ccccc3nc2-c2ccccc2)ccc1-c1ccccc1-c1cc(CCc2ccc(-c3ccccn3)cc2)cc(CCc2ccc(-c3ccccn3)cc2)c1] | 86% |
| S223 | S173 | 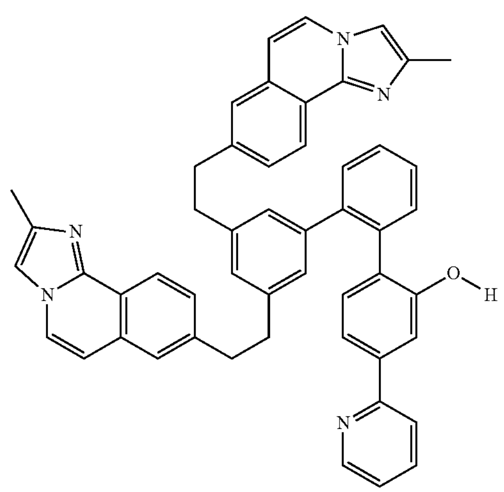 [SMILES: Cc1cn2ccc3cc(CCc4cc(CCc5ccc6c(ccn7cc(C)nc67)c5)cc(-c5ccccc5-c5ccc(-c6ccccn6)cc5O)c4)ccc3c2n1] | 85% |

-continued
| Ex. | Reactants | Product | Yield |
|---|---|---|---|
| S224 | S174 | 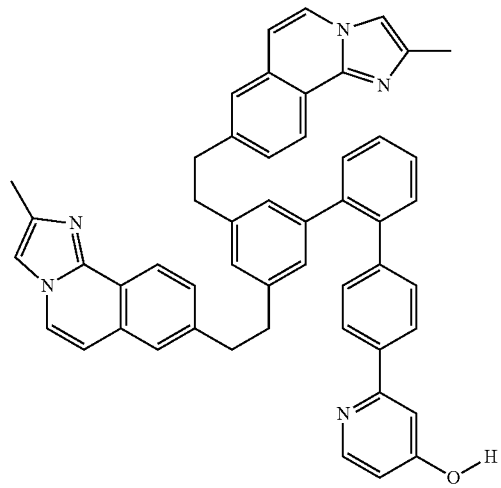 [SMILES: Cc1cn2ccc3cc(CCc4cc(CCc5ccc6c(ccn7cc(C)nc67)c5)cc(-c5ccccc5-c5ccc(-c6cc(O)ccn6)cc5)c4)ccc3c2n1] | 80% |
| S225 | S175 | 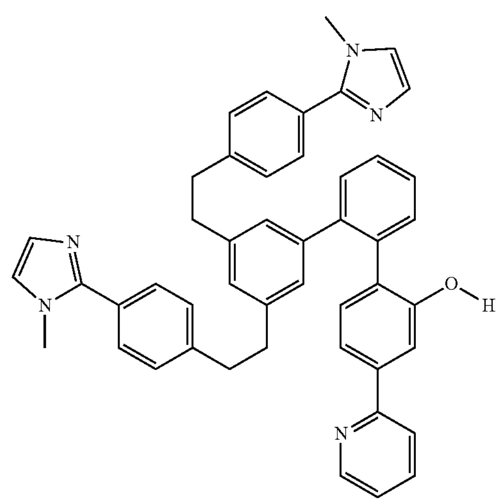 [SMILES: Cn1ccnc1-c1ccc(CCc2cc(CCc3ccc(-c4nccn4C)cc3)cc(-c3ccccc3-c3ccc(-c4ccccn4)cc3O)c2)cc1] | 83% |
| S226 | S176 | 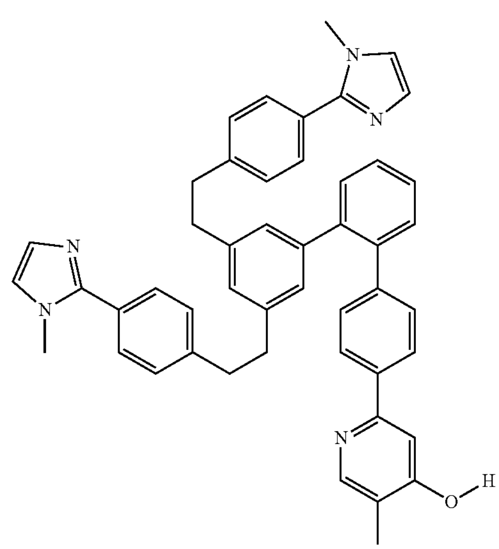 [SMILES: Cc1cnc(-c2ccc(-c3ccccc3-c3cc(CCc4ccc(-c5nccn5C)cc4)cc(CCc4ccc(-c5nccn5C)cc4)c3)cc2)cc1O] | 81% |

-continued
| Ex. | Reactants | Product | Yield |
|---|---|---|---|
| S227 | S177 | 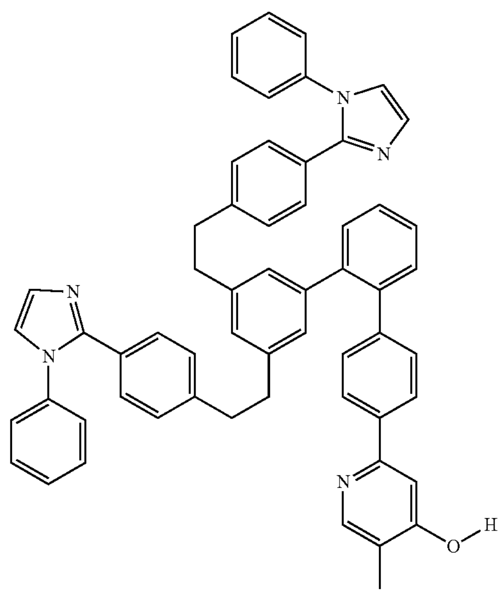 [SMILES: Cc1cnc(-c2ccc(-c3ccccc3-c3cc(CCc4ccc(-c5nccn5-c5ccccc5)cc4)cc(CCc4ccc(-c5nccn5-c5ccccc5)cc4)c3)cc2)cc1O] | 80% |
| S228 | S178 | 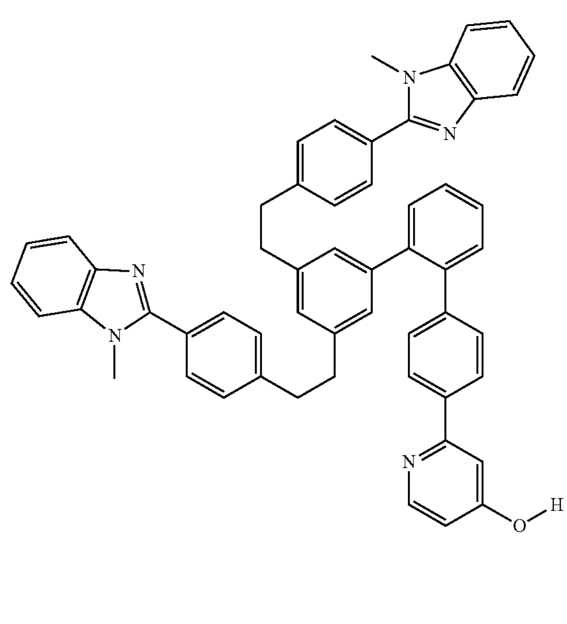 [SMILES: Cn1c(-c2ccc(CCc3cc(CCc4ccc(-c5nc6ccccc6n5C)cc4)cc(-c4ccccc4-c4ccc(-c5cc(O)ccn5)cc4)c3)cc2)nc2ccccc21] | 85% |

-continued
| Ex. | Reactants | Product | Yield |
|---|---|---|---|
| S229 | S179 | 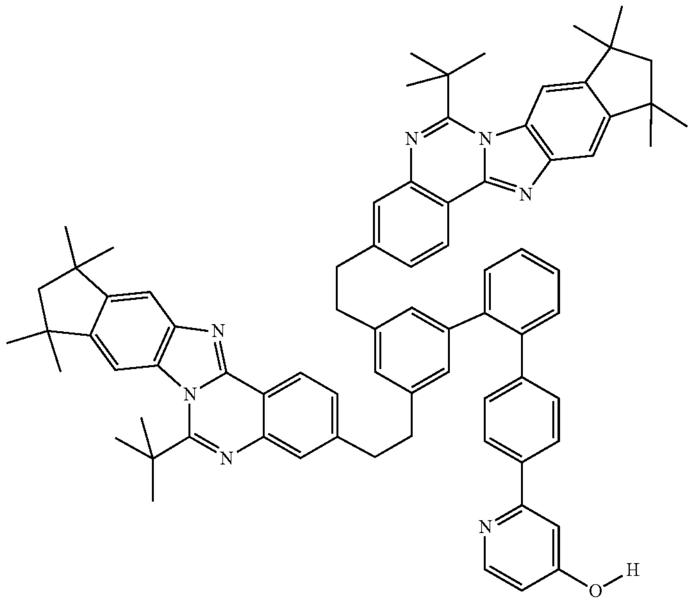 | 78% |
| S230 | S180 | 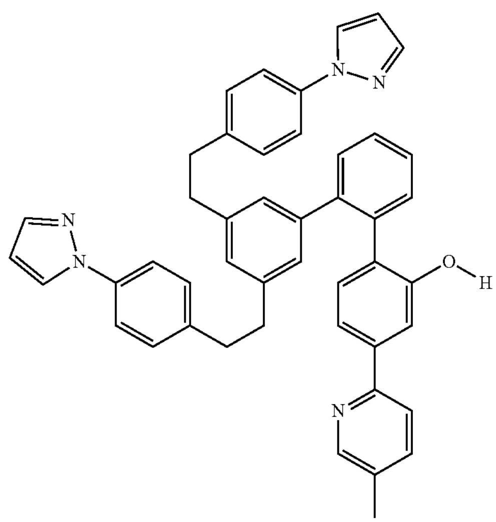 [SMILES: Cc1ccc(-c2ccc(-c3ccccc3-c3cc(CCc4ccc(-n5cccn5)cc4)cc(CCc4ccc(-n5cccn5)cc4)c3)c(O)c2)nc1] | 80% |
| S231 | S181 | 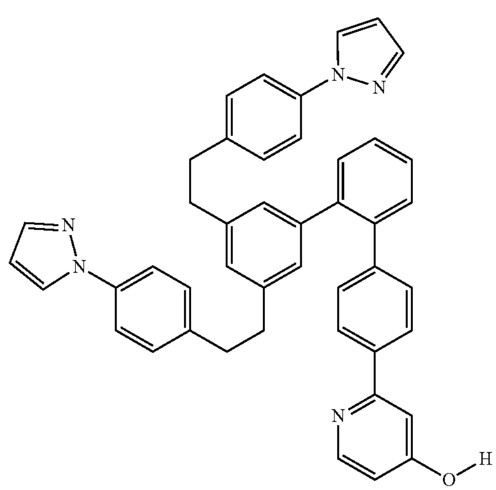 [SMILES: Oc1ccnc(-c2ccc(-c3ccccc3-c3cc(CCc4ccc(-n5cccn5)cc4)cc(CCc4ccc(-n5cccn5)cc4)c3)cc2)c1] | 85% |

-continued
| Ex. | Reactants | Product | Yield |
|---|---|---|---|
| S232 | S182 | 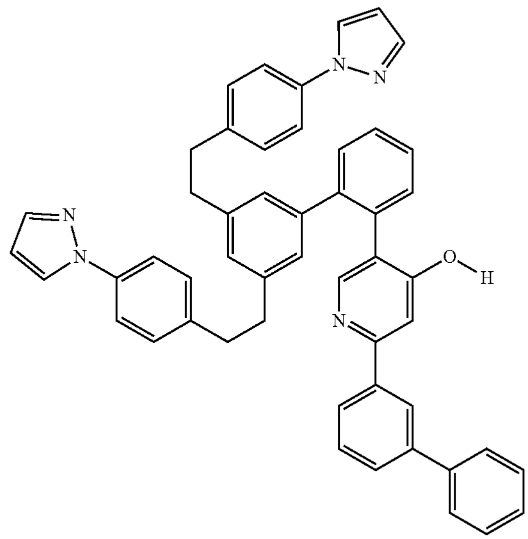 | 84% |
| S233 | S183 | 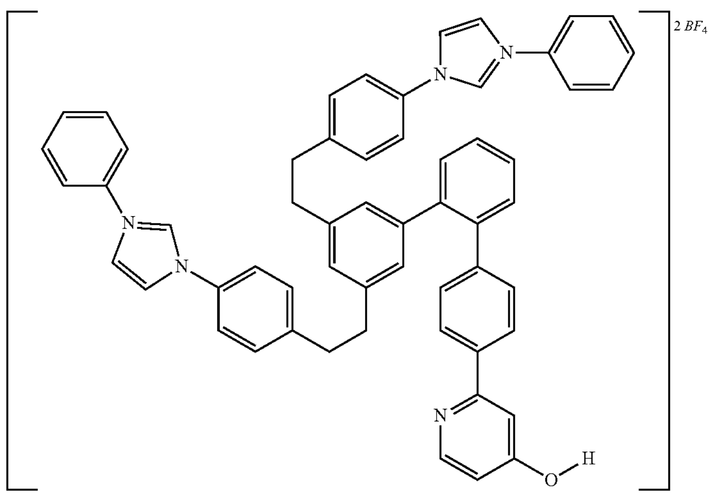 | 55% |
| S234 | S184 | 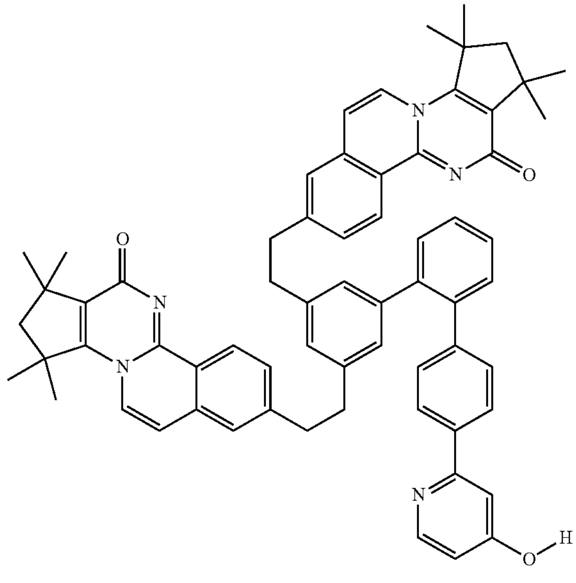 [SMILES: CC1(C)CC(C)(C)c2c1c(=O)nc1c3ccc(CCc4cc(CCc5ccc6c(ccn7c8c(c(=O)nc67)C(C)(C)CC8(C)C)c5)cc(-c5ccccc5-c5ccc(-c6cc(O)ccn6)cc5)c4)cc3ccn21] | 83% |

-continued

| Ex. | Reactants | Product | Yield |
|---|---|---|---|
| S235 | L211 | 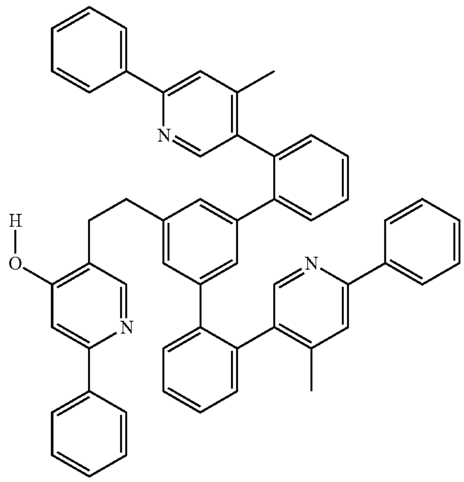 | 86% |

Example S250

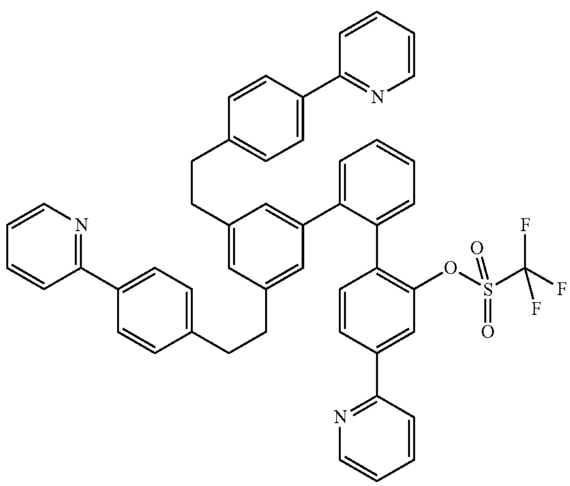 [SMILES: O=S(=O)(Oc1cc(-c2ccccn2)ccc1-c1ccccc1-c1cc(CCc2ccc(-c3ccccn3)cc2)cc(CCc2ccc(-c3ccccn3)cc2)c1)C(F)(F)F]

To a suspension of 68.6 g (100 mmol) of 3200 in 1000 ml of DCM are added, while cooling with ice at 0° C. and with good stirring, 23.7 ml (300 mmol) of pyridine and then, dropwise, 33.6 ml (200 mmol) of trifluoromethanesuifonic anhydride. The mixture is stirred at 0° C. for 1 h and then at room temperature for 4 h. The reaction solution is poured onto 3 l of ice-water and stirred for a further 15 min, the organic phase is removed, washed once with 300 ml of ice-water and once with 300 ml of saturated sodium chloride solution and dried over magnesium sulfate, the desiccant is filtered off, the filtrate is concentrated to dryness and the foam is recrystallized from ethyl acetate at boiling. Yield: 57.3 g (70 mmol), 70%; purity: about 95% by $^{1}H$ NMR.

in an analogous manner, it is possible to prepare the following compounds:

| Ex. | Reactant | Product | Yield |
|---|---|---|---|
| S251 | S201 | 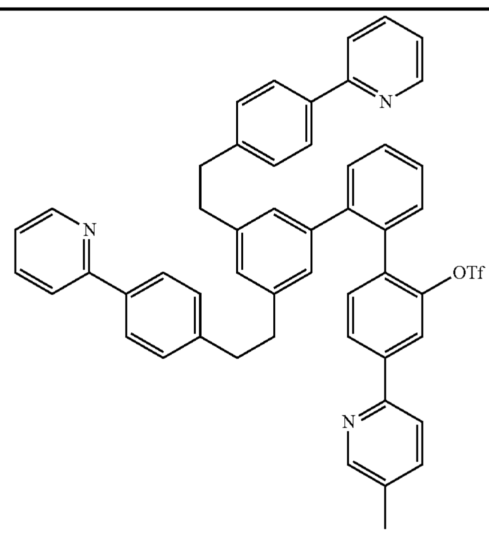 | 68% |

-continued
| Ex. | Reactant | Product | Yield |
|---|---|---|---|
| S252 | S202 | 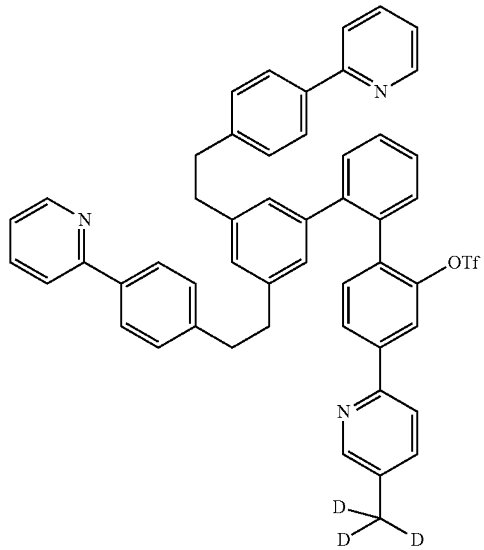 [SMILES: [2H]C([2H])([2H])c1ccc(-c2ccc(-c3ccccc3-c3cc(CCc4ccc(-c5ccccn5)cc4)cc(CCc4ccc(-c5ccccn5)cc4)c3)c(OS(=O)(=O)C(F)(F)F)c2)nc1] | 65% |
| S253 | S203 | 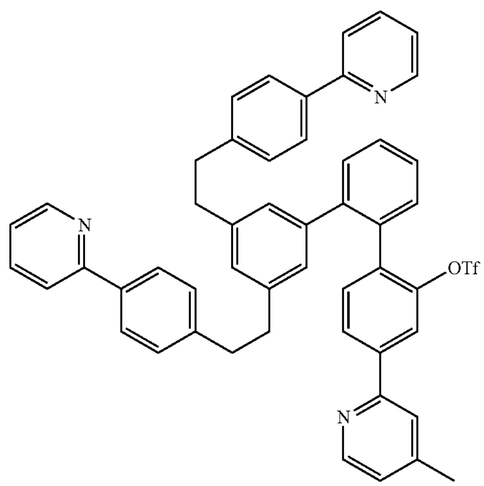 [SMILES: Cc1ccnc(-c2ccc(-c3ccccc3-c3cc(CCc4ccc(-c5ccccn5)cc4)cc(CCc4ccc(-c5ccccn5)cc4)c3)c(OS(=O)(=O)C(F)(F)F)c2)c1] | 707% |
| S254 | S204 | 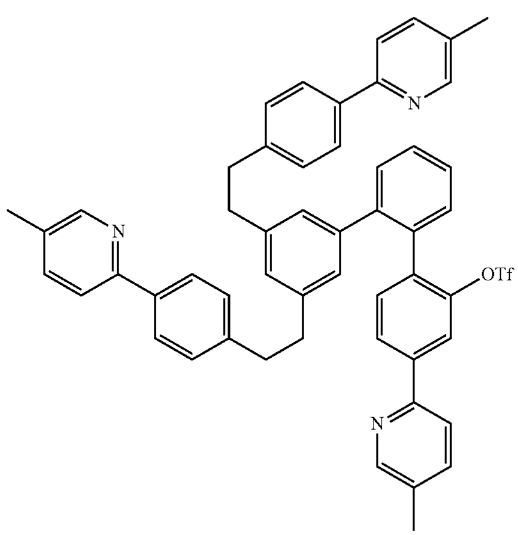 [SMILES: Cc1ccc(-c2ccc(CCc3cc(CCc4ccc(-c5ccc(C)cn5)cc4)cc(-c4ccccc4-c4ccc(-c5ccc(C)cn5)cc4OS(=O)(=O)C(F)(F)F)c3)cc2)nc1] | 71% |

-continued
| Ex. | Reactant | Product | Yield |
|---|---|---|---|
| S255 | S205 | 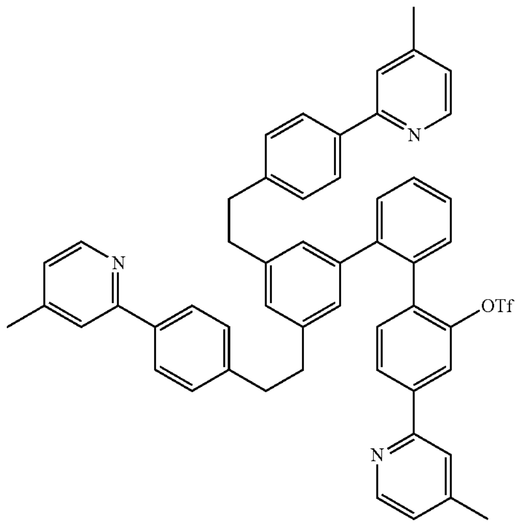 [SMILES: Cc1ccnc(-c2ccc(CCc3cc(CCc4ccc(-c5cc(C)ccn5)cc4)cc(-c4ccccc4-c4ccc(-c5cc(C)ccn5)cc4OS(=O)(=O)C(F)(F)F)c3)cc2)c1] | 68% |
| S256 | S206 | 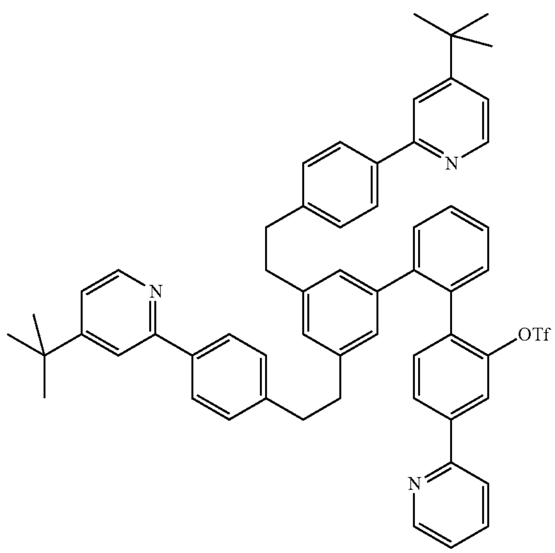 [SMILES: CC(C)(C)c1ccnc(-c2ccc(CCc3cc(CCc4ccc(-c5cc(C(C)(C)C)ccn5)cc4)cc(-c4ccccc4-c4ccc(-c5ccccn5)cc4OS(=O)(=O)C(F)(F)F)c3)cc2)c1] | 67% |
| S257 | S207 | 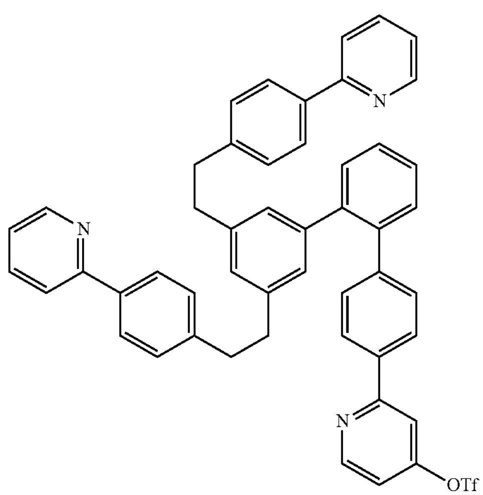 [SMILES: O=S(=O)(Oc1ccnc(-c2ccc(-c3ccccc3-c3cc(CCc4ccc(-c5ccccn5)cc4)cc(CCc4ccc(-c5ccccn5)cc4)c3)cc2)c1)C(F)(F)F] | 69% |

-continued
| Ex. | Reactant | Product | Yield |
|---|---|---|---|
| S258 | S208 | 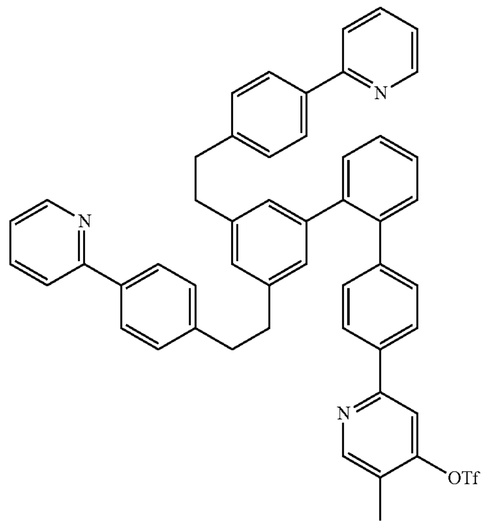 [SMILES: Cc1cnc(-c2ccc(-c3ccccc3-c3cc(CCc4ccc(-c5ccccn5)cc4)cc(CCc4ccc(-c5ccccn5)cc4)c3)cc2)cc1OS(=O)(=O)C(F)(F)F] | 70% |
| S259 | S209 | 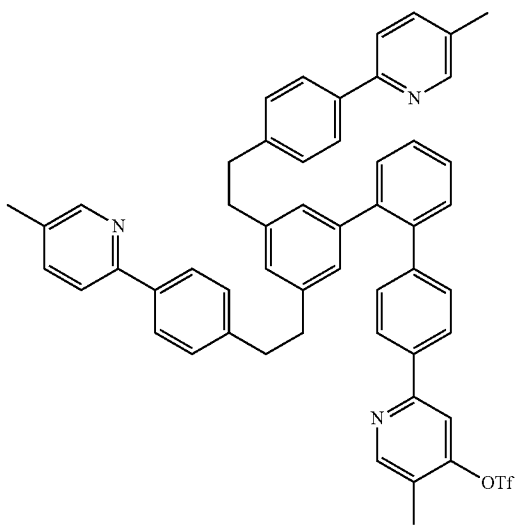 [SMILES: Cc1ccc(-c2ccc(CCc3cc(CCc4ccc(-c5ccc(C)cn5)cc4)cc(-c4ccccc4-c4ccc(-c5cc(OS(=O)(=O)C(F)(F)F)c(C)cn5)cc4)c3)cc2)nc1] | 68% |
| S260 | S210 | 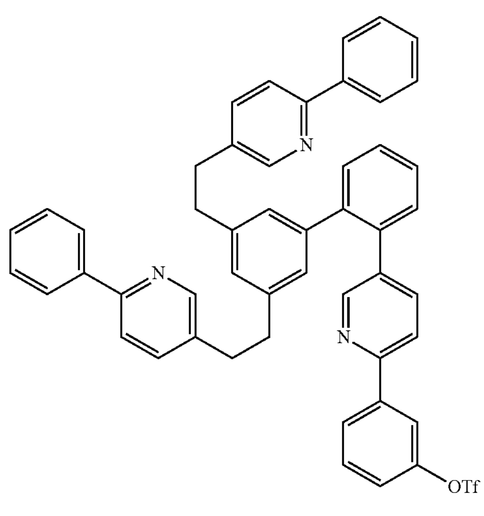 [SMILES: O=S(=O)(Oc1cccc(-c2ccc(-c3ccccc3-c3cc(CCc4ccc(-c5ccccc5)nc4)cc(CCc4ccc(-c5ccccc5)nc4)c3)cn2)c1)C(F)(F)F] | 70% |

-continued
| Ex. | Reactant | Product | Yield |
|---|---|---|---|
| S261 | S211 | 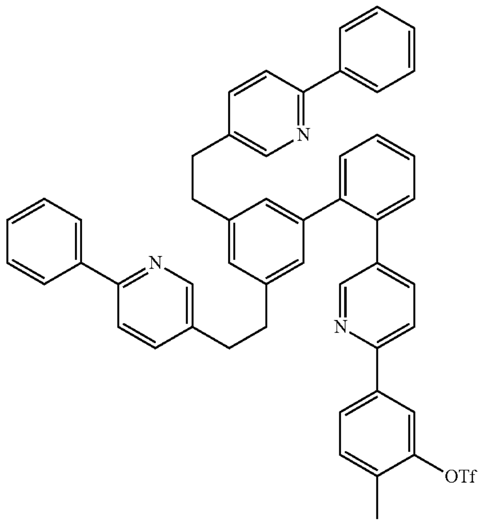 [SMILES: Cc1ccc(-c2ccc(-c3ccccc3-c3cc(CCc4ccc(-c5ccccc5)nc4)cc(CCc4ccc(-c5ccccc5)nc4)c3)cn2)cc1OS(=O)(=O)C(F)(F)F] | 64% |
| S262 | S212 | 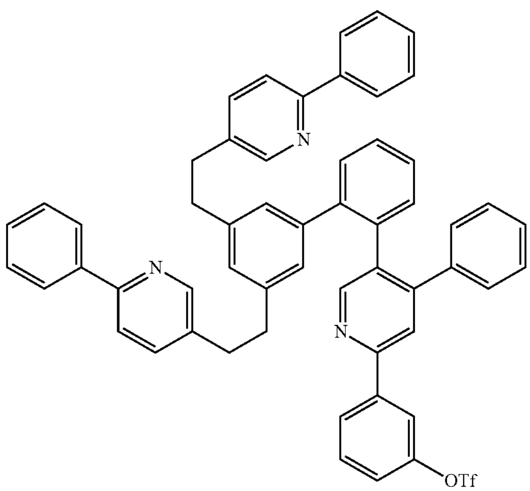 | 66% |
| S263 | S213 | 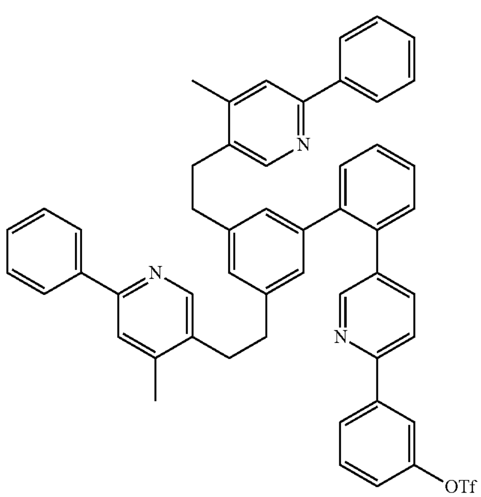 [SMILES: Cc1cc(-c2ccccc2)ncc1CCc1cc(CCc2cnc(-c3ccccc3)cc2C)cc(-c2ccccc2-c2ccc(-c3cccc(OS(=O)(=O)C(F)(F)F)c3)nc2)c1] | 69% |

-continued
| Ex. | Reactant | Product | Yield |
|---|---|---|---|
| S264 | S214 | 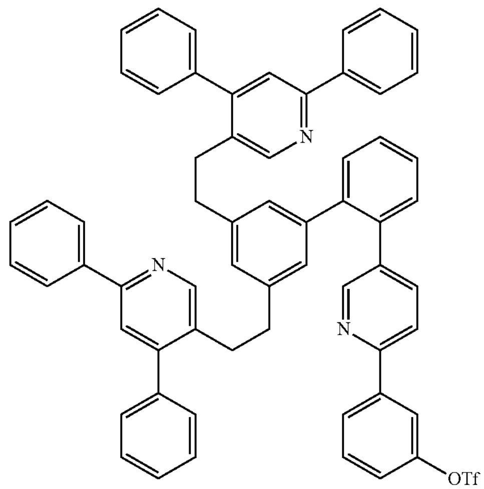 [SMILES: O=S(=O)(Oc1cccc(-c2ccc(-c3ccccc3-c3cc(CCc4cnc(-c5ccccc5)cc4-c4ccccc4)cc(CCc4cnc(-c5ccccc5)cc4-c4ccccc4)c3)cn2)c1)C(F)(F)F] | 67% |
| S265 | S215 | 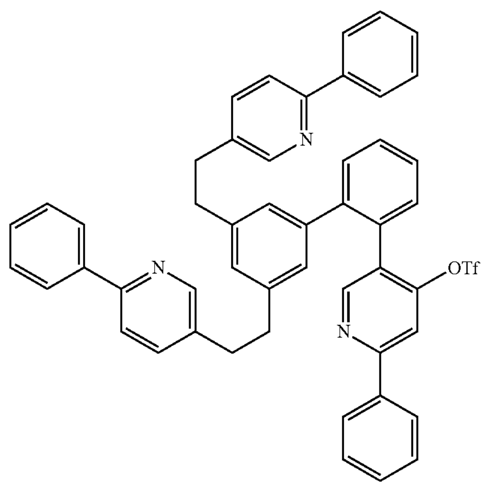 [SMILES: O=S(=O)(Oc1cc(-c2ccccc2)ncc1-c1ccccc1-c1cc(CCc2ccc(-c3ccccc3)nc2)cc(CCc2ccc(-c3ccccc3)nc2)c1)C(F)(F)F] | 70% |
| S266 | S216 | 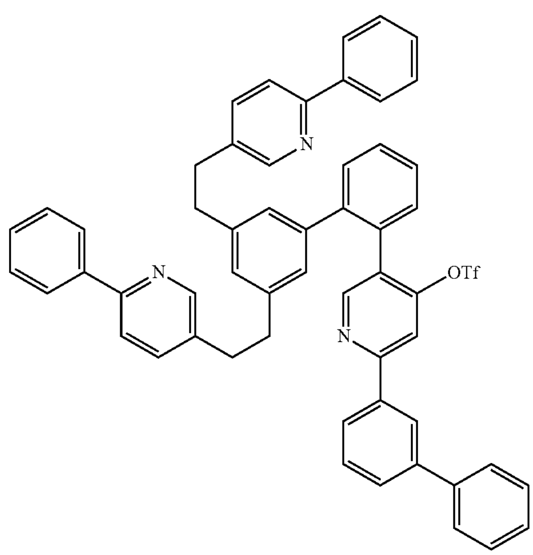 [SMILES: O=S(=O)(Oc1cc(-c2cccc(-c3ccccc3)c2)ncc1-c1ccccc1-c1cc(CCc2ccc(-c3ccccc3)nc2)cc(CCc2ccc(-c3ccccc3)nc2)c1)C(F)(F)F] | 70% |

-continued
| Ex. | Reactant | Product | Yield |
|---|---|---|---|
| S267 | S217 | 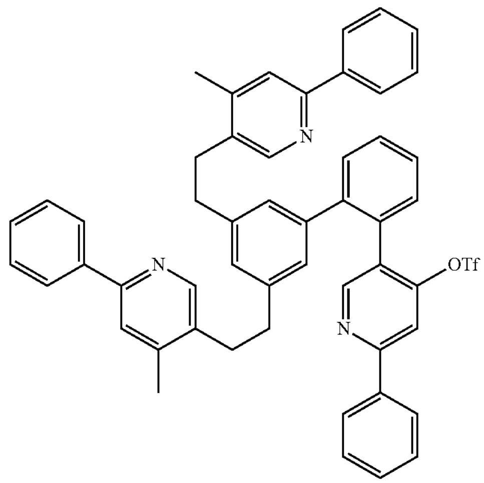 [SMILES: Cc1cc(-c2ccccc2)ncc1CCc1cc(CCc2cnc(-c3ccccc3)cc2C)cc(-c2ccccc2-c2cnc(-c3ccccc3)cc2OS(=O)(=O)C(F)(F)F)c1] | 68% |
| S268 | S218 | 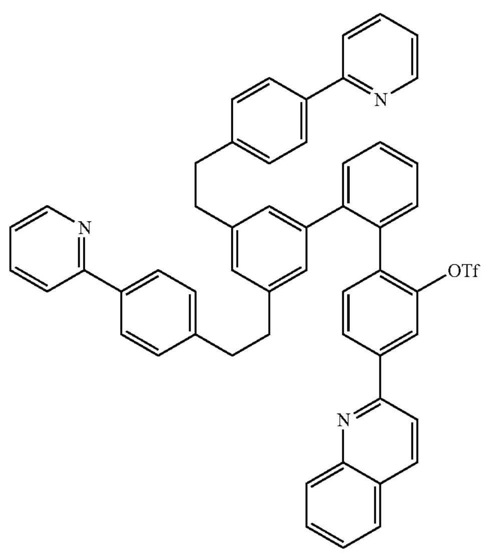 [SMILES: O=S(=O)(Oc1cc(-c2ccc3ccccc3n2)ccc1-c1ccccc1-c1cc(CCc2ccc(-c3ccccn3)cc2)cc(CCc2ccc(-c3ccccn3)cc2)c1)C(F)(F)F] | 65% |
| S269 | S219 | 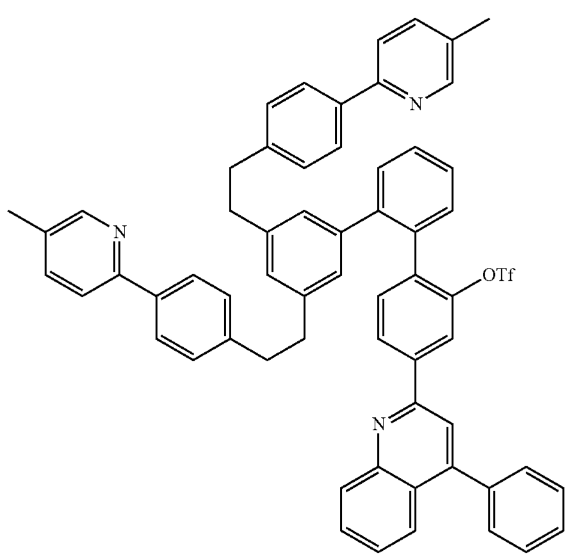 [SMILES: Cc1ccc(-c2ccc(CCc3cc(CCc4ccc(-c5ccc(C)cn5)cc4)cc(-c4ccccc4-c4ccc(-c5cc(-c6ccccc6)c6ccccc6n5)cc4OS(=O)(=O)C(F)(F)F)c3)cc2)nc1] | 64% |

-continued
| Ex. | Reactant | Product | Yield |
|---|---|---|---|
| S270 | S220 | 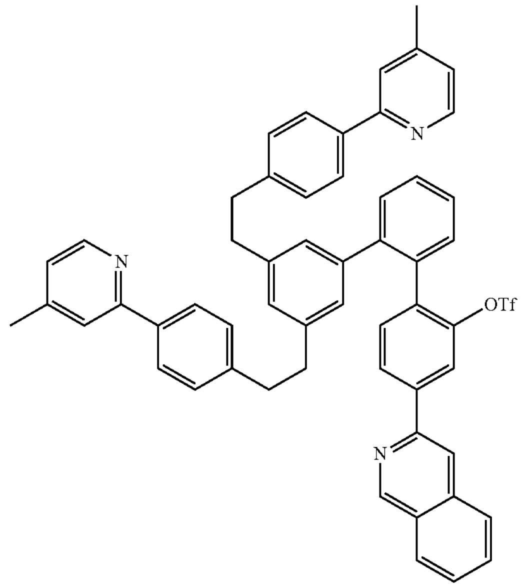 [SMILES: Cc1ccnc(-c2ccc(CCc3cc(CCc4ccc(-c5cc(C)ccn5)cc4)cc(-c4ccccc4-c4ccc(-c5cc6ccccc6cn5)cc4OS(=O)(=O)C(F)(F)F)c3)cc2)c1] | 69% |
| S271 | S221 | 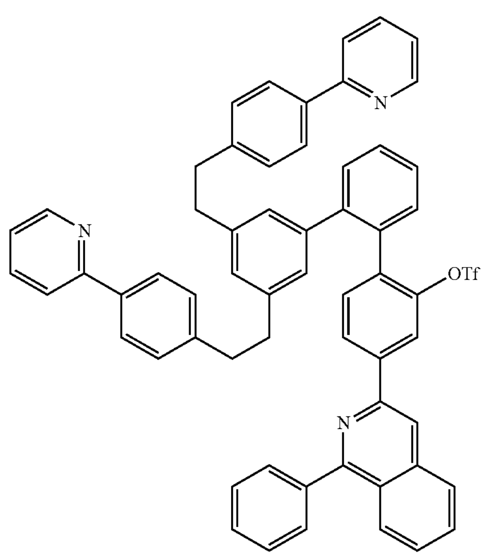 [SMILES: O=S(=O)(Oc1cc(-c2cc3ccccc3c(-c3ccccc3)n2)ccc1-c1ccccc1-c1cc(CCc2ccc(-c3ccccn3)cc2)cc(CCc2ccc(-c3ccccn3)cc2)c1)C(F)(F)F] | 65% |

-continued
| Ex. | Reactant | Product | Yield |
| --- | --- | --- | --- |
| S272 | S222 | 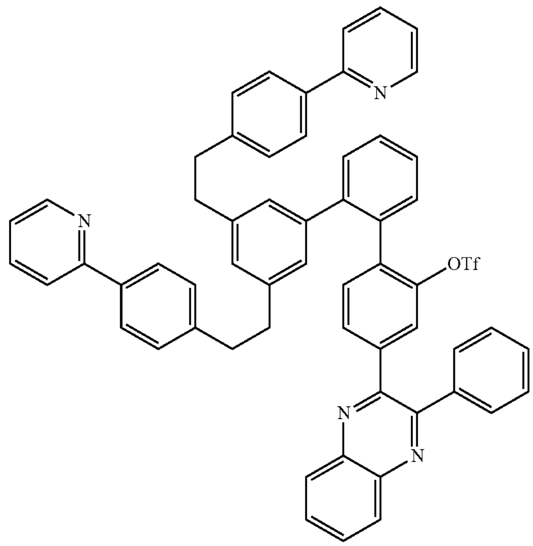 [SMILES: O=S(=O)(Oc1cc(-c2nc3ccccc3nc2-c2ccccc2)ccc1-c1ccccc1-c1cc(CCc2ccc(-c3ccccn3)cc2)cc(CCc2ccc(-c3ccccn3)cc2)c1)C(F)(F)F] | 70% |
| S273 | S223 | 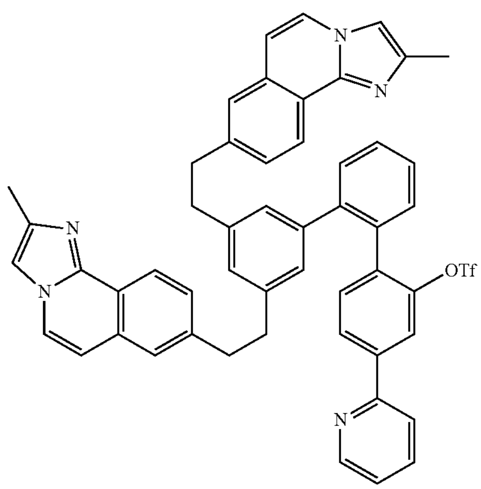 [SMILES: Cc1cn2ccc3cc(CCc4cc(CCc5ccc6c(ccn7cc(C)nc67)c5)cc(-c5ccccc5-c5ccc(-c6ccccn6)cc5OS(=O)(=O)C(F)(F)F)c4)ccc3c2n1] | 73% |
| S274 | S224 | 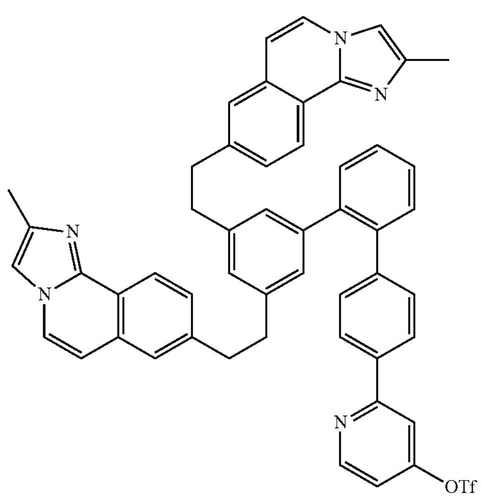 [SMILES: Cc1cn2ccc3cc(CCc4cc(CCc5ccc6c(ccn7cc(C)nc67)c5)cc(-c5ccccc5-c5ccc(-c6cc(OS(=O)(=O)C(F)(F)F)ccn6)cc5)c4)ccc3c2n1] | 69% |

-continued
| Ex. | Reactant | Product | Yield |
| --- | --- | --- | --- |
| S275 | S225 | 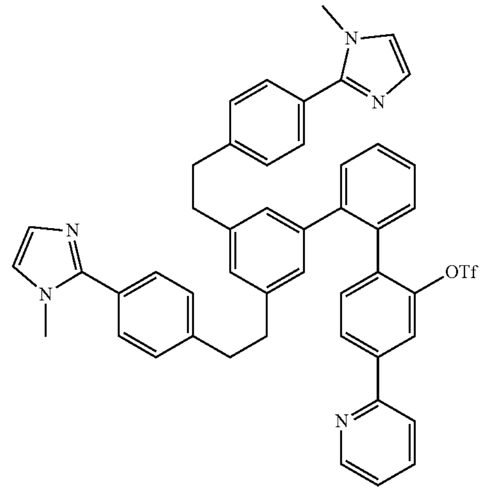 [SMILES: Cn1ccnc1-c1ccc(CCc2cc(CCc3ccc(-c4nccn4C)cc3)cc(-c3ccccc3-c3ccc(-c4ccccn4)cc3OS(=O)(=O)C(F)(F)F)c2)cc1] | 68% |
| S276 | S226 | 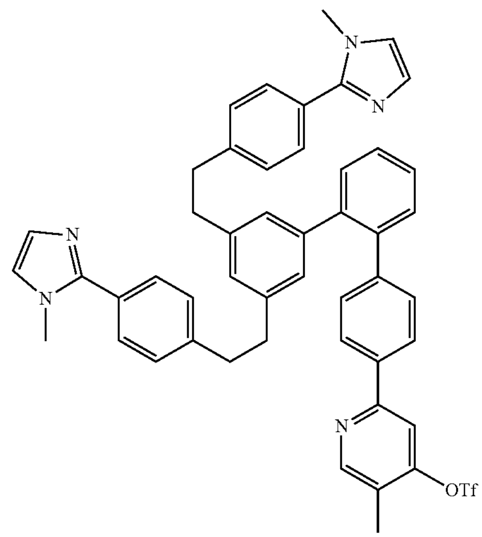 [SMILES: Cc1cnc(-c2ccc(-c3ccccc3-c3cc(CCc4ccc(-c5nccn5C)cc4)cc(CCc4ccc(-c5nccn5C)cc4)c3)cc2)cc1OS(=O)(=O)C(F)(F)F] | 72% |
| S277 | S227 | 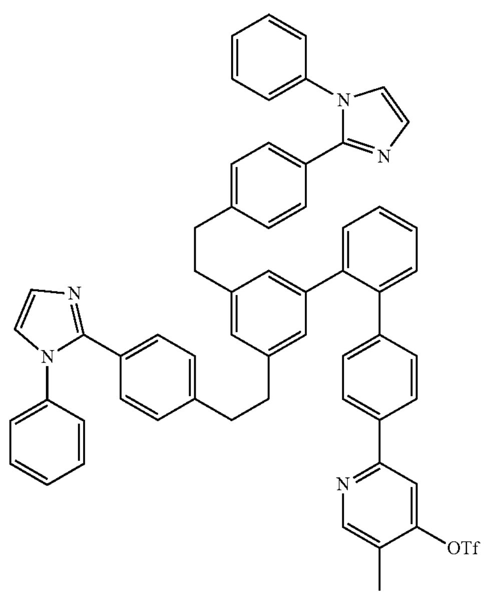 [SMILES: Cc1cnc(-c2ccc(-c3ccccc3-c3cc(CCc4ccc(-c5nccn5-c5ccccc5)cc4)cc(CCc4ccc(-c5nccn5-c5ccccc5)cc4)c3)cc2)cc1OS(=O)(=O)C(F)(F)F] | 70% |

-continued
| Ex. | Reactant | Product | Yield |
|---|---|---|---|
| S278 | S228 | 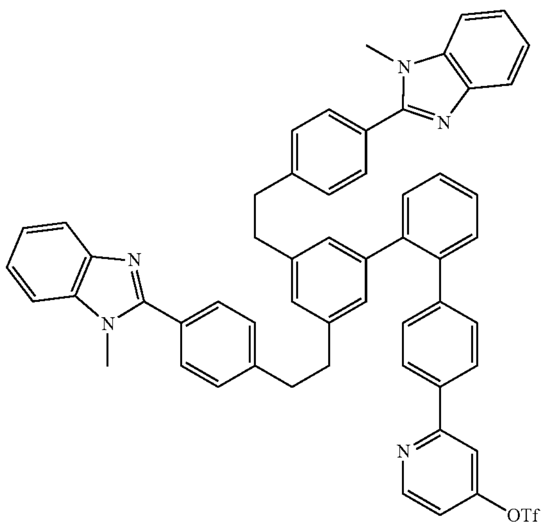 [SMILES: Cn1c(-c2ccc(CCc3cc(CCc4ccc(-c5nc6ccccc6n5C)cc4)cc(-c4ccccc4-c4ccc(-c5cc(OS(=O)(=O)C(F)(F)F)ccn5)cc4)c3)cc2)nc2ccccc21] | 65% |
| S279 | S229 | 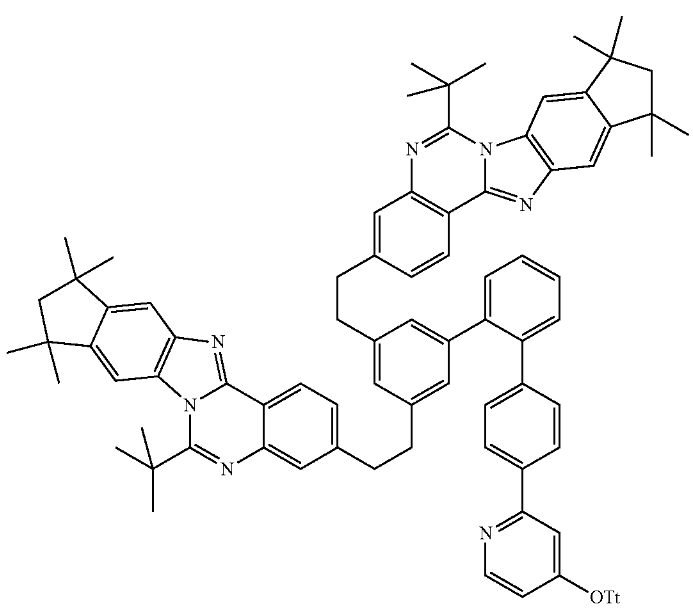 | 65% |

-continued
| Ex. | Reactant | Product | Yield |
|---|---|---|---|
| S280 | S230 | 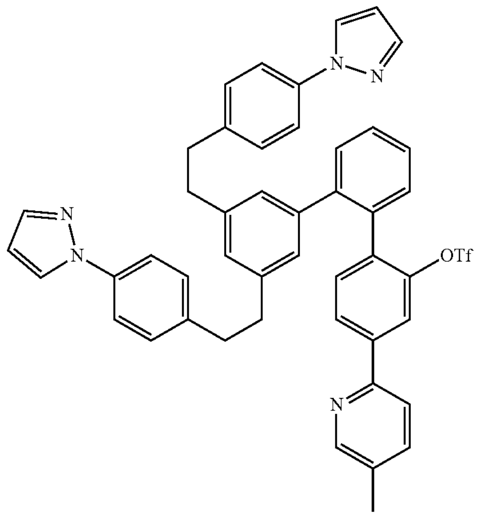 [SMILES: Cc1ccc(-c2ccc(-c3ccccc3-c3cc(CCc4ccc(-n5cccn5)cc4)cc(CCc4ccc(-n5cccn5)cc4)c3)c(OS(=O)(=O)C(F)(F)F)c2)nc1] | 68% |
| S281 | S231 | 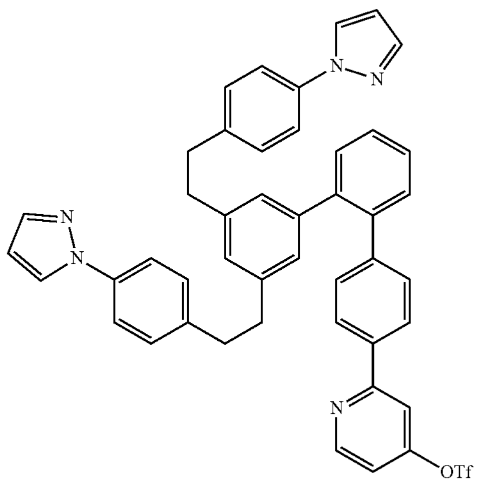 [SMILES: O=S(=O)(Oc1ccnc(-c2ccc(-c3ccccc3-c3cc(CCc4ccc(-n5cccn5)cc4)cc(CCc4ccc(-n5cccn5)cc4)c3)cc2)c1)C(F)(F)F] | 67% |
| S282 | S232 | 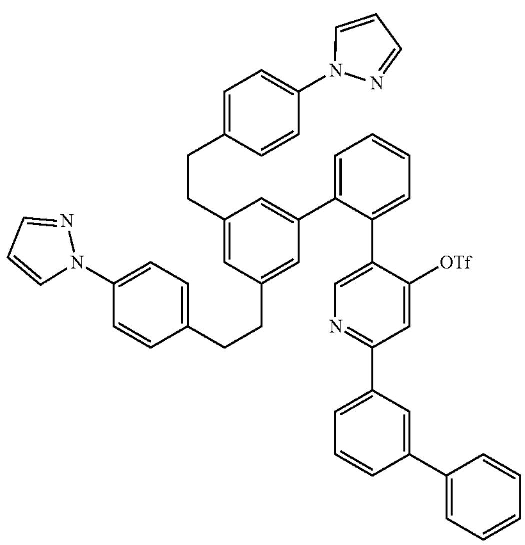 [SMILES: O=S(=O)(Oc1cc(-c2cccc(-c3ccccc3)c2)ncc1-c1ccccc1-c1cc(CCc2ccc(-n3cccn3)cc2)cc(CCc2ccc(-n3cccn3)cc2)c1)C(F)(F)F] | 90% |

-continued
| Ex. | Reactant | Product | Yield |
| --- | --- | --- | --- |
| S283 | S233 | 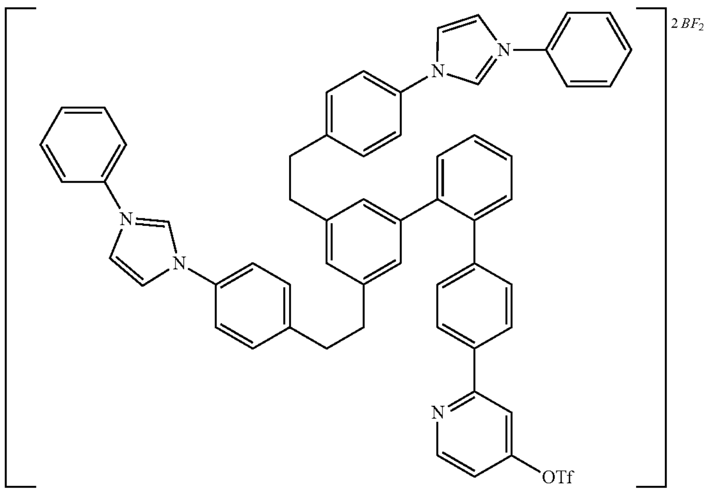  | 60% |
| S284 | S234 | 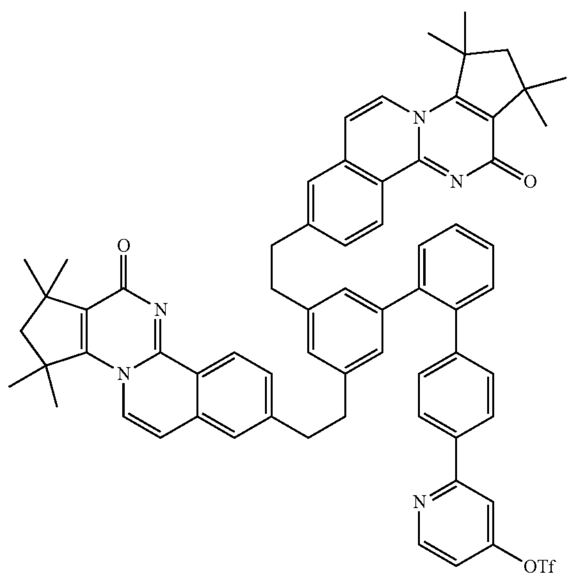  | 63% |
| S285 | S235 | 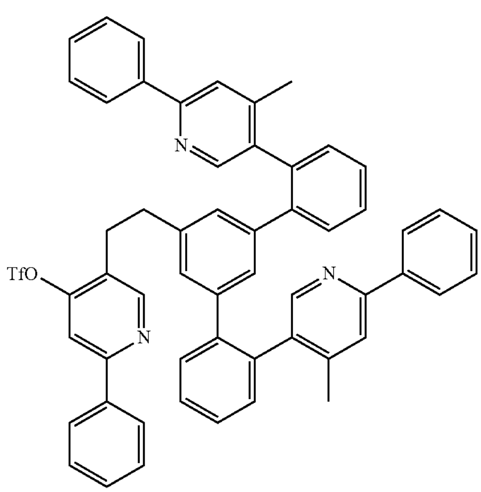 [SMILES: Cc1cc(-c2ccccc2)ncc1-c1ccccc1-c1cc(CCc2cnc(-c3ccccc3)cc2OS(=O)(=O)C(F)(F)F)cc(-c2ccccc2-c2cnc(-c3ccccc3)cc2C)c1]  | 70% |

Example S300

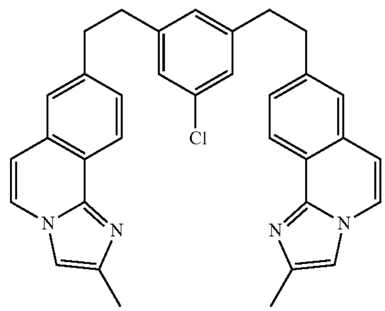 [SMILES: Cc1cn2ccc3cc(CCc4cc(Cl)cc(CCc5ccc6c(ccn7cc(C)nc67)c5)c4)ccc3c2n1]

A well-stirred mixture of 52.2 g (200 mmol) of S400, 16.1 g (100 mmol) of 1-chloro-3,5-ethynylbenzene [1378482-52-0], 56 ml (400 mmol) of triethylamine, 3.8 g (20 mmol) of copper(I) iodide, 898 mg (4 mmol) of tetrakis(triphenylphosphino)palladium(0) and 500 ml of DMF is stirred at 70° C. for 8 h. The triethylammonium hydrobromide formed is filtered out of the still-warm mixture and washed once with 50 ml of DMF. The filtrate is concentrated to dryness, the residue is taken up in 1000 ml of ethyl acetate, and the organic phase is washed three times with 200 ml each time of 20% by weight ammonia solution, three times with 200 ml each time of water and once with 200 ml of saturated sodium chloride solution, and dried over magnesium sulfate. The mixture is filtered through a Celite bed in the form of an ethyl acetate slurry and the solvent is removed under reduced pressure. The solids thus obtained are extracted once by stirring with 150 ml of methanol and then dried under reduced pressure. The solids are hydrogenated in a mixture of 300 ml of THF and 300 ml of MeOH with addition of 3 g of palladium (5%) on charcoal and 16.1 g (300 mmol) of $NH_4Cl$ at 40° C. under a 3 bar hydrogen atmosphere until uptake of hydrogen has ended (about 12 h). The catalyst is filtered off using a Celite bed in the form of a THF slurry, the solvent is removed under reduced pressure and the residue is flash-chromatographed using an automated column system (CombiFlashTorrent from A Semrau). Yield: 36.1 g (68 mmol), 68%; purity: about 97% by $^1H$ NMR.

The bisalkyne can also be hydrogenated according to S. P. Cummings et al., J. Am. Chem. Soc., 138, 6107, 2016.

Analogously, the intermediate bisalkyne can also be deuterated using deuterium, $H_3COD$ and $ND_4Cl$, in which case, rather than the —$CH_2$—$CH_2$— bridges, —$CD_2$-$CD_2$- bridges are obtained.

In an analogous manner, it is possible to prepare the following compounds:

| Ex. | Reactant | Product | Yield |
|---|---|---|---|
| S301 | S401 | 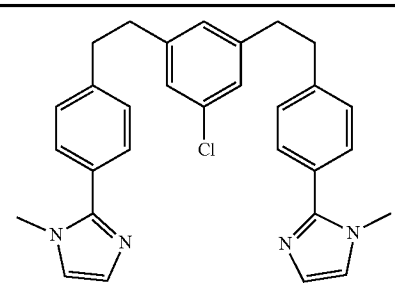 | 63% |
| S302 | S402 | 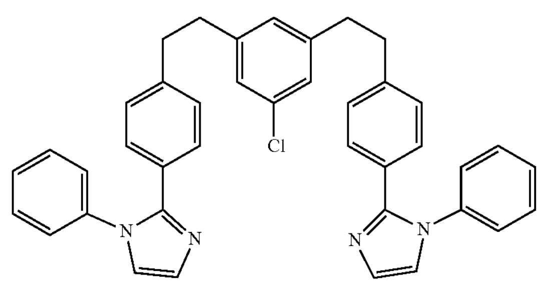 [SMILES: Clc1cc(CCc2ccc(-c3nccn3-c3ccccc3)cc2)cc(CCc2ccc(-c3nccn3-c3ccccc3)cc2)c1] | 66% |
| S303 | S403 | 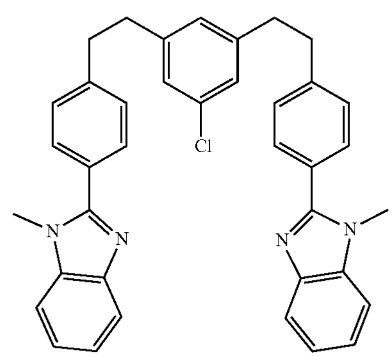 | 56% |

-continued
| Ex. | Reactant | Product | Yield |
|---|---|---|---|
| S304 | S404 | 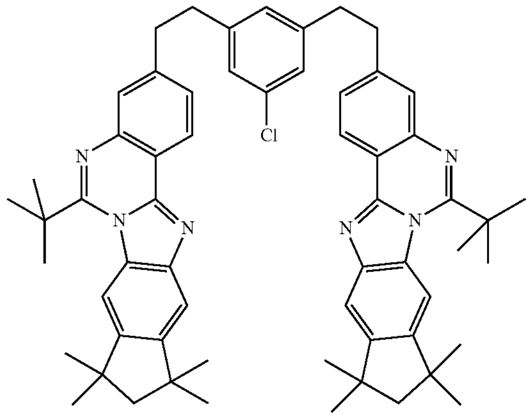 [SMILES: CC(C)(C)c1nc2cc(CCc3cc(Cl)cc(CCc4ccc5c(c4)nc(C(C)(C)C)n4c6cc7c(cc6nc54)C(C)(C)CC7(C)C)c3)ccc2c2nc3cc4c(cc3n12)C(C)(C)CC4(C)C] | 59% |
| S305 | S405 | 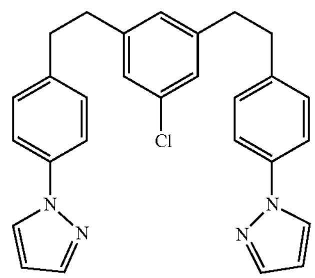 [SMILES: Clc1cc(CCc2ccc(-n3cccn3)cc2)cc(CCc2ccc(-n3cccn3)cc2)c1] | 67% |
| S306 | S406 | 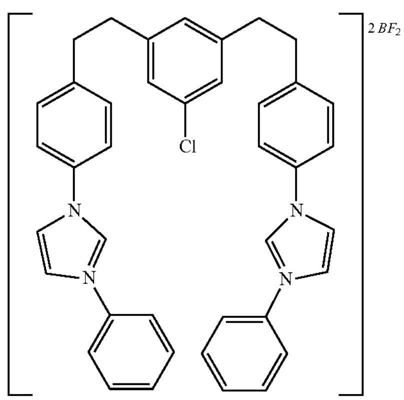 | 27% |
| S307 | S407 | 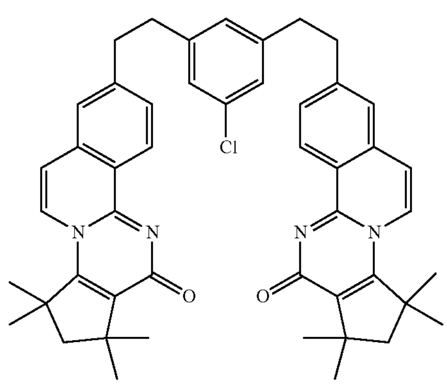 | 55% |

-continued
| Ex. | Reactant | Product | Yield |
|---|---|---|---|
| S308 | 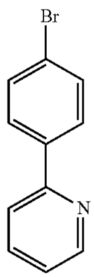 [63996-36-1] | 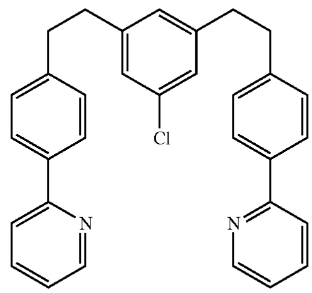 [SMILES: Clc1cc(CCc2ccc(-c3ccccn3)cc2)cc(CCc2ccc(-c3ccccn3)cc2)c1] | 60% |
| S309 | 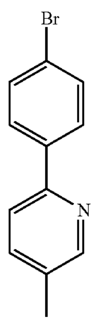 [113744-24-4] | 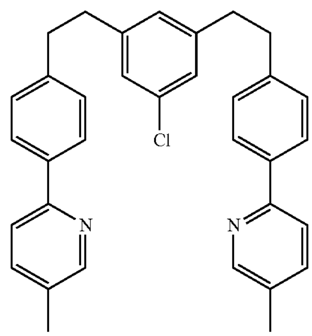 [SMILES: Cc1ccc(-c2ccc(CCc3cc(Cl)cc(CCc4ccc(-c5ccc(C)cn5)cc4)c3)cc2)nc1] | 63% |
| S310 | 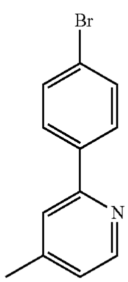 [656257-50-0] | 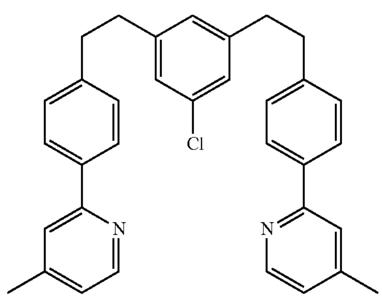 | 67% |
| S311 | 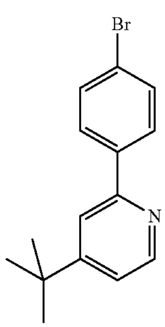 [1246851-70-6] | 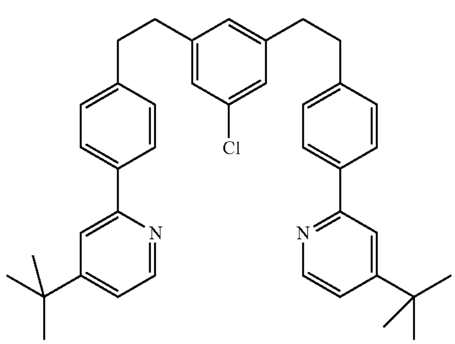 [SMILES: CC(C)(C)c1ccnc(-c2ccc(CCc3cc(Cl)cc(CCc4ccc(-c5cc(C(C)(C)C)ccn5)cc4)c3)cc2)c1] | 63% |

-continued
| Ex. | Reactant | Product | Yield |
|---|---|---|---|
| S312 | 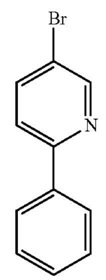 [27012-25-5] | 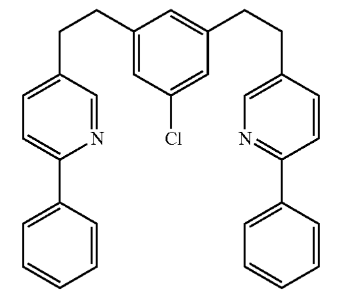 [SMILES: Clc1cc(CCc2ccc(-c3ccccc3)nc2)cc(CCc2ccc(-c3ccccc3)nc2)c1] | 64% |
| S312-D8 | 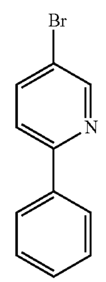 [27012-25-5] | 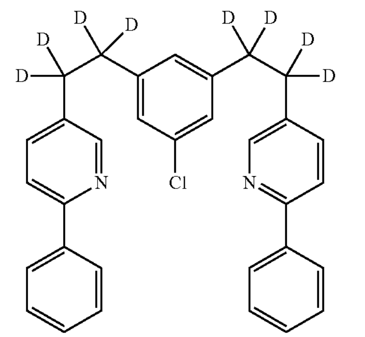 [SMILES: [2H]C([2H])(c1ccc(-c2ccccc2)nc1)C([2H])([2H])c1cc(Cl)cc(C([2H])([2H])C([2H])([2H])c2ccc(-c3ccccc3)nc2)c1] | 70% |
| S313 | 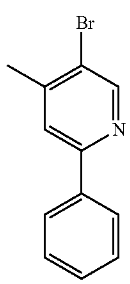 [31686-64-3] | 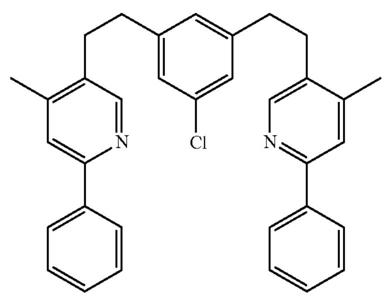 | 51% |
| S313-D8 | 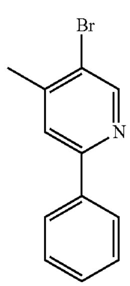 [31686-64-3] | 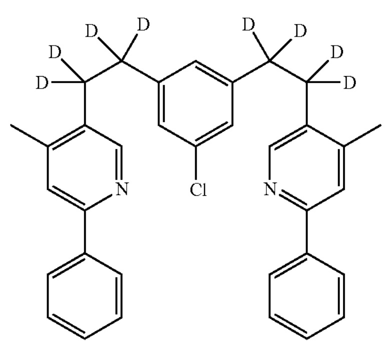 | 55% |

-continued
| Ex. | Reactant | Product | Yield |
|---|---|---|---|
| S314 | 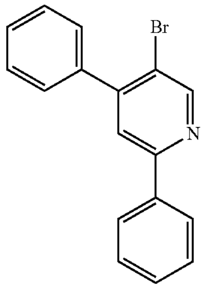 [1989596-06-6] | 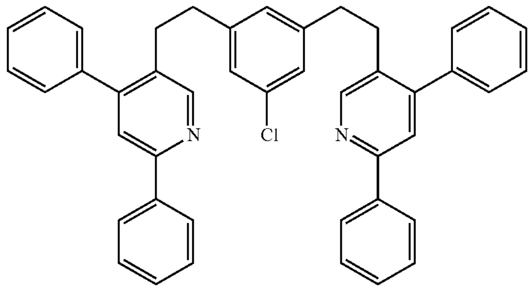 [SMILES: Clc1cc(CCc2cnc(-c3ccccc3)cc2-c2ccccc2)cc(CCc2cnc(-c3ccccc3)cc2-c2ccccc2)c1] | 46% |
| S315 | S408 | 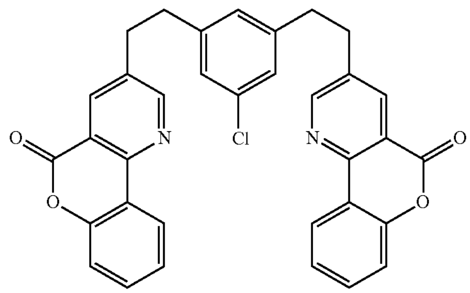 [SMILES: O=c1oc2ccccc2c2ncc(CCc3cc(Cl)cc(CCc4cnc5c(c4)c(=O)oc4ccccc45)c3)cc12] | 28% |
| S315-D8 | S408 | 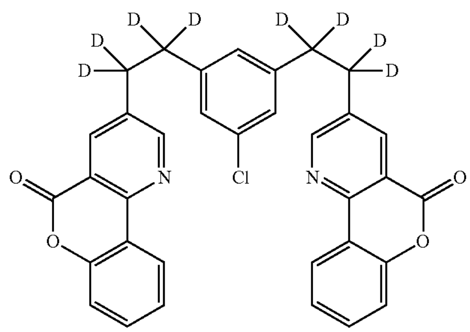 [SMILES: [2H]C([2H])(c1cc(Cl)cc(C([2H])([2H])C([2H])([2H])c2cnc3c(c2)c(=O)oc2ccccc23)c1)C([2H])([2H])c1cnc2c(c1)c(=O)oc1ccccc12] | 32% |
| S316 | S409 | 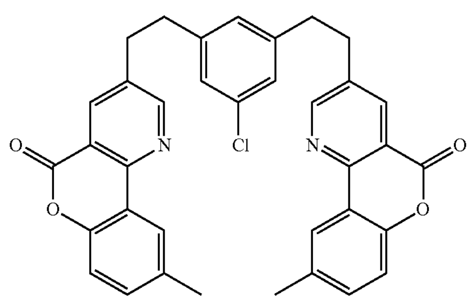 [SMILES: Cc1ccc2oc(=O)c3cc(CCc4cc(Cl)cc(CCc5cnc6c(c5)c(=O)oc5ccc(C)cc56)c4)cnc3c2c1] | 33% |
| S317 | S410 | 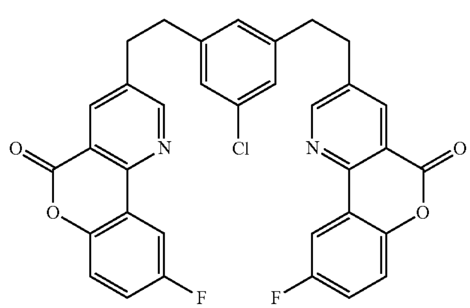 [SMILES: O=c1oc2ccc(F)cc2c2ncc(CCc3cc(Cl)cc(CCc4cnc5c(c4)c(=O)oc4ccc(F)cc45)c3)cc12] | 35% |

-continued
| Ex. | Reactant | Product | Yield |
|---|---|---|---|
| S318 | S411 | 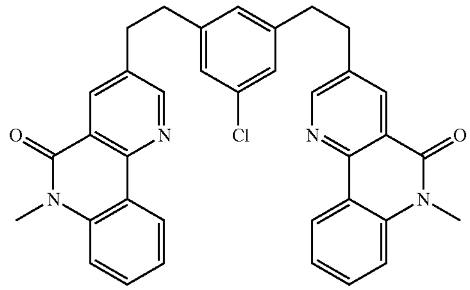 [SMILES: Cn1c(=O)c2cc(CCc3cc(Cl)cc(CCc4cnc5c(c4)c(=O)n(C)c4ccccc54)c3)cnc2c2ccccc21] | 31% |
| S319 | S570 | 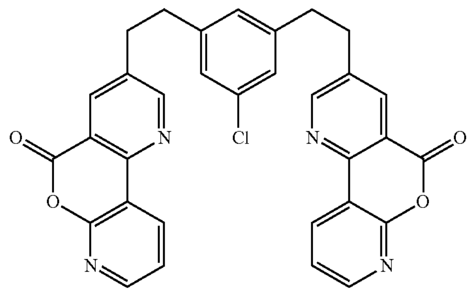 [SMILES: O=c1oc2ncccc2c2ncc(CCc3cc(Cl)cc(CCc4cnc5c(c4)c(=O)oc4ncccc45)c3)cc12] | 35% |
| S319-D8 | S570 | 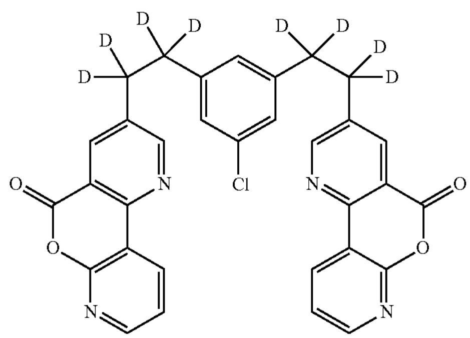 [SMILES: [2H]C([2H])(c1cc(Cl)cc(C([2H])([2H])C([2H])([2H])c2cnc3c(c2)c(=O)oc2ncccc23)c1)C([2H])([2H])c1cnc2c(c1)c(=O)oc1ncccc12] | 30% |
| S320 | S571 | 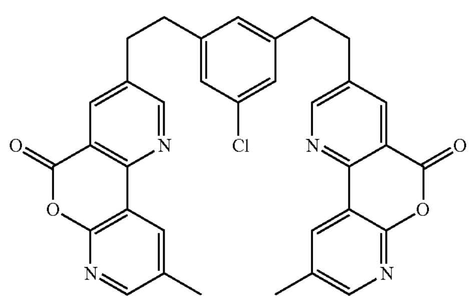 [SMILES: Cc1cnc2oc(=O)c3cc(CCc4cc(Cl)cc(CCc5cnc6c(c5)c(=O)oc5ncc(C)cc56)c4)cnc3c2c1] | 39% |
| S321 | S572 | 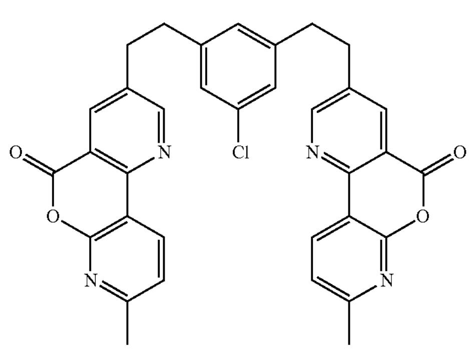 [SMILES: Cc1ccc2c(n1)oc(=O)c1cc(CCc3cc(Cl)cc(CCc4cnc5c(c4)c(=O)oc4nc(C)ccc45)c3)cnc12] | 30% |

-continued
| Ex. | Reactant | Product | Yield |
|---|---|---|---|
| S322 | 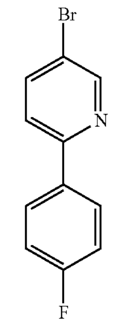 463336-07-4 | 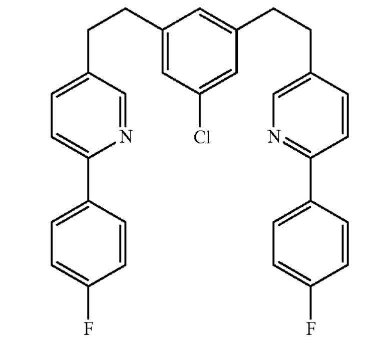 [SMILES: Fc1ccc(-c2ccc(CCc3cc(Cl)cc(CCc4ccc(-c5ccc(F)cc5)nc4)c3)cn2)cc1] | 68% |
| S323 | 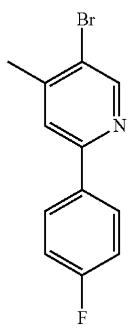 2059970-61-3 | 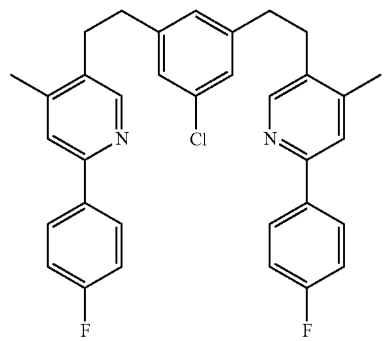 | 66% |
| S324 | 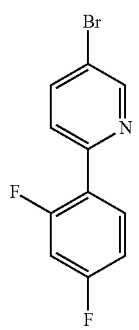 453530-70-6 | 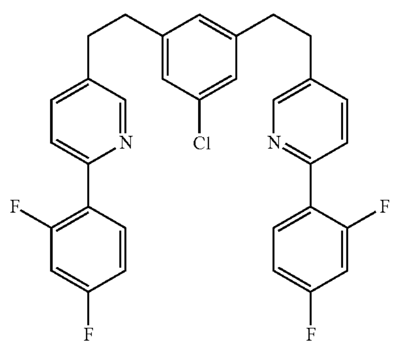 [SMILES: Fc1ccc(-c2ccc(CCc3cc(Cl)cc(CCc4ccc(-c5ccc(F)cc5F)nc4)c3)cn2)c(F)c1] | 70% |
| S324 | 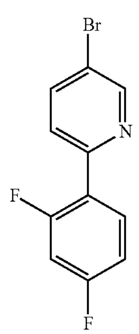 453530-70-6 | 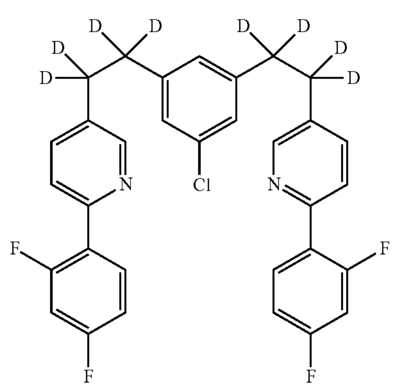 [SMILES: [2H]C([2H])(c1ccc(-c2ccc(F)cc2F)nc1)C([2H])([2H])c1cc(Cl)cc(C([2H])([2H])C([2H])([2H])c2ccc(-c3ccc(F)cc3F)nc2)c1] | 67% |

-continued
| Ex. | Reactant | Product | Yield |
|---|---|---|---|
| S325 | 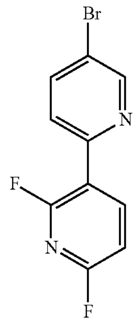 2102327-97-7 | 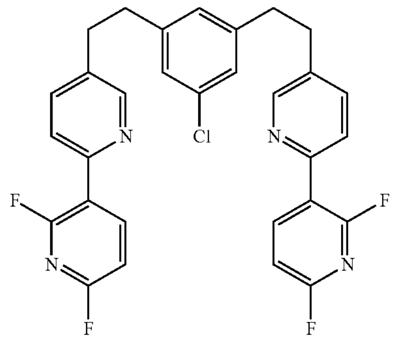 [SMILES: Fc1ccc(-c2ccc(CCc3cc(Cl)cc(CCc4ccc(-c5ccc(F)nc5F)nc4)c3)cn2)c(F)n1] | 66% |
| S326 | 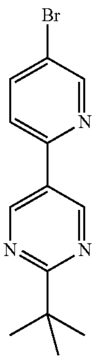 1989596-22-6 | 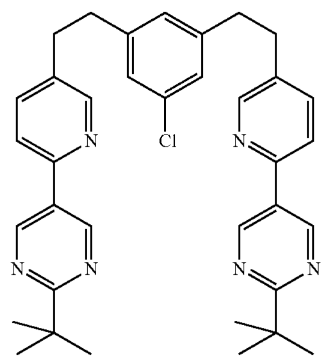 [SMILES: CC(C)(C)c1ncc(-c2ccc(CCc3cc(Cl)cc(CCc4ccc(-c5cnc(C(C)(C)C)nc5)nc4)c3)cn2)cn1] | 60% |
| S327 | 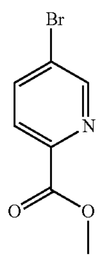 29682-15-3 | 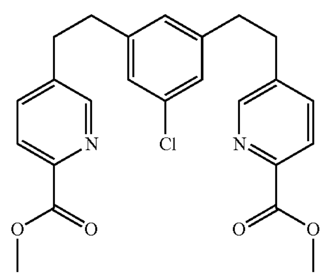 | 67% |
Example S350
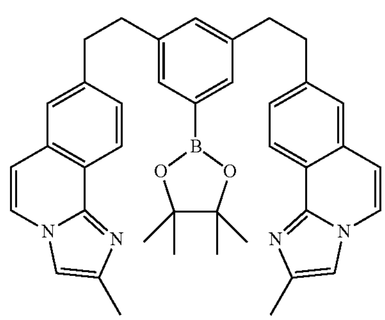 [SMILES: Cc1cn2ccc3cc(CCc4cc(CCc5ccc6c(ccn7cc(C)nc67)c5)cc(B5OC(C)(C)C(C)(C)O5)c4)ccc3c2n1]
Preparation analogous to Example S50, variant A. Use of 52.9 g (100 mmol) of S300. Yield: 54.6 g (88 mmol), 88%; purity: about 95% by $^{1}$H NMR.
In an analogous manner, it is possible to prepare the following compounds:

| Ex. | Reactant | Product | Yield |
|---|---|---|---|
| S351 | S301 | 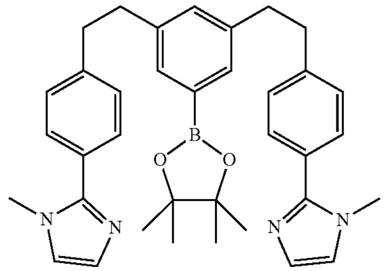 | 85% |
| S352 | S302 | 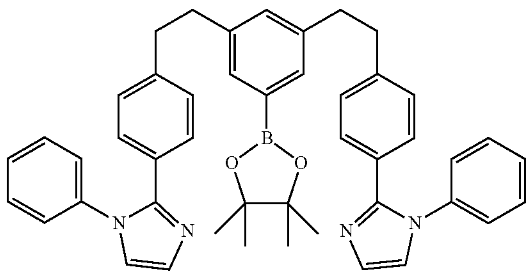 [SMILES: CC1(C)OB(c2cc(CCc3ccc(-c4nccn4-c4ccccc4)cc3)cc(CCc3ccc(-c4nccn4-c4ccccc4)cc3)c2)OC1(C)C] | 88% |
| S353 | S303 | 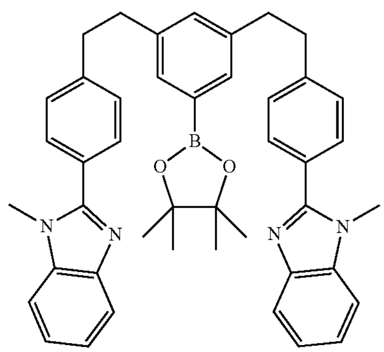 | 84% |
| S354 | S304 | 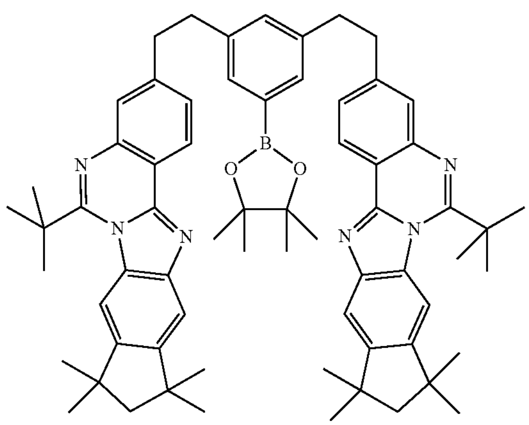 [SMILES: CC(C)(C)c1nc2cc(CCc3cc(CCc4ccc5c(c4)nc(C(C)(C)C)n4c6cc7c(cc6nc54)C(C)(C)CC7(C)C)cc(B4OC(C)(C)C(C)(C)O4)c3)ccc2c2nc3cc4c(cc3n12)C(C)(C)CC4(C)C] | 76% |
| S355 | S305 | 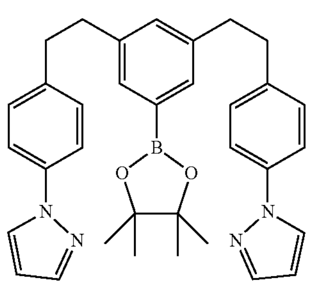 [SMILES: CC1(C)OB(c2cc(CCc3ccc(-n4cccn4)cc3)cc(CCc3ccc(-n4cccn4)cc3)c2)OC1(C)C] | 89% |

-continued
| Ex. | Reactant | Product | Yield |
|---|---|---|---|
| S356 | S306 | 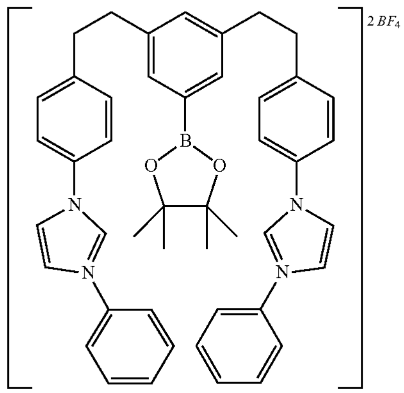 | 65% |
| S357 | S307 | 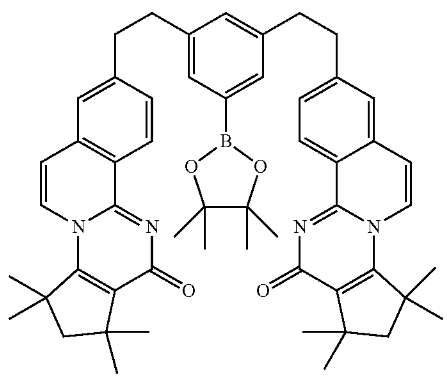 | 79% |
| S358 | S308 | 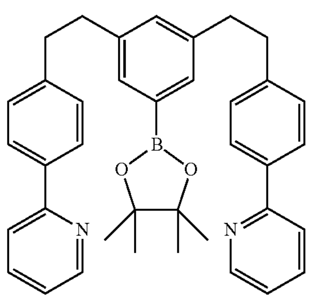 [SMILES: CC1(C)OB(c2cc(CCc3ccc(-c4ccccn4)cc3)cc(CCc3ccc(-c4ccccn4)cc3)c2)OC1(C)C] | 87% |
| S359 | S309 | 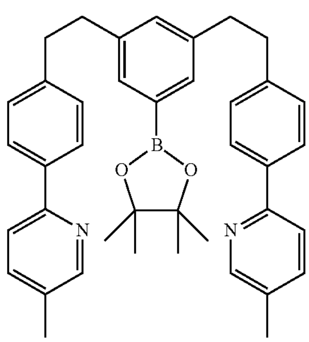 [SMILES: Cc1ccc(-c2ccc(CCc3cc(CCc4ccc(-c5ccc(C)cn5)cc4)cc(B4OC(C)(C)C(C)(C)O4)c3)cc2)nc1] | 88% |

-continued
| Ex. | Reactant | Product | Yield |
|---|---|---|---|
| S360 | S310 | 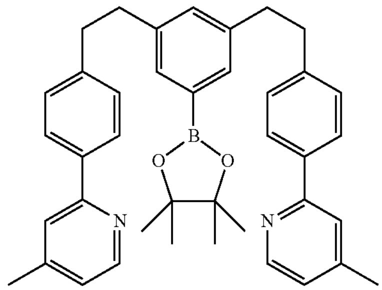 | 85% |
| S361 | S311 | 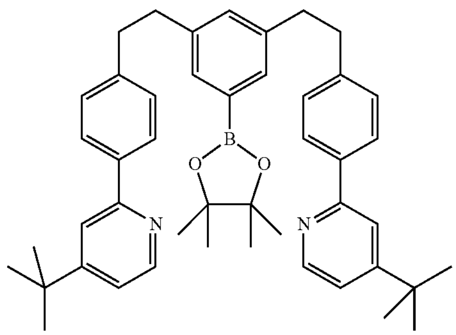 [SMILES: CC(C)(C)c1ccnc(-c2ccc(CCc3cc(CCc4ccc(-c5cc(C(C)(C)C)ccn5)cc4)cc(B4OC(C)(C)C(C)(C)O4)c3)cc2)c1] | 90% |
| S362 | S312 | 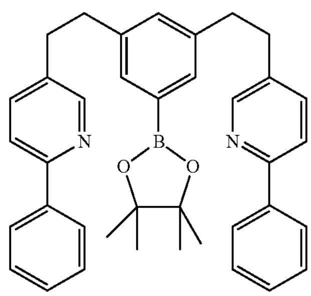 [SMILES: CC1(C)OB(c2cc(CCc3ccc(-c4ccccc4)nc3)cc(CCc3ccc(-c4ccccc4)nc3)c2)OC1(C)C] | 86% |
| S362-D8 | S312 | 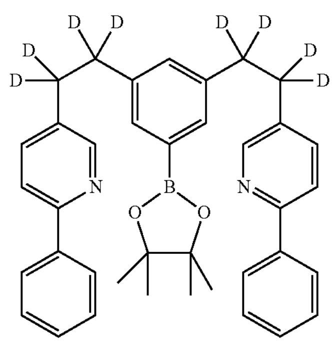 [SMILES: [2H]C([2H])(c1ccc(-c2ccccc2)nc1)C([2H])([2H])c1cc(B2OC(C)(C)C(C)(C)O2)cc(C([2H])([2H])C([2H])([2H])c2ccc(-c3ccccc3)nc2)c1] | 84% |
| S363 | S313 | 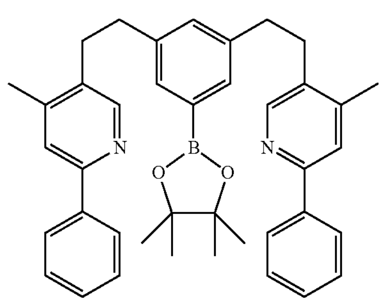 | 84% |

-continued
| Ex. | Reactant | Product | Yield |
|---|---|---|---|
| S363-D8 | S313 | 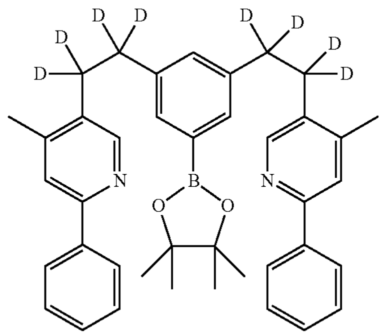 | 78% |
| S364 | S314 | 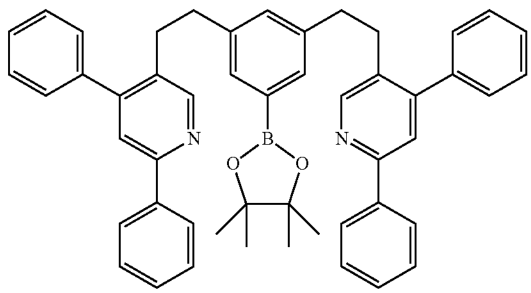 [SMILES: CC1(C)OB(c2cc(CCc3cnc(-c4ccccc4)cc3-c3ccccc3)cc(CCc3cnc(-c4ccccc4)cc3-c3ccccc3)c2)OC1(C)C] | 89% |
| S365 | S315 | 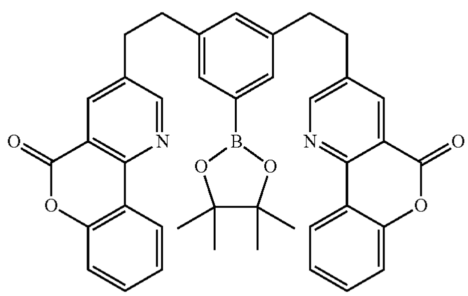 [SMILES: CC1(C)OB(c2cc(CCc3cnc4c(c3)c(=O)oc3ccccc34)cc(CCc3cnc4c(c3)c(=O)oc3ccccc34)c2)OC1(C)C] | 86% |
| S365-D8 | S315-D8 | 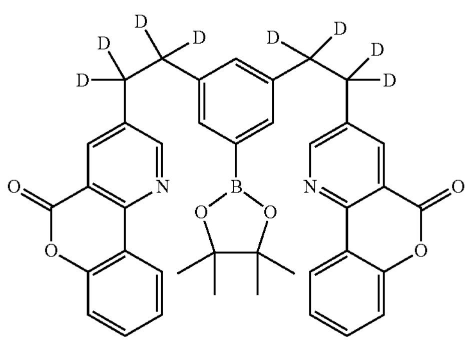 [SMILES: [2H]C([2H])(c1cc(B2OC(C)(C)C(C)(C)O2)cc(C([2H])([2H])C([2H])([2H])c2cnc3c(c2)c(=O)oc2ccccc23)c1)C([2H])([2H])c1cnc2c(c1)c(=O)oc1ccccc12] | 81% |
| S366 | S316 | 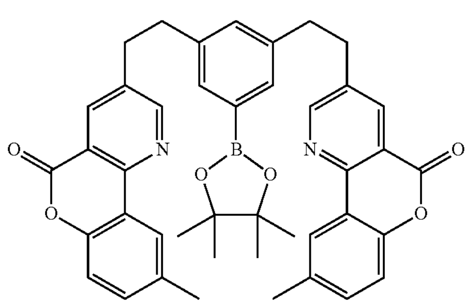 [SMILES: Cc1ccc2oc(=O)c3cc(CCc4cc(CCc5cnc6c(c5)c(=O)oc5ccc(C)cc56)cc(B5OC(C)(C)C(C)(C)O5)c4)cnc3c2c1] | 88% |

-continued
| Ex. | Reactant | Product | Yield |
|---|---|---|---|
| S367 | S317 | 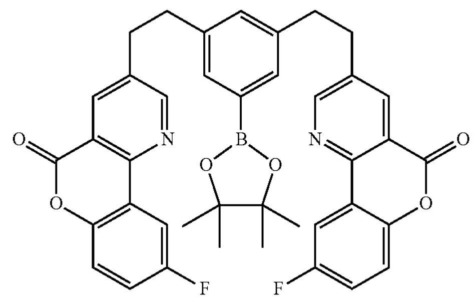 [SMILES: CC1(C)OB(c2cc(CCc3cnc4c(c3)c(=O)oc3ccc(F)cc34)cc(CCc3cnc4c(c3)c(=O)oc3ccc(F)cc34)c2)OC1(C)C] | 83% |
| S368 | S318 | 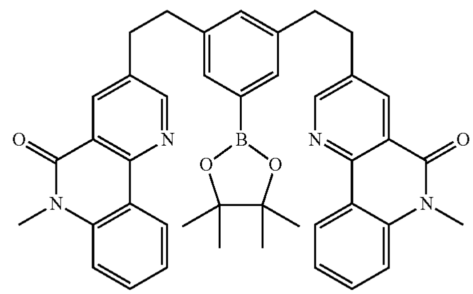 [SMILES: Cn1c(=O)c2cc(CCc3cc(CCc4cnc5c(c4)c(=O)n(C)c4ccccc54)cc(B4OC(C)(C)C(C)(C)O4)c3)cnc2c2ccccc21] | 78% |
| S369 | S319 | 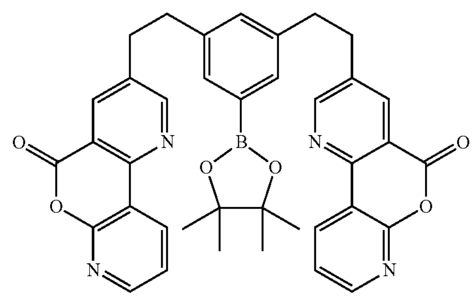 [SMILES: CC1(C)OB(c2cc(CCc3cnc4c(c3)c(=O)oc3ncccc34)cc(CCc3cnc4c(c3)c(=O)oc3ncccc34)c2)OC1(C)C] | 75% |
| S369-D8 | S319-D8 | 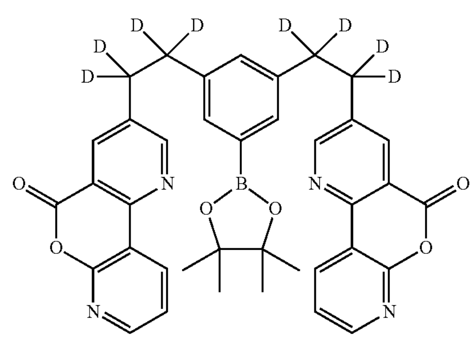 [SMILES: [2H]C([2H])(c1cc(B2OC(C)(C)C(C)(C)O2)cc(C([2H])([2H])C([2H])([2H])c2cnc3c(c2)c(=O)oc2ncccc23)c1)C([2H])([2H])c1cnc2c(c1)c(=O)oc1ncccc12] | 78% |
| S370 | S320 | 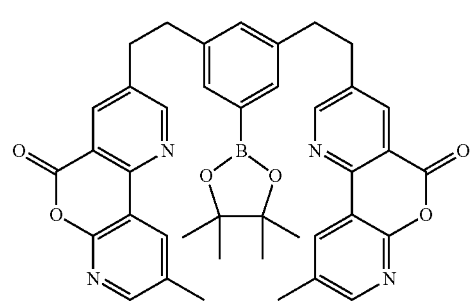 [SMILES: Cc1cnc2oc(=O)c3cc(CCc4cc(CCc5cnc6c(c5)c(=O)oc5ncc(C)cc56)cc(B5OC(C)(C)C(C)(C)O5)c4)cnc3c2c1] | 71% |

-continued
| Ex. | Reactant | Product | Yield |
|---|---|---|---|
| S371 | S321 | 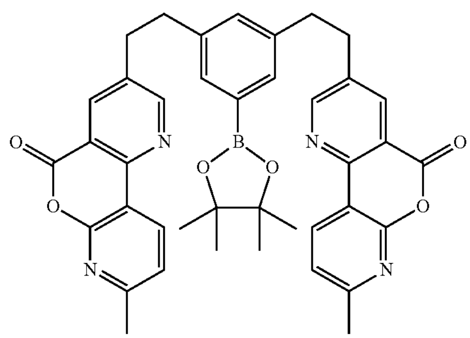 [SMILES: Cc1ccc2c(n1)oc(=O)c1cc(CCc3cc(CCc4cnc5c(c4)c(=O)oc4nc(C)ccc45)cc(B4OC(C)(C)C(C)(C)O4)c3)cnc12] | 71% |
| S372 | S322 | 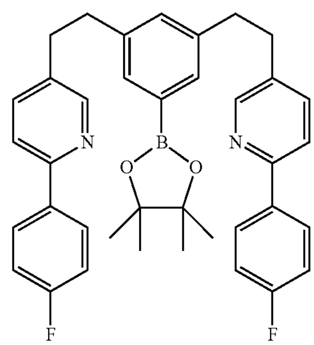 [SMILES: CC1(C)OB(c2cc(CCc3ccc(-c4ccc(F)cc4)nc3)cc(CCc3ccc(-c4ccc(F)cc4)nc3)c2)OC1(C)C] | 75% |
| S373 | S323 | 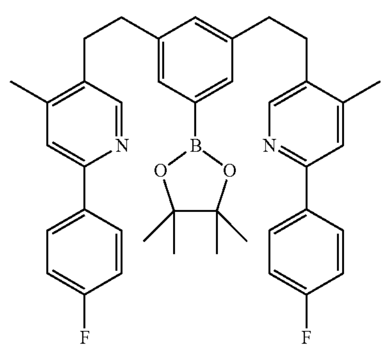 | 77% |
| S374 | S324 | 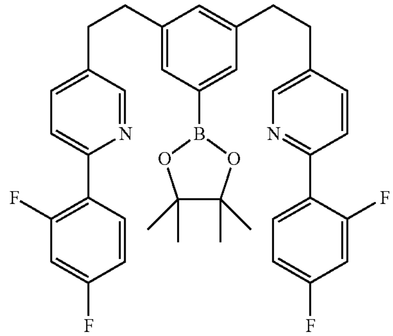 [SMILES: CC1(C)OB(c2cc(CCc3ccc(-c4ccc(F)cc4F)nc3)cc(CCc3ccc(-c4ccc(F)cc4F)nc3)c2)OC1(C)C] | 73% |

-continued
| Ex. | Reactant | Product | Yield |
|---|---|---|---|
| S374-D8 | S324-D8 | 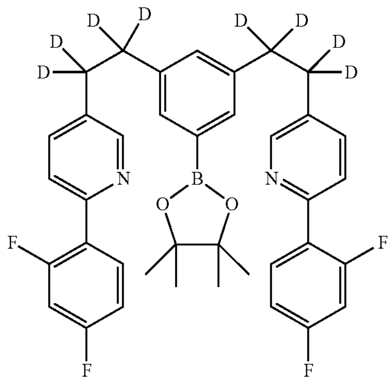 [SMILES: [2H]C([2H])(c1ccc(-c2ccc(F)cc2F)nc1)C([2H])([2H])c1cc(B2OC(C)(C)C(C)(C)O2)cc(C([2H])([2H])C([2H])([2H])c2ccc(-c3ccc(F)cc3F)nc2)c1] | 77% |
| S375 | S325 | 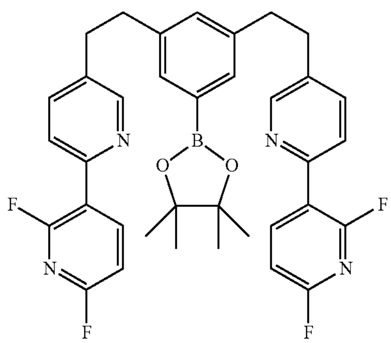 [SMILES: CC1(C)OB(c2cc(CCc3ccc(-c4ccc(F)nc4F)nc3)cc(CCc3ccc(-c4ccc(F)nc4F)nc3)c2)OC1(C)C] | 68% |
| S376 | S326 | 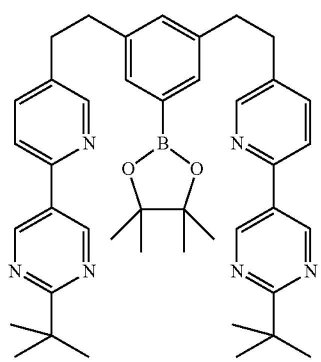 [SMILES: CC(C)(C)c1ncc(-c2ccc(CCc3cc(CCc4ccc(-c5cnc(C(C)(C)C)nc5)nc4)cc(B4OC(C)(C)C(C)(C)O4)c3)cn2)cn1] | 67% |
| S377 | S650 | 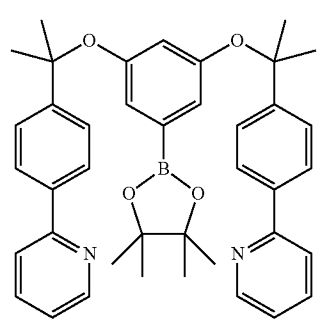 [SMILES: CC(C)(Oc1cc(OC(C)(C)c2ccc(-c3ccccn3)cc2)cc(B2OC(C)(C)C(C)(C)O2)c1)c1ccc(-c2ccccn2)cc1] | 55% |

-continued

| Ex. | Reactant | Product | Yield |
|---|---|---|---|
| S378 | S651 | 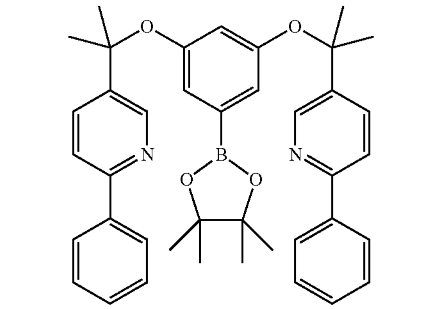 [SMILES: CC(C)(Oc1cc(OC(C)(C)c2ccc(-c3ccccc3)nc2)cc(B2OC(C)(C)C(C)(C)O2)c1)c1ccc(-c2ccccc2)nc1] | 57% |
| S379 | S652 | 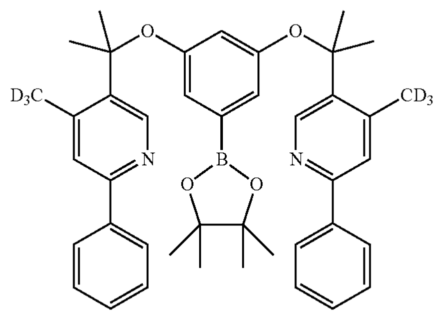 [SMILES: [2H]C([2H])([2H])c1cc(-c2ccccc2)ncc1C(C)(C)Oc1cc(OC(C)(C)c2cnc(-c3ccccc3)cc2C([2H])([2H])[2H])cc(B2OC(C)(C)C(C)(C)O2)c1] | 61% |
| S379 | S653 | 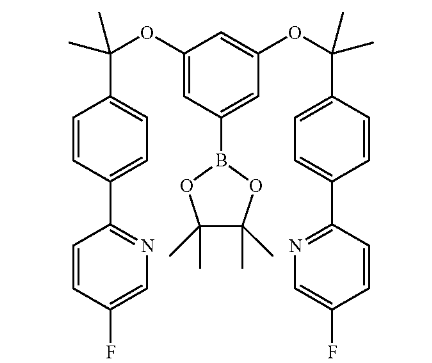 [SMILES: CC(C)(Oc1cc(OC(C)(C)c2ccc(-c3ccc(F)cn3)cc2)cc(B2OC(C)(C)C(C)(C)O2)c1)c1ccc(-c2ccc(F)cn2)cc1] | 66% |
| S380 | S327 | 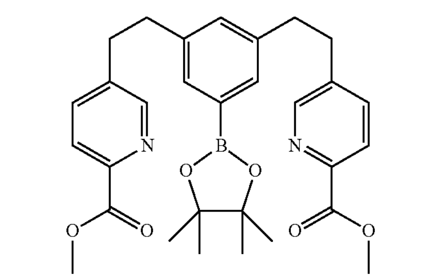 [SMILES: COC(=O)c1ccc(CCc2cc(CCc3ccc(C(=O)OC)nc3)cc(B3OC(C)(C)C(C)(C)O3)c2)cn1] | 68% |

Example S400

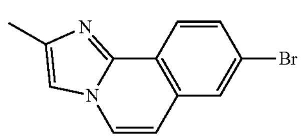

A mixture of 30.8 g (100 mmol) of 2-methyl-8-(4,4,5,5-tetramethyl-1,3,2-dioxaborolan-2-yl)-imidazo[2,1-a]isoquinoline [1989597-11-6], 67.0 g (300 mmol) of copper(II) bromide [7789-45-9], 1000 ml of methanol and 1000 ml of water is stirred in a stirred autoclave at 80° C. for 10 h. Subsequently, the mixture is concentrated to about 1000 ml under reduced pressure, 500 ml of concentrated aqueous ammonia solution are added and then the mixture is extracted three times with 500 ml of dichloromethane. The organic phase is washed once with 300 ml of 10% ammonia solution and once with 300 ml of saturated sodium chloride solution, and then the solvent is removed under reduced pressure. The residue is flash-chromatographed on an automated column system (CombiFlash Torrent from A. Semrau). Yield: 16.5 g (63 mmol), 63%; purity: >98% by $^{1}$H NMR.

In an analogous manner, it is possible to prepare the following compounds:
| | | | |
|---|---|---|---|
| S401 | 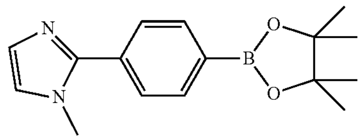 1394374-23-2 | 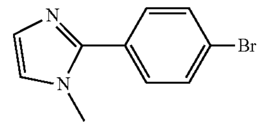 | 56% |
| S402 | 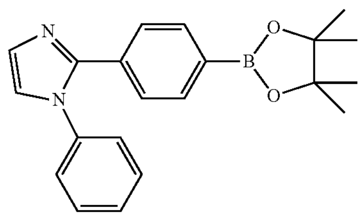 1621467-82-0 | 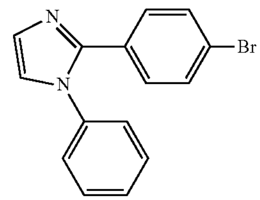 [SMILES: Brc1ccc(-c2nccn2-c2ccccc2)cc1] | 62% |
| S403 | 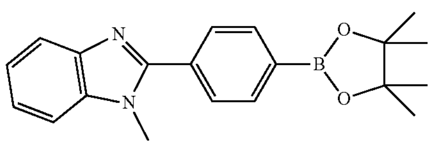 1466412-09-8 | 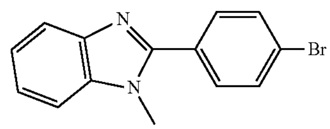 [SMILES: Cn1c(-c2ccc(Br)cc2)nc2ccccc21] | 66% |
| S404 | 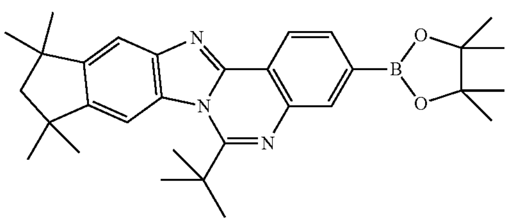 1989597-13-8 | 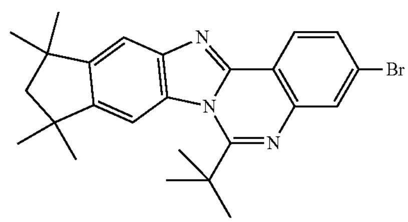 [SMILES: CC(C)(C)c1nc2cc(Br)ccc2c2nc3cc4c(cc3n12)C(C)(C)CC4(C)C] | 60% |
| S405 | 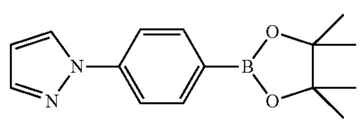 1312478-63-9 | 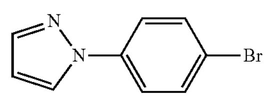 [SMILES: Brc1ccc(-n2cccn2)cc1] | 49% |
| S406 | S66 | 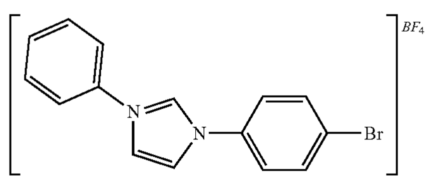 Recrystallization of the crude product from acetonitrile/MeOH | 31% |
| S407 | 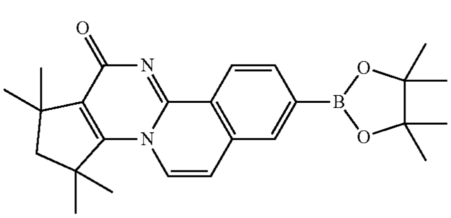 1989597-91-2 | 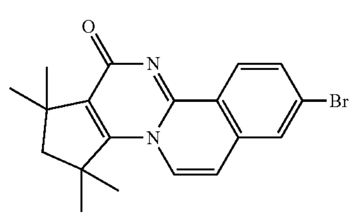 [SMILES: CC1(C)CC(C)(C)c2c1c(=O)nc1c3ccc(Br)cc3ccn21] | 57% |

-continued

| | | | |
|---|---|---|---|
| S408 | S550 | 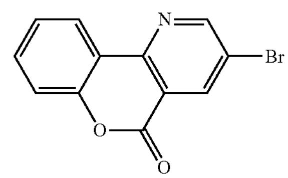 [SMILES: O=c1oc2ccccc2c2ncc(Br)cc12] | 53% |
| S409 | S551 | 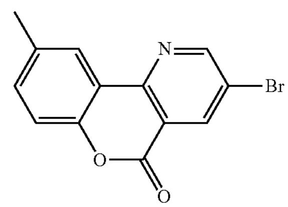 [SMILES: Cc1ccc2oc(=O)c3cc(Br)cnc3c2c1] | 50% |
| S410 | S552 | 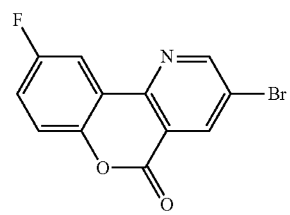 [SMILES: O=c1oc2ccc(F)cc2c2ncc(Br)cc12] | 56% |
| S411 | S553 | 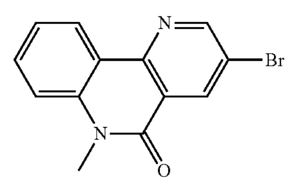 [SMILES: Cn1c(=O)c2cc(Br)cnc2c2ccccc21] | 48% |

Example S450

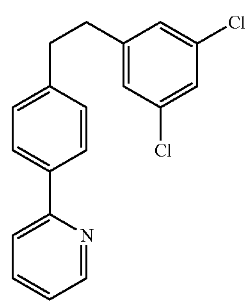 [SMILES: Clc1cc(Cl)cc(CCc2ccc(-c3ccccn3)cc2)c1]

A well-stirred mixture of 23.4 g (100 mmol) of 2-(4-bromophenyl)pyridine, 17.1 g (100 mmol) of 1,3-dichloro-5-ethynylbenzene [99254-90-7], 28 ml (200 mmol) of triethylamine, 1.9 g (10 mmol) of copper(I) iodide, 449 mg (2 mmol) of tetrakis(triphenylphosphino)palladium(0) and 500 ml of DMF is stirred at 70° C. for 8 h. The triethylammonium hydrobromide formed is filtered out of the still-warm mixture and washed once with 50 ml of DMF. The filtrate is concentrated to dryness, the residue is taken up in 1000 ml of ethyl acetate, and the organic phase is washed three times with 200 ml of 20% by weight ammonia solution, three times with 200 ml each time of water and once with 200 ml of saturated sodium chloride solution, and dried over magnesium sulfate. The mixture is filtered through a Celite bed in the form of an ethyl acetate slurry and the solvent is removed under reduced pressure. The solids thus obtained are extracted once by stirring with 100 ml of methanol and then dried under reduced pressure. The solids are hydrogenated in a mixture of 300 ml of THF and 300 ml of MeOH with addition of 1.5 g of palladium (5%) on charcoal and 16.1 g (300 mmol) of $NH_4Cl$ at 40° C. under a 3 bar hydrogen atmosphere until uptake of hydrogen has ended (about 12 h). The catalyst is filtered off using a Celite bed in the form of a THF slurry, the solvent is removed under reduced pressure and flash chromatography is effected using an automated column system (CombiFlashTorrent from A Semrau). Yield: 23.0 g (70 mmol), 70%; purity: about 97% by $^1H$ NMR.

In an analogous manner, it is possible to prepare the following compounds:

| Ex. | Reactant | Product | Yield |
|---|---|---|---|
| S451 | 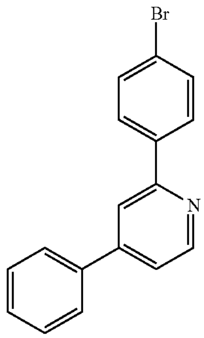 [SMILES: Brc1ccc(-c2cc(-c3ccccc3)ccn2)cc1] [504413-43-8] | 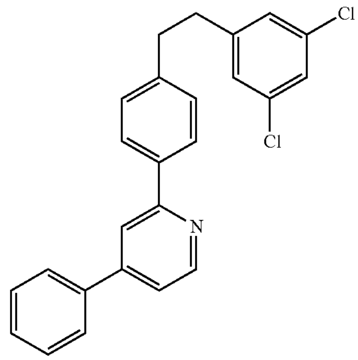 [SMILES: Clc1cc(Cl)cc(CCc2ccc(-c3cc(-c4ccccc4)ccn3)cc2)c1] | 68% |
| S452 | 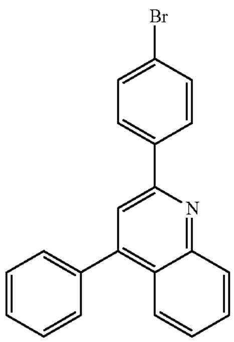 [SMILES: Brc1ccc(-c2cc(-c3ccccc3)c3ccccc3n2)cc1] [73402-91-2] | 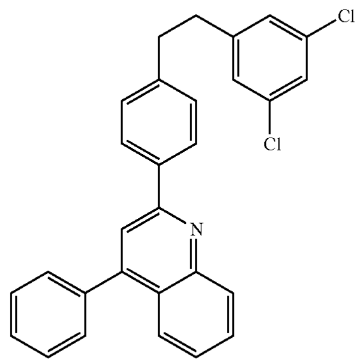 [SMILES: Clc1cc(Cl)cc(CCc2ccc(-c3cc(-c4ccccc4)c4ccccc4n3)cc2)c1] | 74% |
| S453 | 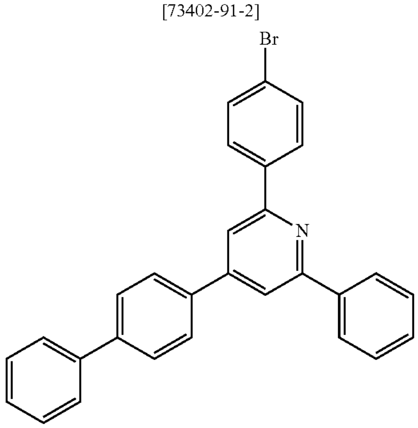 [1852499-57-0] | 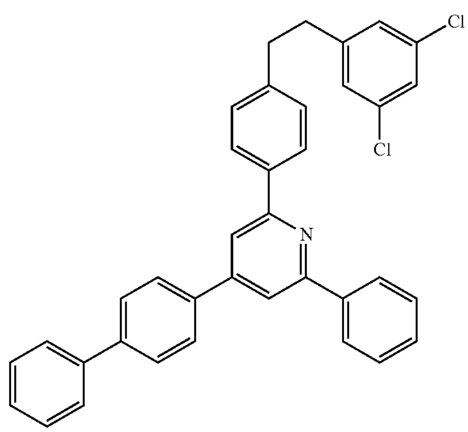 [SMILES: Clc1cc(Cl)cc(CCc2ccc(-c3cc(-c4ccc(-c5ccccc5)cc4)cc(-c4ccccc4)n3)cc2)c1] | 77% |
| S454 | 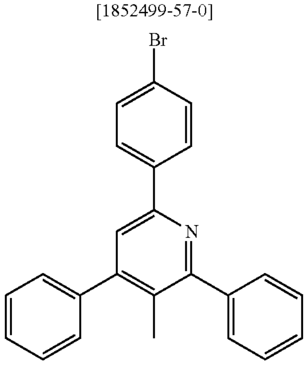 [89009-22-3] | 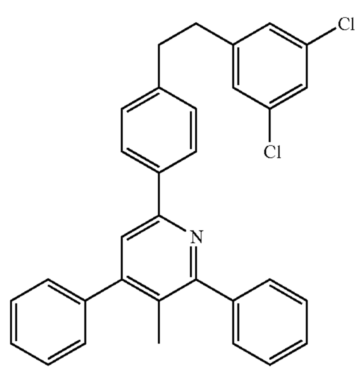 [SMILES: Cc1c(-c2ccccc2)cc(-c2ccc(CCc3cc(Cl)cc(Cl)c3)cc2)nc1-c1ccccc1] | 75% |

-continued
| Ex. | Reactant | Product | Yield |
| --- | --- | --- | --- |
| S455 | 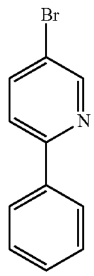 [SMILES: Brc1ccc(-c2ccccc2)nc1] [27012-25-5] | 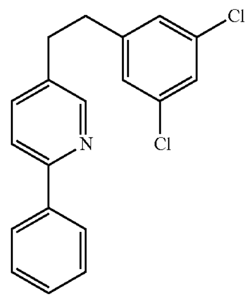 [SMILES: Clc1cc(Cl)cc(CCc2ccc(-c3ccccc3)nc2)c1] | 80% |
| S456 | 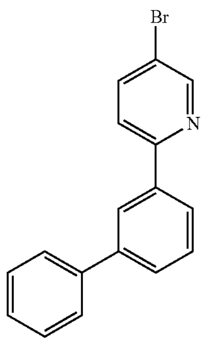 [SMILES: Brc1ccc(-c2cccc(-c3ccccc3)c2)nc1] [875462-73-0] | 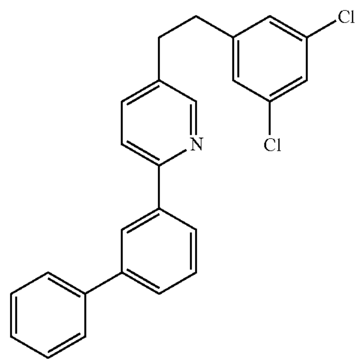 [SMILES: Clc1cc(Cl)cc(CCc2ccc(-c3cccc(-c4ccccc4)c3)nc2)c1] | 78% |
| S457 | 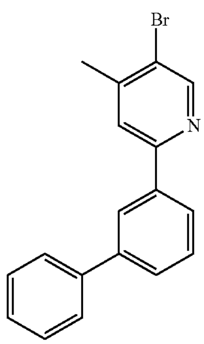 [SMILES: Cc1cc(-c2cccc(-c3ccccc3)c2)ncc1Br] [1415352-89-8] | 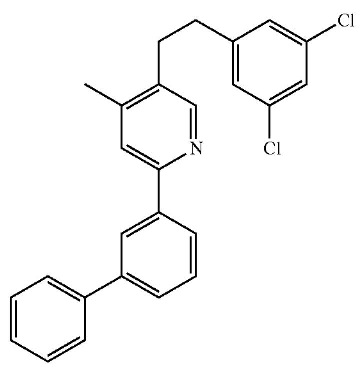 [SMILES: Cc1cc(-c2cccc(-c3ccccc3)c2)ncc1CCc1cc(Cl)cc(Cl)c1] | 74% |
| S458 | 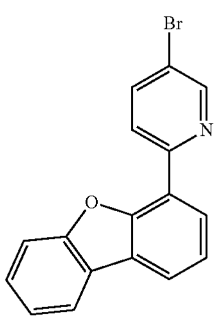 [SMILES: Brc1ccc(-c2cccc3c2oc2ccccc23)nc1] [1989596-02-2] | 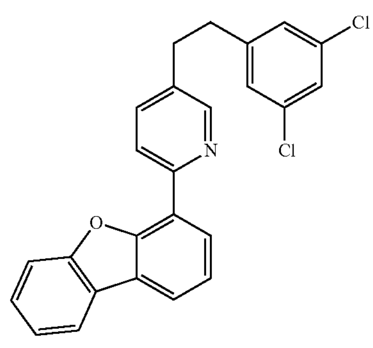 [SMILES: Clc1cc(Cl)cc(CCc2ccc(-c3cccc4c3oc3ccccc34)nc2)c1] | 75% |

-continued
| Ex. | Reactant | Product | Yield |
|---|---|---|---|
| S459 | 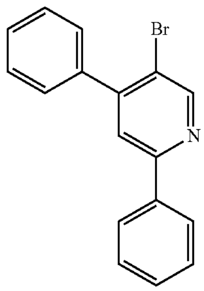 [SMILES: Brc1cnc(-c2ccccc2)cc1-c1ccccc1]<br>[1989596-06-6] | 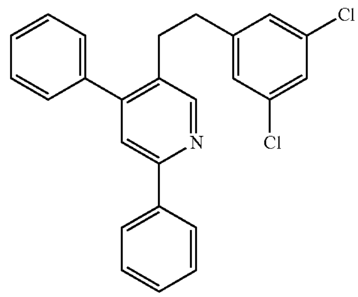 [SMILES: Clc1cc(Cl)cc(CCc2cnc(-c3ccccc3)cc2-c2ccccc2)c1] | 63% |
| S460 | S10 | 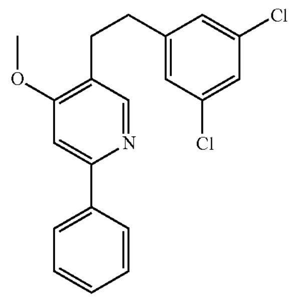 [SMILES: COc1cc(-c2ccccc2)ncc1CCc1cc(Cl)cc(Cl)c1] | 64% |
Example S500
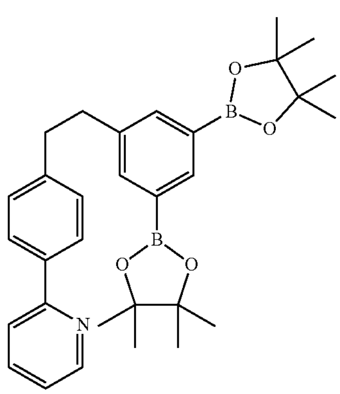 [SMILES: CC1(C)OB(c2cc(CCc3ccc(-c4ccccn4)cc3)cc(B3OC(C)(C)C(C)(C)O3)c2)OC1(C)C]
Preparation analogous to Example S50, variant A. Use of 16.4 g (50 mmol) of S450. Yield: 20.5 g (40 mmol), 80%; purity: about 95% by $^{1}$H NMR.
In an analogous manner, it is possible to prepare the following compounds:

| Ex. | Reactant | Product | Yield |
|---|---|---|---|
| S501 | S451 | 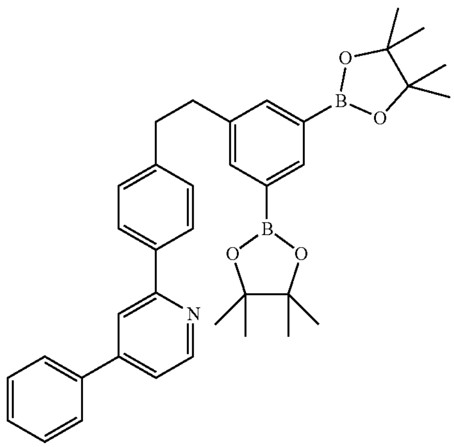 [SMILES: CC1(C)OB(c2cc(CCc3ccc(-c4cc(-c5ccccc5)ccn4)cc3)cc(B3OC(C)(C)C(C)(C)O3)c2)OC1(C)C] | 78% |
| S502 | S452 | 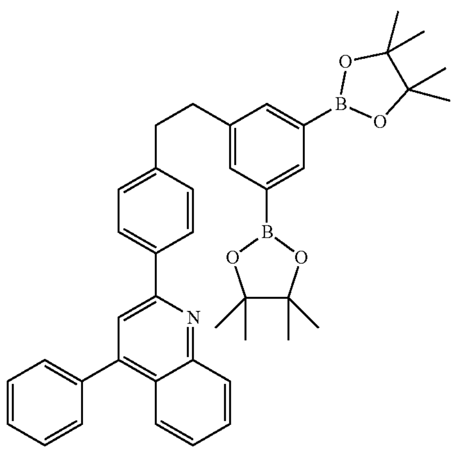 [SMILES: CC1(C)OB(c2cc(CCc3ccc(-c4cc(-c5ccccc5)c5ccccc5n4)cc3)cc(B3OC(C)(C)C(C)(C)O3)c2)OC1(C)C] | 75% |
| S503 | S453 | 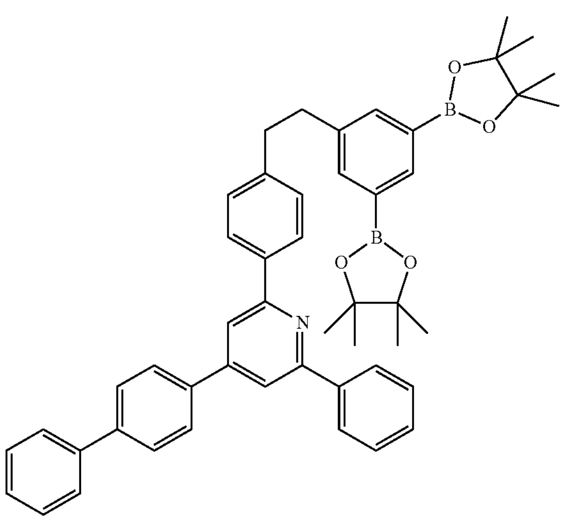 [SMILES: CC1(C)OB(c2cc(CCc3ccc(-c4cc(-c5ccc(-c6ccccc6)cc5)cc(-c5ccccc5)n4)cc3)cc(B3OC(C)(C)C(C)(C)O3)c2)OC1(C)C] | 76% |

-continued
| Ex. | Reactant | Product | Yield |
|---|---|---|---|
| S504 | S454 | 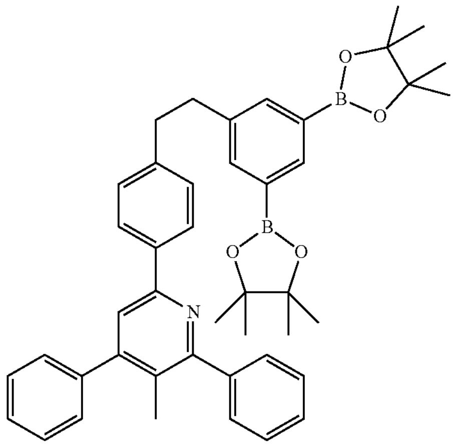 [SMILES: Cc1c(-c2ccccc2)cc(-c2ccc(CCc3cc(B4OC(C)(C)C(C)(C)O4)cc(B4OC(C)(C)C(C)(C)O4)c3)cc2)nc1-c1ccccc1] | 70% |
| S505 | S455 | 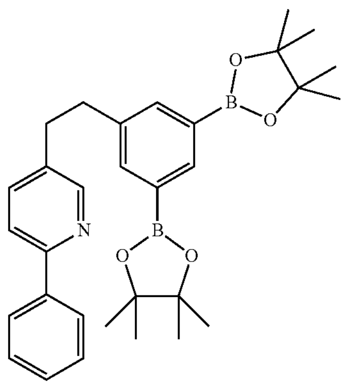 [SMILES: CC1(C)OB(c2cc(CCc3ccc(-c4ccccc4)nc3)cc(B3OC(C)(C)C(C)(C)O3)c2)OC1(C)C] | 80% |
| S506 | S456 | 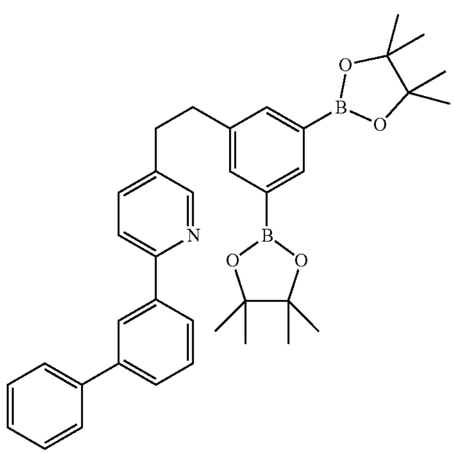 [SMILES: CC1(C)OB(c2cc(CCc3ccc(-c4cccc(-c5ccccc5)c4)nc3)cc(B3OC(C)(C)C(C)(C)O3)c2)OC1(C)C] | 81% |

-continued
| Ex. | Reactant | Product | Yield |
|---|---|---|---|
| S507 | S457 | 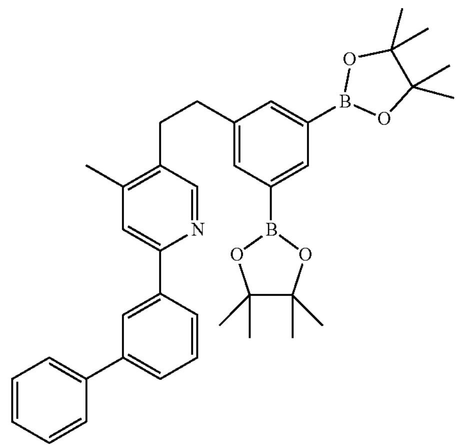 [SMILES: Cc1cc(-c2cccc(-c3ccccc3)c2)ncc1CCc1cc(B2OC(C)(C)C(C)(C)O2)cc(B2OC(C)(C)C(C)(C)O2)c1] | 79% |
| S508 | S458 | 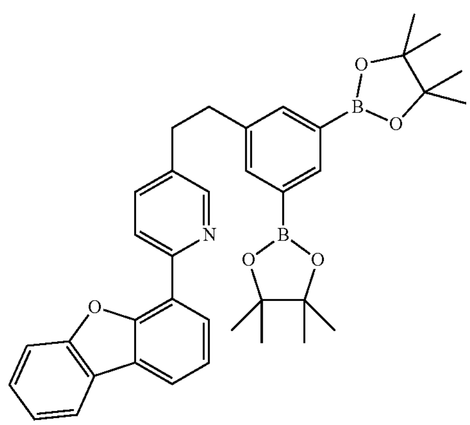 [SMILES: CC1(C)OB(c2cc(CCc3ccc(-c4cccc5c4oc4ccccc45)nc3)cc(B3OC(C)(C)C(C)(C)O3)c2)OC1(C)C] | 77% |
| S509 | S459 | 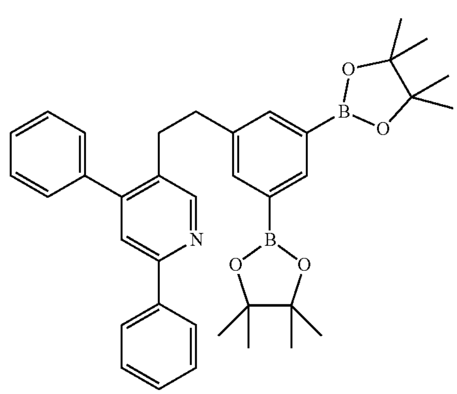 [SMILES: CC1(C)OB(c2cc(CCc3cnc(-c4ccccc4)cc3-c3ccccc3)cc(B3OC(C)(C)C(C)(C)O3)c2)OC1(C)C] | 74% |

-continued

| Ex. | Reactant | Product | Yield |
| --- | --- | --- | --- |
| S510 | S460 | 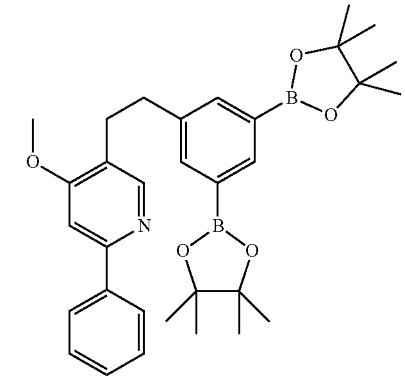 [SMILES: COc1cc(-c2ccccc2)ncc1CCc1cc(B2OC(C)(C)C(C)(C)O2)cc(B2OC(C)(C)C(C)(C)O2)c1] | 75% |

Example S550

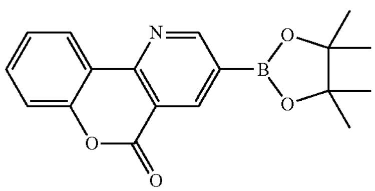 [SMILES: CC1(C)OB(c2cnc3c(c2)c(=O)oc2ccccc23)OC1(C)C]

A mixture of 19.7 g (100 mmol) of 5H-[1]benzopyrano[4,3-b]pyridin-5-one [85175-31-1], 26.7 g (105 mmol) of bis(pinacolato)diborane [73183-34-3], 552 mg (2 mmol) of 4,4'-bis(1,1-dimethylethyl)-2,2'-bipyridine [72914-19-3] and 681 mg (1 mmol) of (1,5-cyclooctadiene)(methoxy)iridium(I) dimer [12146-71-9] in 300 ml of methyl tert-butyl ether is stirred at room temperature for 24 h. The methyl tert-butyl ether is removed under reduced pressure, the residue is taken up in 150 ml of warm methanol, and the mixture is stirred for a further 2 h. The precipitated product is filtered off with suction, washed once with 30 ml of methanol, and then crystallized from acetonitrile with addition of a little ethyl acetate. Yield: 24.3 g (75 mmol), 75%; purity: about 97% by $^{1}$H NMR.

In an analogous manner, it is possible to prepare the following compounds:

| Ex. | Reactant | Product | Yield |
| --- | --- | --- | --- |
| S551 | 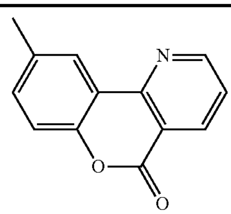 1493784-12-5 | 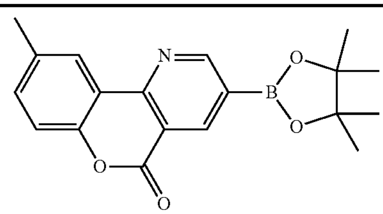 | 72% |
| S552 | 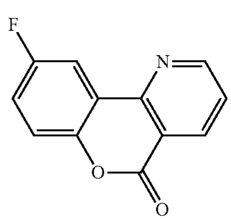 [SMILES: O=c1oc2ccc(F)cc2c2ncccc12] 1493784-11-4 | 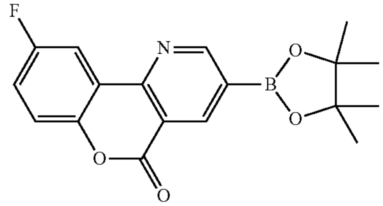 [SMILES: CC1(C)OB(c2cnc3c(c2)c(=O)oc2ccc(F)cc23)OC1(C)C] | 68% |
| S553 | 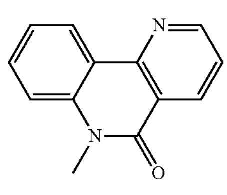 [SMILES: Cn1c(=O)c2cccnc2c2ccccc21] 327096-10-6 | 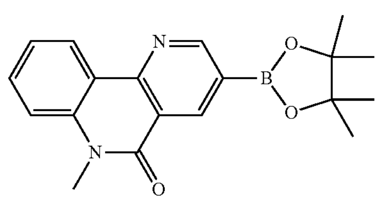 [SMILES: Cn1c(=O)c2cc(B3OC(C)(C)C(C)(C)O3)cnc2c2ccccc21] | 70% |

-continued

| Ex. | Reactant | Product | Yield |
|---|---|---|---|
| S554 | 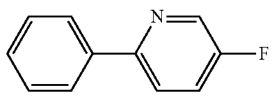 512171-81-2 | 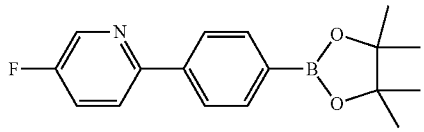 [SMILES: CC1(C)OB(c2ccc(-c3ccc(F)cn3)cc2)OC1(C)C] Purification via flash chromatography | 36% |

Example S570

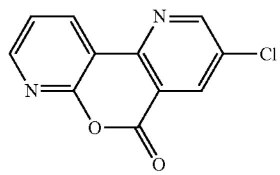 [SMILES: O=c1oc2ncccc2c2ncc(Cl)cc12]

A)

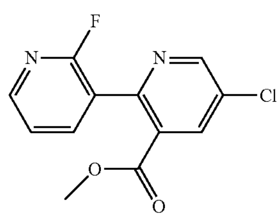 [SMILES: COC(=O)c1cc(Cl)cnc1-c1cccnc1F]

Procedure analogous to S600 B), using 20.6 g (100 mmol) of methyl 2,5-dichloropyridine-3-carboxylate [67754-03-4] and 15.5 g (110 mmol) of (2-fluoropyridin-3-yl)boronic acid [174669-73-9]. Yield: 20.9 g (78 mmol), 78%; purity: about 95% by $^1$H NMR.

B)

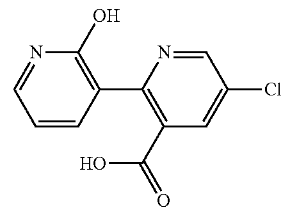 [SMILES: O=C(O)c1cc(Cl)cnc1-c1cccnc1O]

A mixture of 26.7 g (100 mmol) of A), 16.8 g (300 mmol) of potassium hydroxide, 250 ml of ethanol and 75 ml of water is stirred at 70° C. for 16 h. After cooling, the mixture is acidified to pH~5 by addition of 1 N hydrochloric acid and stirred for a further 1 h. The precipitated product is filtered off with suction, washed once with 50 ml of water and once with 50 ml of methanol, and then dried under reduced pressure. Yield: 23.8 g (95 mmol), 95%; purity: about 97% by $^1$H NMR.

C) S570

A mixture of 25.1 g (100 mmol) B) and 951 mg (5 mmol) of p-toluenesulfonic acid monohydrate in 500 ml of toluene is heated under reflux on a water separator for 16 h. After cooling, the reaction mixture is stirred in an ice/water bath for a further 1 h, and the solids are filtered off with suction, washed with 50 ml of toluene and dried under reduced pressure. The solids are then extracted by stirring with 300 ml of water, filtered off with suction and washed with 100 ml of water in order to remove the p-toluenesulfonic acid. After filtration with suction and drying under reduced pressure, the final drying is effected by azeotropic drying twice with toluene. Yield: 20.5 g (88 mmol), 88%; purity: about 97% by $^1$H NMR.

In an analogous manner, it is possible to prepare the following compounds:

| Ex. | Reactant | Product | Yield |
|---|---|---|---|
| S571 | 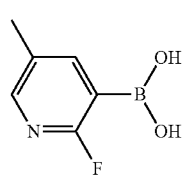 1072952-45-4 | 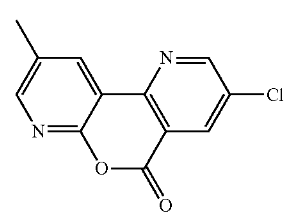 [SMILES: Cc1cnc2oc(=O)c3cc(Cl)cnc3c2c1] | 65% |

-continued

| Ex. | Reactant | Product | Yield |
|---|---|---|---|
| S572 | 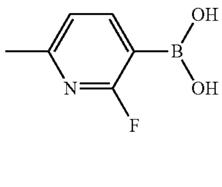 906744-85-2 | 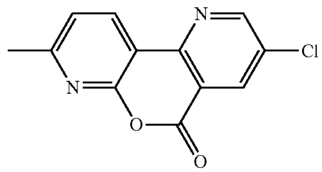 [SMILES: Cc1ccc2c(n1)oc(=O)c1cc(Cl)cnc12] | 61% |

Example S600

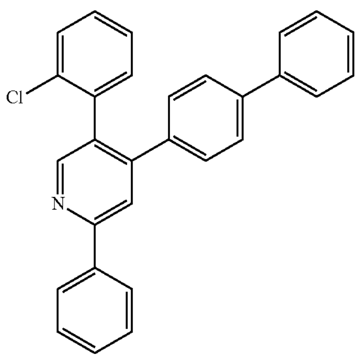 [SMILES: Clc1ccccc1-c1cnc(-c2ccccc2)cc1-c1ccc(-c2ccccc2)cc1]

A)

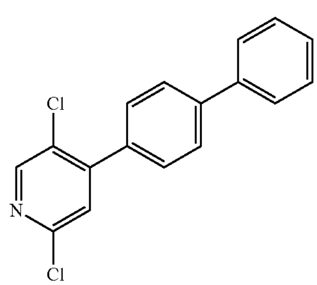 [SMILES: Clc1cc(-c2ccc(-c3ccccc3)cc2)c(Cl)cn1]

A mixture of 27.4 g (100 mmol) of 2,5-dichloro-4-iodopyridine [796851-03-1], 19.8 g (100 mmol) of 4-biphenylboronic acid [5122-94-1], 41.4 g (300 mmol) of potassium carbonate, 702 mg (1 mmol) of bis(triphenylphosphino)palladium(II) chloride [13965-03-2], 300 ml of methanol and 300 ml of acetonitrile is heated under reflux for 16 h. After cooling, the reaction mixture is stirred into 3 l of warm water and stirred for a further 30 min, and the precipitated product is filtered off with suction, washed three times with 50 ml each time of methanol, dried under reduced pressure, taken up in 500 ml of DCM, filtered through a silica gel bed in the form of a DCM slurry and then recrystallized from acetonitrile. Yield: 28.5 g (95 mmol), 95%; purity: about 97% by NMR.

B)

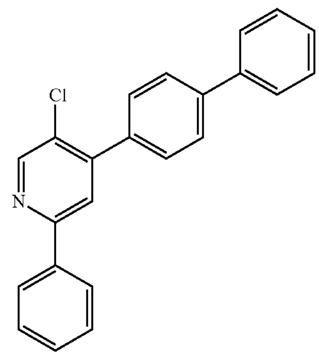 [SMILES: Clc1cnc(-c2ccccc2)cc1-c1ccc(-c2ccccc2)cc1]

Variant 1

Procedure as described in A), except that, rather than 4-biphenylboronic acid, 12.2 g (100 mmol) of phenylboronic acid [98-80-6] are used. Yield: 26.0 g (76 mmol), 76%; purity: about 97% by $^{1}$H NMR.

Variant 2

Alternatively, the Suzuki coupling can also be effected in the biphasic toluene/dioxane/water system (2:1:2 vv) using 3 equivalents of tripotassium phosphate and 1 mol % of bis(triphenylphosphino)palladium(II) chloride.

C) S600

A mixture of 34.2 g (100 mmol) of S600 Stage B), 17.2 g (110 mmol) of 2-chlorophenylboronic acid [3900-89-8], 63.7 g (300 mmol) of tripotassium phosphate, 1.64 g (4 mmol) of SPhos, 449 mg (2 mmol) of palladium(II) acetate, 600 ml of THF and 200 ml of water is heated under reflux for 24 h. After cooling, the aqueous phase is removed, the organic phase is concentrated to dryness, the glassy residue is taken up in 200 ml of ethyl acetate/DCM (4:1 vv) and filtered through a silica gel bed (about 500 g of silica gel) in the form of an ethyl acetate/DCM (4:1 vv) slurry, and the core fraction is separated out. The core fraction is concentrated to about 100 ml, and the crystallized product is filtered off with suction, washed twice with 50 ml each time of methanol and dried under reduced pressure. Further purification is effected by fractional Kugelrohr distillation under reduced pressure (~$10^{-3}$-$10^{-4}$ mbar), with removal of a little S600 Stage B) in the initial fraction, leaving higher oligomers. Yield: 29.7 g (71 mmol), 71%; purity: about 95% by $^{1}$H NMR.

Analogously, by using the corresponding boronic acids/esters in A), B) and C), the following compounds can be prepared:

| Ex. | Reactant Variant 1 | Product | Yield |
|---|---|---|---|
| S601 | 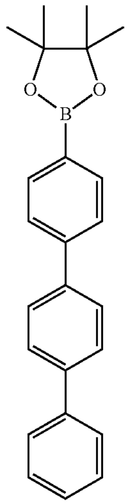 1080632-76-3 | 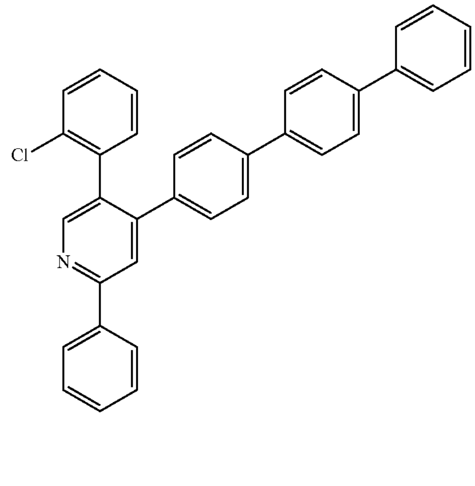 [SMILES: Clc1ccccc1-c1cnc(-c2ccccc2)cc1-c1ccc(-c2ccc(-c3ccccc3)cc2)cc1] | 53% |
| S602 | 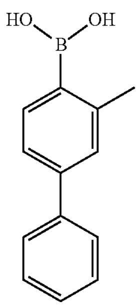 [SMILES: Cc1cc(-c2ccccc2)ccc1B(O)O] 1383628-42-9 | 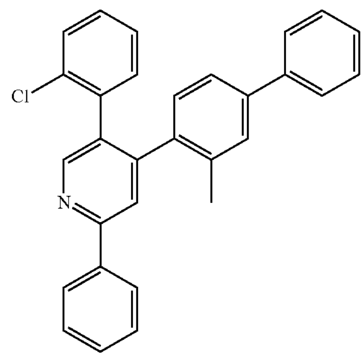 [SMILES: Cc1cc(-c2ccccc2)ccc1-c1cc(-c2ccccc2)ncc1-c1ccccc1Cl] | 48% |
| S603 | 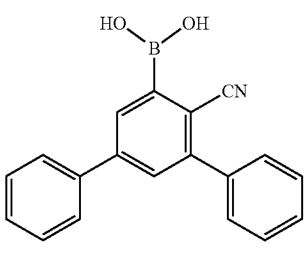 [SMILES: N#Cc1c(B(O)O)cc(-c2ccccc2)cc1-c1ccccc1] 2173324-06-4 | 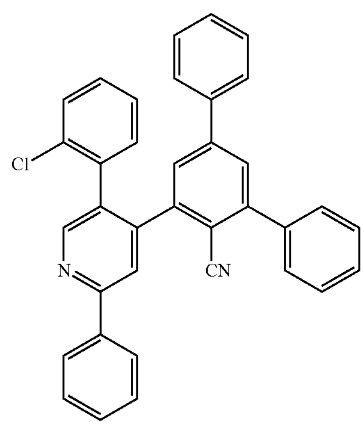 [SMILES: N#Cc1c(-c2ccccc2)cc(-c2ccccc2)cc1-c1cc(-c2ccccc2)ncc1-c1ccccc1Cl] | 46% |

-continued
| Ex. | Reactant Variant 1 | Product | Yield |
|---|---|---|---|
| S604 | 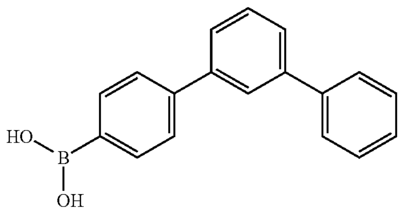 [SMILES: OB(O)c1ccc(-c2cccc(-c3ccccc3)c2)cc1] 1191061-81-0 | 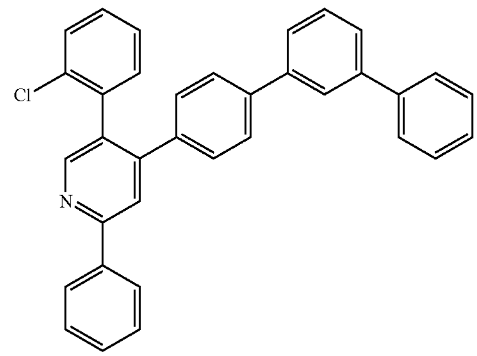 [SMILES: Clc1ccccc1-c1cnc(-c2ccccc2)cc1-c1ccc(-c2cccc(-c3ccccc3)c2)cc1] | 49% |
| S605 | 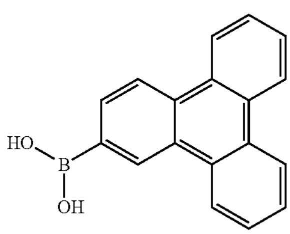 [SMILES: OB(O)c1ccc2c3ccccc3c3ccccc3c2c1] Variant 1 Variant 2 654664-63-8 | 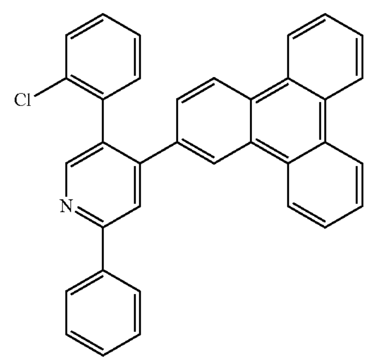 [SMILES: Clc1ccccc1-c1cnc(-c2ccccc2)cc1-c1ccc2c3ccccc3c3ccccc3c2c1] | 30% 58% |
| S606 | 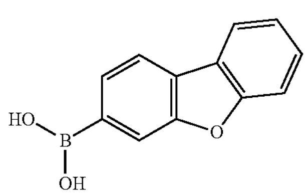 [SMILES: OB(O)c1ccc2c(c1)oc1ccccc12] 395087-89-5 | 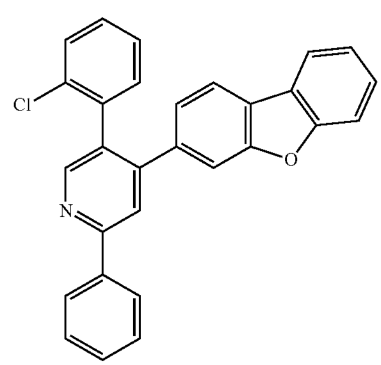 [SMILES: Clc1ccccc1-c1cnc(-c2ccccc2)cc1-c1ccc2c(c1)oc1ccccc12] | 47% |

-continued
| Ex. | Reactant Variant 1 | Product | Yield |
|---|---|---|---|
| S607 | 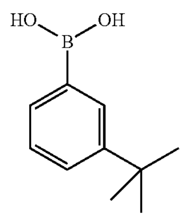 | 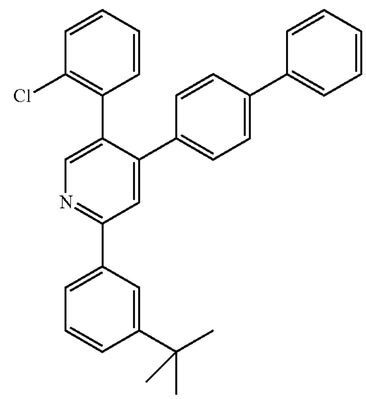 [SMILES: CC(C)(C)c1cccc(-c2cc(-c3ccc(-c4ccccc4)cc3)c(-c3ccccc3Cl)cn2)c1] | 48% |
| S607 | 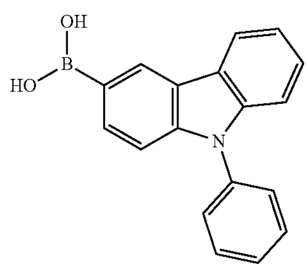 [SMILES: OB(O)c1ccc2c(c1)c1ccccc1n2-c1ccccc1] 854952-58-2 | 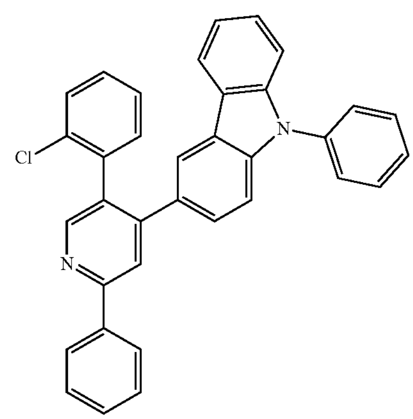 [SMILES: Clc1ccccc1-c1cnc(-c2ccccc2)cc1-c1ccc2c(c1)c1ccccc1n2-c1ccccc1] | 55% |
| S608 | 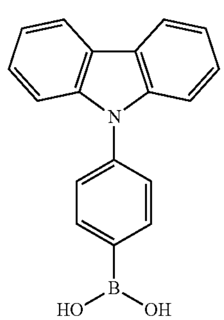 [SMILES: OB(O)c1ccc(-n2c3ccccc3c3ccccc32)cc1] Variant 1<br>Variant 2<br>419536-33-7 | 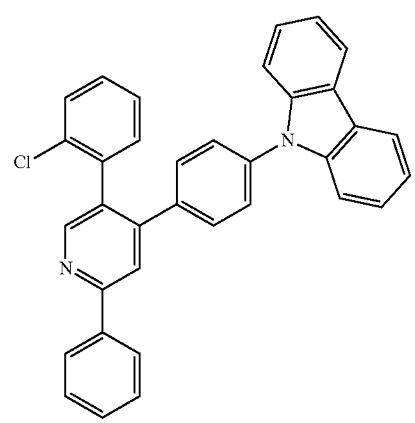 [SMILES: Clc1ccccc1-c1cnc(-c2ccccc2)cc1-c1ccc(-n2c3ccccc3c3ccccc32)cc1] | 39%<br>60% |

-continued

| Ex. | Reactant Variant 1 | Product | Yield |
|---|---|---|---|
| S609 | 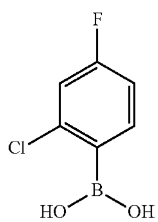 [SMILES: OB(O)c1ccc(F)cc1Cl] | 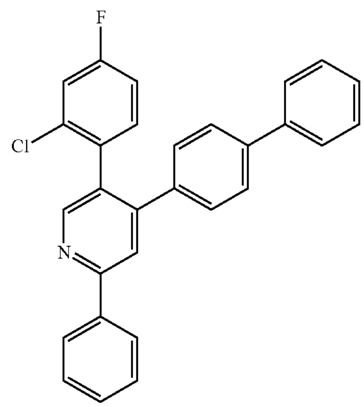 [SMILES: Fc1ccc(-c2cnc(-c3ccccc3)cc2-c2ccc(-c3ccccc3)cc2)c(Cl)c1] | 53% |

* over three stages

Example 650

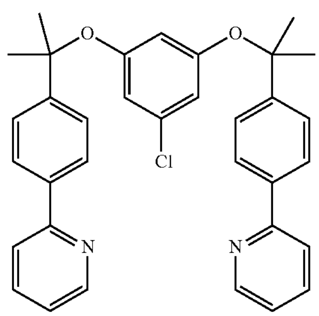 [SMILES: CC(C)(Oc1cc(Cl)cc(OC(C)(C)c2ccc(-c3ccccn3)cc2)c1)c1ccc(-c2ccccn2)cc1]

Procedure analogous to T. K. Salvador et al., J. Am. Chem. Soc., 138, 1658, 2016. A mixture of 60.2 g (300 mmol) of 2-[4-(1-methylethyl)phenyl]pyridine [1314959-26-6], 22.9 g (100 mmol) of 5-chloro-1,3-benzene diacetate [2096371-94-5], 36.6 g (250 mmol) of tert-butylperoxide [110-05-4], 5.2 g (10 mmol) of [$(MeO)_2$NN]Cu(re-toluene) [2052927-86-1] and 50 ml of t-butanol is heated to 90° C. in an autoclave while stirring for 30 h. After cooling, all volatile constituents are removed under reduced pressure, the residue is taken up in 50 ml of DCM and filtered through an Alox bed (Alox, basic, activity level 1, from Woelm), and the crude product thus obtained is chromatographed with ethyl acetate:n-heptane (1:1) on silica gel. Yield: 24.1 g (45 mmol), 45%; purity: about 95% by $^1$H NMR.

In an analogous manner, it is possible to prepare the following compounds:

| Ex. | Reactants | Product | Yield |
|---|---|---|---|
| S651 | 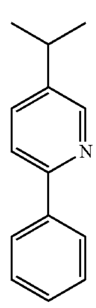 2096371-94-5 85391-13-5 | 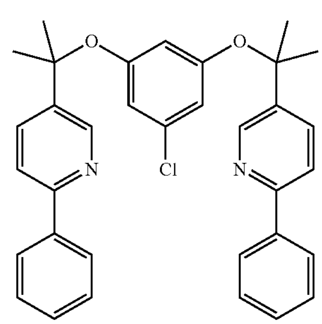 [SMILES: CC(C)(Oc1cc(Cl)cc(OC(C)(C)c2ccc(-c3ccccc3)nc2)c1)c1ccc(-c2ccccc2)nc1] | 38% |

-continued

| Ex. | Reactants | Product | Yield |
|---|---|---|---|
| S652 | 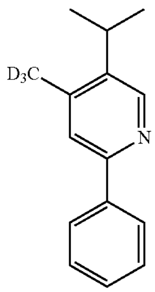 [SMILES: [2H]C([2H])([2H])c1cc(-c2ccccc2)ncc1C(C)C] 2096371-94-5 1689568-10-2 | 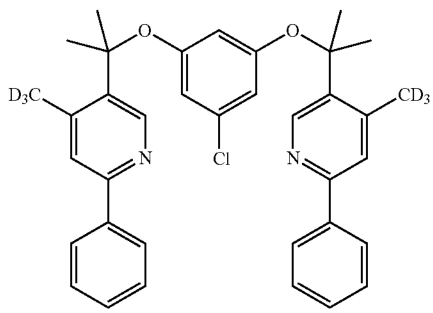 [SMILES: [2H]C([2H])([2H])c1cc(-c2ccccc2)ncc1C(C)(C)Oc1cc(Cl)cc(OC(C)(C)c2cnc(-c3ccccc3)cc2C([2H])([2H])[2H])c1] | 27% |
| S653 | 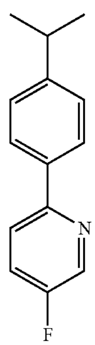 2096371-94-5 S17 | 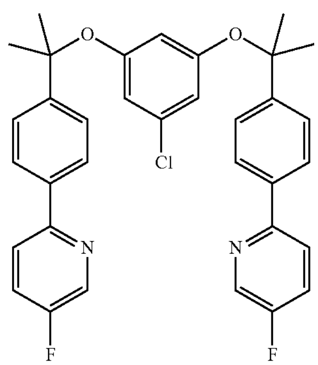 [SMILES: CC(C)(Oc1cc(Cl)cc(OC(C)(C)c2ccc(-c3ccc(F)cn3)cc2)c1)c1ccc(-c2ccc(F)cn2)cc1] | 24% |

B: Synthesis of the Ligands L

Example L1

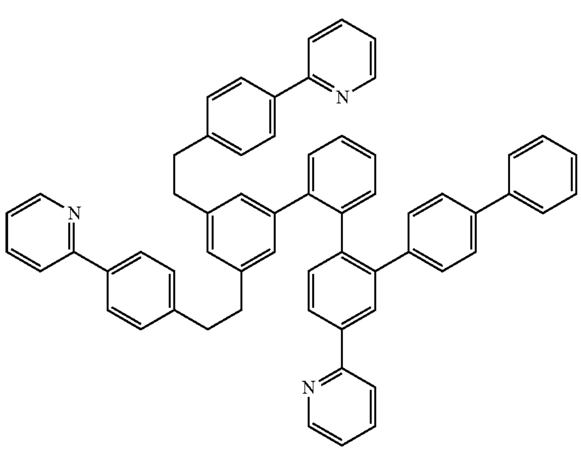 [SMILES: c1ccc(-c2ccc(-c3cc(-c4ccccn4)ccc3-c3ccccc3-c3cc(CCc4ccc(-c5ccccn5)cc4)cc(CCc4ccc(-c5ccccn5)cc4)c3)cc2)cc1]

To a mixture of 81.8 g (100 mmol) of S250, 30.6 g (110 mmol) of 2-[1,1'-biphenyl]-4-yl-4,4,5,5-tetramethyl-1,3,2-dioxaborolane [144432-80-4], 53.1 g (250 mmol) of tripotassium phosphate, 800 ml of THF and 200 ml of water are added, with vigorous stirring, 1.64 g (4 mmol) of SPhos and then 449 mg (2 mmol) of palladium(II) acetate, and the mixture is heated under reflux for 16 h. After cooling, the aqueous phase is removed, the organic phase is substantially concentrated, the residue is taken up in 500 ml of ethyl acetate, and the organic phase is washed twice with 300 ml each time of water, once with 2% aqueous N-acetylcysteine solution and once with 300 ml of saturated sodium chloride solution and dried over magnesium sulfate. The desiccant is filtered off by means of a silica gel bed in the form of an ethyl acetate slurry, which is washed through with ethyl acetate, the filtrate is concentrated to dryness and the residue is recrystallized from about 200 ml of acetonitrile at boiling. Yield: 60.0 g (73 mmol), 73%; purity: about 97% by $^{1}H$ NMR.

In an analogous manner, it is possible to prepare the following compounds:

| Ex. | Reactant | Product | Yield |
|---|---|---|---|
| L2 | 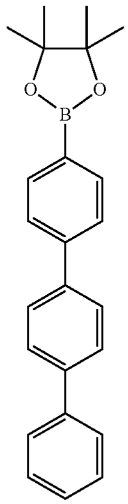 S250 1080632-76-3 | 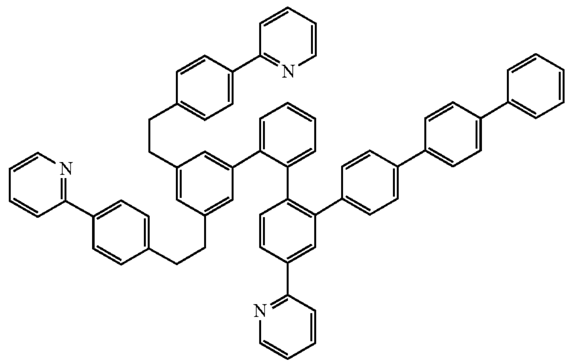 [SMILES: c1ccc(-c2ccc(-c3ccc(-c4cc(-c5ccccn5)ccc4-c4ccccc4-c4cc(CCc5ccc(-c6ccccn6)cc5)cc(CCc5ccc(-c6ccccn6)cc5)c4)cc3)cc2)cc1] | 78% |
| L3 | 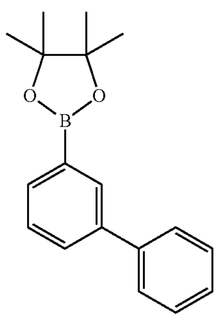 [SMILES: CC1(C)OB(c2cccc(-c3ccccc3)c2)OC1(C)C] S250 912844-88-3 | 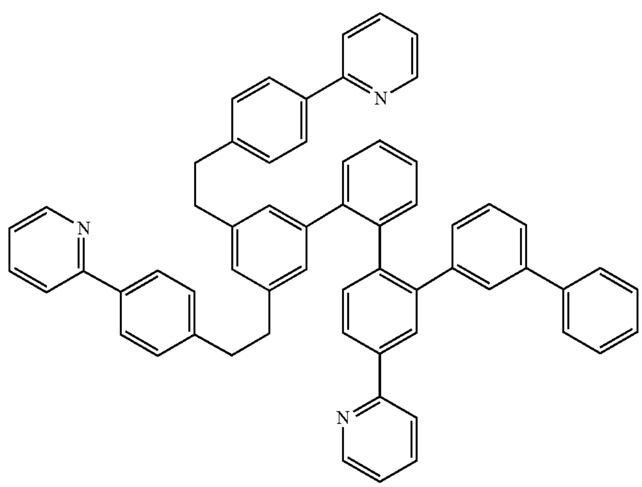 [SMILES: c1ccc(-c2cccc(-c3cc(-c4ccccn4)ccc3-c3ccccc3-c3cc(CCc4ccc(-c5ccccn5)cc4)cc(CCc4ccc(-c5ccccn5)cc4)c3)c2)cc1] | 78% |
| L4 | 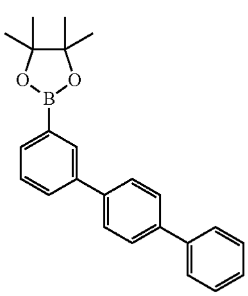 [SMILES: CC1(C)OB(c2cccc(-c3ccc(-c4ccccc4)cc3)c2)OC1(C)C] S250 1401577-23-8 | 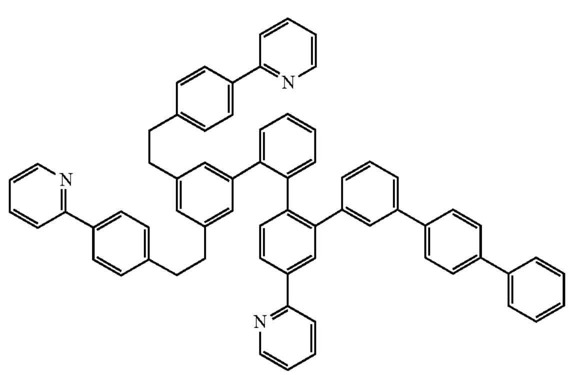 [SMILES: c1ccc(-c2ccc(-c3cccc(-c4cc(-c5ccccn5)ccc4-c4ccccc4-c4cc(CCc5ccc(-c6ccccn6)cc5)cc(CCc5ccc(-c6ccccn6)cc5)c4)c3)cc2)cc1] | 74% |

-continued
| Ex. | Reactant | Product | Yield |
|---|---|---|---|
| L5 | 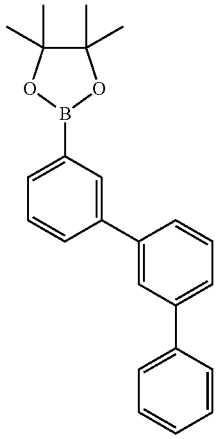 [SMILES: CC1(C)OB(c2cccc(-c3cccc(-c4ccccc4)c3)c2)OC1(C)C] S250 1115023-84-1 | 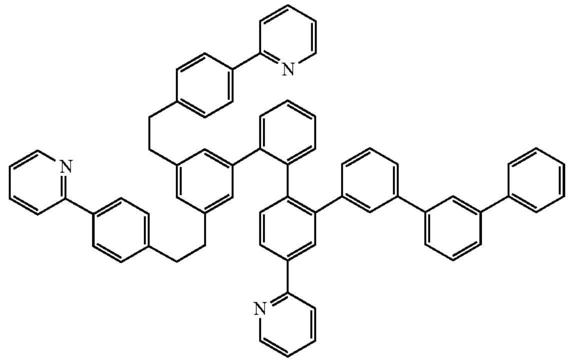 [SMILES: c1ccc(-c2cccc(-c3cccc(-c4cc(-c5ccccn5)ccc4-c4ccccc4-c4cc(CCc5ccc(-c6ccccn6)cc5)cc(CCc5ccc(-c6ccccn6)cc5)c4)c3)c2)cc1] | 73% |
| L6 | 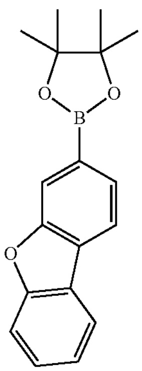 [SMILES: CC1(C)OB(c2ccc3c(c2)oc2ccccc23)OC1(C)C] S250 1056113-50-8 | 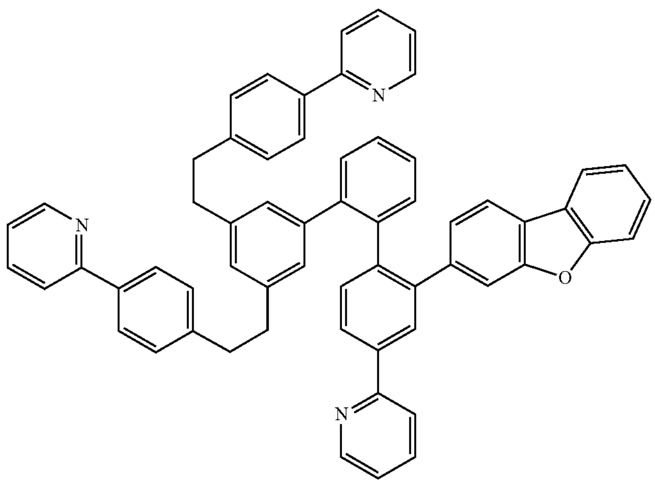 [SMILES: c1ccc(-c2ccc(CCc3cc(CCc4ccc(-c5ccccn5)cc4)cc(-c4ccccc4-c4ccc(-c5ccccn5)cc4-c4ccc5c(c4)oc4ccccc45)c3)cc2)nc1] | 77% |
| L7 | 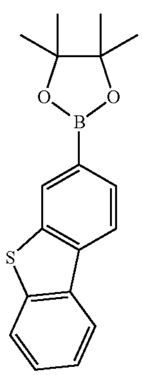 [SMILES: CC1(C)OB(c2ccc3c(c2)sc2ccccc23)OC1(C)C] S250 1362691-15-3 | 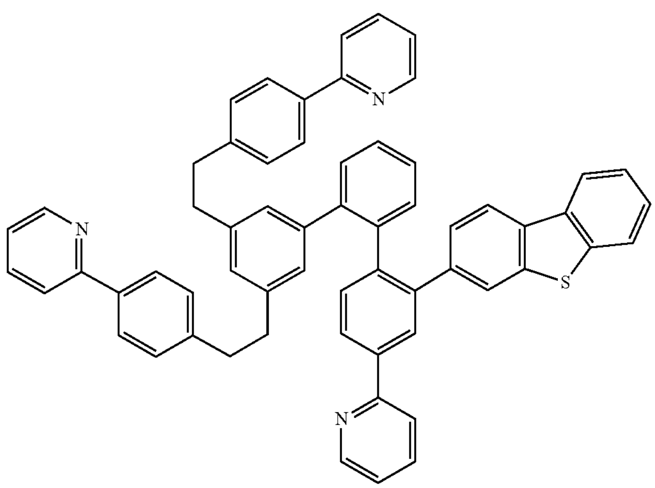 [SMILES: c1ccc(-c2ccc(CCc3cc(CCc4ccc(-c5ccccn5)cc4)cc(-c4ccccc4-c4ccc(-c5ccccn5)cc4-c4ccc5c(c4)sc4ccccc45)c3)cc2)nc1] | 75% |

-continued
| Ex. | Reactant | Product | Yield |
| --- | --- | --- | --- |
| L8 | 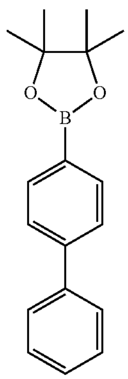 S251 144432-80-4 | 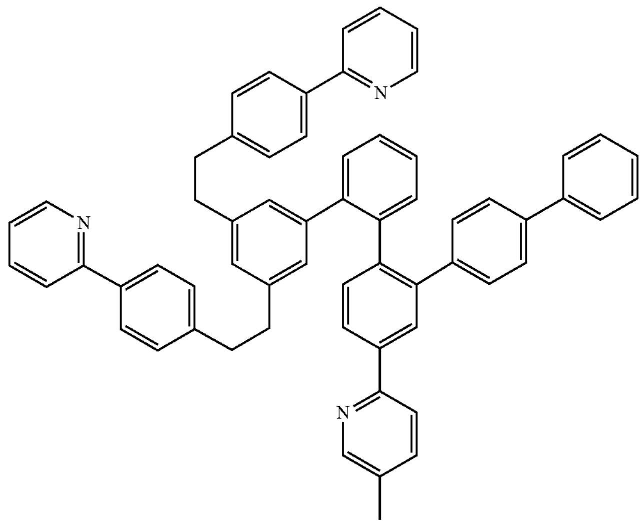 [SMILES: Cc1ccc(-c2ccc(-c3ccccc3-c3cc(CCc4ccc(-c5ccccn5)cc4)cc(CCc4ccc(-c5ccccn5)cc4)c3)c(-c3ccc(-c4ccccc4)cc3)c2)nc1] | 81% |
| L9 | 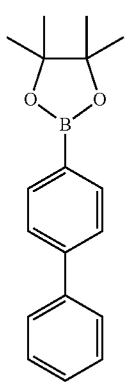 S252 144432-80-4 | 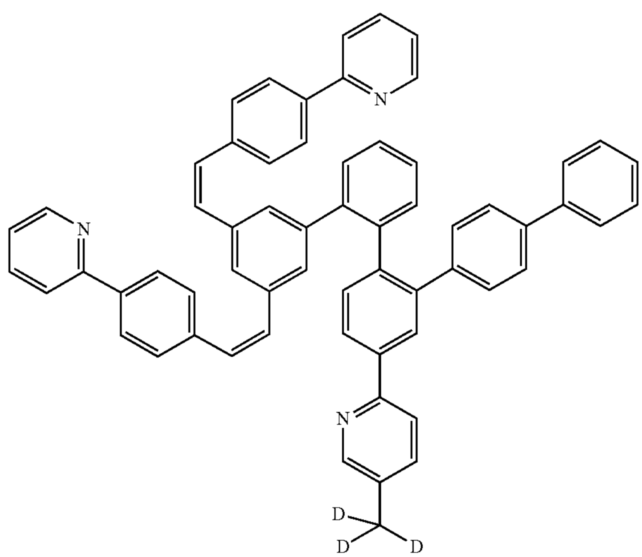 [SMILES: [2H]C([2H])([2H])c1ccc(-c2ccc(-c3ccccc3-c3cc(/C=C\c4ccc(-c5ccccn5)cc4)cc(/C=C\c4ccc(-c5ccccn5)cc4)c3)c(-c3ccc(-c4ccccc4)cc3)c2)nc1] | 77% |

-continued
| Ex. | Reactant | Product | Yield |
|---|---|---|---|
| L10 | 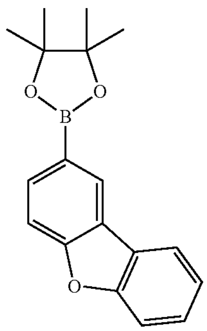 [SMILES: CC1(C)OB(c2ccc3oc4ccccc4c3c2)OC1(C)C] S253 197770-80-1 | 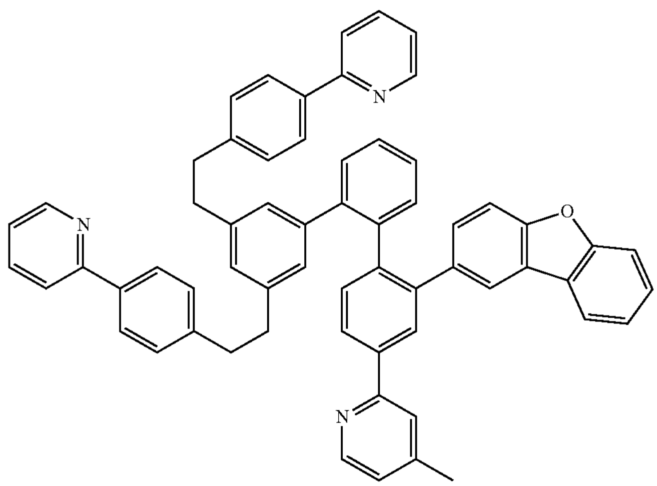 [SMILES: Cc1ccnc(-c2ccc(-c3ccccc3-c3cc(CCc4ccc(-c5ccccn5)cc4)cc(CCc4ccc(-c5ccccn5)cc4)c3)c(-c3ccc4oc5ccccc5c4c3)c2)c1] | 79% |
| L11 | 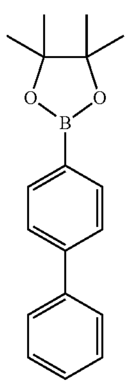 S254 144432-80-4 | 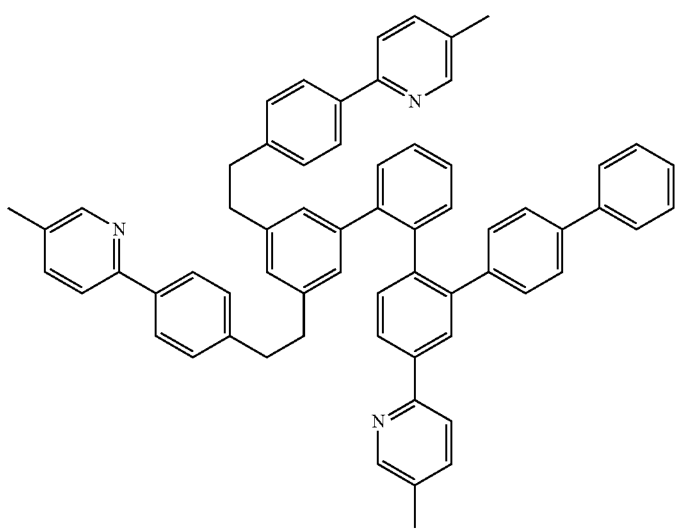 [SMILES: Cc1ccc(-c2ccc(CCc3cc(CCc4ccc(-c5ccc(C)cn5)cc4)cc(-c4ccccc4-c4ccc(-c5ccc(C)cn5)cc4-c4ccc(-c5ccccc5)cc4)c3)cc2)nc1] | 74% |

-continued
| Ex. | Reactant | Product | Yield |
|---|---|---|---|
| L12 | 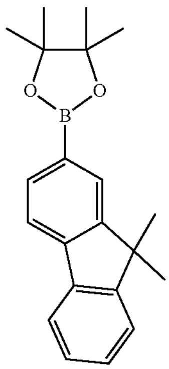 S255 569343-09-5 | 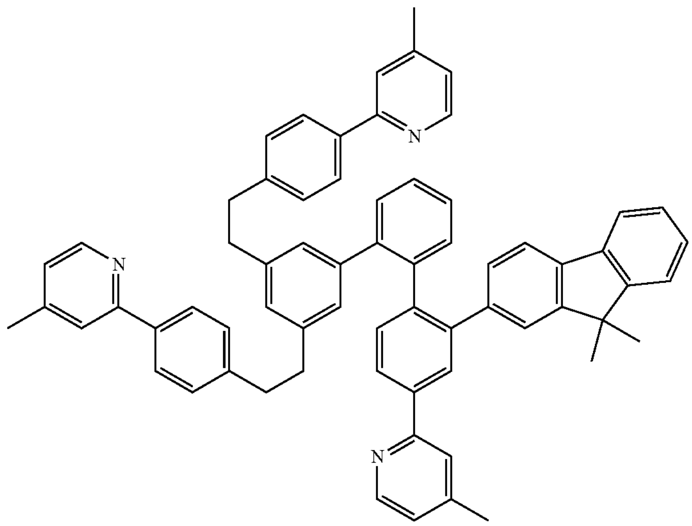 [SMILES: Cc1ccnc(-c2ccc(CCc3cc(CCc4ccc(-c5cc(C)ccn5)cc4)cc(-c4ccccc4-c4ccc(-c5cc(C)ccn5)cc4-c4ccc5c(c4)C(C)(C)c4ccccc4-5)c3)cc2)c1] | 82% |
| L13 | 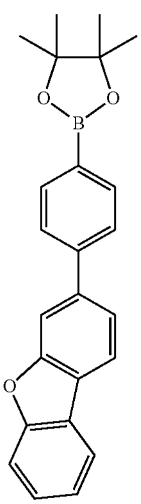 [SMILES: CC1(C)OB(c2ccc(-c3ccc4c(c3)oc3ccccc34)cc2)OC1(C)C] S256 2007912-69-6 | 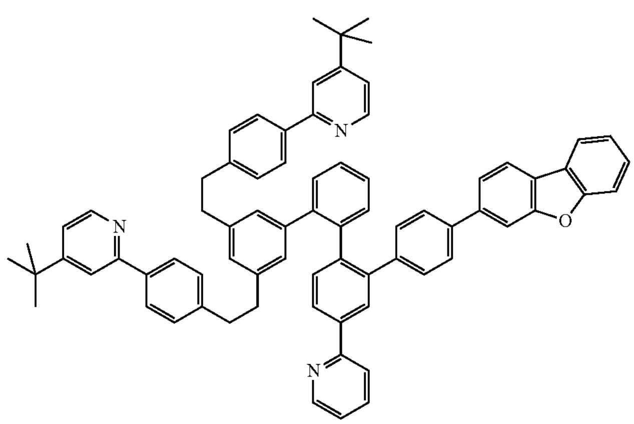 [SMILES: CC(C)(C)c1ccnc(-c2ccc(CCc3cc(CCc4ccc(-c5cc(C(C)(C)C)ccn5)cc4)cc(-c4ccccc4-c4ccc(-c5ccccn5)cc4-c4ccc(-c5ccc6c(c5)oc5ccccc56)cc4)c3)cc2)c1] | 78% |

-continued
| Ex. | Reactant | Product | Yield |
|---|---|---|---|
| L14 | 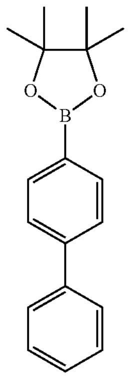<br>S257<br>144432-80-4 | 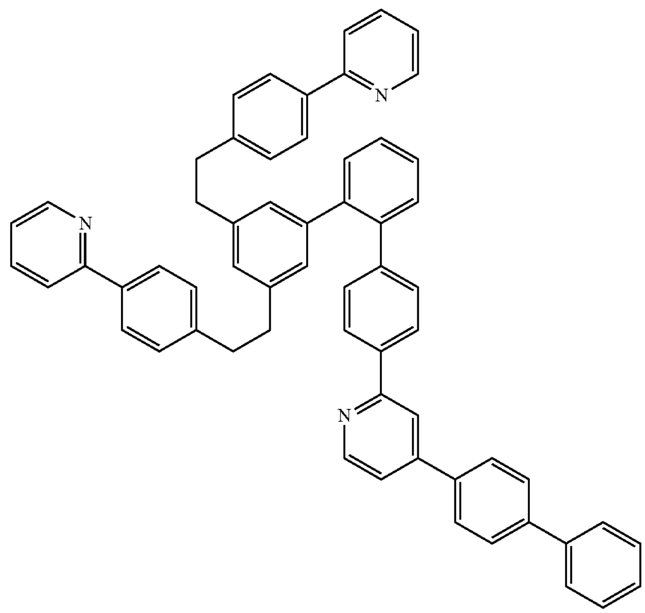 [SMILES: c1ccc(-c2ccc(-c3ccnc(-c4ccc(-c5ccccc5-c5cc(CCc6ccc(-c7ccccn7)cc6)cc(CCc6ccc(-c7ccccn7)cc6)c5)cc4)c3)cc2)cc1] | 79% |
| L15 | 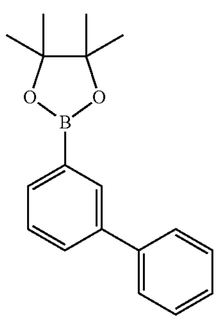 [SMILES: CC1(C)OB(c2cccc(-c3ccccc3)c2)OC1(C)C]<br>S257<br>912844-88-3 | 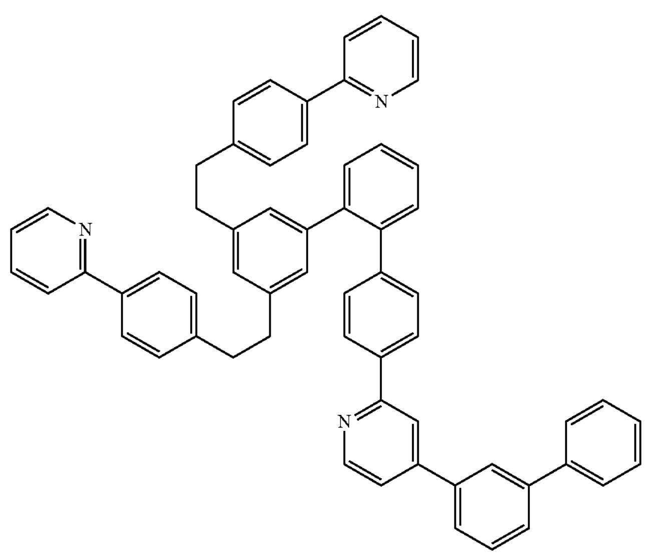 [SMILES: c1ccc(-c2cccc(-c3ccnc(-c4ccc(-c5ccccc5-c5cc(CCc6ccc(-c7ccccn7)cc6)cc(CCc6ccc(-c7ccccn7)cc6)c5)cc4)c3)c2)cc1] | 76% |

-continued
| Ex. | Reactant | Product | Yield |
|---|---|---|---|
| L16 | 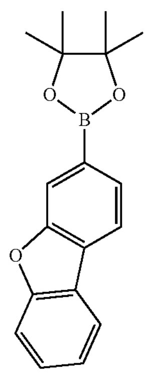 [SMILES: CC1(C)OB(c2ccc3c(c2)oc2ccccc23)OC1(C)C] S257 1056113-50-8 | 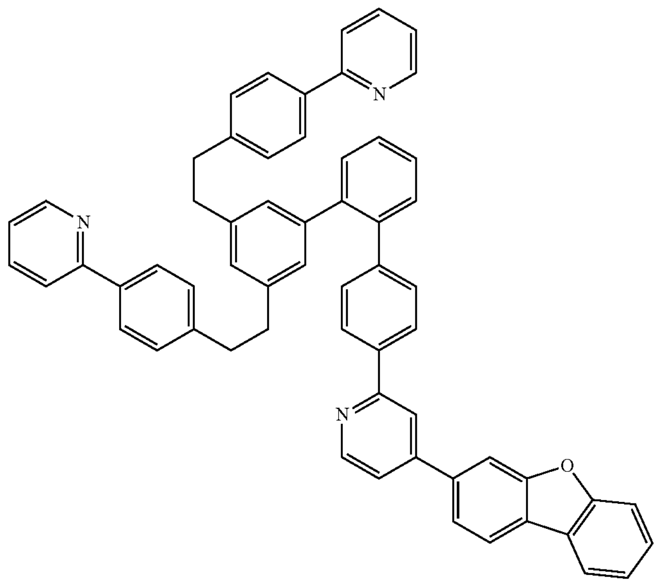 [SMILES: c1ccc(-c2ccc(CCc3cc(CCc4ccc(-c5ccccn5)cc4)cc(-c4ccccc4-c4ccc(-c5cc(-c6ccc7c(c6)oc6ccccc67)ccn5)cc4)c3)cc2)nc1] | 80% |
| L17 | 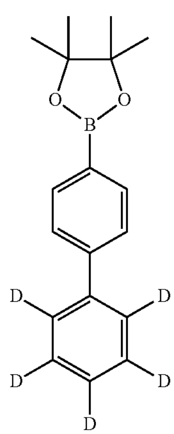 S258 1197180-12-3 | 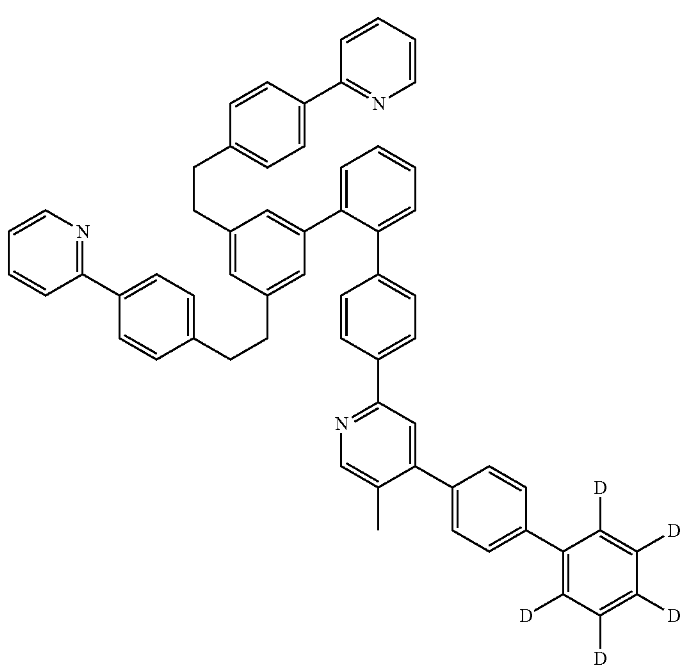 [SMILES: [2H]c1c([2H])c([2H])c(-c2ccc(-c3cc(-c4ccc(-c5ccccc5-c5cc(CCc6ccc(-c7ccccn7)cc6)cc(CCc6ccc(-c7ccccn7)cc6)c5)cc4)ncc3C)cc2)c([2H])c1[2H]] | 73% |

-continued
| Ex. | Reactant | Product | Yield |
|---|---|---|---|
| L18 | 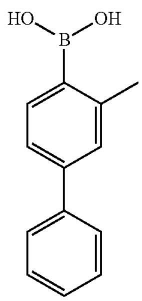<br>S259<br>1383628-42-9 | 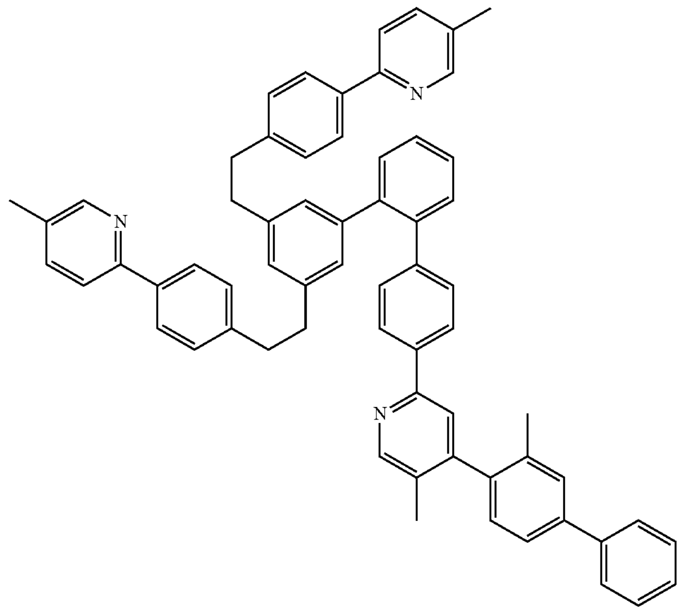 [SMILES: Cc1ccc(-c2ccc(CCc3cc(CCc4ccc(-c5ccc(C)cn5)cc4)cc(-c4ccccc4-c4ccc(-c5cc(-c6ccc(-c7ccccc7)cc6C)c(C)cn5)cc4)c3)cc2)nc1] | 74% |
| L19 | 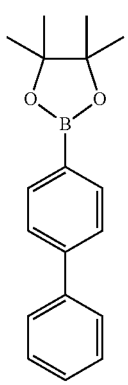<br>S260<br>144432-80-4 | 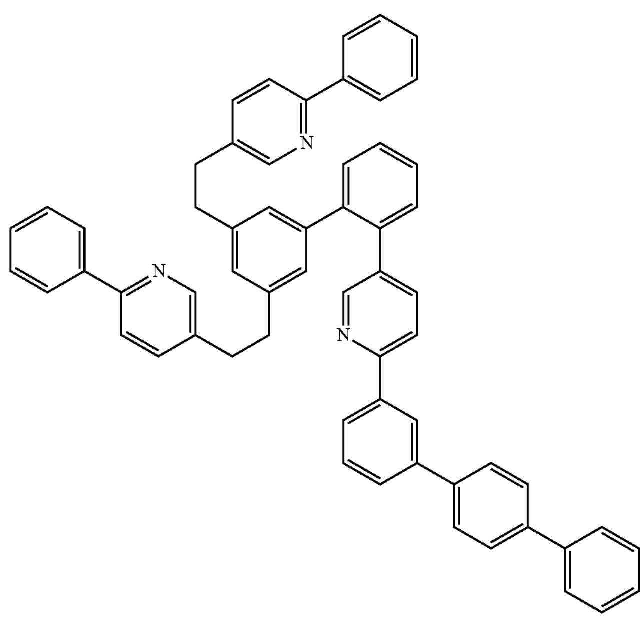 [SMILES: c1ccc(-c2ccc(-c3cccc(-c4ccc(-c5ccccc5-c5cc(CCc6ccc(-c7ccccc7)nc6)cc(CCc6ccc(-c7ccccc7)nc6)c5)cn4)c3)cc2)cc1] | 78% |

-continued
| Ex. | Reactant | Product | Yield |
|---|---|---|---|
| L20 | 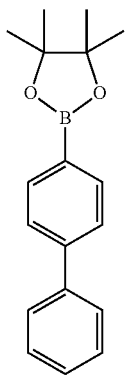 S261 144432-80-4 | 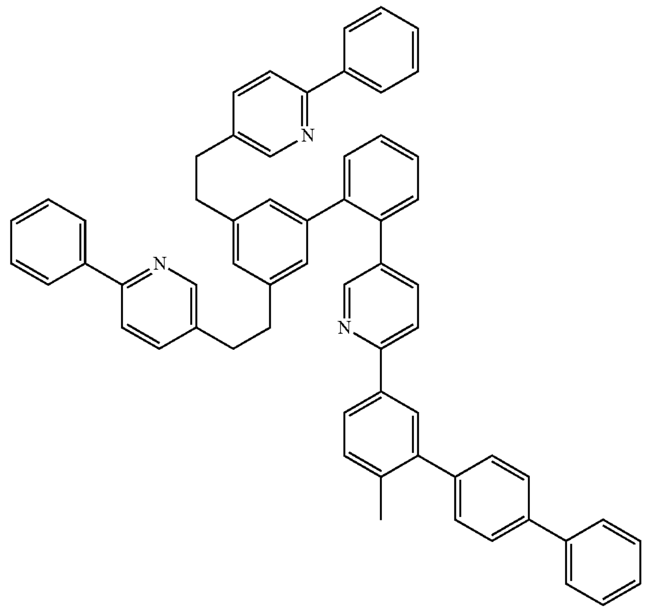 [SMILES: Cc1ccc(-c2ccc(-c3ccccc3-c3cc(CCc4ccc(-c5ccccc5)nc4)cc(CCc4ccc(-c5ccccc5)nc4)c3)cn2)cc1-c1ccc(-c2ccccc2)cc1] | 80% |
| L21 | 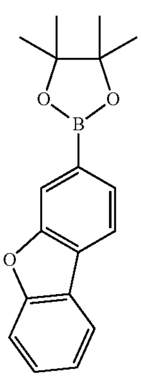 [SMILES: CC1(C)OB(c2ccc3c(c2)oc2ccccc23)OC1(C)C] S261 1056113-50-8 | 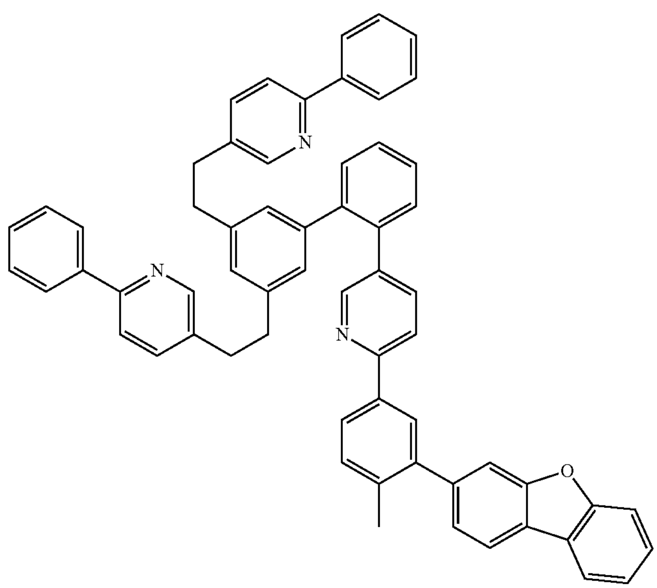 [SMILES: Cc1ccc(-c2ccc(-c3ccccc3-c3cc(CCc4ccc(-c5ccccc5)nc4)cc(CCc4ccc(-c5ccccc5)nc4)c3)cn2)cc1-c1ccc2c(c1)oc1ccccc12] | 73% |

-continued
| Ex. | Reactant | Product | Yield |
|---|---|---|---|
| L22 | 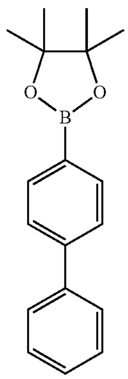 S262 144432-80-4 | 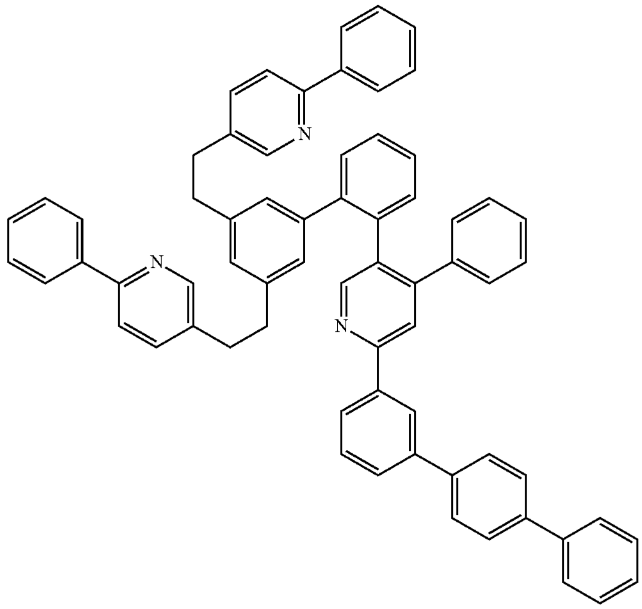 [SMILES: c1ccc(-c2ccc(-c3cccc(-c4cc(-c5ccccc5)c(-c5ccccc5-c5cc(CCc6ccc(-c7ccccc7)nc6)cc(CCc6ccc(-c7ccccc7)nc6)c5)cn4)c3)cc2)cc1] | 70% |
| L23 | 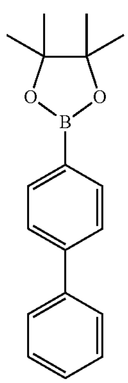 S263 144432-80-4 | 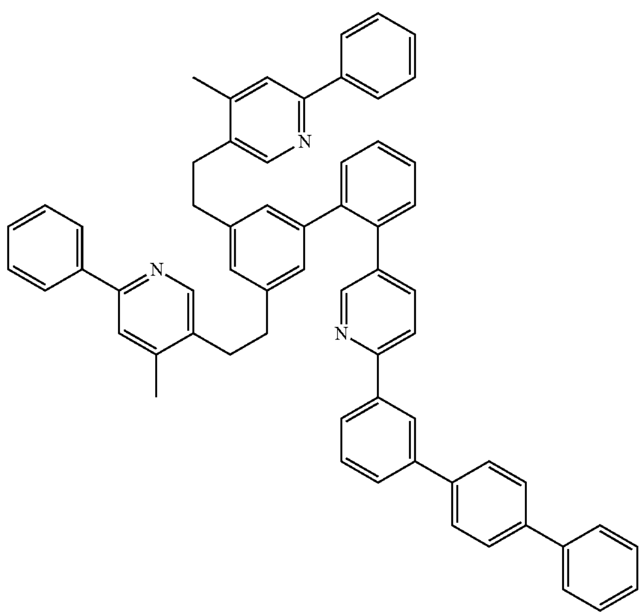 [SMILES: Cc1cc(-c2ccccc2)ncc1CCc1cc(CCc2cnc(-c3ccccc3)cc2C)cc(-c2ccccc2-c2ccc(-c3cccc(-c4ccc(-c5ccccc5)cc4)c3)nc2)c1] | 76% |

-continued
| Ex. | Reactant | Product | Yield |
| --- | --- | --- | --- |
| L24 | 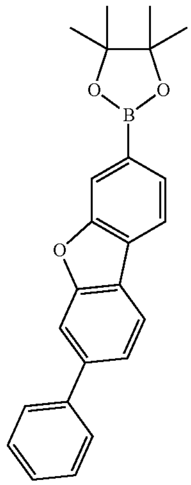 [SMILES: CC1(C)OB(c2ccc3c(c2)oc2cc(-c4ccccc4)ccc23)OC1(C)C] S264 1959608-16-2 | 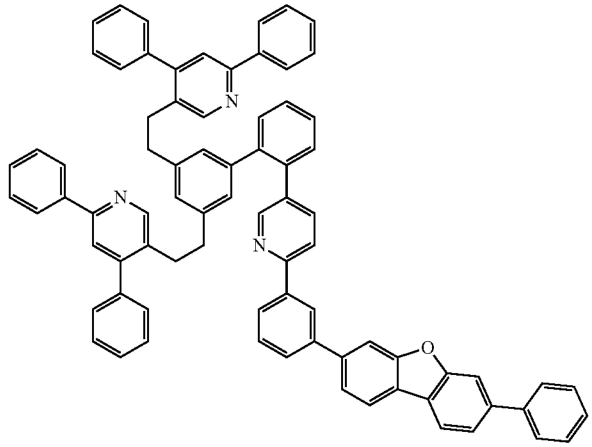 [SMILES: c1ccc(-c2ccc3c(c2)oc2cc(-c4cccc(-c5ccc(-c6ccccc6-c6cc(CCc7cnc(-c8ccccc8)cc7-c7ccccc7)cc(CCc7cnc(-c8ccccc8)cc7-c7ccccc7)c6)cn5)c4)ccc23)cc1] | 72% |
| L25 | 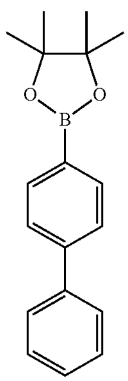 S265 144432-80-4 | 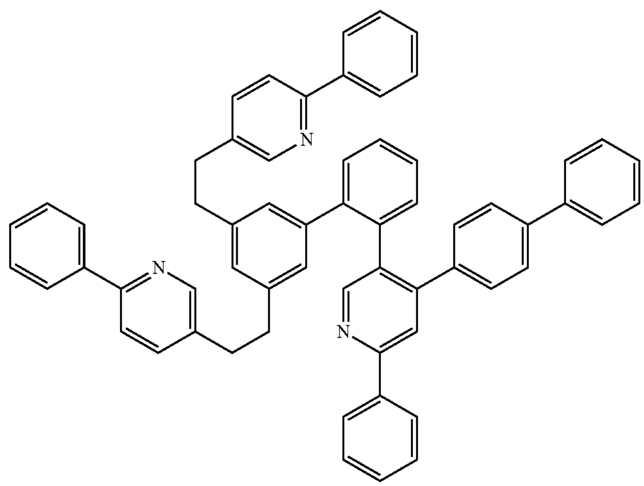 [SMILES: c1ccc(-c2ccc(-c3cc(-c4ccccc4)ncc3-c3ccccc3-c3cc(CCc4ccc(-c5ccccc5)nc4)cc(CCc4ccc(-c5ccccc5)nc4)c3)cc2)cc1] | 80% |
| L26 | 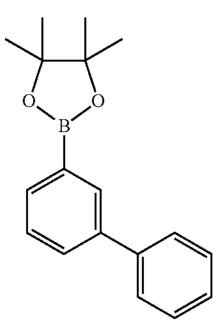 [SMILES: CC1(C)OB(c2cccc(-c3ccccc3)c2)OC1(C)C] S265 912844-88-3 | 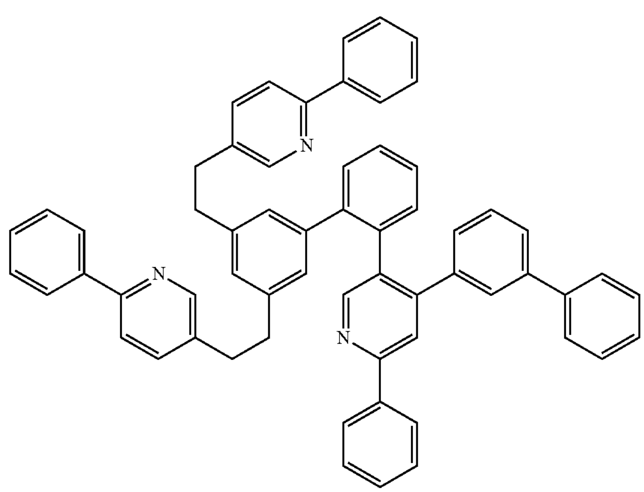 [SMILES: c1ccc(-c2cccc(-c3cc(-c4ccccc4)ncc3-c3ccccc3-c3cc(CCc4ccc(-c5ccccc5)nc4)cc(CCc4ccc(-c5ccccc5)nc4)c3)c2)cc1] | 74% |

-continued
| Ex. | Reactant | Product | Yield |
|---|---|---|---|
| L27 | 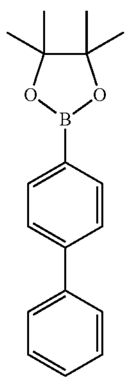 S266 144432-80-4 | 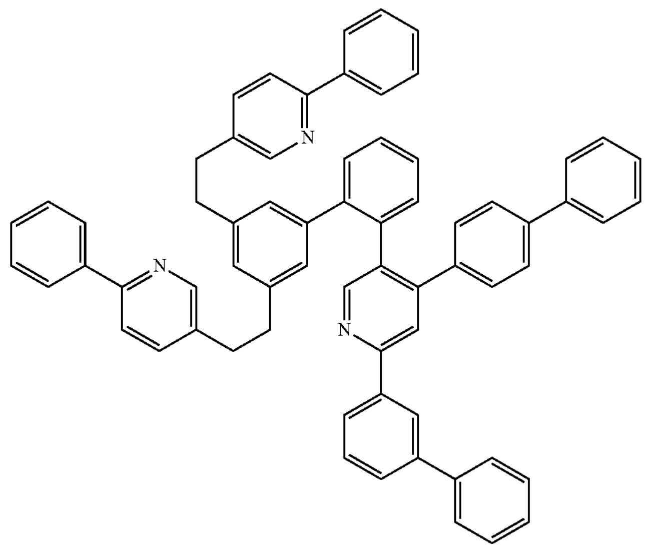 [SMILES: c1ccc(-c2ccc(-c3cc(-c4cccc(-c5ccccc5)c4)ncc3-c3ccccc3-c3cc(CCc4ccc(-c5ccccc5)nc4)cc(CCc4ccc(-c5ccccc5)nc4)c3)cc2)cc1] | 78% |
| L28 | 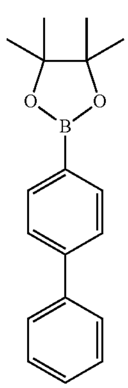 S267 144432-80-4 | 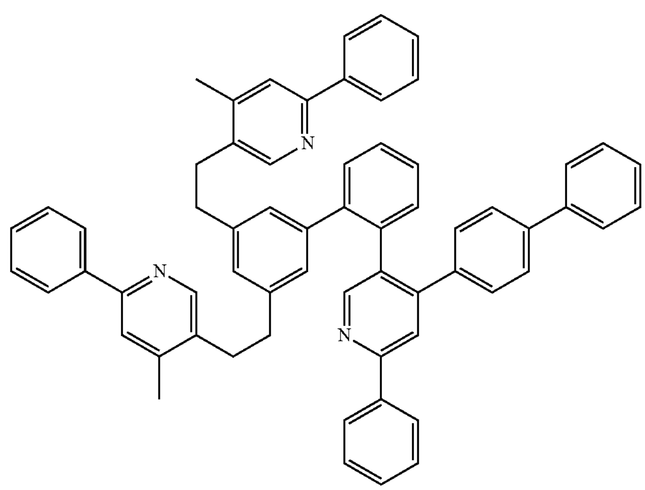 [SMILES: Cc1cc(-c2ccccc2)ncc1CCc1cc(CCc2cnc(-c3ccccc3)cc2C)cc(-c2ccccc2-c2cnc(-c3ccccc3)cc2-c2ccc(-c3ccccc3)cc2)c1] | 74% |

-continued
| Ex. | Reactant | Product | Yield |
|---|---|---|---|
| L29 | 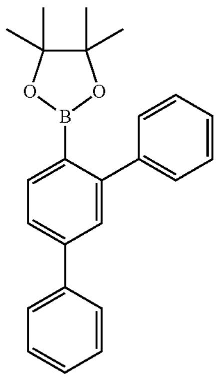 [SMILES: CC1(C)OB(c2ccc(-c3ccccc3)cc2-c2ccccc2)OC1(C)C] S267 583823-92-1 | 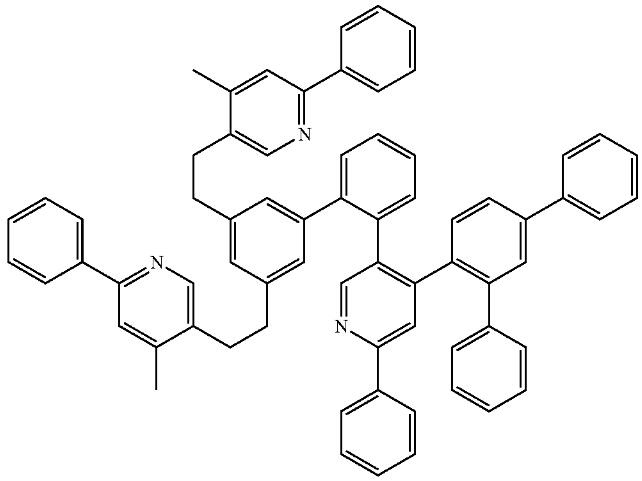 [SMILES: Cc1cc(-c2ccccc2)ncc1CCc1cc(CCc2cnc(-c3ccccc3)cc2C)cc(-c2ccccc2-c2cnc(-c3ccccc3)cc2-c2ccc(-c3ccccc3)cc2-c2ccccc2)c1] | 76% |
| L30 | 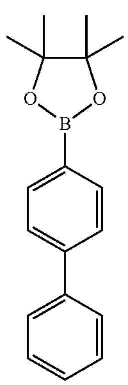 S268 144432-80-4 | 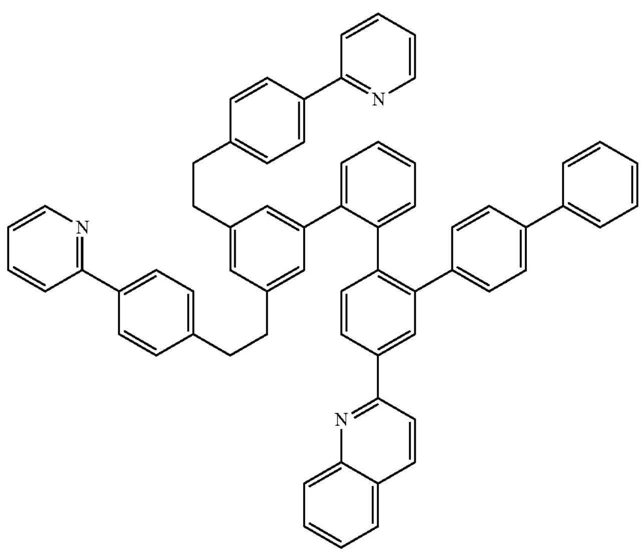 [SMILES: c1ccc(-c2ccc(-c3cc(-c4ccc5ccccc5n4)ccc3-c3ccccc3-c3cc(CCc4ccc(-c5ccccn5)cc4)cc(CCc4ccc(-c5ccccn5)cc4)c3)cc2)cc1] | 72% |

-continued
| Ex. | Reactant | Product | Yield |
|---|---|---|---|
| L31 | 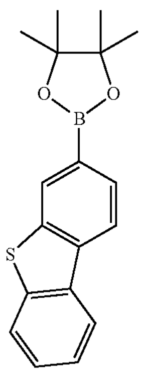 [SMILES: CC1(C)OB(c2ccc3c(c2)sc2ccccc23)OC1(C)C]<br>S269<br>1362691-15-3 | 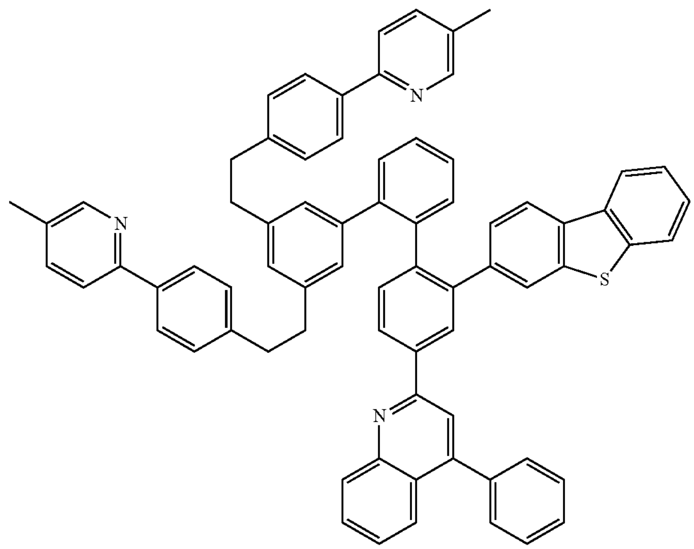 [SMILES: Cc1ccc(-c2ccc(CCc3cc(CCc4ccc(-c5ccc(C)cn5)cc4)cc(-c4ccccc4-c4ccc(-c5cc(-c6ccccc6)c6ccccc6n5)cc4-c4ccc5c(c4)sc4ccccc45)c3)cc2)nc1] | 74% |
| L32 | 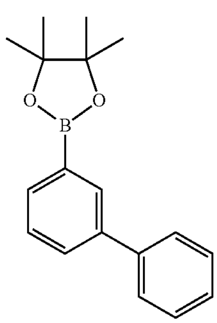 [SMILES: CC1(C)OB(c2cccc(-c3ccccc3)c2)OC1(C)C]<br>S270<br>912844-88-3 | 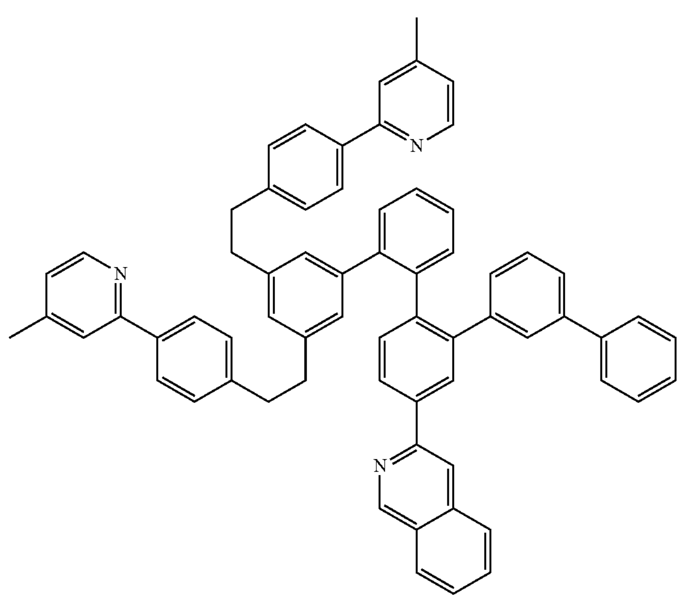 [SMILES: Cc1ccnc(-c2ccc(CCc3cc(CCc4ccc(-c5cc(C)ccn5)cc4)cc(-c4ccccc4-c4ccc(-c5cc6ccccc6cn5)cc4-c4cccc(-c5ccccc5)c4)c3)cc2)c1] | 78% |

-continued
| Ex. | Reactant | Product | Yield |
| --- | --- | --- | --- |
| L33 | 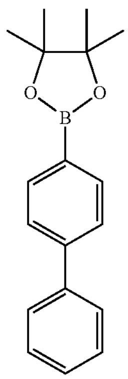 S271 144432-80-4 | 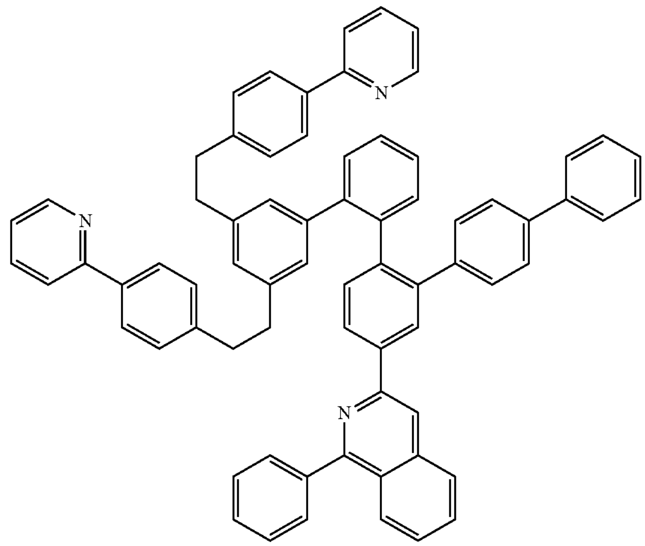 [SMILES: c1ccc(-c2ccc(-c3cc(-c4cc5ccccc5c(-c5ccccc5)n4)ccc3-c3ccccc3-c3cc(CCc4ccc(-c5ccccn5)cc4)cc(CCc4ccc(-c5ccccn5)cc4)c3)cc2)cc1] | 75% |
| L34 | 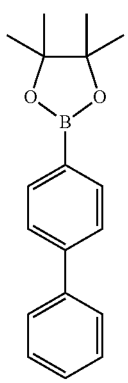 S272 144432-80-4 | 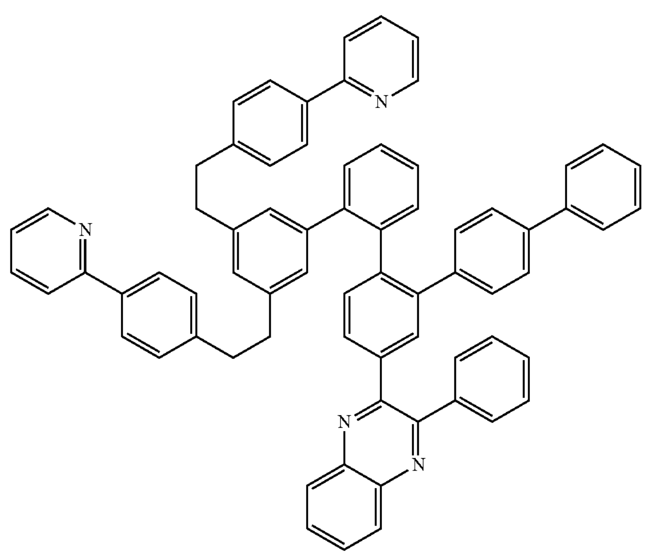 [SMILES: c1ccc(-c2ccc(-c3cc(-c4nc5ccccc5nc4-c4ccccc4)ccc3-c3ccccc3-c3cc(CCc4ccc(-c5ccccn5)cc4)cc(CCc4ccc(-c5ccccn5)cc4)c3)cc2)cc1] | 80% |

-continued
| Ex. | Reactant | Product | Yield |
|---|---|---|---|
| L35 | 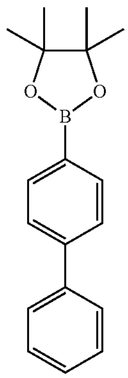 S273 144432-80-4 | 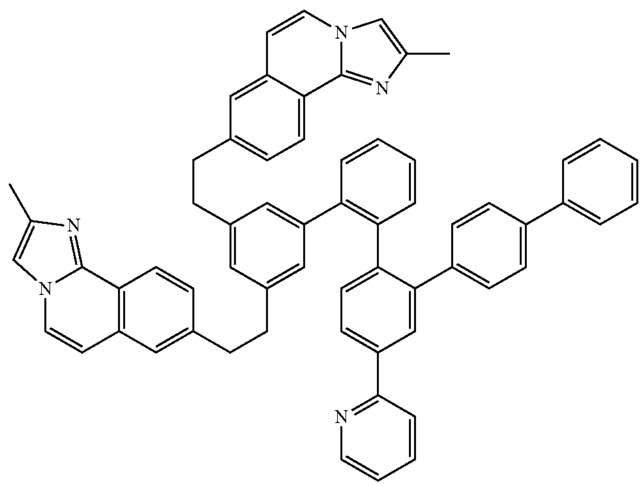 [SMILES: Cc1cn2ccc3cc(CCc4cc(CCc5ccc6c(ccn7cc(C)nc67)c5)cc(-c5ccccc5-c5ccc(-c6ccccn6)cc5-c5ccc(-c6ccccc6)cc5)c4)ccc3c2n1] | 76% |
| L36 | 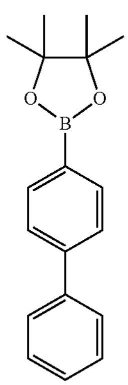 S274 144432-80-4 | 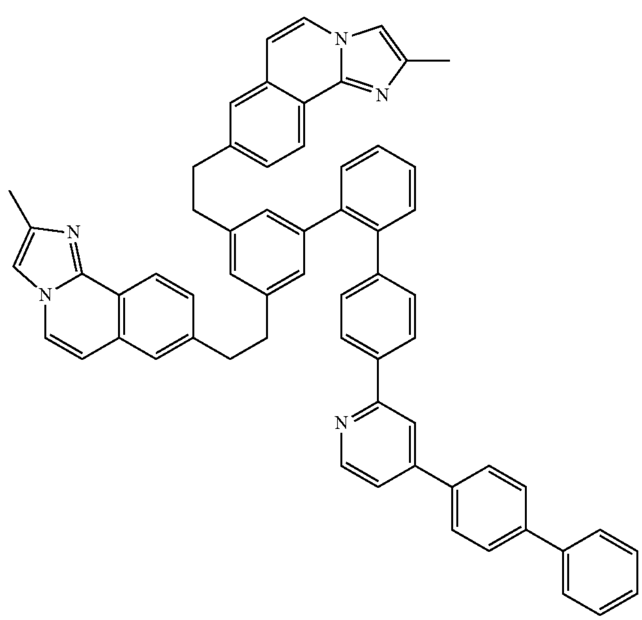 [SMILES: Cc1cn2ccc3cc(CCc4cc(CCc5ccc6c(ccn7cc(C)nc67)c5)cc(-c5ccccc5-c5ccc(-c6cc(-c7ccc(-c8ccccc8)cc7)ccn6)cc5)c4)ccc3c2n1] | 79% |

-continued
| Ex. | Reactant | Product | Yield |
| --- | --- | --- | --- |
| L37 | 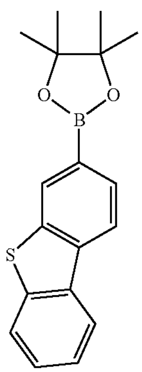 [SMILES: CC1(C)OB(c2ccc3c(c2)sc2ccccc23)OC1(C)C] S275 1362691-15-3 | 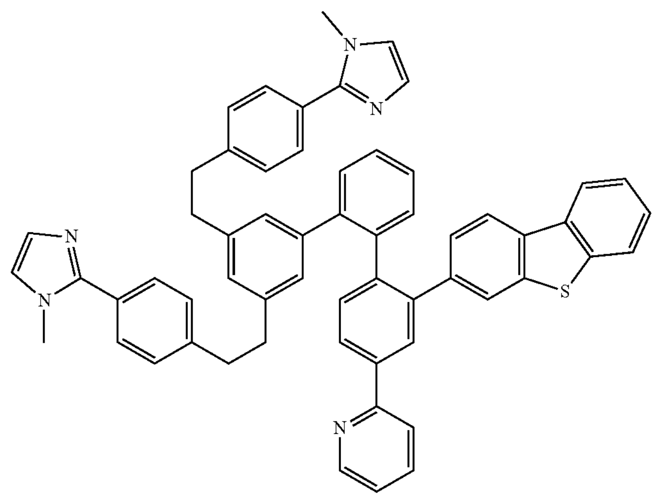 [SMILES: Cn1ccnc1-c1ccc(CCc2cc(CCc3ccc(-c4nccn4C)cc3)cc(-c3ccccc3-c3ccc(-c4ccccn4)cc3-c3ccc4c(c3)sc3ccccc34)c2)cc1] | 80% |
| L38 | 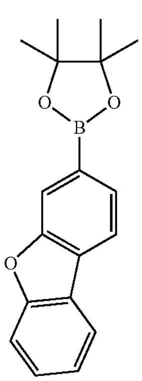 [SMILES: CC1(C)OB(c2ccc3c(c2)oc2ccccc23)OC1(C)C] S276 1056113-50-8 | 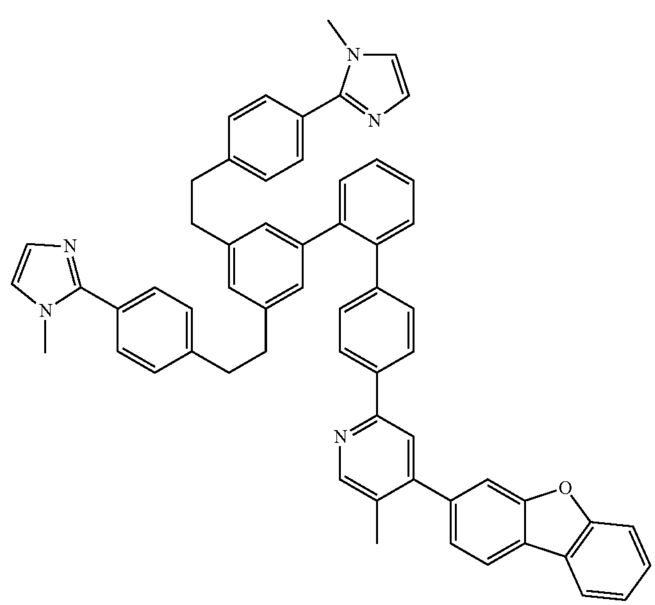 [SMILES: Cc1cnc(-c2ccc(-c3ccccc3-c3cc(CCc4ccc(-c5nccn5C)cc4)cc(CCc4ccc(-c5nccn5C)cc4)c3)cc2)cc1-c1ccc2c(c1)oc1ccccc12] | 73% |

-continued
| Ex. | Reactant | Product | Yield |
|---|---|---|---|
| L39 | 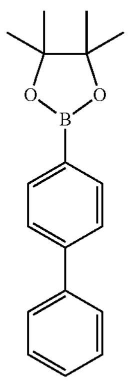 S277 144432-80-4 | 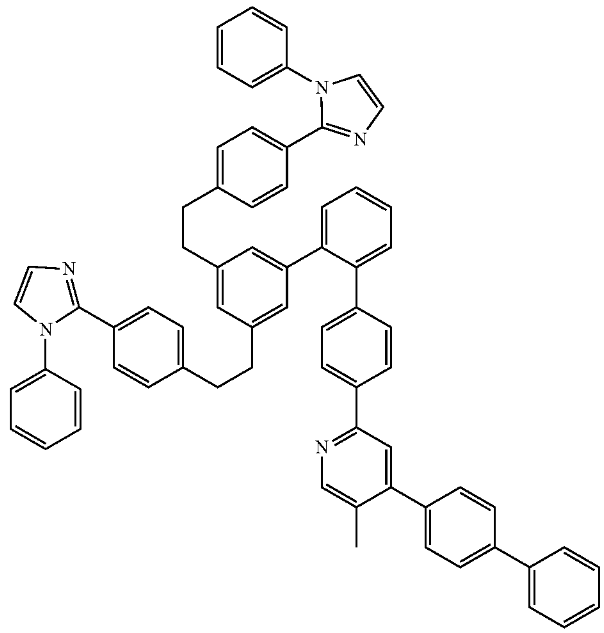 [SMILES: Cc1cnc(-c2ccc(-c3ccccc3-c3cc(CCc4ccc(-c5nccn5-c5ccccc5)cc4)cc(CCc4ccc(-c5nccn5-c5ccccc5)cc4)c3)cc2)cc1-c1ccc(-c2ccccc2)cc1] | 79% |
| L40 | 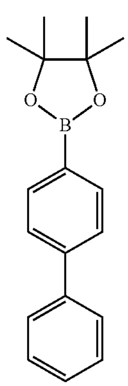 S278 144432-80-4 | 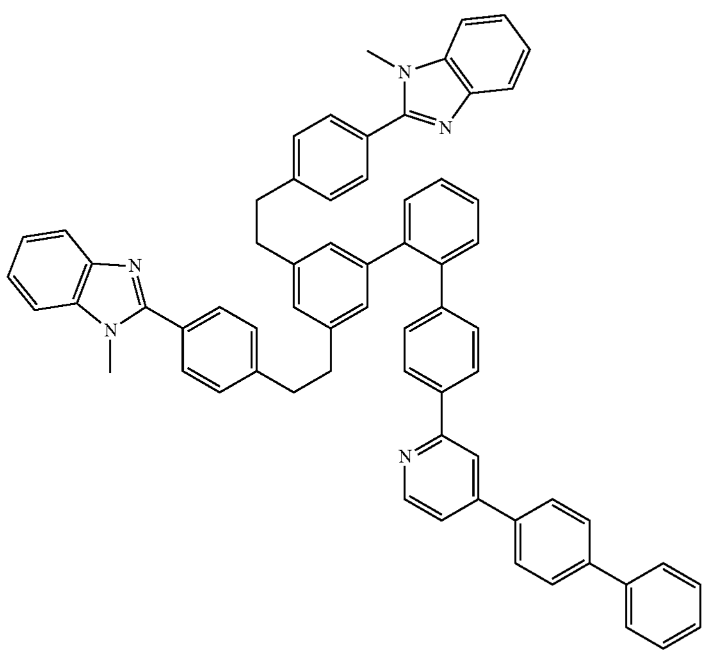 [SMILES: Cn1c(-c2ccc(CCc3cc(CCc4ccc(-c5nc6ccccc6n5C)cc4)cc(-c4ccccc4-c4ccc(-c5cc(-c6ccc(-c7ccccc7)cc6)ccn5)cc4)c3)cc2)nc2ccccc21] | 71% |

-continued
| Ex. | Reactant | Product | Yield |
|---|---|---|---|
| L41 | 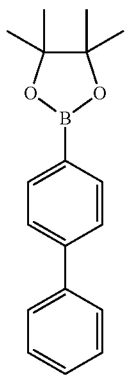 S279 144432-80-4 | 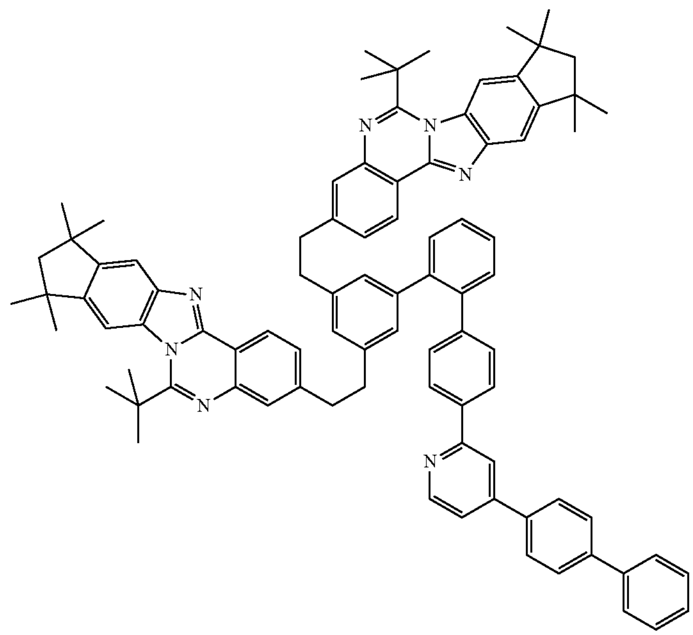 [SMILES: CC(C)(C)c1nc2cc(CCc3cc(CCc4ccc5c(c4)nc(C(C)(C)C)n4c6cc7c(cc6nc54)C(C)(C)CC7(C)C)cc(-c4ccccc4-c4ccc(-c5cc(-c6ccc(-c7ccccc7)cc6)ccn5)cc4)c3)ccc2c2nc3cc4c(cc3n12)C(C)(C)CC4(C)C] | 75% |
| L42 | 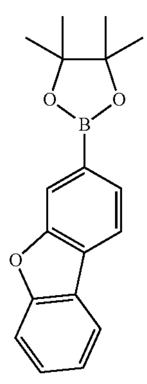 [SMILES: CC1(C)OB(c2ccc3c(c2)oc2ccccc23)OC1(C)C] S280 1056113-50-8 | 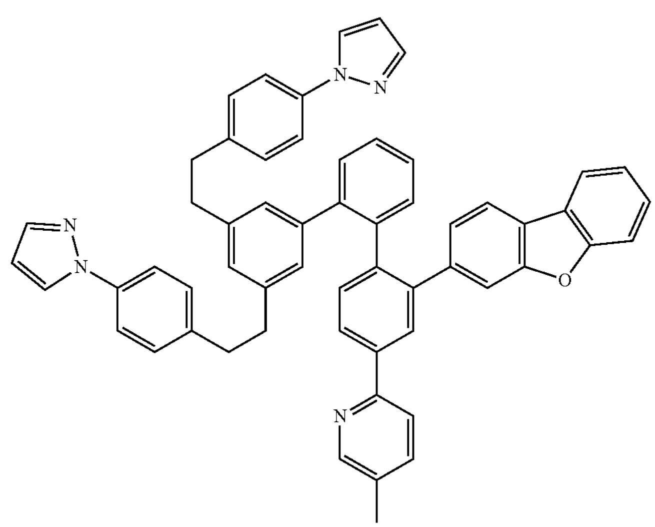 [SMILES: Cc1ccc(-c2ccc(-c3ccccc3-c3cc(CCc4ccc(-n5cccn5)cc4)cc(CCc4ccc(-n5cccn5)cc4)c3)c(-c3ccc4c(c3)oc3ccccc34)c2)nc1] | 77% |

-continued
| Ex. | Reactant | Product | Yield |
| --- | --- | --- | --- |
| L43 | 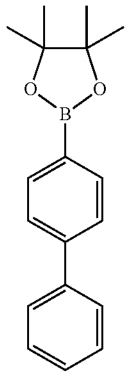 S281 144432-80-4 | 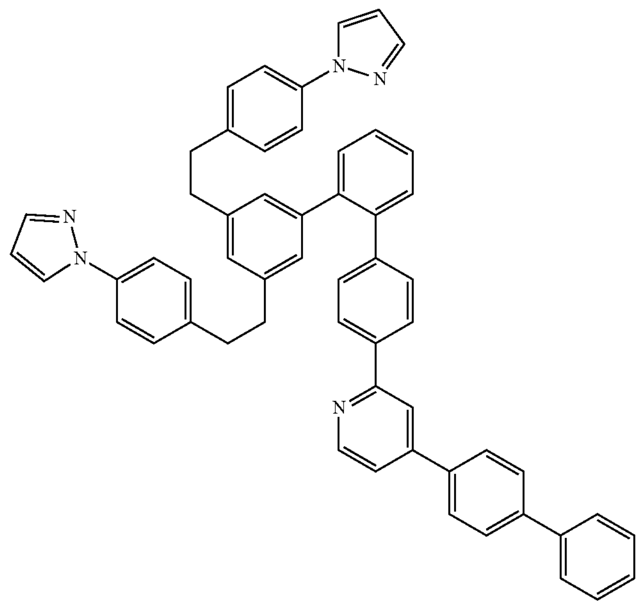 [SMILES: c1ccc(-c2ccc(-c3ccnc(-c4ccc(-c5ccccc5-c5cc(CCc6ccc(-n7cccn7)cc6)cc(CCc6ccc(-n7cccn7)cc6)c5)cc4)c3)cc2)cc1] | 79% |
| L44 | 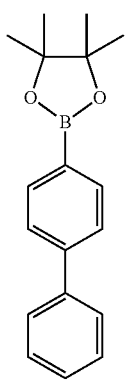 S282 144432-80-4 | 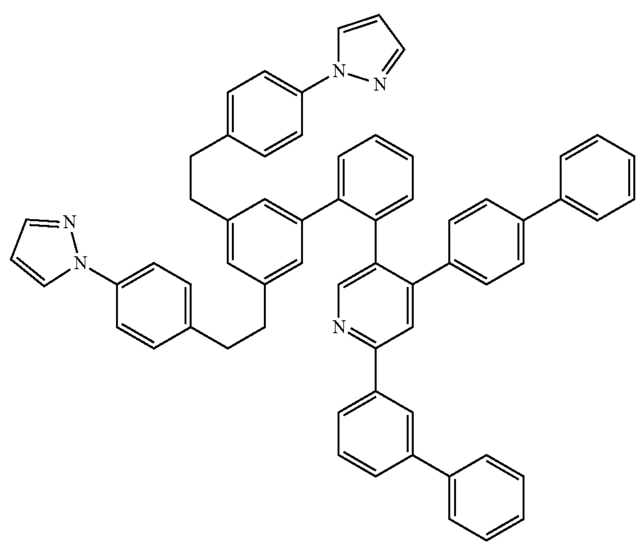 [SMILES: c1ccc(-c2ccc(-c3cc(-c4cccc(-c5ccccc5)c4)ncc3-c3ccccc3-c3cc(CCc4ccc(-n5cccn5)cc4)cc(CCc4ccc(-n5cccn5)cc4)c3)cc2)cc1] | 80% |

-continued
| Ex. | Reactant | Product | Yield |
|---|---|---|---|
| L45 | 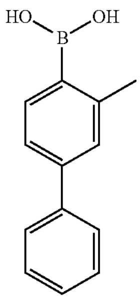 S283 1383628-42-9 | 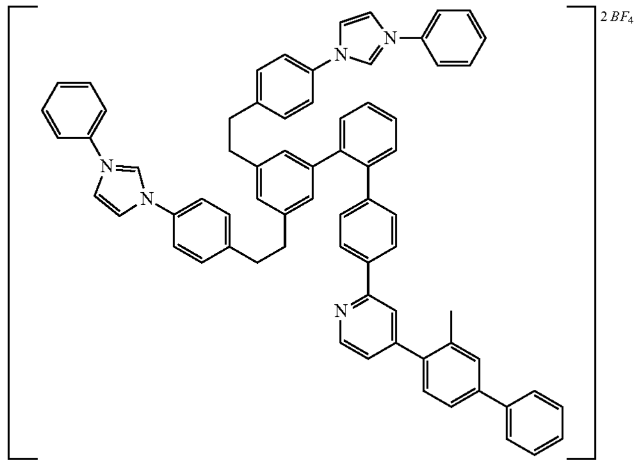 | 55% |
| L46 | 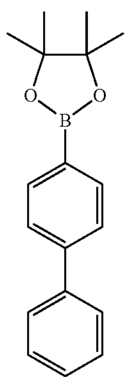 S284 144432-80-4 | 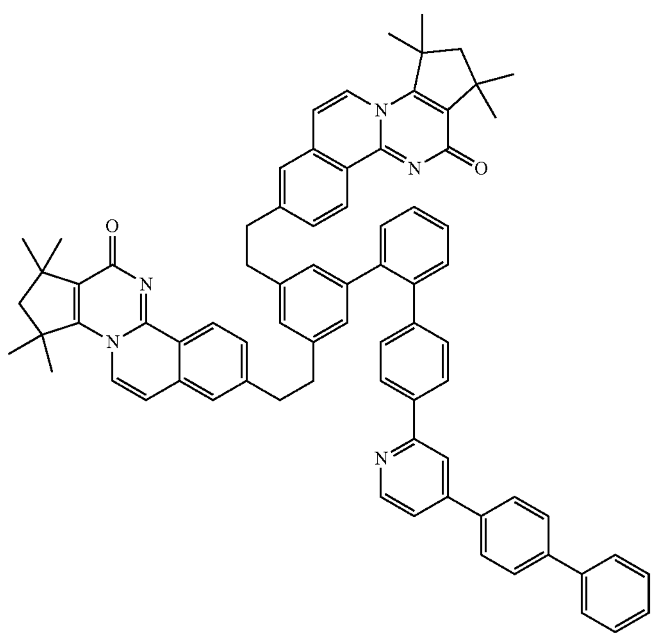 [SMILES: CC1(C)CC(C)(C)c2c1c(=O)nc1c3ccc(CCc4cc(CCc5ccc6c(ccn7c8c(c(=O)nc67)C(C)(C)CC8(C)C)c5)cc(-c5ccccc5-c5ccc(-c6cc(-c7ccc(-c8ccccc8)cc7)ccn6)cc5)c4)cc3ccn21] | 77% |

-continued
| Ex. | Reactant | Product | Yield |
|---|---|---|---|
| L47 | 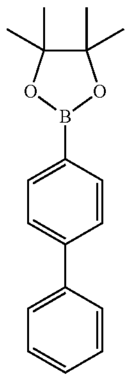 S285 144432-80-4 | 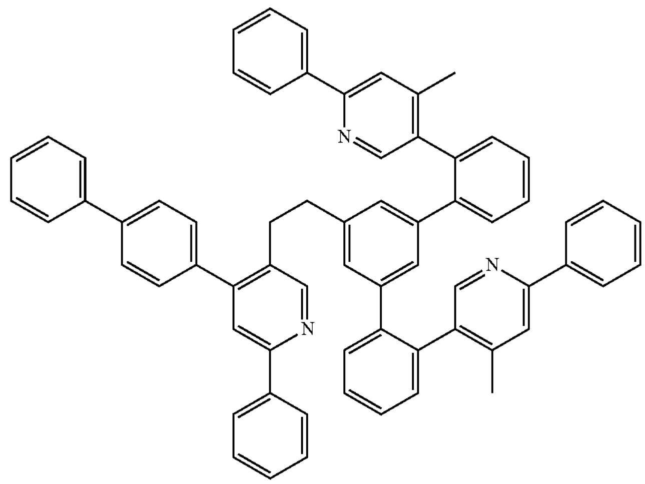 [SMILES: Cc1cc(-c2ccccc2)ncc1-c1ccccc1-c1cc(CCc2cnc(-c3ccccc3)cc2-c2ccc(-c3ccccc3)cc2)cc(-c2ccccc2-c2cnc(-c3ccccc3)cc2C)c1] | 78% |
Example L100
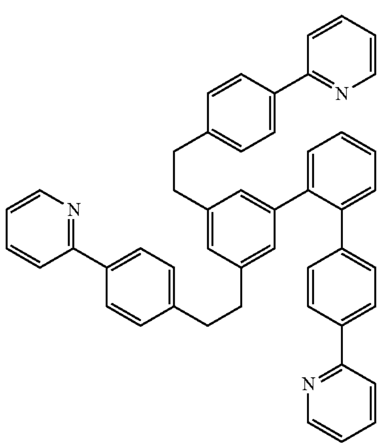 [SMILES: c1ccc(-c2ccc(CCc3cc(CCc4ccc(-c5ccccn5)cc4)cc(-c4ccccc4-c4ccc(-c5ccccn5)cc4)c3)cc2)nc1]
Preparation analogous to Example S150, using, rather than S100, 31.0 g (100 mmol) of 2-(2'-bromo[1,1'-biphenyl]-4-yl)pyridine [1374202-35-3]. Yield: 51.6 g (77 mmol), 77%; purity: about 95% by $^1$H NMR.
In an analogous manner, it is possible to prepare the following compounds:

| Ex. | Reactants | Product | Yield |
|---|---|---|---|
| L101 | S358 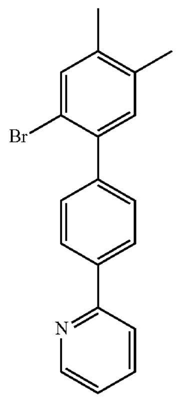 [SMILES: Cc1cc(Br)c(-c2ccc(-c3ccccn3)cc2)cc1C] [1989597-43-4] | 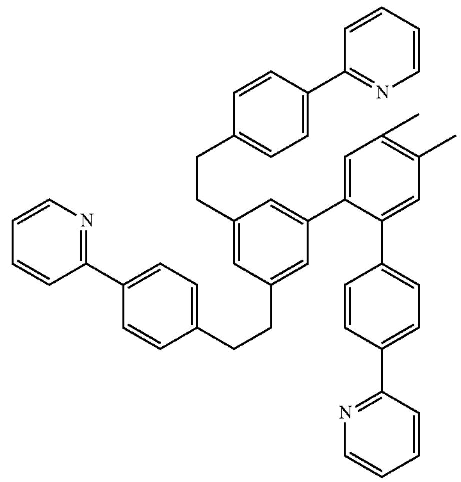 [SMILES: Cc1cc(-c2ccc(-c3ccccn3)cc2)c(-c2cc(CCc3ccc(-c4ccccn4)cc3)cc(CCc3ccc(-c4ccccn4)cc3)c2)cc1C] | 75% |

-continued
| Ex. | Reactants | Product | Yield |
|---|---|---|---|
| L102 | S359 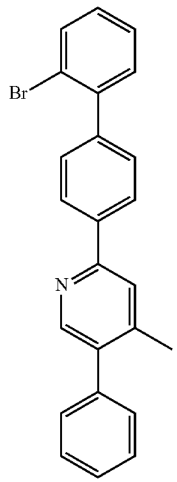 [SMILES: Cc1cc(-c2ccc(-c3ccccc3Br)cc2)ncc1-c1ccccc1] [1989597-34-3] | 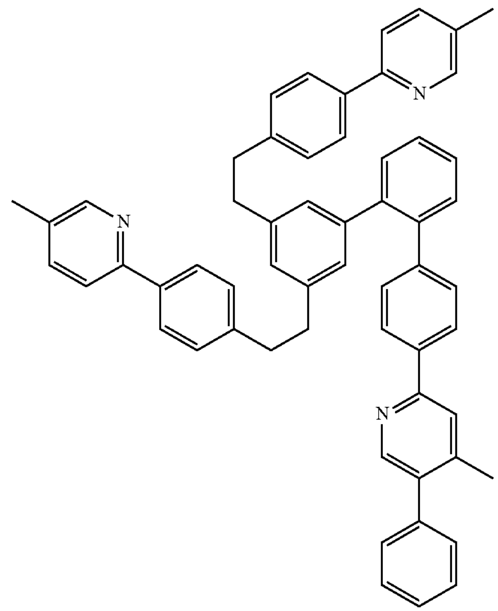 | 70% |

-continued
| Ex. | Reactants | Product | Yield |
| --- | --- | --- | --- |
| L103 | S360 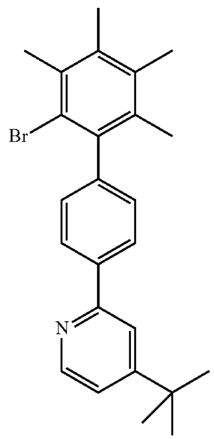 [SMILES: Cc1c(C)c(C)c(-c2ccc(-c3cc(C(C)(C)C)ccn3)cc2)c(Br)c1C] [1989597-44-5] | 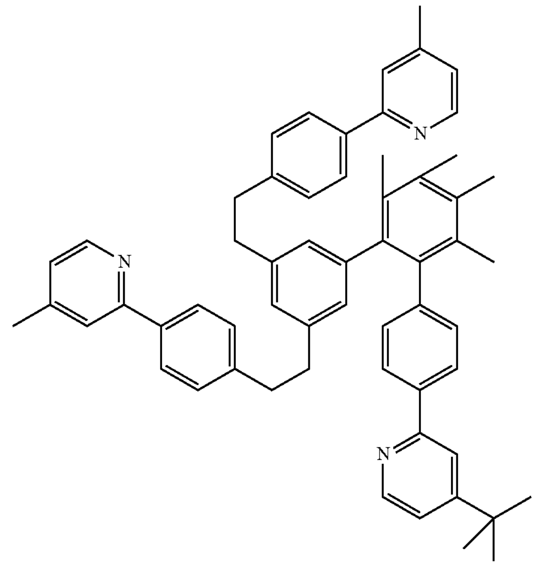 [SMILES: Cc1ccnc(-c2ccc(CCc3cc(CCc4ccc(-c5cc(C)ccn5)cc4)cc(-c4c(C)c(C)c(C)c(C)c4-c4ccc(-c5cc(C(C)(C)C)ccn5)cc4)c3)cc2)c1] | 72% |

-continued
| Ex. | Reactants | Product | Yield |
| --- | --- | --- | --- |
| L104 | S361<br>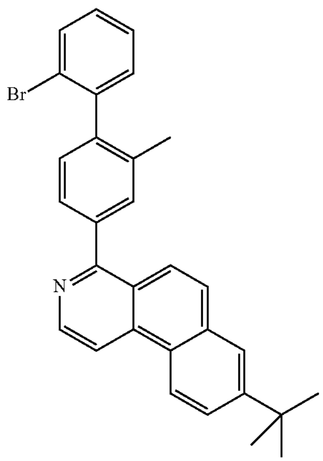 [SMILES: Cc1cc(-c2nccc3c2ccc2cc(C(C)(C)C)ccc23)ccc1-c1ccccc1Br]<br>[1989597-56-9] | 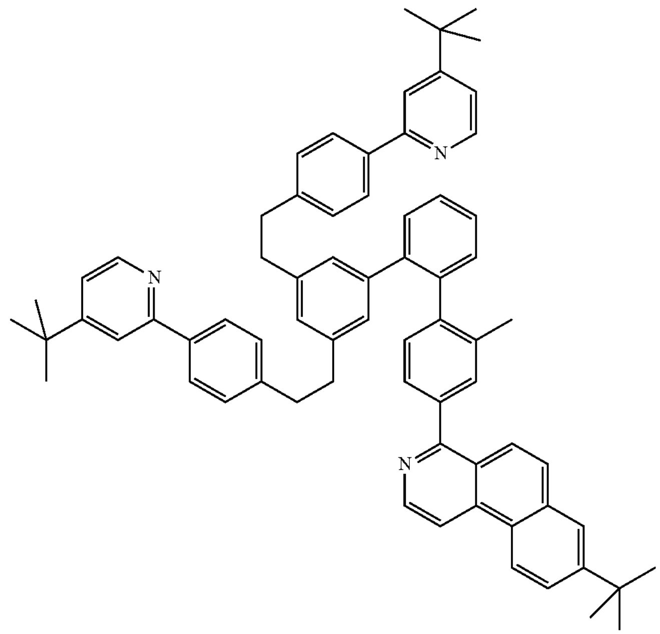 [SMILES: Cc1cc(-c2nccc3c2ccc2cc(C(C)(C)C)ccc23)ccc1-c1ccccc1-c1cc(CCc2ccc(-c3cc(C(C)(C)C)ccn3)cc2)cc(CCc2ccc(-c3cc(C(C)(C)C)ccn3)cc2)c1] | 75% |

-continued
| Ex. | Reactants | Product | Yield |
|---|---|---|---|
| L105 | S359 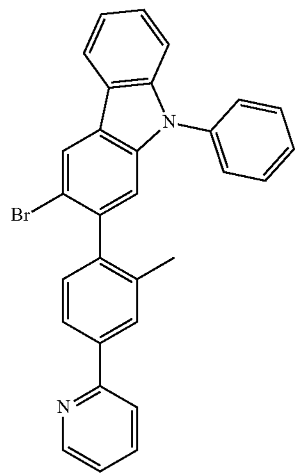 [SMILES: Cc1cc(-c2ccccn2)ccc1-c1cc2c(cc1Br)c1ccccc1n2-c1ccccc1] [1989597-54-7] | 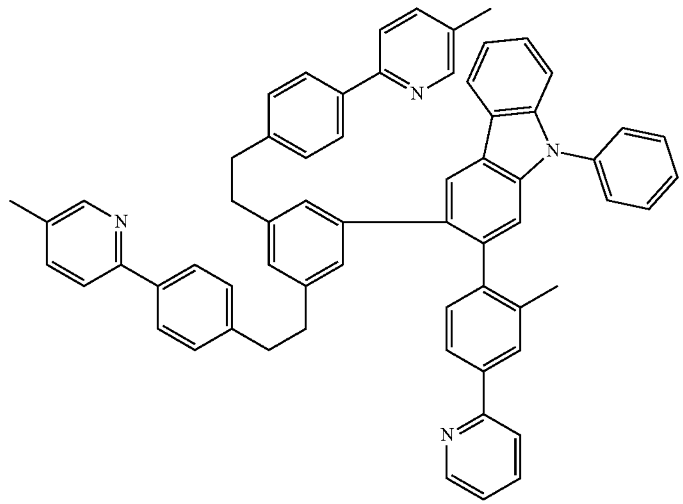 [SMILES: Cc1ccc(-c2ccc(CCc3cc(CCc4ccc(-c5ccc(C)cn5)cc4)cc(-c4cc5c6ccccc6n(-c6ccccc6)c5cc4-c4ccc(-c5ccccn5)cc4C)c3)cc2)nc1] | 68% |
| L106 | S362 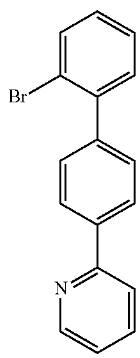 [1374202-35-3] | 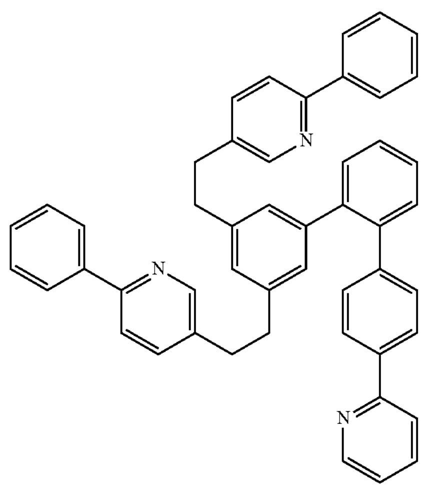 [SMILES: c1ccc(-c2ccc(CCc3cc(CCc4ccc(-c5ccccc5)nc4)cc(-c4ccccc4-c4ccc(-c5ccccn5)cc4)c3)cn2)cc1] | 74% |

-continued
| Ex. | Reactants | Product | Yield |
|---|---|---|---|
| L107 | S362 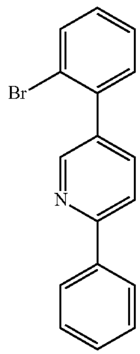 [1989597-29-6] | 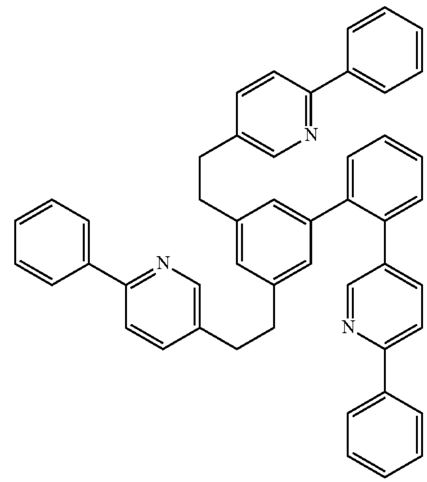 [SMILES: c1ccc(-c2ccc(CCc3cc(CCc4ccc(-c5ccccc5)nc4)cc(-c4ccccc4-c4ccc(-c5ccccc5)nc4)c3)cn2)cc1] | 80% |
| L108 | S362 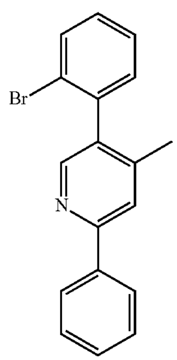 [1989597-30-9] | 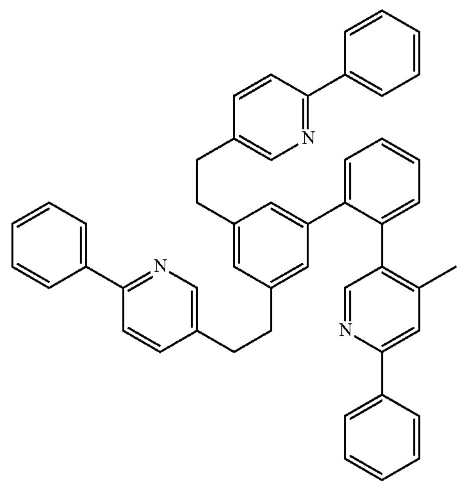 [SMILES: Cc1cc(-c2ccccc2)ncc1-c1ccccc1-c1cc(CCc2ccc(-c3ccccc3)nc2)cc(CCc2ccc(-c3ccccc3)nc2)c1] | 78% |

-continued
| Ex. | Reactants | Product | Yield |
|---|---|---|---|
| L109 | S362 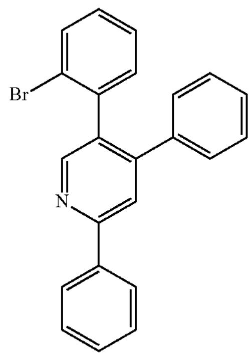 [SMILES: Brc1ccccc1-c1cnc(-c2ccccc2)cc1-c1ccccc1]  [1989597-32-1] | 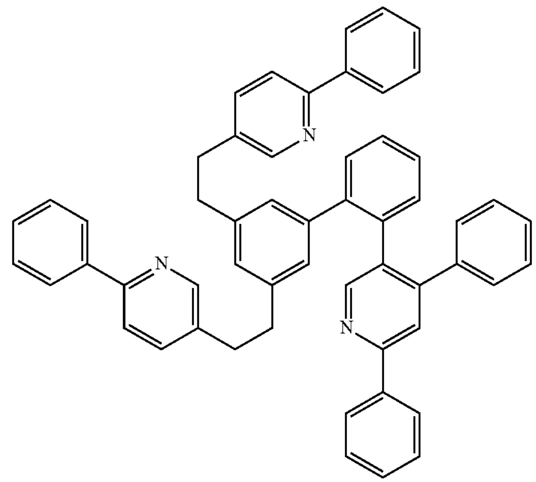 [SMILES: c1ccc(-c2ccc(CCc3cc(CCc4ccc(-c5ccccc5)nc4)cc(-c4ccccc4-c4cnc(-c5ccccc5)cc4-c4ccccc4)c3)cn2)cc1]  | 81% |
| L109-D8 | S362-08 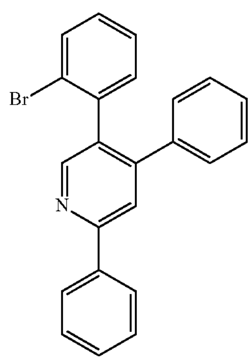 [SMILES: Brc1ccccc1-c1cnc(-c2ccccc2)cc1-c1ccccc1]  [1989597-32-1] | 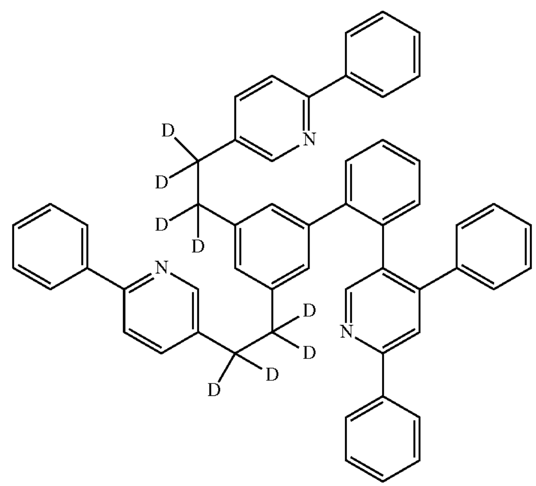 [SMILES: [2H]C([2H])(c1ccc(-c2ccccc2)nc1)C([2H])([2H])c1cc(-c2ccccc2-c2cnc(-c3ccccc3)cc2-c2ccccc2)cc(C([2H])([2H])C([2H])([2H])c2ccc(-c3ccccc3)nc2)c1]  | 79% |

-continued
| Ex. | Reactants | Product | Yield |
|---|---|---|---|
| L110 | S363 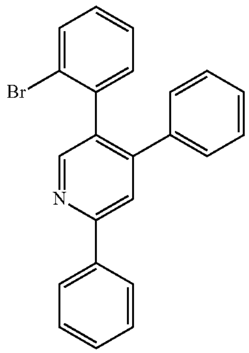 [SMILES: Brc1ccccc1-c1cnc(-c2ccccc2)cc1-c1ccccc1] [1989597-32-1] | 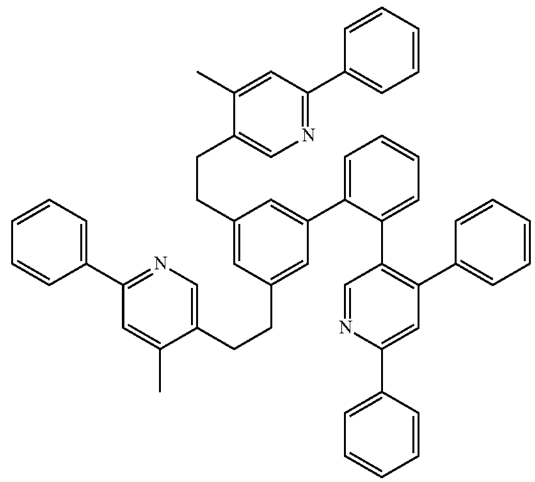 [SMILES: Cc1cc(-c2ccccc2)ncc1CCc1cc(CCc2cnc(-c3ccccc3)cc2C)cc(-c2ccccc2-c2cnc(-c3ccccc3)cc2-c2ccccc2)c1] | 79% |
| L111 | S363 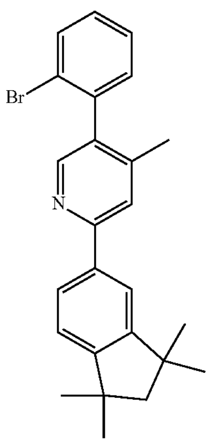 [SMILES: Cc1cc(-c2ccc3c(c2)C(C)(C)CC3(C)C)ncc1-c1ccccc1Br] [1989597-32-1] | 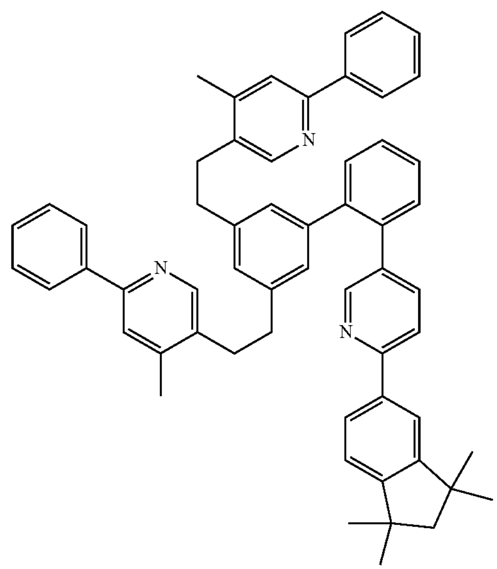 [SMILES: Cc1cc(-c2ccccc2)ncc1CCc1cc(CCc2cnc(-c3ccccc3)cc2C)cc(-c2ccccc2-c2ccc(-c3ccc4c(c3)C(C)(C)CC4(C)C)nc2)c1] | 72% |

-continued
| Ex. | Reactants | Product | Yield |
|---|---|---|---|
| L112 | S363 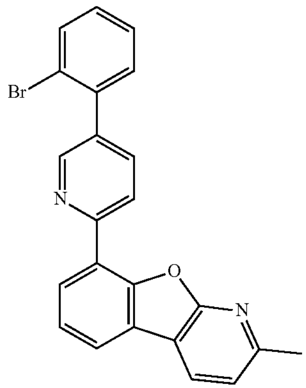 [SMILES: Cc1ccc2c(n1)oc1c(-c3ccc(-c4ccccc4Br)cn3)cccc12]  [1989597-42-3] | 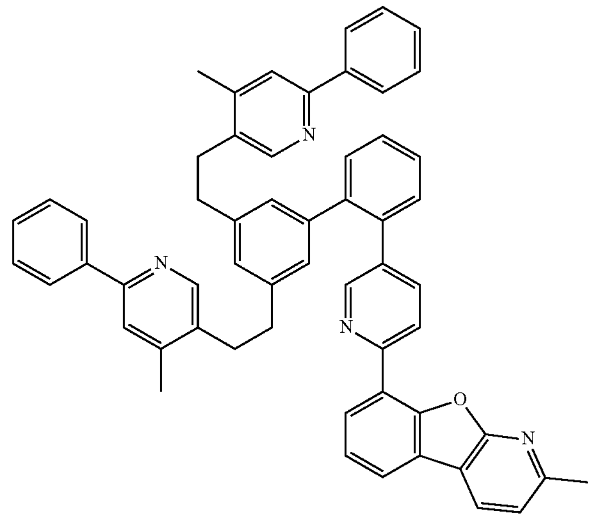 [SMILES: Cc1ccc2c(n1)oc1c(-c3ccc(-c4ccccc4-c4cc(CCc5cnc(-c6ccccc6)cc5C)cc(CCc5cnc(-c6ccccc6)cc5C)c4)cn3)cccc12]  | 75% |
| L113-D8 | S363-08<br>S600 | 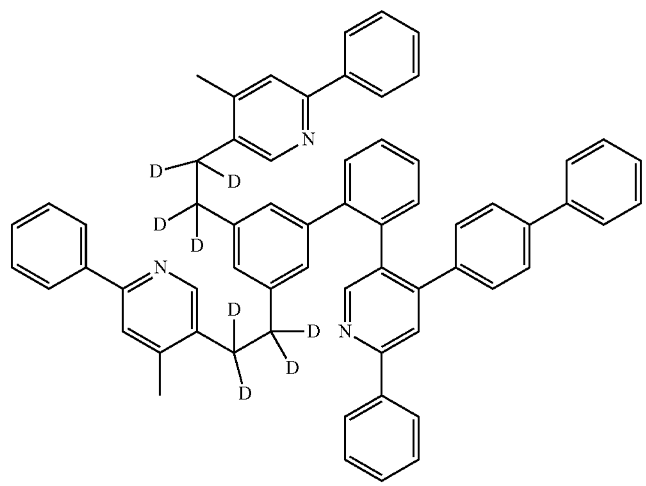 [SMILES: [2H]C([2H])(c1cc(-c2ccccc2-c2cnc(-c3ccccc3)cc2-c2ccc(-c3ccccc3)cc2)cc(C([2H])([2H])C([2H])([2H])c2cnc(-c3ccccc3)cc2C)c1)C([2H])([2H])c1cnc(-c2ccccc2)cc1C]  | 70% |

-continued
| Ex. | Reactants | Product | Yield |
| --- | --- | --- | --- |
| L114 | S362<br>S601 | 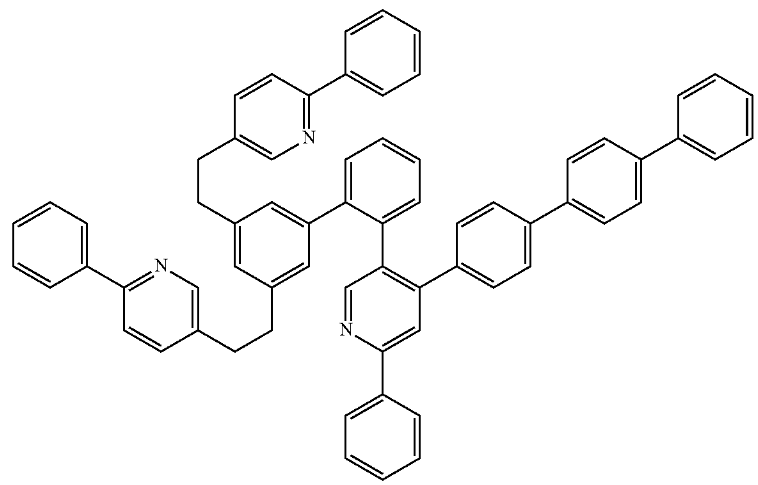 [SMILES: c1ccc(-c2ccc(-c3ccc(-c4cc(-c5ccccc5)ncc4-c4ccccc4-c4cc(CCc5ccc(-c6ccccc6)nc5)cc(CCc5ccc(-c6ccccc6)nc5)c4)cc3)cc2)cc1] | 71% |
| L115 | S362<br>S602 | 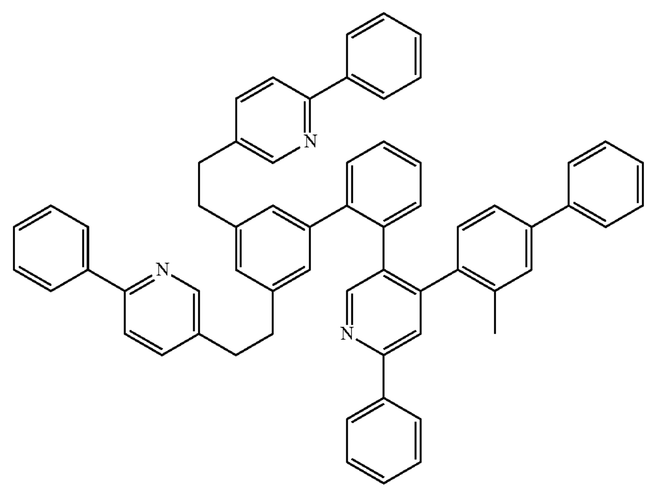 [SMILES: Cc1cc(-c2ccccc2)ccc1-c1cc(-c2ccccc2)ncc1-c1ccccc1-c1cc(CCc2ccc(-c3ccccc3)nc2)cc(CCc2ccc(-c3ccccc3)nc2)c1] | 63% |

-continued
| Ex. | Reactants | Product | Yield |
|---|---|---|---|
| L116 | S362<br>S603 | 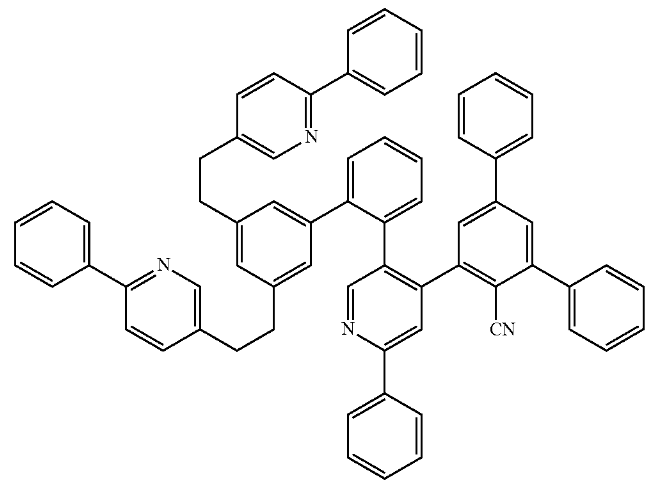 [SMILES: N#Cc1c(-c2ccccc2)cc(-c2ccccc2)cc1-c1cc(-c2ccccc2)ncc1-c1ccccc1-c1cc(CCc2ccc(-c3ccccc3)nc2)cc(CCc2ccc(-c3ccccc3)nc2)c1] | 59% |
| L117 | S363<br>S604 | 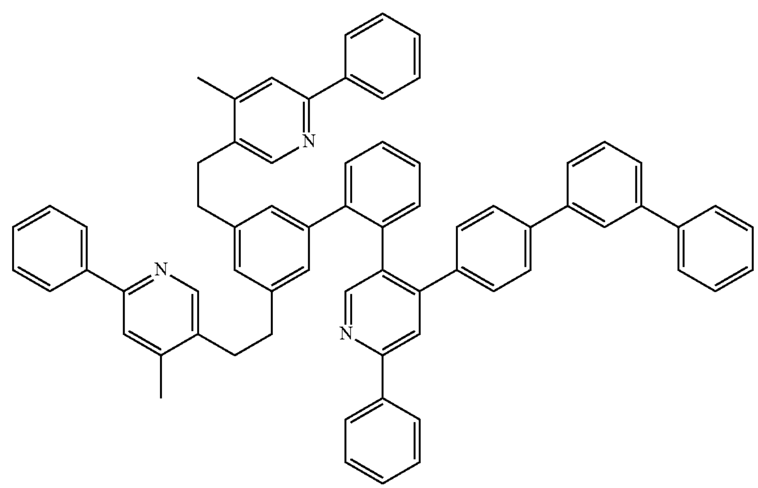 [SMILES: Cc1cc(-c2ccccc2)ncc1CCc1cc(CCc2cnc(-c3ccccc3)cc2C)cc(-c2ccccc2-c2cnc(-c3ccccc3)cc2-c2ccc(-c3cccc(-c4ccccc4)c3)cc2)c1] | 65% |

-continued
| Ex. | Reactants | Product | Yield |
|---|---|---|---|
| L118 | S363<br>S605 | 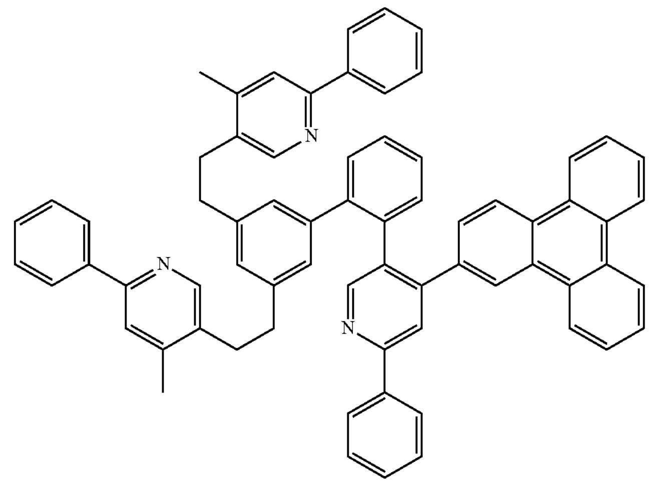 [SMILES: Cc1cc(-c2ccccc2)ncc1CCc1cc(CCc2cnc(-c3ccccc3)cc2C)cc(-c2ccccc2-c2cnc(-c3ccccc3)cc2-c2ccc3c4ccccc4c4ccccc4c3c2)c1] | 78% |
| L119 | S362<br>S606 | 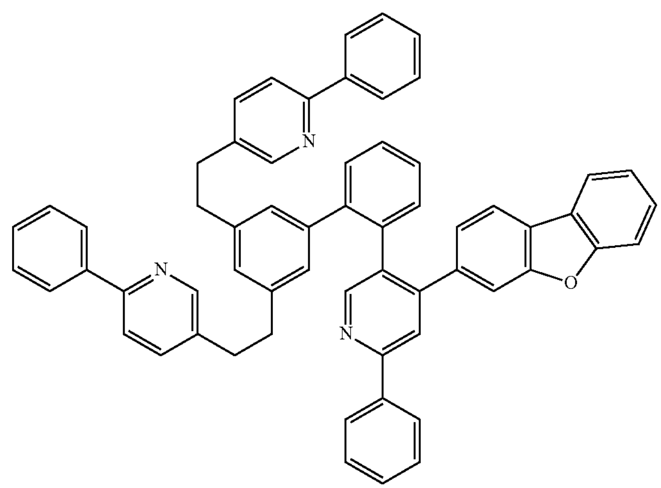 [SMILES: c1ccc(-c2ccc(CCc3cc(CCc4ccc(-c5ccccc5)nc4)cc(-c4ccccc4-c4cnc(-c5ccccc5)cc4-c4ccc5c(c4)oc4ccccc45)c3)cn2)cc1] | 74% |

-continued
| Ex. | Reactants | Product | Yield |
| --- | --- | --- | --- |
| L120 | S363<br>S607 | 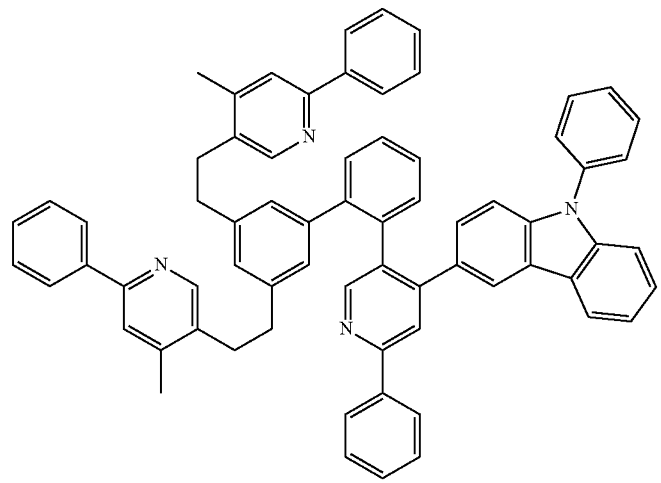 [SMILES: Cc1cc(-c2ccccc2)ncc1CCc1cc(CCc2cnc(-c3ccccc3)cc2C)cc(-c2ccccc2-c2cnc(-c3ccccc3)cc2-c2ccc3c(c2)c2ccccc2n3-c2ccccc2)c1] | 70% |
| L121 | S362<br>S608 | 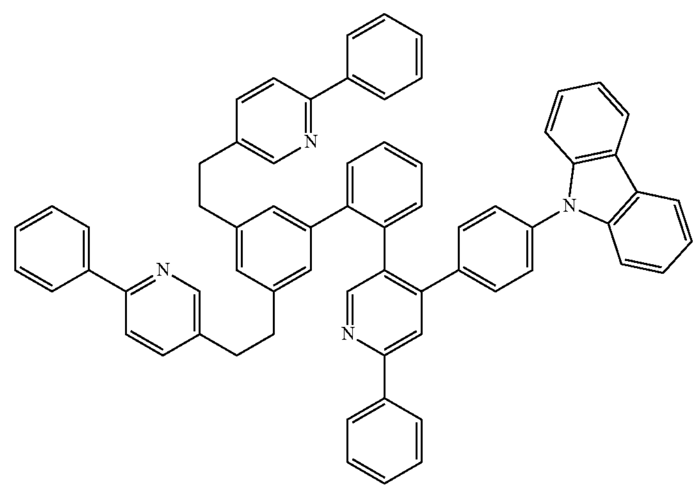 [SMILES: c1ccc(-c2ccc(CCc3cc(CCc4ccc(-c5ccccc5)nc4)cc(-c4ccccc4-c4cnc(-c5ccccc5)cc4-c4ccc(-n5c6ccccc6c6ccccc65)cc4)c3)cn2)cc1] | 77% |

-continued
| Ex. | Reactants | Product | Yield |
|---|---|---|---|
| L122 | S363<br>S609 | 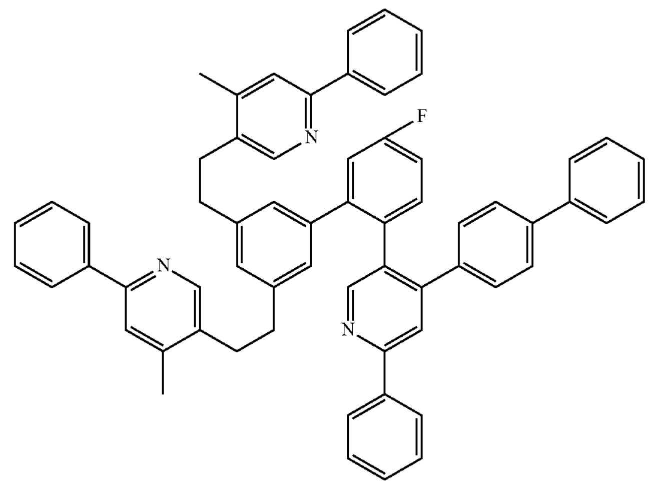 [SMILES: Cc1cc(-c2ccccc2)ncc1CCc1cc(CCc2cnc(-c3ccccc3)cc2C)cc(-c2cc(F)ccc2-c2cnc(-c3ccccc3)cc2-c2ccc(-c3ccccc3)cc2)c1] | 68% |
| L123 | S362<br>S610 | 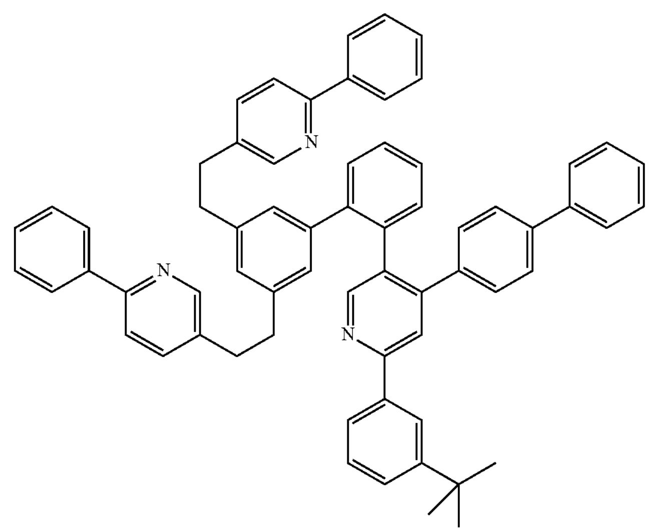 [SMILES: CC(C)(C)c1cccc(-c2cc(-c3ccc(-c4ccccc4)cc3)c(-c3ccccc3-c3cc(CCc4ccc(-c5ccccc5)nc4)cc(CCc4ccc(-c5ccccc5)nc4)c3)cn2)c1] | 65% |

-continued
| Ex. | Reactants | Product | Yield |
|---|---|---|---|
| L124 | S365<br>S600 | 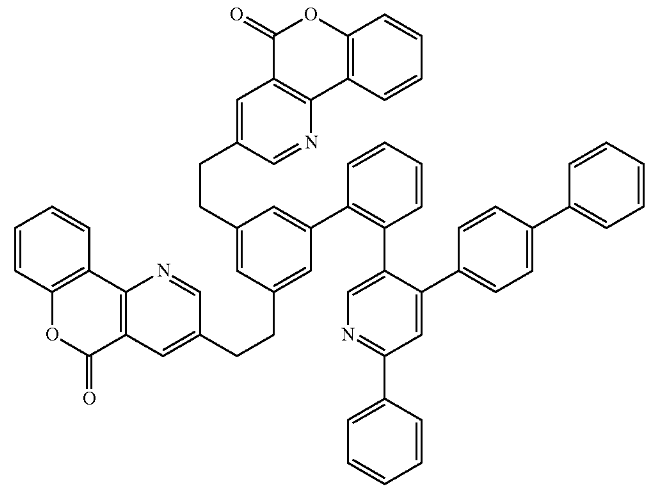 [SMILES: O=c1oc2ccccc2c2ncc(CCc3cc(CCc4cnc5c(c4)c(=O)oc4ccccc45)cc(-c4ccccc4-c4cnc(-c5ccccc5)cc4-c4ccc(-c5ccccc5)cc4)c3)cc12] | 66% |
| L124-D8 | S365-D8<br>S600 | 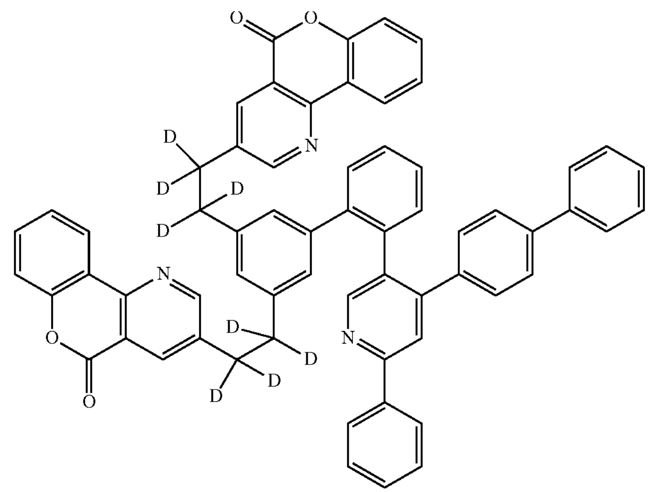 [SMILES: [2H]C([2H])(c1cc(-c2ccccc2-c2cnc(-c3ccccc3)cc2-c2ccc(-c3ccccc3)cc2)cc(C([2H])([2H])C([2H])([2H])c2cnc3c(c2)c(=O)oc2ccccc23)c1)C([2H])([2H])c1cnc2c(c1)c(=O)oc1ccccc12] | 67% |

-continued
| Ex. | Reactants | Product | Yield |
|---|---|---|---|
| L125 | S366<br>S609 | 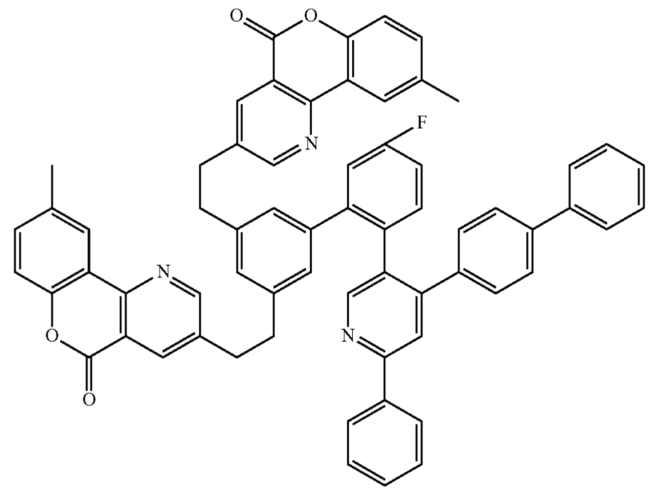 [SMILES: Cc1ccc2oc(=O)c3cc(CCc4cc(CCc5cnc6c(c5)c(=O)oc5ccc(C)cc56)cc(-c5cc(F)ccc5-c5cnc(-c6ccccc6)cc5-c5ccc(-c6ccccc6)cc5)c4)cnc3c2c1] | 61% |
| L126 | S367<br>S605 | 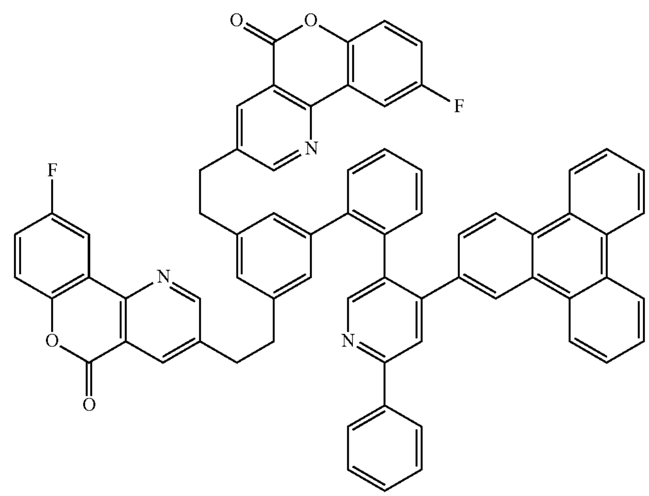 [SMILES: O=c1oc2ccc(F)cc2c2ncc(CCc3cc(CCc4cnc5c(c4)c(=O)oc4ccc(F)cc45)cc(-c4ccccc4-c4cnc(-c5ccccc5)cc4-c4ccc5c6ccccc6c6ccccc6c5c4)c3)cc12] | 69% |

-continued
| Ex. | Reactants | Product | Yield |
| --- | --- | --- | --- |
| L127 | S368<br>S601 | 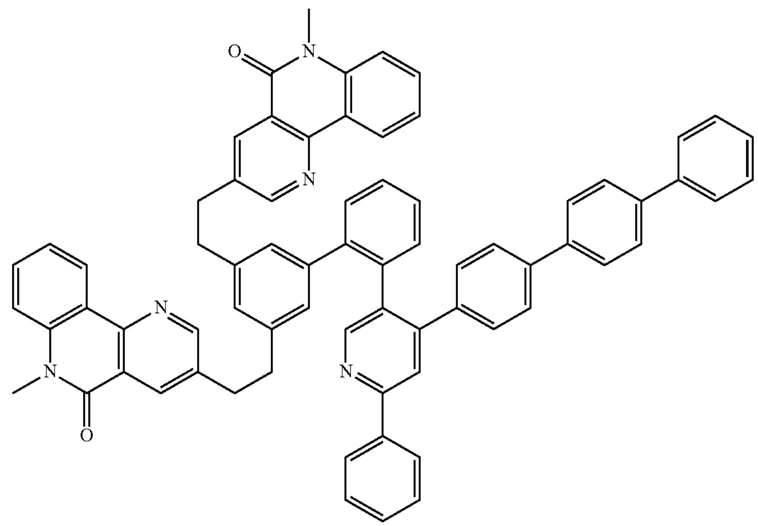 [SMILES: Cn1c(=O)c2cc(CCc3cc(CCc4cnc5c(c4)c(=O)n(C)c4ccccc54)cc(-c4ccccc4-c4cnc(-c5ccccc5)cc4-c4ccc(-c5ccc(-c6ccccc6)cc5)cc4)c3)cnc2c2ccccc21] | 63% |
| L128 | S369<br>S609 | 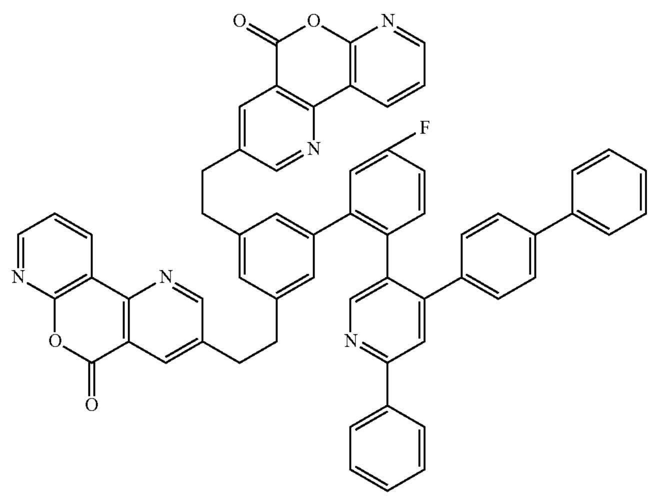 [SMILES: O=c1oc2ncccc2c2ncc(CCc3cc(CCc4cnc5c(c4)c(=O)oc4ncccc45)cc(-c4cc(F)ccc4-c4cnc(-c5ccccc5)cc4-c4ccc(-c5ccccc5)cc4)c3)cc12] | 60% |

-continued
| Ex. | Reactants | Product | Yield |
|---|---|---|---|
| L128-D8 | S369-08<br>S609 | 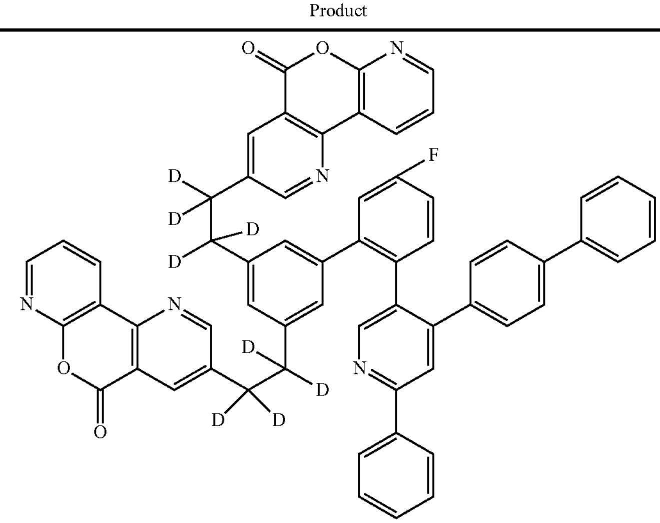 | 68% |
| L129 | S370<br>S601 | 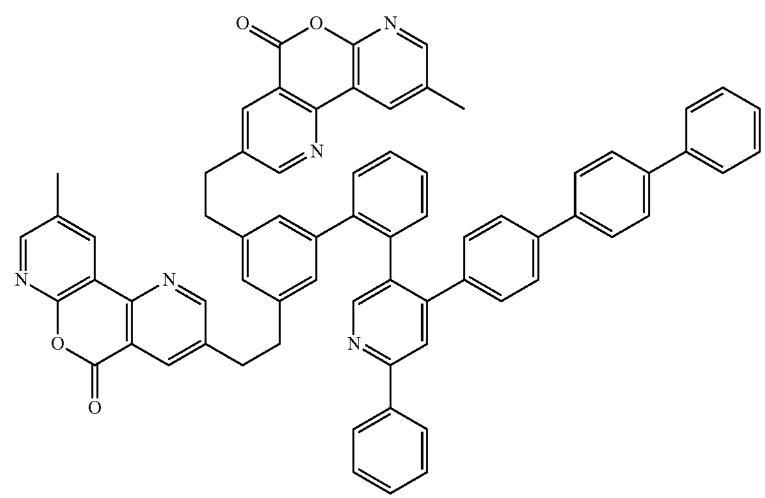 [SMILES: Cc1cnc2oc(=O)c3cc(CCc4cc(CCc5cnc6c(c5)c(=O)oc5ncc(C)cc56)cc(-c5ccccc5-c5cnc(-c6ccccc6)cc5-c5ccc(-c6ccc(-c7ccccc7)cc6)cc5)c4)cnc3c2c1] | 66% |

-continued
| Ex. | Reactants | Product | Yield |
| --- | --- | --- | --- |
| L130 | S371<br>S605 | 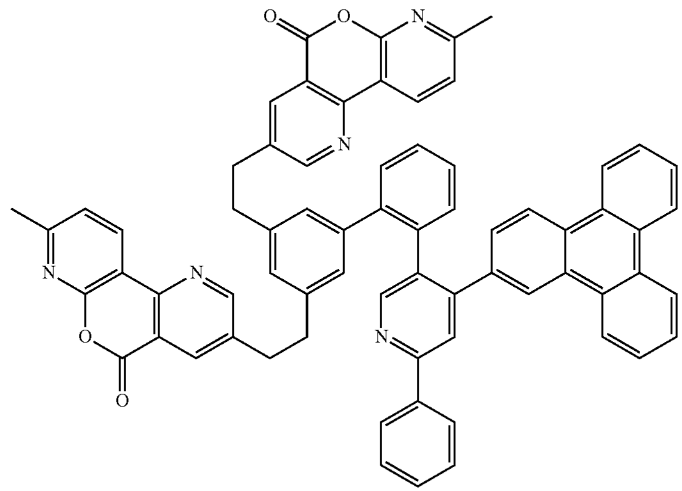 [SMILES: Cc1ccc2c(n1)oc(=O)c1cc(CCc3cc(CCc4cnc5c(c4)c(=O)oc4nc(C)ccc45)cc(-c4ccccc4-c4cnc(-c5ccccc5)cc4-c4ccc5c6ccccc6c6ccccc6c5c4)c3)cnc12] | 63% |
| L131 | S372<br>S600 | 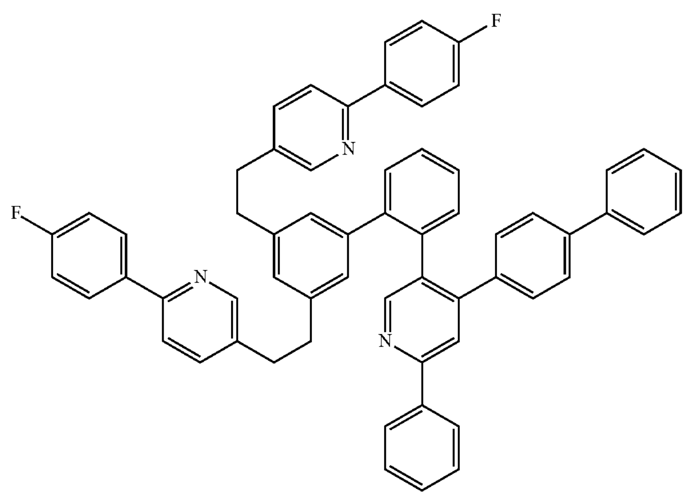 [SMILES: Fc1ccc(-c2ccc(CCc3cc(CCc4ccc(-c5ccc(F)cc5)nc4)cc(-c4ccccc4-c4cnc(-c5ccccc5)cc4-c4ccc(-c5ccccc5)cc4)c3)cn2)cc1] | 65% |

-continued
| Ex. | Reactants | Product | Yield |
|---|---|---|---|
| L132 | S373<br>S601 | 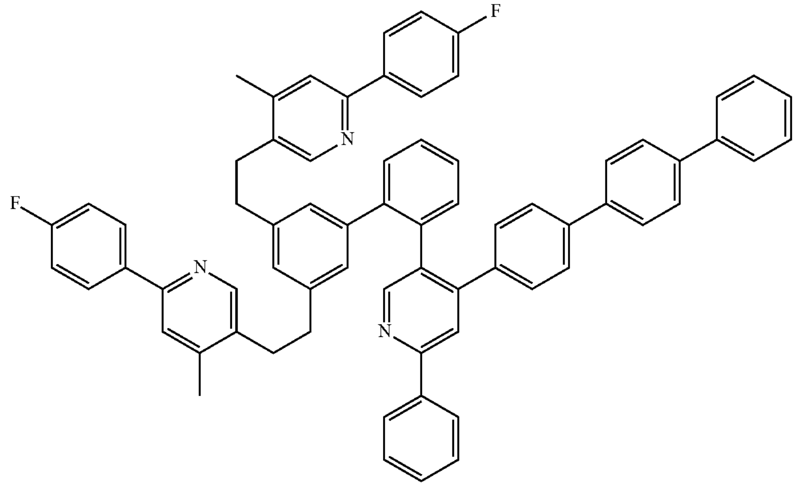 [SMILES: Cc1cc(-c2ccc(F)cc2)ncc1CCc1cc(CCc2cnc(-c3ccc(F)cc3)cc2C)cc(-c2ccccc2-c2cnc(-c3ccccc3)cc2-c2ccc(-c3ccc(-c4ccccc4)cc3)cc2)c1] | 67% |
| L133 | S374<br>S609 | 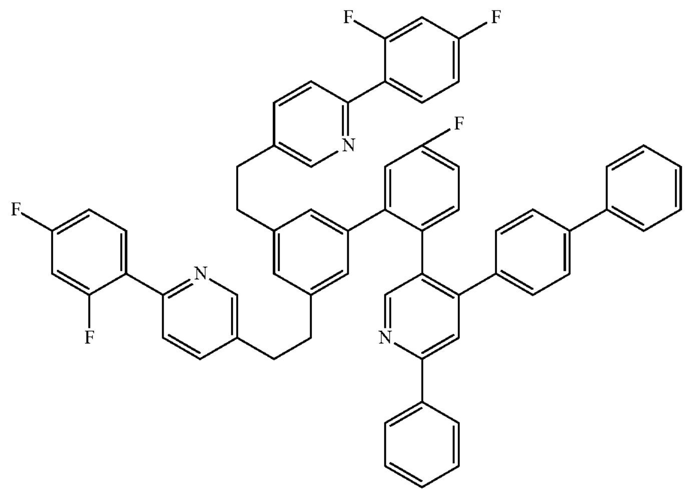 [SMILES: Fc1ccc(-c2ccc(CCc3cc(CCc4ccc(-c5ccc(F)cc5F)nc4)cc(-c4cc(F)ccc4-c4cnc(-c5ccccc5)cc4-c4ccc(-c5ccccc5)cc4)c3)cn2)c(F)c1] | 64% |

-continued
| Ex. | Reactants | Product | Yield |
|---|---|---|---|
| L133-D8 | S374-D8<br>S609 | 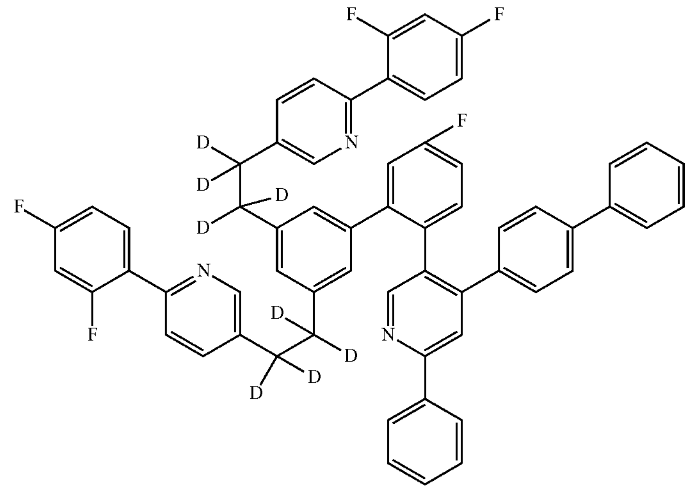 [SMILES: [2H]C([2H])(c1ccc(-c2ccc(F)cc2F)nc1)C([2H])([2H])c1cc(-c2cc(F)ccc2-c2cnc(-c3ccccc3)cc2-c2ccc(-c3ccccc3)cc2)cc(C([2H])([2H])C([2H])([2H])c2ccc(-c3ccc(F)cc3F)nc2)c1] | 67% |
| L134 | S375<br>S606 | 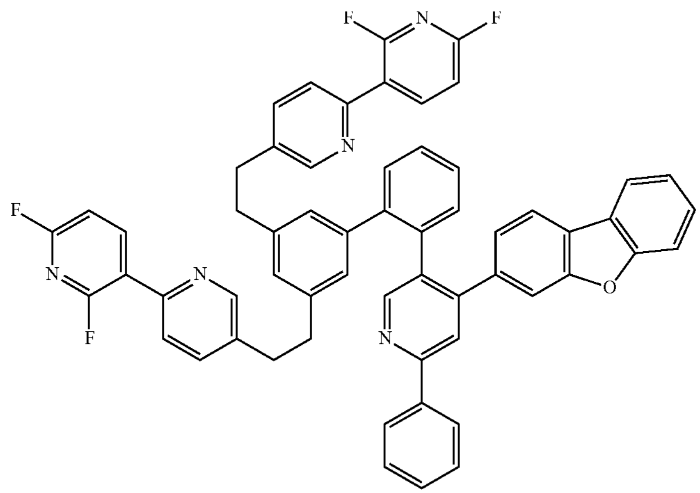 [SMILES: Fc1ccc(-c2ccc(CCc3cc(CCc4ccc(-c5ccc(F)nc5F)nc4)cc(-c4ccccc4-c4cnc(-c5ccccc5)cc4-c4ccc5c(c4)oc4ccccc45)c3)cn2)c(F)n1] | 60% |

-continued
| Ex. | Reactants | Product | Yield |
|---|---|---|---|
| L135 | S376<br>S601 | 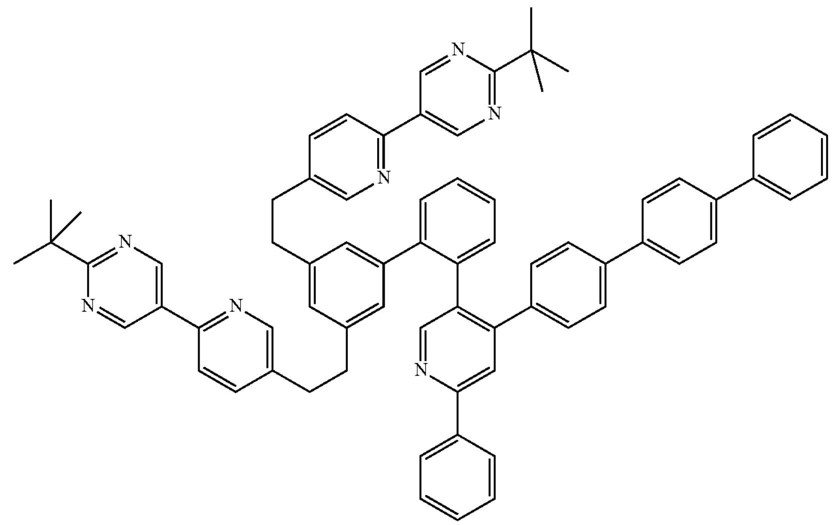 [SMILES: CC(C)(C)c1ncc(-c2ccc(CCc3cc(CCc4ccc(-c5cnc(C(C)(C)C)nc5)nc4)cc(-c4ccccc4-c4cnc(-c5ccccc5)cc4-c4ccc(-c5ccc(-c6ccccc6)cc5)cc4)c3)cn2)cn1] | 64% |
| L136 | S374<br>S600 | 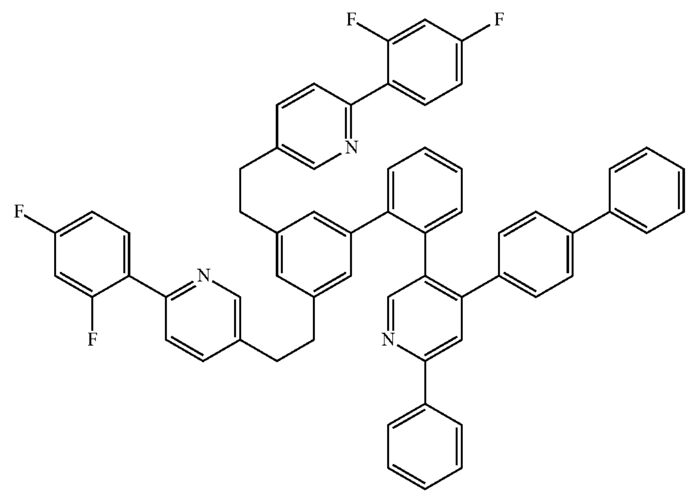 [SMILES: Fc1ccc(-c2ccc(CCc3cc(CCc4ccc(-c5ccc(F)cc5F)nc4)cc(-c4ccccc4-c4cnc(-c5ccccc5)cc4-c4ccc(-c5ccccc5)cc4)c3)cn2)c(F)c1] | 67% |

-continued
| Ex. | Reactants | Product | Yield |
|---|---|---|---|
| L136-D8 | S374-08<br>S600 | 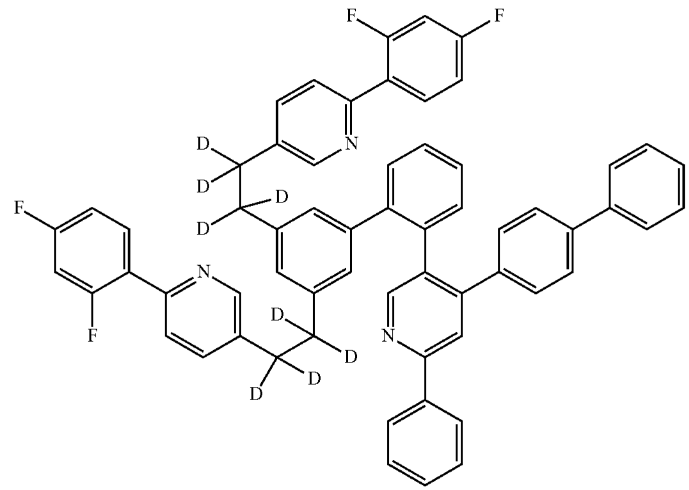 [SMILES: [2H]C([2H])(c1ccc(-c2ccc(F)cc2F)nc1)C([2H])([2H])c1cc(-c2ccccc2-c2cnc(-c3ccccc3)cc2-c2ccc(-c3ccccc3)cc2)cc(C([2H])([2H])C([2H])([2H])c2ccc(-c3ccc(F)cc3F)nc2)c1] | 65% |
| L137-D8 | S374-08<br>S601 | 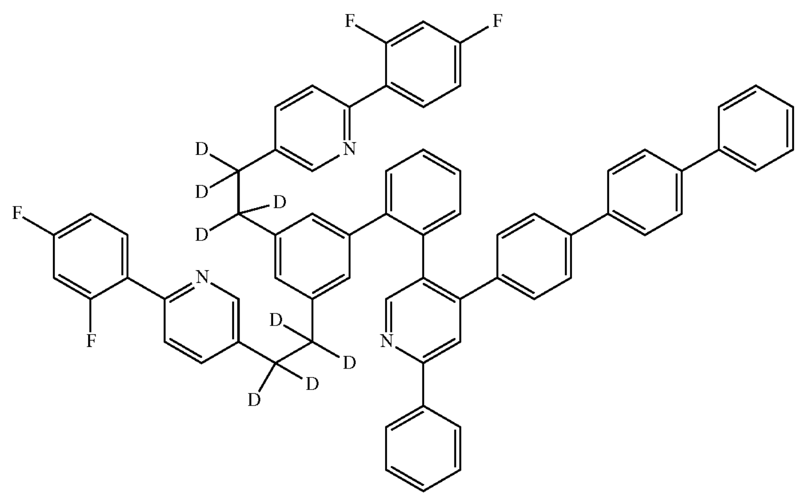 [SMILES: [2H]C([2H])(c1ccc(-c2ccc(F)cc2F)nc1)C([2H])([2H])c1cc(-c2ccccc2-c2cnc(-c3ccccc3)cc2-c2ccc(-c3ccc(-c4ccccc4)cc3)cc2)cc(C([2H])([2H])C([2H])([2H])c2ccc(-c3ccc(F)cc3F)nc2)c1] | 68% |

-continued
| Ex. | Reactants | Product | Yield |
|---|---|---|---|
| L138-D8 | S374-08<br>S605 | 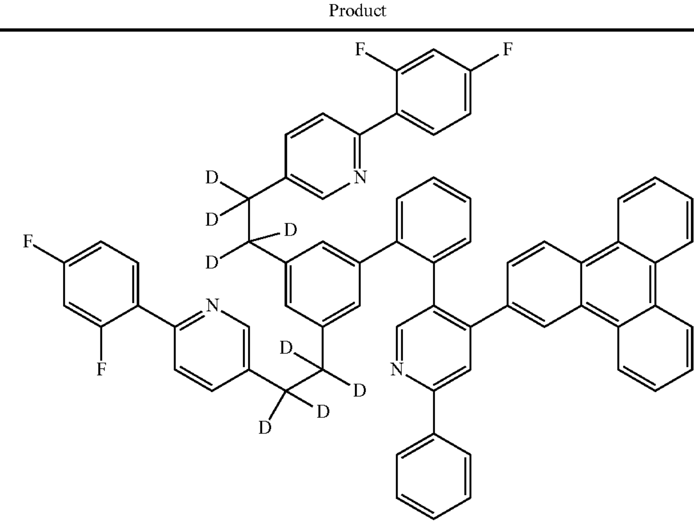 | 65% |
| L139-D8 | S374-08<br>S606 | 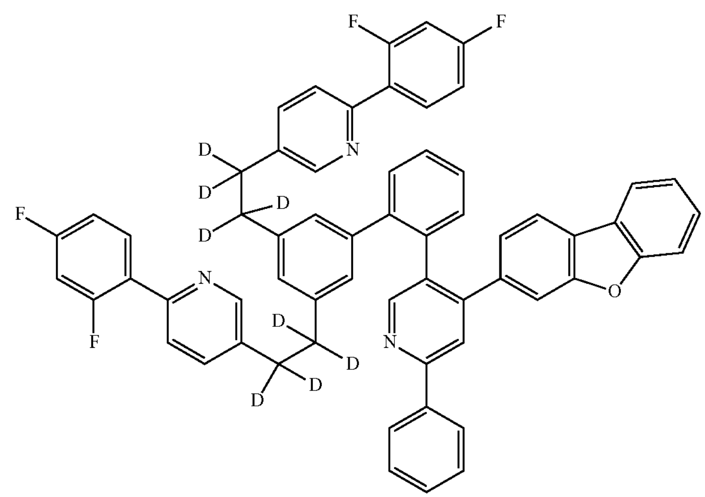 [SMILES: [2H]C([2H])(c1ccc(-c2ccc(F)cc2F)nc1)C([2H])([2H])c1cc(-c2ccccc2-c2cnc(-c3ccccc3)cc2-c2ccc3c(c2)oc2ccccc23)cc(C([2H])([2H])C([2H])([2H])c2ccc(-c3ccc(F)cc3F)nc2)c1] | 63% |

-continued
| Ex. | Reactants | Product | Yield |
|---|---|---|---|
| L140 | S650<br>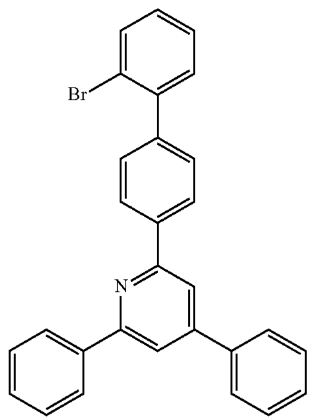 [SMILES: Brc1ccccc1-c1ccc(-c2cc(-c3ccccc3)cc(-c3ccccc3)n2)cc1]<br>1987894-82-5 | 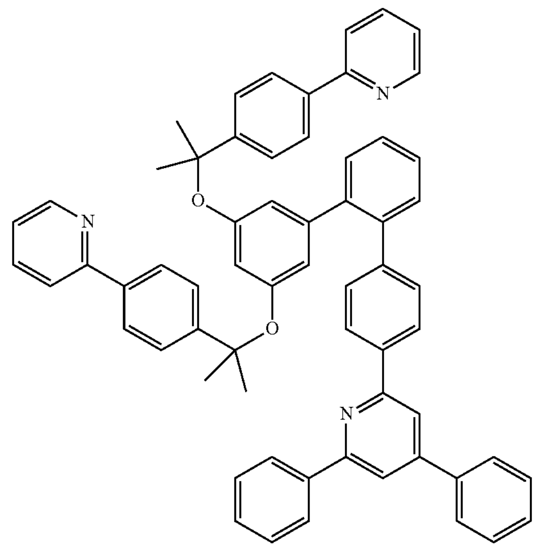 [SMILES: CC(C)(Oc1cc(OC(C)(C)c2ccc(-c3ccccn3)cc2)cc(-c2ccccc2-c2ccc(-c3cc(-c4ccccc4)cc(-c4ccccc4)n3)cc2)c1)c1ccc(-c2ccccn2)cc1] | 60% |
| L141 | S651<br>S600 | 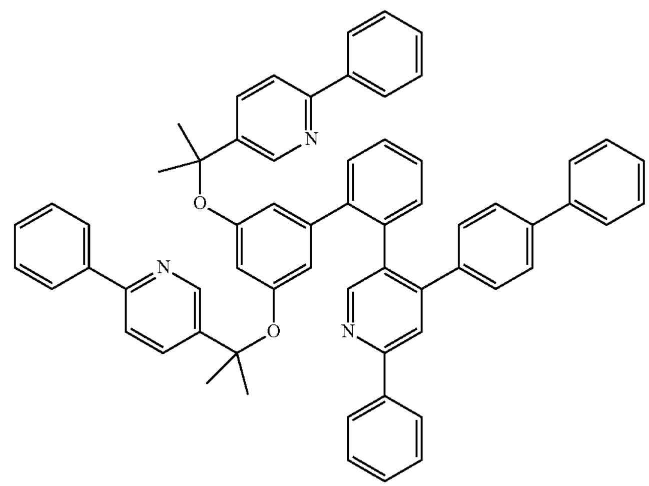 [SMILES: CC(C)(Oc1cc(OC(C)(C)c2ccc(-c3ccccc3)nc2)cc(-c2ccccc2-c2cnc(-c3ccccc3)cc2-c2ccc(-c3ccccc3)cc2)c1)c1ccc(-c2ccccc2)nc1] | 67% |

-continued
| Ex. | Reactants | Product | Yield |
|---|---|---|---|
| L142 | S651<br>S609 | 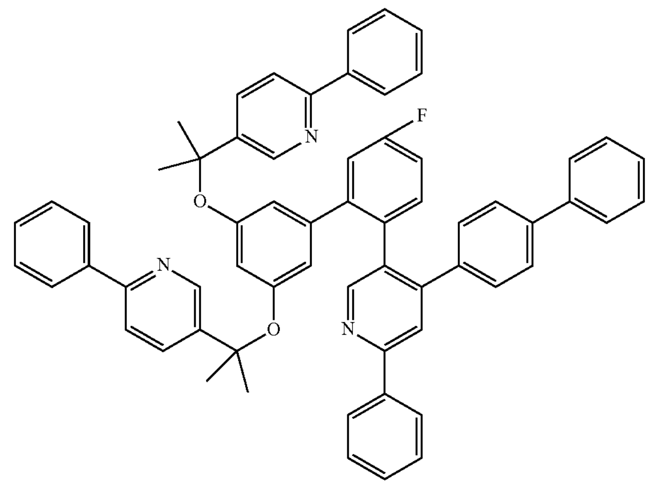 [SMILES: CC(C)(Oc1cc(OC(C)(C)c2ccc(-c3ccccc3)nc2)cc(-c2cc(F)ccc2-c2cnc(-c3ccccc3)cc2-c2ccc(-c3ccccc3)cc2)c1)c1ccc(-c2ccccc2)nc1] | 64% |
| L143 | S652<br>S605 | 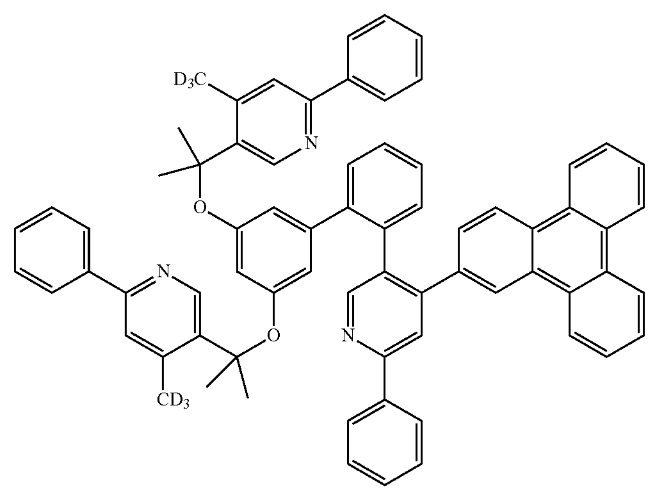 [SMILES: [2H]C([2H])([2H])c1cc(-c2ccccc2)ncc1C(C)(C)Oc1cc(OC(C)(C)c2cnc(-c3ccccc3)cc2C([2H])([2H])[2H])cc(-c2ccccc2-c2cnc(-c3ccccc3)cc2-c2ccc3c4ccccc4c4ccccc4c3c2)c1] | 66% |

-continued
| Ex. | Reactants | Product | Yield |
|---|---|---|---|
| L144 | S652<br>S606 | 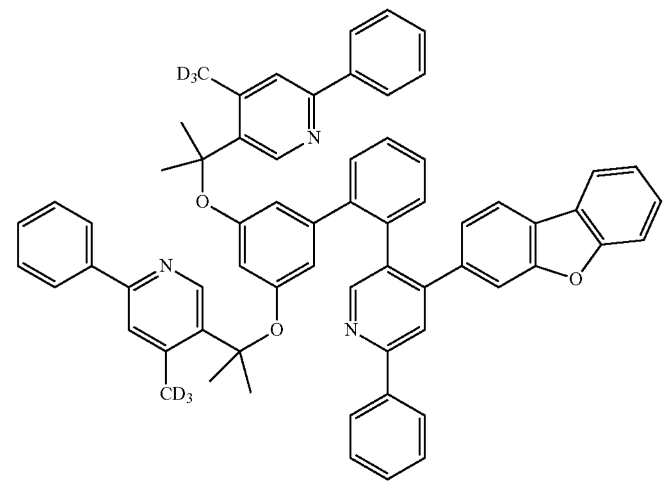 [SMILES: [2H]C([2H])([2H])c1cc(-c2ccccc2)ncc1C(C)(C)Oc1cc(OC(C)(C)c2cnc(-c3ccccc3)cc2C([2H])([2H])[2H])cc(-c2ccccc2-c2cnc(-c3ccccc3)cc2-c2ccc3c(c2)oc2ccccc23)c1] | 63% |
| L145 | S359<br>S600 | 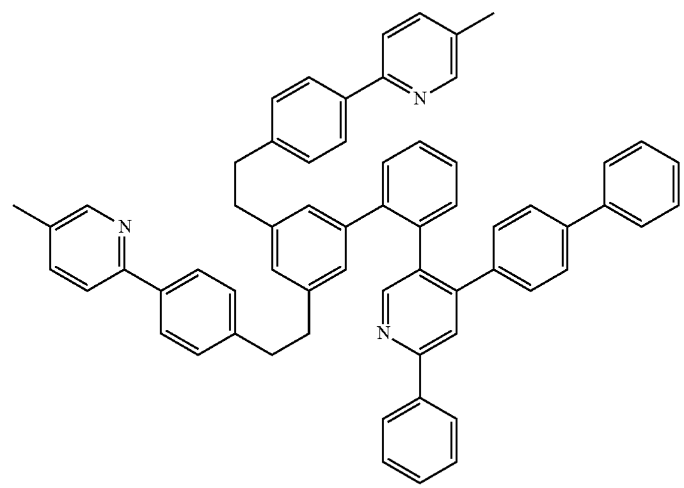 [SMILES: Cc1ccc(-c2ccc(CCc3cc(CCc4ccc(-c5ccc(C)cn5)cc4)cc(-c4ccccc4-c4cnc(-c5ccccc5)cc4-c4ccc(-c5ccccc5)cc4)c3)cc2)nc1] | 67% |

-continued
| Ex. | Reactants | Product | Yield |
| --- | --- | --- | --- |
| L146 | S359<br>S605 | 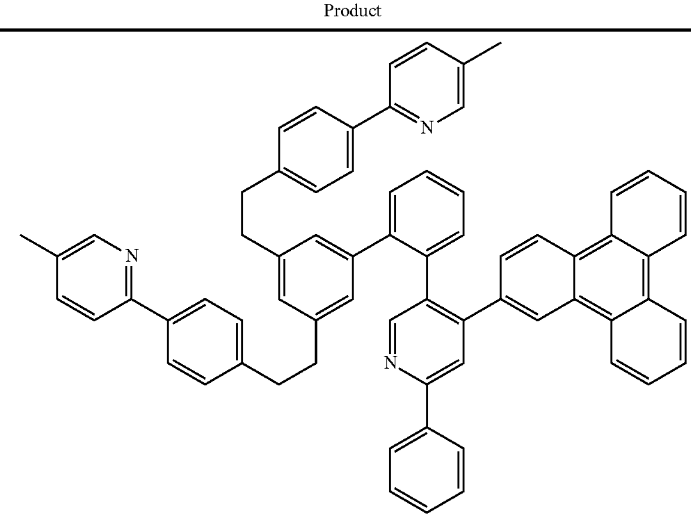 | 70% |
| L147 | S359<br>S606 | 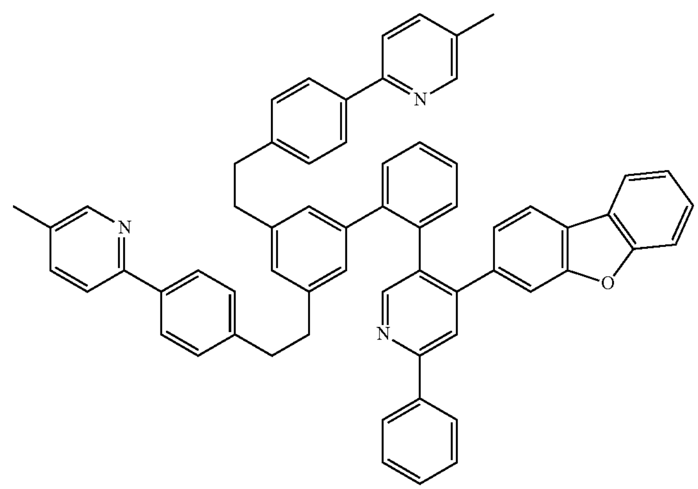 [SMILES: Cc1ccc(-c2ccc(CCc3cc(CCc4ccc(-c5ccc(C)cn5)cc4)cc(-c4ccccc4-c4cnc(-c5ccccc5)cc4-c4ccc5c(c4)oc4ccccc45)c3)cc2)nc1] | 68% |

-continued
| Ex. | Reactants | Product | Yield |
|---|---|---|---|
| L148 | S359<br>S601 | 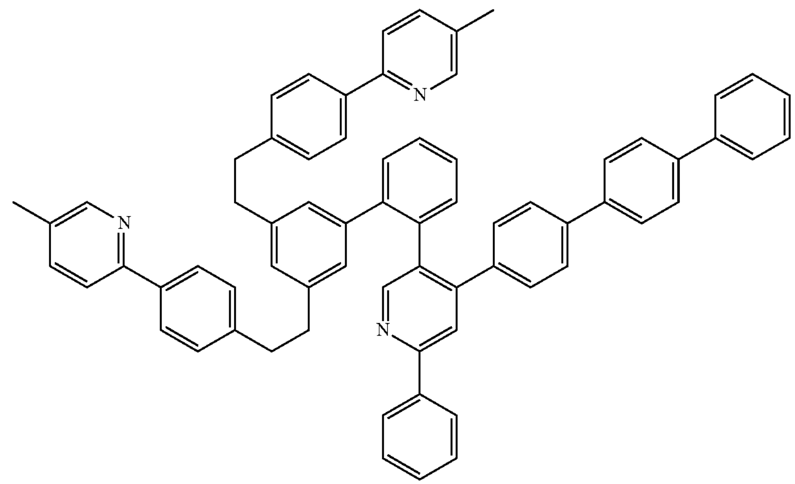 [SMILES: Cc1ccc(-c2ccc(CCc3cc(CCc4ccc(-c5ccc(C)cn5)cc4)cc(-c4ccccc4-c4cnc(-c5ccccc5)cc4-c4ccc(-c5ccc(-c6ccccc6)cc5)cc4)c3)cc2)nc1] | 65% |
| L149 | S379<br>S124 | 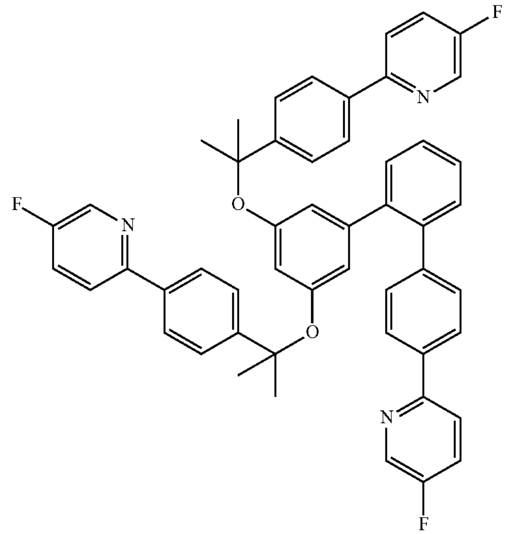 [SMILES: CC(C)(Oc1cc(OC(C)(C)c2ccc(-c3ccc(F)cn3)cc2)cc(-c2ccccc2-c2ccc(-c3ccc(F)cn3)cc2)c1)c1ccc(-c2ccc(F)cn2)cc1] | 67% |

-continued
| Ex. | Reactants | Product | Yield |
|---|---|---|---|
| L150 | S380<br>S600 | 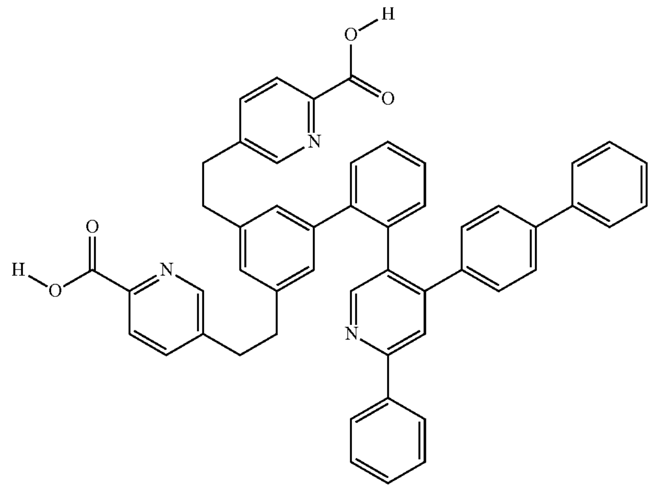 [SMILES: O=C(O)c1ccc(CCc2cc(CCc3ccc(C(=O)O)nc3)cc(-c3ccccc3-c3cnc(-c4ccccc4)cc3-c3ccc(-c4ccccc4)cc3)c2)cn1]<br>Addition of 150 ml of 1N HCl to the cooled reaction mixture prior to separation | 48% |

-continued
| Ex. | Reactants | Product | Yield |
| --- | --- | --- | --- |
| L151 | S380<br>S601 | 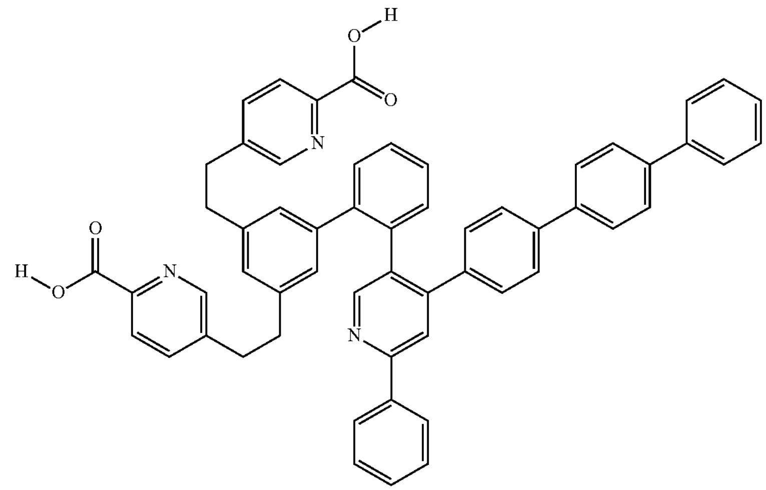 [SMILES: O=C(O)c1ccc(CCc2cc(CCc3ccc(C(=O)O)nc3)cc(-c3ccccc3-c3cnc(-c4ccccc4)cc3-c3ccc(-c4ccc(-c5ccccc5)cc4)cc3)c2)cn1]<br>Addition of 150 ml of 1N HCl to the cooled reaction mixture prior to separation | 53% |

-continued
| Ex. | Reactants | Product | Yield |
| --- | --- | --- | --- |
| L152 | S380<br>S605 | 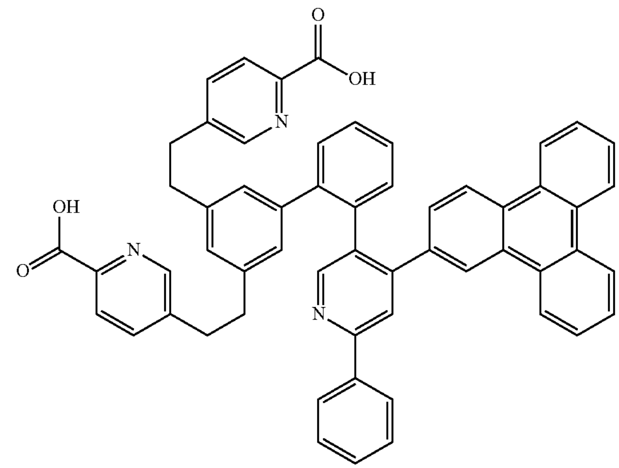 [SMILES: O=C(O)c1ccc(CCc2cc(CCc3ccc(C(=O)O)nc3)cc(-c3ccccc3-c3cnc(-c4ccccc4)cc3-c3ccc4c5ccccc5c5ccccc5c4c3)c2)cn1]<br>Addition of 150 ml of 1N HCl to the cooled reaction mixture prior to separation | 57% |
| L153 | S362<br>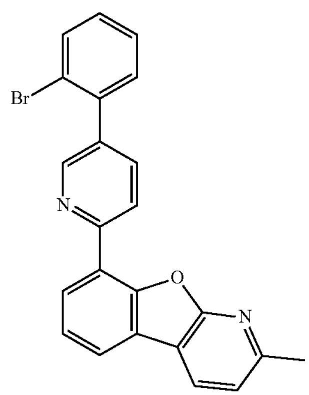 [SMILES: Cc1ccc2c(n1)oc1c(-c3ccc(-c4ccccc4Br)cn3)cccc12]<br>1989597-42-3 | 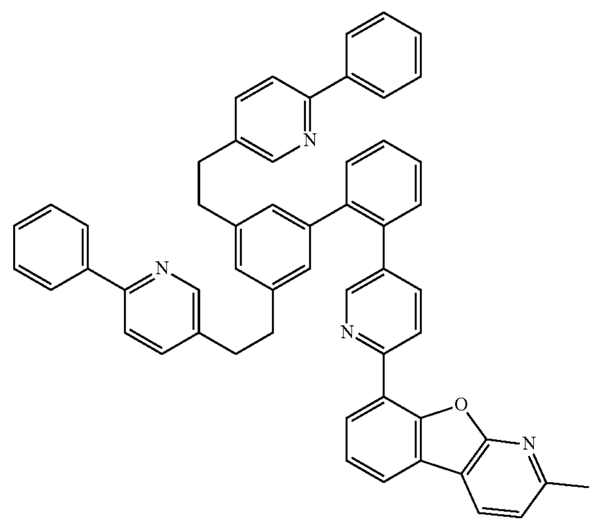 [SMILES: Cc1ccc2c(n1)oc1c(-c3ccc(-c4ccccc4-c4cc(CCc5ccc(-c6ccccc6)nc5)cc(CCc5ccc(-c6ccccc6)nc5)c4)cn3)cccc12] | 63% |

-continued
| Ex. | Reactants | Product | Yield |
| --- | --- | --- | --- |
| L153-D8 | S362-D8<br>1989597-42-3 | 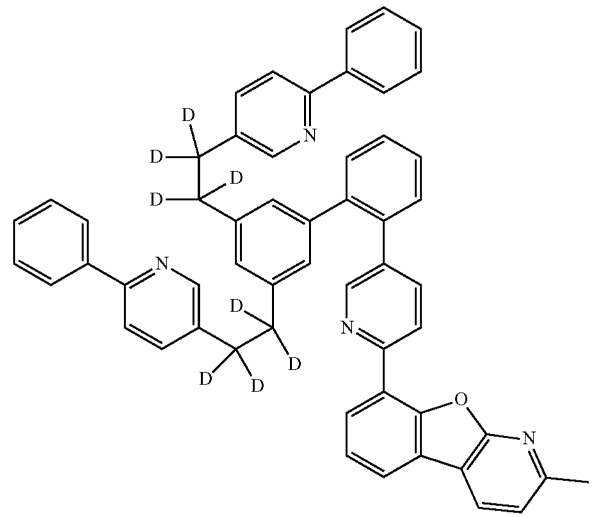 [SMILES: [2H]C([2H])(c1ccc(-c2ccccc2)nc1)C([2H])([2H])c1cc(-c2ccccc2-c2ccc(-c3cccc4c3oc3nc(C)ccc34)nc2)cc(C([2H])([2H])C([2H])([2H])c2ccc(-c3ccccc3)nc2)c1] | 60% |
| L154 | S363<br>1989597-42-3 | 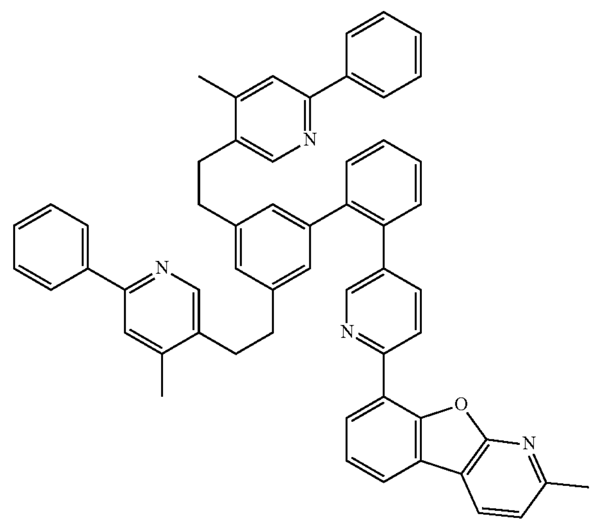 [SMILES: Cc1ccc2c(n1)oc1c(-c3ccc(-c4ccccc4-c4cc(CCc5cnc(-c6ccccc6)cc5C)cc(CCc5cnc(-c6ccccc6)cc5C)c4)cn3)cccc12] | 65% |

-continued
| Ex. | Reactants | Product | Yield |
|---|---|---|---|
| L154-D8 | S363-D8<br>1989597-42-3 | 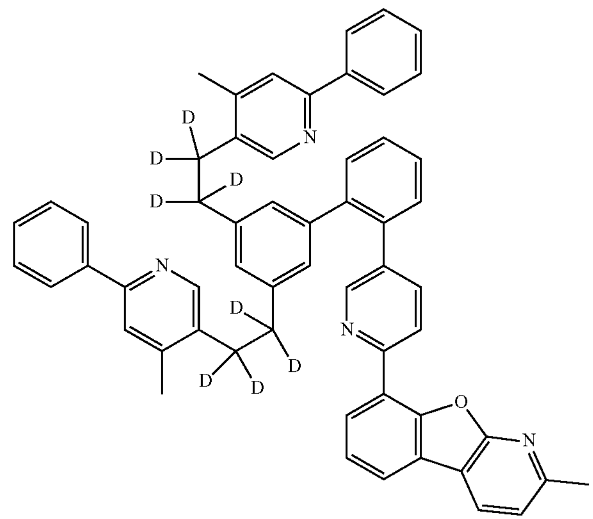 [SMILES: [2H]C([2H])(c1cc(-c2ccccc2-c2ccc(-c3cccc4c3oc3nc(C)ccc34)nc2)cc(C([2H])([2H])C([2H])([2H])c2cnc(-c3ccccc3)cc2C)c1)C([2H])([2H])c1cnc(-c2ccccc2)cc1C] | 62% |
| L155-D8 | S365-D8<br>1989597-42-3 | 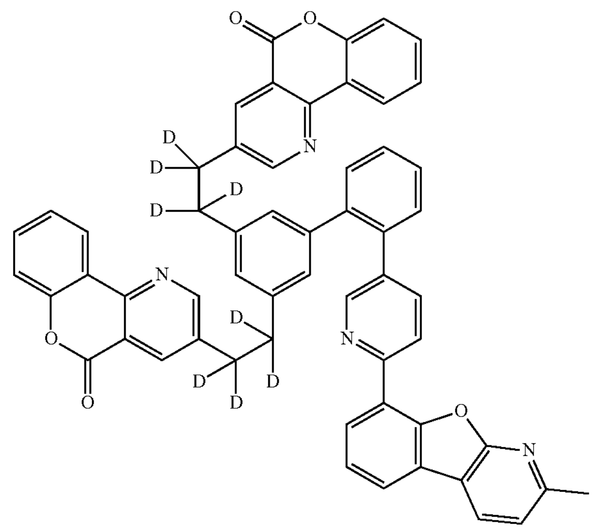 [SMILES: [2H]C([2H])(c1cc(-c2ccccc2-c2ccc(-c3cccc4c3oc3nc(C)ccc34)nc2)cc(C([2H])([2H])C([2H])([2H])c2cnc3c(c2)c(=O)oc2ccccc23)c1)C([2H])([2H])c1cnc2c(c1)c(=O)oc1ccccc12] | 70% |

-continued
| Ex. | Reactants | Product | Yield |
| --- | --- | --- | --- |
| L156 | S371<br>1989597-42-3 | 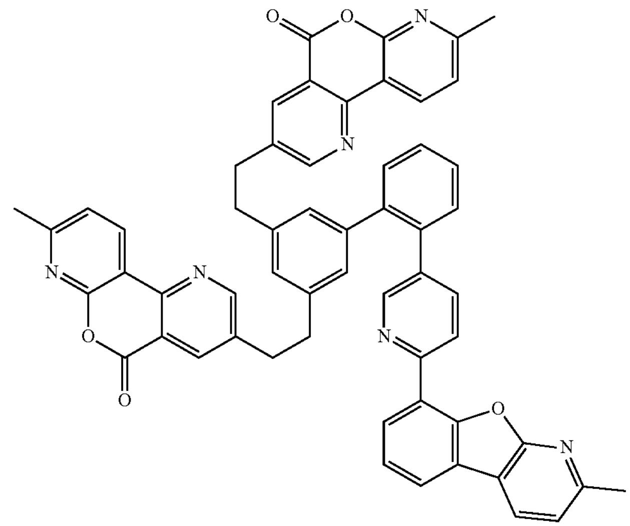 | 71% |
| L157-D8 | S374-D8<br>1989597-42-3 | 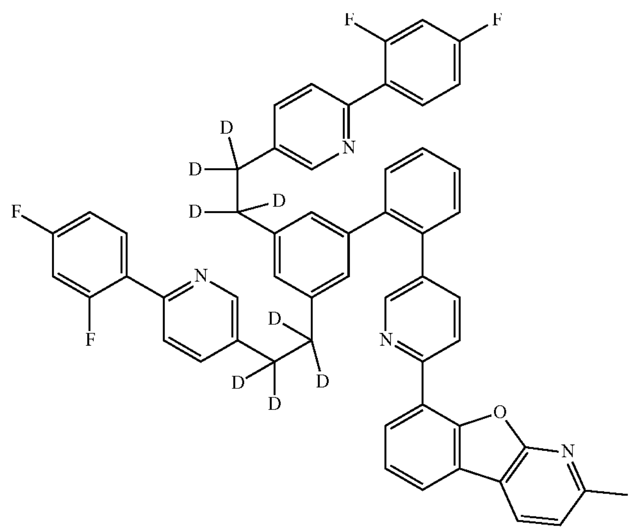 [SMILES: [2H]C([2H])(c1ccc(-c2ccc(F)cc2F)nc1)C([2H])([2H])c1cc(-c2ccccc2-c2ccc(-c3cccc4c3oc3nc(C)ccc34)nc2)cc(C([2H])([2H])C([2H])([2H])c2ccc(-c3ccc(F)cc3F)nc2)c1] | 68% |

-continued
| Ex. | Reactants | Product | Yield |
|---|---|---|---|
| L158 | S380<br>1989597-42-3 | 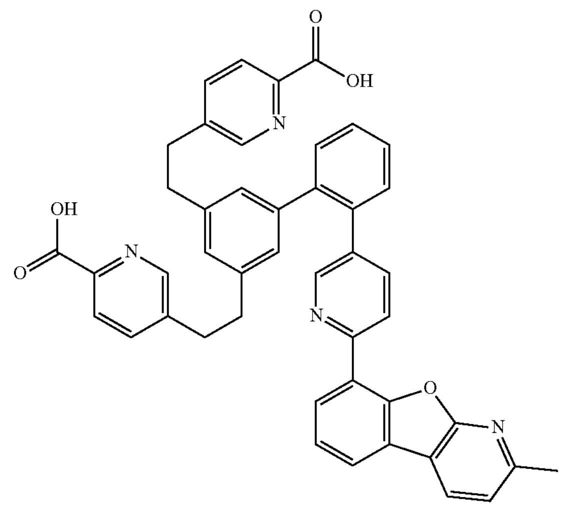 [SMILES: Cc1ccc2c(n1)oc1c(-c3ccc(-c4ccccc4-c4cc(CCc5ccc(C(=O)O)nc5)cc(CCc5ccc(C(=O)O)nc5)c4)cn3)cccc12]<br>Addition of 150 ml of 1N HCl to the cooled reaction mixture prior to separation | 70% |

Example L200
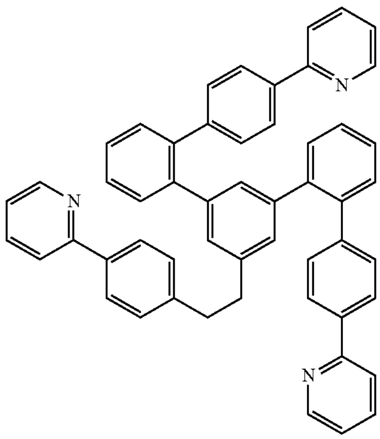 [SMILES: c1ccc(-c2ccc(CCc3cc(-c4ccccc4-c4ccc(-c5ccccn5)cc4)cc(-c4ccccc4-c4ccc(-c5ccccn5)cc4)c3)cc2)nc1]
Preparation analogous to Example S150, using, rather than 100 mmol of S358, 25.6 g (50 mmol) of S500 and, rather than 100 mmol of S100, 31.0 g (100 mmol) of 2-(2'-bromo[1,1'-biphenyl]-4-yl)pyridine [1374202-35-3]. Yield: 27.3 g (38 mmol), 76%; purify: approx. 95% by $^{1}$H NMR.
In an analogous manner, it is possible to prepare the following compounds:
| Ex. | Reactants | Product | Yield |
| --- | --- | --- | --- |
| L201 | S501 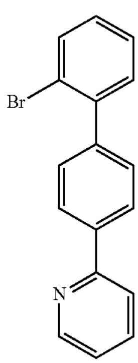 [1374202-35-3] | 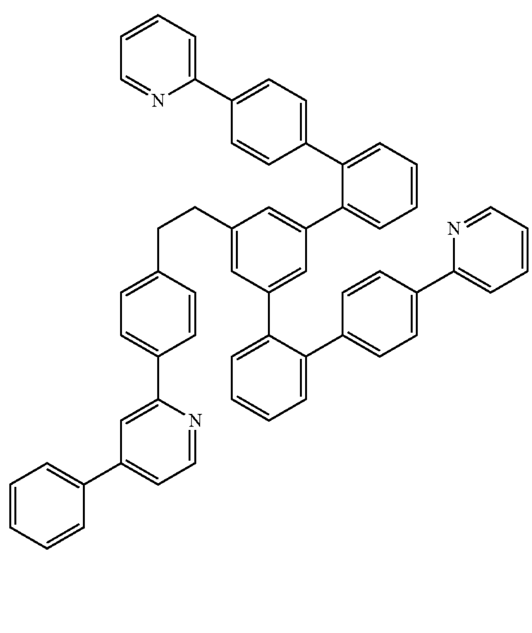 [SMILES: c1ccc(-c2ccnc(-c3ccc(CCc4cc(-c5ccccc5-c5ccc(-c6ccccn6)cc5)cc(-c5ccccc5-c5ccc(-c6ccccn6)cc5)c4)cc3)c2)cc1] | 70% |

-continued
| Ex. | Reactants | Product | Yield |
|---|---|---|---|
| L202 | S501 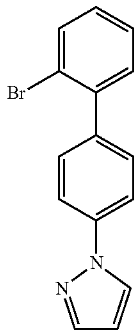 S121 | 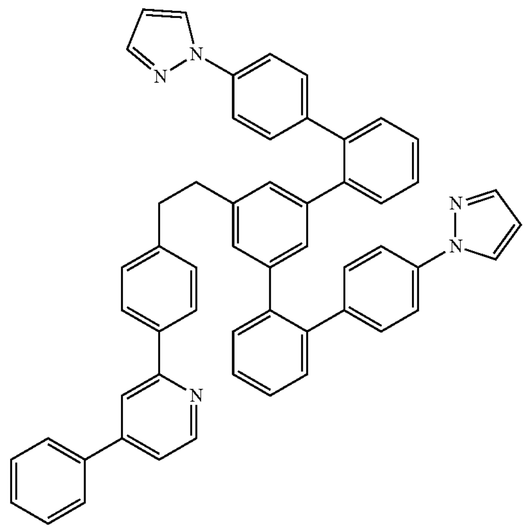 [SMILES: c1ccc(-c2ccnc(-c3ccc(CCc4cc(-c5ccccc5-c5ccc(-n6cccn6)cc5)cc(-c5ccccc5-c5ccc(-n6cccn6)cc5)c4)cc3)c2)cc1] | 56% |
| L203 | S502 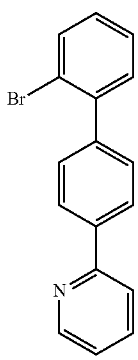 [1374202-35-3] | 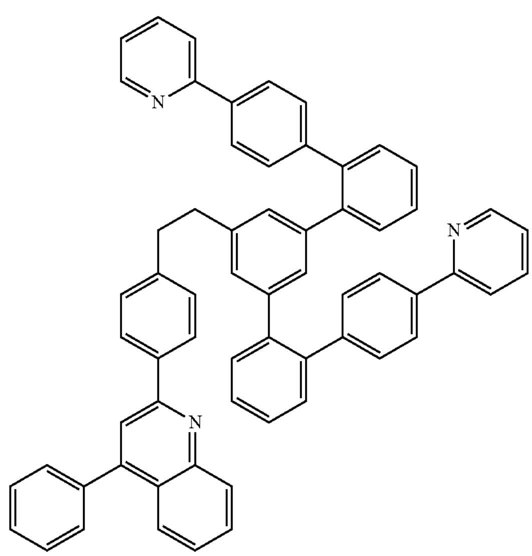 [SMILES: c1ccc(-c2cc(-c3ccc(CCc4cc(-c5ccccc5-c5ccc(-c6ccccn6)cc5)cc(-c5ccccc5-c5ccc(-c6ccccn6)cc5)c4)cc3)nc3ccccc23)cc1] | 74% |

-continued
| Ex. | Reactants | Product | Yield |
|---|---|---|---|
| L204 | S503<br>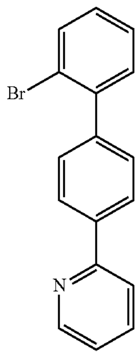<br>[1374202-35-3] | 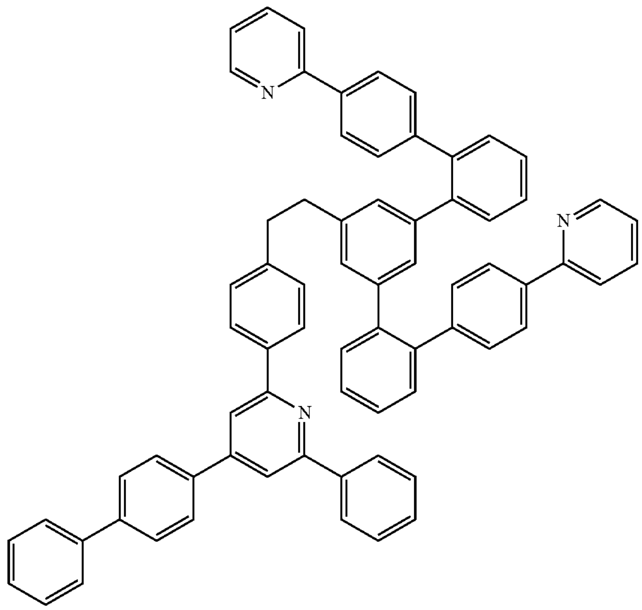 [SMILES: c1ccc(-c2ccc(-c3cc(-c4ccccc4)nc(-c4ccc(CCc5cc(-c6ccccc6-c6ccc(-c7ccccn7)cc6)cc(-c6ccccc6-c6ccc(-c7ccccn7)cc6)c5)cc4)c3)cc2)cc1] | 73% |
| L205 | S504<br>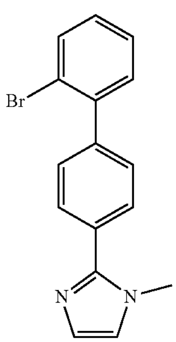 [SMILES: Cn1ccnc1-c1ccc(-c2ccccc2Br)cc1]<br>S117 | 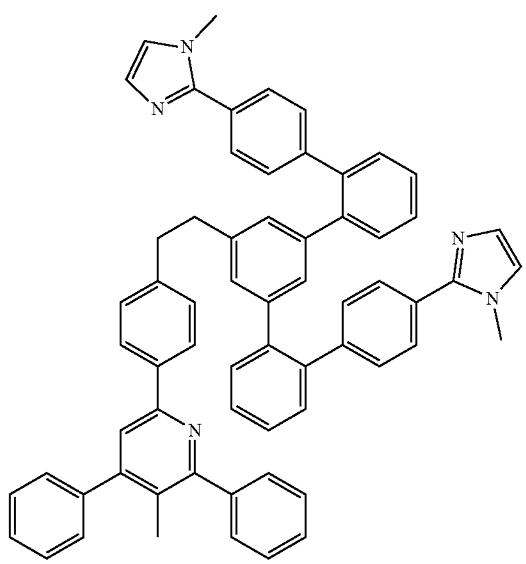 [SMILES: Cc1c(-c2ccccc2)cc(-c2ccc(CCc3cc(-c4ccccc4-c4ccc(-c5nccn5C)cc4)cc(-c4ccccc4-c4ccc(-c5nccn5C)cc4)c3)cc2)nc1-c1ccccc1] | 58% |

-continued
| Ex. | Reactants | Product | Yield |
|---|---|---|---|
| L206 | S505 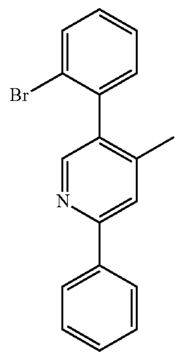 [SMILES: Cc1cc(-c2ccccc2)ncc1-c1ccccc1Br] [1989597-30-9] | 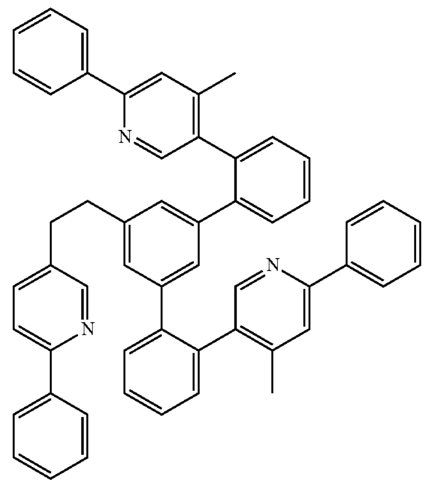 [SMILES: Cc1cc(-c2ccccc2)ncc1-c1ccccc1-c1cc(CCc2ccc(-c3ccccc3)nc2)cc(-c2ccccc2-c2cnc(-c3ccccc3)cc2C)c1] | 69% |
| L207 | S505 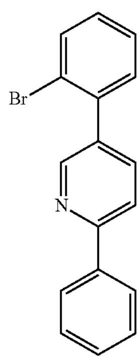 [1989597-29-6] | 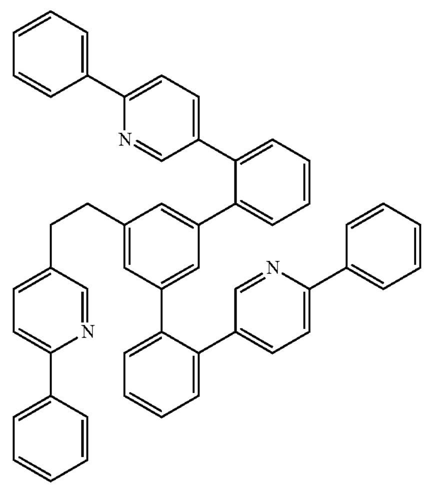 [SMILES: c1ccc(-c2ccc(CCc3cc(-c4ccccc4-c4ccc(-c5ccccc5)nc4)cc(-c4ccccc4-c4ccc(-c5ccccc5)nc4)c3)cn2)cc1] | 70% |
| L208 | S507 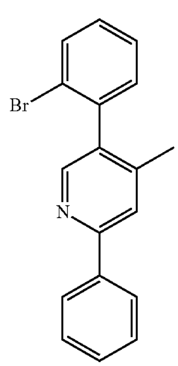 [SMILES: Cc1cc(-c2ccccc2)ncc1-c1ccccc1Br] [1989597-30-9] | 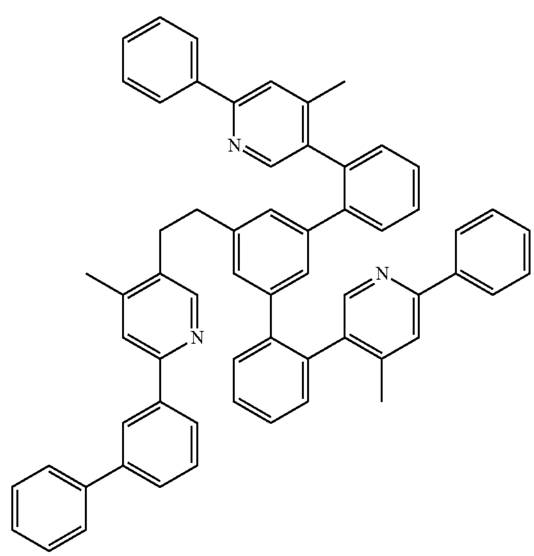 [SMILES: Cc1cc(-c2cccc(-c3ccccc3)c2)ncc1CCc1cc(-c2ccccc2-c2cnc(-c3ccccc3)cc2C)cc(-c2ccccc2-c2cnc(-c3ccccc3)cc2C)c1] | 68% |

-continued
| Ex. | Reactants | Product | Yield |
|---|---|---|---|
| L209 | S508 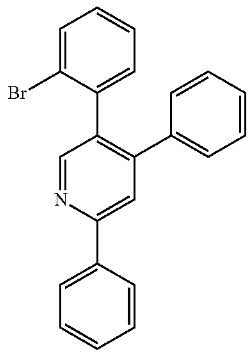 [SMILES: Brc1ccccc1-c1cnc(-c2ccccc2)cc1-c1ccccc1] [1989597-32-1] | 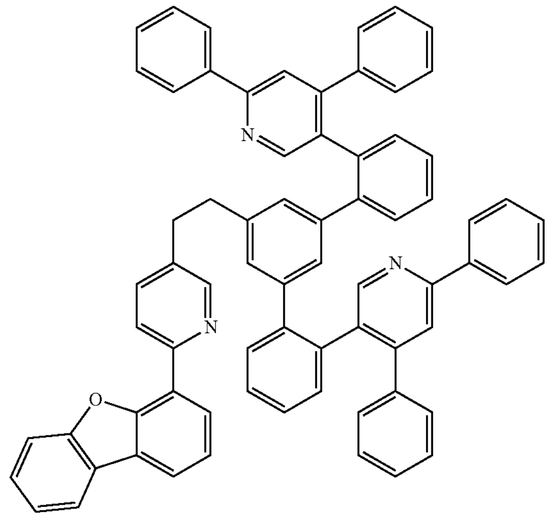 [SMILES: c1ccc(-c2cc(-c3ccccc3)c(-c3ccccc3-c3cc(CCc4ccc(-c5cccc6c5oc5ccccc56)nc4)cc(-c4ccccc4-c4cnc(-c5ccccc5)cc4-c4ccccc4)c3)cn2)cc1] | 72% |
| L210 | S509 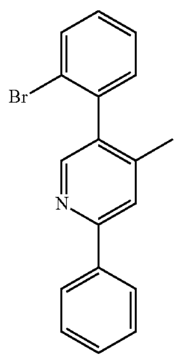 [SMILES: Cc1cc(-c2ccccc2)ncc1-c1ccccc1Br] [1989597-30-9] | 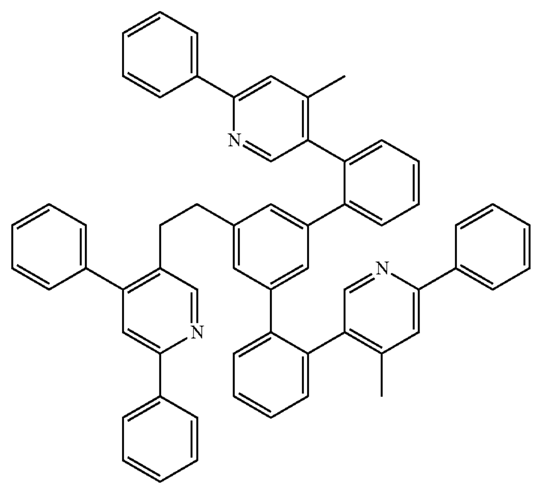 [SMILES: Cc1cc(-c2ccccc2)ncc1-c1ccccc1-c1cc(CCc2cnc(-c3ccccc3)cc2-c2ccccc2)cc(-c2ccccc2-c2cnc(-c3ccccc3)cc2C)c1] | 70% |
| L211 | S510 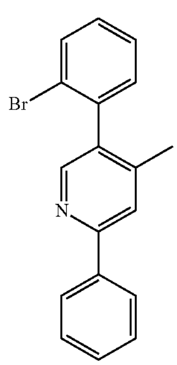 [SMILES: Cc1cc(-c2ccccc2)ncc1-c1ccccc1Br] [1989597-30-9] | 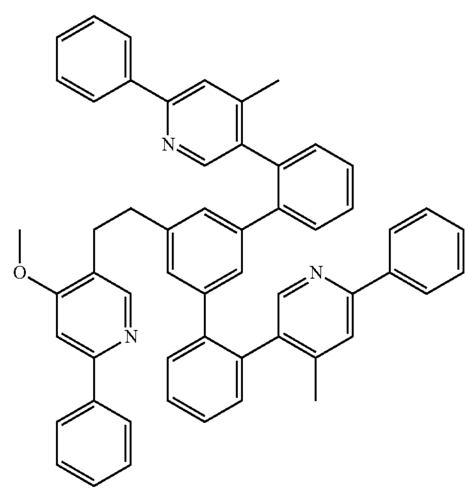 [SMILES: COc1cc(-c2ccccc2)ncc1CCc1cc(-c2ccccc2-c2cnc(-c3ccccc3)cc2C)cc(-c2ccccc2-c2cnc(-c3ccccc3)cc2C)c1] | 67% |

C: Preparation of the Metal Complexes

Example Ir(L1)

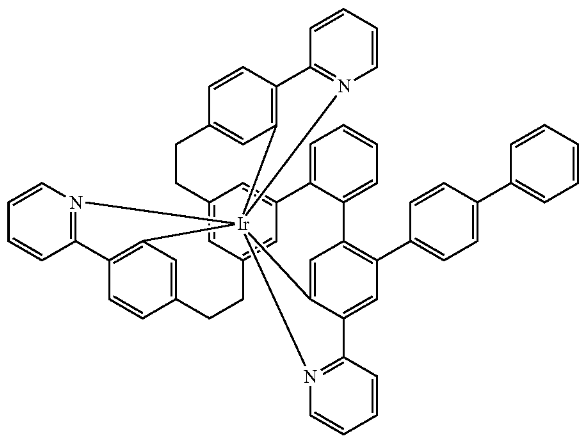

Variant A

A mixture of 8.22 g (10 mmol) of ligand L1, 4.90 g (10 mmol) of trisacetylacetonatoiridium(III) [15635-87-7] and 120 g of hydroquinone [123-31-9] is initially charged in a 1000 ml two-neck round-bottom flask with a glass-sheathed magnetic bar. The flask is provided with a water separator (for media of lower density than water) and an air condenser with argon blanketing. The flask is placed in a metal heating bath. The apparatus is purged with argon from the top via the argon blanketing system for 15 min, allowing the argon to flow out of the side neck of the two-neck flask. Through the side neck of the two-neck flask, a glass-sheathed Pt-100 thermocouple is introduced into the flask and the end is positioned just above the magnetic stirrer bar. Then the apparatus is thermally insulated with several loose windings of domestic aluminium foil, the insulation being run up to the middle of the riser tube of the water separator. Then the apparatus is heated rapidly with a heated laboratory stirrer system to 250-255° C., measured with the Pt-100 temperature sensor which dips into the molten stirred reaction mixture. Over the next 2 h, the reaction mixture is kept at 250-255° C., in the course of which a small amount of condensate is distilled off and collects in the water separator. After 2 h, the mixture is allowed to cool down to 190° C., the heating bath is removed and then 100 ml of ethylene glycol are added dropwise. After cooling to 100° C., 400 ml of methanol are slowly added dropwise. The yellow suspension thus obtained is filtered through a double-ended frit, and the yellow solids are washed three times with 50 ml of methanol and then dried under reduced pressure. Crude yield: quantitative. The solids thus obtained are dissolved in 200 ml of dichloromethane and filtered through about 1 kg of silica gel in the form of a dichloromethane slurry (column diameter about 18 cm) with exclusion of air in the dark, leaving dark-coloured components at the start. The core fraction is cut out and concentrated on a rotary evaporator, with simultaneous continuous dropwise addition of MeOH until crystallization. After filtration with suction, washing with a little MeOH and drying under reduced pressure, the orange product is purified further by continuous hot extraction four times with dichloromethane/i-propanol 1:1 (vv) and then hot extraction four times with dichloromethane/acetonitrile (amount initially charged in each case about 200 ml, extraction thimble: standard Soxhlet thimbles made of cellulose from Whatman) with careful exclusion of air and light. The loss into the mother liquor can be adjusted via the ratio of dichloromethane (low boilers and good dissolvers): i-propanol or acetonitrile (high boilers and poor dissolvers). It should typically be 3-6% by weight of the amount used. Hot extraction can also be accomplished using other solvents such as toluene, xylene, ethyl acetate, butyl acetate, etc. Finally, the product is subjected to fractional sublimation under high vacuum at p about $10^{-6}$ mbar and T about 350-430° C. Yield: 5.38 g (5.3 mmol), 53%; purity: >99.9% by HPLC.

Variant B

Procedure analogous to Ir(L1) Variant A, except that 300 ml of ethylene glycol [111-46-6] are used rather than 120 g of hydroquinone and the mixture is stirred at 190° C. for 16 h. After cooling to 70° C., the mixture is diluted with 300 ml of ethanol, and the solids are filtered off with suction (P3), washed three times with 100 ml each time of ethanol and then dried under reduced pressure. Further purification is effected as described in Variant A. Yield: 4.87 g (4.8 mmol), 48%; purity: >99.9% by HPLC.

Variant C

Procedure analogous to Ir(L1) Variant B, except that 3.53 g (10 mmol) of iridium(III) chloride×n $H_2O$ (n about 3) are used rather than 4.90 g (10 mmol) of trisacetylacetonatoiridium(III) [15635-87-7] and 300 ml of 2-ethoxyethanol/water (3:1, vv) rather than 120 g of hydroquinone, and the mixture is stirred in a stirred autoclave at 190° C. for 30 h. After cooling, the solid is filtered off with suction (P3), washed three times with 30 ml each time of ethanol and then dried under reduced pressure. Further purification is effected as described in Variant B. Yield: 4.16 g (4.1 mmol), 41%; purity: >99.9% by HPLC.

The metal complexes are typically obtained as a 1:1 mixture of the Λ and Δ isomers/enantiomers. The images of complexes adduced hereinafter typically show only one isomer. If ligands having three different sub-ligands are used, or chiral ligands are used as a racemate, the metal complexes derived are obtained as a diastereomer mixture. These can be separated by fractional crystallization or by chromatography, for example with an automatic column system (CombiFlash from A. Semrau). If chiral ligands are used in enantiomerically pure form, the metal complexes derived are obtained as a diastereomer mixture, the separation of which by fractional crystallization or chromatography leads to pure enantiomers. The separated diastereomers or enantiomers can be purified further as described above, for example by hot extraction.

In an analagous manner, it is possible to prepare the following compounds:

| Ex. | Ligand | Product Variant A/extractant* | Yield |
|---|---|---|---|
| Ir(L2) | L2 | 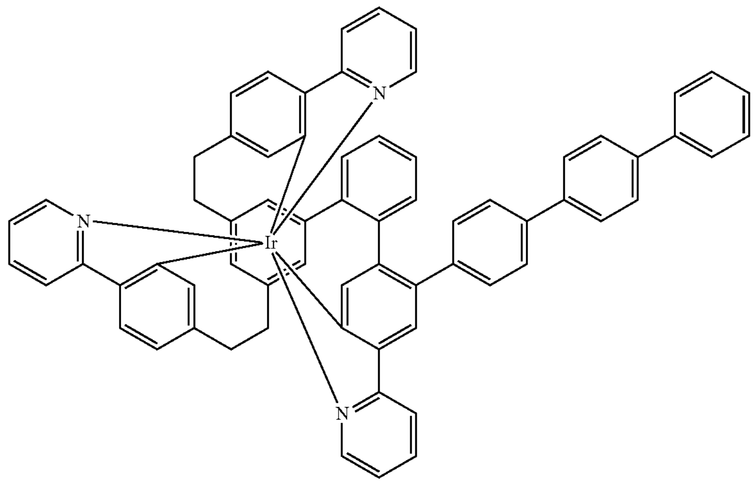 | 67% |
| Ir(L3) | L3 | 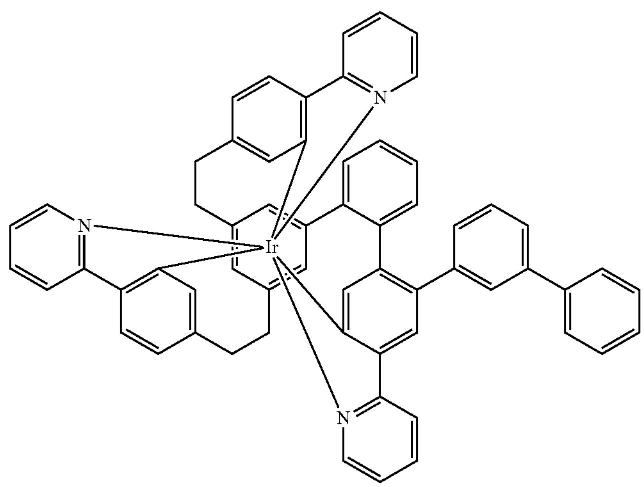 | 63% |
| Ir(L4) | L4 | 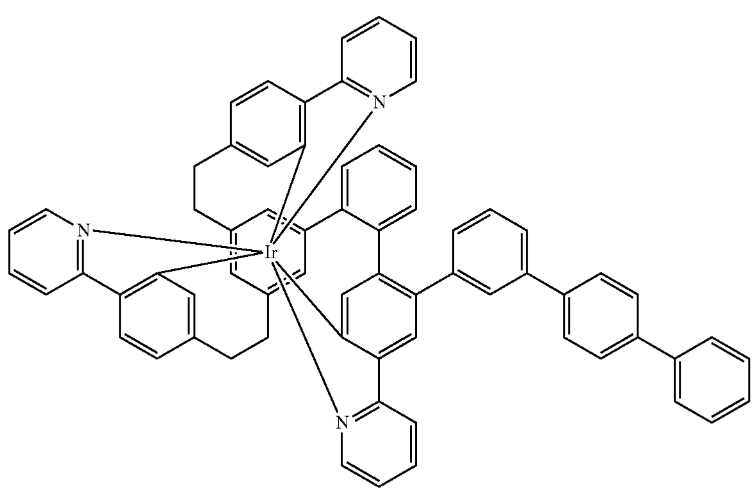 | 60% |
4 x dichloromethane/i-propanol 1:1
4 x toluene -continued
| Ex. | Ligand | Product Variant A/extractant* | Yield |
|---|---|---|---|
| Ir(L5) | L5 | 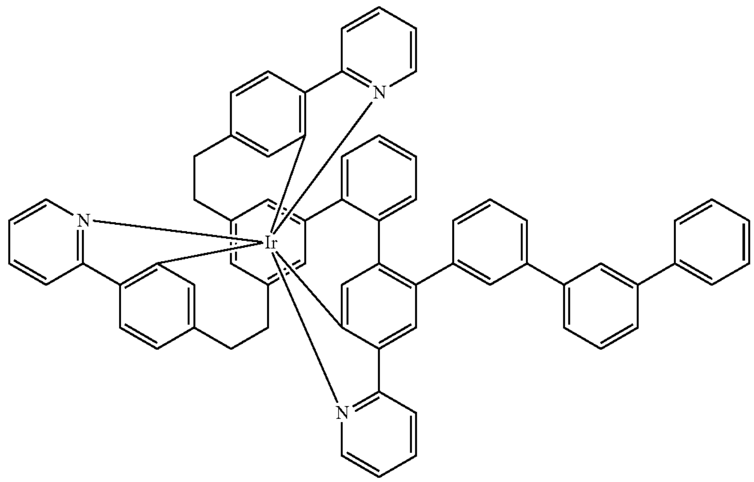 | 55% |
| Ir(L6) | L6 | 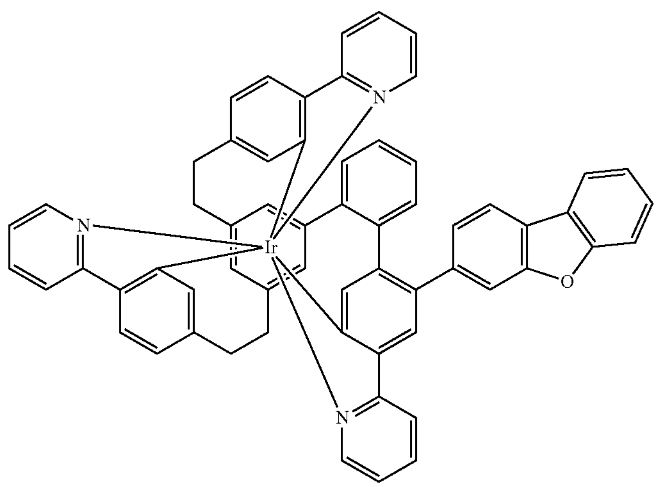 | 61% |
| Ir(L7) | L7 | 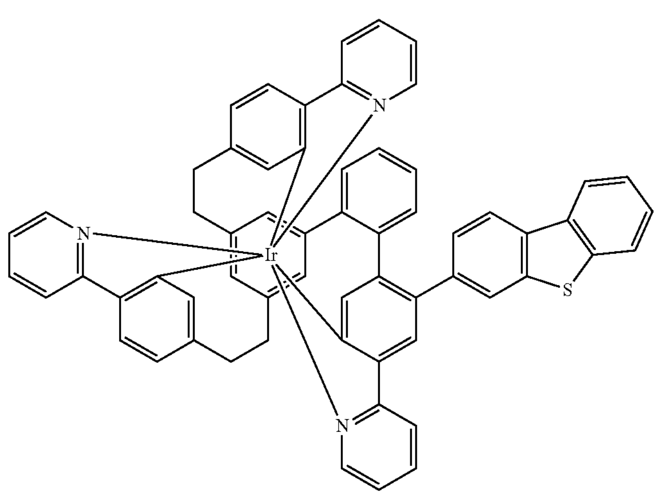 | 59% |

-continued
| Ex. | Ligand | Product Variant A/extractant* | Yield |
|---|---|---|---|
| Ir(L8) | L8 | 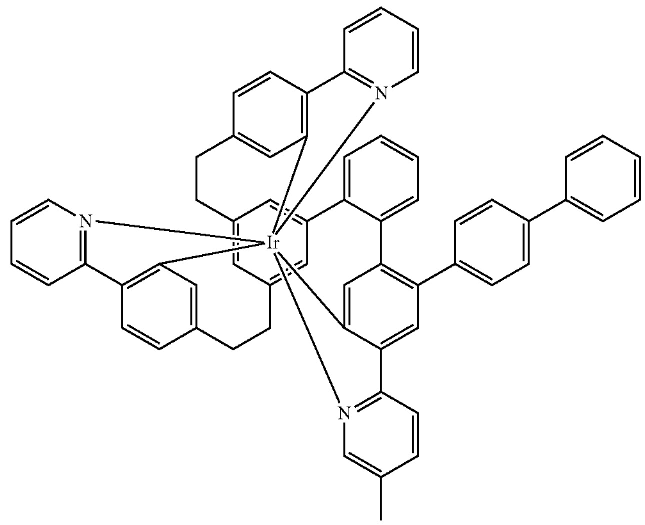 | 61% |
| Ir(L9) | L9 | 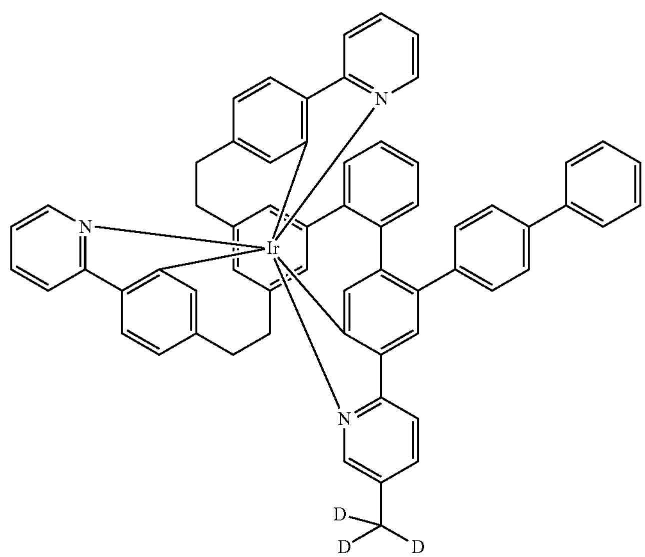 | 57% |
| Ir(L10) | L10 | 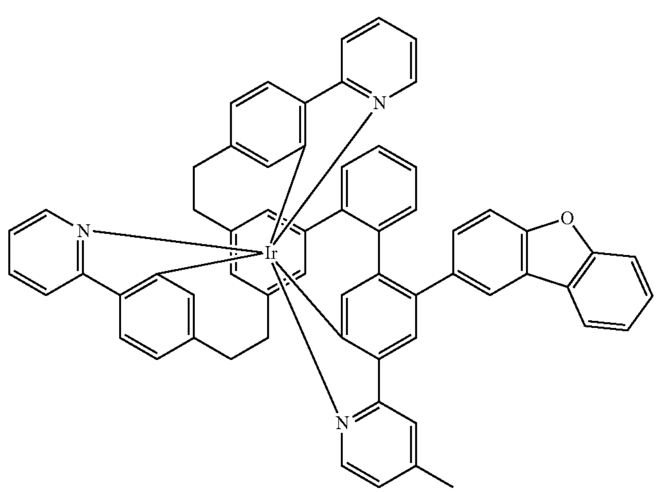 | 62% |

-continued
| Ex. | Ligand | Product Variant A/extractant* | Yield |
|---|---|---|---|
| Ir(L11) | L11 | 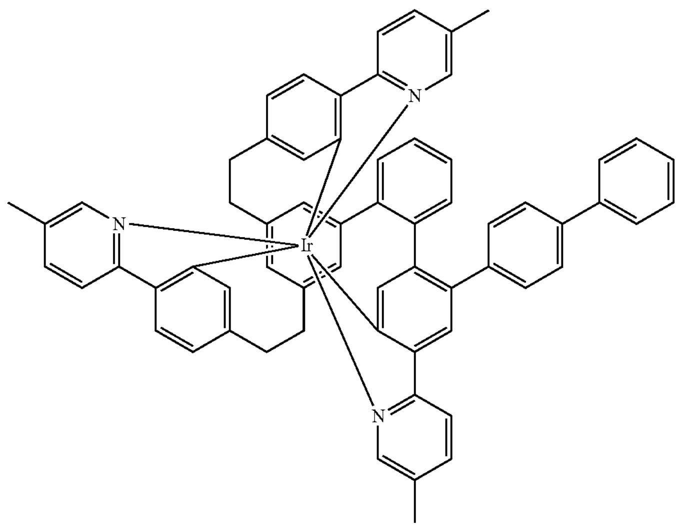 | 62% |
| Ir(L12) | L12 | 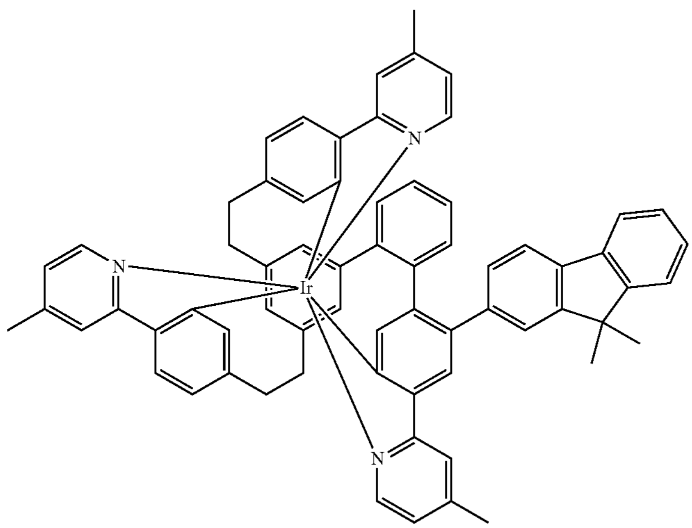 | 64% |
| Ir(L13) | L13 | 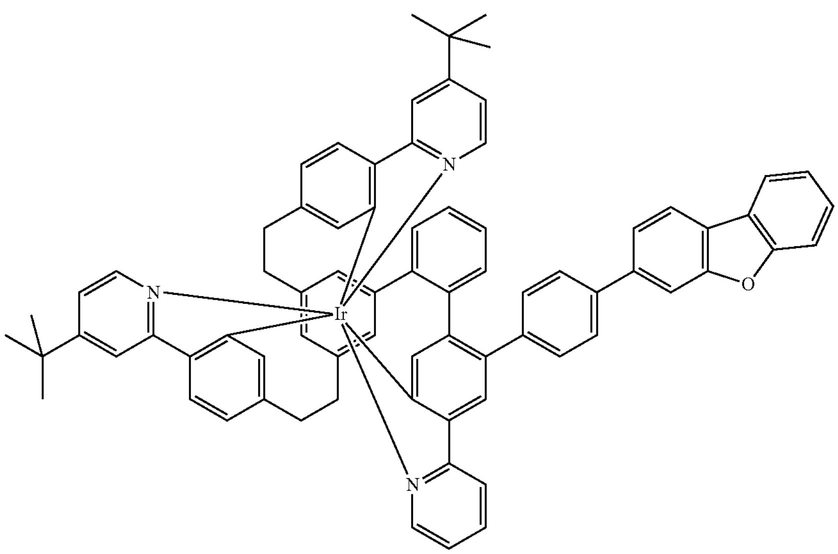 | 60% |

-continued
| Ex. | Ligand | Product Variant A/extractant* | Yield |
|---|---|---|---|
| Ir(L14) | L14 | 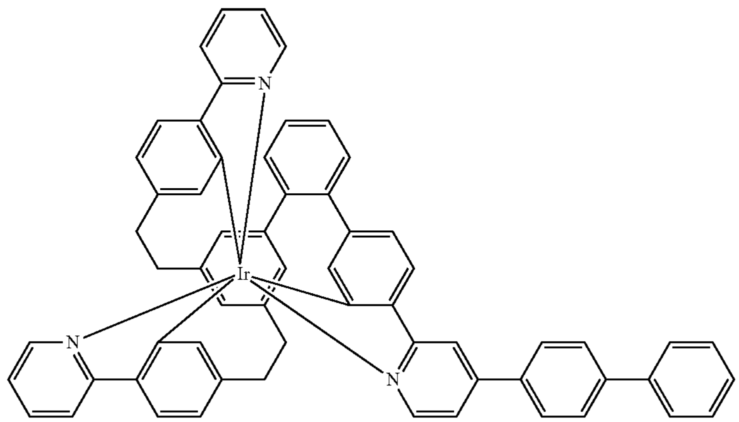 | 58% |
| Ir(L15) | L15 | 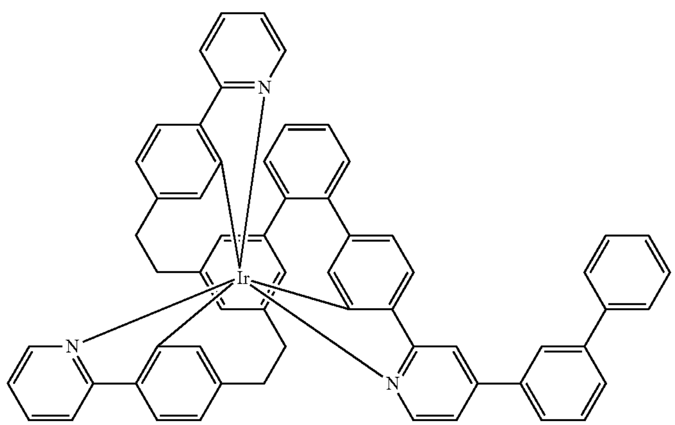 | 60% |
| Ir(L16) | L16 | 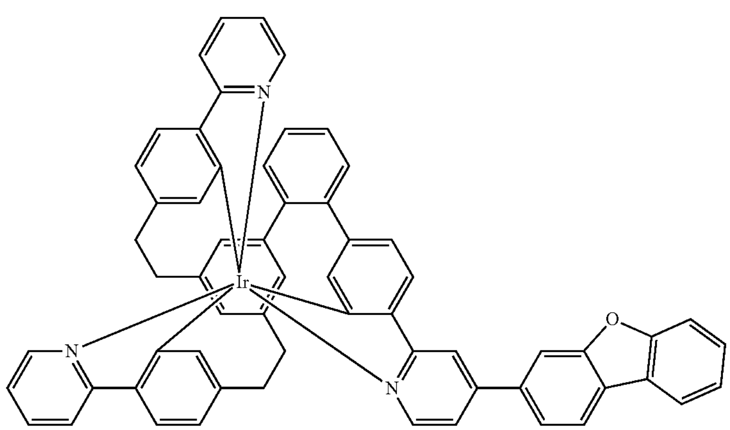 | 64% |

-continued
| Ex. | Ligand | Product Variant A/extractant* | Yield |
|---|---|---|---|
| Ir(L17) | L17 | 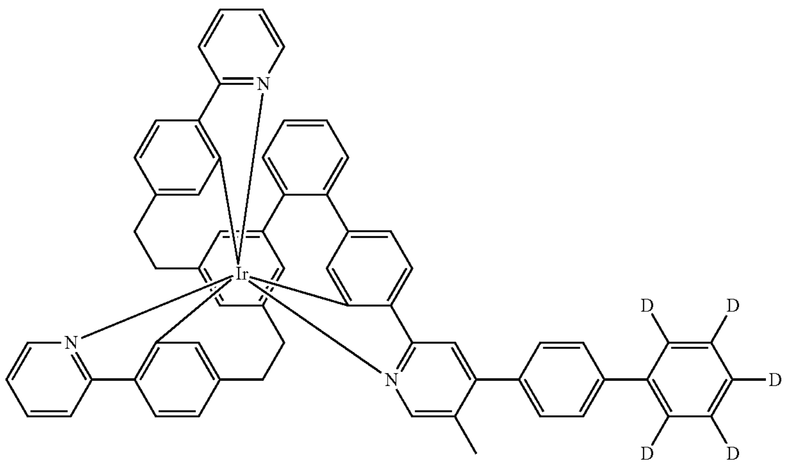 | 57% |
| Ir(L18) | L18 | 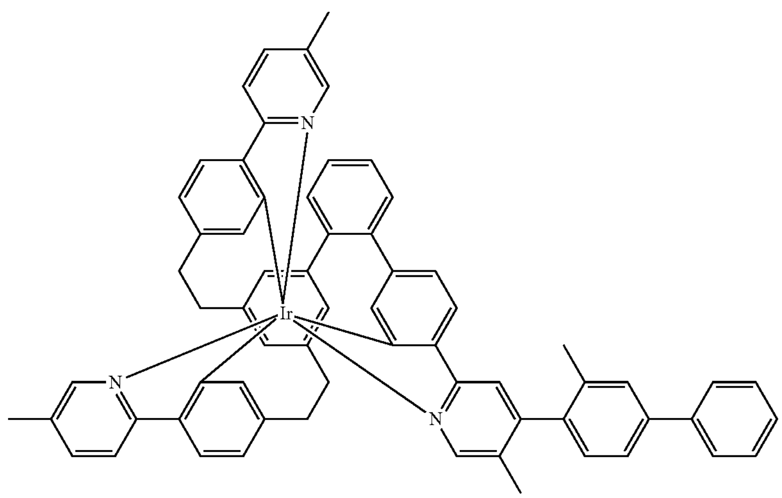 | 59% |
| Ir(L19) | L19 | 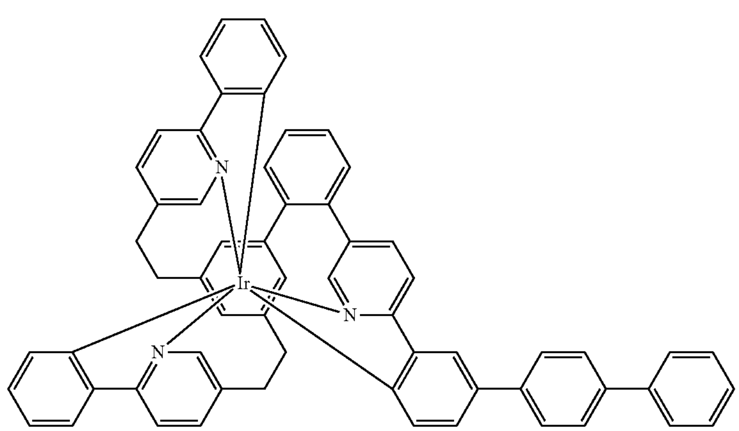 | 66% |

-continued
| Ex. | Ligand | Product Variant A/extractant* | Yield |
|---|---|---|---|
| Ir(L20) | L20 | 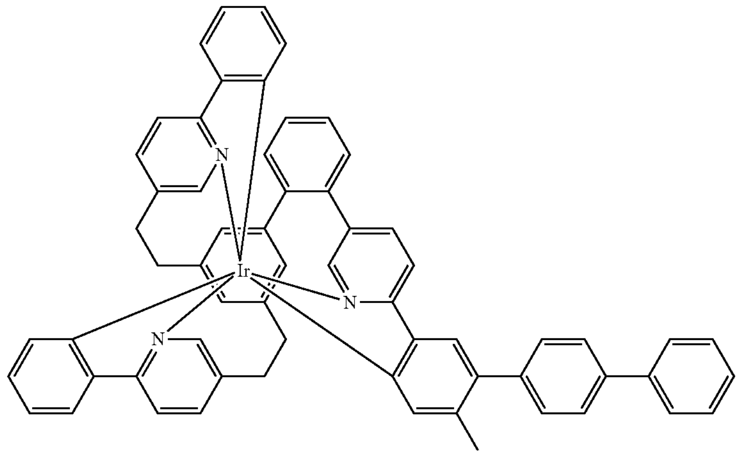 | 62% |
| Ir(L21) | L21 | 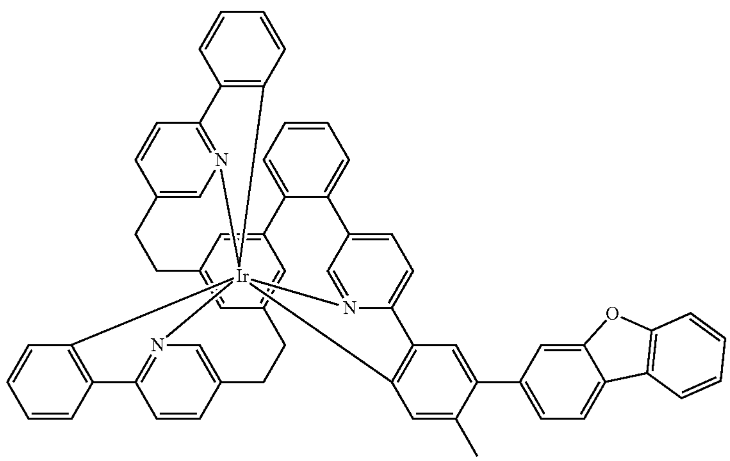 | 60% |
| Ir(L22) | L22 | 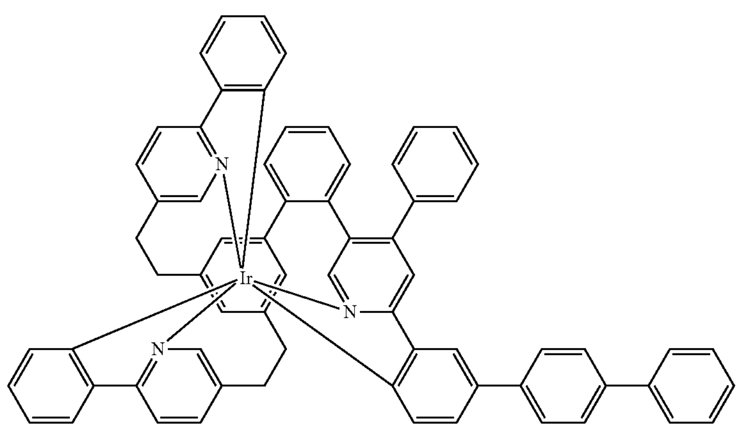 | 57% |

-continued
| Ex. | Ligand | Product Variant A/extractant* | Yield |
|---|---|---|---|
| Ir(L23) | L23 | 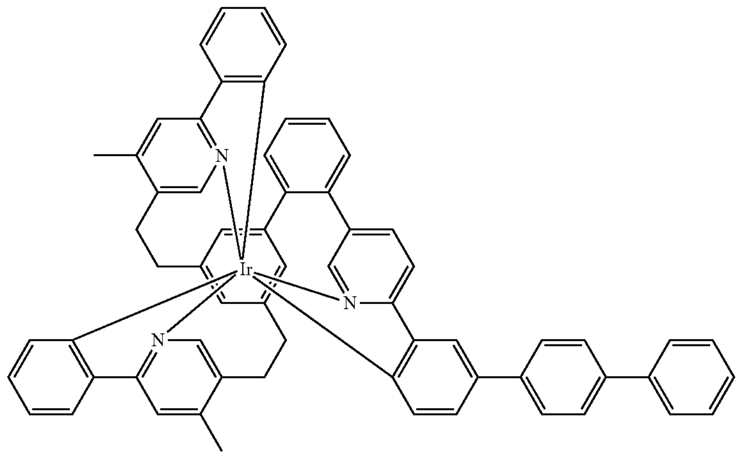 | 60% |
| Ir(L24) | L24 | 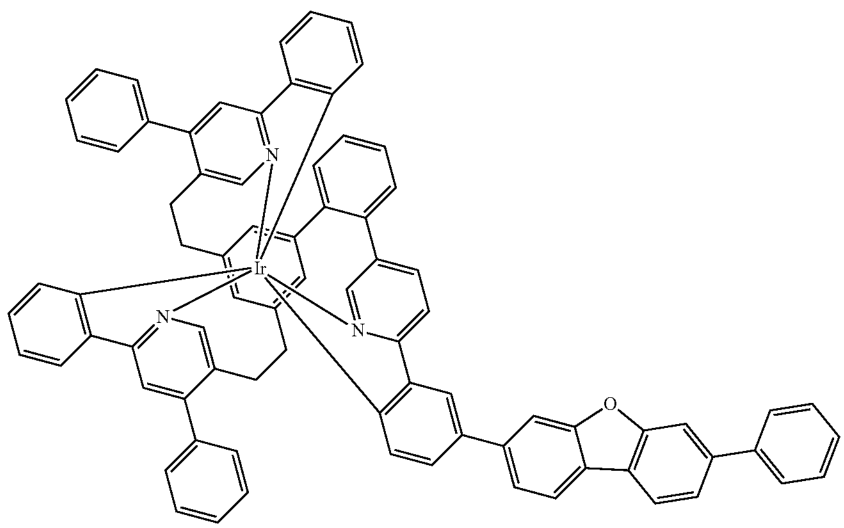 | 57% |
| Ir(L25) | L25 | 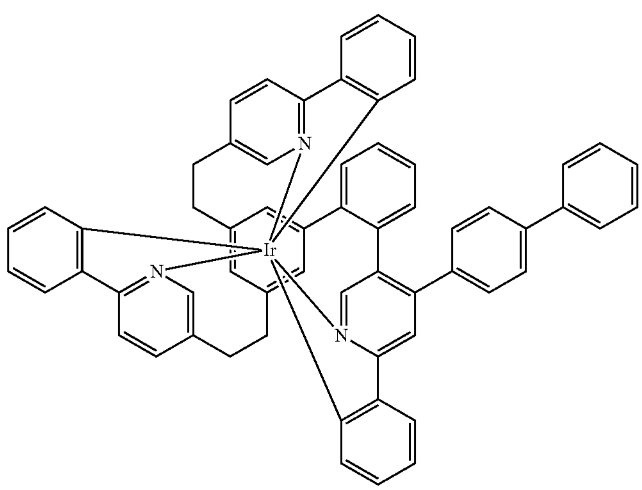 | 64% |

-continued
| Ex. | Ligand | Product Variant A/extractant* | Yield |
|---|---|---|---|
| Ir(L26) | L26 | 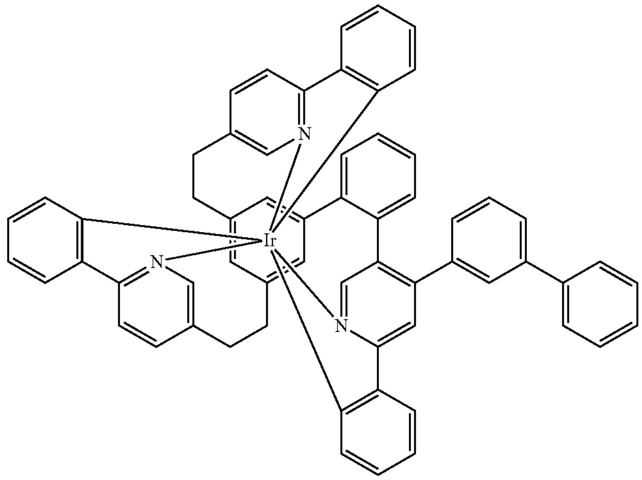 | 63% |
| Ir(L27) | L27 | 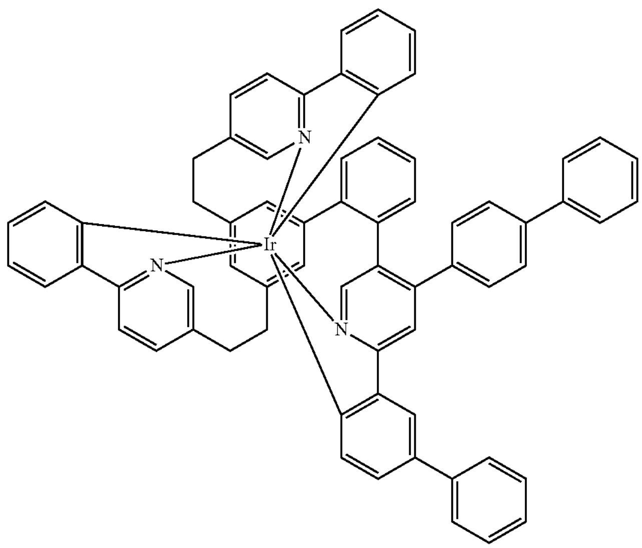 | 59% |
| Ir(L28) | L28 | 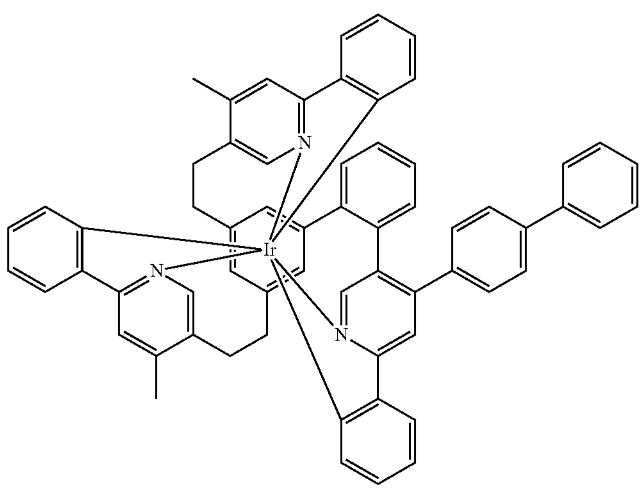 | 58% |

-continued
| Ex. | Ligand | Product Variant A/extractant* | Yield |
| --- | --- | --- | --- |
| Ir(L29) | L29 | 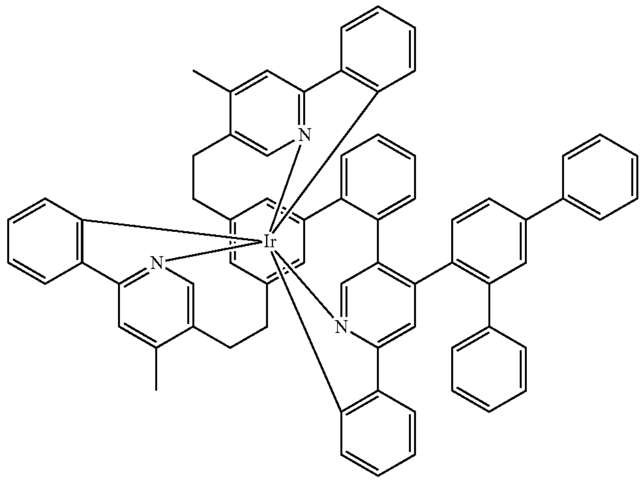 | 62% |
| Ir(L30) | L30 | 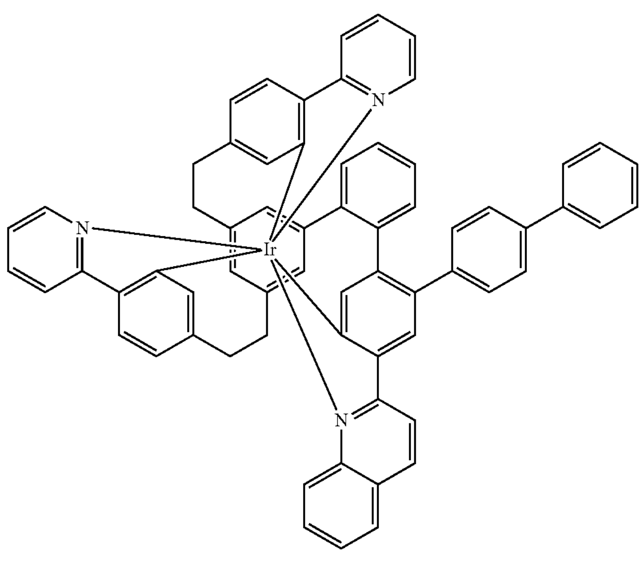 | 58% |

-continued
| Ex. | Ligand | Product Variant A/extractant* | Yield |
|---|---|---|---|
| Ir(L31) | L31 | 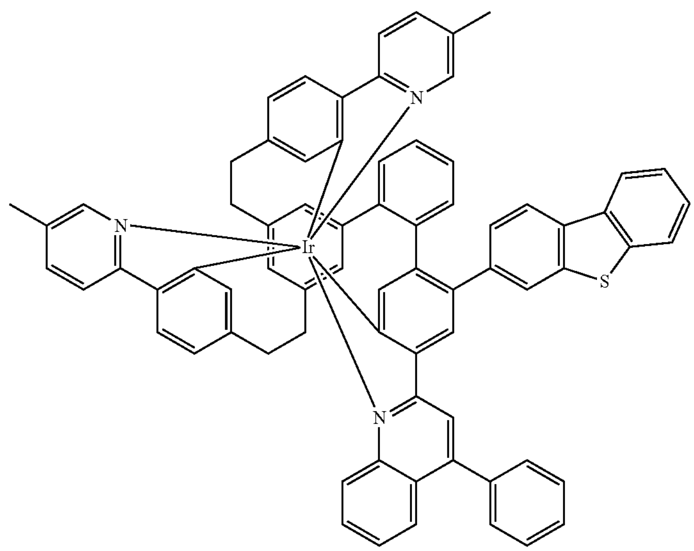<br><br>4 x dichloromethane/i-propanol 1:1<br>4 x o-xylene | 60% |
| Ir(L32) | L32 | 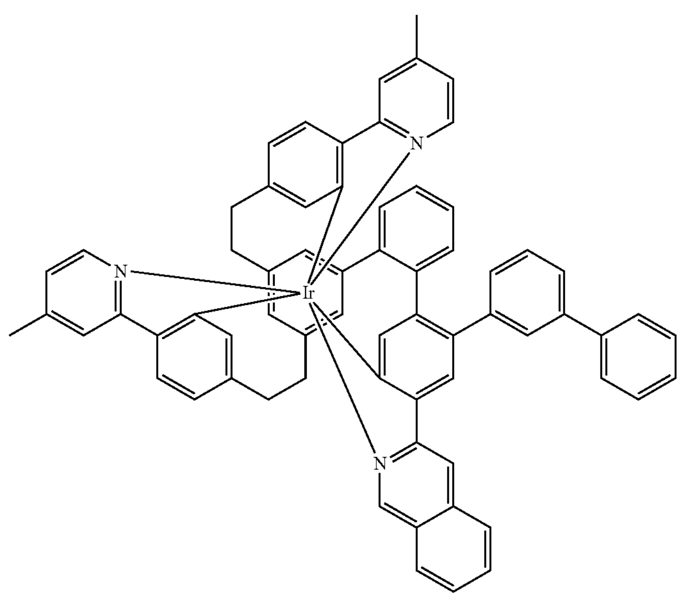<br> | 60% |

-continued
| Ex. | Ligand | Product Variant A/extractant* | Yield |
|---|---|---|---|
| Ir(L33) | L33 | 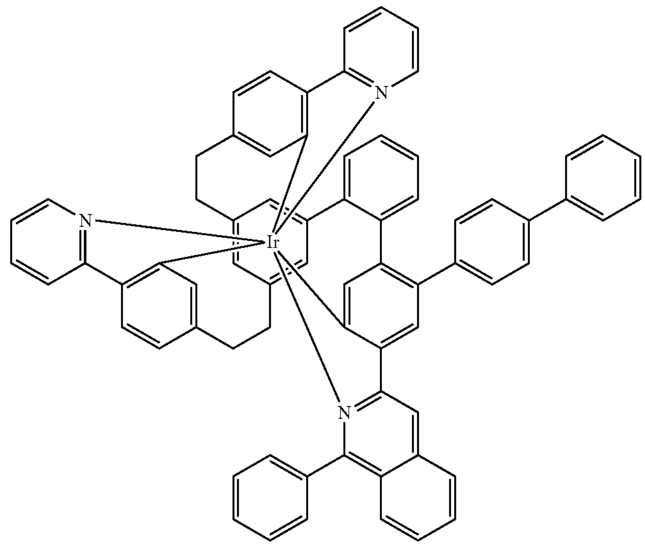 | 63% |
| Ir(L34) | L34 | 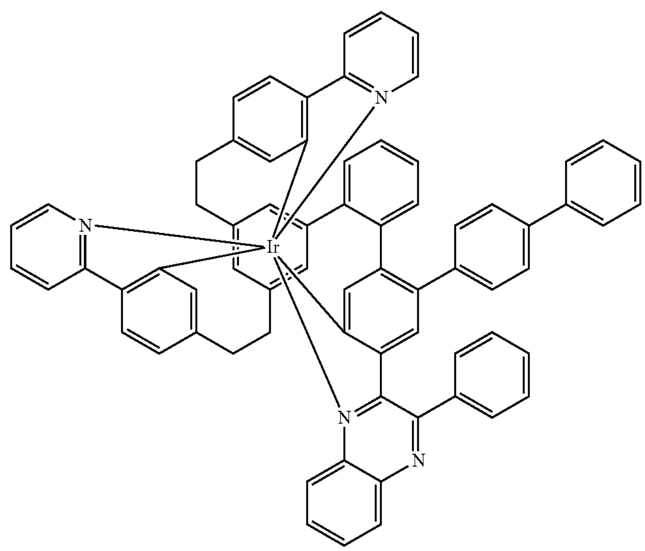 | 60% |
| Ir(L35) | L35 | 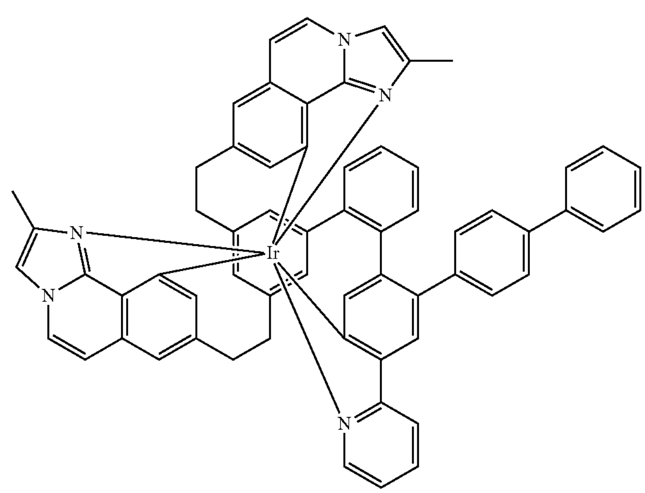 | 61% |

-continued
| Ex. | Ligand | Product Variant A/extractant* | Yield |
|---|---|---|---|
| Ir(L36) | L36 | 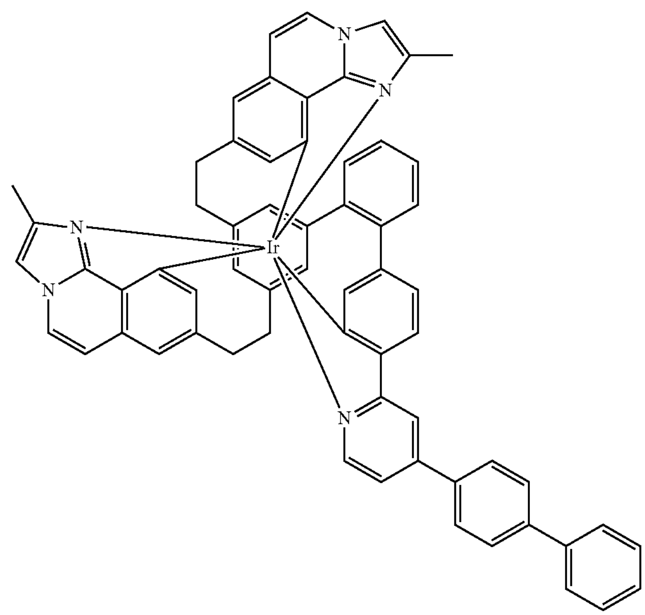 | 57% |
| Ir(L37) | L37 | 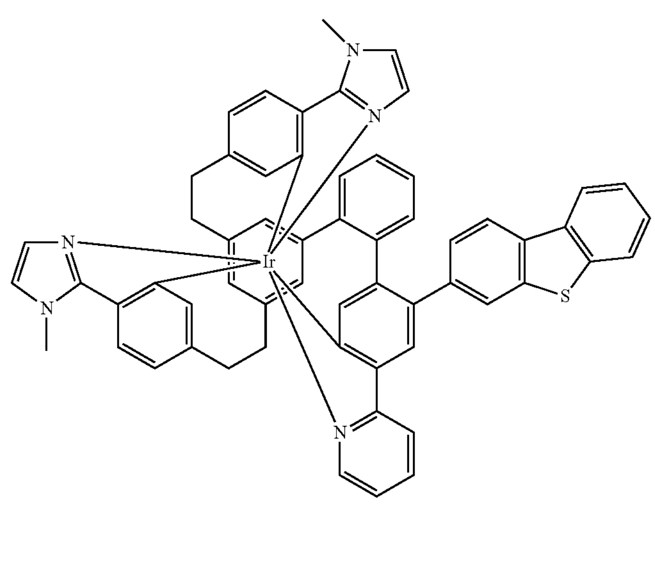 | 55% |

-continued
| Ex. | Ligand | Product Variant A/extractant* | Yield |
|---|---|---|---|
| Ir(L38) | L38 | 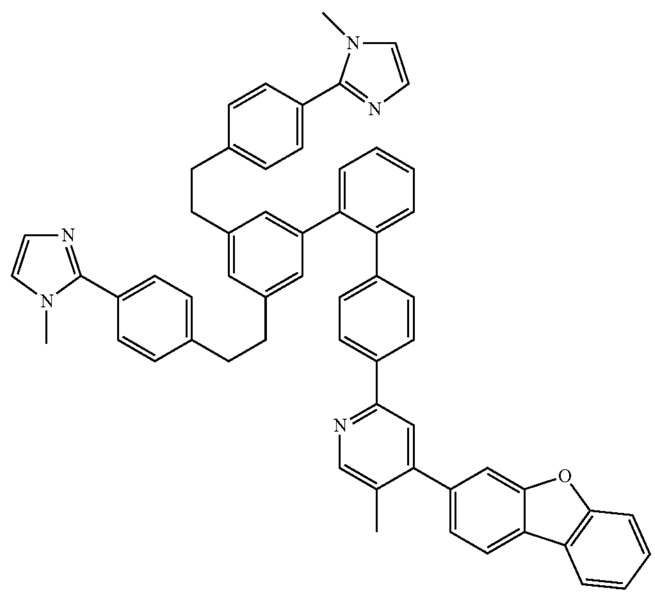 [SMILES: Cc1cnc(-c2ccc(-c3ccccc3-c3cc(CCc4ccc(-c5nccn5C)cc4)cc(CCc4ccc(-c5nccn5C)cc4)c3)cc2)cc1-c1ccc2c(c1)oc1ccccc12] | 58% |
| Ir(L39) | L39 | 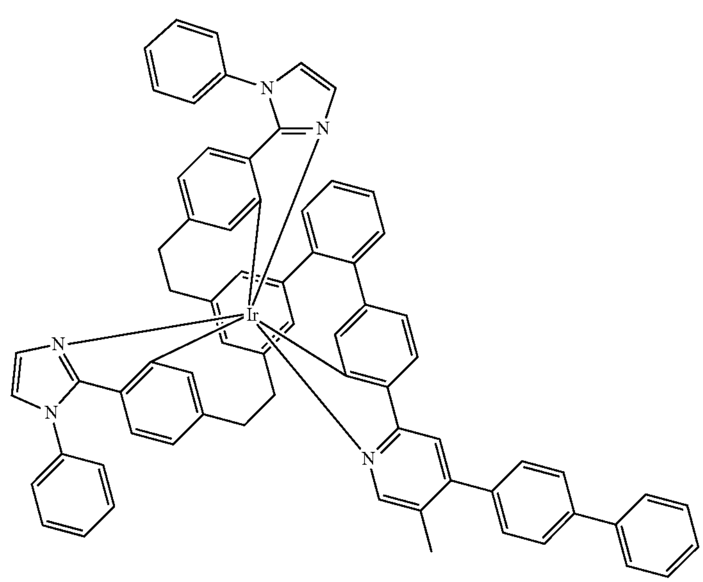 | 56% |

-continued
| Ex. | Ligand | Product Variant A/extractant* | Yield |
|---|---|---|---|
| Ir(L40) | L40 | 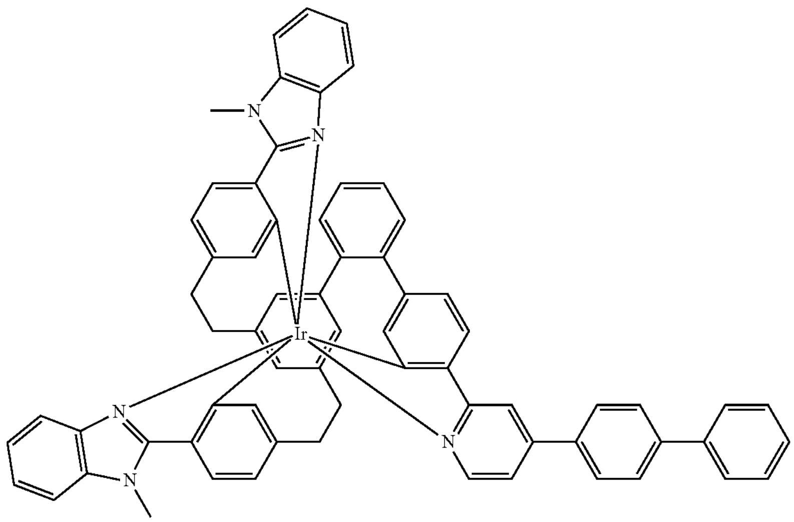 | 60% |
| Ir(L41) | L41 | 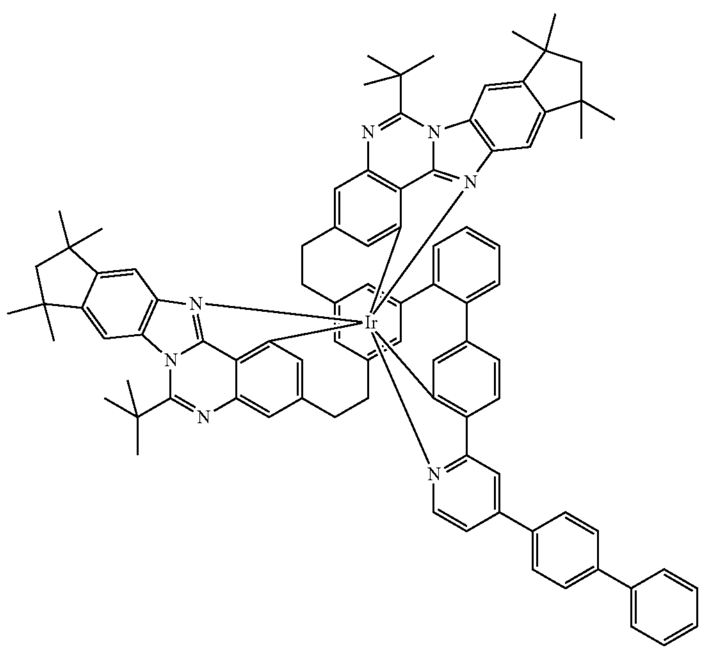 | 53% |

-continued
| Ex. | Ligand | Product Variant A/extractant* | Yield |
| --- | --- | --- | --- |
| Ir(L42) | L42 | 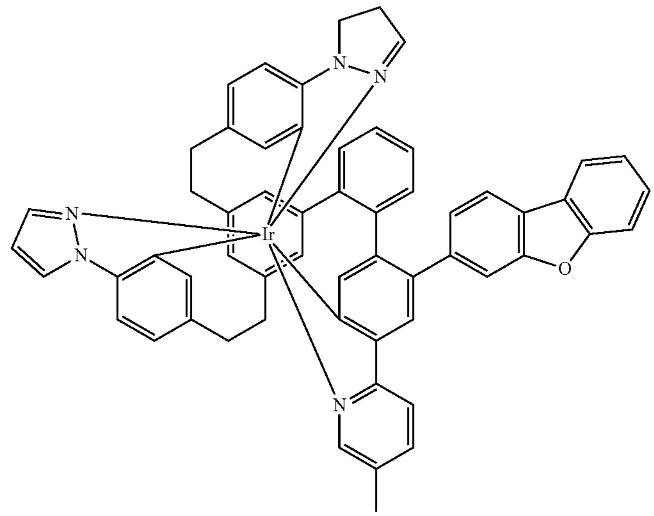 | 60% |
| Ir(L43) | L43 | 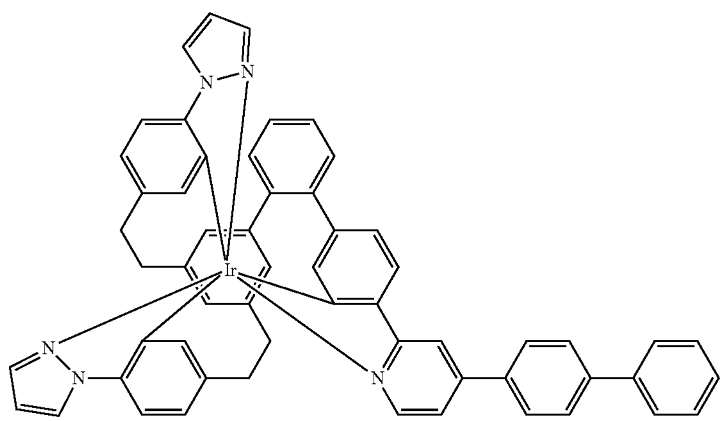 | 63% |
| Ir(L44) | L44 | 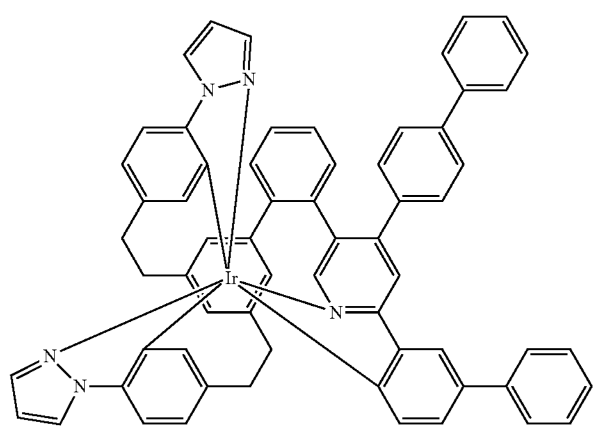 | 62% |

-continued
| Ex. | Ligand | Product Variant A/extractant* | Yield |
|---|---|---|---|
| Ir(L45) | L45 |  Addition of 25 mmol of NaOtBu to the reaction mixture | 40% |
| Ir(L46) | L46 | 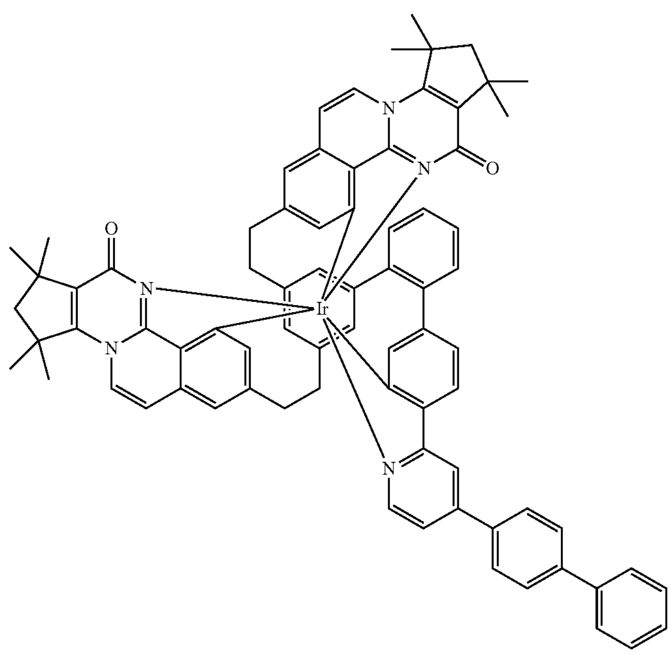 4 x dichloromethane/i-propanol 1:1 4 x n-BuAc | 55% |

-continued
| Ex. | Ligand | Product Variant A/extractant* | Yield |
|---|---|---|---|
| Ir(L47) | L47 | 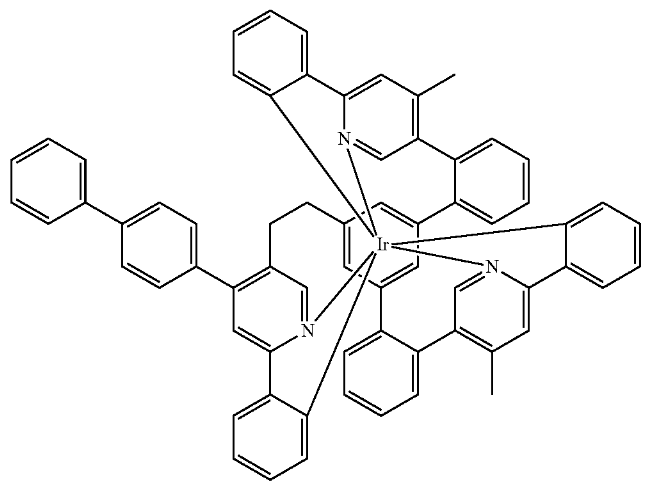 | 61% |
| Ir(L100) | L100 | 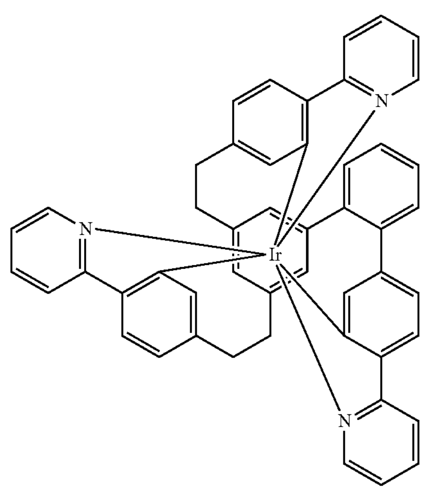 | 65% |
| Ir(L101) | L101 | 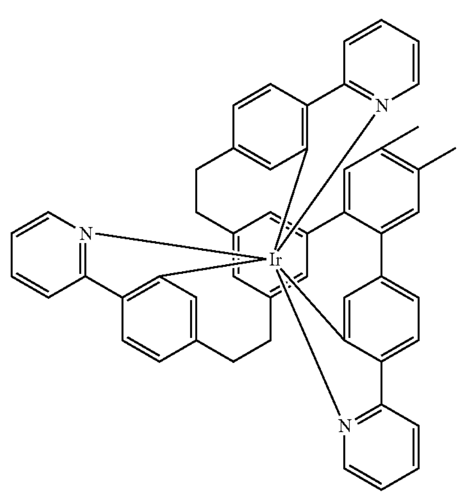 | 67% |

-continued
| Ex. | Ligand | Product Variant A/extractant* | Yield |
|---|---|---|---|
| Ir(L102) | L102 | 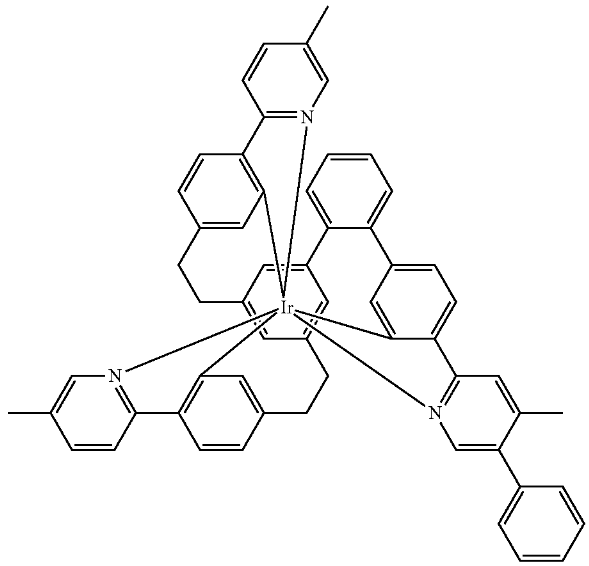 | 63% |
| Ir(L103) | L103 | 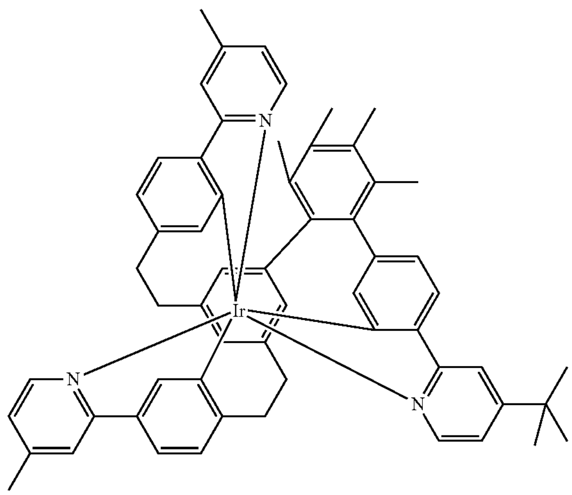 | 65% |
| Ir(L104) | L104 | 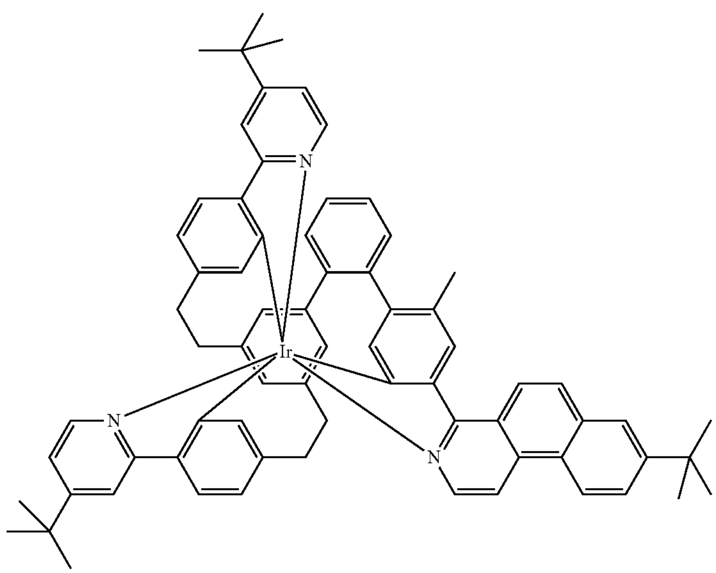 | 58% |

-continued
| Ex. | Ligand | Product Variant A/extractant* | Yield |
|---|---|---|---|
| Ir(L105) | L105 | 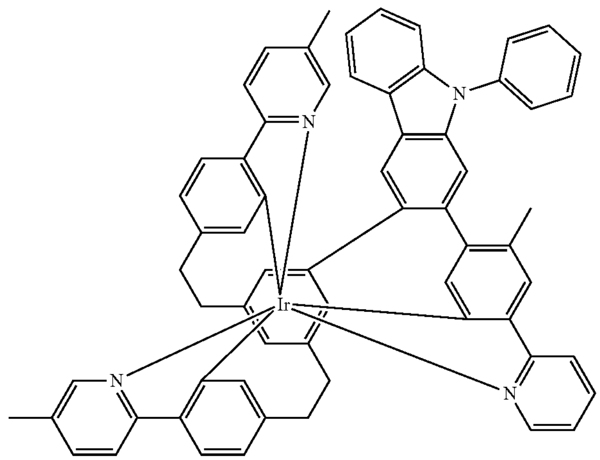 | 61% |
| Ir(L106) | L106 | 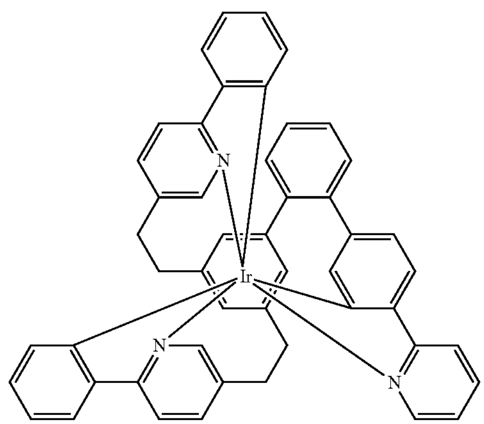 | 64% |
| Ir(L107) | L107 | 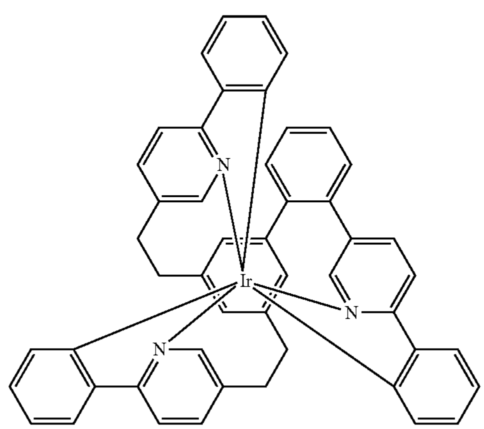 | 67% |

-continued
| Ex. | Ligand | Product Variant A/extractant* | Yield |
|---|---|---|---|
| Ir(L108) | L108 | 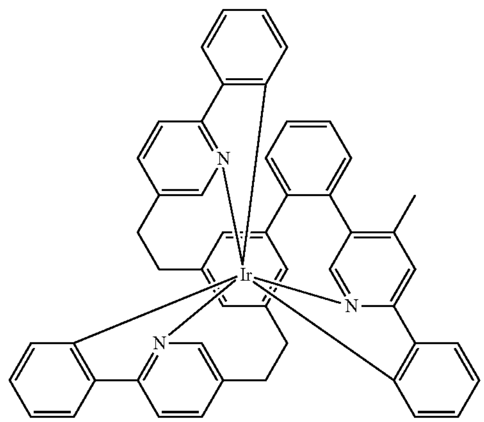 | 65% |
| Ir(L109) | L109 | 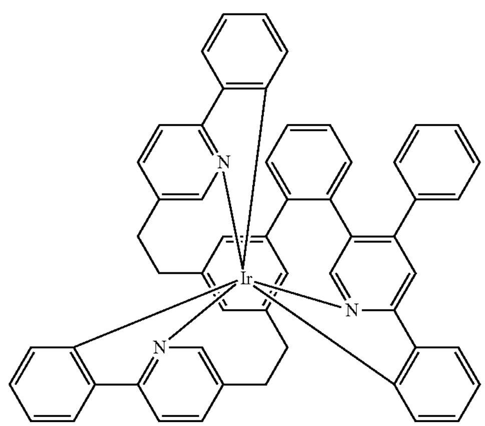 | 67% |
| Ir(L109-D8) | L109-D8 | 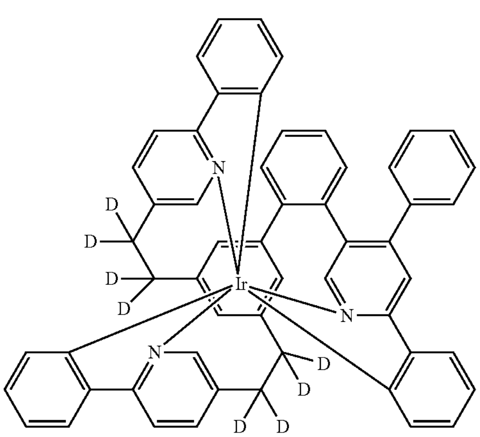 | 65% |

-continued
| Ex. | Ligand | Product Variant A/extractant* | Yield |
|---|---|---|---|
| Ir(L110) | L110 | 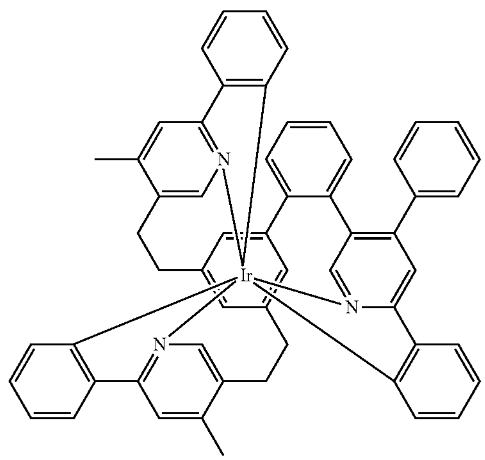 | 63% |
| Ir(L111) | L111 | 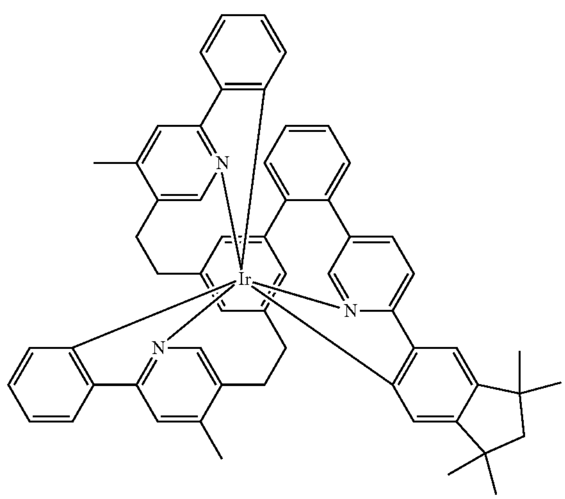 | 61% |
| Ir(L112) | L112 | 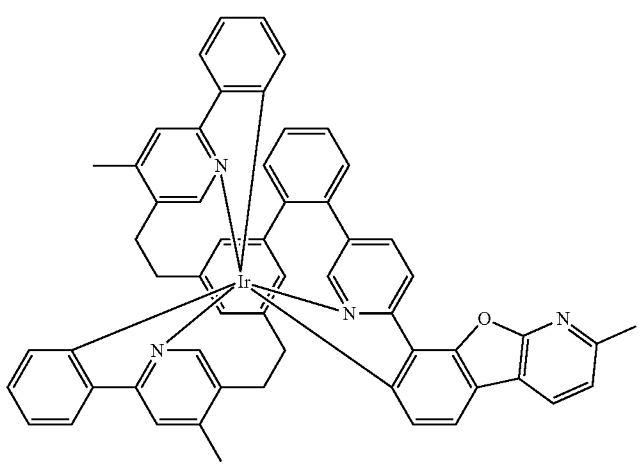 | 64% |

-continued
| Ex. | Ligand | Product Variant A/extractant* | Yield |
|---|---|---|---|
| Ir(L113-D8) | L113-D8 | 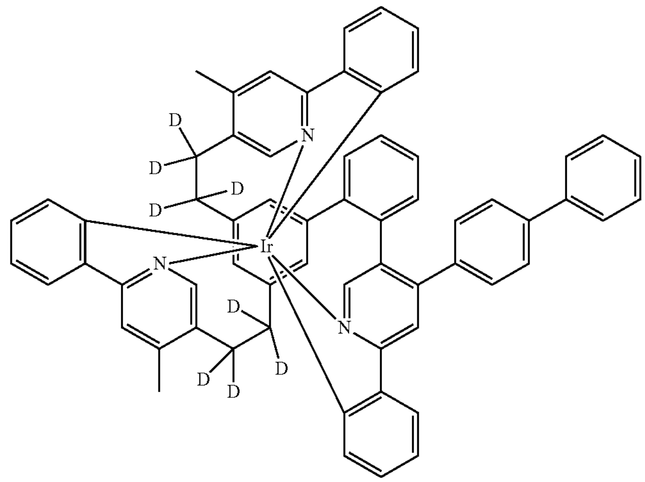 | 66% |
| Ir(L114) | L114 | 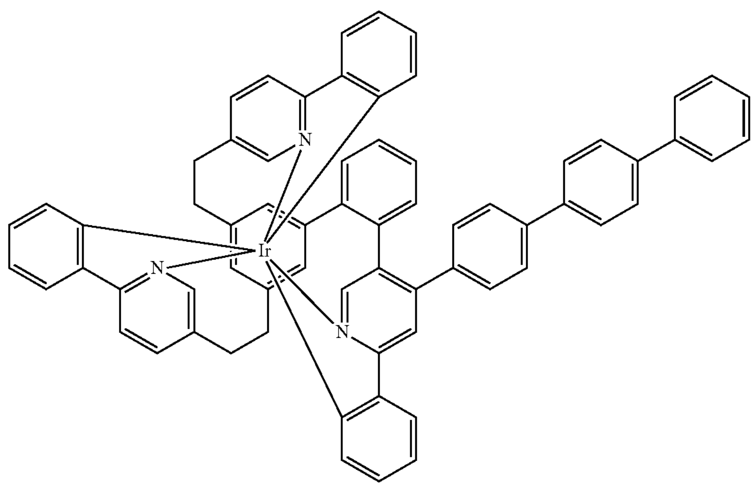 | 63% |
| Ir(L115) | L115 | 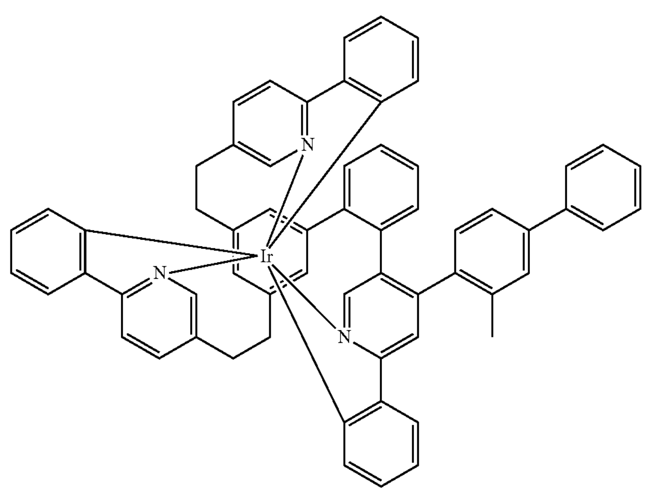 | 60% |

-continued
| Ex. | Ligand | Product Variant A/extractant* | Yield |
|---|---|---|---|
| Ir(L116) | L116 | 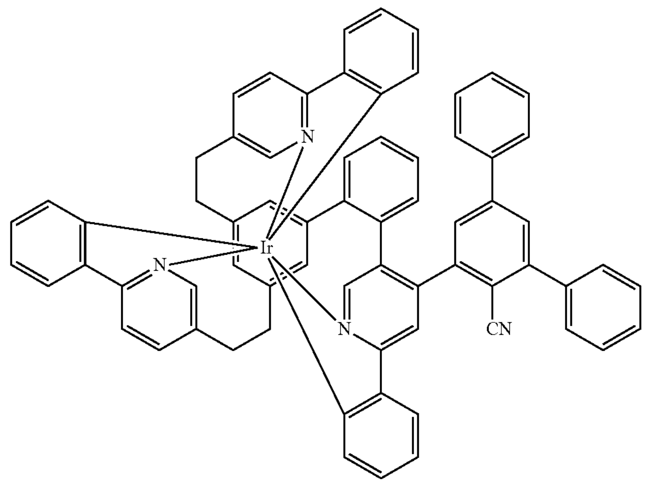 | 51% |
| Ir(L117) | L117 | 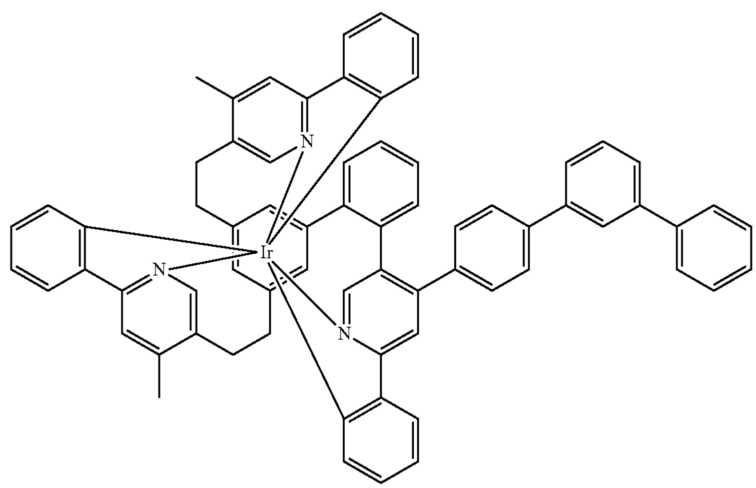 | 59% |
| Ir(L118) | L118 | 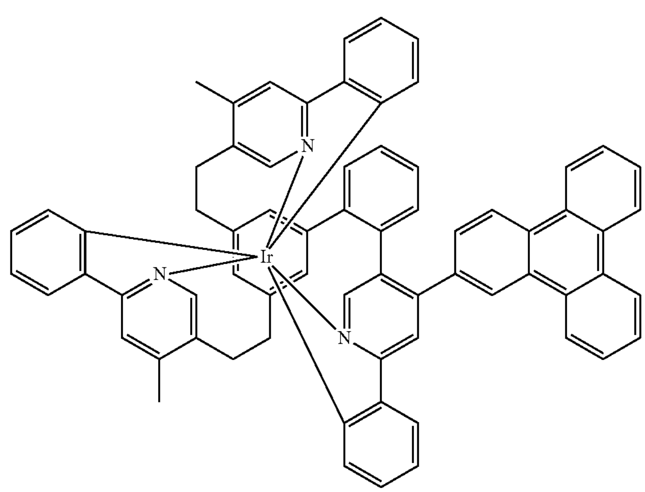 | 67% |

-continued
| Ex. | Ligand | Product Variant A/extractant* | Yield |
|---|---|---|---|
| Ir(L119) | L119 | 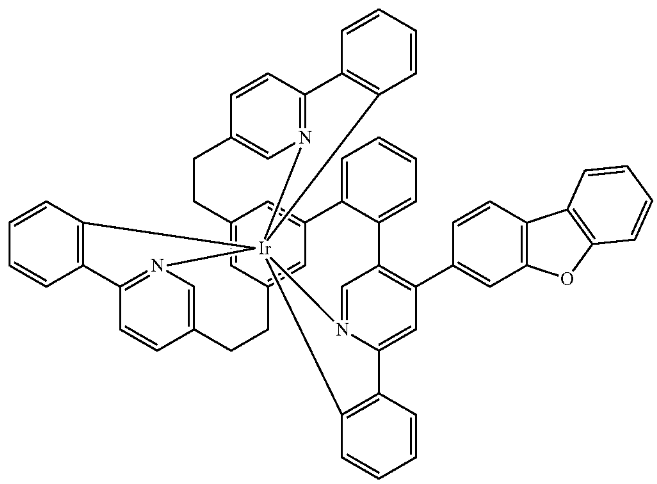 | 65% |
| Ir(L120) | L120 | 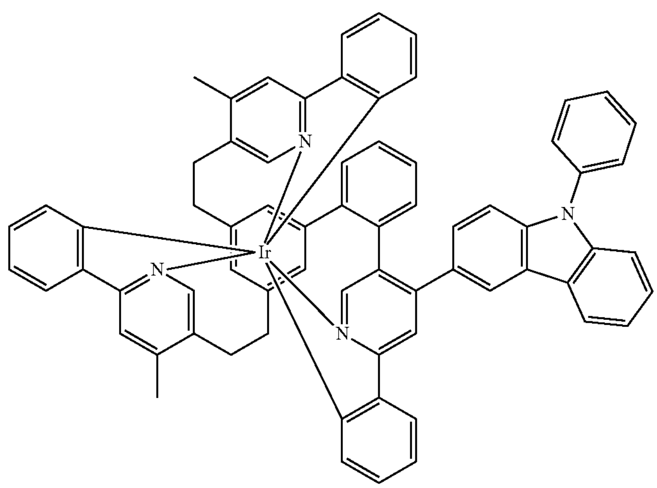 | 63% |
| Ir(L121) | L121 | 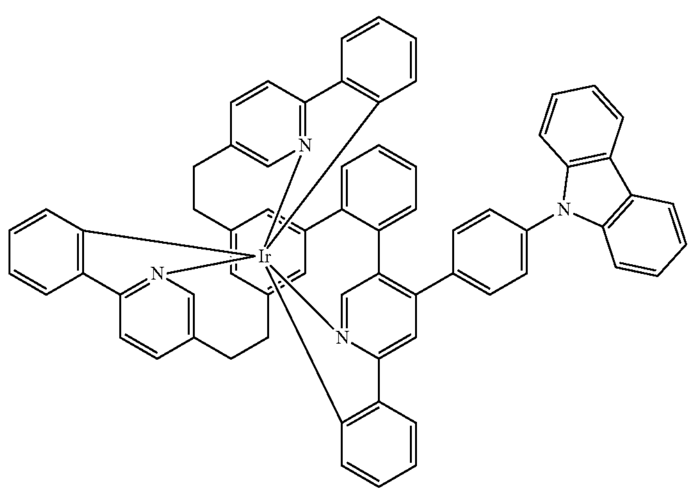 | 69% |

-continued
| Ex. | Ligand | Product Variant A/extractant* | Yield |
|---|---|---|---|
| Ir(L122) | L122 | 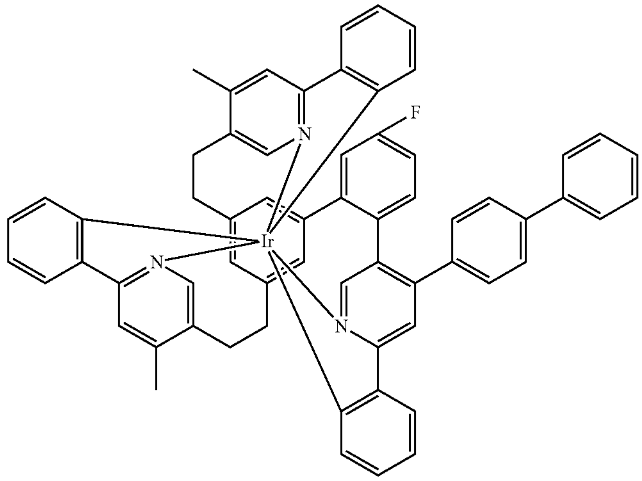 | 65% |
| Ir(L123) | L123 | 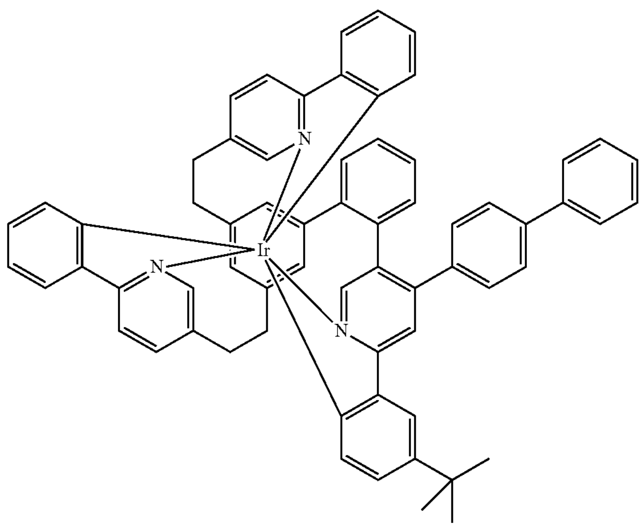 | 67% |
| Ir(L124) | L124 | 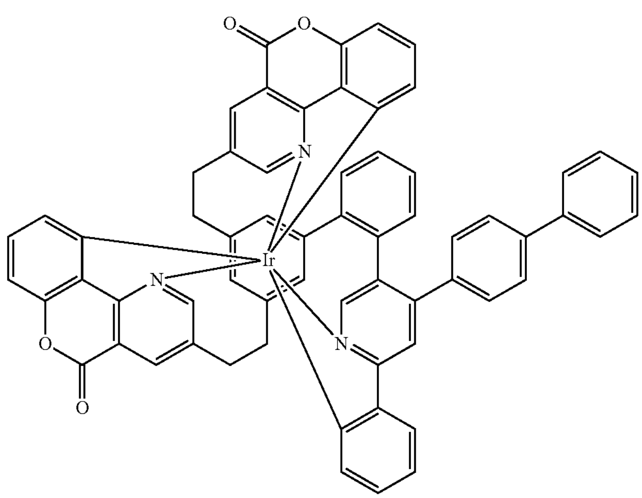 | 55% |

-continued
| Ex. | Ligand | Product Variant A/extractant* | Yield |
|---|---|---|---|
| Ir(L124-D8) | L124-D8 | 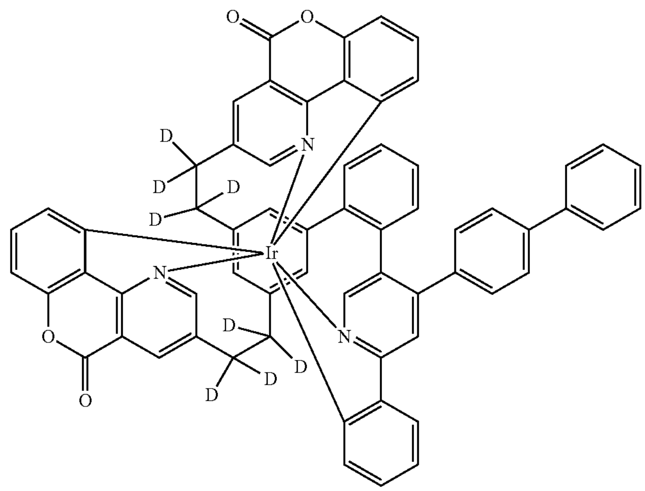 | 52% |
| Ir(L125) | L125 | 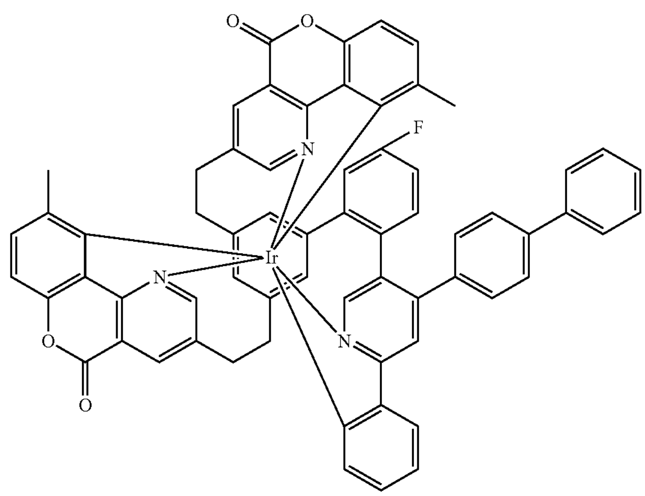 | 43% |
| Ir(L126) | L126 | 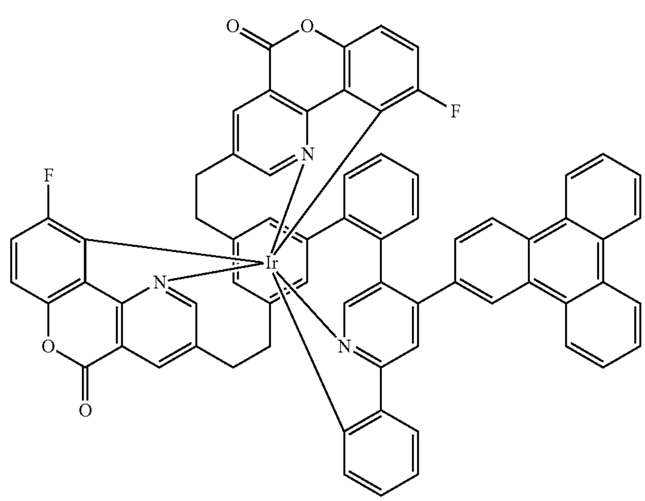 | 47% |

-continued
| Ex. | Ligand | Product Variant A/extractant* | Yield |
|---|---|---|---|
| Ir(L127) | L127 | 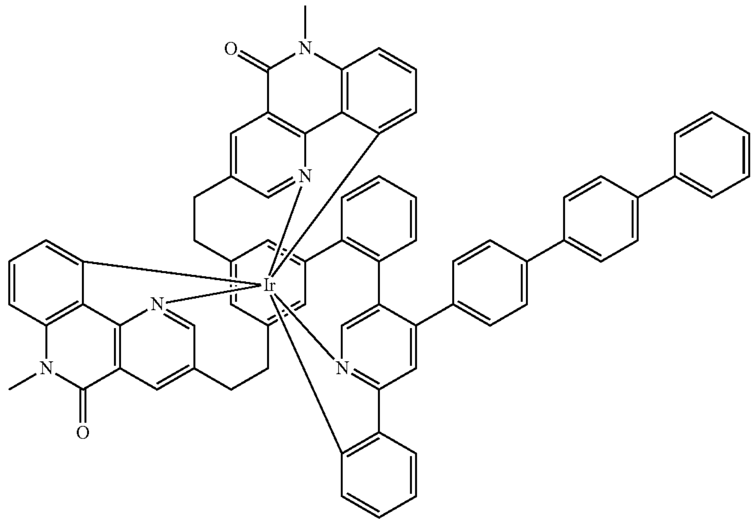 | 50% |
| Ir(L128) | L128 | 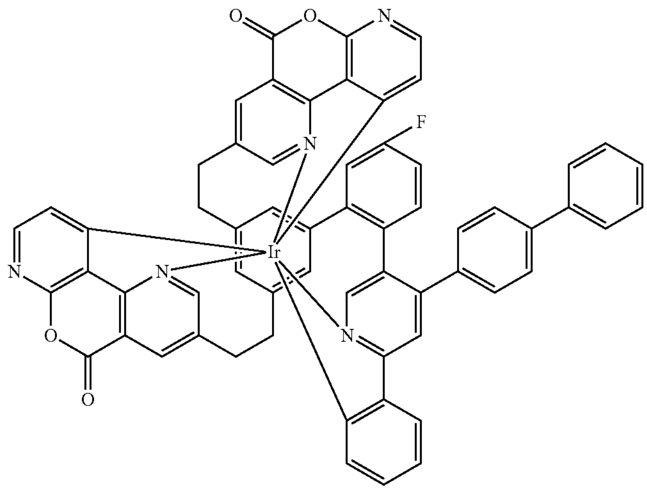 | 48% |
| Ir(L128-D8) | L128-D8 | 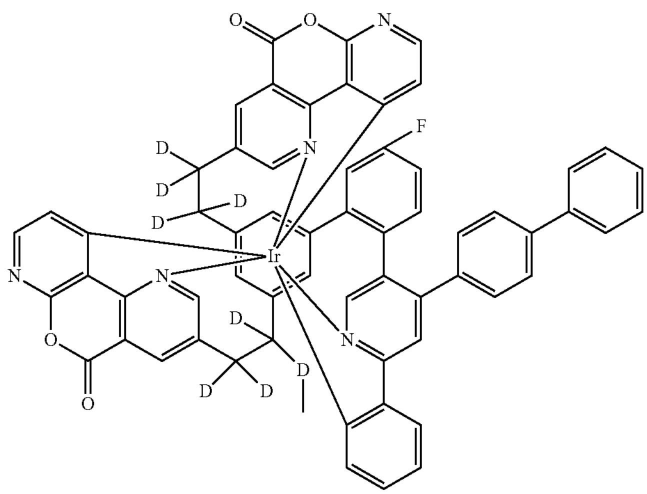 | 52% |

-continued
| Ex. | Ligand | Product Variant A/extractant* | Yield |
|---|---|---|---|
| Ir(L129) | L129 | 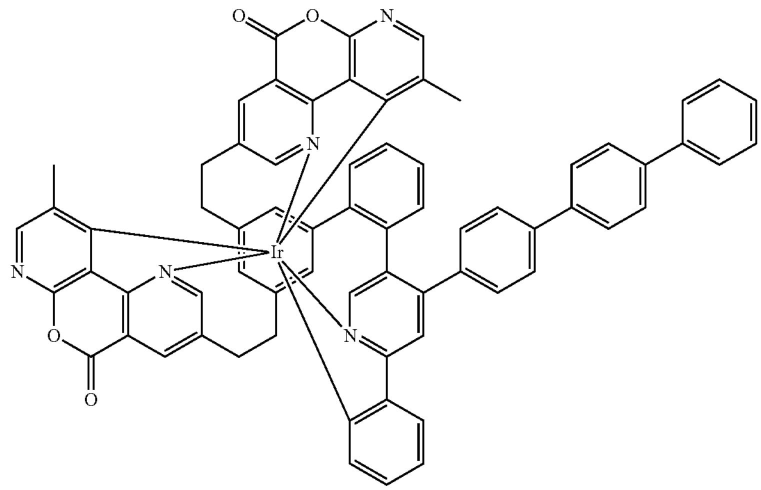 | 37% |
| Ir(L130) | L130 | 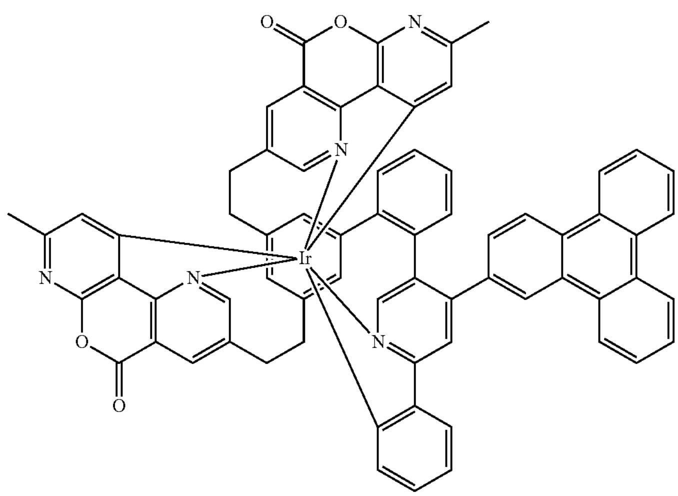 | 39% |
| Ir(L131) | L131 | 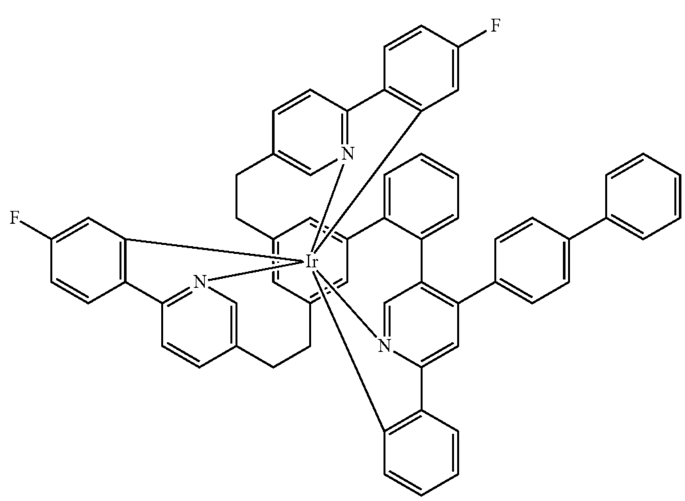 | 70% |

-continued
| Ex. | Ligand | Product Variant A/extractant* | Yield |
|---|---|---|---|
| Ir(L132) | L132 | 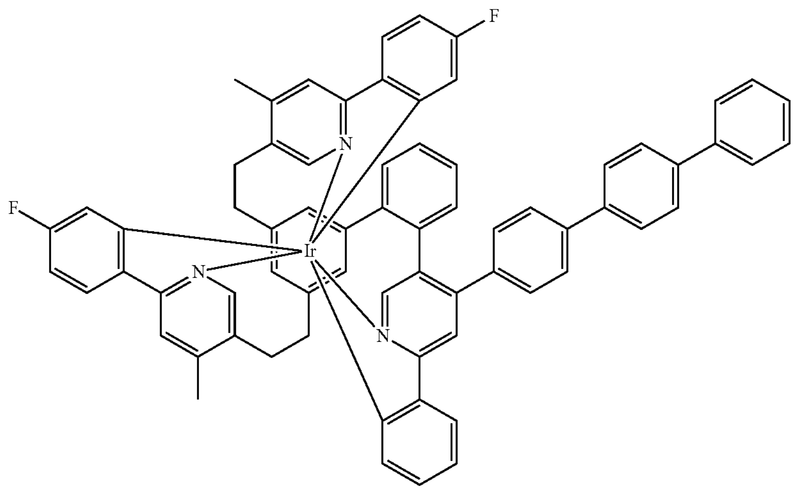 | 68% |
| Ir(L133) | L133 | 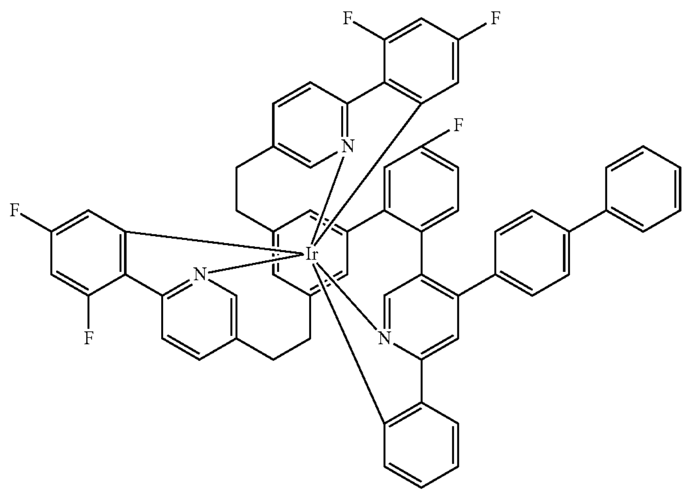 | 67% |
| Ir(L133-D8) | L133-D8 | 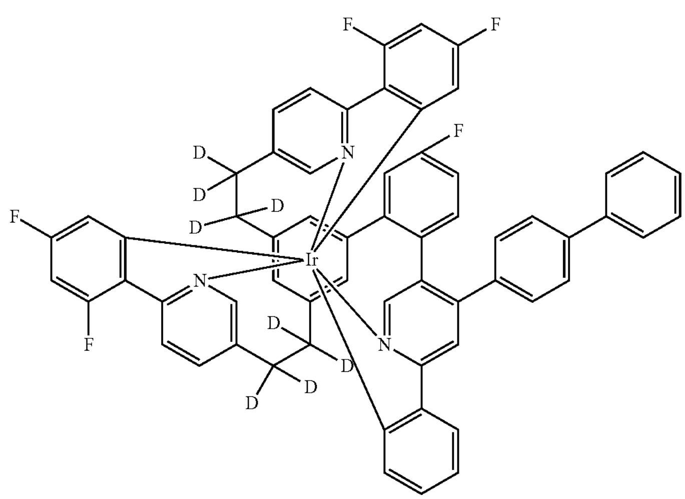 | 69% |

-continued
| Ex. | Ligand | Product Variant A/extractant* | Yield |
|---|---|---|---|
| Ir(L134) | L134 | 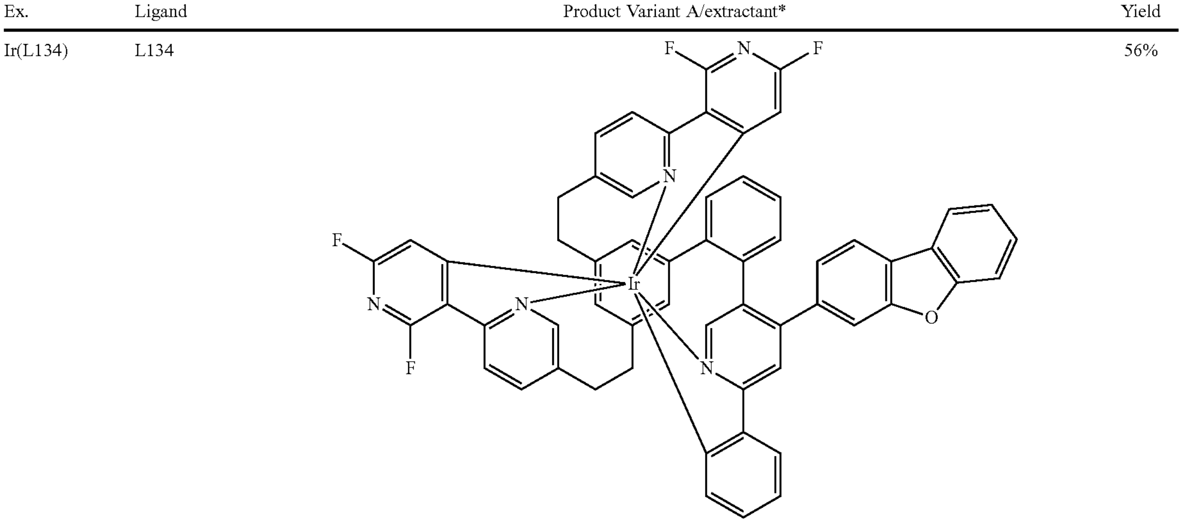 | 56% |
| Ir(L135) | L135 | 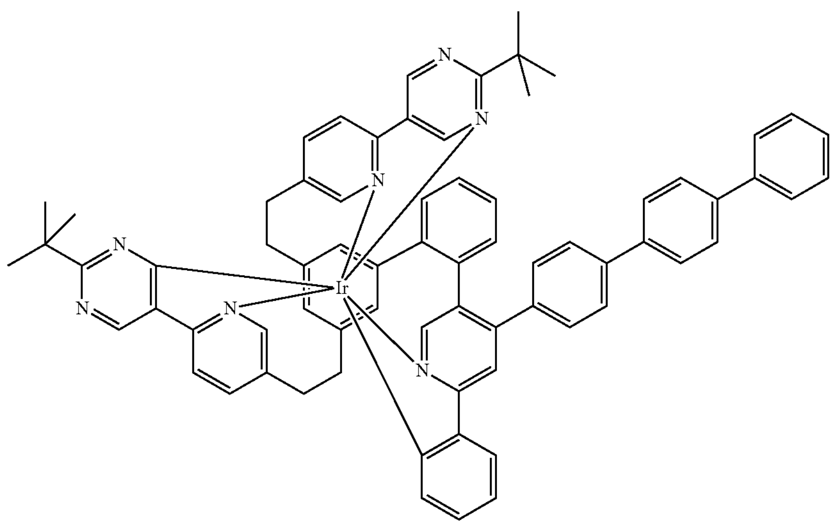 | 61% |
| Ir(L136) | L136 | 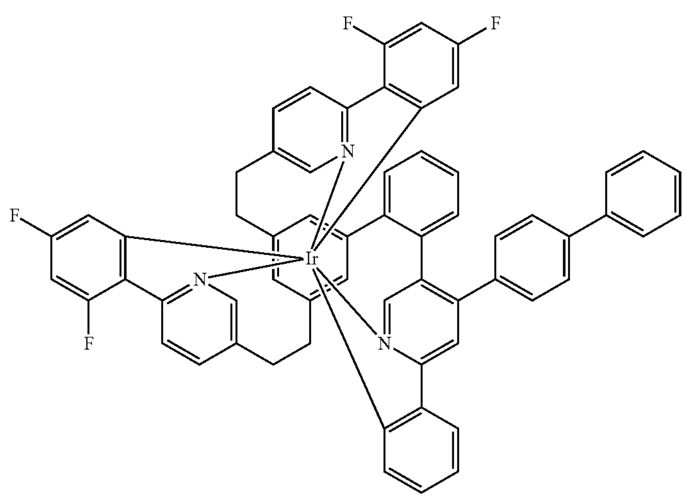 | 63% |

-continued
| Ex. | Ligand | Product Variant A/extractant* | Yield |
| --- | --- | --- | --- |
| Ir(L136-D8) | L136-D8 | 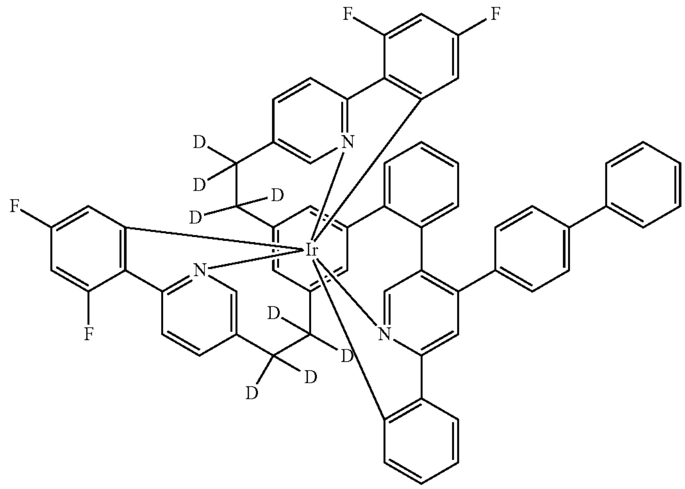 | 66% |
| Ir(L137-D8) | L137-D8 | 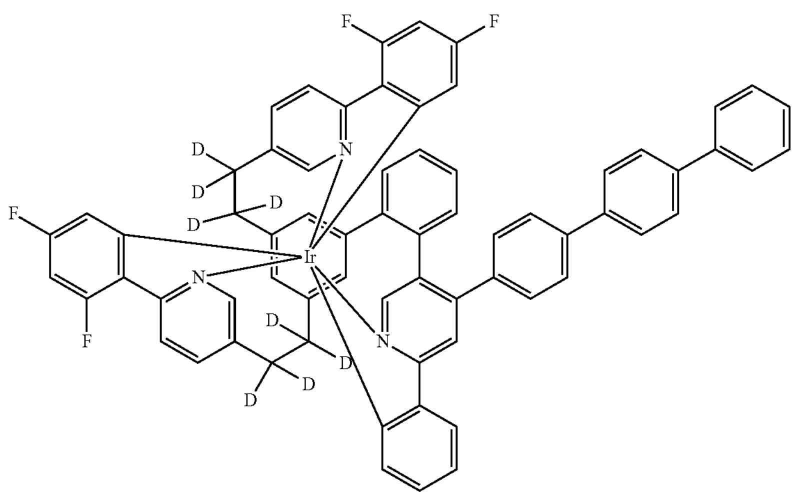 | 72% |
| Ir(L138-D8) | L138-D8 | 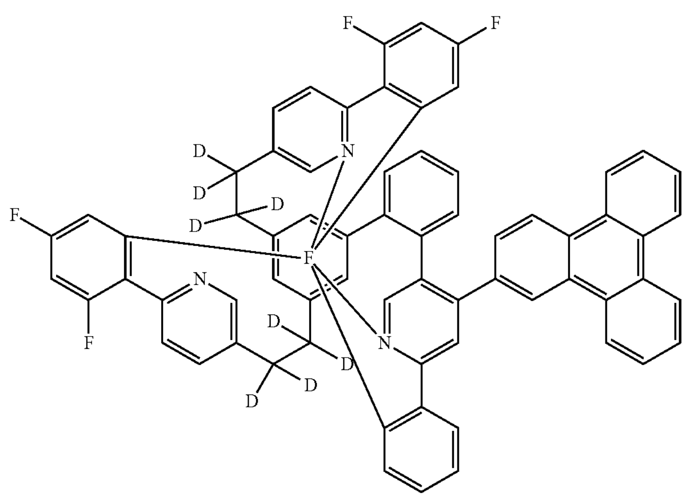 | 69% |

-continued
| Ex. | Ligand | Product Variant A/extractant* | Yield |
|---|---|---|---|
| Ir(L139-D8) | L139-D8 | 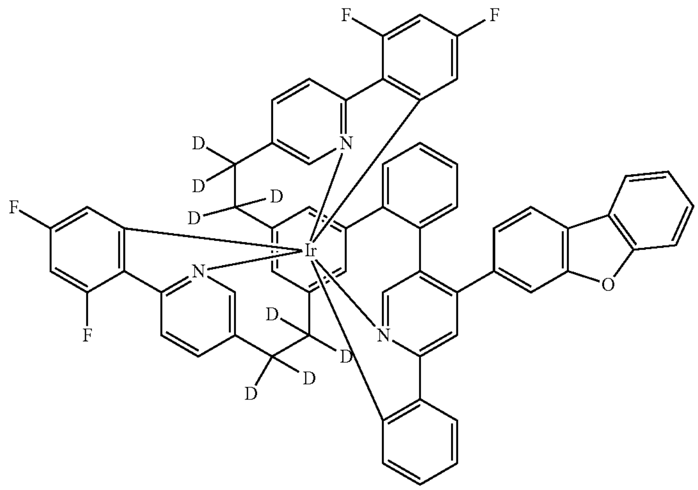 | 65% |
| Ir(L140) | L140 | 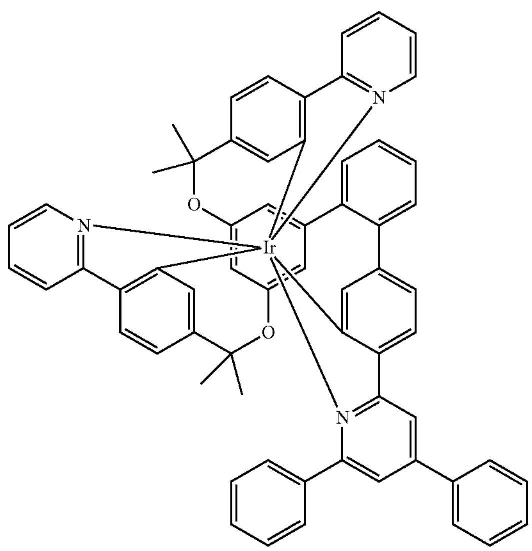 | 43% |
| Ir(L141) | L141 | 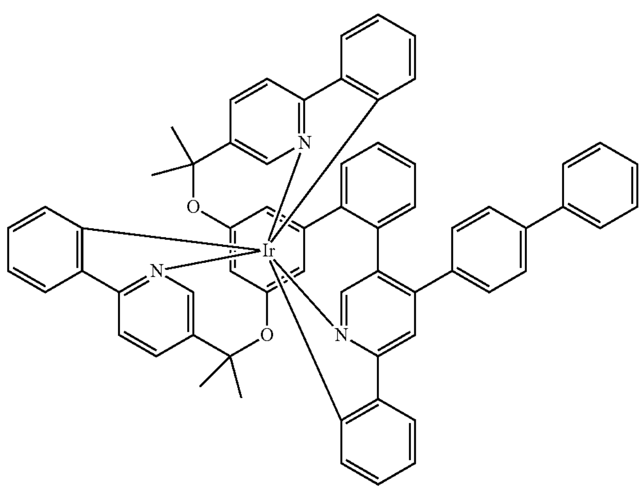 | 67% |

-continued
| Ex. | Ligand | Product Variant A/extractant* | Yield |
|---|---|---|---|
| Ir(L142) | L142 | 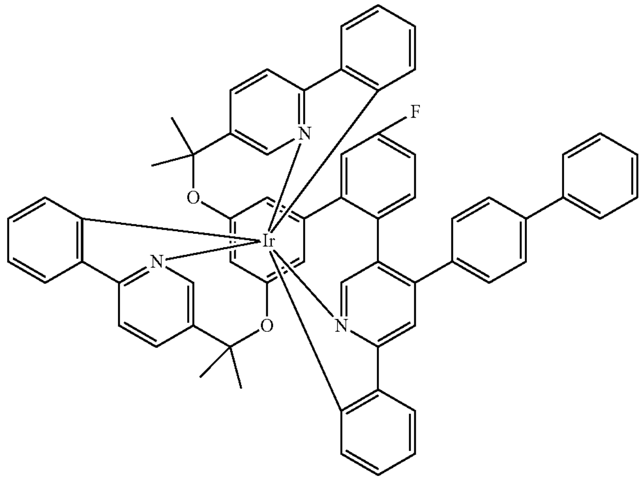 | 64% |
| Ir(L143) | L143 | 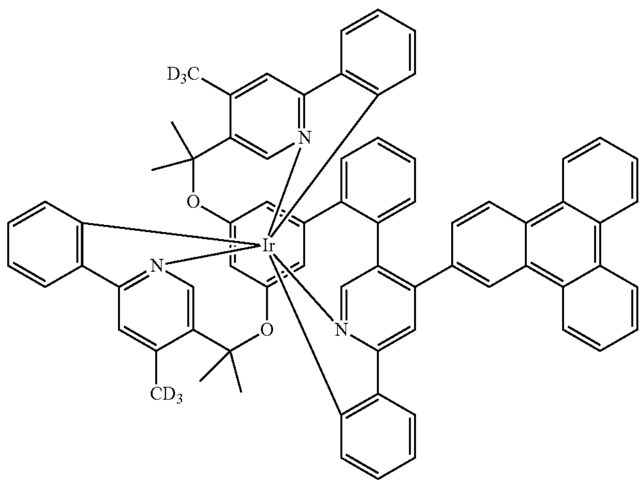 | 54% |
| Ir(L144) | L144 | 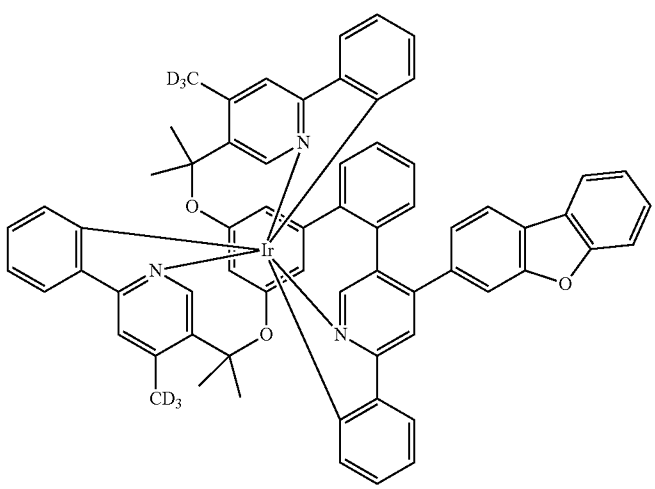 | 57% |

-continued
| Ex. | Ligand | Product Variant A/extractant* | Yield |
|---|---|---|---|
| Ir(L145) | L145 | 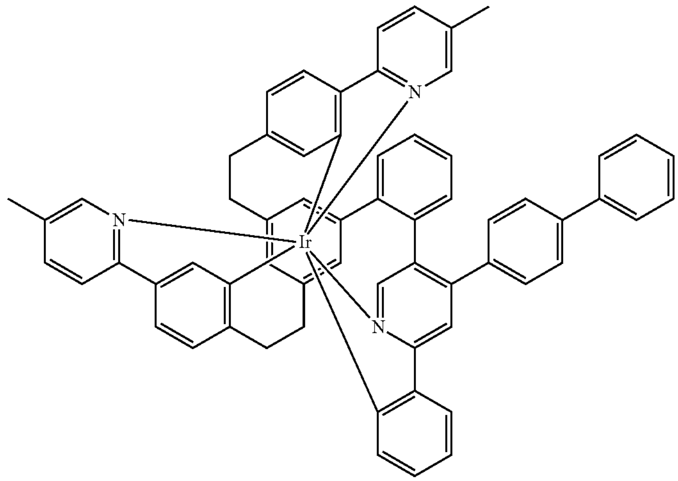 | 62% |
| Ir(L146) | L146 | 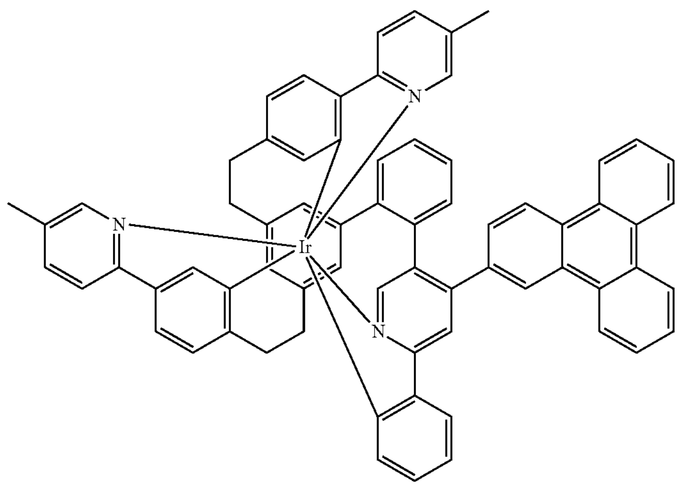 | 65% |
| Ir(L147) | L147 | 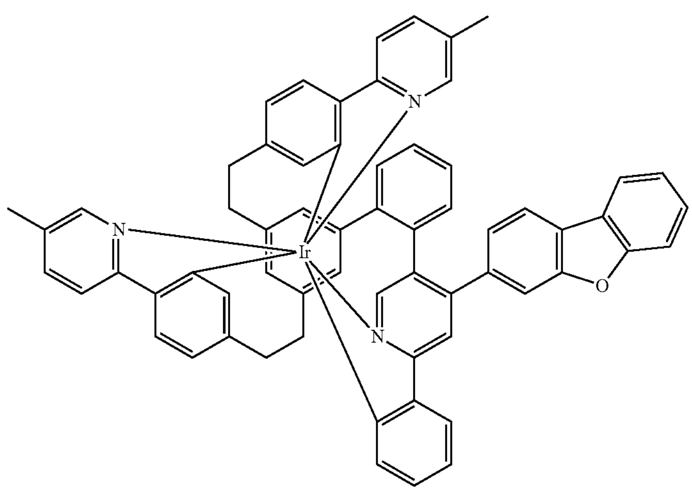 | 60% |

-continued
| Ex. | Ligand | Product Variant A/extractant* | Yield |
|---|---|---|---|
| Ir(L148) | L148 | 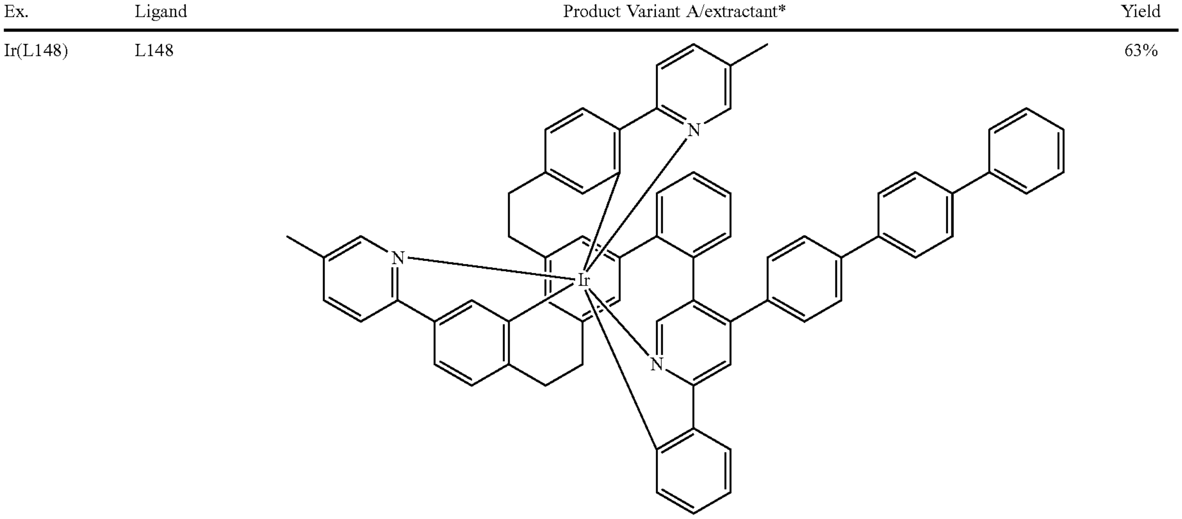 | 63% |
| Ir(L149) | L149 | 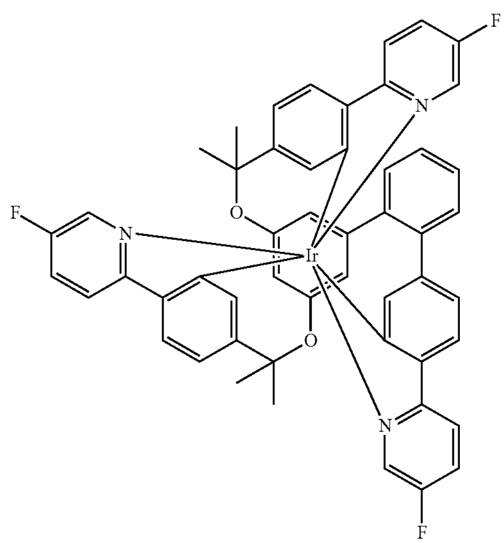 | 56% |
| Ir(L150) | L150 | 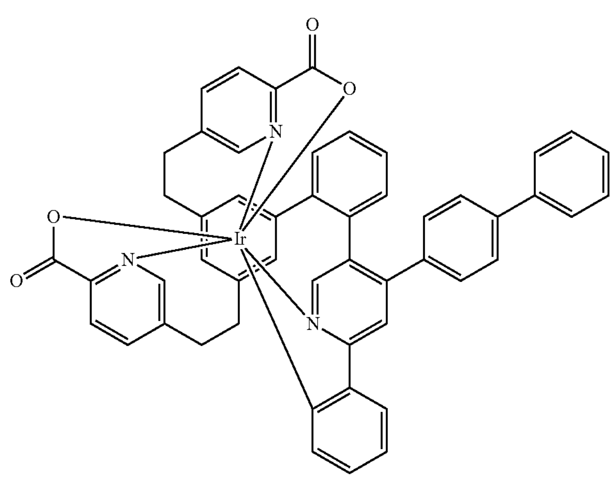 | 45% |

-continued
| Ex. | Ligand | Product Variant A/extractant* | Yield |
| --- | --- | --- | --- |
| Ir(L151) | L151 | 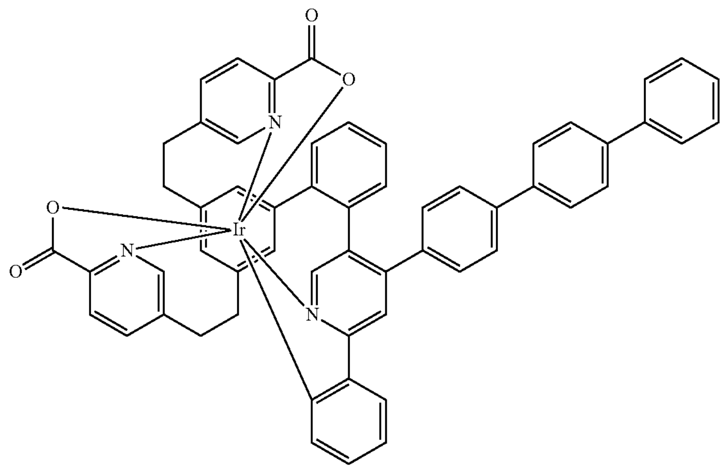 | 47% |
| Ir(L152) | L152 | 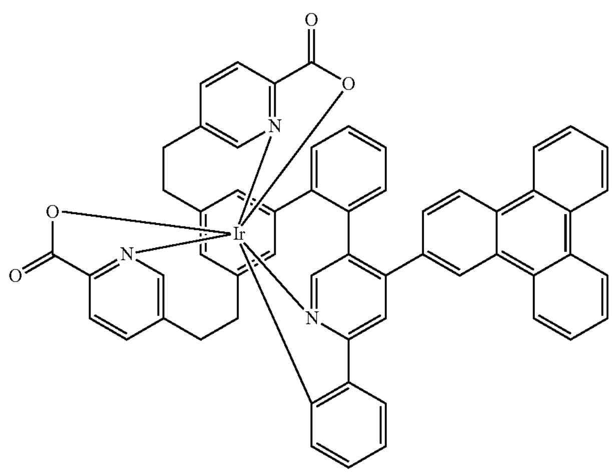 | 51% |
| Ir(L153) | L153 | 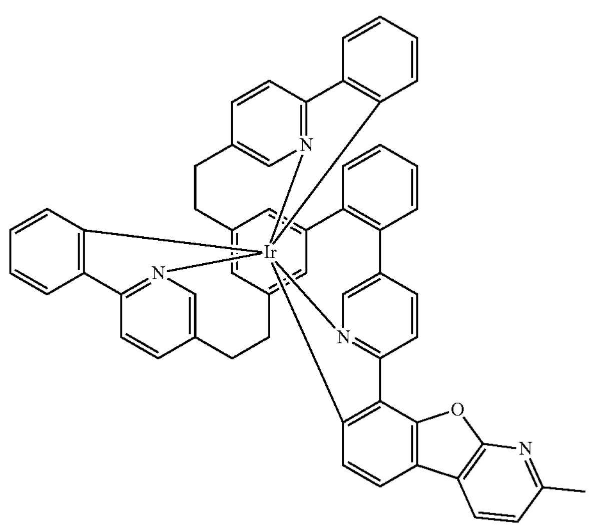 | 60% |

-continued
| Ex. | Ligand | Product Variant A/extractant* | Yield |
|---|---|---|---|
| Ir(L153-D8) | L153-D8 | 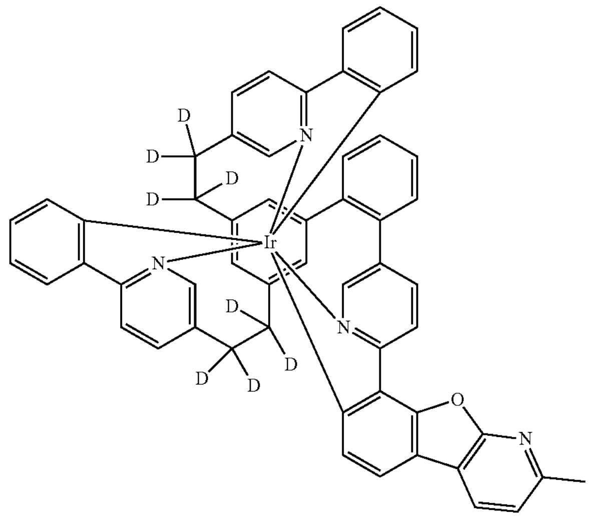 | 58% |
| Ir(L154) | L154 | 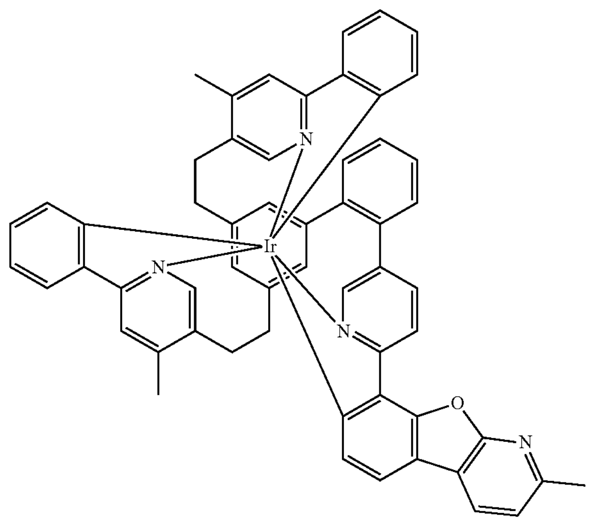 | 61% |
| Ir(L154-D8) | L154-D8 | 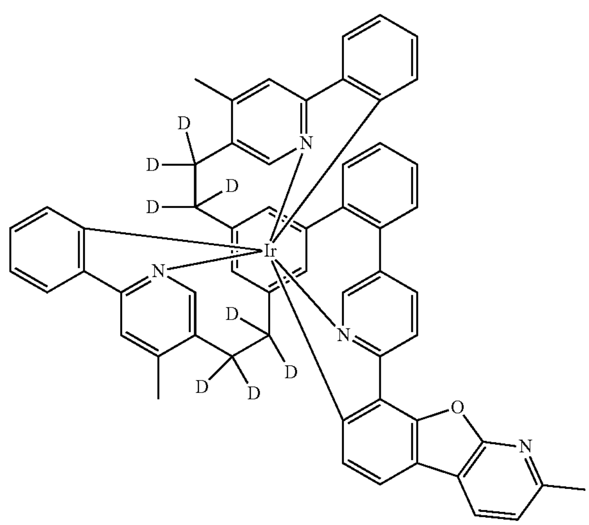 | 63% |

-continued
| Ex. | Ligand | Product Variant A/extractant* | Yield |
|---|---|---|---|
| Ir(L155-D8) | L155-D8 | 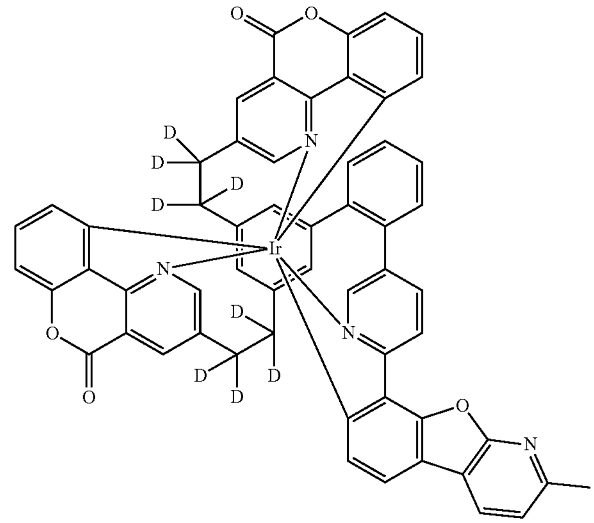 | 57% |
| Ir(L156) | L156 | 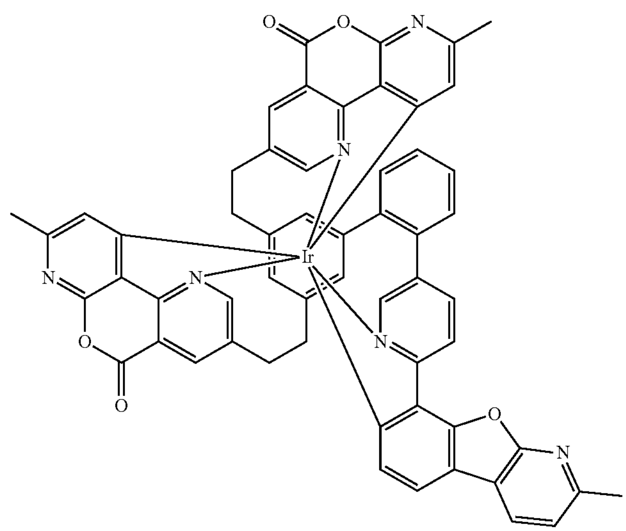 | 60% |
| Ir(L157-D8) | L157-D8 | 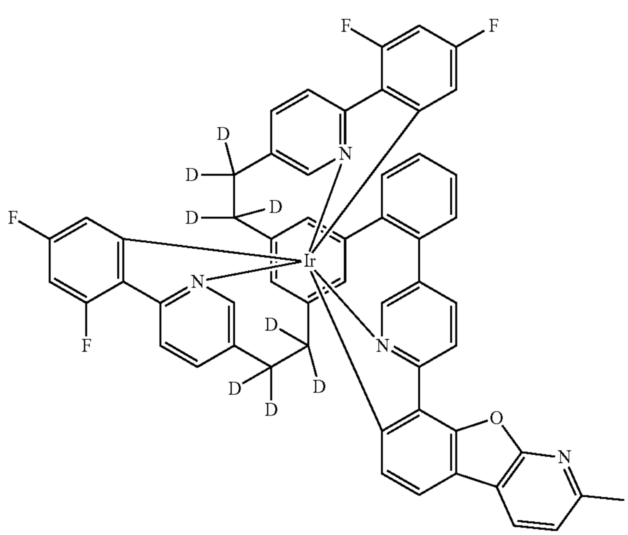 | 64% |

-continued
| Ex. | Ligand | Product Variant A/extractant* | Yield |
|---|---|---|---|
| Ir(L158) | L158 | 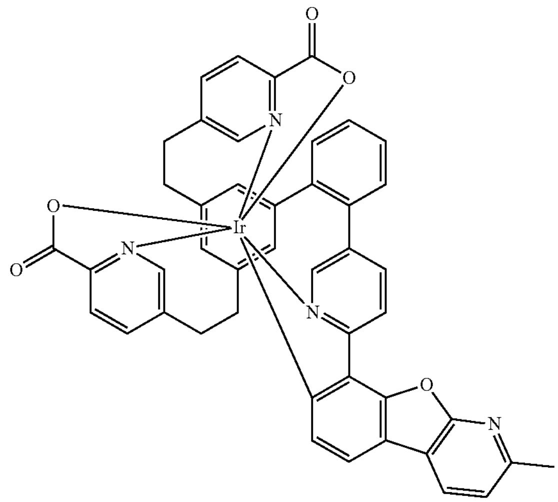 | 48% |
| Ir(L200) | L200 | 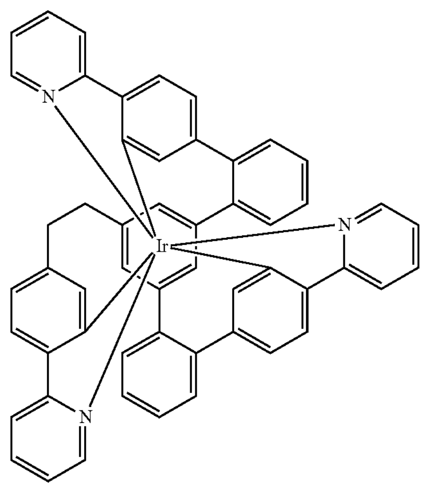 | 66% |
| Ir(L201) | L201 | 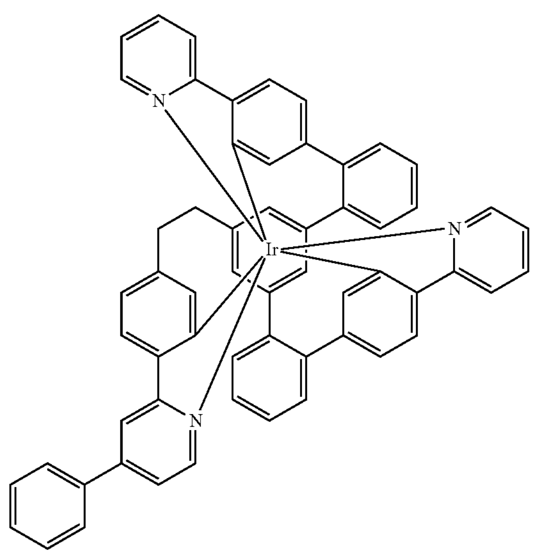 | 63% |

-continued
| Ex. | Ligand | Product Variant A/extractant* | Yield |
|---|---|---|---|
| Ir(L202) | L202 | 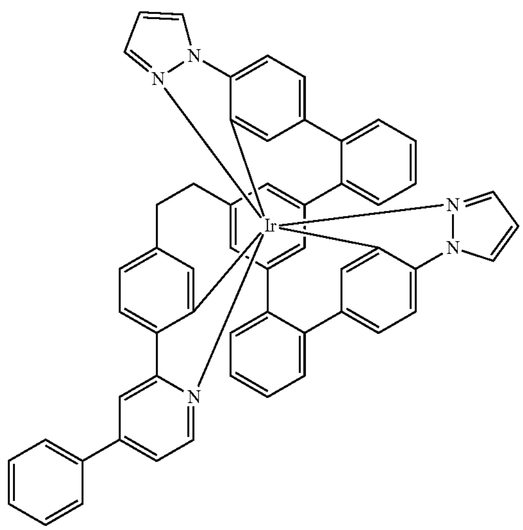 | 58% |
| Ir(L203) | L203 | 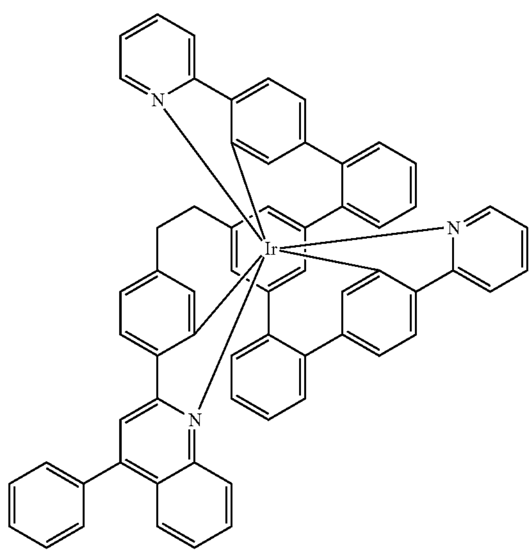 | 63% |

-continued
| Ex. | Ligand | Product Variant A/extractant* | Yield |
|---|---|---|---|
| Ir(L204) | L204 | 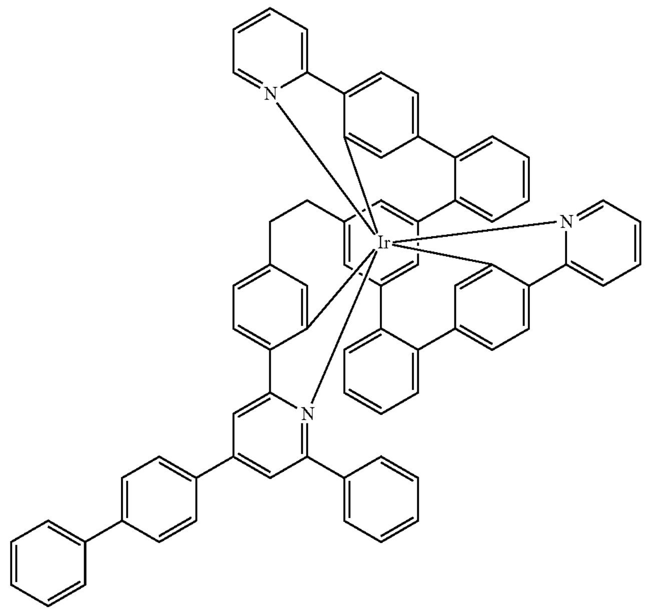 | 54% |
| Ir(L205) | L205 | 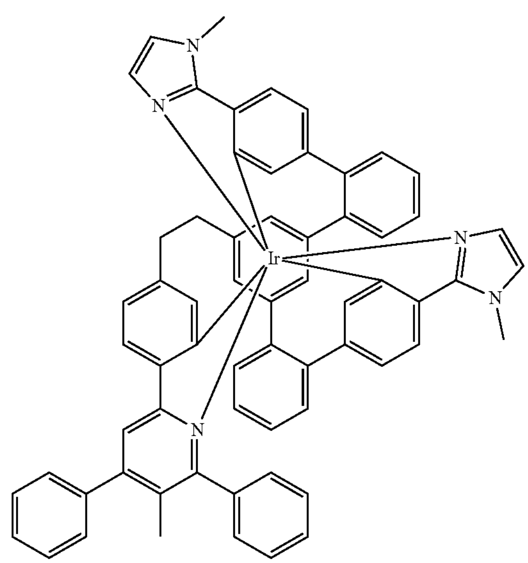 | 56% |

-continued
| Ex. | Ligand | Product Variant A/extractant* | Yield |
|---|---|---|---|
| Ir(L206) | L206 | 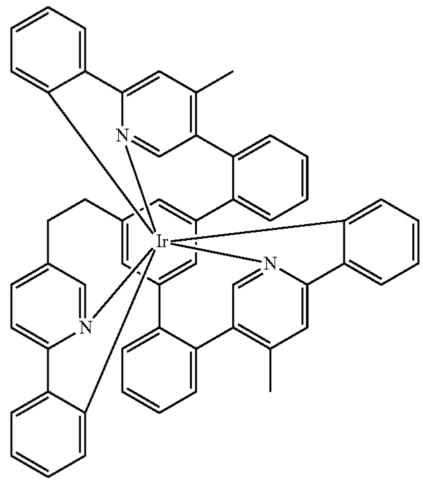 | 68% |
| Ir(L207) | L207 | 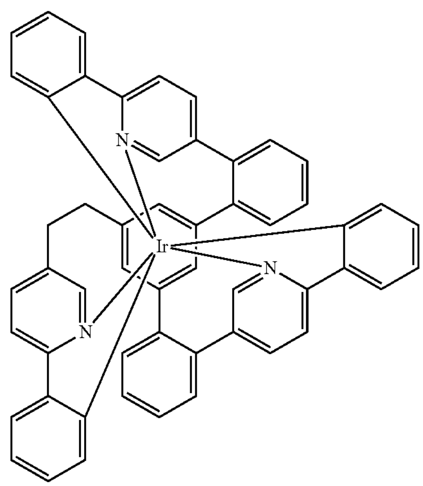 | 65% |
| Ir(L208) | L208 | 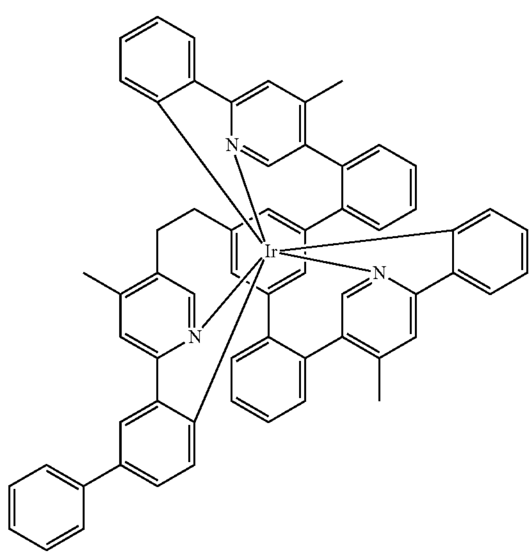 | 67% |

-continued

| Ex. | Ligand | Product Variant A/extractant* | Yield |
|---|---|---|---|
| Ir(L209) | L209 | 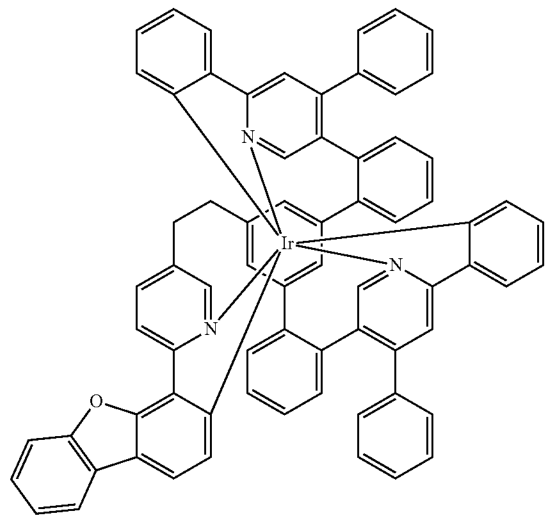 | 61% |
| Ir(L210) | L210 | 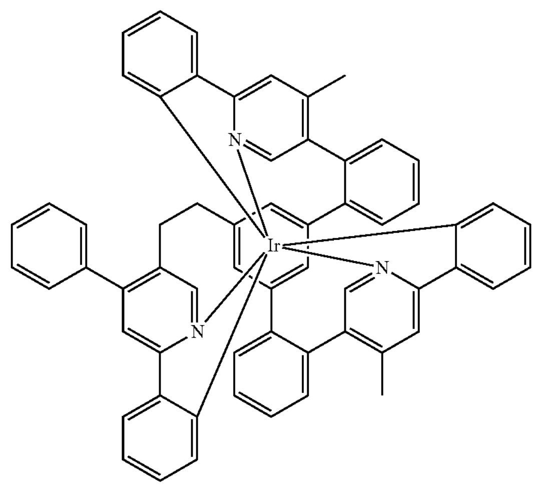 | 65% |

*if different

D: Functionalization of the Metal Complexes

1) Deuteration of Metal Complexes

A) Deuteration of the Methyl Groups 1 mmol of the clean complex (purity >99.9%) having x methyl/methylene groups with x=1-6 is dissolved in 50 ml of DMSO-d6 (deuteration level >99.8%) by heating to about 180° C. The solution is stirred at 180° C. for 5 min. The mixture is left to cool to 80° C., and a mixture of 5 ml of methanol-dl (deuteration level >99.8%) and 10 ml of DMSO-d6 (deuteration level>99.8%) in which 0.3 mmol of sodium hydride has been dissolved is added rapidly with good stirring. The clear yellow/orange solution is stirred at 80° C. for a further 30 min for complexes having methyl/methylene groups para to the pyridine nitrogen or for a further 6 h for complexes having methyl/methylene groups meta to the pyridine nitrogen, then the mixture is cooled with the aid of a cold water bath, 20 ml of 1 N DCI in $D_2O$ are added dropwise starting from about 60° C., the mixture is left to cool to room temperature and stirred for a further 5 h, and the solids are filtered off with suction and washed three times with 10 ml each time of $H_2O$/MeOH (1:1, vv) and then three times with 10 ml each time of MeOH and dried under reduced pressure. The solids are dissolved in DCM, the solution is filtered through a silica gel, and the filtrate is concentrated under reduced pressure while simultaneously adding MeOH dropwise, hence inducing crystallization. Finally, fractional sublimation is effected as described in "C: Preparation of the metal complexes, Variant A". Yield: typically 80-90%, deuteration level >95%.

Complexes that are sparingly soluble in DMSO can also be deuterated by a hot extraction method. For this purpose, the complex is subjected to a continuous hot extraction with THF-H8, the initial charge comprising a mixture of THF-H8 (about 100-300 ml/mmol), 10-100 mol eq of methanol-D1 ($H_3COD$) and 0.3-3 mol eq of sodium methoxide ($NaOCH_3$) per acidic CH unit to be exchanged. Yield: typically 80-90%, deuteration level >95%. In order to attain higher degrees of deuteration, the deuteration of a complex with fresh deuterating agents each time can also be conducted more than once in succession.

In an analogous manner, it is possible to prepare the following deuterated complexes:

| Ex. | Reactant | Product | Yield |
|---|---|---|---|
| Ir(L10-D3) | Ir(L10) | 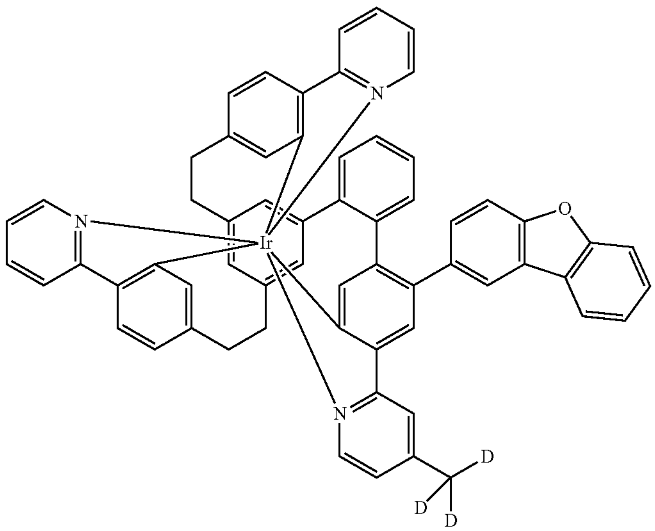 | 90% |
| Ir(L11-D9) | Ir(L11) | 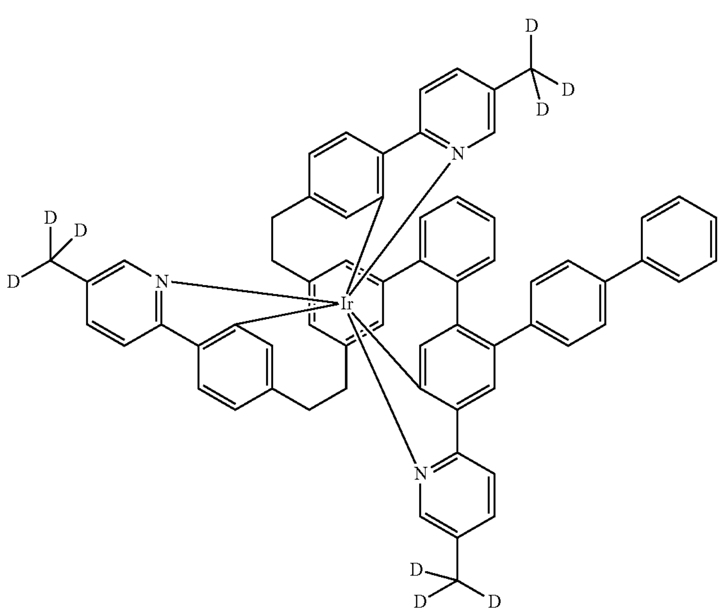 | 89% |

-continued
| Ex. | Reactant | Product | Yield |
|---|---|---|---|
| Ir(L23-D10) | Ir(L23) | 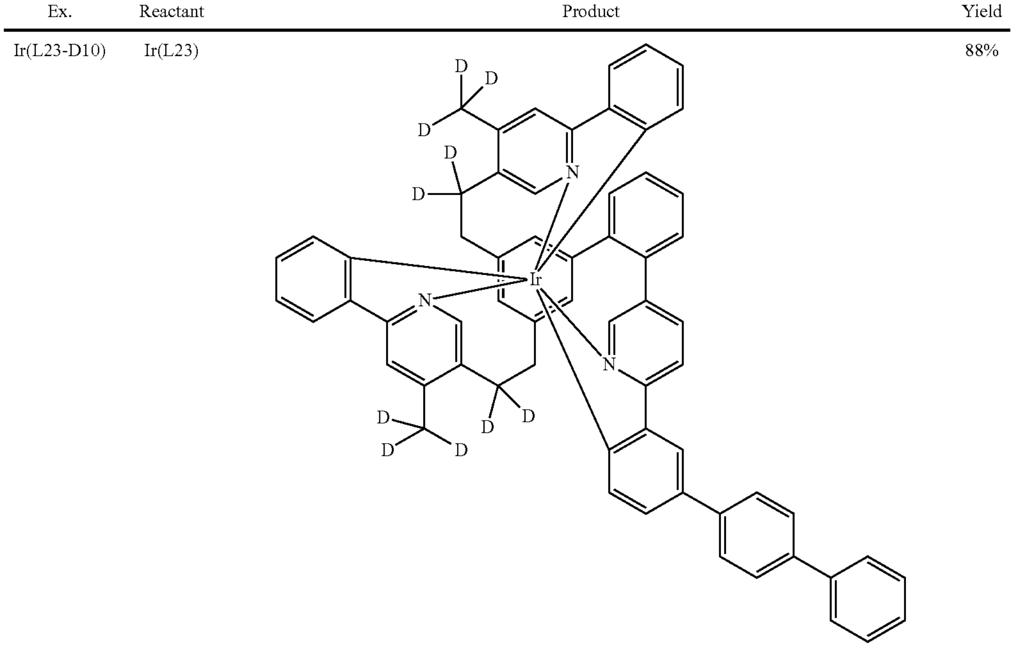 | 88% |
| Ir(L28-D10) | Ir(L28) | 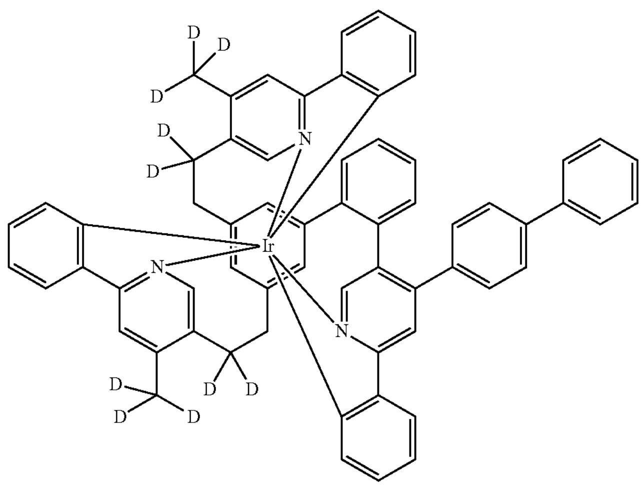 | 91% |
| Ir(L153-D11) | Ir(L153-D8) | 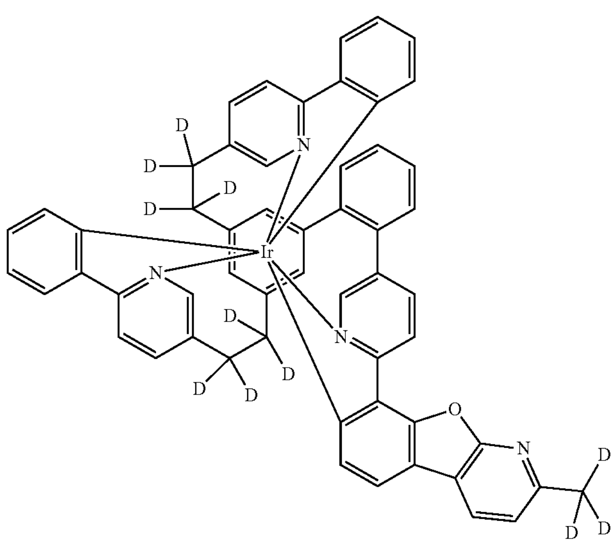 | 93% |

-continued

| Ex. | Reactant | Product | Yield |
|---|---|---|---|
| Ir(L154-D17) | Ir(L154-D8) | 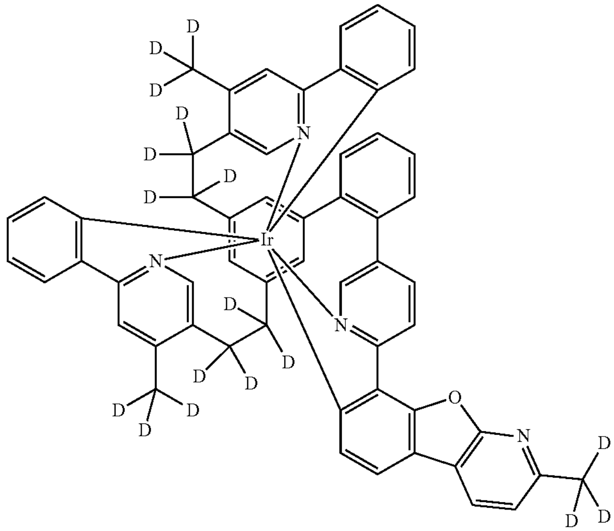 | 89% |

B) Deuteration of the Alkyl Groups and Ring Deuteration on the Pyridine

Procedure as described in A), except using 3 mmol of NaH and conducting the reaction not at 80° C. but at 120° C. for 16 h. Yield typically 80-90%.

In the manner described above, it is possible to prepare the following deuteratedcomplexes:

2) Bromination of the Metal Complexes

To a solution or suspension of 10 mmol of a complex bearing A×C-H groups (with A=1, 2, 3) in the para position to the iridium in 500 ml to 2000 ml of dichloromethane according to the solubility of the metal complexes is added, in the dark and with exclusion of air, at −30 to +30° C., A×10.5 mmol of N-halosuccinimide (halogen: Cl, Br, I), and the mixture is stirred for 20 h. Complexes of sparing

| Ex. | Reactant | Product | Yield |
|---|---|---|---|
| Ir(L1-D17) | Ir(L1) | 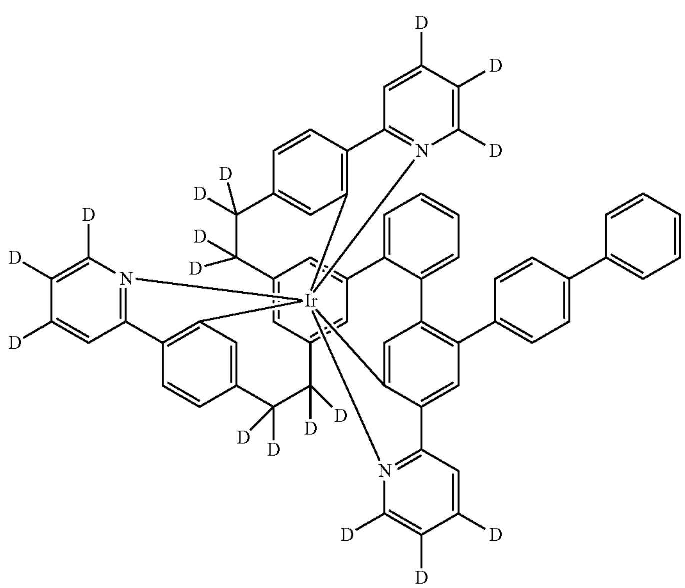 | 90% |

solubility in DCM may also be converted in other solvents (TCE, THF, DMF, chlorobenzene, etc.) and at elevated temperature. Subsequently, the solvent is substantially removed under reduced pressure. The residue is extracted by boiling with 100 ml of methanol, and the solids are filtered off with suction, washed three times with 30 ml of methanol and then dried under reduced pressure. This gives the iridium complexes brominated in the para position to the iridium. Complexes having a HOMO (CV) of about −5.1 to −5.0 eV and of smaller magnitude have a tendency to oxidation (Ir(III)→Ir(IV)), the oxidizing agent being bromine released from NBS. This oxidation reaction is apparent by a distinct green hue in the otherwise yellow to red solutions/suspensions of the emitters. In such cases, a further equivalent of NBS is added. For workup, 300-500 ml of methanol and 2 ml of hydrazine hydrate as reducing agent are added, which causes the green solutions/suspensions to turn yellow (reduction of Ir(IV)>Ir(III)). Then the solvent is substantially drawn off under reduced pressure, 300 ml of methanol are added, and the solids are filtered off with suction, washed three times with 100 ml each time of methanol and dried under reduced pressure.

Substoichiometric brominations, for example mono- and dibrominations, of complexes having 3 C—H groups in the para position to iridium usually proceed less selectively than the stoichiometric brominations. The crude products of these brominations can be separated by chromatography (CombiFlash Torrent from A. Semrau).

Synthesis of Ir(L1-2Br)

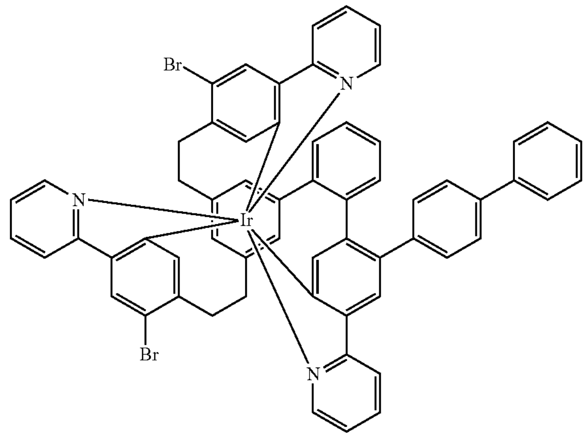

To a suspension, stirred at 0° C., of 10.1 g (10 mmol) of Ir(L1) in 500 ml of DCM are added 3.7 g (21.0 mmol) of N-bromosuccinimide all at once and then the mixture is stirred for a further 20 h. After removing about 450 ml of the DCM under reduced pressure, 100 ml of methanol are added to the yellow suspension, and the solids are filtered off with suction, washed three times with about 50 ml of methanol and then dried under reduced pressure. Yield: 11.3 g (9.6 mmol), 96%; purity: >99.0% by NMR.

In an analogous manner, it is possible to prepare the following compounds:

| Ex. | Reactant<br>Bromination product | Yield |
|---|---|---|
| Ir(L6-2Br) | Ir(L6) | 94% |

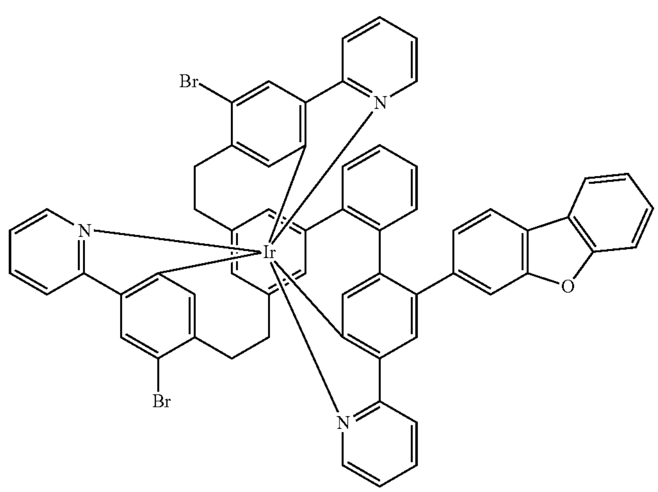

-continued
| Ex. | Reactant Bromination product | Yield |
|---|---|---|
| Ir(L8-2Br) | Ir(L8) | 93% |
| 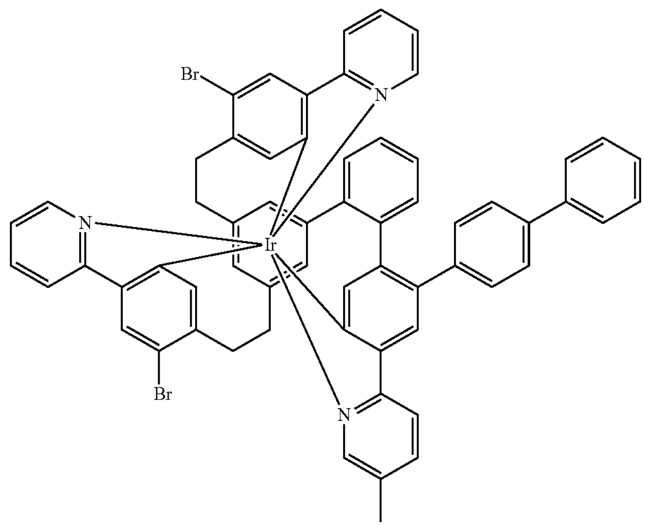 | | |
| Ir(L14-3Br) | Ir(L14) | 94% |
| 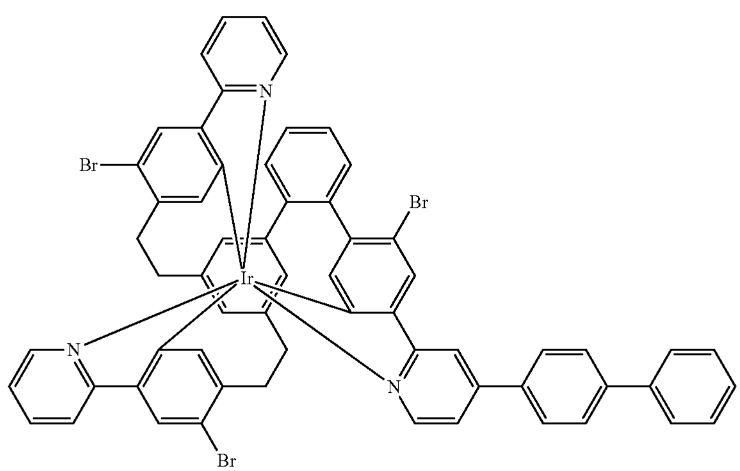 | | |

-continued
| Ex. | Reactant<br>Bromination product | Yield |
|---|---|---|
| Ir(L19-2Br) | Ir(L19) | 90% |
| 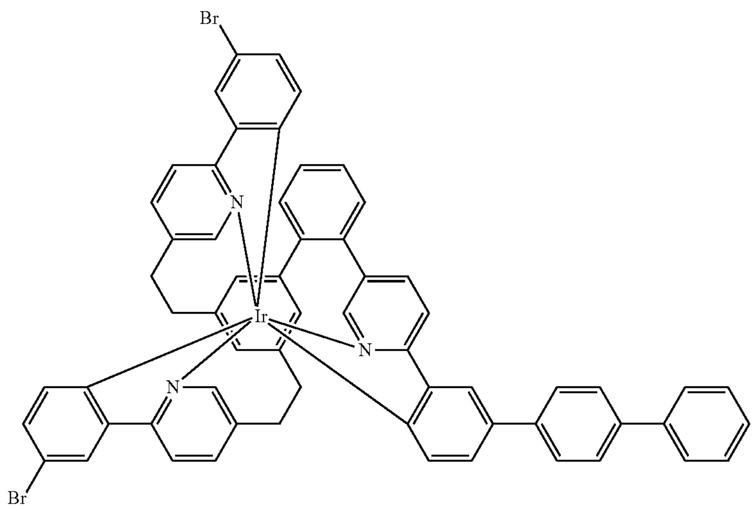 | | |
| Ir(L28-3Br) | Ir(L28) | 90% |
| 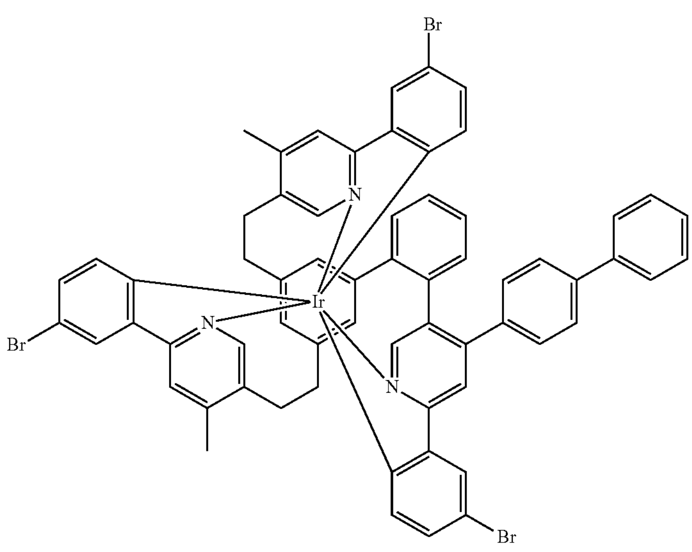 | | |

-continued
| Ex. | Reactant Bromination product | Yield |
|---|---|---|
| Ir(L100-3Br) | Ir(L100) | 93% |
| | 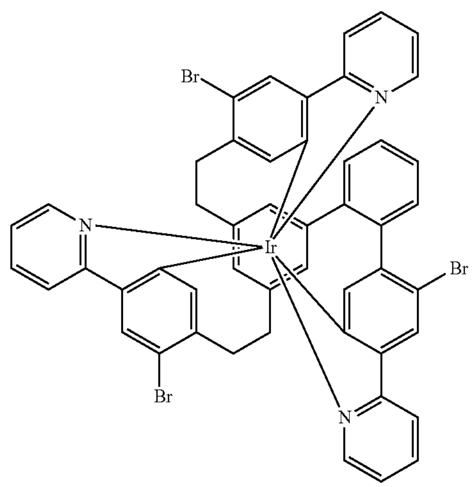 | |
| Ir(L200-3Br) | Ir(L200) | 90% |
| | 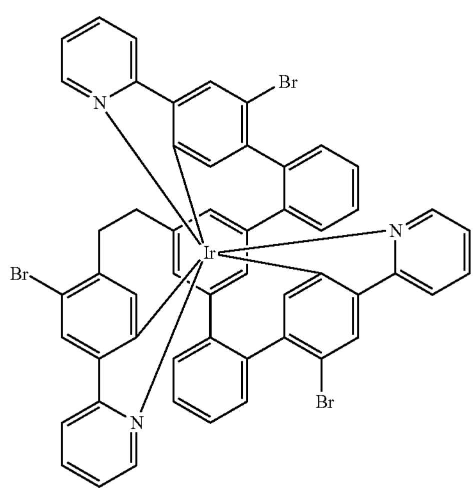 | |

-continued
| Ex. | Reactant<br>Bromination product | Yield |
|---|---|---|
| Ir(L123-2Br) | Ir(L123) | 93% |
| | 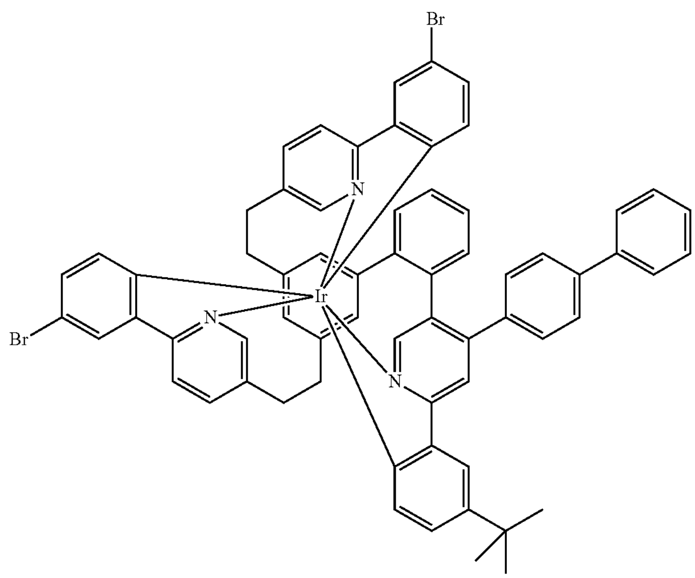 | |
| Ir(L124-3Br) | Ir(L124) | 90% |
| | 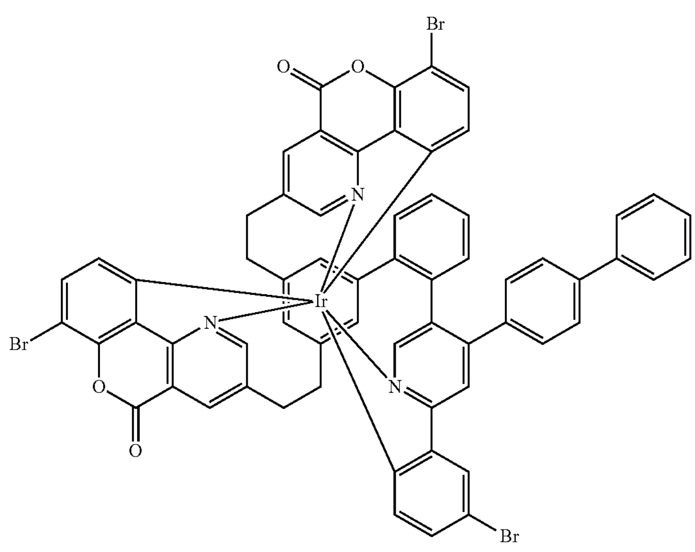 | |

-continued

| Ex. | Reactant<br>Bromination product | Yield |
|---|---|---|
| Ir(L136-D8-Br) | Ir(L136-D8)<br>1 eq NBS | 75% |

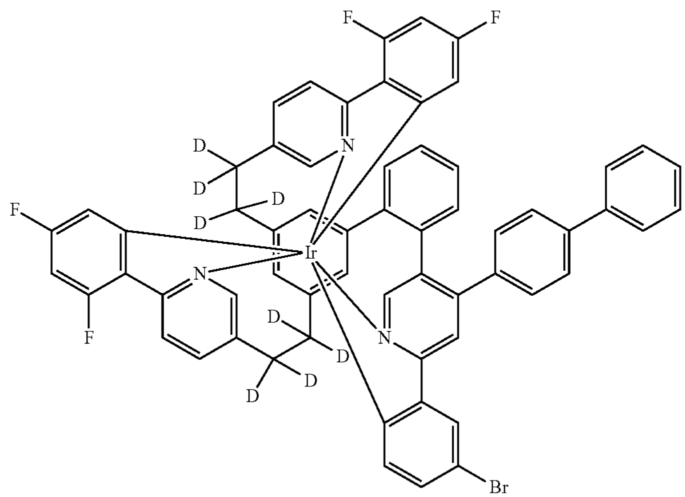

3) Cyanation of the Metal Complexes

A mixture of 10 mmol of the brominated complex, 20 mmol of copper(I) cyanide per bromine function and 300 ml of NMP is stirred at 180° C. for 40 h. After cooling, the solvent is removed under reduced pressure, the residue is taken up in 500 ml of dichloromethane, the copper salts are filtered off using Celite, the dichloromethane is concentrated almost to dryness under reduced pressure, 100 ml of ethanol are added, and the precipitated solids are filtered off with suction, washed twice with 50 ml each time of ethanol and dried under reduced pressure. The crude product is purified by chromatography and/or hot extraction. The heat treatment is effected under high vacuum (p about $10^{-6}$ mbar) within the temperature range of about 200-300° C. The sublimation is effected under high vacuum (p about $10^{-6}$ mbar) within the temperature range of about 350-450° C., the sublimation preferably being conducted in the form of a fractional sublimation.

Synthesis of Ir(L1-2CN)

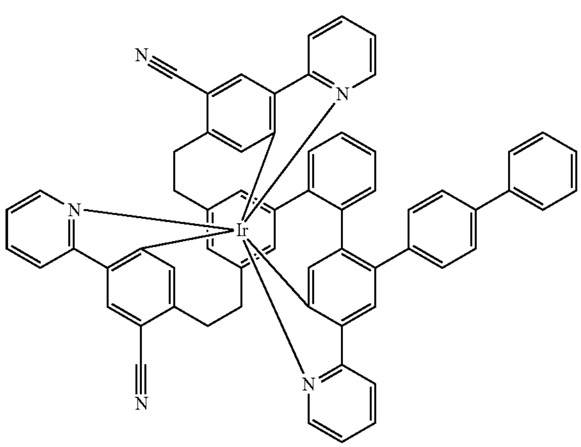

Use of 11.7 g (10 mmol) of Ir(L1-2Br) and 3.6 g (40 mmol) of copper(I) cyanide. Chromatography on silica gel with dichloromethane, hot extraction six times with dichloromethane/acetonitrile (2:1 vv), sublimation. Yield: 6.4 g (6.0 mmol), 60%; purity: about 99.9% by HPLC.

In an analogous manner, it is possible to prepare the following compounds:

| Ex. | Reactant<br>Cyanation product | Yield |
|---|---|---|
| Ir(L6-2CN) | Ir(L6-2Br)<br>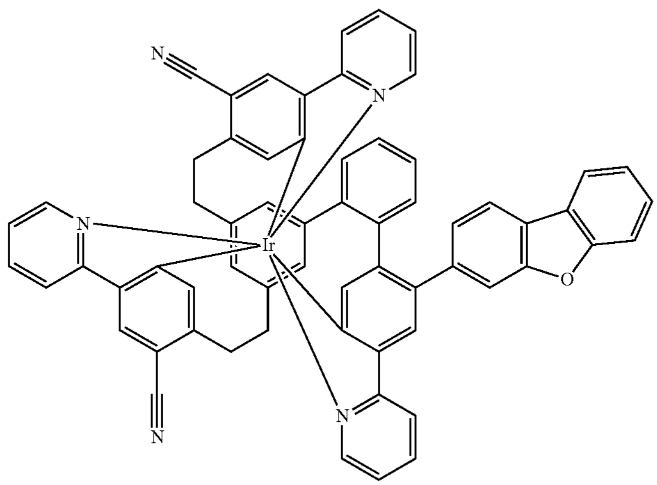 | 57% |
| Ir(L200-3CN) | Ir(L200-3Br)<br>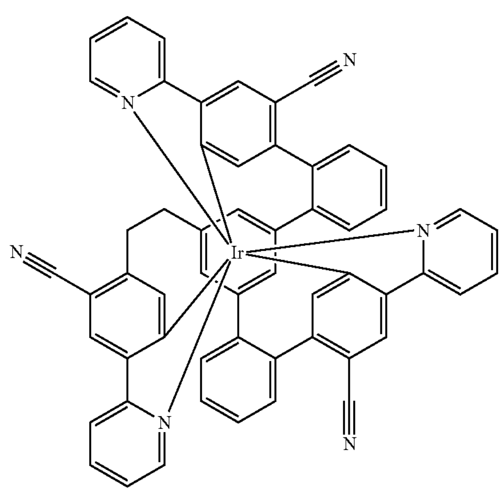 | 58% |

-continued
| Ex. | Reactant<br>Cyanation product | Yield |
|---|---|---|
| Ir(L123-2CN) | 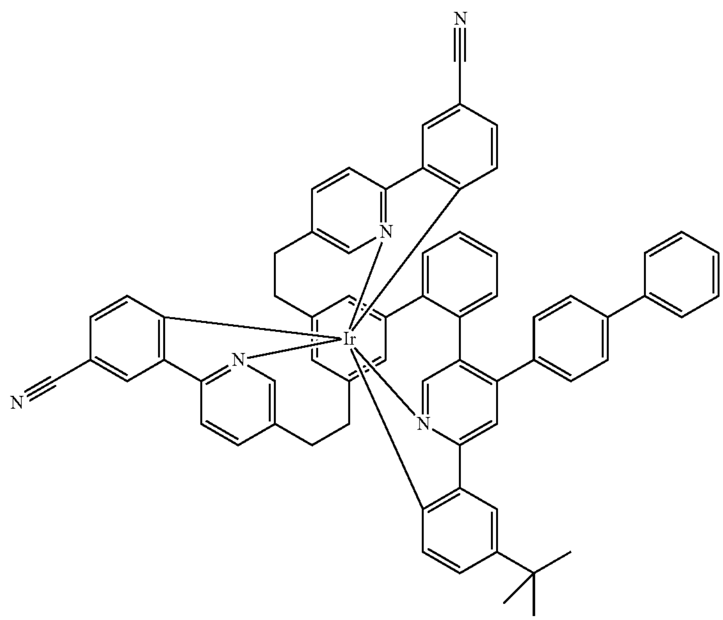 | 53% |
| Ir(L124-3CN) | 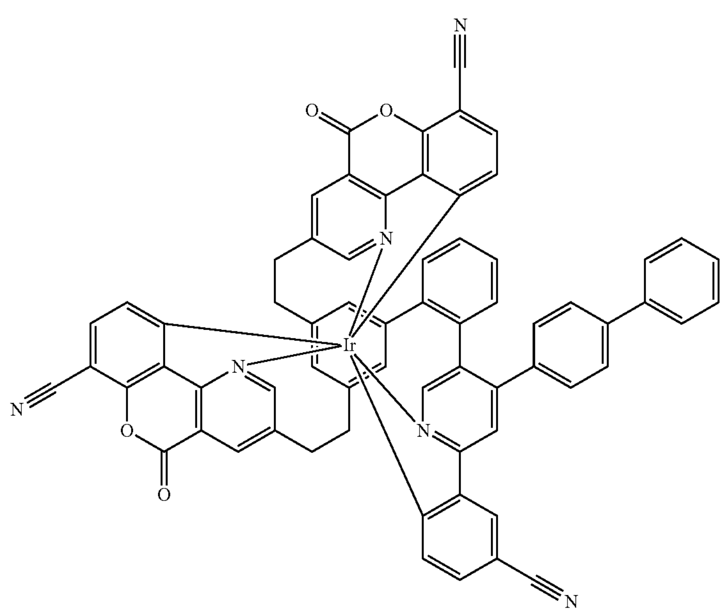 | 41% |

-continued

| Ex. | Reactant<br>Cyanation product | Yield |
|---|---|---|
| Ir(L136-D8-CN) | 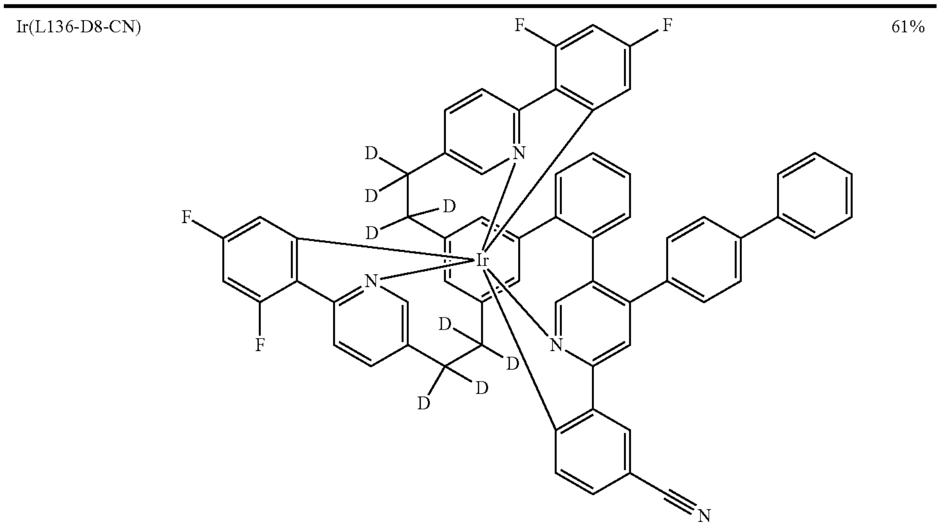 | 61% |

4) Suzuki Coupling with the Brominated Iridium Complexes

Variant A, Biphasic Reaction Mixture

To a suspension of 10 mmol of a brominated complex, 12-20 mmol of boronic acid or boronic ester per Br function and 40-80 mmol of tripotassium phosphate in a mixture of 300 ml of toluene, 100 ml of dioxane and 300 ml of water are added 0.6 mmol of tri-o-tolylphosphine and then 0.1 mmol of palladium(II) acetate, and the mixture is heated under reflux for 16 h. After cooling, 500 ml of water and 200 ml of toluene are added, the aqueous phase is removed, and the organic phase is washed three times with 200 ml of water and once with 200 ml of saturated sodium chloride solution and dried over magnesium sulfate. The mixture is filtered through a Celite bed and washed through with toluene, the toluene is removed almost completely under reduced pressure, 300 ml of methanol are added, and the precipitated crude product is filtered off with suction, washed three times with 50 ml each time of methanol and dried under reduced pressure. The crude product is columned on silica gel. The metal complex is finally heat-treated or sublimed. The heat treatment is effected under high vacuum (p about $10^{-6}$ mbar) within the temperature range of about 200-300° C. The sublimation is effected under high vacuum (p about $10^{-6}$ mbar) within the temperature range of about 300-400° C., the sublimation preferably being conducted in the form of a fractional sublimation.

Variant B, Monophasic Reaction Mixture:

To a suspension of 10 mmol of a brominated complex, 12-20 mmol of boronic acid or boronic ester per Br function and 60-100 mmol of the base (potassium fluoride, tripotassium phosphate (anhydrous or monohydrate or trihydrate), potassium carbonate, caesium carbonate etc.) and 100 g of glass beads (diameter 3 mm) in 100-500 ml of an aprotic solvent (THF, dioxane, xylene, mesitylene, dimethylacetamide, NMP, DMSO, etc.) are added 0.6 mmol of tri-o-tolylphosphine and then 0.1 mmol of palladium(II) acetate, and the mixture is heated under reflux for 1-24 h. Alternatively, it is possible to use other phosphines such as triphenylphosphine, tri-tert-butylphosphine, Sphos, Xphos, RuPhos, XanthPhos, etc., the preferred phosphine:palladium ratio in the case of these phosphines being 3:1 to 1.2:1. The solvent is removed under reduced pressure, the product is taken up in a suitable solvent (toluene, dichloromethane, ethyl acetate, etc.) and purification is effected as described in Variant A.

Synthesis of Ir1

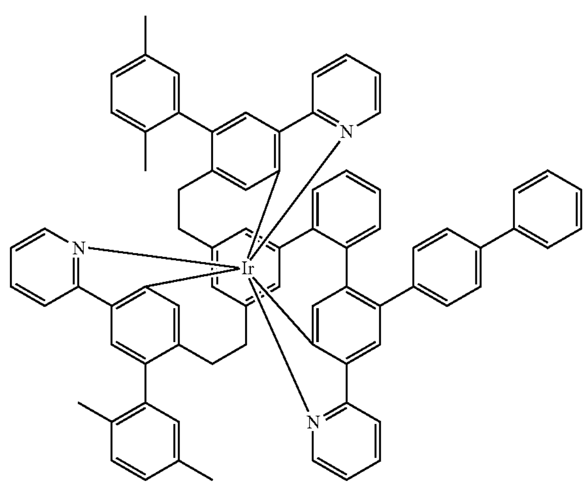

Variant A

Use of 11.7 g (10.0 mmol) of Ir(L1-2Br) and 6.0 g (40.0 mmol) of 2,5-dimethylphenylboronic acid [85199-06-0], 17.7 g (60 mmol) of tripotassium phosphate (anhydrous), 183 mg (0.6 mmol) of tri-o-tolylphosphine [6163-58-2], 23 mg (0.1 mmol) of palladium(II) acetate, 300 ml of toluene, 100 ml of dioxane and 300 ml of water, reflux, 16 h. Chromatographic separation twice on silica gel with toluene/ethyl acetate (9:1, v/v), followed by hot extraction five times with ethyl acetate/dichloromethane (1:1, v/v). Yield: 8.1 g (6.6 mmol), 66%; purity: about 99.9% by HPLC.

In an analogous manner, it is possible to prepare the following compounds:
| Ex. | Bromide/boronic acid/variant<br>Product | Yield |
|---|---|---|
| Ir2 | Ir(L8-2Br) / [5122-95-2] / A<br>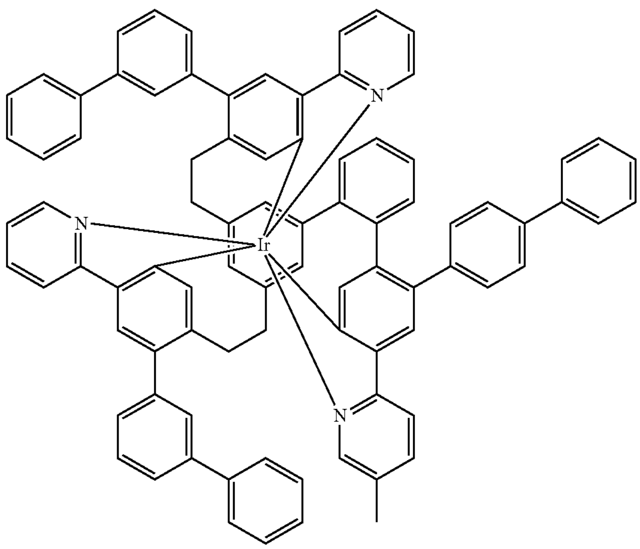 | 70% |
| Ir3 | Ir(L14-3Br) / 1313018-07-3 / B, DMSO, $K_3PO_4 \times H_20$, Pd(ac)$_2$:Triphenyphosphine 1:3<br>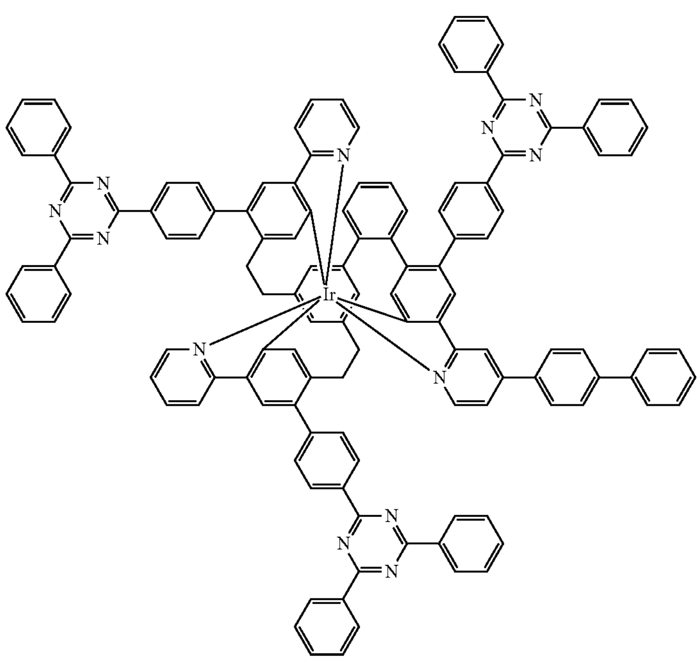 | 62% |

-continued
| Ex. | Bromide/boronic acid/variant Product | Yield |
|---|---|---|
| Ir4 | Ir(L19-2Br) / [854952-58-2] / A | 74% |
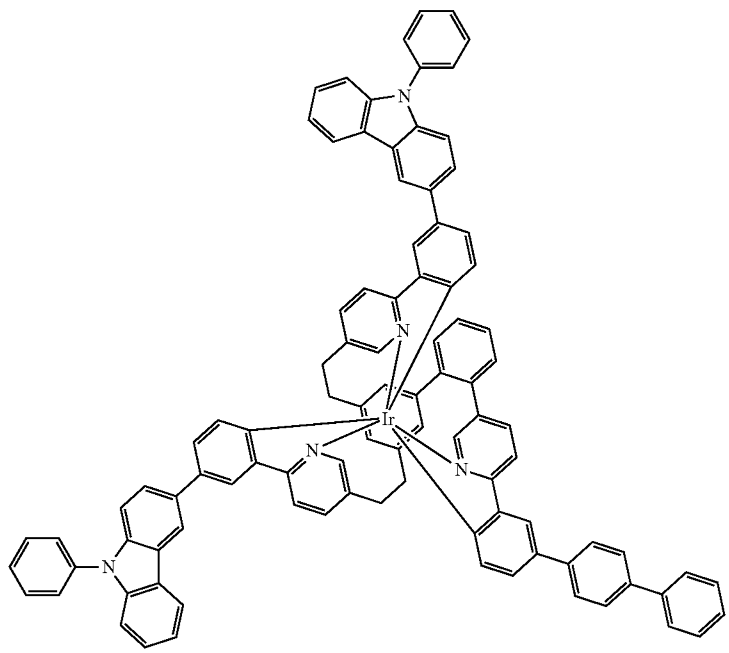
| | | |
|---|---|---|
| Ir5 | Ir(L28-3Br) / [100124-06-9] / A | 56% |
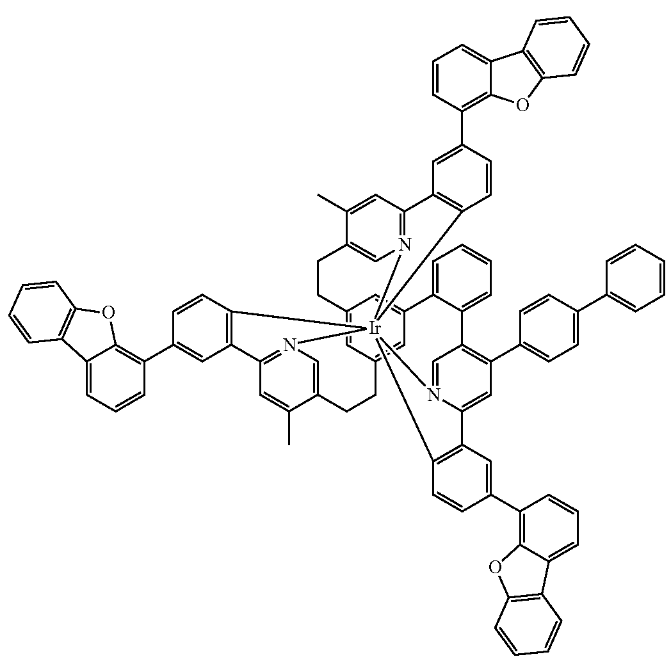

-continued
| Ex. | Bromide/boronic acid/variant Product | Yield |
|---|---|---|
| Ir6 | Ir(L100-3Br) / [5122-95-2] / A | 68% |
| | 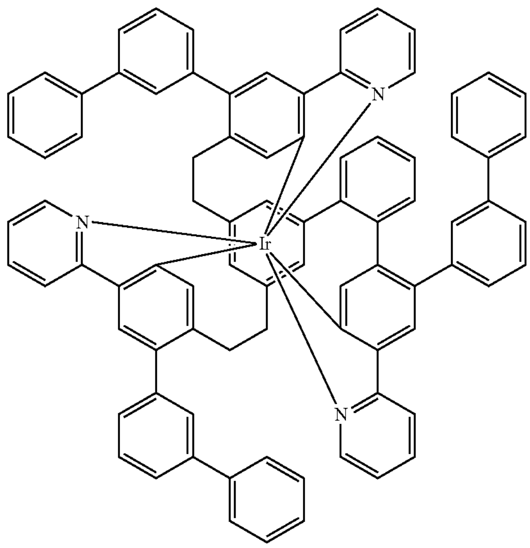 | |
| Ir7 | Ir(L200-3Br) / [1703019-86-6] / A | 60% |
| | 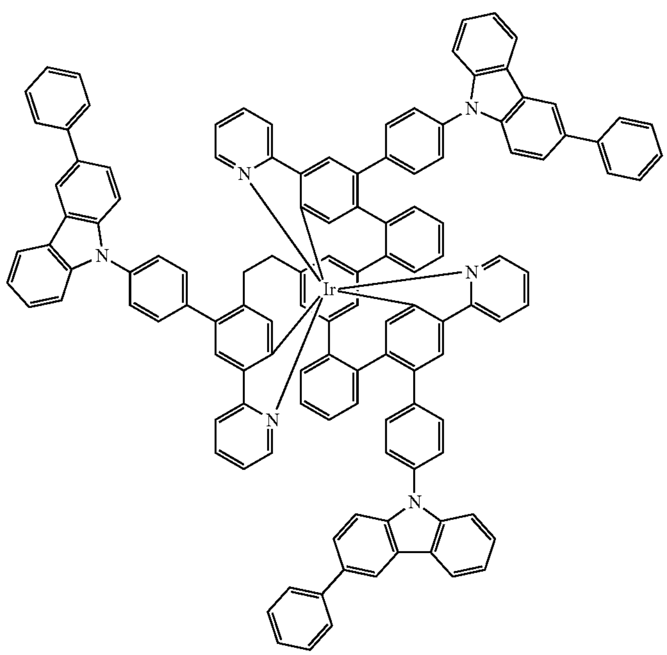 | |

In an analogous manner, it is possible to convert di-, tri-, oligo-phenylene-, fluorene-, carbazole-, dibenzofuran-, dibenzothiophene-. dibenzothiophene 1,1-dioxide-, indenocarbazole- or indolocarbazole-boronic acids or boronic esters. The coupling products are purified by reprecipitation of the crude product from DCM in methanol or by chromatography, flash chromatography or gel permeation chromatography. Some examples of suitable boronic acids or boronic esters are listed in the table which follows in the form of the CAS numbers:

| Example | CAS |
|---|---|
| 1 | 1448677-51-7 |
| 2 | 1899022-50-4 |
| 3 | 1448677-51-7 |
| 4 | 881913-00-4 |
| 5 | 2247552-50-5 |
| 6 | 491880-61-6 |
| 7 | 1643142-51-1 |
| 8 | 1443276-75-2 |
| 9 | 1056044-55-3 |
| 10 | 1622168-79-9 |
| 11 | 1308841-85-1 |
| 12 | 2182638-63-5 |
| 13 | 2159145-70-5 |
| 14 | 2101985-67-3 |
| 15 | 400607-34-3 |
| 16 | 2007912-79-8 |
| 17 | 1356465-28-5 |
| 18 | 1788946-55-3 |
| 19 | 2226968-34-7 |
| 20 | 1646636-93-2 |

5) Ullmann Coupling with the Brominated Iridium Complexes

A well-stirred suspension of 10 mmol of a brominated complex, 30 mmol of the carbazole per Br function, 30 mmol of potassium carbonate per Br function, 30 mmol of sodium sulfate per Br function, 10 mmol of copper powder per Br function, 150 ml of nitrobenzene and 100 g of glass beads (diameter 3 mm) is heated to 210° C. for 18 h. After cooling, 500 ml of MeOH are added, and the solids and the salts are filtered off with suction, washed three times with 50 ml each time of MeOH and dried under reduced pressure. The solids are suspended in 500 ml of DCM, and the mixture is stirred at room temperature for 1 h and then filtered through a silica gel bed in the form of a DCM slurry. 100 ml of MeOH are added to the filtrate, the mixture is concentrated to a slurry on a rotary evaporator, and the crude product is filtered off with suction and washed three times with 50 ml each time of MeOH. The crude product is applied to 300 g of silica gel with DCM, the laden silica gel is packed onto a silica gel bed in the form of an ethyl acetate slurry, excess carbazole is eluted with ethyl acetate, then the eluent is switched to DCM and the product is eluted. The crude product thus obtained is columned again on silica gel with DCM. Further purification is effected by hot extraction, for example with DCM/acetonitrile. The metal complex is finally heat-treated or sublimed. The heat treatment is effected under high vacuum (p about $10^{-6}$ mbar) within the temperature range of about 200-350° C. The sublimation is effected under high vacuum (p about $10^{-6}$ mbar) within the temperature range of about 350-450° C., the sublimation preferably being conducted in the form of a fractional sublimation.

Synthesis of Ir50

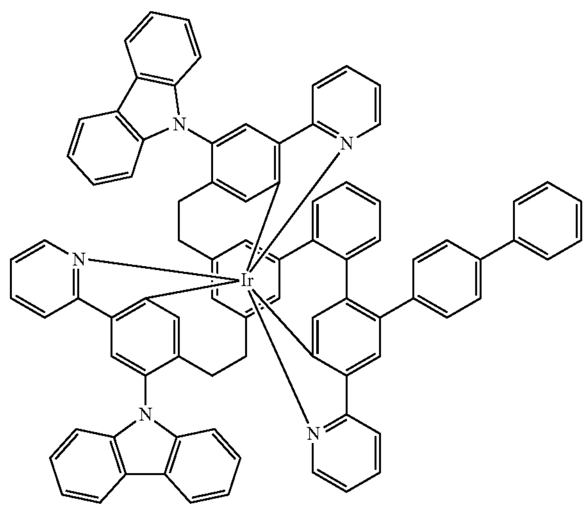

Use of 11.7 g (10 mmol) of Ir(L1-2Br), 10.0 g (60 mmol) of carbazole, 8.3 g (60 mmol) of potassium carbonate, 8.5 g (60 mmol) of sodium sulfate, 1.3 g (20 mmol) of copper powder. Workup as described above. Hot extraction five times with dichloromethane/acetonitrile (1:1, vv). Yield: 8.4 g (6.2 mmol), 62%; purity: about 99.9% by HPLC.

In an analogous manner, it is possible to prepare the following compounds:

| Ex. | Reactants<br>Product | Yield |
|---|---|---|
| Ir51 | Ir(L8-2Br) / [103012-26-6] | 67% |
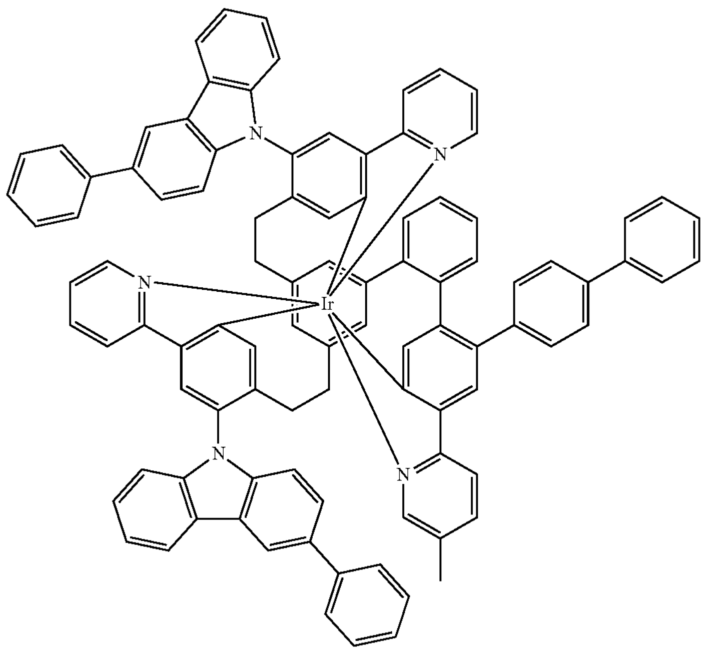
| Ex. | Reactants<br>Product | Yield |
|---|---|---|
| Ir52 | Ir(L14-3Br) / [1257220-47-5] | 61% |
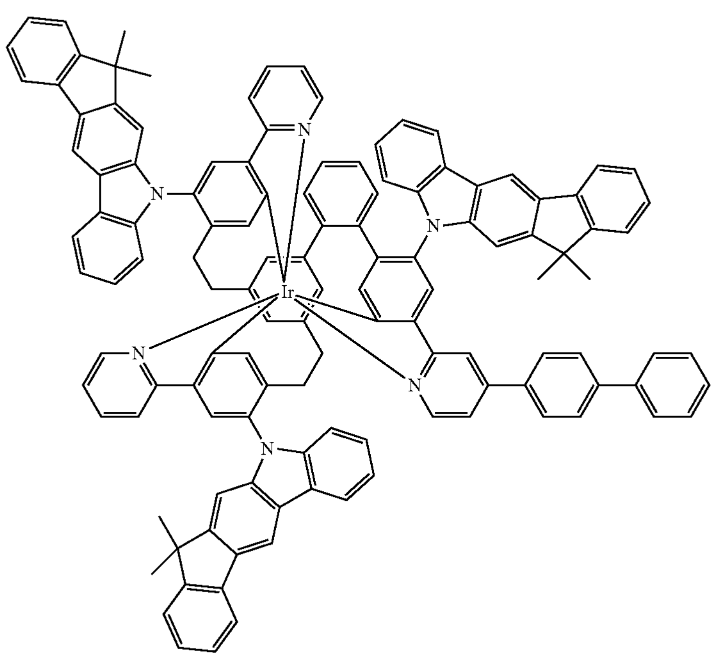

-continued
| Ex. | Reactants<br>Product | Yield |
|---|---|---|
| Ir53 | Ir(L28-3Br) / [88590-005] | 66% |
| | 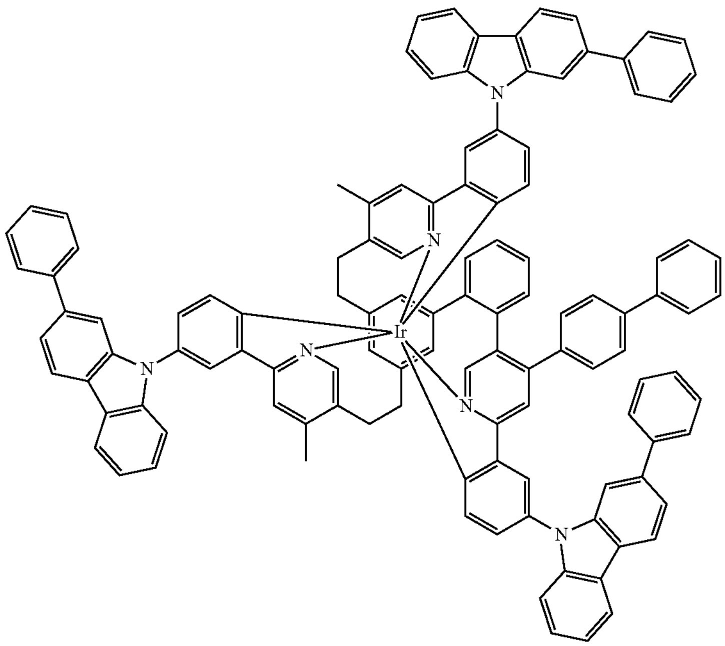 | |
| Ir54 | Ir(L200-3Br) / [244-69-9] | 60% |
| | 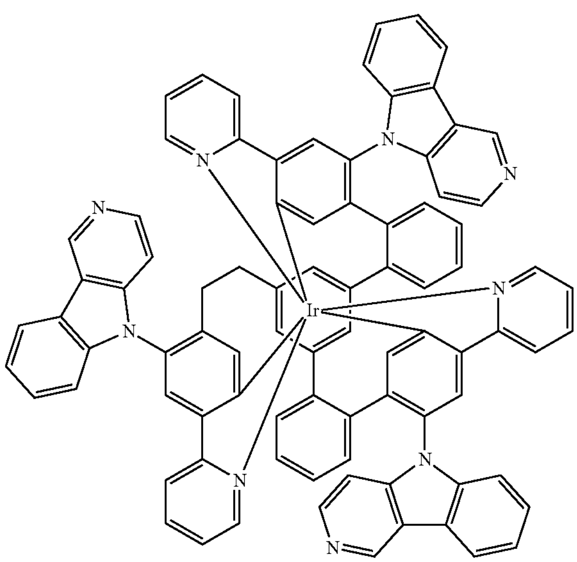 | |

Synthesis of Ir60

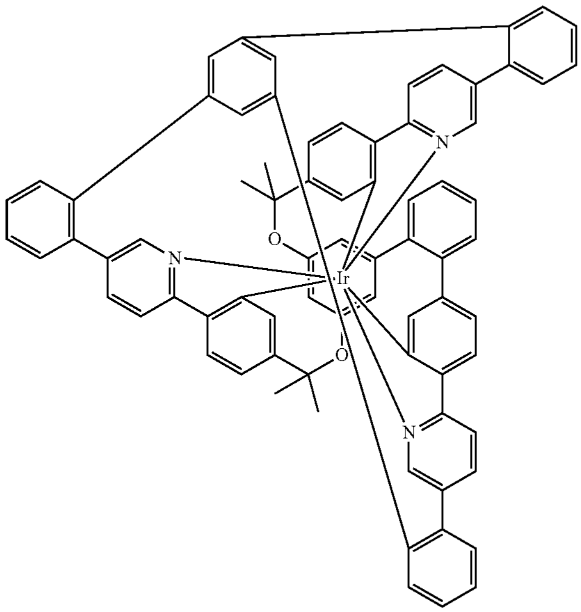

To a solution, cooled to −78° C., of 5.43 g (10 mmol) of 2,2"-dibromo-5'-(2-bromophenyl)-1,1':3',1"-terphenyl [380626-56-2] in 200 ml THF are added dropwise 18.8 ml (30 mmol) of n-butyllithium, 1.6 N in n-hexane, and the mixture is stirred at −78° C. for a further 1 h. Then, with good stirring, a solution, precooled to −78° C., of 9.22 g (10 mmol) of Ir(L149) in 200 ml of THF is added rapidly, and the mixture is stirred at −78° C. for a further 2 h and then allowed to warm up gradually to room temperature. The solvent is removed under reduced pressure and the residue is chromatographed twice with toluene/DCM (8:2 vv) on silica gel. The metal complex is finally heat-treated under high vacuum (p about $10^{-6}$ mbar) in the temperature range of about 300-350° C. Yield 2.9 g (2.4 mmol), 24%. Purity: about 99.7% by 1H NMR.

Synthesis of Complexes with a Spiro Bridge

A) Introduction in the Iridium Complex

The introduction of spiro rings into the bridging units of the complexes can be effected on the complex itself, by a lithiation-alkylation-lithiation-intramolecular alkylation sequence with α,ω-dihaloalkanes as electrophile (see scheme below).

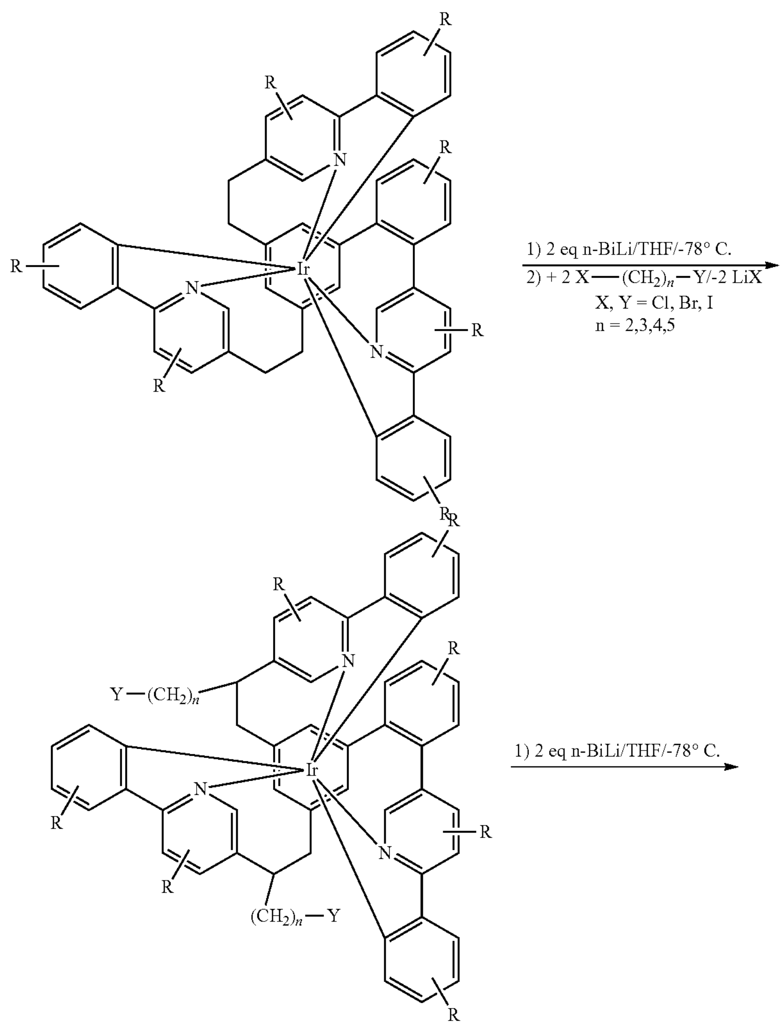

-continued

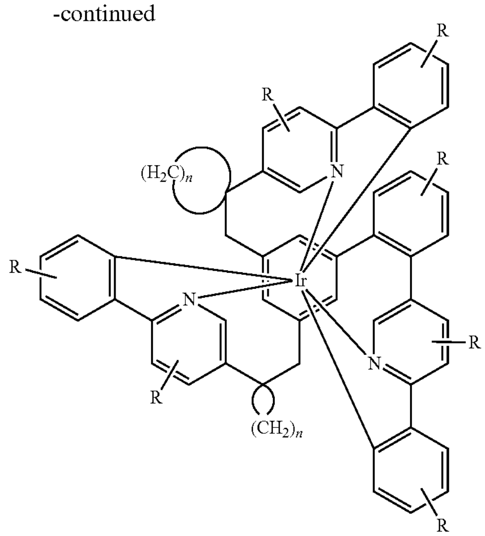

B) Introduction During the Ligand Synthesis

The introduction of Spiro rings into the bridging units of the complexes can alternatively also be effected by synthesis of suitable ligands having spiro rings, and subsequent o-metallation. This involves joining the spiro rings via Suzuki coupling (see van den Hoogenband, Adri et al. Tetrahedron Lett., 49, 4122, 2008) to the appropriate bidentate subligands (see step 1 of the scheme below). The rest of the synthesis is effected by techniques that are known from literature and have already been described in detail above.

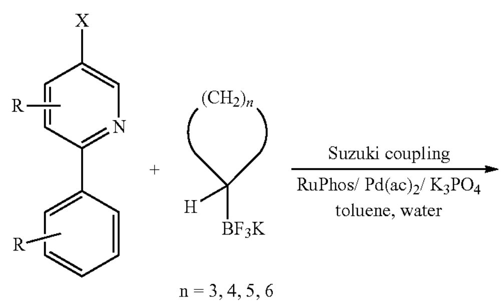

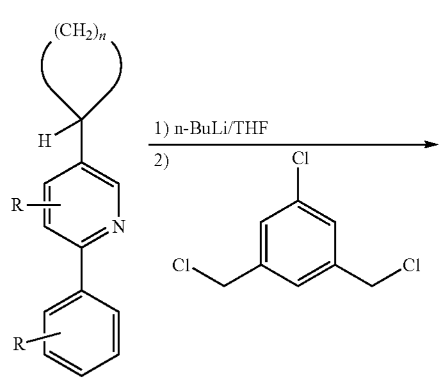

-continued

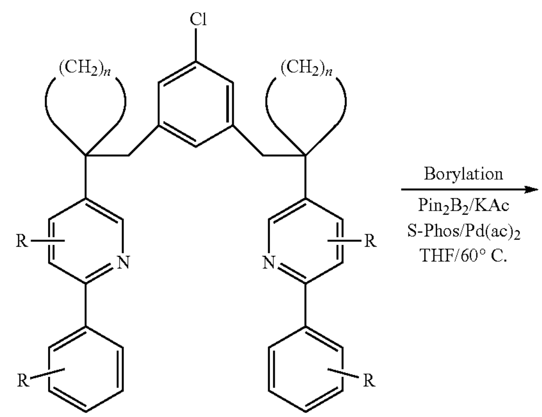

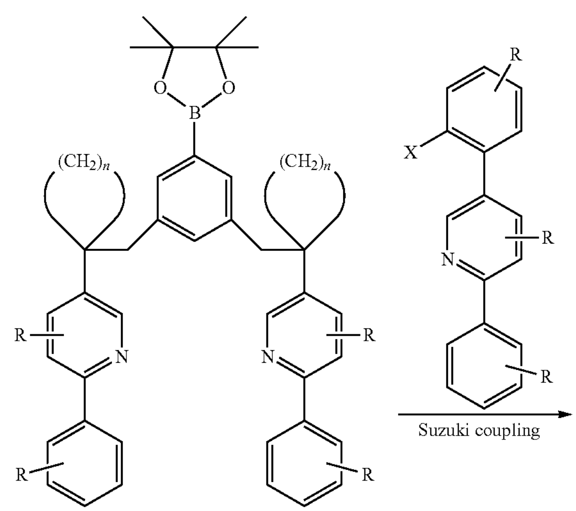

-continued

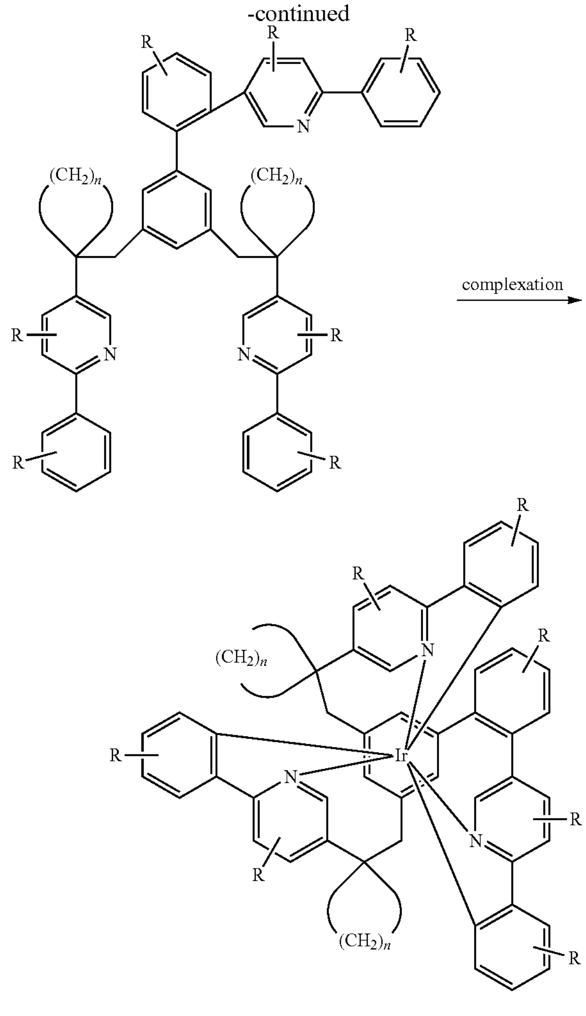

Example: Production of the OLEDs

1) Vacuum-Processed Devices:

OLEDs of the invention and OLEDs according to the prior art are produced by a general method according to WO 2004/058911, which is adapted to the circumstances described here (variation in layer thickness, materials used).

In the examples which follow, the results for various OLEDs are presented. Cleaned glass plaques (cleaning in Miele laboratory glass washer, Merck Extran detergent) coated with structured ITO (indium tin oxide) of thickness 50 nm are pretreated with UV ozone for 25 minutes (PR-100 UV ozone generator from UVP) and, within 30 min, for improved processing, coated with 20 nm of PEDOT:PSS (poly(3,4-ethylenedioxythiophene) poly(styrenesulfonate), purchased as CLEVIOS™ P VP Al 4083 from Heraeus Precious Metals GmbH Deutschland, spun on from aqueous solution) and then baked at 180° C. for 10 min. These coated glass plaques form the substrates to which the OLEDs are applied.

The OLEDs basically have the following layer structure: substrate/hole injection layer 1 (HIL1) consisting of HTM1 doped with 5% NDP-9 (commercially available from Novaled), 20 nm/hole transport layer 1 (HTL1) consisting of HTM1, 220 nm for green/yellow devices, 110 nm for red devices/hole transport layer 2 (HTL2)/emission layer (EML)/hole blocker layer (HBL)/electron transport layer (ETL)/optional electron injection layer (EIL) and finally a cathode. The cathode is formed by an aluminium layer of thickness 100 nm.

First of all, vacuum-processed OLEDs are described. For this purpose, all the materials are applied by thermal vapour deposition in a vacuum chamber. In this case, the emission layer always consists of at least one matrix material (host material) and an emitting dopant (emitter) which is added to the matrix material(s) in a particular proportion by volume by co-evaporation. Details given in such a form as M1:M2: Ir(L1) (55%:35%:10%) mean here that the material M1 is present in the layer in a proportion by volume of 55%, M2 in a proportion by volume of 35% and Ir(L1) in a proportion by volume of 10%. Analogously, the electron transport layer may also consist of a mixture of two materials. The exact structure of the OLEDs can be found in Table 1. The materials used for production of the OLEDs are shown in Table 4.

The OLEDs are characterized in a standard manner. For this purpose, the electroluminescence spectra, the current efficiency (measured in cd/A), the power efficiency (measured in lm/W) and the external quantum efficiency (EQE, measured in percent) as a function of luminance, calculated from current-voltage-luminance characteristics (IUL characteristics) assuming Lambertian emission characteristics, and also the lifetime are determined. The electroluminescence spectra are determined at a luminance of 1000 cd/m$^2$, and the CIE 1931 x and y colour coordinates are calculated therefrom. The lifetime LT90 is defined as the time after which the luminance in operation has dropped to 90% of the starting luminance with a starting brightness of 10 000 cd/m$^2$.

The OLEDs can initially also be operated at different starting luminances. The values for the lifetime can then be converted to a figure for other starting luminances with the aid of conversion formulae known to those skilled in the art.

Use of Compounds of the Invention as Emitter Materials in Phosphorescent OLEDs

One use of the compounds of the invention is as phosphorescent emitter materials in the emission layer in OLEDs. The iridium compounds according to Table 4 are used as a comparison according to the prior art. The results for the OLEDs are collated in Table 2.

TABLE 1

Structure of the OLEDs

| Ex. | HTL2 thickness | EML thickness | HBL thickness | ETL thickness |
|---|---|---|---|---|
| Ref.D1 | HTM2 10 nm | M1:M2:Ir-Ref.1 (55%:30%:15%) 30 nm | ETM1 10 nm | ETM1:ETM2 (50%:50%) 30 nm |
| Ref.D2 | HTM2 10 nm | M1:M2:Ir-Ref.2 (55%:30%:15%) 30 nm | ETM1 10 nm | ETM1:ETM2 (50%:50%) 30 nm |
| Ref.D3 | HTM2 10 nm | M1:M2:Ir-Ref.3 (55%:30%:15%) 30 nm | ETM1 10 nm | ETM1:ETM2 (50%:50%) 30 nm |
| Ref.D4 | HTM2 10 nm | M1:M2:Ir-Ref.4 (55%:30%:15%) 30 nm | ETM1 10 nm | ETM1:ETM2 (50%:50%) 30 nm |
| D1 | HTM2 10 nm | M1:M2:Ir(L100) (55%:30%:15%) 30 nm | ETM1 10 nm | ETM1:ETM2 (50%:50%) 30 nm |
| D2 | HTM2 10 nm | M1:M2:Ir(L107) (55%:30%:15%) 30 nm | ETM1 10 nm | ETM1:ETM2 (50%:50%) 30 nm |

TABLE 1-continued

| Structure of the OLEDs | | | | |
|---|---|---|---|---|
| Ex. | HTL2 thickness | EML thickness | HBL thickness | ETL thickness |
| D3 | HTM2 10 nm | M1:M2:Ir(L200) (55%:30%:15%) 30 nm | ETM1 10 nm | ETM1:ETM2 (50%:50%) 30 nm |
| D4 | HTM2 10 nm | M1:M2:Ir(L207) (55%:30%:15%) 30 nm | ETM1 10 nm | ETM1:ETM2 (50%:50%) 30 nm |
| D5A | HTM2 10 nm | M1:M2:Ir(L1) (55%:30%:15%) 30 nm | ETM1 10 nm | ETM1:ETM2 (50%:50%) 30 nm |
| D5B | HTM2 10 nm | M1:M7:Ir(L1) (49%:29%:22%) 30 nm | ETM1 10 nm | ETM1:ETM2 (50%:50%) 30 nm |
| D5C | HTM2 10 nm | M1:M8:Ir(L1) (68%:25%:7%) 30 nm | ETM1 10 nm | ETM1:ETM2 (50%:50%) 30 nm |
| D5D | HTM2 10 nm | M1:M9:Ir(L1) (58%:35%:7%) 30 nm | ETM1 10 nm | ETM1:ETM2 (50%:50%) 30 nm |
| D5E | HTM2 10 nm | M1:M9:Ir(L1) (46%:50%:4%) 30 nm | ETM1 10 nm | ETM1:ETM2 (50%:50%) 30 nm |
| D6A | HTM2 10 nm | M1:M2:Ir(L14) (62%:31%:7%) 30 nm | ETM1 10 nm | ETM1:ETM2 (50%:50%) 30 nm |
| D6B | HTM2 10 nm | M1:M2:Ir(L14) (59%:29%:12%) 30 nm | ETM1 10 nm | ETM1:ETM2 (50%:50%) 30 nm |
| D6C | HTM2 10 nm | M1:M2:Ir(L14) (56%:27%:17%) 30 nm | ETM1 10 nm | ETM1:ETM2 (50%:50%) 30 nm |
| D6D | HTM2 10 nm | M1:M2:Ir(L14) (41.5%:41.5%:17%) 30 nm | ETM1 10 nm | ETM1:ETM2 (50%:50%) 30 nm |
| D6E | HTM2 10 nm | M1:M7:Ir(L14) (26%:52%:22%) 30 nm | ETM1 10 nm | ETM1:ETM2 (50%:50%) 30 nm |
| D6F | HTM2 | M1:M11:Ir(L14) (26%:52%:22%) 30 nm | ETM1 10 nm | ETM1:ETM2 (50%:50%) 30 nm |
| D7 | HTM2 10 nm | M6:Ir(L30) (88%:12%) 40 nm | ETM1 10 nm | ETM1:ETM2 (50%:50%) 30 nm |
| D8A | HTM3 10 nm | M1:M11:Ir(L43) (26%:52%:22%) 30 nm | ETM1 10 nm | ETM1:ETM2 (50%:50%) 30 nm |
| D8B | HTM3 10 nm | M1:M2:Ir(L43) (47%:47%:6%) 30 nm | ETM1 10 nm | ETM1:ETM2 (50%:50%) 30 nm |
| D9 | HTM3 10 nm | M1:M11:Ir(L25) (55%:27%:18%) 30 nm | ETM1 10 nm | ETM1:ETM2 (50%:50%) 30 nm |
| D10 | HTM3 10 nm | M1:Ir(L136) (80%:20%) 30 nm | ETM1 10 nm | ETM1:ETM2 (50%:50%) 30 nm |
| D11 | HTM3 10 nm | M1:M2:Ir(L136) (68%:20%:12%) 30 nm | ETM1 10 nm | ETM1:ETM2 (50%:50%) 30 nm |
| D12 | HTM3 10 nm | M1:Ir(L136-D8) (80%:20%) 30 nm | ETM1 10 nm | ETM1:ETM2 (50%:50%) 30 nm |
| D13 | HTM3 10 nm | M1:M7:Ir(L2) (57%:28%:15%) 30 nm | ETM1 10 nm | ETM1:ETM2 (50%:50%) 30 nm |
| D14 | HTM3 10 nm | M1:M7:Ir(L3) (57%:28%:15%) 30 nm | ETM1 10 nm | ETM1:ETM2 (50%:50%) 30 nm |
| D15 | HTM3 10 nm | M1:M7:Ir(L6) (57%:28%:15%) 30 nm | ETM1 10 nm | ETM1:ETM2 (50%:50%) 30 nm |
| D16 | HTM3 10 nm | M1:M7:Ir(L7) (57%:28%:15%) 30 nm | ETM1 10 nm | ETM1:ETM2 (50%:50%) 30 nm |
| D17 | HTM3 10 nm | M1:M7:Ir(L8) (57%:28%:15%) 30 nm | ETM1 10 nm | ETM1:ETM2 (50%:50%) 30 nm |

TABLE 1-continued

| Structure of the OLEDs | | | | |
|---|---|---|---|---|
| Ex. | HTL2 thickness | EML thickness | HBL thickness | ETL thickness |
| D18 | HTM3 10 nm | M1:M7:Ir(L9) (57%:28%:15%) 30 nm | ETM1 10 nm | ETM1:ETM2 (50%:50%) 30 nm |
| D19 | HTM3 10 nm | M1:M7:Ir(L11) (57%:28%:15%) 30 nm | ETM1 10 nm | ETM1:ETM2 (50%:50%) 30 nm |
| D20 | HTM3 10 nm | M1:M11:Ir(L15) (26%:52%:22%) 30 nm | ETM1 10 nm | ETM1:ETM2 (50%:50%) 30 nm |
| D21 | HTM3 10 nm | M1:M11:Ir(L16) (26%:52%:22%) 30 nm | ETM1 10 nm | ETM1:ETM2 (50%:50%) 30 nm |
| D22 | HTM3 10 nm | M1:M11:Ir(L17) (26%:52%:22%) 30 nm | ETM1 10 nm | ETM1:ETM2 (50%:50%) 30 nm |
| D23 | HTM3 10 nm | M1:M2:Ir(L23) (62%:31%:7%) 30 nm | ETM1 10 nm | ETM1:ETM2 (50%:50%) 30 nm |
| D24 | HTM3 10 nm | M1:M11:Ir(L26) (55%:27%:18%) 30 nm | ETM1 10 nm | ETM1:ETM2 (50%:50%) 30 nm |
| D25 | HTM3 10 nm | M1:M11:Ir(L27) (55%:27%:18%) 30 nm | ETM1 10 nm | ETM1:ETM2 (50%:50%) 30 nm |
| D26 | HTM3 10 nm | M1:M11:Ir(L28) (55%:27%:18%) 30 nm | ETM1 10 nm | ETM1:ETM2 (50%:50%) 30 nm |
| D27 | HTM3 10 nm | M1:M11:Ir(L29) (55%:27%:18%) 30 nm | ETM1 10 nm | ETM1:ETM2 (50%:50%) 30 nm |
| D28 | HTM2 10 nm | M6:Ir(L31) (95%:5%) 40 nm | ETM1 10 nm | ETM1:ETM2 (50%:50%) 30 nm |
| D29 | HTM3 10 nm | M1:M2:Ir(L44) (47%:47%:6%) 30 nm | ETM1 10 nm | ETM1:ETM2 (50%:50%) 30 nm |
| D30 | HTM3 10 nm | M1:M2:Ir(L42) (47%:47%:6%) 30 nm | ETM1 10 nm | ETM1:ETM2 (50%:50%) 30 nm |
| D31 | HTM3 10 nm | M1:M11:Ir(L113) (55%:27%:18%) 30 nm | ETM1 10 nm | ETM1:ETM2 (50%:50%) 30 nm |
| D32 | HTM3 10 nm | M1:M11:Ir(L114) (55%:27%:18%) 30 nm | ETM1 10 nm | ETM1:ETM2 (50%:50%) 30 nm |
| D33 | HTM3 10 nm | M1:M11:Ir(L115) (55%:27%:18%) 30 nm | ETM1 10 nm | ETM1:ETM2 (50%:50%) 30 nm |
| D34 | HTM3 10 nm | M1:M11:Ir(L118) (55%:27%:18%) 30 nm | ETM1 10 nm | ETM1:ETM2 (50%:50%) 30 nm |
| D35 | HTM3 10 nm | M1:M11:Ir(L119) (50%:30%:20%) 30 nm | ETM1 10 nm | ETM1:ETM2 (50%:50%) 30 nm |
| D36 | HTM3 10 nm | M1:M11:Ir(L120) (50%:30%:20%) 30 nm | ETM1 10 nm | ETM1:ETM2 (50%:50%) 30 nm |
| D37 | HTM3 10 nm | M1:M11:Ir(L122) (55%:27%:18%) 30 nm | ETM1 10 nm | ETM1:ETM2 (50%:50%) 30 nm |
| D38 | HTM3 10 nm | M1:M11:Ir(L123) (55%:27%:18%) 30 nm | ETM1 10 nm | ETM1:ETM2 (50%:50%) 30 nm |
| D39 | HTM3 10 nm | M1:M2:Ir(L124) (68%:20%:12%) 30 nm | ETM1 10 nm | ETM1:ETM2 (50%:50%) 30 nm |
| D40 | HTM3 10 nm | M1:M2:Ir(L124-D8) (68%:20%:12%) 30 nm | ETM1 10 nm | ETM1:ETM2 (50%:50%) 30 nm |
| D41 | HTM3 10 nm | M1:M9:Ir(L128) (68%:20%:12%) 30 nm | ETM1 10 nm | ETM1:ETM2 (50%:50%) 30 nm |
| D42 | HTM3 10 nm | M1:M2:Ir(L131) (62%:31%:7%) 30 nm | ETM1 10 nm | ETM1:ETM2 (50%:50%) 30 nm |

TABLE 1-continued

Structure of the OLEDs

| Ex. | HTL2 thickness | EML thickness | HBL thickness | ETL thickness |
|---|---|---|---|---|
| D43 | HTM3 10 nm | M1:M2:Ir(L132) (62%:31%:7%) 30 nm | ETM1 10 nm | ETM1:ETM2 (50%:50%) 30 nm |
| D44 | HTM3 10 nm | M1:M2:Ir(L133) (62%:31%:7%) 30 nm | ETM1 10 nm | ETM1:ETM2 (50%:50%) 30 nm |
| D45 | HTM3 10 nm | M1:M2:Ir(L133-D8) (62%:31%:7%) 30 nm | ETM1 10 nm | ETM1:ETM2 (50%:50%) 30 nm |
| D46 | HTM3 10 nm | M1:M2:Ir(L137) (62%:31%:7%) 30 nm | ETM1 10 nm | ETM1:ETM2 (50%:50%) 30 nm |
| D47 | HTM3 10 nm | M1:M2:Ir(L138) (62%:31%:7%) 30 nm | ETM1 10 nm | ETM1:ETM2 (50%:50%) 30 nm |
| D48 | HTM3 10 nm | M1:M2:Ir(L139) (62%:31%:7%) 30 nm | ETM1 10 nm | ETM1:ETM2 (50%:50%) 30 nm |
| D49 | HTM3 10 nm | M1:M11:Ir(L28-D10) (55%:27%:18%) 30 nm | ETM1 10 nm | ETM1:ETM2 (50%:50%) 30 nm |
| D50 | HTM3 10 nm | M1:M2:Ir(L123-2CN) (60%:30%:10%) 30 nm | ETM1 10 nm | ETM1:ETM2 (50%:50%) 30 nm |
| D51 | HTM3 10 nm | M1:M2:Ir(L145) (60%:30%:10%) 30 nm | ETM1 10 nm | ETM1:ETM2 (50%:50%) 30 nm |
| D52 | HTM3 10 nm | M1:M2:Ir(L153-D11) (60%:30%:10%) 30 nm | ETM1 10 nm | ETM1:ETM2 (50%:50%) 30 nm |
| D53 | HTM3 10 nm | M1:M2:Ir(L154-D17) (60%:30%:10%) 30 nm | ETM1 10 nm | ETM1:ETM2 (50%:50%) 30 nm |

TABLE 2

Results for the vacuum-processed OLEDs

| Ex. | EQE (%) 1000 cd/m$^2$ | Voltage (V) 1000 cd/m$^2$ | CIE x/y 1000 cd/m$^2$ | LT90 (h) 10000 cd/m$^2$ |
|---|---|---|---|---|
| Ref.D1 | 20.0 | 3.1 | 0.32/0.64 | 260 |
| Ref.D2 | 19.7 | 3.1 | 0.40/0.59 | 190 |
| Ref.D3 | 18.8 | 3.2 | 0.32/0.62 | 170 |
| Ref.D4 | 18.6 | 3.2 | 0.30/0.63 | 120 |
| D1 | 21.6 | 3.0 | 0.31/0.63 | 310 |
| D2 | 20.9 | 3.1 | 0.39/0.59 | 230 |
| D3 | 21.3 | 3.1 | 0.32/0.63 | 290 |
| D4 | 20.5 | 3.1 | 0.40/0.59 | 220 |
| D5A | 22.7 | 3.1 | 0.32/0.63 | 800 |
| D5B | 22.9 | 3.3 | 0.33/0.64 | 1000 |
| D5C | 20.3 | 2.9 | 0.33/0.64 | 700 |
| D5D | 22.5 | 3.0 | 0.32/0.63 | 1100 |
| D5E | 22.7 | 3.0 | 0.33/0.64 | 800 |
| D6A | 29.5 | 3.0 | 0.53/0.45 | 750 |
| D6B | 29.0 | 3.0 | 0.52/0.47 | 1000 |
| D6C | 27.6 | 3.1 | 0.51/0.48 | 1500 |
| D6D | 27.5 | 3.0 | 0.51/0.48 | 1400 |
| D6E | 25.8 | 3.0 | 0.50/0.48 | 4600 |
| D6F | 24.2 | 3.1 | 0.53/0.46 | 8000 |
| D7 | 23.0 | 2.9 | 0.65/0.35 | 1700 |
| D8A | 26.8 | 2.9 | 0.49/0.51 | 200 |
| D8B | 31.0 | 3.0 | 0.44/0.55 | 240 |
| D9 | 23.8 | 2.9 | 0.51/0.49 | 1500 |
| D10 | 31.9 | 2.9 | 0.35/0.62 | 450 |
| D11 | 31.0 | 2.9 | 0.34/0.63 | 350 |
| D12 | 32.1 | 2.9 | 0.36/0.61 | 550 |
| D13 | 23.6 | 3.2 | 0.33/0.64 | 700 |
| D14 | 21.4 | 3.2 | 0.32/0.64 | 500 |
| D15 | 22.3 | 3.1 | 0.35/0.63 | 450 |
| D16 | 22.9 | 3.1 | 0.35/0.62 | 500 |
| D17 | 21.4 | 3.1 | 0.34/0.62 | 500 |

TABLE 2-continued

Results for the vacuum-processed OLEDs

| Ex. | EQE (%) 1000 cd/m$^2$ | Voltage (V) 1000 cd/m$^2$ | CIE x/y 1000 cd/m$^2$ | LT90 (h) 10000 cd/m$^2$ |
|---|---|---|---|---|
| D18 | 22.2 | 3.1 | 0.34/0.63 | 550 |
| D19 | 21.9 | 3.2 | 0.35/0.62 | 600 |
| D20 | 22.9 | 3.1 | 0.50/0.48 | 6500 |
| D21 | 24.6 | 3.1 | 0.55/0.43 | 9000 |
| D22 | 22.0 | 3.1 | 0.45/0.54 | 3500 |
| D23 | 21.7 | 2.9 | 0.37/0.62 | 800 |
| D24 | 23.0 | 2.9 | 0.49/0.51 | 1300 |
| D25 | 24.0 | 2.9 | 0.52/0.48 | 1600 |
| D26 | 23.6 | 2.9 | 0.51/0.49 | 1900 |
| D27 | 21.7 | 2.9 | 0.44/0.55 | 900 |
| D28 | 26.1 | 2.9 | 0.66/0.34 | 6500 |
| D29 | 28.7 | 3.0 | 0.46/0.53 | 270 |
| D30 | 23.1 | 3.1 | 0.30/0.62 | 200 |
| D31 | 23.4 | 2.9 | 0.52/0.48 | 1800 |
| D32 | 24.3 | 2.9 | 0.53/0.46 | 2000 |
| D33 | 21.4 | 2.9 | 0.38/0.60 | 800 |
| D34 | 23.9 | 2.9 | 0.53/0.46 | 2200 |
| D35 | 23.6 | 2.9 | 0.53/0.46 | 2000 |
| D36 | 23.5 | 2.8 | 0.51/0.49 | 2000 |
| D37 | 23.9 | 2.9 | 0.56/0.44 | 3100 |
| D38 | 22.7 | 3.0 | 0.53/0.47 | 1500 |
| D39 | 30.0 | 2.9 | 0.35/0.62 | 800 |
| D40 | 30.3 | 2.9 | 0.35/0.62 | 1000 |
| D41 | 27.5 | 2.9 | 0.35/0.63 | 500 |
| D42 | 29.7 | 2.8 | 0.36/0.61 | 450 |
| D43 | 30.4 | 2.9 | 0.37/0.61 | 500 |
| D44 | 30.7 | 2.9 | 0.37/0.62 | 700 |
| D45 | 30.9 | 2.9 | 0.37/0.62 | 800 |
| D46 | 32.4 | 2.9 | 0.36/0.62 | 500 |
| D47 | 31.4 | 2.9 | 0.36/0.62 | 550 |
| D48 | 30.0 | 2.9 | 0.37/0.61 | 500 |
| D49 | 24.4 | 2.9 | 0.53/0.47 | 1600 |
| D50 | 30.5 | 2.9 | 0.34/0.63 | 550 |
| D51 | 20.4 | 2.9 | 0.57/0.41 | 1100 |
| D52 | 24.5 | 3.0 | 0.35/0.62 | 1200 |
| D53 | 24.2 | 3.0 | 0.37/0.61 | 1350 |

Solution-Processed Devices:

A: From Soluble Functional Materials of Low Molecular Weight

The iridium complexes of the invention may also be processed from solution and lead therein to OLEDs which are much simpler in terms of process technology compared to the vacuum-processed OLEDs, but nevertheless have good properties. The production of such components is based on the production of polymeric light-emitting diodes (PLEDs), which has already been described many times in the literature (for example in WO 2004/037887). The structure is composed of substrate/ITO/hole injection layer (60 nm)/interlayer (20 nm)/emission layer (60 nm)/hole blocker layer (10 nm)/electron transport layer (40 nm)/cathode. For this purpose, substrates from Technoprint (soda-lime glass) are used, to which the ITO structure (indium tin oxide, a transparent conductive anode) is applied. The substrates are cleaned in a cleanroom with DI water and a detergent (Deconex 15 PF) and then activated by a UV/ozone plasma treatment. Thereafter, likewise in a cleanroom, a 20 nm hole injection layer (PEDOT:PSS from Clevios™) is applied by spin-coating. The required spin rate depends on the degree of dilution and the specific spin-coater geometry. In order to remove residual water from the layer, the substrates are baked on a hotplate at 200° C. for 30 minutes. The interlayer used serves for hole transport; in this case, HL-X from Merck is used. The interlayer may alternatively also be replaced by one or more layers which merely have to fulfil the condition of not being leached off again by the subsequent processing step of EML deposition from solution. For production of the emission layer, the triplet emitters of the invention are dissolved together with the matrix materials in toluene or chlorobenzene. The typical solids content of such solutions is between 16 and 25 g/l when, as here, the layer thickness of 60 nm which is typical of a device is to be achieved by means of spin-coating. The solution-processed devices of type 1 contain an emission layer composed of M4:M5:IrL (20%:58%:22%), and those of type 2 contain an emission layer composed of M4:M5:IrLa:IrLb (30%:34%:29%:7%); in other words, they contain two different Ir complexes. The emission layer is spun on in an inert gas atmosphere, argon in the present case, and baked at 160° C. for 10 min. Vapour-deposited atop the latter are the hole blocker layer (10 nm ETM1) and the electron transport layer (40 nm ETM1 (50%)/ETM2 (50%)) (vapour deposition systems from Lesker or the like, typical vapour deposition pressure $5\times10^{-6}$ mbar). Finally, a cathode of aluminium (100 nm) (high-purity metal from Aldrich) is applied by vapour deposition. In order to protect the device from air and air humidity, the device is finally encapsulated and then characterized. The OLED examples cited have not yet been optimized. Table 3 summarizes the data obtained. The lifetime LT50 is defined as the time after which the luminance in operation drops to 50% of the starting luminance with a starting brightness of 1000 cd/m².

TABLE 3

Results with materials processed from solution

| Ex. | Emitter Device | EQE (%) 1000 cd/m² | Voltage (V) 1000 cd/m² | CIE x/y | LT50 (h) 1000 cd/m² |
|---|---|---|---|---|---|
| Sol-Ref.GreenD1 | Ir-Sol-Ref.1 Typ1 | 21.7 | 4.4 | 0.34/0.62 | 350000 |
| Sol-GreenD1 | Ir(L2) Typ1 | 22.4 | 4.3 | 0.34/0.63 | 380000 |
| Sol-GreenD2 | Ir(L13) Typ1 | 22.5 | 4.2 | 0.33/0.62 | 410000 |
| Sol-GreenD3 | Ir(L18) Typ1 | 21.9 | 4.4 | 0.32/0.62 | 370000 |
| Sol-GreenD4 | Ir(L23) Typ1 | 22.0 | 4.3 | 0.39/0.59 | 420000 |
| Sol-GreenD5 | Ir(L23-D8) Typ1 | 22.4 | 4.3 | 0.39/0.59 | 460000 |
| Sol-GreenD6 | Ir6 Typ1 | 21.9 | 4.4 | 0.33/0.63 | 390000 |
| Sol-GreenD7 | Ir51 Typ1 | 21.6 | 4.3 | 0.31/0.64 | 320000 |
| Sol-GreenD8 | Ir(L12) Typ1 | 22.2 | 4.2 | 0.33/0.62 | 350000 |
| Sol-Green D9 | Ir(L19) Typ1 | 22.1 | 4.2 | 0.36/0.62 | 300000 |
| Sol-GreenD10 | Ir(L21) Typ1 | 21.8 | 4.2 | 0.35/0.61 | 440000 |
| Sol-GreenD11 | Ir(L40) Typ1 | 22.7 | 4.2 | 0.37/0.59 | 280000 |
| Sol-GreenD12 | Ir(L41) Typ1 | 22.7 | 4.2 | 0.36/0.62 | 340000 |
| Sol-GreenD13 | Ir(L45) Typ1 | 22.0 | 4.4 | 0.30/0.62 | 350000 |
| Sol-GreenD14 | Ir(L46) Typ1 | 22.7 | 4.3 | 0.38/0.61 | 350000 |
| Sol-GreenD15 | Ir(L202) Typ1 | 21.9 | 4.2 | 0.39/0.59 | 330000 |
| Sol-GreenD16 | Ir(L36) Typ1 | 22.7 | 4.3 | 0.38/0.59 | 290000 |
| Sol-GreenD17 | Ir(L40) Typ1 | 23.0 | 4.2 | 0.40/0.59 | 370000 |
| Sol-GreenD18 | Ir(L46) Typ1 | 23.2 | 4.3 | 0.38/0.61 | 370000 |
| Sol-GreenD19 | Ir(L112) Typ1 | 23.0 | 4.3 | 0.37/0.62 | 380000 |

TABLE 3-continued

Results with materials processed from solution

| Ex. | Emitter Device | EQE (%) 1000 cd/m² | Voltage (V) 1000 cd/m² | CIE x/y | LT50 (h) 1000 cd/m² |
|---|---|---|---|---|---|
| Sol-Green D20 | Ir(L129) Typ1 | 22.7 | 4.3 | 0.34/0.63 | 370000 |
| Sol-GreenD21 | Ir(L23-D10) Typ1 | 22.7 | 4.3 | 0.37/0.61 | 390000 |
| Sol-GreenD22 | Ir(L136-D8-CN) Typ1 | 22.9 | 4.4 | 0.30/0.63 | 300000 |
| Sol-GreenD23 | Ir1 Typ1 | 22.0 | 4.4 | 0.33/0.63 | 390000 |
| Sol-GreenD24 | Ir4 Typ1 | 23.2 | 4.0 | 0.35/0.61 | 430000 |
| Sol-GreenD25 | Ir7 Typ1 | 23.6 | 4.0 | 0.34/0.62 | 420000 |
| Sol-GreenD26 | Ir53 Typ1 | 23.4 | 4.0 | 0.33/0.62 | 450000 |
| Sol-GreenD27 | Ir(L151) Typ1 | 22.8 | 4.2 | 0.38/0.61 | 290000 |
| Sol-GreenD28 | Ir(L156) Typ1 | 22.9 | 4.3 | 0.33/0.62 | 300000 |
| Sol-Green D29 | Ir(L157-D8) Typ1 | 22.4 | 4.0 | 0.29/0.62 | 290000 |
| Sol-YellowD1 | Ir(L15) Typ1 | 23.1 | 4.2 | 0.44/0.55 | 560000 |
| Sol-YellowD2 | Ir(L28-D10) Typ1 | 22.4 | 4.2 | 0.43/0.54 | 400000 |
| Sol-YellowD3 | Ir(L141) Typ1 | 22.8 | 4.2 | 0.45/0.54 | 300000 |
| Sol-YellowD4 | Ir(L146) Typ1 | 21.2 | 4.1 | 0.57/0.41 | 380000 |
| Sol-YellowD5 | Ir(L204) Typ1 | 23.3 | 4.2 | 0.45/0.54 | 540000 |
| Sol-YellowD6 | Ir(L201) Typ1 | 23.0 | 4.2 | 0.44/0.55 | 500000 |
| Sol-YellowD7 | Ir(L209) Typ1 | 22.5 | 4.2 | 0.47/0.52 | 430000 |
| Sol-YellowD8 | Ir(L210) Typ1 | 22.7 | 4.2 | 0.49/0.51 | 430000 |
| Sol-YellowD9 | Ir(L141) Typ1 | 22.5 | 4.2 | 0.49/0.50 | 320000 |
| Sol-YellowD10 | Ir(L127) Typ1 | 21.4 | 4.2 | 0.48/0.50 | 280000 |
| Sol-YellowD11 | Ir(L135) Typ1 | 21.4 | 4.2 | 0.51/0.48 | 300000 |
| Sol-Ref.RedD1 | Ir(15) Ir-Sol-Ref.2 Typ2 | 18.6 | 4.4 | 0.66/0.34 | 130000 |
| Sol-RedD1 | Ir(L15) Ir(L33) Typ2 | 21.3 | 4.3 | 0.66/0.34 | 330000 |
| Sol-RedD2 | Ir(L15) Ir(L32) Typ2 | 21.0 | 4.3 | 0.65/0.35 | 300000 |
| Sol-RedD3 | Ir(L15) Ir(L34) Typ2 | 18.1 | 4.3 | 0.69/0.31 | 170000 |
| Sol-RedD4 | Ir(L147) Ir(L34) Typ2 | 18.5 | 4.2 | 0.67/0.33 | 220000 |
| Sol-RedD5 | Ir(L15) Ir(L203) Typ2 | 21.0 | 4.3 | 0.65/0.35 | 300000 |

TABLE 4
| Structural formulae of the materials used |
|---|
| 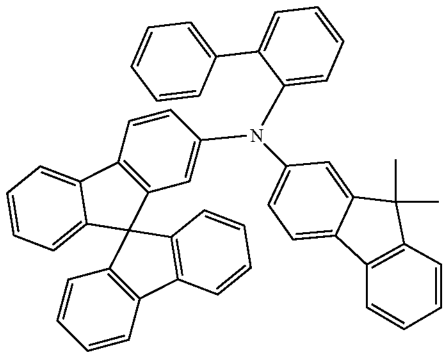 [SMILES: CC1(C)c2ccccc2-c2ccc(N(c3ccc4c(c3)C3(c5ccccc5-c5ccccc53)c3ccccc3-4)c3ccccc3-c3ccccc3)cc21] |
| HTM1<br>[136463-07-5] |
| 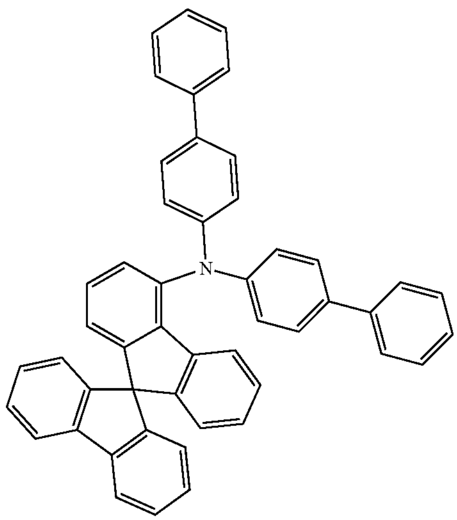 [SMILES: c1ccc(-c2ccc(N(c3ccc(-c4ccccc4)cc3)c3cccc4c3-c3ccccc3C43c4ccccc4-c4ccccc43)cc2)cc1] |
| HTM2<br>[1450933-43-3] |
| 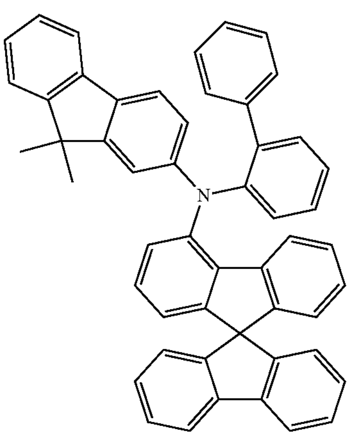 [SMILES: CC1(C)c2ccccc2-c2ccc(N(c3ccccc3-c3ccccc3)c3cccc4c3-c3ccccc3C43c4ccccc4-c4ccccc43)cc21] |
| HTM3<br>[1450933-44-4] |

TABLE 4-continued
| Structural formulae of the materials used |
| --- |
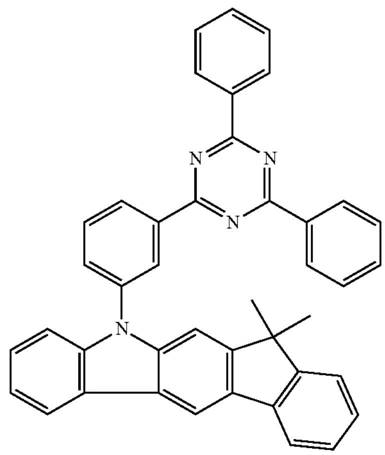 [SMILES: CC1(C)c2ccccc2-c2cc3c4ccccc4n(-c4cccc(-c5nc(-c6ccccc6)nc(-c6ccccc6)n5)c4)c3cc21]
M1
[1257248-13-7]
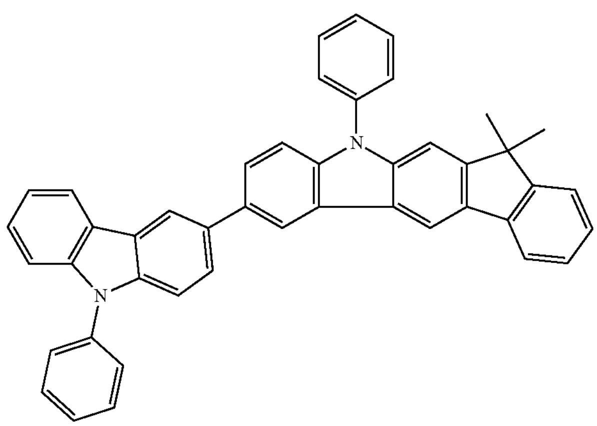 [SMILES: CC1(C)c2ccccc2-c2cc3c4cc(-c5ccc6c(c5)c5ccccc5n6-c5ccccc5)ccc4n(-c4ccccc4)c3cc21]
M2
[1357150-54-9]

TABLE 4-continued
| Structural formulae of the materials used |
| --- |
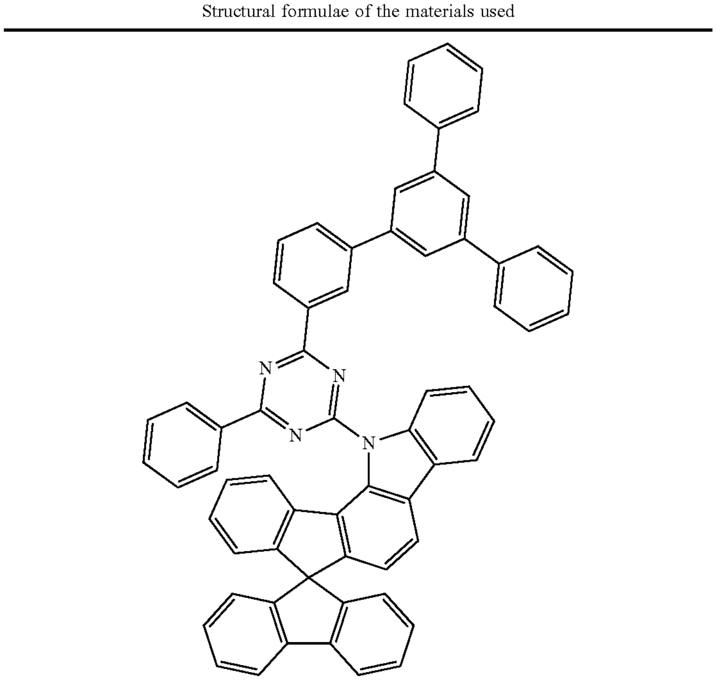
M4
[1616231-60-7]
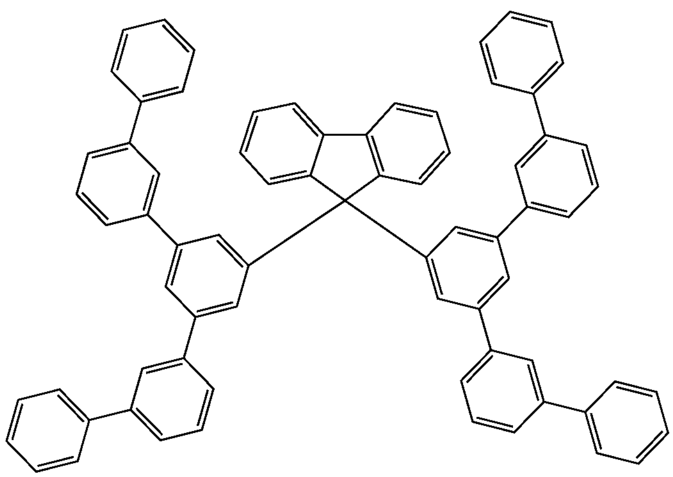 [SMILES: c1ccc(-c2cccc(-c3cc(-c4cccc(-c5ccccc5)c4)cc(C4(c5cc(-c6cccc(-c7ccccc7)c6)cc(-c6cccc(-c7ccccc7)c6)c5)c5ccccc5-c5ccccc54)c3)c2)cc1]
M5
[1246496-85-4]
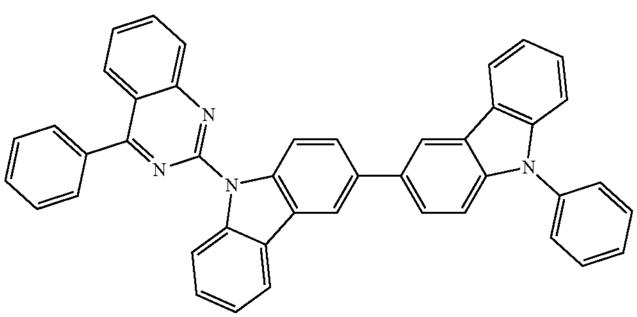 [SMILES: c1ccc(-c2nc(-n3c4ccccc4c4cc(-c5ccc6c(c5)c5ccccc5n6-c5ccccc5)ccc43)nc3ccccc23)cc1]
M6
[1398395-92-0]

TABLE 4-continued
| Structural formulae of the materials used |
| --- |
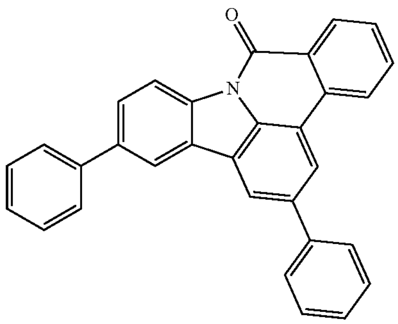 [SMILES: O=c1c2ccccc2c2cc(-c3ccccc3)cc3c4cc(-c5ccccc5)ccc4n1c23]
M7
[1915695-76-5]
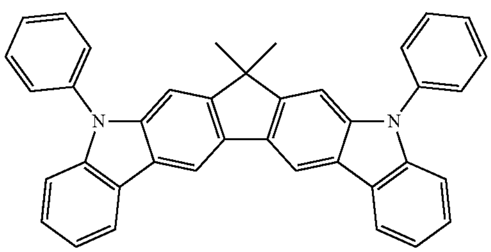 [SMILES: CC1(C)c2cc3c(cc2-c2cc4c5ccccc5n(-c5ccccc5)c4cc21)c1ccccc1n3-c1ccccc1]
M8
[1257248-72-8]
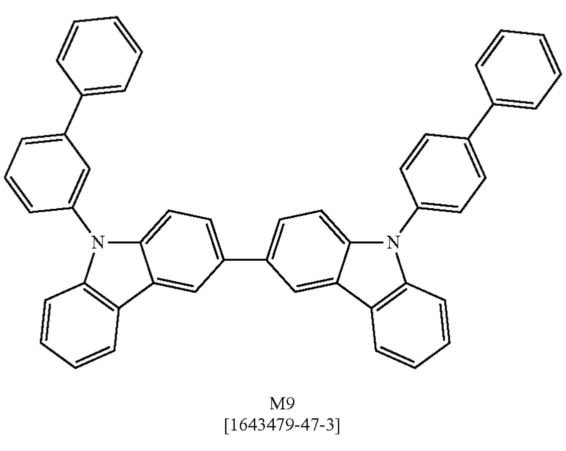
M9
[1643479-47-3]

TABLE 4-continued
| Structural formulae of the materials used |
| --- |
| 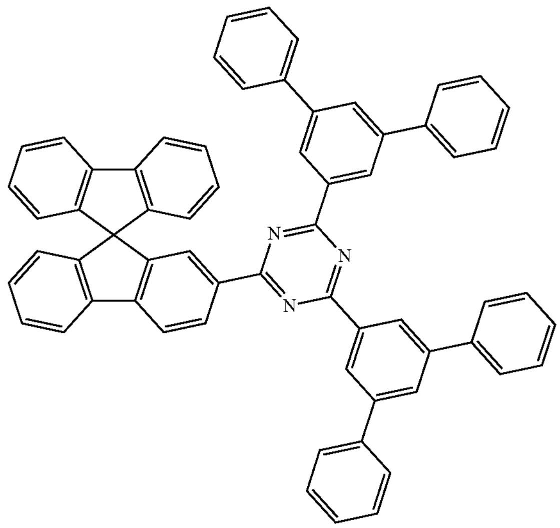 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1] ETM1 = M10 [1233900-52-6] |
| 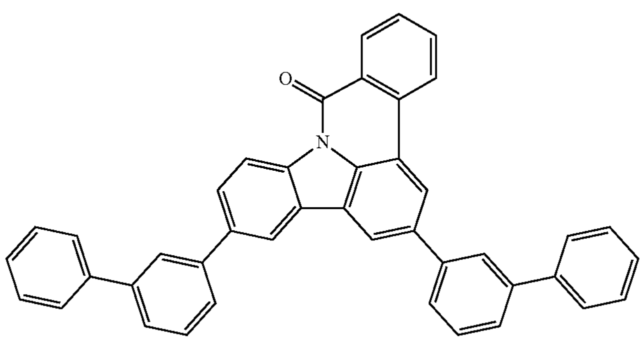 [SMILES: O=c1c2ccccc2c2cc(-c3cccc(-c4ccccc4)c3)cc3c4cc(-c5cccc(-c6ccccc6)c5)ccc4n1c23] M11 [1615703-24-6] |
| 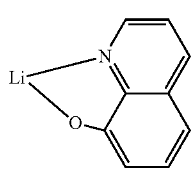 ETM2 [25387-93-3] |

TABLE 4-continued
| Structural formulae of the materials used |
|---|
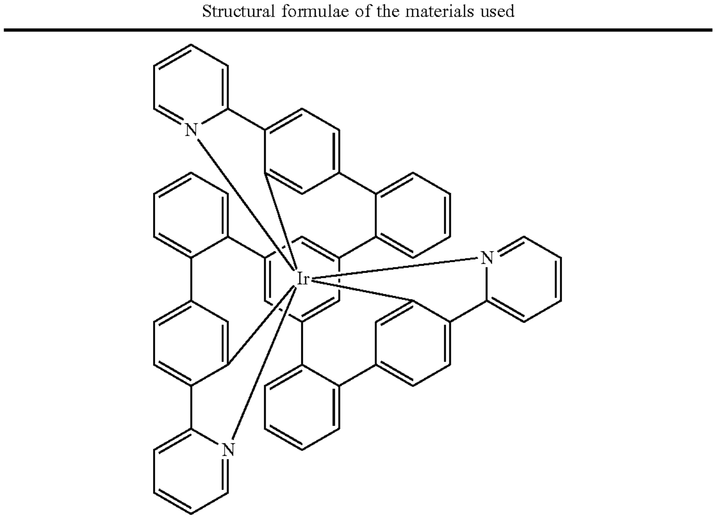
Ir-Ref. 1
[1989600-78-3]
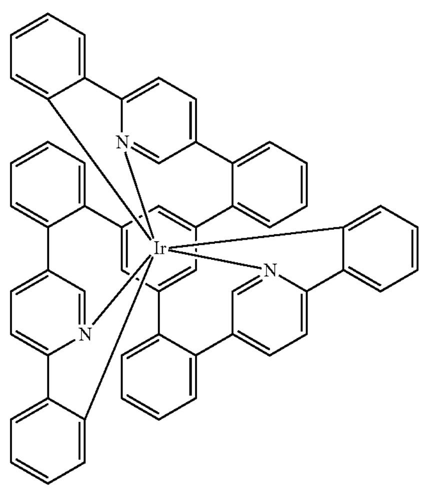
Ir-Ref. 2
[1989600-75-0]
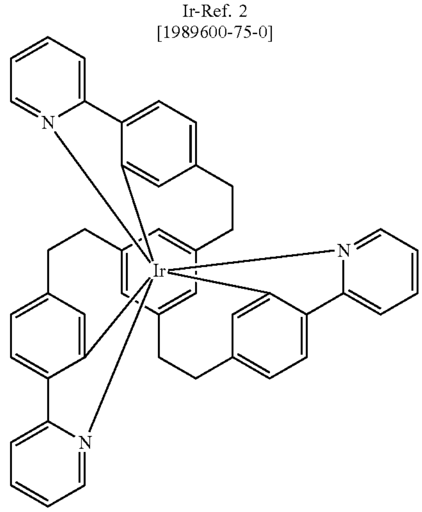
Ir-Ref. 3
[861806-74-8]

TABLE 4-continued
| Structural formulae of the materials used |
| --- |
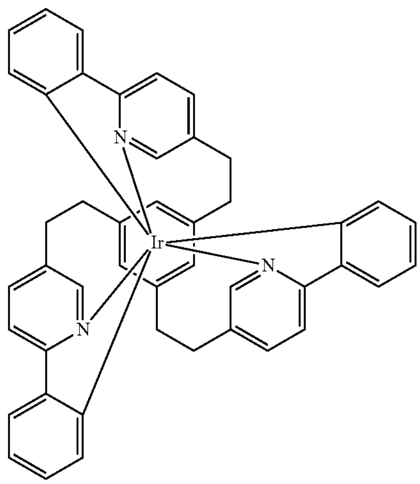
Ir-Ref. 4
[861806-70-4]
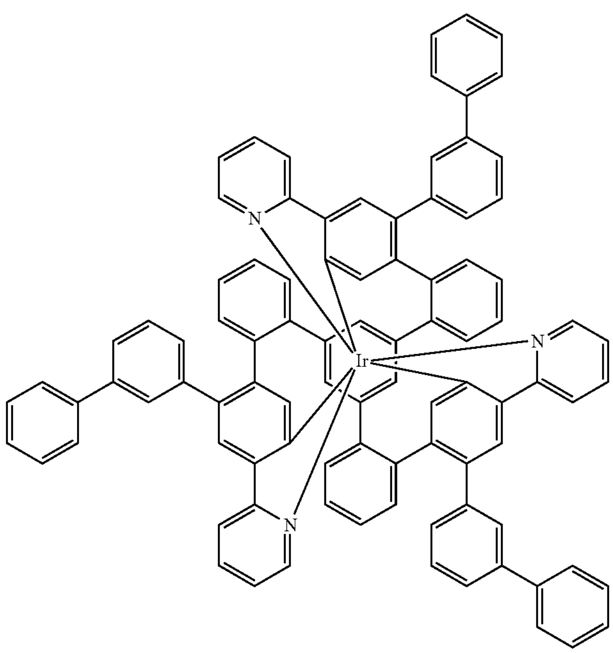
Ir-Sol-Ref. 1
[1989601-89-9]

TABLE 4-continued

| Structural formulae of the materials used |
|---|
| 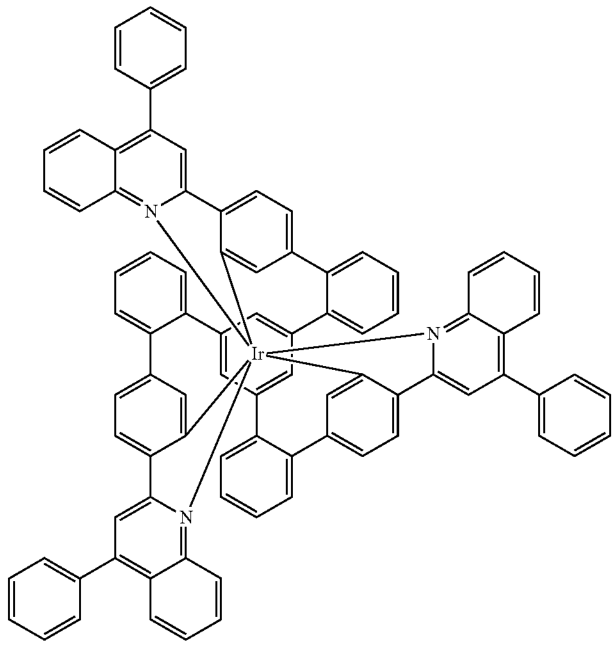 Ir-Sol-Ref. 2 [1989605-98-2] |

The invention claimed is:

1. A compound of the formula (1)

formula (1)

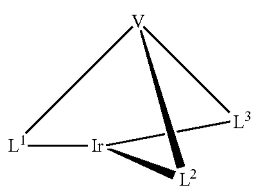

where the symbols used are as follows:

$L^1$, $L^2$, $L^3$ are the same or different at each instance and are each a bidentate monoanionic sub-ligand that coordinates to the iridium via one carbon atom and one nitrogen atom, via two carbon atoms, via two nitrogen atoms, via two oxygen atoms or via one nitrogen atom and one oxygen atom;

V is a group of the formula (2), where the dotted bonds each represent the position of linkage of the sub-ligands $L^1$, $L^2$ and $L^3$, formula (2)

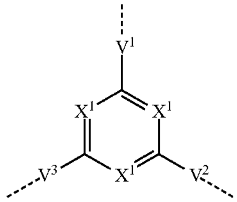

$V^1$ is a group of the following formula (3):

formula (3)

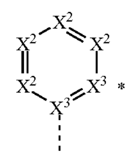

where the dotted bond represents the bond to $L^1$ and * represents the bond to the central cycle in formula (2);

$V^2$ is selected from the group consisting of —$CR_2$—$CR_2$—, —$CR_2$—$SiR_2$—, —$CR_2$—O— and —$CR_2$—NR—, where these groups are each bonded to $L^2$ and to the central cycle in formula (2);

$V^3$ is the same or different and is $V^1$ or $V^2$, where this group is bonded to $L^3$ and to the central cycle in formula (2);

$X^1$ is the same or different at each instance and is CR or N;

$X^2$ is the same or different at each instance and is CR or N, or two adjacent $X^2$ groups together are NR, O or S, thus forming a five-membered ring; or two adjacent $X^2$ groups together are CR or N when one of the $X^3$ groups in the cycle is N, thus forming a five-membered ring; with the proviso that not more than two adjacent $X^2$ groups in each ring are N;

$X^3$ is C at each instance in the same cycle or one $X^3$ group is N and the other $X^3$ group in the same cycle is C, where the $X^3$ groups may be selected independently when V contains more than one group of the formula (3); with the proviso that two adjacent $X^2$ groups together are CR or N when one of the $X^3$ groups in the cycle is N;

R is the same or different at each instance and is H, D, F, Cl, Br, I, N $(R^1)_2$, $OR^1$, $SR^1$, CN, $NO_2$, COOH, C(=O)$N(R^1)_2$, $Si(R^1)_3$, $Ge(R^1)_3$, $B(OR^1)_2$, C(=O)$R^1$, P(=O)$(R^1)_2$, S(=O)$R^1$, S(=O)$_2R^1$, $OSO_2R^1$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^1$ radicals and where one or more nonadjacent $CH_2$ groups may be replaced by $Si(R^1)_2$, C=O, $NR^1$, O, S or $CONR^1$, or an aromatic or heteroaromatic ring system which has 5 to 40 aromatic ring atoms and may be substituted in each case by one or more $R^1$ radicals; at the same time, two R radicals together may also form a ring system;

$R^1$ is the same or different at each instance and is H, D, F, Cl, Br, I, N $(R^2)_2$, $OR^2$, $SR^2$, CN, $NO_2$, $Si(R^2)_3$, $Ge(R^2)_3$, $B(OR^2)_2$, C(=O)$R^2$, P(=O)$(R^2)_2$, S(=O)$R^2$, S(=O)$_2R^2$, $OSO_2R^2$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^2$ radicals and where one or more nonadjacent $CH_2$ groups may be replaced by $Si(R^2)_2$, C=O, $NR^2$, O, S or $CONR^2$, or an aromatic or heteroaromatic ring system which has 5 to 40 aromatic ring atoms and may be substituted in each case by one or more $R^2$ radicals; at the same time, two or more $R^1$ radicals together may form a ring system;

$R^2$ is the same or different at each instance and is H, D, F or an aliphatic, aromatic and/or heteroaromatic organic radical having 1 to 20 carbon atoms, in which one or more hydrogen atoms may also be replaced by F;

at the same time, the three bidentate ligands $L^1$, $L^2$ and $L^3$, may also be closed by a further bridge to form a cryptate; and provided that none of $V^1$, $V^2$, $V^3$, $L^1$, $L^2$, and $L^3$ comprises a bicyclic group.

2. The compound according to claim 1, wherein the group of the formula (3) is selected from the groups of the formulae (6) to (30)

formula (6)

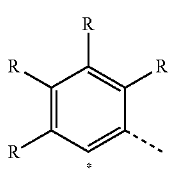

formula (7)

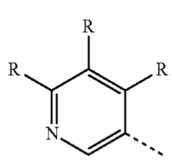

formula (8)

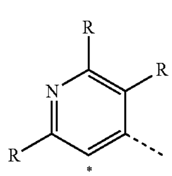

-continued formula (9)

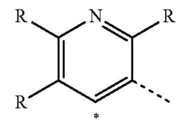

formula (10)

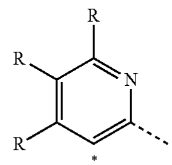

formula (11)

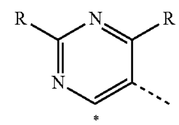

formula (12)

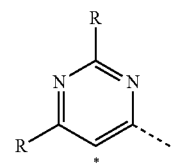

formula (13)

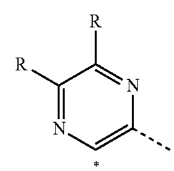

formula (14)

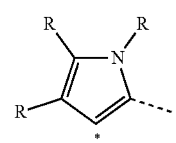

formula (15)

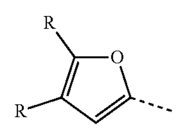

formula (16)

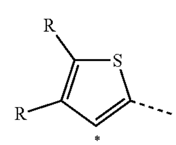

formula (17)

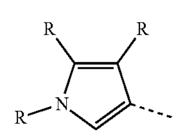

formula (18)

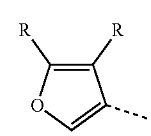

-continued formula (19)

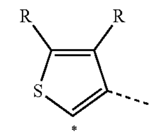

formula (20)

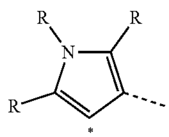

formula (21)

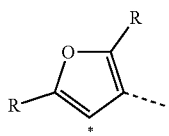

formula (22)

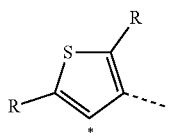

formula (23)

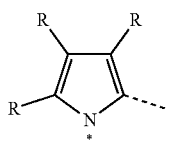

formula (24)

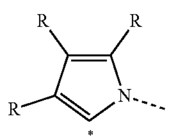

formula (25)

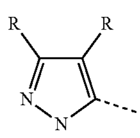

formula (26)

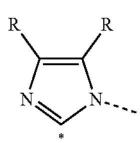

formula (27)

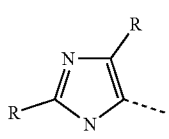

formula (28)

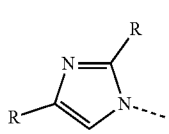

-continued formula (29)

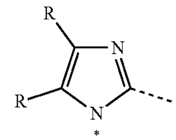

formula (30)

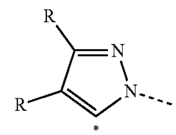

where the symbols used have the definitions given in claim 1.

3. The compound according to claim 1, wherein $V^2$ is —$CR_2$—$CR_2$—where R is the same or different at each instance and is selected from the group consisting of H, D, F and an alkyl group having 1 to 5 carbon atoms, where hydrogen atoms may also be replaced by D or F and where adjacent R together may form a ring system.

4. The compound according to claim 1, wherein V is selected from the structures of the formulae (4a), (4b), (5a) and (5b)

formula (4a)

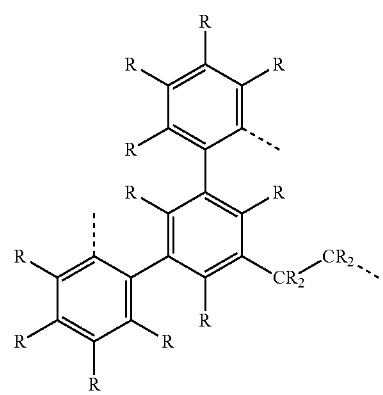

formula (4b)

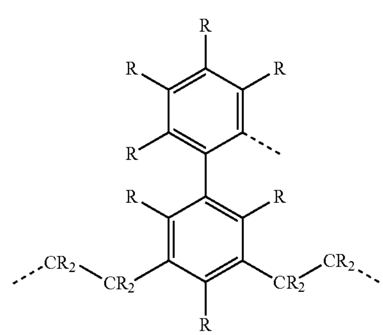

-continued
formula (5a)
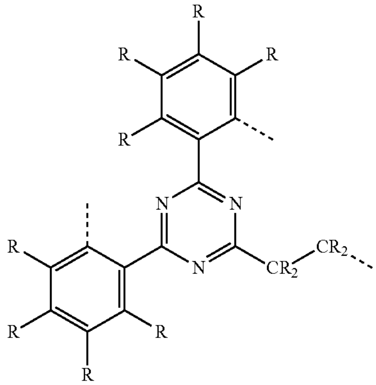
formula (5b)
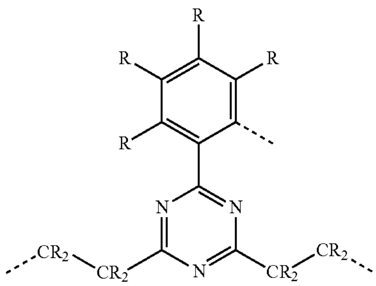
where the symbols used have the definitions given in claim 1.
5. The compound according to claim 1, wherein V is selected from the structures of the formulae (4c), (4d), (4e), (4f), (5c), (5d), (5e) and (5f)
formula (4c)
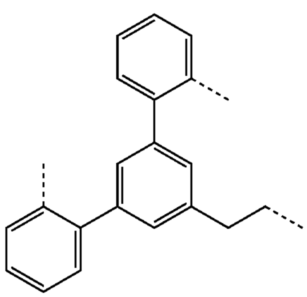
formula (4d)
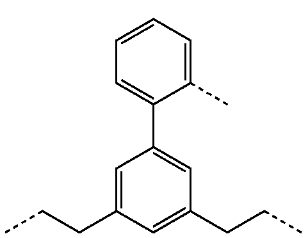
-continued
formula (4e)
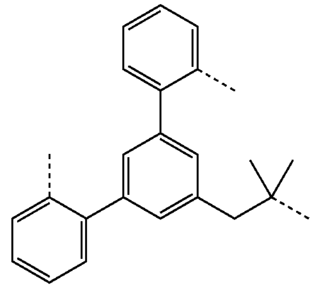
formula (4f)
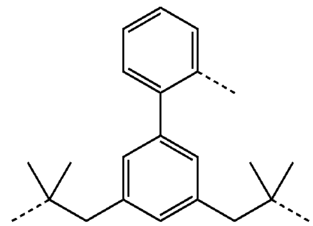
formula (5c)
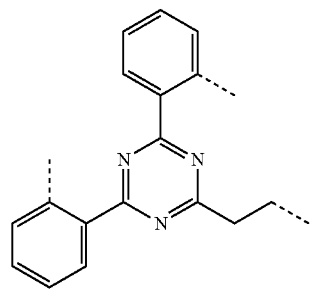
formula (5d)
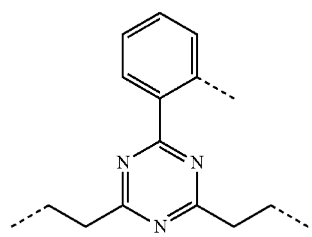
formula (5e)
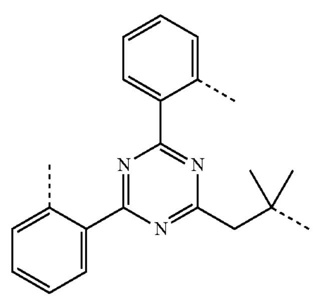
formula (5f)
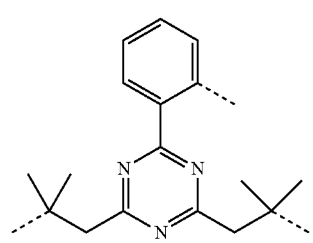

where the symbols used have the definitions given in claim 1.

6. The compound according to claim 1, wherein at least one of the sub-ligands $L^1$, $L^2$ and $L^3$, coordinate(s) to the iridium via one carbon atom and one nitrogen atom or via two carbon atoms.

7. The compound according to claim 1, wherein at least one of the sub-ligands $L^1$, $L^2$ and $L^3$, has a structure of one of the formulae (L-1) and (L-2)

formula (L-1)

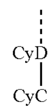

formula (L-2)

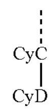

where the dotted bond represents the bond of the sub-ligand to V and the other symbols used are as follows:

CyC is the same or different at each instance and is a substituted or unsubstituted aryl or heteroaryl group which has 5 to 14 aromatic ring atoms and coordinates in each case to the metal via a carbon atom and which is bonded to CyD via a covalent bond;

CyD is the same or different at each instance and is a substituted or unsubstituted heteroaryl group which has 5 to 14 aromatic ring atoms and coordinates to the metal via a nitrogen atom or via a carbene carbon atom and which is bonded to CyC via a covalent bond;

at the same time, two or more of the optional substituents together may form a ring system.

8. The compound according to claim 7, wherein (L-1) is selected from the structures of the formulae (L-1-1) and (L-1-2), and (L-2) is selected from the structures of the formulae (L-2-1) to (L-2-4)

(L1-1)

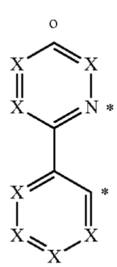

(L-1-2)

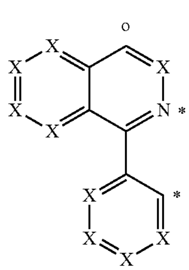

-continued (L-2-1)

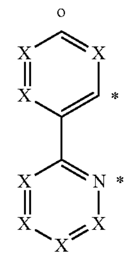

(L-2-2)

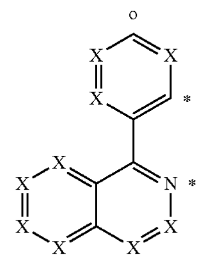

(L-2-3)

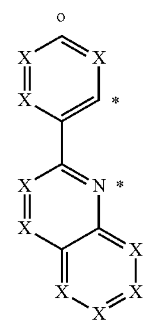

(L-2-4)

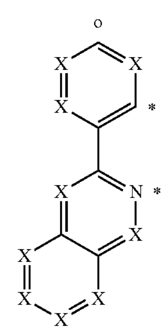

where X is the same or different at each instance and is CR or N, where not more than two X per cycle are N, * represents the position of coordination to the iridium and "o" represents the position of the bond to V.

9. The compound according to claim 1, wherein one of the sub-ligands $L^1$, $L^2$ and $L^3$ has a substituent of one of the formulae (49) and (50)

formula (49)

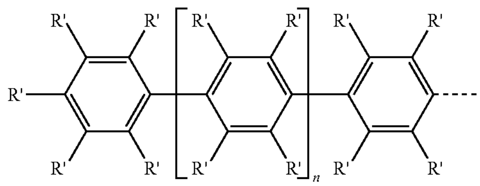

formula (50)

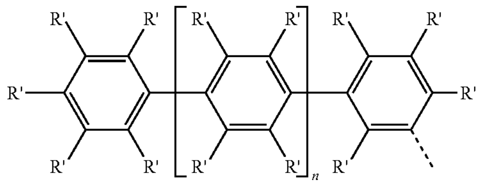

where the dotted bond indicates the linkage of the group and, in addition:

R' is the same or different at each instance and is H, D, F, CN, a straight chain alkyl group having 1 to 10 carbon atoms in which one or more hydrogen atoms may also be replaced by D or F, or a branched or cyclic alkyl group having 3 to 10 carbon atoms in which one or more hydrogen atoms may also be replaced by D or F, or an alkenyl group having 2 to 10 carbon atoms in which one or more hydrogen atoms may also be replaced by D or F; at the same time, two adjacent R' radicals or two R' radicals on adjacent phenyl groups together may also form a ring system; or two R' on adjacent phenyl groups together are a group selected from O and S, such that the two phenyl rings together with the bridging group are a dibenzofuran or dibenzothiophene, and the further R' are as defined above;

n is 0, 1, 2, 3, 4 or 5.

10. The compound according to claim 9, wherein the structure of the formula (49) is selected from the structures of the formulae (49a) to (49h) and the structure of the formula (50) is selected from the structures of the formulae (50a) to (50h)

formula (49a)

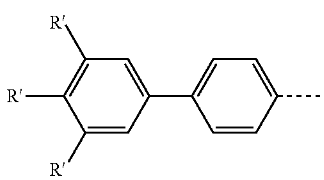

formula (49b)

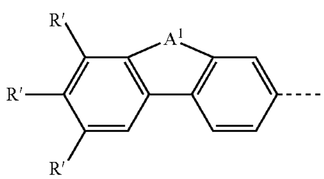

formula (49c)

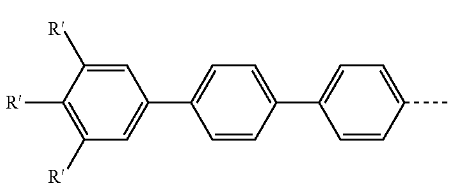

-continued formula (49d)

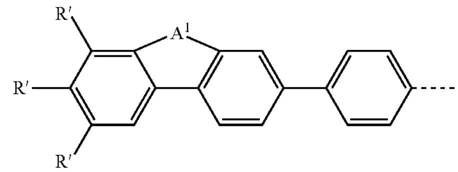

formula (49e)

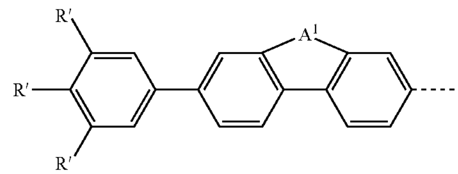

formula (49f)

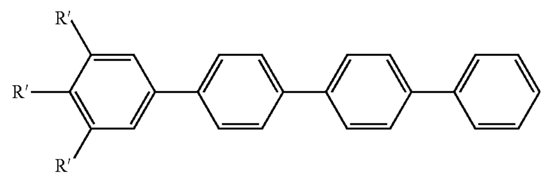

formula (49g)

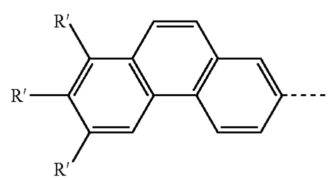

formula (49h)

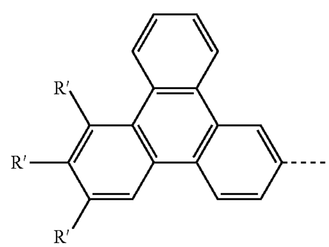

formula (50a)

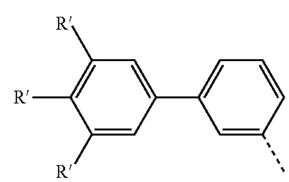

formula (50b)

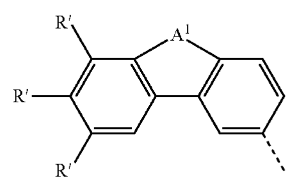

formula (50c)

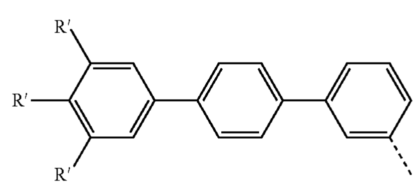

-continued formula (50d)

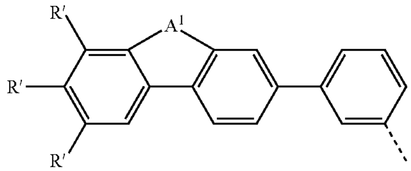

formula (50e)

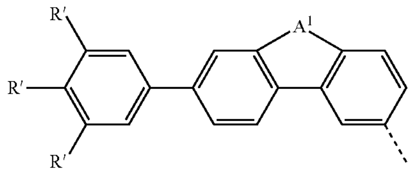

formula (50f)

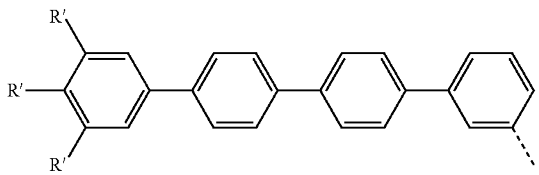

formula (50g)

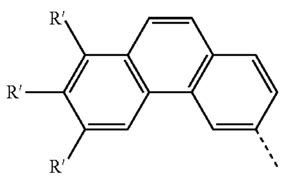

formula (50h)

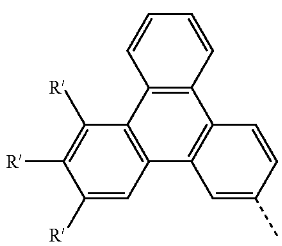

where $A^1$ is O, S, C $(R^1)_2$ or $NR^1$ and the further symbols used have the definitions given in claim 1.

11. A process for preparing the compound according to claim 1 by reacting the ligand with iridium alkoxides of the formula (51), with iridium ketoketonates of the formula (52), with iridium halides of the formula (53) or with iridium carboxylates of the formula (54)

formula (51)

$Ir(OR)_3$ formula (52)

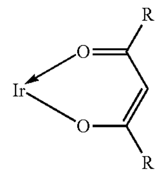

formuls (53)

$IrHal_3$ formula (54)

$Ir(OOCR)_3$ where R has the definitions given in claim 1, Hal=F, Cl, Br or I and the iridium reactants may also take the form of the corresponding hydrates.

12. A formulation comprising at least one compound according to claim 1 and at least one solvent and/or at least one further organic or inorganic compound.

13. An electronic device, oxygen sensitizer, photoinitiator, or photocatalyst comprising at least one compound according to claim 1.

14. An electronic device comprising at least one compound according to claim 1.

15. The electronic device according to claim 14 which is an organic electroluminescent device, wherein the compound is used in an emitting layer.

* * * * *